US012239009B2

(12) United States Patent
Lee et al.

(10) Patent No.: US 12,239,009 B2
(45) Date of Patent: Feb. 25, 2025

(54) ORGANOMETALLIC COMPOUND, ORGANIC LIGHT-EMITTING DEVICE INCLUDING THE SAME AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Kum Hee Lee, Suwon-si (KR); Byungjoon Kang, Seoul (KR); Seungyeon Kwak, Suwon-si (KR); Sunghun Lee, Hwaseong-si (KR); Aram Jeon, Seoul (KR); Hyeonho Choi, Seoul (KR); Kyuyoung Hwang, Anyang-si (KR); Byoungki Choi, Hwaseong-si (KR); Whail Choi, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 635 days.

(21) Appl. No.: 17/032,392

(22) Filed: Sep. 25, 2020

(65) Prior Publication Data

US 2021/0104691 A1 Apr. 8, 2021

(30) Foreign Application Priority Data

Sep. 26, 2019 (KR) ........................ 10-2019-0119095
Sep. 23, 2020 (KR) ........................ 10-2020-0123024

(51) Int. Cl.
*H01L 51/00* (2006.01)
*C07F 15/00* (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
CPC .. H10K 85/342; H10K 85/40; C07F 15/0033; C09K 2211/185
See application file for complete search history.

(56) References Cited

U.S. PATENT DOCUMENTS 6,687,266 B1 2/2004 Ma et al.
9,257,658 B2 2/2016 Kottas et al.
(Continued)

FOREIGN PATENT DOCUMENTS

CN 105461753 A 4/2016
CN 105968142 A 9/2016
(Continued)

OTHER PUBLICATIONS

Extended European Search Report mailed Jan. 22, 2021 of EP Patent Application No. 20198206.3.
(Continued)

*Primary Examiner* — Alexander C Kollias
(74) *Attorney, Agent, or Firm* — CANTOR COLBURN LLP

(57) ABSTRACT

An organometallic compound represented by Formula 1:

$$M(L_1)_{n1}(L_2)_{n2} \quad \text{Formula 1}$$

wherein, Formula 1, M is a transition metal, $L_1$ is a ligand represented by Formula 2 as provided herein, $L_2$ is a ligand represented by Formula 3 as provided herein, and n1 and n2 are each independently 1 or 2.

20 Claims, 1 Drawing Sheet

(51) Int. Cl.

| | |
|---|---|
| ***C09K 11/06*** | (2006.01) |
| ***H10K 85/30*** | (2023.01) |
| ***H10K 85/40*** | (2023.01) |
| *H10K 50/11* | (2023.01) |
| *H10K 50/15* | (2023.01) |
| *H10K 50/16* | (2023.01) |
| *H10K 50/17* | (2023.01) |
| *H10K 50/18* | (2023.01) |

(52) U.S. Cl.

CPC ........... *H10K 85/361* (2023.02); *H10K 85/40* (2023.02); *C07B 2200/05* (2013.01); *C09K 2211/1062* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02)

(56) References Cited

U.S. PATENT DOCUMENTS

| | | | | |
|---|---|---|---|---|
| 10,135,007 | B2 | 11/2018 | Ma et al. | |
| 10,243,153 | B2 | 3/2019 | Ise | |
| 10,400,163 | B2 | 9/2019 | Beers et al. | |
| 2003/0165715 | A1* | 9/2003 | Yoon | H10K 85/6572 313/506 |
| 2012/0292600 | A1 | 11/2012 | Kottas et al. | |
| 2013/0181190 | A1 | 7/2013 | Ma et al. | |
| 2013/0334521 | A1* | 12/2013 | Lee | H10K 85/342 546/4 |
| 2015/0090981 | A1* | 4/2015 | Xia | C09K 11/06 546/4 |
| 2015/0115250 | A1 | 4/2015 | Ma et al. | |
| 2016/0093814 | A1 | 3/2016 | Hwang et al. | |
| 2016/0093816 | A1* | 3/2016 | Ma | C09K 11/025 546/4 |
| 2016/0268522 | A1 | 9/2016 | Hwang et al. | |
| 2017/0012226 | A1 | 1/2017 | Hwang et al. | |
| 2017/0365801 | A1 | 12/2017 | Margulies et al. | |
| 2017/0373259 | A1* | 12/2017 | Su | H10K 85/654 |
| 2018/0097185 | A1* | 4/2018 | Su | H10K 85/654 |
| 2019/0112324 | A1 | 4/2019 | Kim et al. | |
| 2020/0212323 | A1 | 7/2020 | Hwang et al. | |
| 2020/0358012 | A1 | 11/2020 | Lee et al. | |

FOREIGN PATENT DOCUMENTS

| | | | |
|---|---|---|---|
| CN | 107098938 | A | 8/2017 |
| EP | 3001480 | B1 | 4/2017 |
| JP | 2016069379 | A | 5/2016 |
| KR | 1020140028043 | A | 3/2014 |
| KR | 1020140101292 | A | 8/2014 |
| KR | 1020150050383 | A | 5/2015 |
| KR | 20160109908 | A | 9/2016 |
| KR | 20190106807 | A | 9/2019 |
| KR | 1020210031395 | A | 3/2021 |

OTHER PUBLICATIONS

Yongbiao Zhao et al., "Ultrathin Nondoped Emissive Layers for Efficient and Simple Monochrome and White Organic Light-Emitting Diodes," Applied Materials & Interfaces, Jan. 16, 2013, pp. 965-971, vol. 5.

Office Action issued Nov. 28, 2023 of CN Patent Application No. 202011028967.2.

Office Action issued date Jul. 9, 2024 of JP Patent Application No. 2020-161373.

* cited by examiner

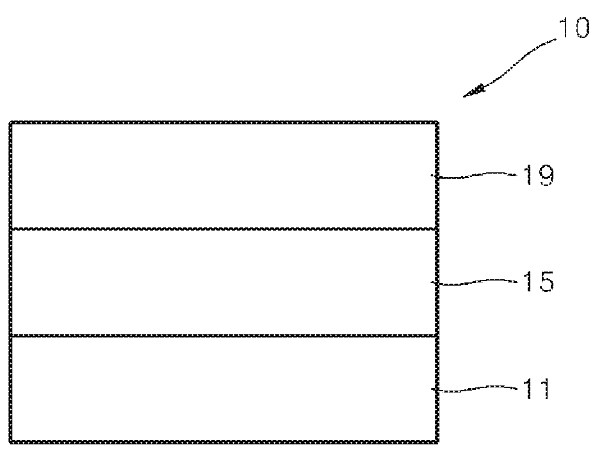
10
19
15
11

ORGANOMETALLIC COMPOUND, ORGANIC LIGHT-EMITTING DEVICE INCLUDING THE SAME AND ELECTRONIC APPARATUS INCLUDING THE ORGANIC LIGHT-EMITTING DEVICE

CROSS-REFERENCE TO RELATED APPLICATION

This application claims priority to and the benefit of Korean Patent Application No. 10-2019-0119095, filed on Sep. 26, 2019 in the Korean Intellectual Property Office, and Korean Patent Applications No. 10-2020-0123024, filed on Sep. 23, 2020, in the Korean Intellectual Property Office, and all the benefits accruing therefrom under 35 U.S.C. § 119, the contents of which are incorporated herein in their entireties by reference.

BACKGROUND

1. Field

One or more embodiments of the present disclosure relate to an organometallic compound, an organic light-emitting device including the same and an electronic apparatus including the organic light-emitting device.

2. Description of Related Art

Organic light-emitting devices are self-emission devices that produce full-color images, and also have wide viewing angles, high contrast ratios, short response times, and excellent characteristics in terms of brightness, driving voltage, and response speed An example of the organic light-emitting device may include an anode, a cathode, and an organic layer disposed between the anode and the cathode and including an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. Carriers, such as holes and electrons, recombine in the emission layer to produce excitons. These excitons transit from an excited state to a ground state, thereby generating light.

SUMMARY

Provided are novel organometallic compounds, organic light-emitting devices using the same and an electronic apparatus including the organic light-emitting device.

Additional aspects will be set forth in part in the description which follows and, in part, will be apparent from the description, or may be learned by practice of the presented embodiments of the disclosure.

According to an aspect, an organometallic compound presented in Formula 1 is provided:

$M(L_1)_{n1}(L_2)_{n2}$ Formula 1

In Formula 1,

M may be a transition metal, $L_1$ may be a ligand represented by Formula 2, $L_2$ may be a ligand represented by Formula 3, n1 and n2 may each independently be 1 or 2, when n1 is 2, two $L_1$ groups may be identical to or different from each other, and when n2 is 2, two $L_2$ groups may be identical to or different from each other.

Formula 2

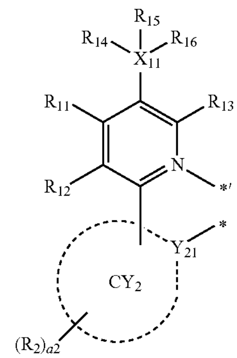

Formula 3

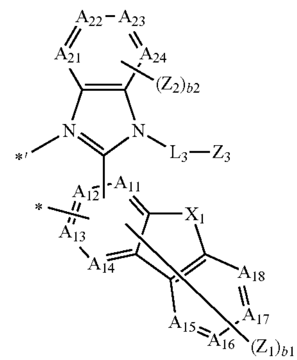

In Formulae 2 and 3, $Y_{21}$ may be C or N, ring $CY_2$ may be a $C_5$-$C_{30}$ carbocyclic group or $C_1$-$C_{30}$ heterocyclic group, $X_{11}$ may be Si or Ge, $X_1$ may be O, S, Se, $N(Z_{19})$, $C(Z_{19})(Z_{20})$, or $Si(Z_{19})(Z_{20})$, $A_{11}$ to $A_{14}$ may each independently be C or N, wherein one of $A_{11}$ to $A_{14}$ may be C bonded to a group represented by:

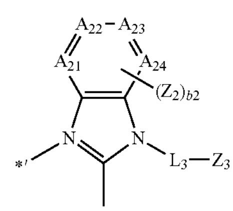

in Formula (3), and one of remaining $A_{11}$ to $A_{14}$ may be C bonded to M in Formula 1, $A_{15}$ to $A_{18}$ and $A_{21}$ to $A_{24}$ may each independently be C or N, at least one of $A_{11}$ to $A_{18}$ may be N, $L_3$ may be a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $R_2$, $R_{11}$ to $R_{16}$, $Z_1$ to $Z_3$, $Z_{19}$, and $Z_{20}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$ or —$P(Q_8)(Q_9)$, a2 is an integer from 0 to 20, and when a2 is two or more, two or more of $R_2$ may be identical to or different from each other, b1 is an integer from 0 to 5, and when b1 is two or more, two or more of $Z_1$ may be identical to or different from each other, b2 is an integer from 0 to 4, and when b2 is two or more, two or more of $Z_2$ may be identical to or different from each other, $R_{11}$ and $R_{12}$ are optionally linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of $R_2$ groups are optionally linked to each other to form a $C_5$-$C_{30}$ carbocyclic group that is unsubstituted or substituted with at least one $R_{10a}$, or two or more of the plurality of $R_2$ groups are optionally linked to each other to form a $C_1$-$C_{30}$ heterocyclic group that is unsubstituted or substituted with at least one $R_{10a}$, two or more of a plurality of $Z_1$ groups are optionally linked to each other to form a $C_5$-$C_{30}$ carbocyclic group that is unsubstituted or substituted with at least one $R_{10a}$, or two or more of the plurality of $Z_1$ groups are optionally linked to each other to form a $C_1$-$C_{30}$ heterocyclic group that is unsubstituted or substituted with at least one $R_{10a}$, two or more of a plurality of $Z_2$ groups are optionally linked to each other to form a $C_5$-$C_{30}$ carbocyclic group that is unsubstituted or substituted with at least one $R_{10a}$, or two or more of a plurality of $Z_2$ groups are optionally linked to each other to form a $C_1$-$C_{30}$ heterocyclic group that is unsubstituted or substituted with at least one $R_{10a}$, $R_{10a}$ is deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$,

*, *', and *" each indicate a binding site to M in Formula 1, wherein a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, carboxylic acid group or a salt thereof, sulfonic acid group or a salt thereof, phosphoric acid group or a salt thereof, a $C_1$-$C_{60}$ alkyl group, a $C_2$-$C_{60}$ alkenyl group, a $C_2$-$C_{60}$ alkynyl group, $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, carboxylic acid group or a salt thereof, sulfonic acid group or a salt thereof, phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, carboxylic acid group or a salt thereof, sulfonic acid group or a salt thereof, phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or a combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); or a combination thereof, and wherein $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, —F, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, —F, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a $C_2$-$C_{60}$ alkylheteroaryl group; a monovalent non-aromatic condensed polycyclic group; or a monovalent non-aromatic condensed heteropolycyclic group.

Another aspect provides an organic light-emitting device including a first electrode; a second electrode; and an organic layer including an emission layer disposed between the first electrode and the second electrode, wherein the organic layer includes at least one organometallic compound described above.

The organometallic compound may be included in the emission layer, and the organometallic compound included in the emission layer may serve as a dopant.

Another aspect provides an electronic apparatus including the organic light-emitting device.

BRIEF DESCRIPTION OF THE DRAWINGS

The above and other aspects, features, and advantages of certain embodiments of the disclosure will be more apparent from the following description taken in conjunction with the accompanying drawings, in which FIGURE is a schematic view of a structure of an organic light-emitting device according to an embodiment.

FIGURE shows a schematic cross-sectional view of an organic light-emitting device according to an embodiment.

DETAILED DESCRIPTION

Reference will now be made in detail to exemplary embodiments, examples of which are illustrated in the accompanying drawing, wherein like reference numerals refer to like elements throughout. In this regard, the present exemplary embodiments may have different forms and should not be construed as being limited to the descriptions set forth herein. Accordingly, the exemplary embodiments are merely described below, by referring to the FIGURES, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to a cross section illustration that is a schematic illustration of one or more idealized embodiments. As such, variations from the shapes of the illustration as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the FIGURE are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An aspect of the present disclosure provides an organometallic compound represented by Formula 1 below:

$$M(L_1)_{n1}(L_2)_{n2}$$ Formula 1

In Formula 1, M may be a transition metal.

For example, M may be a first-row transition metal, a second-row transition metal, or a third-row transition metal of the Periodic Table of Elements.

In one or more embodiments, M may be iridium (Ir), platinum (Pt), osmium (Os), titanium (Ti), zirconium (Zr), hafnium (Hf), europium (Eu), terbium (Tb), thulium (Tm), or rhodium (Rh).

In one or more embodiments, M may be Ir, Pt, Os, or Rh.

In Formula 1, $L_1$ may be a ligand represented by Formula 2 below, and $L_2$ may be a ligand represented by Formula 3 below:

Formula 2

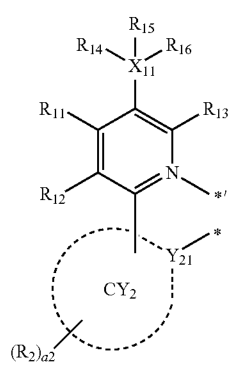

-continued

Formula 3

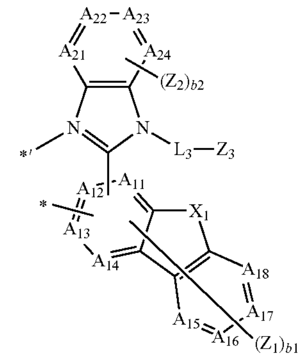

Formulae 2 and 3 may each be understood by referring to the corresponding descriptions thereof provided herein.

In Formula 1, $L_1$ and $L_2$ may be different from each other.

In Formula 1, n1 and n2 indicate the number of $L_1$ groups and the number of $L_2$ groups, respectively, and may each independently be 1 or 2. When n1 is 2, the two $L_1$ groups may be identical to or different from each other, and when n2 is 2, the two $L_2$ groups may be identical to or different from each other.

For example, in Formula 1, i) n1 may be 2, and n2 may be 1; or ii) n1 may be 1, and n2 may be 2, but embodiments of the present disclosure are not limited thereto.

In one or more embodiments, in Formula 1, i) M may be Ir or Os, and the sum of n1+n2 may be 3 or 4; or ii) M may be Pt, and the sum of n1+n2 may be 2.

In Formula 2, $Y_{21}$ may be C or N.

For example, $Y_{21}$ may be C.

In Formula 2, ring $CY_2$ may be a $C_5$-$C_{30}$ carbocyclic group or a $C_1$-$C_{30}$ heterocyclic group.

For example, ring $CY_2$ may be i) a first ring, ii) a second ring, iii) a condensed ring in which two or more first rings are condensed with each other, iv) a condensed ring in which two or more second rings are condensed with each other, or v) a condensed ring in which one or more first rings and one or more second rings are condensed with each other.

The first ring may be a cyclopentane group, a cyclopentadiene group, a furan group, a thiophene group, a pyrrole group, a silole group, a germole group, a borole group, a selenophene group, a phosphole group, an oxazole group, an oxadiazole group, an oxatriazole group, a thiazole group, a thiadiazole group, a thiatriazole group, a pyrazole group, an imidazole group, a triazole group, a tetrazole group, an azasilole group, an azagermole group, an azaborole group, an azaselenophene group, or an azaphosphole group.

The second ring may be an adamantane group, a norbornane group (a bicyclo[2.2.1]heptane group), a norbornene group, a bicyclo[1.1.1]pentane group, a bicyclo[2.1.1]hexane group, a bicyclo[2.2.2]octane group, a cyclohexane group, a cyclohexene group, a benzene group, a pyridine group, a pyrimidine group, a pyrazine group, a pyridazine group, or a triazine group.

In one or more embodiments, ring $CY_2$ may be a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In one or more embodiments, ring $CY_2$ may be a benzene group, a naphthalene group, an anthracene group, a phenanthrene group, a 1,2,3,4-tetrahydronaphthalene group, an indole group, a carbazole group, a fluorene group, a dibenzosilole group, a dibenzothiophene group, a dibenzofuran group, an azabenzosilole group, a pyridine group, a benzimidazole group, a benzoxazole group, or a benzothiazole group.

In one or more embodiments, ring $CY_2$ may be a benzene group, a naphthalene group, an anthracene group, a phenanthrene group, a 1,2,3,4-tetrahydronaphthalene group, a carbazole group, a fluorene group, a dibenzosilole group, a dibenzothiophene group, or a dibenzofuran group.

In Formula 2, $X_{11}$ may be Si or Ge.

In Formula 3, $X_1$ may be O, S, Se, $N(Z_{19})$, $C(Z_{19})(Z_{20})$, or $Si(Z_{19})(Z_{20})$. $Z_{19}$ and $Z_{20}$ may each be understood by referring to the corresponding descriptions thereof provided herein.

For example, $X_1$ may be O, S, or $N(Z_{19})$.

In Formula 3, $A_{11}$ to $A_{14}$ may each independently be C or N, wherein one of $A_{11}$ to $A_{14}$ may be C bonded to a group represented by

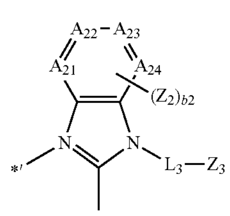

In Formula 3, and one of remaining $A_{11}$ to $A_{14}$ may be C bonded to M in Formula 1.

In Formula 3, $A_{15}$ to $A_{18}$ and $A_{21}$ to $A_{24}$ may each independently be C or N.

In Formula 3, at least one of $A_{11}$ to $A_{18}$ may be N.

For example, one or two of $A_{11}$ to $A_{18}$ in Formula 3 may be N.

In one or more embodiments, in Formula 3, one or two of $A_{13}$ to $A_{18}$ may be N.

In one or more embodiments, in Formula 3, one or two of $A_{15}$ to $A_{18}$ may be N.

In one or more embodiments, in Formula 3, $A_{18}$ may be N.

In one or more embodiments, $A_{21}$ to $A_{24}$ in Formula 3 may each be C.

In one or more embodiments, at least one of $A_{21}$ to $A_{24}$ (for example, one or two of $A_{21}$ to $A_{24}$) in Formula 3 may be N.

In Formula 3, $L_3$ may be a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

For example, $L_3$ may be:

a single bond; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with at least one $R_{10a}$. It is to be understood that the foregoing are divalent groups in the case of $L_3$.

In one or more embodiments, $L_3$ in Formula 3 may be:

a single bond; or a benzene group unsubstituted or substituted with at least one $R_{10a}$.

In one or more embodiments, $L_3$ in Formula 3 may be:

a single bond; or a benzene group, a naphthalene group, a dibenzofuran group, or a dibenzothiophene group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a phenyl group, a deuterated phenyl group, a fluorinated phenyl group, a ($C_1$-$C_{20}$ alkyl) phenyl group, a naphthyl group, a pyridinyl group, a furanyl group, a thiophenyl group, a benzofuranyl group, a benzothiophenyl group, a dibenzofuranyl group, a dibenzothiophenyl group, or a combination thereof.

In Formulae 2 and 3, $R_2$, $R_{11}$ to $R_{16}$, $Z_1$ to $Z_3$, $Z_{19}$, and $Z_{20}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$.

$Q_1$ to $Q_9$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, —F, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-Coo alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, —F, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a $C_2$-$C_{60}$ alkylheteroaryl group; a monovalent non-aromatic condensed polycyclic group; or a monovalent non-aromatic condensed heteropolycyclic group.

For example, $R_2$, $R_{11}$ to $R_{16}$, $Z_1$ to $Z_3$, $Z_{19}$, and $Z_{20}$ in Formulae 2 and 3 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a cyclopentyl group, a cyclohexyl group, a cycloheptyl group, a cyclooctyl group, an adamantanyl group, a norbornanyl group (a bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl) cyclohexyl group, a ($C_1$-$C_{20}$ alkyl)cycloheptyl group, a ($C_1$-$C_{20}$ alkyl)cyclooctyl group, a ($C_1$-$C_{20}$ alkyl) adamantanyl group, a ($C_1$-$C_{20}$ alkyl) norbornanyl group, a ($C_1$-$C_{20}$ alkyl) norbornenyl group, a ($C_1$-$C_{20}$ alkyl) cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl) bicyclo[1.1.1]pentyl group, a ($C_1$-$C_{20}$ alkyl) bicyclo[2.1.1]hexyl group, a ($C_1$-$C_{20}$ alkyl) bicyclo [2.2.2]octyl group, a phenyl group, a ($C_1$-$C_{20}$ alkyl) phenyl group, a biphenyl group, a terphenyl group, a naphthyl group, a 1,2,3,4-tetrahydronaphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1] hexyl group, a bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo [2.1.1]hexyl group, a bicyclo[2.2.2]octyl group, a ($C_1$-$C_{20}$ alkyl)cyclopentyl group, a ($C_1$-$C_{20}$ alkyl) cyclohexyl group, a ($C_1$-$C_{20}$ alkyl)cycloheptyl group, a ($C_1$-$C_{20}$ alkyl)cyclooctyl group, a ($C_1$-$C_{20}$ alkyl) adamantanyl group, a ($C_1$-$C_{20}$ alkyl) norbornanyl group, a ($C_1$-$C_{20}$ alkyl) norbornenyl group, a ($C_1$-$C_{20}$ alkyl) cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl) bicyclo[1.1.1]pentyl group, a ($C_1$-$C_{20}$ alkyl) bicyclo[2.1.1]hexyl group, a ($C_1$-$C_{20}$ alkyl) bicyclo [2.2.2]octyl group, a phenyl group, a ($C_1$-$C_{20}$ alkyl) phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, —Si($Q_{33}$)($Q_{34}$)($Q_{35}$), —Ge($Q_{33}$)($Q_{34}$)($Q_{35}$), or a combination thereof; or —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), and $Q_1$ to $Q_9$ and $Q_{33}$ to $Q_{35}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, an neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{20}$ alkyl group, a phenyl group, or a combination thereof.

For example, in one or more embodiments each of $R_2$, $Z_1$ and $Z_2$ may not be hydrogen.

In one or more embodiments, $R_2$, $R_{11}$ to $R_{13}$, $Z_1$ to $Z_3$, $Z_{19}$ and $Z_{20}$ in Formulae 2 and 3 may each independently be:

hydrogen, deuterium, —F, or a cyano group; or a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a phenyl group, a deuterated phenyl group, a fluorinated phenyl group, a ($C_1$-$C_{20}$ alkyl) phenyl group, a naphthyl group, a pyridinyl group, a furanyl group, a thiophenyl group, a benzofuranyl group, a benzothiophenyl group, a dibenzofuranyl group, a dibenzothiophenyl group, —Si($Q_{33}$)($Q_{34}$)($Q_{35}$), —Ge($Q_{33}$)($Q_{34}$)($Q_{35}$), or a combination thereof.

In one or more embodiments, $R_{14}$ to $R_{16}$ in Formula 2 may each independently be a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or a combination thereof.

In one or more embodiments, $R_{14}$ to $R_{16}$ in Formula 2 may each independently be —$CH_3$, —$CH_2CH_3$, —$CD_3$, —$CD_2H$, —$CDH_2$, —$CH_2CD_3$, or —$CD_2CH_3$.

In one or more embodiments, $R_{14}$ to $R_{16}$ in Formula 2 may be the same as each other or different from each other.

In one or more embodiments, $R_{11}$ in Formula 2 is not hydrogen.

In one or more embodiments, $R_{11}$ in Formula 2 is not hydrogen or a methyl group.

In one or more embodiments, $R_{11}$ in Formula 2 is not hydrogen, a methyl group, or a cyano group.

In one or more embodiments, in Formula 2, $R_{11}$ is not hydrogen, and $R_{12}$ and $R_{13}$ are hydrogen.

In one or more embodiments, $R_{11}$ in Formula 2 may be a group including at least two carbons, at least three carbons or at least four carbons.

In one or more embodiments, $R_{11}$ in Formula 2 may be:

a methyl group, substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or a combination thereof; or a $C_2$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a phenyl group, a deuterated phenyl group, a fluorinated phenyl group, a ($C_1$-$C_{20}$ alkyl) phenyl group, a naphthyl group, a pyridinyl group, a furanyl group, a thiophenyl group, a benzofuranyl group, a benzothiophenyl group, a dibenzofuranyl group, a dibenzothiophenyl group, or a combination thereof.

In one or more embodiments, $Z_3$ may in Formula 3 be a $C_6$-$C_{20}$ aryl group substituted with at least one $C_1$-$C_{20}$ alkyl group and at least one $C_6$-$C_{20}$ aryl group at the same time.

In one or more embodiments, Formula 3 may satisfy at least one of Condition A and Condition B as follows:

Condition A:

$L_3$ is a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$; and Condition B:

$Z_3$ is a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In some embodiments, $R_2$, $R_{11}$ to $R_{16}$, $Z_1$ to $Z_3$, $Z_{19}$ and $Z_{20}$ in Formulae 2 and 3 may each independently be hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, —$OCH_3$, —$OCDH_2$, —$OCD_2H$, —$OCD_3$, —$SCH_3$, —$SCDH_2$, —$SCD_2H$, —$SCD_3$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-230, a group represented by one of Formulae 9-201 to 9-230 in which at least one hydrogen is substituted with deuterium, a group represented by one of Formulae 9-201 to 9-230 in which at least one hydrogen is substituted with —F, a group represented by one of Formulae 10-1 to 10-145, a group represented by one of Formulae 10-1 to 10-145 in which at least one hydrogen is substituted with deuterium, a group represented by one of Formulae 10-1 to 10-145 in which at least one hydrogen is substituted with —F, a group represented by one of Formulae 10-201 to 10-354, a group represented by one of Formulae 10-201 to 10-354 in which at least one hydrogen is substituted with deuterium, a group represented by one of Formulae 10-201 to 10-354 in which at least one hydrogen is substituted with —F, —$Si(Q_3)(Q_4)(Q_5)$, or —$Ge(Q_3)(Q_4)(Q_5)$, wherein $Q_3$ to $Q_5$ may respectively be understood by referring to the descriptions of $Q_3$ to $Q_5$ provided herein.

In some embodiments, $R_{11}$ in Formula 2 may be a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-230, a group represented by one of Formulae 9-201 to 9-230 in which at least one hydrogen is substituted with deuterium, a group represented by one of Formulae 9-201 to 9-230 in which at least one hydrogen is substituted with —F, a group represented by one of Formulae 10-1 to 10-145, a group represented by one of Formulae 10-1 to 10-145 in which at least one hydrogen is substituted with deuterium, a group represented by one of Formulae 10-1 to 10-145 in which at least one hydrogen is substituted with —F, a group represented by one of Formulae 10-201 to 10-354, a group represented by one of Formulae 10-201 to 10-354 in which at least one hydrogen is substituted with deuterium, or a group represented by one of Formulae 10-201 to 10-354 in which at least one hydrogen is substituted with —F.

In some embodiments, $Z_3$ in Formula 3 may be a group represented by one of Formulae 10-12 to 10-145, a group represented by one of Formulae 10-12 to 10-145 in which at least one hydrogen is substituted with deuterium, a group represented by one of Formulae 10-12 to 10-145 in which at least one hydrogen is substituted with —F, a group represented by one of Formulae 10-201 to 10-354, a group represented by one of Formulae 10-201 to 10-354 in which at least one hydrogen is substituted with deuterium, or a group represented by one of Formulae 10-201 to 10-354 in which at least one hydrogen is substituted with —F:

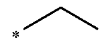
9-1

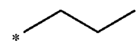
9-2

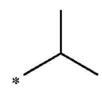
9-3

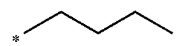
9-4

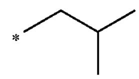
9-5

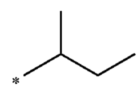
9-6

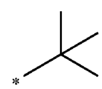
9-7

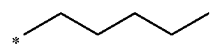
9-8

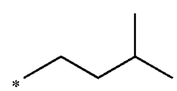
9-9

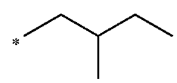
9-10

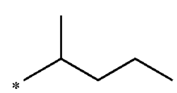
9-11

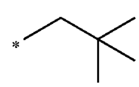
9-12

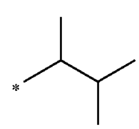
9-13

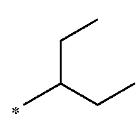
9-14

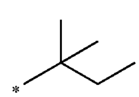
9-15

-continued
9-16
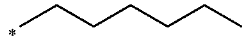
9-17
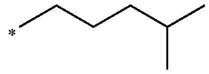
9-18
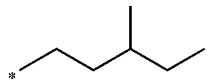
9-19
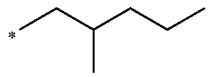
9-20
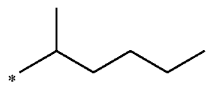
9/21
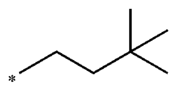
9-22
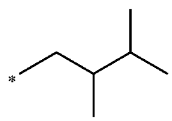
9-23
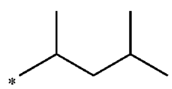
9-24
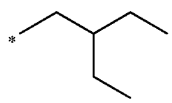
9-25
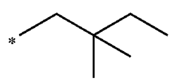
9-26
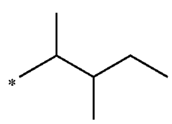
9-27
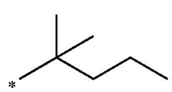
9-28
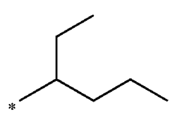
9-29
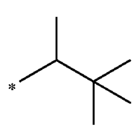
9-30
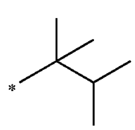
-continued
9-31
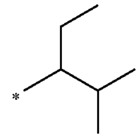
9-32
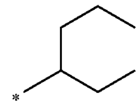
9-33
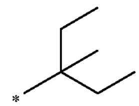
9-34
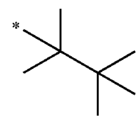
9-35
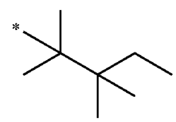
9-36
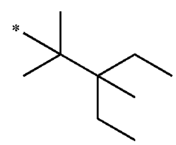
9-37
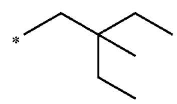
9-38
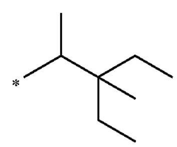
9-39
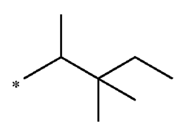
9-201
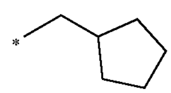
9-202
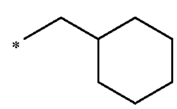
9-203
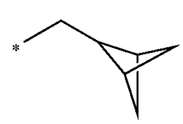

-continued
9-204
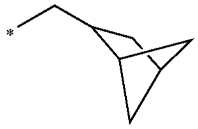
9-205
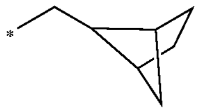
9-206
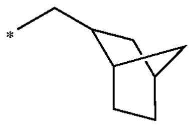
9-207
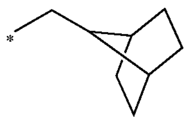
9-208
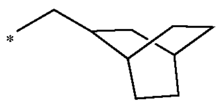
9-209
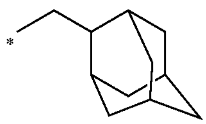
9-210
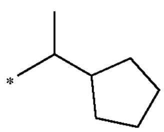
9-211
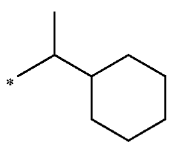
9-212
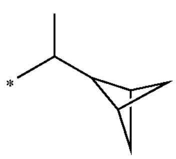
9-213
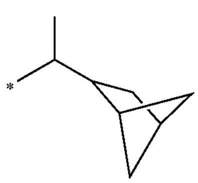
9-214
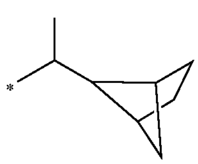
-continued
9-215
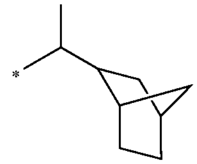
9-216
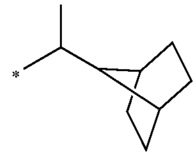
9-217
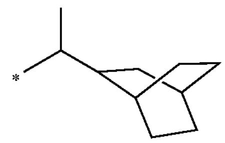
9-218
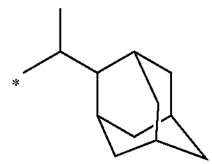
9-219
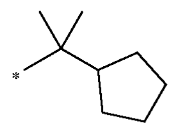
9-220
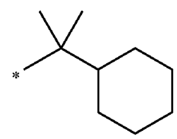
9-221
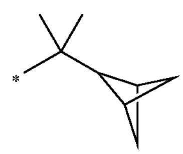
9-222
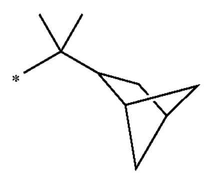
9-226
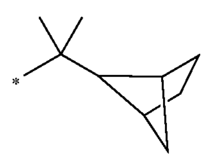
9-224
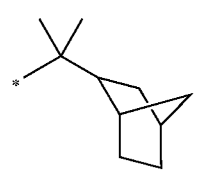

-continued
9-225
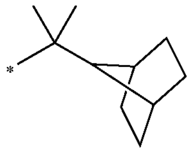
9-226
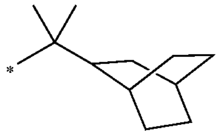
9-227
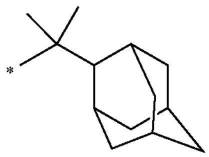
9-228
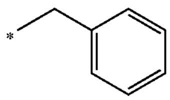
9-229
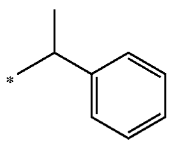
9-230
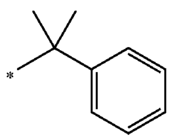
10-1
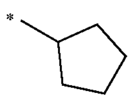
10-2
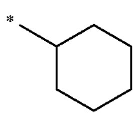
10-3
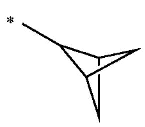
10-4
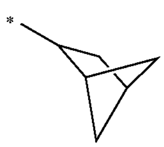
10-5
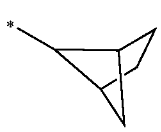
-continued
10-6
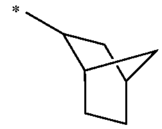
10-7
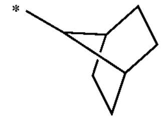
10-8
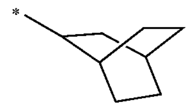
10-9
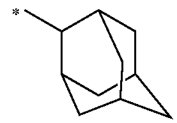
10-10
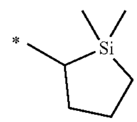
10-11
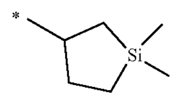
10-12
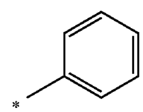
10-13
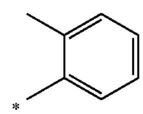
10-14
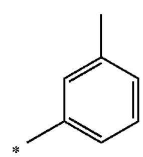
10-15
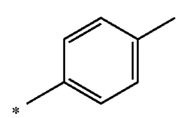
10-16
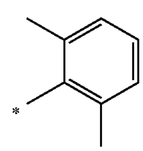
10-17
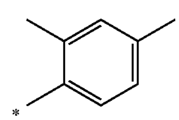

10-18
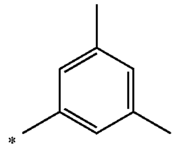
10-19
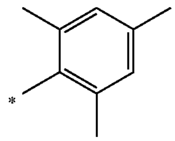
10-20
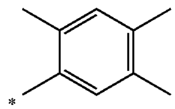
10-21
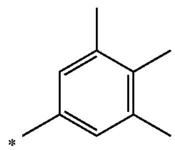
10-22
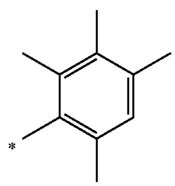
10-23
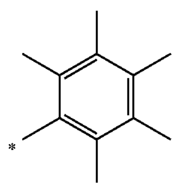
10-24
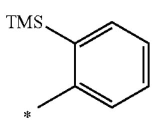
10-25
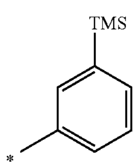
10-26
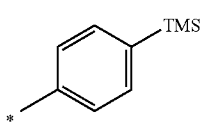
10-27
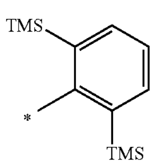
10-28
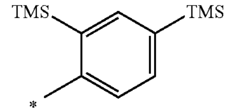
10-29
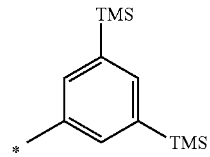
10-30
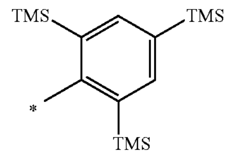
10-31
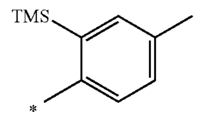
10-32
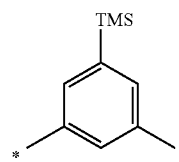
10-33
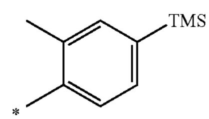
10-34
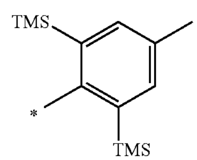
10-35
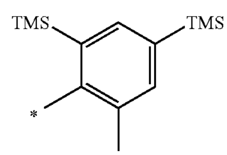
10-36
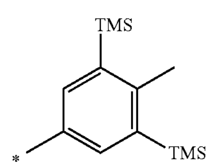
10-37
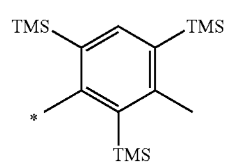

-continued
10-38
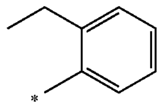
10-39
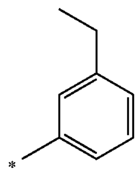
10-40
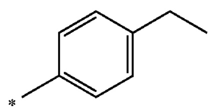
10-41
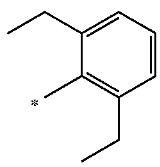
10-42
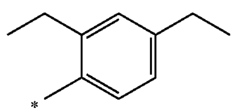
10-43
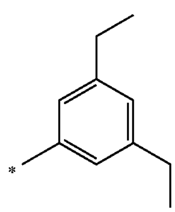
10-44
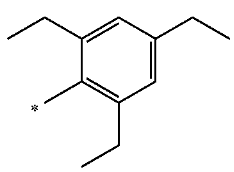
10-45
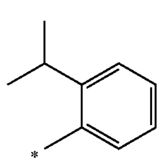
10-46
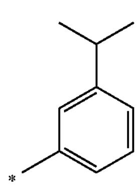
-continued
10-47
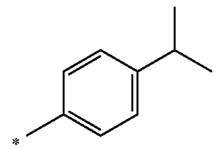
10-48
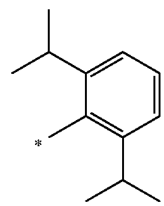
10-49
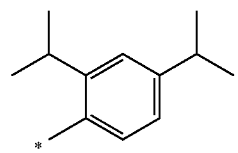
10-50
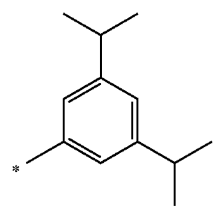
10-51
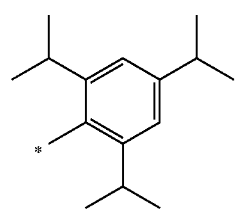
10-52
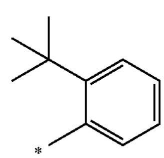
10-53
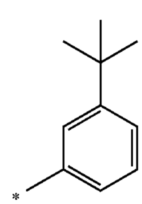
10-54
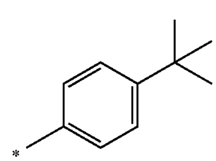

-continued
10-55
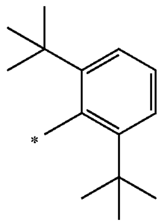
10-56
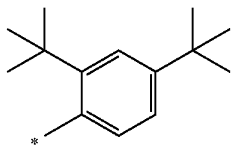
10-57
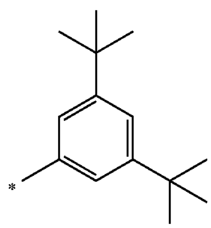
10-58
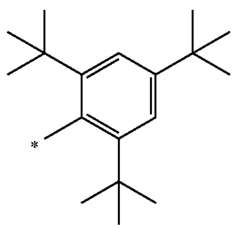
10-59
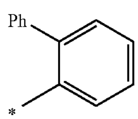
10-60
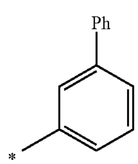
10-61
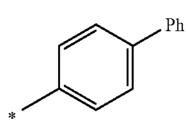
10-62
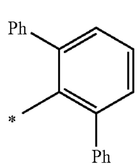
-continued
10-63
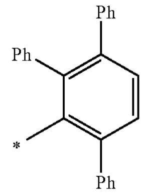
10-64
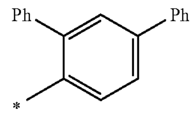
10-65
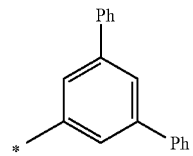
10-66
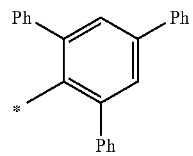
10-67
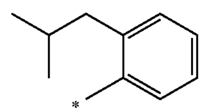
10-68
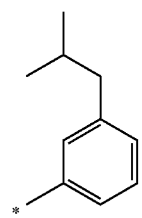
10-69
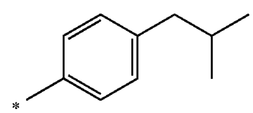
10-70
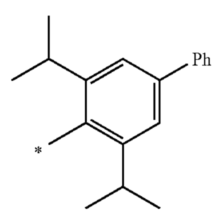
10-71
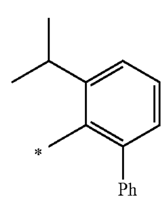

-continued
10-72
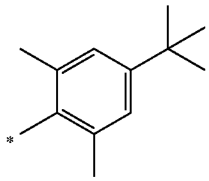
10-73
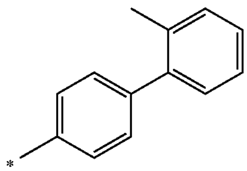
10-74
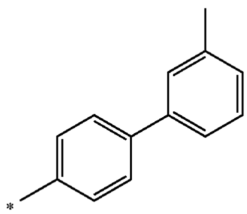
10-75
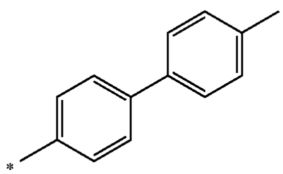
10-76
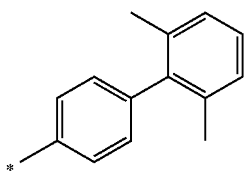
10-77
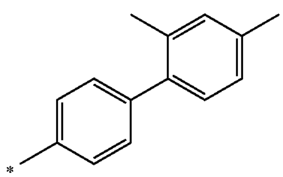
10-78
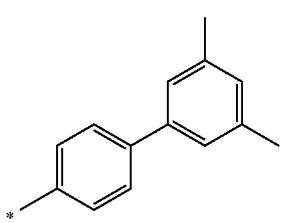
10-79
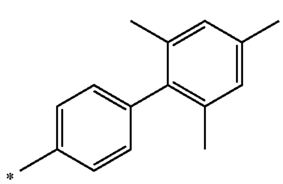
-continued
10-80
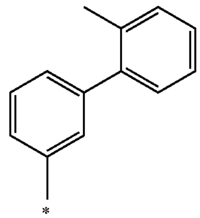
10-81
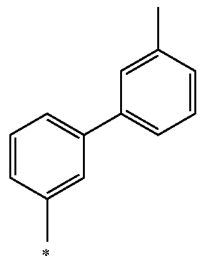
10-82
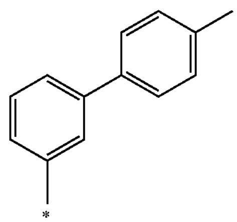
10-83
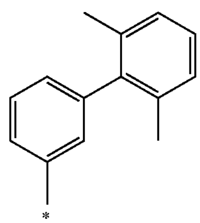
10-84
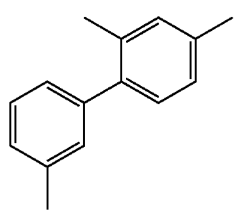
10-85
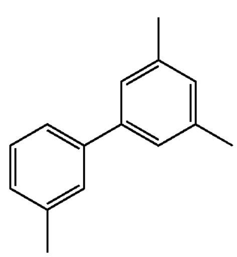

-continued
10-86
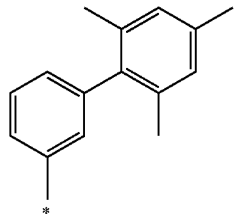
10-87
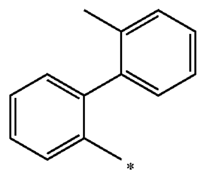
10-88
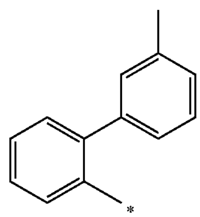
10-89
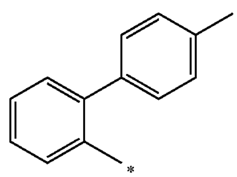
10-90
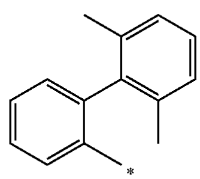
10-91
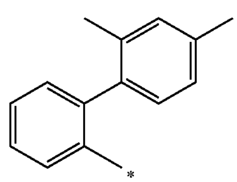
10-92
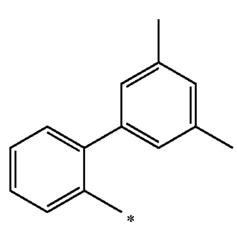
-continued
10-93
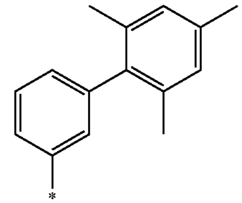
10-94
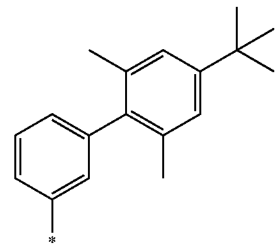
10-95
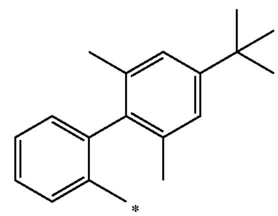
10-96
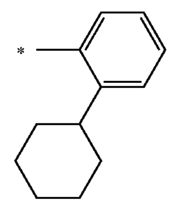
10-97
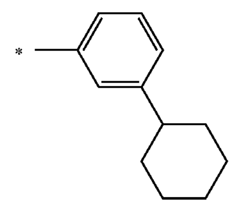
10-98
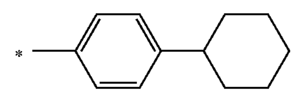
10-99
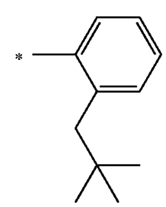
10-100
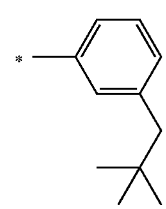

-continued
10-101
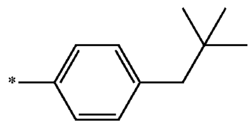
10-102
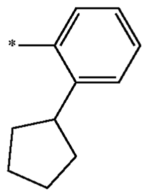
10-103
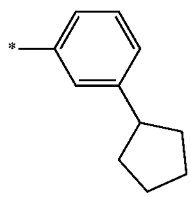
10-104
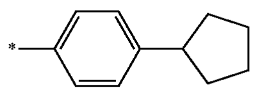
10-105
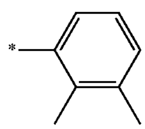
10-106
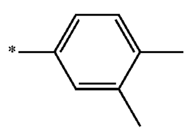
10-107
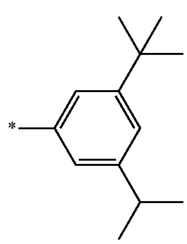
10-108
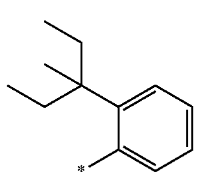
10-109
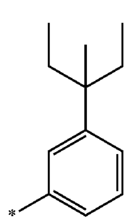
10-110
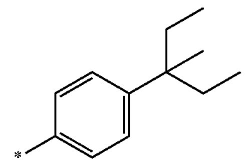
10-111
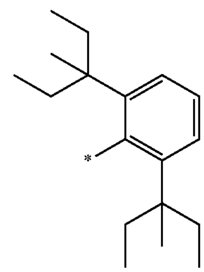
10-112
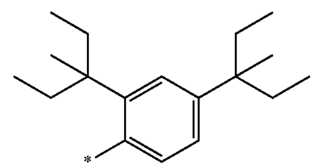
10-113
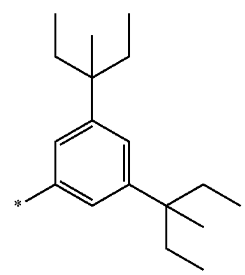
10-114
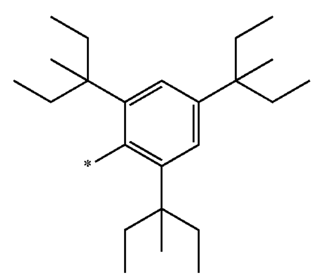
10-115
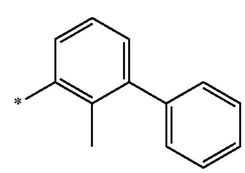
10-116
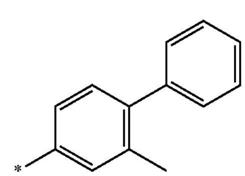

-continued
10-117
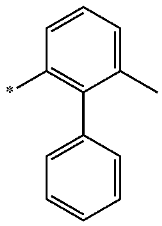
10-118
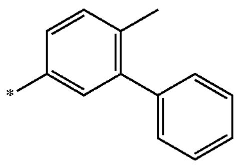
10-119
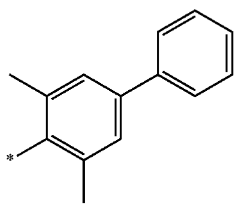
10-120
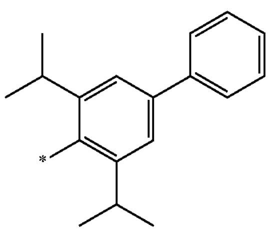
10-121
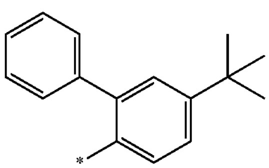
10-122
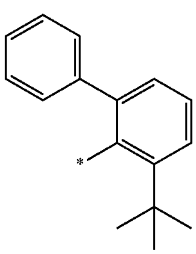
10-123
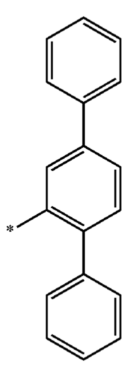
-continued
10-124
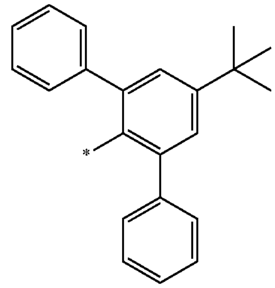
10-125
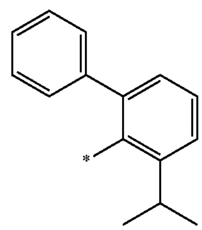
10-126
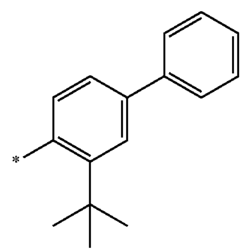
10-127
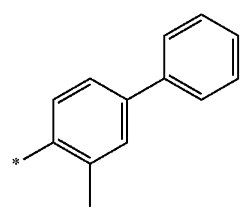
10-128
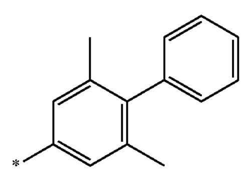
10-129
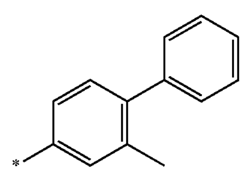
10-130
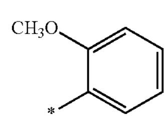
10-131
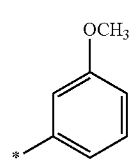

-continued
10-132
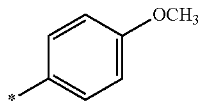
10-133
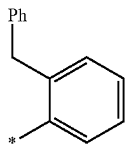
10-134
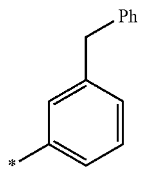
10-135
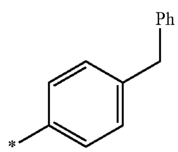
10-136
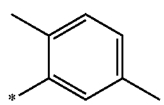
10-137
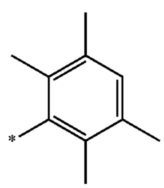
10-138
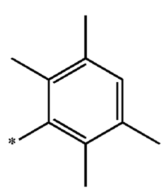
10-139
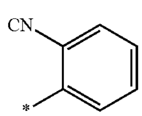
10-140
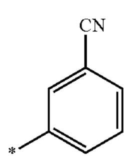
10-141
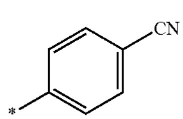
-continued
10-142
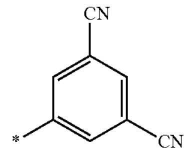
10-143
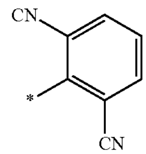
10-144
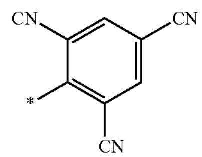
10-145
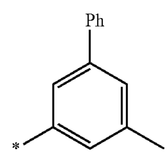
10-201
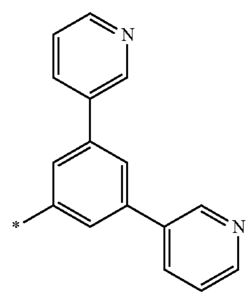
10-202
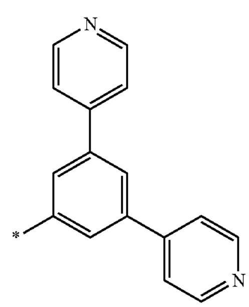
10-203
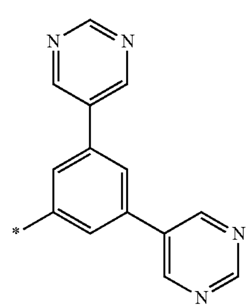

-continued
10-204
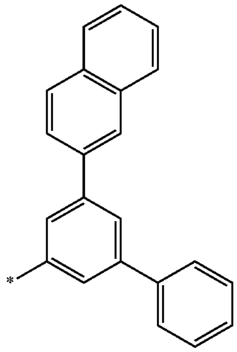
10-205
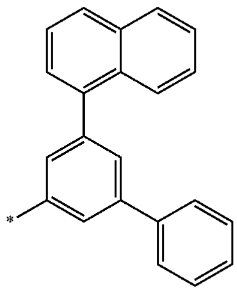
10-206
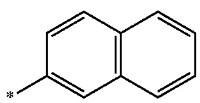
10-207
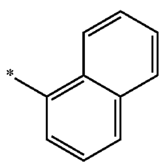
10-208
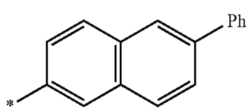
10-209
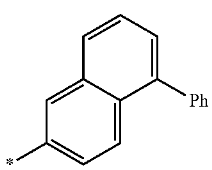
10-210
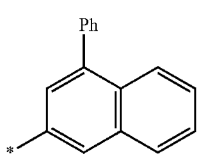
10-211
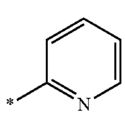
10-212
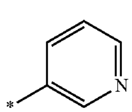
-continued
10-213
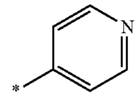
10-214
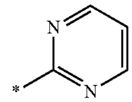
10-215
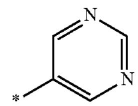
10-216
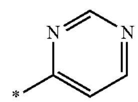
10-217
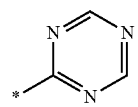
10-218
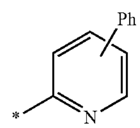
10-219
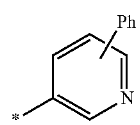
10-220
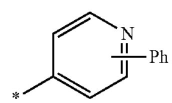
10-221
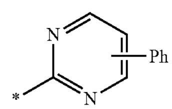
10-222
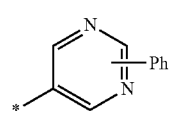
10-223
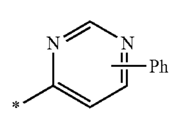
10-224
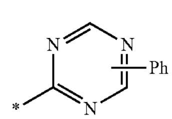
10-225
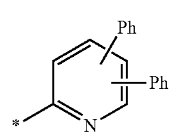

-continued
10-226
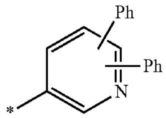
10-227
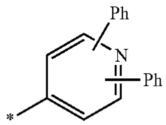
10-228
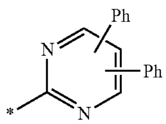
10-229
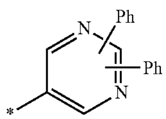
10-230
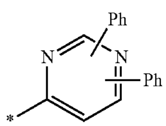
10-231
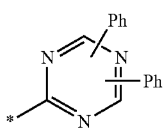
10-232
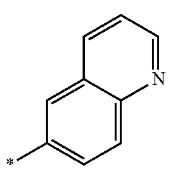
10-233
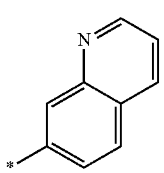
10-234
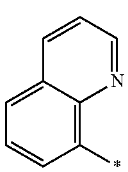
10-235
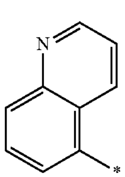
-continued
10-236
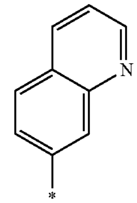
10-237
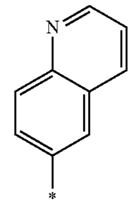
10-238
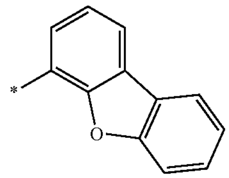
10-239
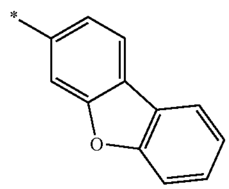
10-240
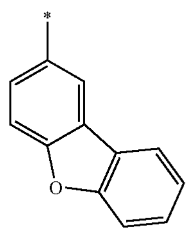
10-241
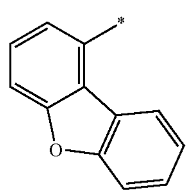
10-242
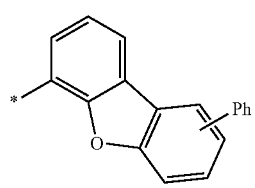
10-243
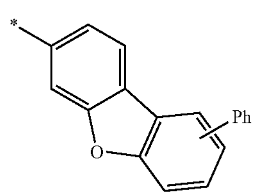

-continued
10-244
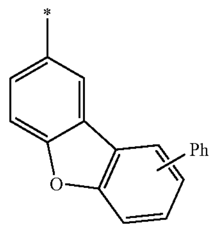
10-245
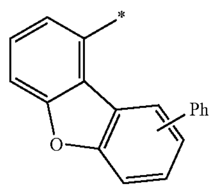
10-246
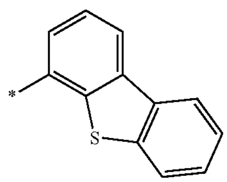
10-247
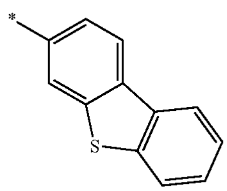
10-248
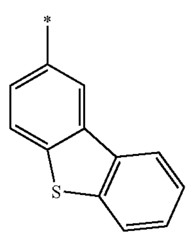
10-249
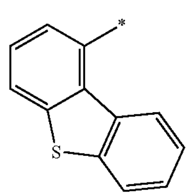
10-250
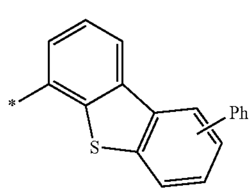
10-251
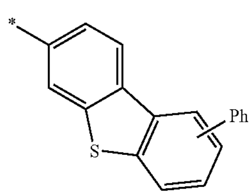
-continued
10-252
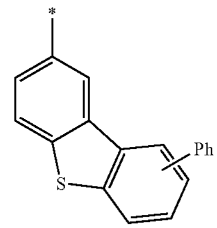
10-253
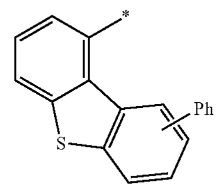
10-254
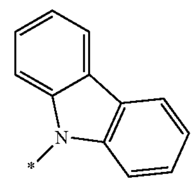
10-255
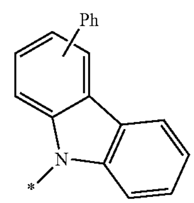
10-256
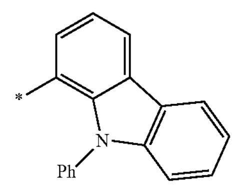
10-257
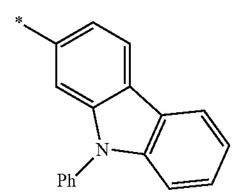
10-258
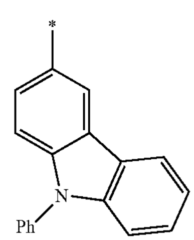
10-259
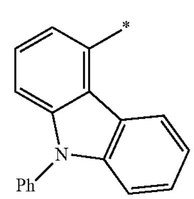

-continued
10-260
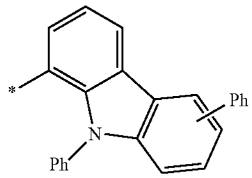
10-261
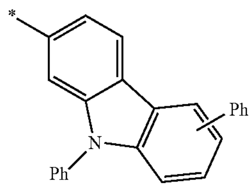
10-262
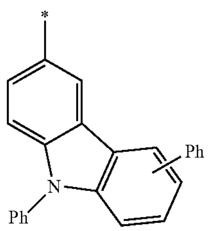
10-263
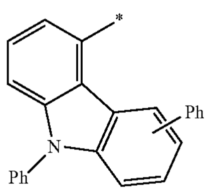
10-264
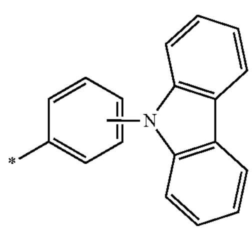
10-265
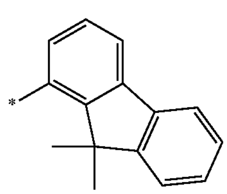
10-266
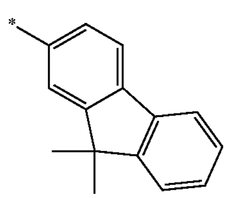
-continued
10-267
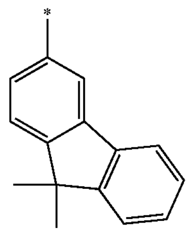
10-268
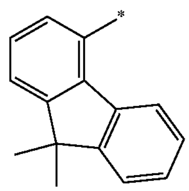
10-269
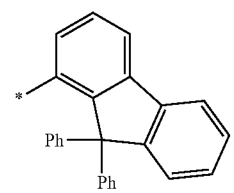
10-270
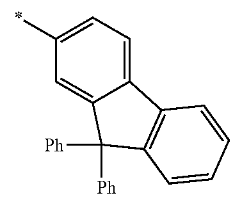
10-271
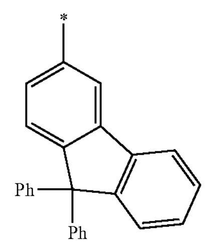
10-272
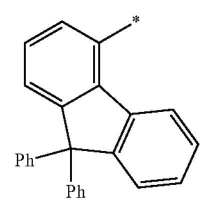
10-273
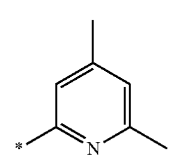
10-274
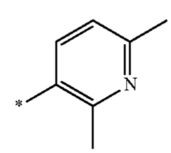

-continued
10-275
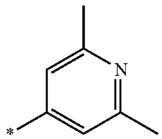
10-276
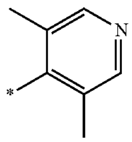
10-277
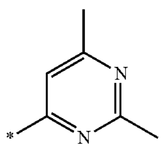
10-278
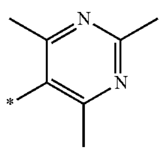
10-279
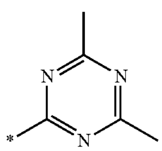
10-280
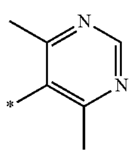
10-281
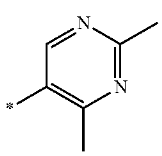
10-282
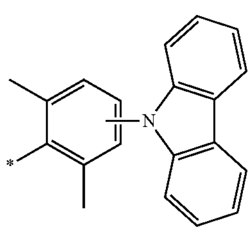
10-283
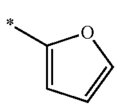
10-284
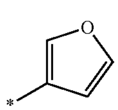
10-285
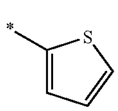
-continued
10-286
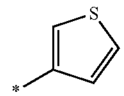
10-287
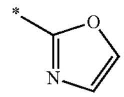
10-288
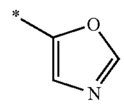
10-289
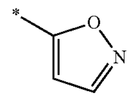
10-290
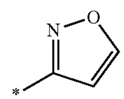
10-291
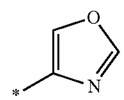
10-292
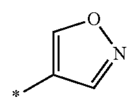
10-293
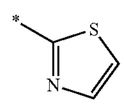
10-294
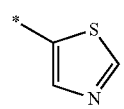
10-295
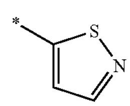
10-296
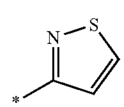
10-297
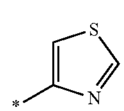
10-298
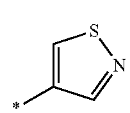
10-299
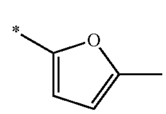
10-300
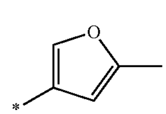

-continued
10-301
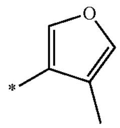
10-302
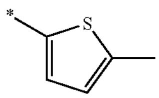
10-303
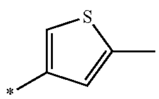
10-304
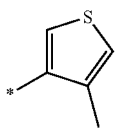
10-305
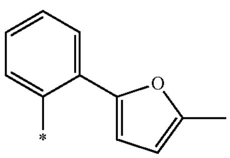
10-306
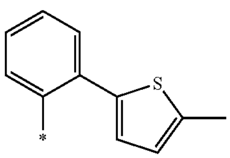
10-307
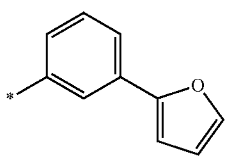
10-308
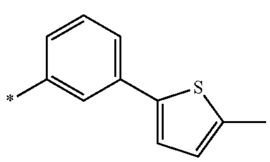
10-309
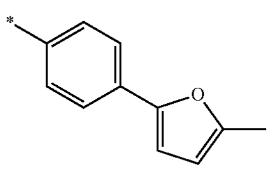
10-310
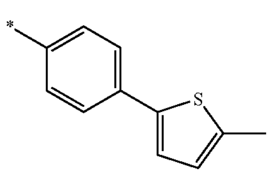
-continued
10-311
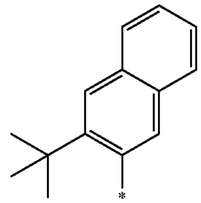
10-312
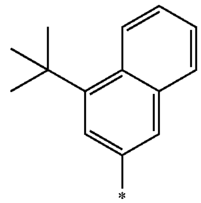
10-313
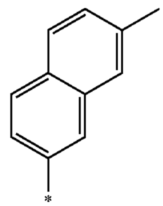
10-314
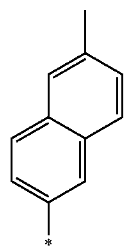
10-315
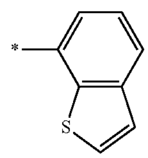
10-316
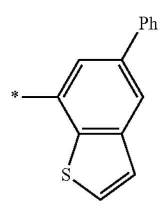
10-317
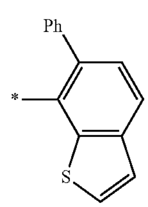
10-318
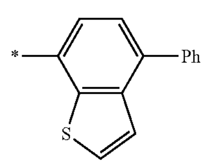

-continued
10-319
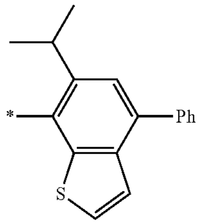
10-320
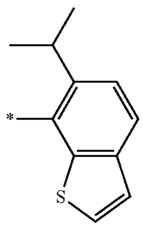
10-321
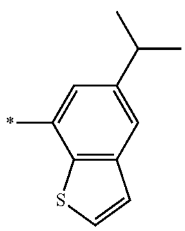
10-322
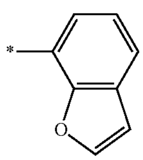
10-323
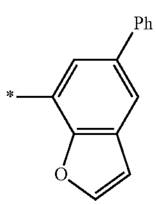
10-324
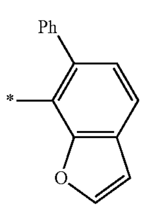
10-325
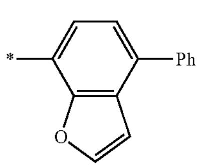
-continued
10-326
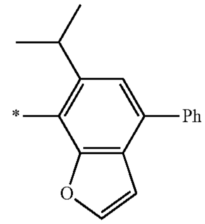
10-327
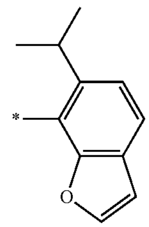
10-328
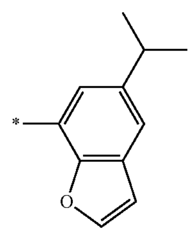
10-329
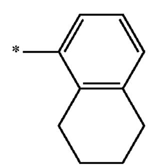
10-330
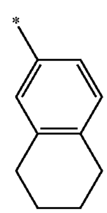
10-331
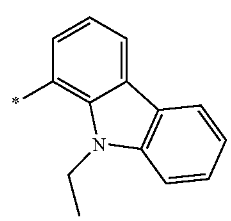
10-332
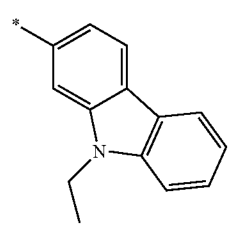

-continued
10-333
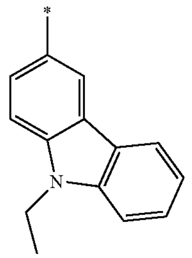
10-334
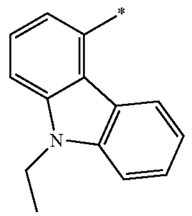
10-335
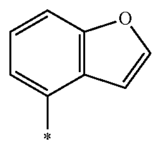
10-336
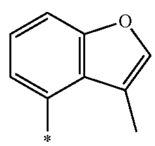
10-337
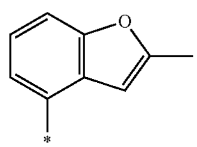
10-338
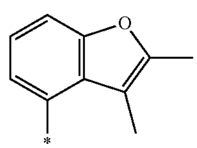
10-339
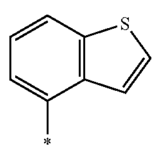
10-340
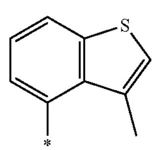
10-341
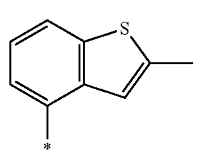
-continued
10-342
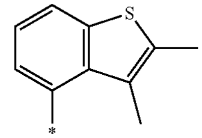
10-343
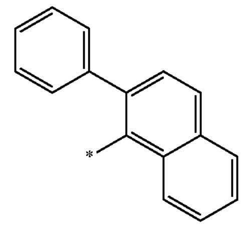
10-344
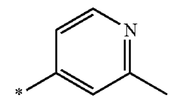
10-345
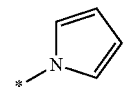
10-346
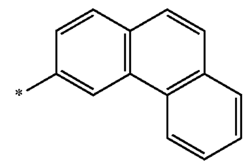
10-347
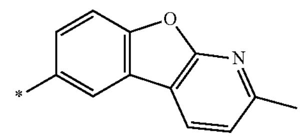
10-348
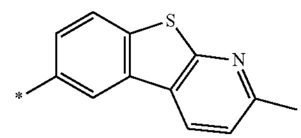
10-349
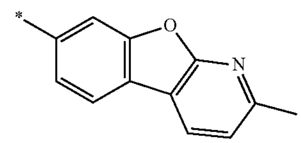
10-350
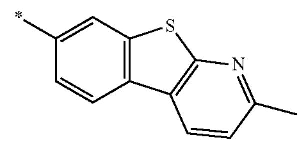
10-351
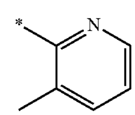
10-352
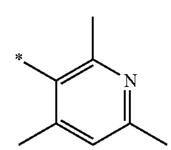

-continued 10-353

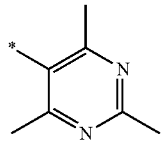

10-354

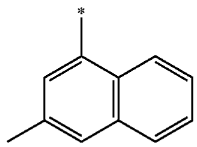

In Formulae 9-1 to 9-39, 9-201 to 9-230, 10-1 to 10-145, and 10-201 to 10-354, * indicates a binding site to an adjacent atom, "Ph" represents a phenyl group, "TMS" represents a trimethylsilyl group, "TMG" represents a trimethylgermyl group and "OMe" represents a methoxy group.

The "group represented by one of Formulae 9-1 to 9-39 in which at least one hydrogen is substituted with deuterium" and the "group represented by one of Formulae 9-201 to 9-230 in which at least one hydrogen is substituted with deuterium" may each be, for example, a group represented by one of Formulae 9-501 to 9-514 and 9-601 to 9-637:

9-501

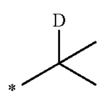

9-502

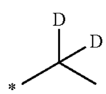

9-503

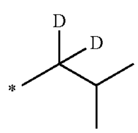

9-504

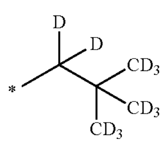

9-505

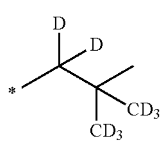

9-506

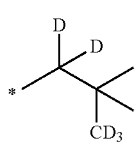

9-507

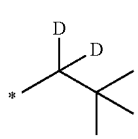

-continued 9-508

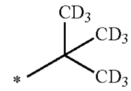

9-509

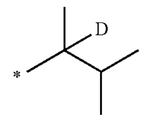

9-510

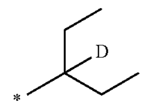

9-511

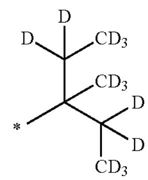

9-512

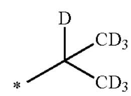

9-513

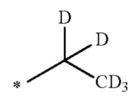

9-514

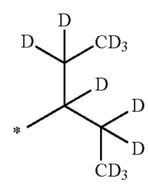

9-601

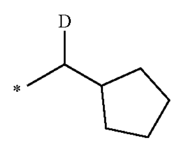

9-602

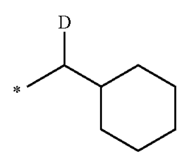

9-603

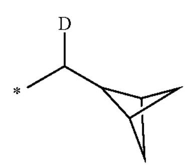

9-604

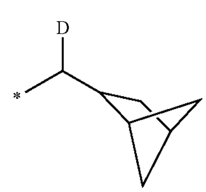

-continued
9-605
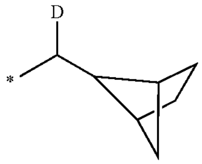
9-606
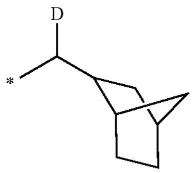
9-607
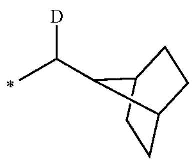
9-608
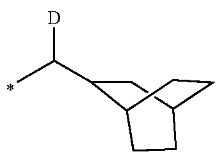
9-609
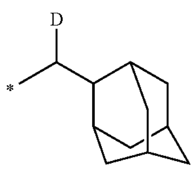
9-610
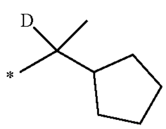
9-611
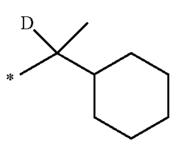
9-612
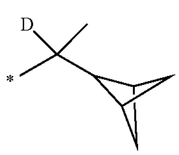
9-613
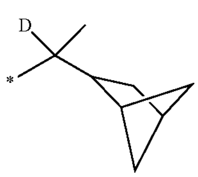
9-614
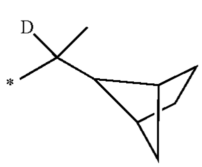
-continued
9-615
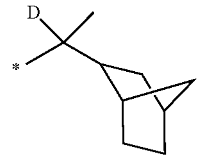
9-616
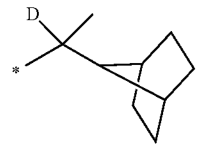
9-617
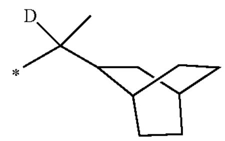
9-618
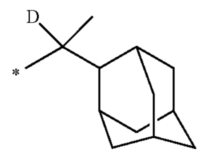
9-619
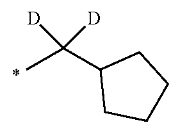
9-620
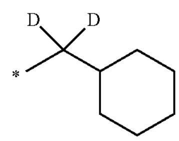
9-621
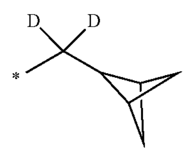
9-622
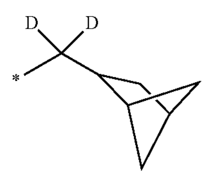
9-623
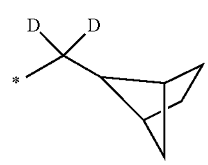
9-624
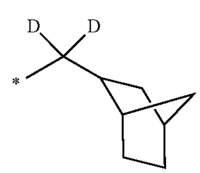

-continued
9-625
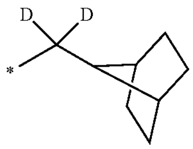
9-626
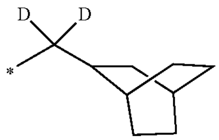
9-627
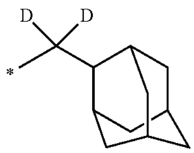
9-628
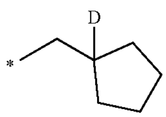
9-629
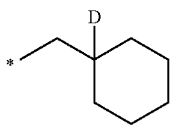
9-630
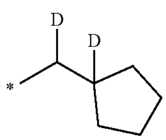
9-631
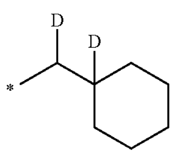
9-632
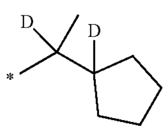
9-633
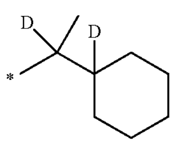
9-634
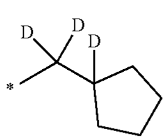
9-635
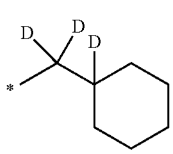
-continued
9-636
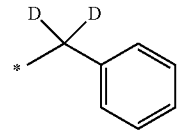
9-637
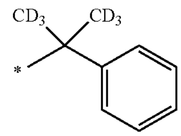
The "group represented by one of Formulae 9-1 to 9-39 in which at least one hydrogen is substituted with —F" and the "group represented by one of Formulae 9-201 to 9-230 in which at least one hydrogen is substituted with —F" may each be, for example, a group represented by one of Formulae 9-701 to 9-710:
9-701
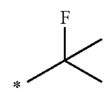
9-702
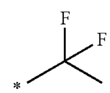
9-703
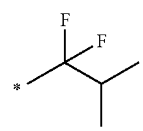
9-704
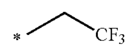
9-705
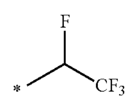
9-706
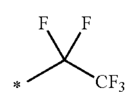
9-707
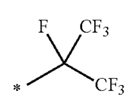
9-708
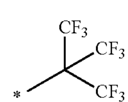
9-709
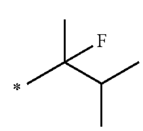

9-710
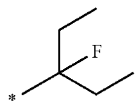
The "group represented by one of Formulae 10-1 to 10-145 in which at least one hydrogen is substituted with a deuterium" and the "group represented by one of Formulae 10-201 to 10-354 in which at least one hydrogen is substituted with deuterium" may each be, for example, a group represented by one of Formulae 10-501 to 10-553:
10-501
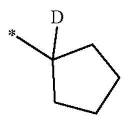
10-502
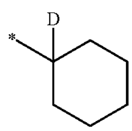
10-503
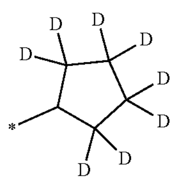
10-504
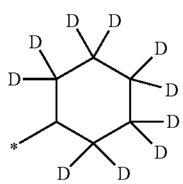
10-505
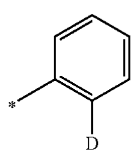
10-506
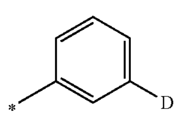
10-507
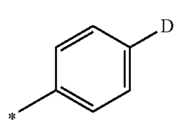
10-508
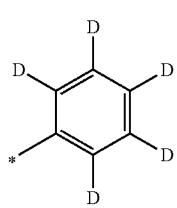
10-509
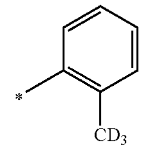
10-510
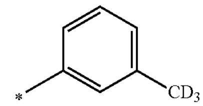
10-511
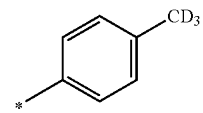
10-512
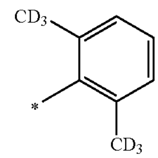
10-513
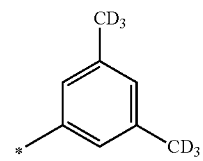
10-514
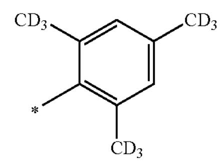
10-515
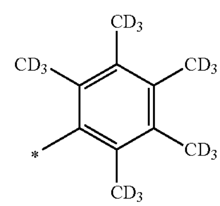
10-516
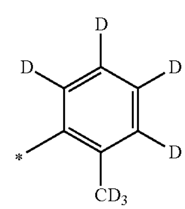
10-517
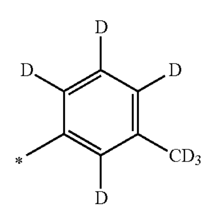

-continued
10-518
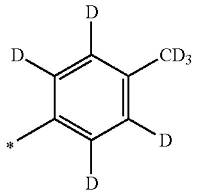
10-519
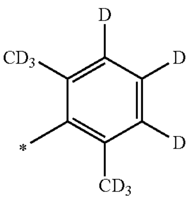
10-520
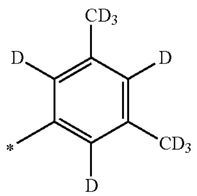
10-521
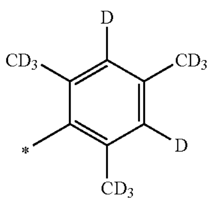
10-522
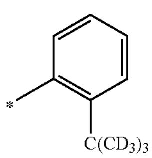
10-523
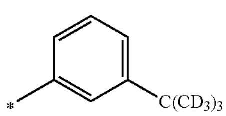
10-524
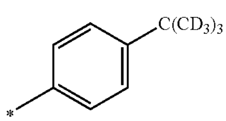
10-525
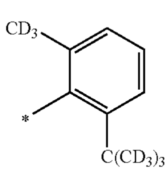
10-526
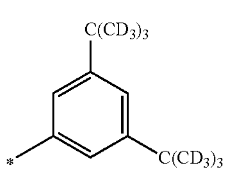
-continued
10-527
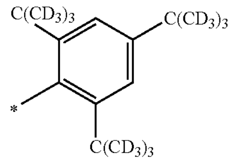
10-528
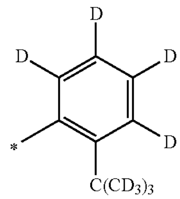
10-529
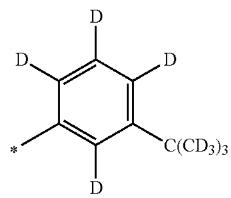
10-530
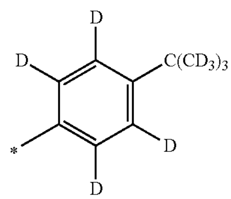
10-531
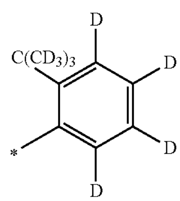
10-532
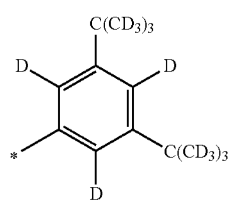
10-533
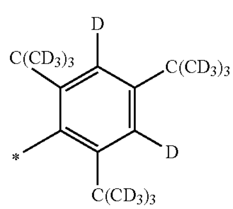
10-534
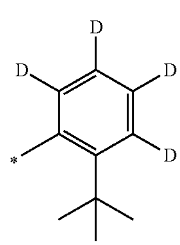

-continued
10-535
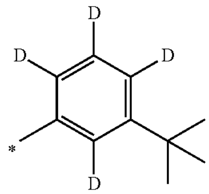
10-536
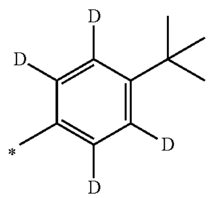
10-537
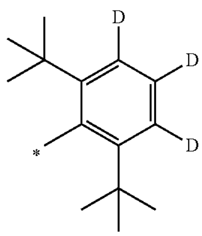
10-538
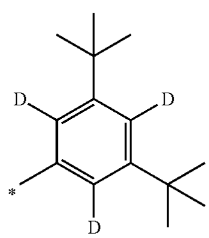
10-540
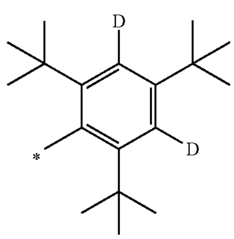
10-541
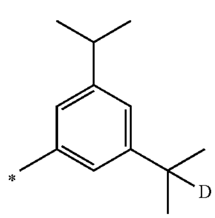
10-542
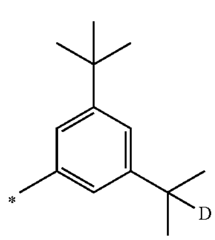
-continued
10-543
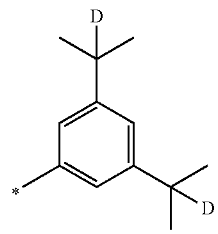
10-544
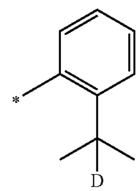
10-545
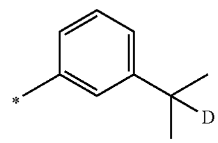
10-546
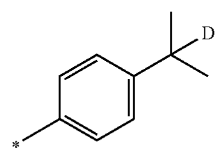
10-547
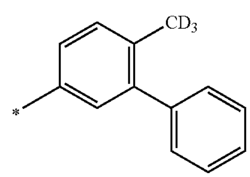
10-548
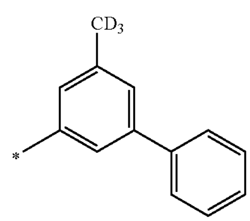
10-549
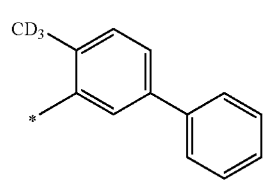
10-550
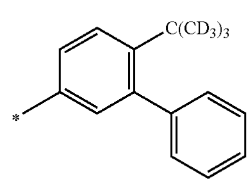

-continued
10-551
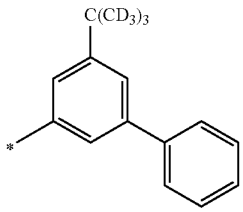
10-552
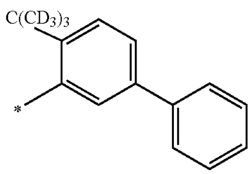
10-553
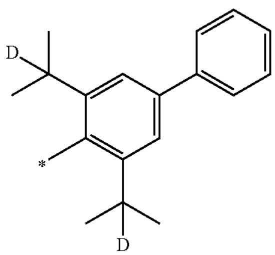
The "group represented by one of Formulae 10-1 to 10-145 in which at least one hydrogen is substituted with —F" and the "group represented by one of Formulae 10-201 to 10-354 in which at least one hydrogen is substituted with —F" may each be, for example, a group represented by one of Formulae 10-601 to 10-636:
10-601
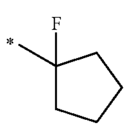
10-602
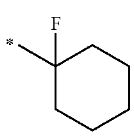
10-603
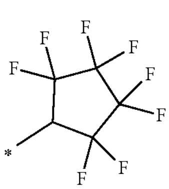
10-604
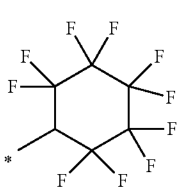
-continued
10-605
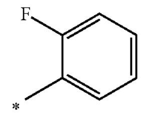
10-606
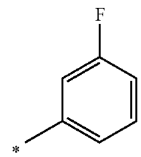
10-607
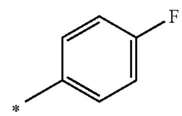
10-608
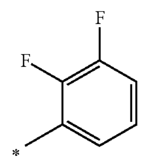
10-609
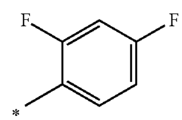
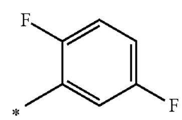
10-611
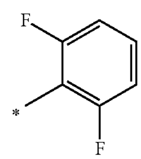
10-612
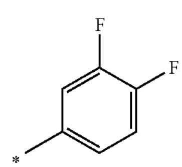
10-613
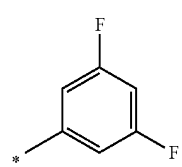
10-614
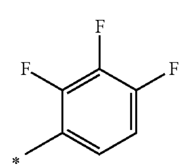

10-615
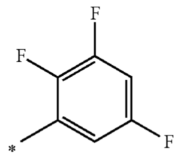
10-616
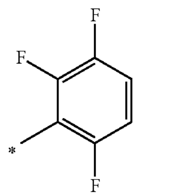
10-617
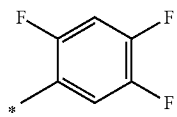
10-618
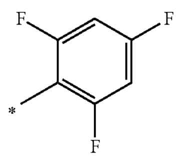
10-619
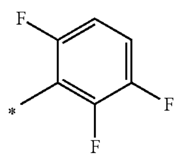
10-620
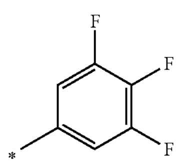
10-621
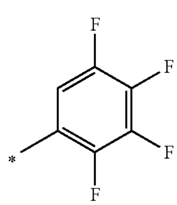
10-622
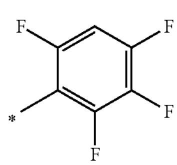
10-623
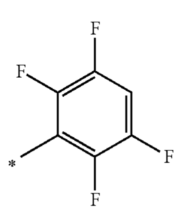
10-624
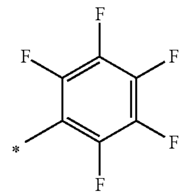
10-625
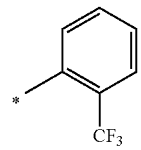
10-626
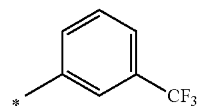
10-627
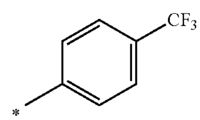
10-628
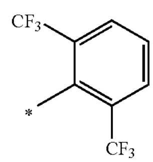
10-629
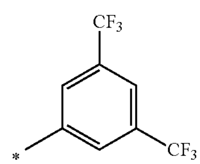
10-630
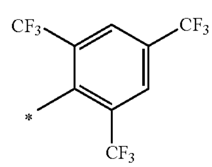
10-631
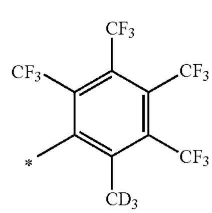
10-632
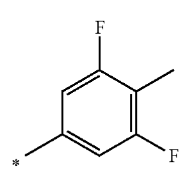

-continued 10-633

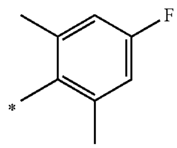

10-634

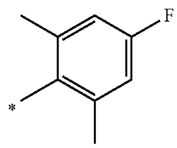

10-635

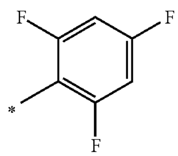

10-636

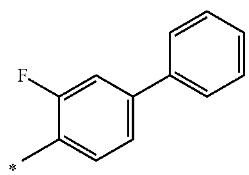

In Formulae 2 and 3, a2, b1, and b2 indicate the number of $R_2$ groups, the number of $Z_1$ groups, and the number of $Z_2$ groups, respectively, wherein a2 may be an integer from 0 to 20 (for example, an integer from 0 to 10), b1 may be an integer 0 to 5, and b2 may be an integer from 0 to 4. When a2 is 2 or more, two or more $R_2$ groups may be identical to or different from each other, when b1 is 2 or more, two or more $Z_1$ groups may be identical to or different from each other, and when b2 is 2 or more, two or more $Z_2$ groups may be identical to or different from each other.

In one or more embodiments, in Formula 3, $Z_1$ is not hydrogen and b1 may be an integer from 1 to 5.

In one or more embodiments, $Z_2$ in Formula 3 is not hydrogen and b2 may be an integer from 1 to 4.

In one or more embodiments, the organometallic compound represented by Formula 1 may include deuterium, —F, or a combination thereof.

In one or more embodiments, the organometallic compound represented by Formula 1 may satisfy at least one of Condition 1 to Condition 12:

Condition 1

$R_{11}$ is not hydrogen, and includes at least one deuterium.

Condition 2

At least one of $R_{11}$ to $R_{13}$ is not hydrogen, and includes at least one deuterium.

Condition 3

At least one of $R_2$ groups in the number of a2 is not hydrogen, and includes at least one deuterium.

Condition 4

$L_3$ is not a single bond, and includes at least one deuterium.

Condition 5

$Z_3$ is not hydrogen, and includes at least one deuterium.

Condition 6

At least one of $Z_1$ group in the number of b1 is not hydrogen, and includes at least one deuterium.

Condition 7

$R_{11}$ is not hydrogen and includes at least one fluoro group (—F).

Condition 8 at least one of $R_{11}$ to $R_{13}$ is not hydrogen and includes at least one fluoro group.

Condition 9 at least one of $R_2$ group in the number of a2 is not hydrogen and includes at least one fluoro group.

Condition 10

$L_3$ is not a single bond and may include at least one fluoro group.

Condition 11

$Z_3$ is not hydrogen and includes at least one fluoro group.

Condition 12 at least one of $Z_1$ group in the number of b1 is not hydrogen and includes at least one fluoro group.

In Formulae 2 and 3, i) $R_{11}$ and $R_{12}$ may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, ii) two or more of a plurality of $R_2$ groups may optionally be linked to form a $C_5$-$C_{30}$ carbocyclic group that is unsubstituted or substituted with at least one $R_{10a}$, or two or more of a plurality of $R_2$ groups may optionally be linked to form a $C_1$-$C_{30}$ heterocyclic group that is unsubstituted or substituted with at least one $R_{10a}$, iii) two or more of a plurality of $Z_1$ groups may optionally be linked to each other to form a $C_5$-$C_{30}$ carbocyclic group that is unsubstituted or substituted with at least one $R_{10a}$, or two or more of a plurality of $Z_1$ groups may optionally be linked to each other to form a $C_1$-$C_{30}$ heterocyclic group that is unsubstituted or substituted with at least one $R_{10a}$, or iv) two or more of a plurality of $Z_2$ groups may optionally be linked to each other to form a $C_5$-$C_{30}$ carbocyclic group that is unsubstituted or substituted with at least one $R_{10a}$, or two or more of a plurality of $Z_2$ groups may optionally be linked to each other to form a $C_1$-$C_{30}$ heterocyclic group that is unsubstituted or substituted with at least one $R_{10a}$. $R_{10a}$ may be understood by referring to the description provided in connection with $Z_1$. For example, $R_{10a}$ may be understood by referring to the description provided in connection with $Z_1$, but may not be hydrogen.

In Formulae 2 and 3, * and *' each indicate a binding site to a neighboring atom.

In one or more embodiments, a group represented by:

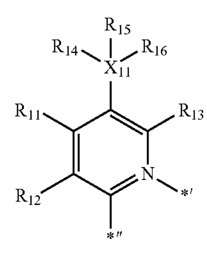

in Formula 2 may be a group represented by Formula 2-1 or 2-2:

2-1

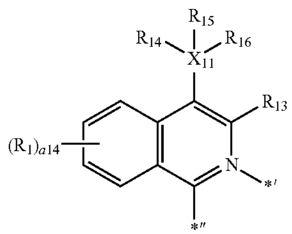

2-2

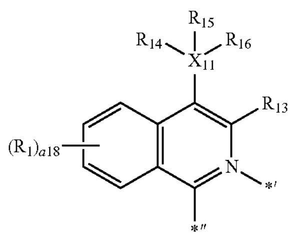

In Formulae 2-1 and 2-2, $X_{11}$, and $R_{13}$ to $R_{16}$ may each be understood by referring to the corresponding descriptions thereof provided herein, $R_1$ may be understood by referring to the description provided in connection with $R_{12}$, a14 may be an integer from 0 to 4, a18 may be an integer from 0 to 8,

*' indicates a binding site to M in Formula 1, and

*" indicates a binding site to a neighboring atom in Formula 2.

In one or more embodiments, a group represented by:

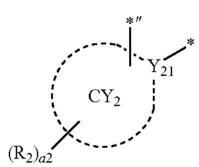

in Formula 2 may be a group represented by one of Formulae CY2-1 to CY2-33:

CY2-1

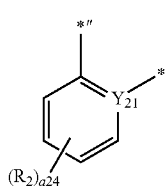

CY2-2

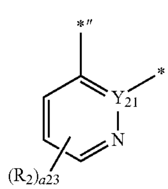

-continued

CY2-3

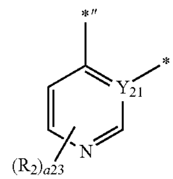

CY2-4

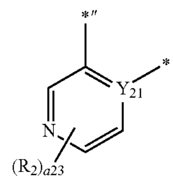

CY2-5

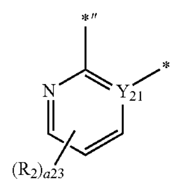

CY2-6

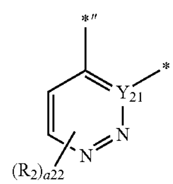

CY2-7

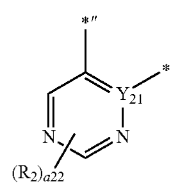

CY2-8

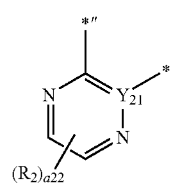

CY2-9

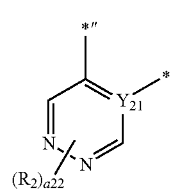

CY2-10

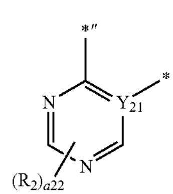

-continued
CY2-11
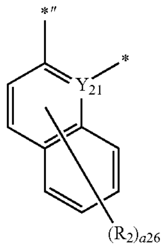
CY2-12
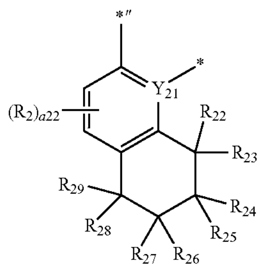
CY2-13
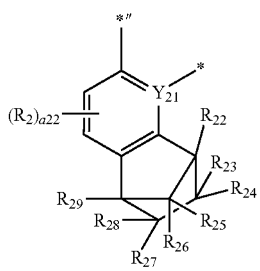
CY2-14
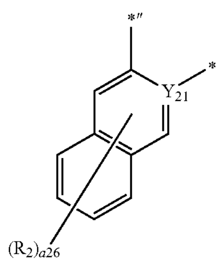
CY2-15
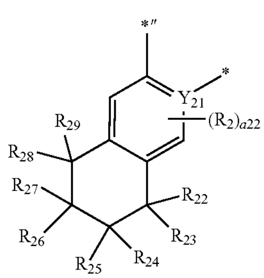
CY2-16
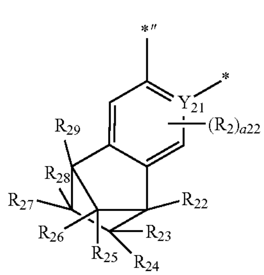
-continued
CY2-17
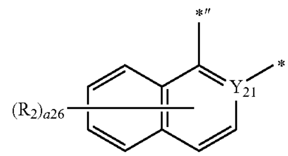
CY2-18
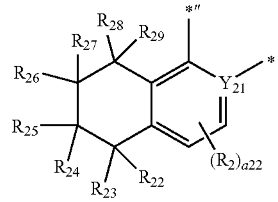
CY2-19
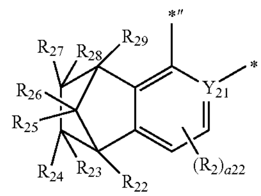
CY2-20
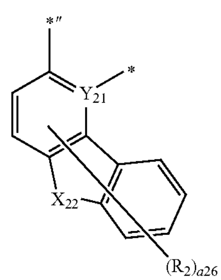
CY2-21
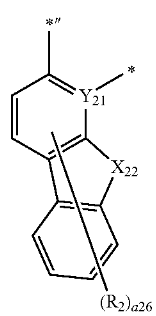
CY2-22
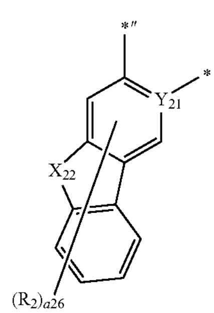

-continued

CY2-23

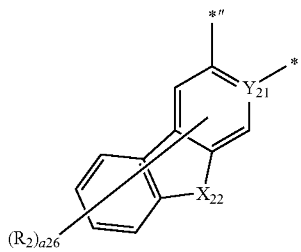

CY2-24

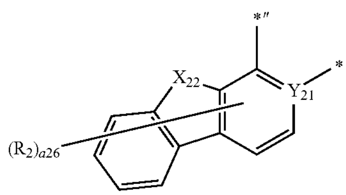

CY2-25

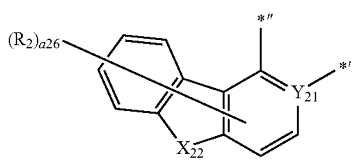

CY2-26

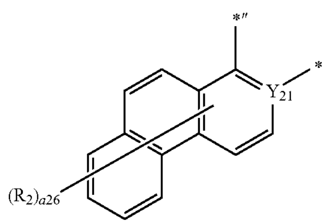

CY2-27

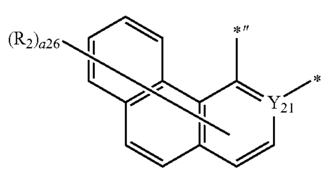

CY2-28

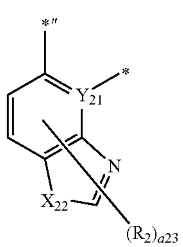

CY2-29

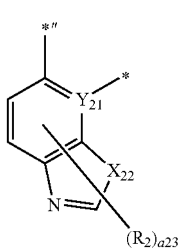

-continued

CY2-30

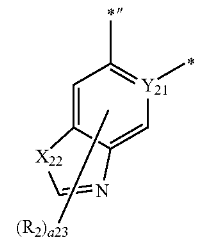

CY2-31

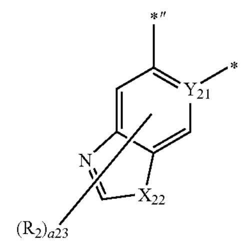

CY2-32

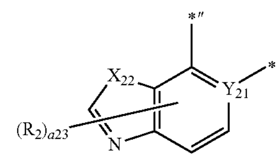

CY2-33

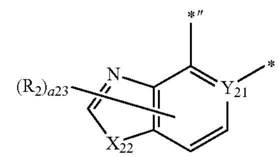

In Formulae CY2-1 to CY2-33, $Y_{21}$ and $R_2$ may each be understood by referring to the descriptions thereof provided herein, $X_{22}$ may be $C(R_{22})(R_{23})$, $N(R_{22})$, O, S, or $Si(R_{22})(R_{23})$, $R_{22}$ to $R_{29}$ may each independently a substituent group understood by referring to the description provided in connection with $R_2$, a28 may be an integer from 0 to 8, a26 may be an integer from 0 to 6, a24 may be an integer from 0 to 4, a23 may be an integer from 0 to 3, a22 may be an integer from 0 to 2,

*" indicates a binding site to a neighboring atom in Formula 2, and

* indicates a binding site to M in Formula 1.

In one or more embodiments, a group represented by:

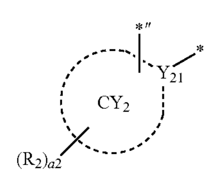

in Formula 2 may be a group represented by one of Formulae CY2 (1) to CY2 (56) or a group represented by one of Formulae CY2-11 to CY2-33:

-continued
CY2(1)
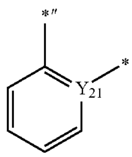
CY2(2)
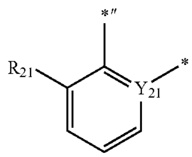
CY2(3)
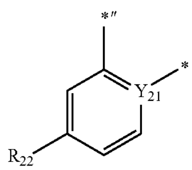
CY2(4)
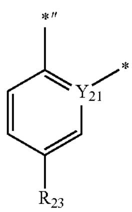
CY2(5)
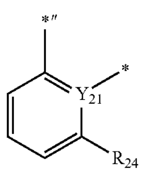
CY2(6)
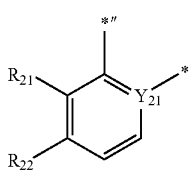
CY2(7)
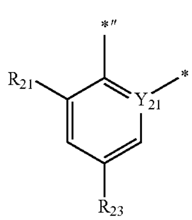
CY2(8)
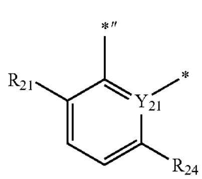
CY2(9)
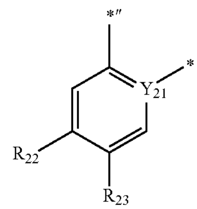
CY2(10)
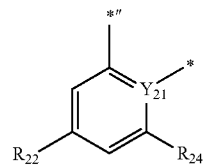
CY2(11)
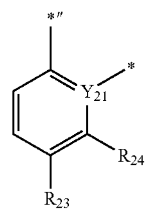
CY2(12)
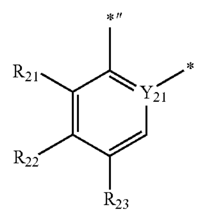
CY2(13)
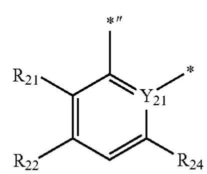
CY2(14)
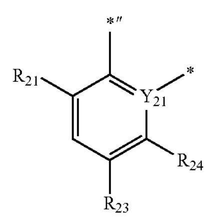
CY2(15)
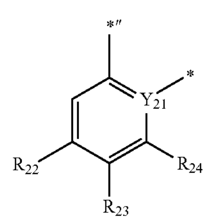

-continued
CY2(16)
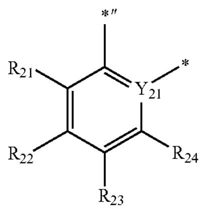
CY2(17)
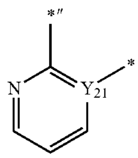
CY2(18)
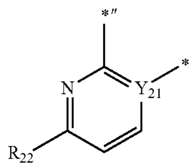
CY2(19)
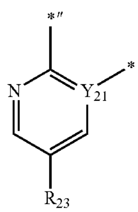
CY2(20)
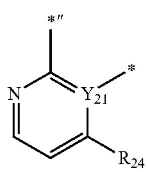
CY2(21)
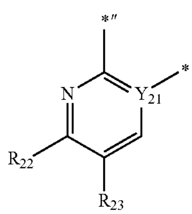
CY2(22)
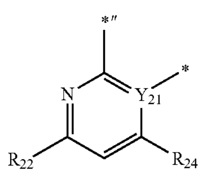
CY2(23)
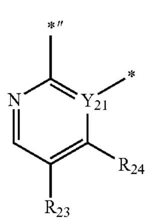
-continued
CY2(24)
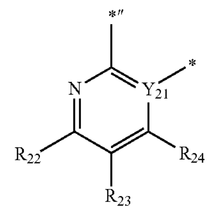
CY2(25)
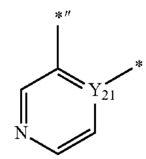
CY2(26)
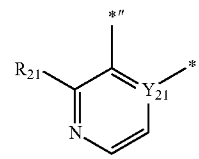
CY2(27)
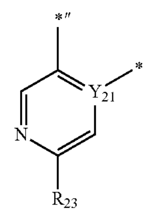
CY2(28)
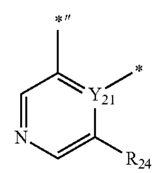
CY2(29)
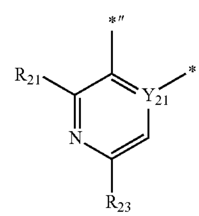
CY2(30)
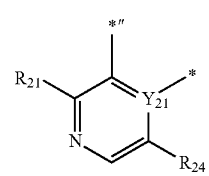
CY2(31)
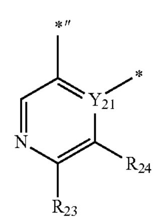

-continued
CY2(32)
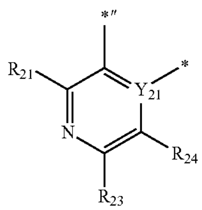
CY2(33)
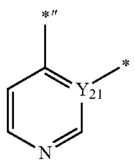
CY2(34)
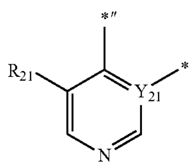
CY2(35)
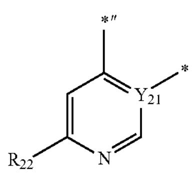
CY2(36)
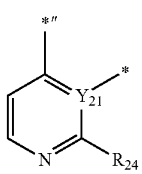
CY2(37)
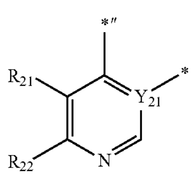
CY2(38)
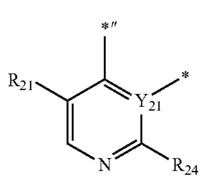
CY2(39)
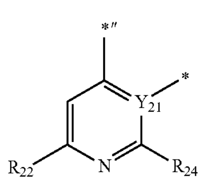
-continued
CY2(40)
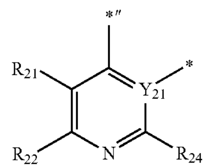
CY2(41)
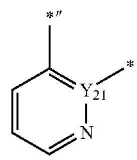
CY2(42)
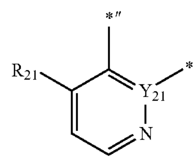
CY2(43)
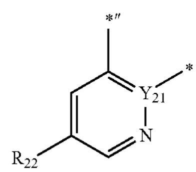
CY2(44)
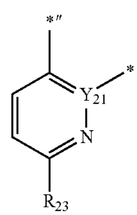
CY2(45)
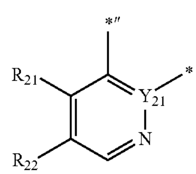
CY2(46)
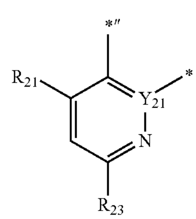
CY2(47)
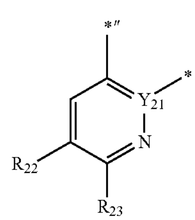

-continued

CY2(48)

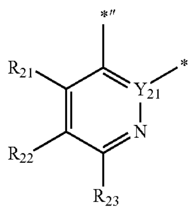

CY2(49)

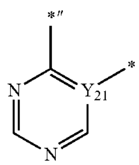

CY2(50)

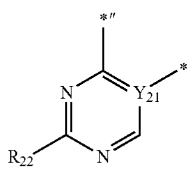

CY2(51)

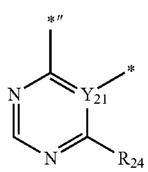

CY2(52)

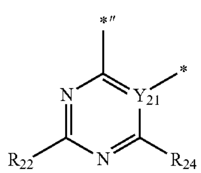

CY2(53)

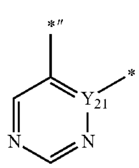

CY2(54)

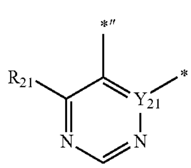

CY2(55)

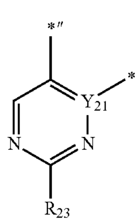

-continued

CY2(56)

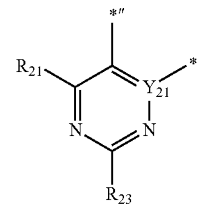

In Formulae CY2(1) to CY2(56), $Y_{21}$ may be C, $R_{21}$ to $R_{24}$ may each independently be understood by referring to the description provided in connection with $R_2$, wherein each of $R_{21}$ to $R_{24}$ may not be hydrogen,

*" indicates a binding site to a neighboring atom in Formula 2, and

* indicates a binding site to M in Formula 1.

In one or more embodiments, a group represented by:

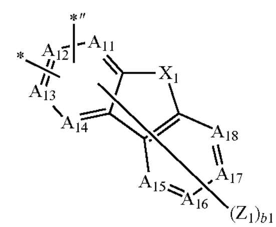

in Formula 3 may be a group represented by one of Formulae CY3-1 to CY3-6:

CY3-1

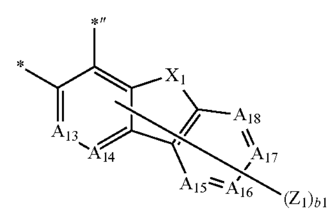

CY3-2

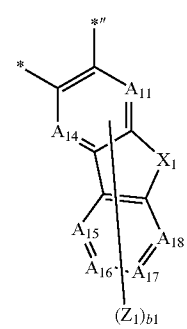

CY3-3

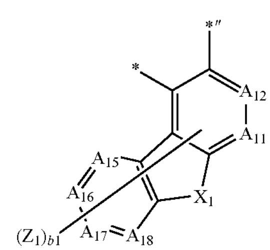

-continued

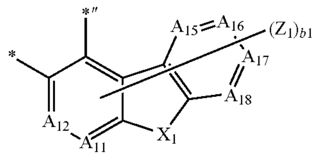
CY3-4

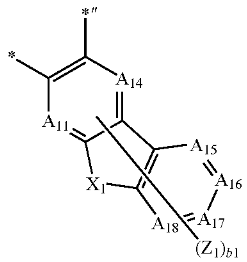
CY3-5

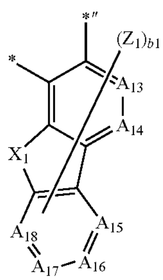
CY3-6

In Formulae CY3-1 to CY3-6, $X_1$, $Z_1$ and b1 may each be understood by referring to the corresponding descriptions thereof provided herein, $A_{11}$ to $A_{18}$ may each independently be C or N, wherein at least one of $A_{13}$ to $A_{18}$ in Formulae CY3-1 and CY3-6 may be N, at least one of $A_{11}$, $A_{14}$, $A_{15}$, $A_{16}$, $A_{17}$ and $A_{18}$ in Formulae CY3-2 and CY3-5 may be N, and at least one of $A_{11}$, $A_{12}$, $A_{15}$, $A_{16}$, $A_{17}$ and $A_{18}$ in Formulae CY3-3 and CY3-4 may be N,

* indicates a binding site to M in Formula 1, and

*" indicates a binding site to a neighboring atom in Formula 3.

In one or more embodiments, a group represented by:

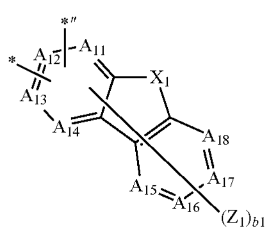

in Formula 3 may be a group represented by one of Formulae CY3-1-1 to CY3-1-6, CY3-2-1 to CY3-2-6, CY3-3-1 to CY3-3-6, CY3-4-1 to CY3-4-6, CY3-5-1 to CY3-5-6, and CY3-6-1 to CY3-6-6:

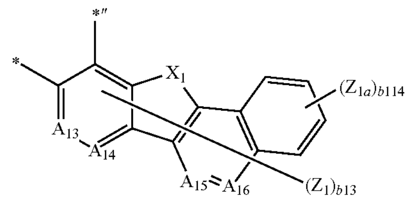
CY3-1-1

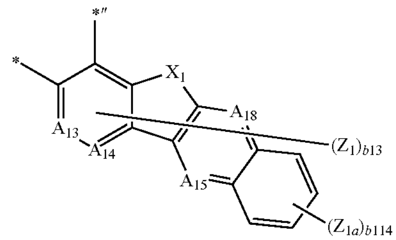
CY3-1-2

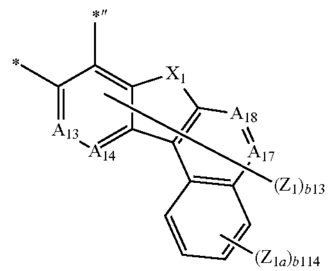
CY3-1-3

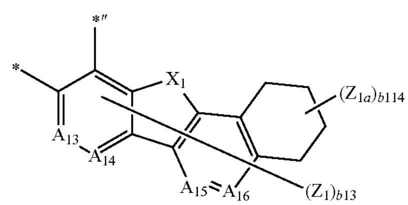
CY3-1-4

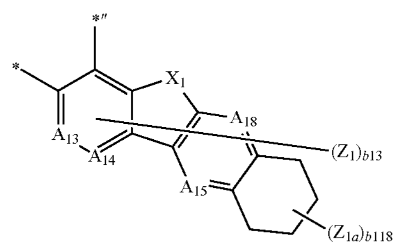
CY3-1-5

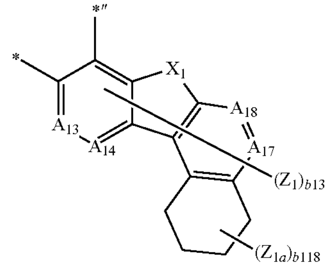
CY3-1-6

-continued
CY3-2-1
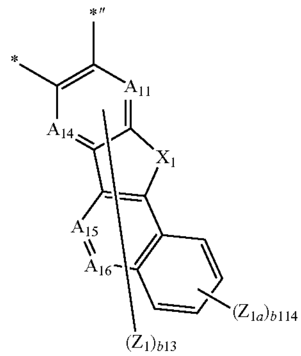
CY3-2-2
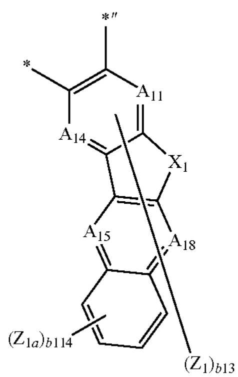
CY3-2-3
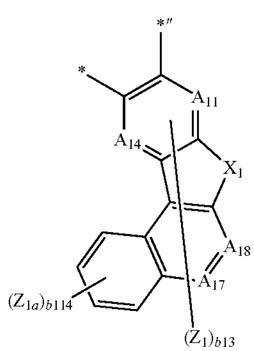
CY3-2-4
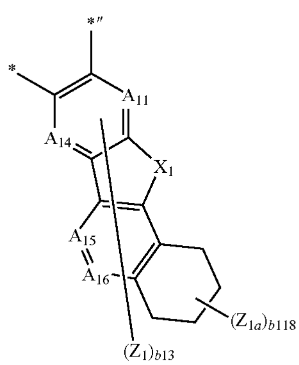
-continued
CY3-2-5
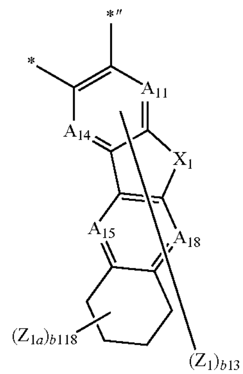
CY3-2-6
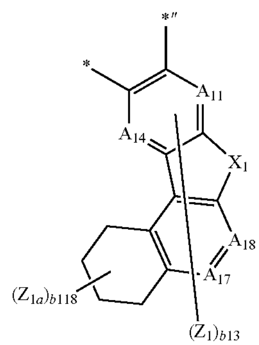
CY3-3-1
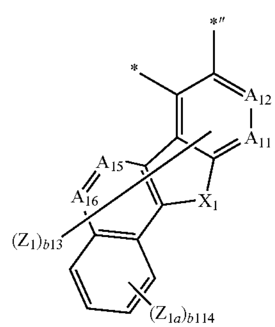
CY3-3-2
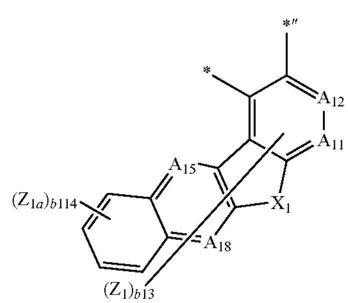
CY3-3-3
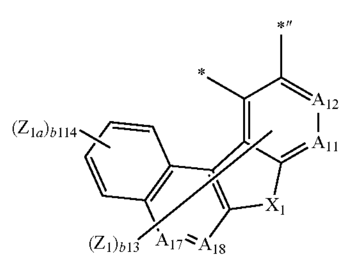

-continued
CY3-3-4
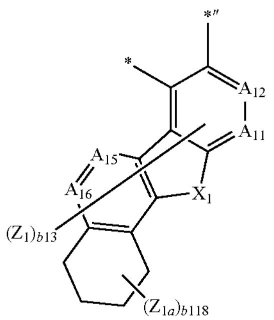
CY3-3-5
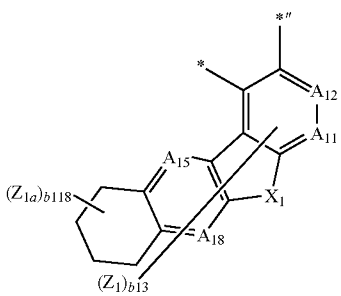
CY3-3-6
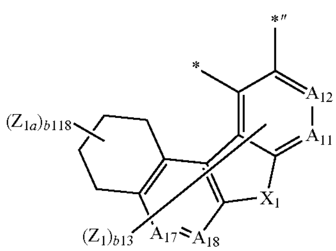
CY3-4-1
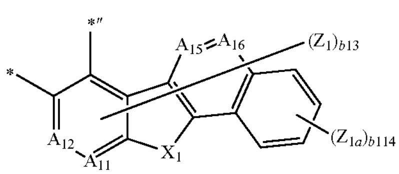
CY3-4-2
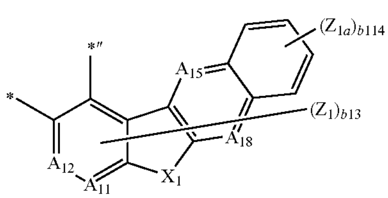
CY3-4-3
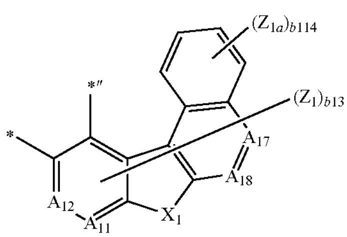
-continued
CY3-4-4
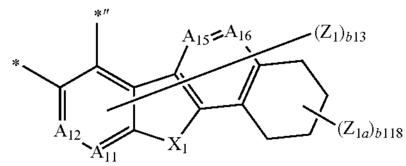
CY3-4-5
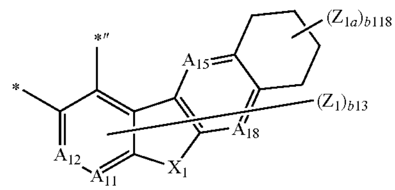
CY3-4-6
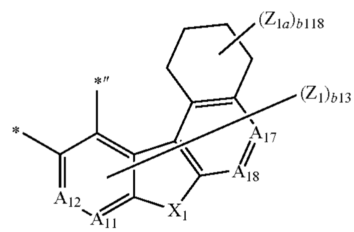
CY3-5-1
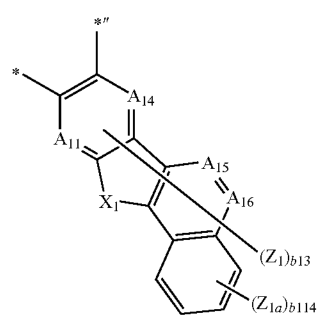
CY3-5-2
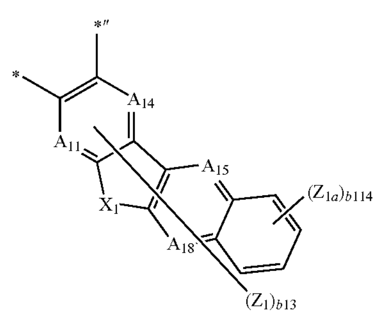
CY3-5-3
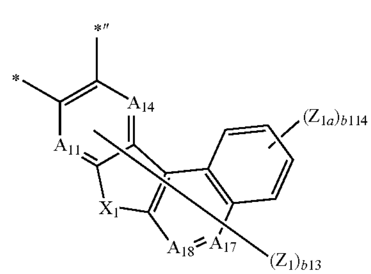

-continued

CY3-5-4

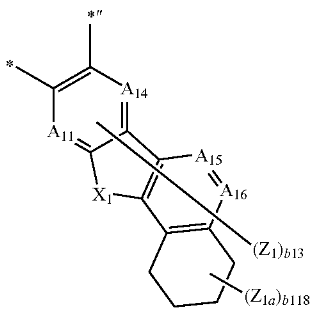

CY3-5-5

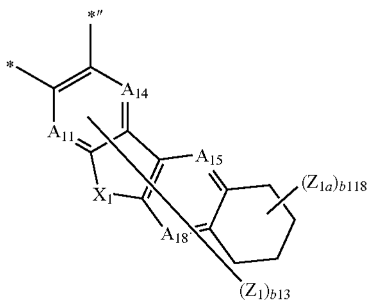

CY3-5-6

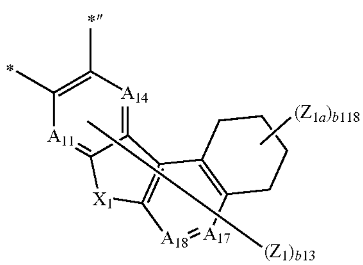

CY3-6-1

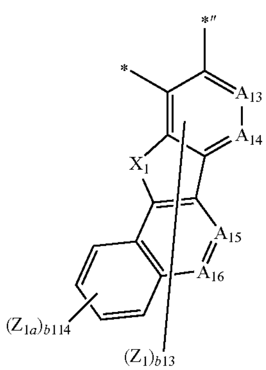

CY3-6-2

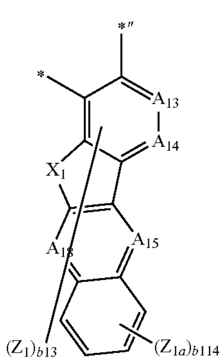

-continued

CY3-6-3

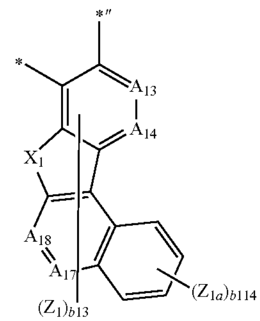

CY3-6-4

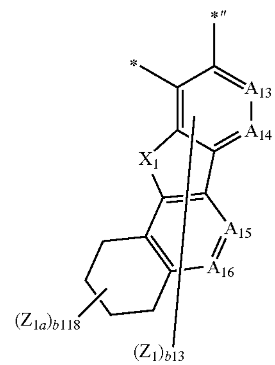

CY3-6-5

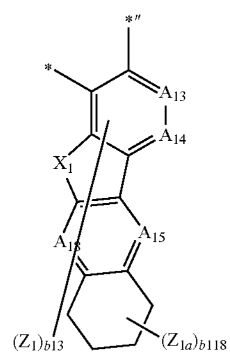

CY3-6-6

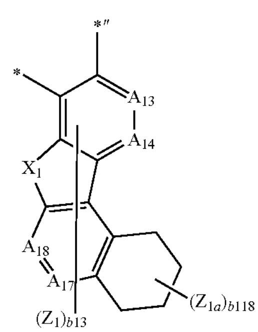

In Formulae CY3-1-1 to CY3-1-6, CY3-2-1 to CY3-2-6, CY3-3-1 to CY3-3-6, CY3-4-1 to CY3-4-6, CY3-5-1 to CY3-5-6, and CY3-6-1 to CY3-6-6, $X_1$ and $Z_1$ may each be understood by referring to the corresponding descriptions thereof provided herein, $Z_{1a}$ may be understood by referring to the description provided in connection with $R_{1a}$, $A_{11}$ to $A_{18}$ may each independently be C or N, wherein a) at least one of $A_{13}$, $A_{14}$, $A_{15}$, and $A_{16}$ in Formulae CY3-1-1, CY3-1-4, CY3-6-1, and CY3-6-4 is N, b) at least one of $A_{13}$, $A_{14}$, $A_{15}$, and $A_{18}$ in Formulae CY3-1-2, CY3-1-5, CY3-6-2, and CY3-6-5 is N, c) at least one of $A_{13}$, $A_{14}$, $A_{17}$, and $A_{18}$ in Formulae CY3-1-3, CY3-1-6, CY3-6-3, and CY3-6-6 is N, d) at least one of $A_{11}$, $A_{14}$, $A_{15}$, and $A_{16}$ in Formulae CY3-2-1, CY3-2-4, CY3-5-1, and CY3-5-4 is N, e) at least one of $A_{11}$, $A_{14}$, $A_{15}$, and $A_{18}$ in Formulae CY3-2-2, CY3-2-5, CY3-5-2, and CY3-5-5 is N, f) at least one of $A_{11}$, $A_{14}$, $A_{17}$, and $A_{18}$ in Formulae CY3-2-3, CY3-2-6, CY3-5-3, and CY3-5-6 is N, g) at least one of $A_{11}$, $A_{12}$, $A_{15}$, and $A_{16}$ in Formulae CY3-3-1, CY3-3-4, CY3-4-1, and CY3-4-4 is N, h) at least one of $A_{11}$, $A_{12}$, $A_{15}$ and $A_{18}$ in Formulae CY3-3-2, CY3-3-5, CY3-4-2, and CY3-4-5 is N, i) at least one of $A_{11}$, $A_{12}$, $A_{17}$, and $A_{18}$ in Formulae CY3-3-3, CY3-3-6, CY3-4-3, and CY3-4-6 is N, b13 may be an integer from 0 to 3, b114 may be an integer from 0 to 4, b118 may be an integer from 0 to 8,

* indicates a binding site to M in Formula 1, and

*" indicates a binding site to a neighboring atom in Formula 3.

In one or more embodiments, a group represented by:

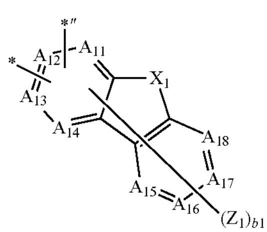

in Formula 3 may be a group represented by one of Formulae NCY3(1) to NCY3(84):

NCY3(1)

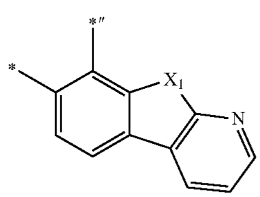

NCY3(2)

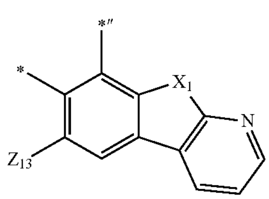

NCY3(3)

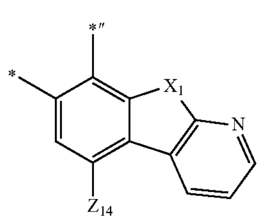

-continued

NCY3(4)

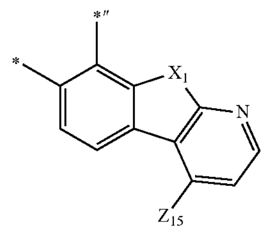

NCY3(5)

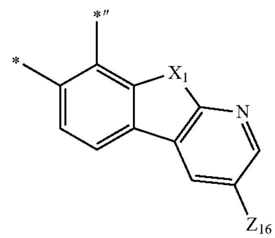

NCY3(6)

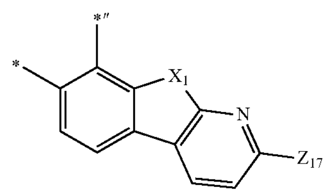

NCY3(7)

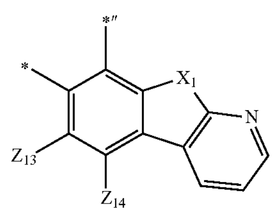

NCY3(8)

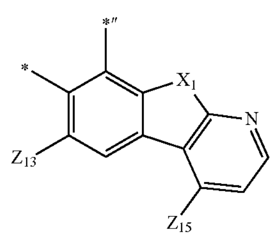

NCY3(9)

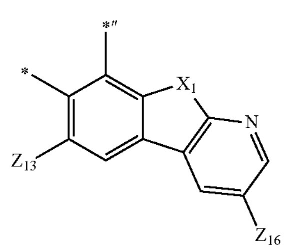

NCY3(10)

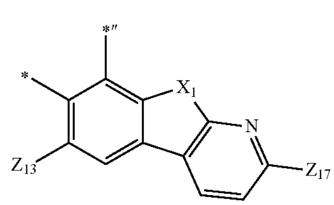

-continued
NCY3(11)
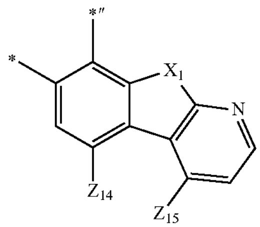
NCY3(12)
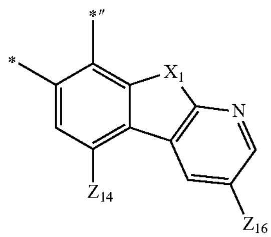
NCY3(13)
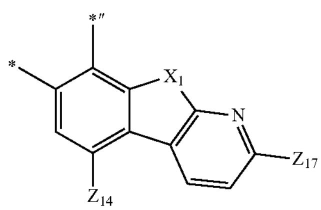
NCY3(14)
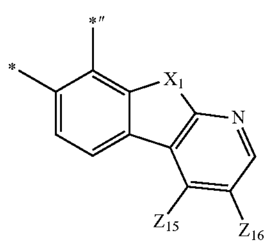
NCY3(15)
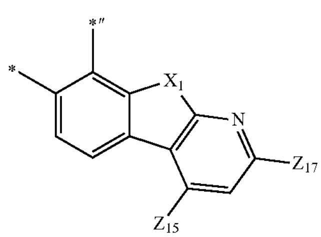
NCY3(16)
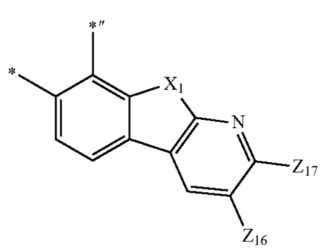
-continued
NCY3(17)
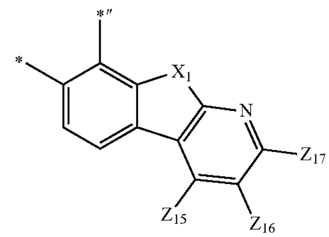
NCY3(18)
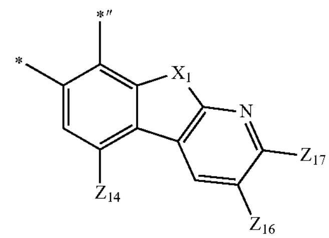
NCY3(19)
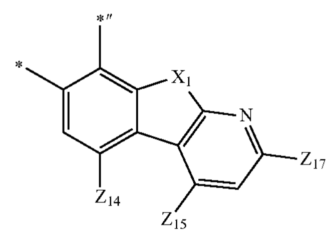
NCY3(20)
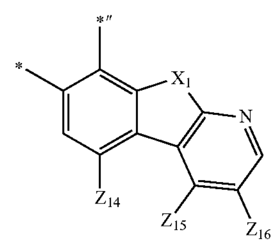
NCY3(21)
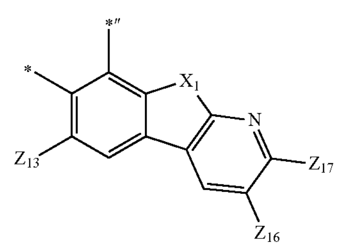
NCY3(22)
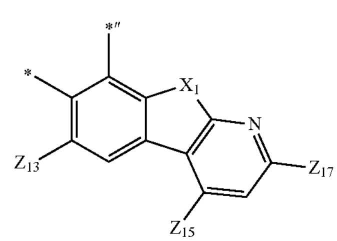

-continued
NCY3(23)
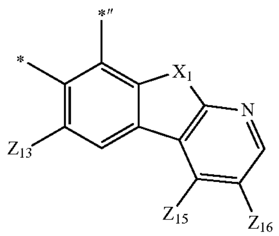
NCY3(24)
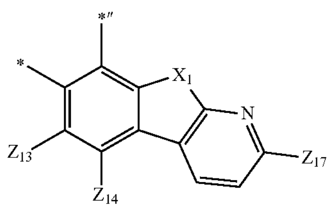
NCY3(25)
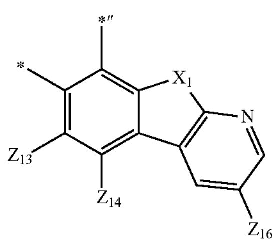
NCY3(26)
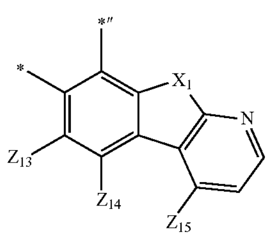
NCY3(27)
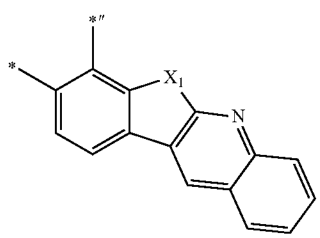
NCY3(28)
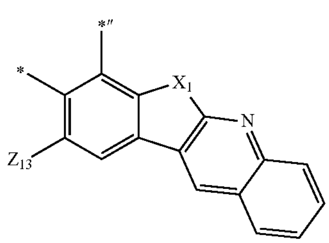
-continued
NCY3(29)
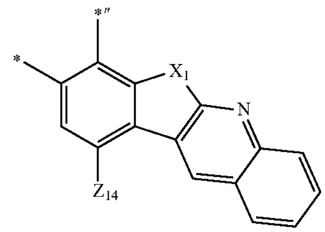
NCY3(30)
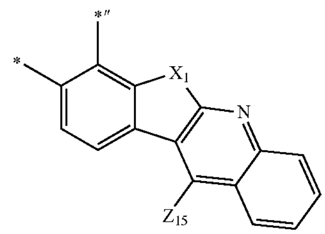
NCY3(31)
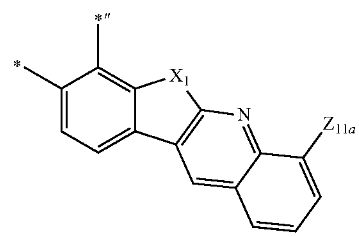
NCY3(32)
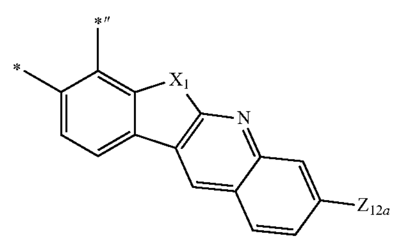
NCY3(33)
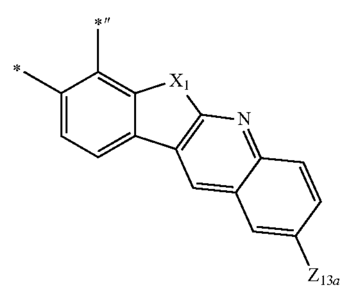
NCY3(34)
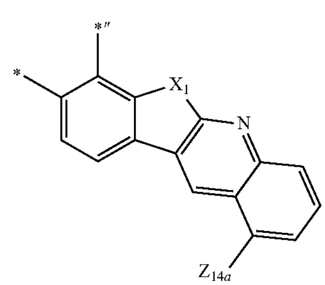

-continued
NCY3(35)
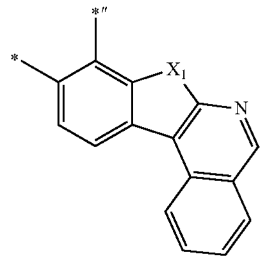
NCY3(36)
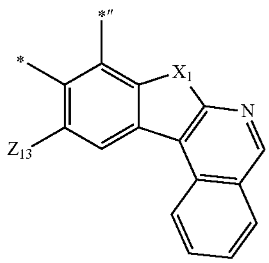
NCY3(37)
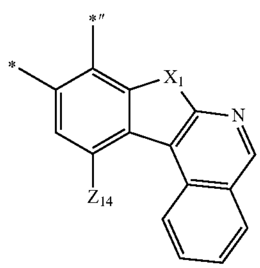
NYC3(38)
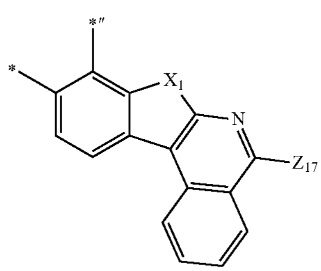
NYC3(39)
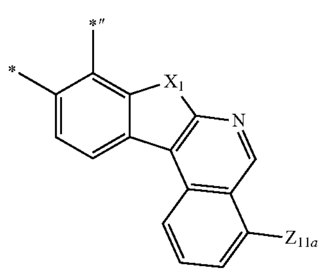
-continued
NYC3(40)
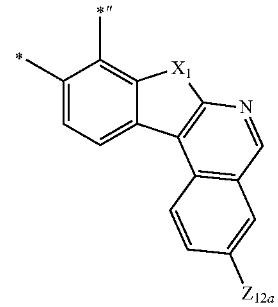
NYC3(41)
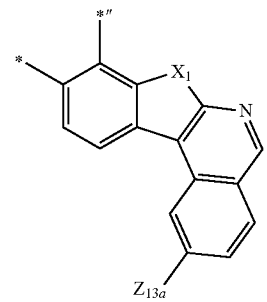
NYC3(42)
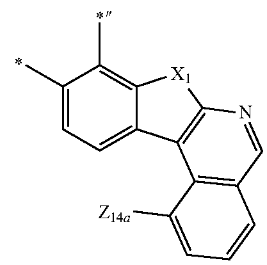
NCY3(43)
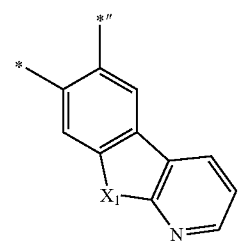
NCY3(44)
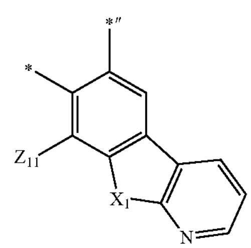
NCY3(45)
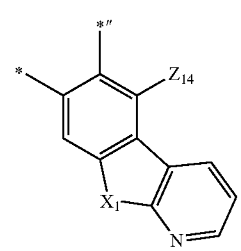

-continued
NCY3(46)
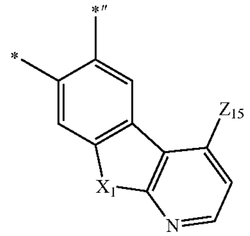
NCY3(47)
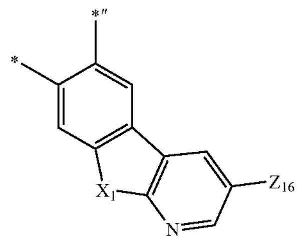
NCY3(48)
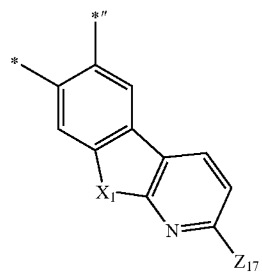
NCY3(49)
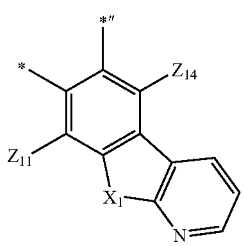
NCY3(50)
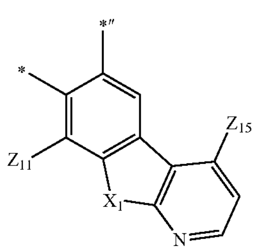
NCY3(51)
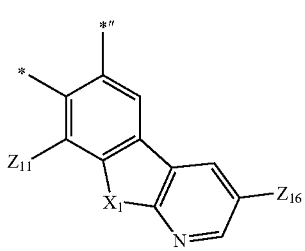
-continued
NCY3(52)
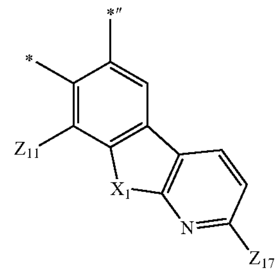
NCY3(53)
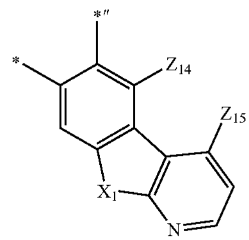
NCY3(54)
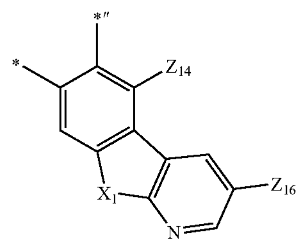
NCY3(55)
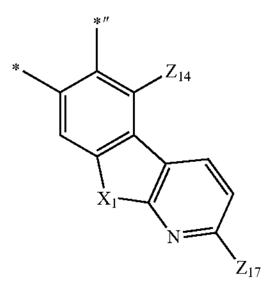
NCY3(56)
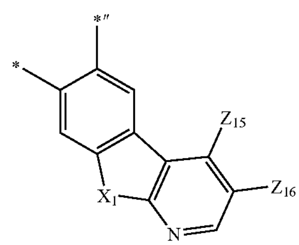
NCY3(57)
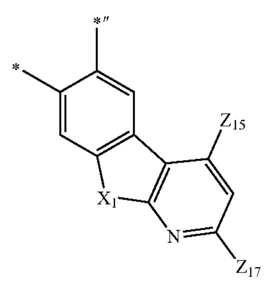

-continued
NCY3(58)
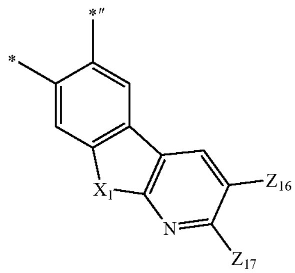
NCY3(59)
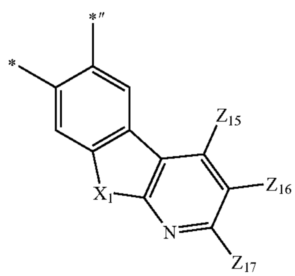
NCY3(60)
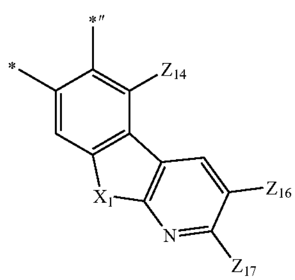
NCY3(61)
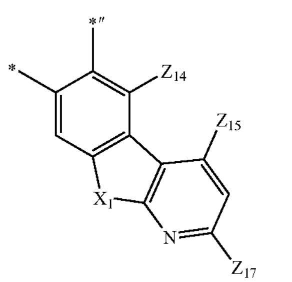
NCY3(62)
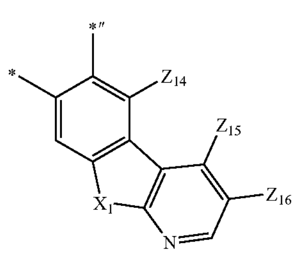
-continued
NCY3(63)
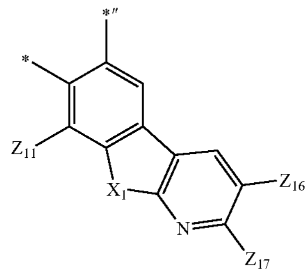
NCY3(64)
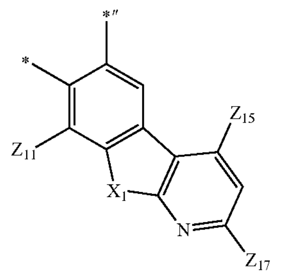
NCY3(65)
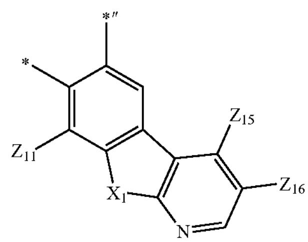
NCY3(66)
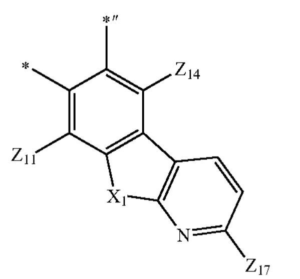
NCY3(67)
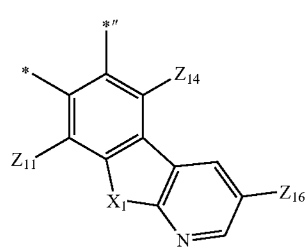
NCY3(68)
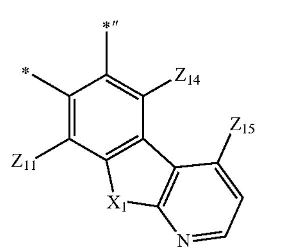

-continued
NCY3(69)
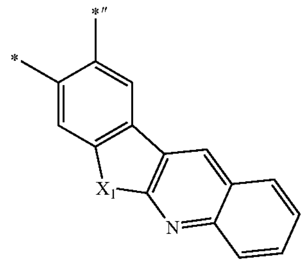
NCY3(70)
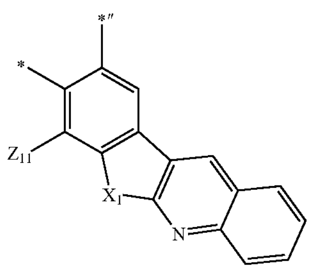
NCY3(71)
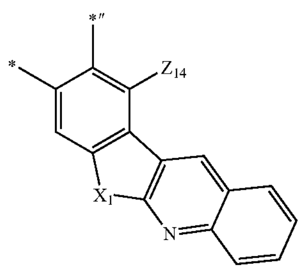
NCY3(72)
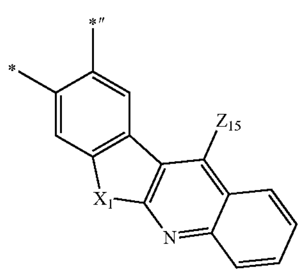
NCY3(73)
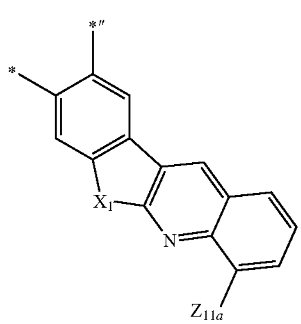
-continued
NCY3(74)
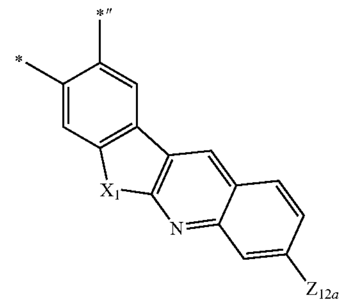
NCY3(75)
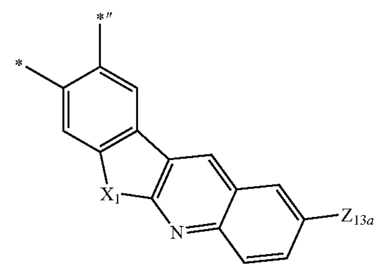
NCY3(76)
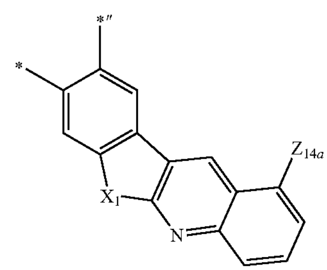
NCY3(77)
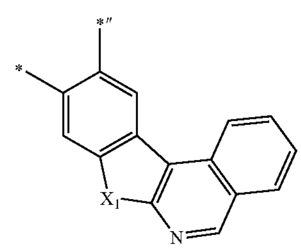
NCY3(78)
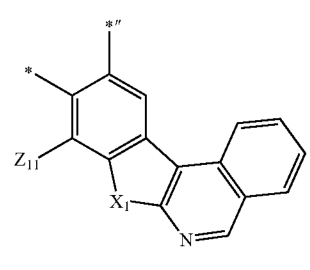
NCY3(79)
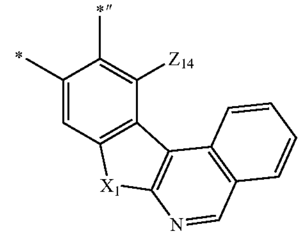

-continued

NCY3(80)

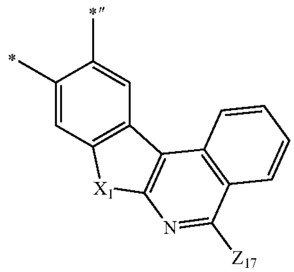

NCY3(81)

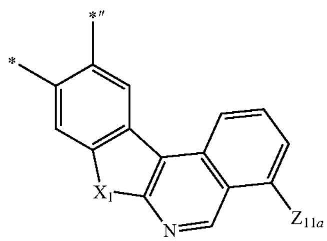

NCY3(82)

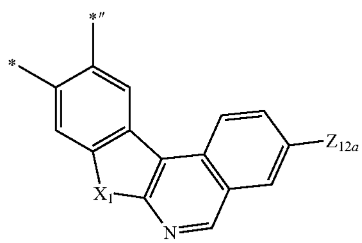

NCY3(83)

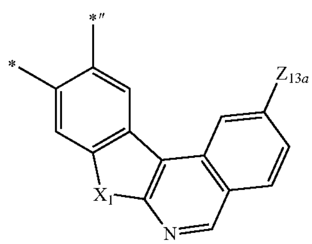

NCY3(84)

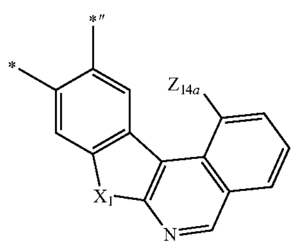

In Formulae NCY3(1) to NCY3(84), $X_1$ may be understood by referring to the corresponding descriptions thereof provided herein, $Z_{11}$ to $Z_{18}$ and $Z_{11}$a to $Z_{14}$a may be each understood by referring to the description provided in connection with $Z_1$, and each of $Z_{11}$ to $Z_{18}$ and $Z_{11a}$ to $Z_{14a}$ is not hydrogen,

* indicates a binding site to M in Formula 1, and

*" indicates a binding site to a neighboring atom in Formula 3.

In one or more embodiments, a group represented by:

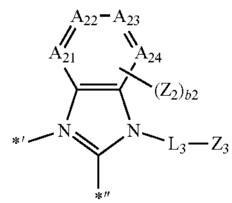

in Formula 3 may be a group represented by one of Formulae CY4-1 to CY4-60:

CY4-1

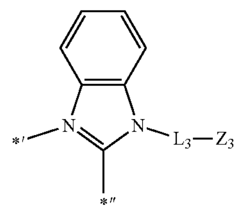

CY4-2

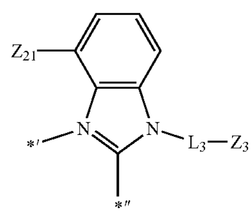

CY4-3

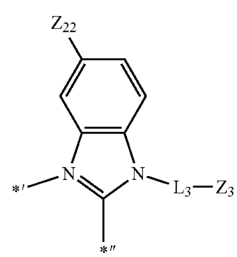

CY4-4

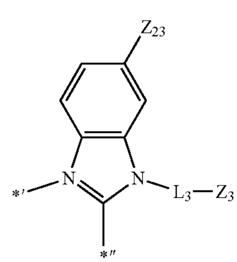

CY4-5

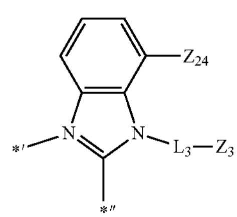

-continued
CY4-6
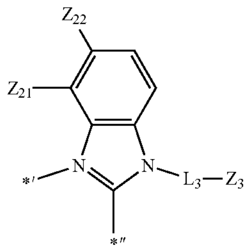
CY4-7
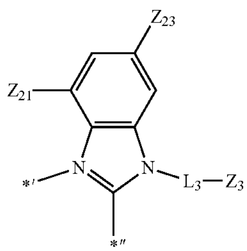
CY4-8
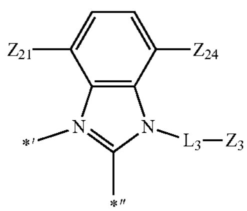
CY4-9
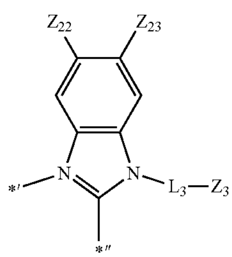
CY4-10
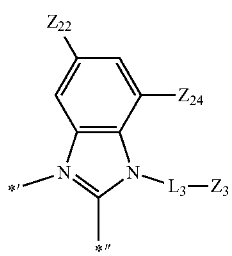
CY4-11
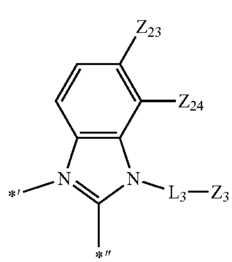
-continued
CY4-12
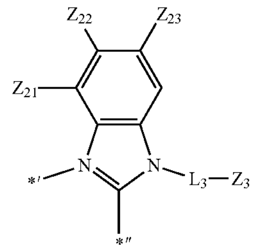
CY4-13
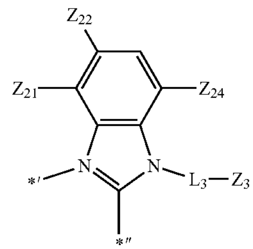
CY4-14
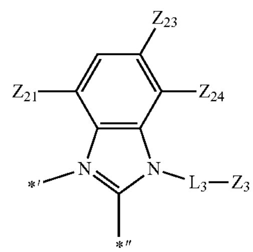
CY4-15
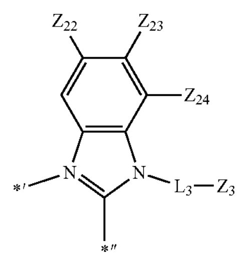
CY4-16
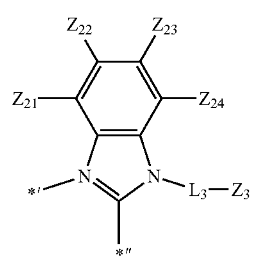
CY4-17
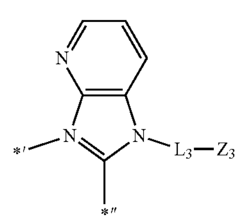

-continued
CY4-18
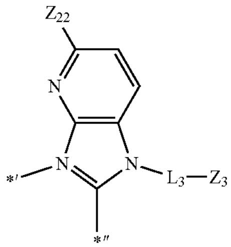
CY4-19
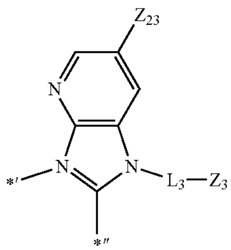
CY4-20
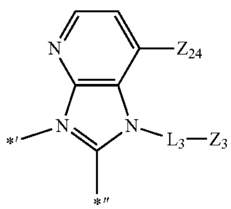
CY4-21
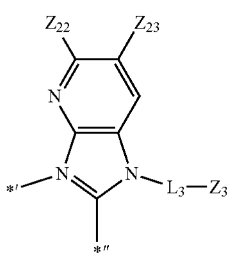
CY4-22
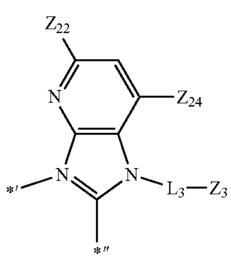
CY4-23
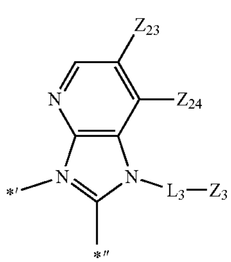
-continued
CY4-24
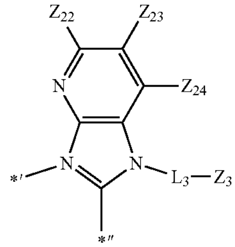
CY4-25
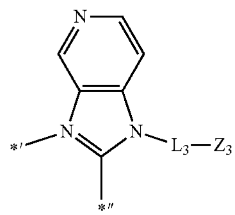
CY4-26
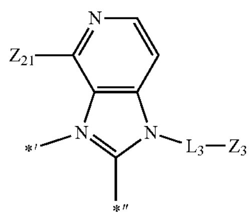
CY4-27
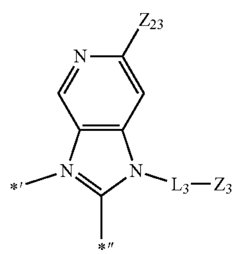
CY4-28
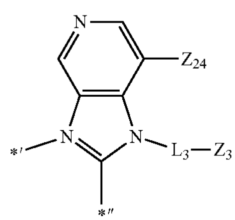
CY4-29
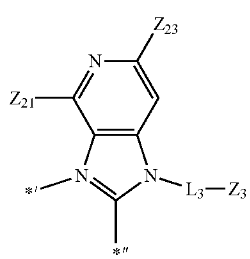

-continued
CY4-30
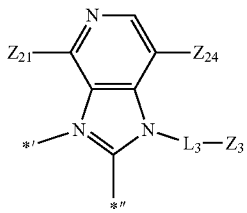
CY4-31
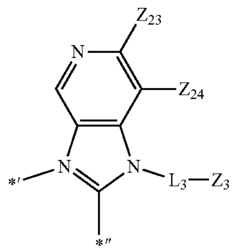
CY4-32
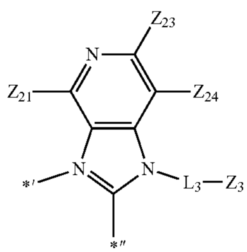
CY4-33
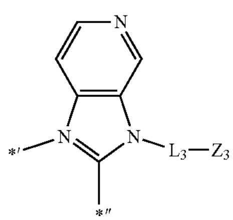
CY4-34
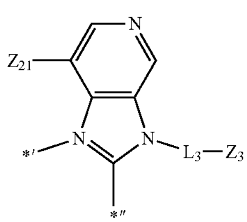
CY4-35
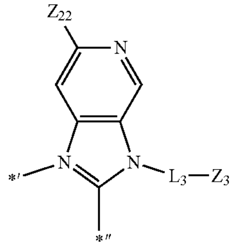
-continued
CY4-36
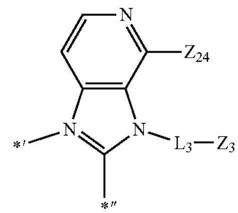
CY4-37
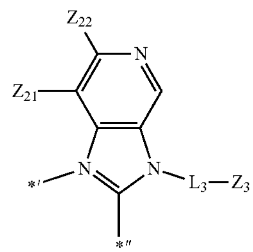
CY4-38
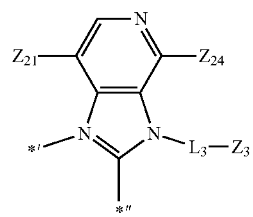
CY4-39
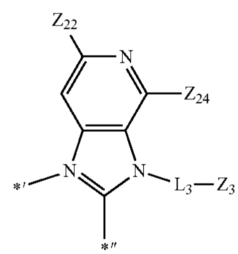
CY4-40
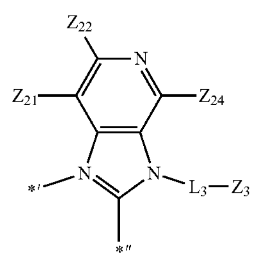
CY4-41
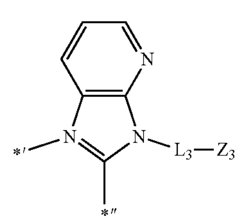

-continued
CY4-42
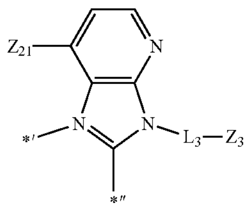
CY4-43
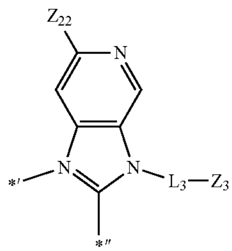
CY4-44
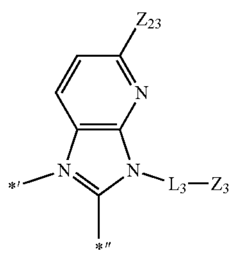
CY4-45
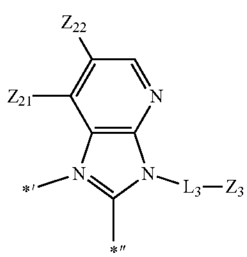
CY4-46
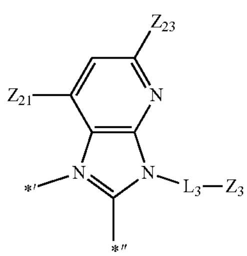
CY4-47
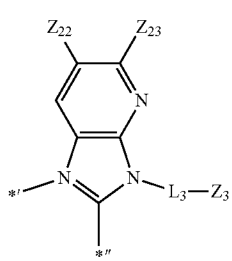
-continued
CY4-48
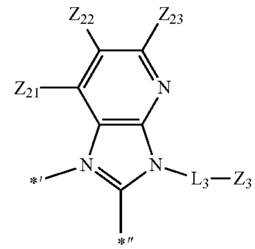
CY4-49
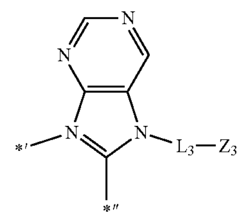
CY4-50
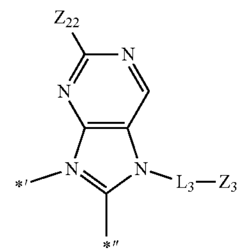
CY4-51
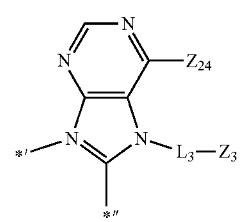
CY4-52
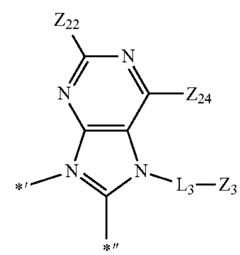
CY4-53
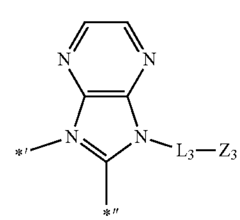

-continued

CY4-54

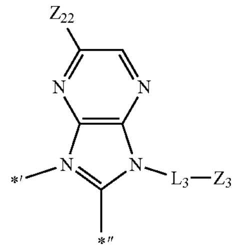

CY4-55

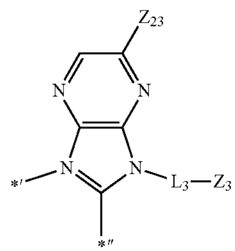

CY4-56

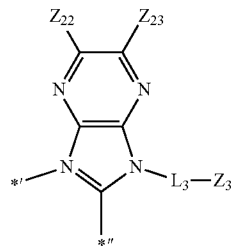

CY4-57

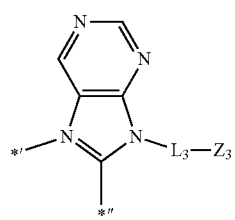

CY4-58

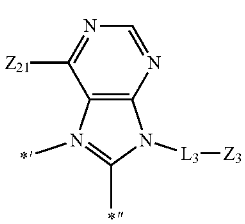

CY4-59

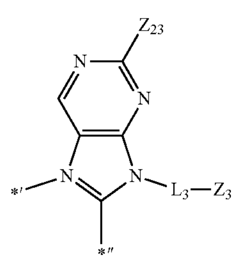

-continued

CY4-60

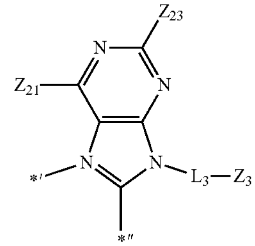

In Formulae CY4-1 to CY4-60, $L_3$ and $Z_3$ may each be understood by referring to the corresponding descriptions thereof provided herein, $Z_{21}$ to $Z_{24}$ may each be understood by referring to the description provided in connection with $Z_2$, wherein each of $Z_{21}$ to $Z_{24}$ may not be hydrogen,

* indicates a binding site to M in Formula 1, and

*" indicates a binding site to a neighboring atom in Formula 3.

In one or more embodiments, two or more of a plurality of $Z_2$ groups in a group represented by in Formula 3 may be linked to form a $C_5$-$C_{30}$ carbocyclic group that is unsubstituted or substituted with at least one $R_{10a}$, or two or more of the plurality of $Z_2$ groups in the group represented by:

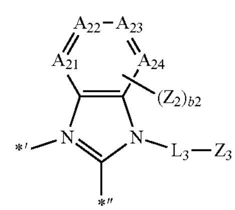

in Formula 3 may be linked to form a $C_1$-$C_{30}$ heterocyclic group that is unsubstituted or substituted with at least one $R_{10a}$. As a result, a group represented by:

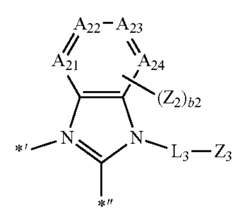

in Formula 3 may be a group represented by one of Formulae CY4(1) to CY4(4):

CY4(1)

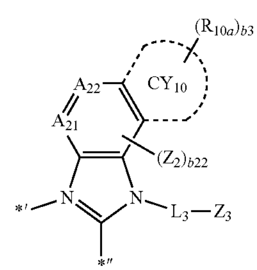

-continued

CY4(2)

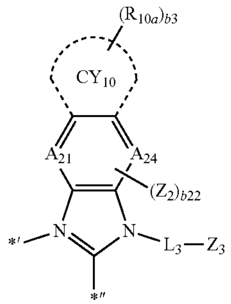

CY4(3)

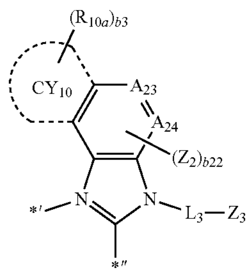

CY(4)

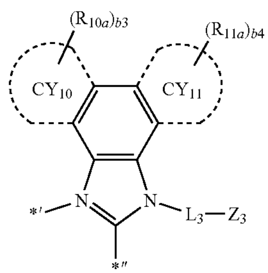

In Formulae CY4(1) to CY4(4), $A_{21}$ to $A_{24}$, $L_3$, $Z_2$, $Z_3$ and $R_{10a}$ are the same as described above, b22 may be an integer from 0 to 2, ring $CY_{10}$ and ring $CY_{11}$ may each independently be a $C_5$-$C_{30}$ carbocyclic group or a $C_1$-$C_{30}$ heterocyclic group, $R_{11a}$ is the same as described in connection with $R_{10a}$, b3 and b4 may each independently be an integer from 0 to 20, when b3 is 2 or more, two or more $R_{10a}$ groups may be identical to or different from each other, and when b4 is 2 or more, two or more $R_{11a}$ groups may be identical to or different from each other,

* indicates a binding site to M in Formula 1, and

*" indicates a binding site to a neighboring atom in Formula 3.

For example, ring $CY_{10}$ and ring $CY_{11}$ in Formulae CY4(1) to CY4(4) may each independently be a benzene group or a naphthalene group.

In one or more embodiments, a group represented by:

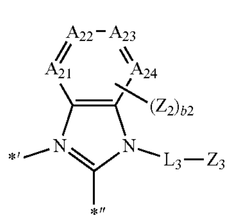

in Formula 3 may be a group represented by one of Formulae CY4(1)-1 to CY4(1)-4, CY4(2)-1 to CY4(2)-4, CY4(3)-1 to CY4(3)-4 and CY4(4)-1:

CY4(1)-1

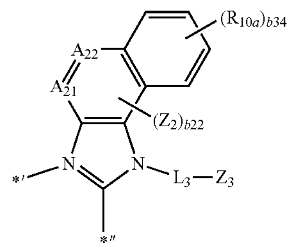

CY4(1)-2

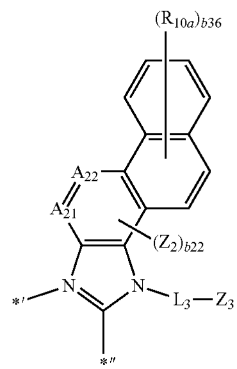

CY4(1)-3

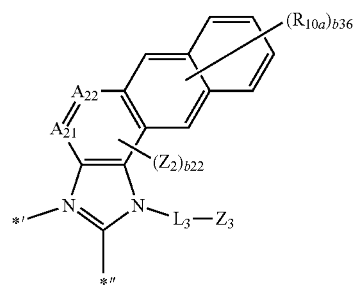

CY4(1)-4

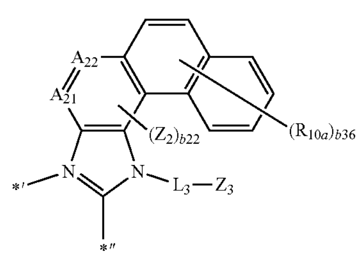

CY4(2)-1

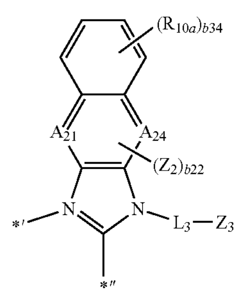

-continued

CY4(2)-2

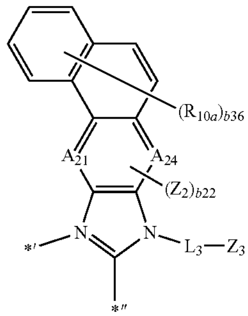

CY4(2)-3

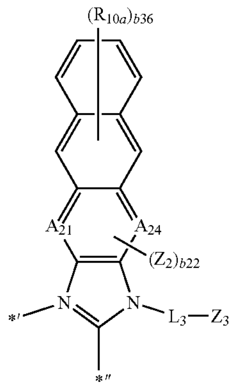

CY4(2)-4

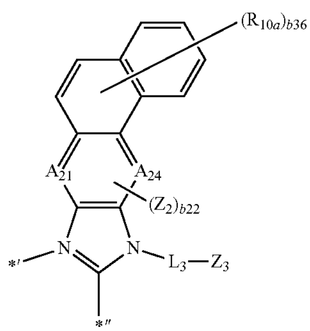

CY4(3)-1

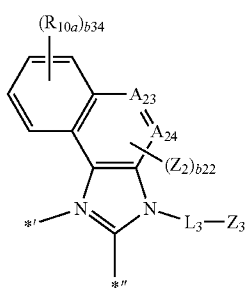

CY4(3)-2

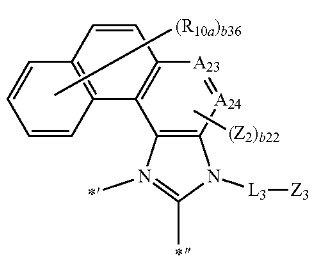

-continued

CY4(3)-3

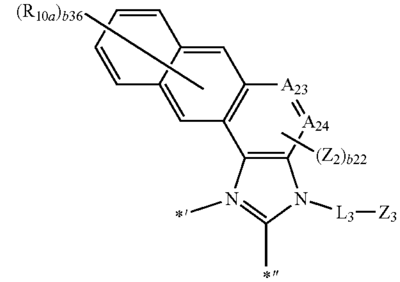

CY4(3)-4

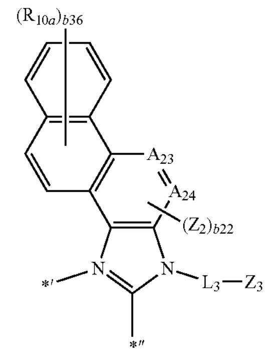

CY4(4)-1

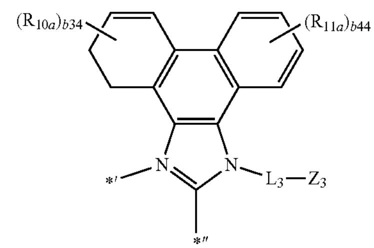

In Formulae CY4(1)-1 to CY4(1)-4, CY4(2)-1 to CY4 (2)-4, CY4(3)-1 to CY4(3)-4 and CY4(4)-1, $A_{21}$ to $A_{24}$, $L_3$, $Z_2$, $Z_3$ and $R_{10a}$ are the same as described above, b22 may be an integer from 0 to 2, $R_{11a}$ is the same as described in connection with $R_{10a}$, b34 and b44 may each independently be an integer from 0 to 4, when b34 is 2 or more, two or more $R_{10a}$ groups may be identical to or different from each other, and when b44 is 2 or more, two or more $R_{11a}$ groups may be identical to or different from each other, b36 may be an integer from 0 to 6, when b36 is 2 or more, two or more $R_{10a}$ groups may be identical to or different from each other,

* indicates a binding site to M in Formula 1, and

*" indicates a binding site to a neighboring atom in Formula 3.

In one or more embodiments, the organometallic compound represented by Formula 1 may emit red light or green light, for example, red light or green light, each having a maximum emission wavelength of 500 nm or more, for example, 500 nm or more and 850 nm or less. For example, the organometallic compound may emit green light.

For example, the organometalic compound may be one of Compounds 1 to 4010:
1
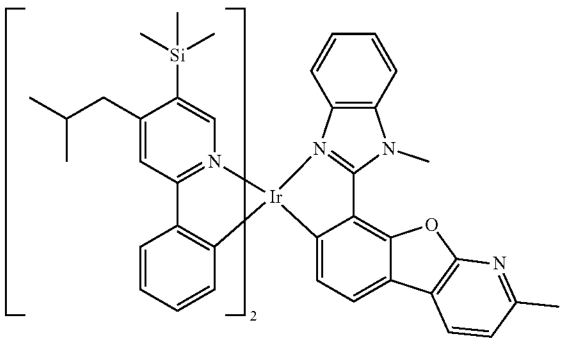
2
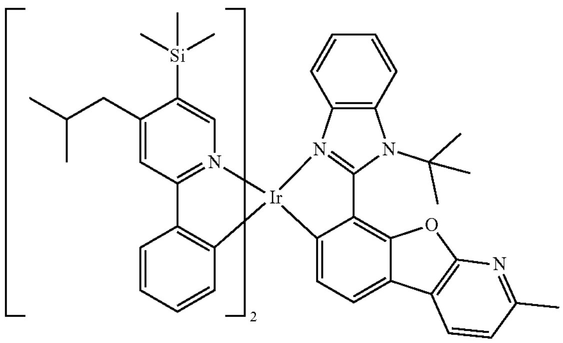
3
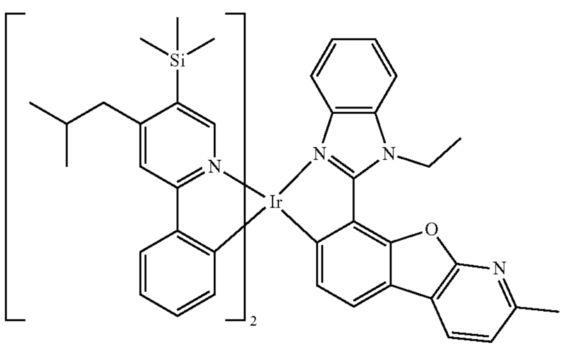
4
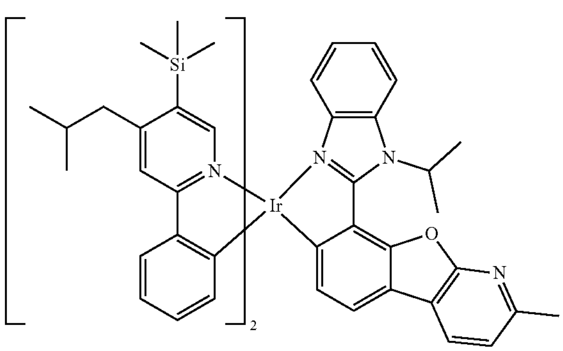
-continued
5
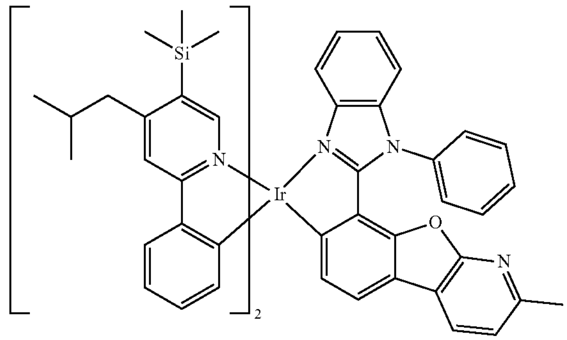
6
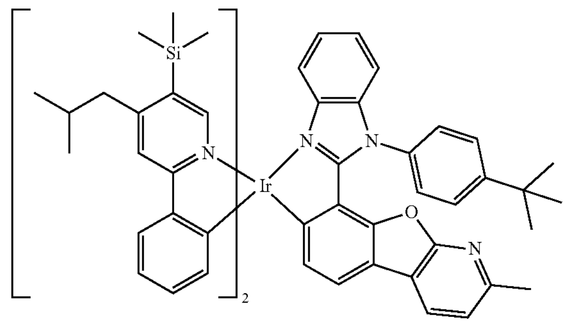
7
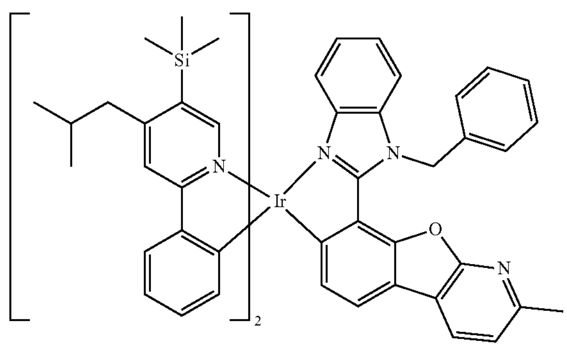
8
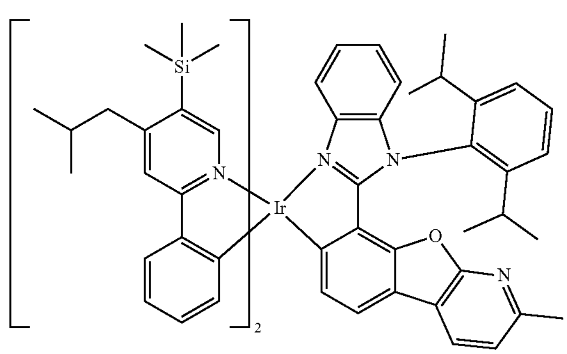

-continued
9
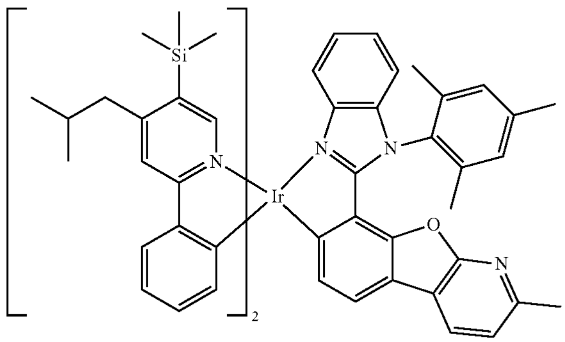
10
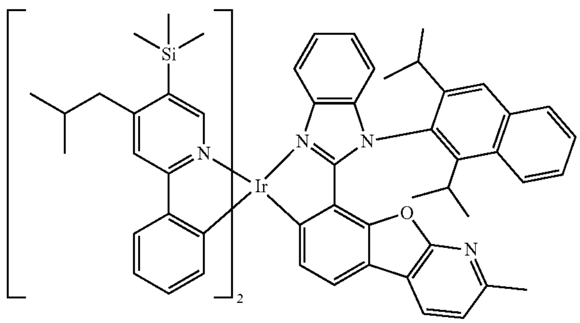
11
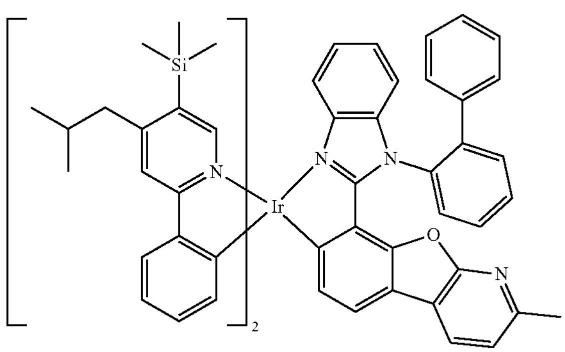
12
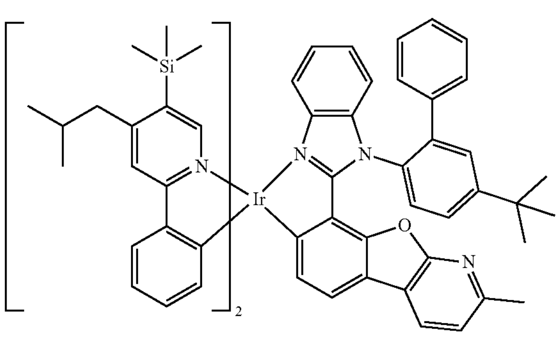
-continued
13
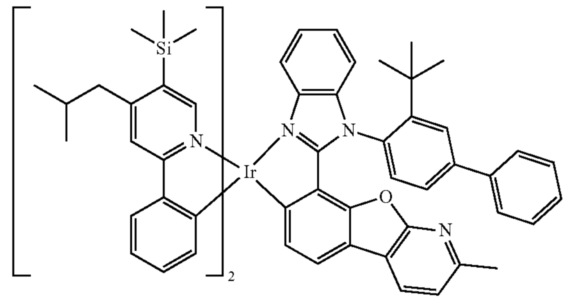
14
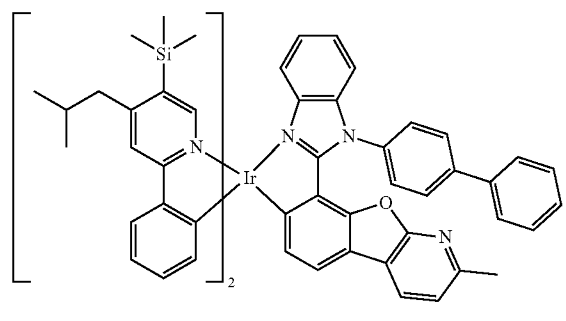
15
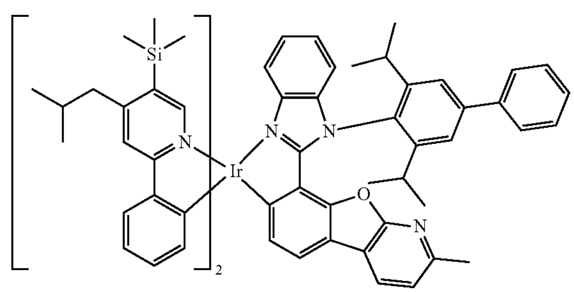
16
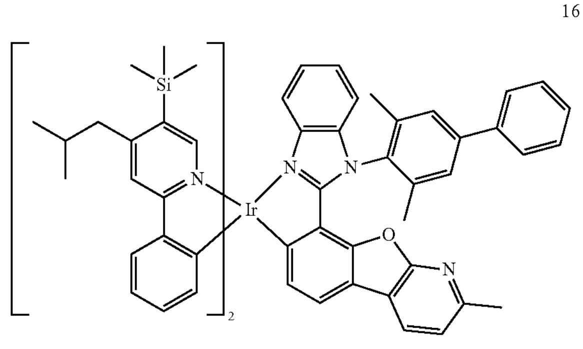

-continued
17
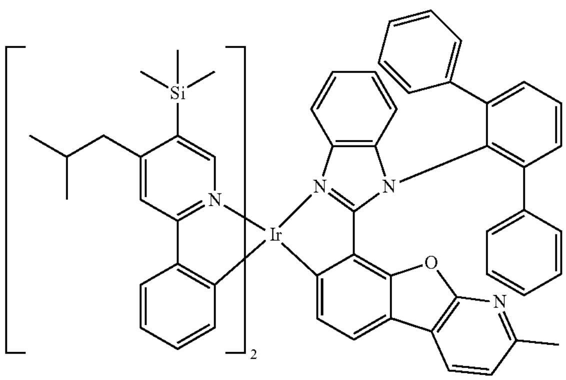
18
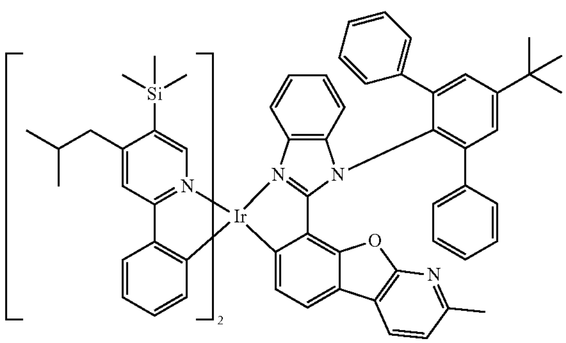
19
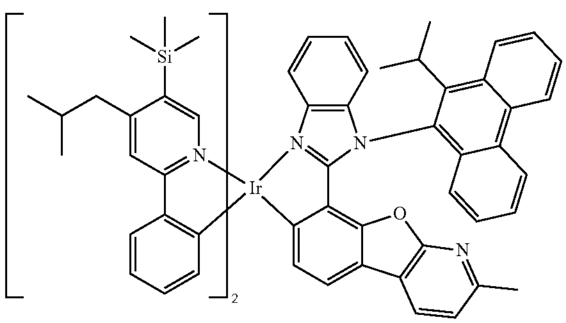
20
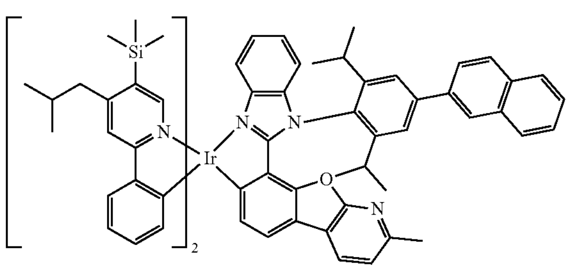
-continued
21
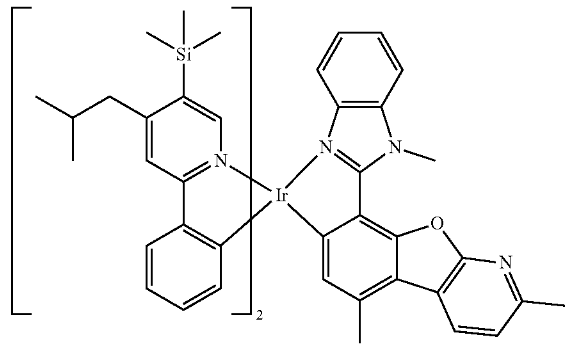
22
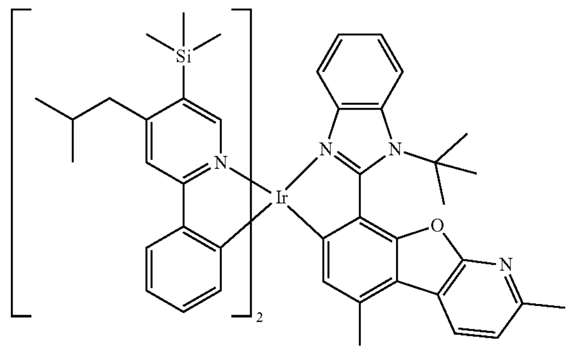
23
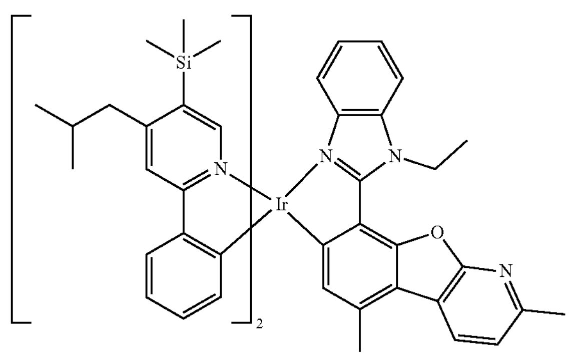
24
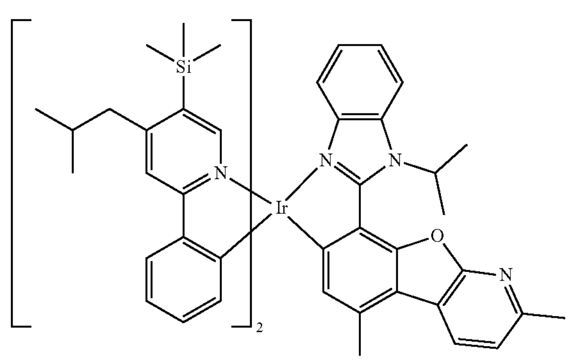

25
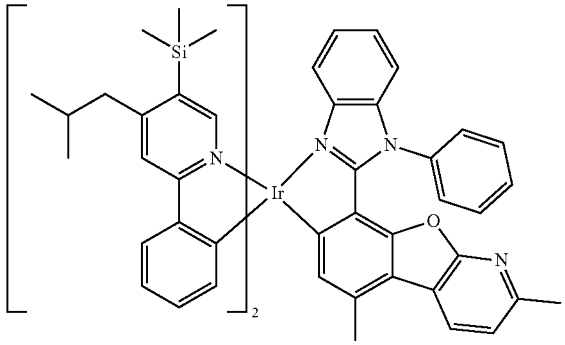
26
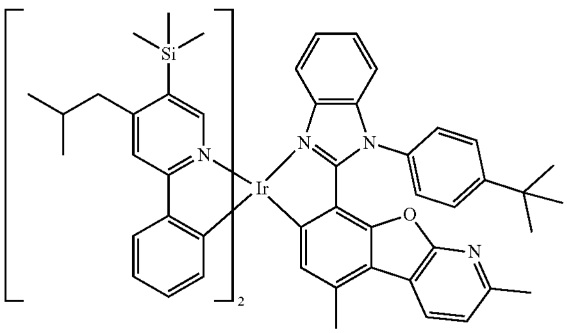
27
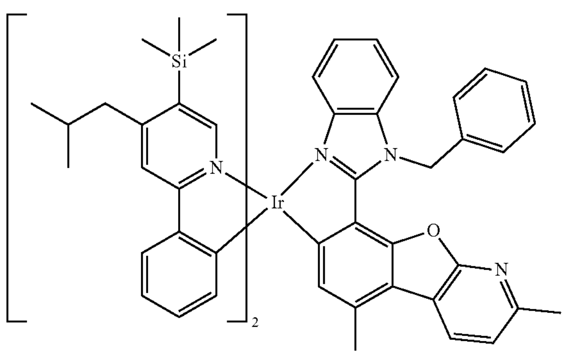
28
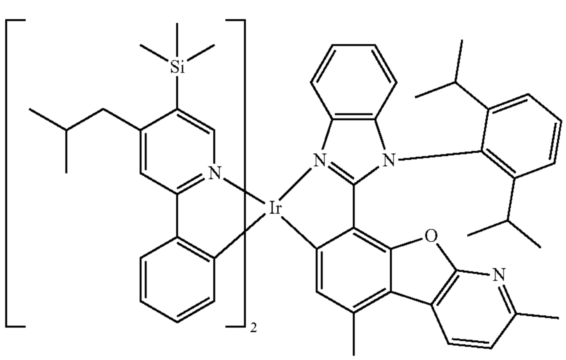
29
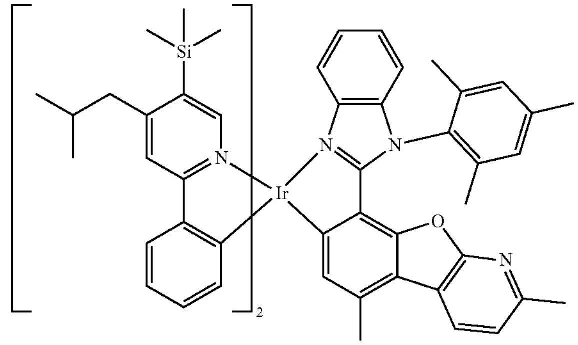
30
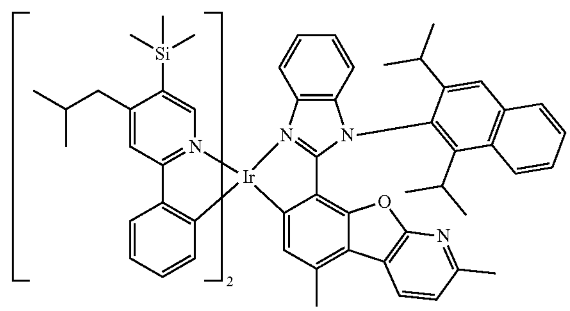
31
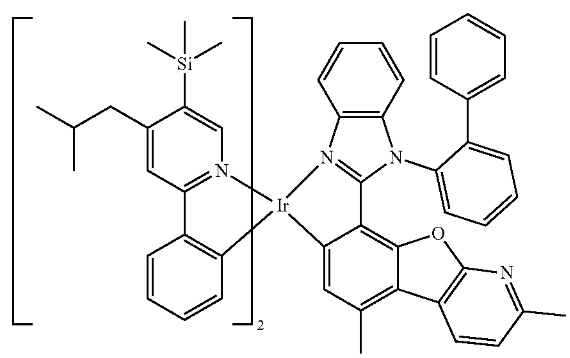
32
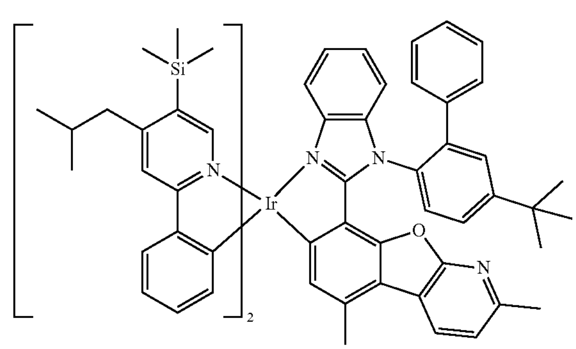

-continued
33
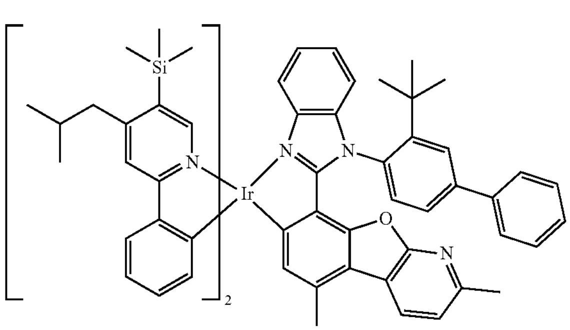
34
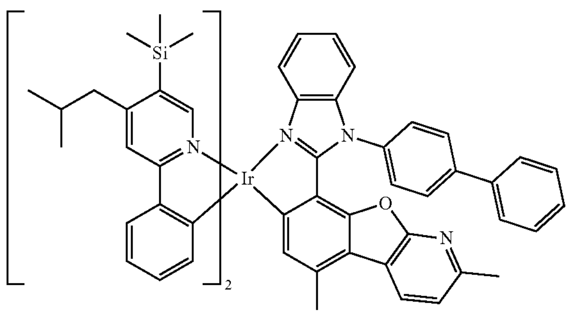
35
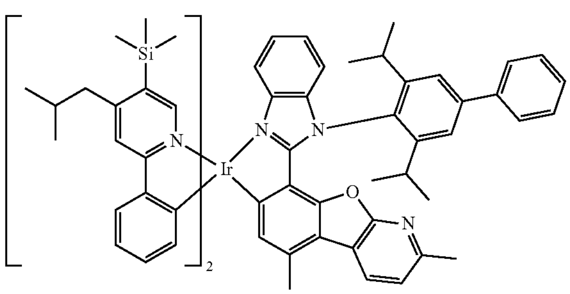
36
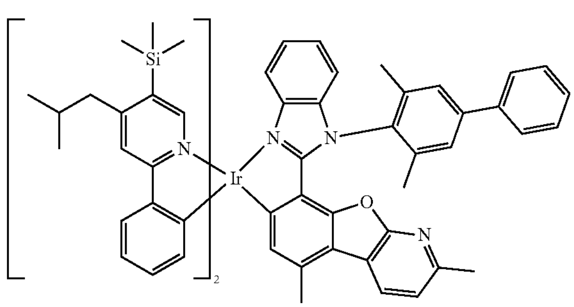
-continued
37
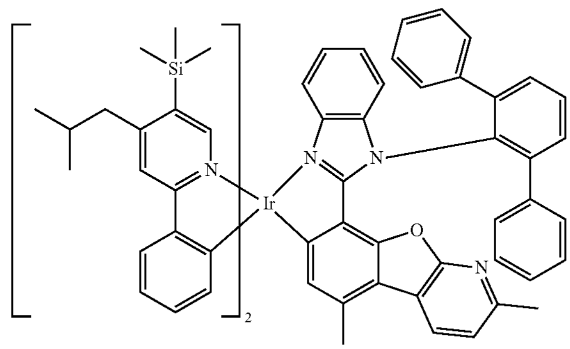
38
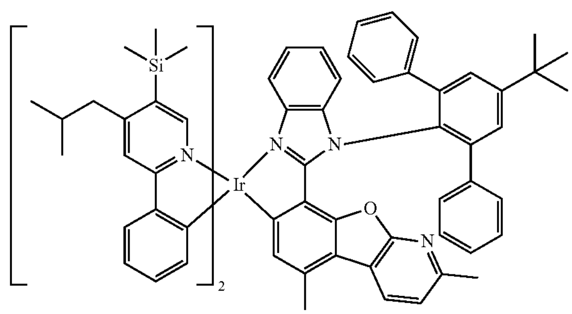
39
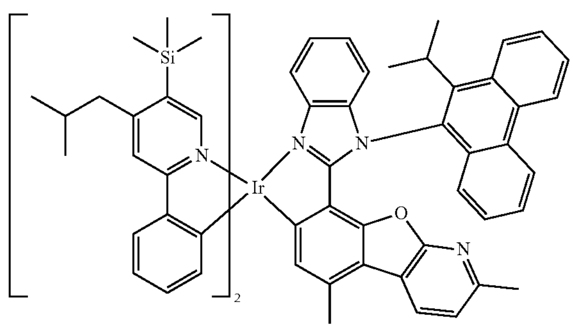
40
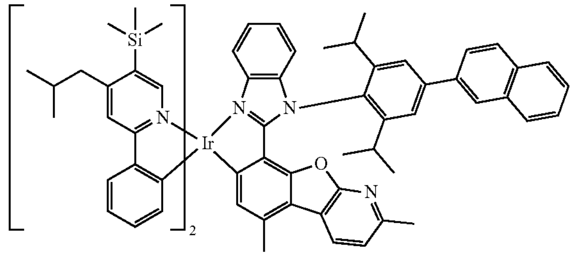

-continued
41
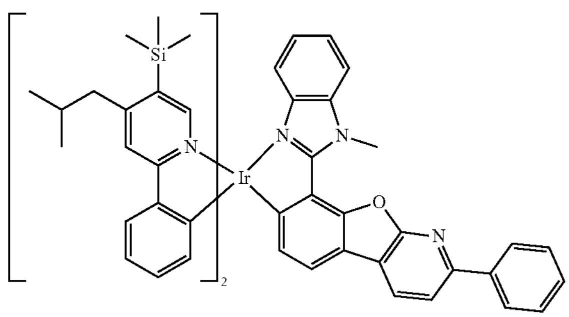
42
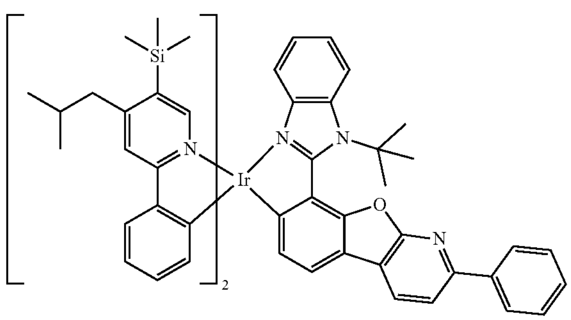
43
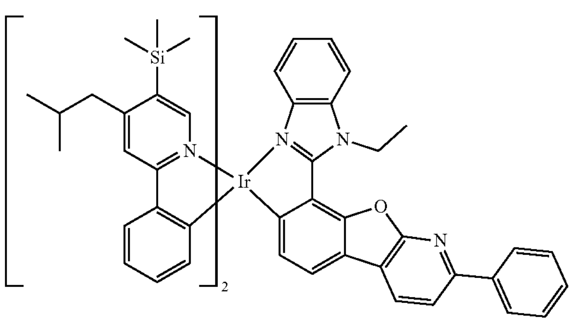
44
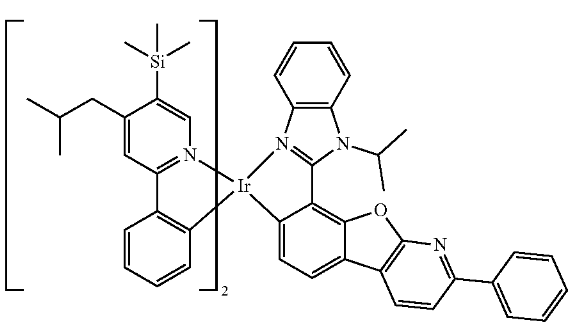
-continued
45
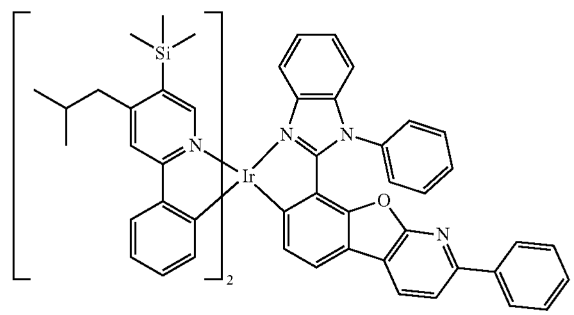
46
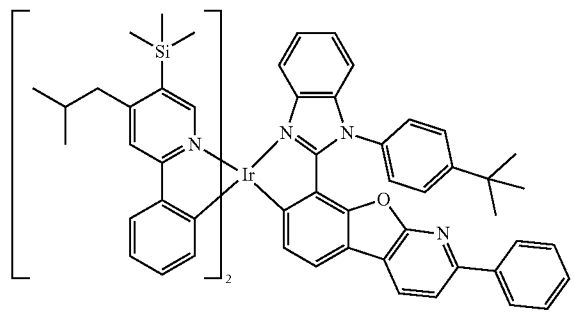
47
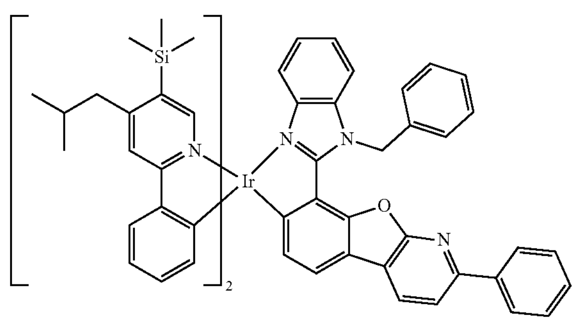
48
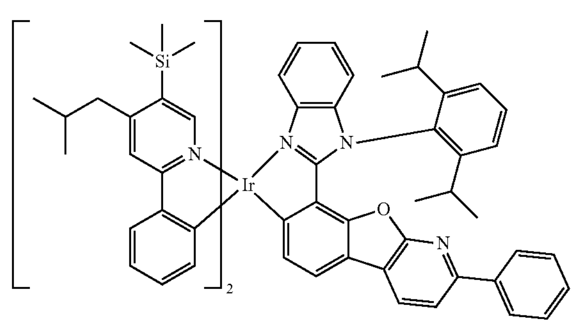

49
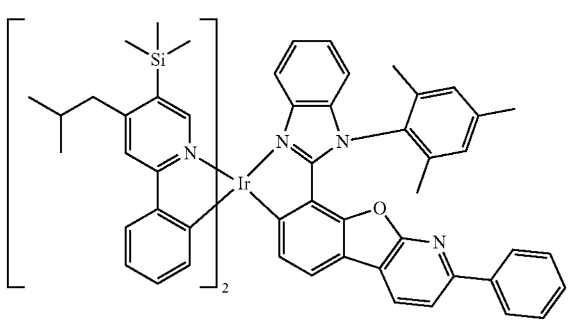
50
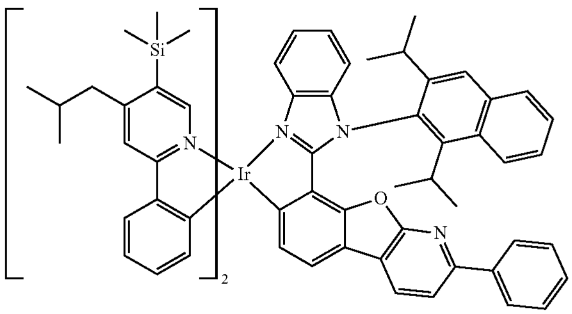
51
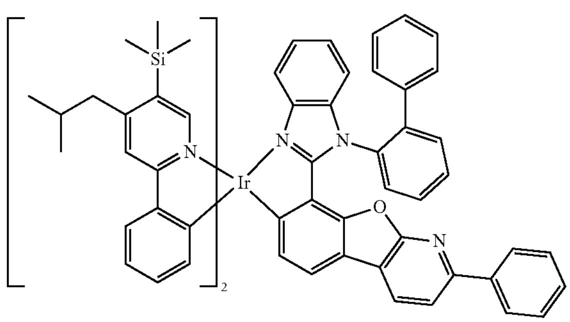
52
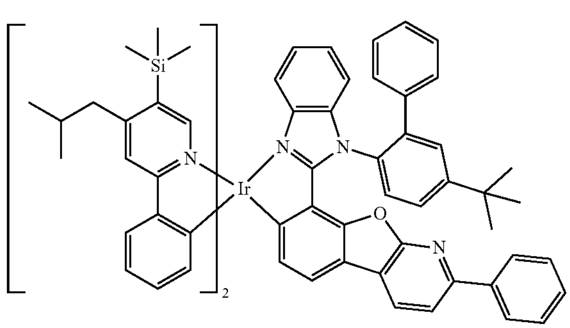
53
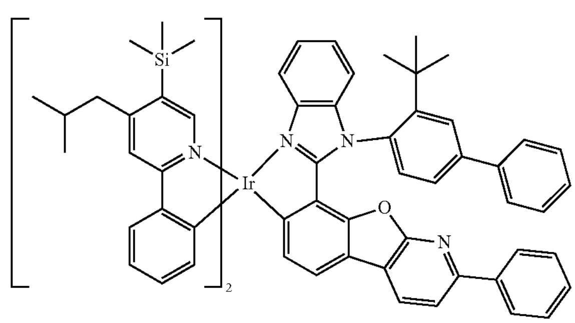
54
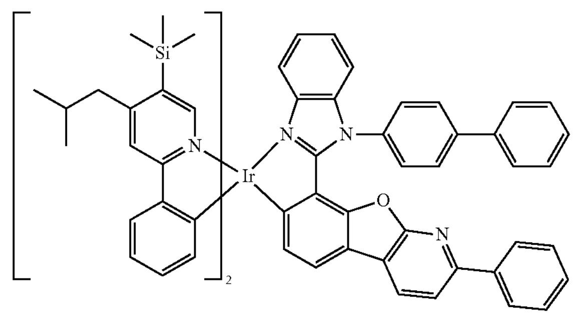
55
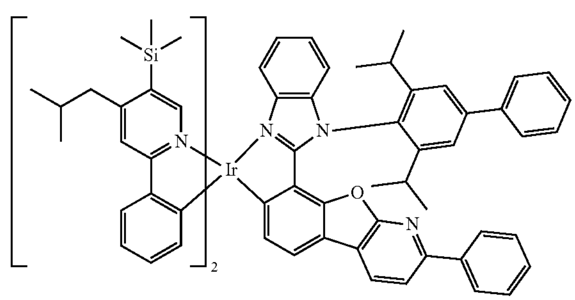
56
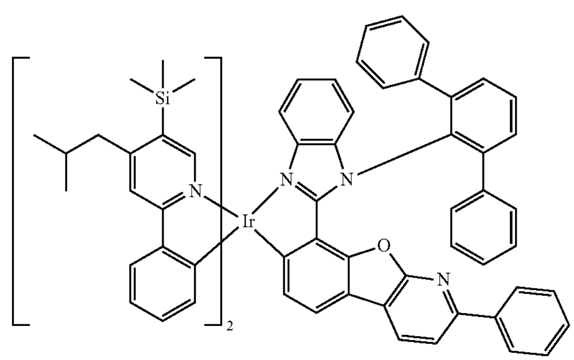

-continued
57
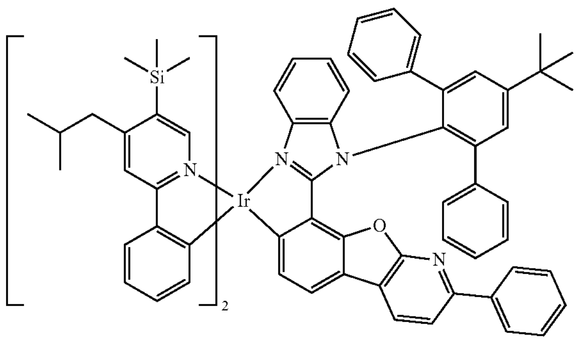
58
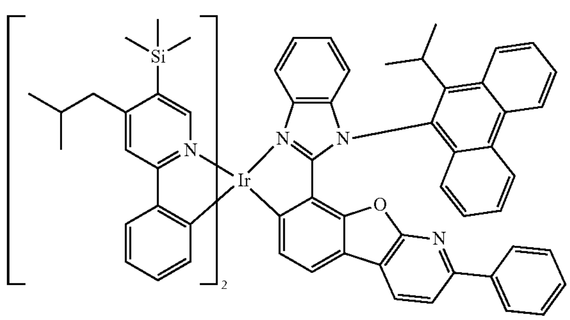
59
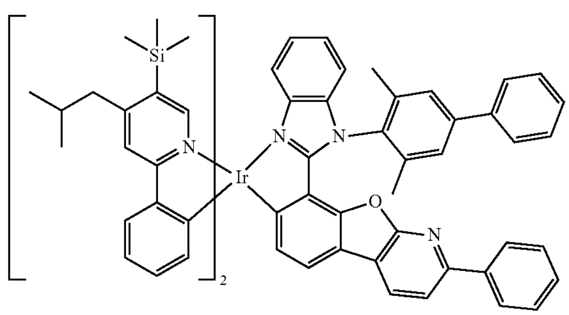
60
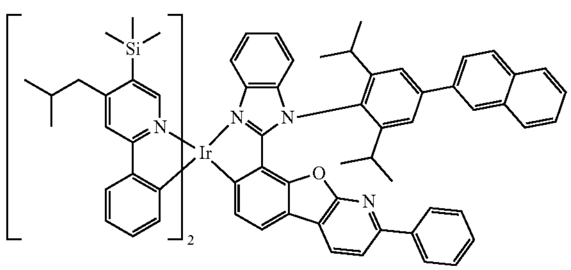
-continued
61
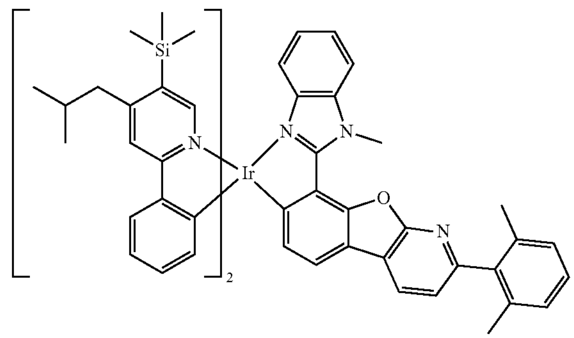
62
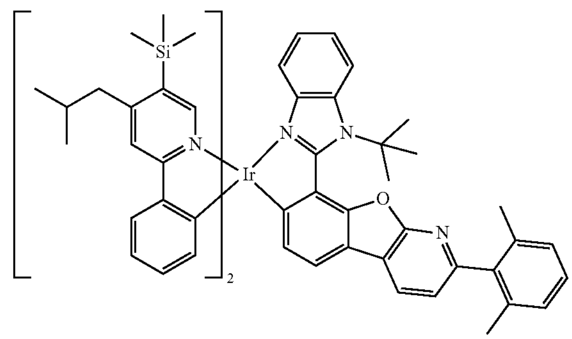
63
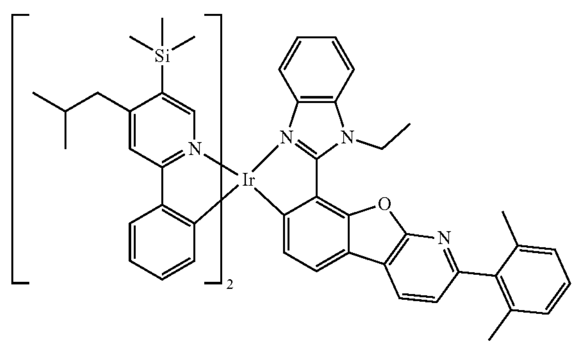
64
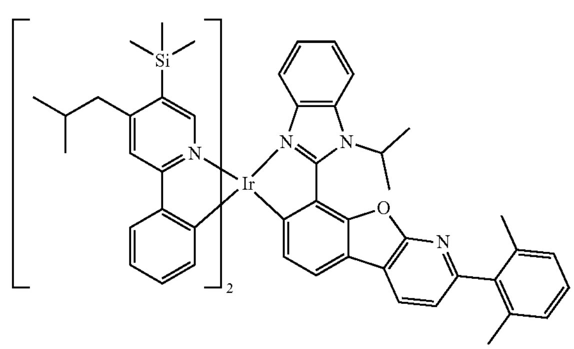

-continued
65
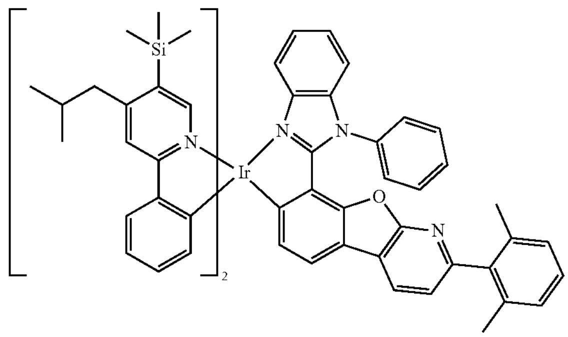
66
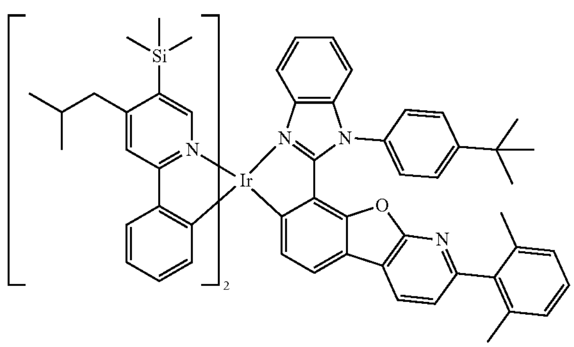
67
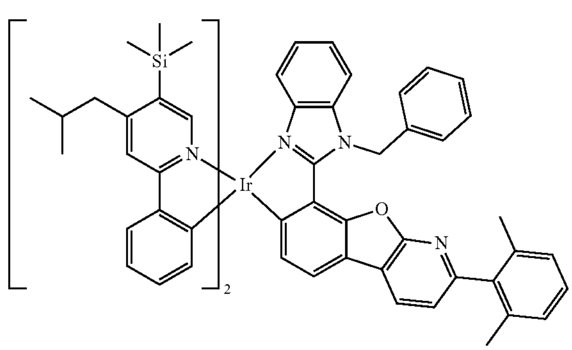
68
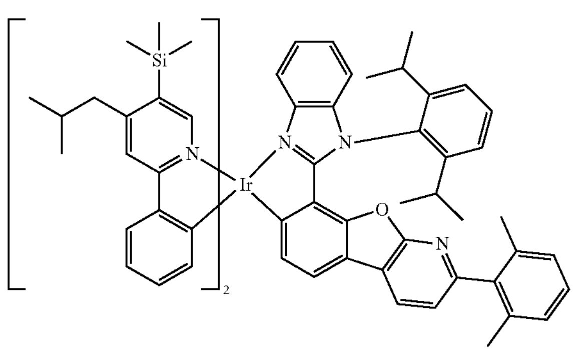
-continued
69
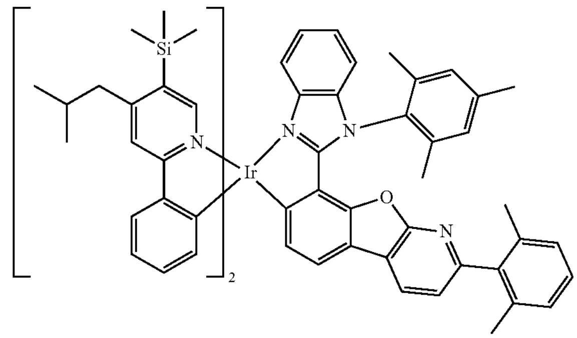
70
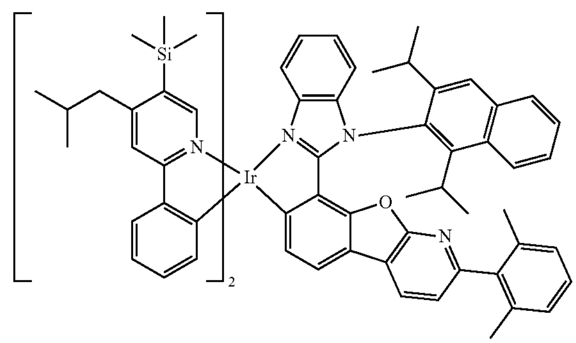
71
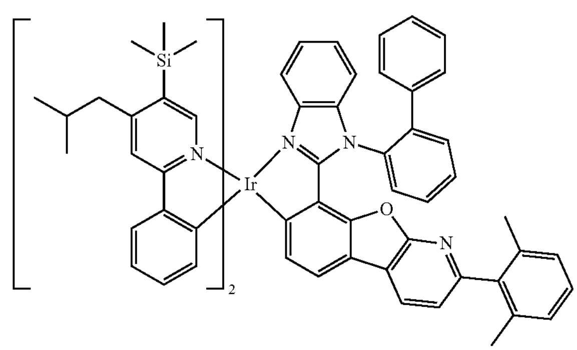
72
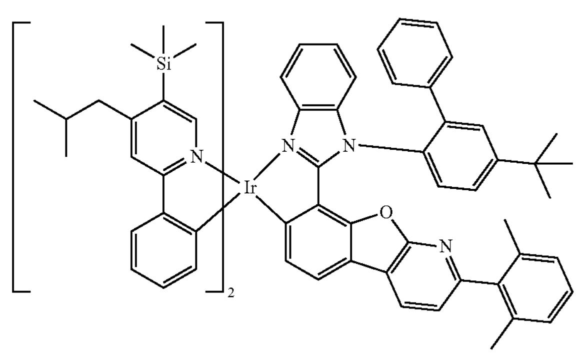

73
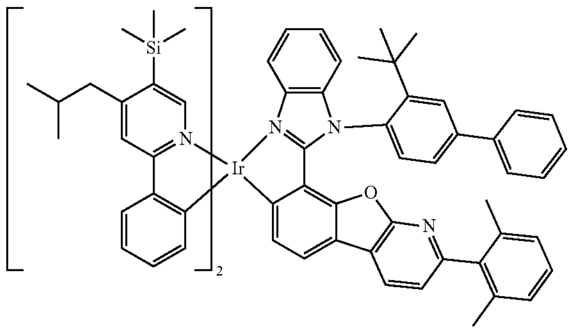
74
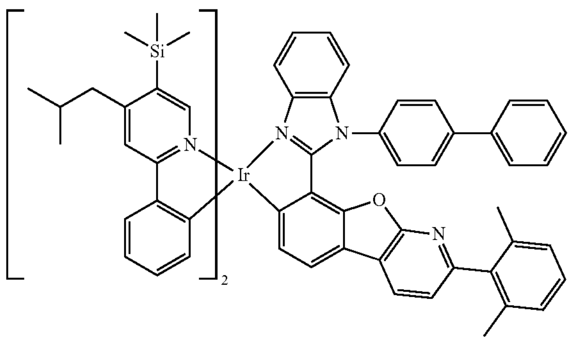
75
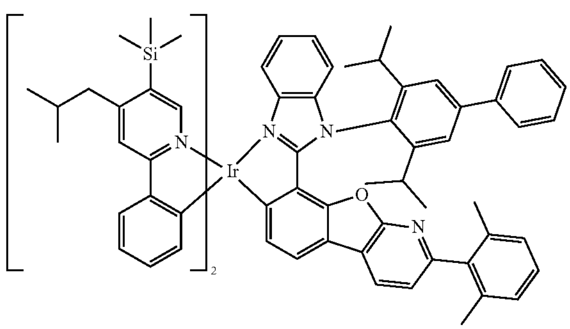
76
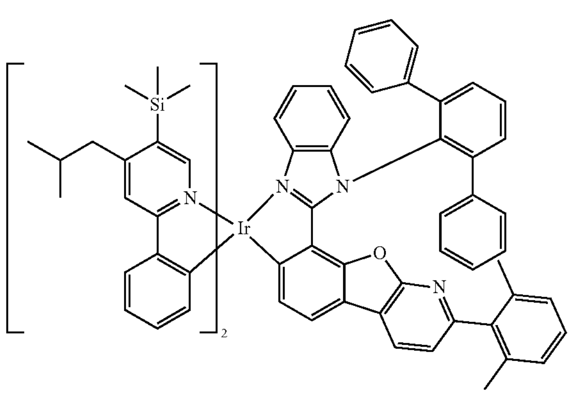
77
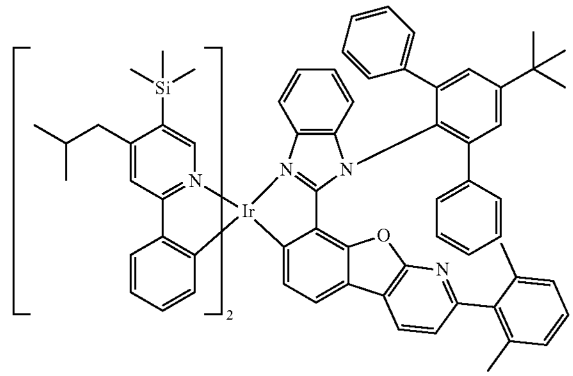
78
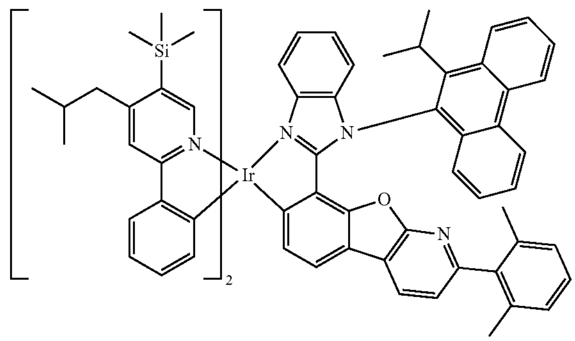
79
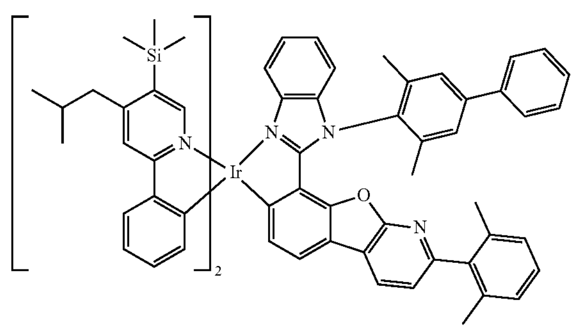
80
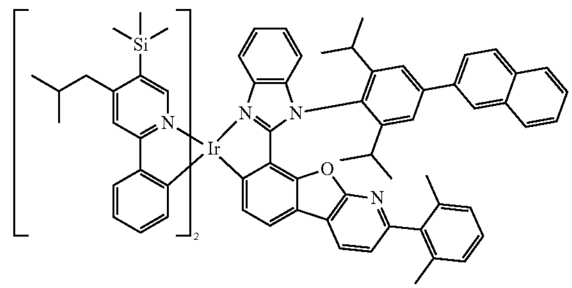

-continued
81
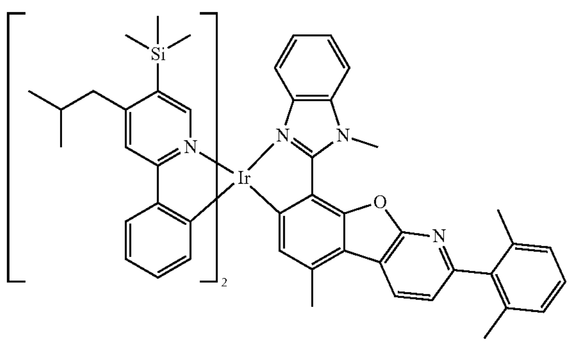
82
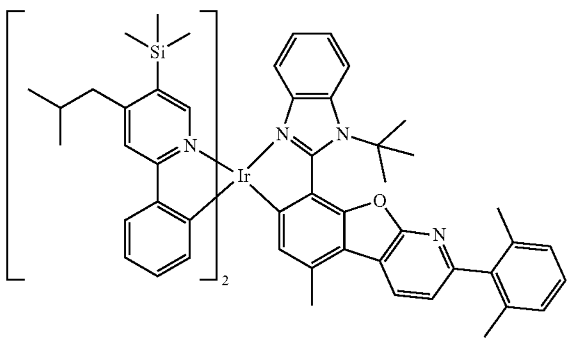
83
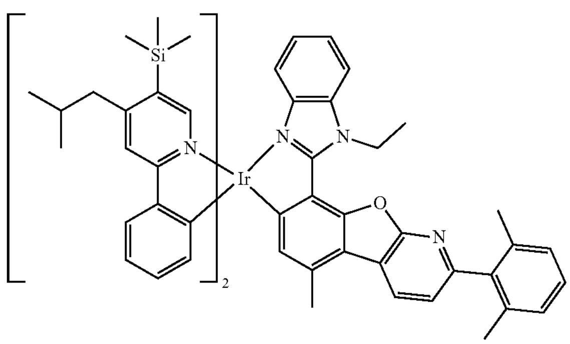
84
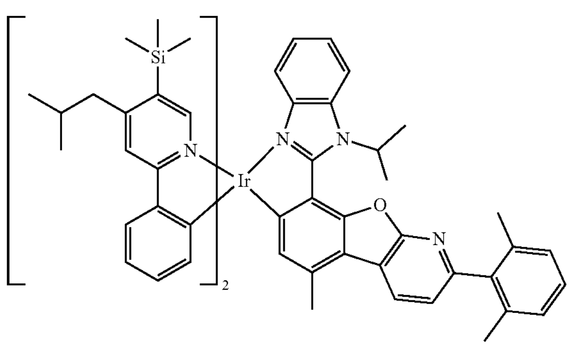
-continued
85
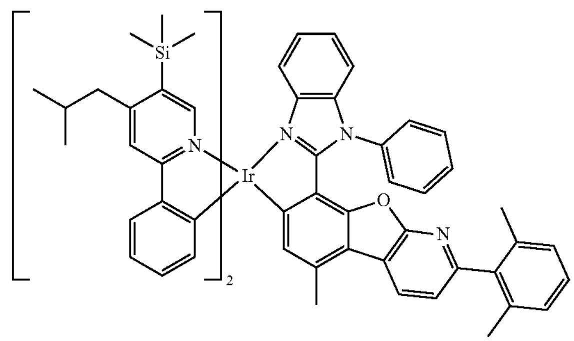
86
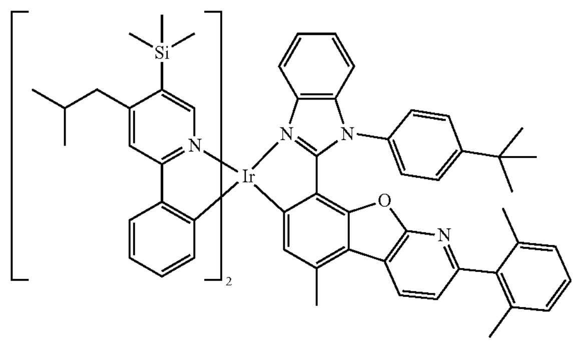
87
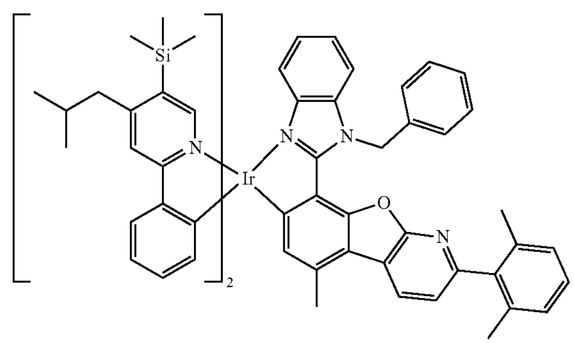
88
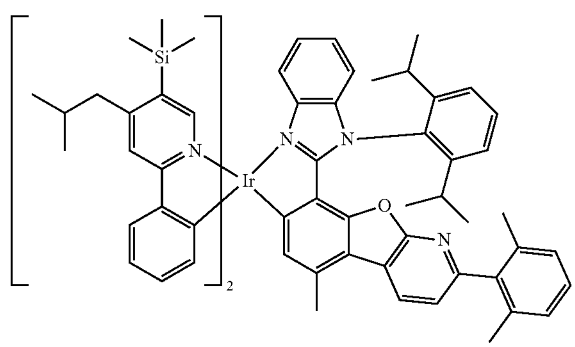

89
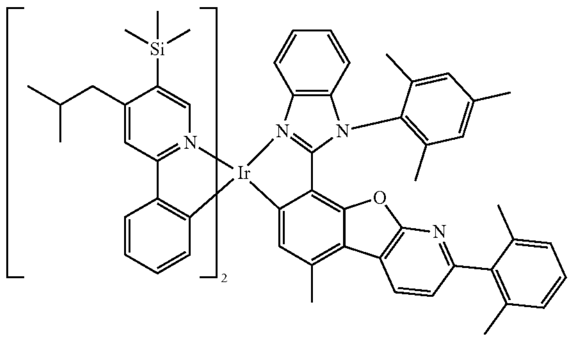
90
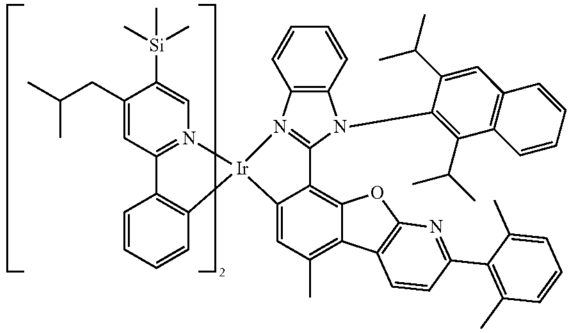
91
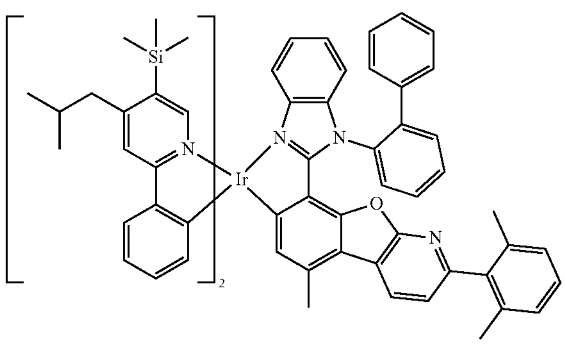
92
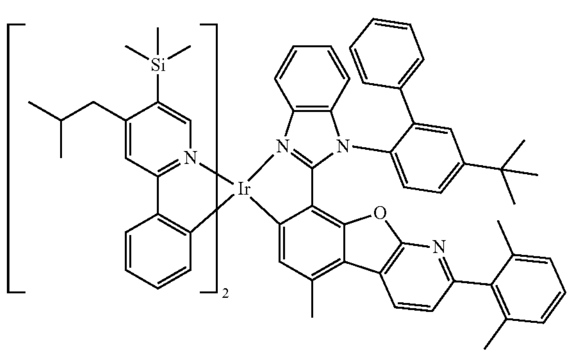
93
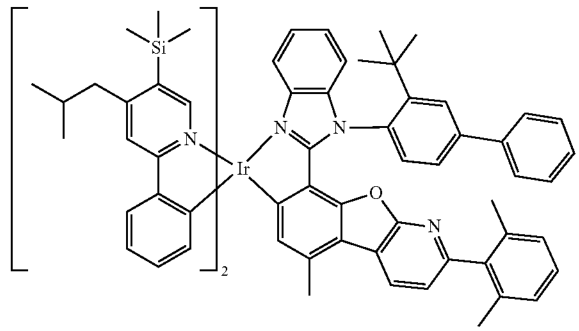
94
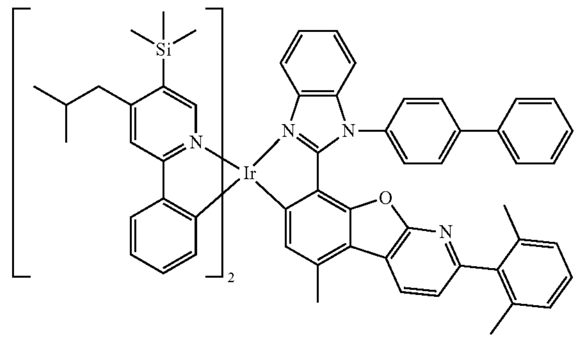
95
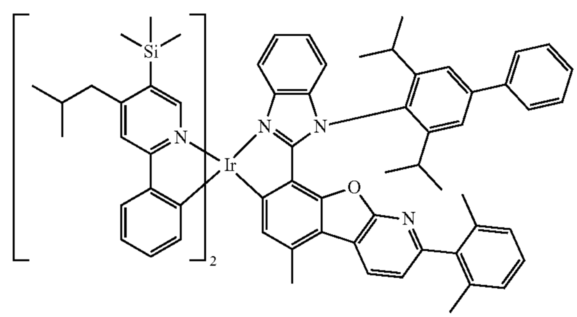
96
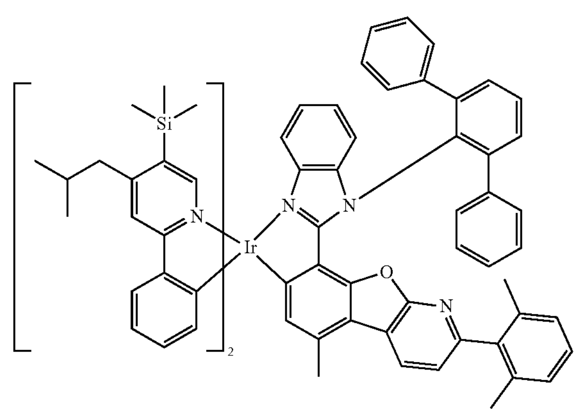

97
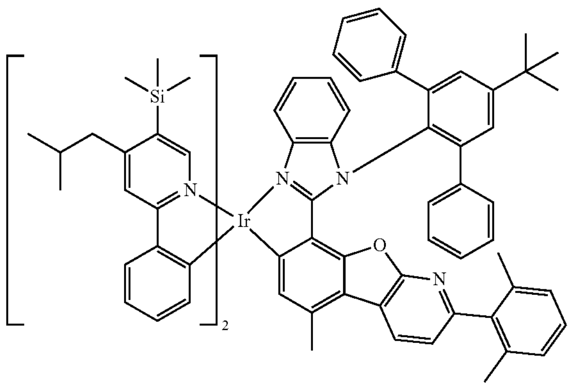
98
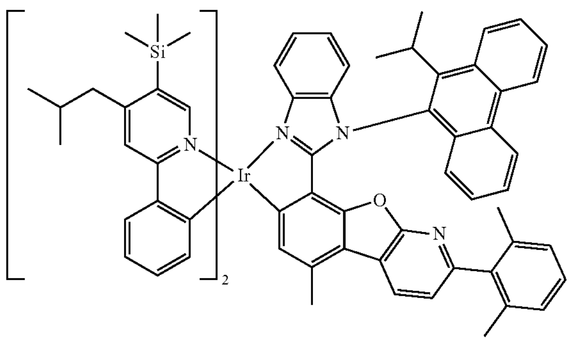
99
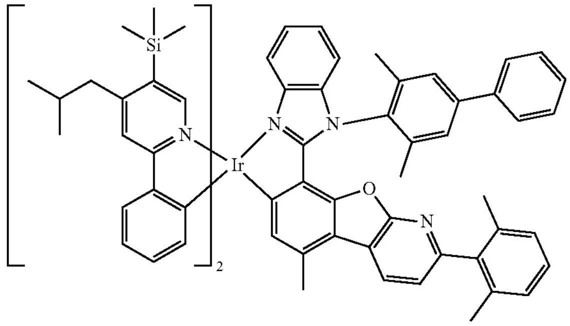
100
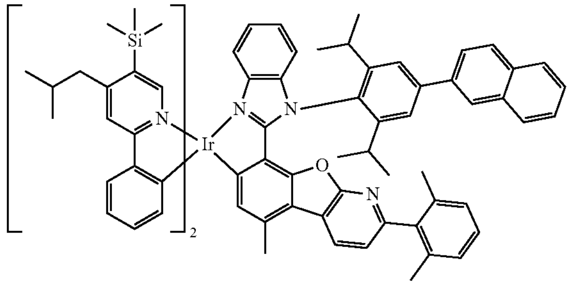
101
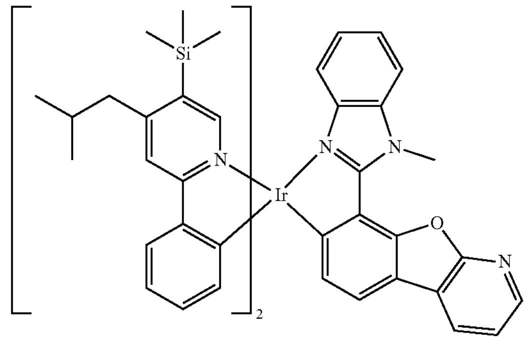
102
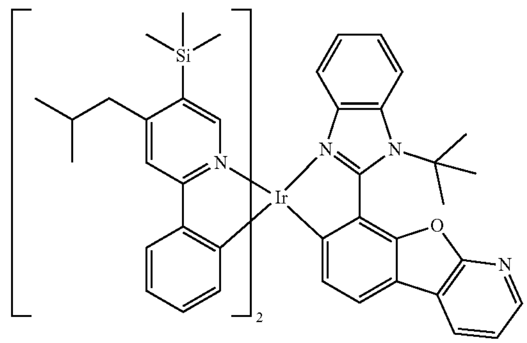
103
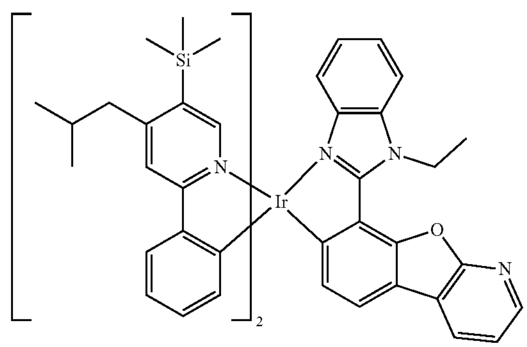
104
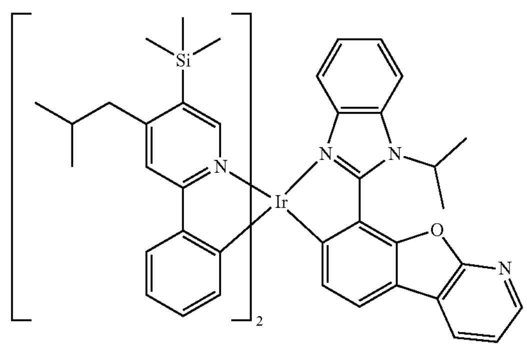

-continued
105
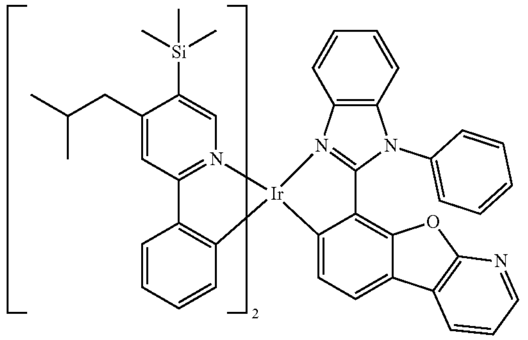
106
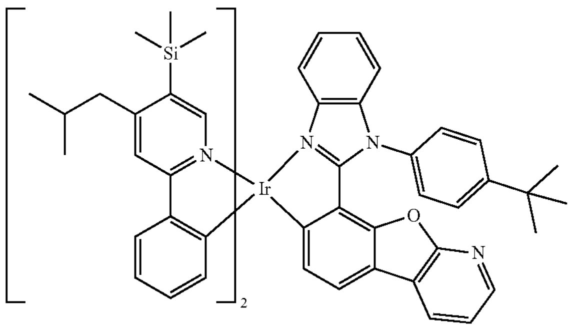
107
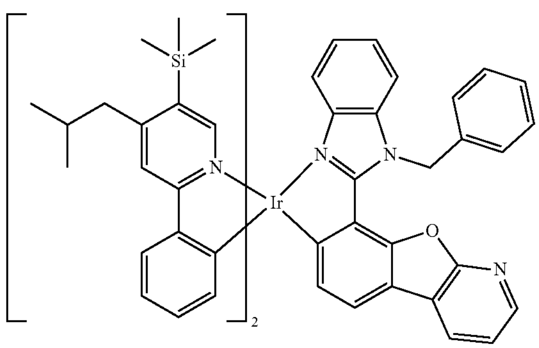
108
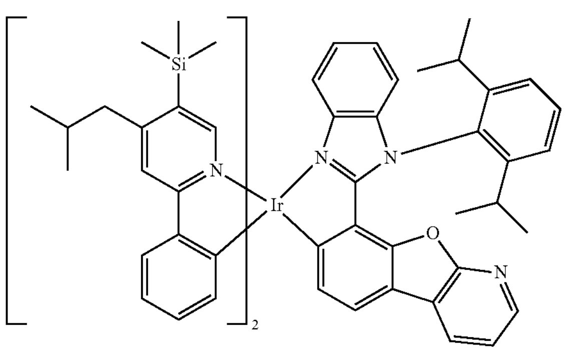
-continued
109
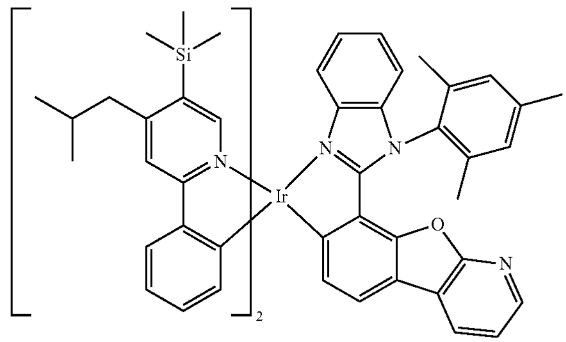
110
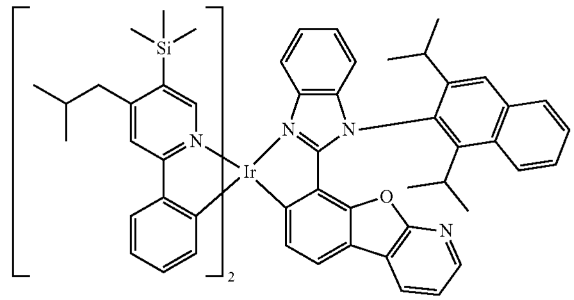
111
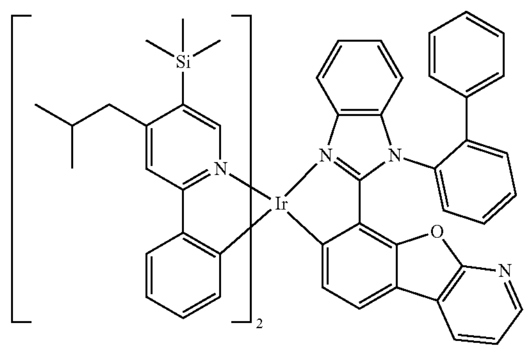
112
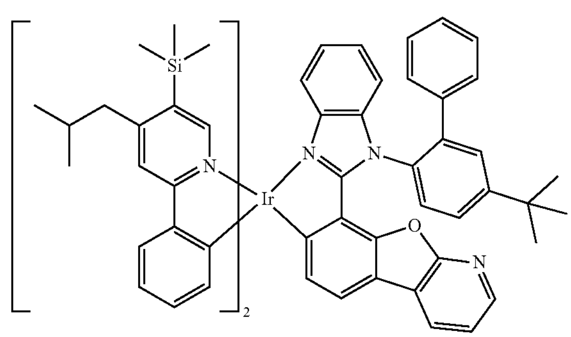

-continued
113
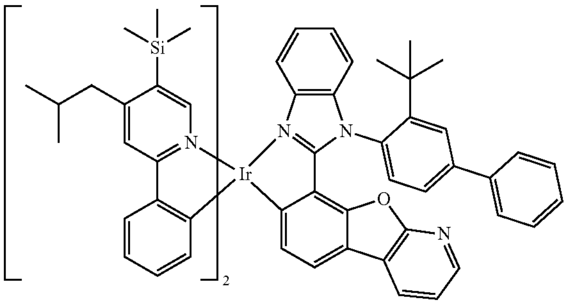
114
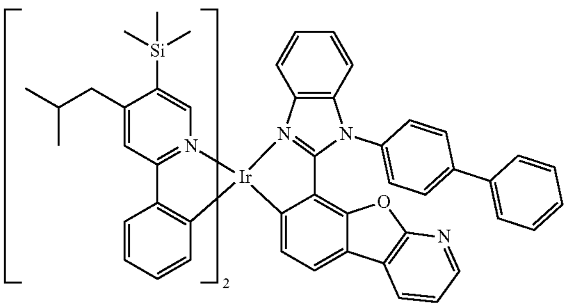
115
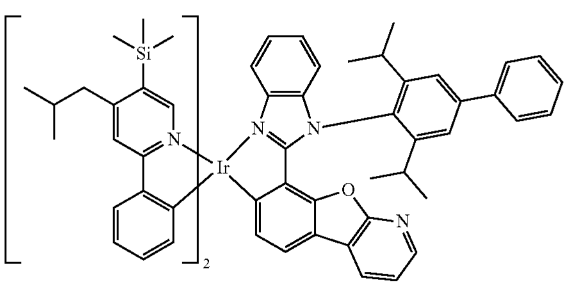
116
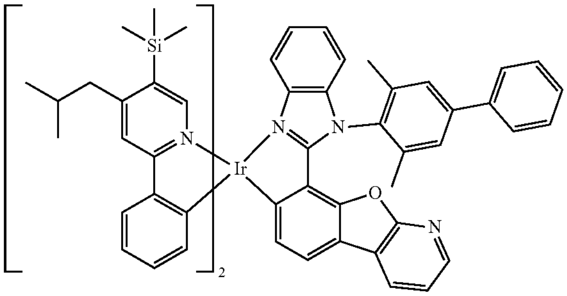
-continued
117
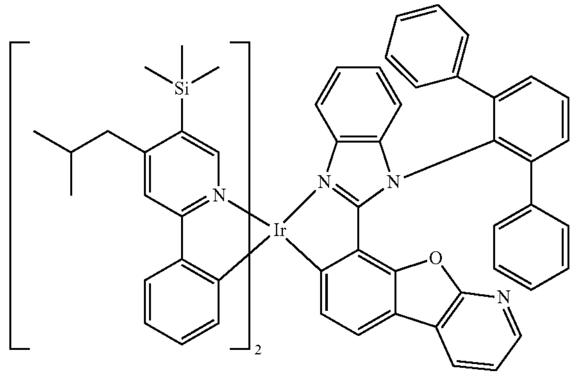
118
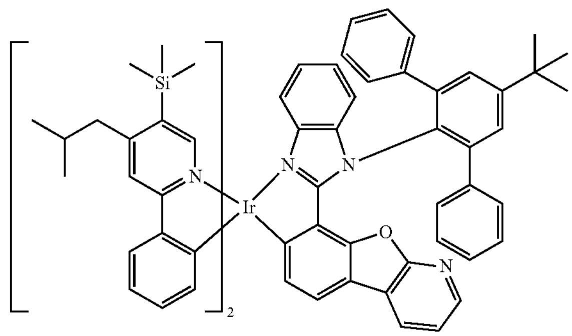
119
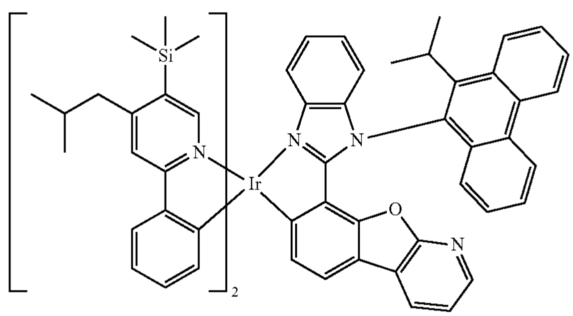
120
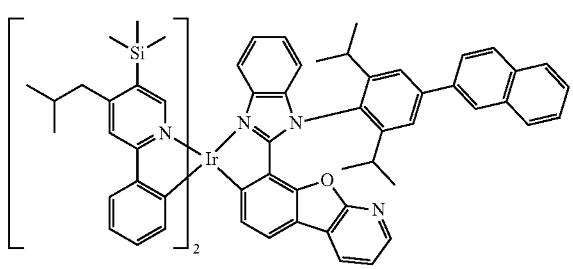

-continued
121
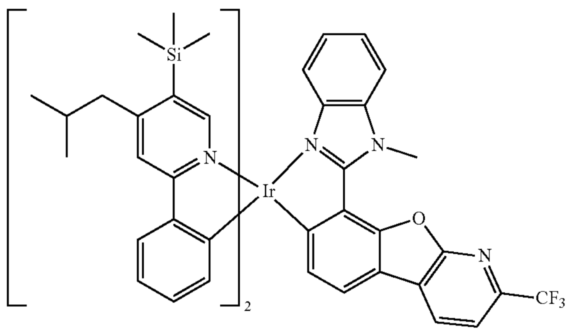
122
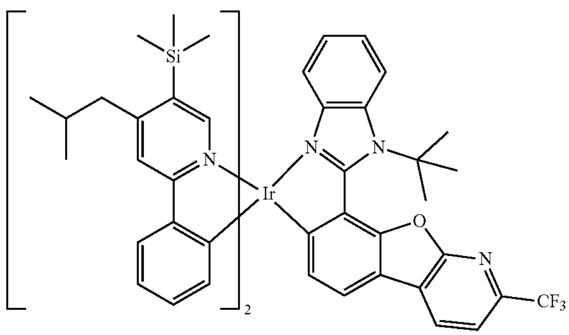
123
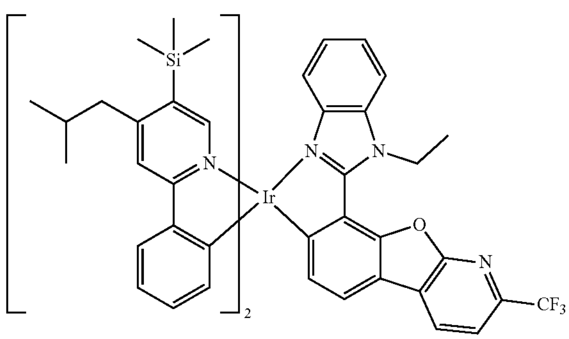
124
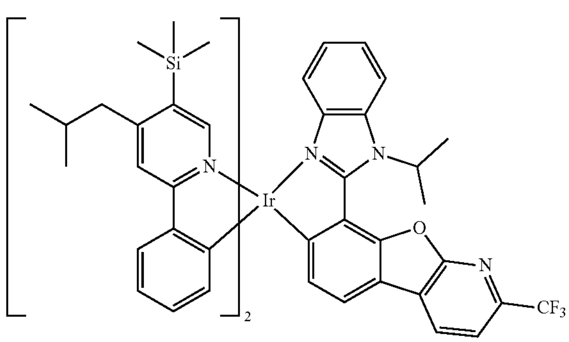
-continued
125
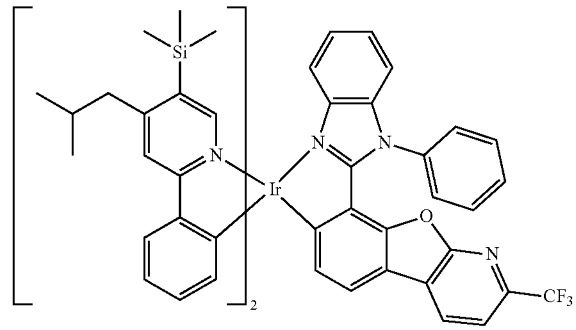
126
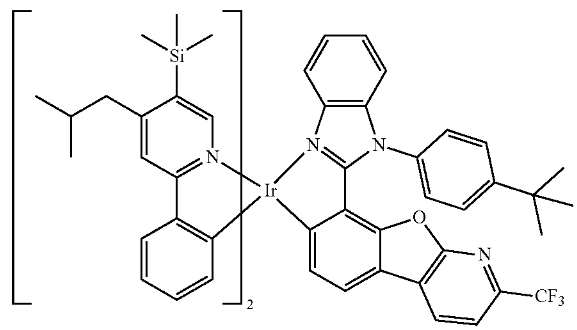
127
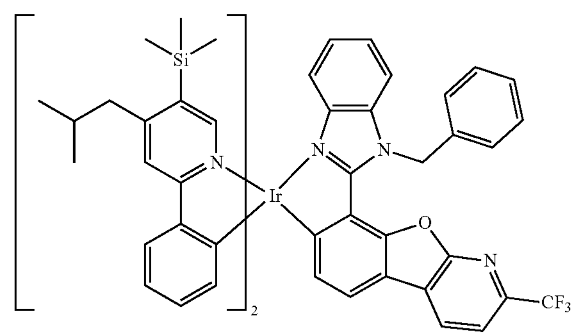
128
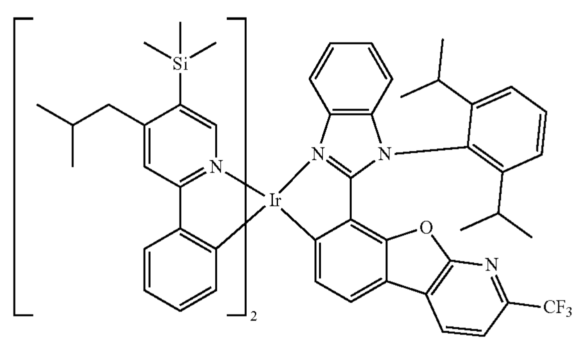

-continued
129
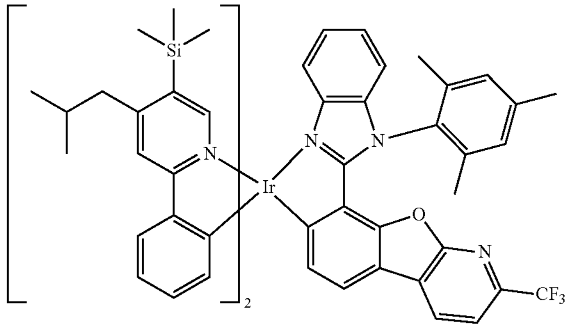
130
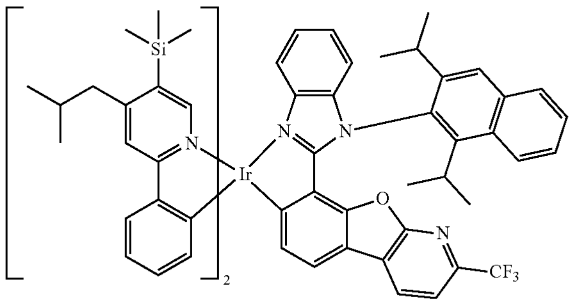
131
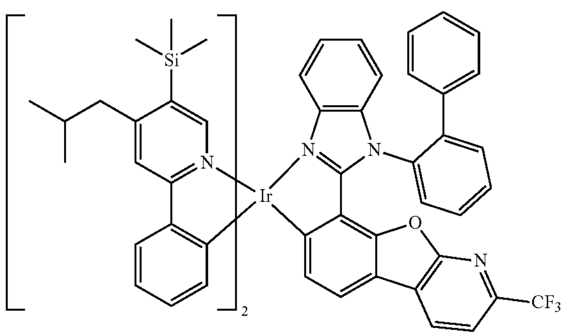
132
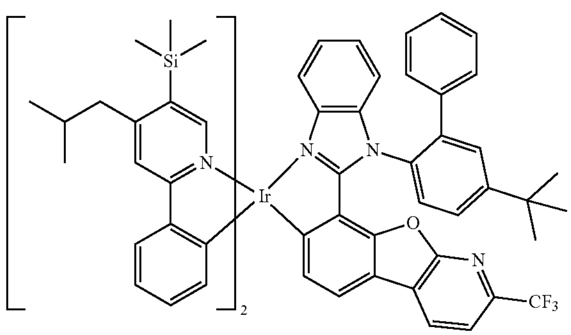
-continued
133
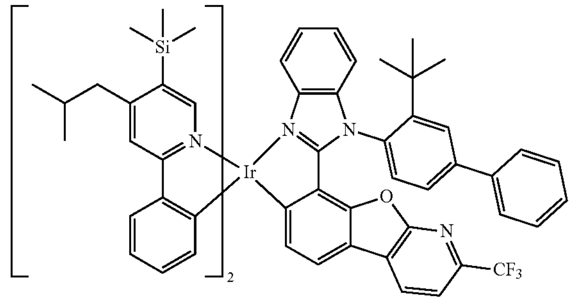
134
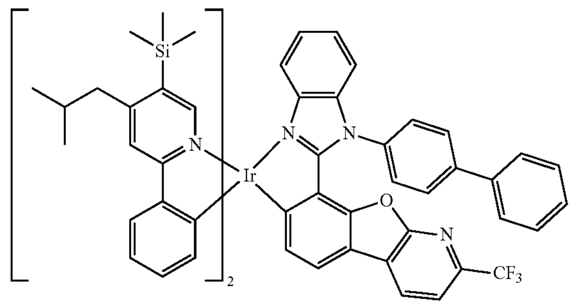
135
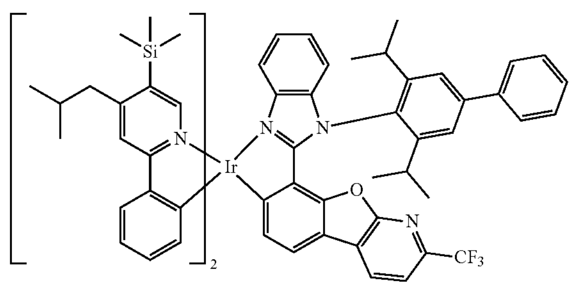
136
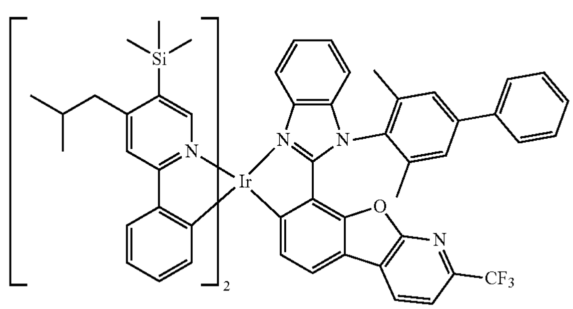

-continued
137
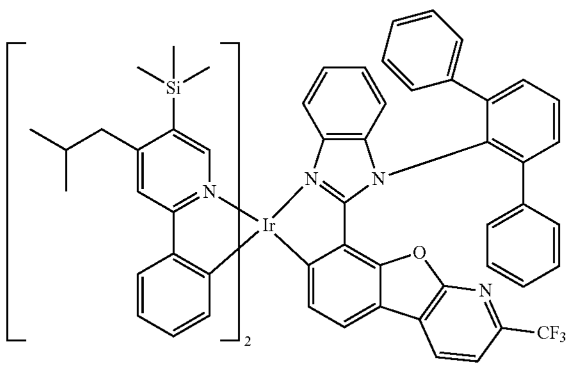
138
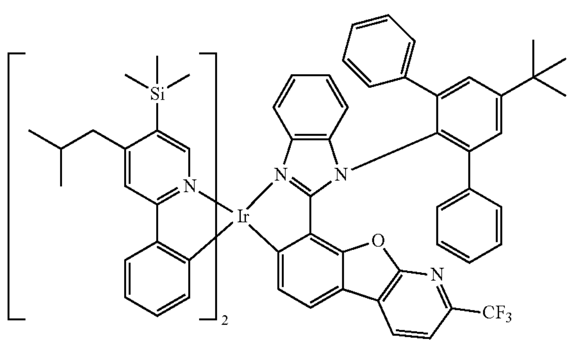
139
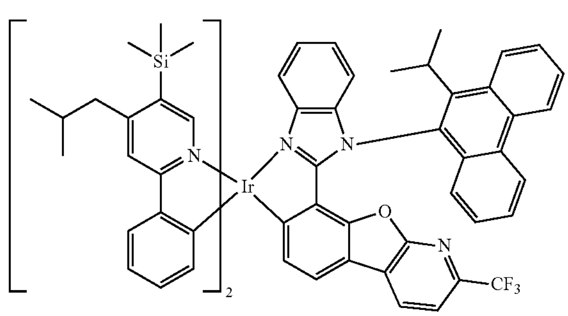
140
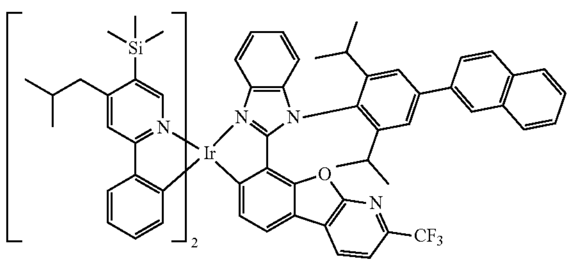
-continued
141
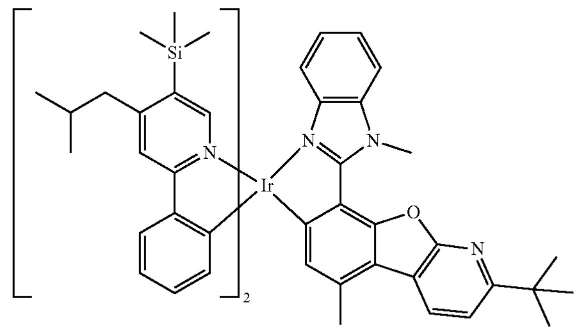
142
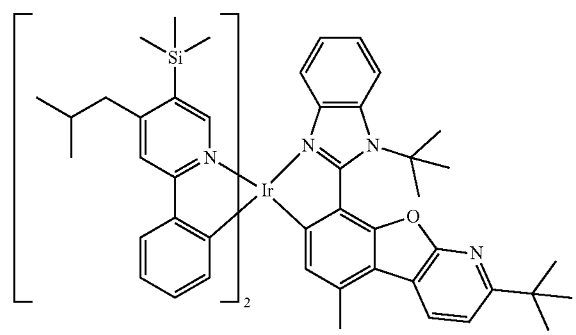
143
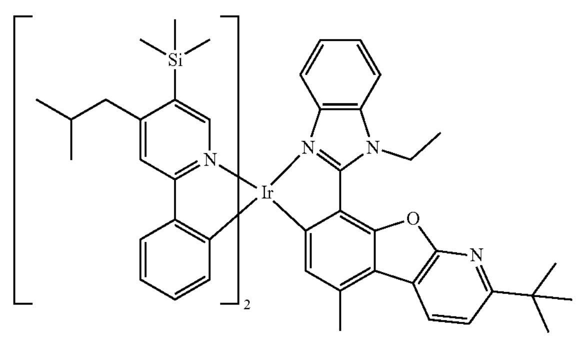
144
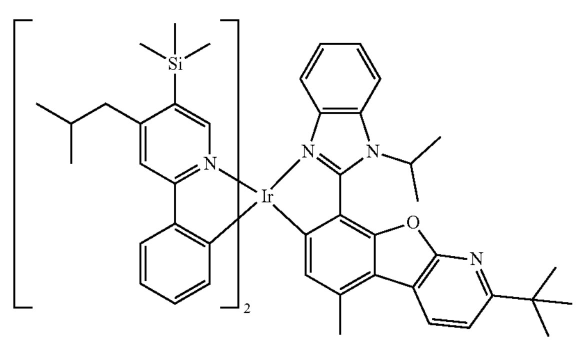

-continued
145
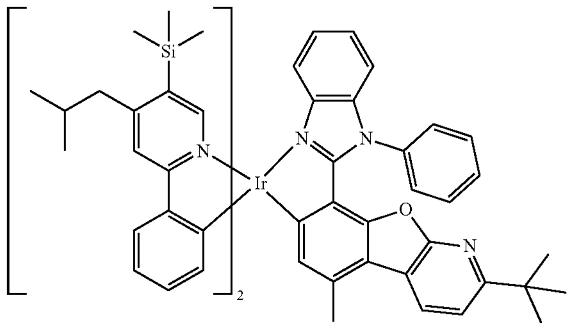
146
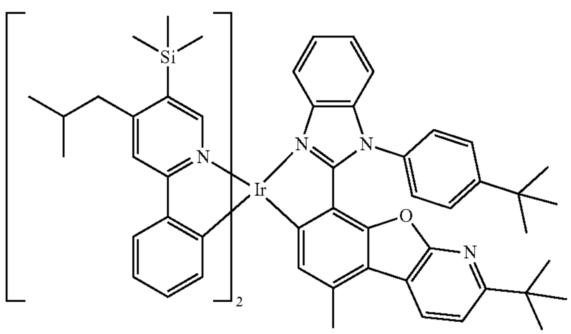
147
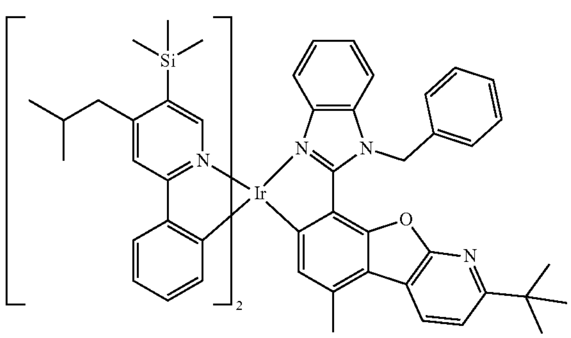
148
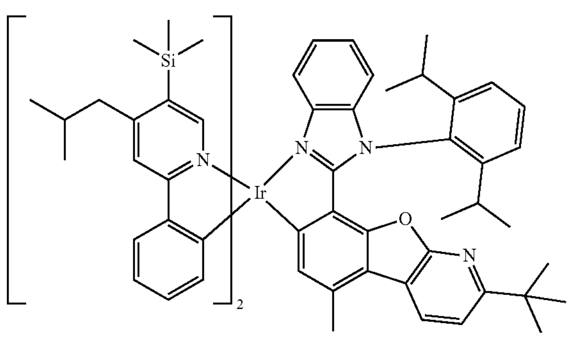
-continued
149
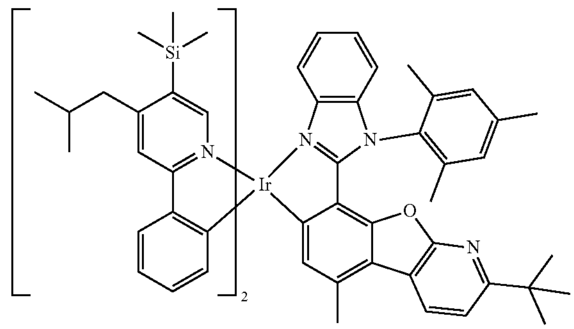
150
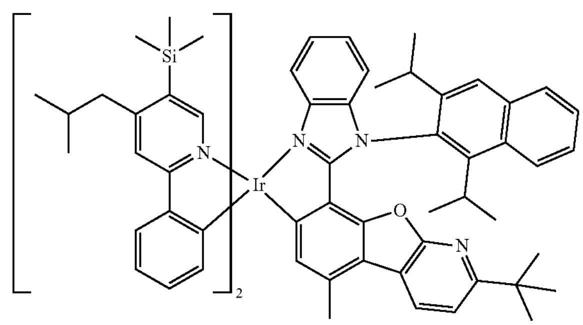
151
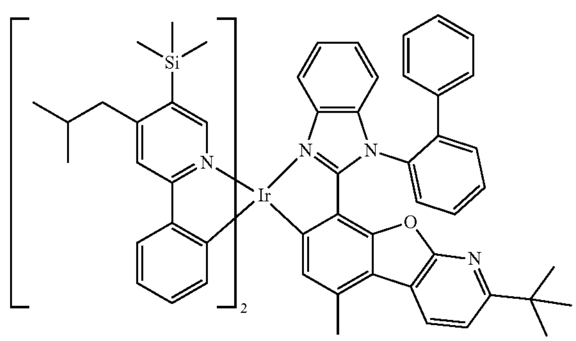
152
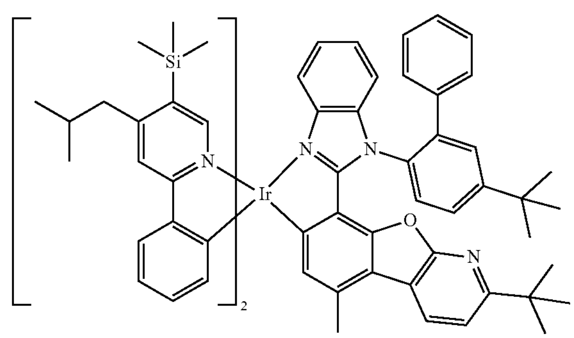

153
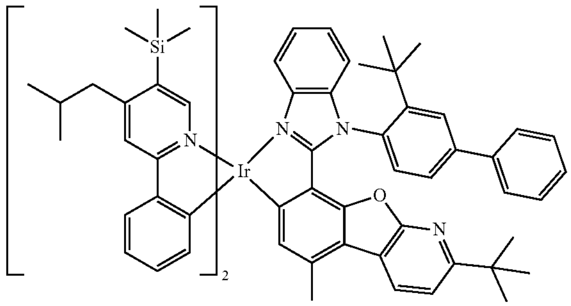
154
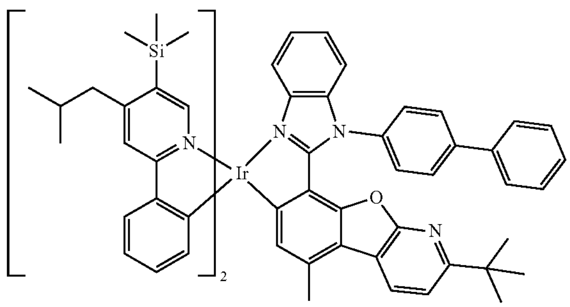
155
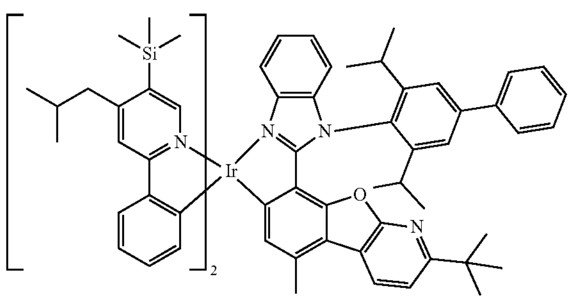
156
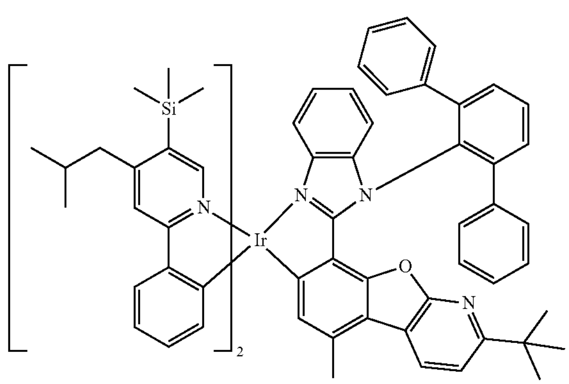
157
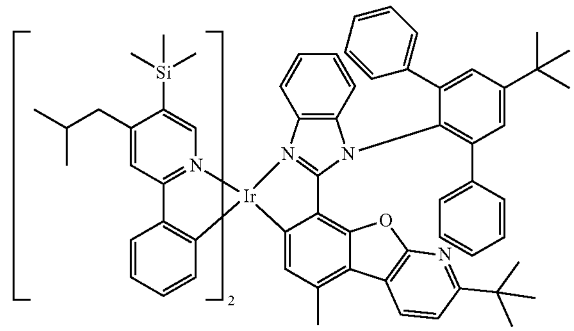
158
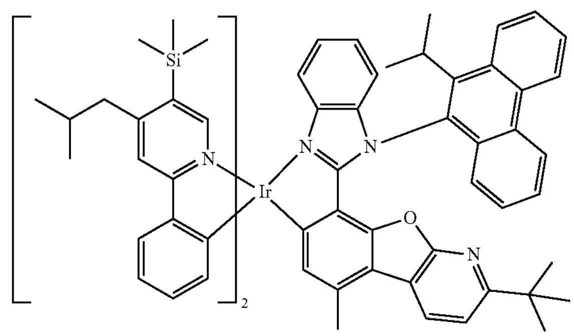
159
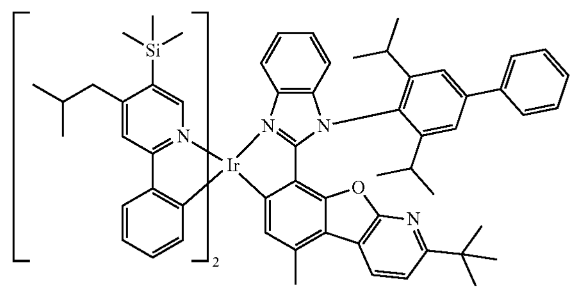
160
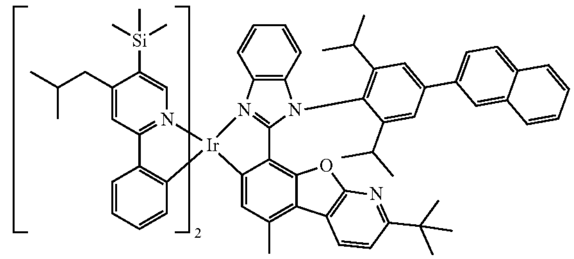

-continued
161
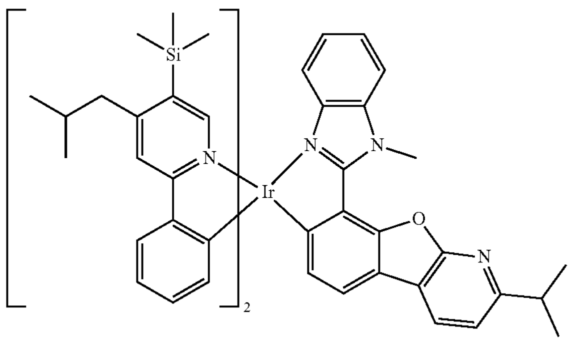
162
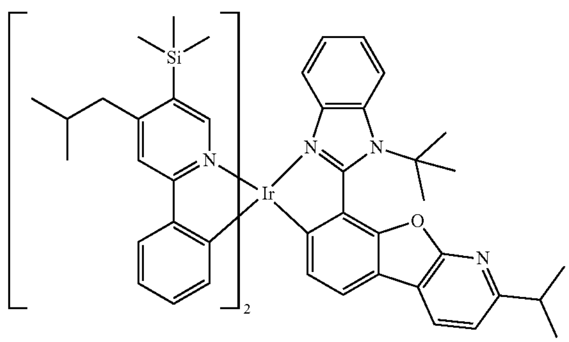
163
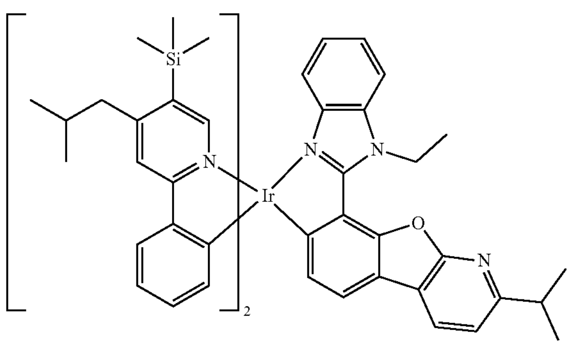
164
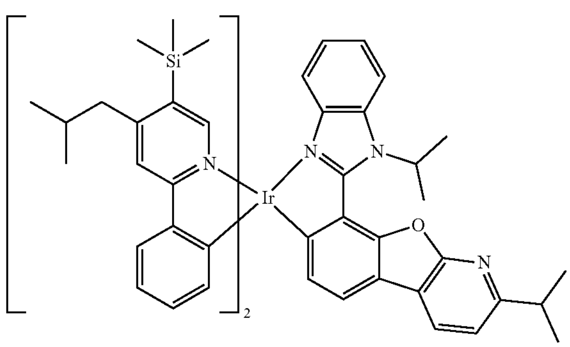
-continued
165
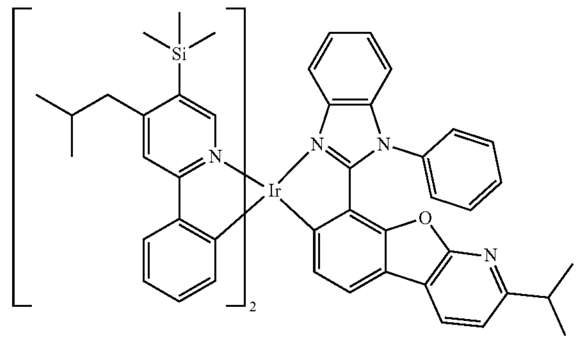
166
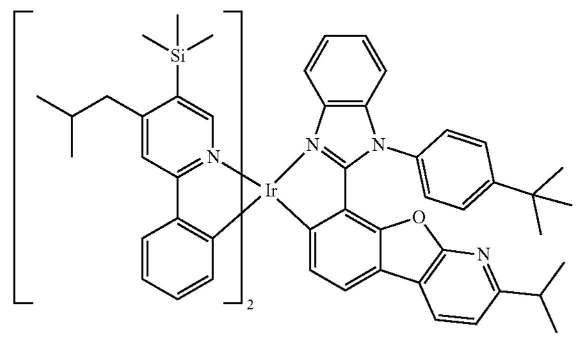
167
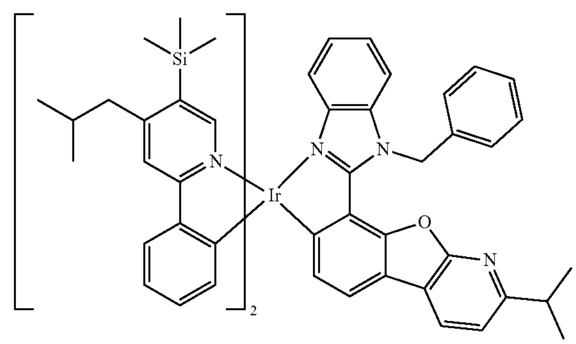
168
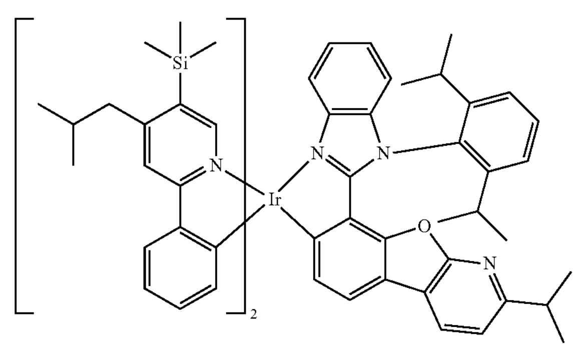

169
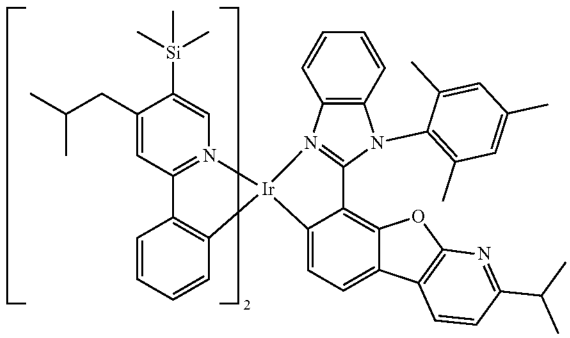
170
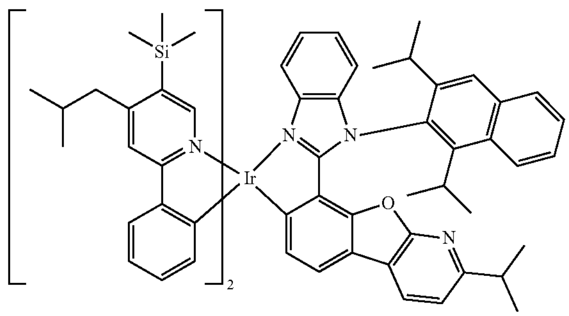
171
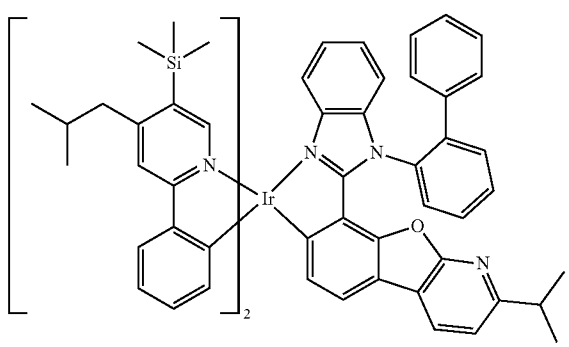
172
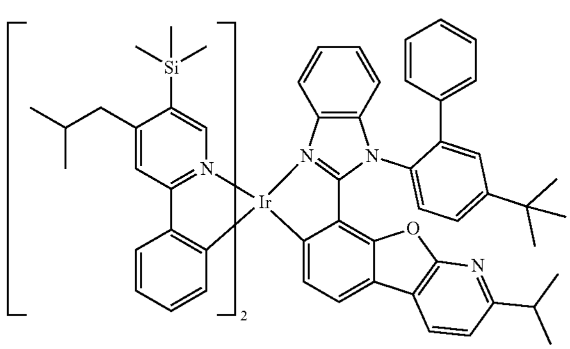
173
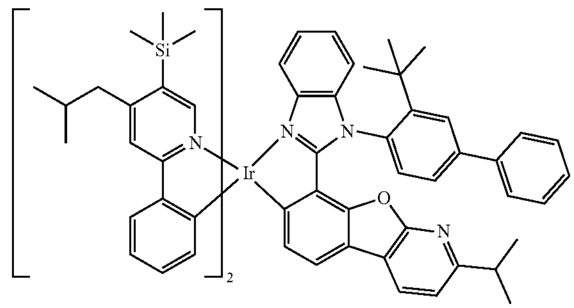
174
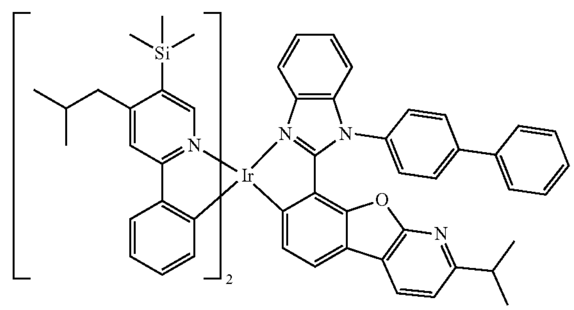
175
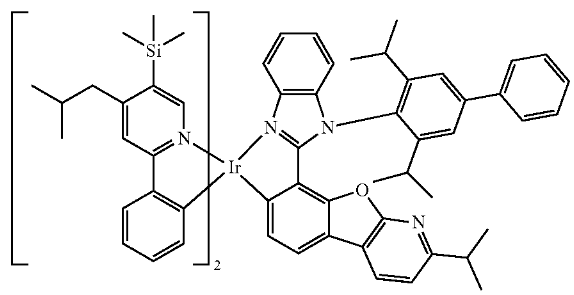
176
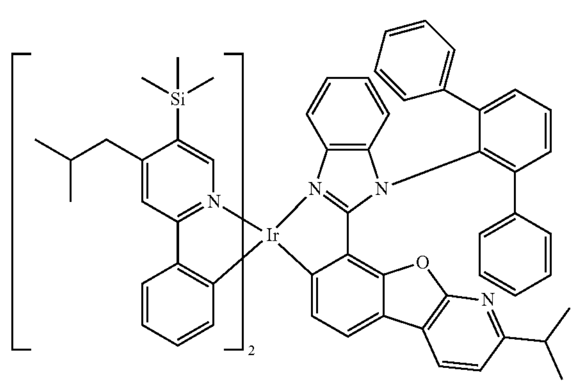

-continued
177
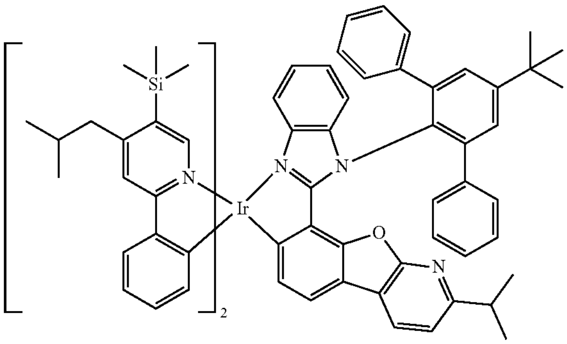
178
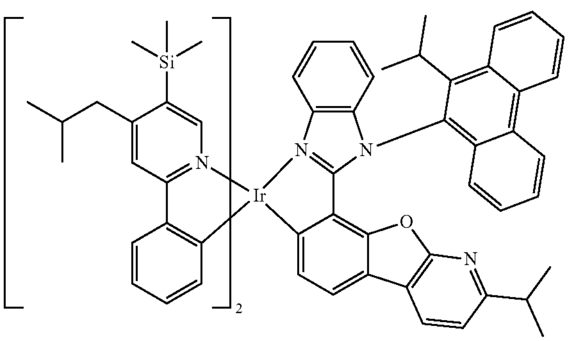
179
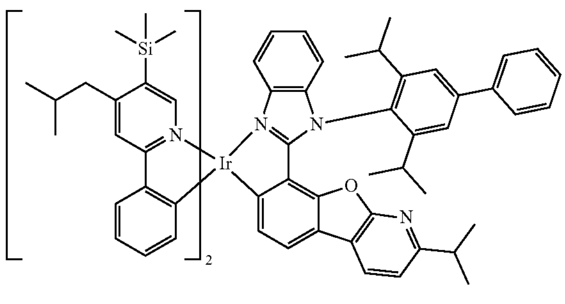
180
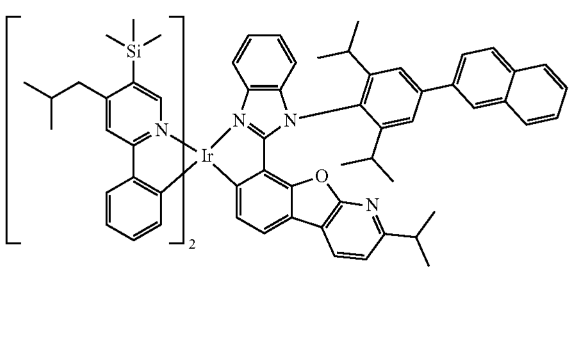
-continued
181
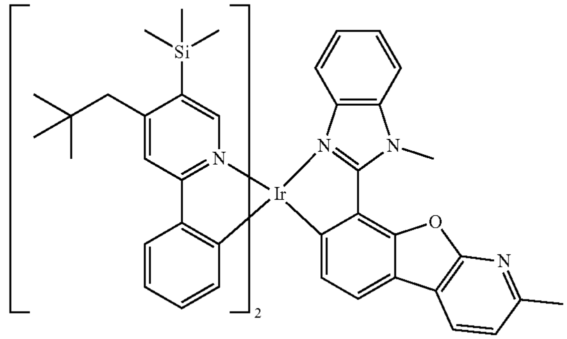
182
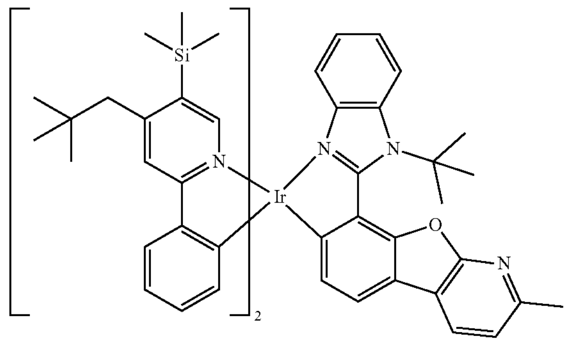
183
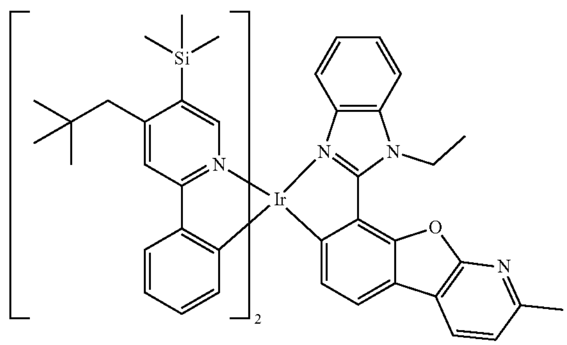
184
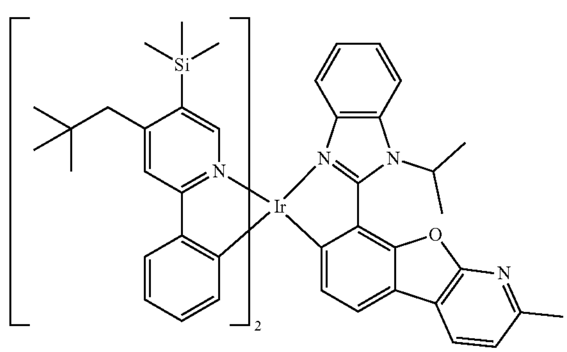

185
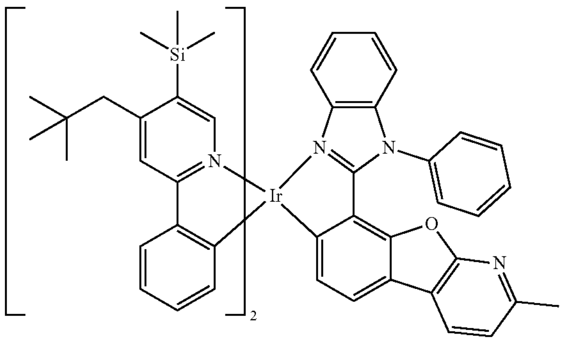
186
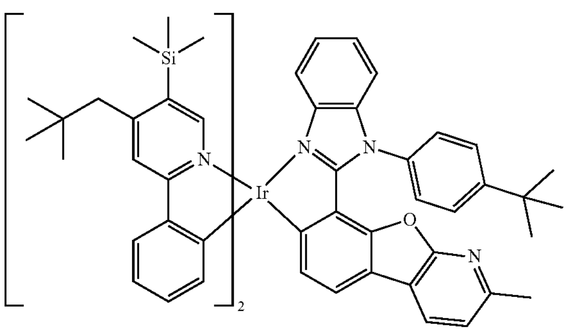
187
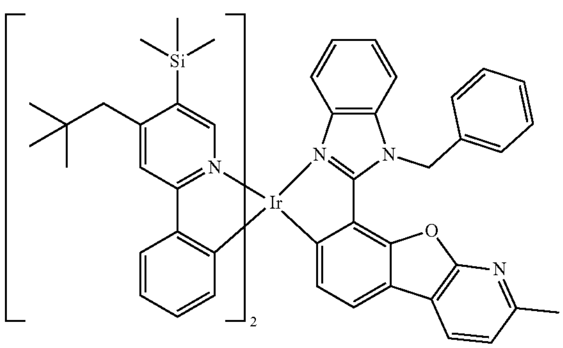
188
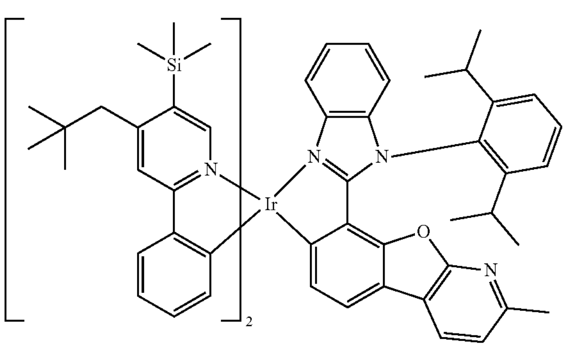
189
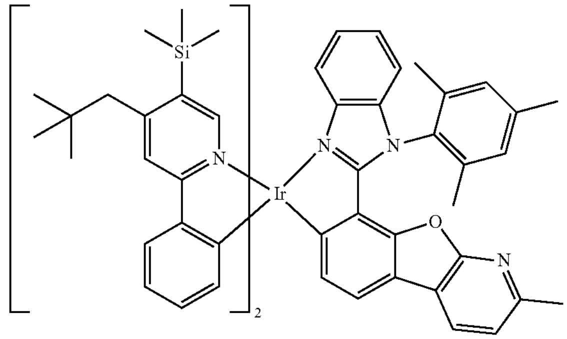
190
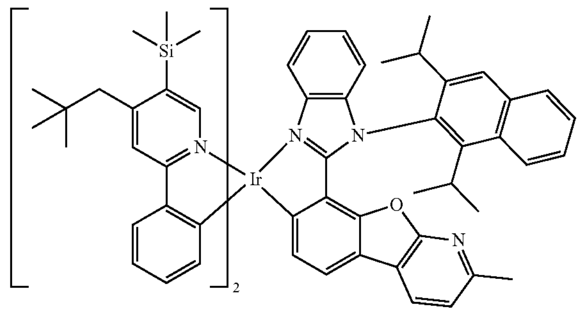
191
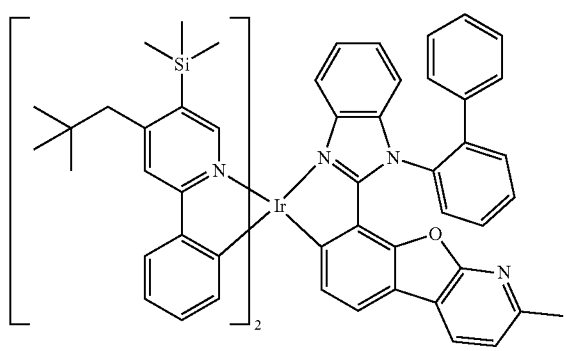
192
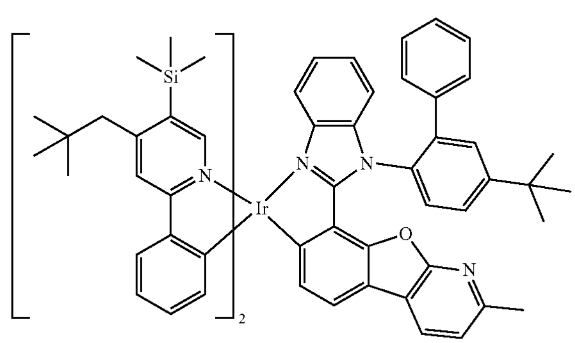

-continued
193
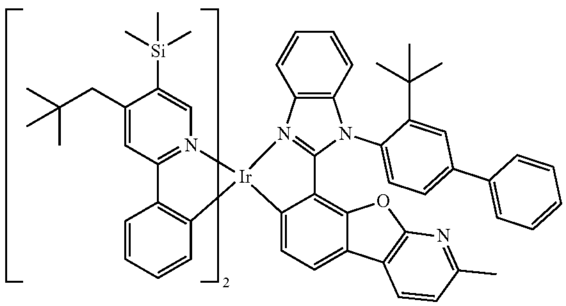
194
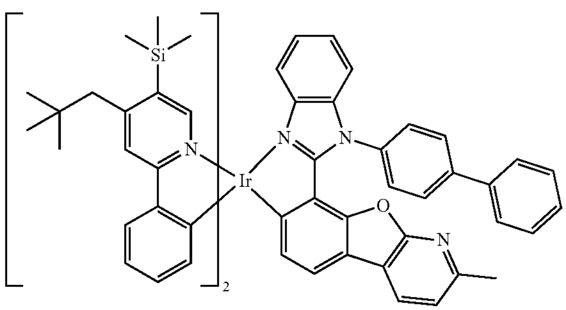
195
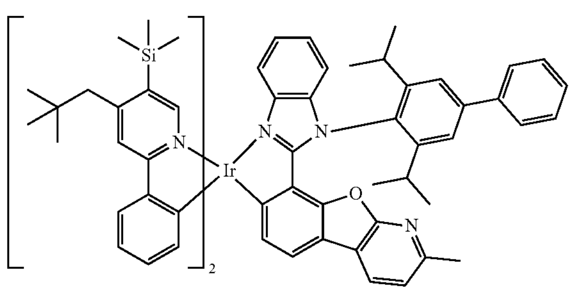
196
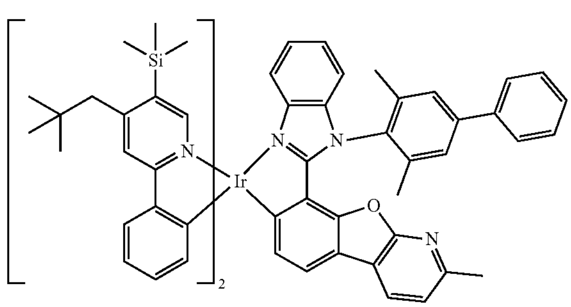
-continued
197
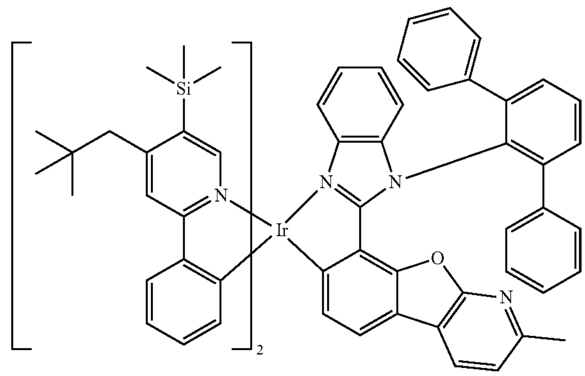
198
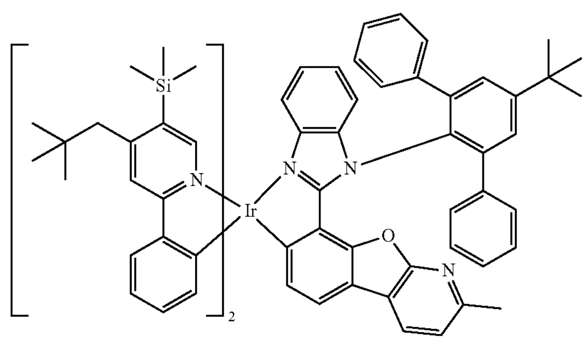
199
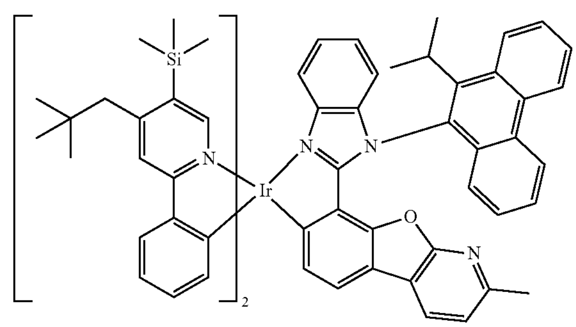
200
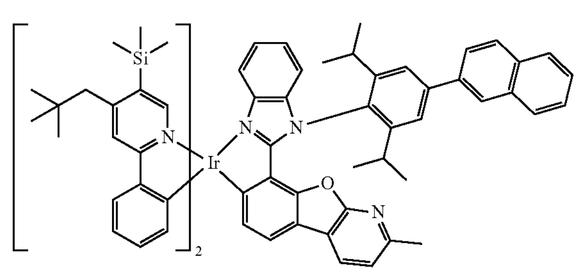

-continued
201
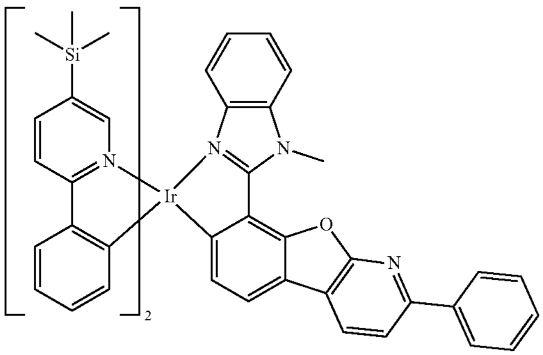
202
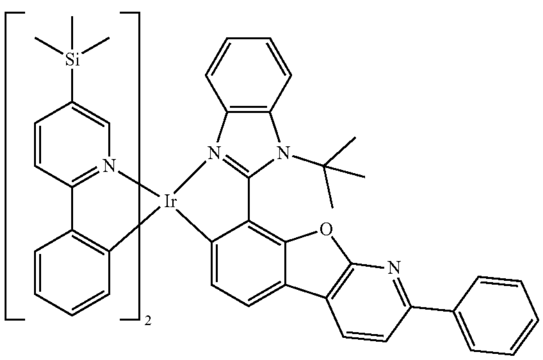
203
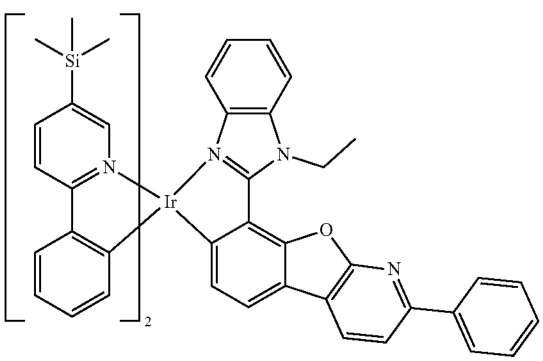
204
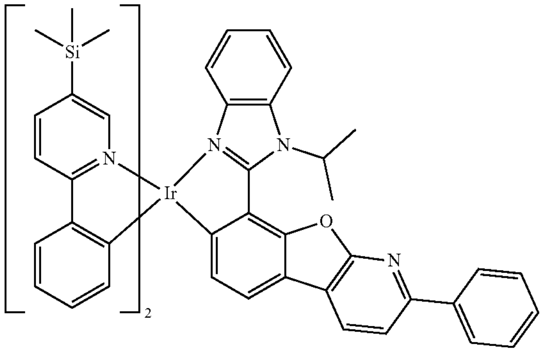
-continued
205
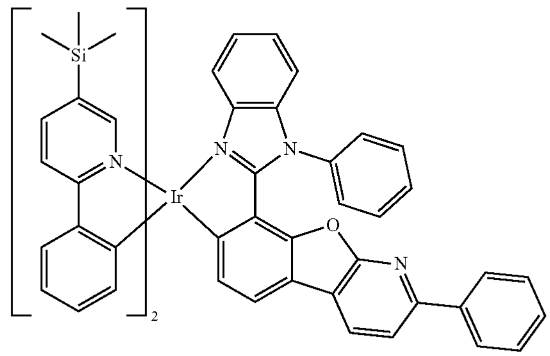
206
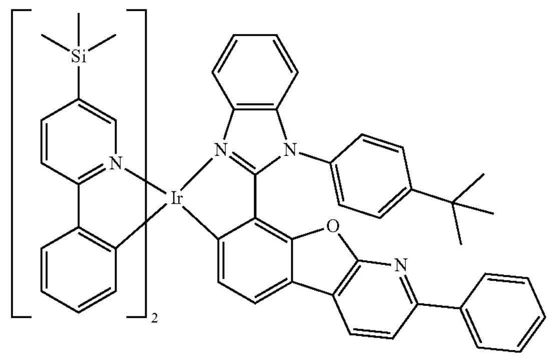
207
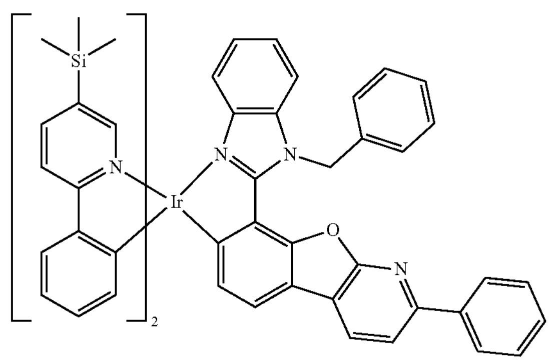
208
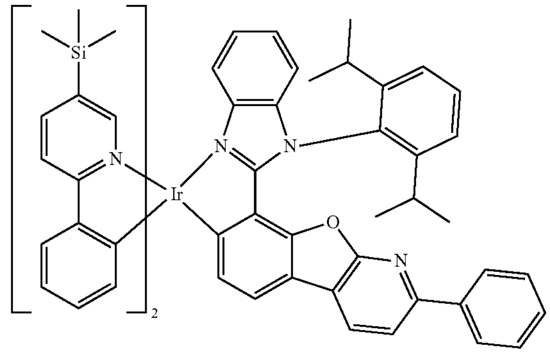

-continued
209
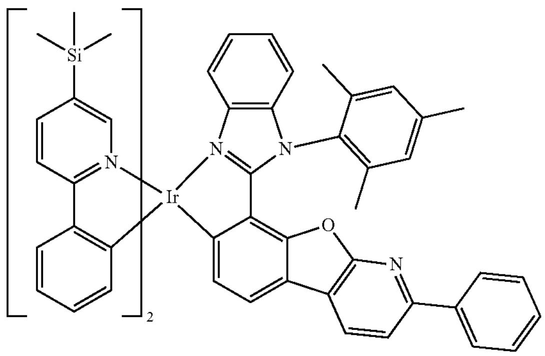
210
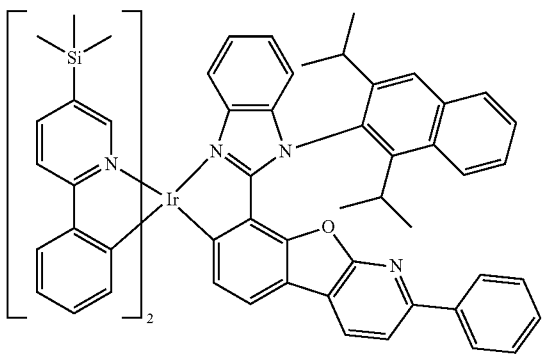
211
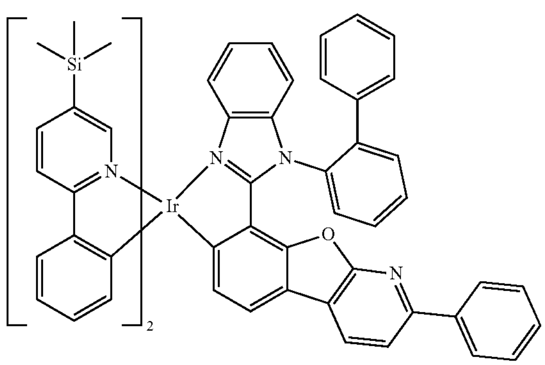
212
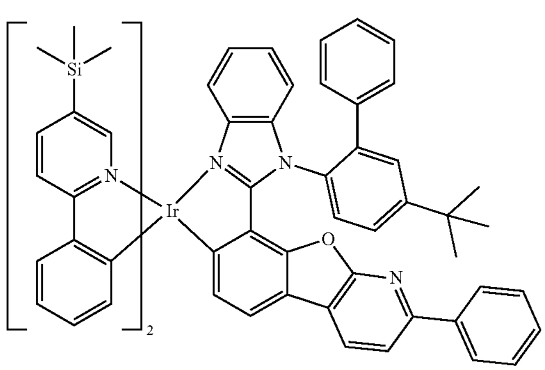
-continued
213
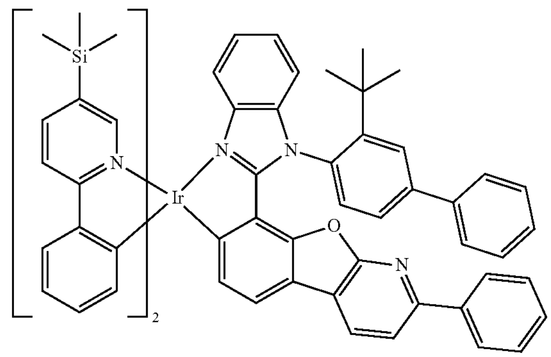
214
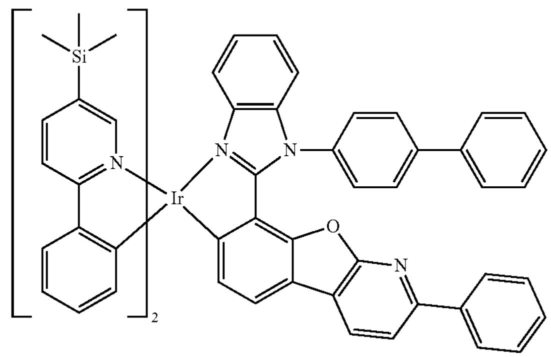
215
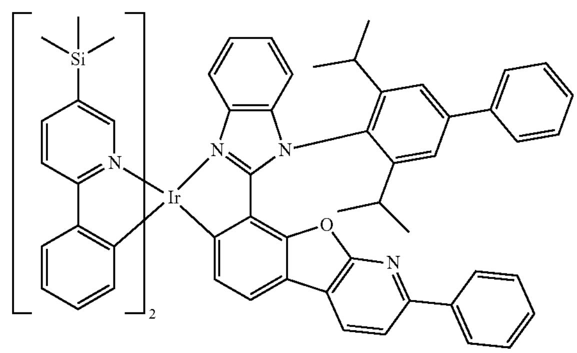
216
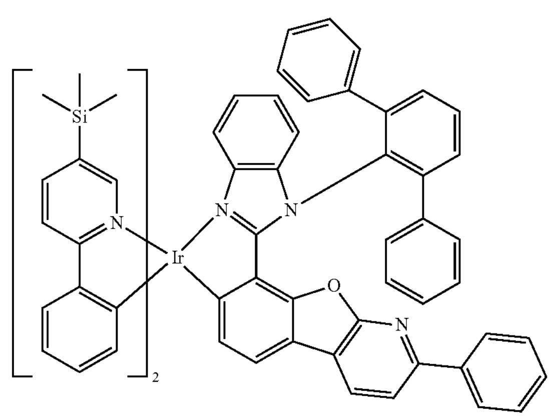

-continued
217
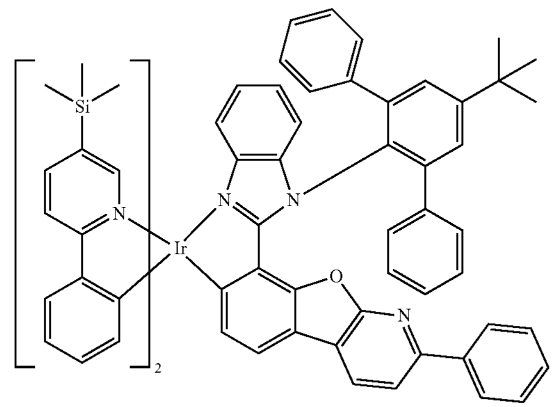
218
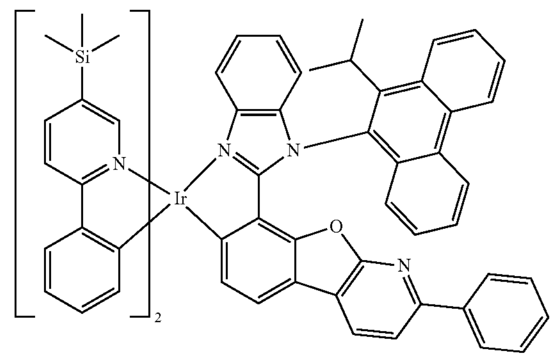
219
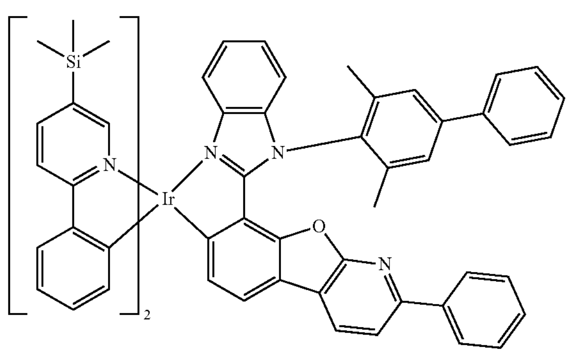
220
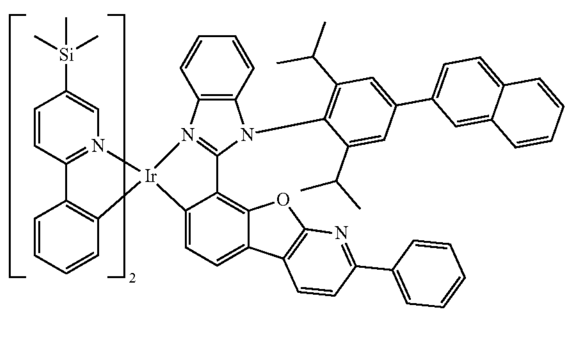
-continued
221
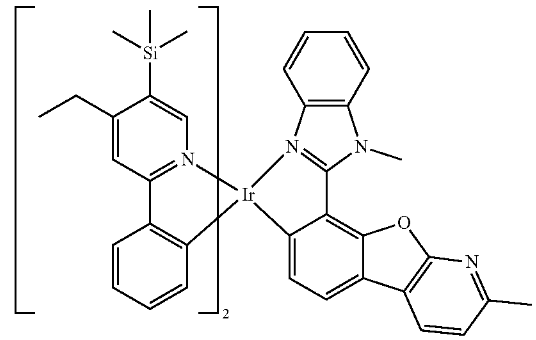
222
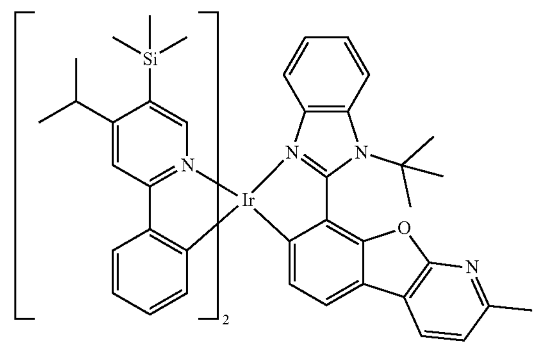
223
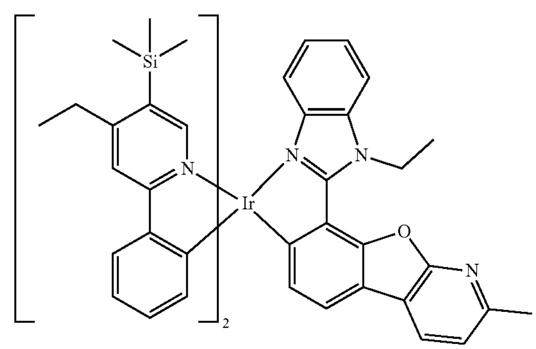
224
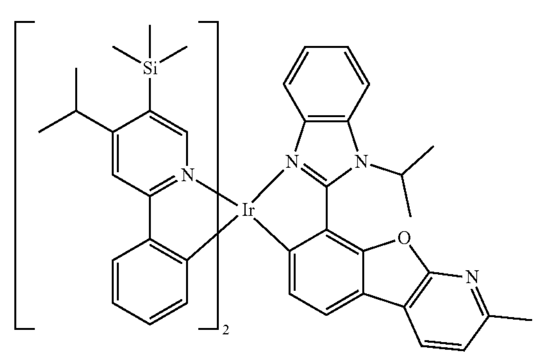

-continued
225
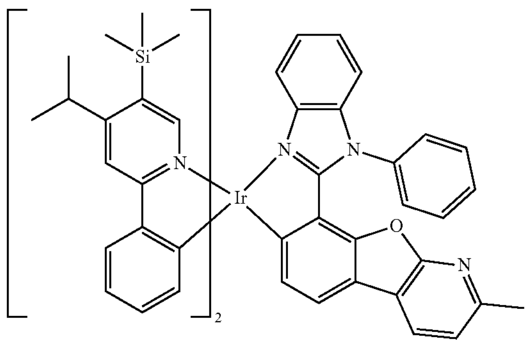
226
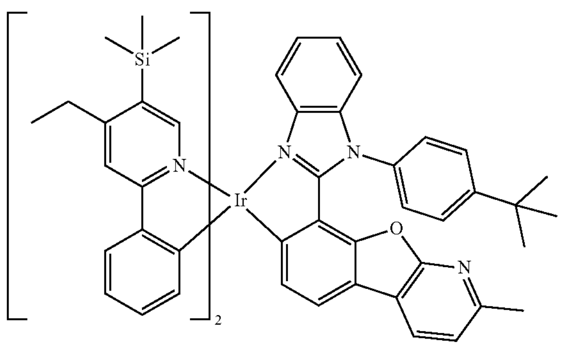
227
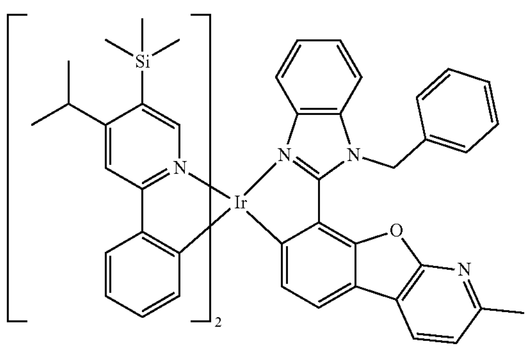
228
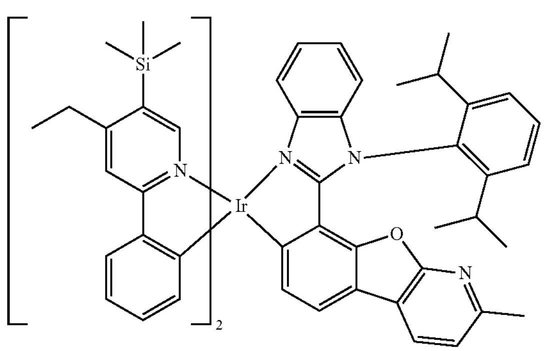
-continued
229
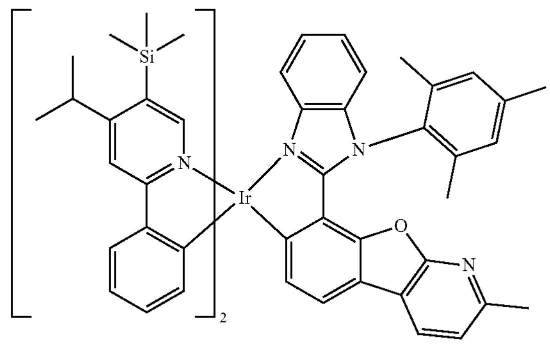
230
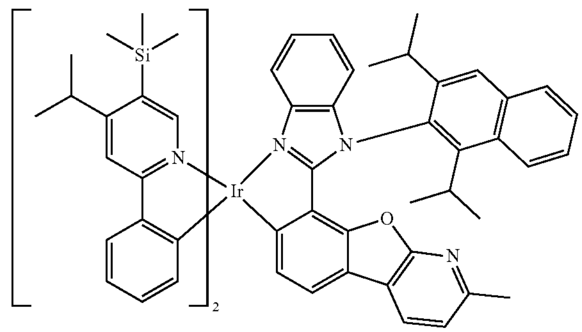
231
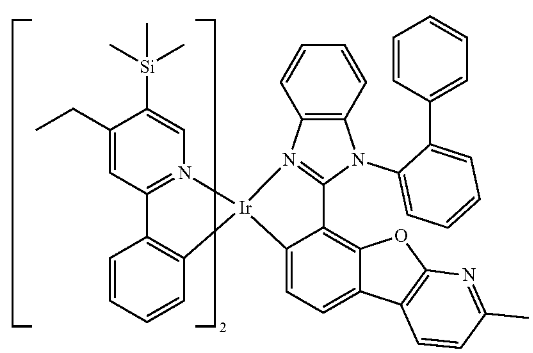
232
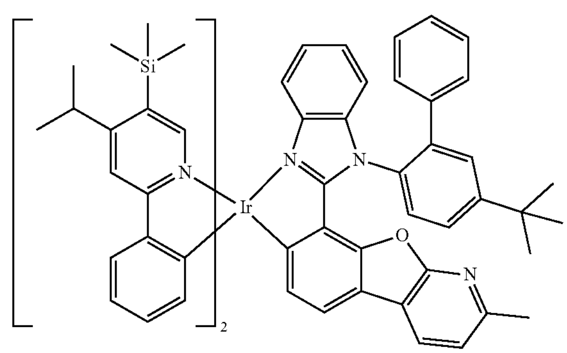

-continued
233
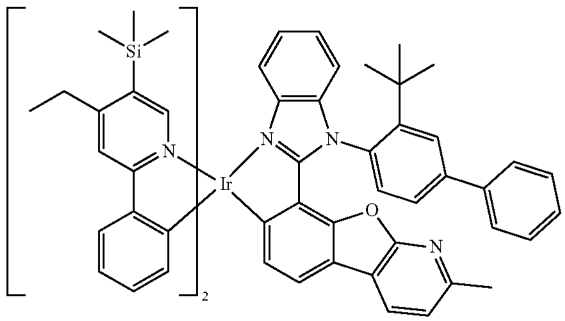
234
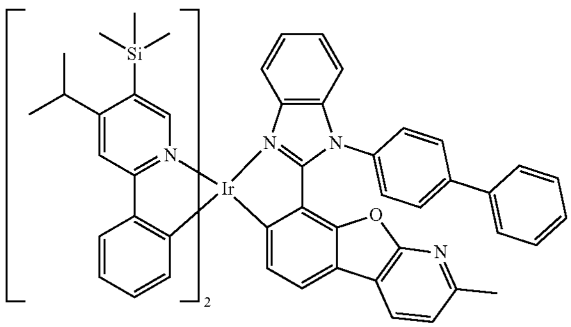
235
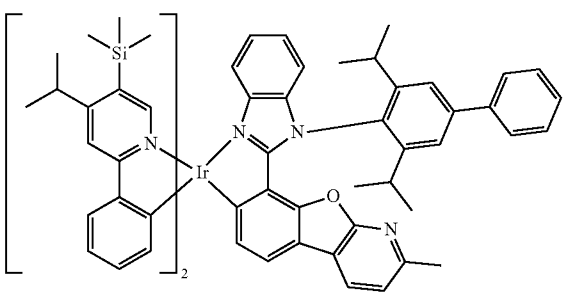
236
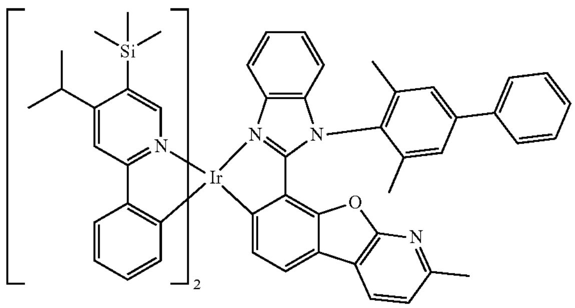
-continued
237
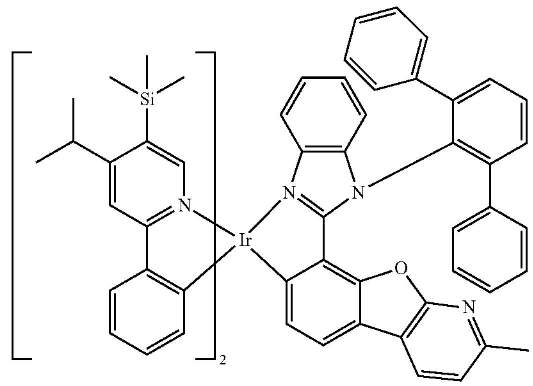
238
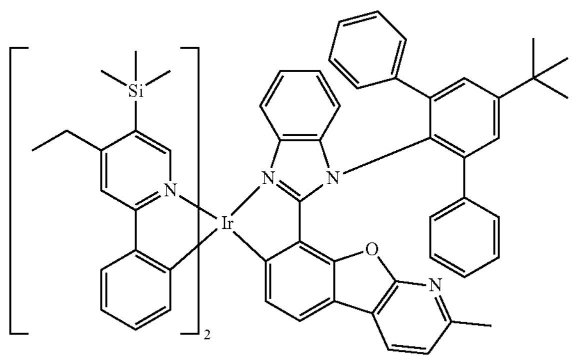
239
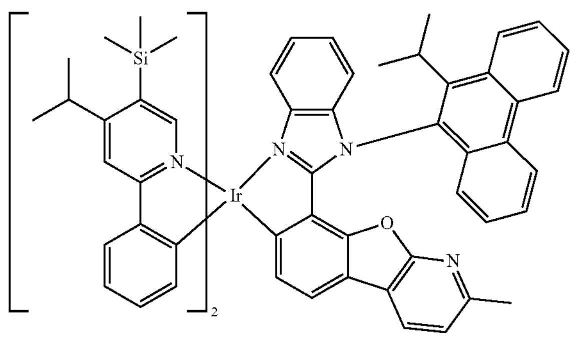
240
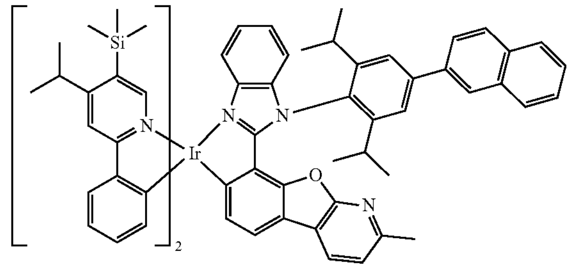

241
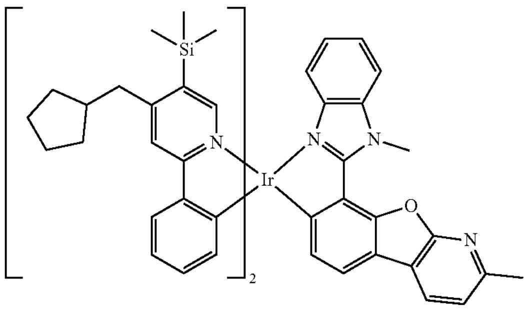
242
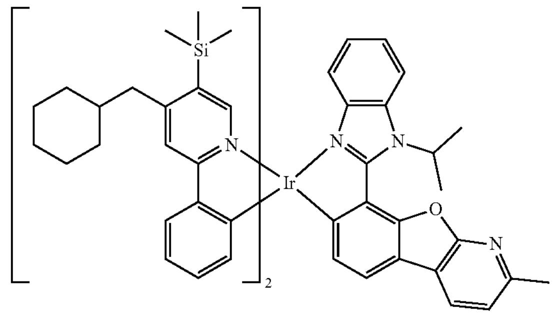
243
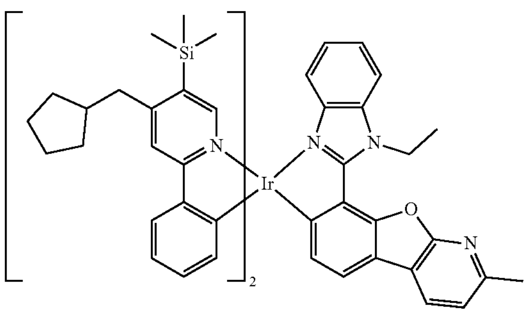
244
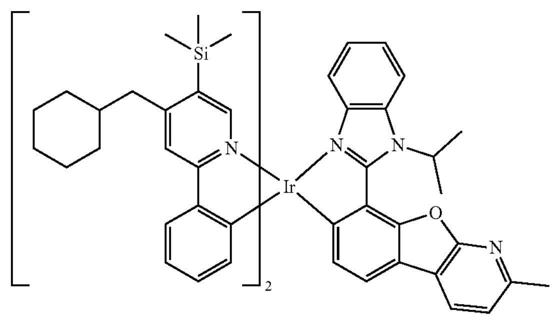
245
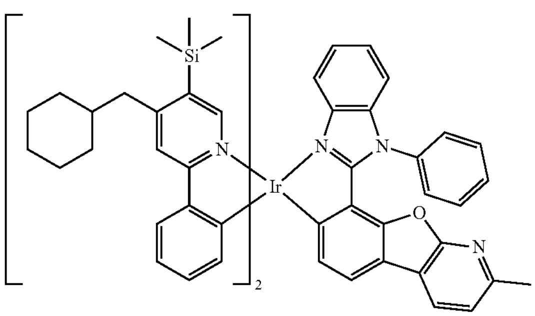
246
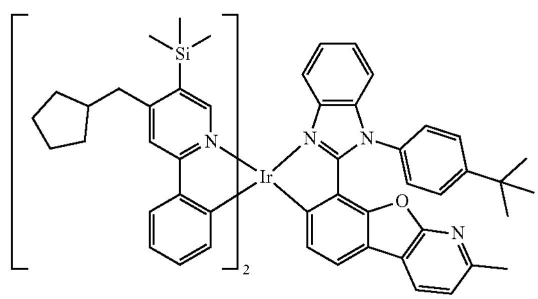
247
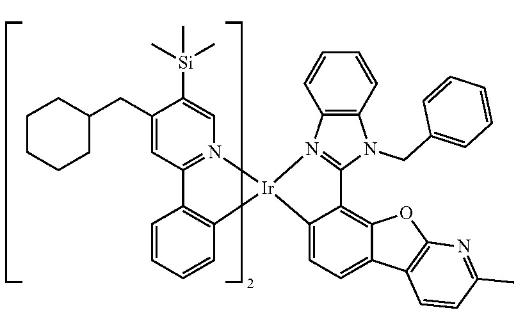
248
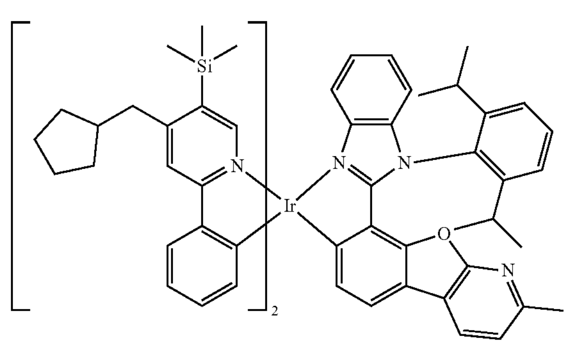

-continued
249
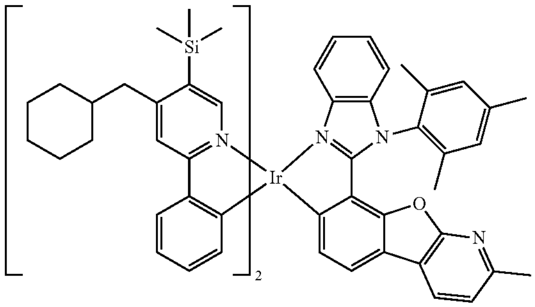
250
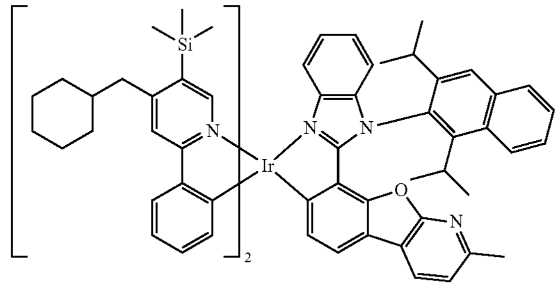
251
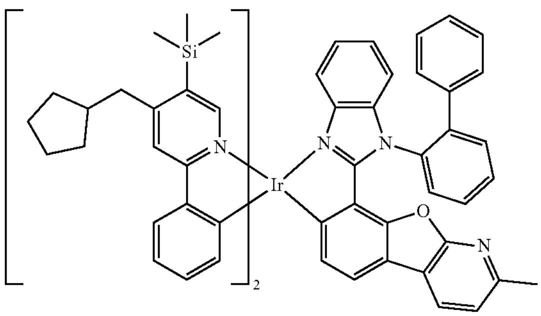
252
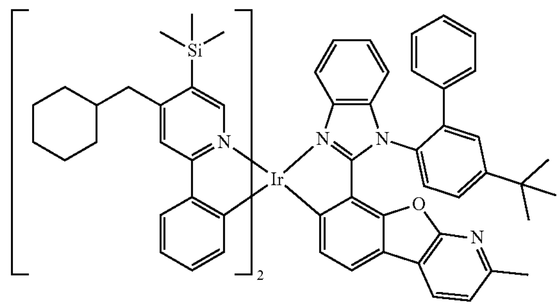
253
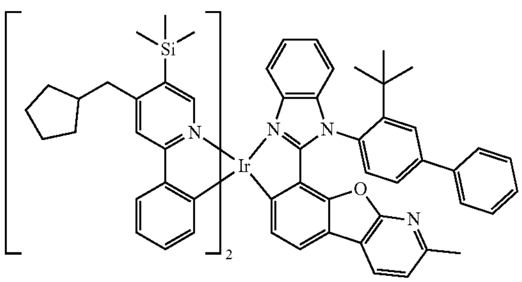
254
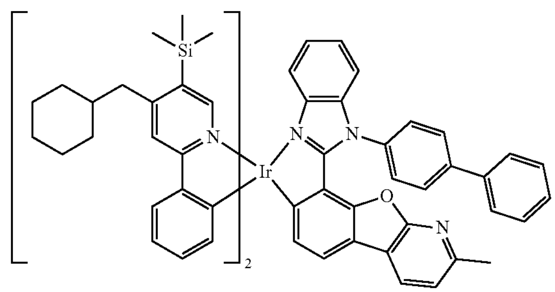
255
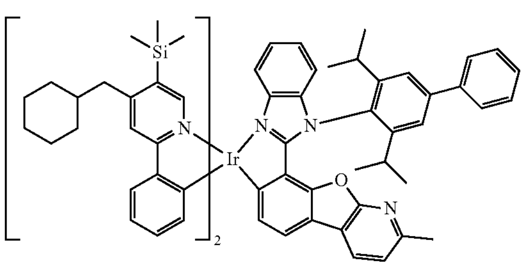
256
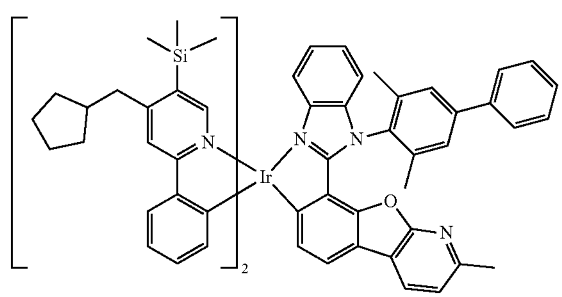

-continued
257
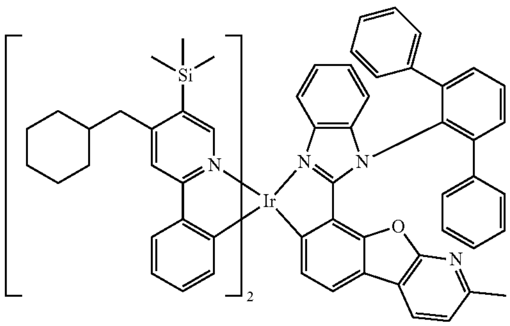
258
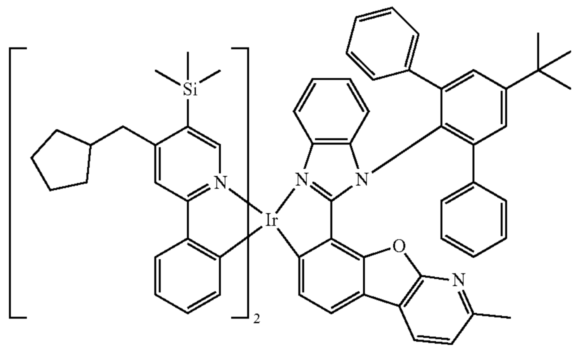
259
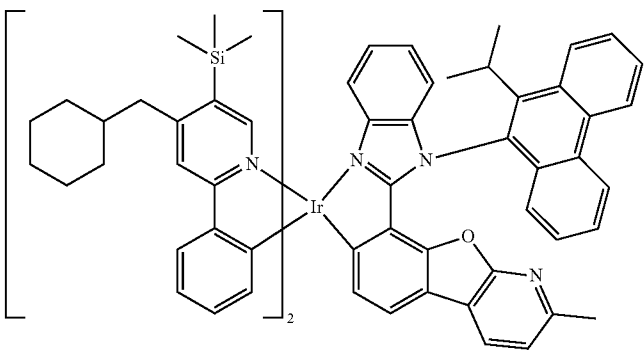
260
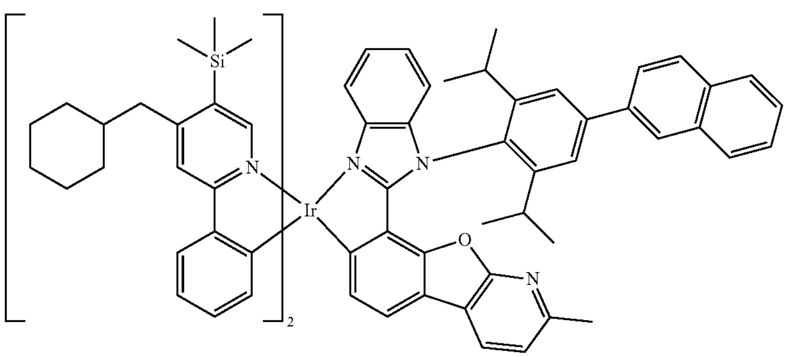
261
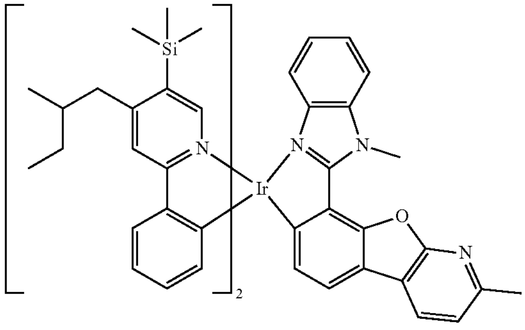
262
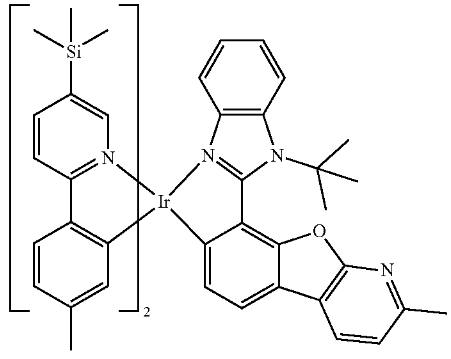

-continued
263
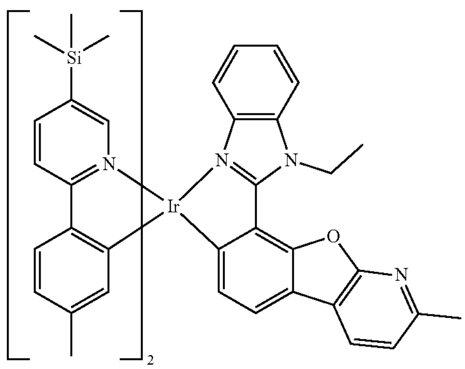
264
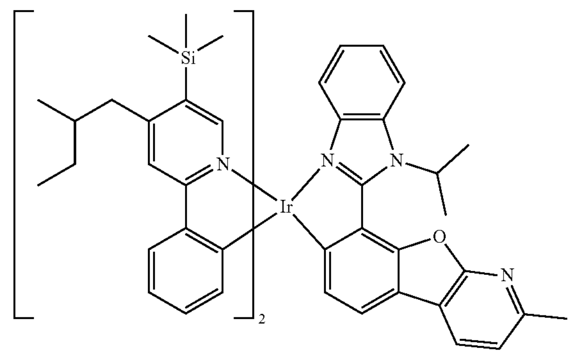
265
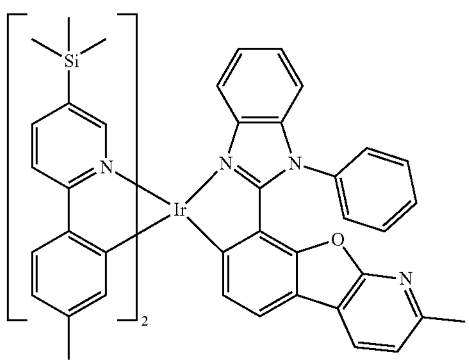
266
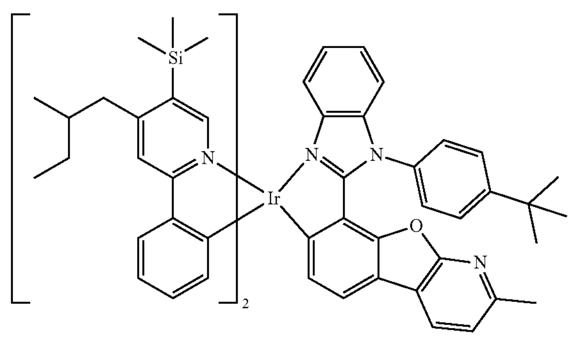
267
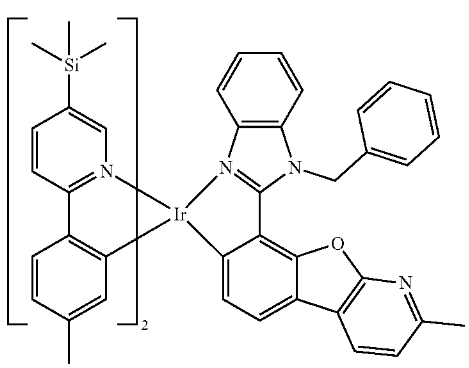
268
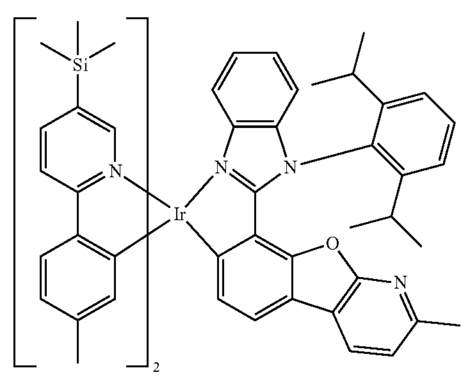
269
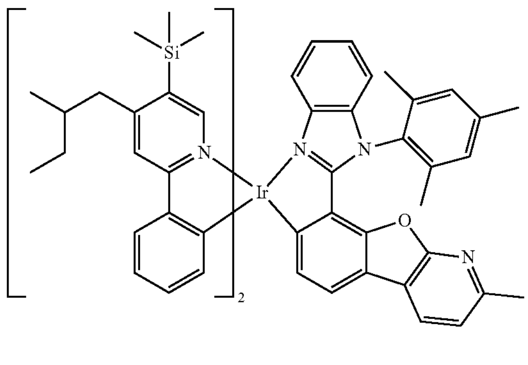
270
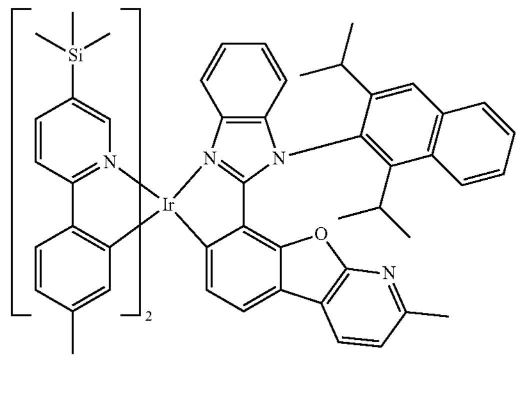

-continued
271
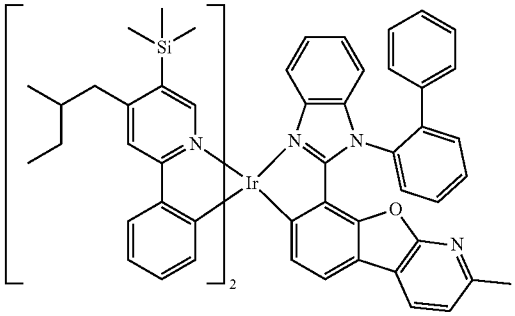
272
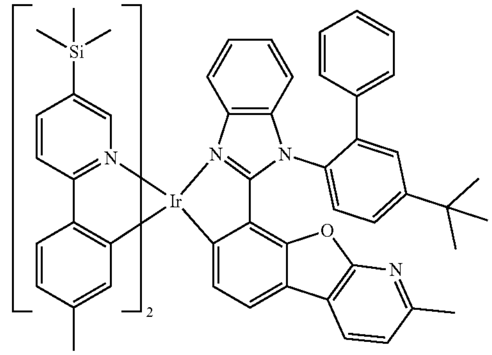
273
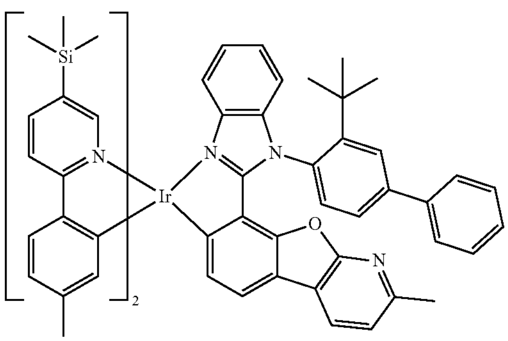
274
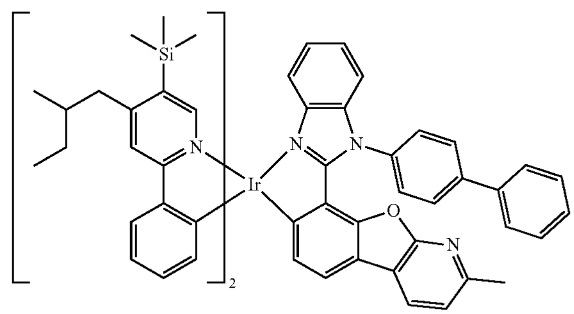
275
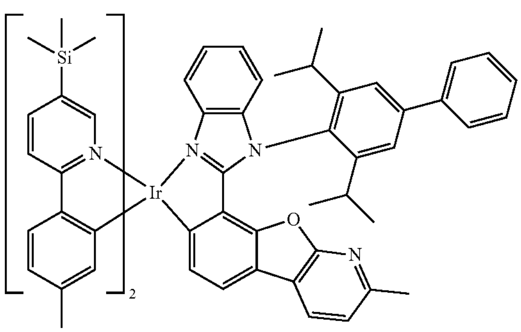
276
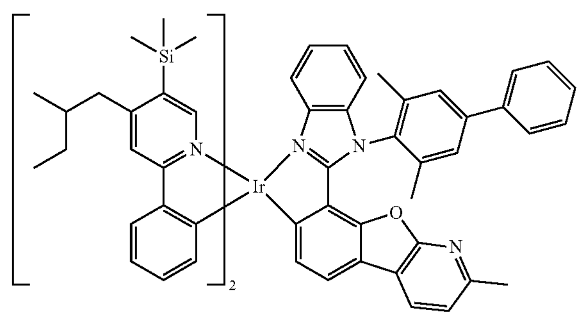
277
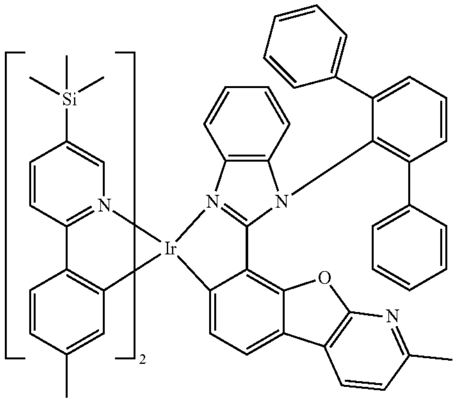
278
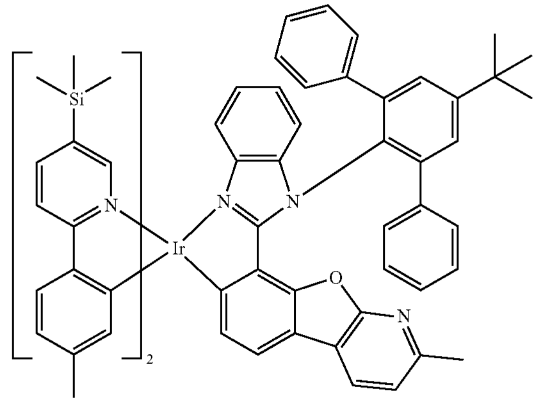

-continued
279
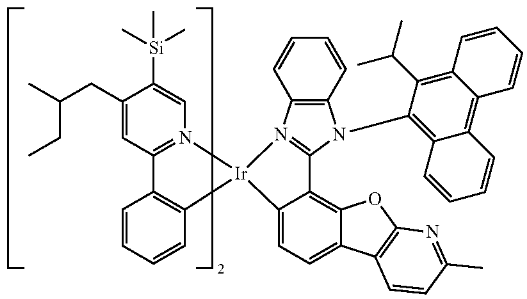
280
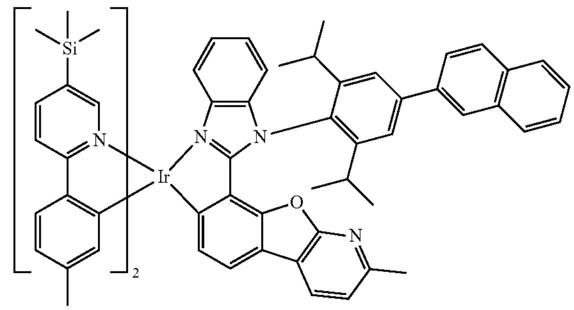
281
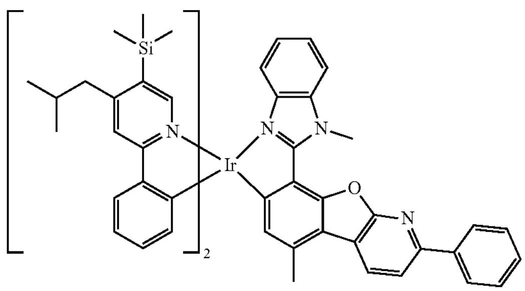
282
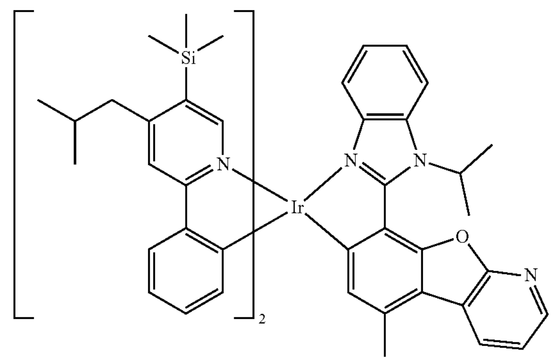
283
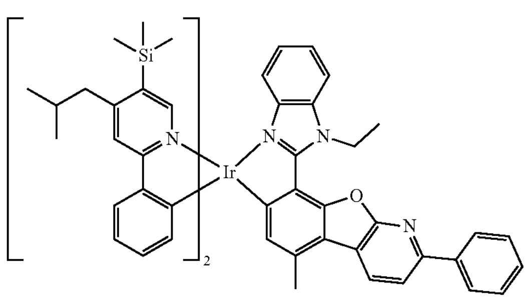
284
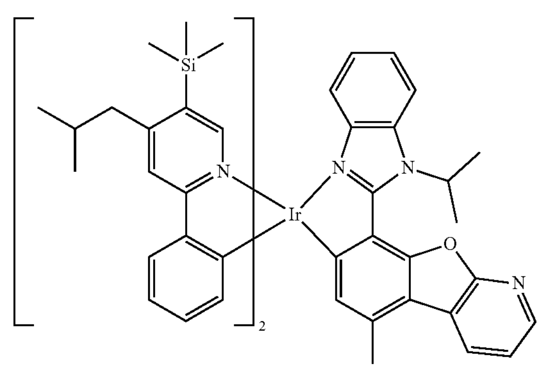
285
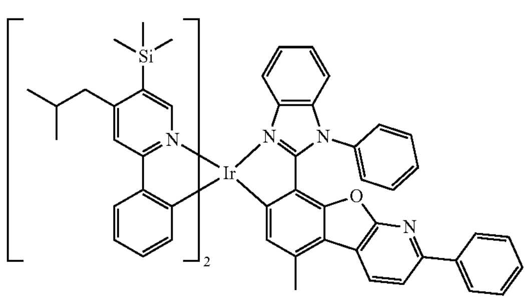
286
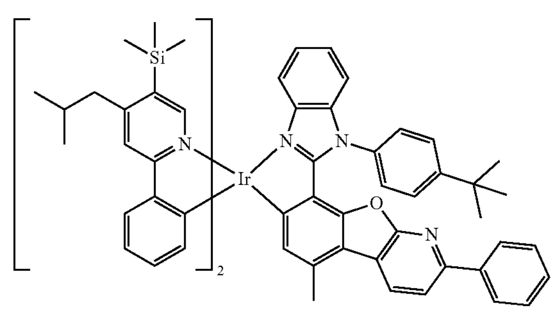

-continued
287
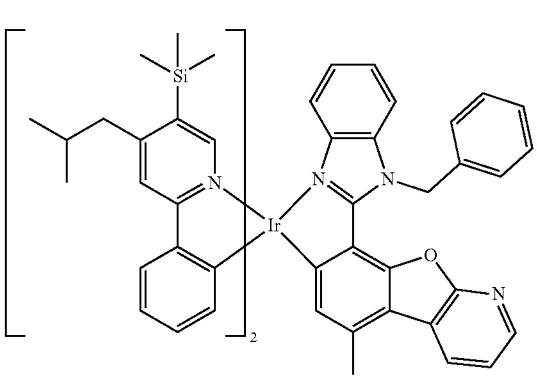
288
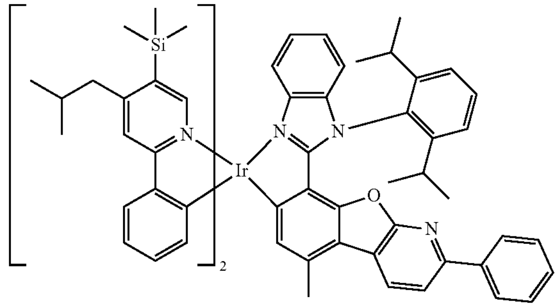
289
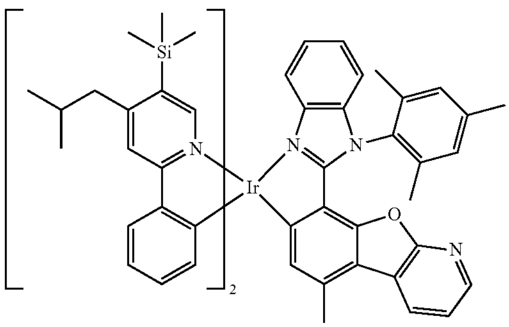
290
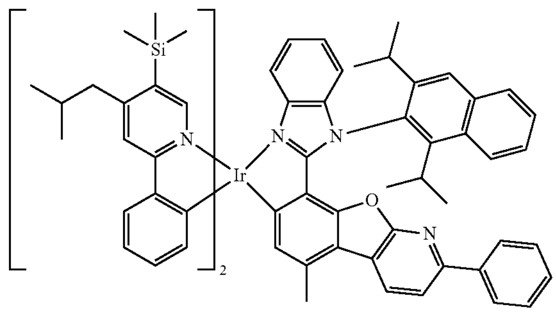
291
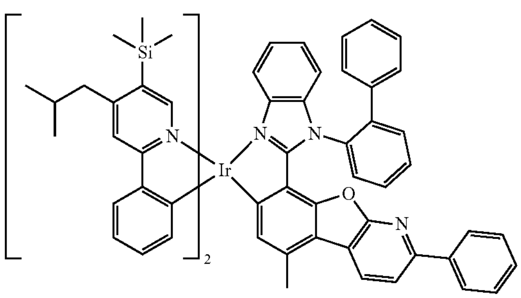
292
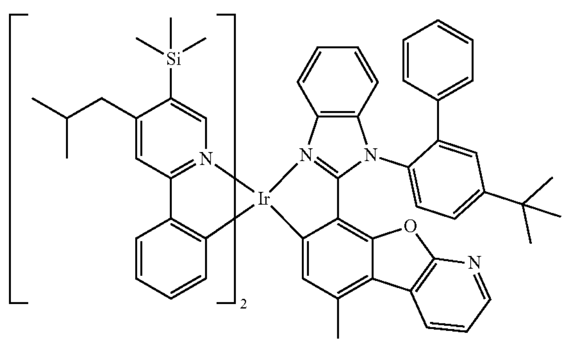
293
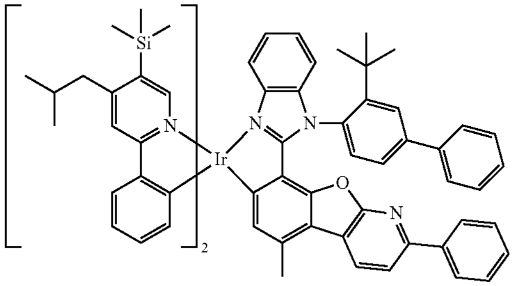
294
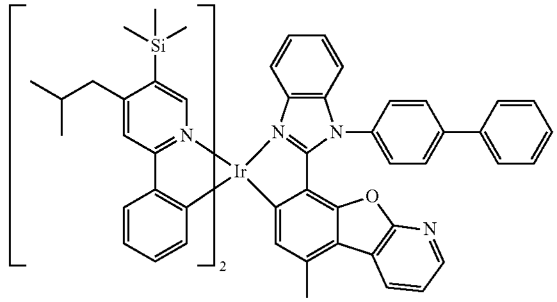

-continued
295
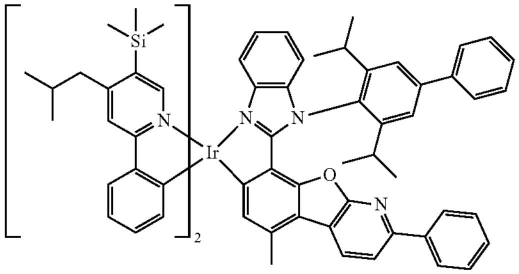
296
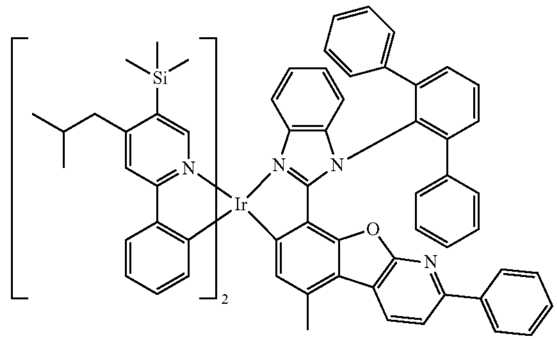
297
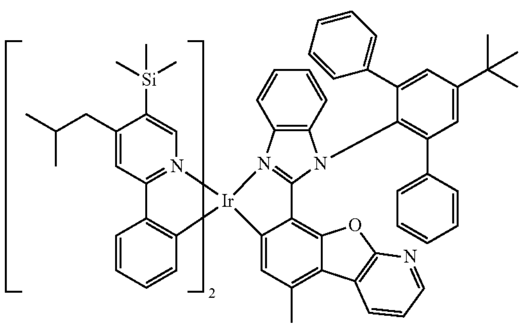
298
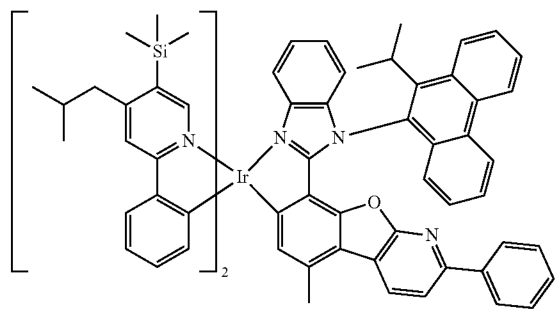
299
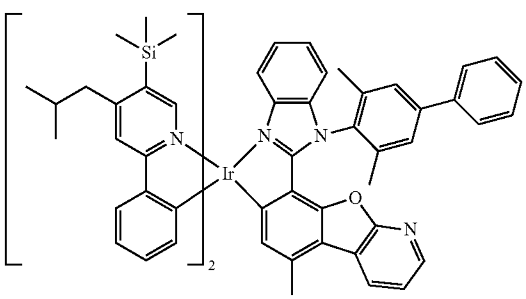
300
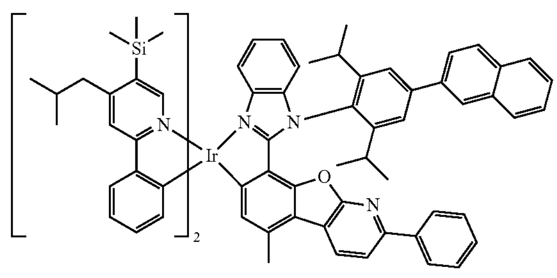
301
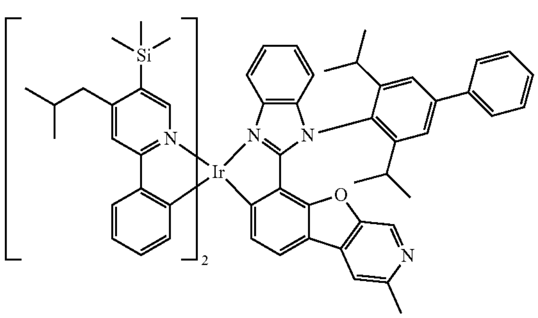
302
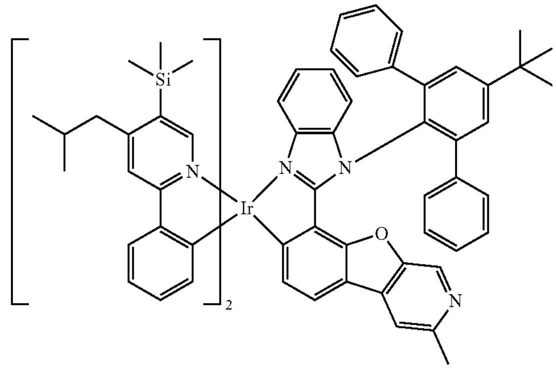

-continued
303
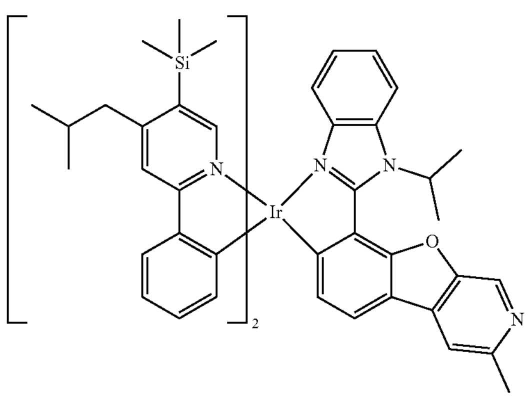
304
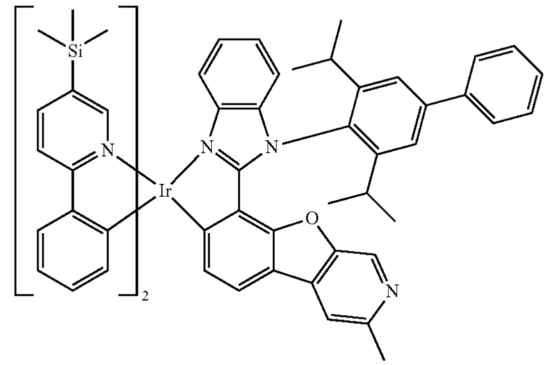
305
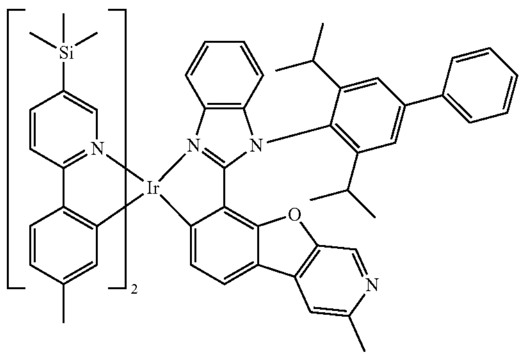
306
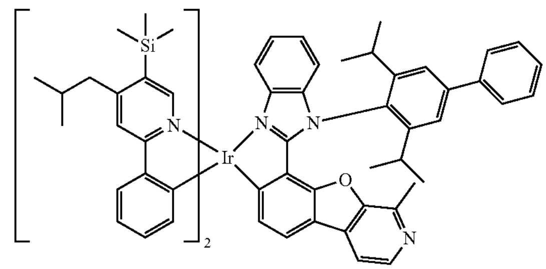
307
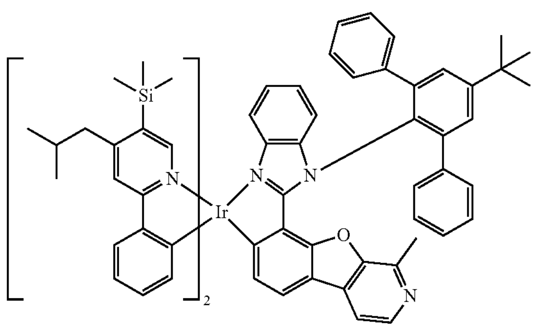
308
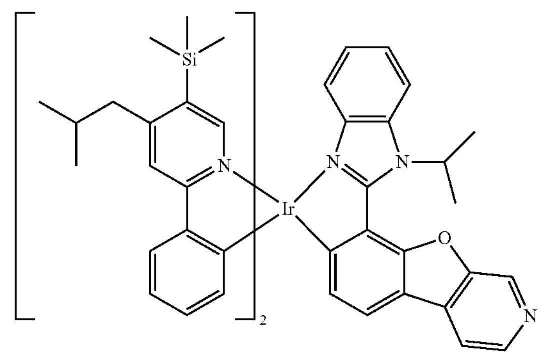
309
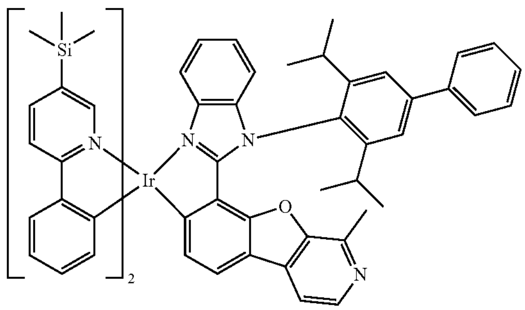
310
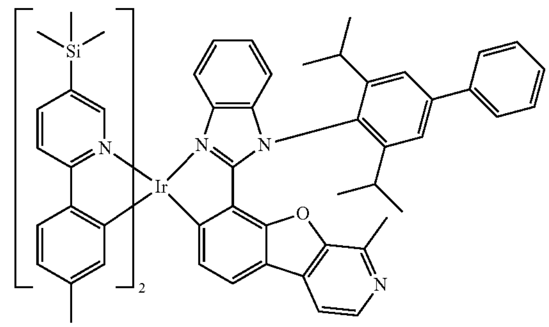

-continued
311
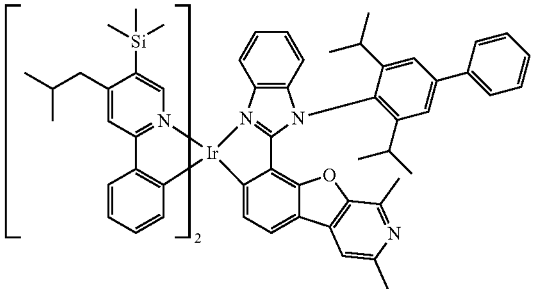
312
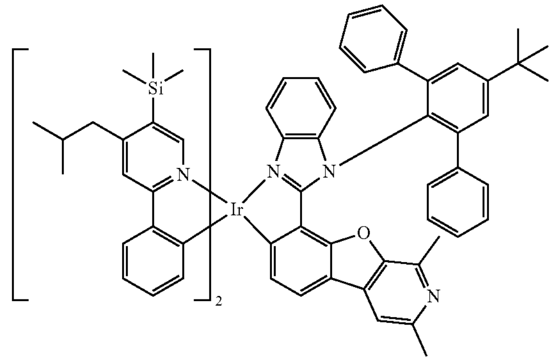
313
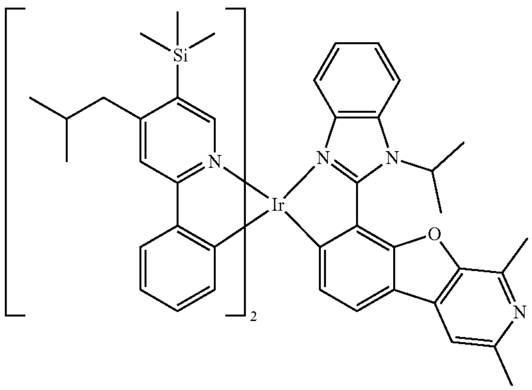
314
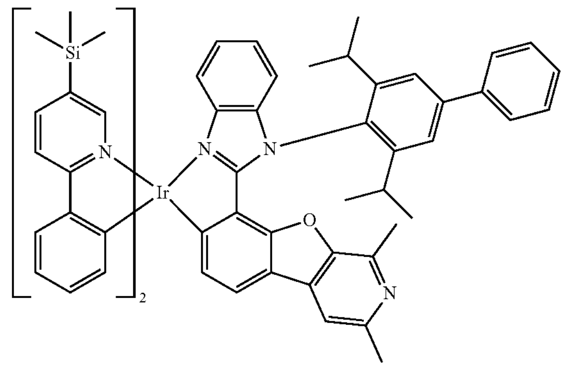
315
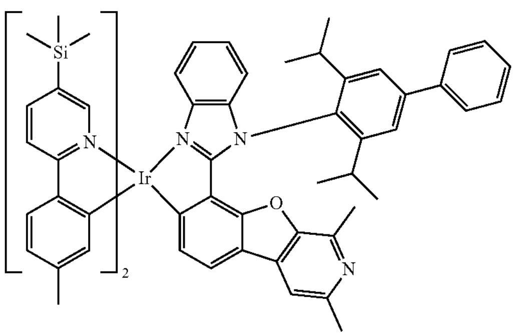
316
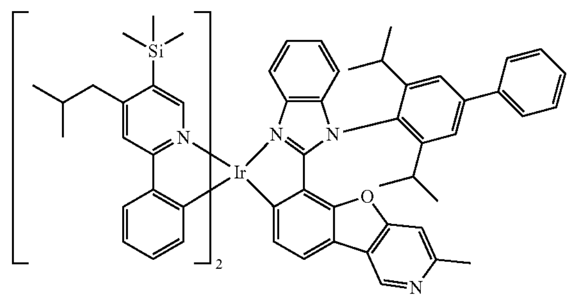
317
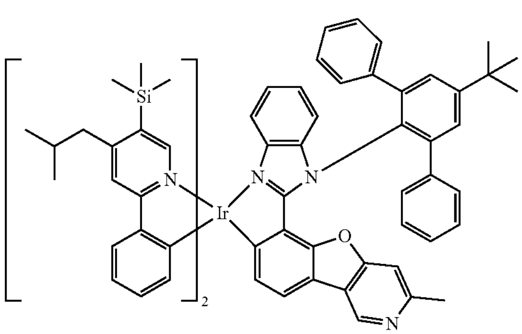
318
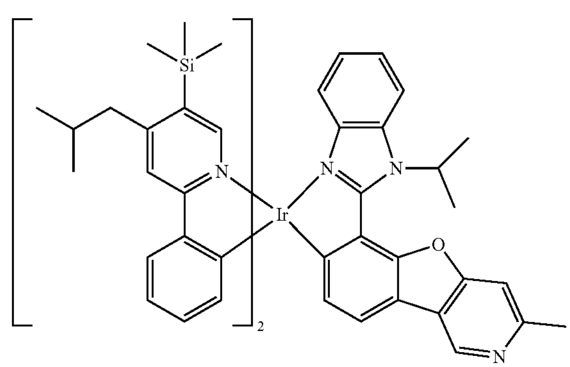

-continued
319
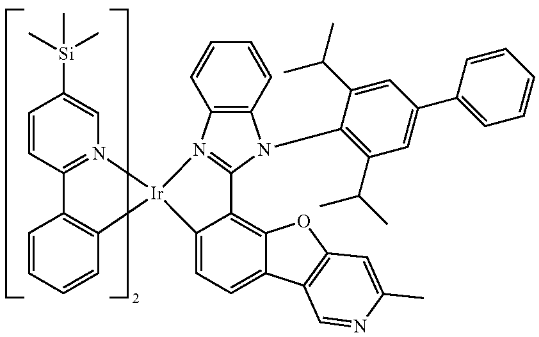
320
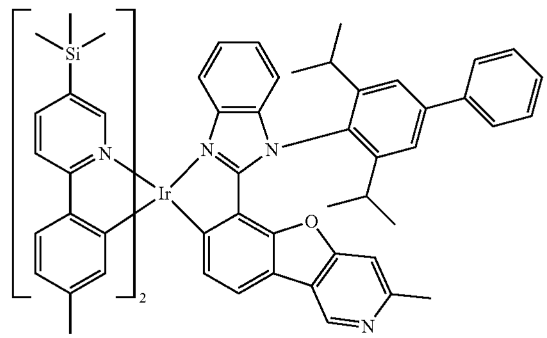
321
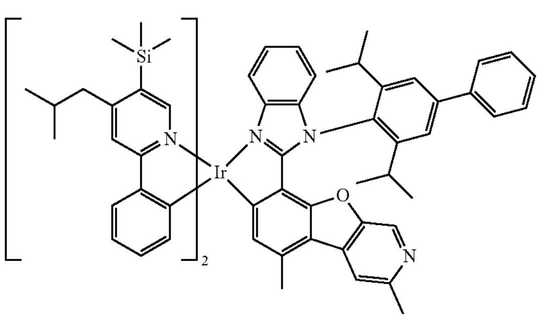
322
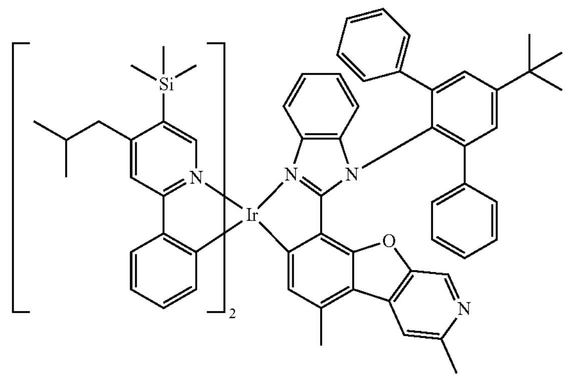
323
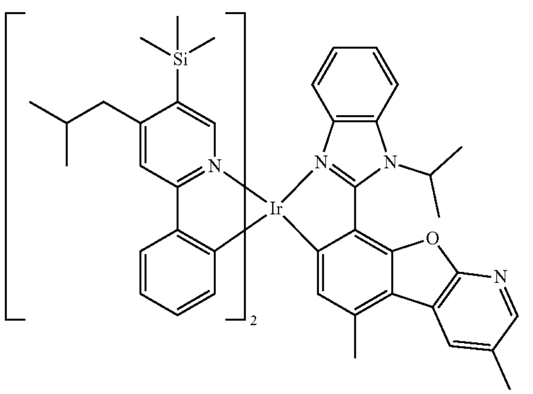
324
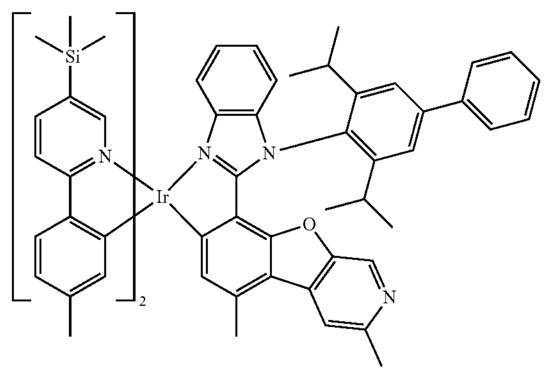
325
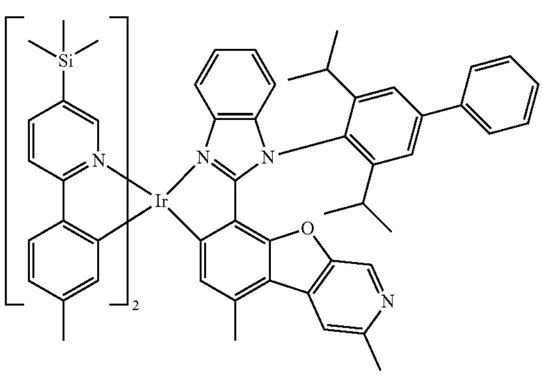
326
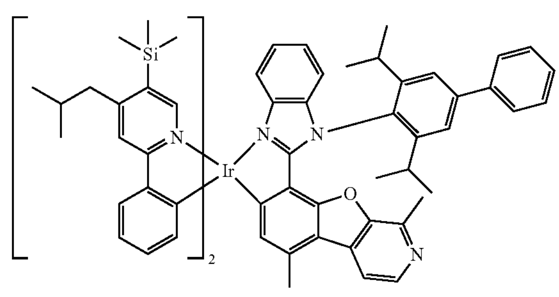

-continued
327
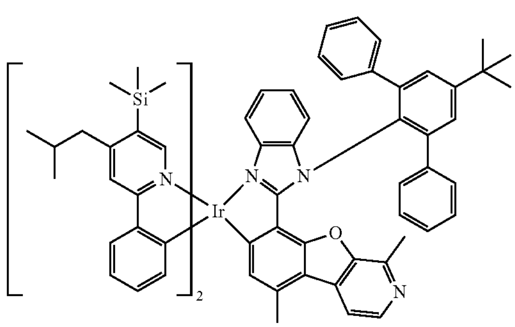
328
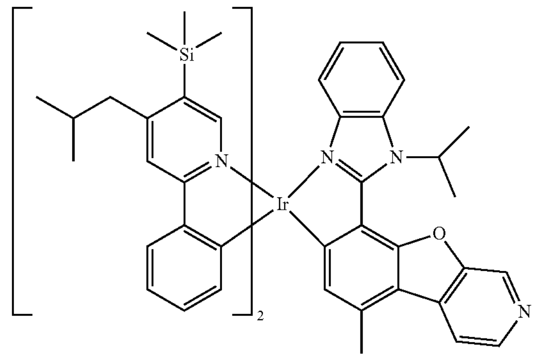
329
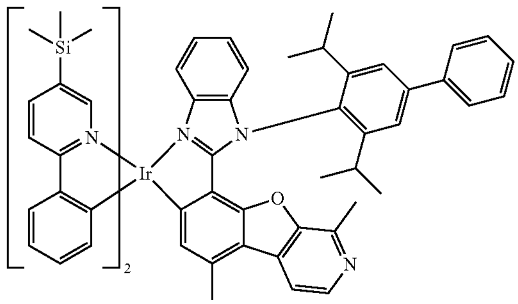
330
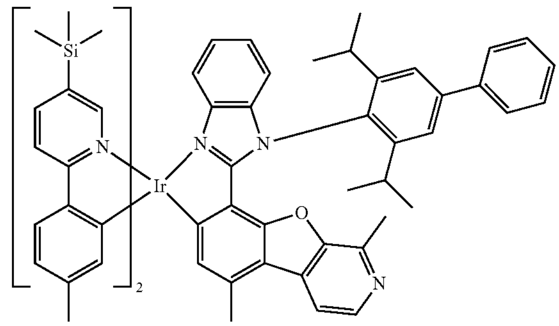
331
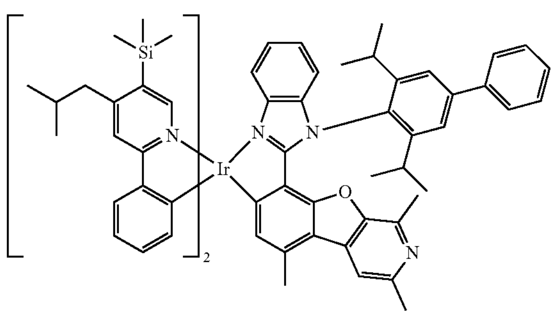
332
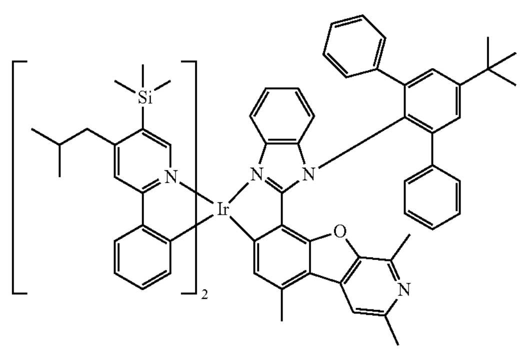
333
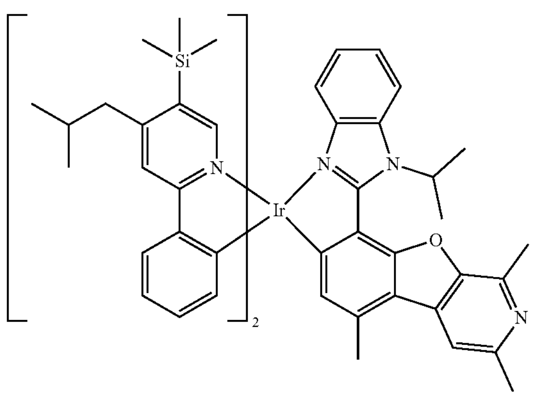
334
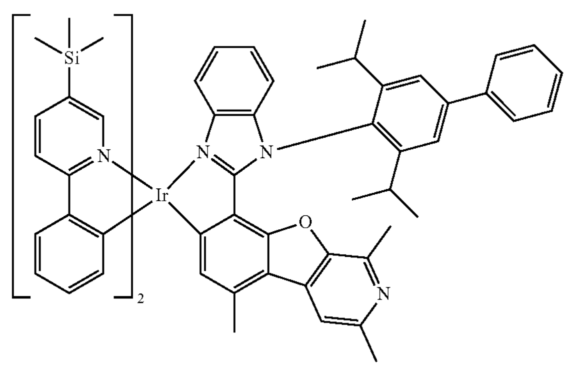

-continued
335
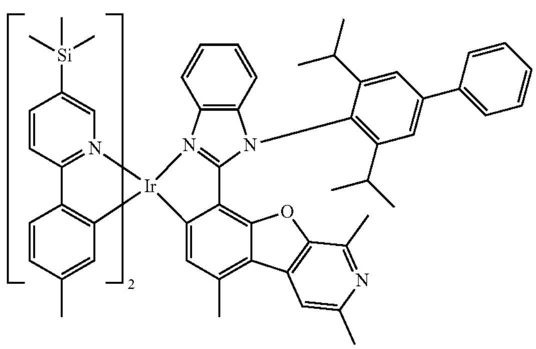
336
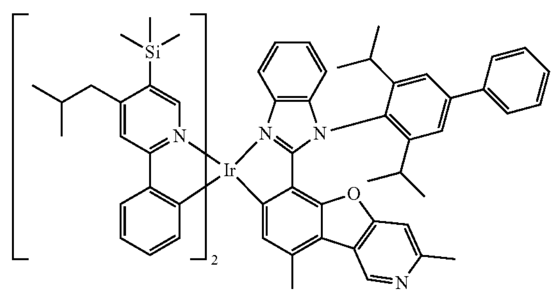
337
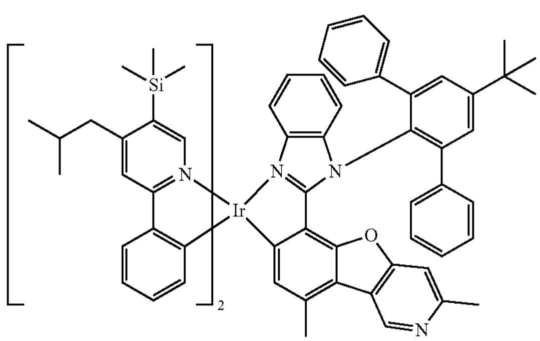
338
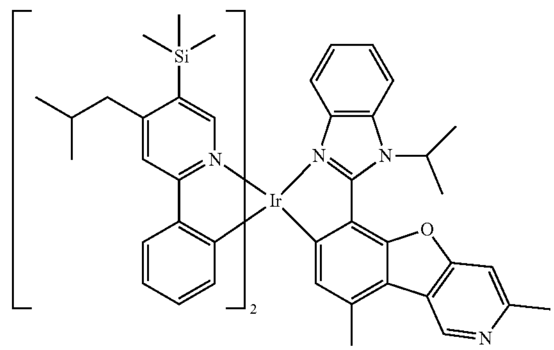
339
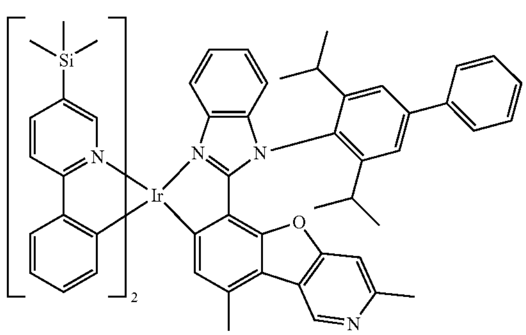
340
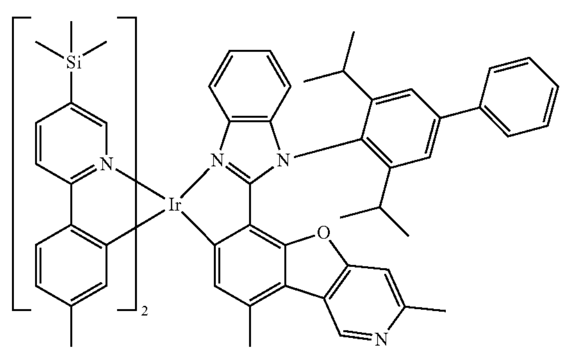
341
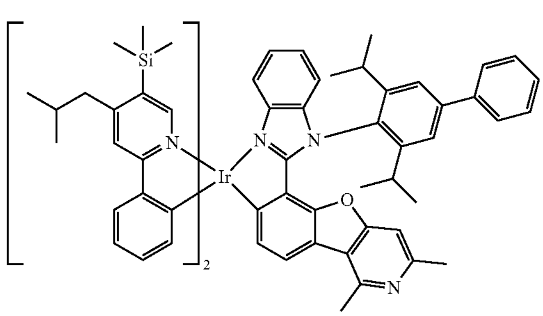
342
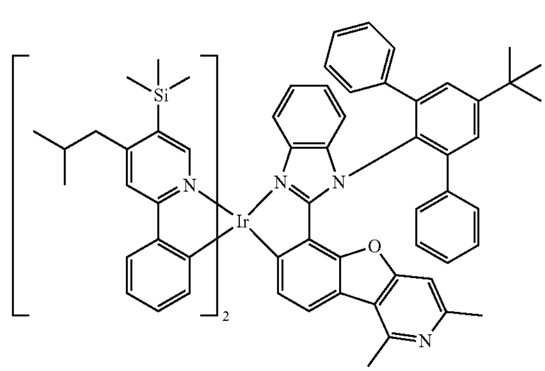

-continued
343
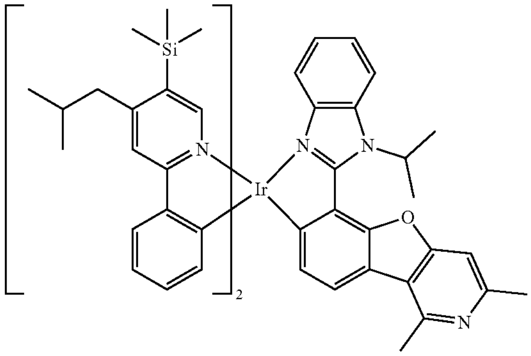
344
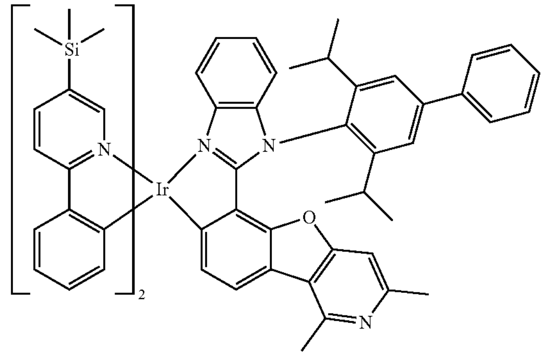
345
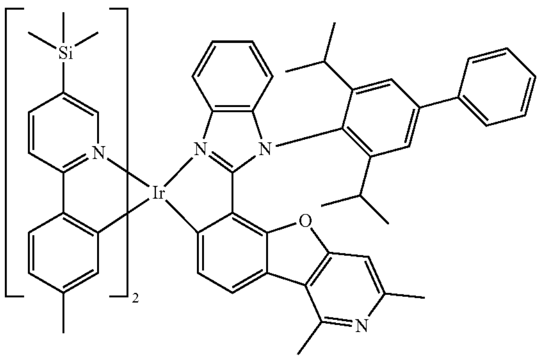
346
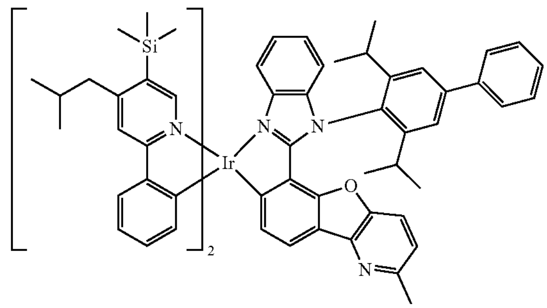
347
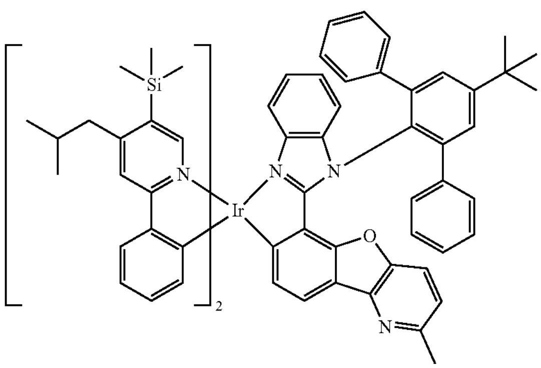
348
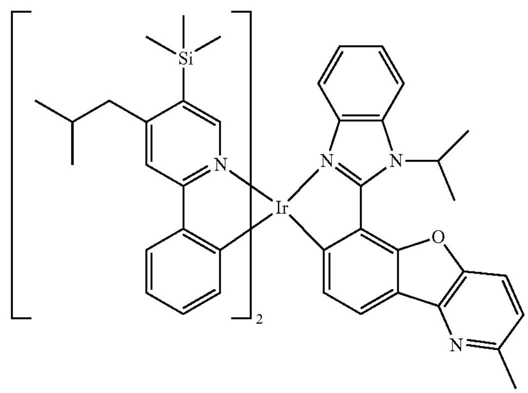
349
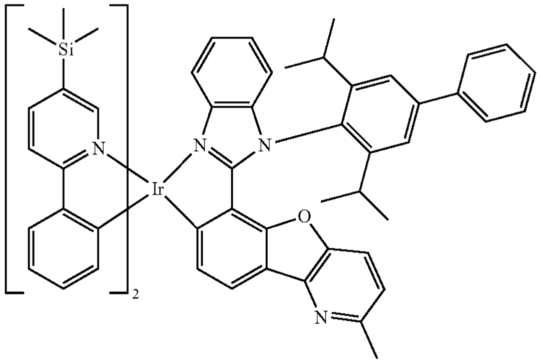
350
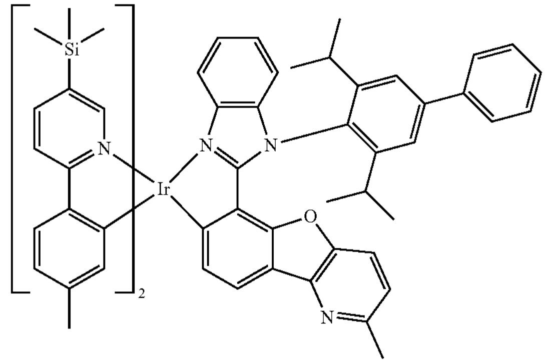

-continued
351
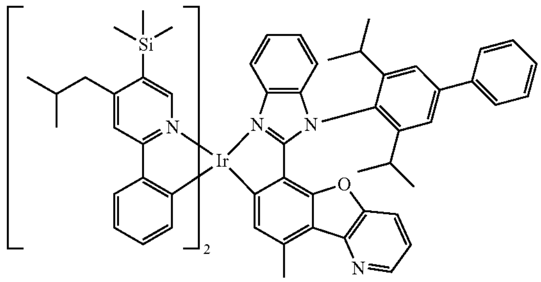
352
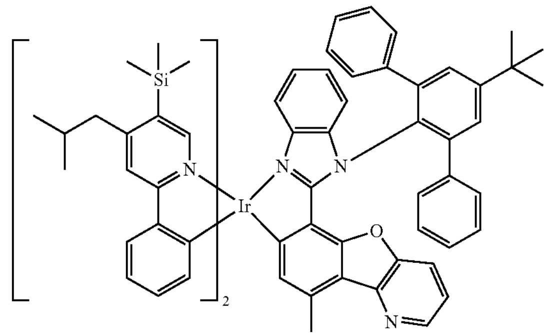
353
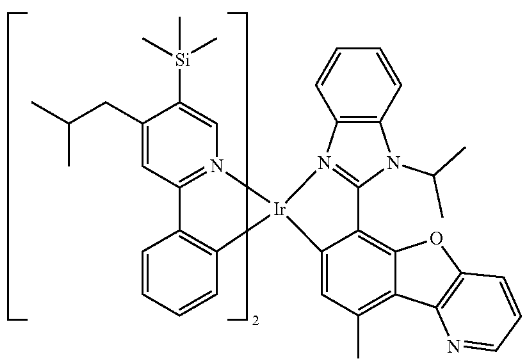
354
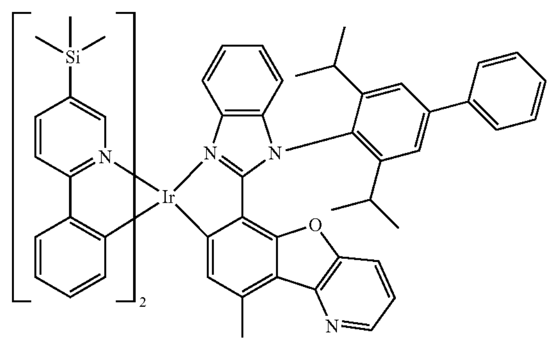
355
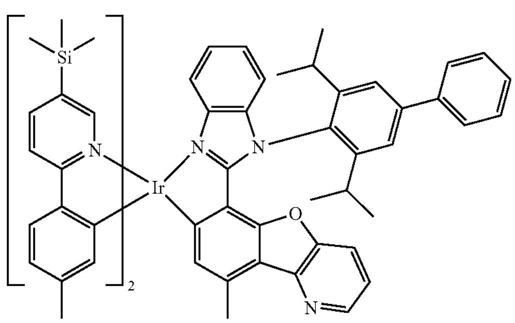
356
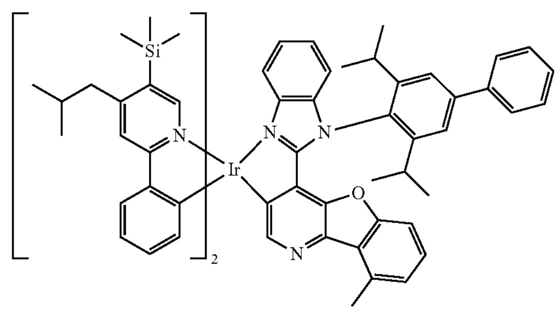
357
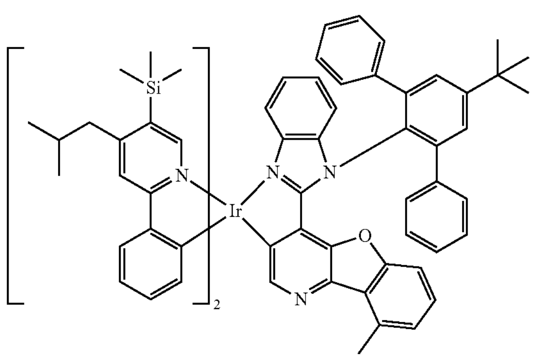
358
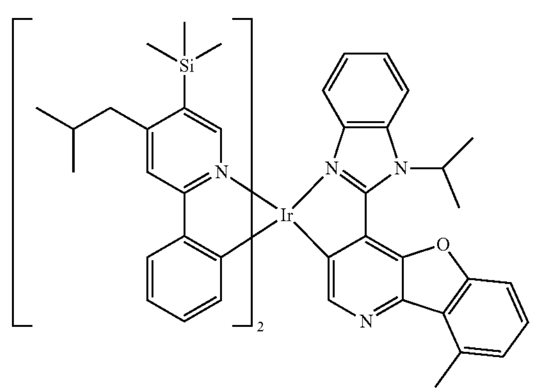

-continued
359
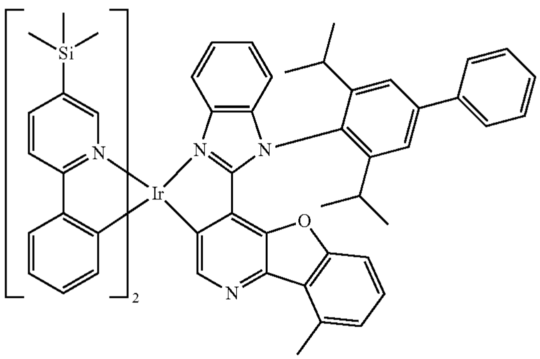
360
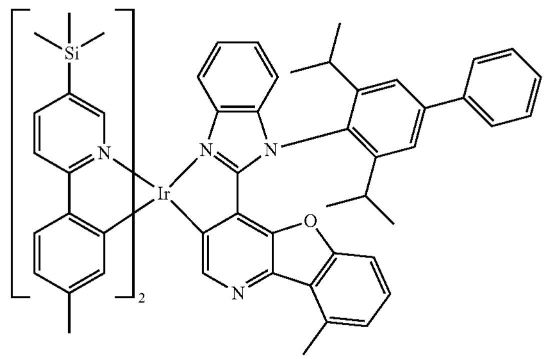
361
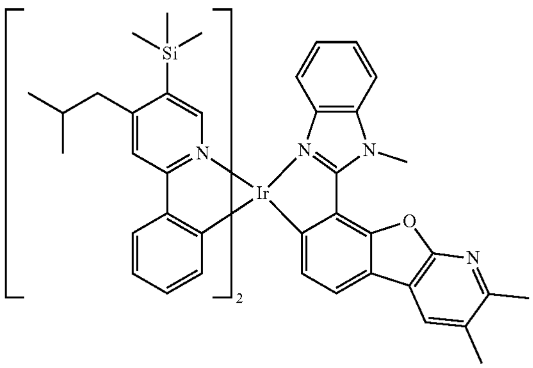
362
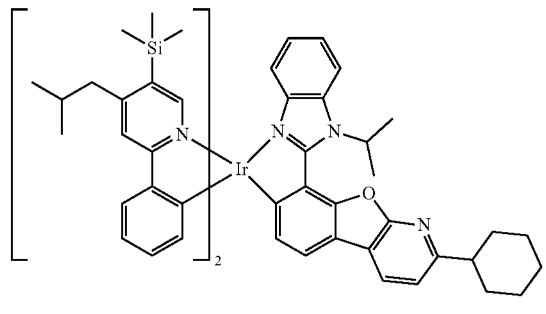
363
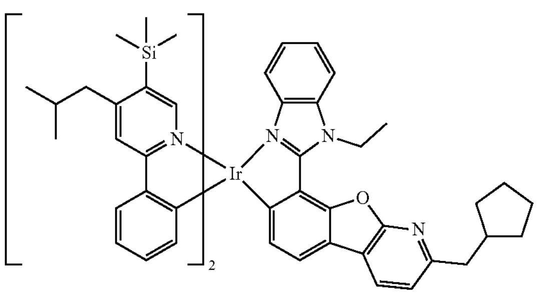
364
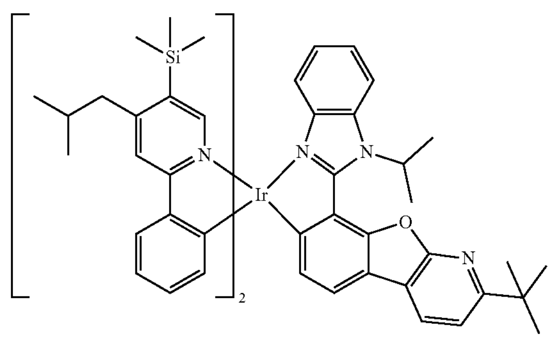
365
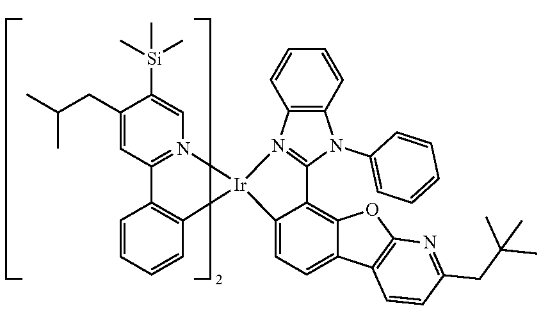
366
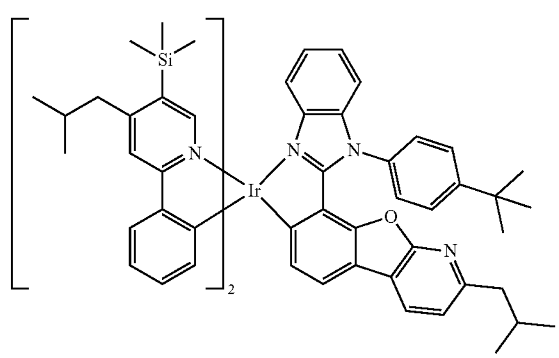

-continued
367
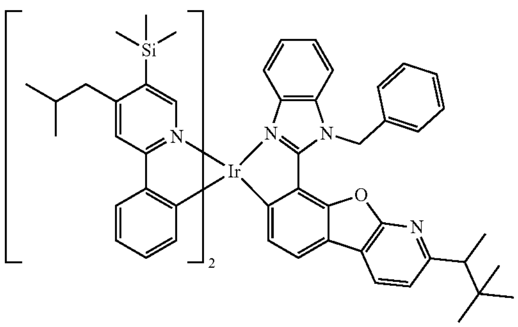
368
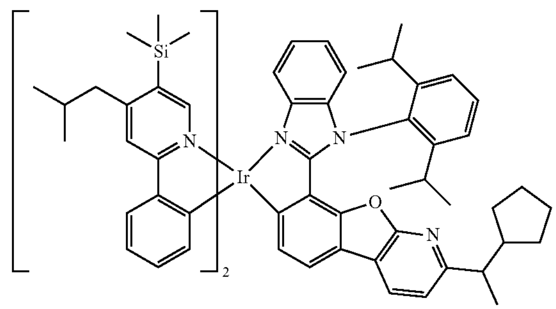
369
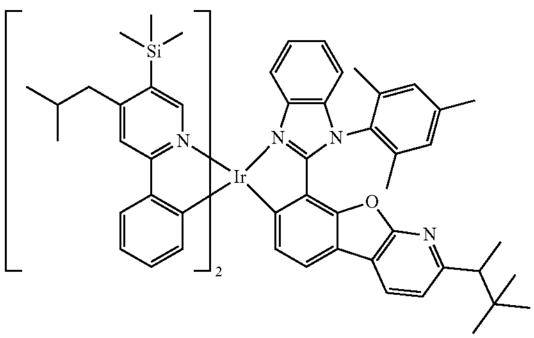
370
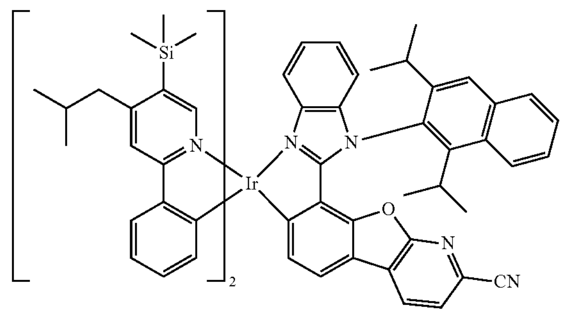
371
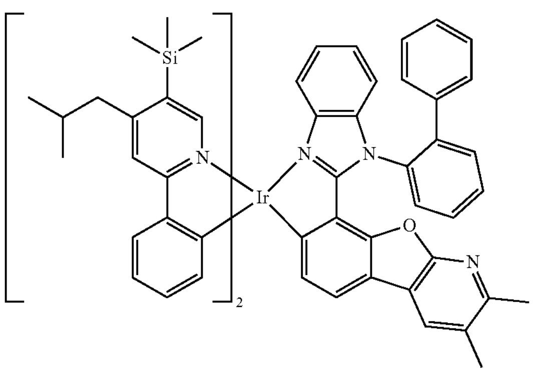
372
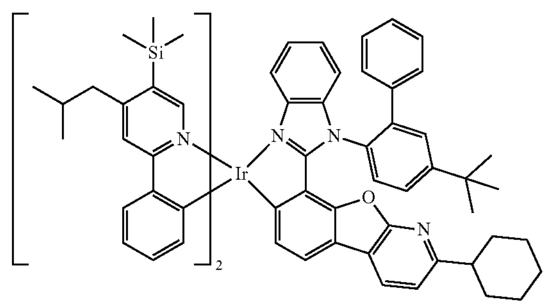
373
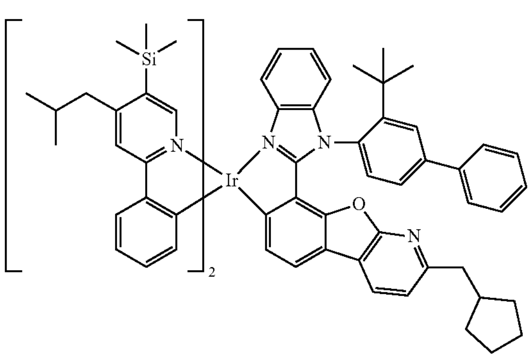
374
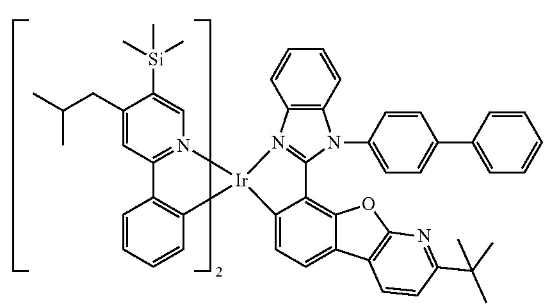

-continued
375
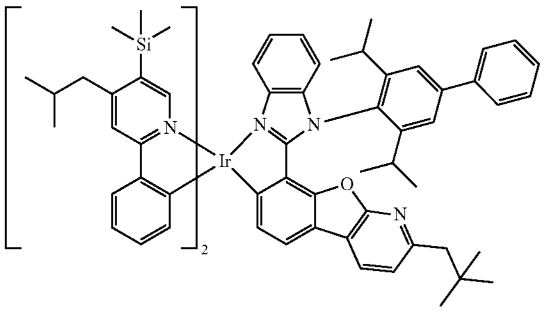
376
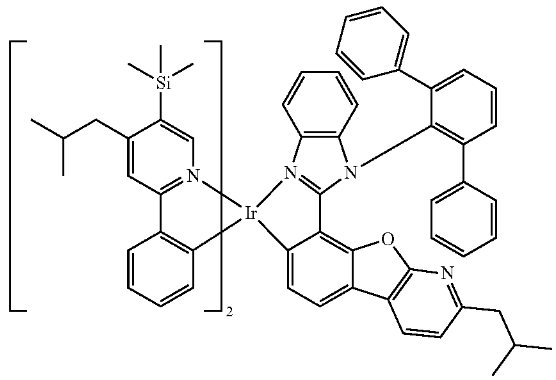
377
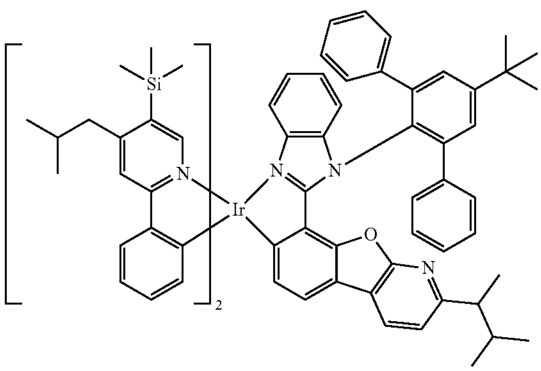
378
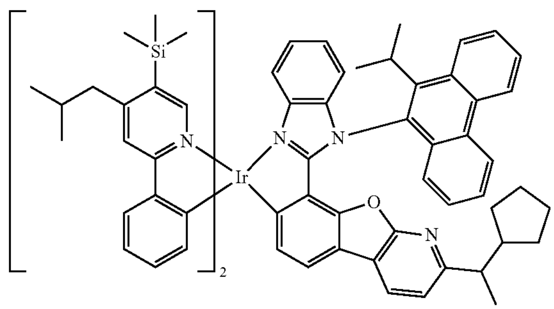
379
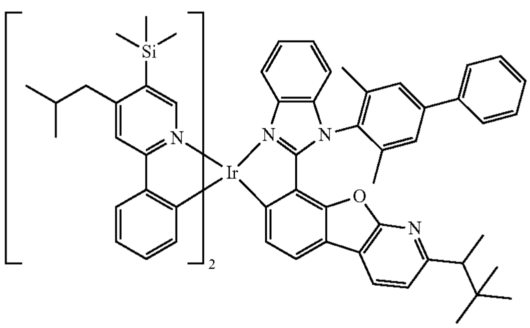
380
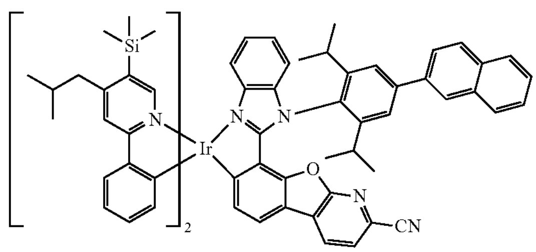
381
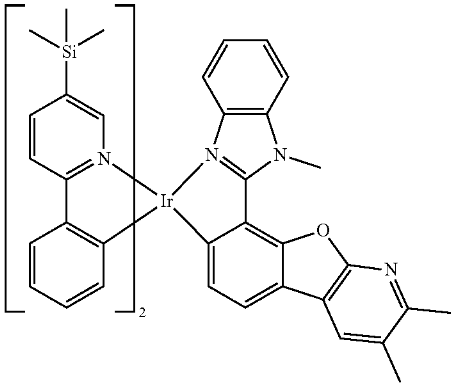
382
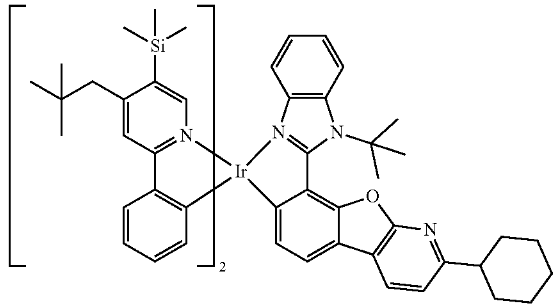

-continued
383
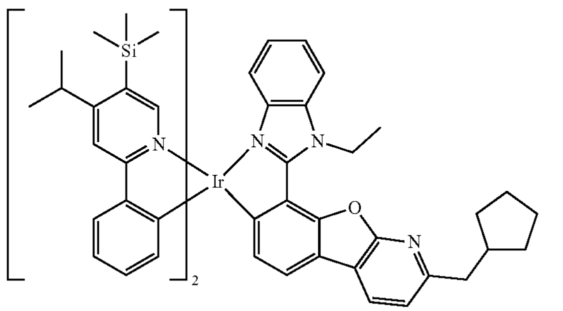
384
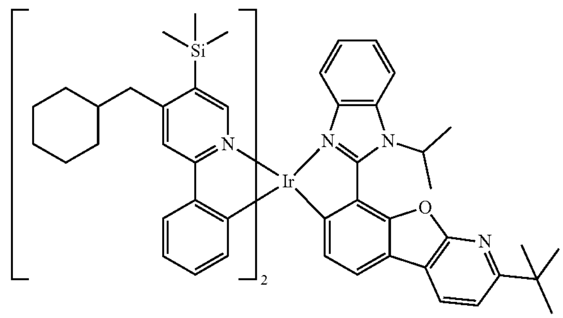
385
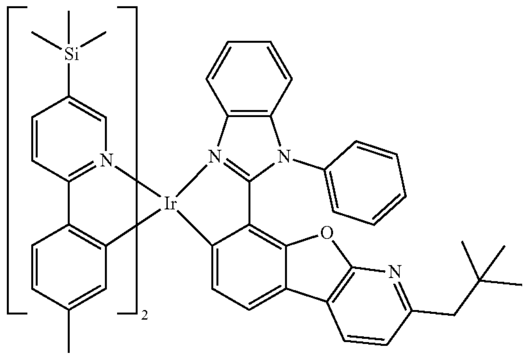
386
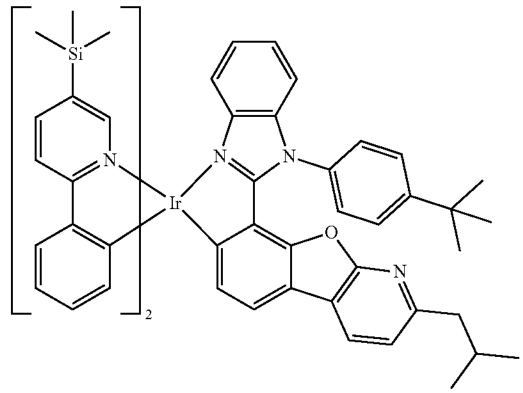
387
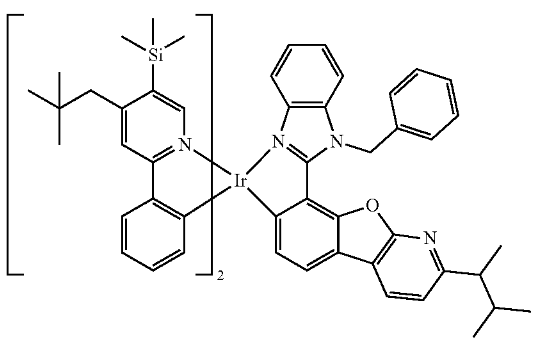
388
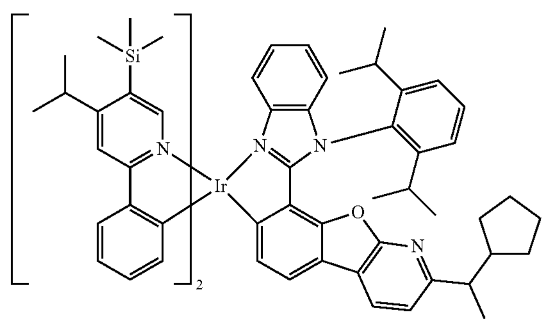
389
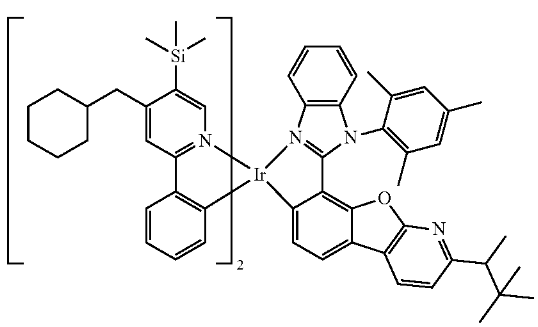
390
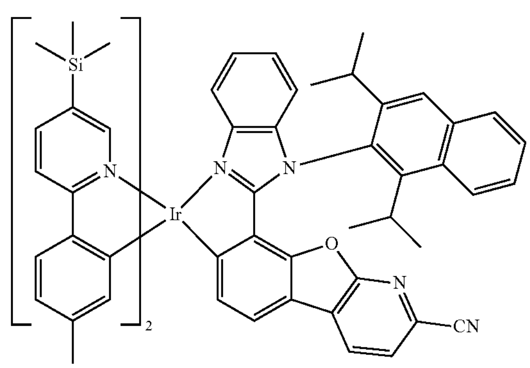

-continued
391
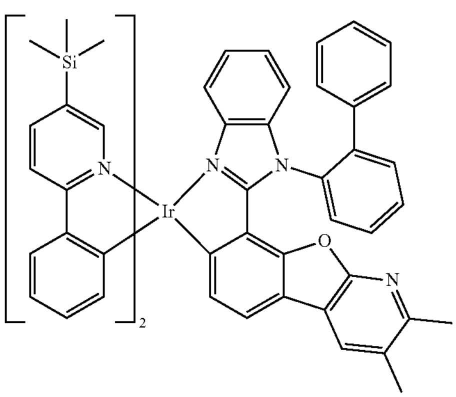
392
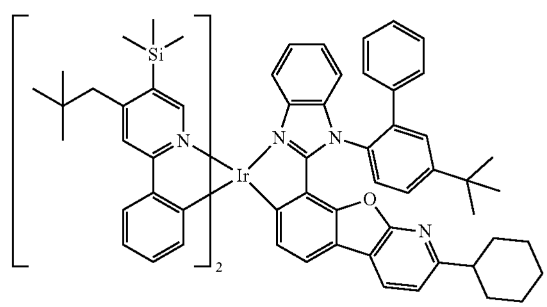
393
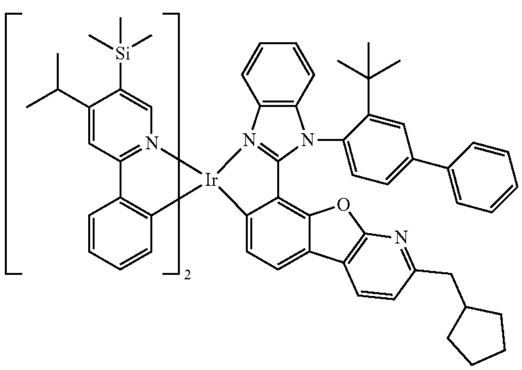
394
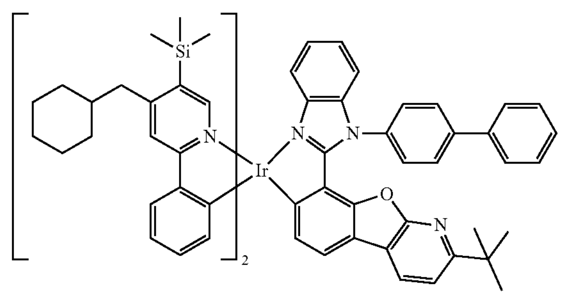
395
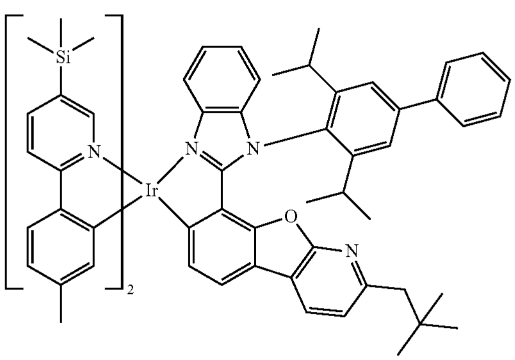
396
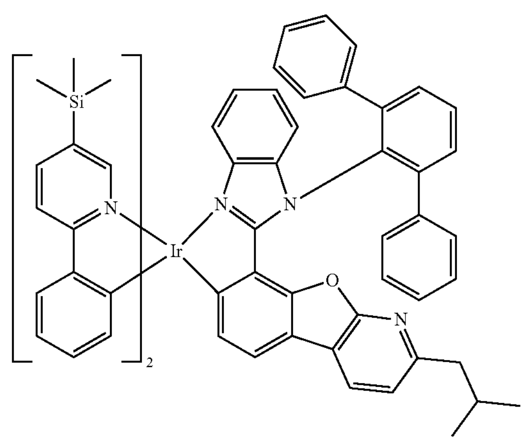
397
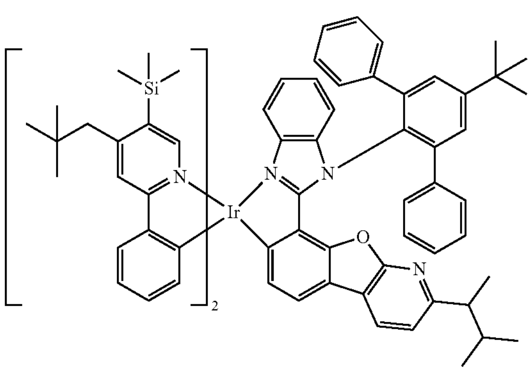
398
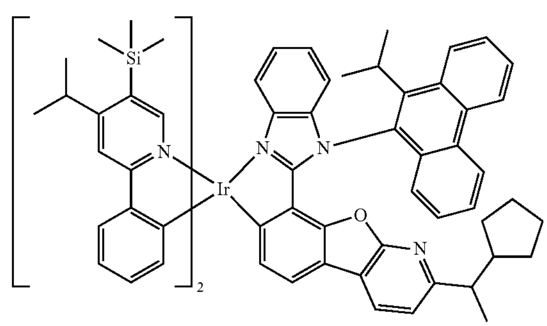

-continued
399
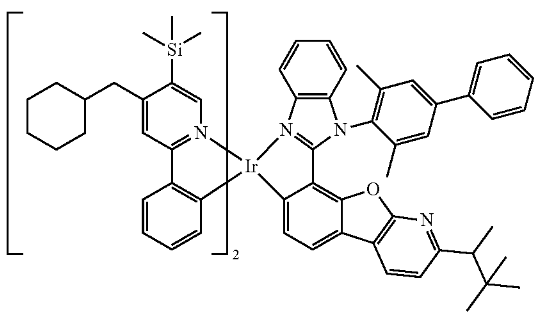
400
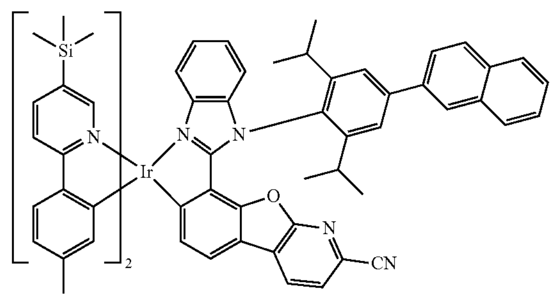
401
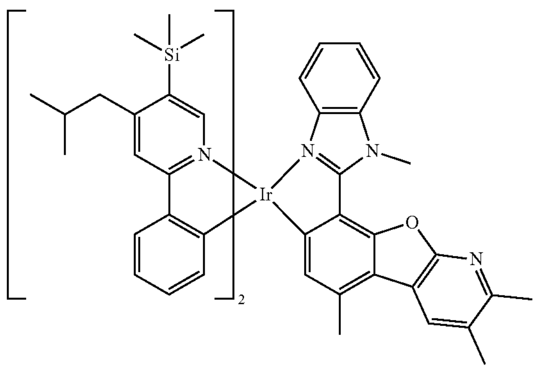
402
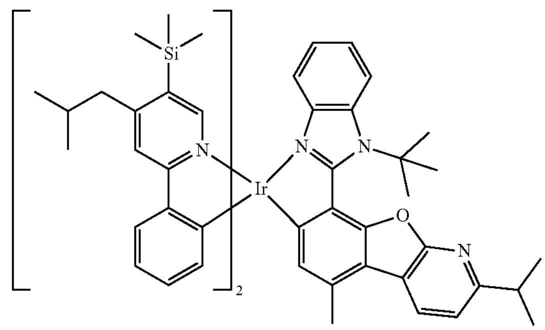
403
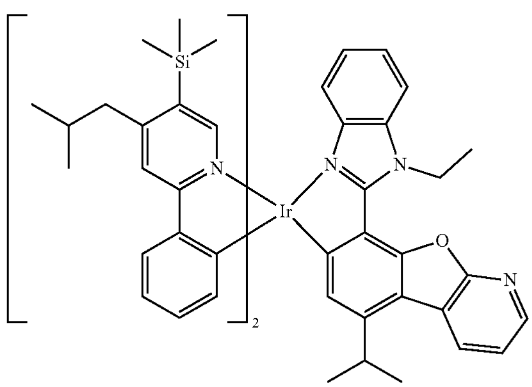
404
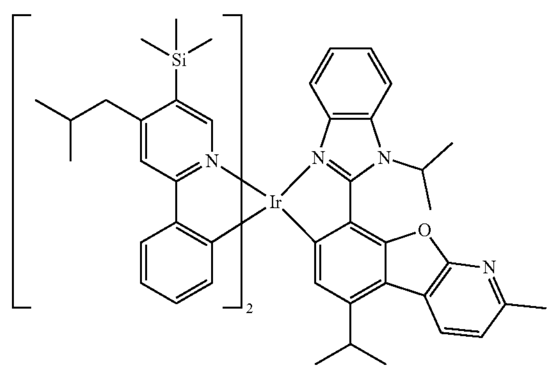
405
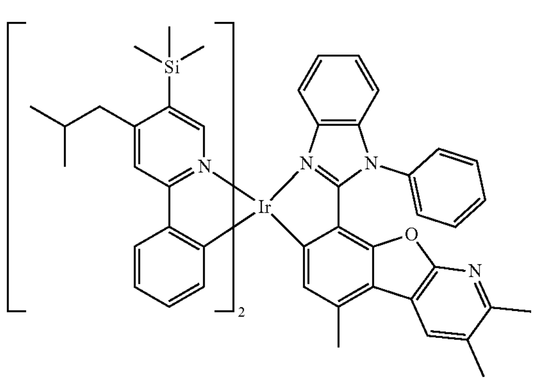
406
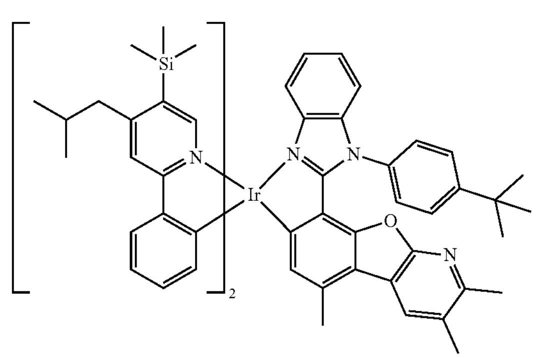

-continued
407
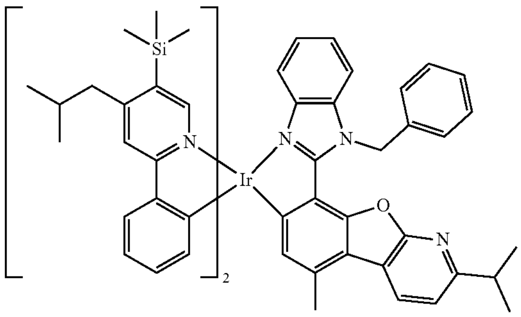
408
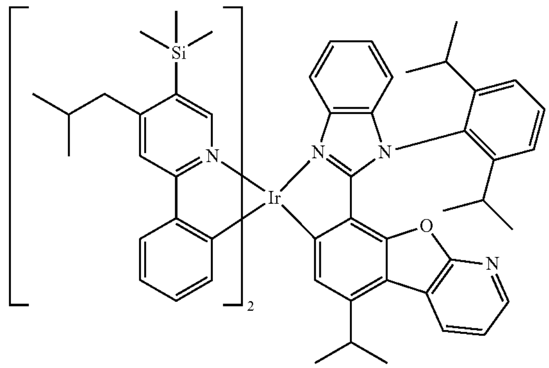
409
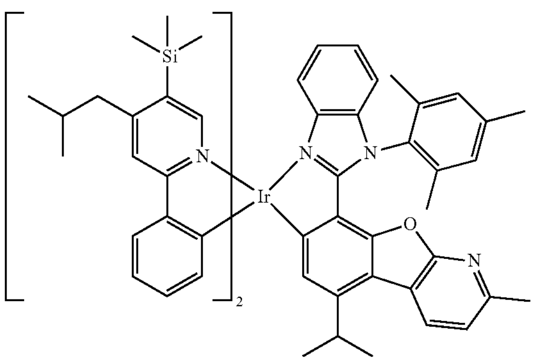
410
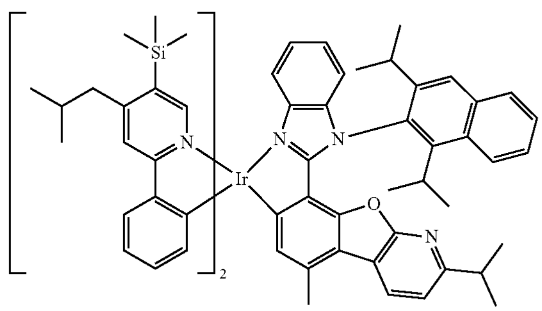
411
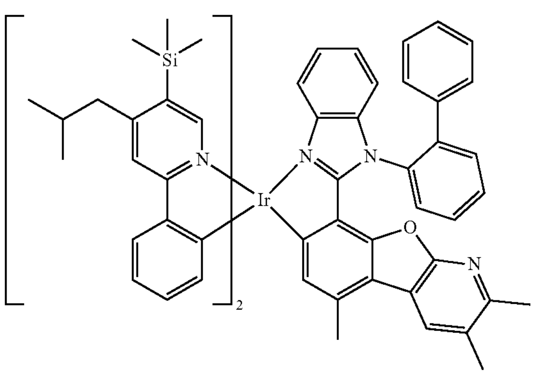
412
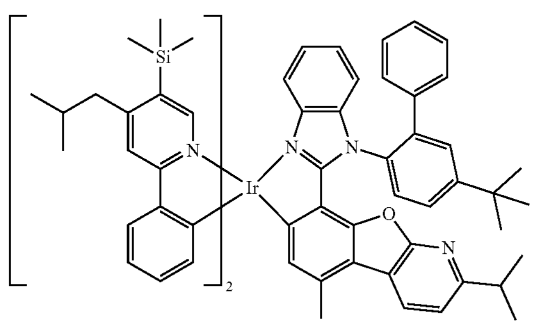
413
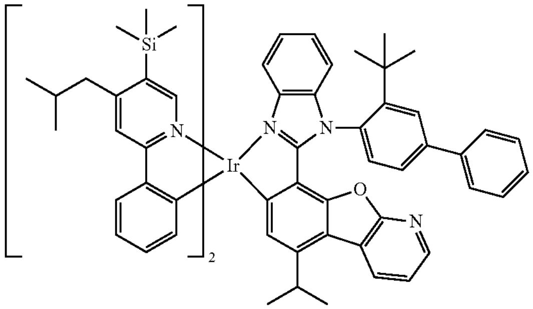
414
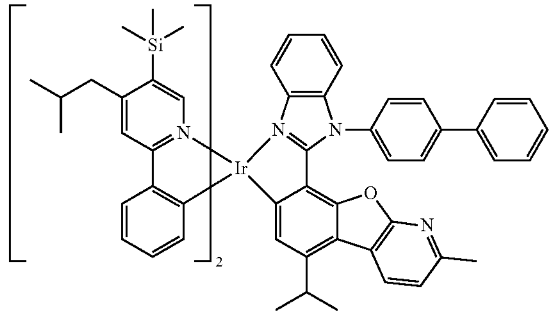

-continued
415
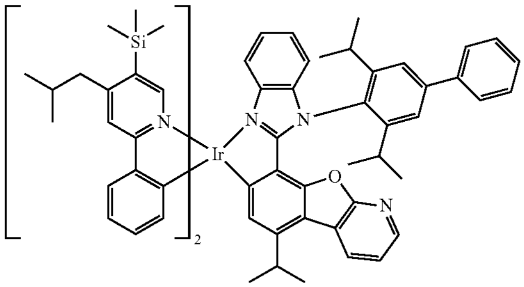
416
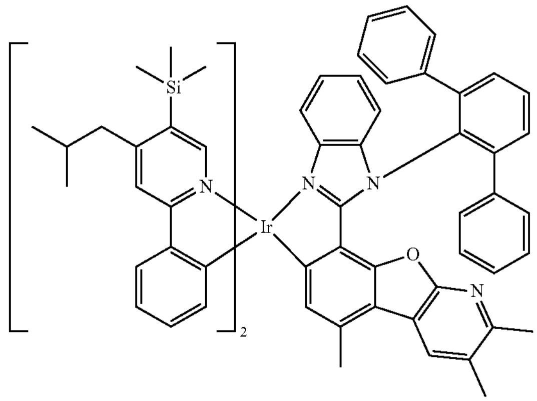
417
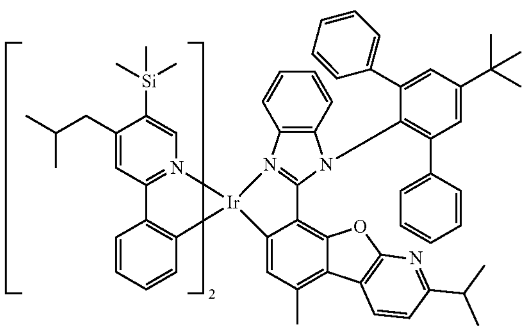
418
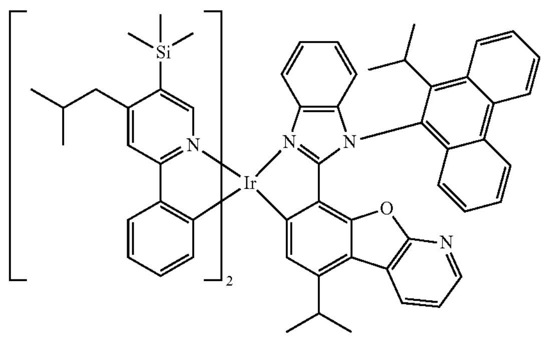
419
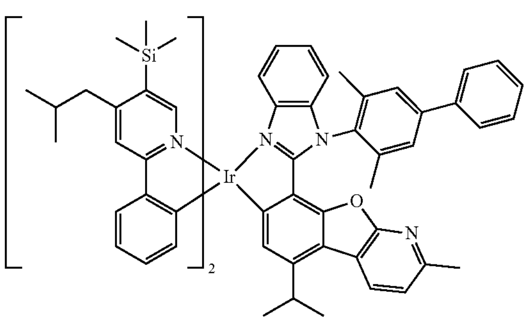
420
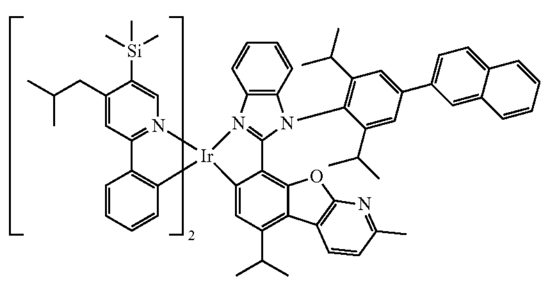
421
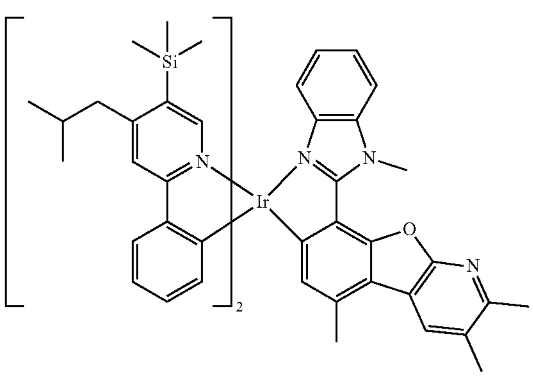
422
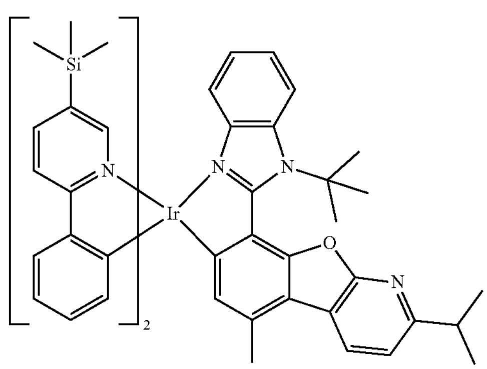

-continued
423
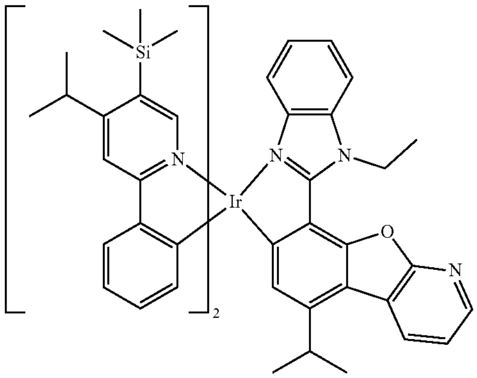
424
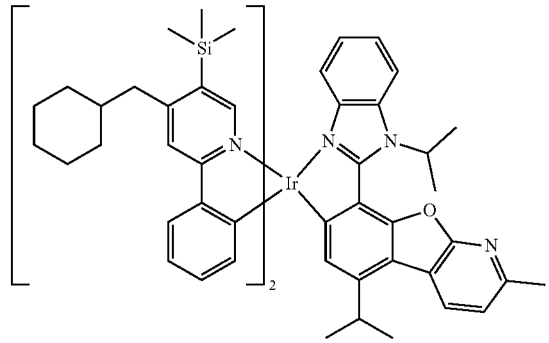
425
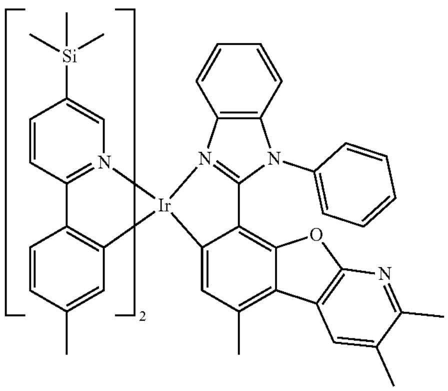
426
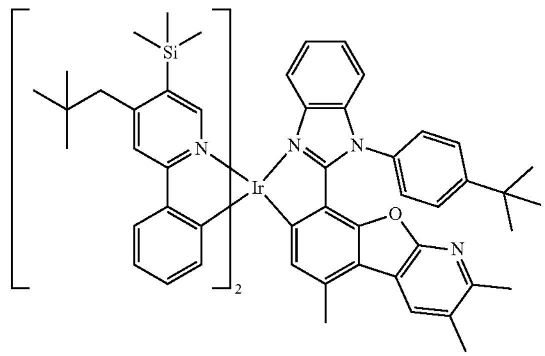
427
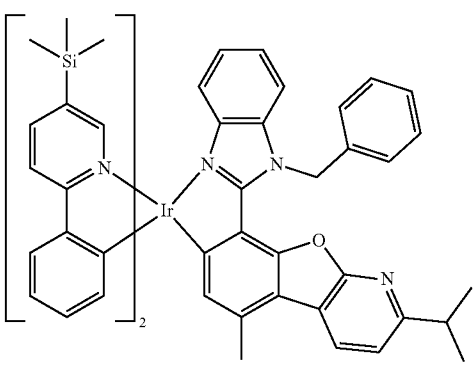
428
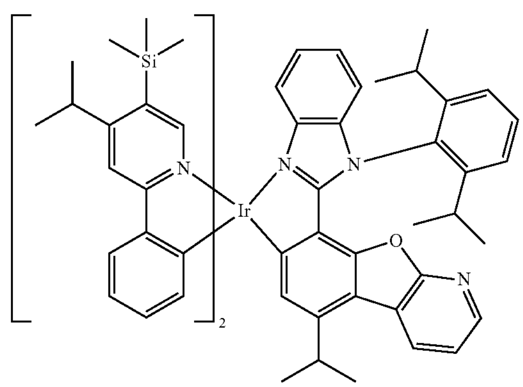
429
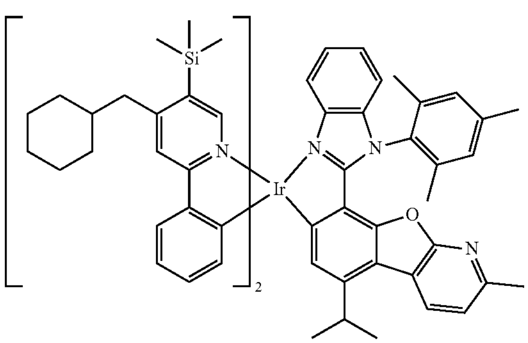
430
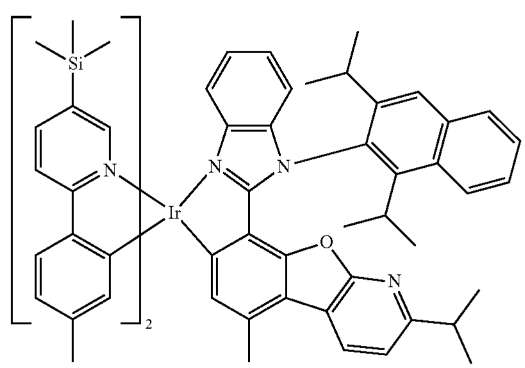

-continued
431
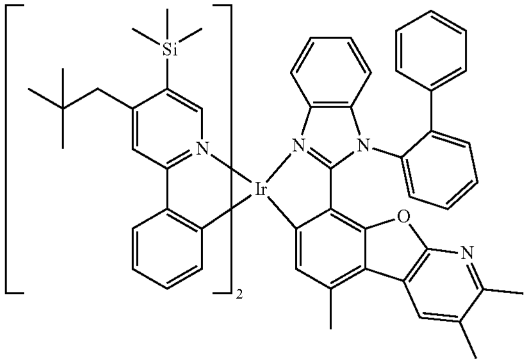
432
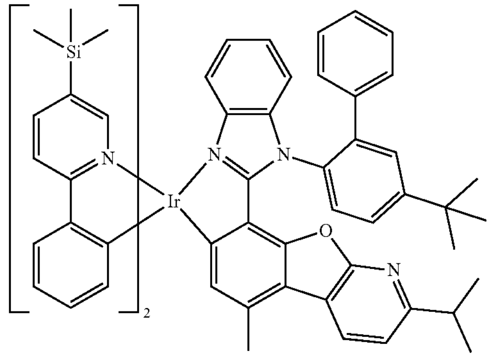
433
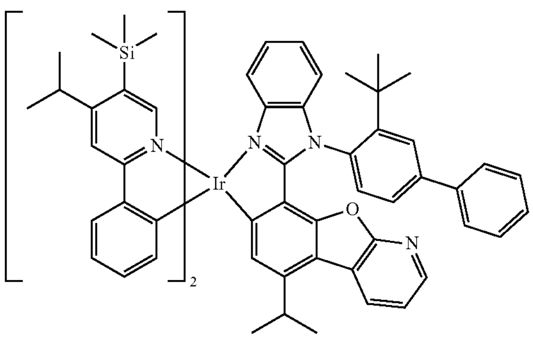
434
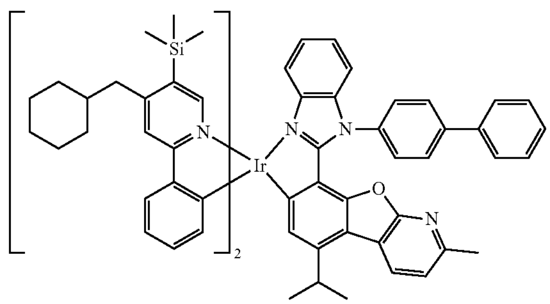
435
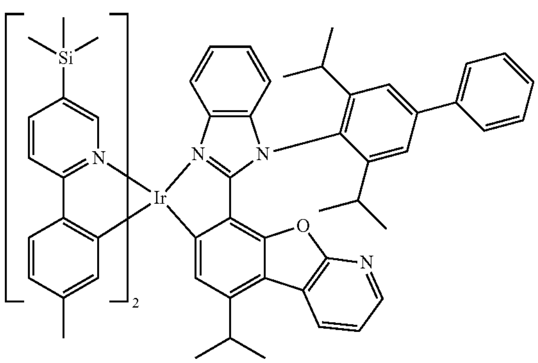
436
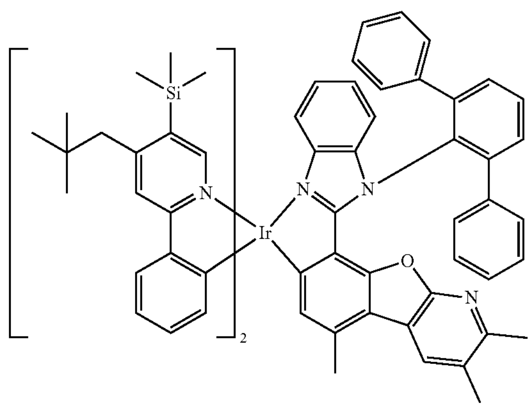
437
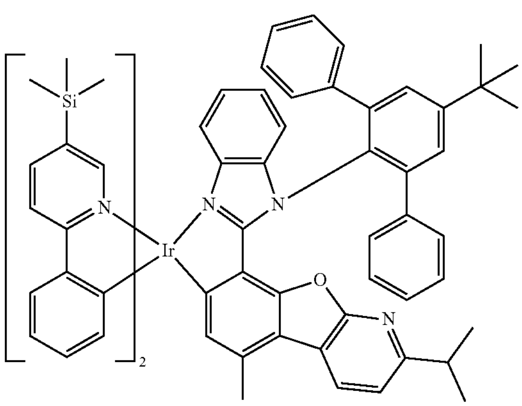
438
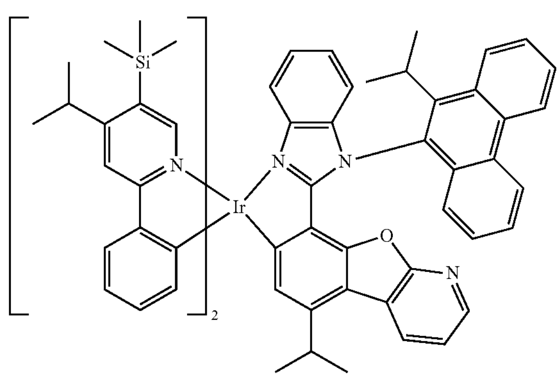

-continued
439
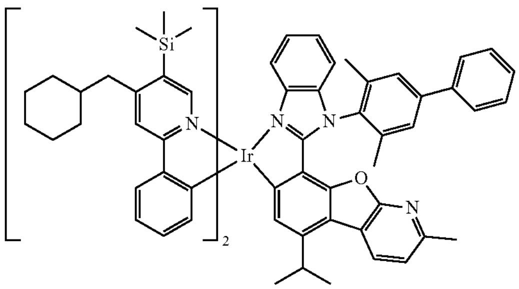
440
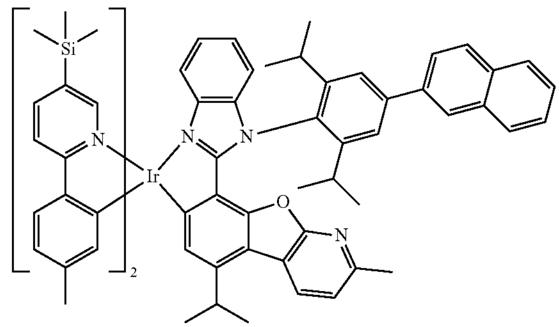
441
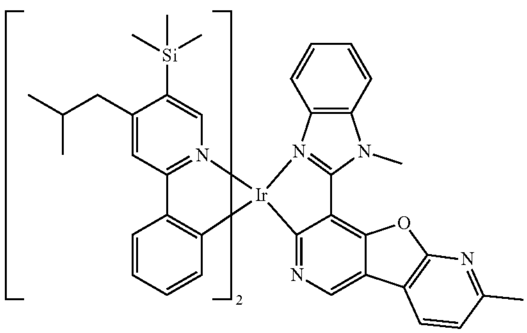
442
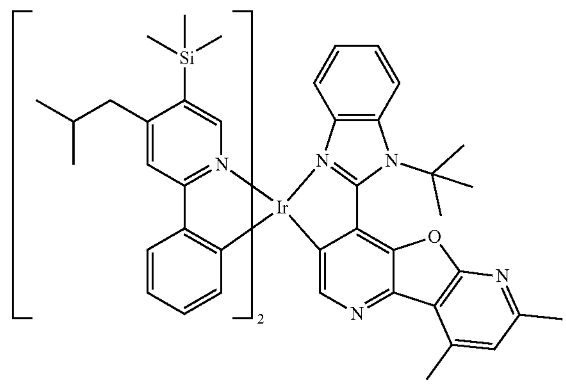
443
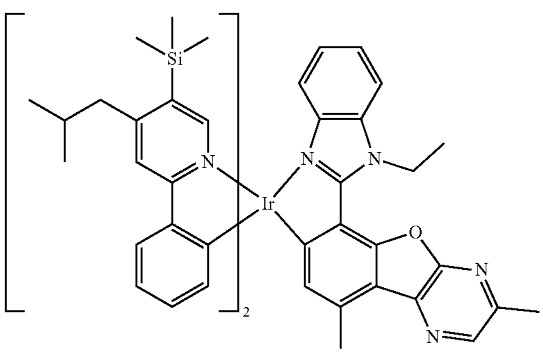
444
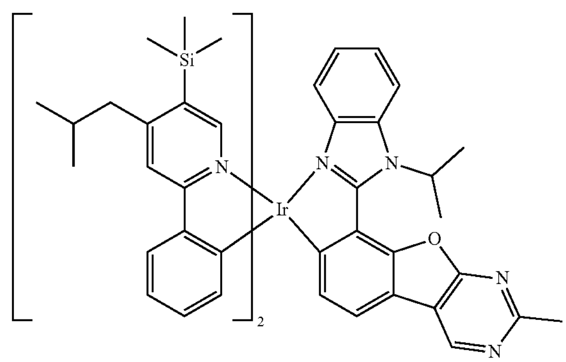
445
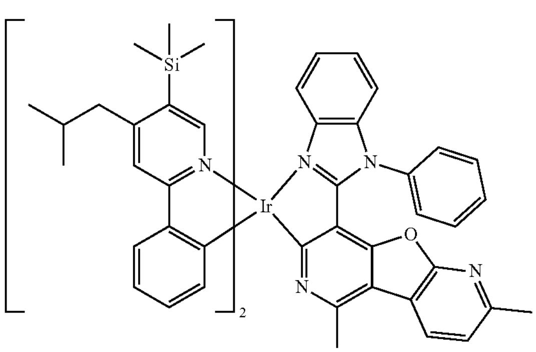
446
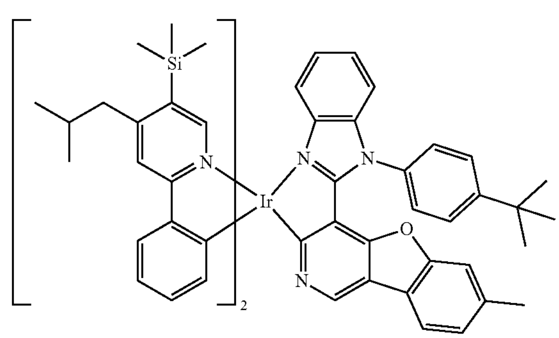

-continued
447
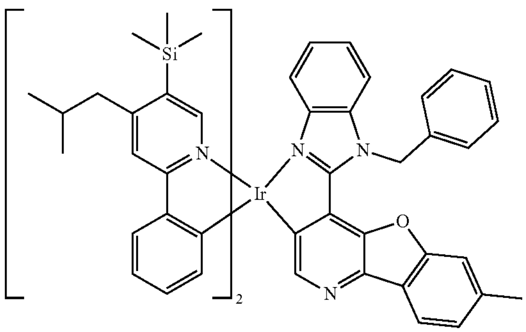
448
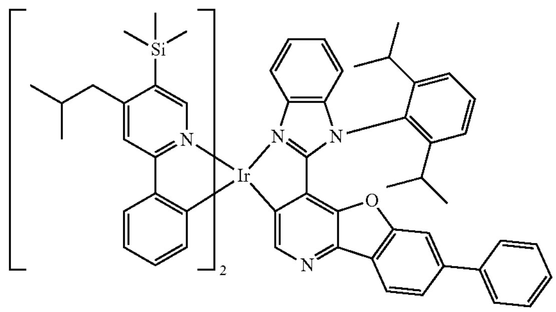
449
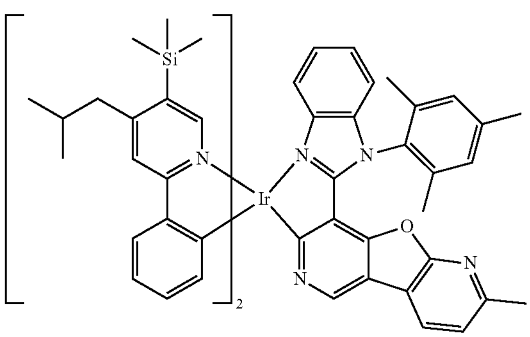
450
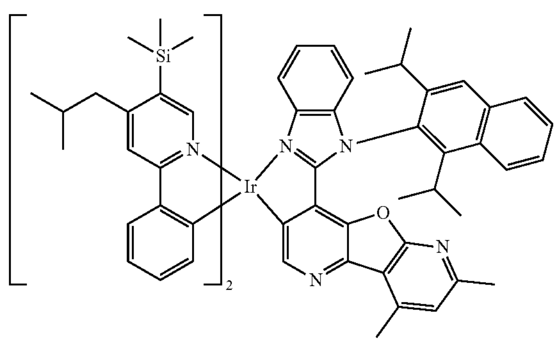
451
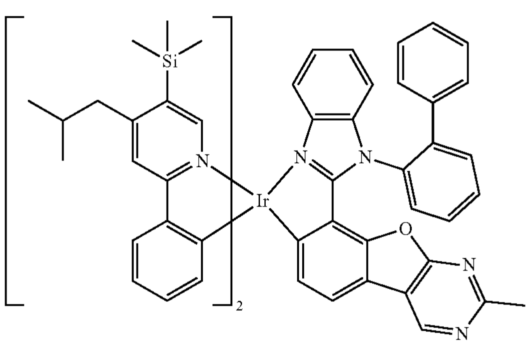
452
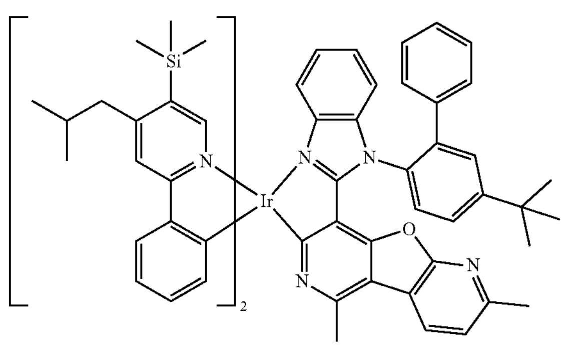
453
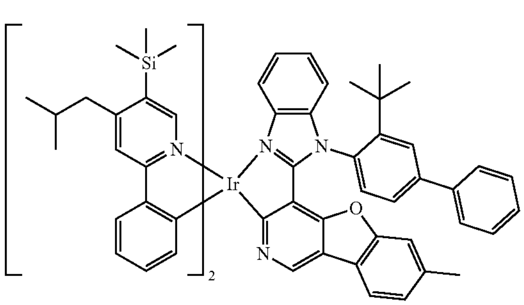
454
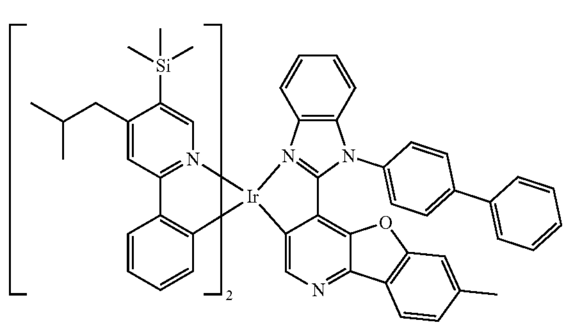

-continued
455
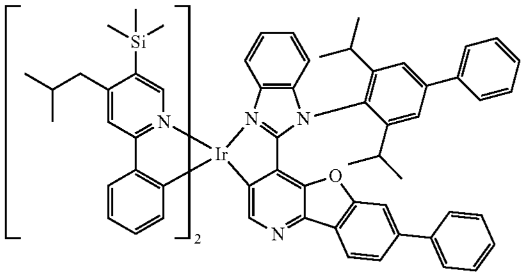
456
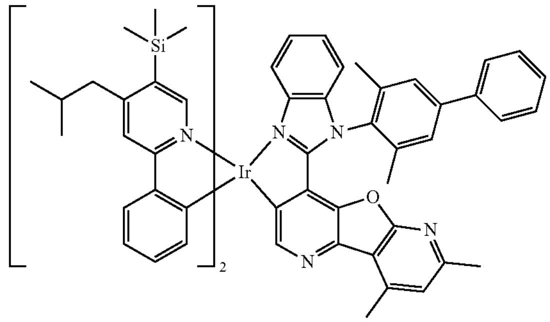
457
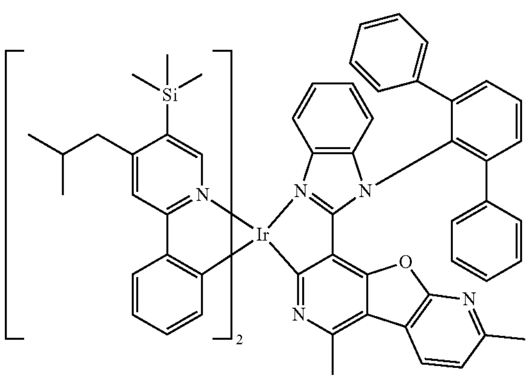
458
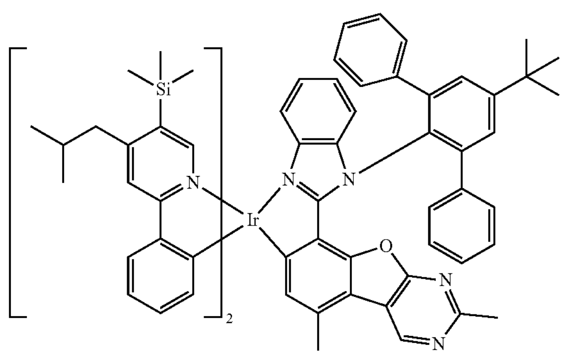
459
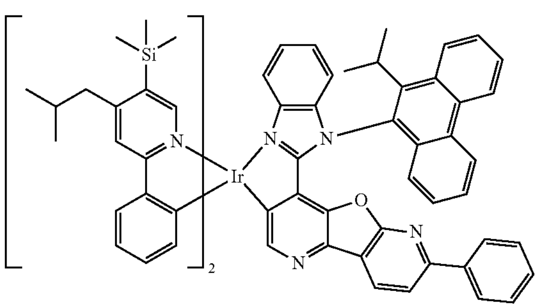
460
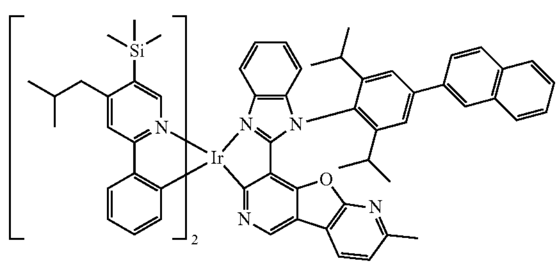
461
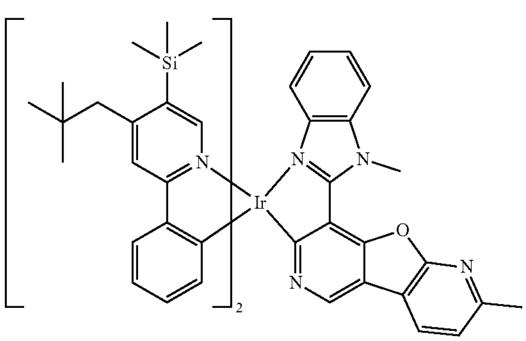
462
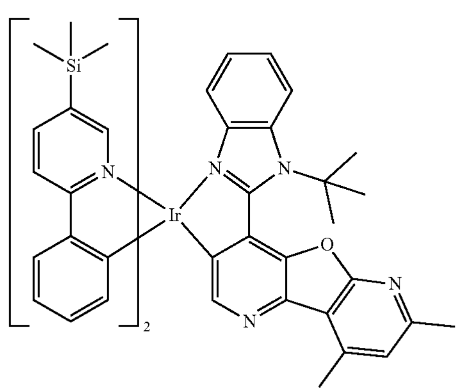

-continued
463
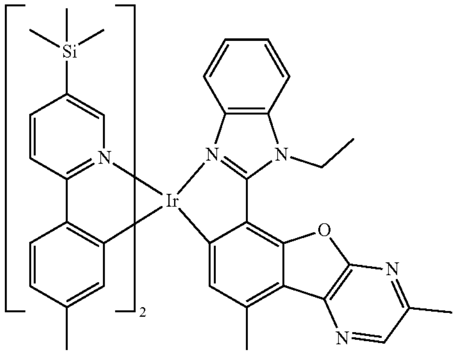
464
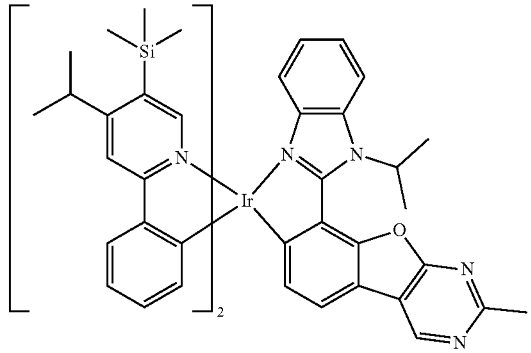
465
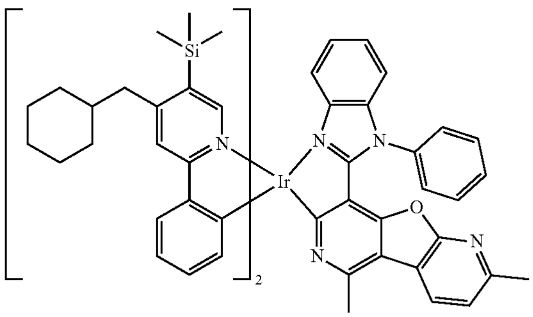
466
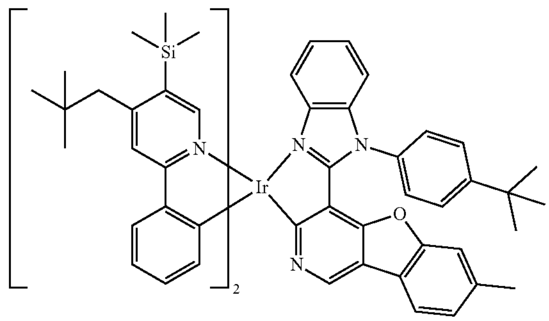
467
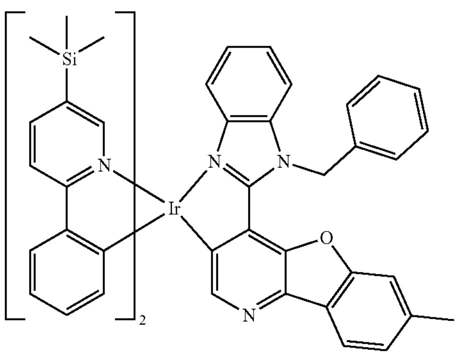
468
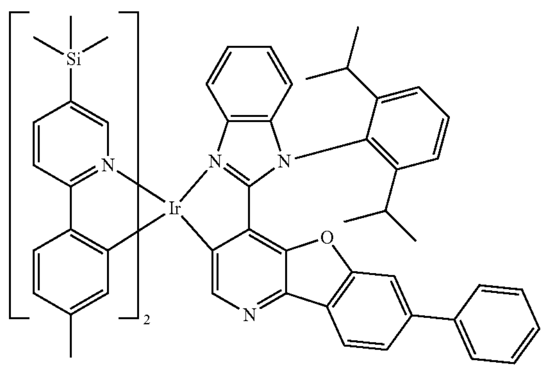
469
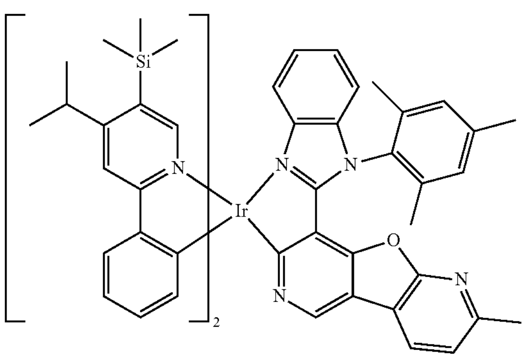
470
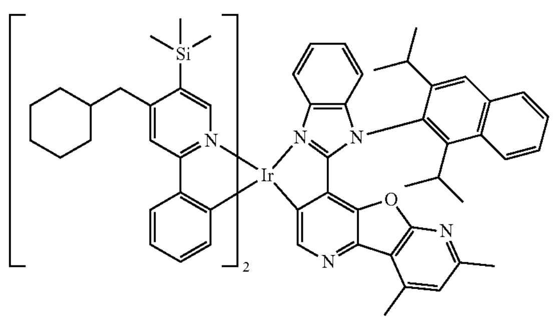

-continued
471
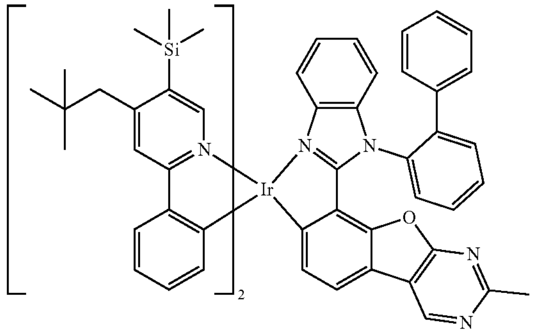
472
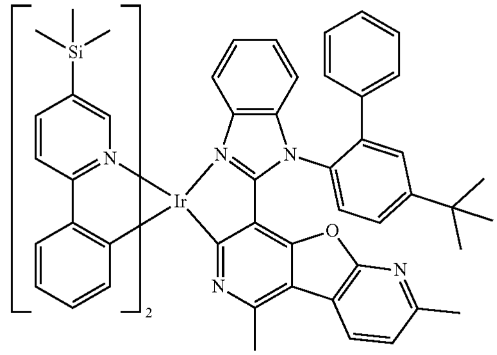
473
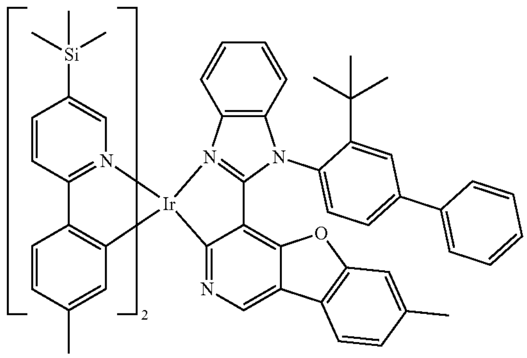
474
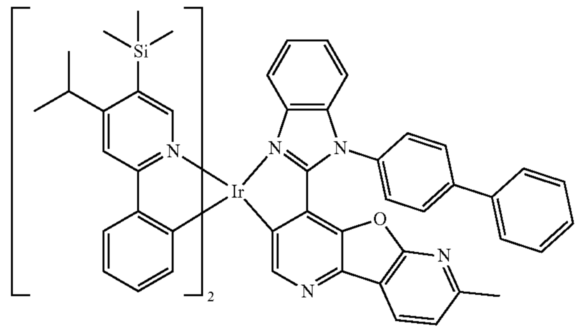
475
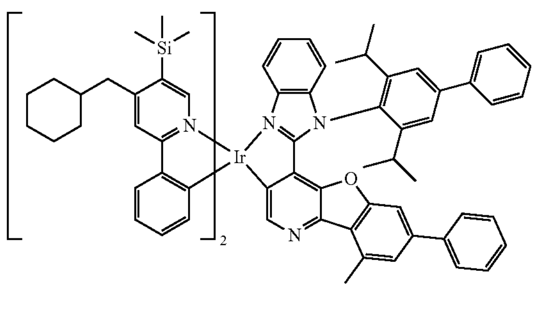
476
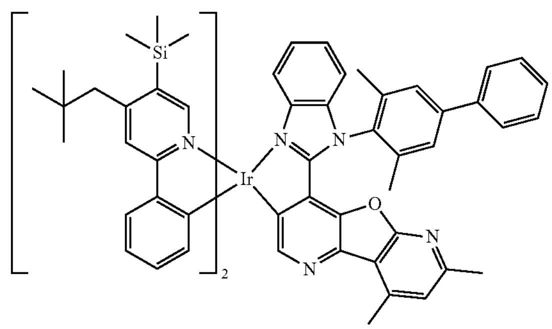
477
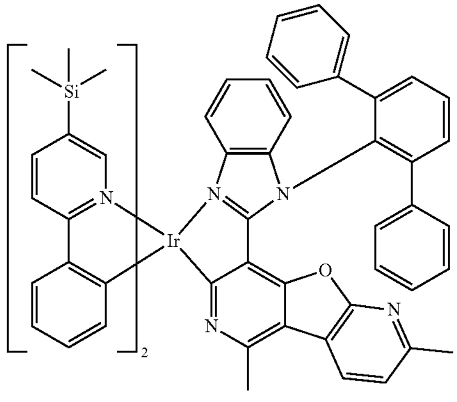
478
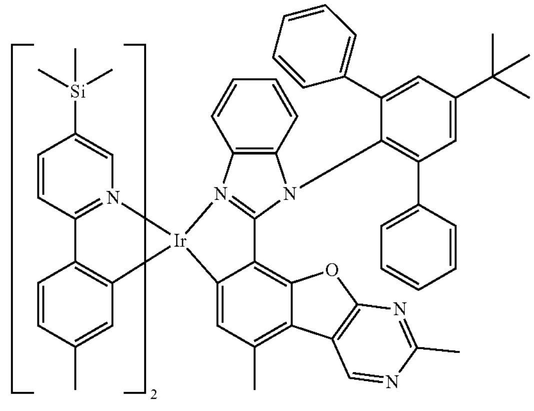

-continued
479
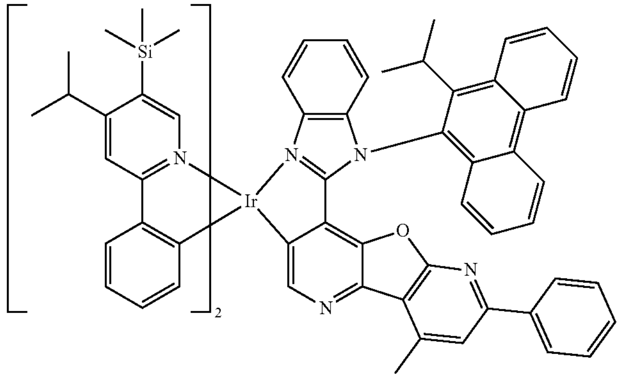
480
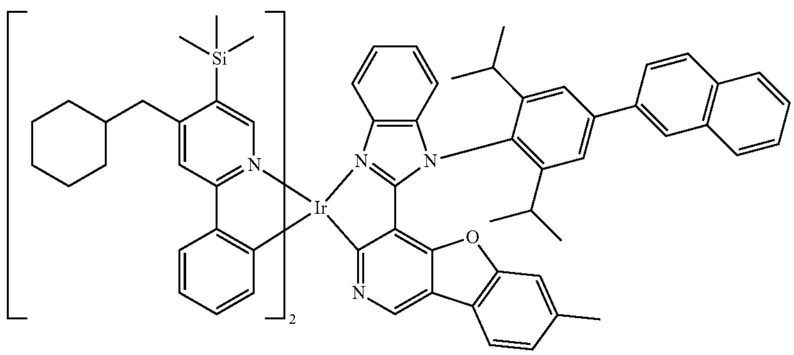
481
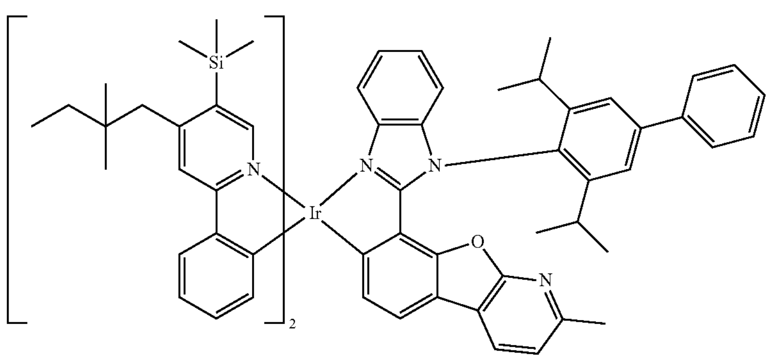
482
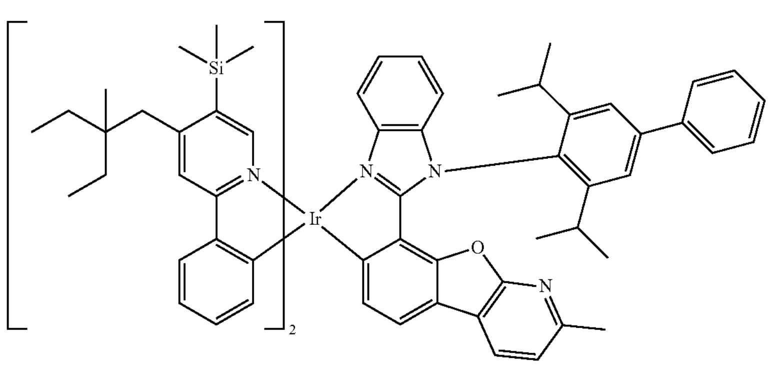

-continued
483
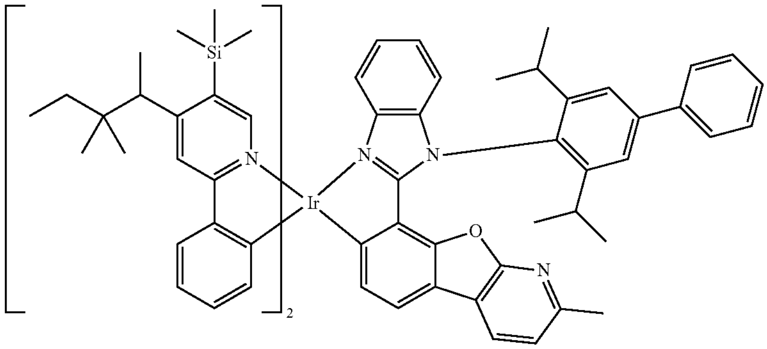
484
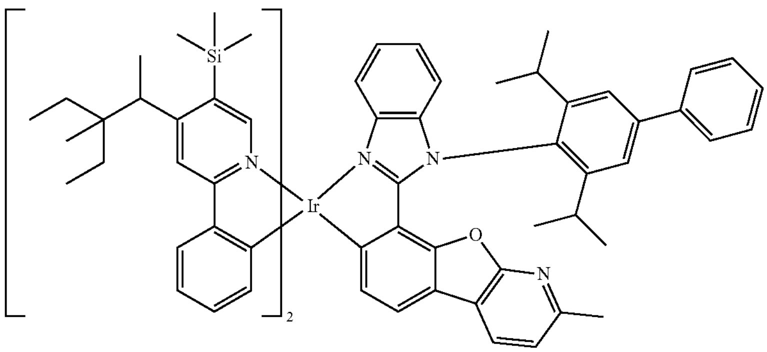
485
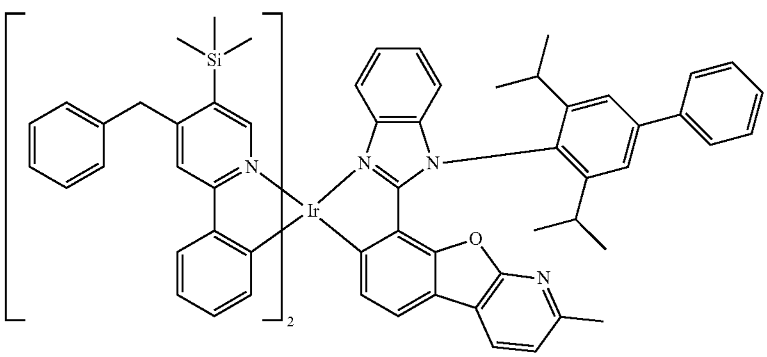
486
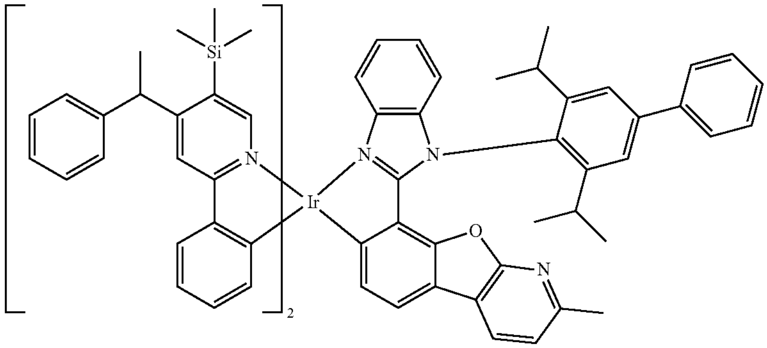

-continued
487
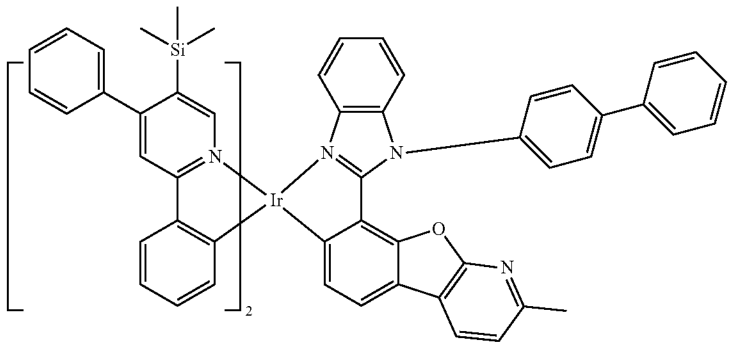
488
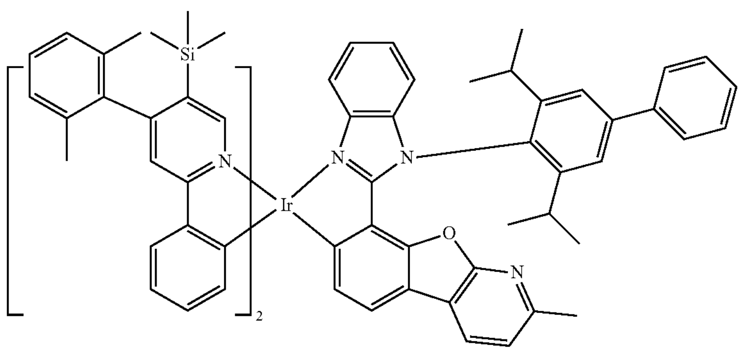
489
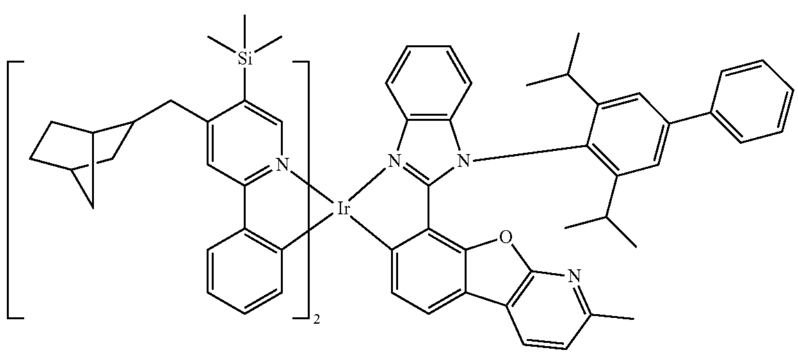
490
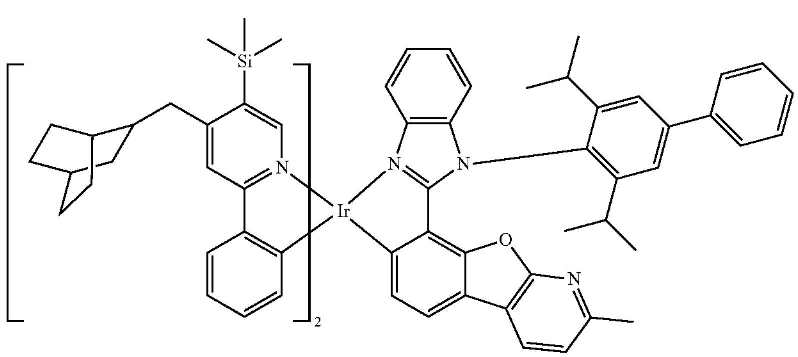

-continued
491
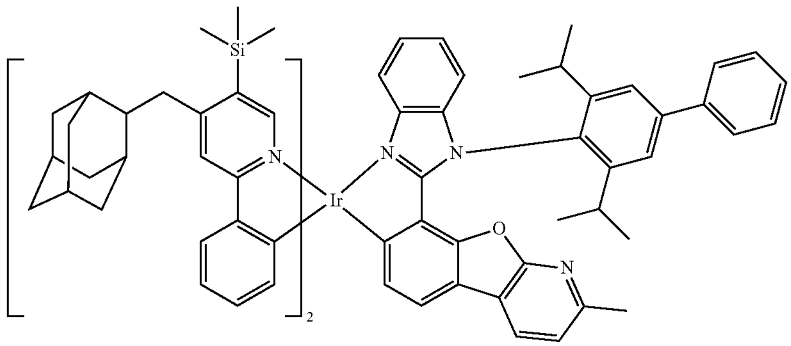
492
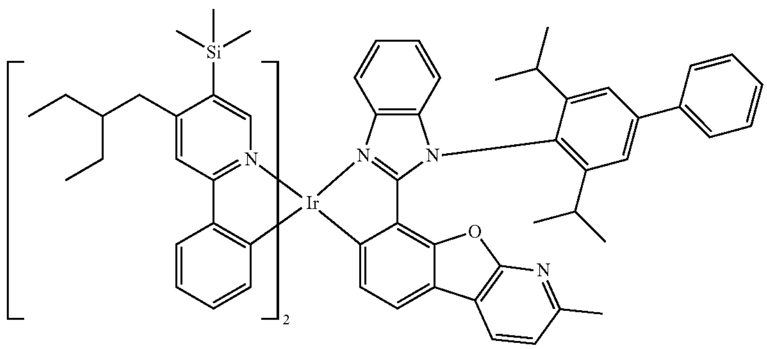
493
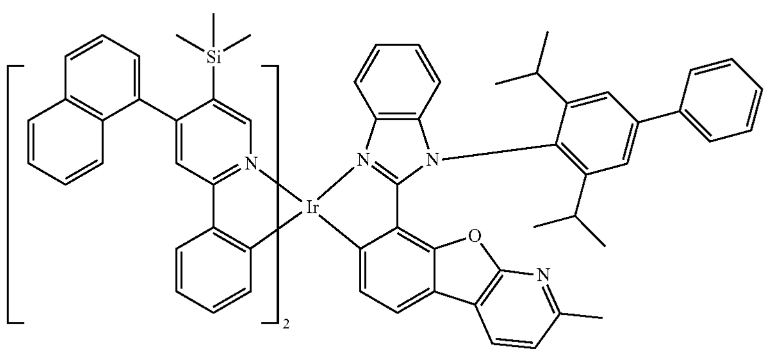
494
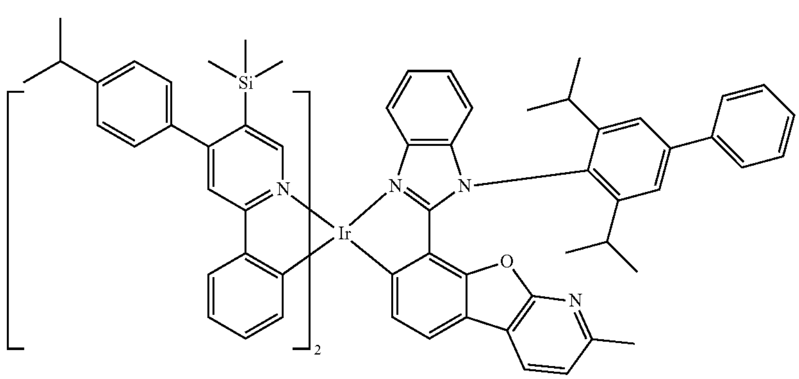

-continued
495
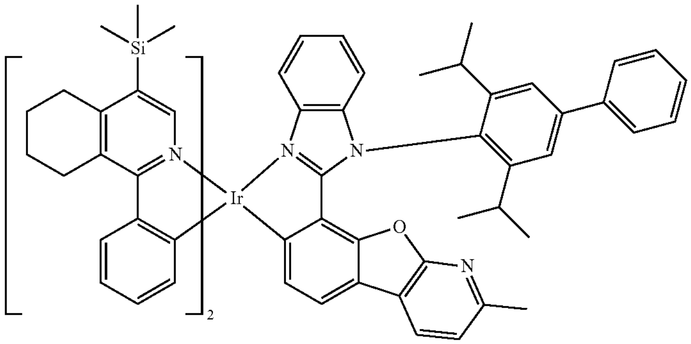
496
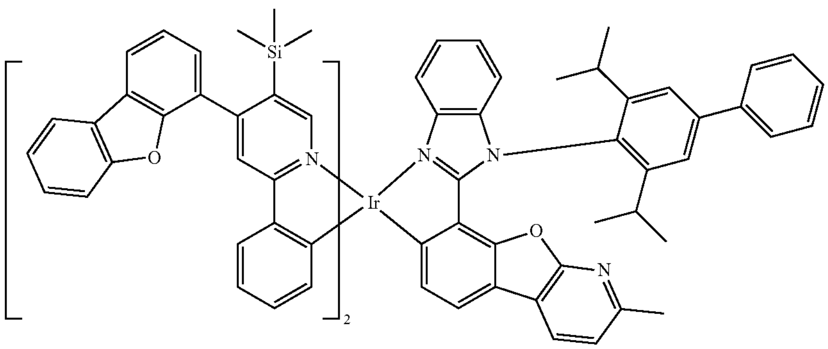
497
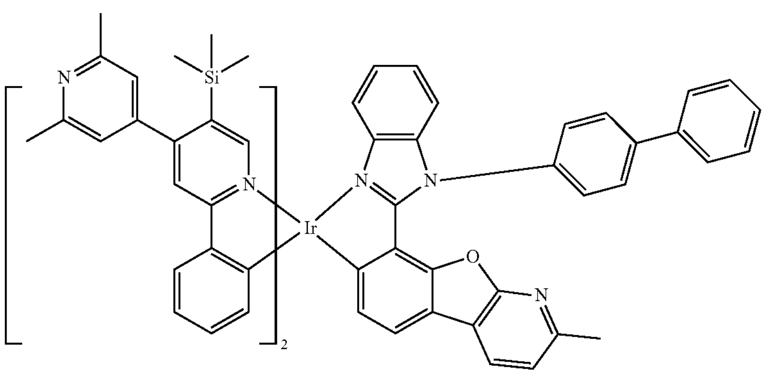
498
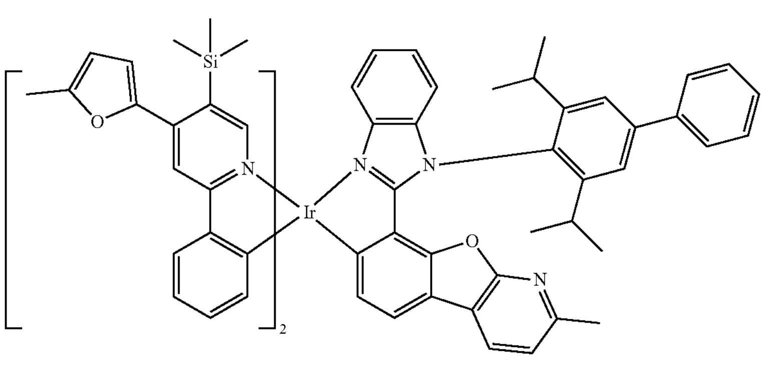

-continued
499
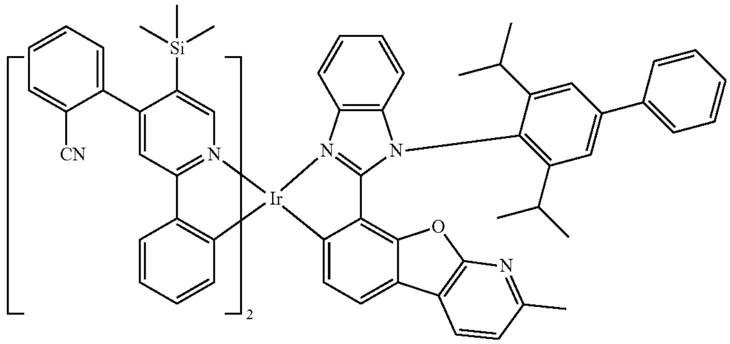
500
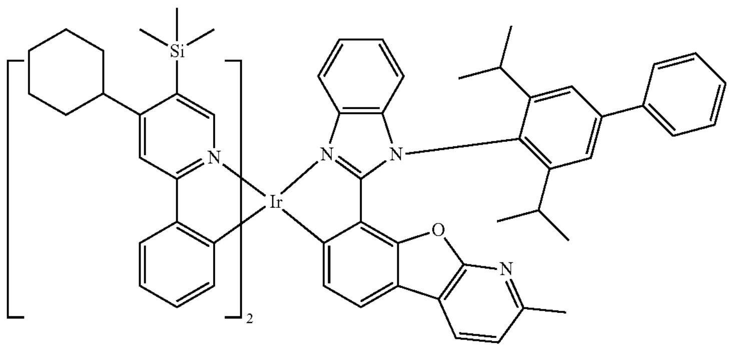
501
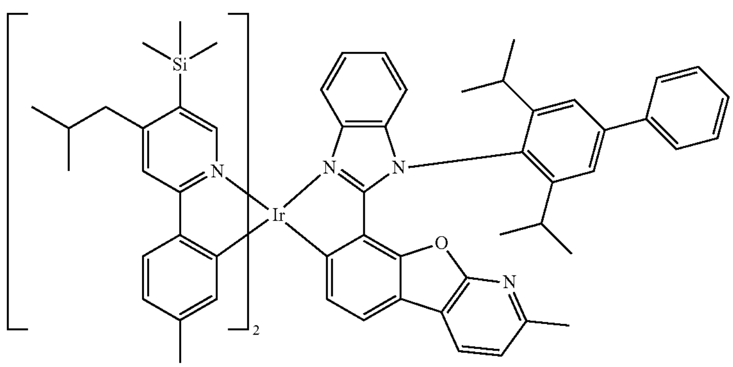
502
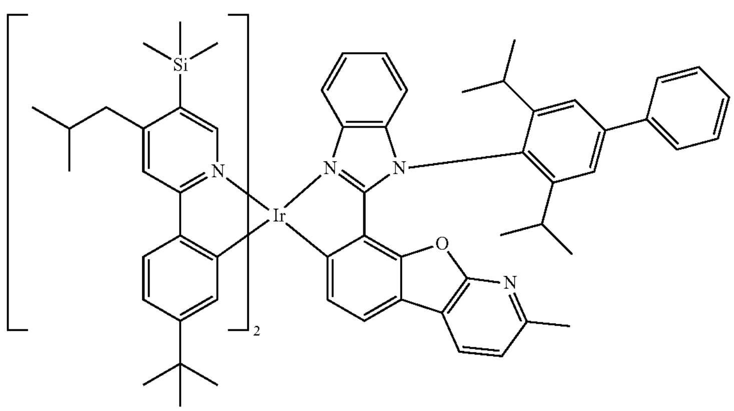

-continued
503
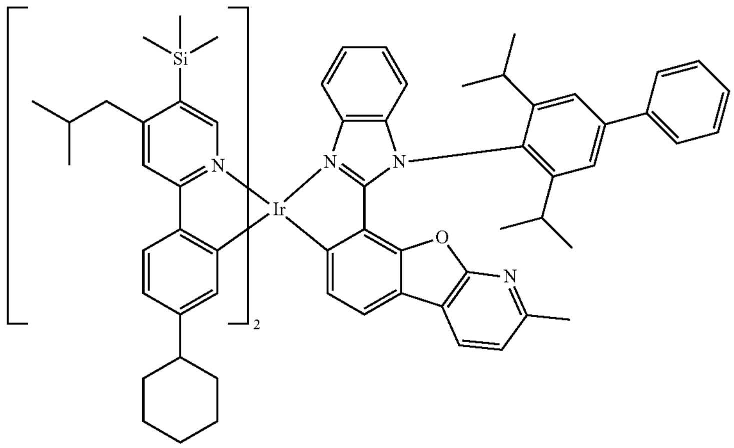
504
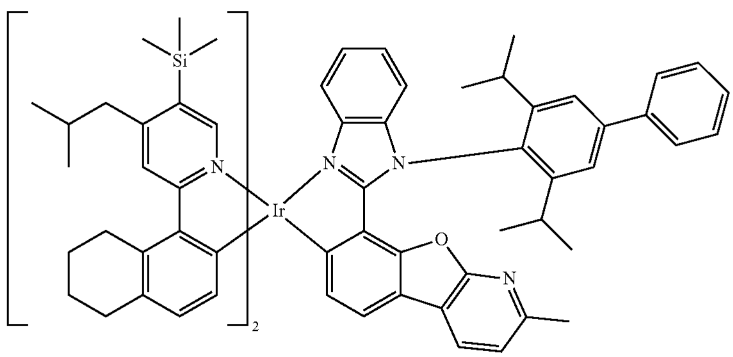
505
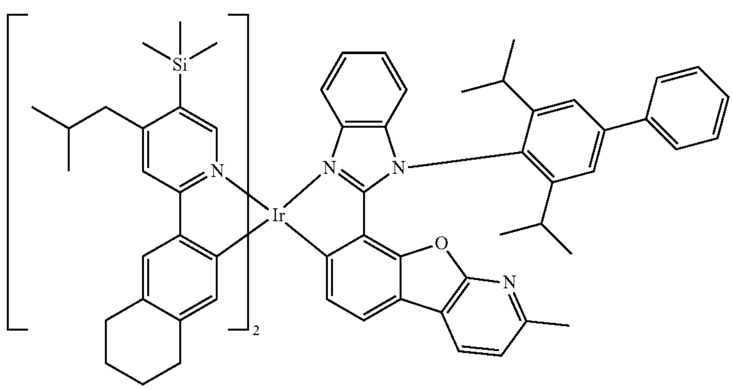
506
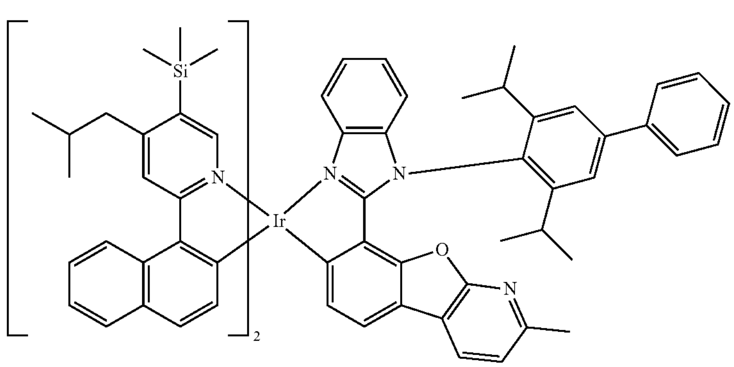

-continued
507
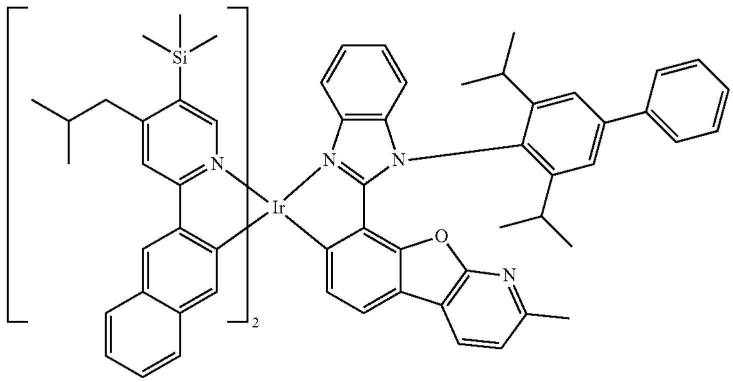
508
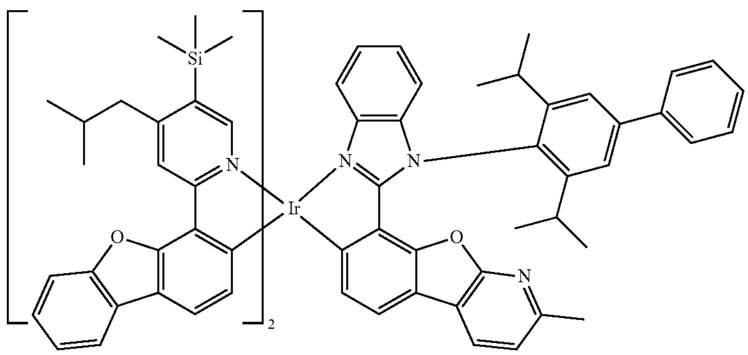
509
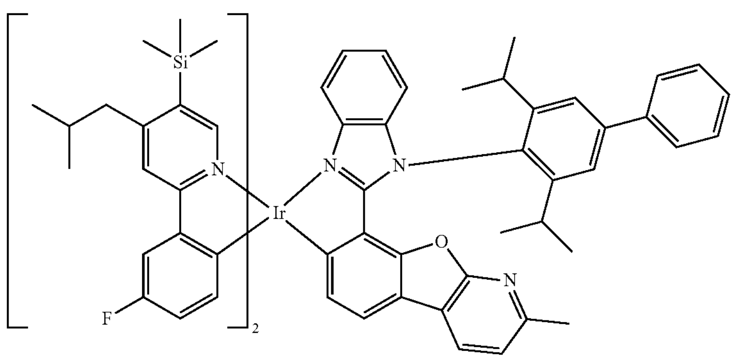
510
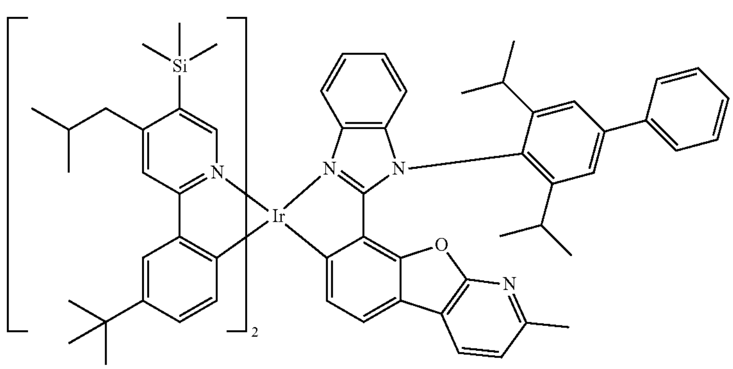

-continued
511
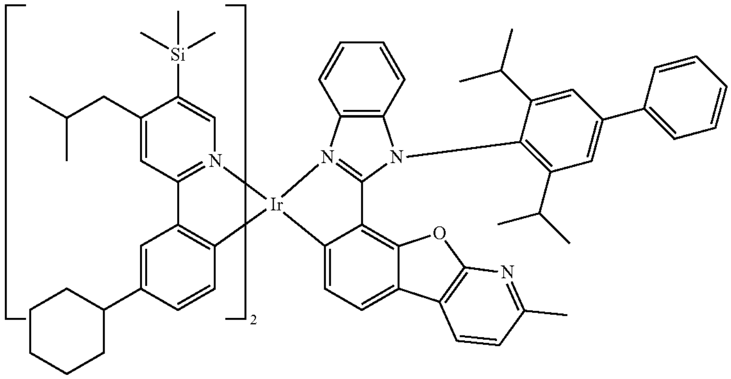
512
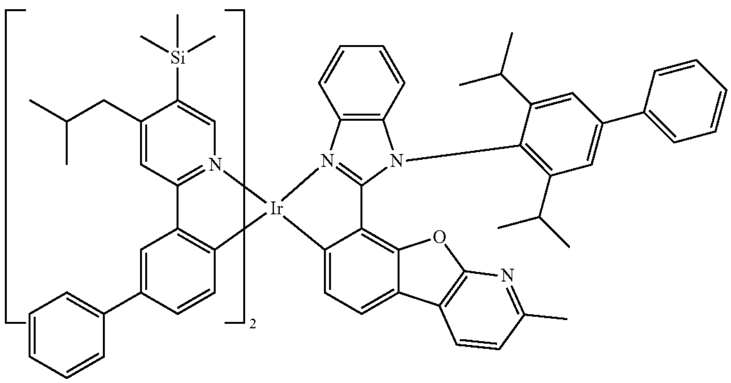
513
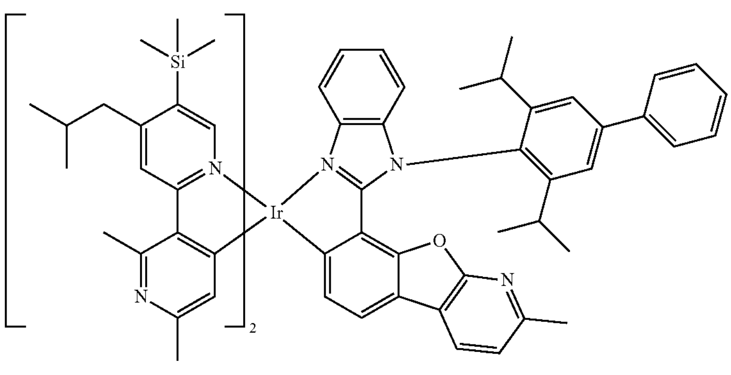
514
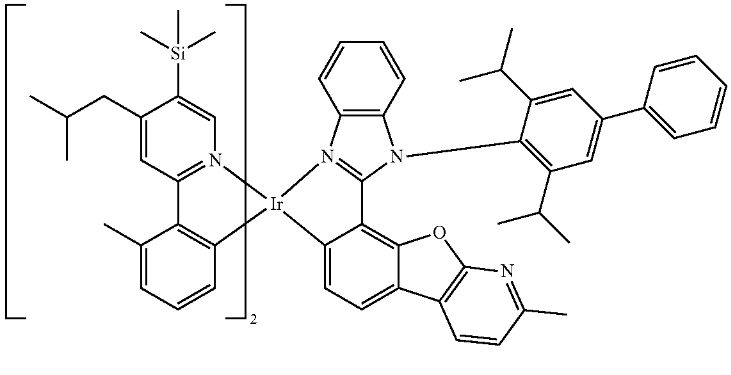

-continued
515
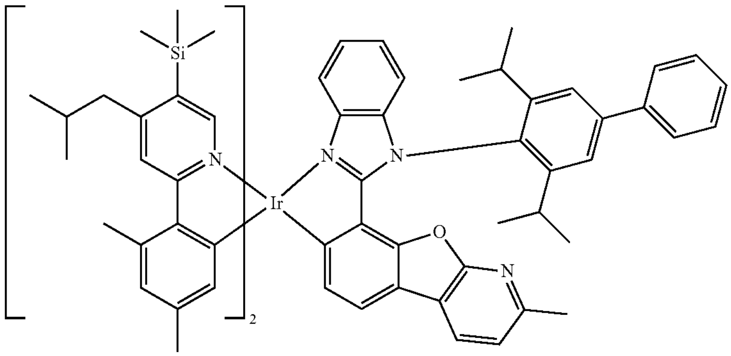
516
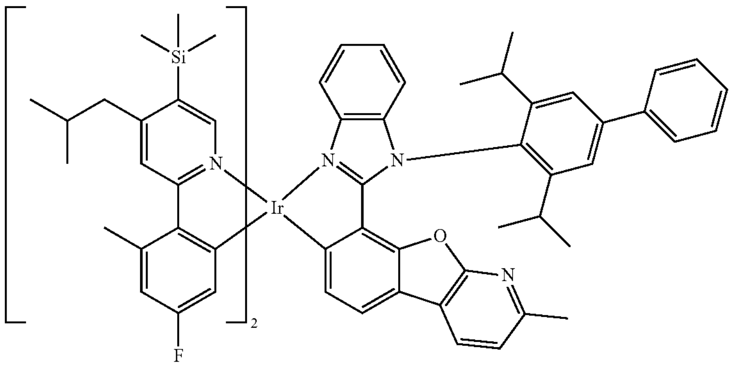
517
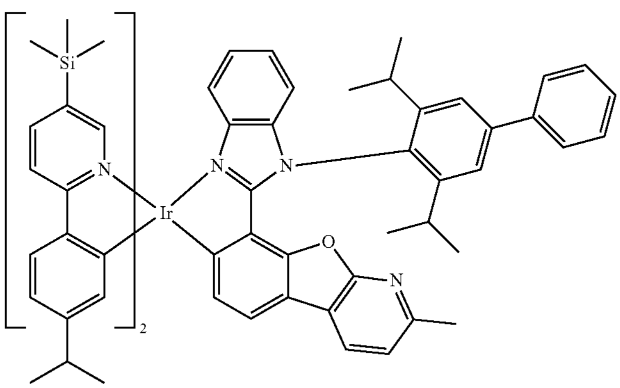
518
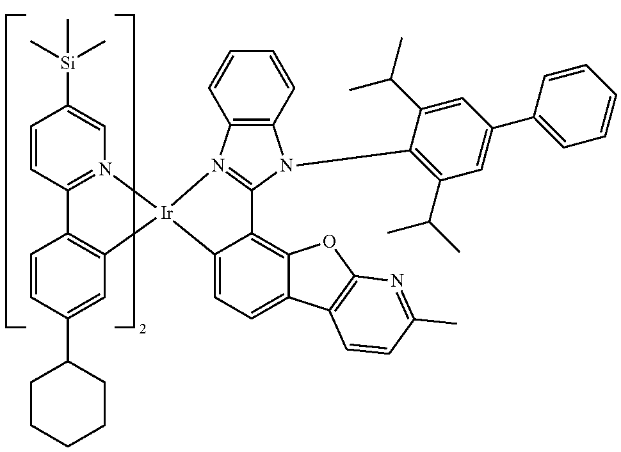

-continued
519
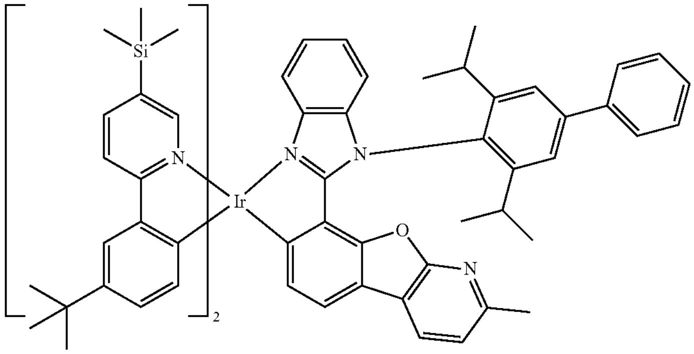
520
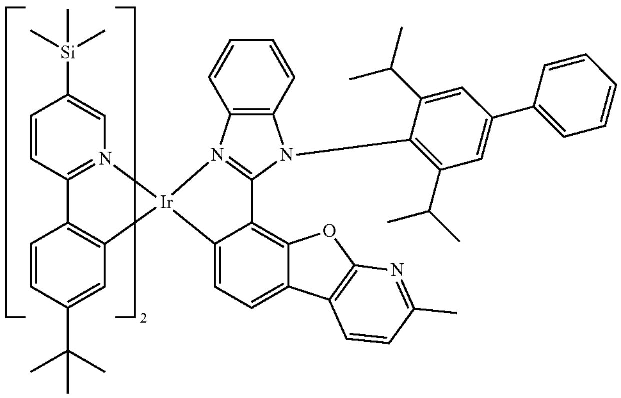
521
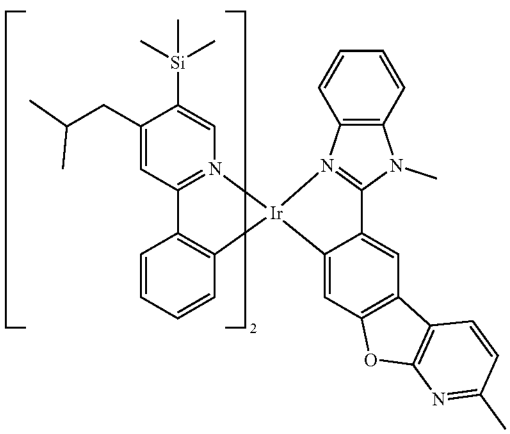
522
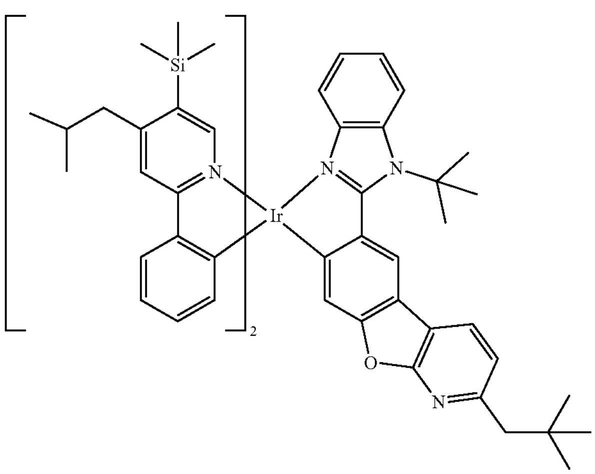

-continued
523
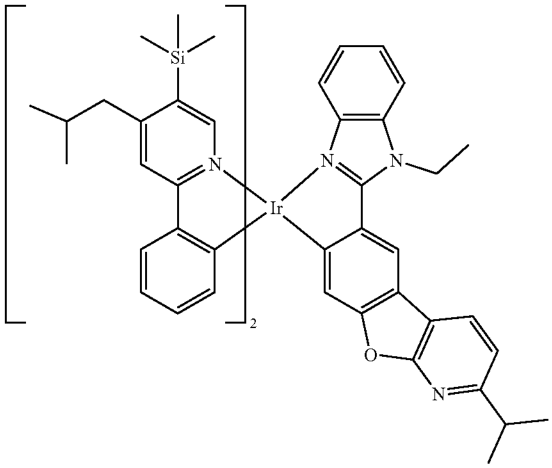
524
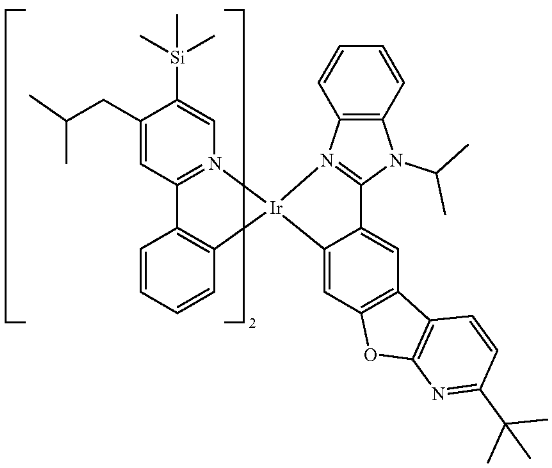
525
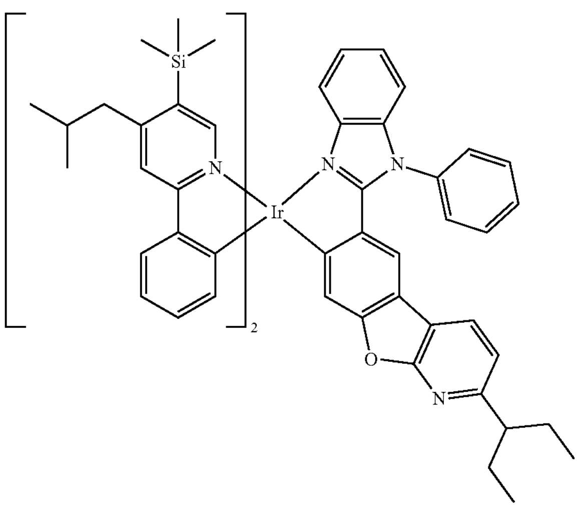

-continued
526
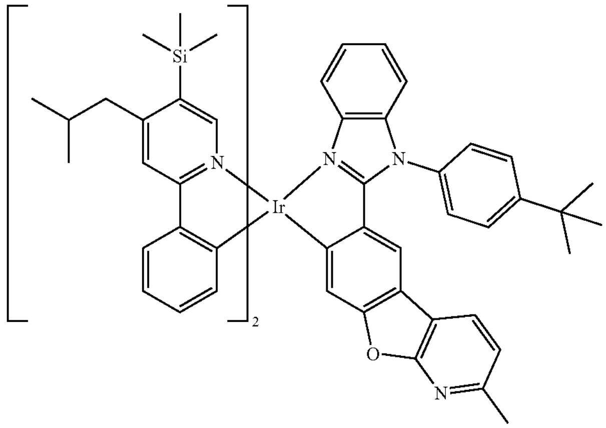
527
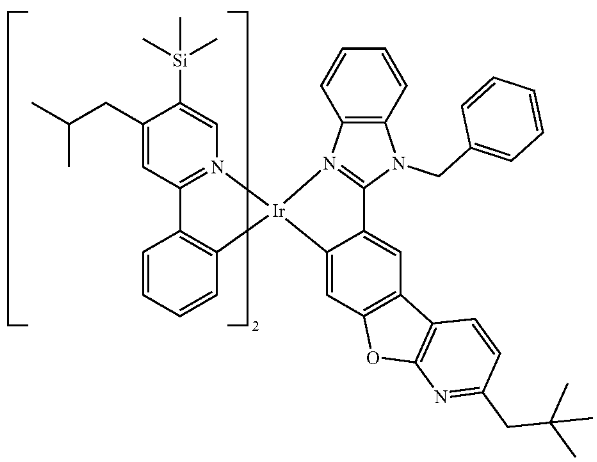
528
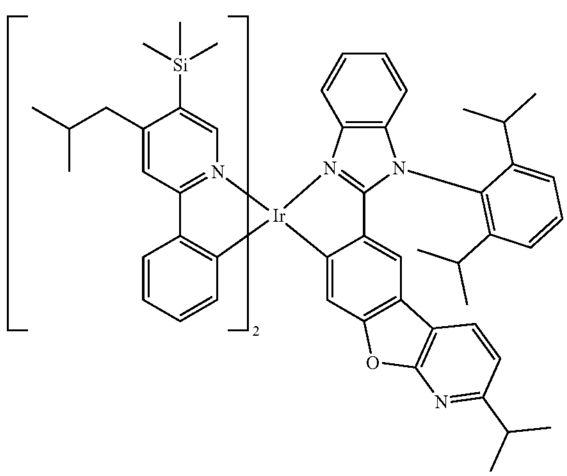

-continued
529
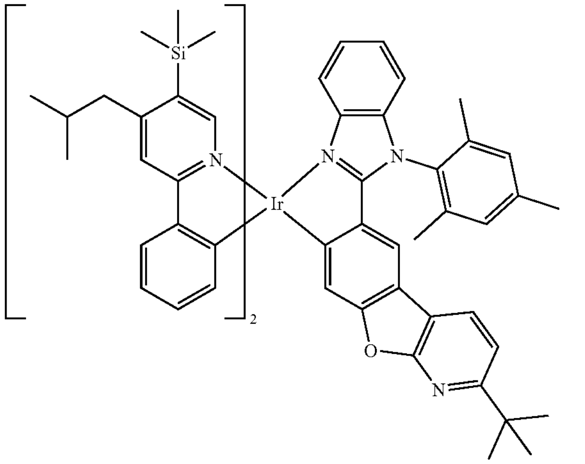
530
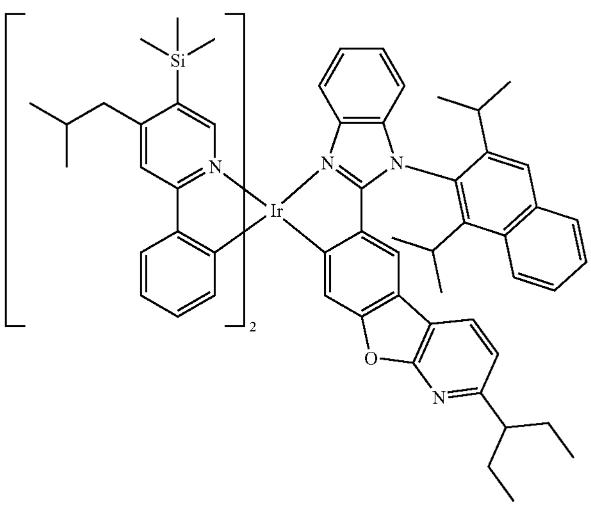
531
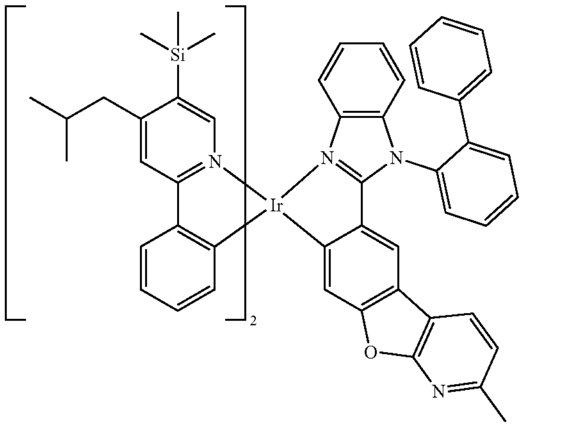

-continued
532
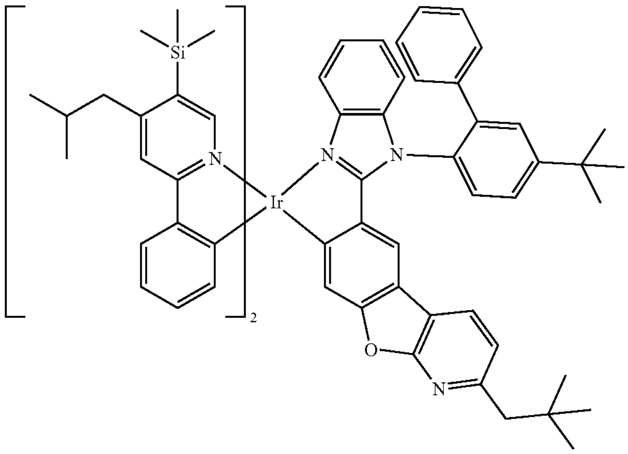
533
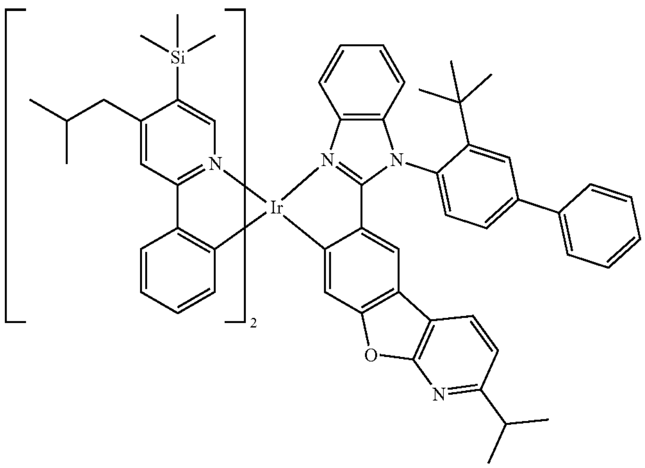
534
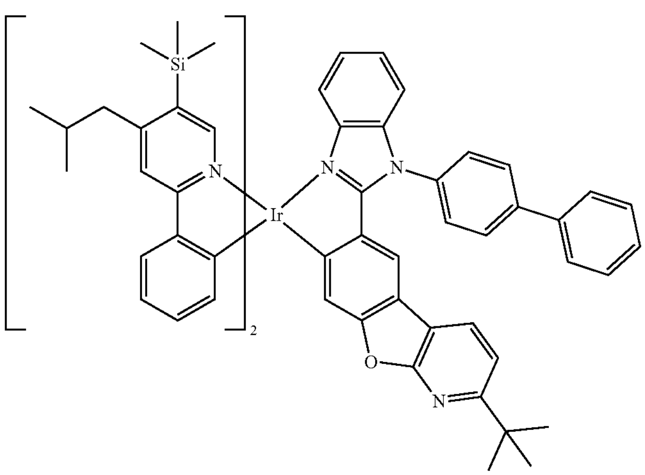

-continued
535
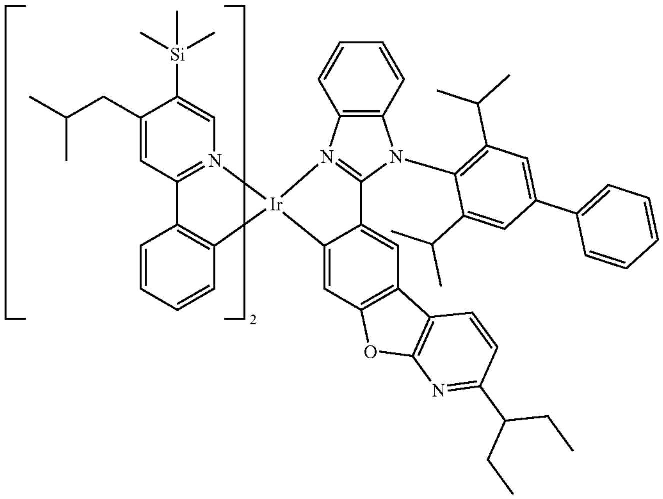
536
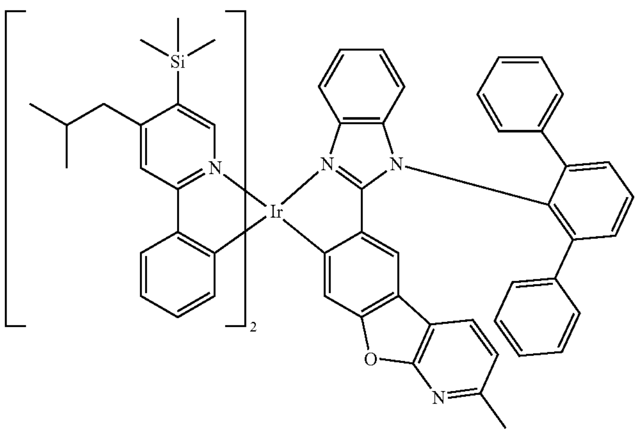
537
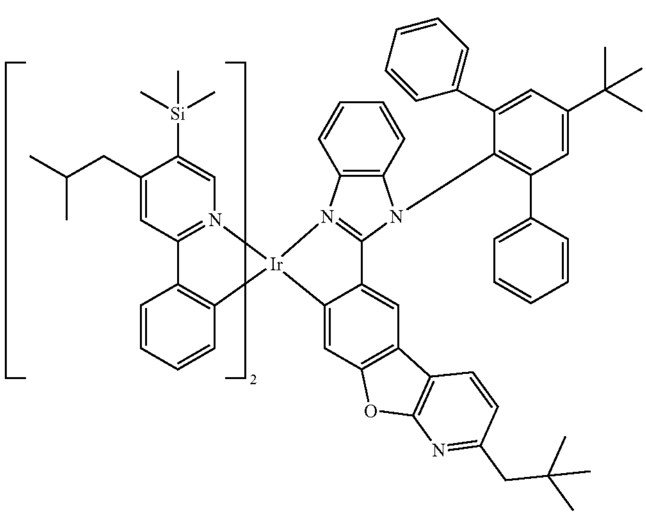

-continued
538
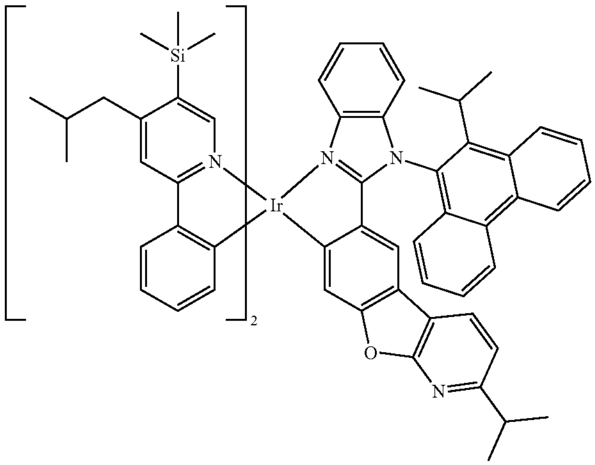
539
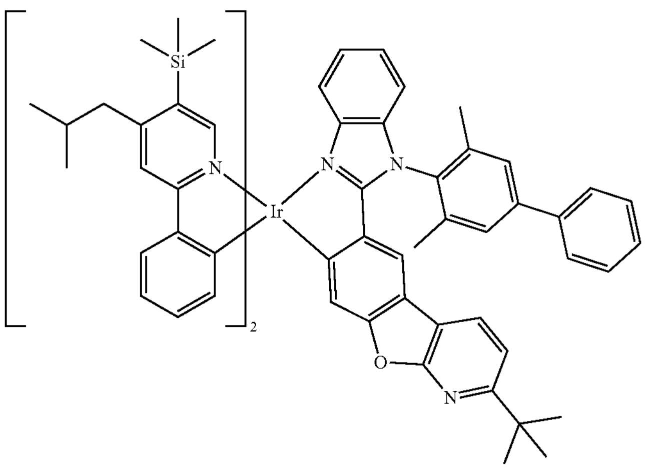
540
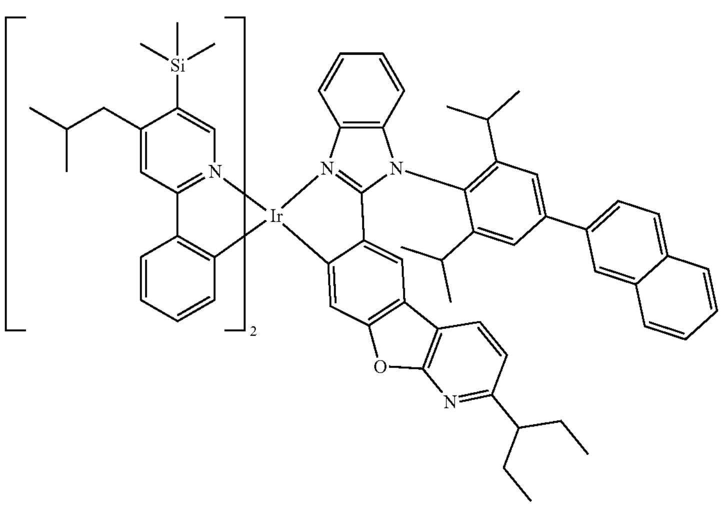

-continued
541
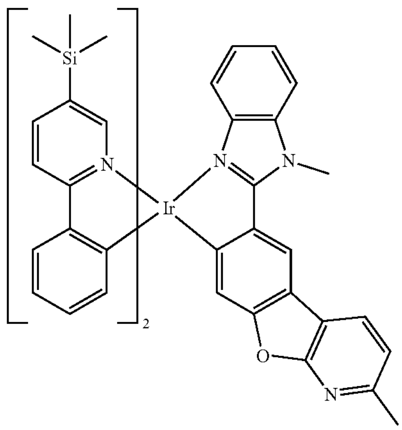
542
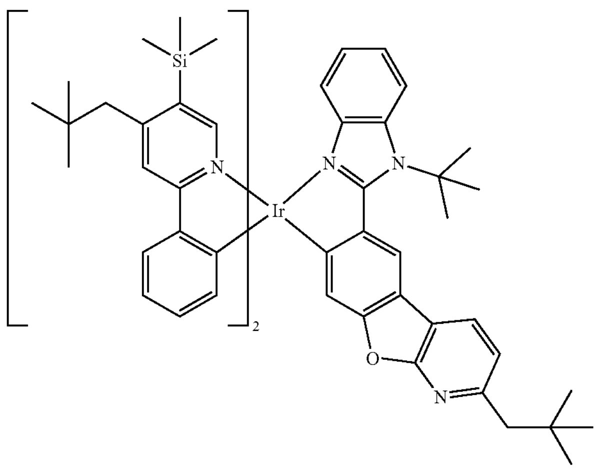
543
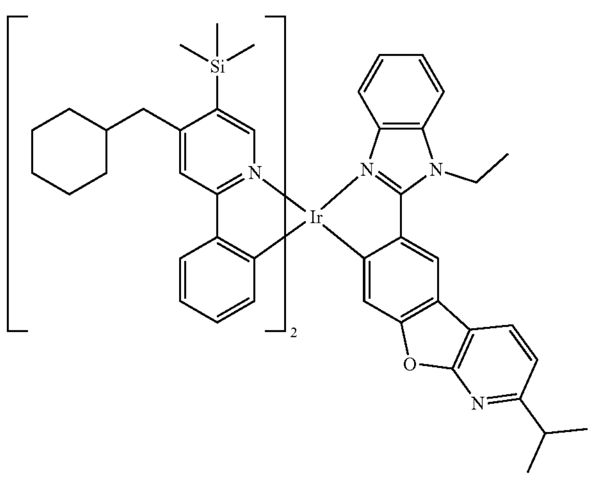

-continued
544
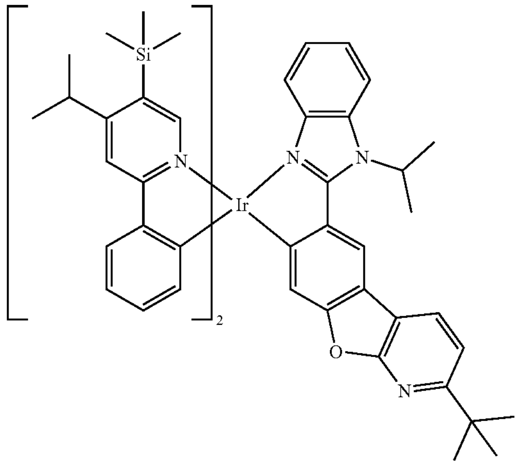
545
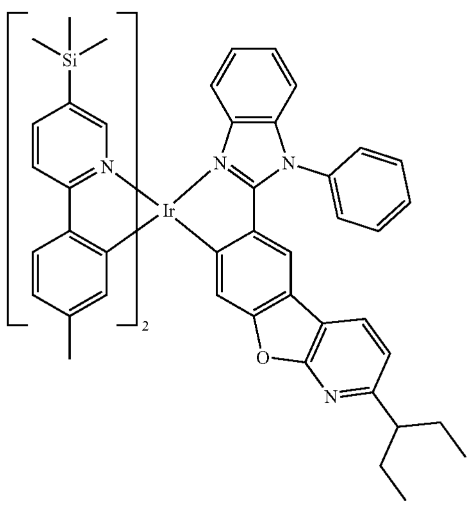
546
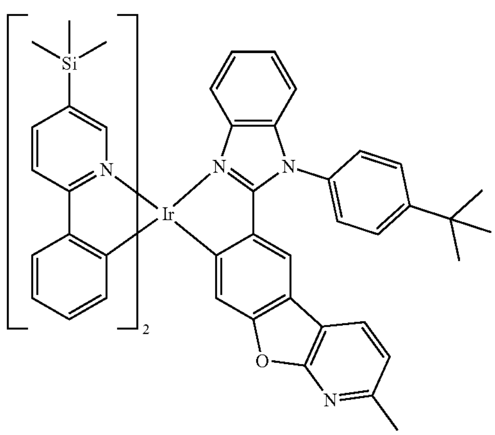

-continued
547
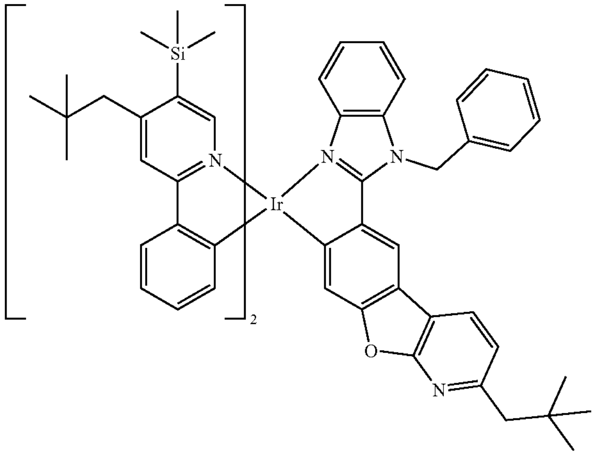
548
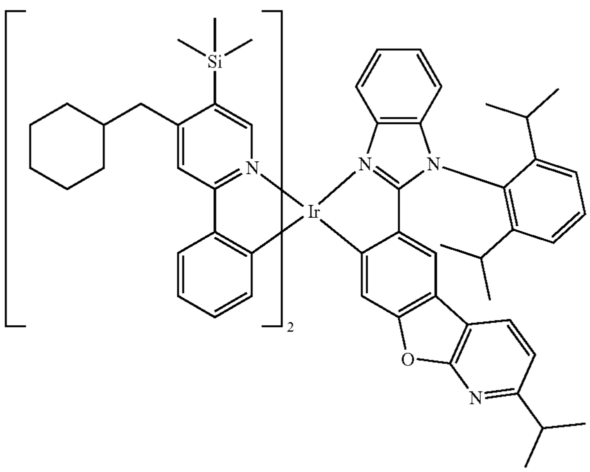
549
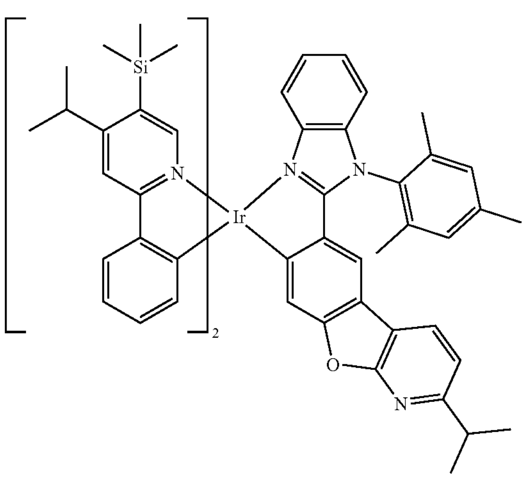

-continued
550
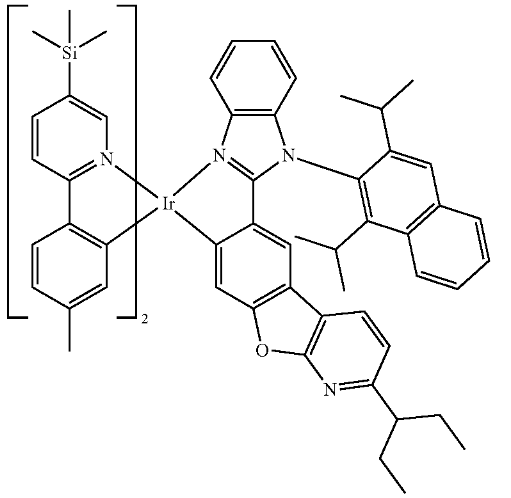
551
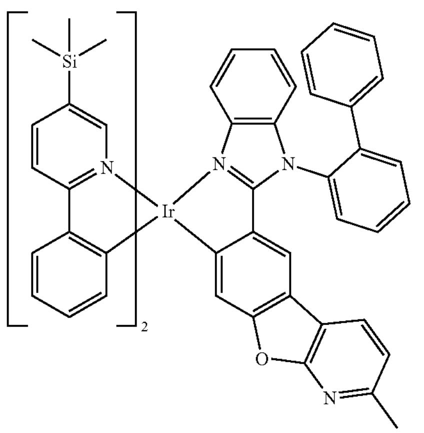
552
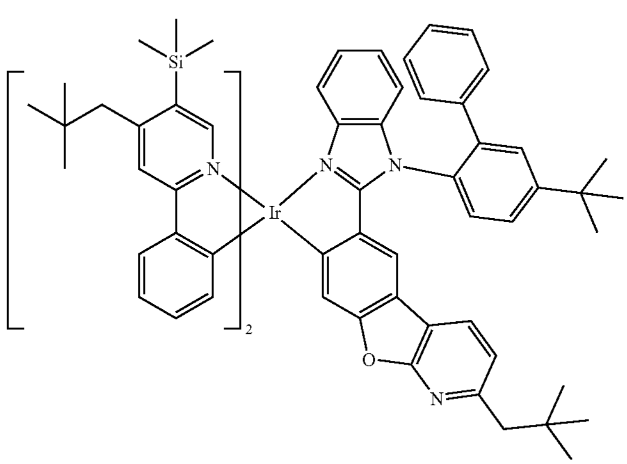

-continued
553
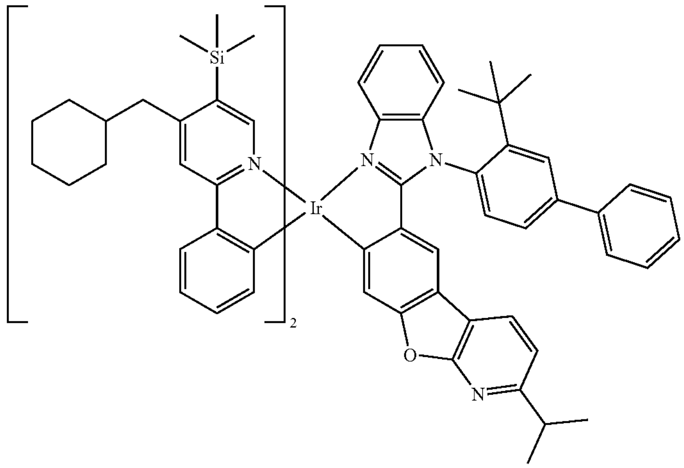
554
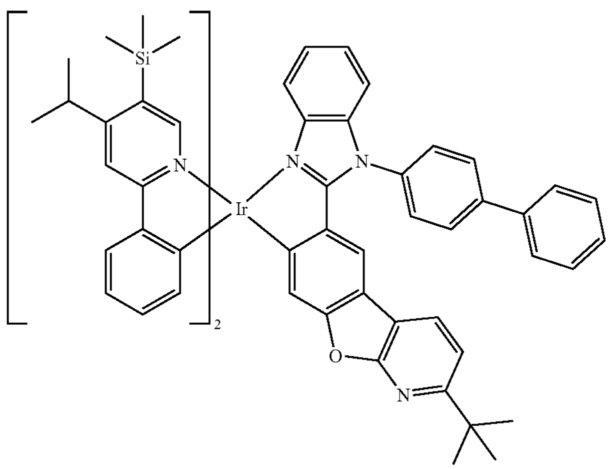
555
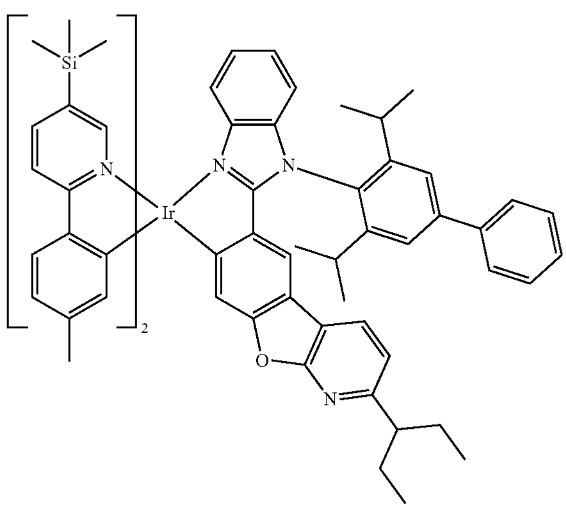

-continued
556
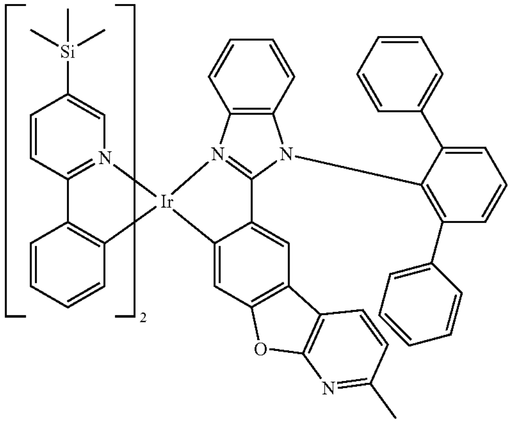
557
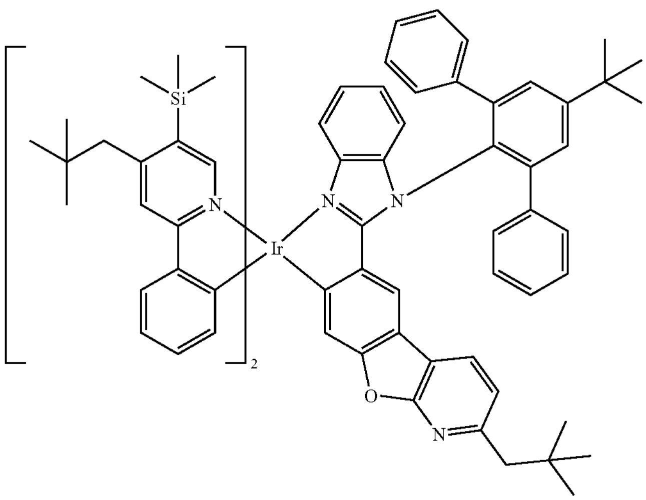
558
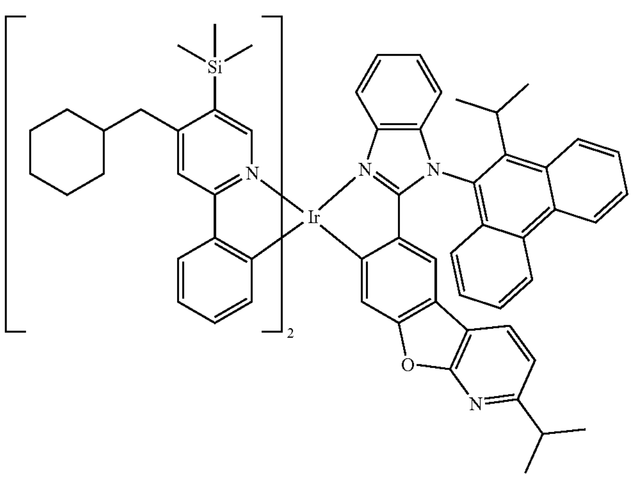

-continued
559
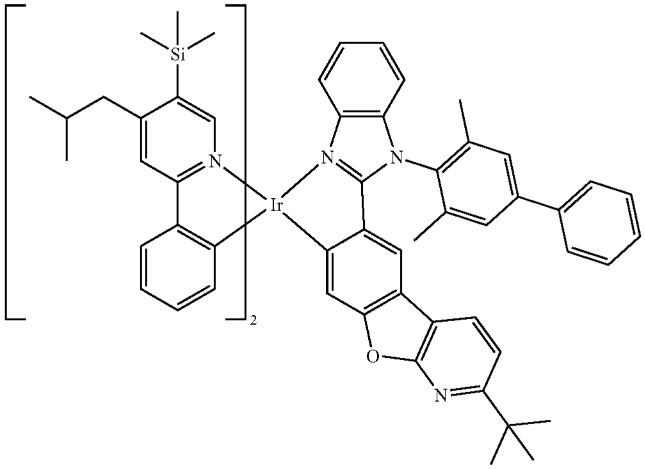
560
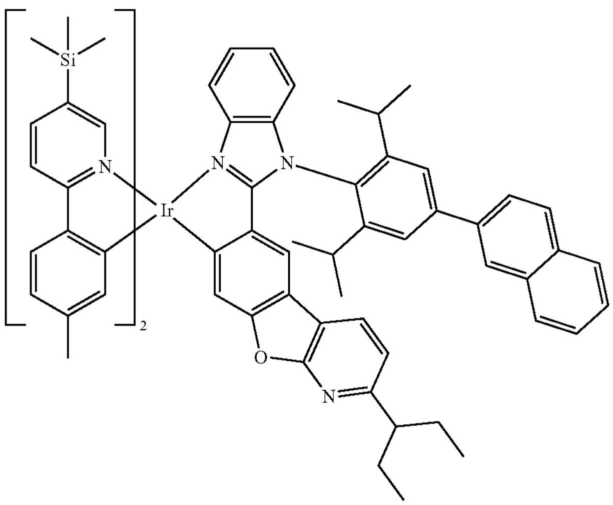
561
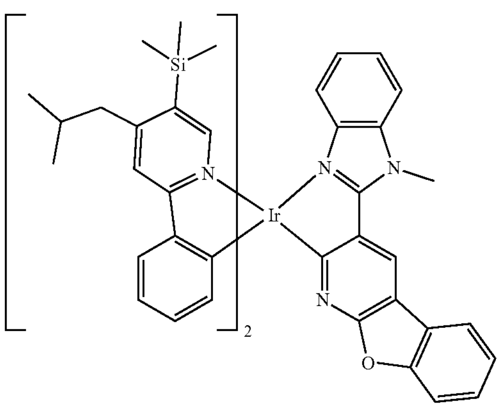

-continued
562
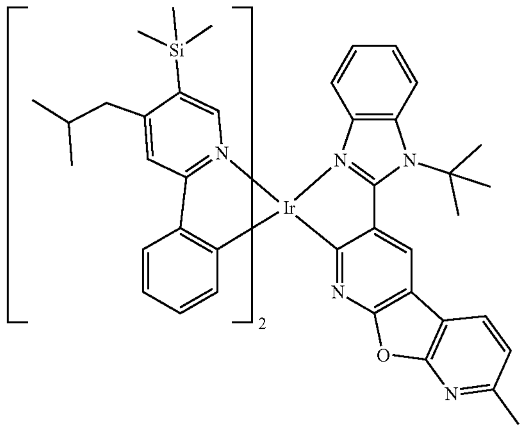
563
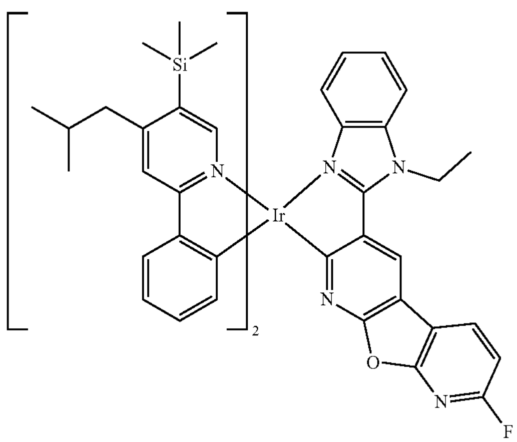
564
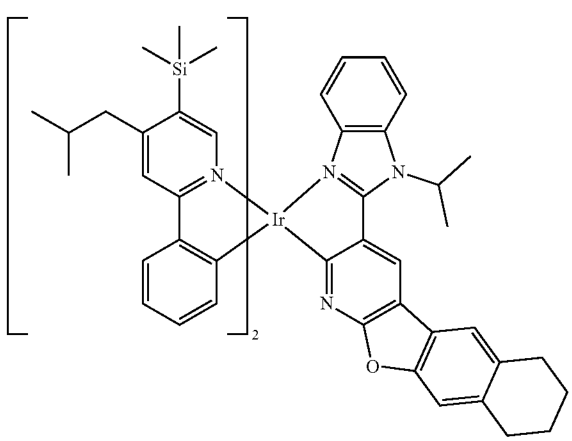

-continued
565
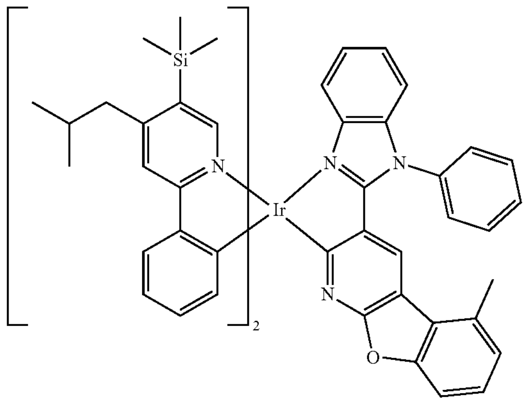
566
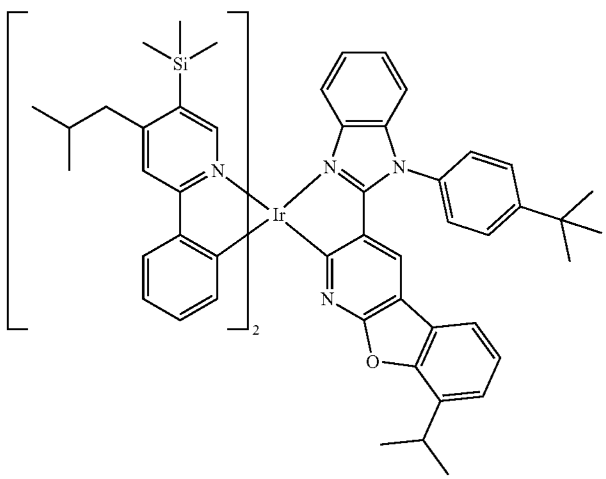
567
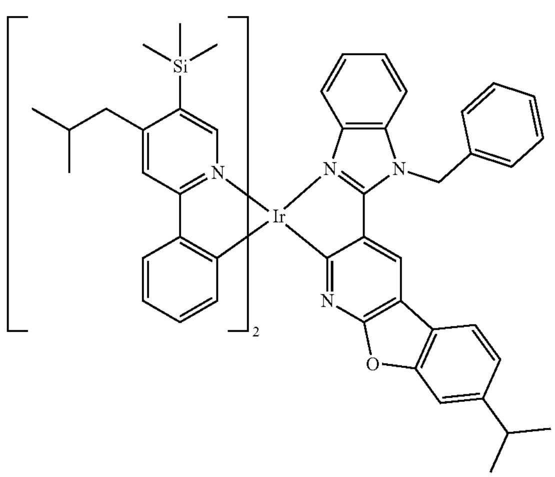

-continued
568
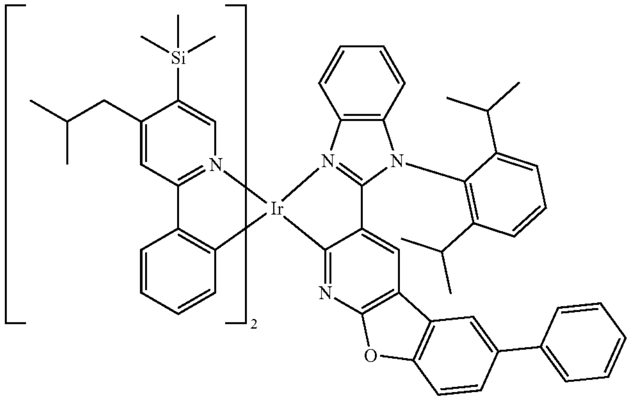
569
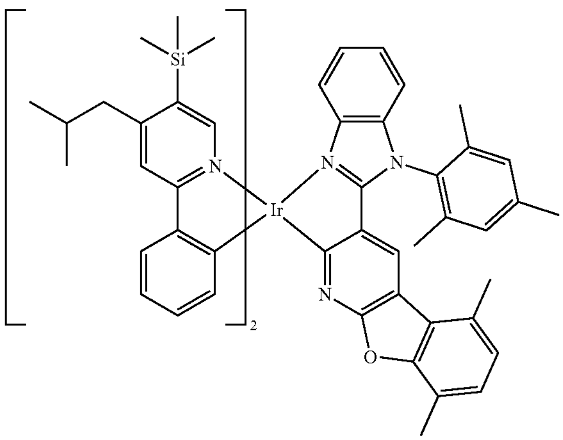
570
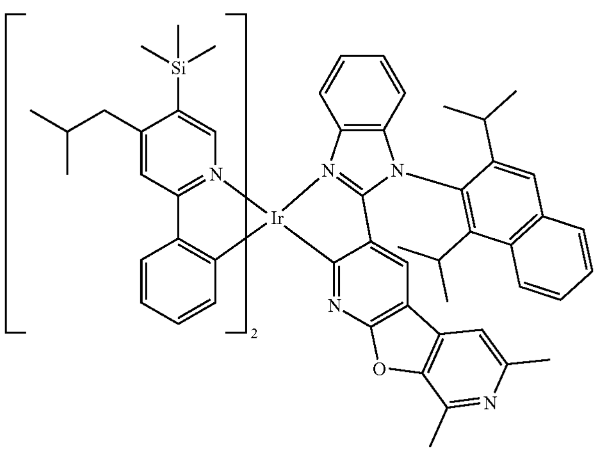

-continued
571
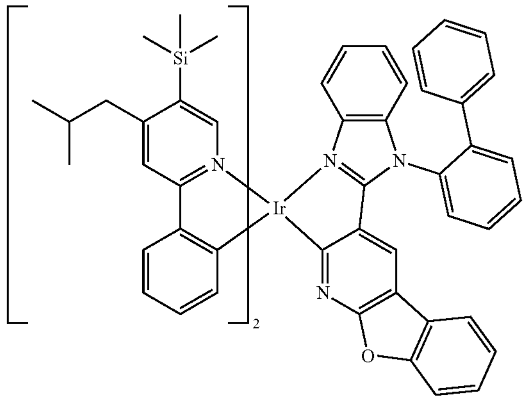
572
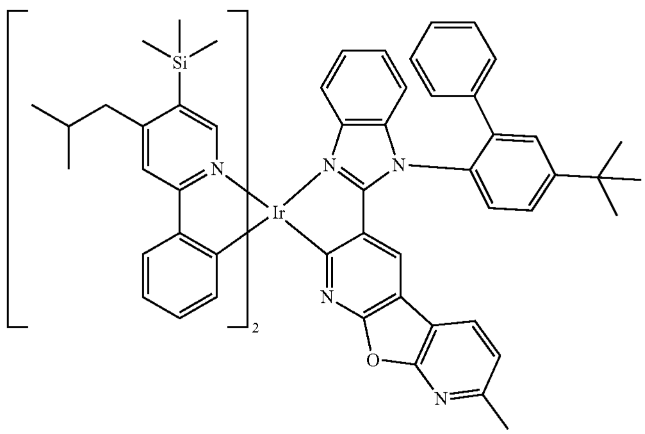
573
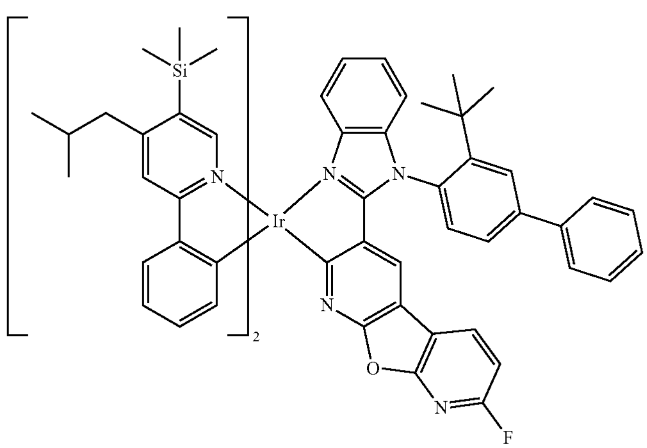

-continued
574
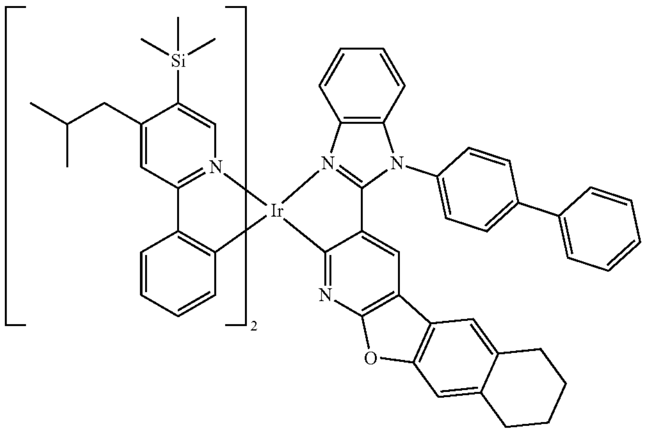
575
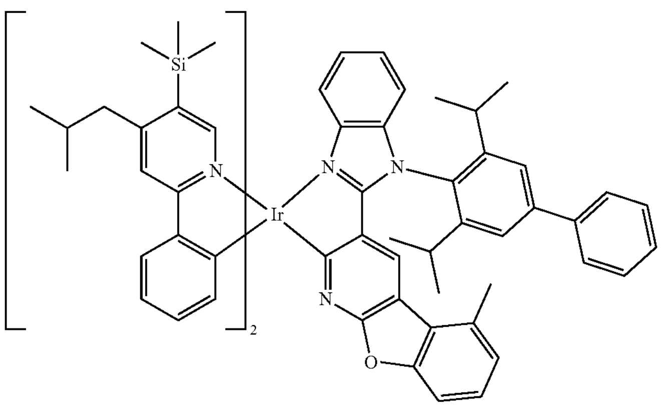
576
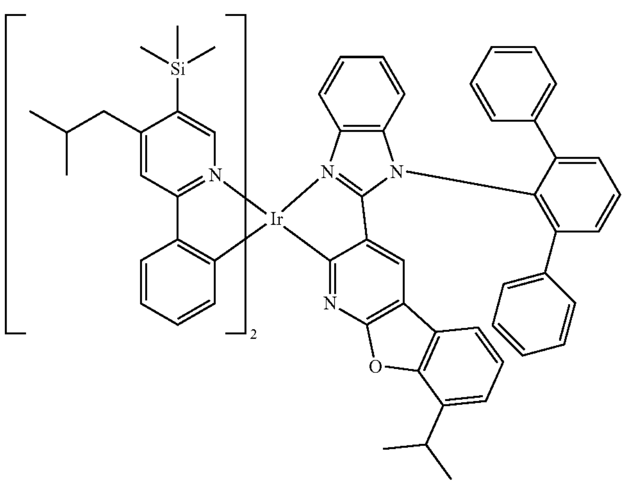

-continued
577
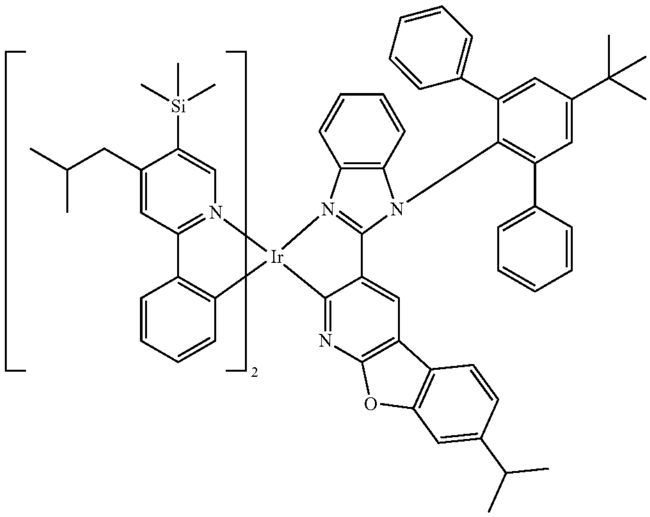
578
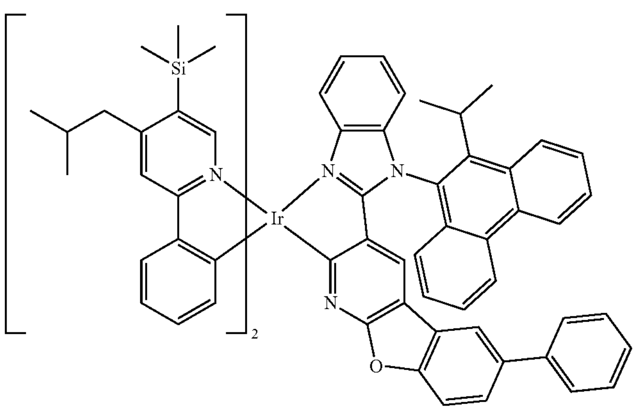
579
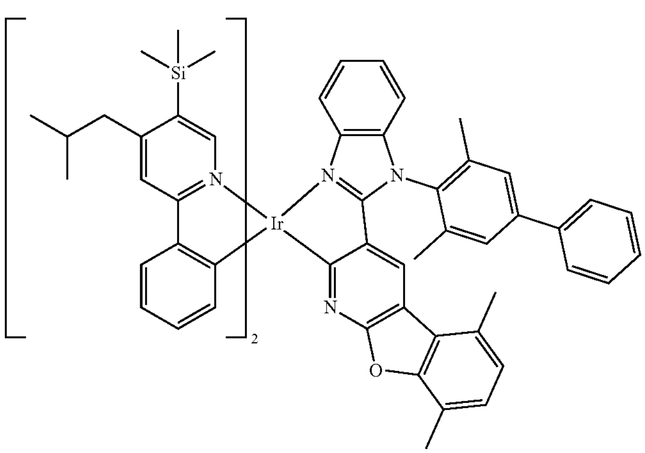

-continued
580
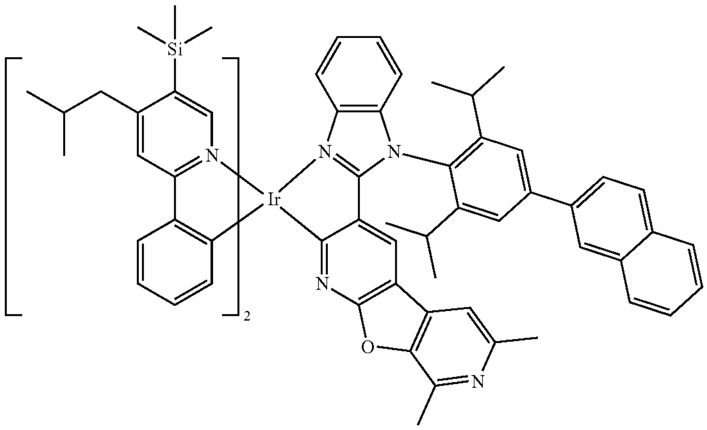
581
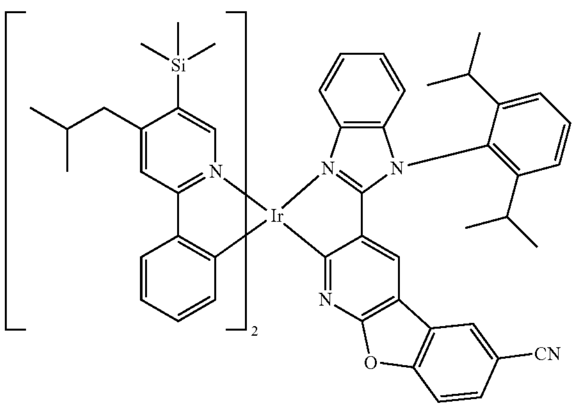
582
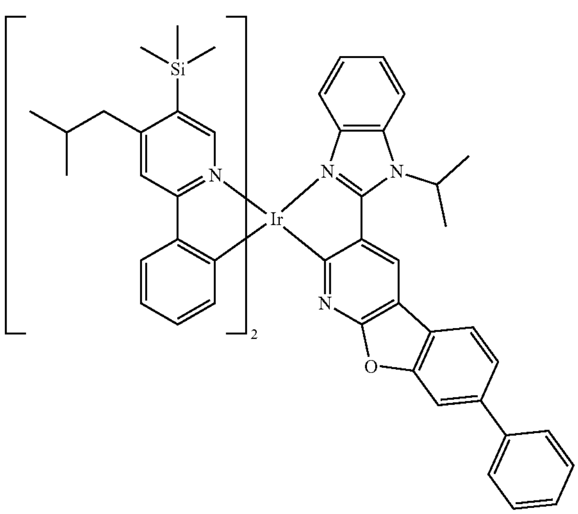

-continued
583
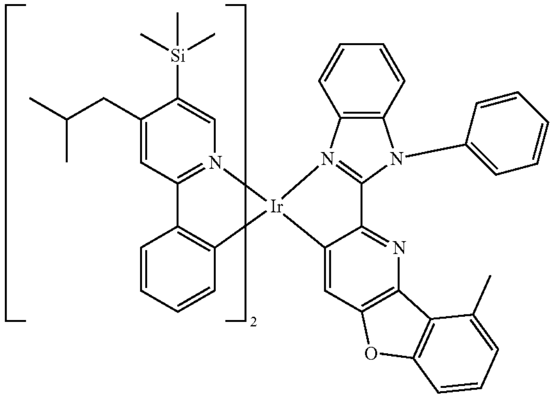
584
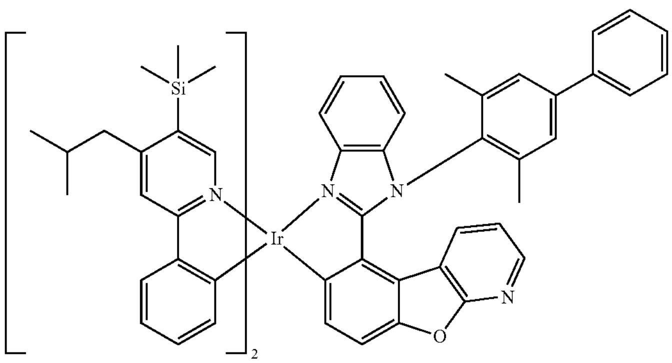
585
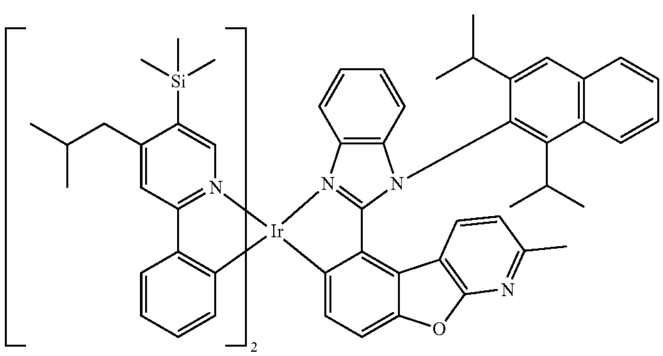
586
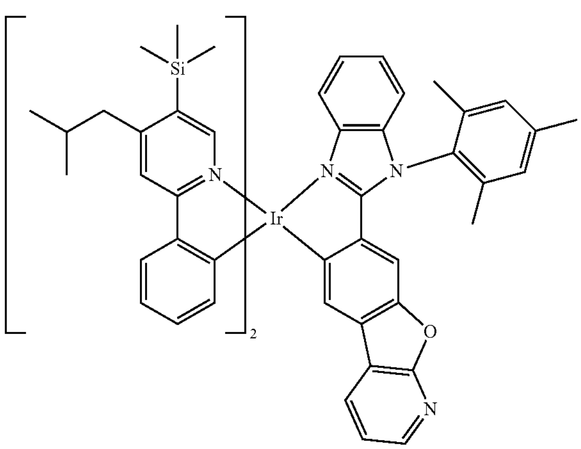

-continued
587
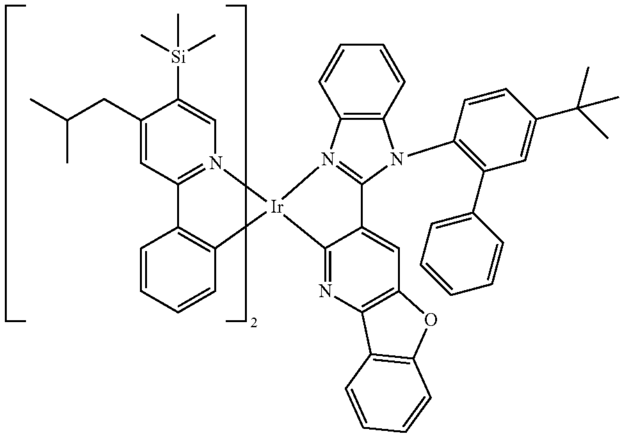
588
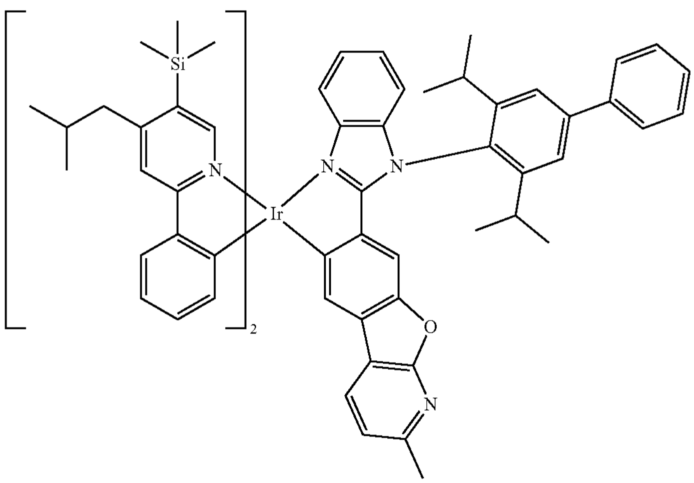
589
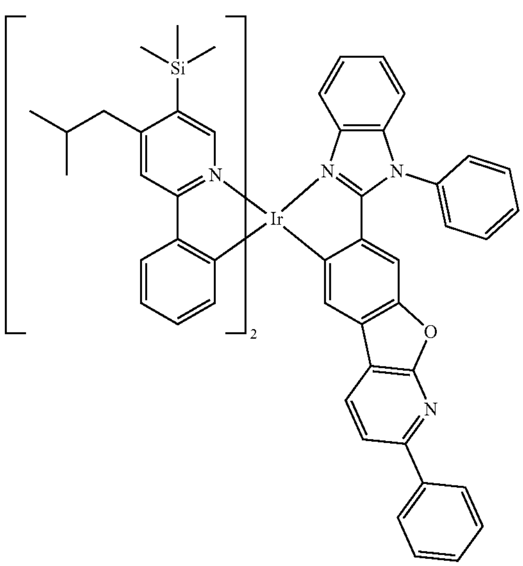

-continued
590
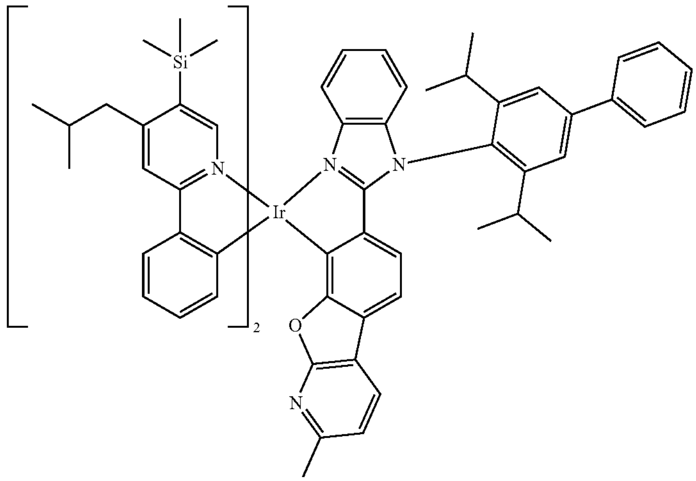
591
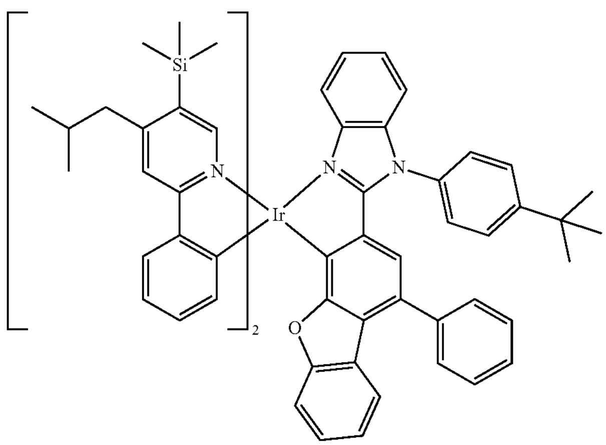
592
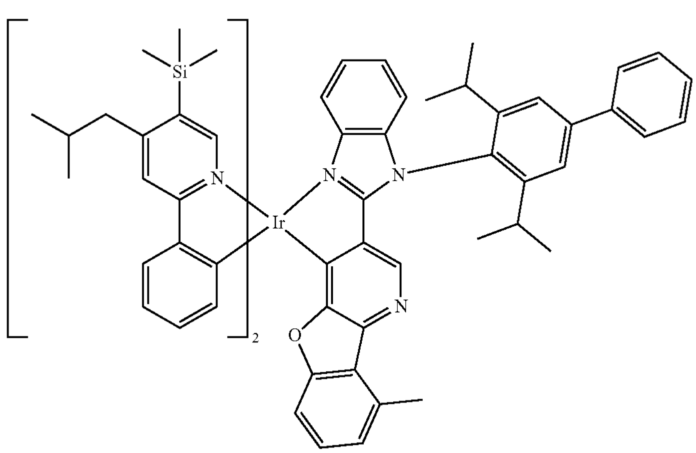

-continued
593
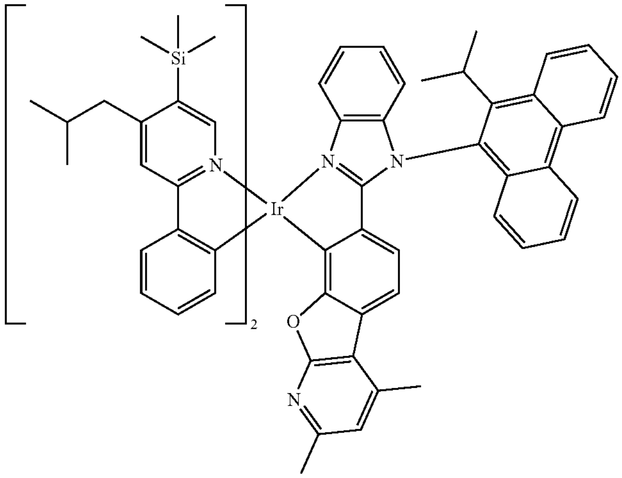
594
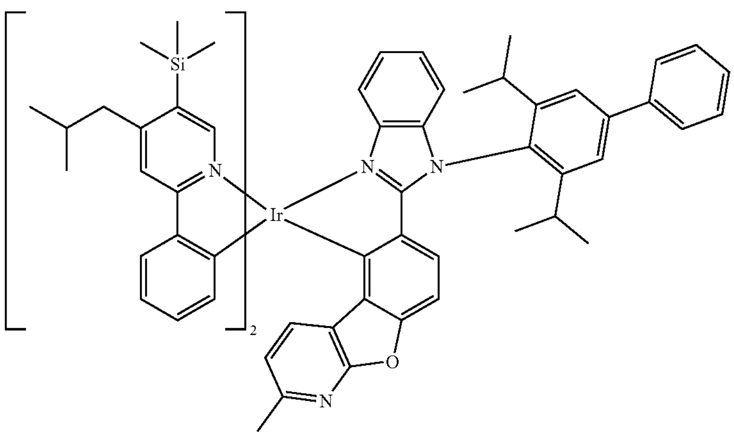
595
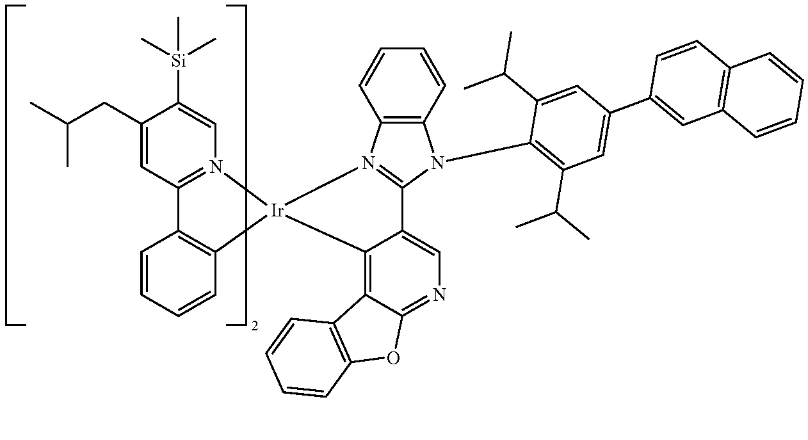

-continued
596
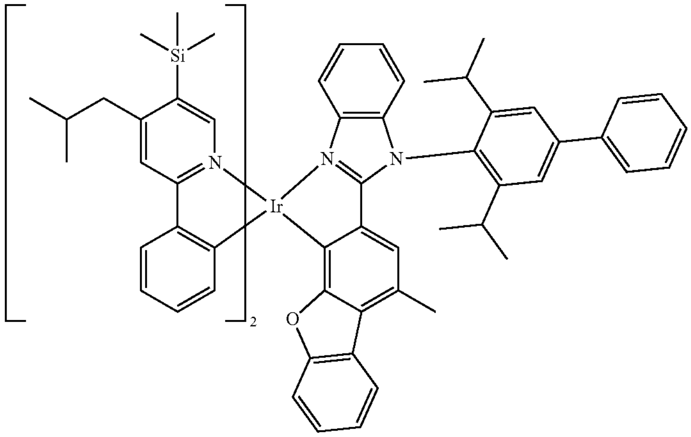
597
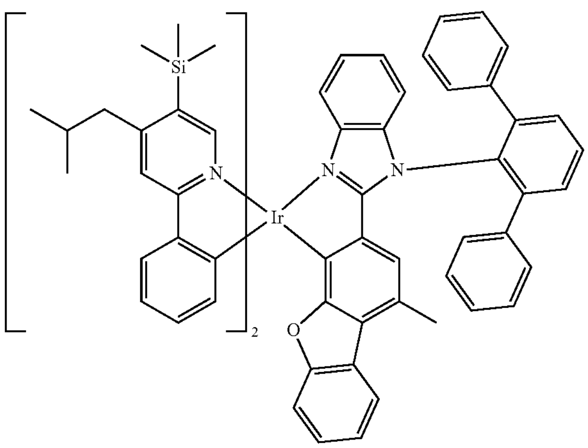
598
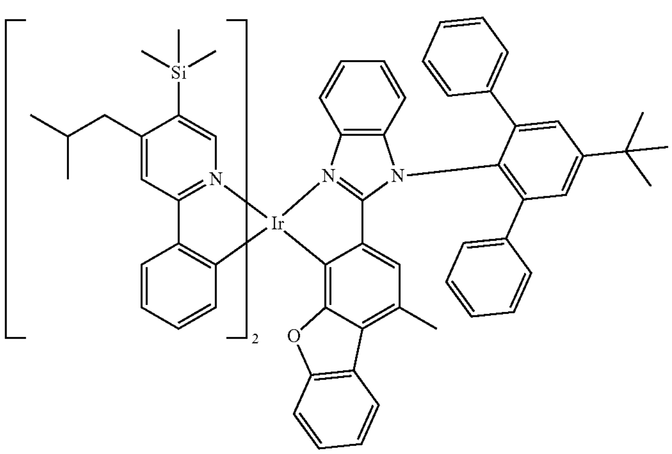

-continued
599
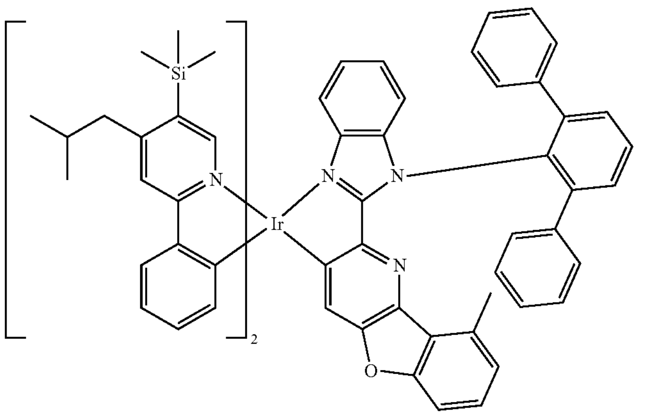
600
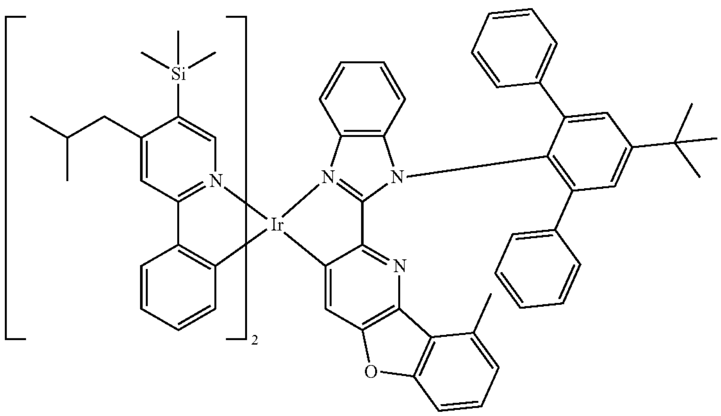
601
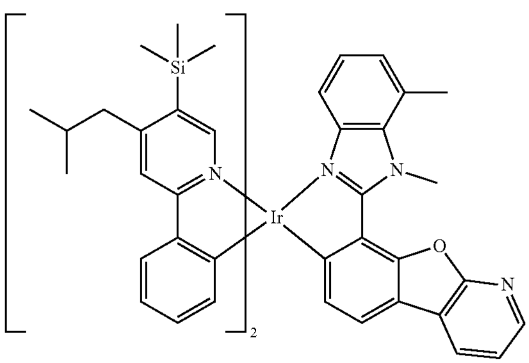
602
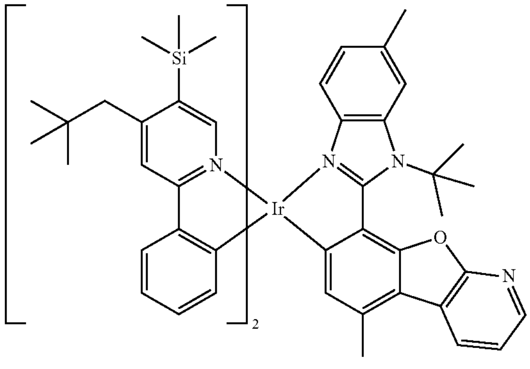

-continued
603
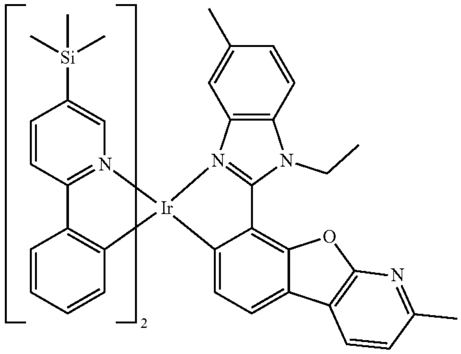
604
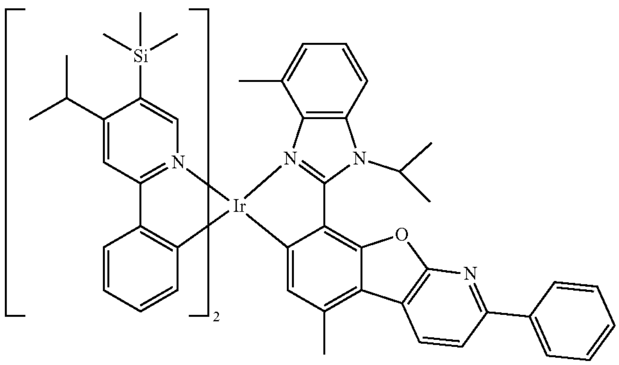
605
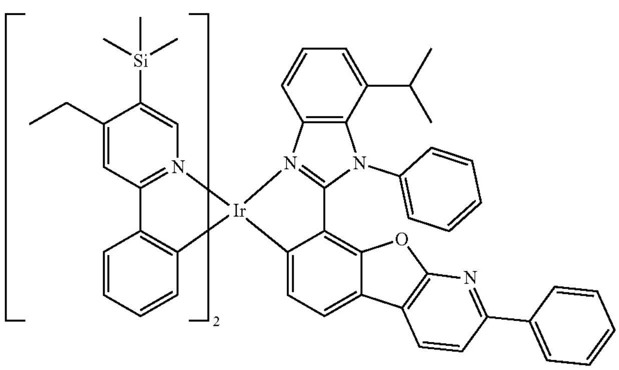
606
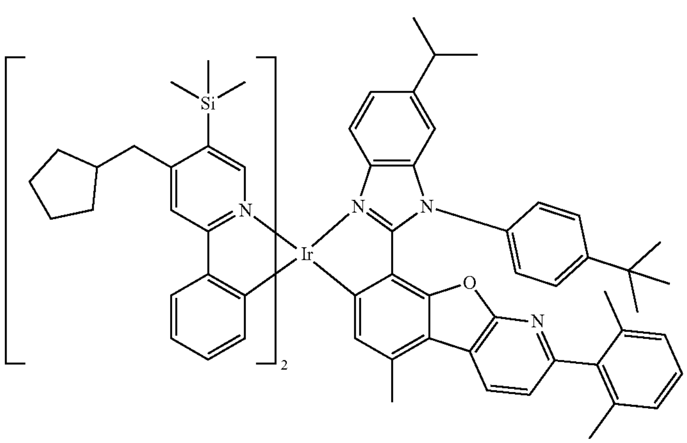

-continued
607
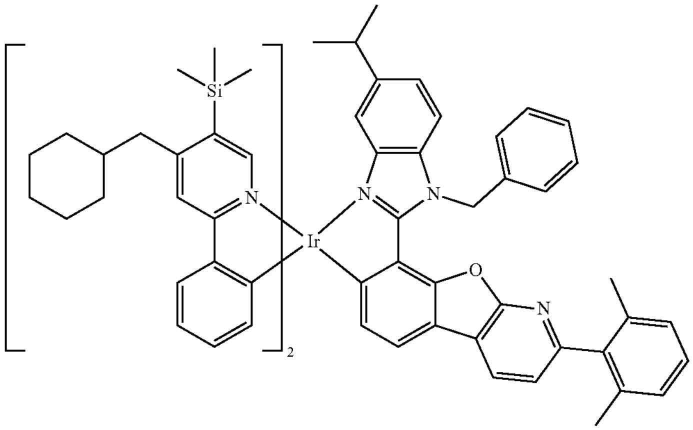
608
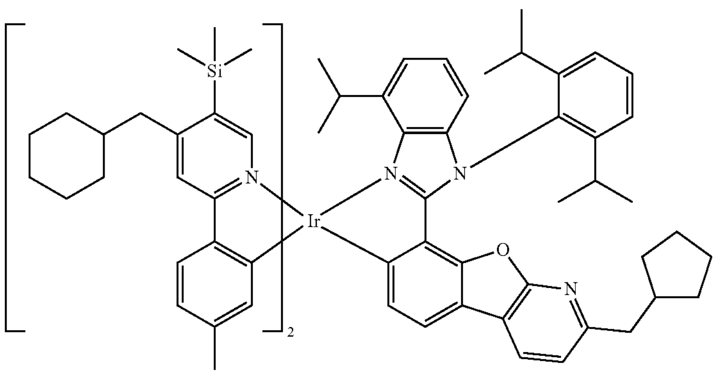
609
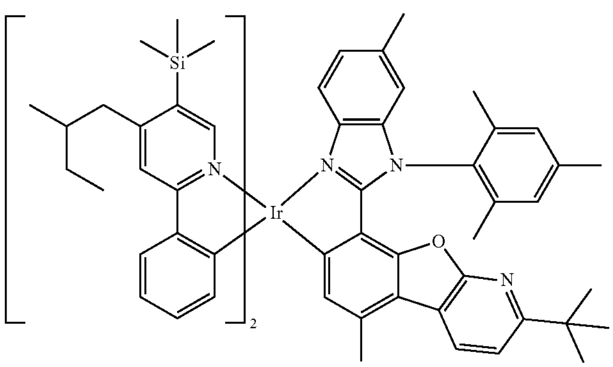
610
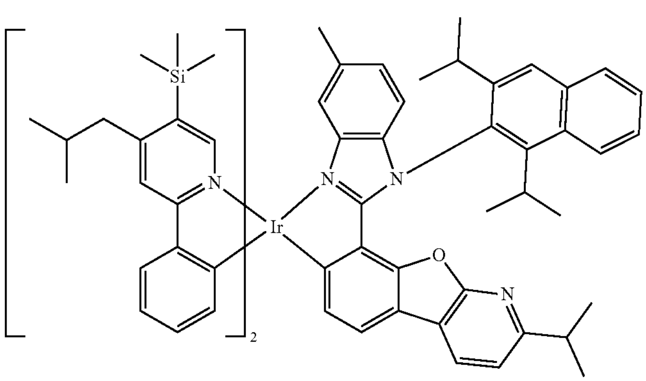

-continued
611
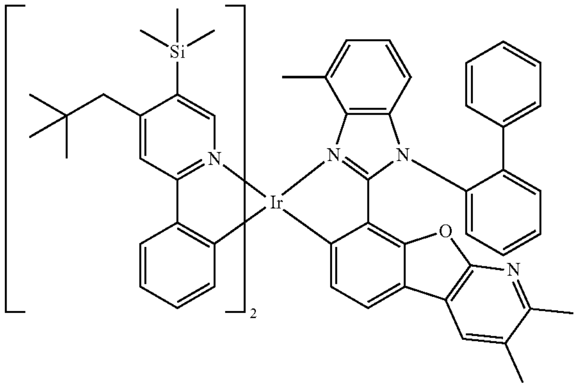
612
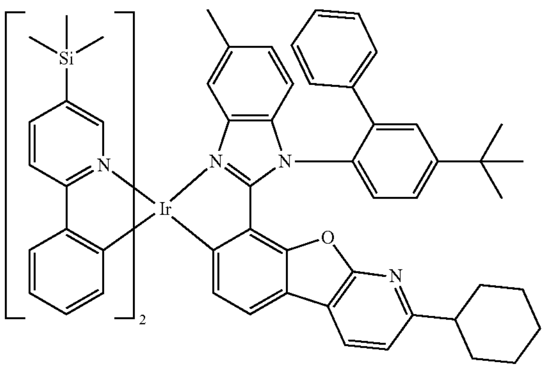
613
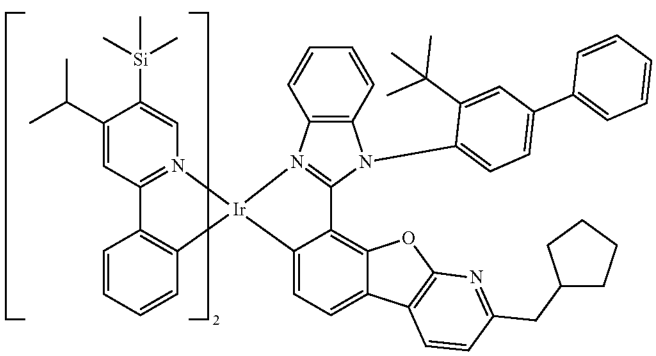
614
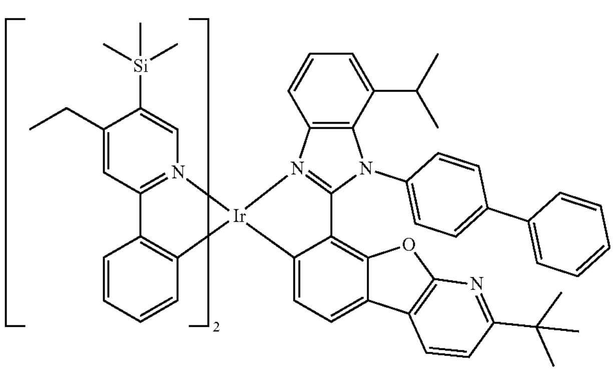

-continued
615
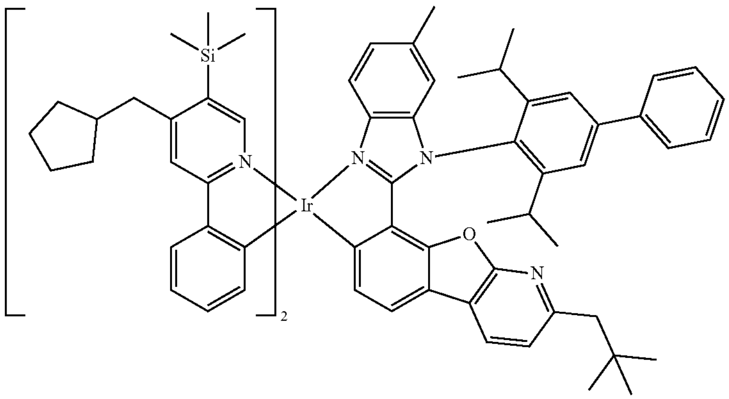
616
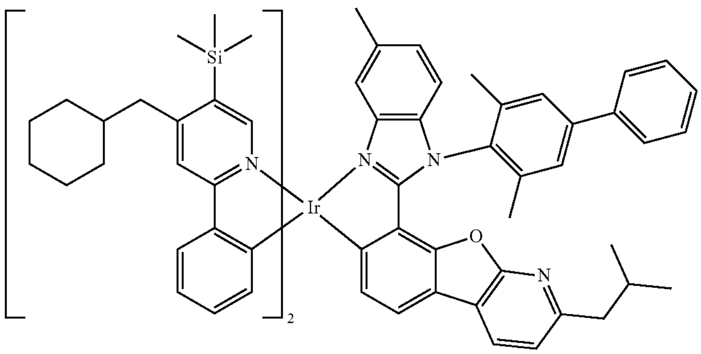
617
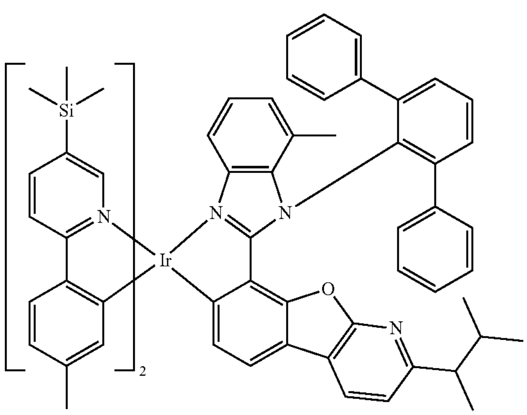
618
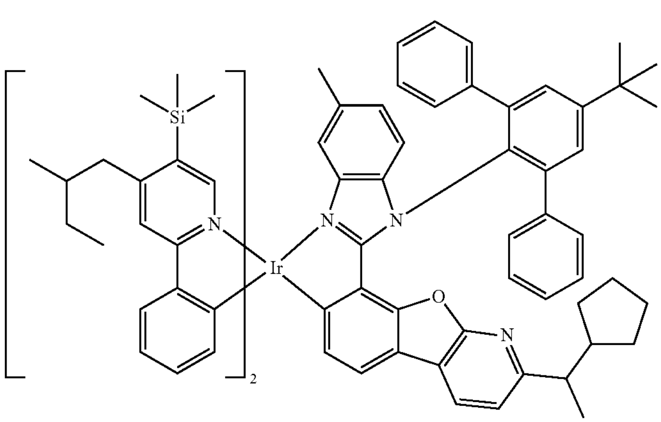

-continued
619
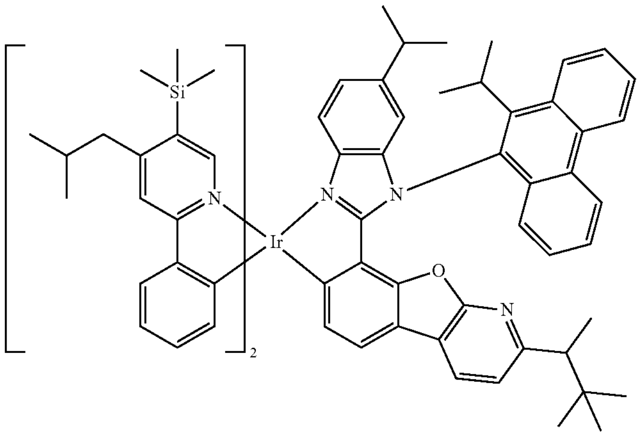
620
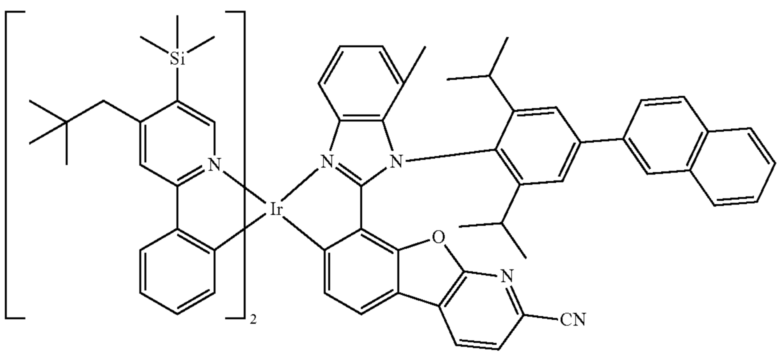
621
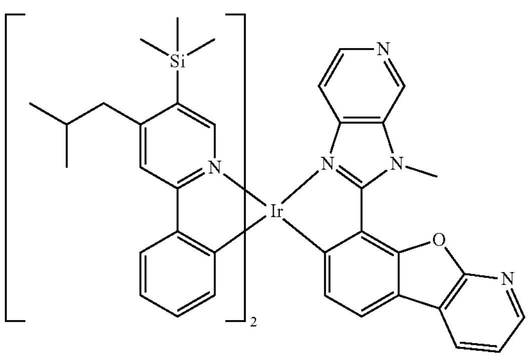
622
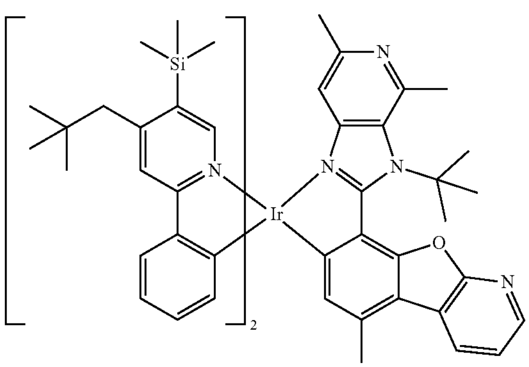

-continued
623
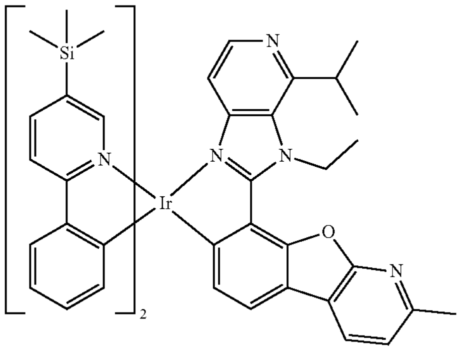
624
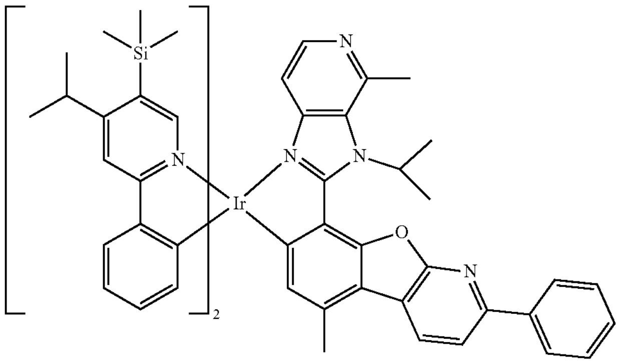
625
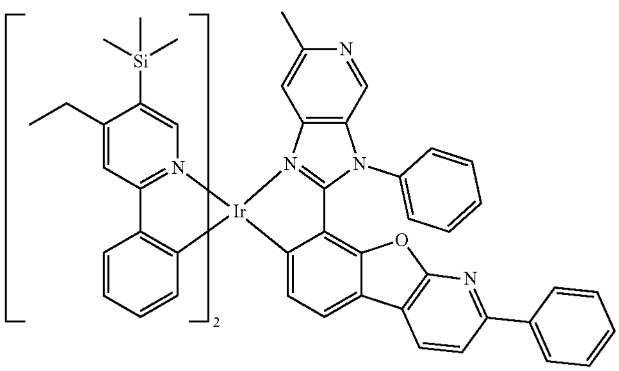
626
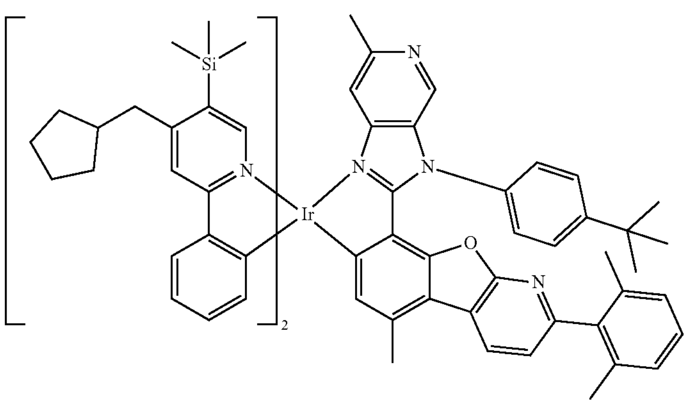

-continued
627
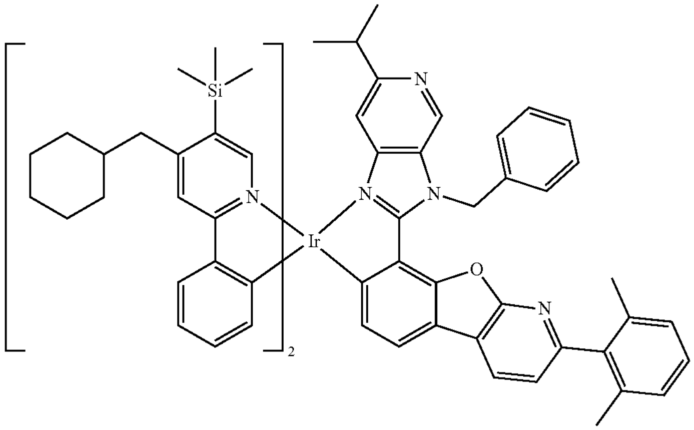
628
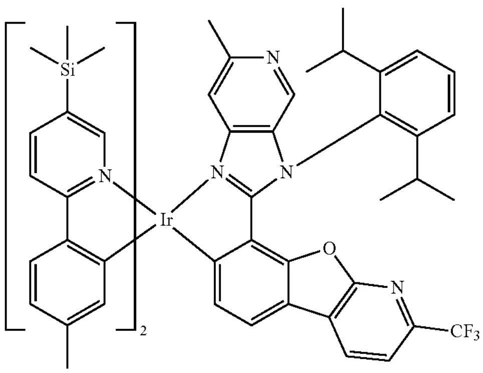
629
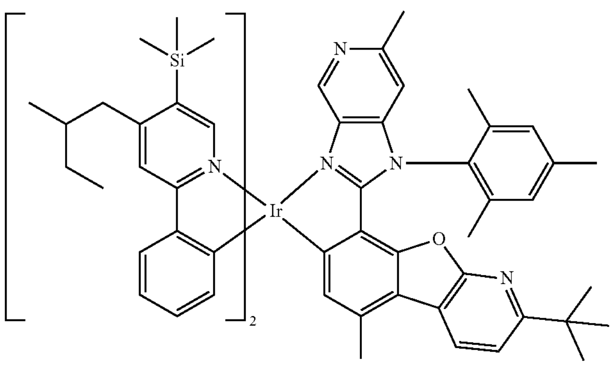
630
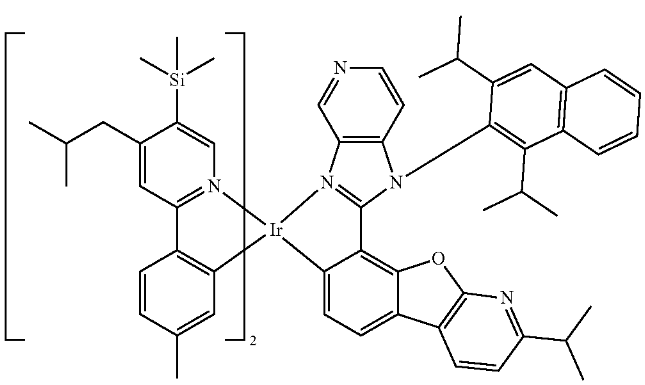

-continued
631
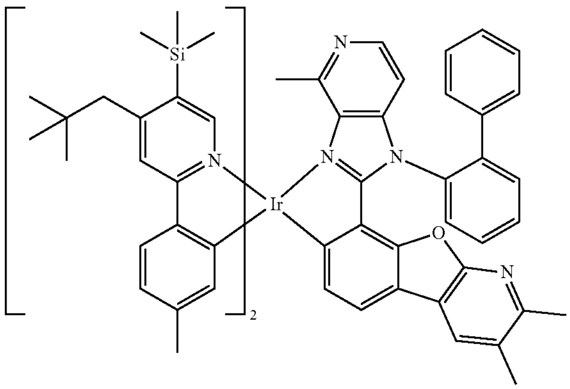
632
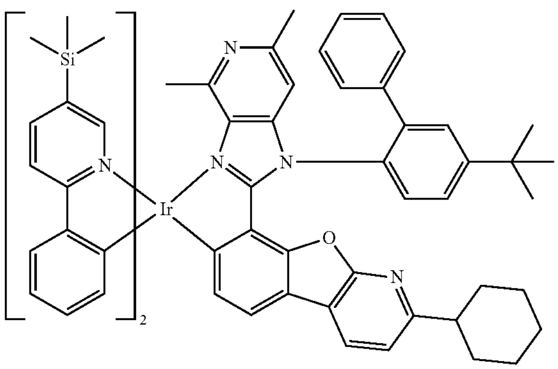
633
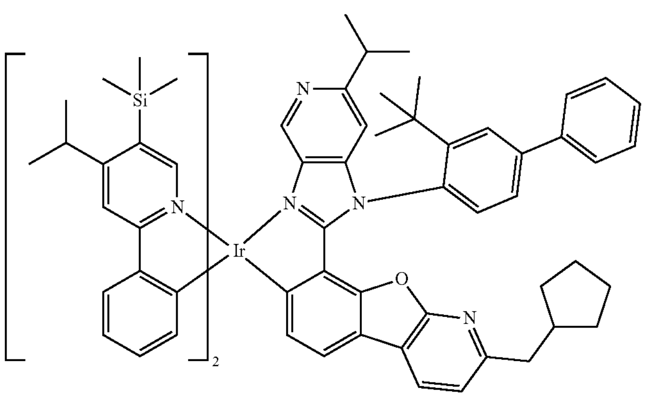
634
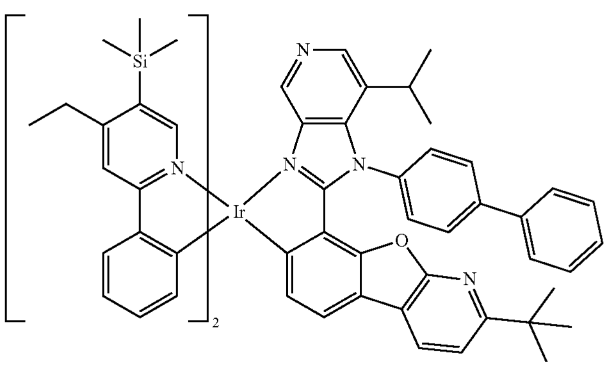

-continued
635
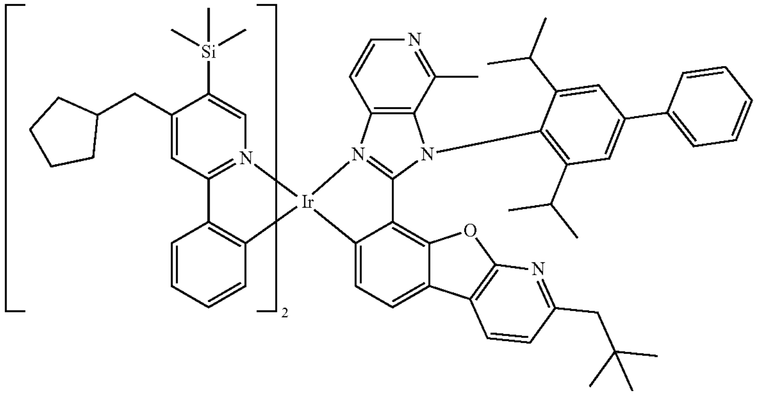
636
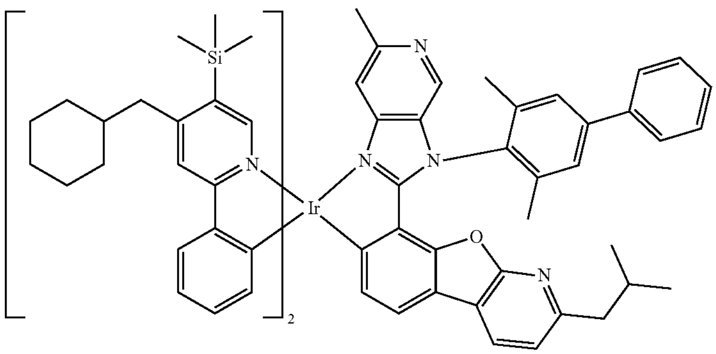
637
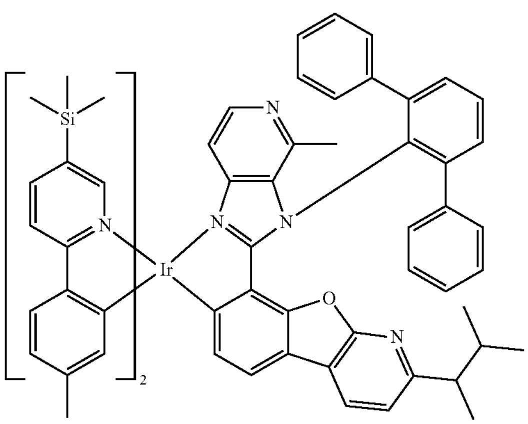
638
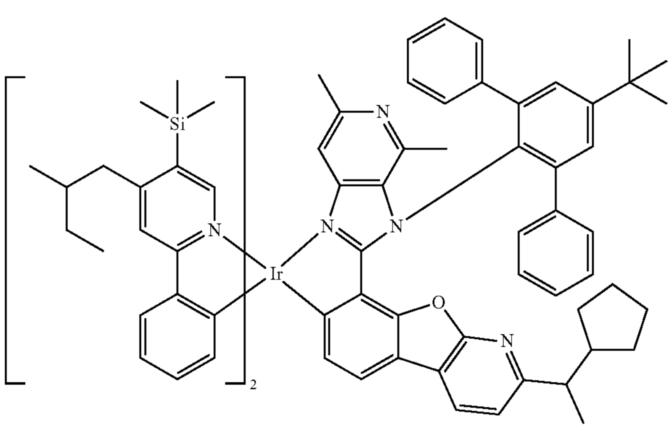

-continued
639
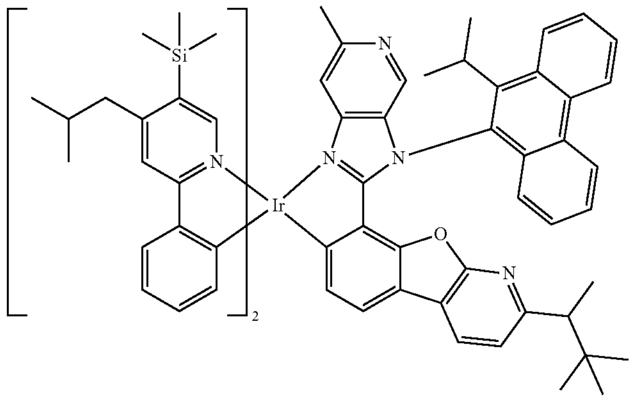
640
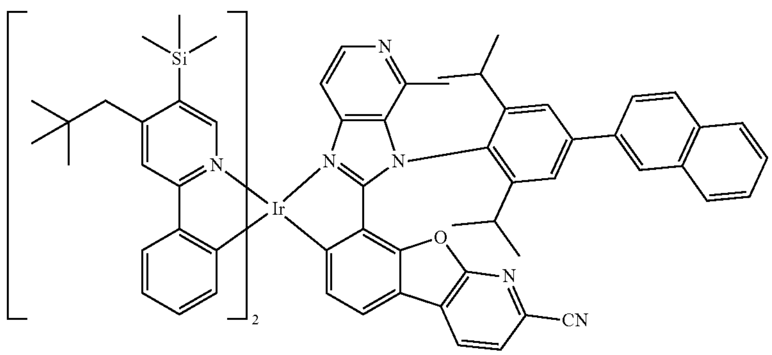
641
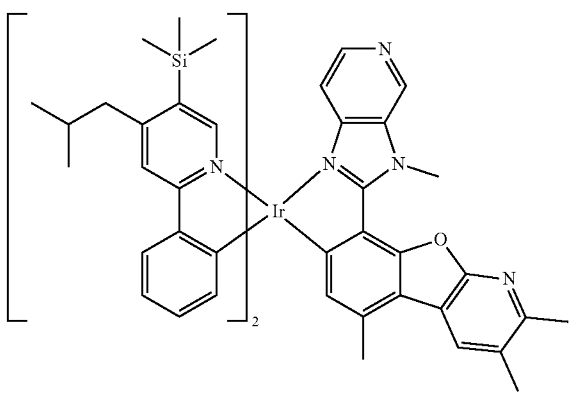
642
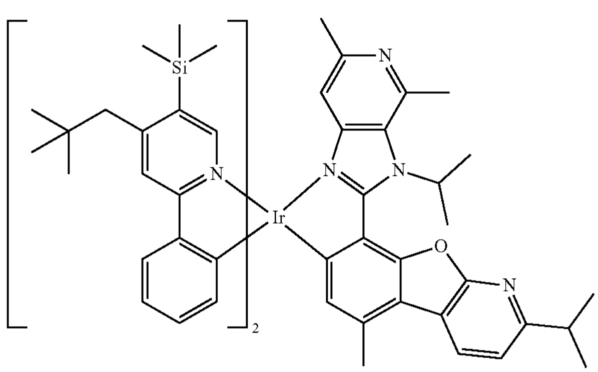

-continued
643
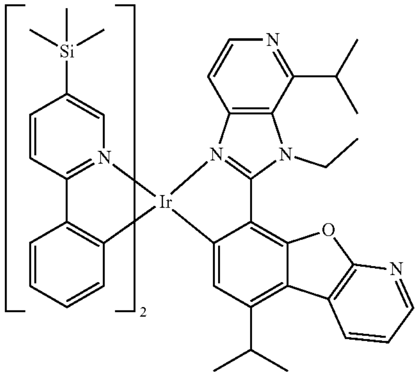
644
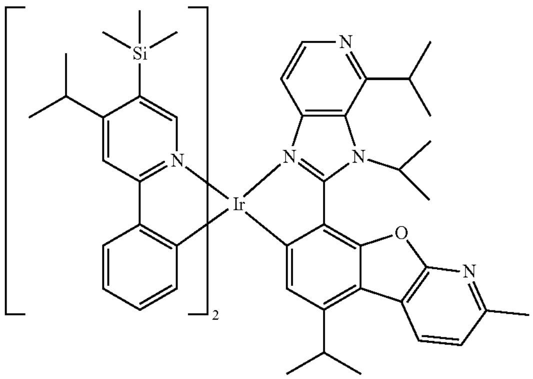
645
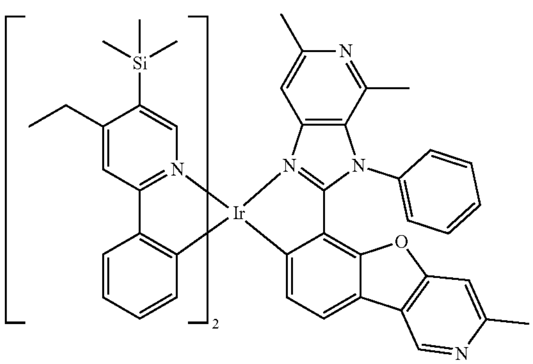
646
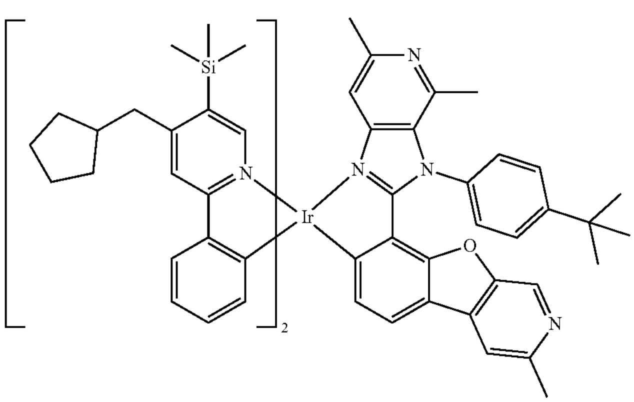

-continued
647
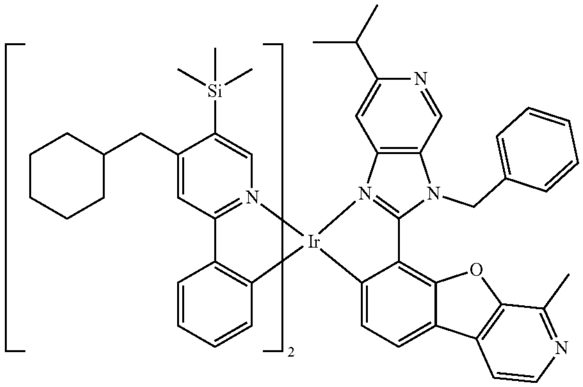
648
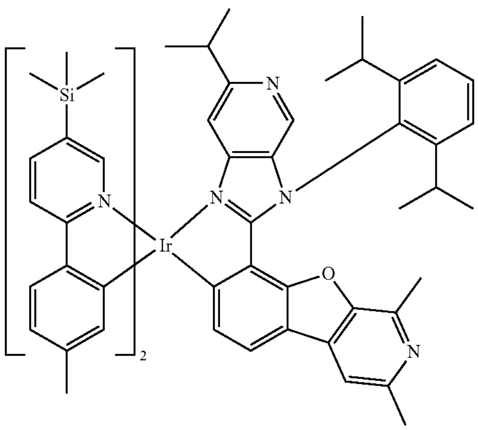
649
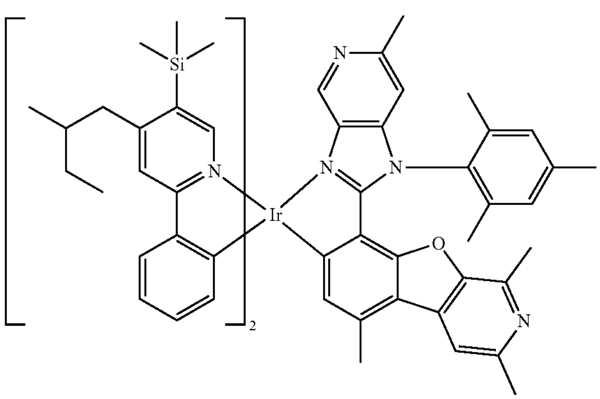
650
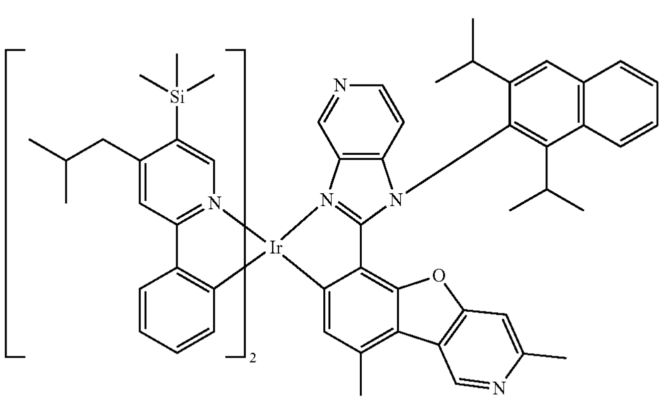

-continued
651
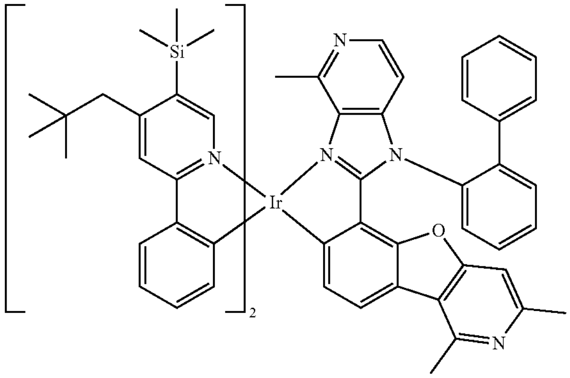
652
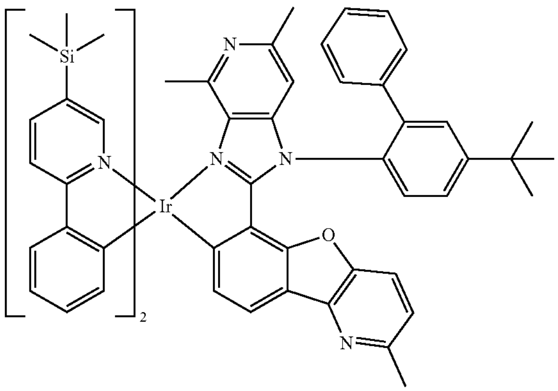
653
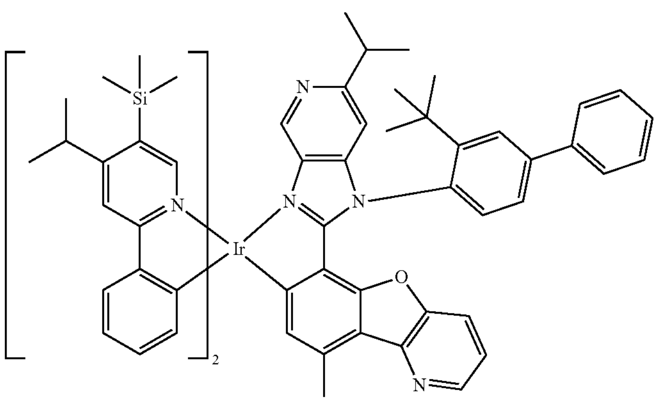
654
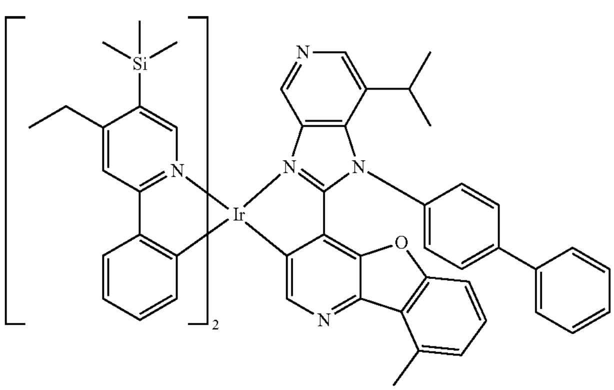

-continued
655
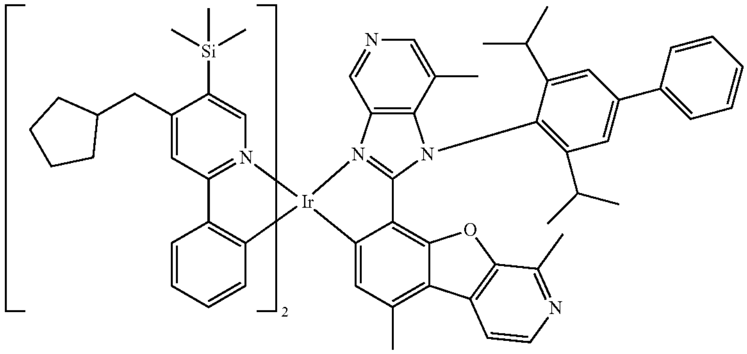
656
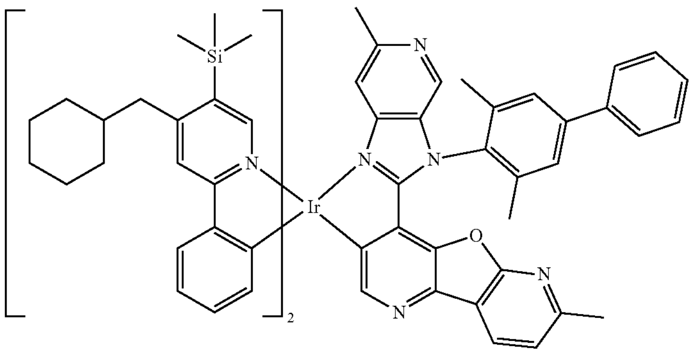
657
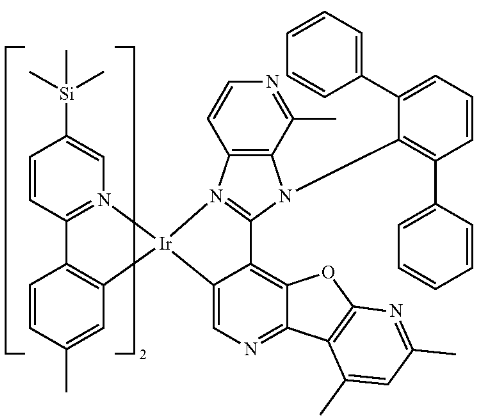
658
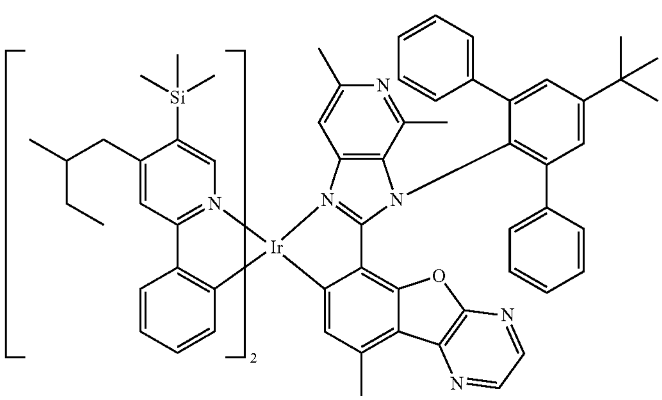

-continued
659
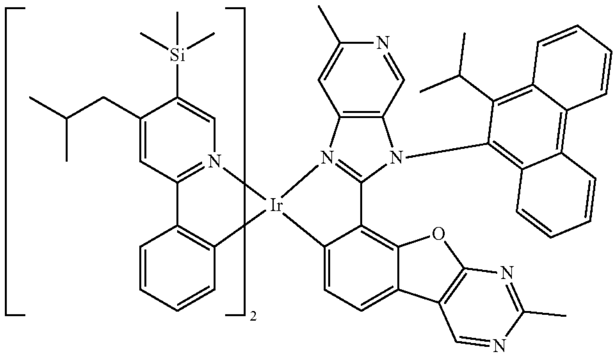
660
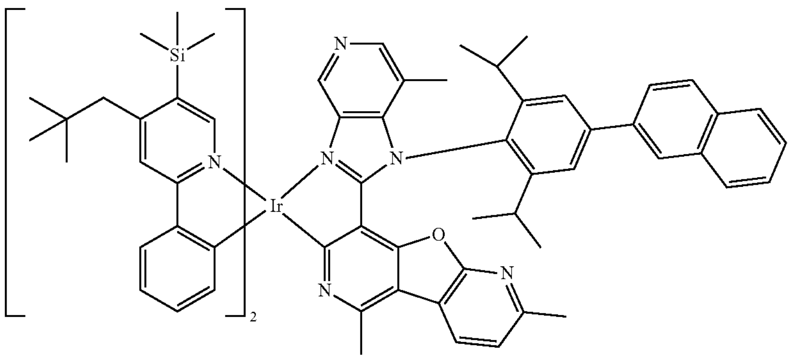
661
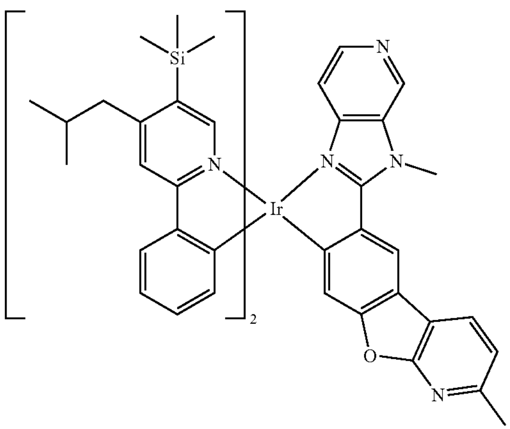
662
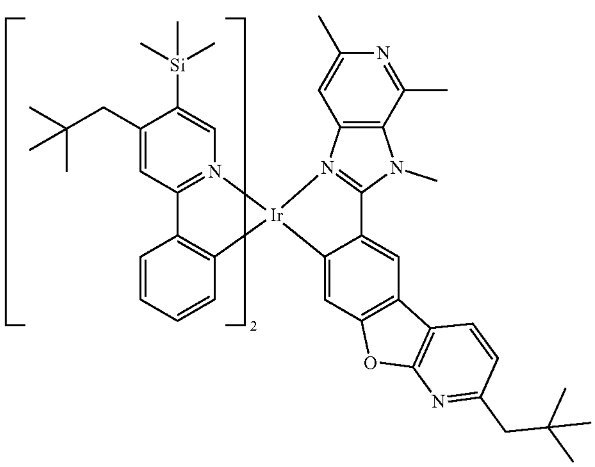

-continued
663
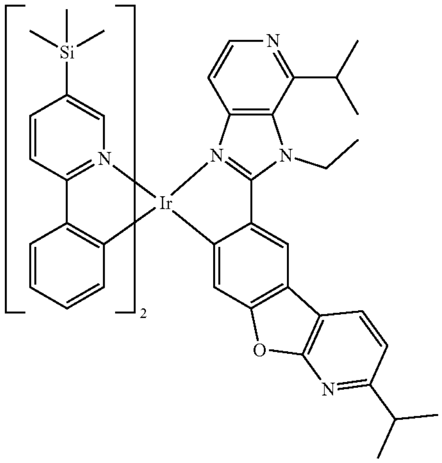
664
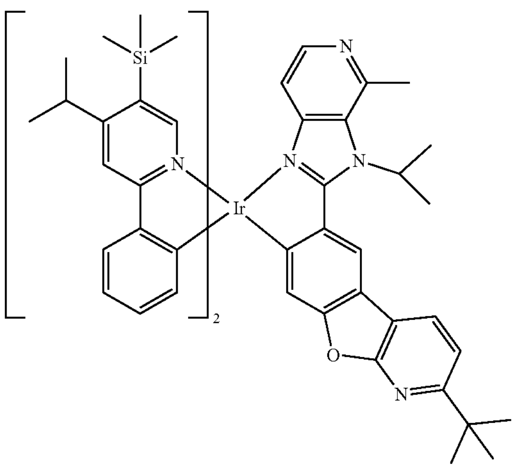
665
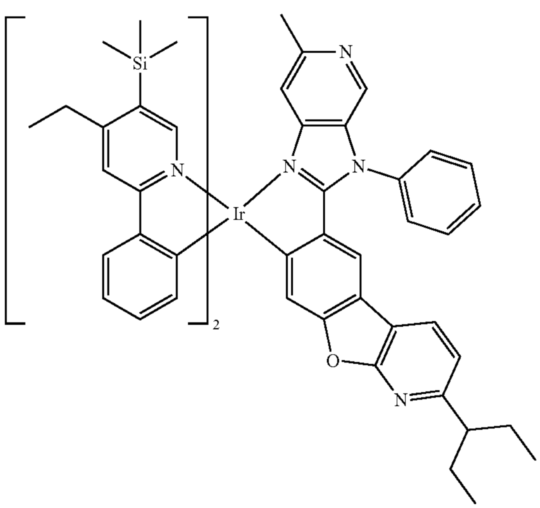

-continued
666
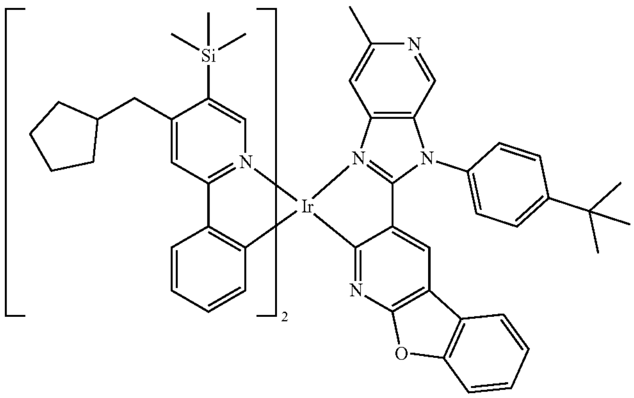
667
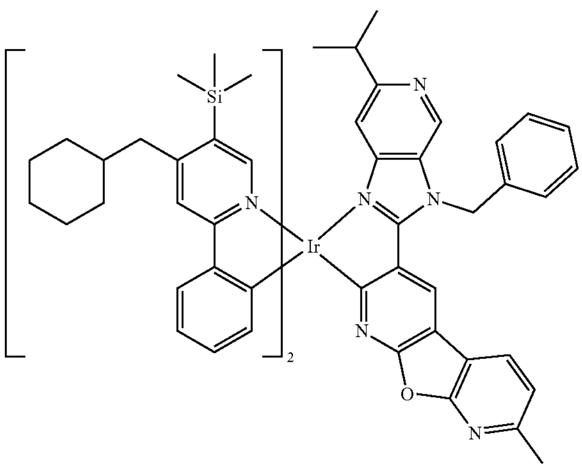
668
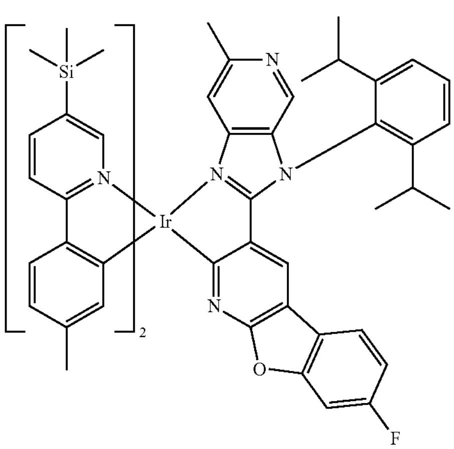

-continued
669
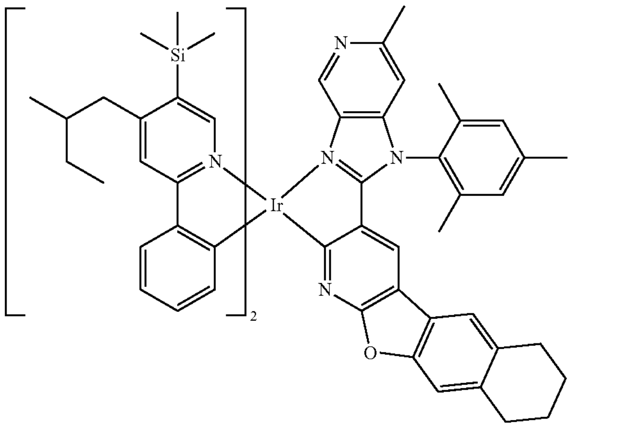
670
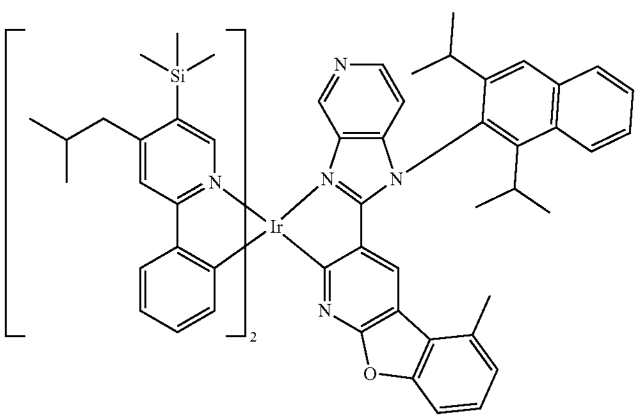
671
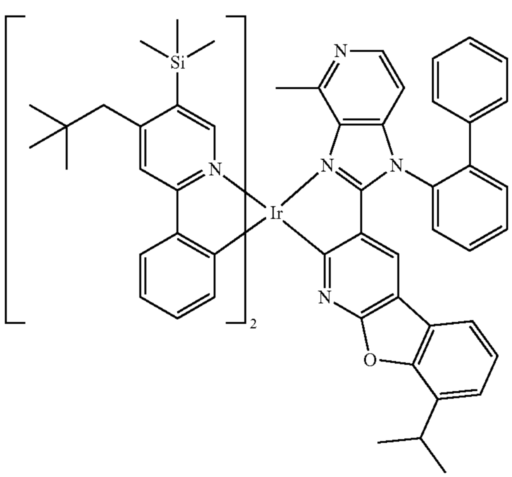

-continued
672
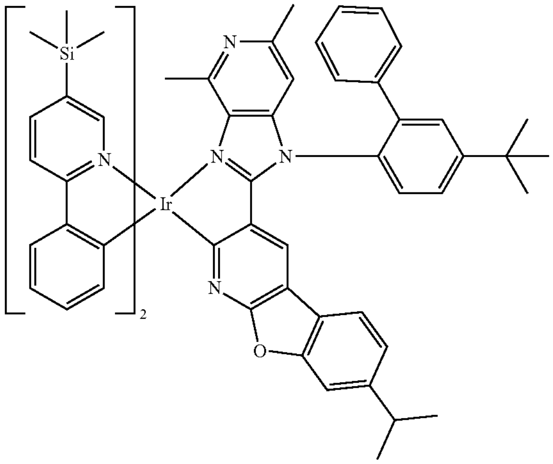
673
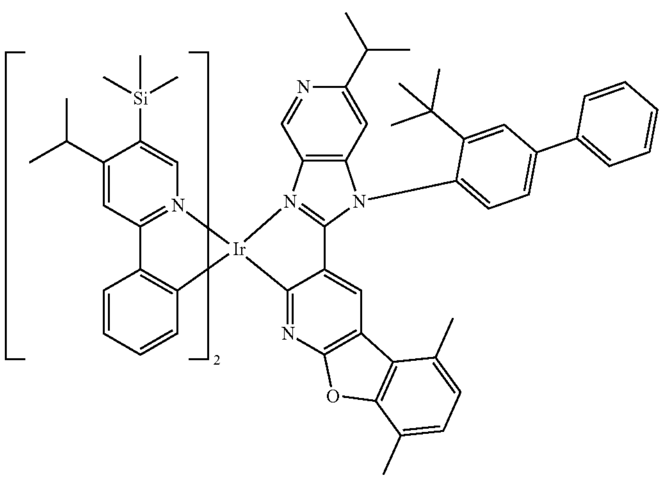
674
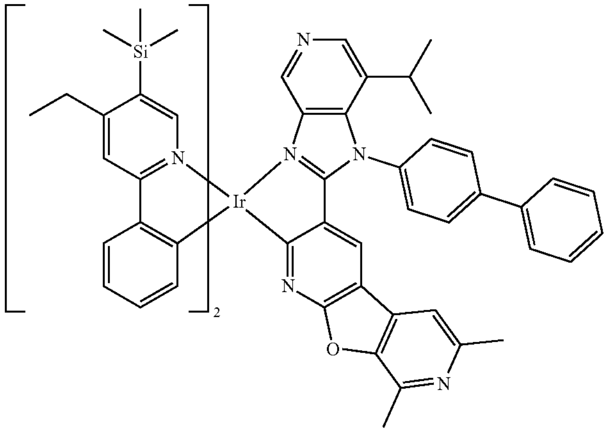

-continued
675
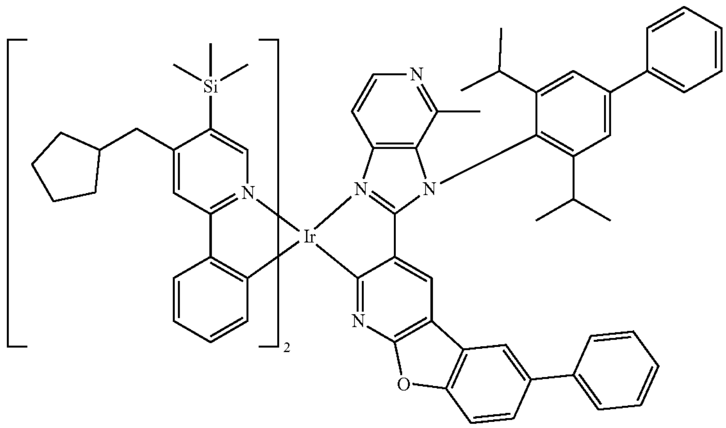
676
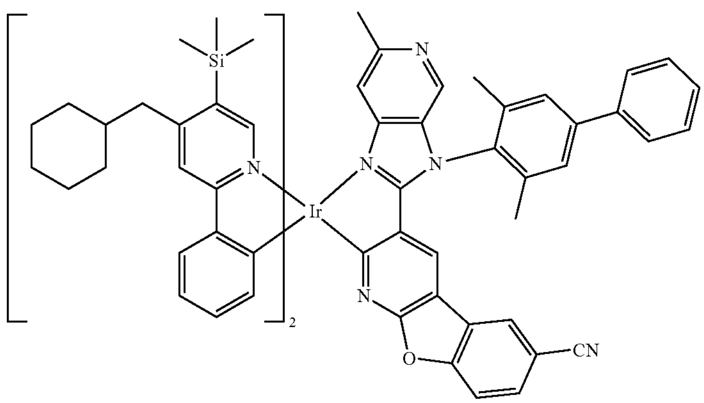
677
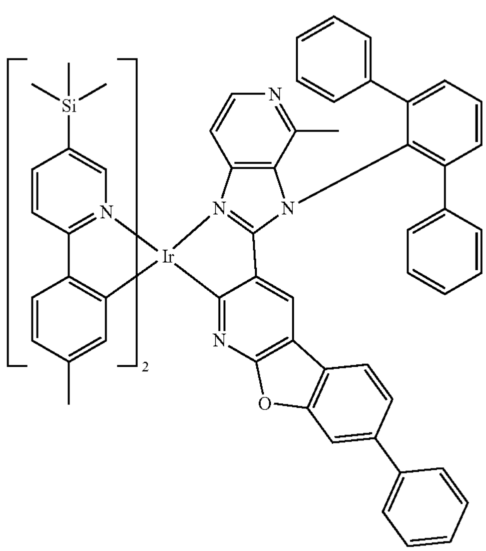

-continued
678
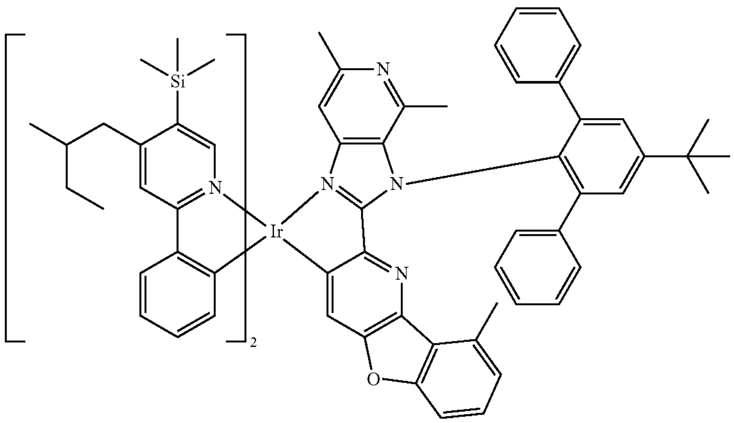
679
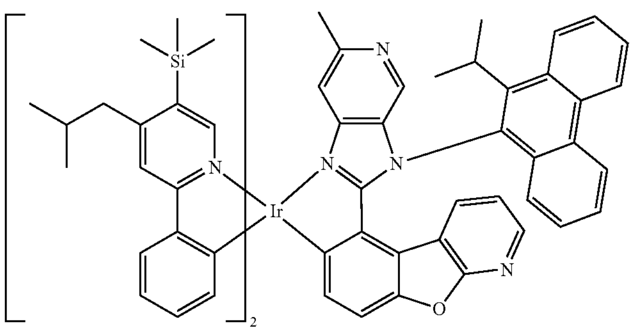
680
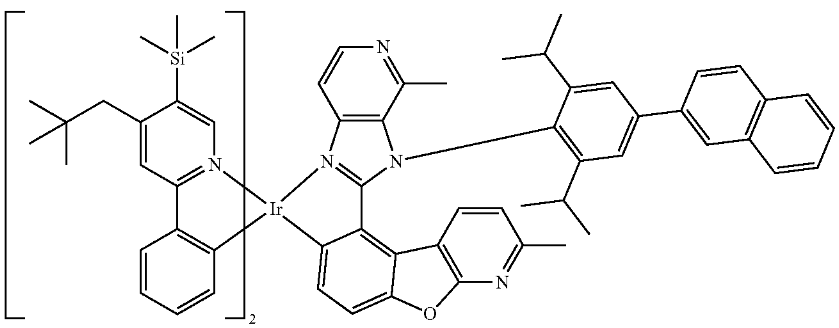
681
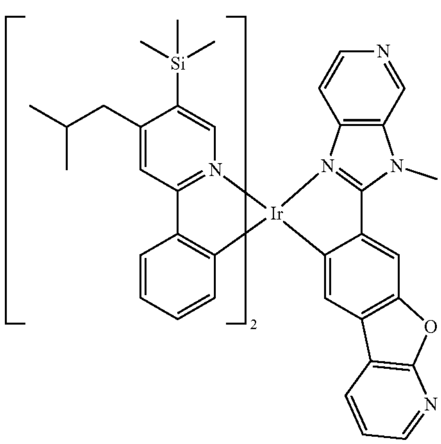

-continued
682
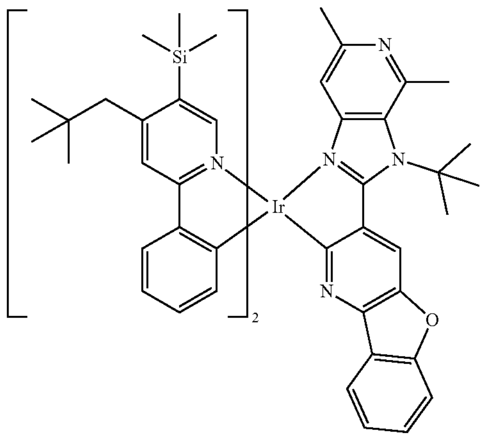
683
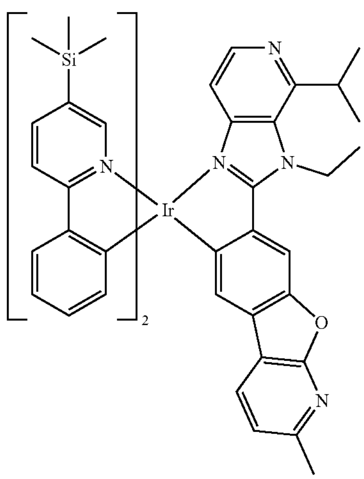
684
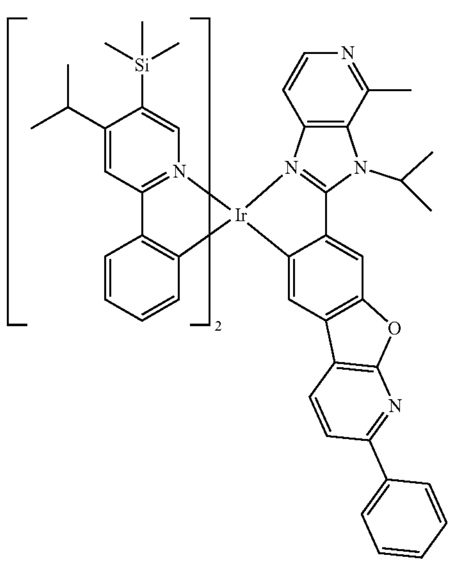

-continued
685
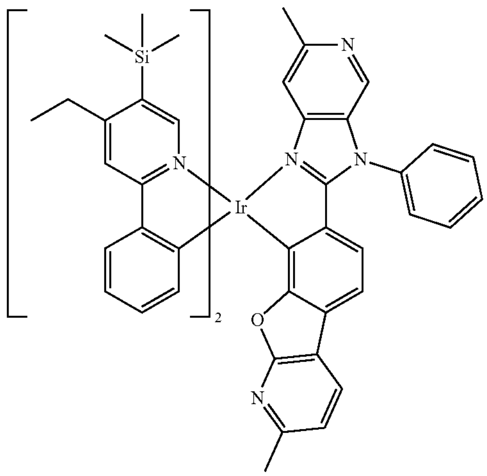
686
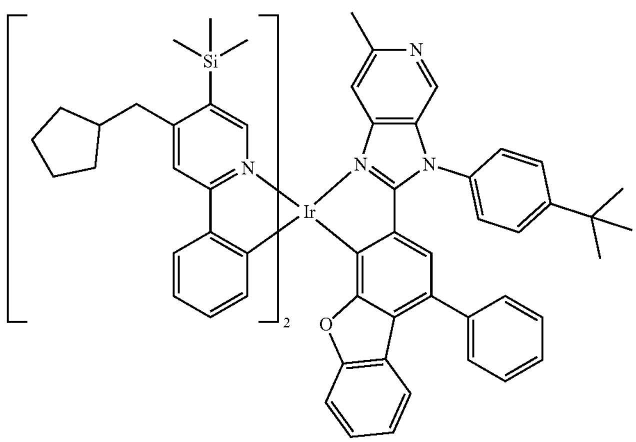
687
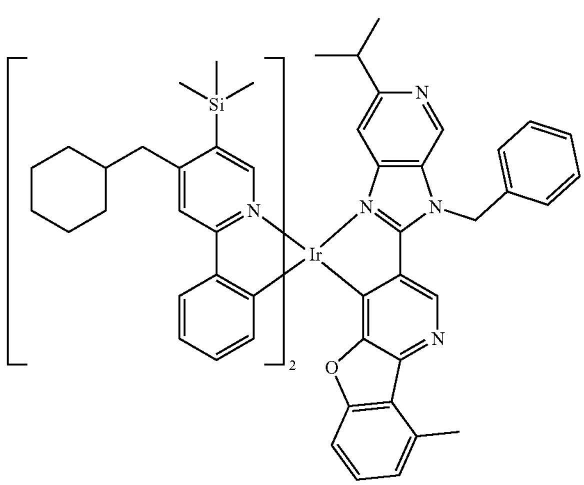

-continued
688
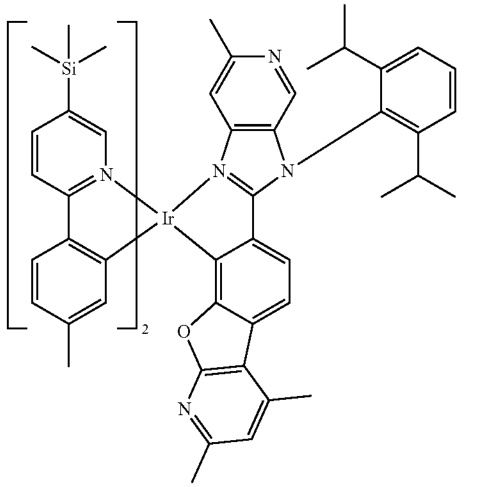
689
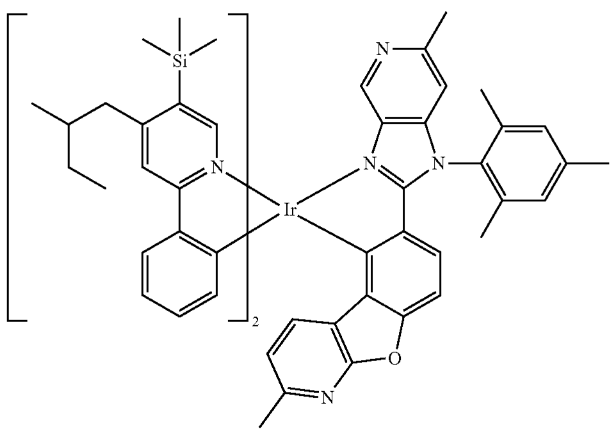
690
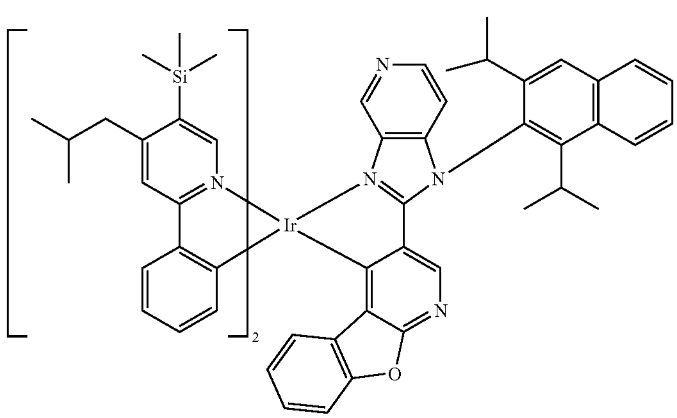

-continued
691
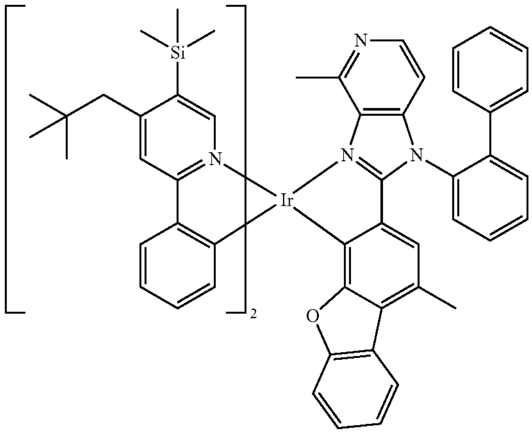
692
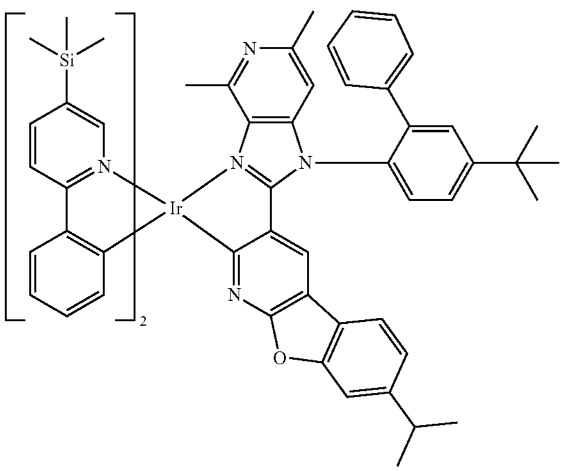
693
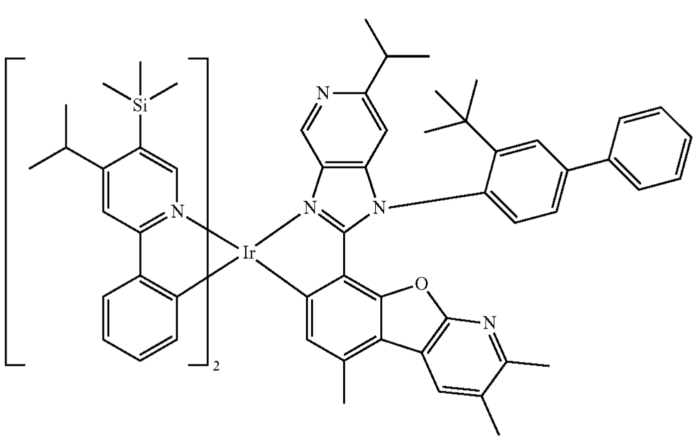

-continued
694
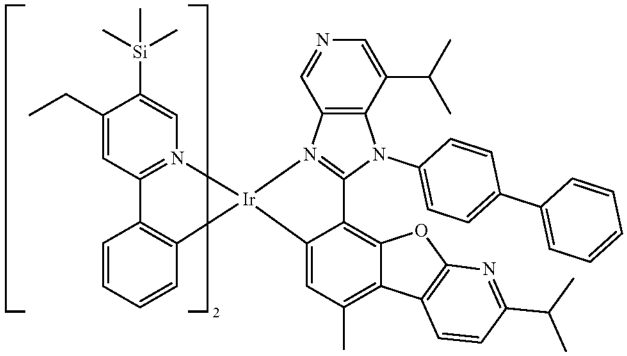
695
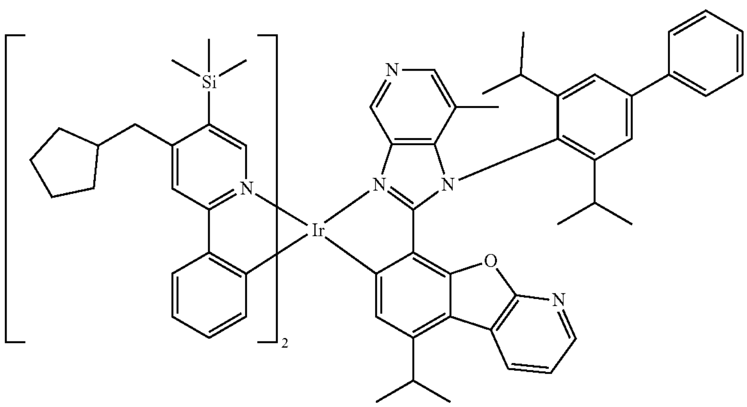
696
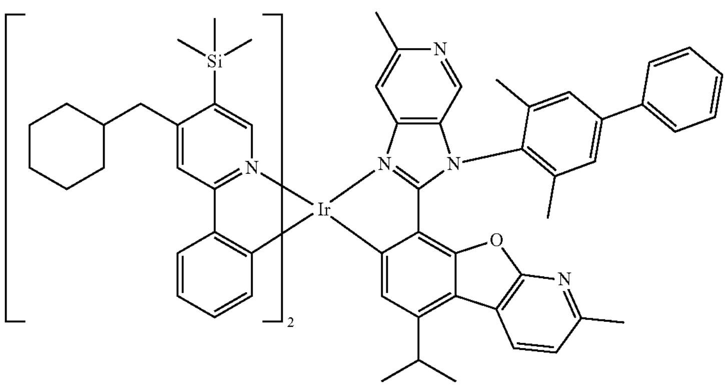
697
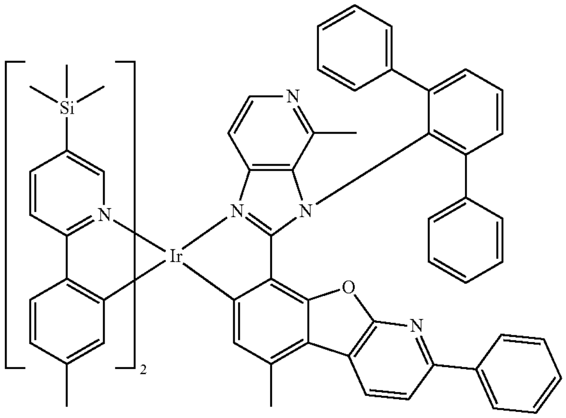

-continued
698
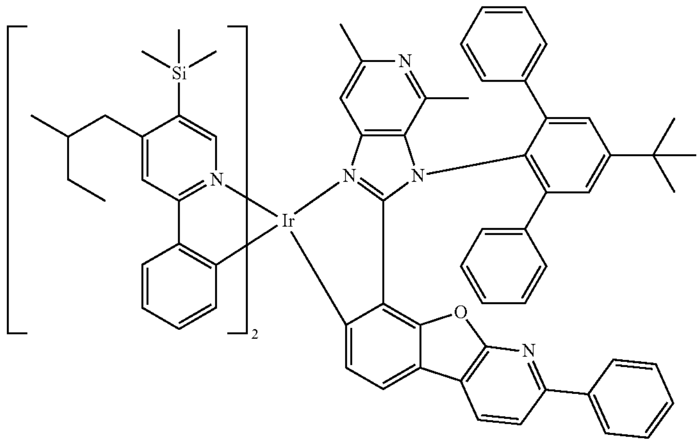
699
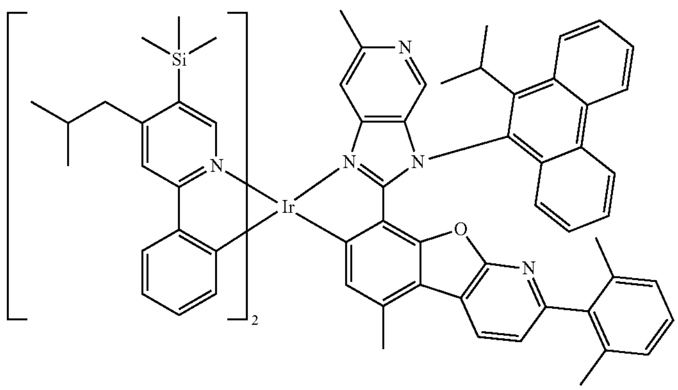
700
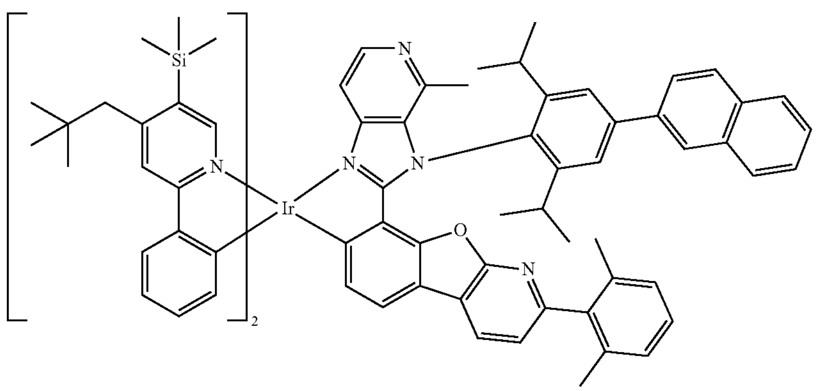
701
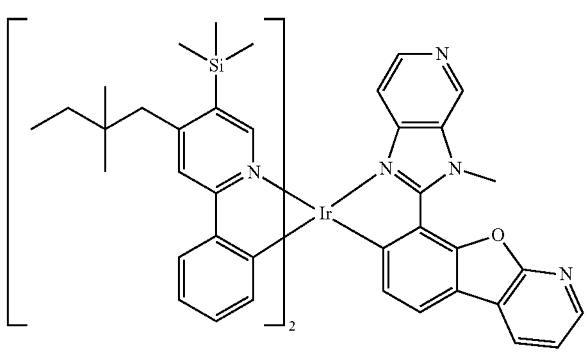

-continued
702
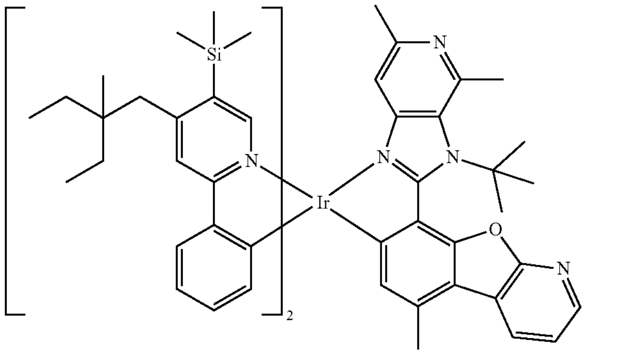
703
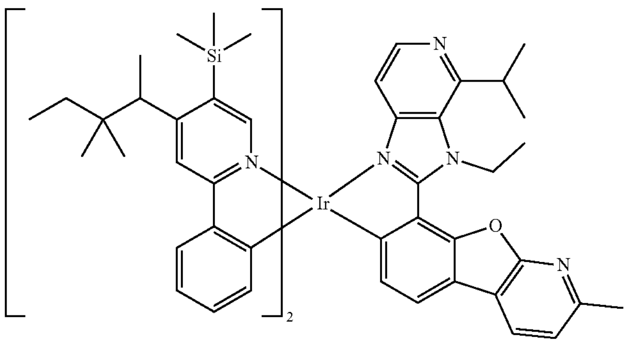
704
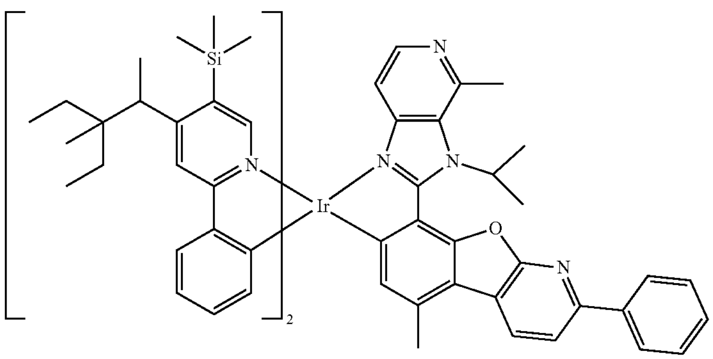
705
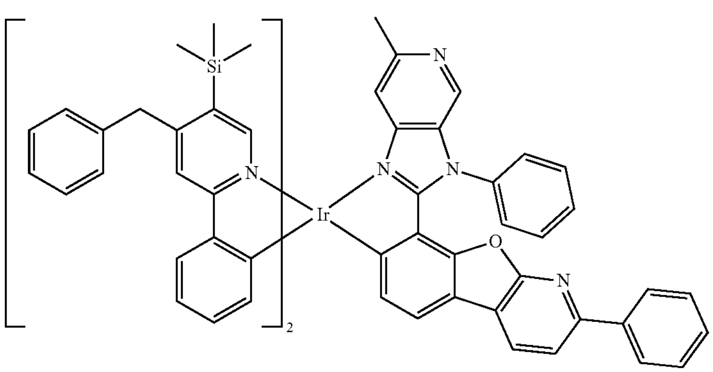

-continued
706
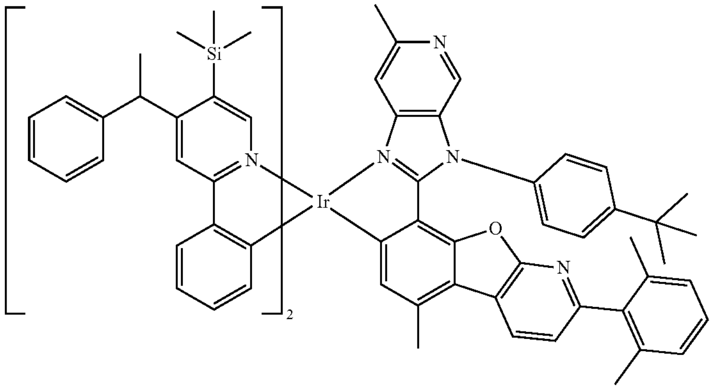
707
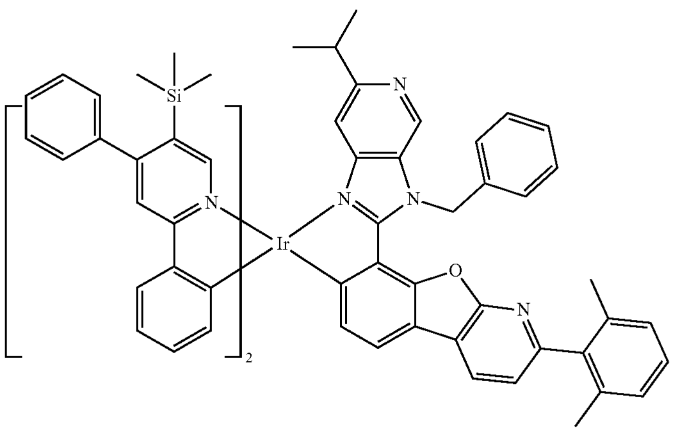
708
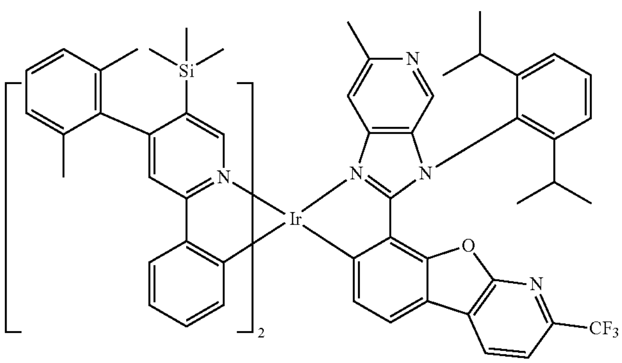
709
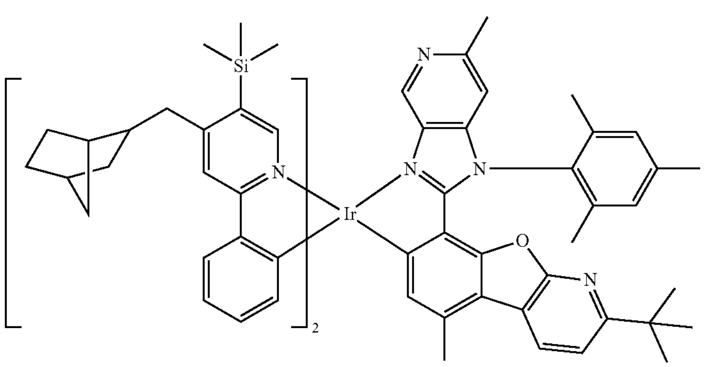

-continued
710
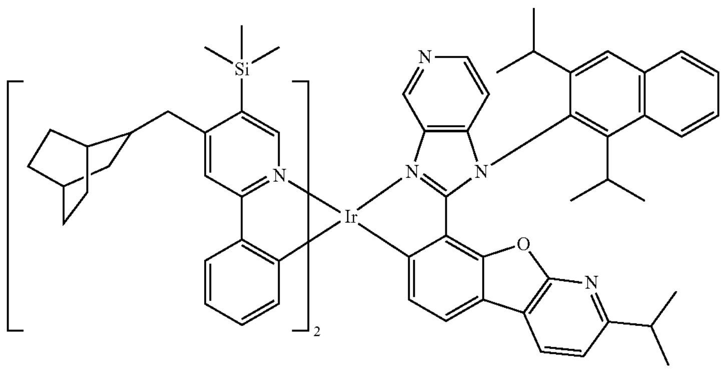
711
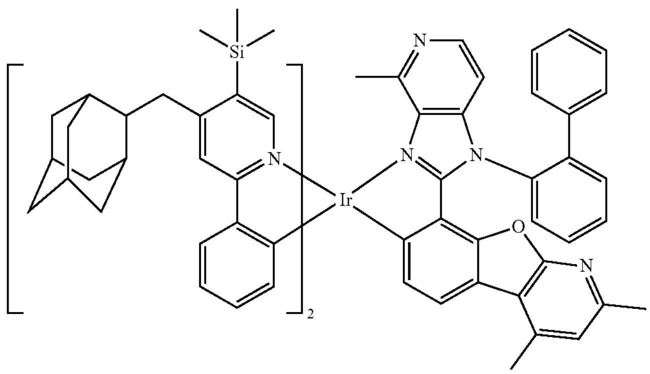
712
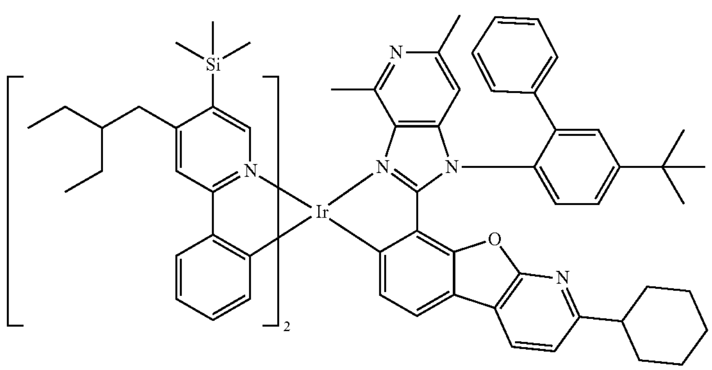
713
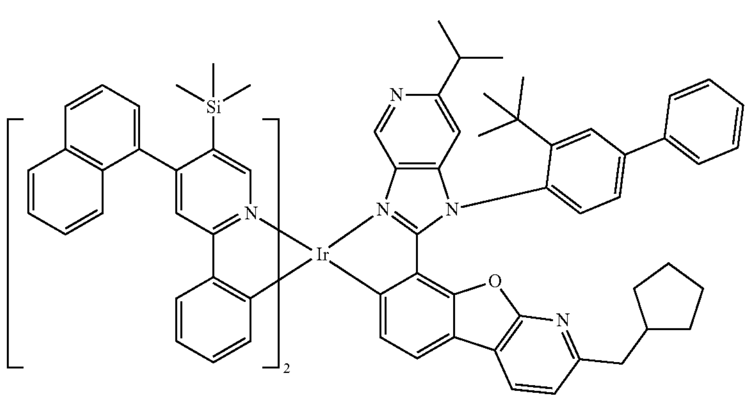

-continued
714
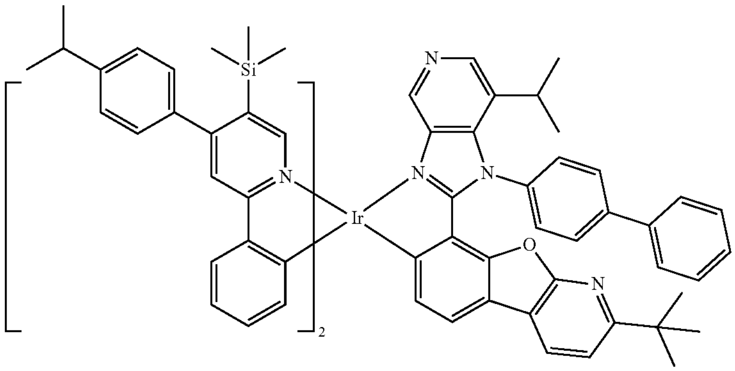
715
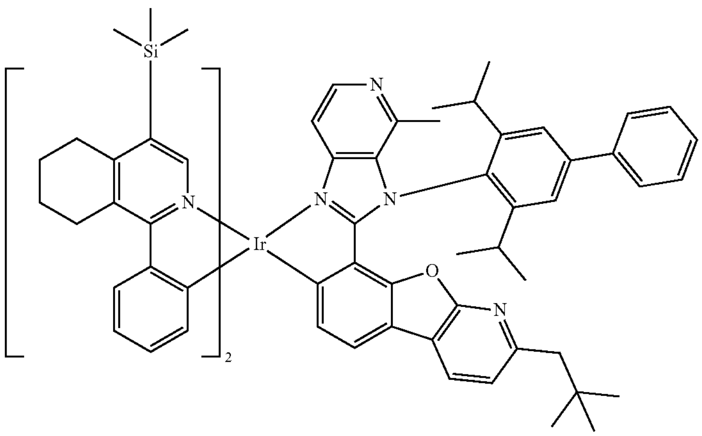
716
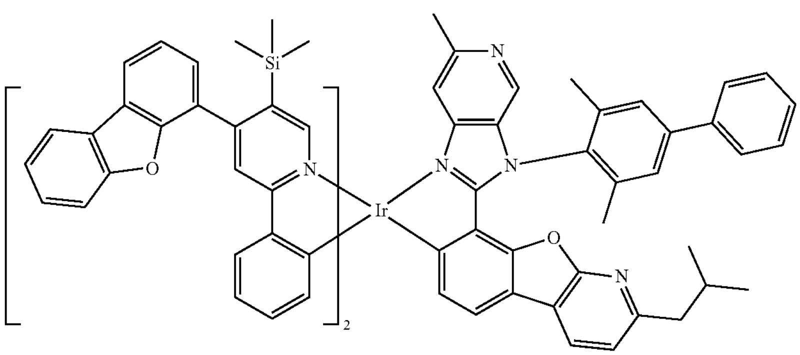
717
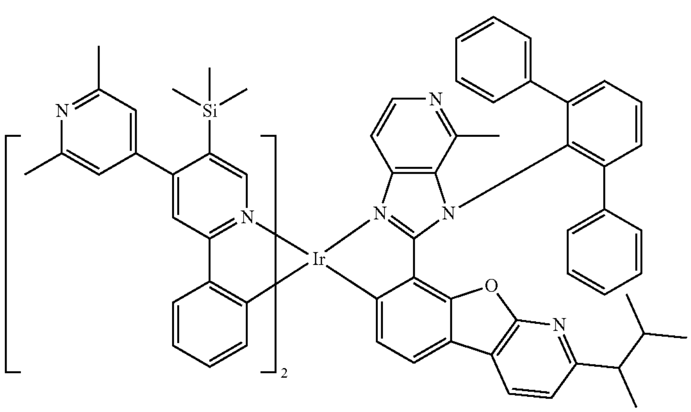

-continued
718
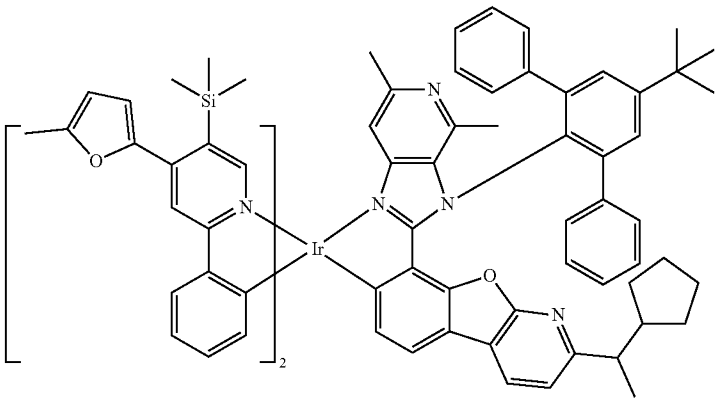
719
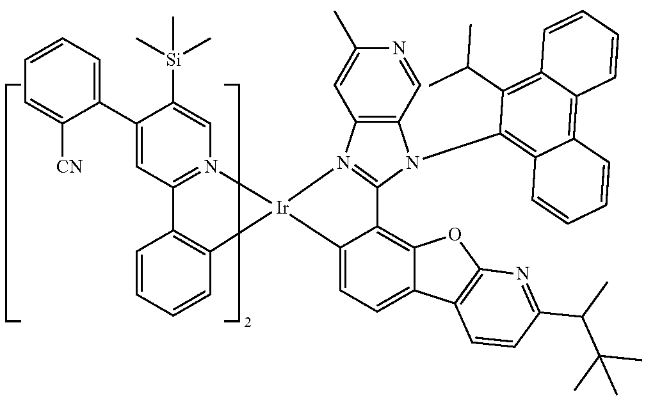
720
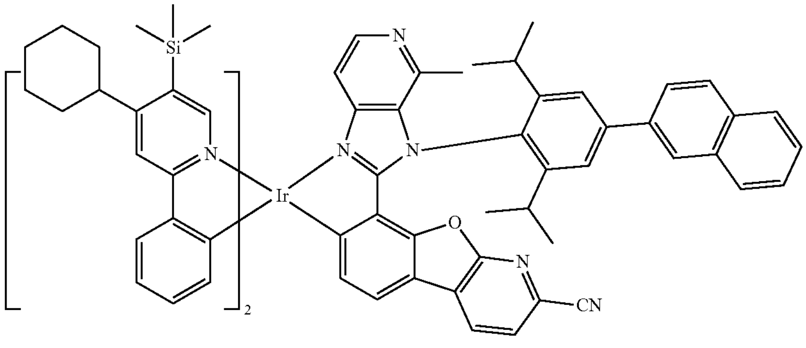

721
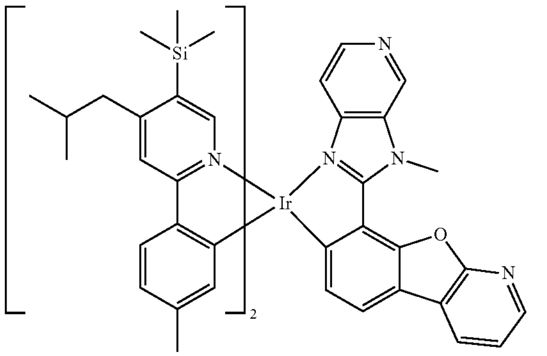
722
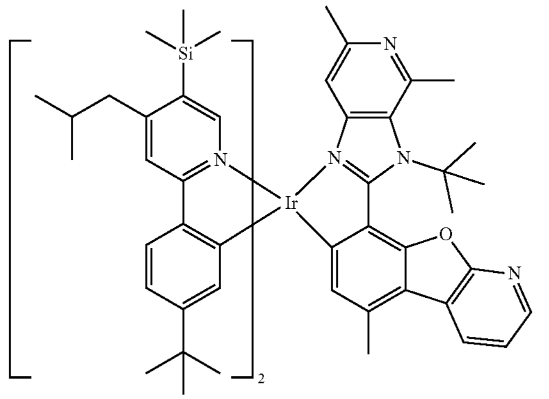
723
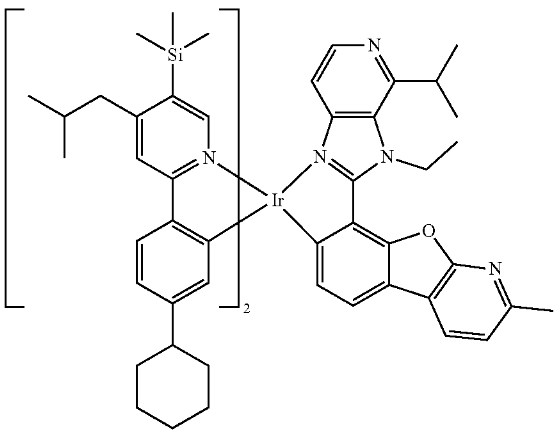
724
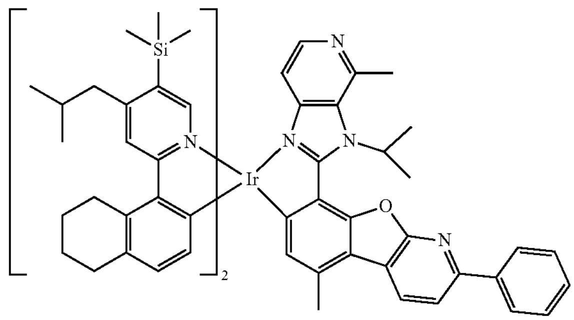
725
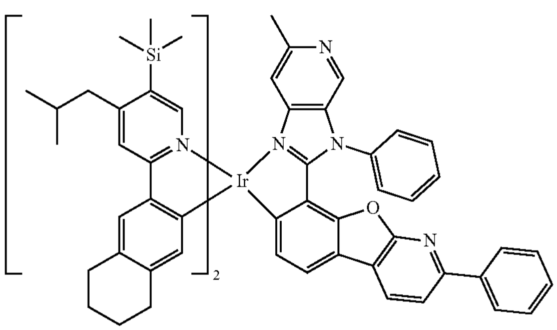
726
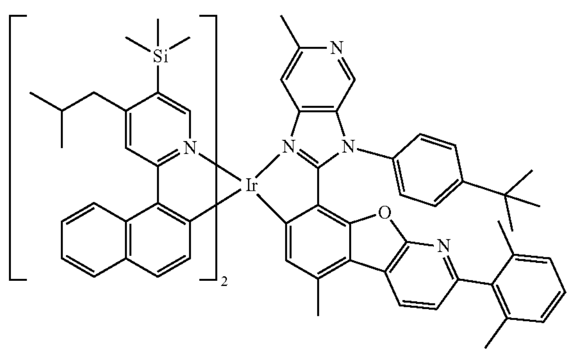
727
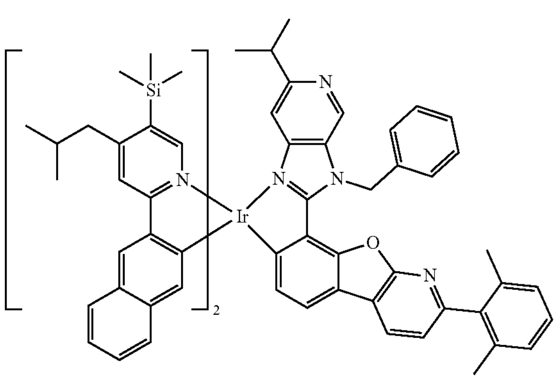
728
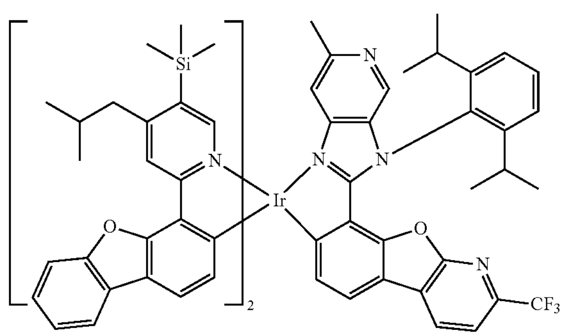

-continued
729
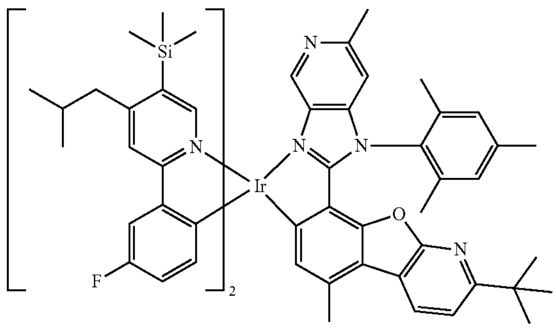
730
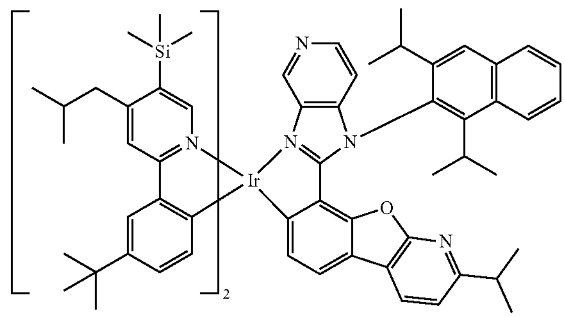
731
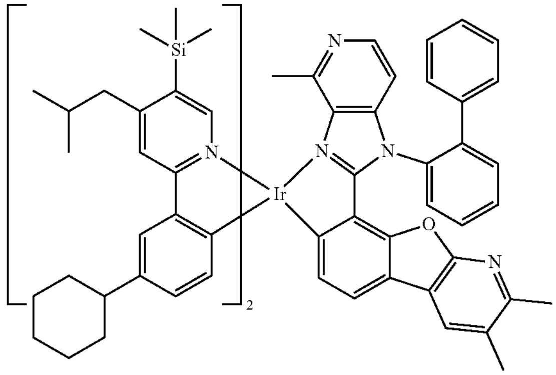
732
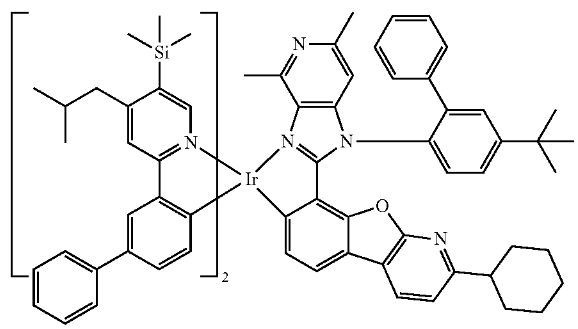
733
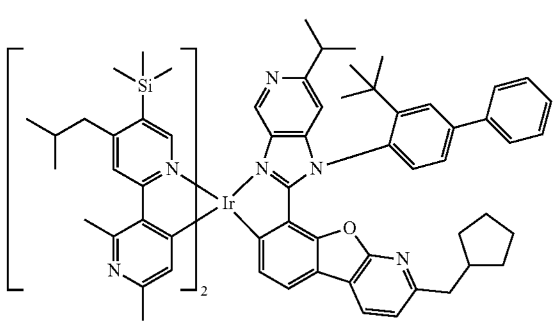
734
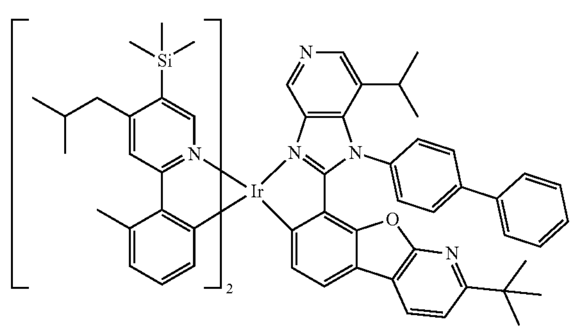
735
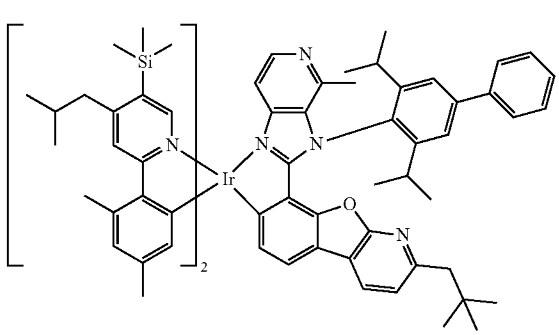
736
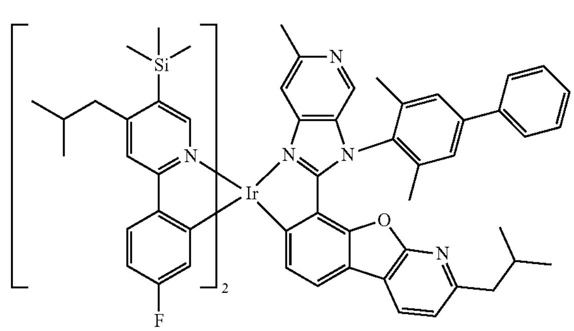

-continued
737
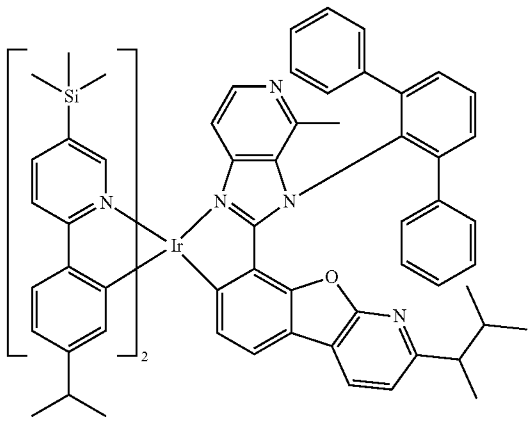
738
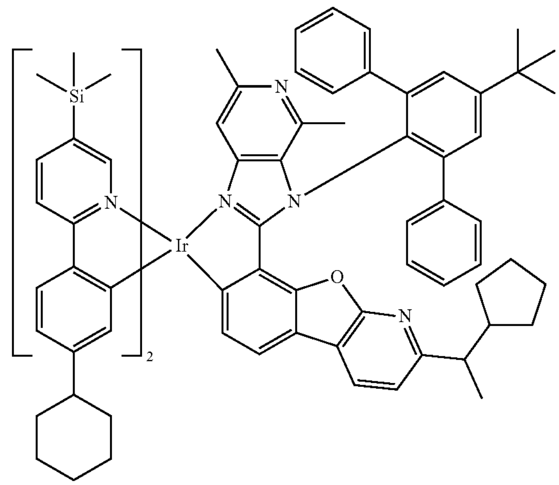
739
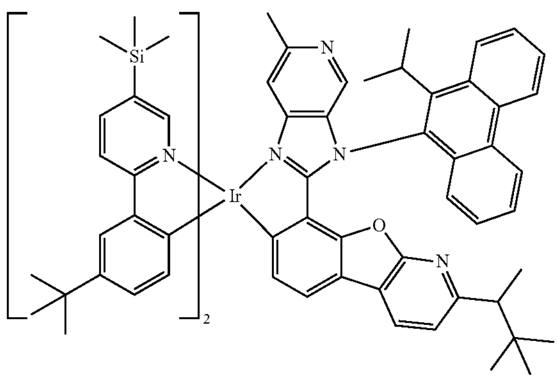
740
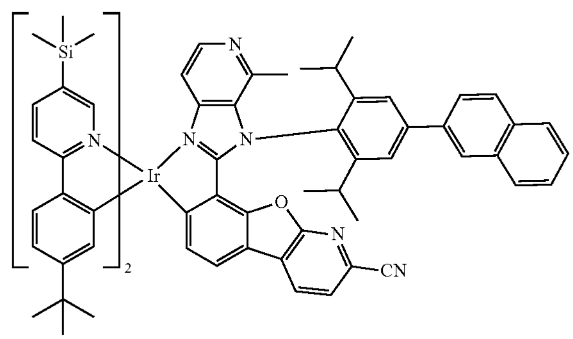
741
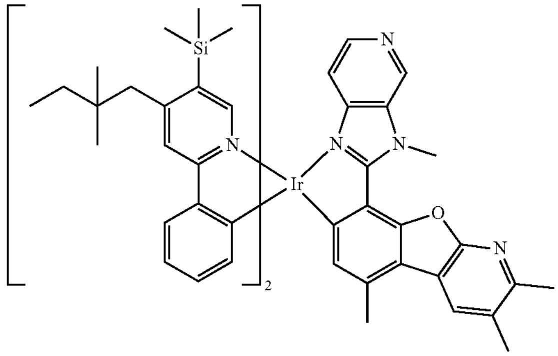
742
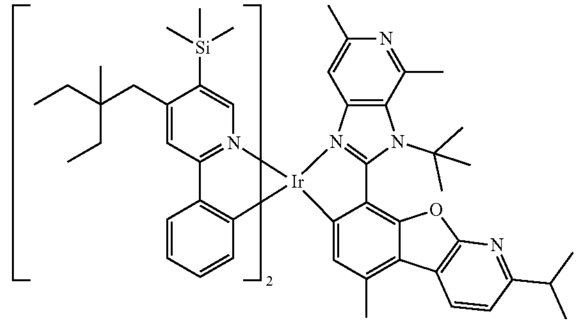

-continued
743
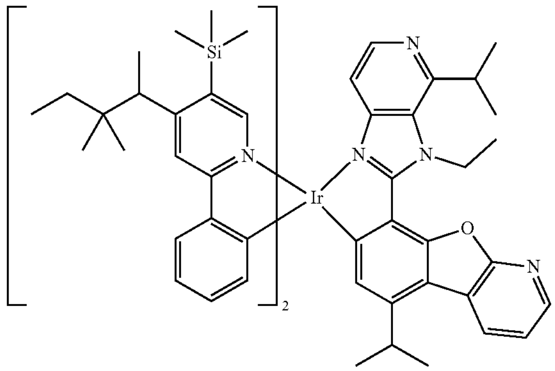
744
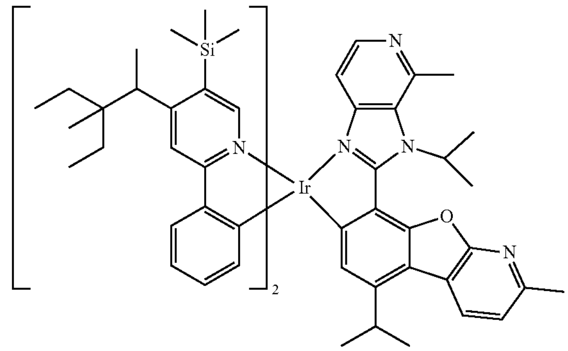
745
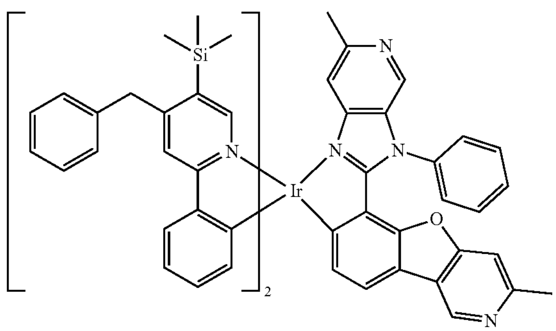
746
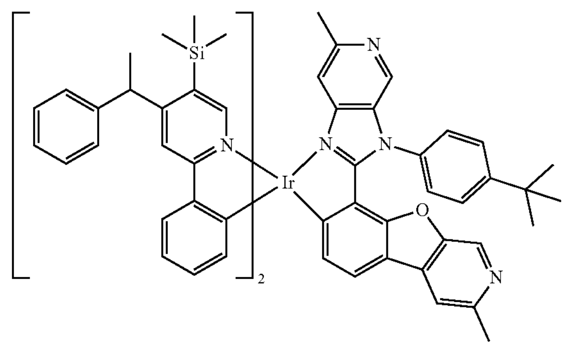
747
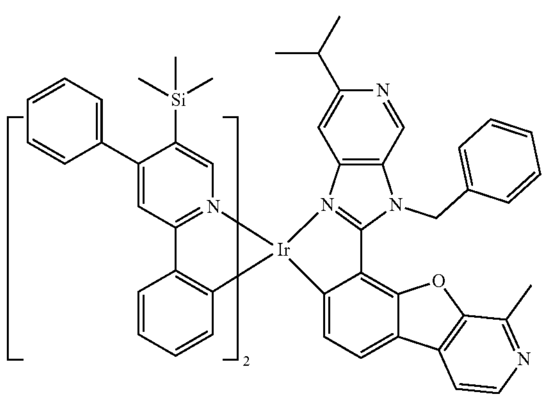
748
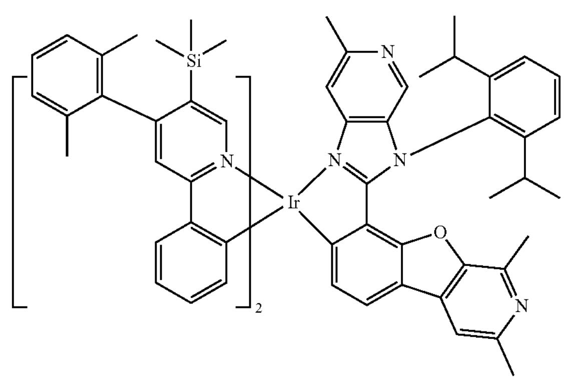
749
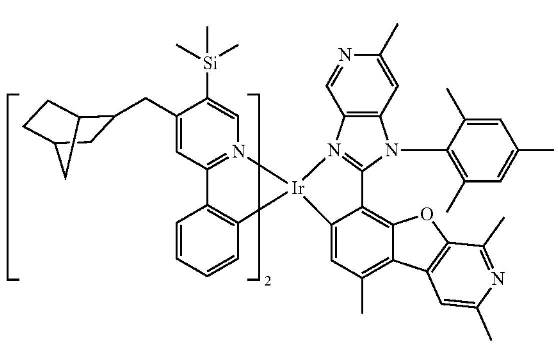
750
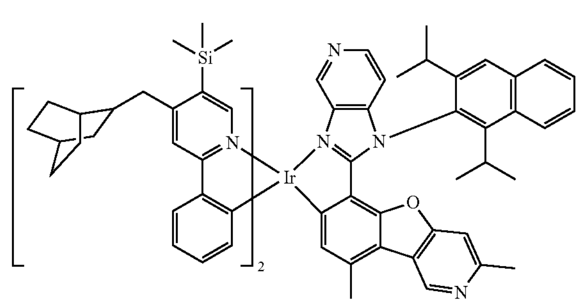

-continued
751
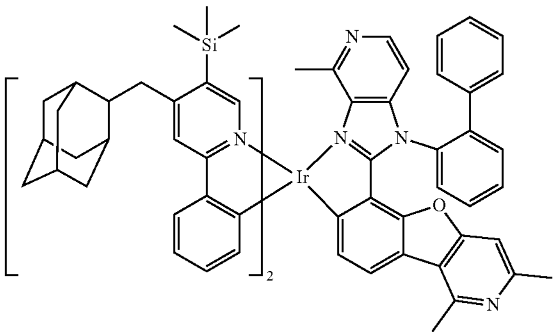
752
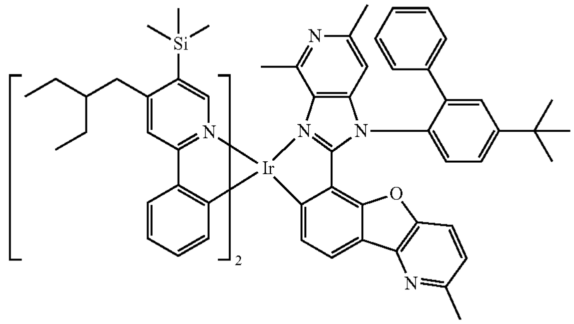
753
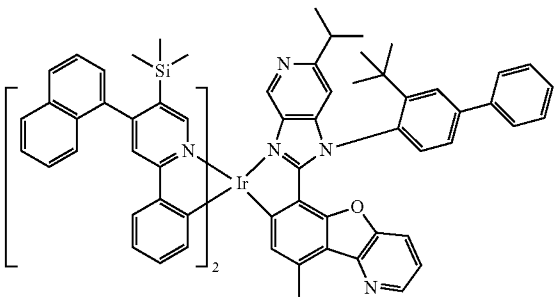
754
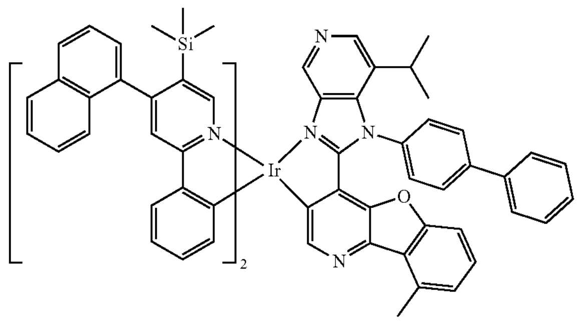
755
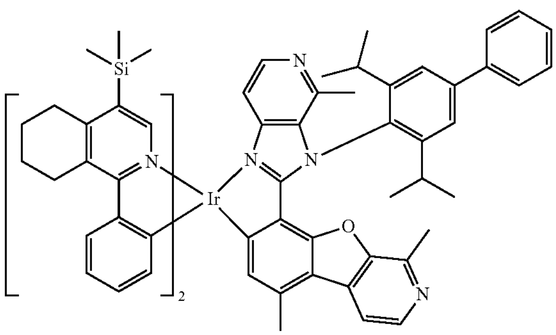
756
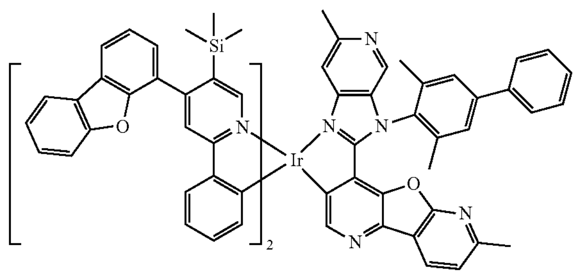
757
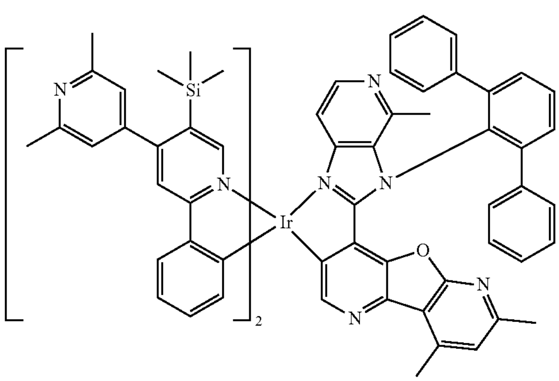
758
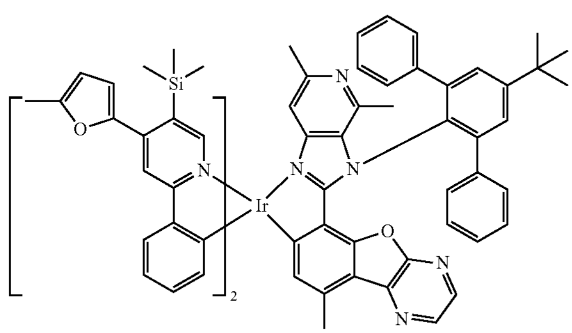

-continued
759
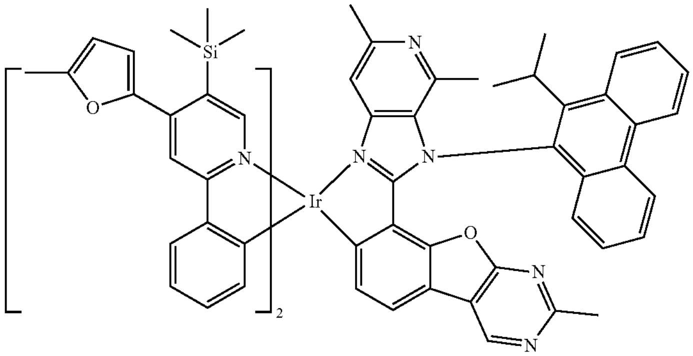
760
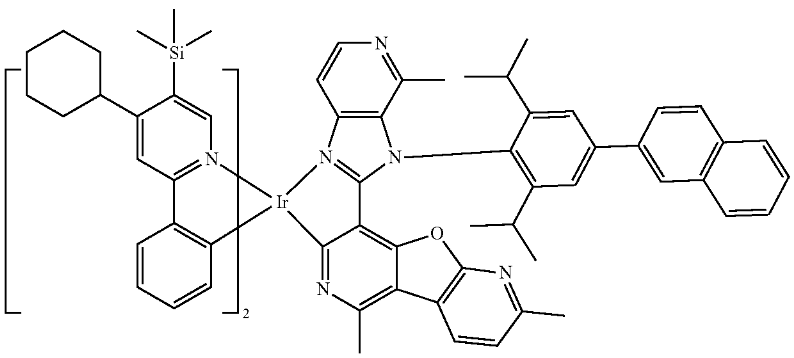
761
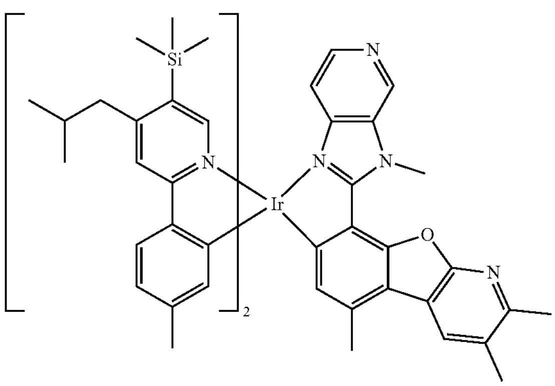
762
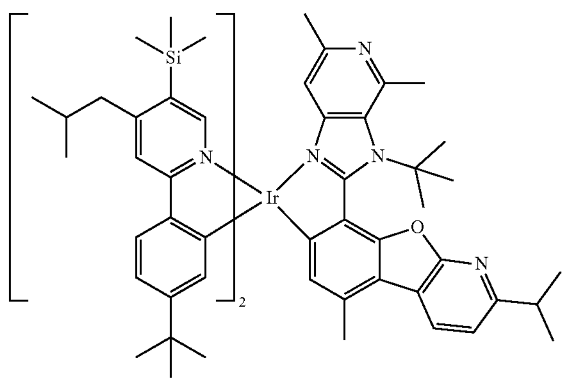
763
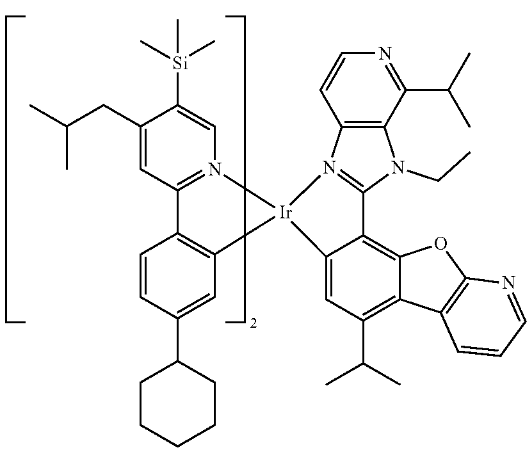
764
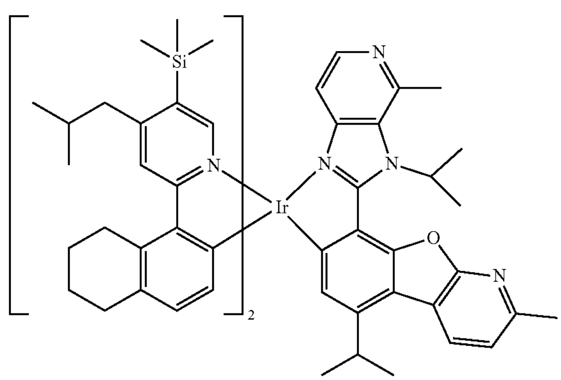

-continued
765
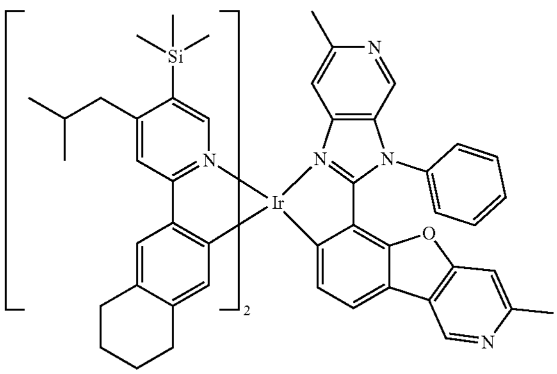
766
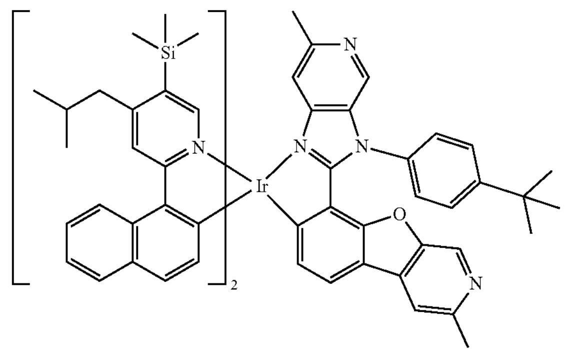
767
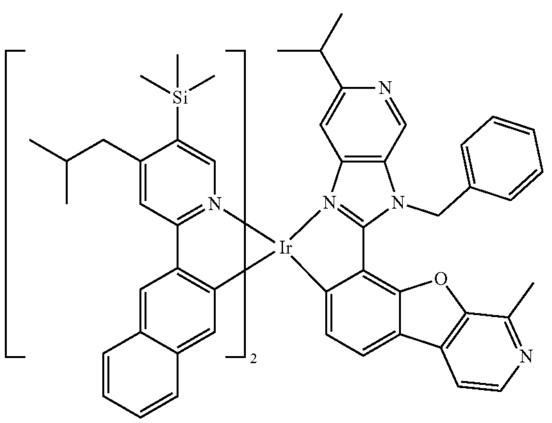
768
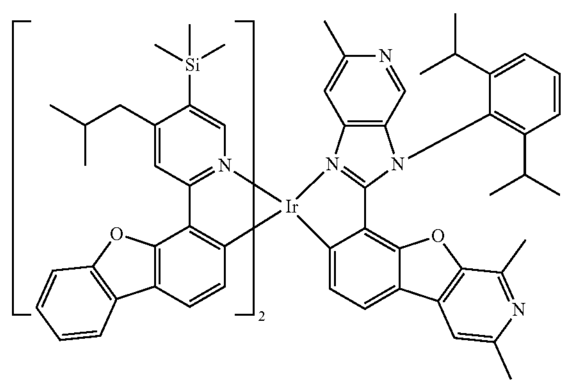
769
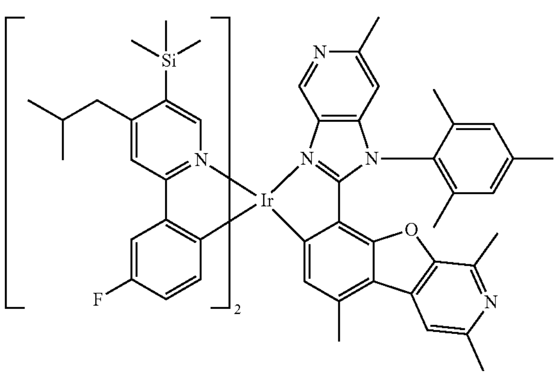
770
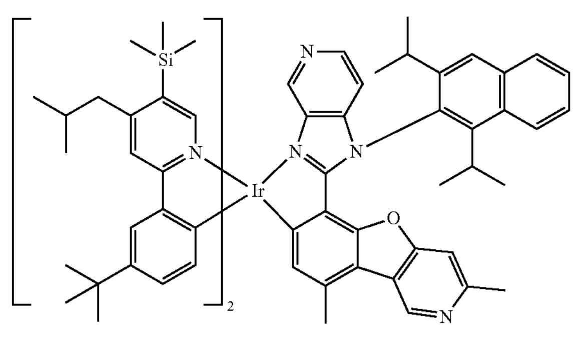
771
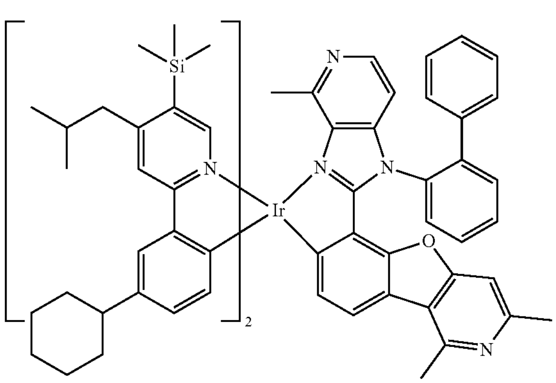
772
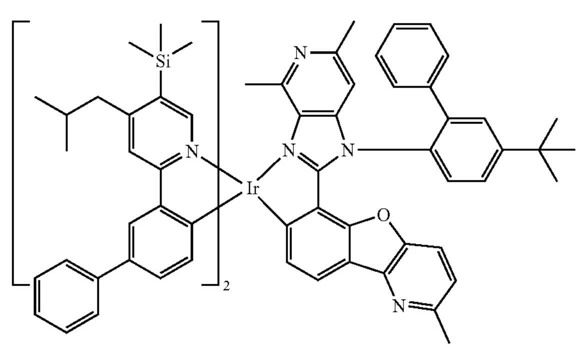

-continued
773
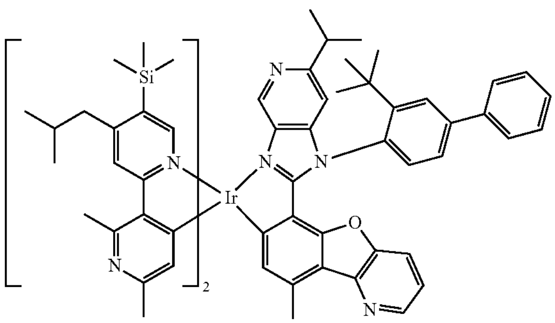
774
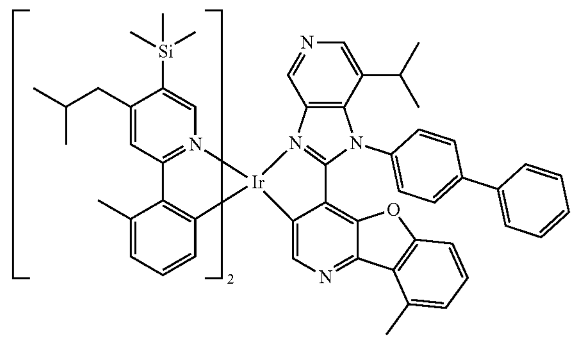
775
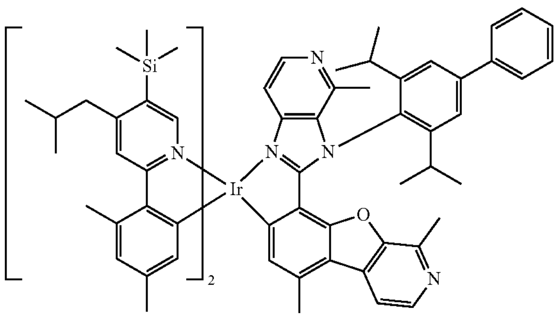
776
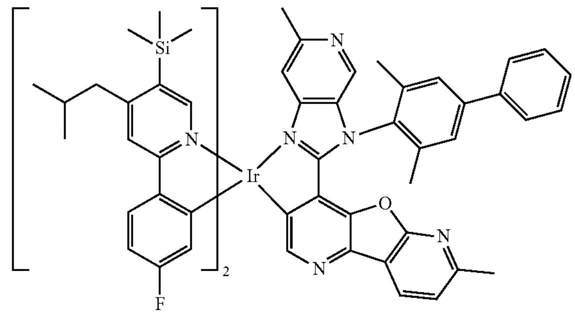
777
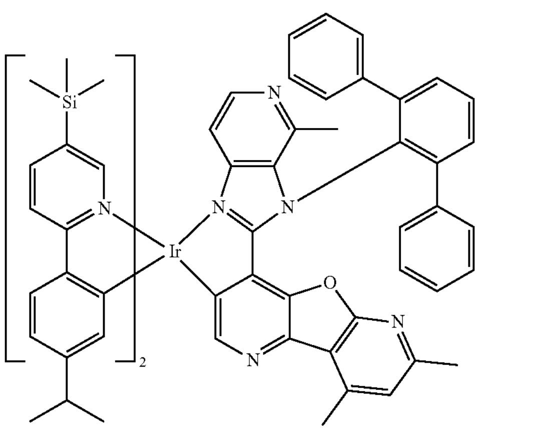
778
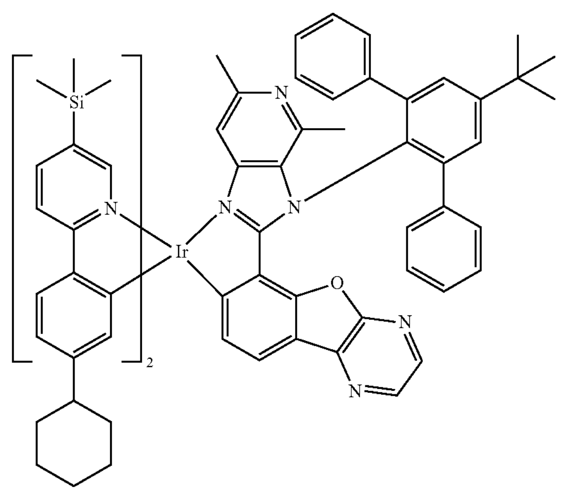
779
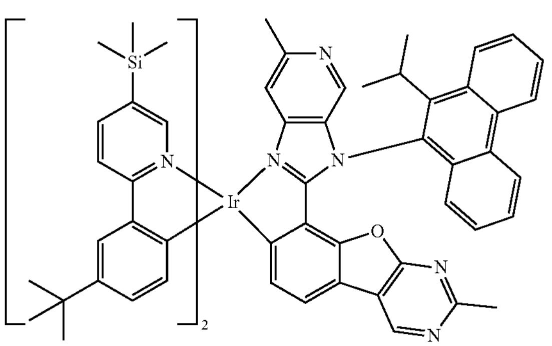
780
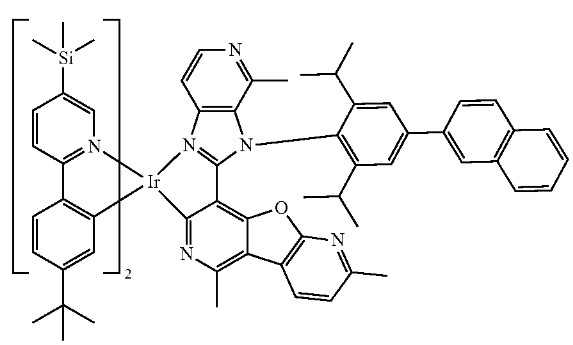

-continued
781
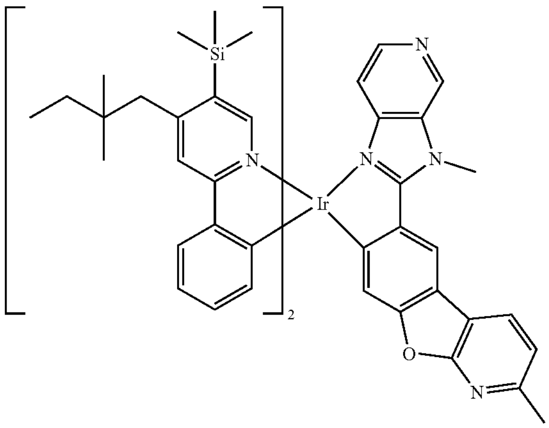
782
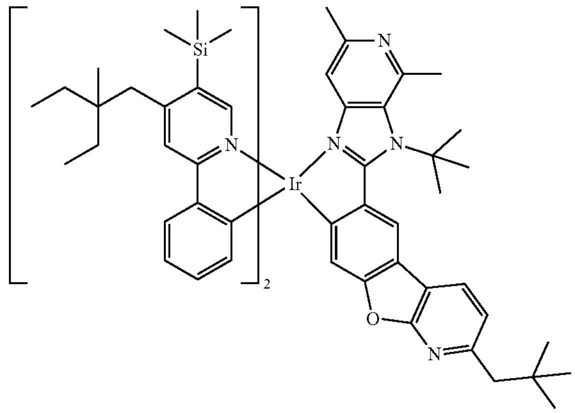
783
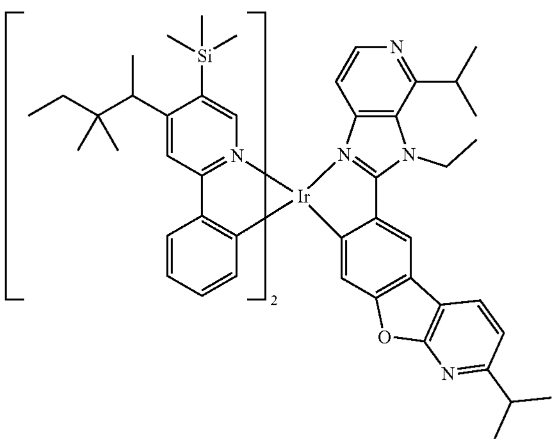
784
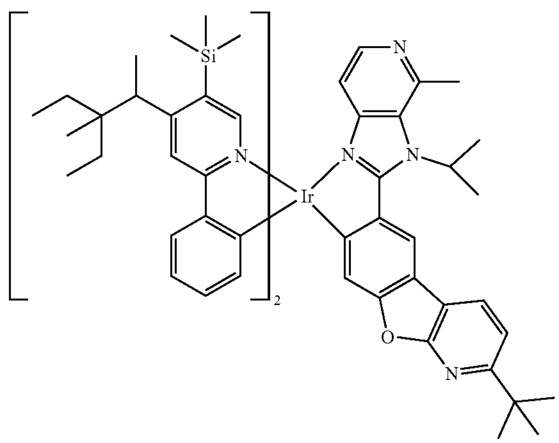
785
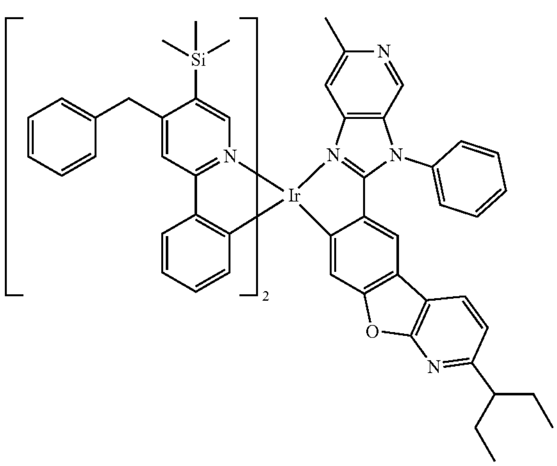
786
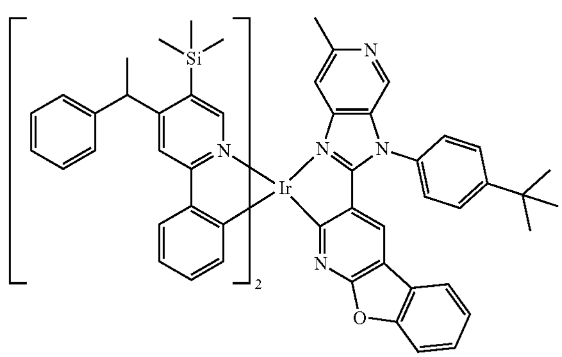

-continued
787
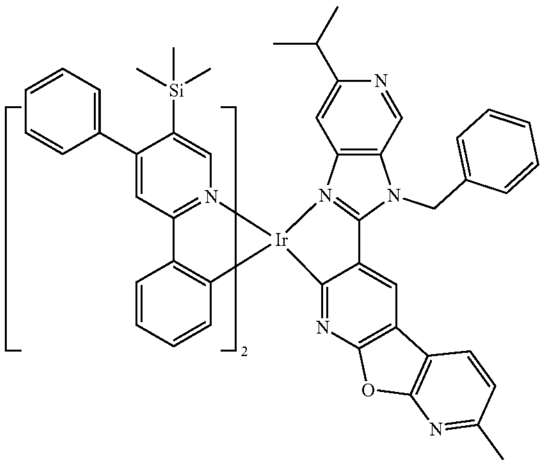
788
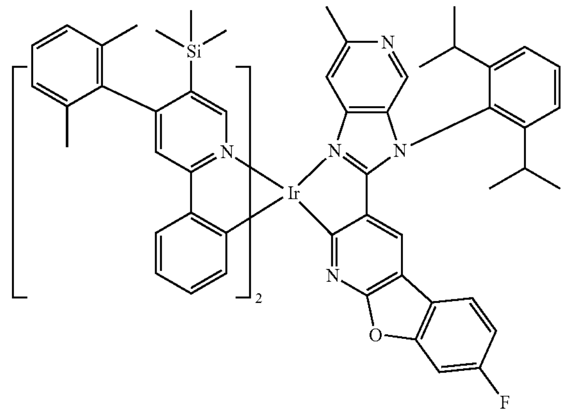
789
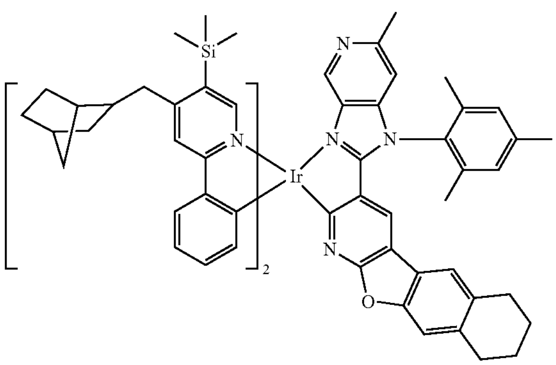
790
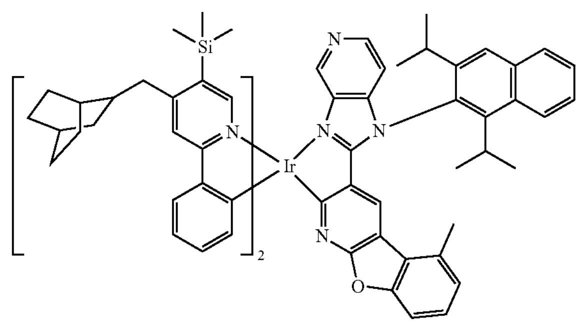
791
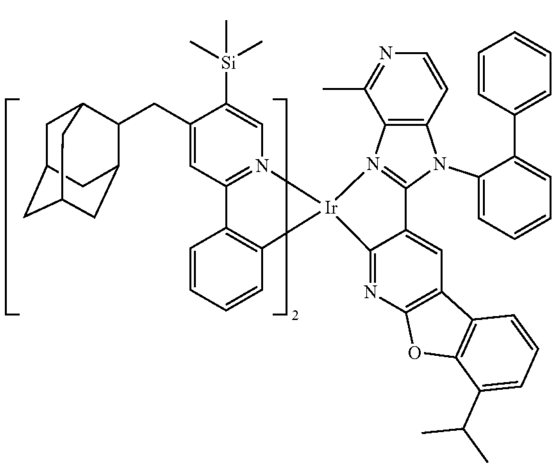
792
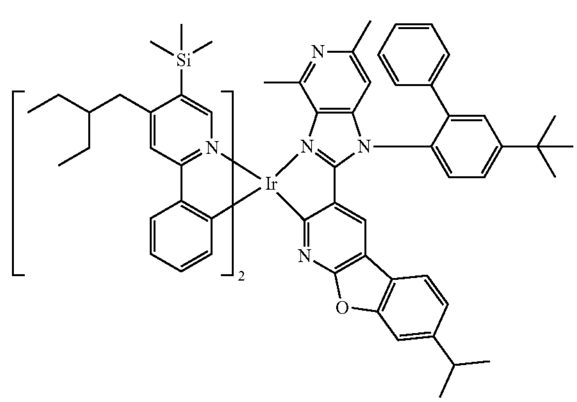

-continued
793
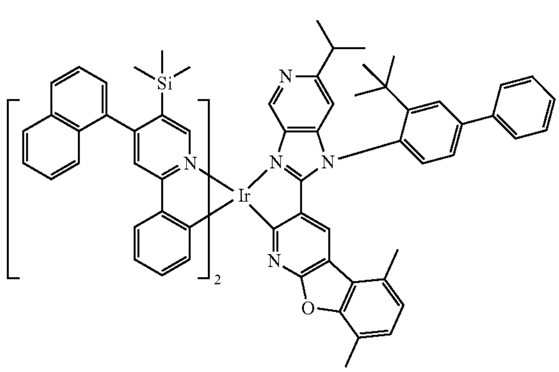
794
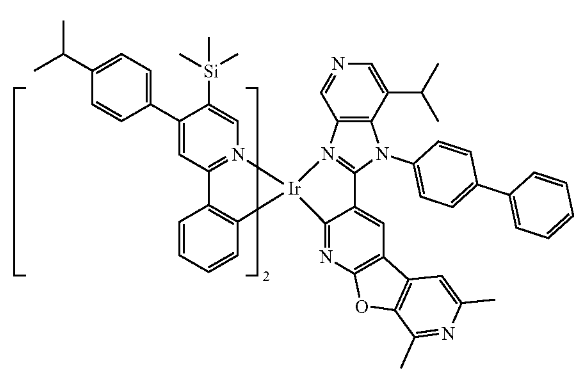
795
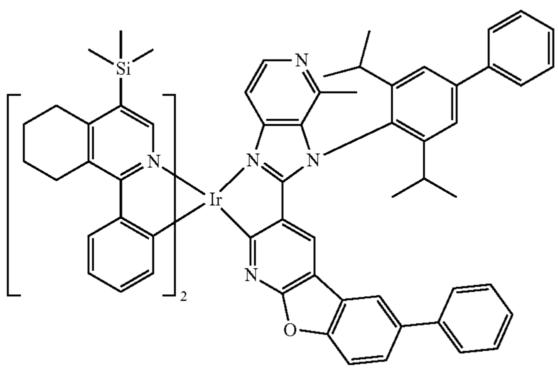
796
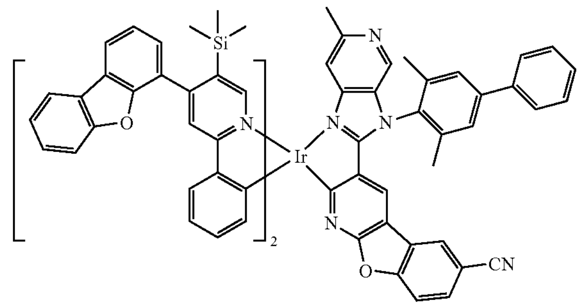
797
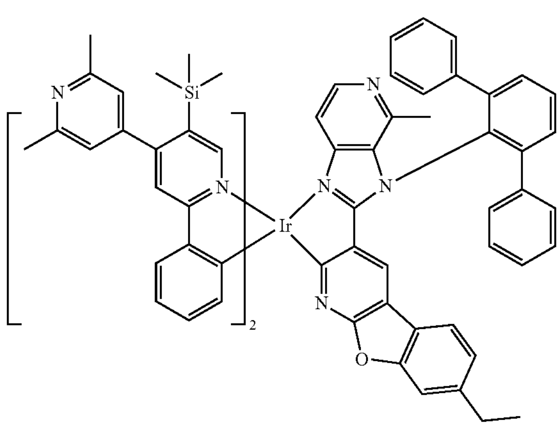
798
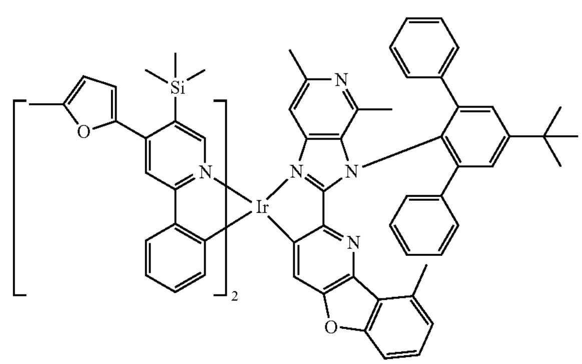
799
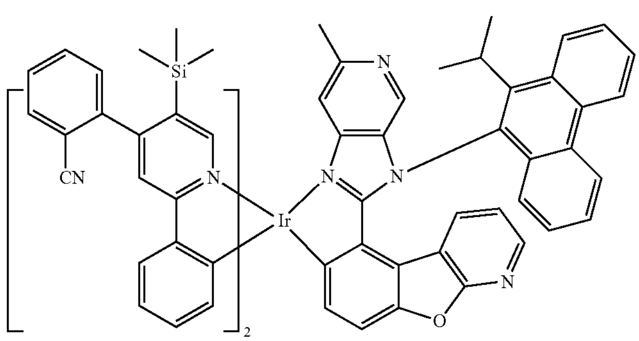

-continued
800
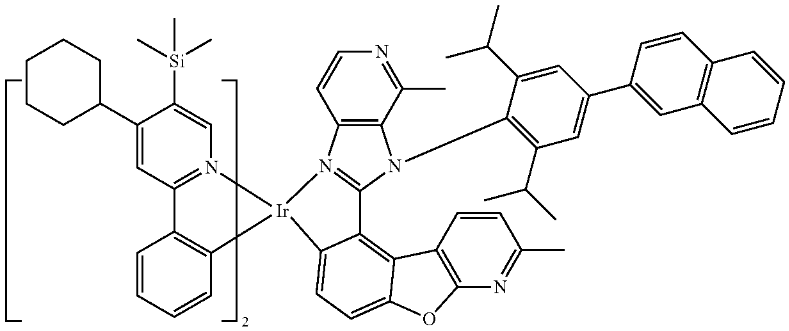
801
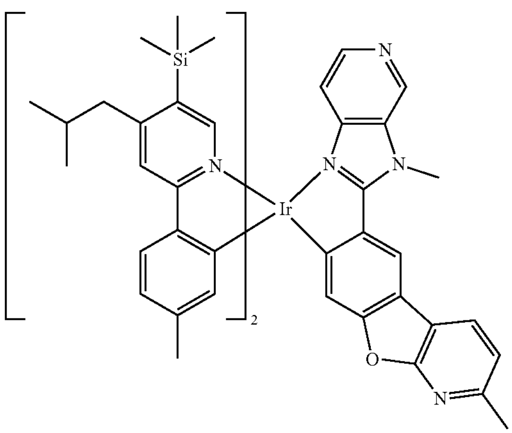
802
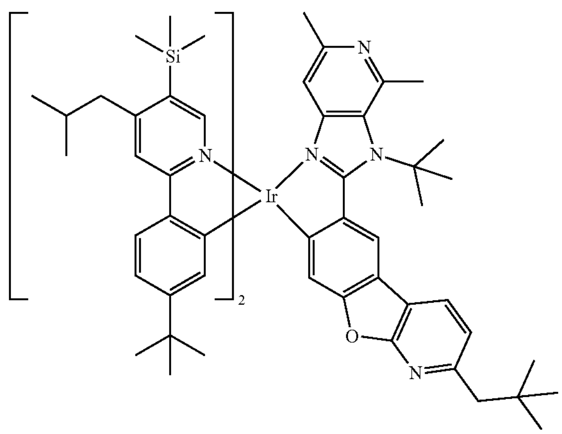
803
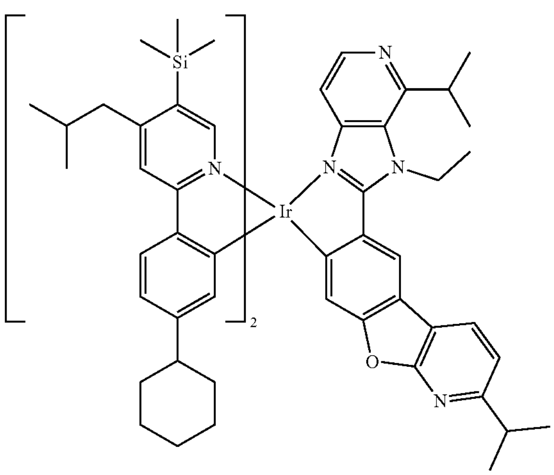
804
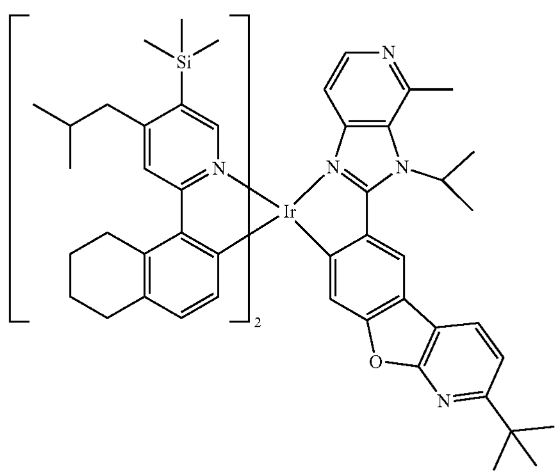

-continued
805
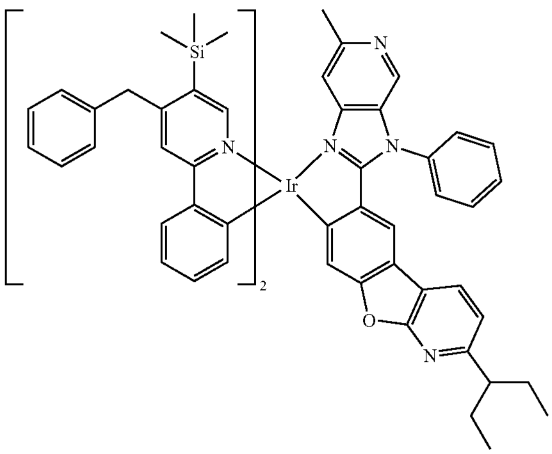
806
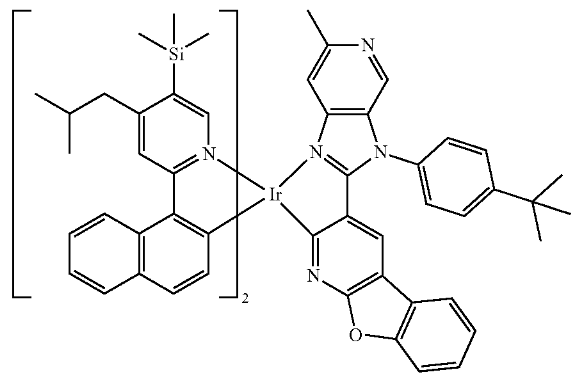
807
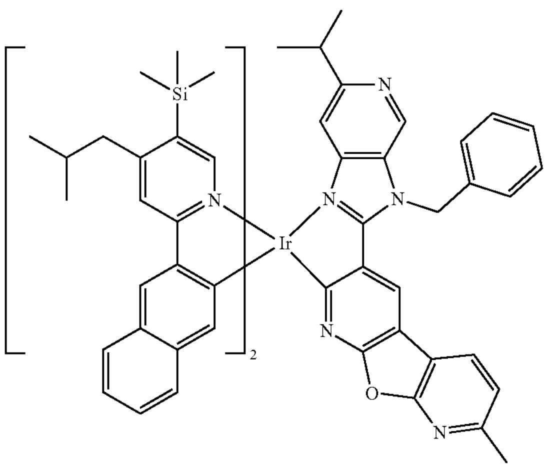
808
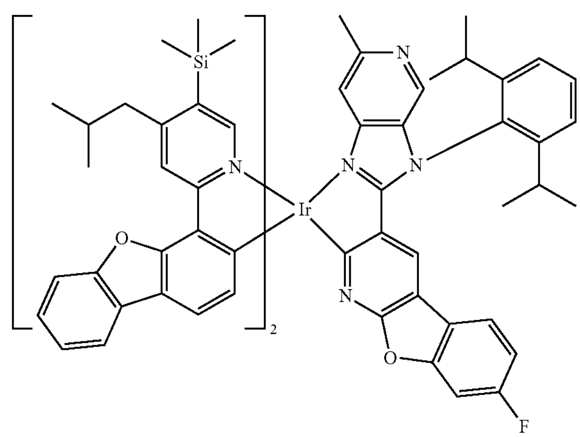
809
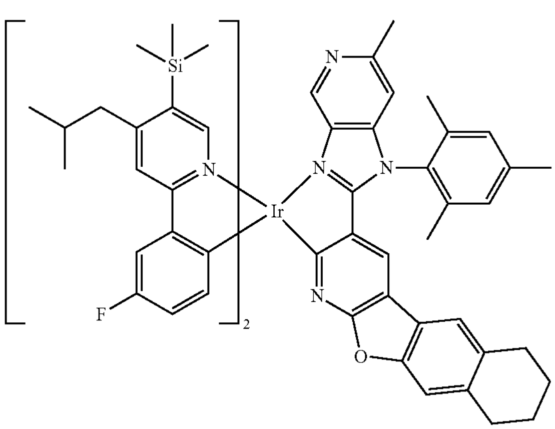
810
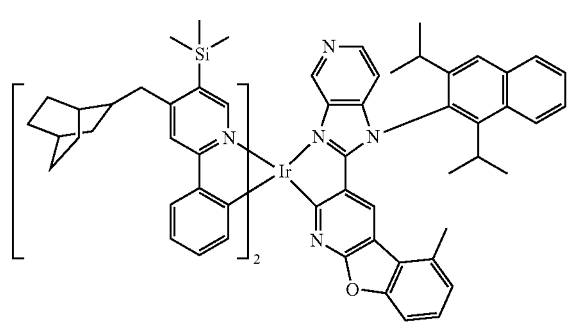

-continued
811
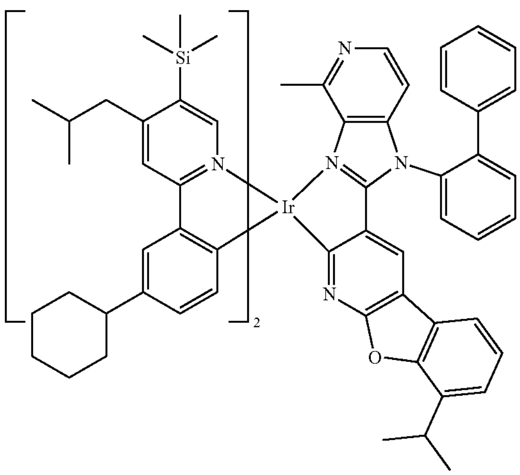
812
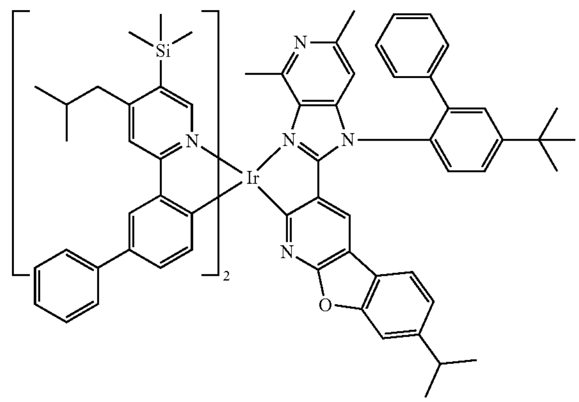
813
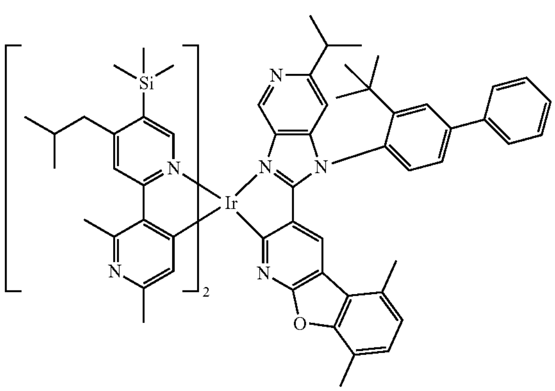
814
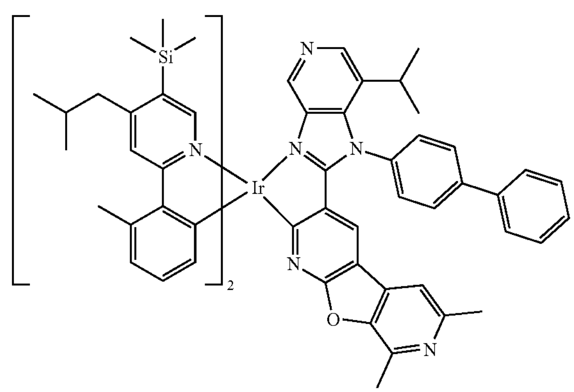
815
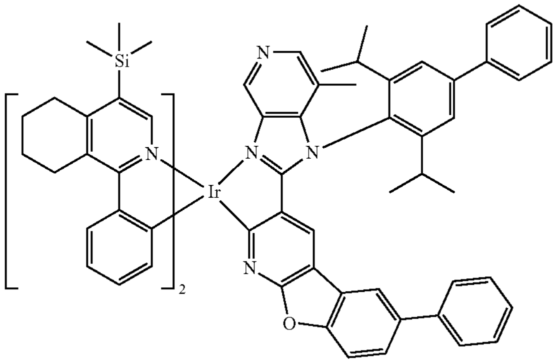
816
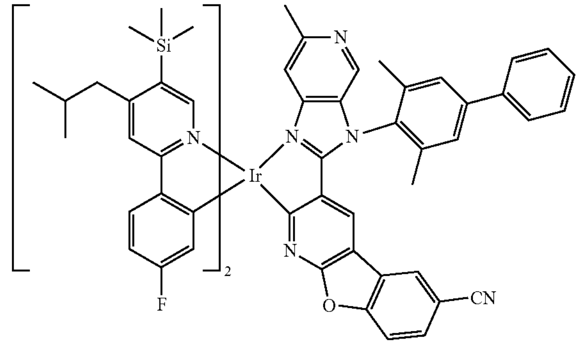

-continued
817
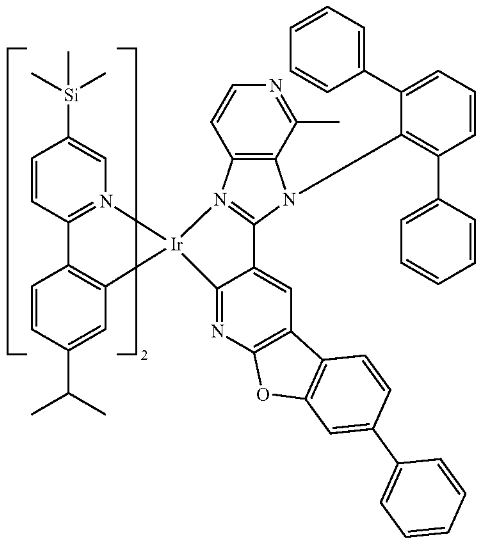
818
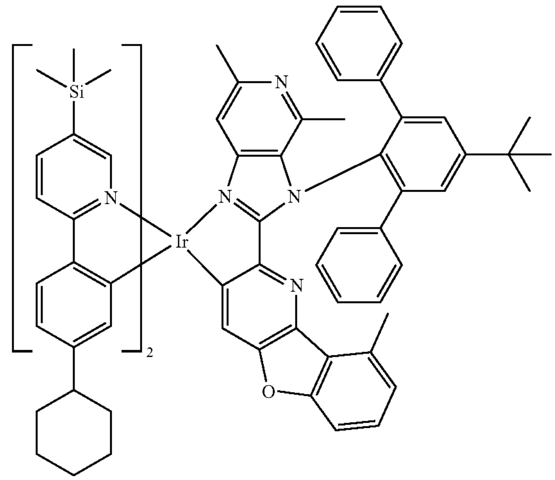
819
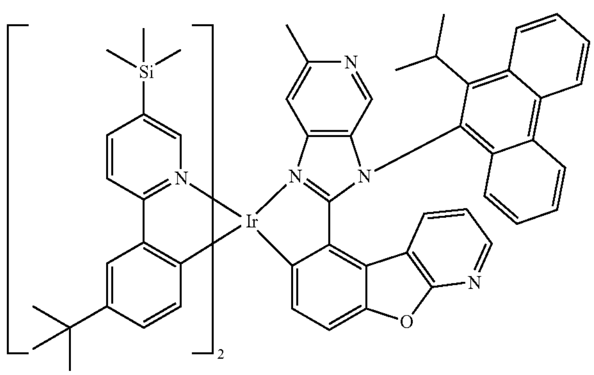
820
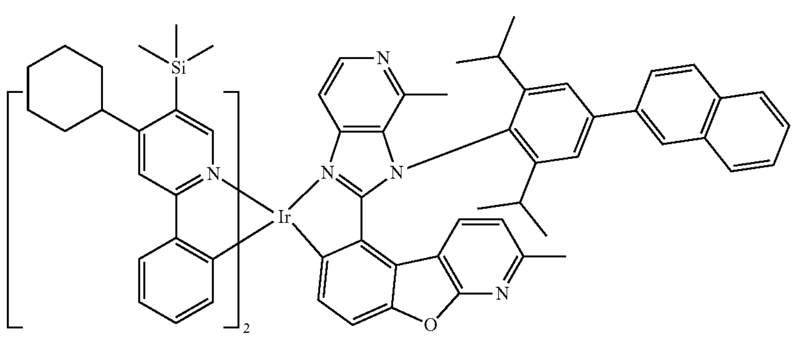

-continued
821
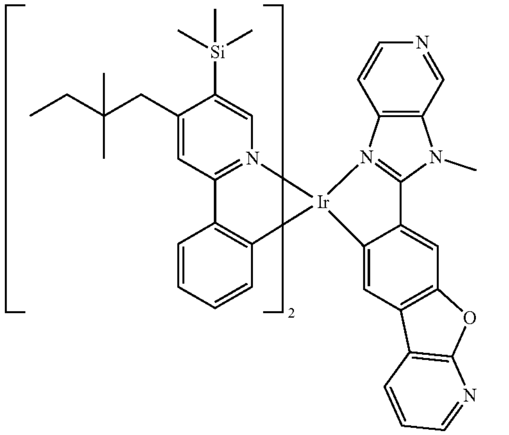
822
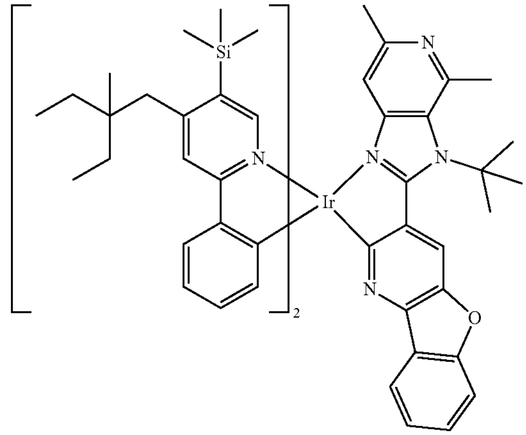
823
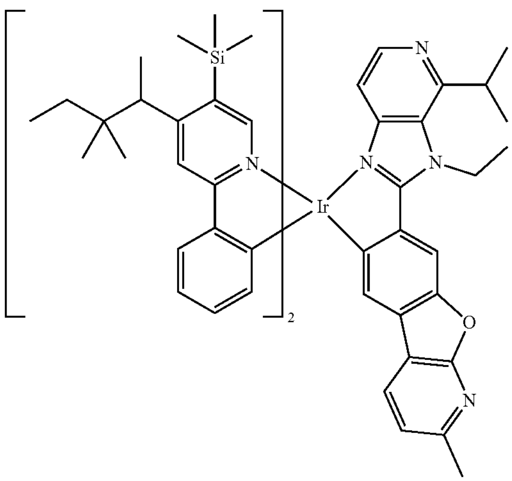
824
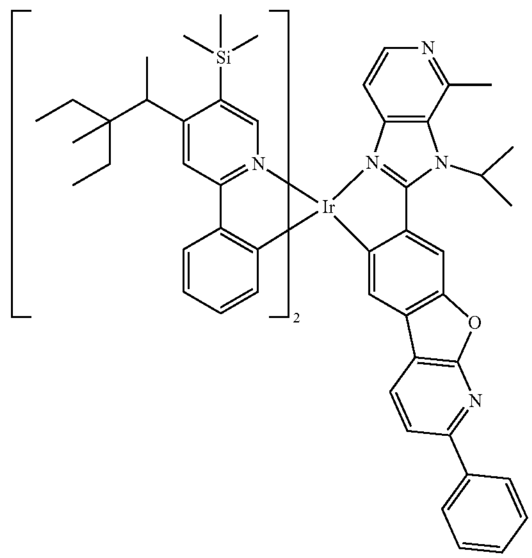
825
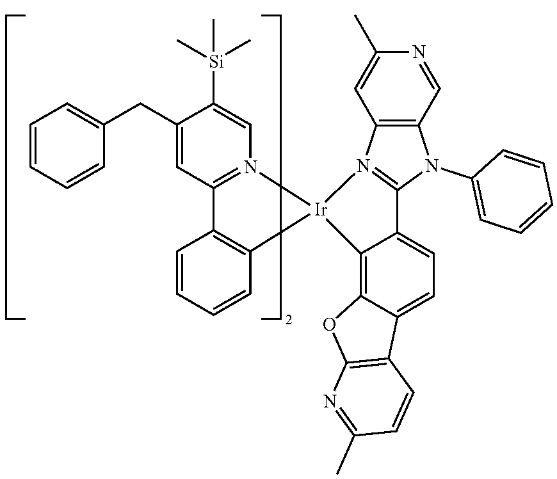
826
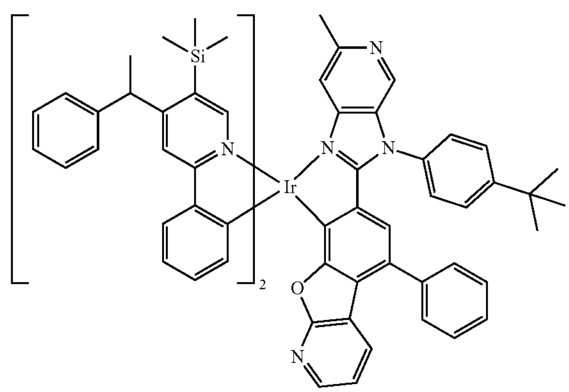

-continued
827
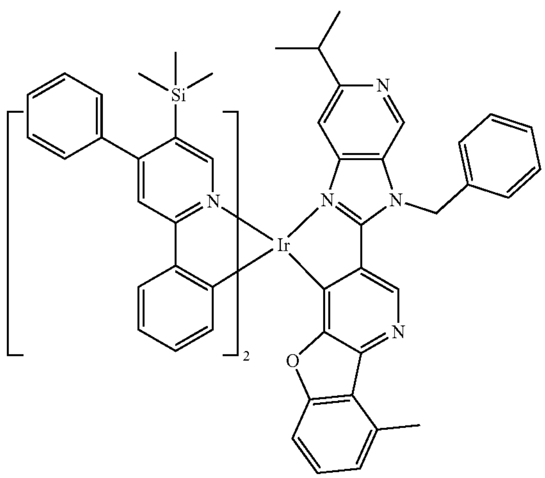
828
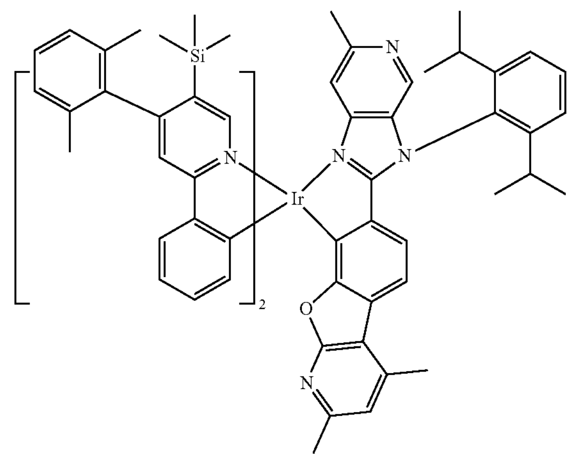
829
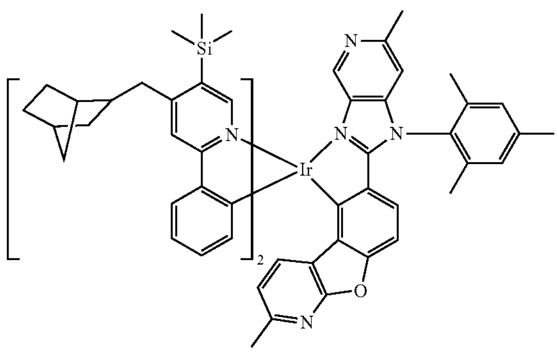
830
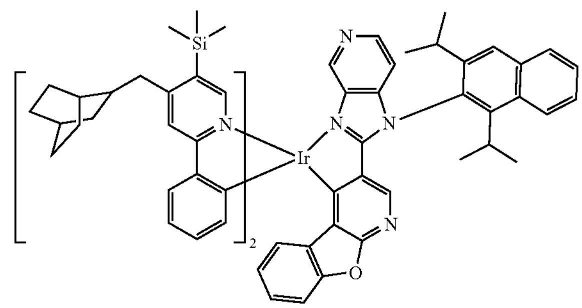
831
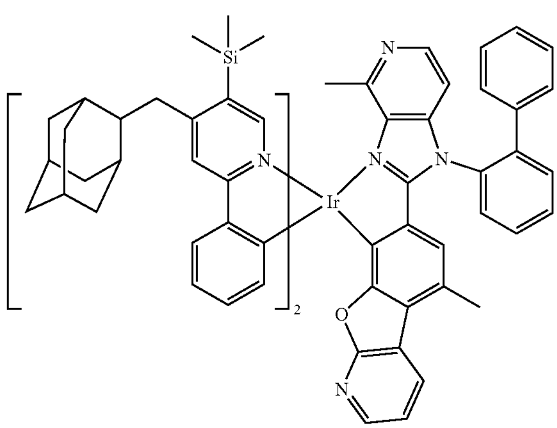
832
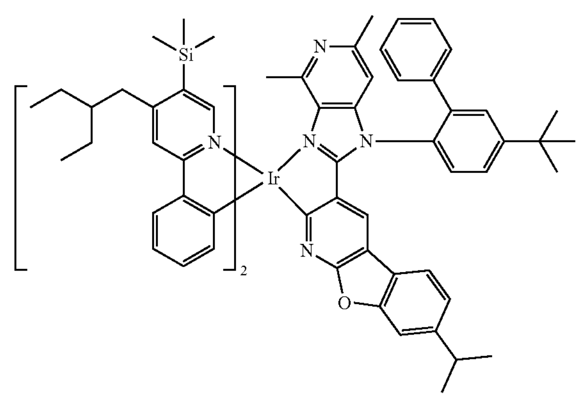
833
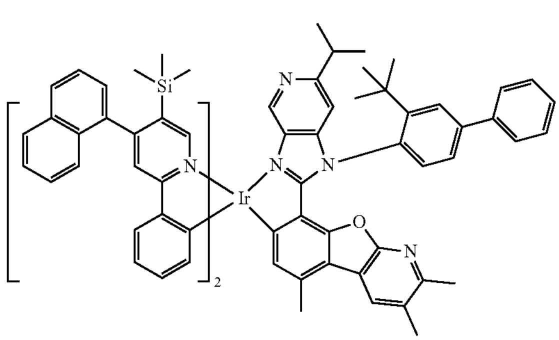
834
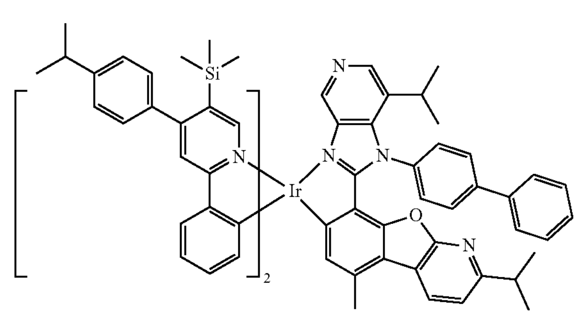

-continued
835
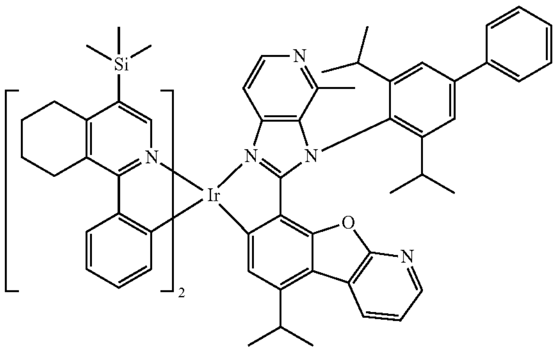
836
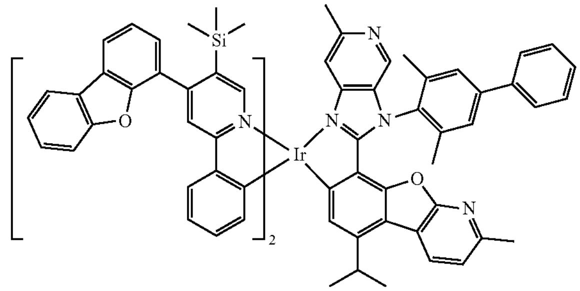
837
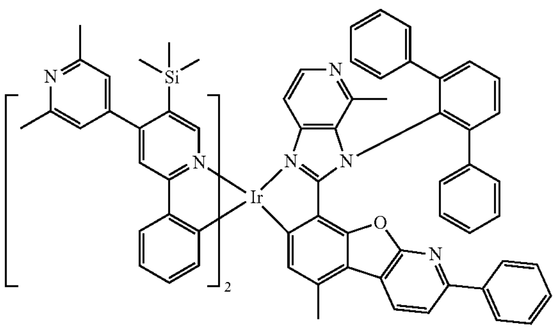
838
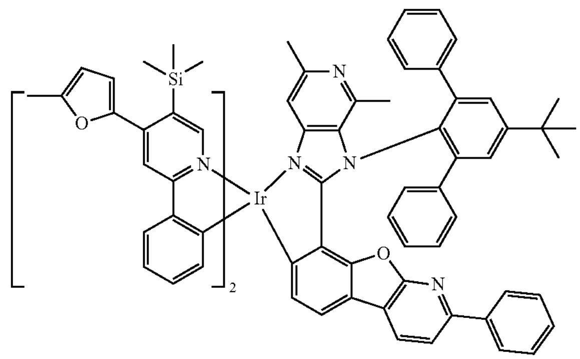
839
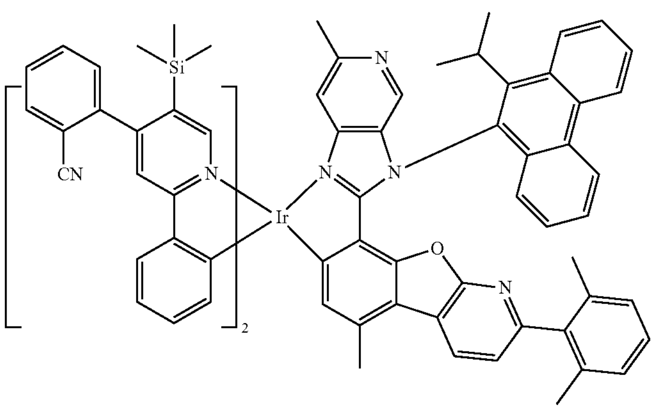
840
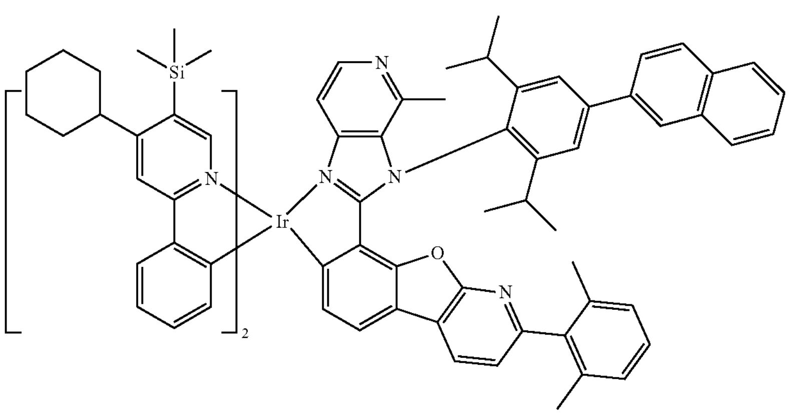

-continued
841
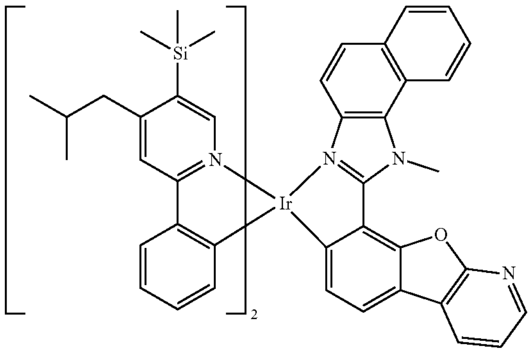
842
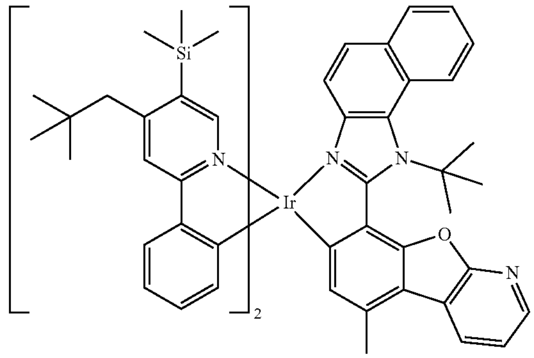
843
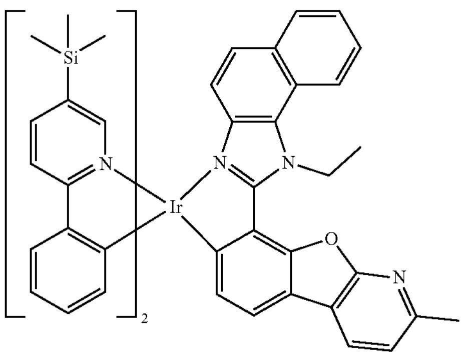
844
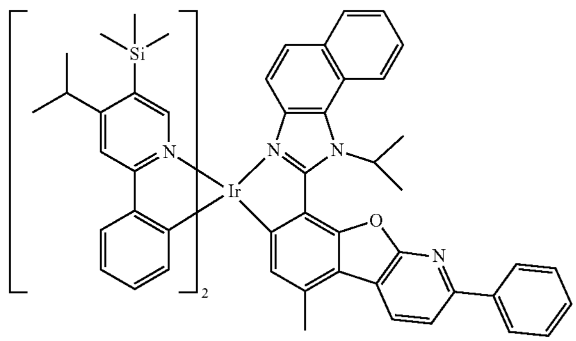
845
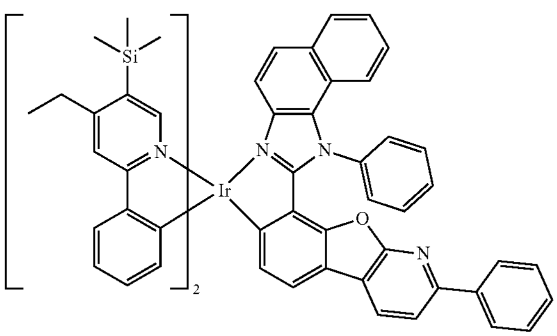
846
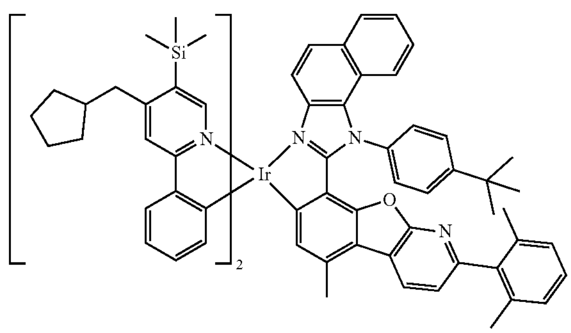
847
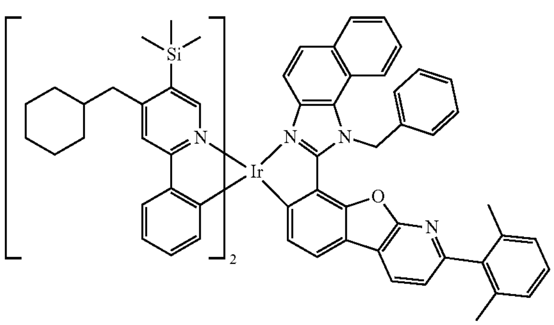
848
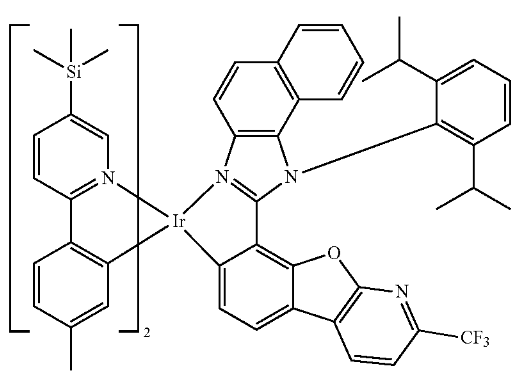

-continued
849
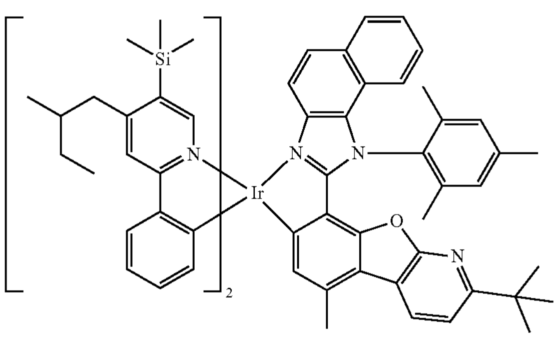
850
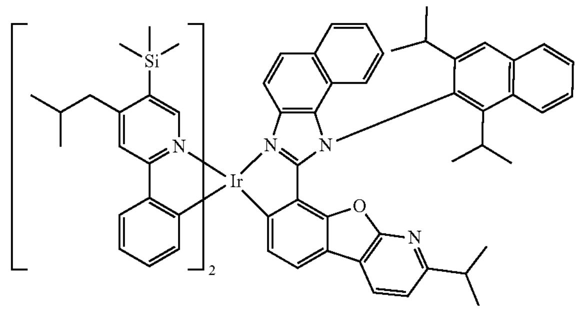
851
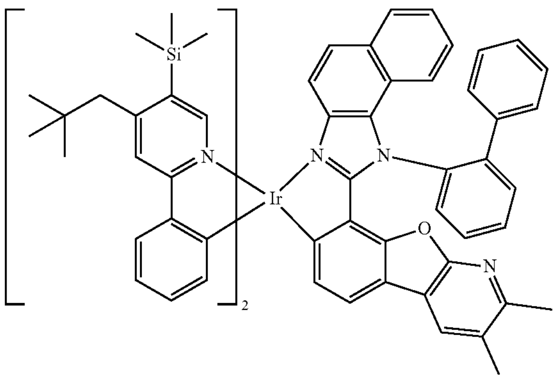
852
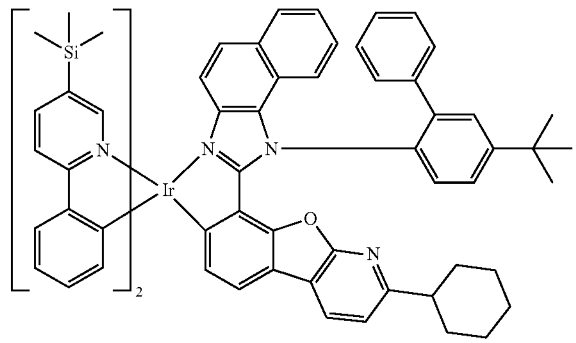
853
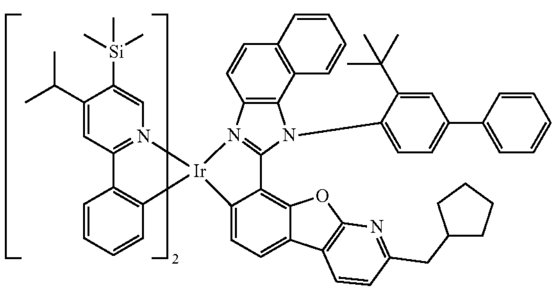
854
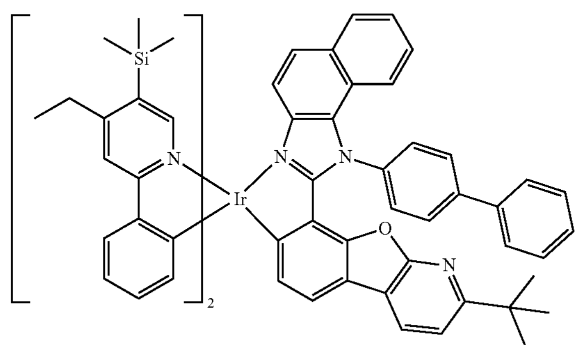
855
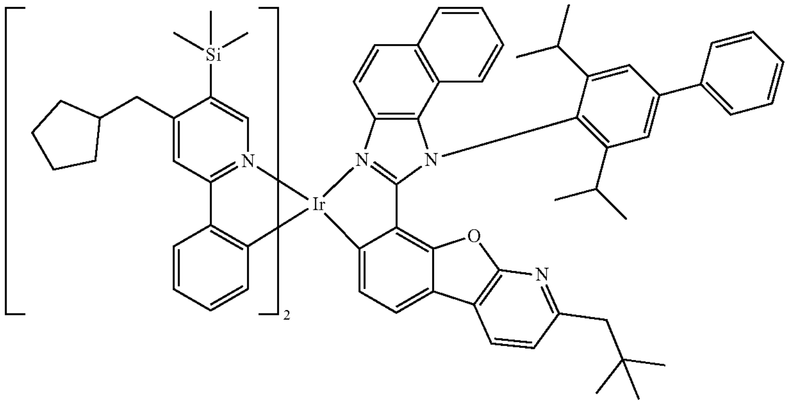

-continued
856
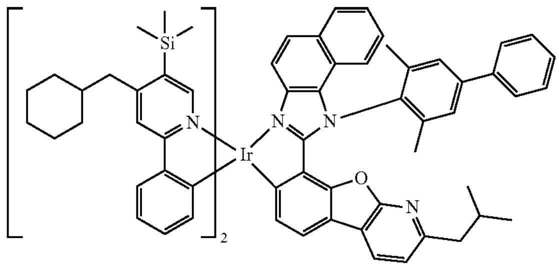
857
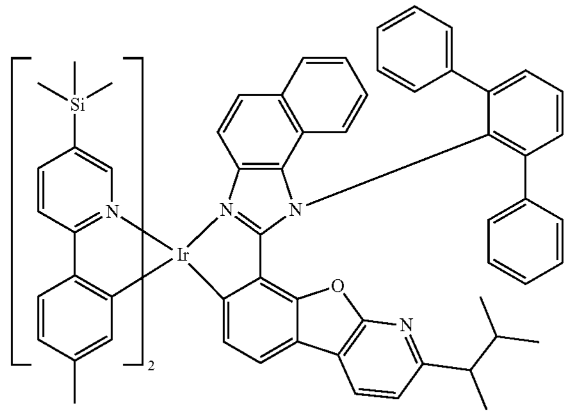
858
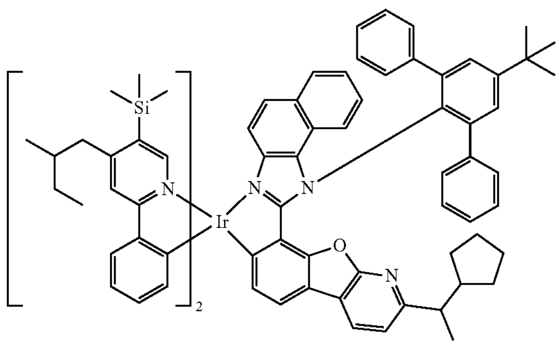
859
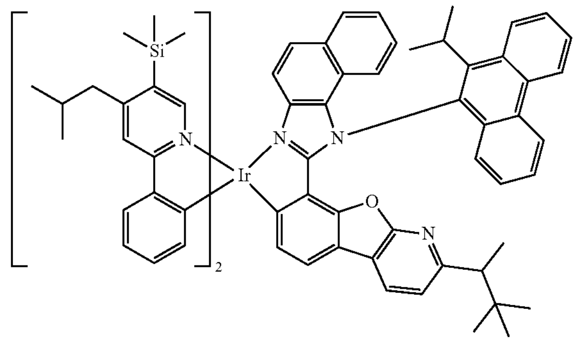
860
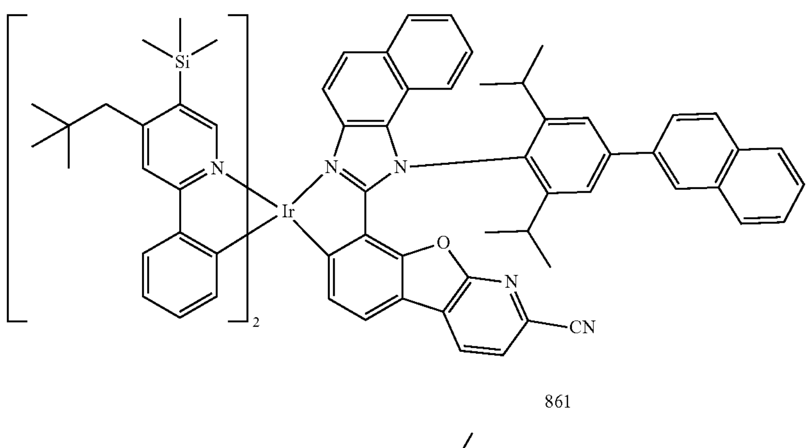
861
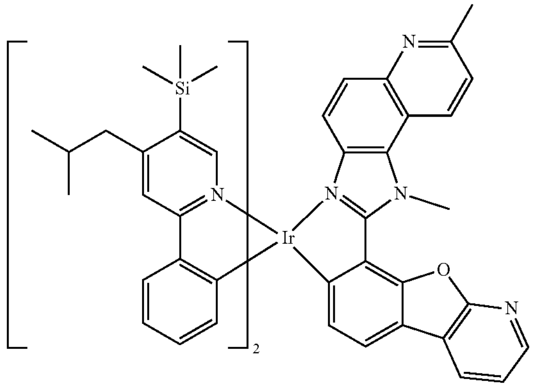
862
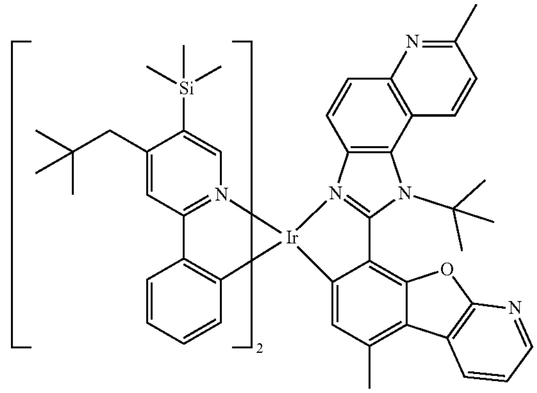

-continued
863
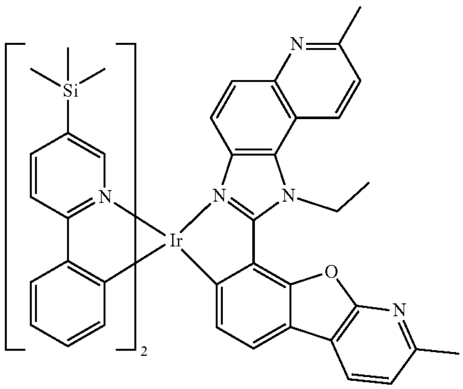
864
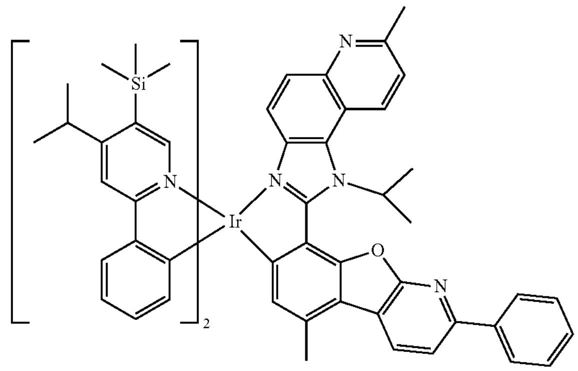
865
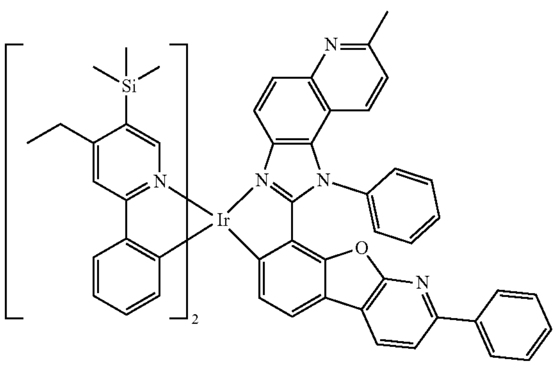
866
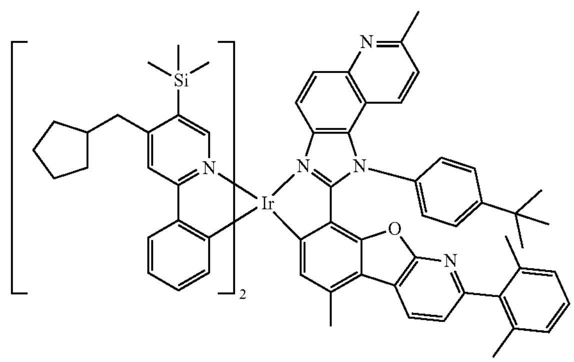
867
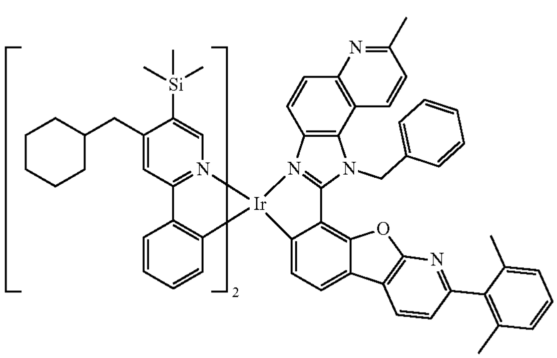
868
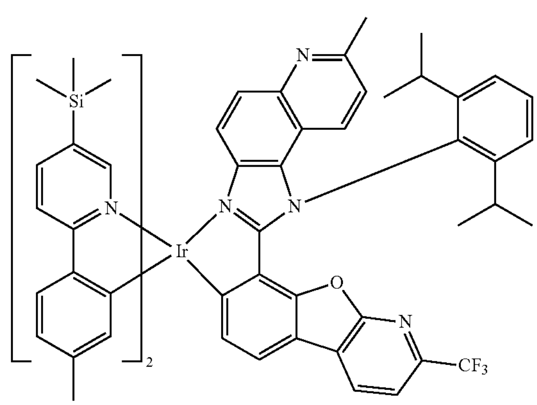
869
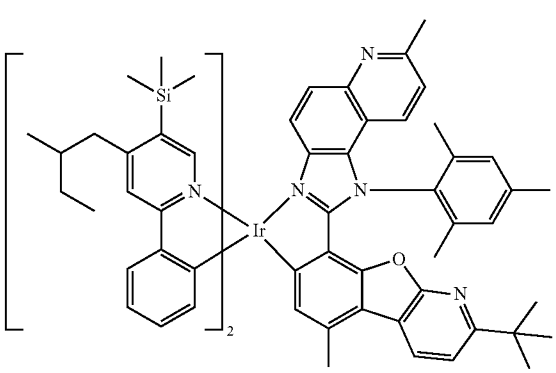
870
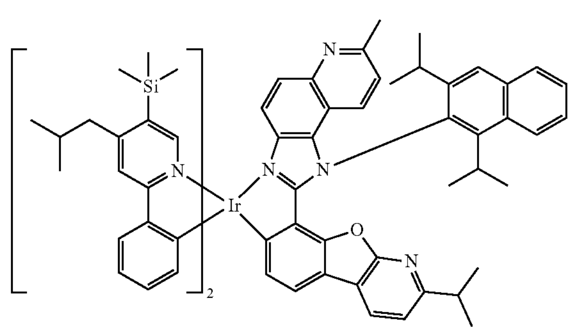

-continued
871
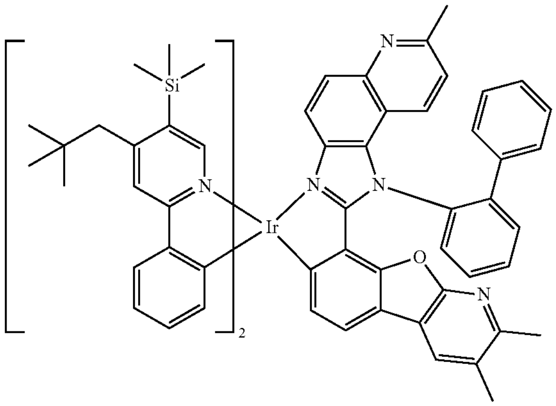
872
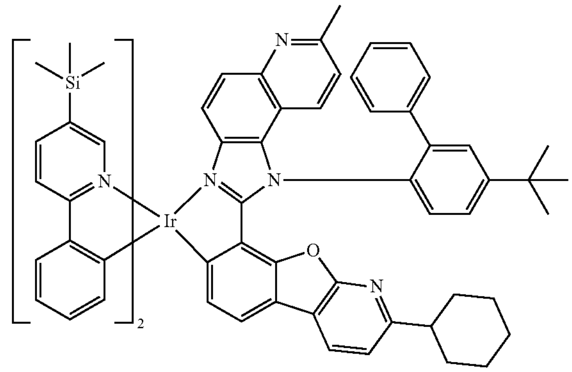
873
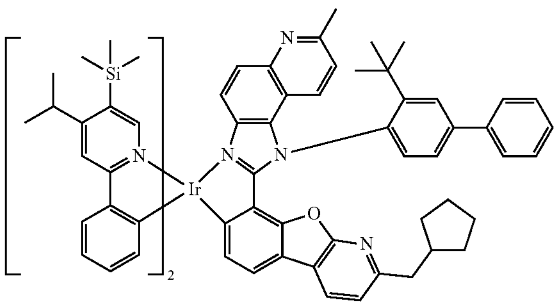
874
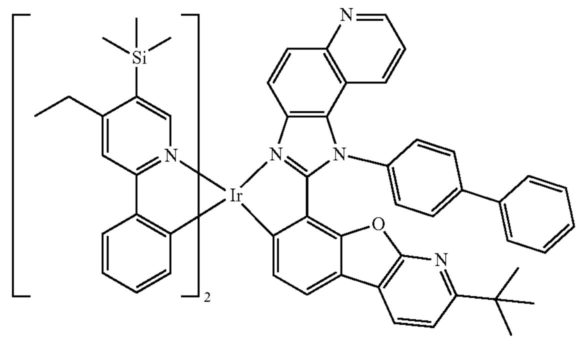
875
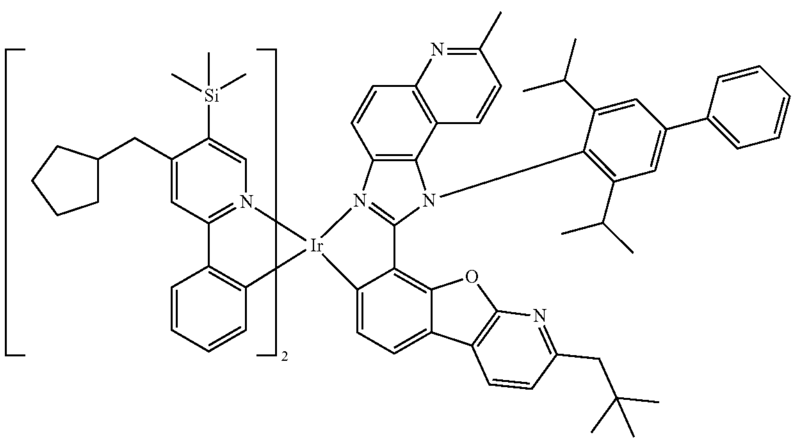
876
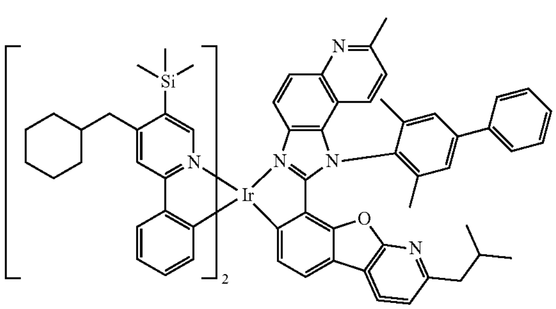
877
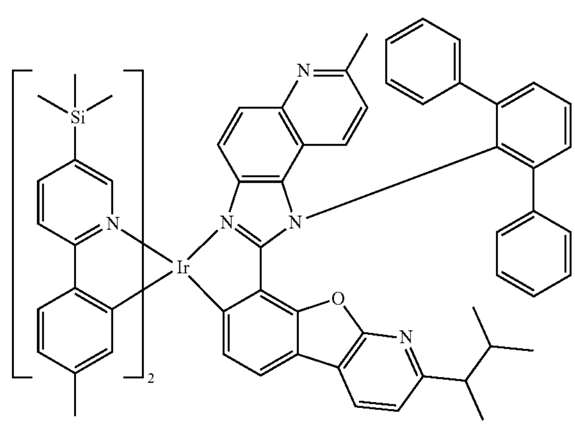

-continued
878
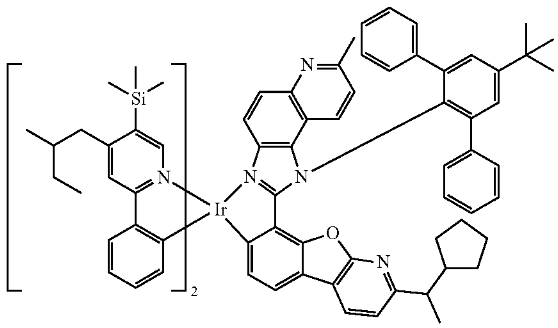
879
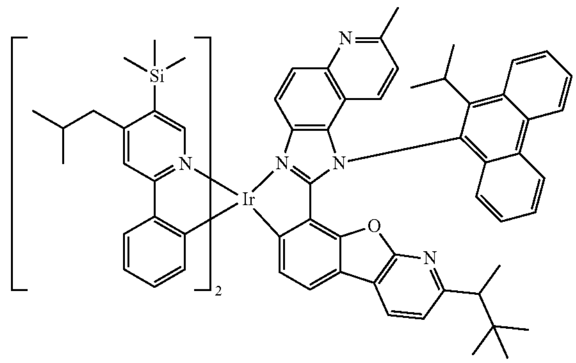
880
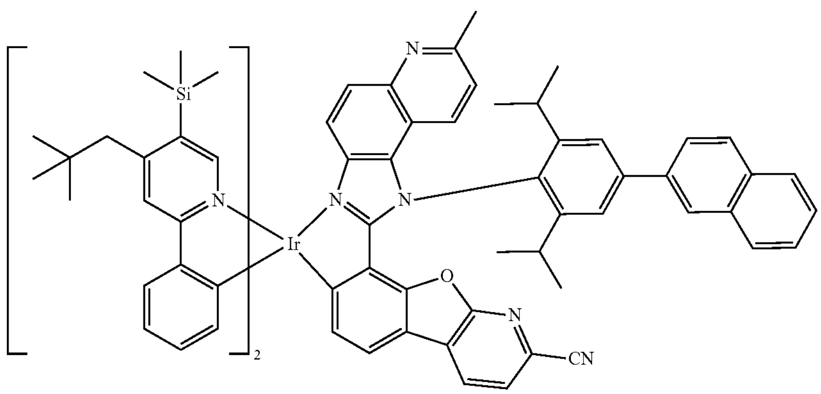
881
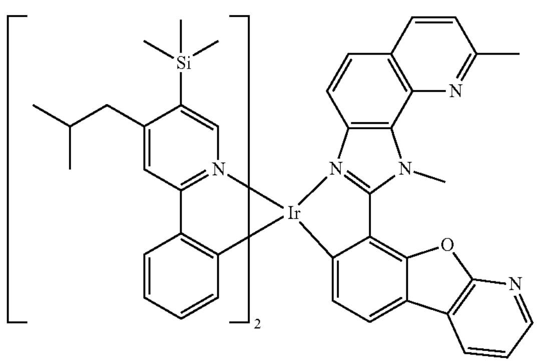
882
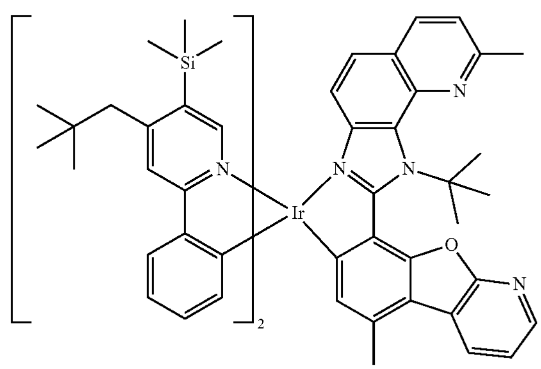
883
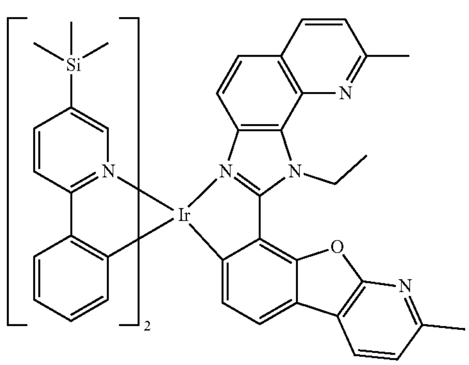
884
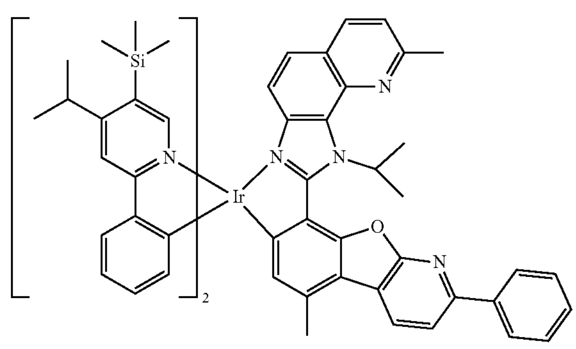

-continued
885
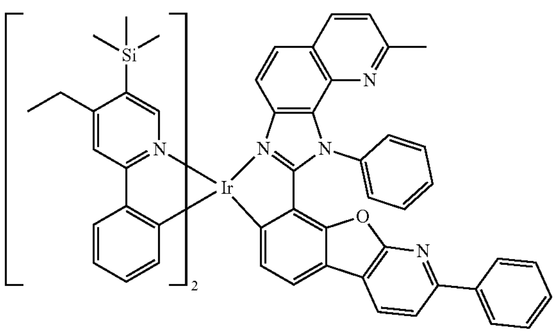
886
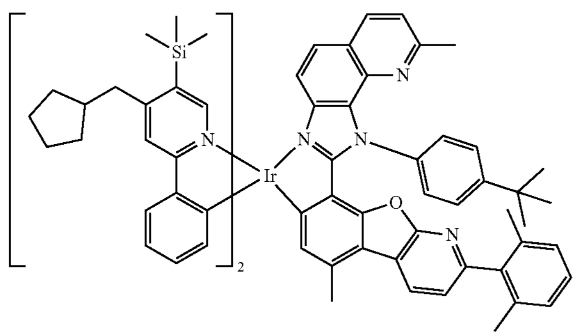
887
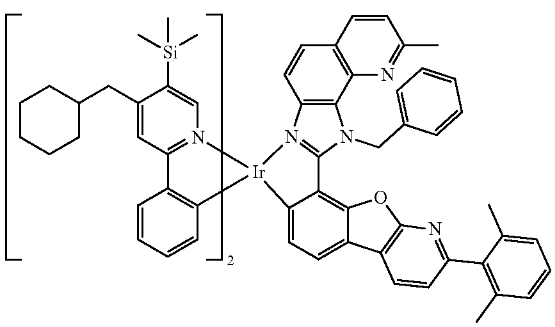
888
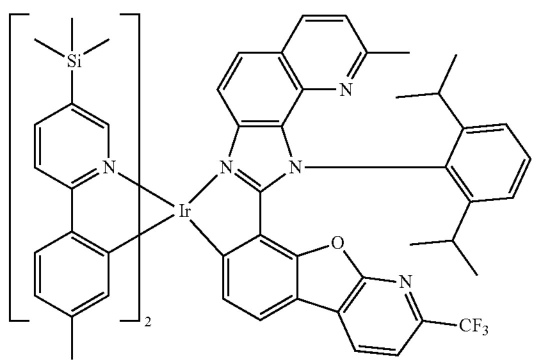
889
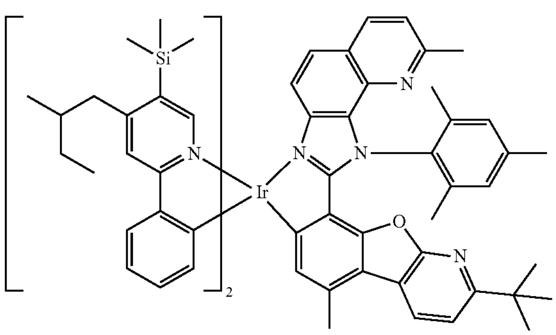
890
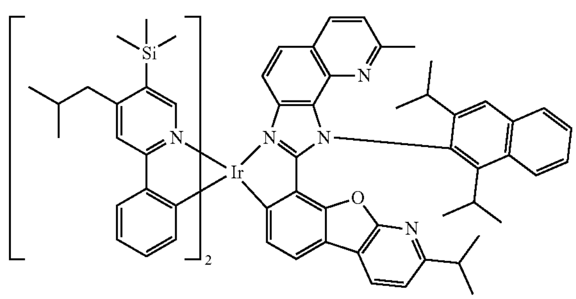
891
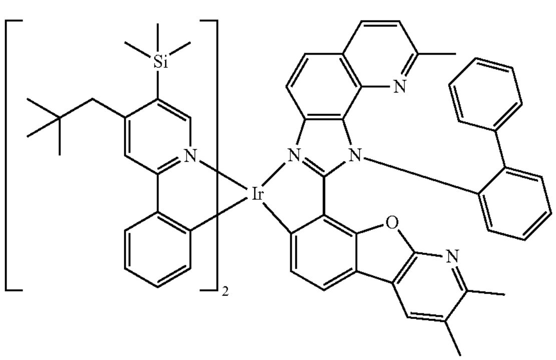
892
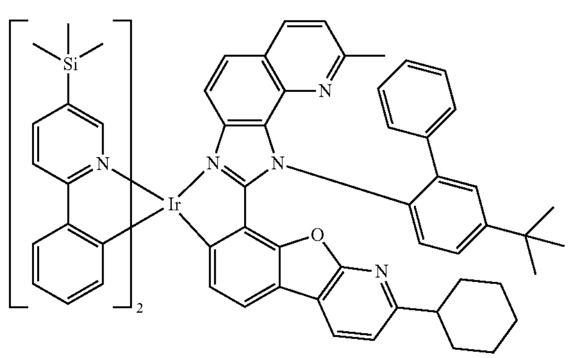

-continued
893
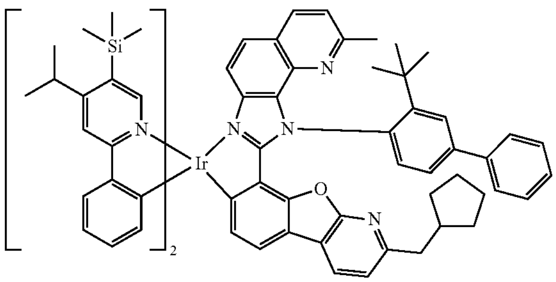
894
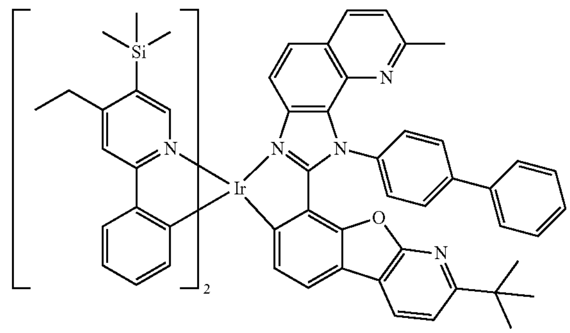
895
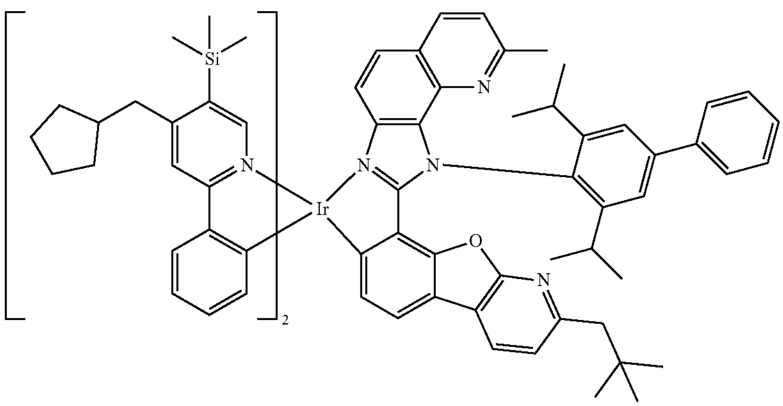
896
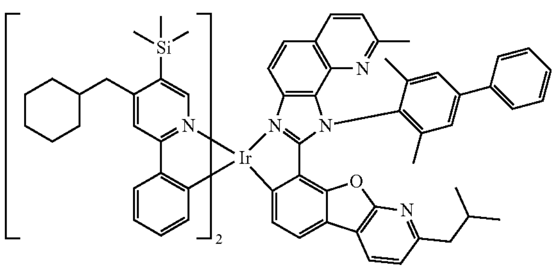
897
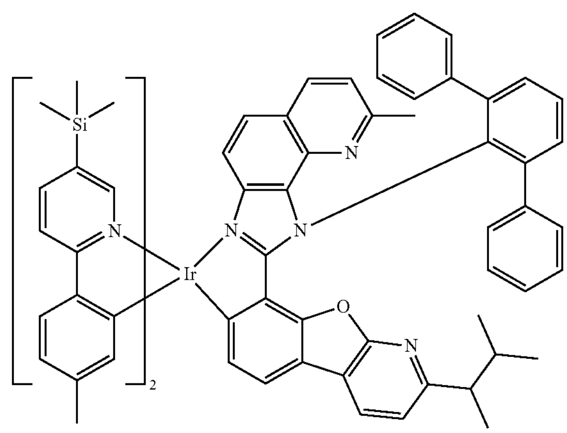
898
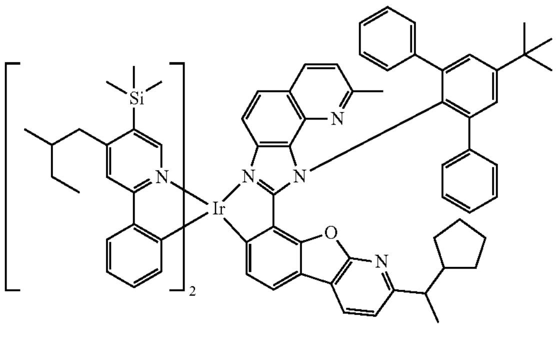
899
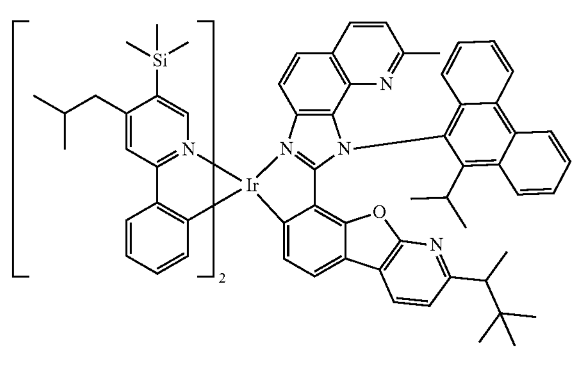

-continued
900
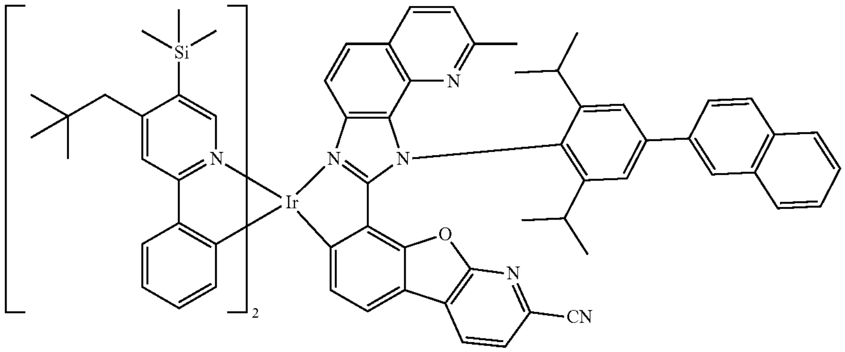
901
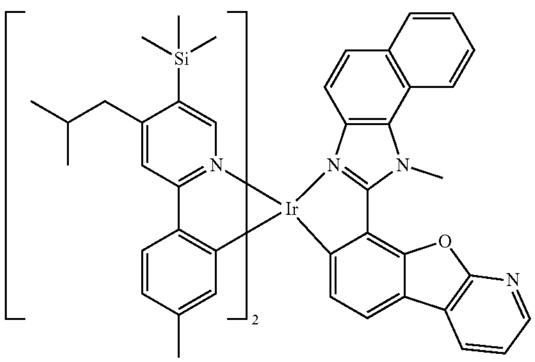
902
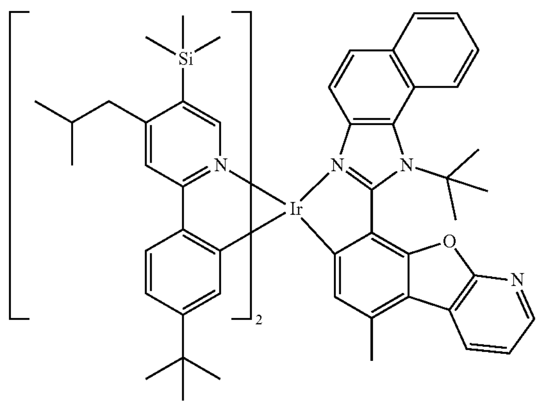
903
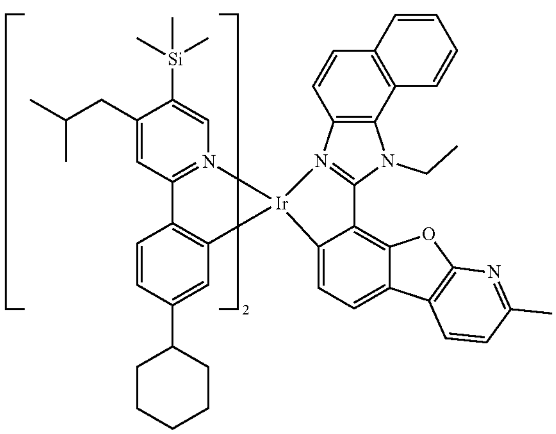
904
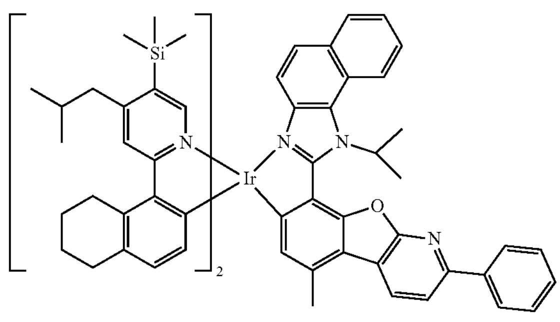
905
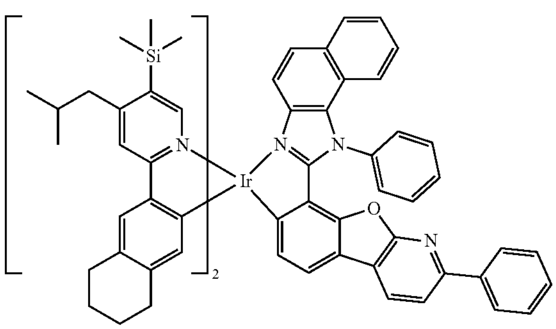
906
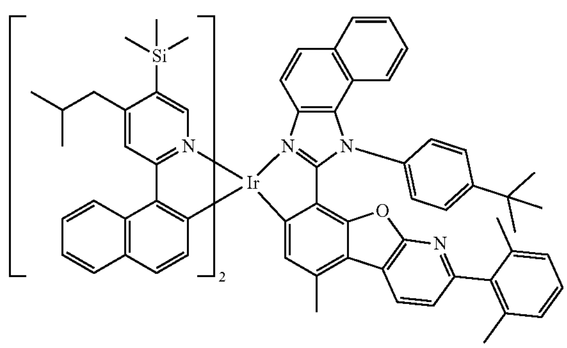

-continued
907
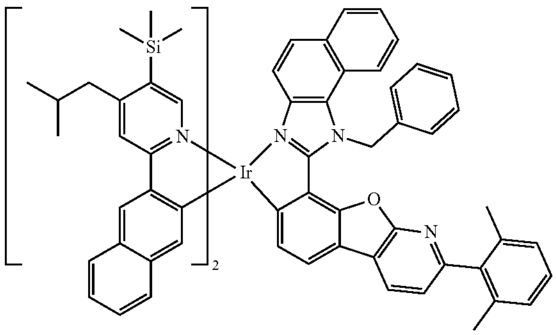
908
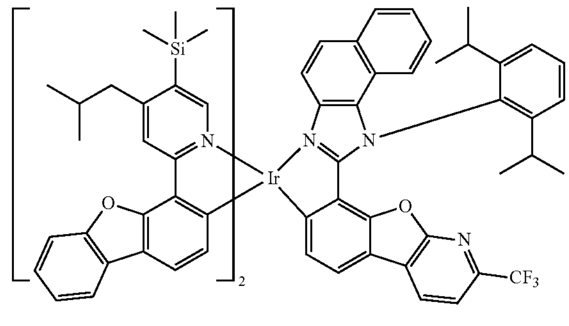
909
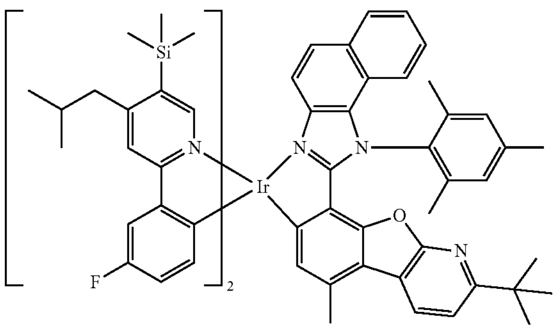
910
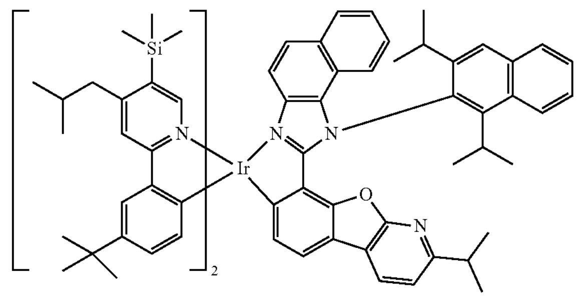
911
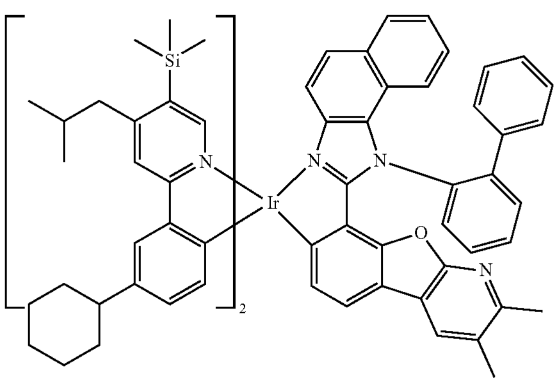
912
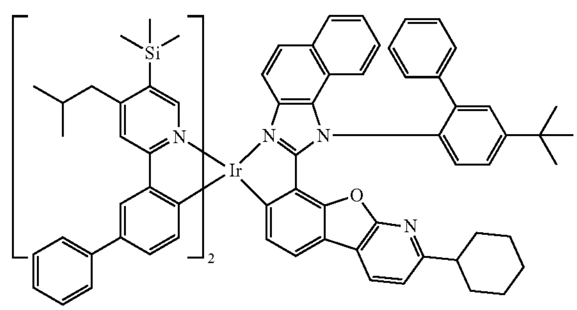
913
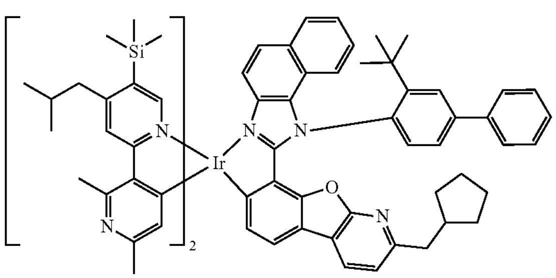
914
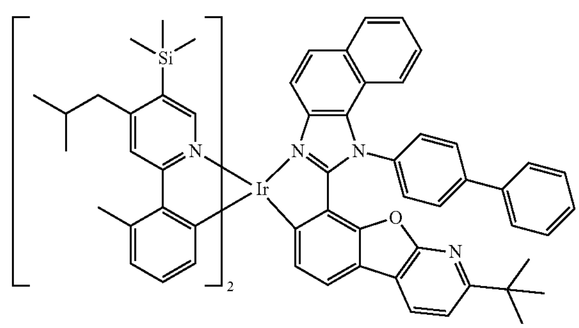

-continued
915
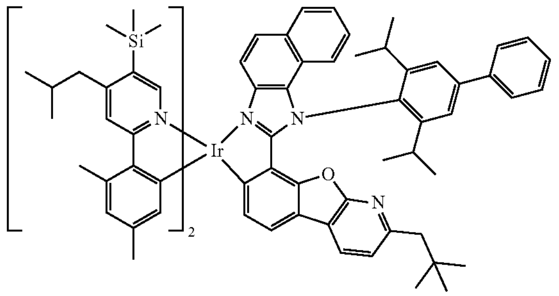
916
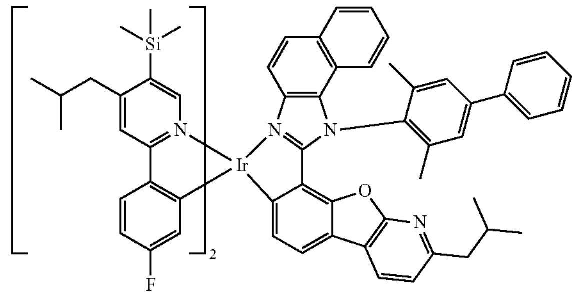
917
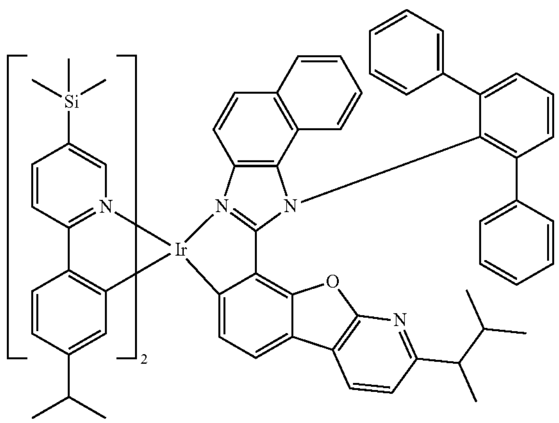
918
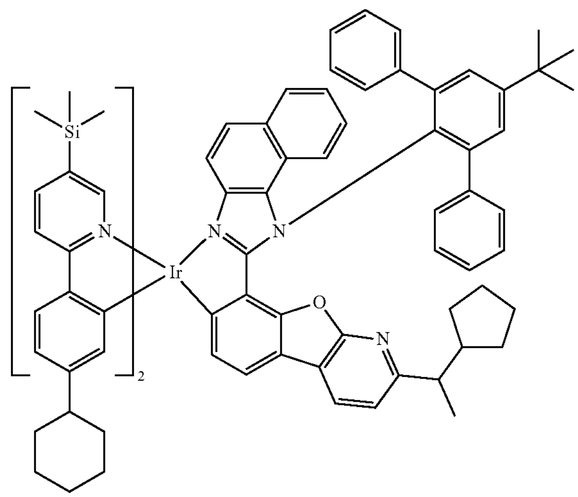
919
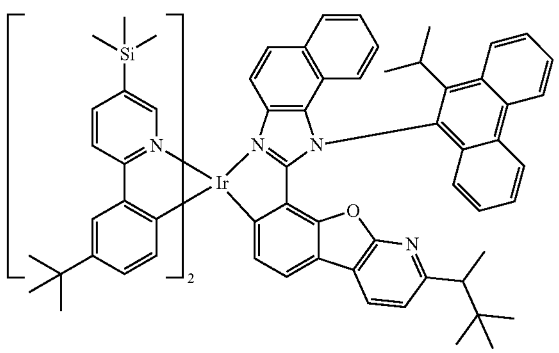
920
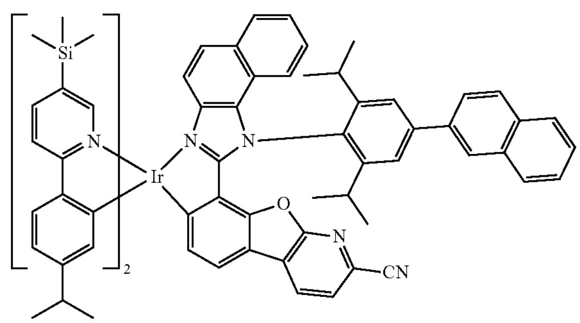
921
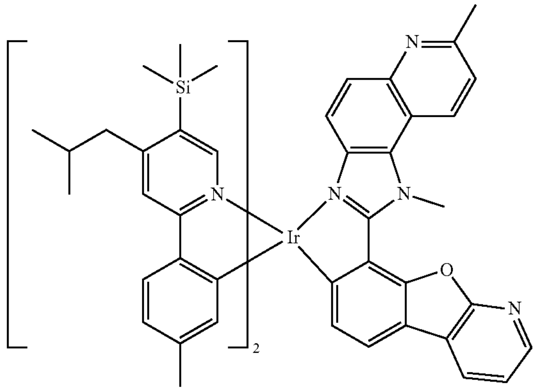
922
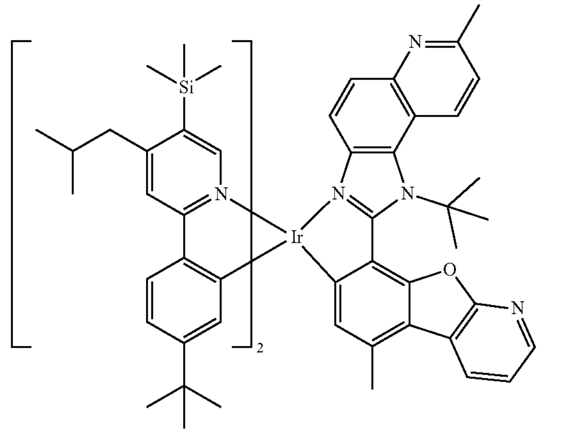

-continued
923
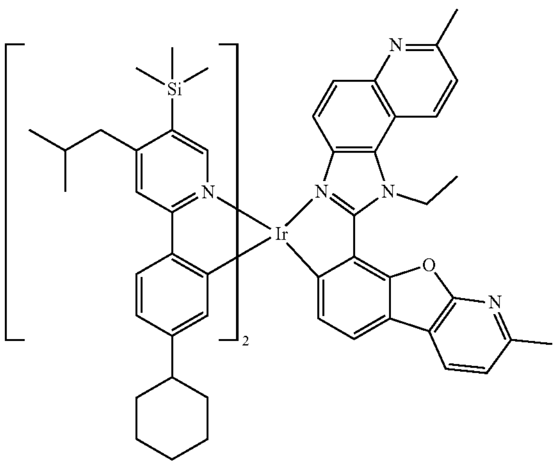
924
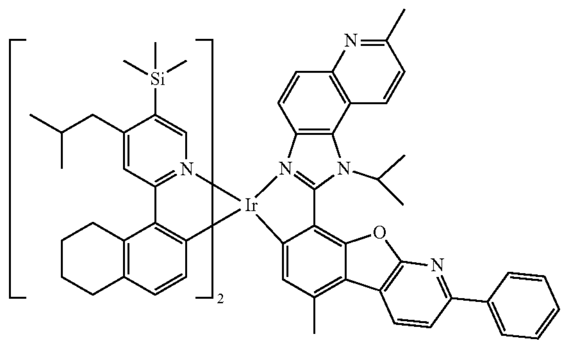
925
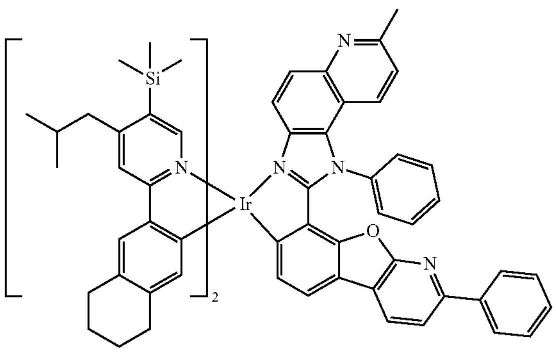
926
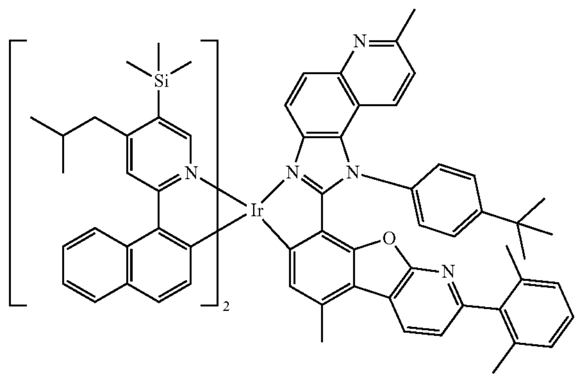
927
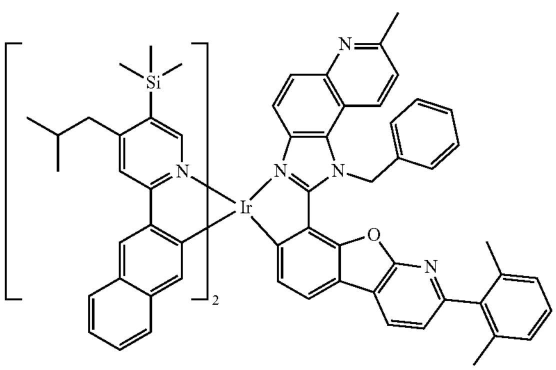
928
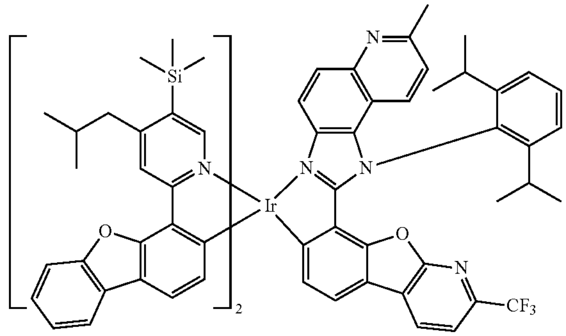
929
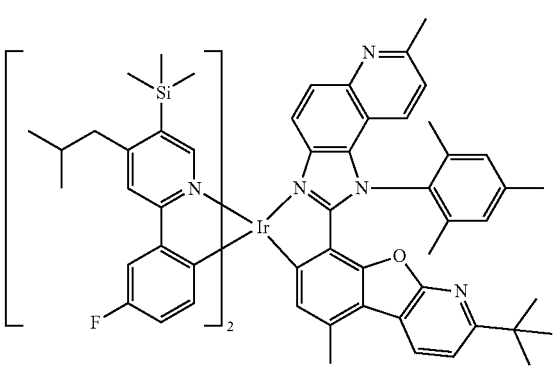
930
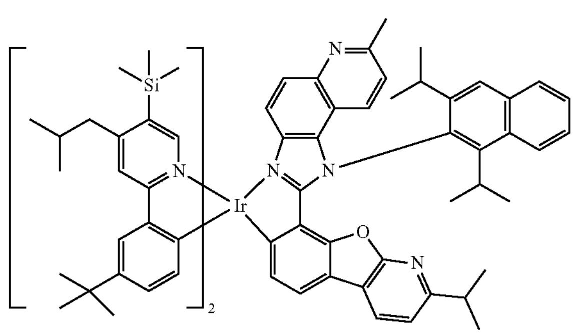

-continued
931
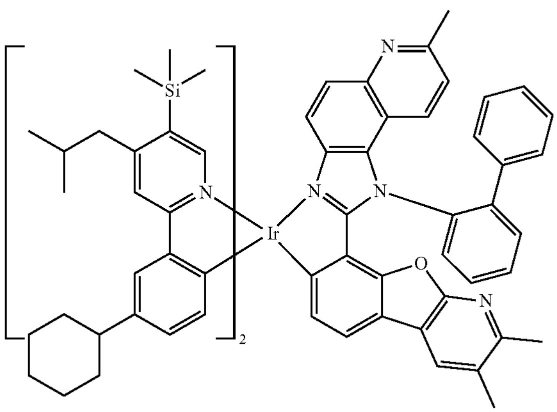
932
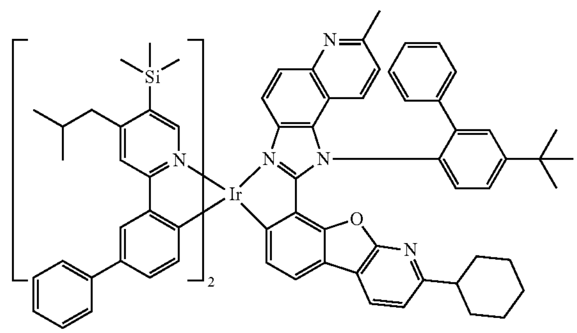
933
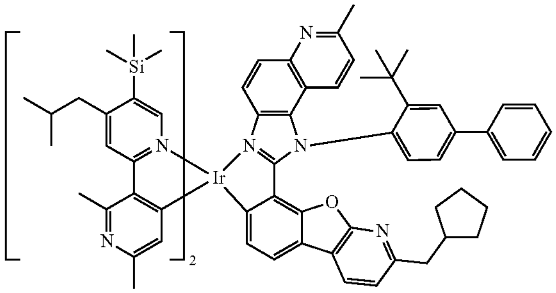
934
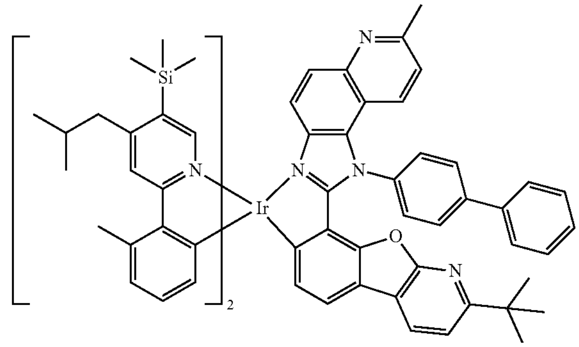
935
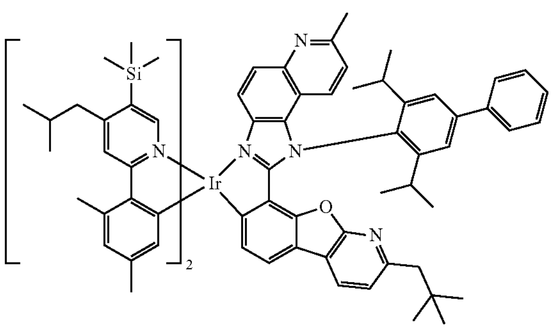
936
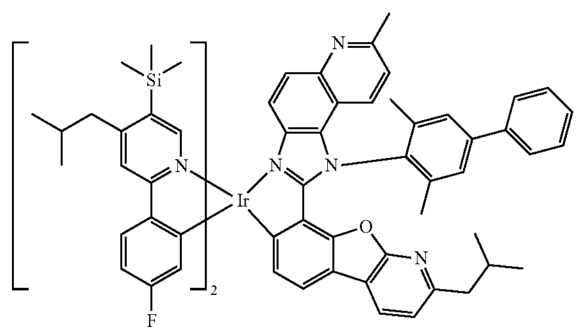
937
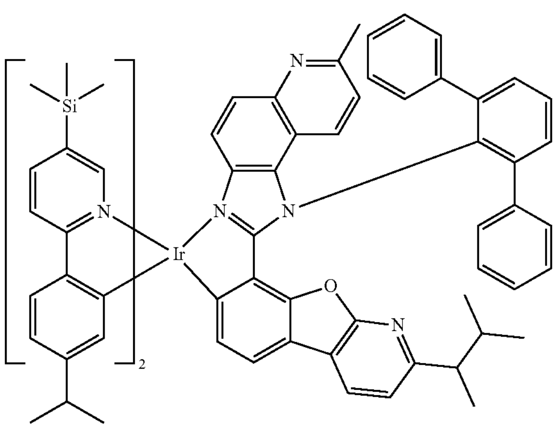
938
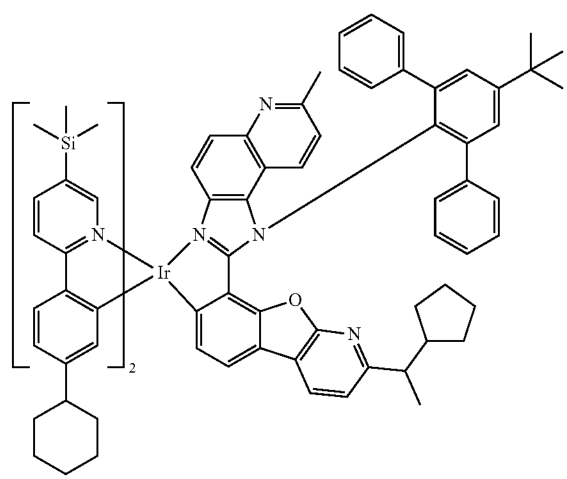

-continued
939
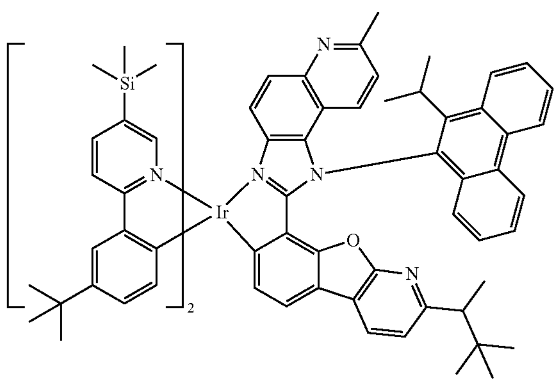
940
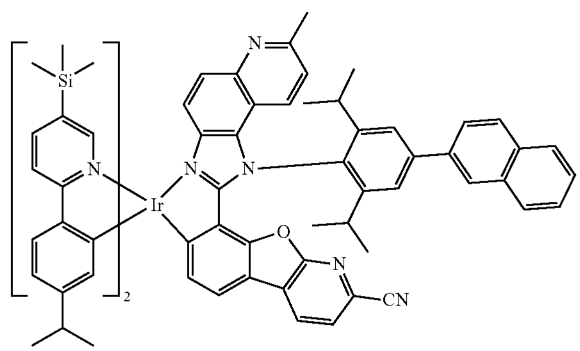
941
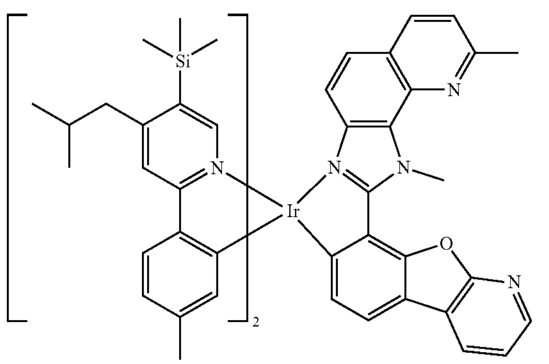
942
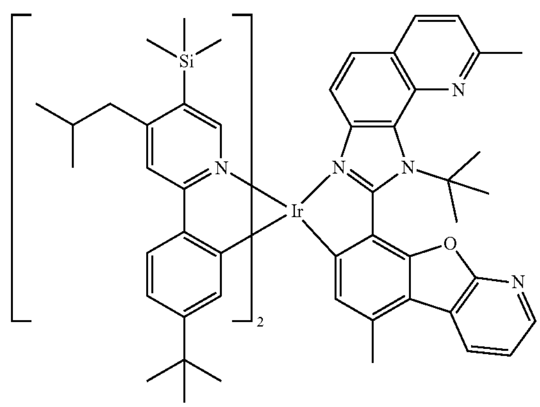
943
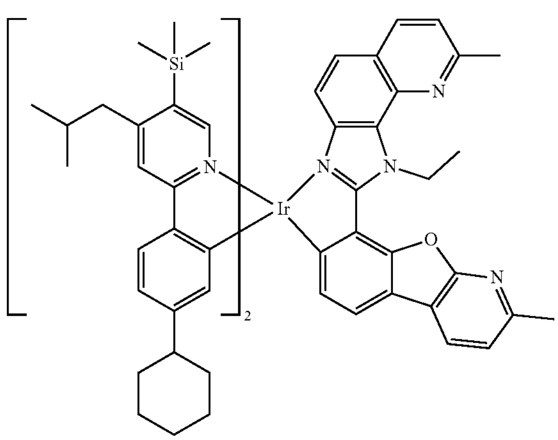
944
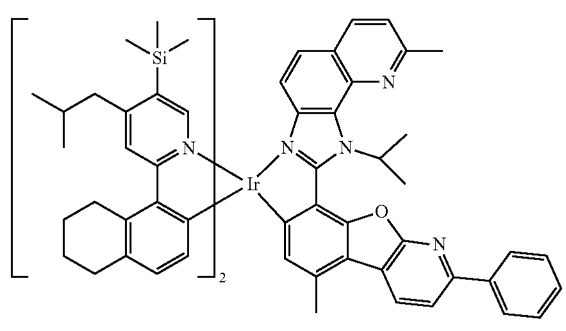
945
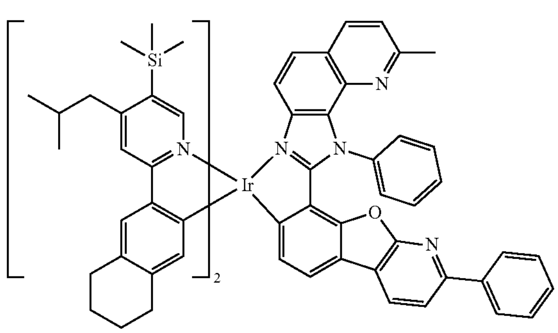
946
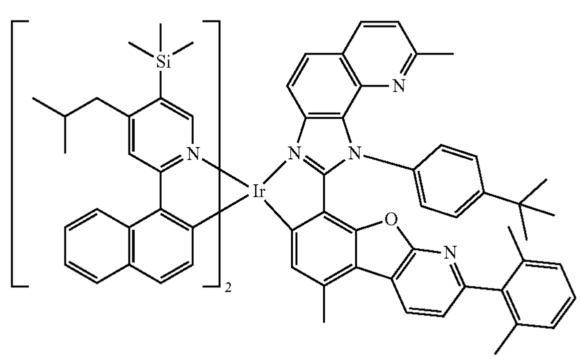

-continued
946
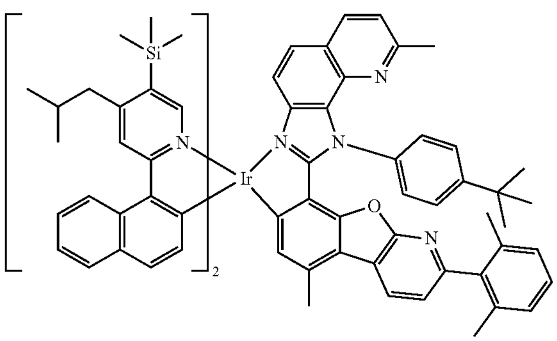
947
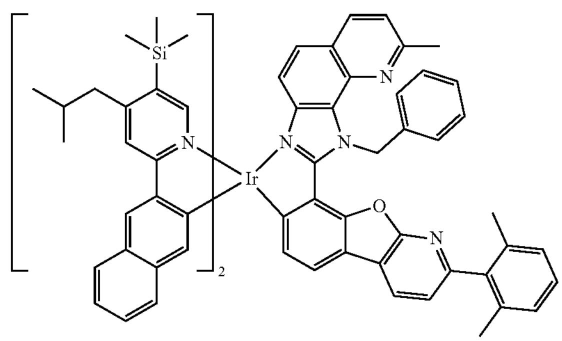
948
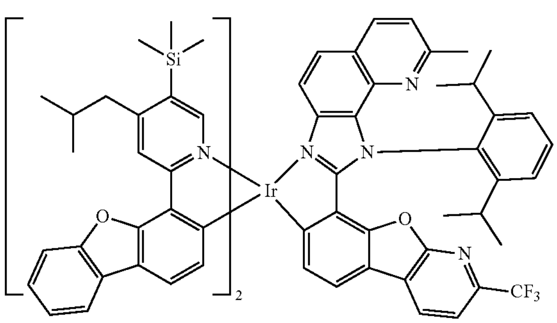
949
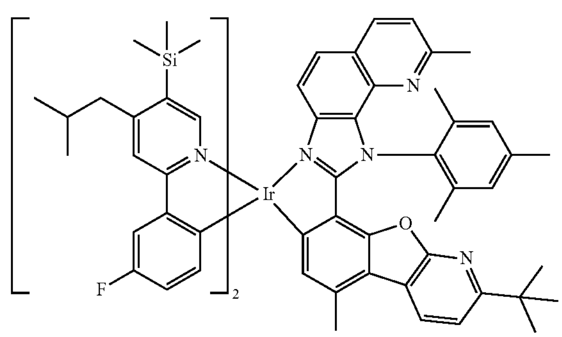
950
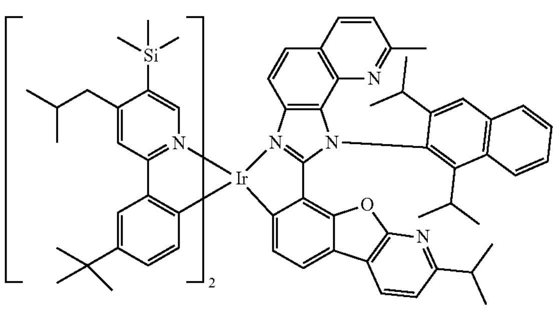
951
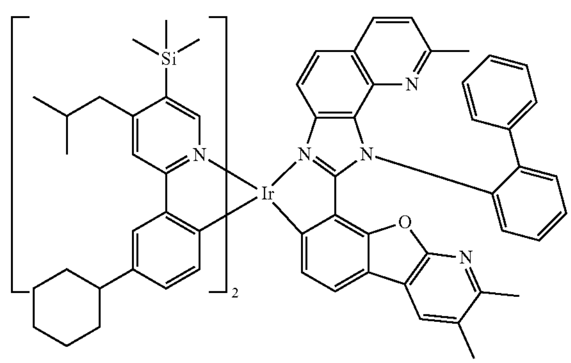
952
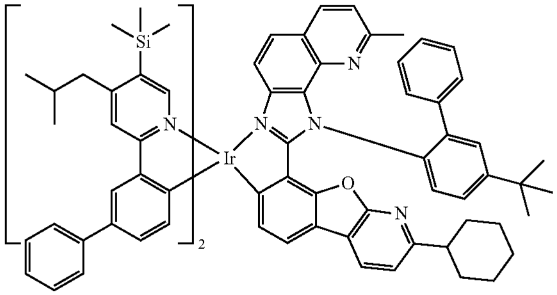
953
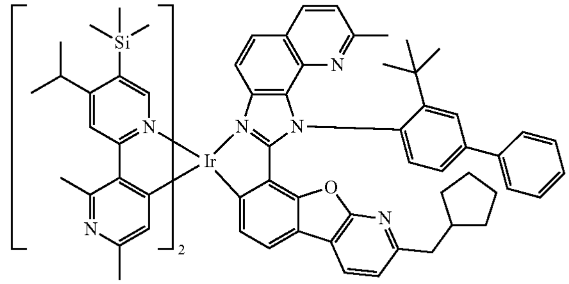

-continued
954
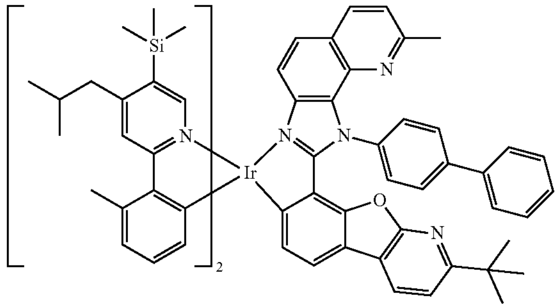
955
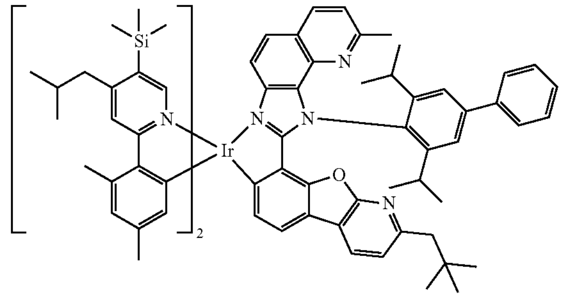
956
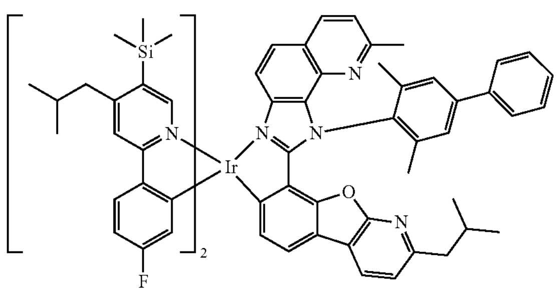
957
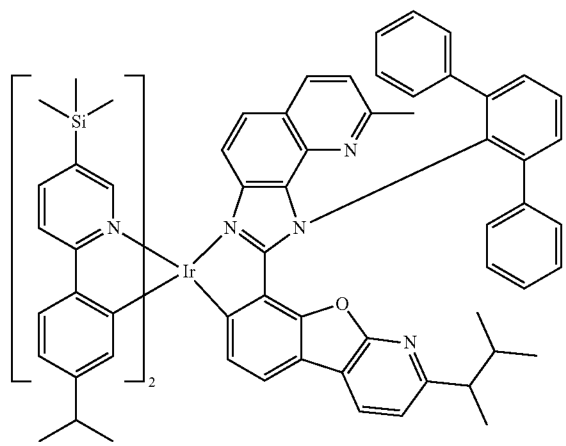
958
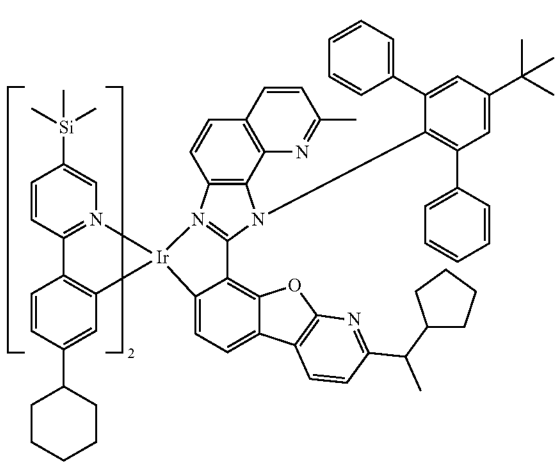
959
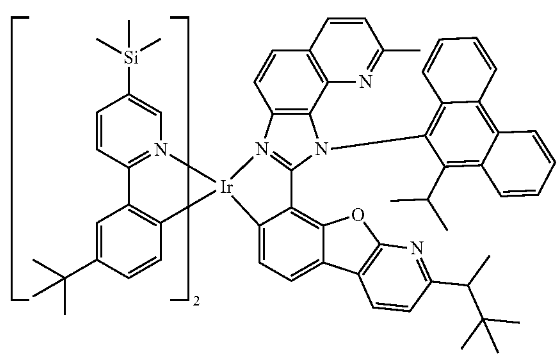

-continued
960
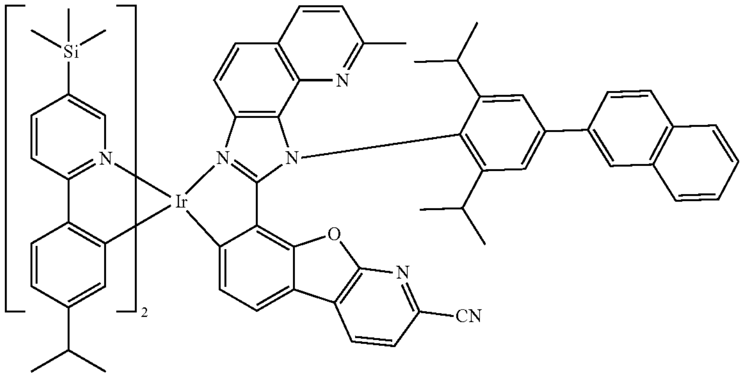
961
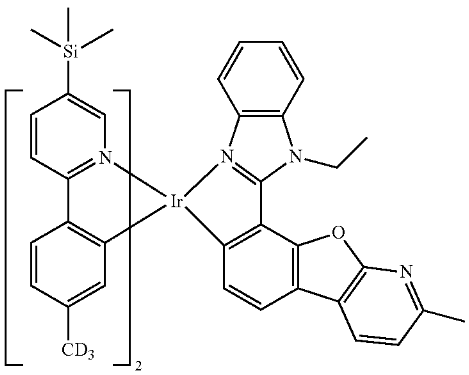
962
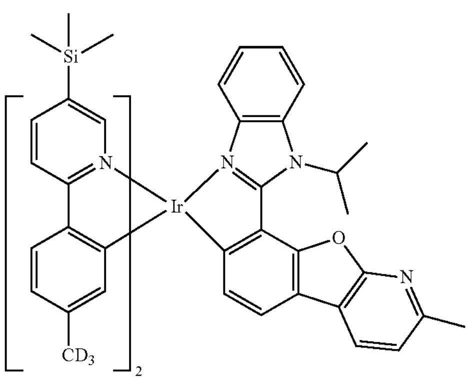
963
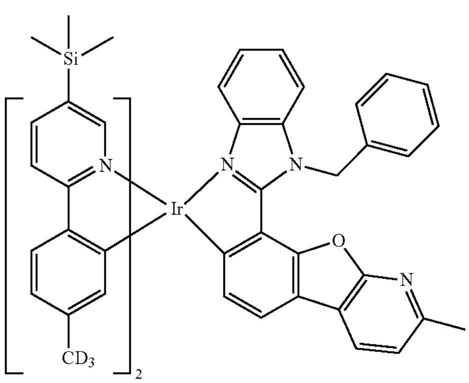
-continued
964
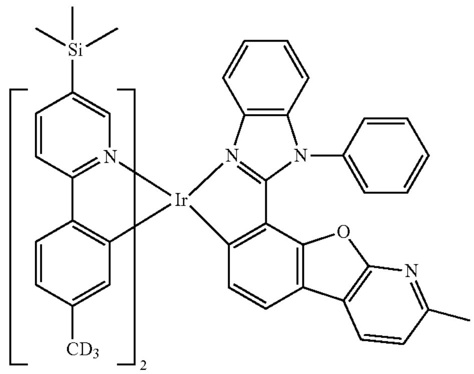
965
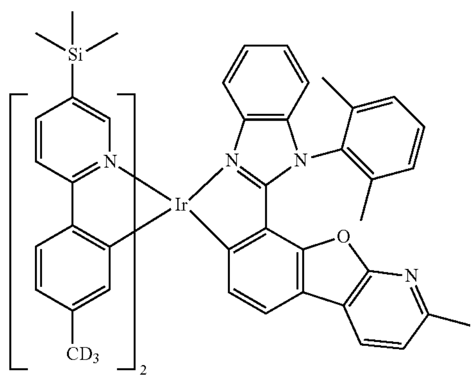
966
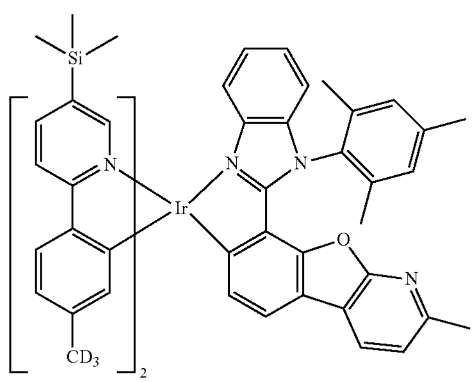

-continued
967
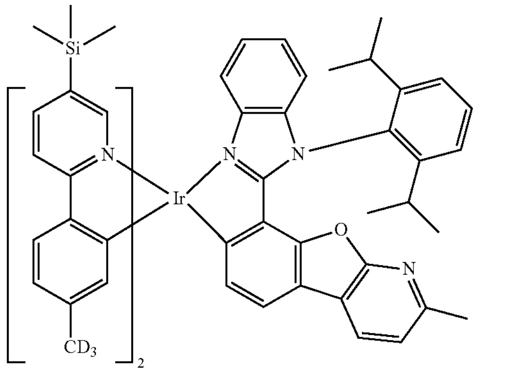
968
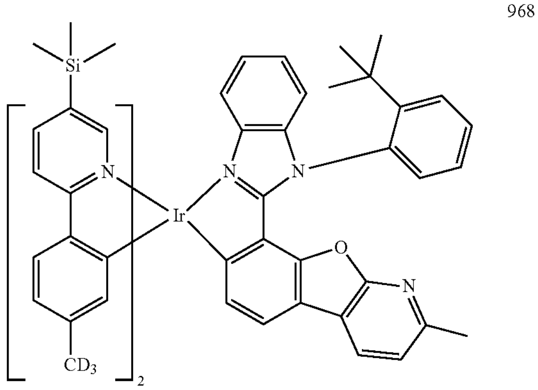
969
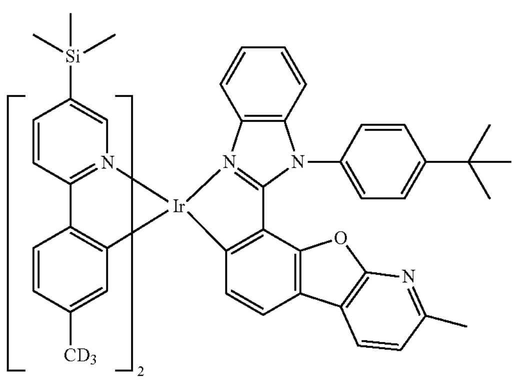
970
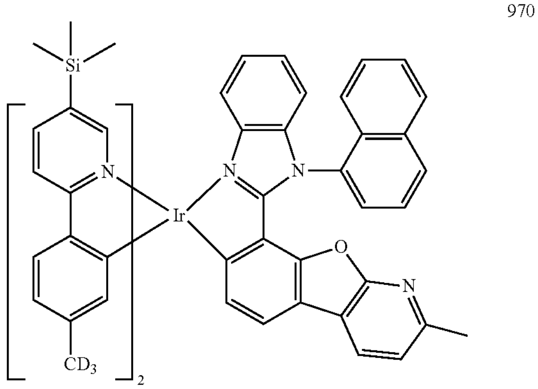
-continued
971
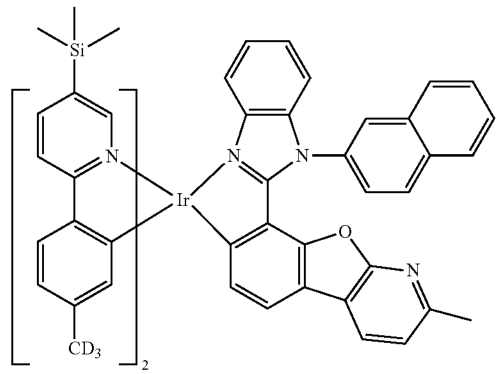
972
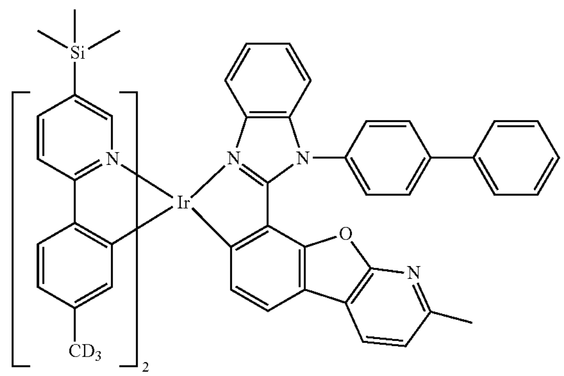
973
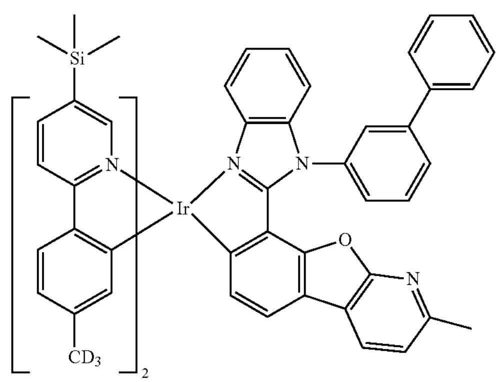
974
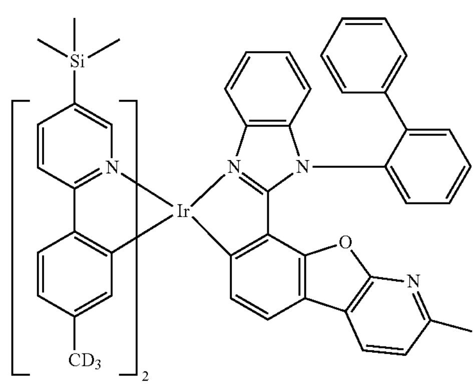

-continued
975
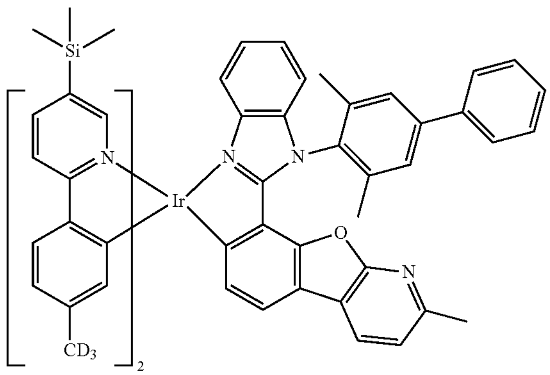
976
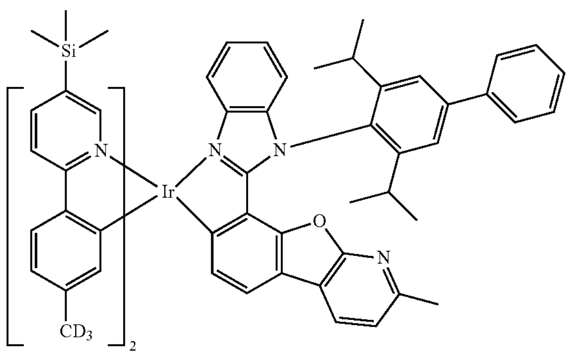
977
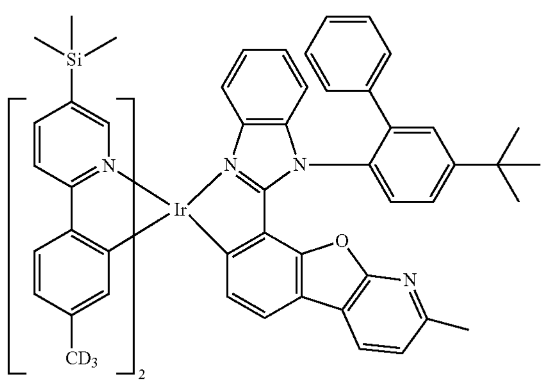
978
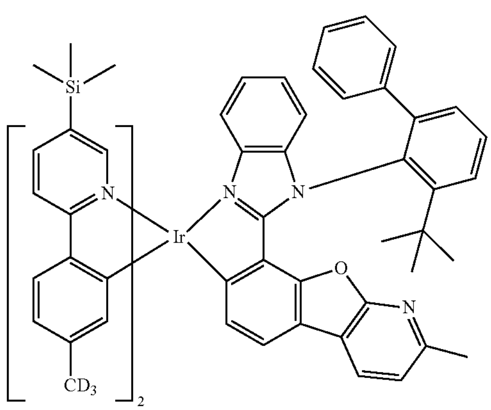
-continued
979
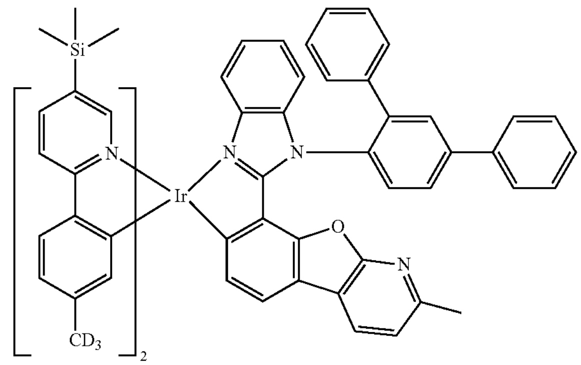
980
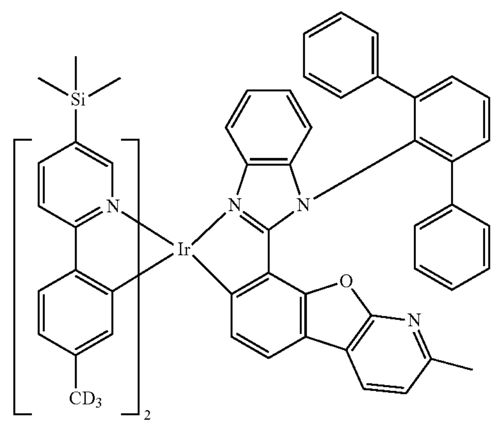
981
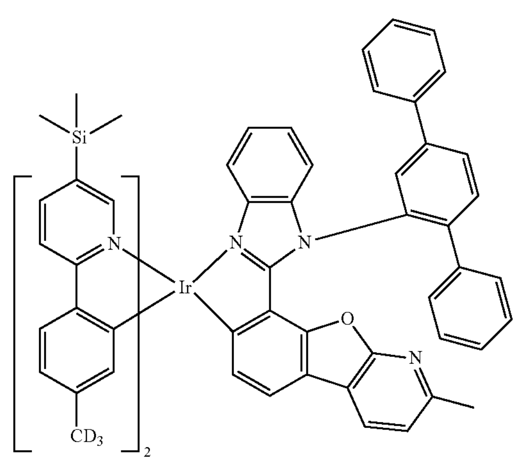

-continued
982
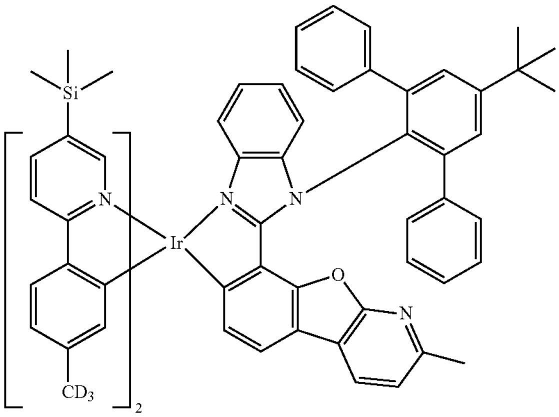
983
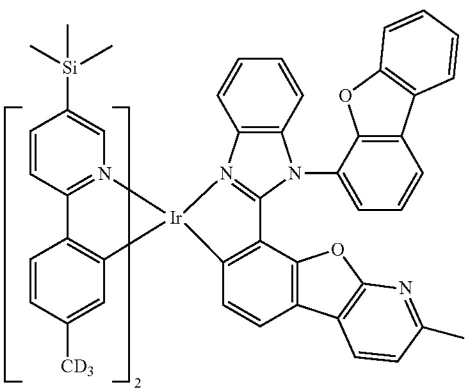
984
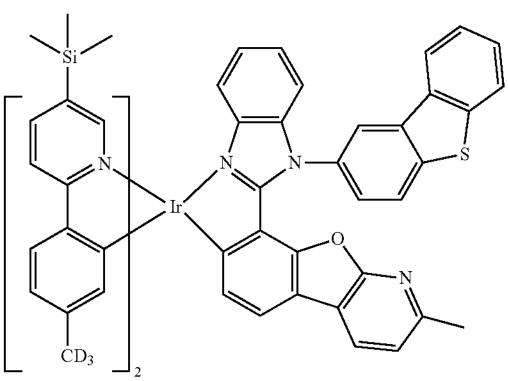
985
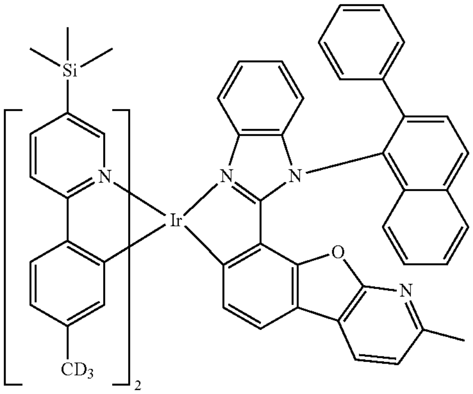
-continued
986
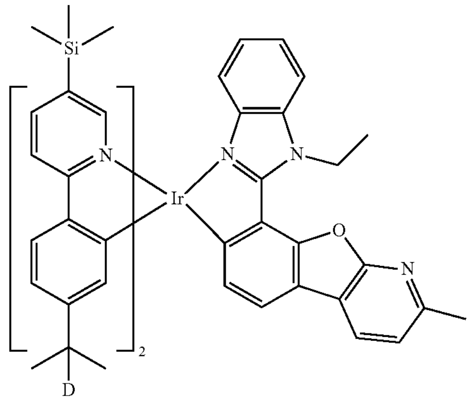
987
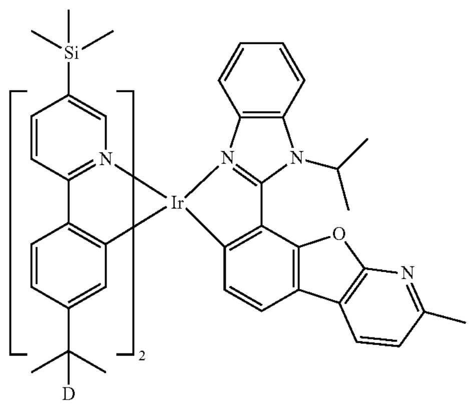
988
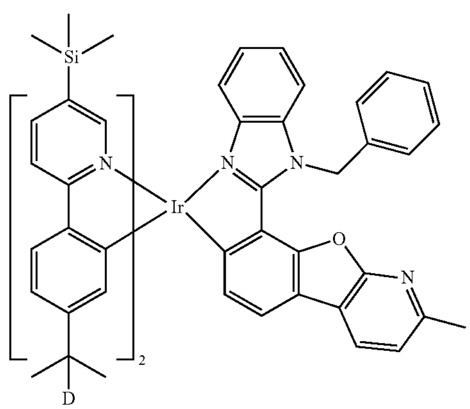
989
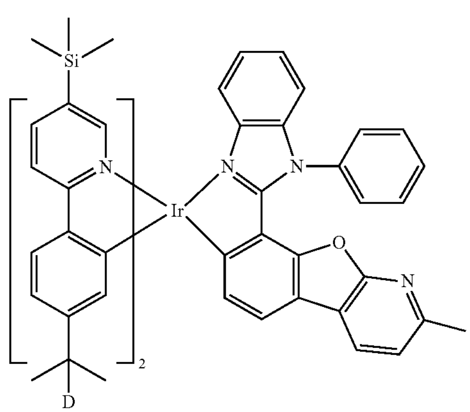

990
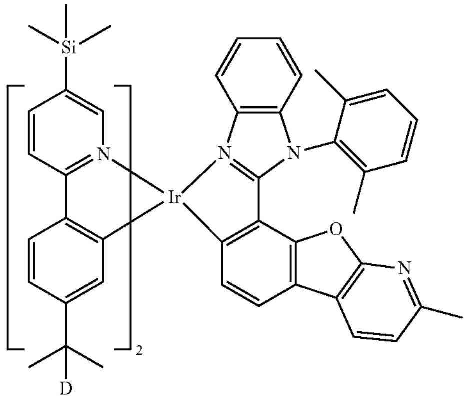
991
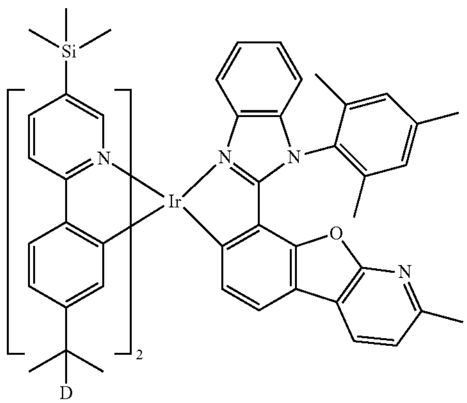
992
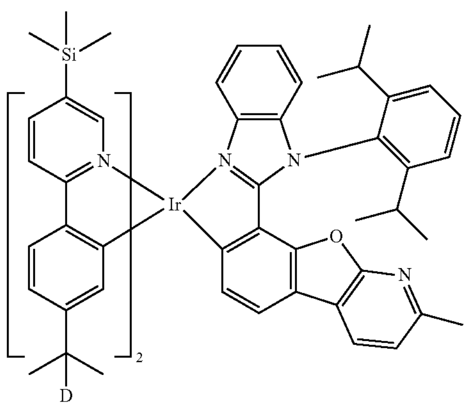
993
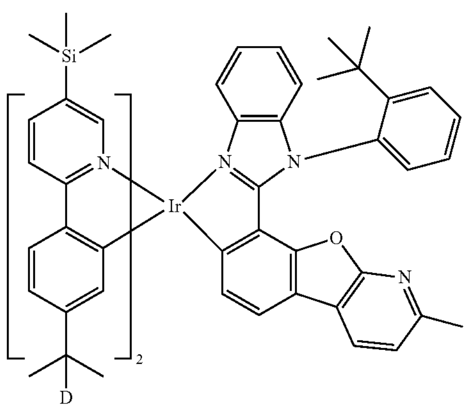
994
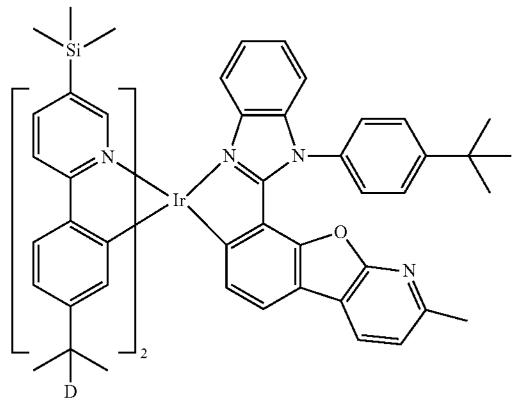
995
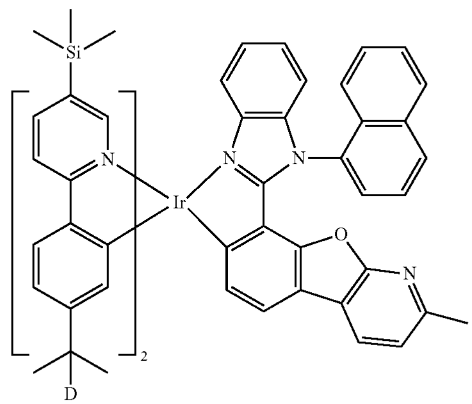
996
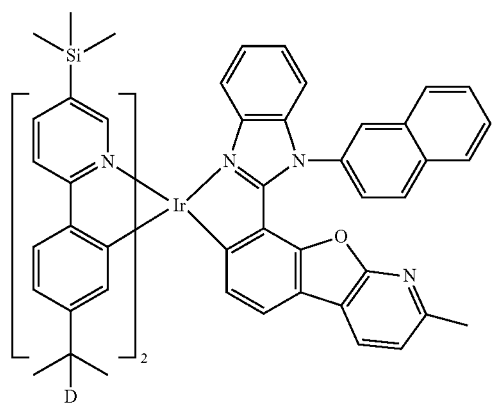
997
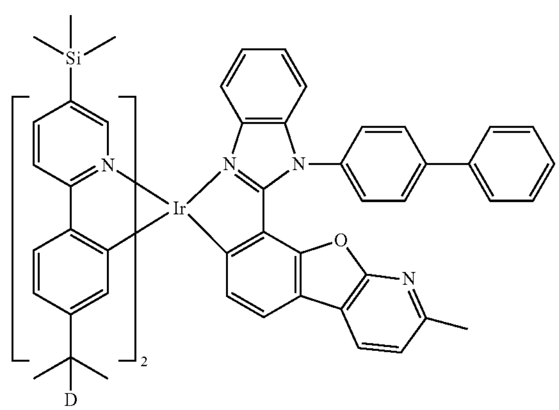

-continued
998
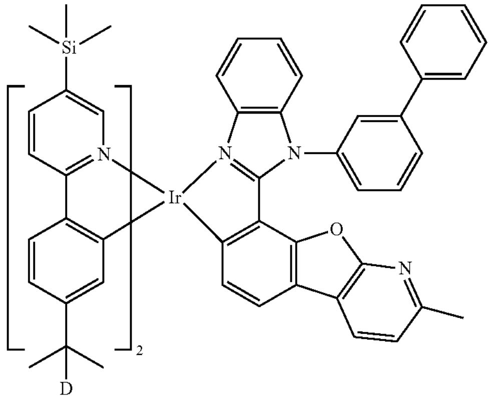
999
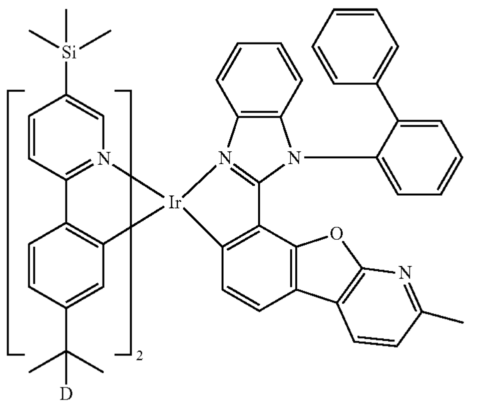
1000
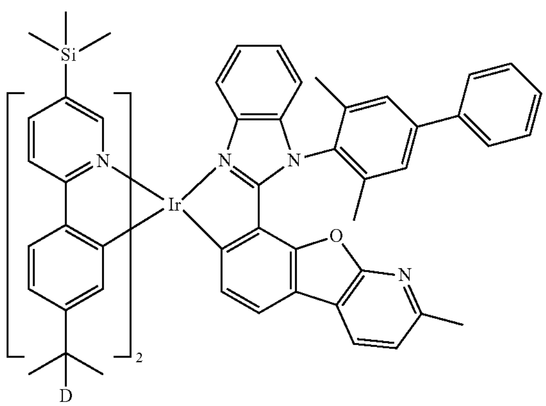
1001
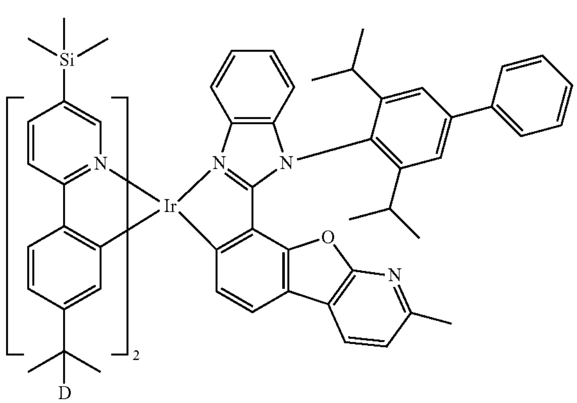
-continued
1002
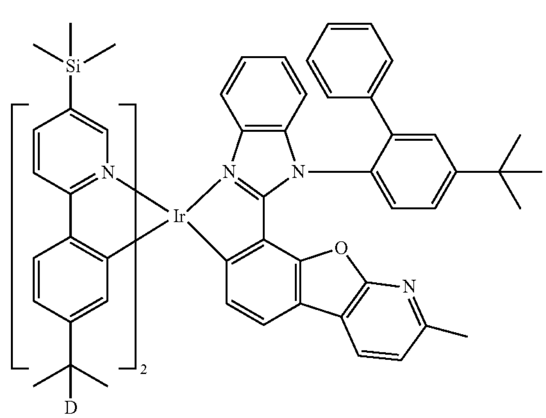
1003
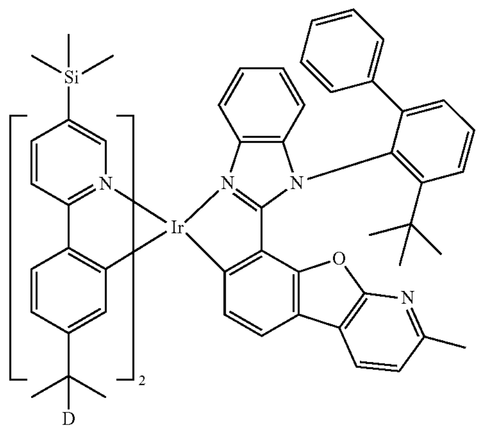
1004
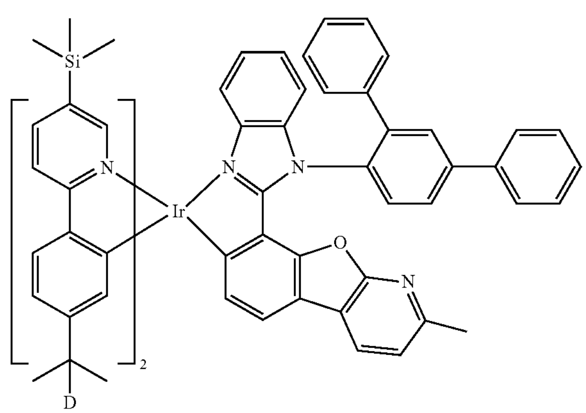

-continued
1005
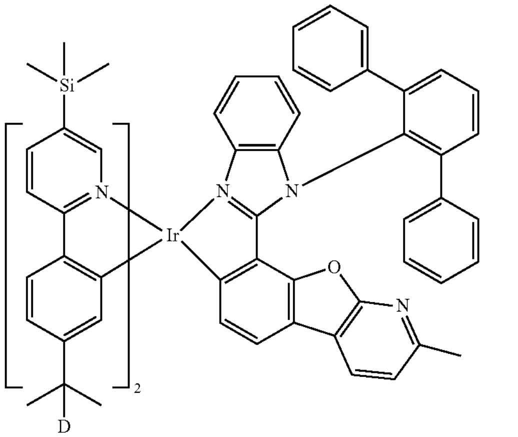
1006
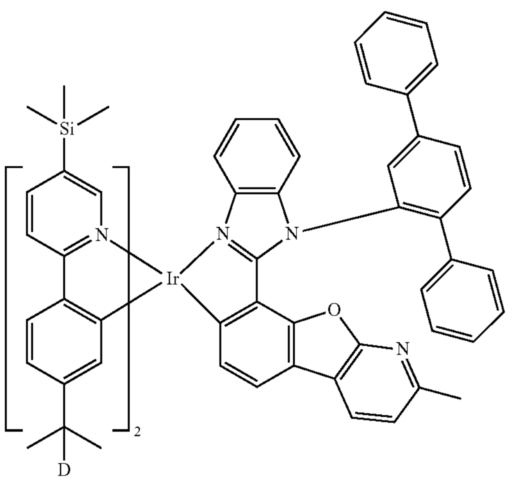
1007
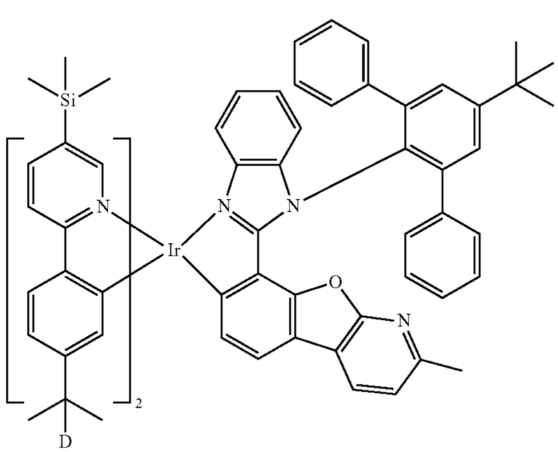
-continued
1008
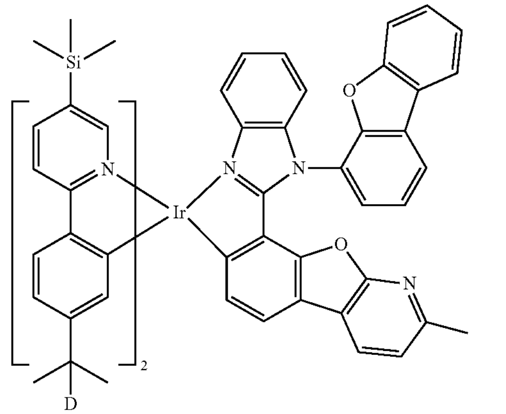
1009
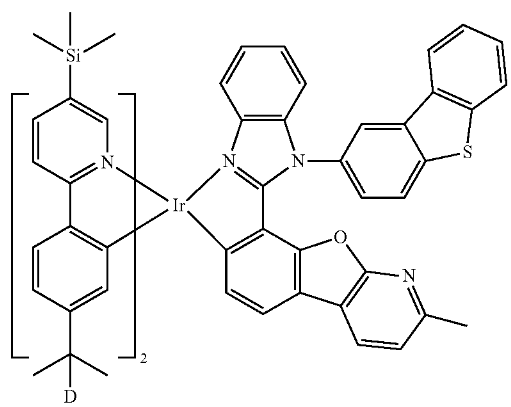
1010
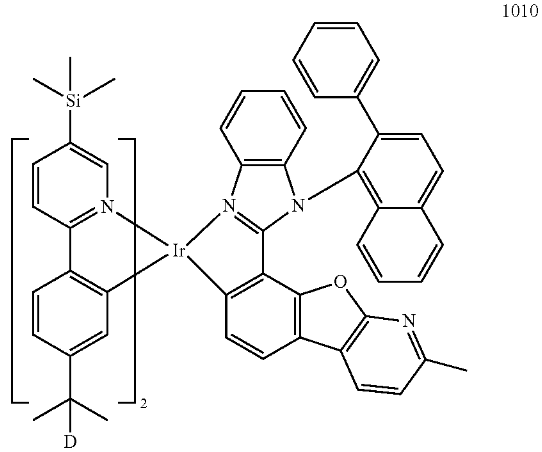

1011
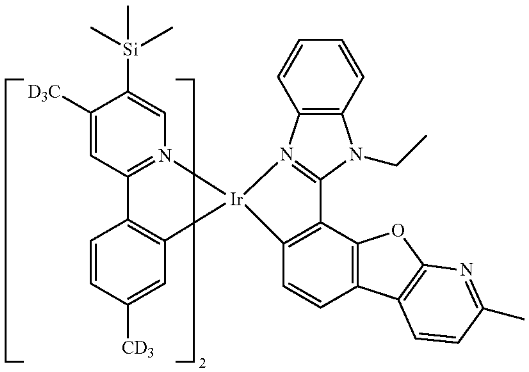
1012
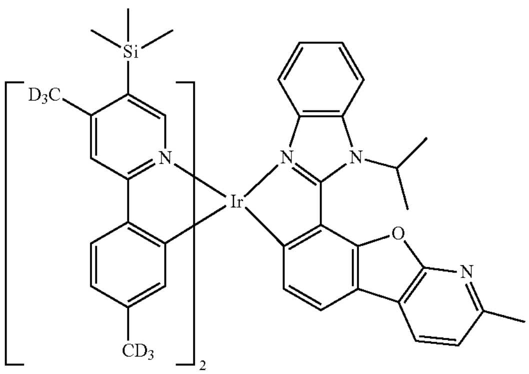
1013
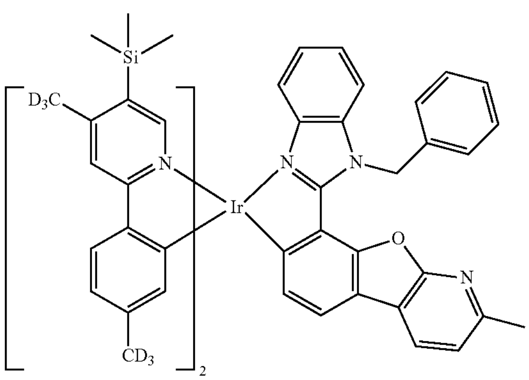
1014
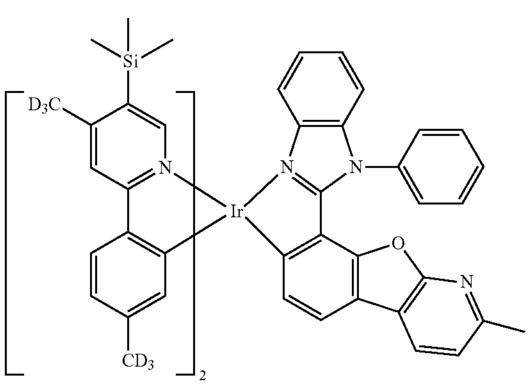
1015
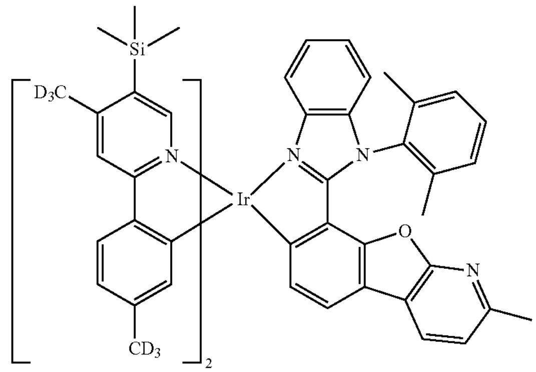
1016
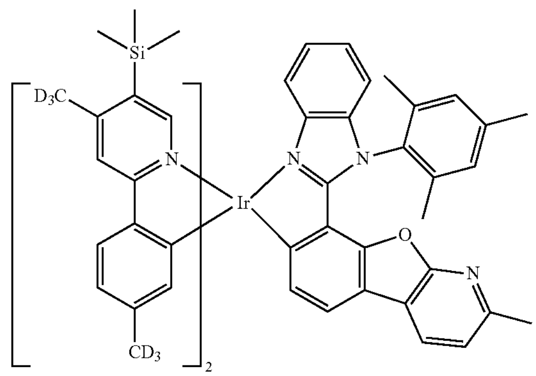
1017
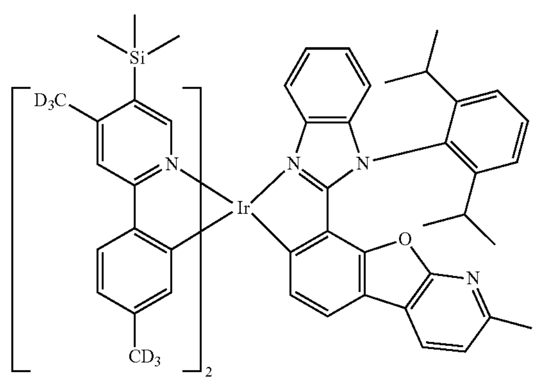
1018
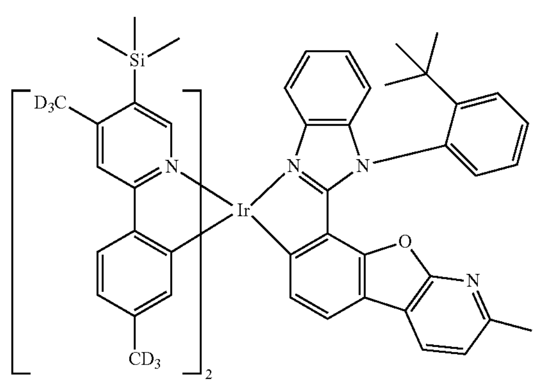

-continued
1019
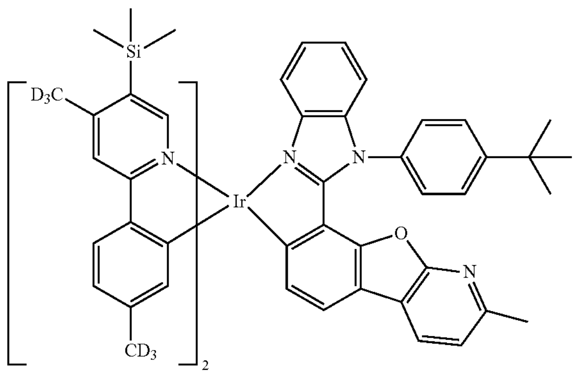
1020
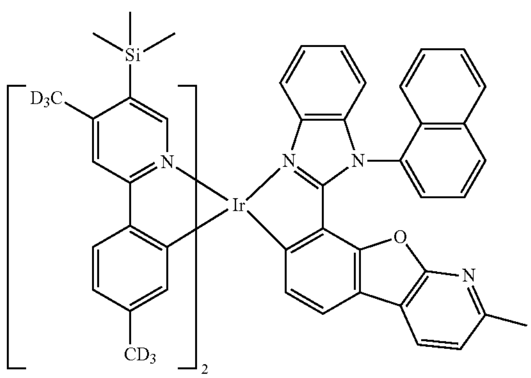
1021
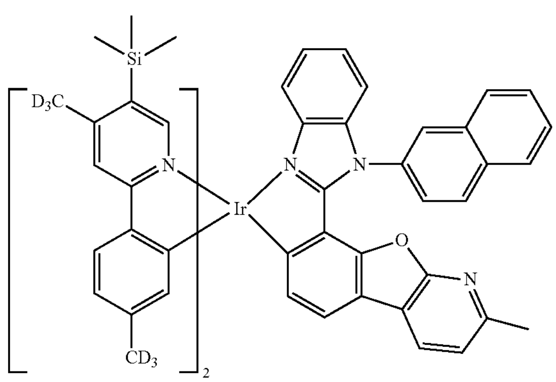
1022
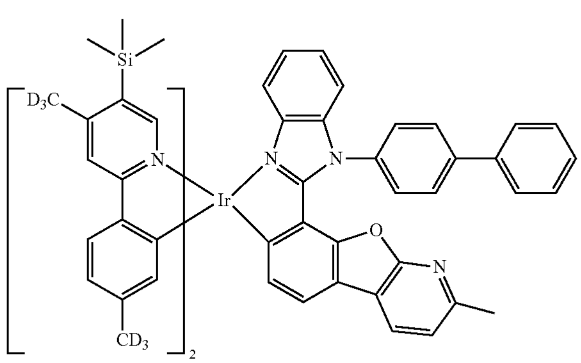
-continued
1023
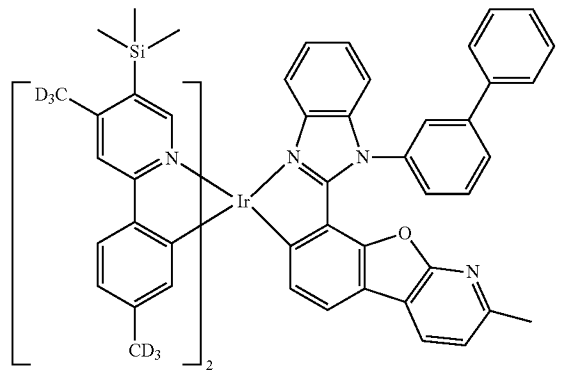
1024
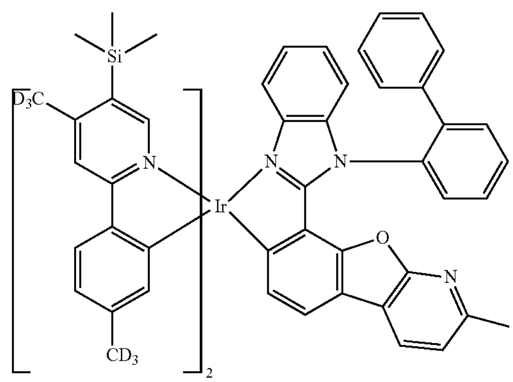
1025
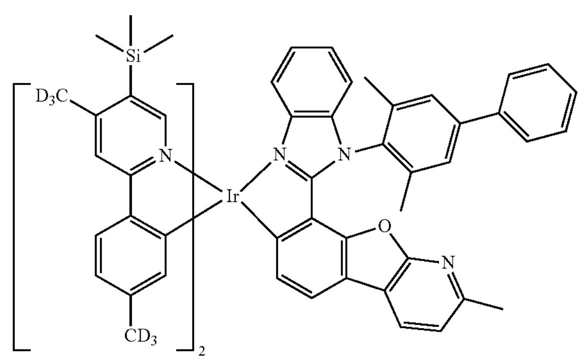
1026
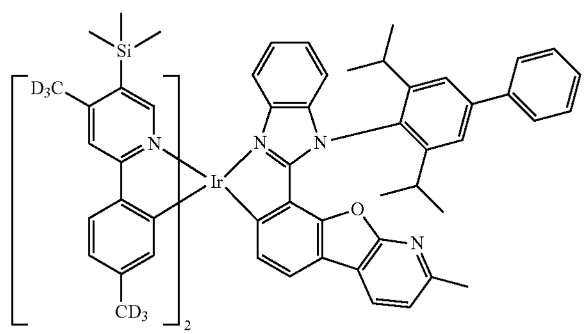

-continued
1027
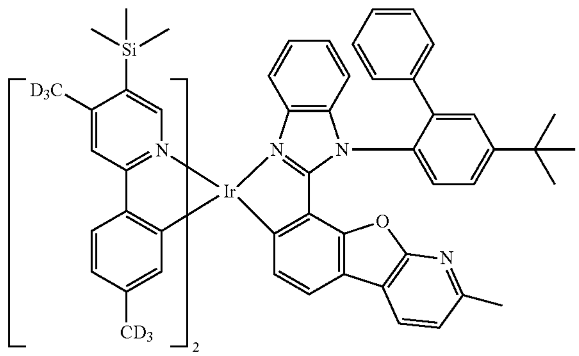
1028
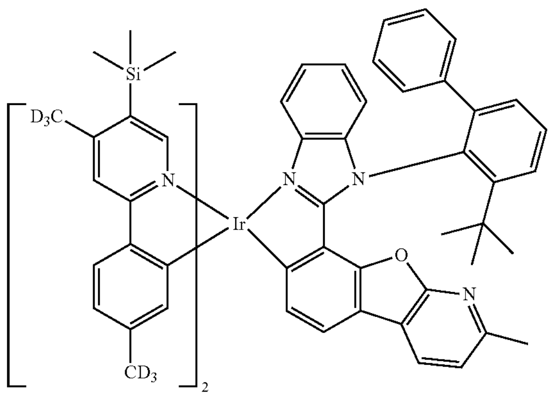
1029
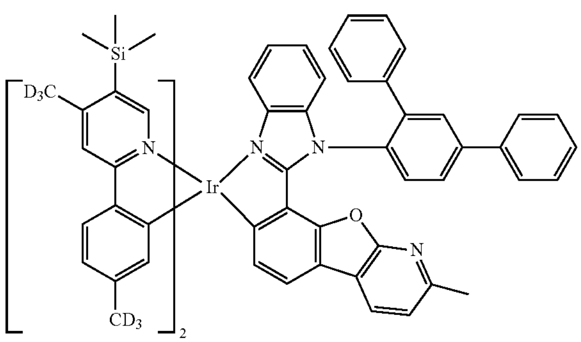
1030
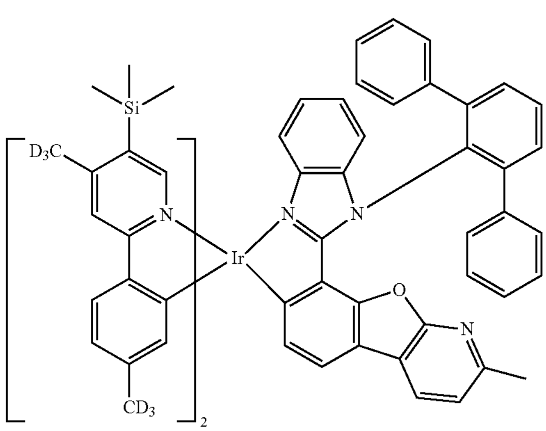
-continued
1031
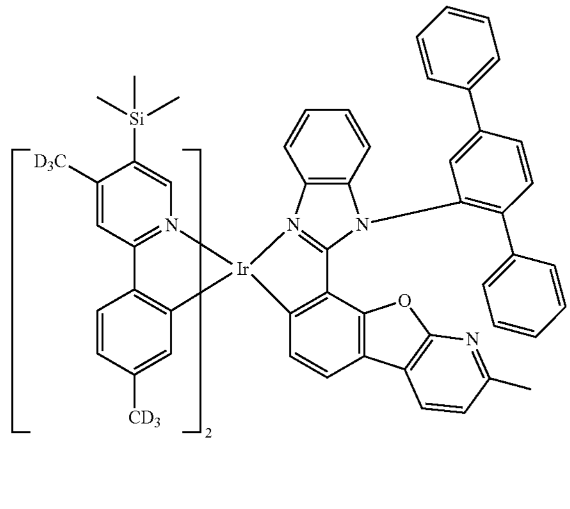
1032
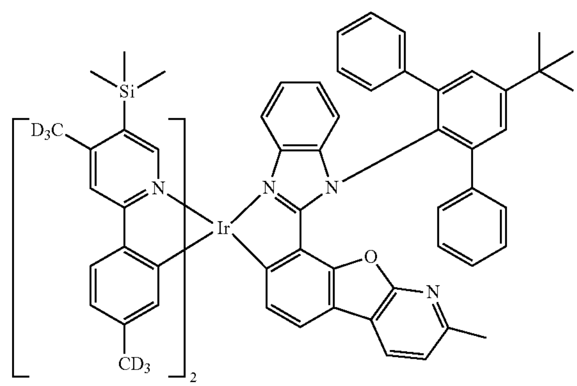
1033
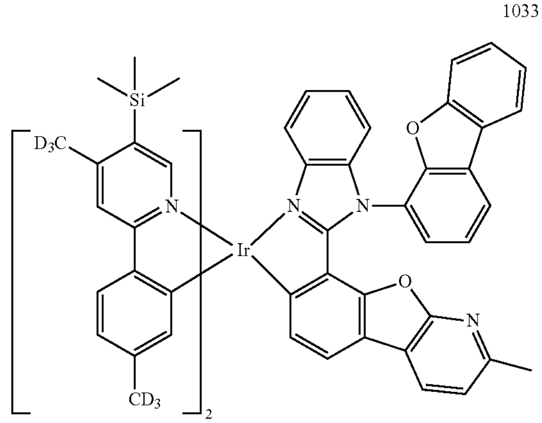

1034
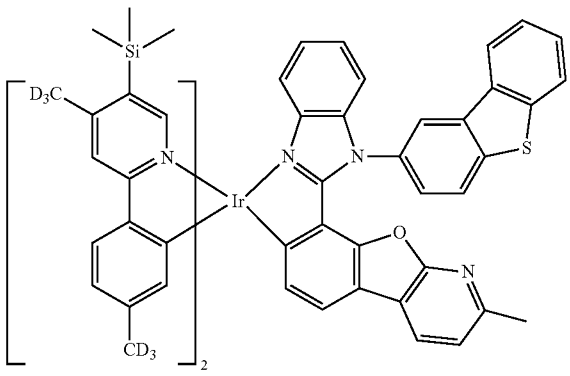
1035
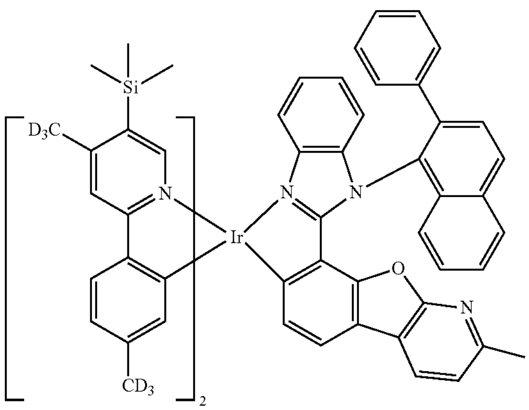
1036
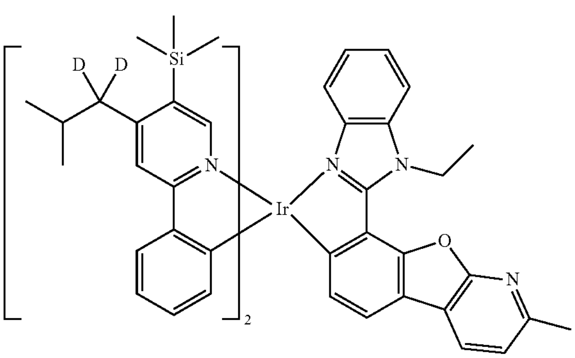
1037
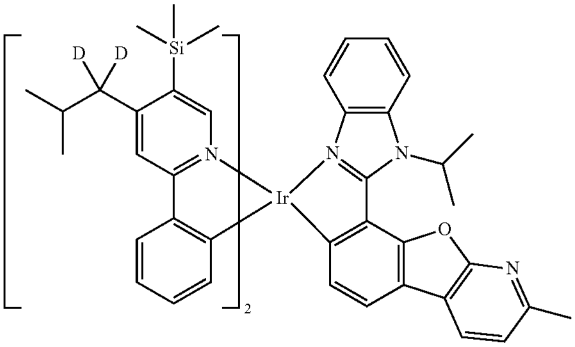
1038
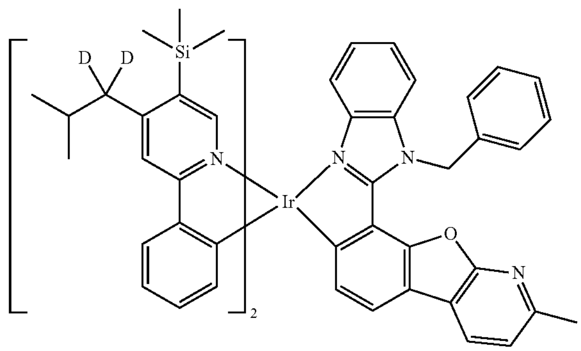
1039
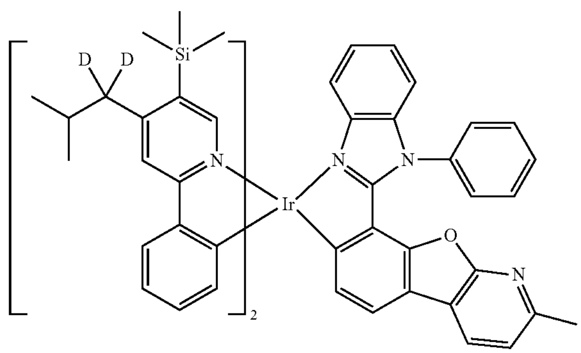
1040
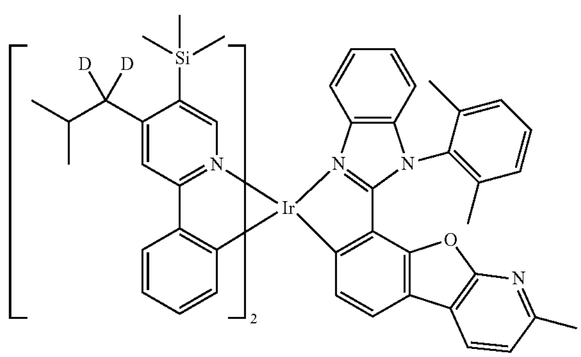
1041
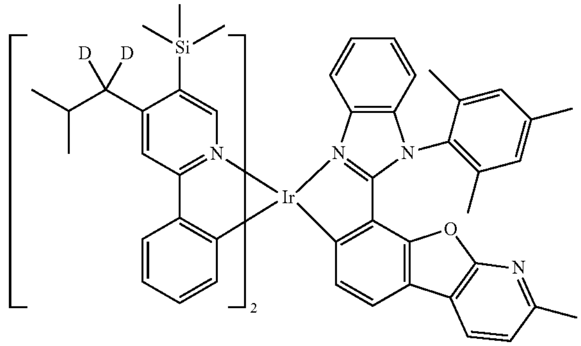

-continued
1042
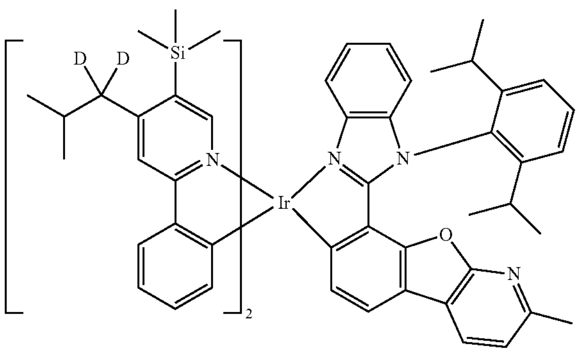
1043
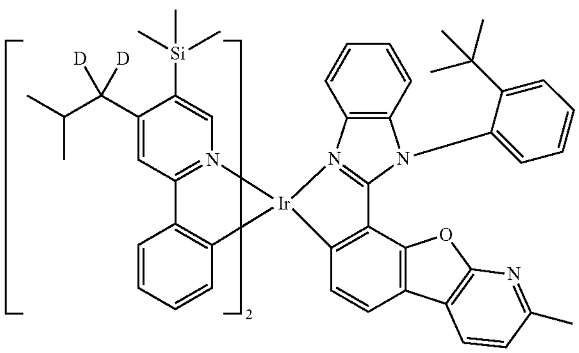
1044
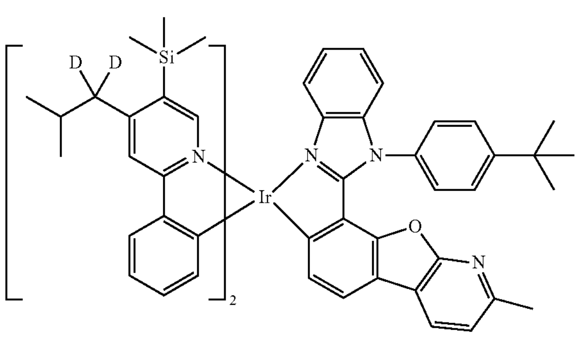
1045
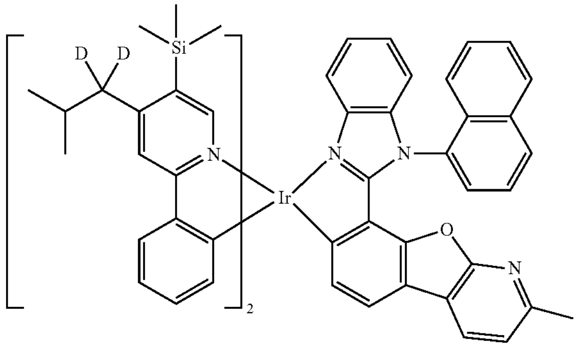
-continued
1046
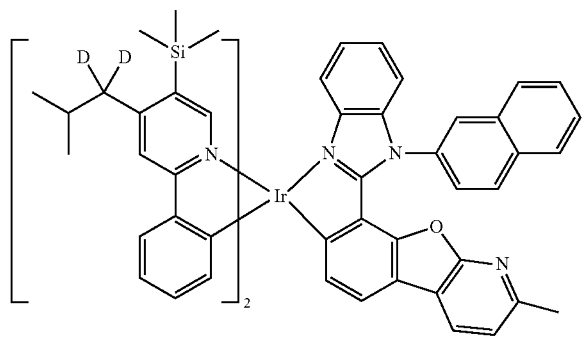
1047
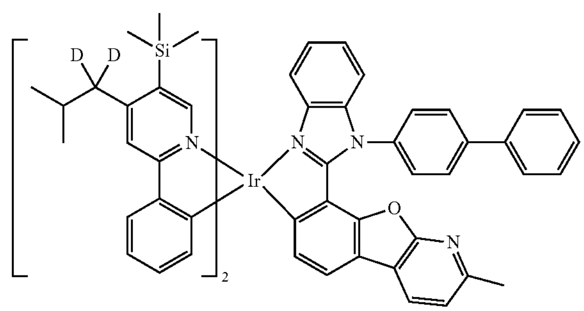
1048
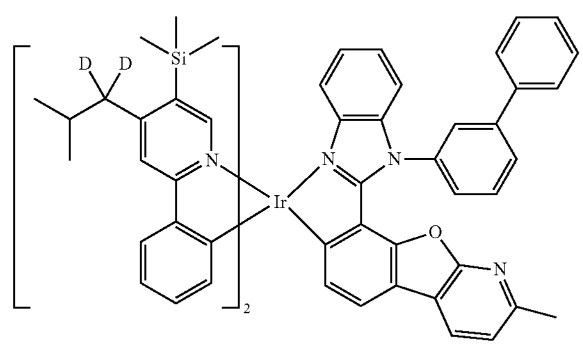
1049
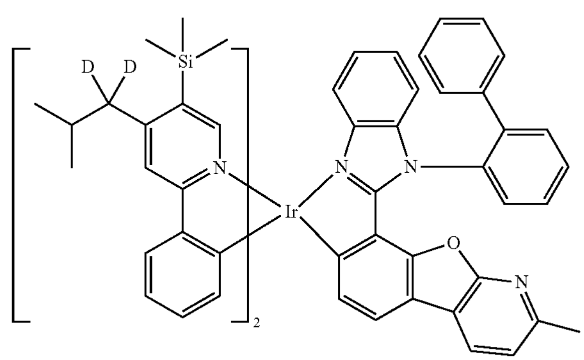

-continued
1050
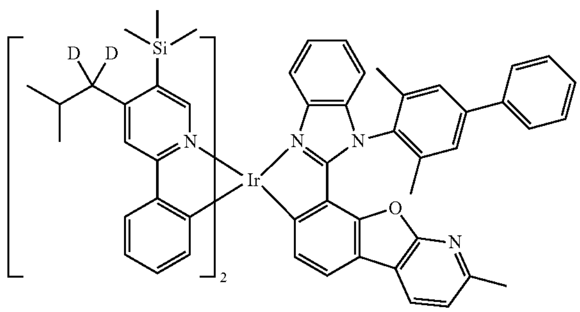
1051
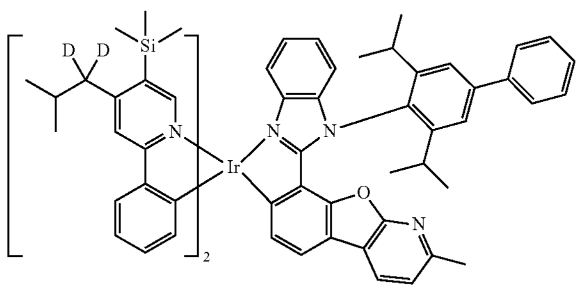
1052
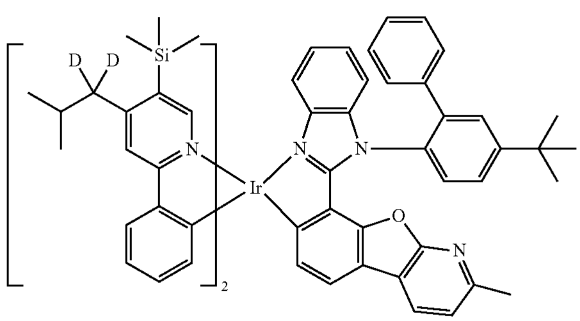
1053
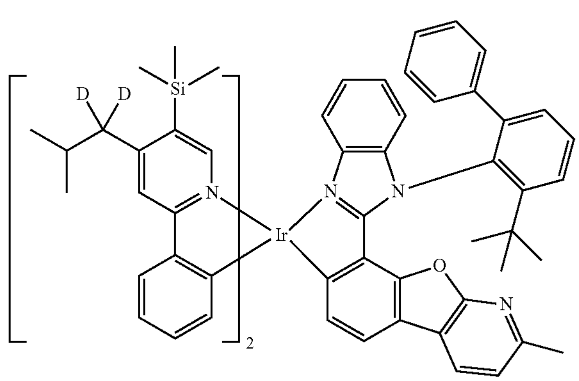
-continued
1054
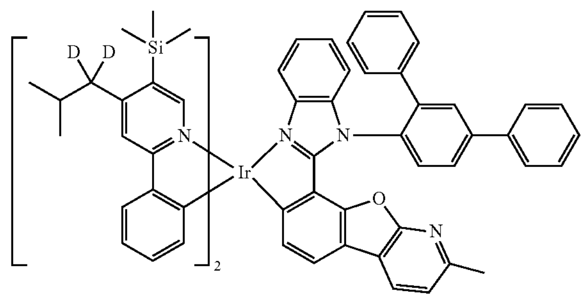
1055
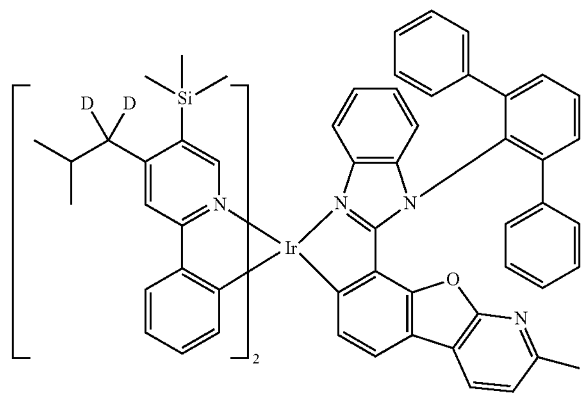
1056
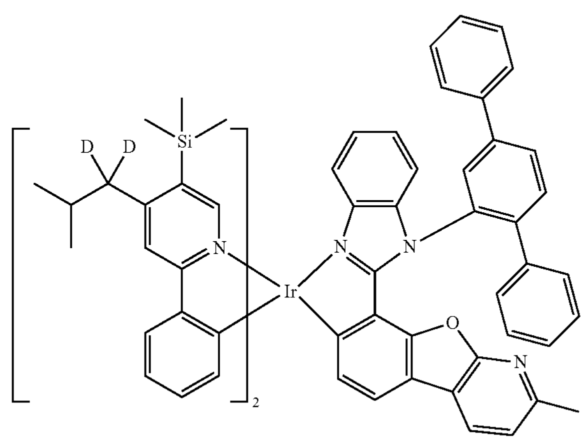
1057
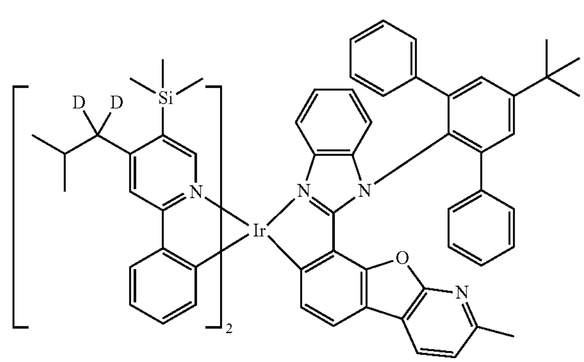

-continued
1058
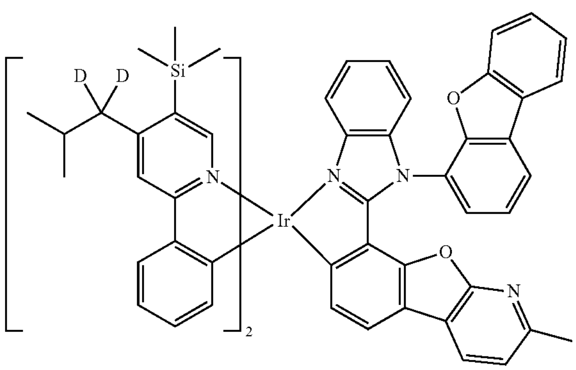
1059
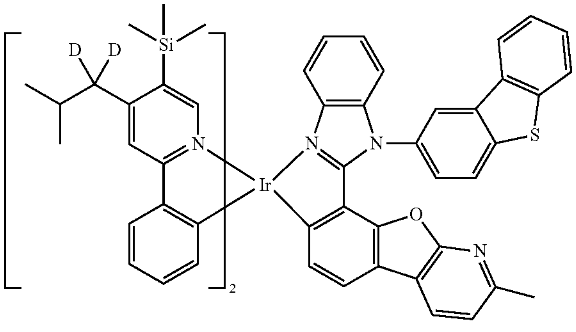
1060
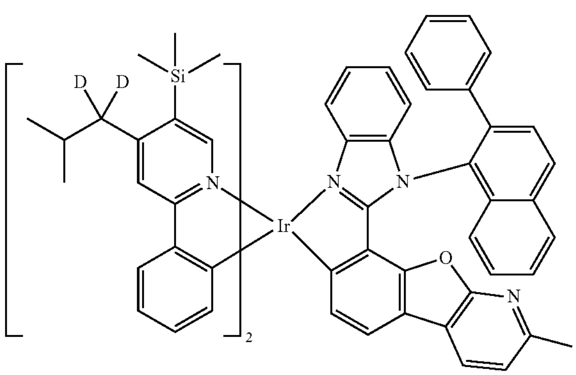
1061
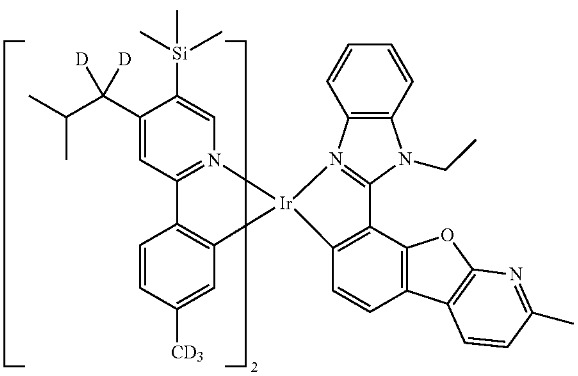
-continued
1062
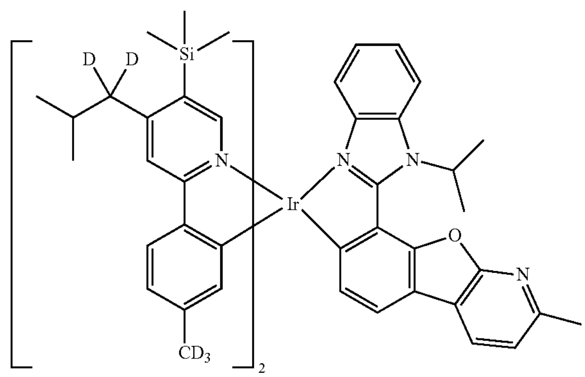
1063
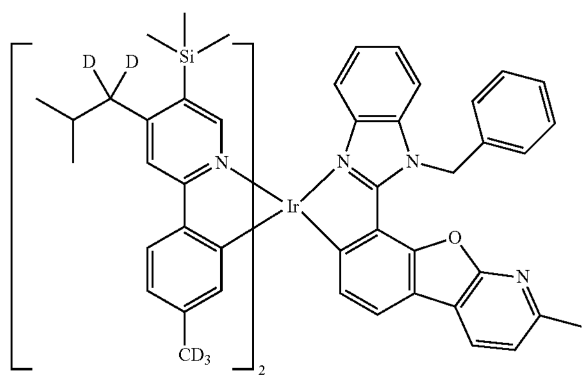
1064
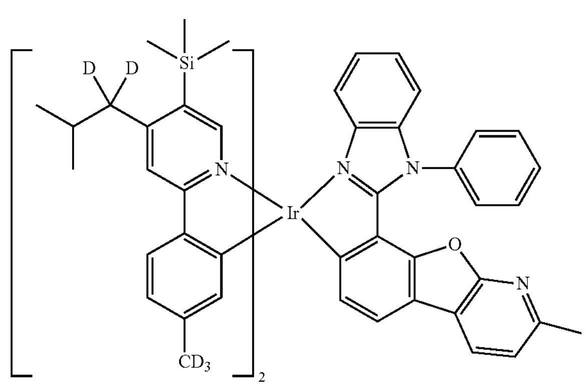
1065
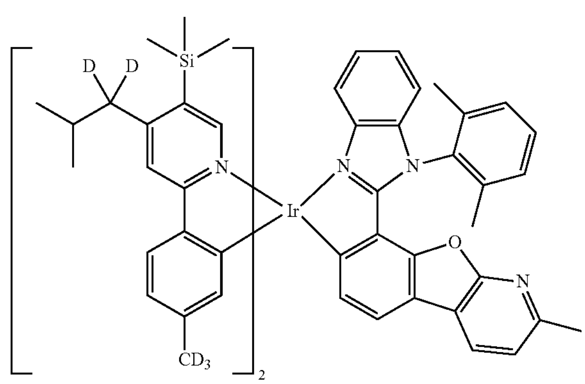

-continued
1066
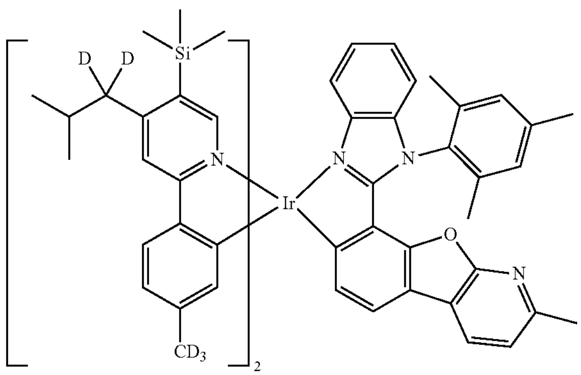
1067
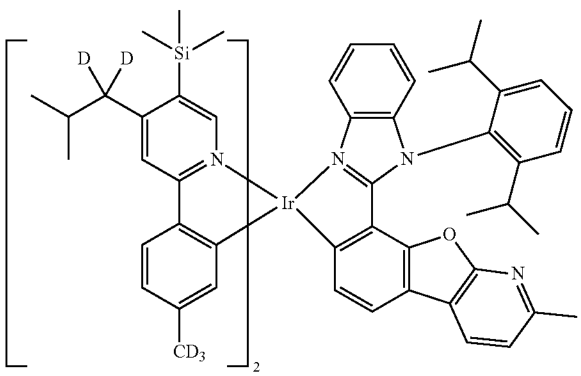
1068
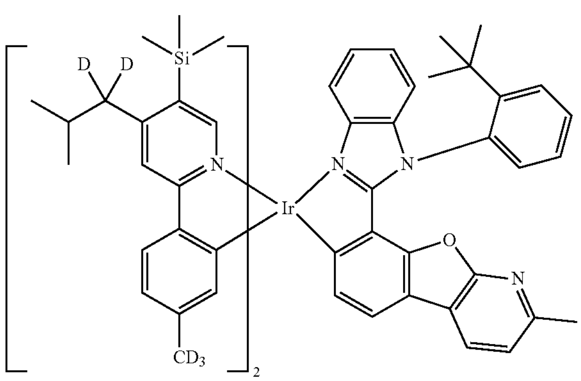
1069
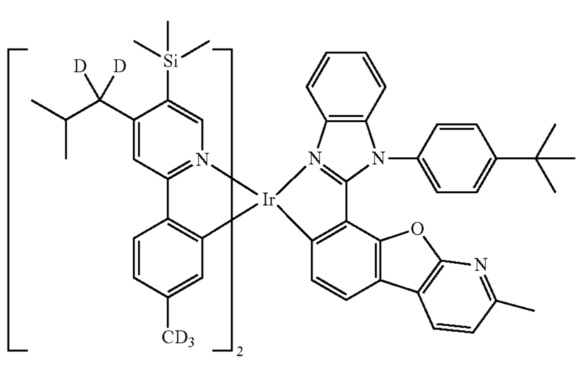
-continued
1070
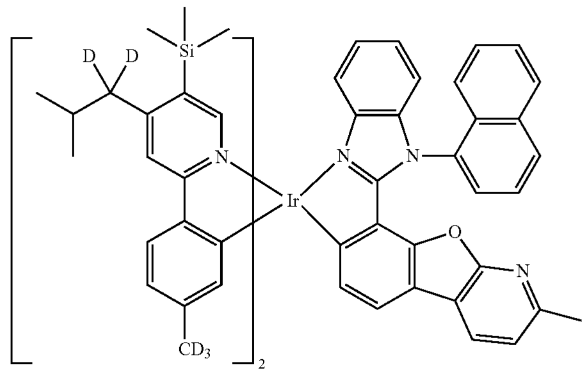
1071
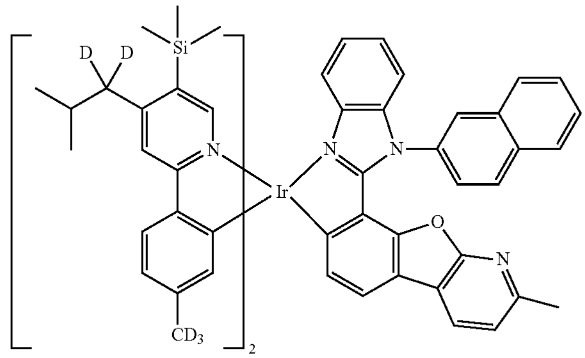
1072
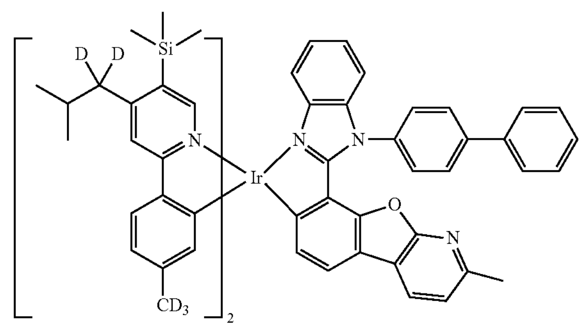
1073
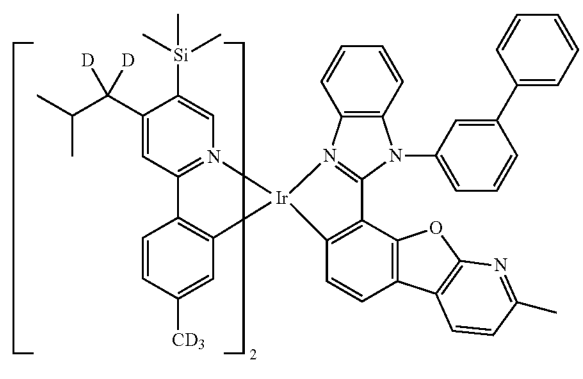

-continued
1074
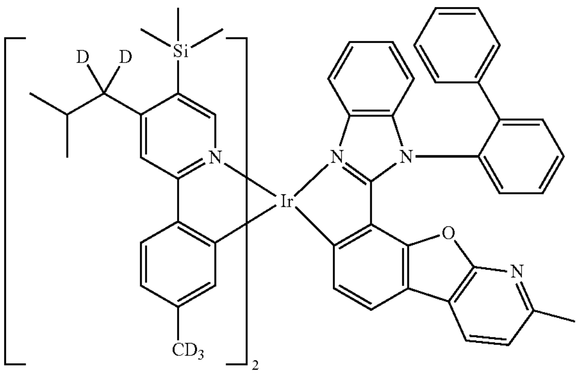
1075
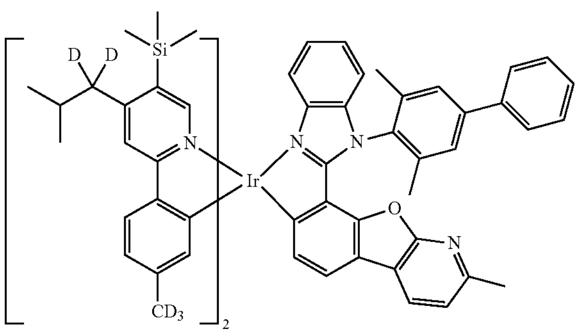
1076
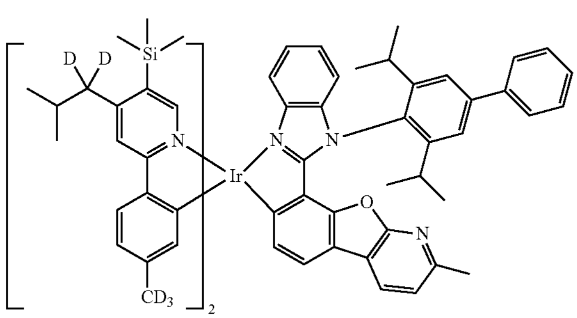
1077
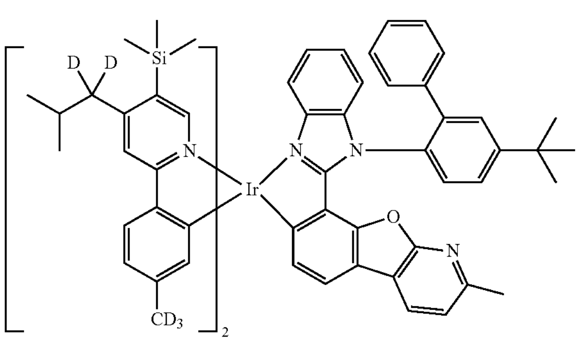
-continued
1078
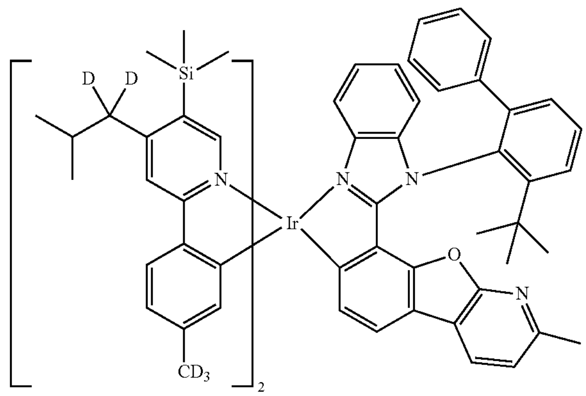
1079
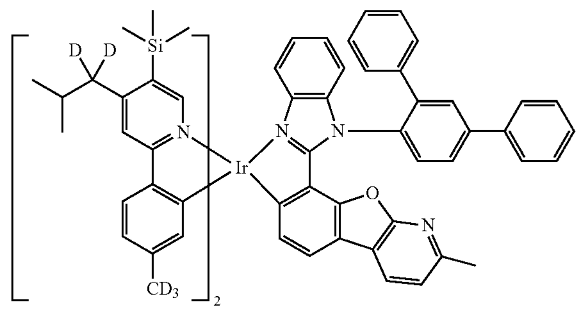
1080
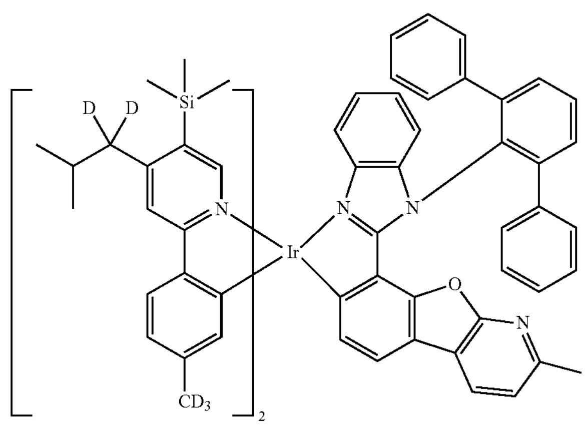
1081
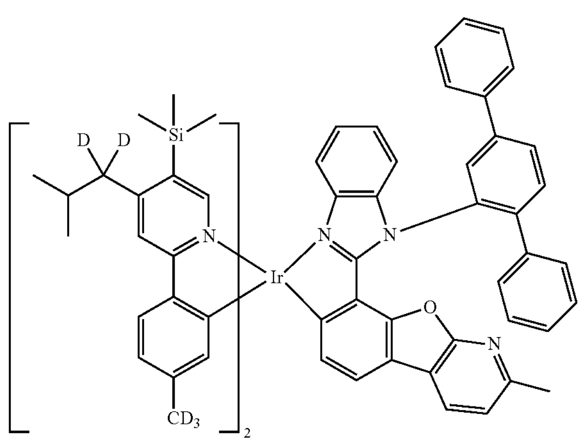

-continued
1082
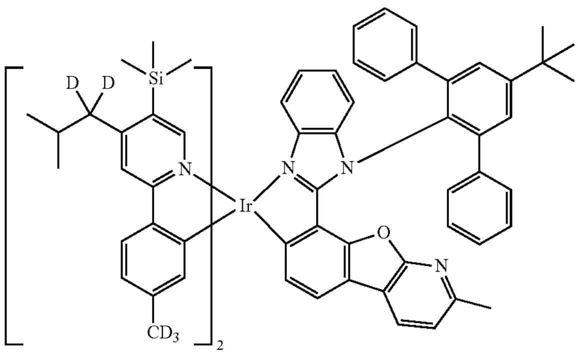
1083
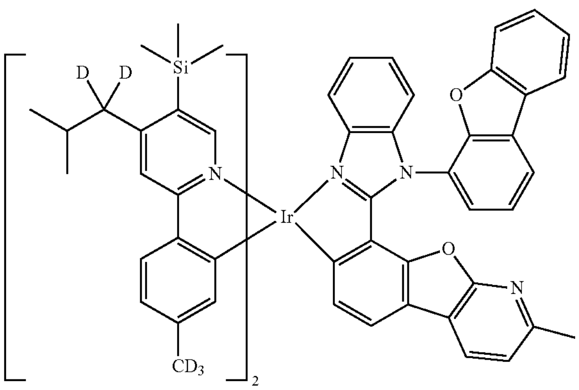
1084
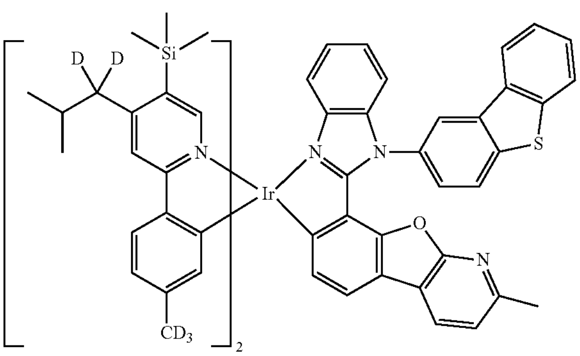
1085
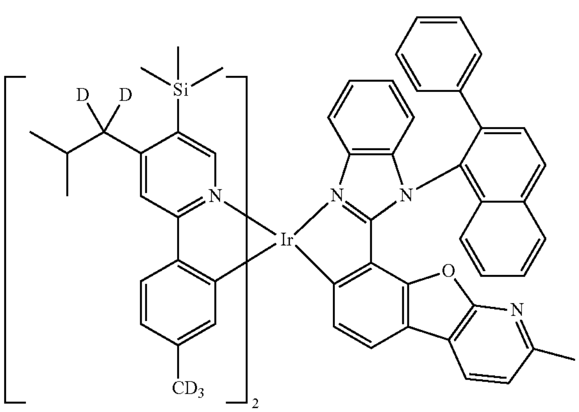
-continued
1086
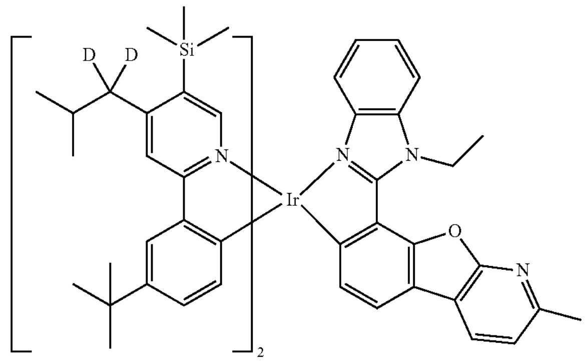
1087
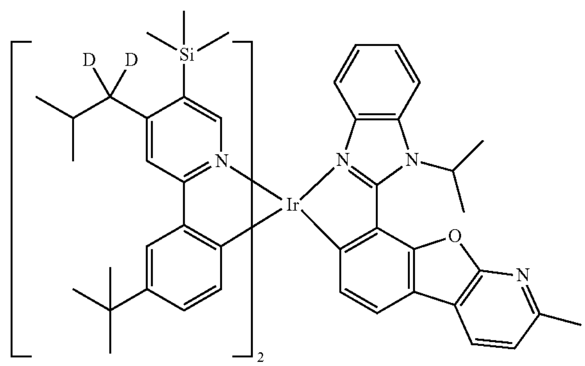
1088
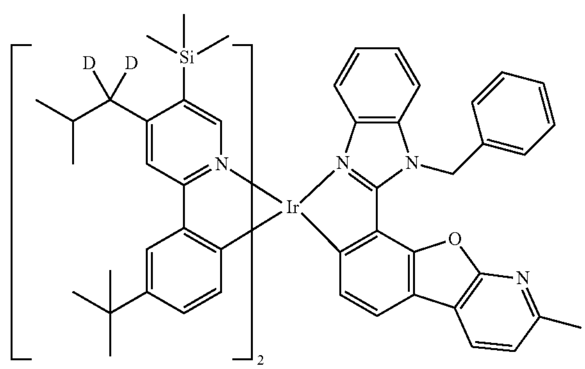
1089
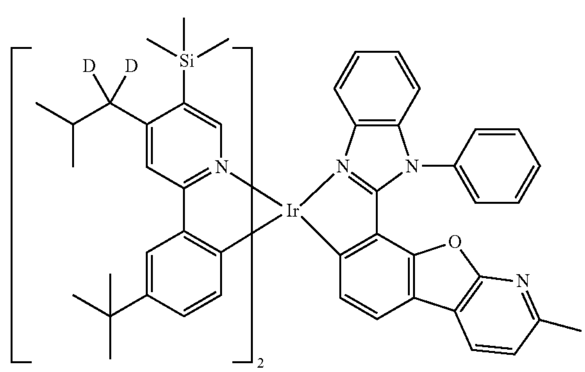

-continued
1090
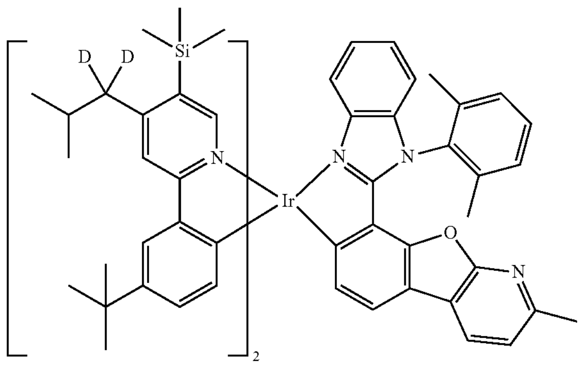
1091
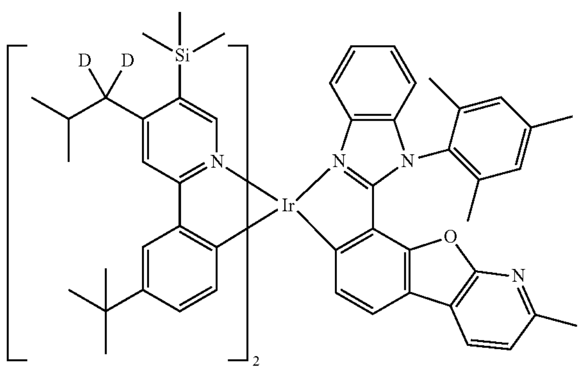
1092
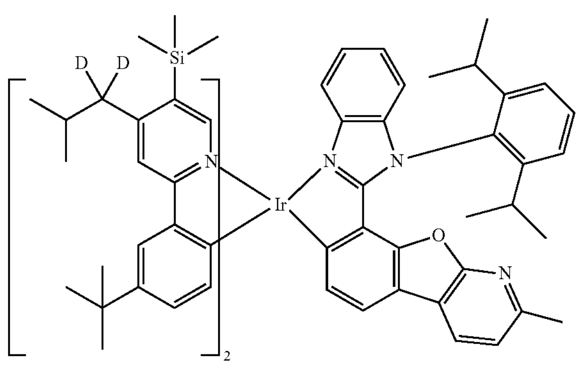
1093
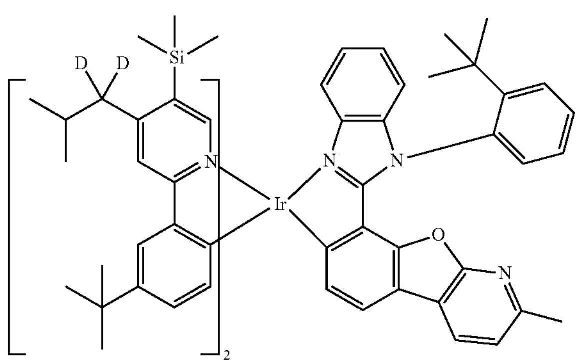
-continued
1094
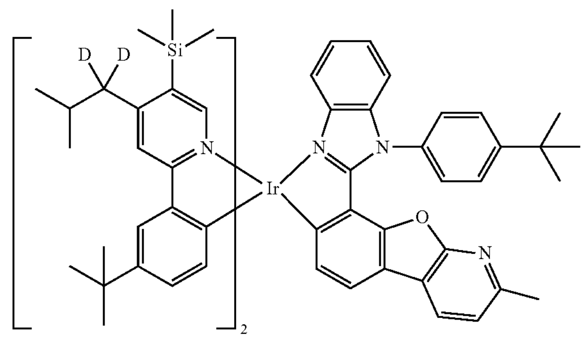
1095
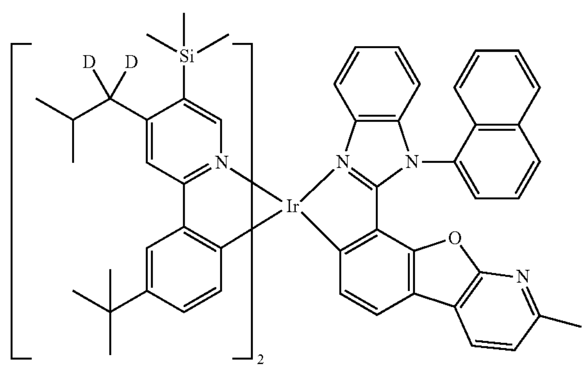
1096
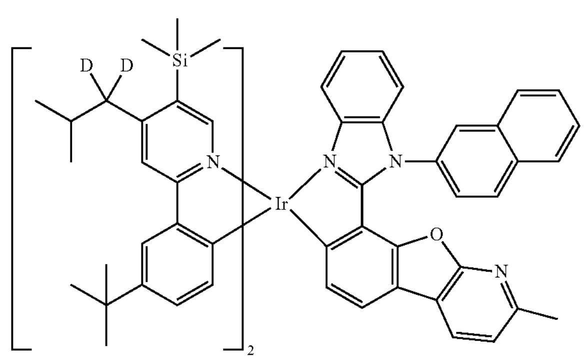
1097
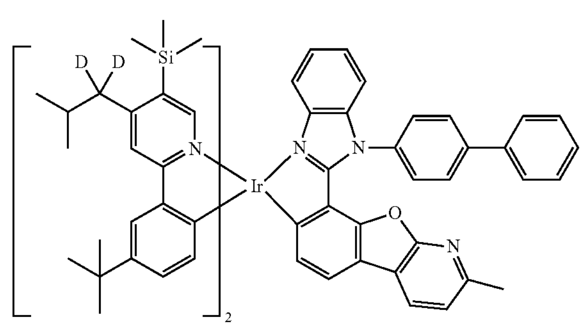

1098
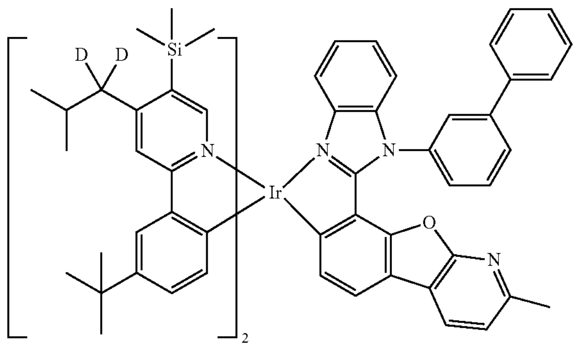
1099
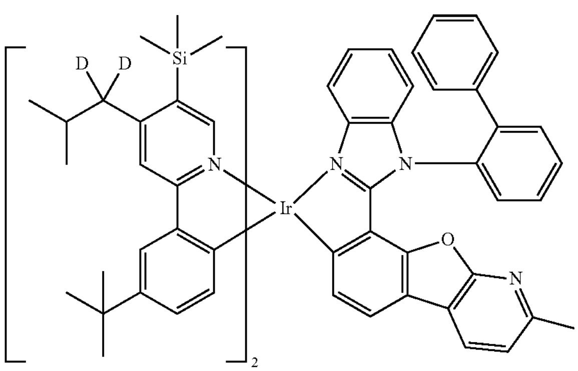
1100
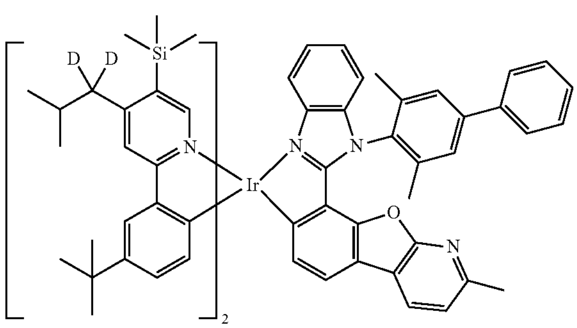
1101
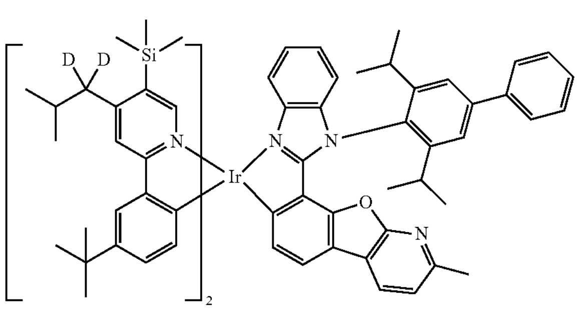
1102
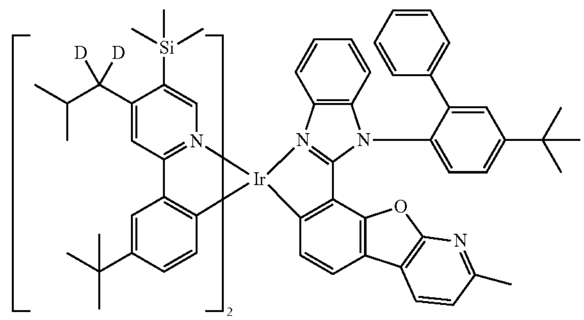
1103
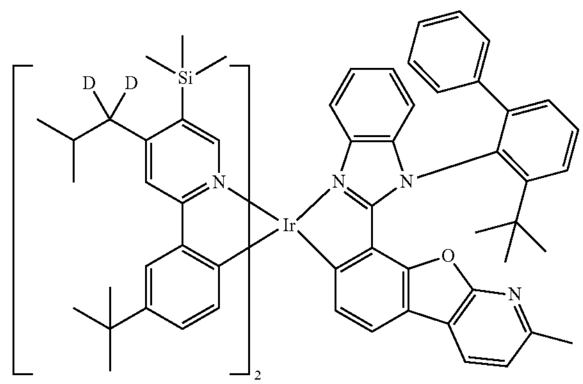
1104
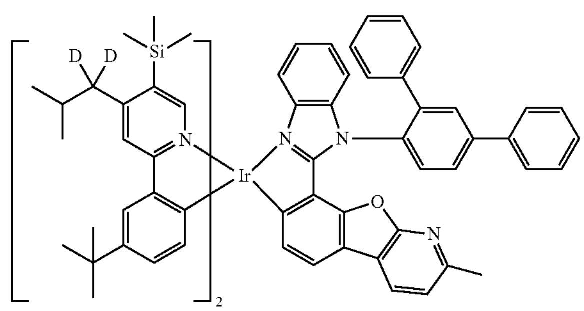
1105
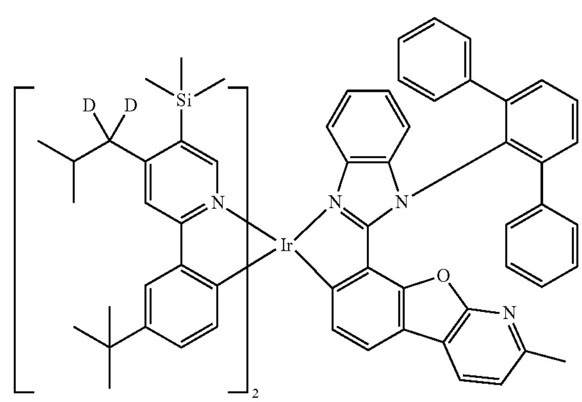

-continued
1106
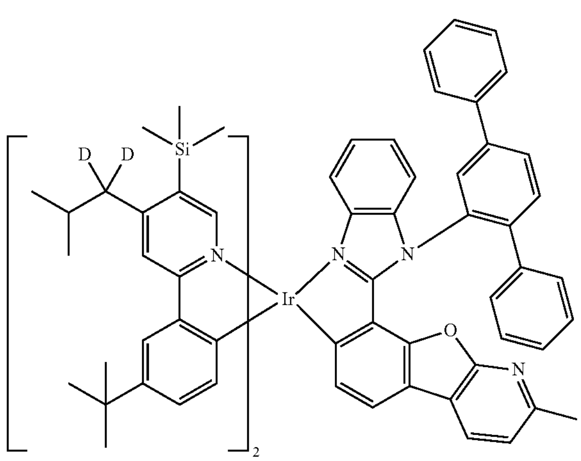
1107
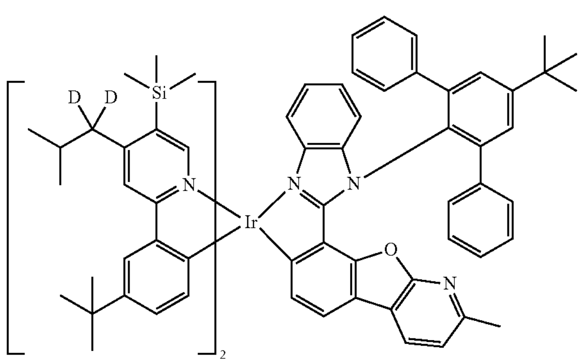
1108
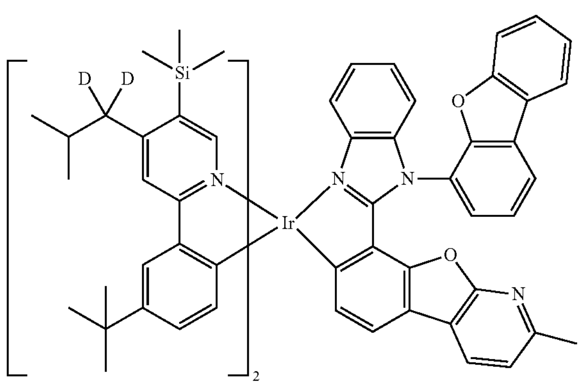
1109
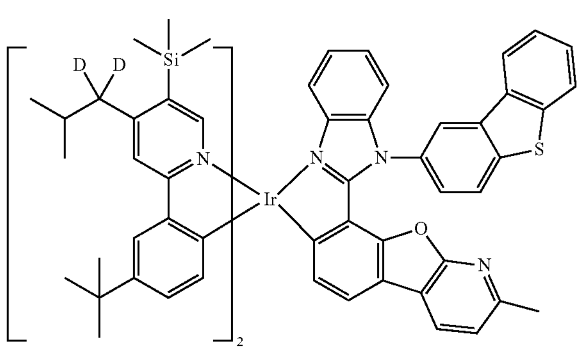
-continued
1110
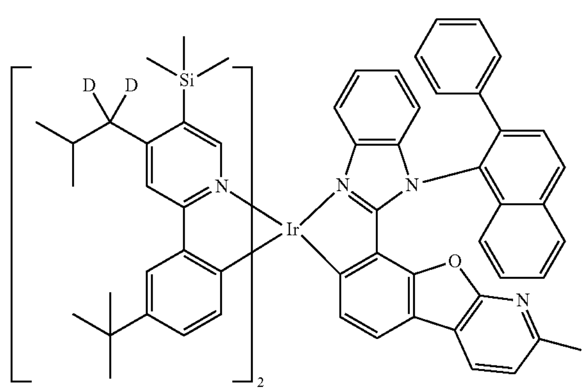
1111
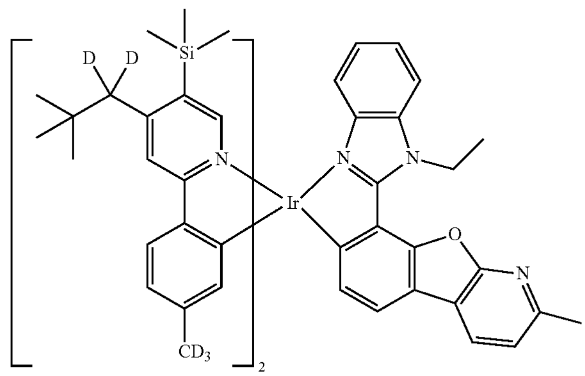
1112
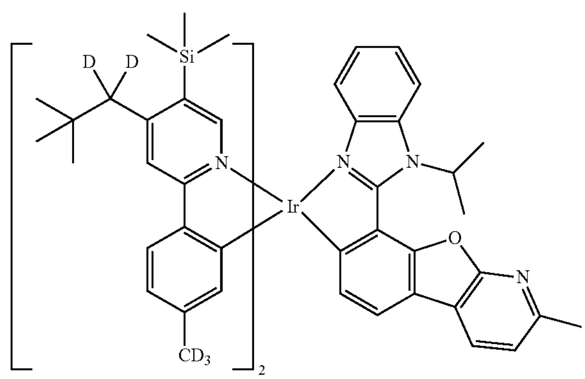
1113
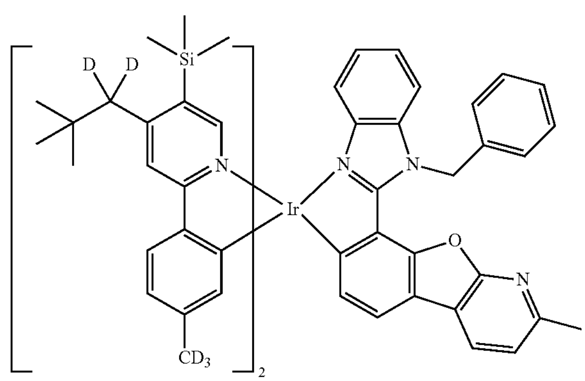

-continued
1114
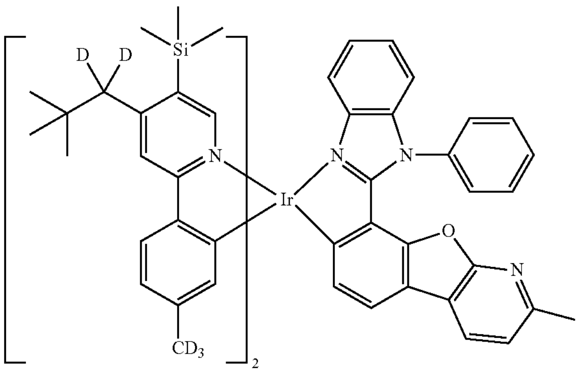
1115
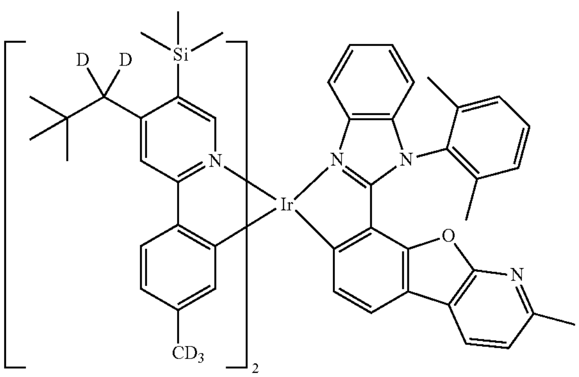
1116
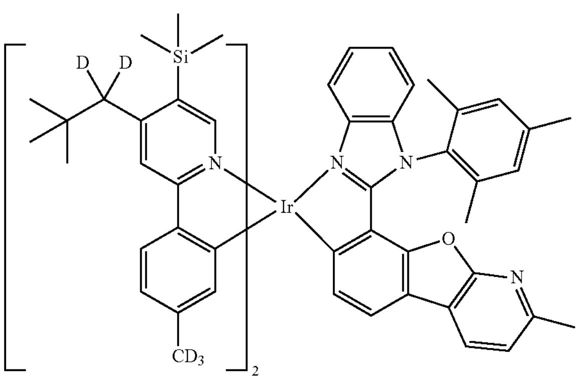
1117
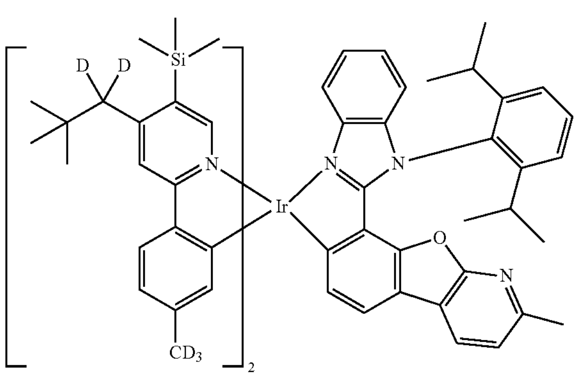
-continued
1118
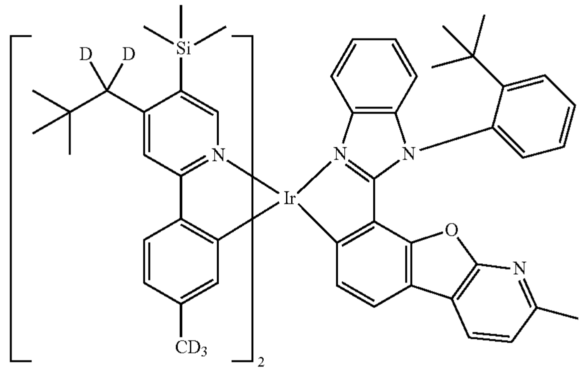
1119
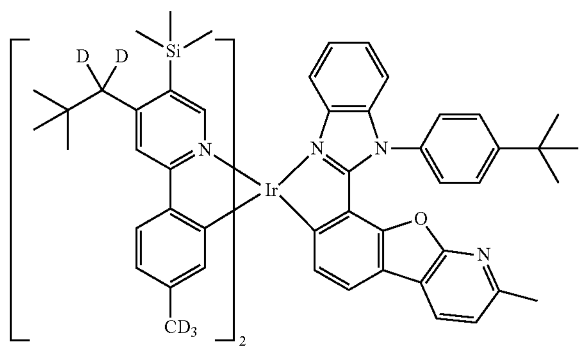
1120
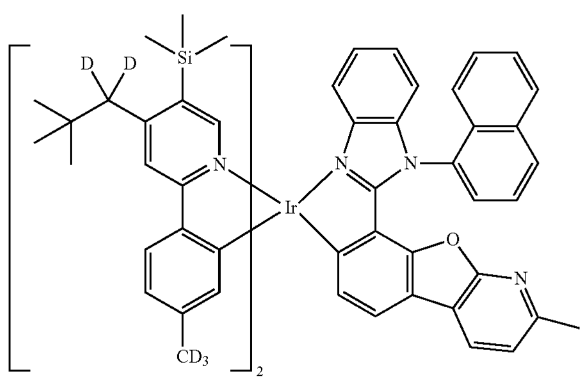
1121
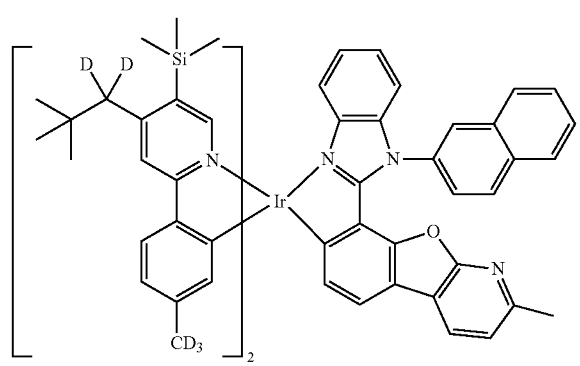

-continued
1122
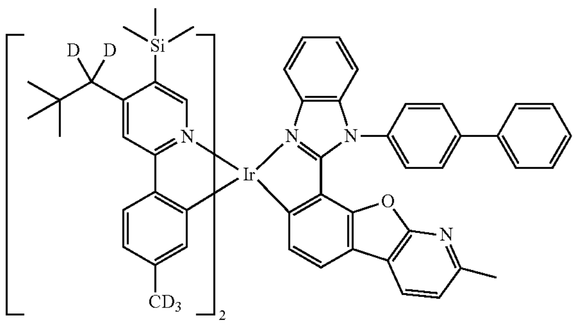
1123
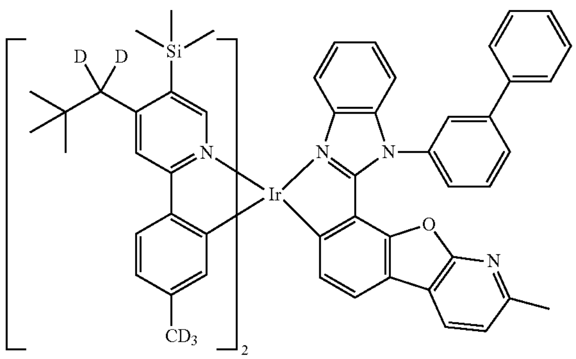
1124
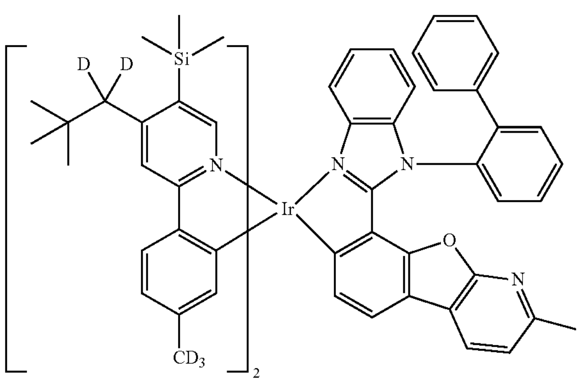
1125
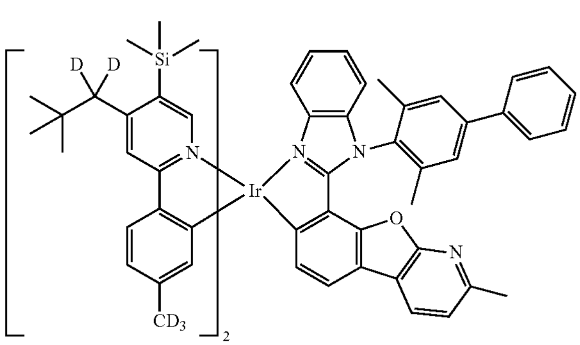
-continued
1126
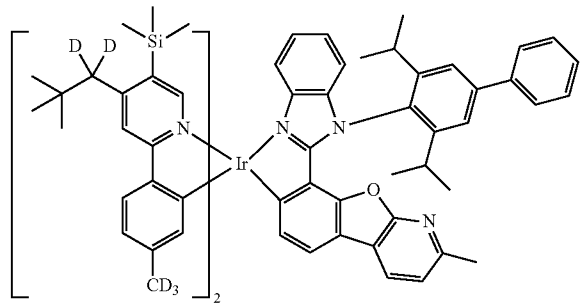
1127
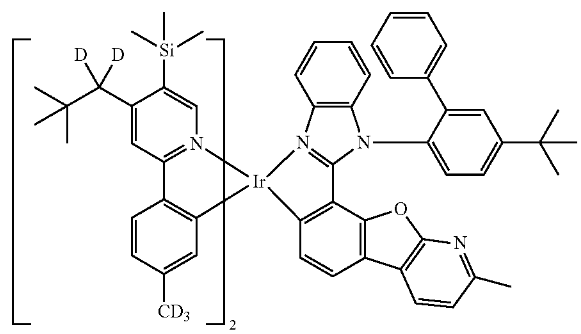
1128
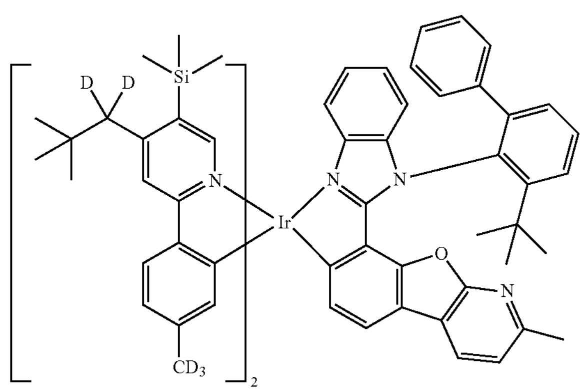
1129
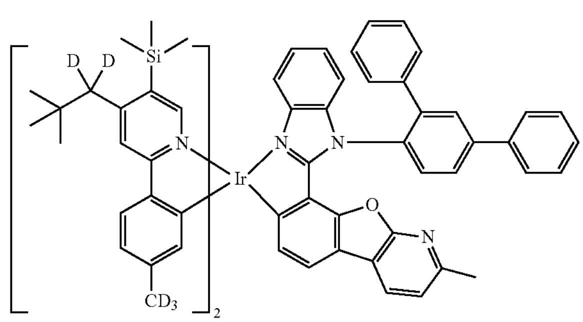

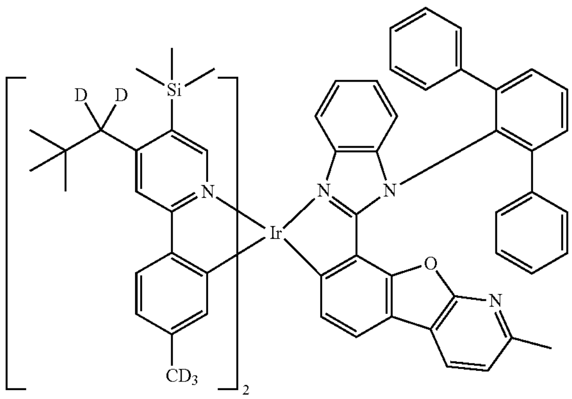
1130
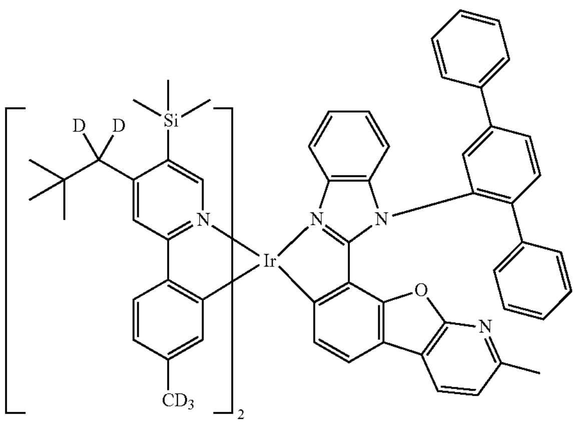
1131
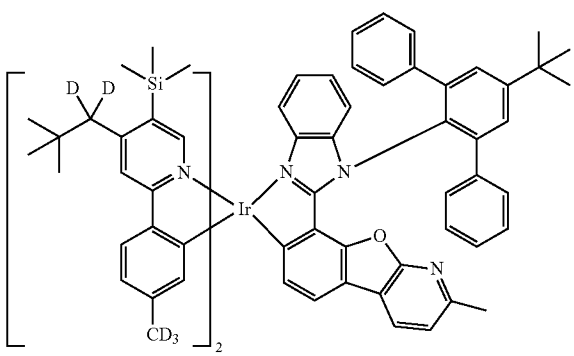
1132
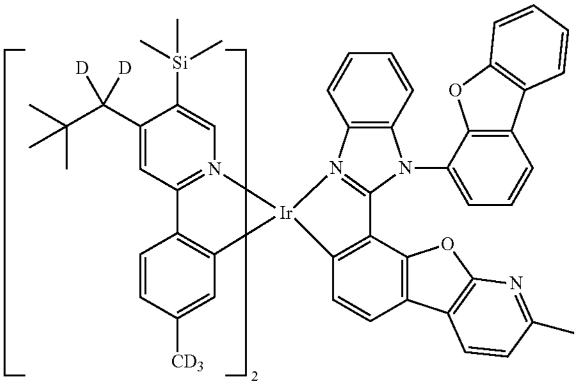
1133
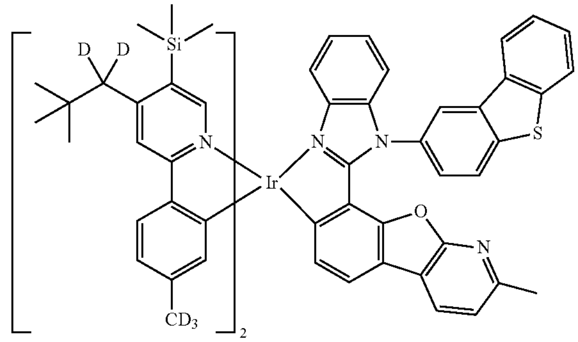
1134
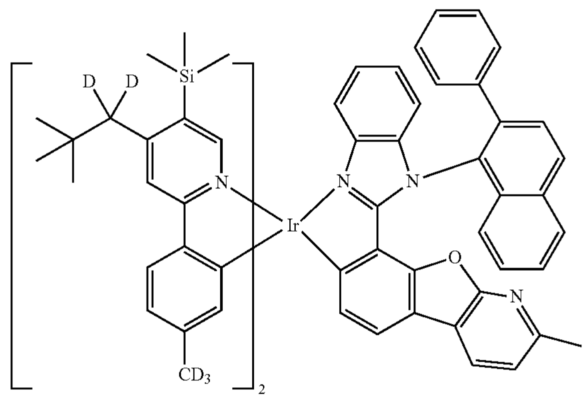
1135
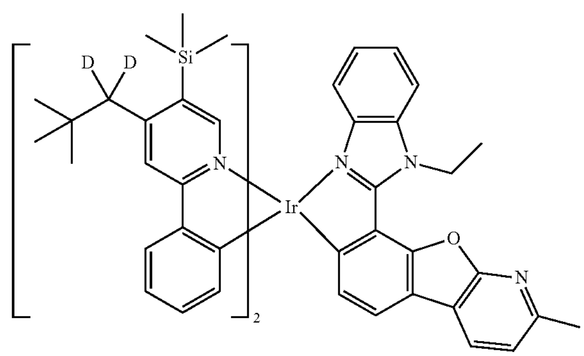
1136
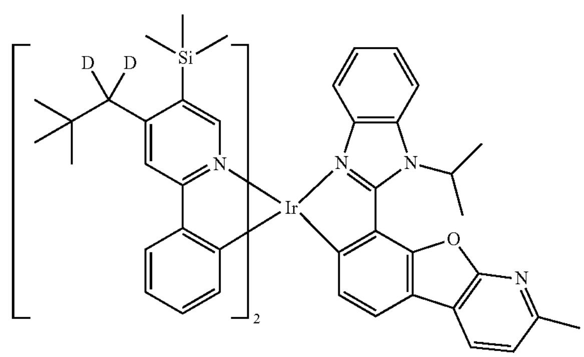
1137

-continued
1138
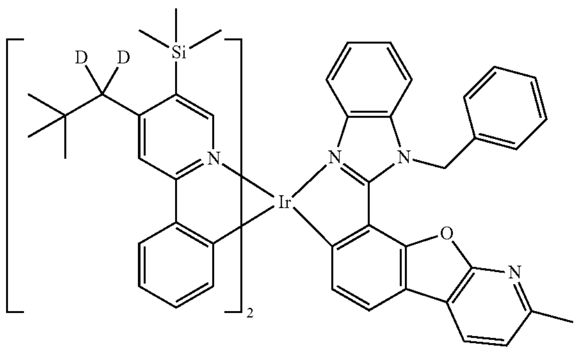
1139
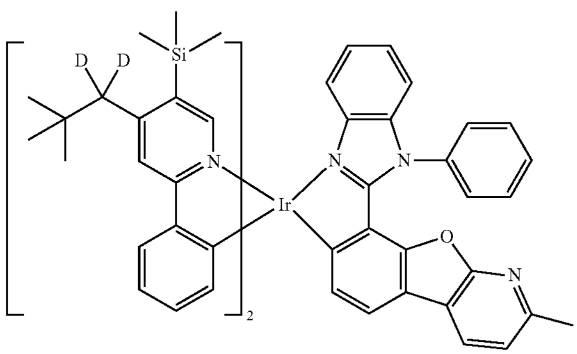
1140
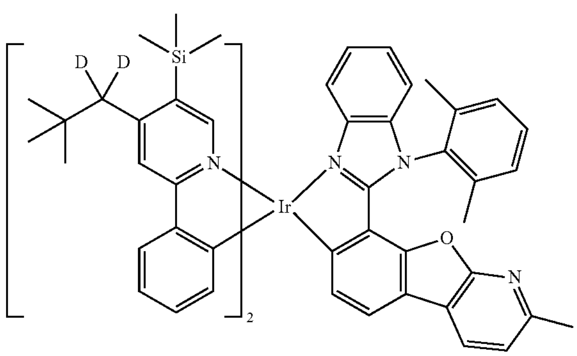
1141
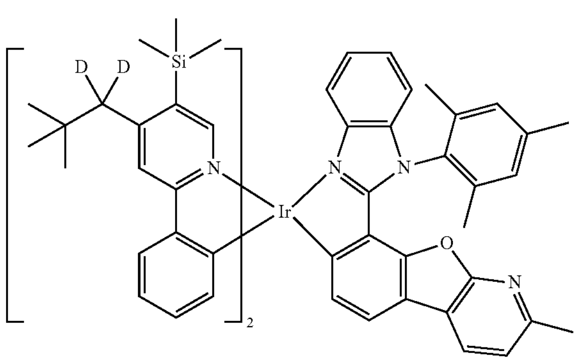
-continued
1142
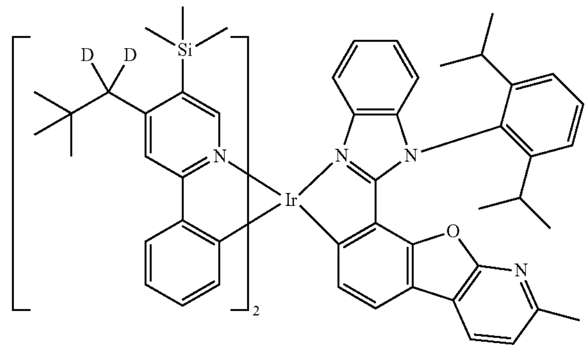
1143
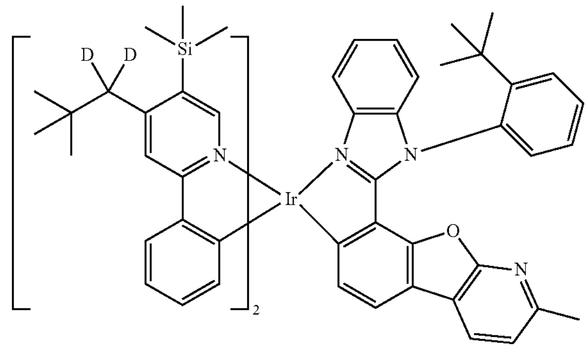
1144
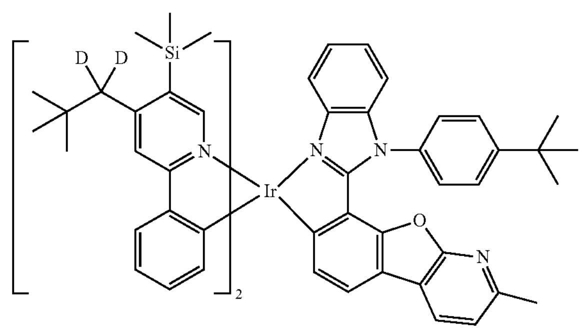
1145
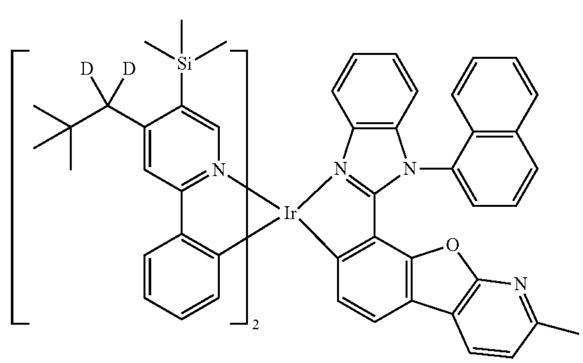

1146
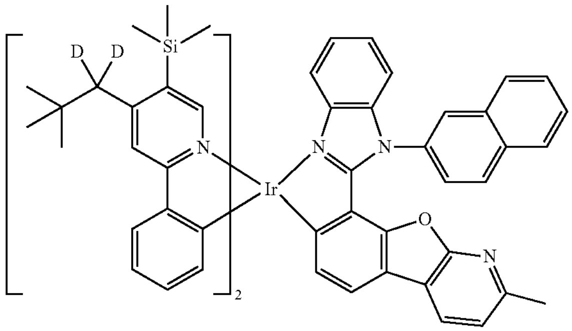
1147
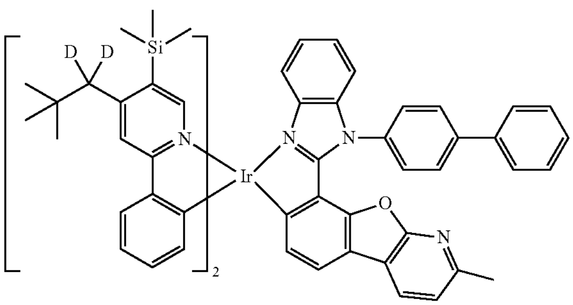
1148
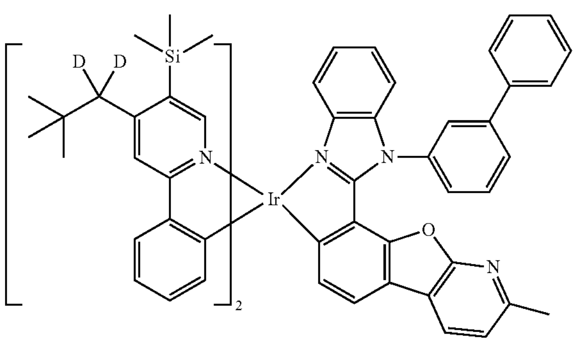
1149
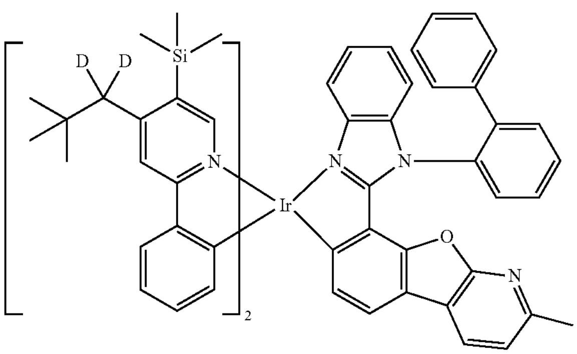
1150
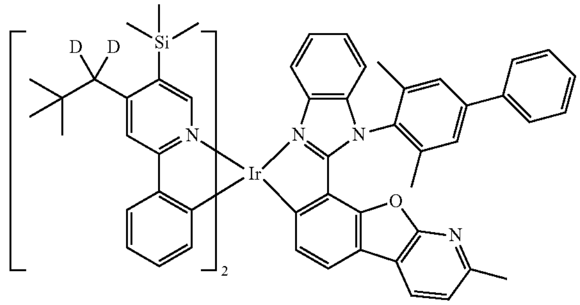
1151
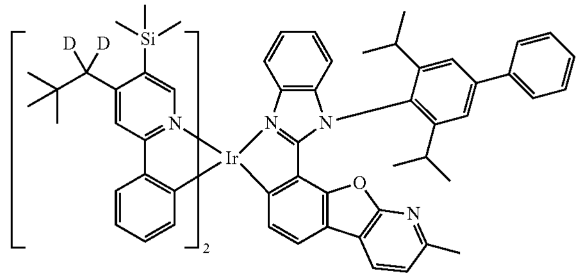
1152
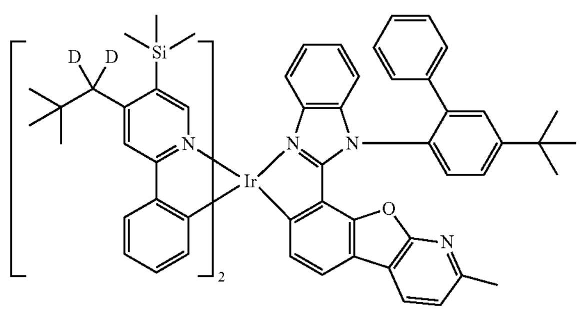
1153
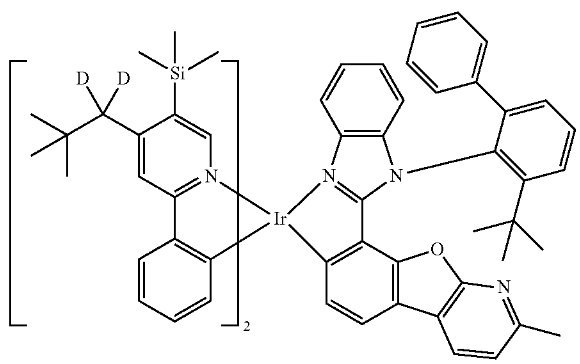

1154
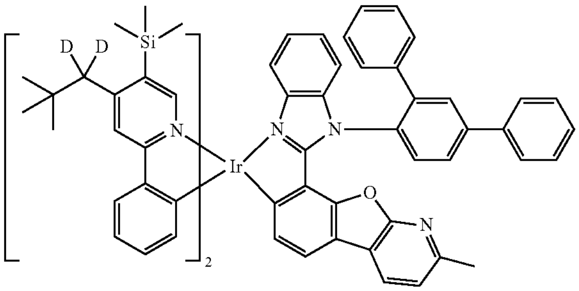
1155
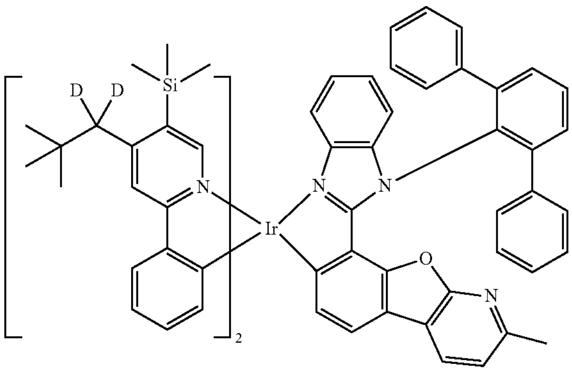
1156
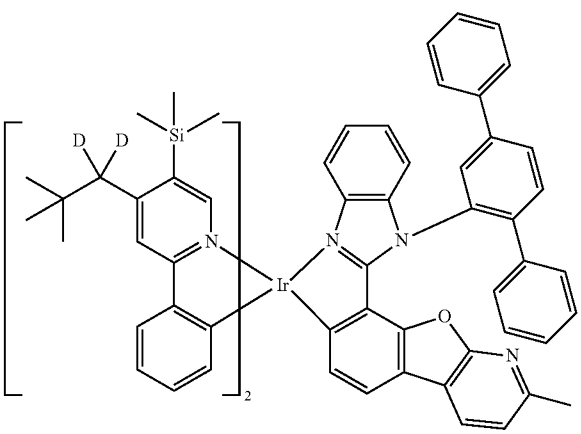
1157
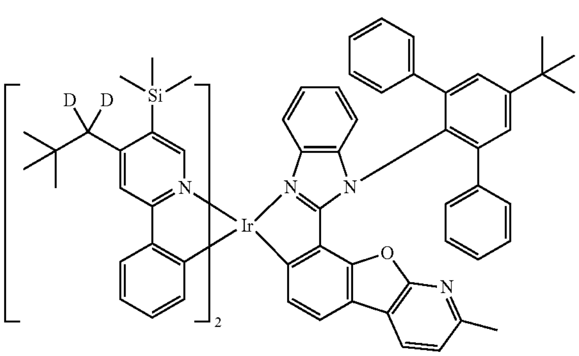
1158
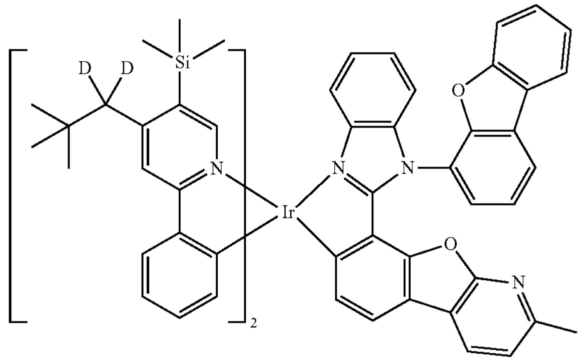
1159
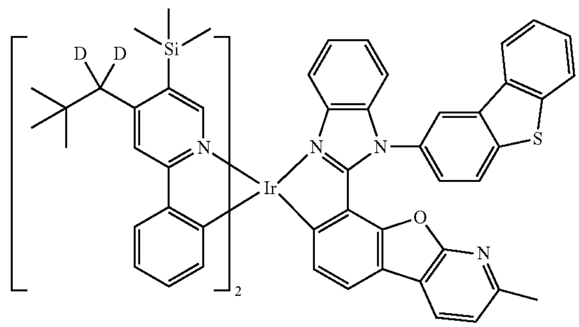
1160
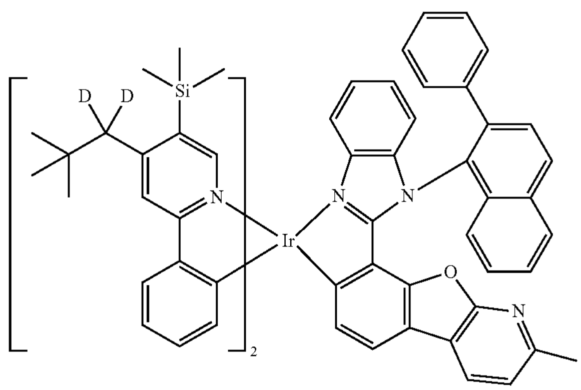
1161
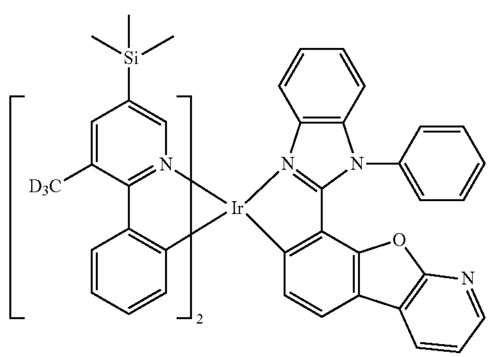

-continued
1162
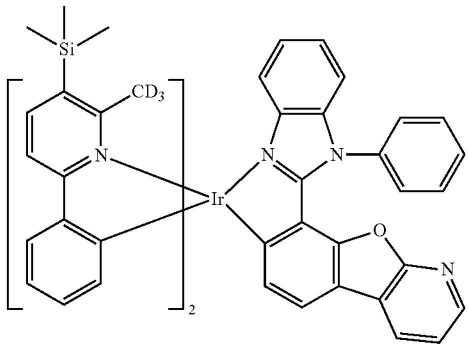
1163
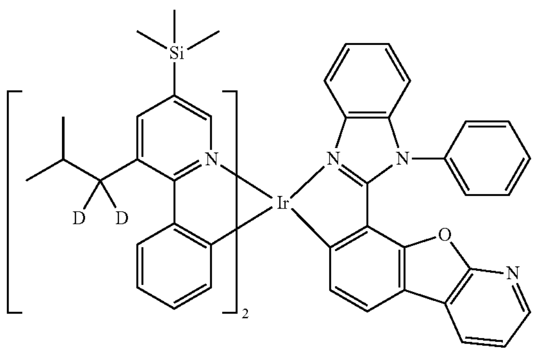
1164
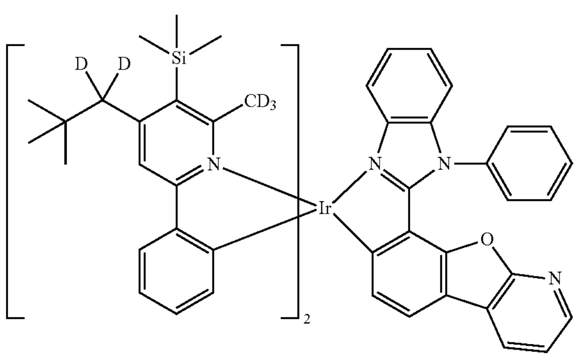
1165
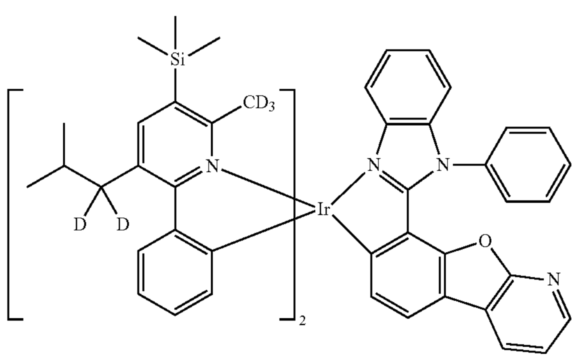
-continued
1166
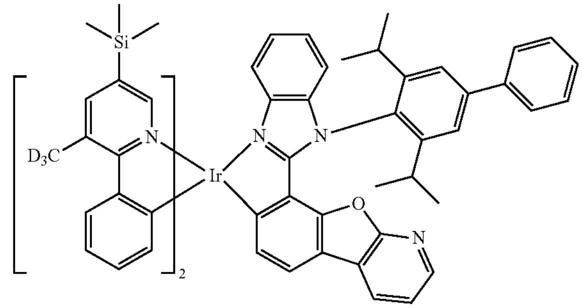
1167
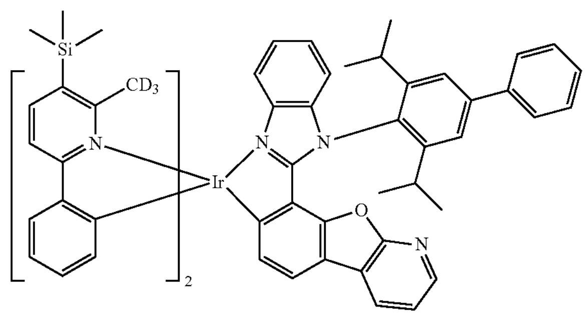
1168
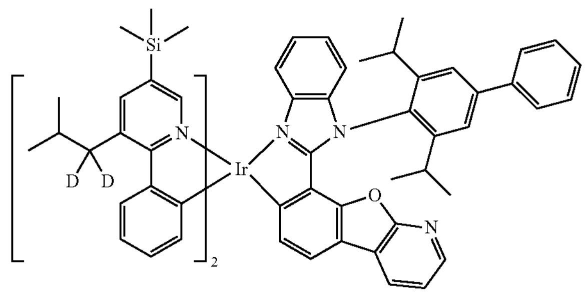
1169
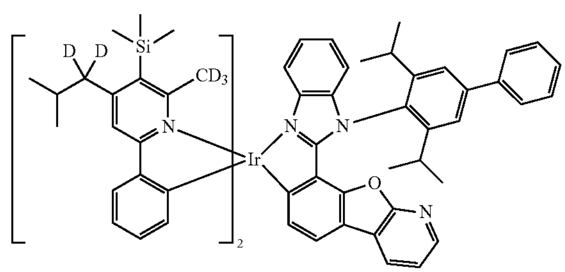
1170
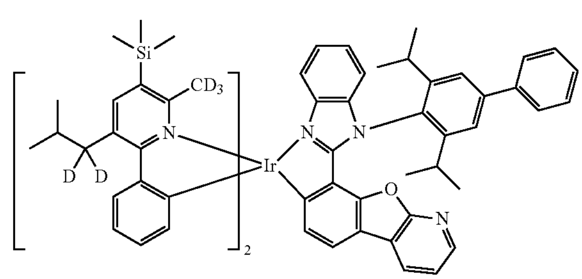

-continued
1171
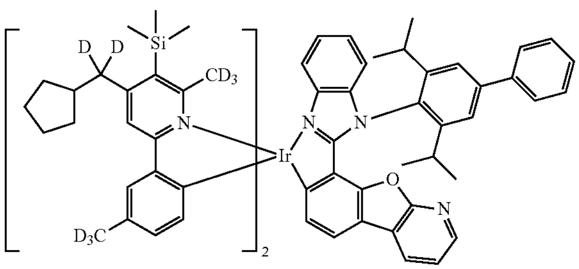
1172
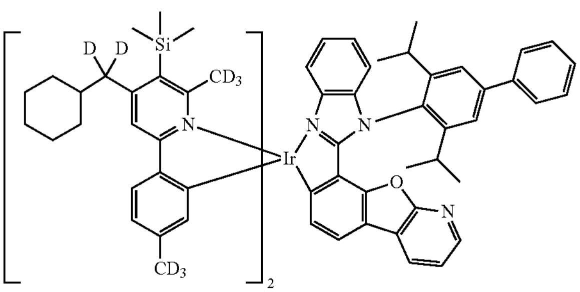
1173
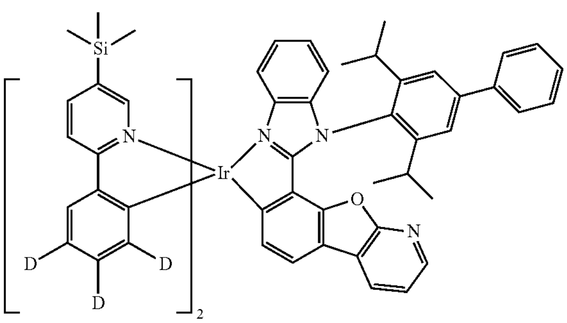
1174
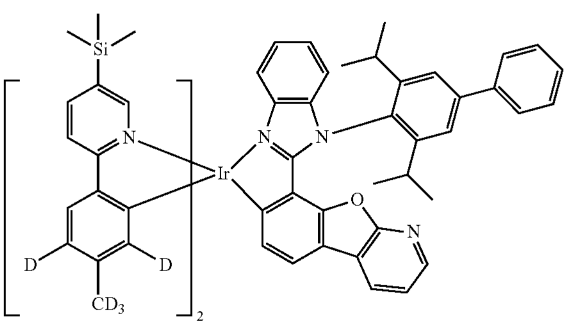
1175
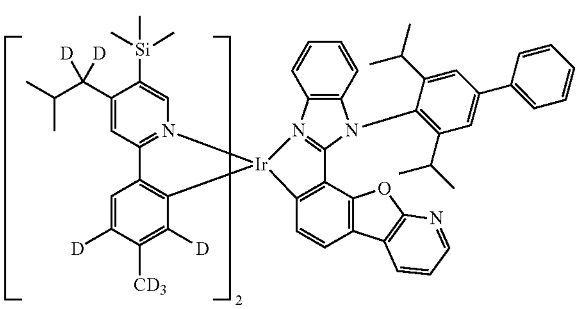
-continued
1176
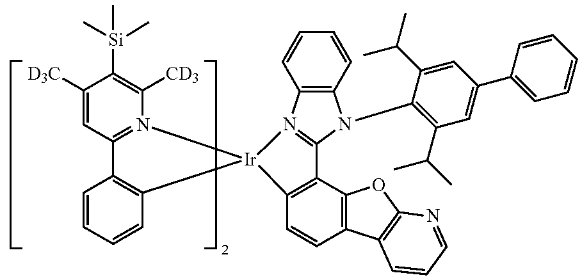
1177
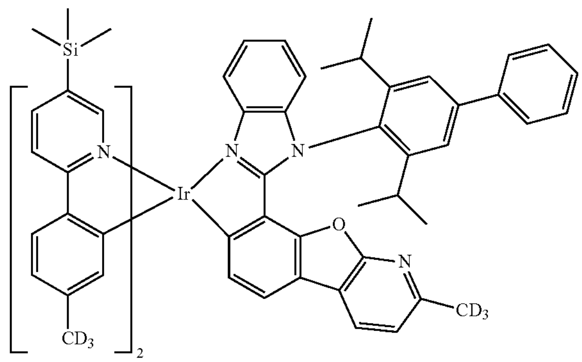
1178
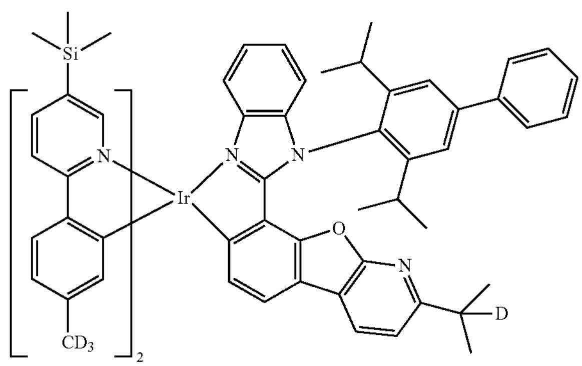
1179
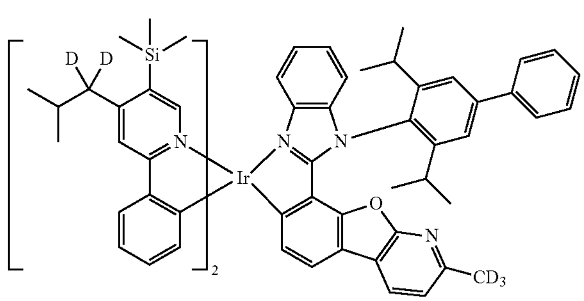

1180
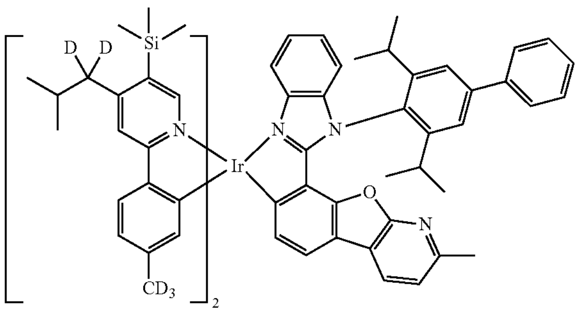
1181
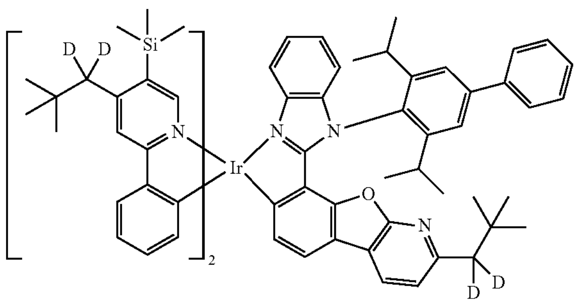
1182
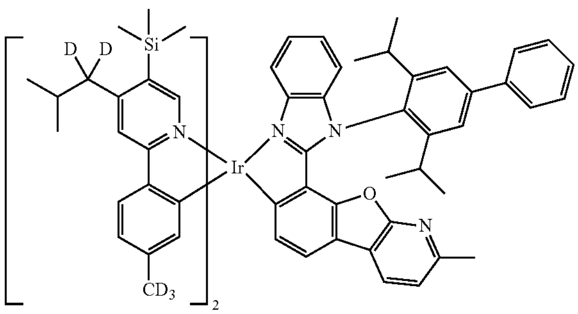
1183
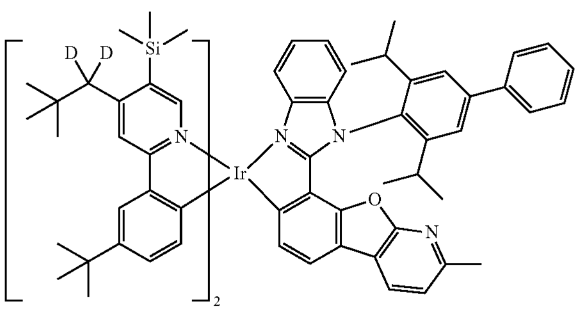
1184
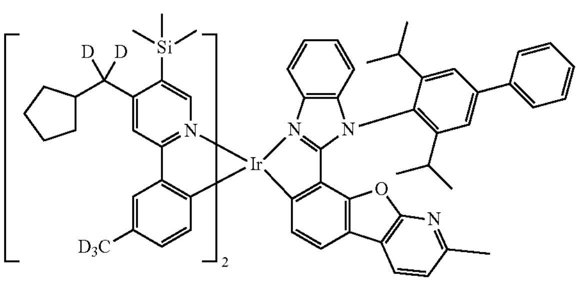
1185
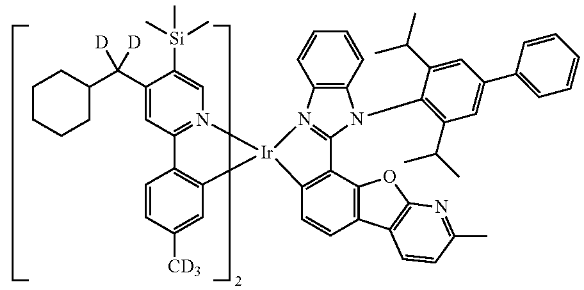
1186
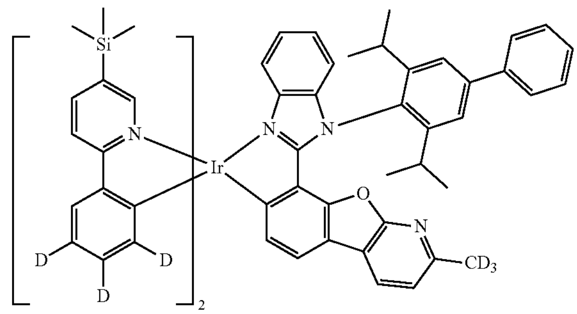
1187
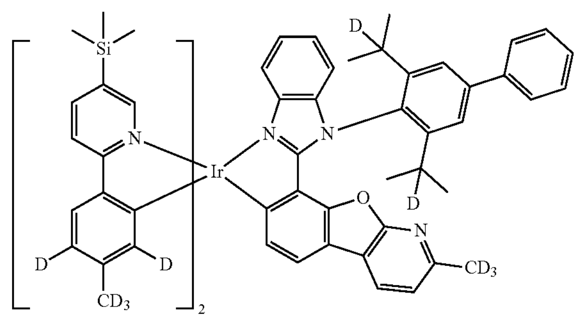
1188
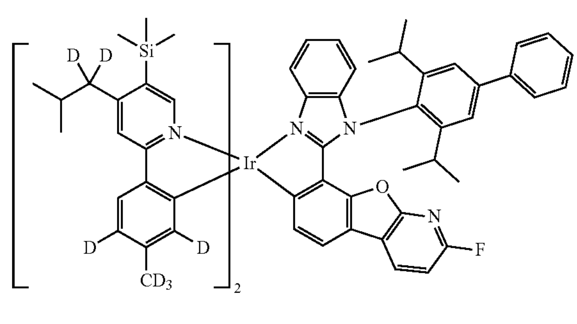

-continued
1189
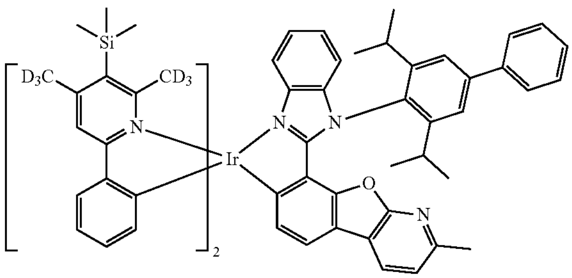
1190
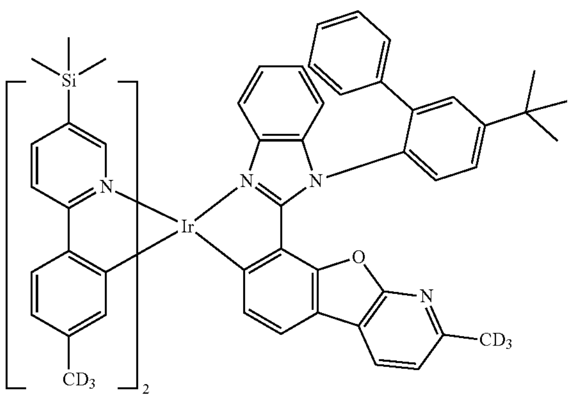
1191
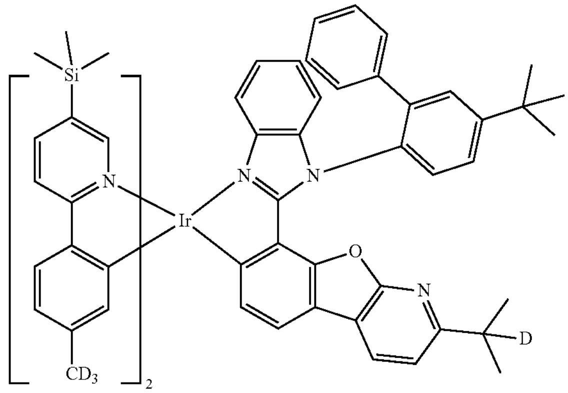
1192
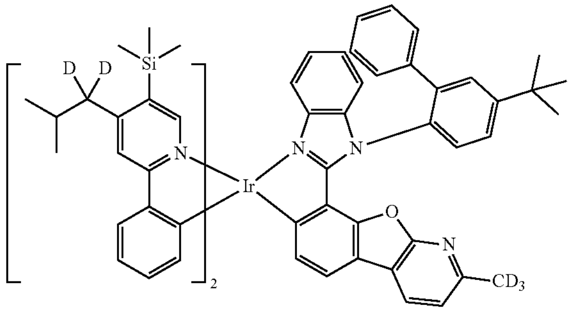
-continued
1193
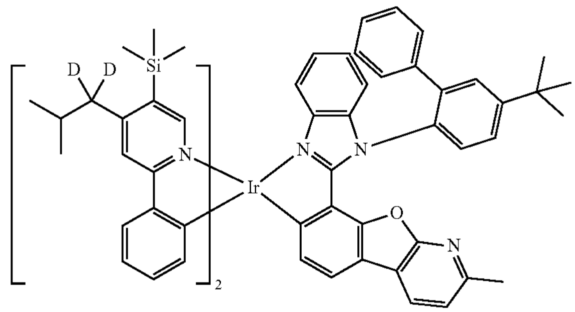
1194
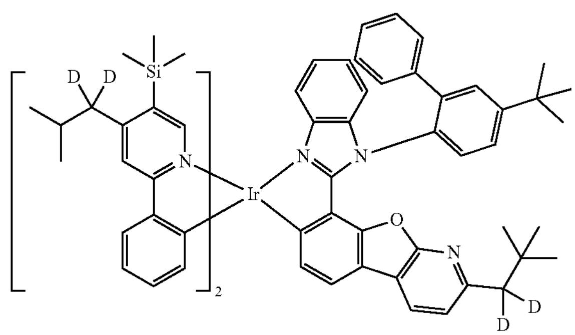
1195
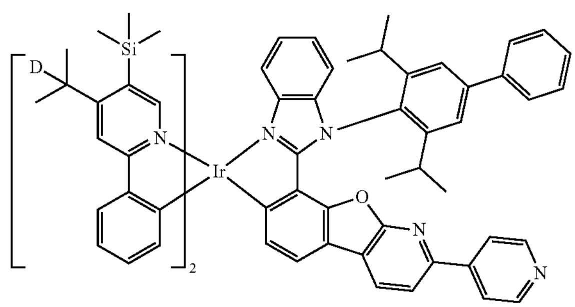
1196
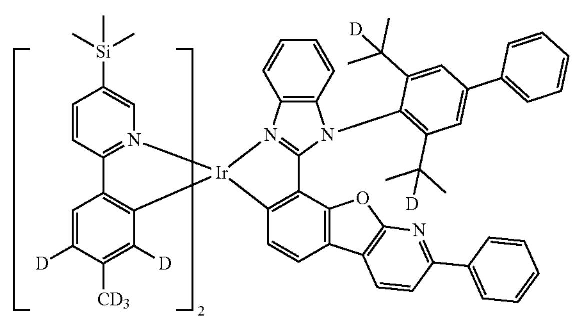

-continued
1197
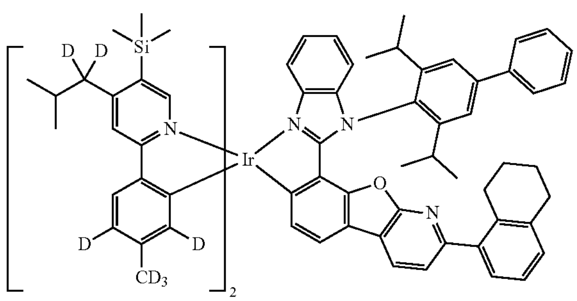
1198
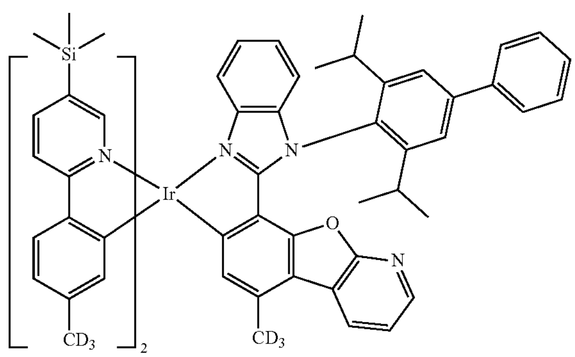
1199
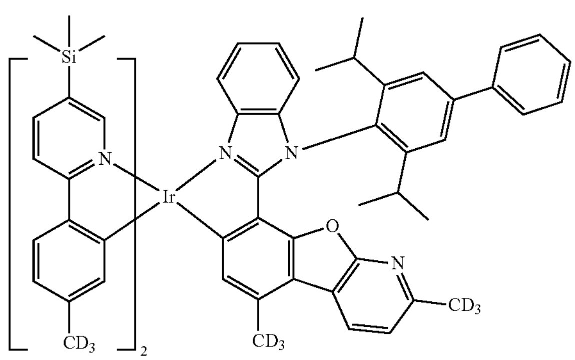
1200
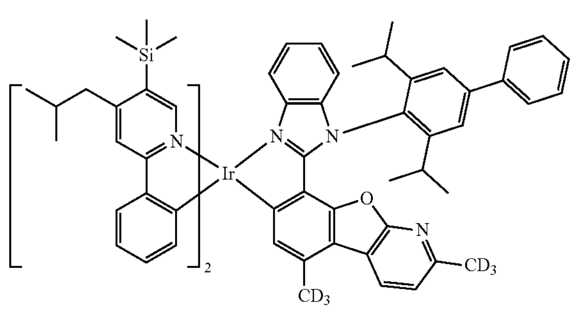
-continued
1201
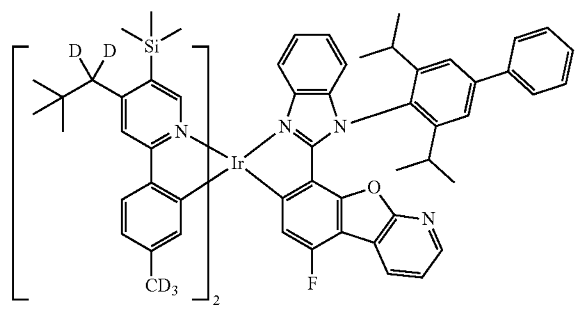
1202
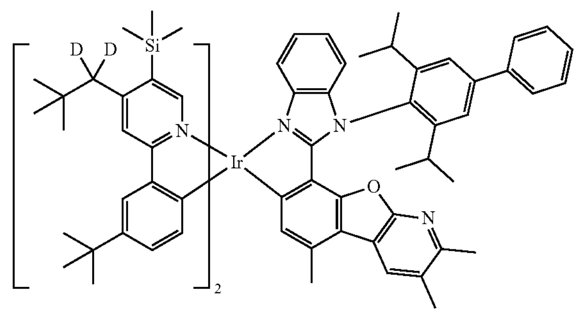
1203
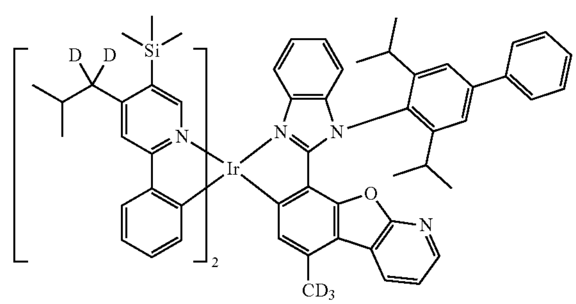
1204
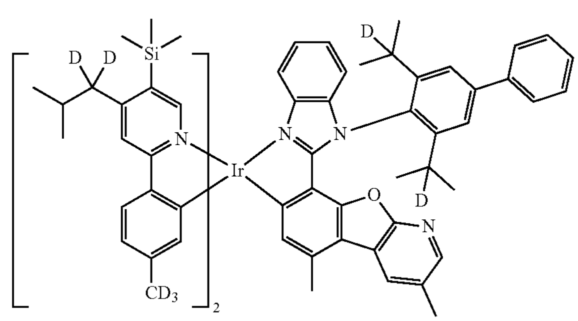
1205
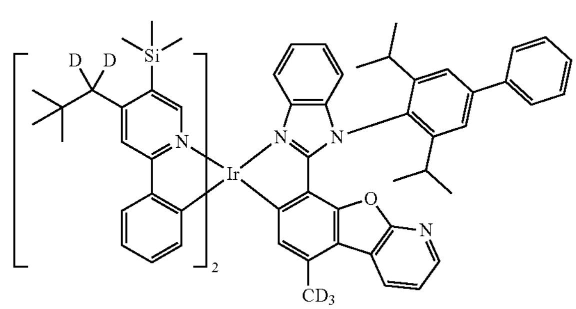

-continued
1206
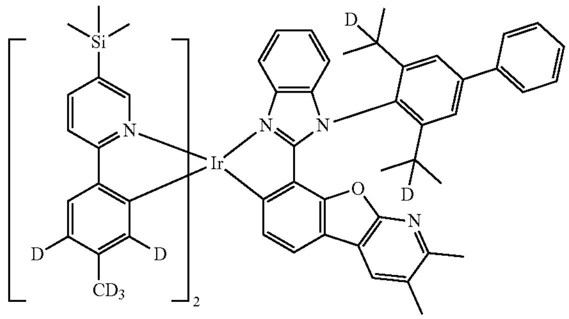
1207
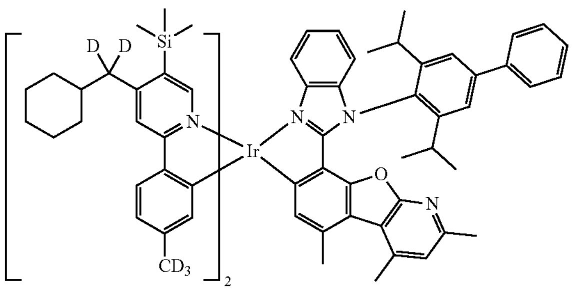
1208
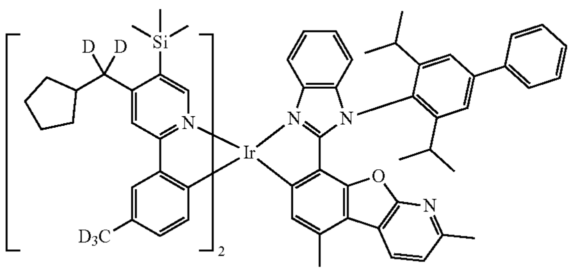
1209
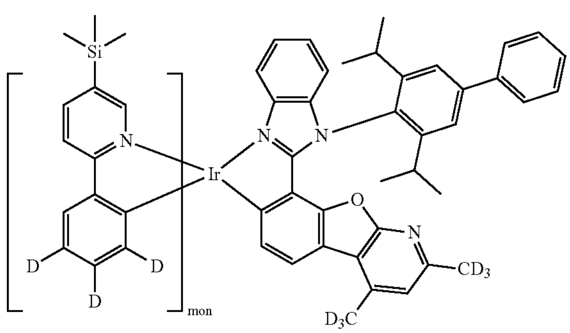
1210
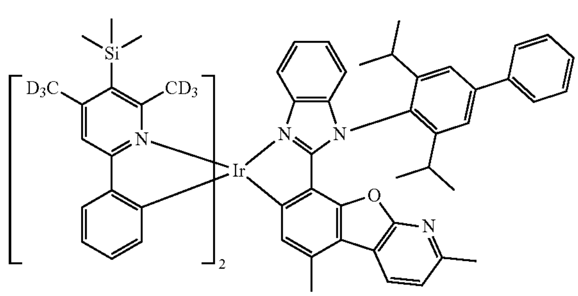
-continued
1211
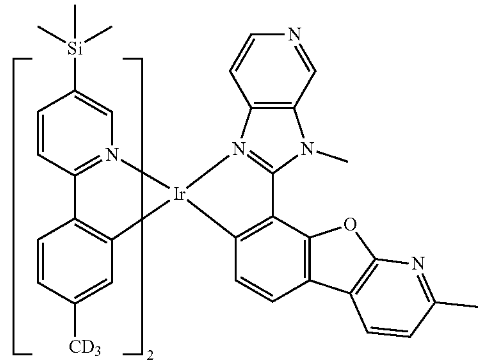
1212
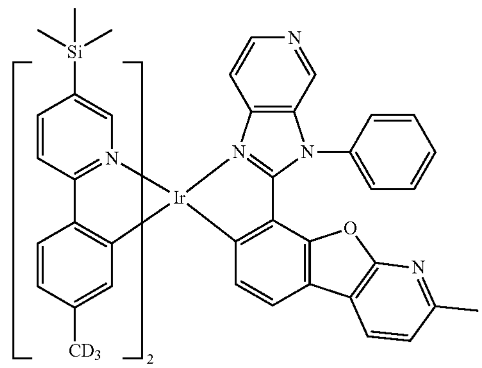
1213
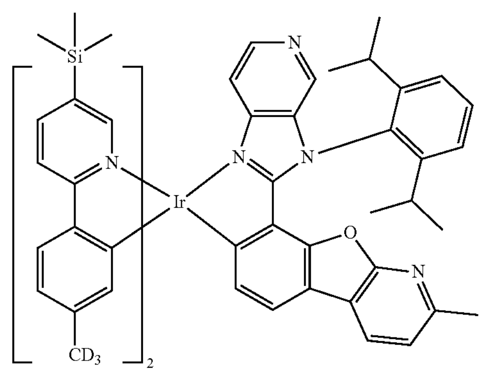
1214
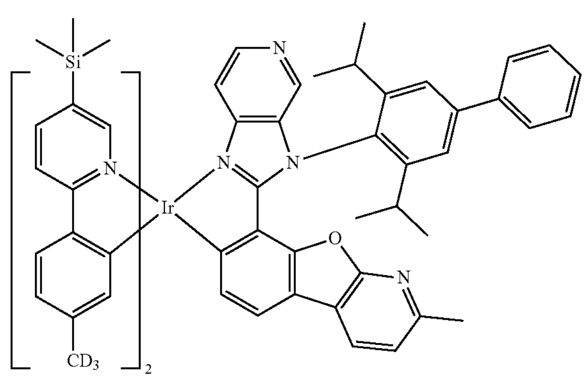

-continued
1215
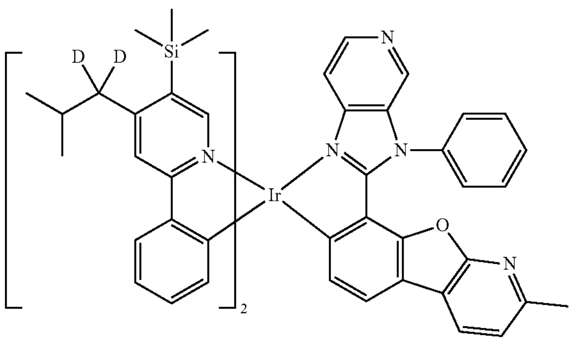
1216
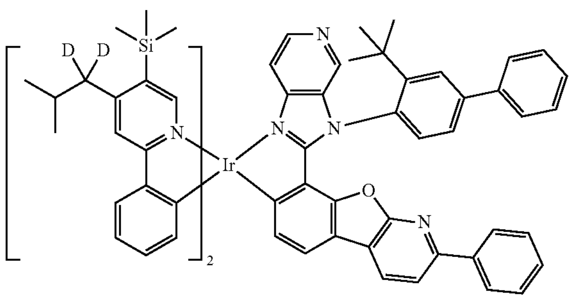
1217
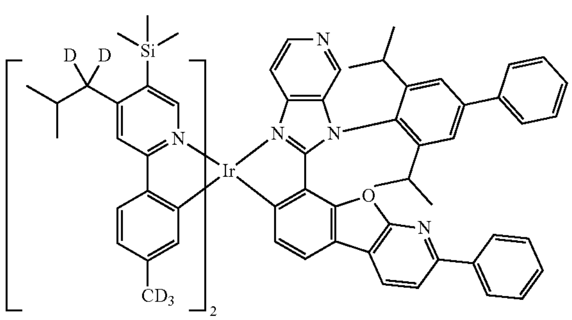
1218
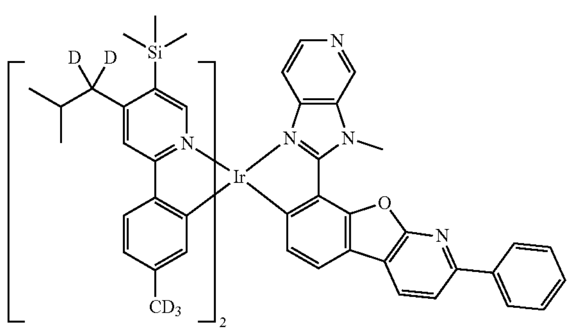
-continued
1219
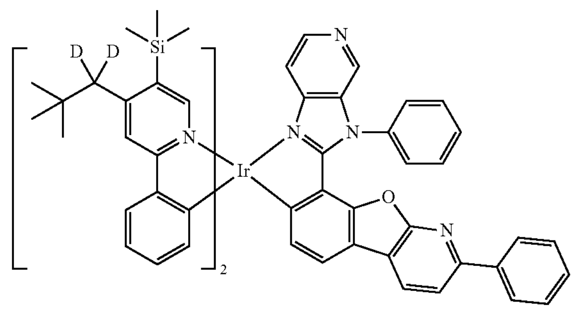
1220
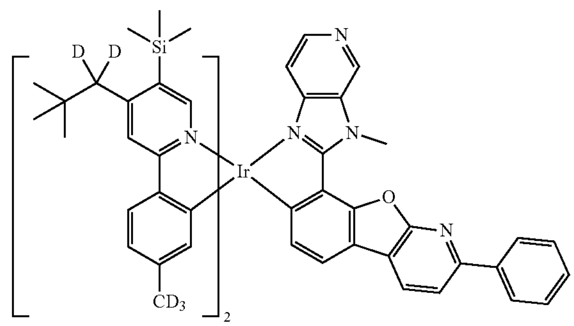
1221
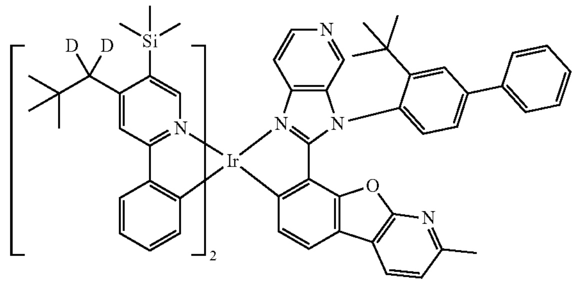
1222
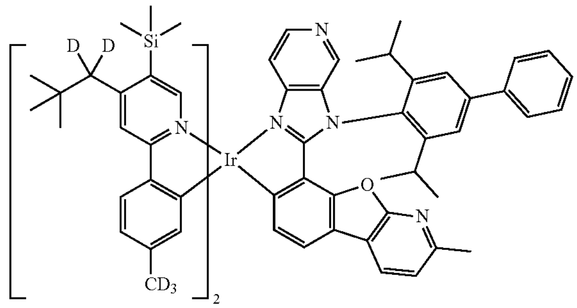

-continued
1223
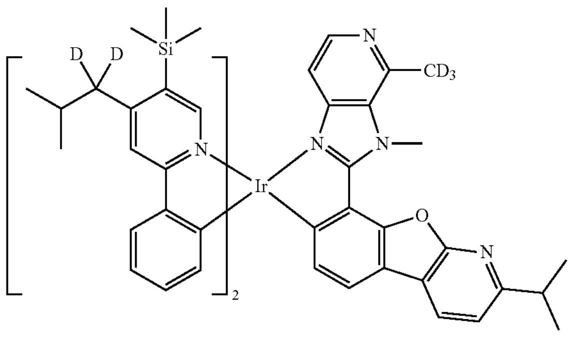
1224
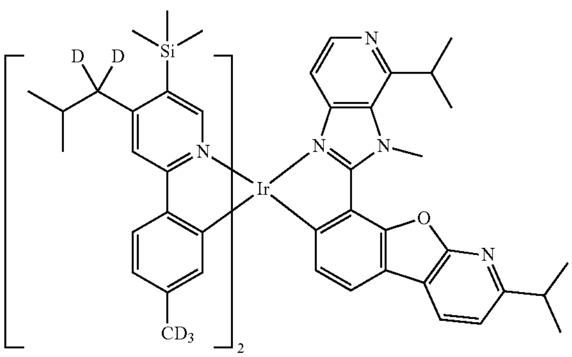
1225
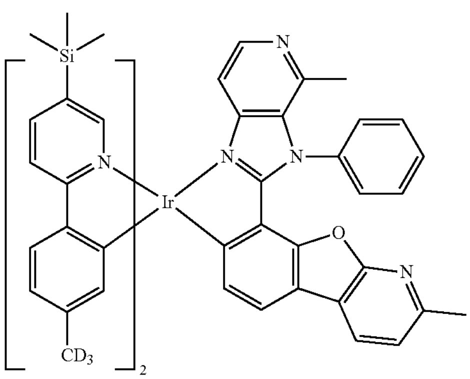
1226
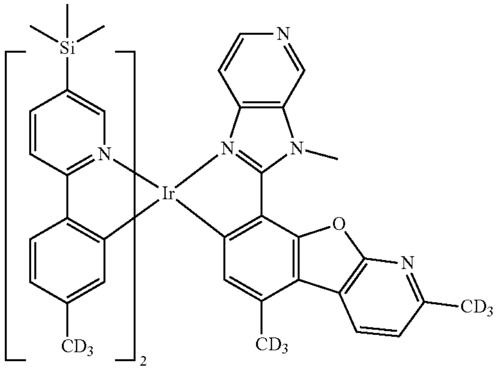
-continued
1227
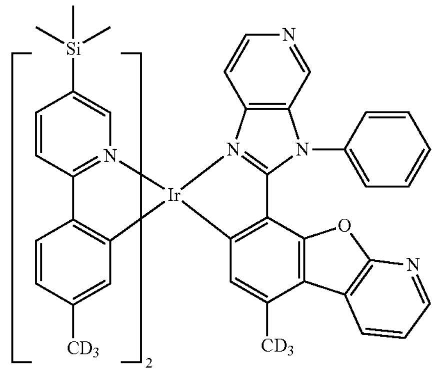
1228
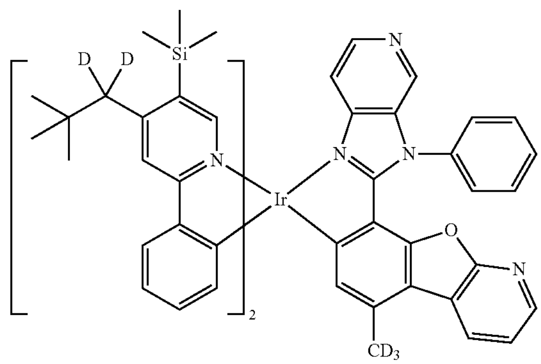
1229
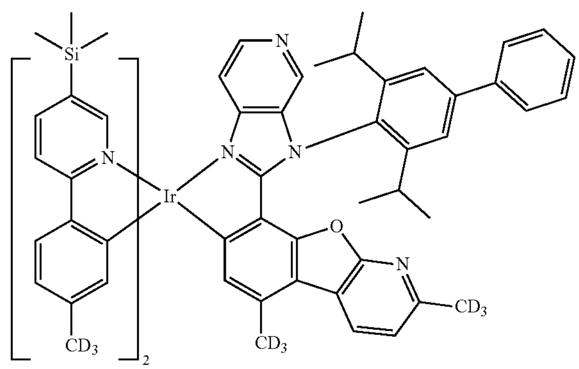
1230
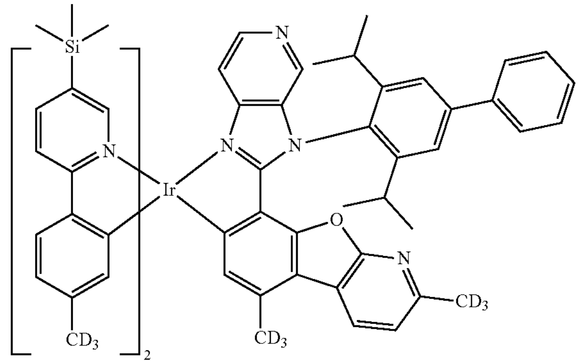

-continued
1231
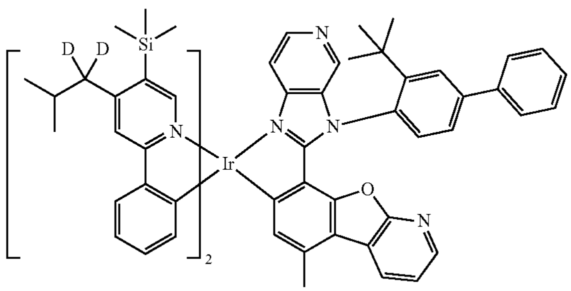
1232
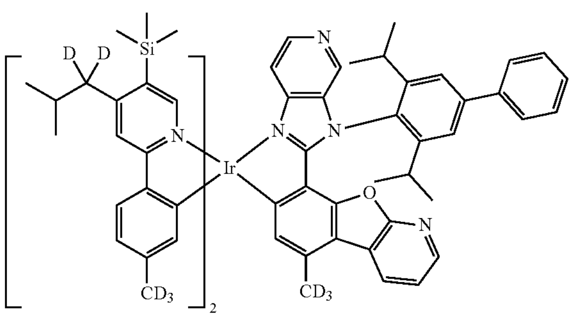
1233
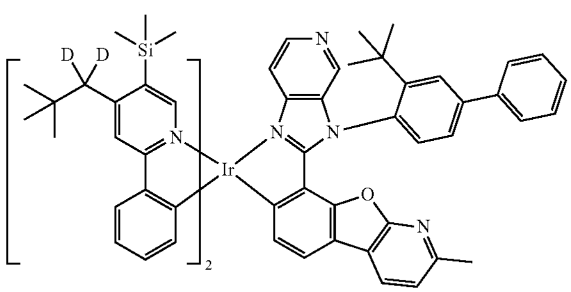
1234
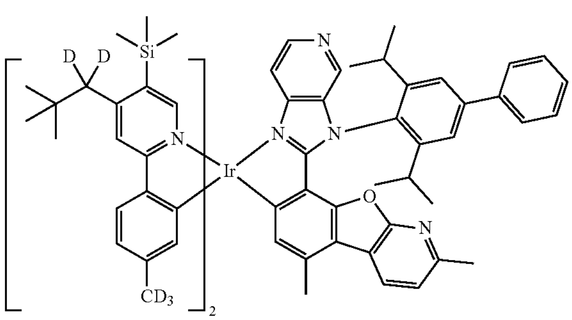
-continued
1235
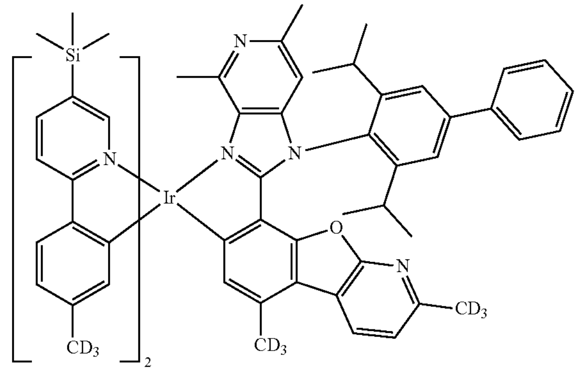
1236
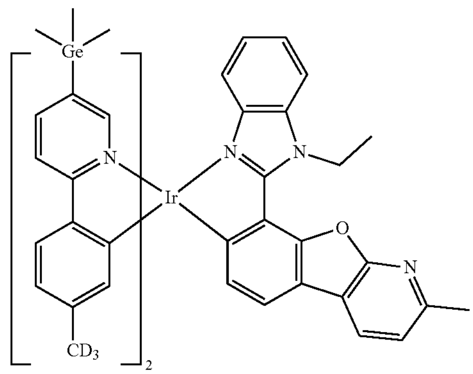
1237
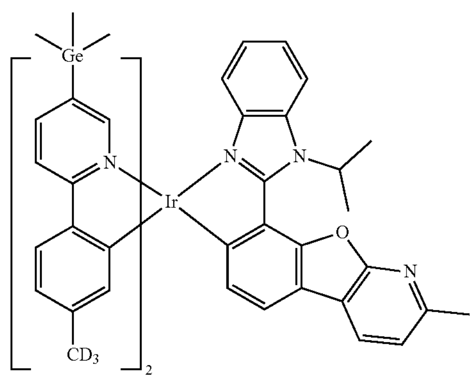
1238
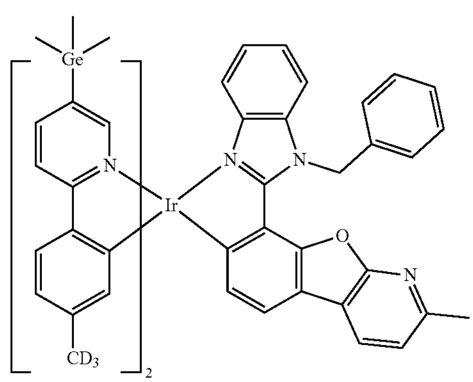

-continued
1239
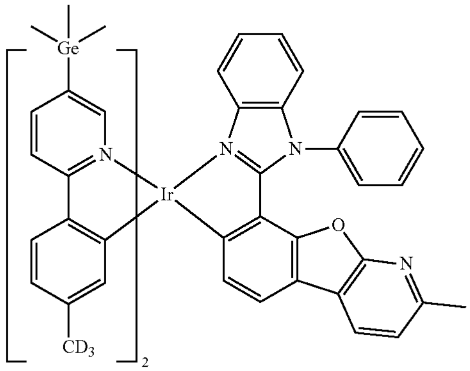
1240
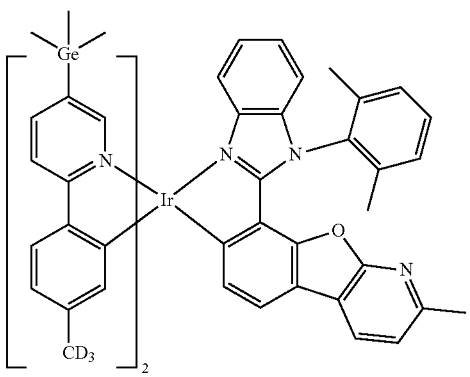
1241
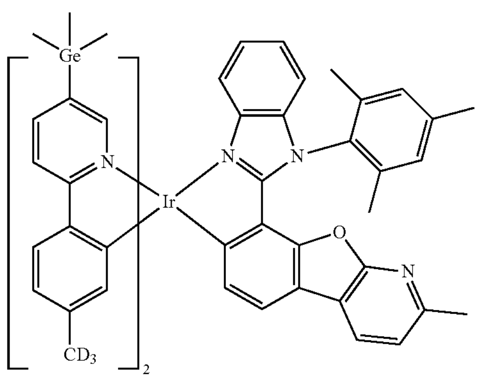
1242
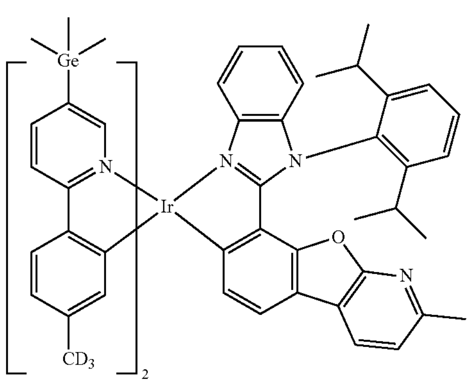
-continued
1243
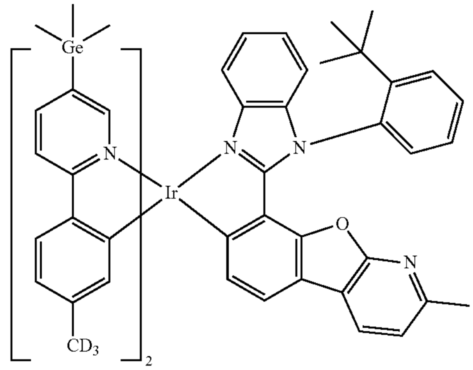
1244
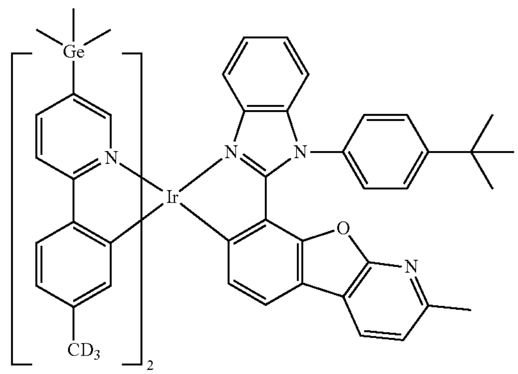
1245
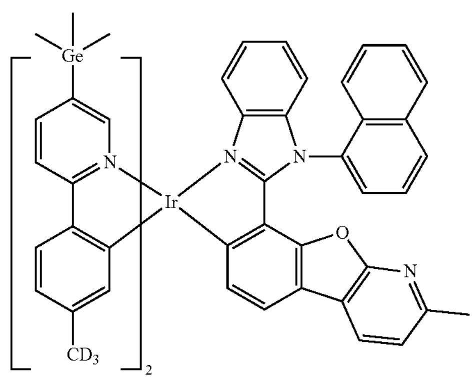
1246
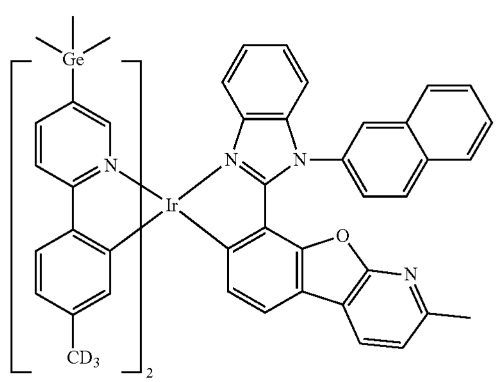

-continued
1247
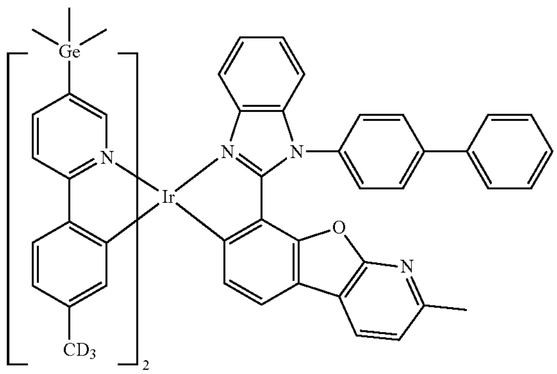
1248
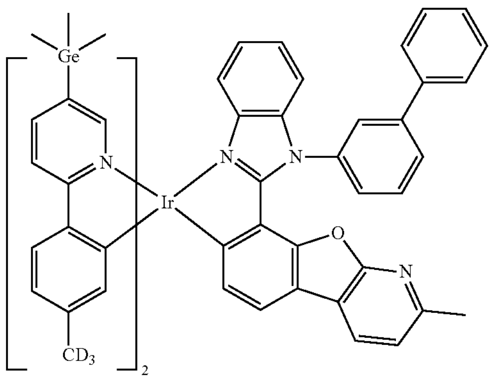
1249
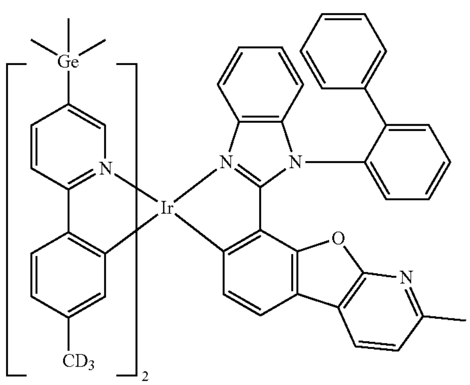
1250
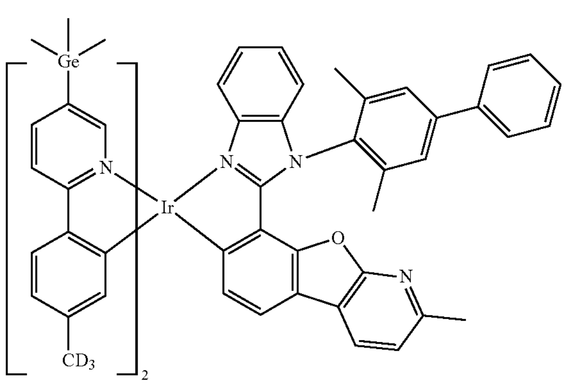
-continued
1251
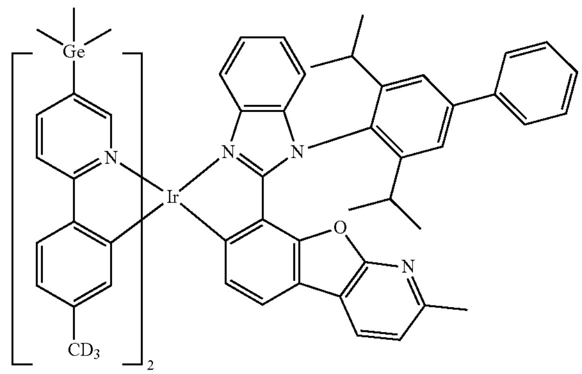
1252
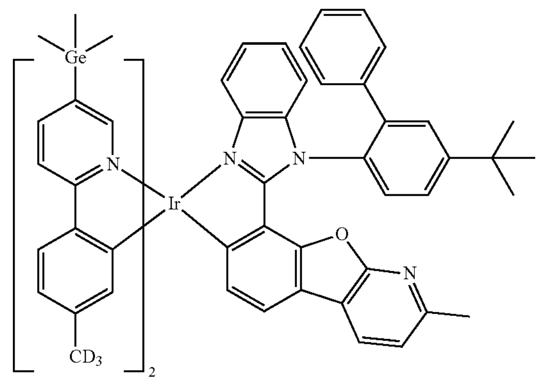
1253
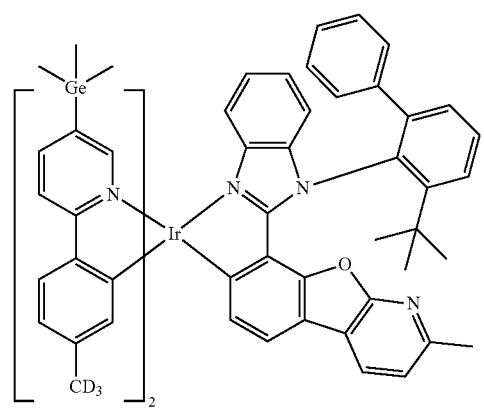
1254
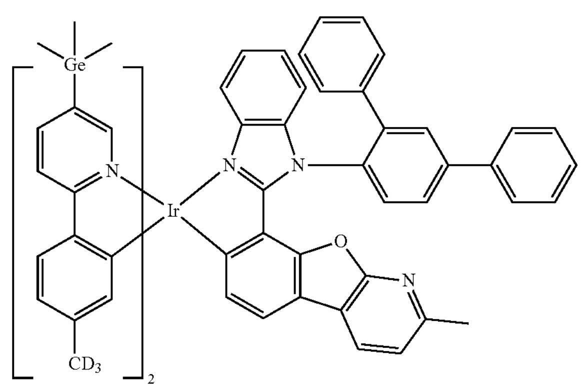

-continued
1255
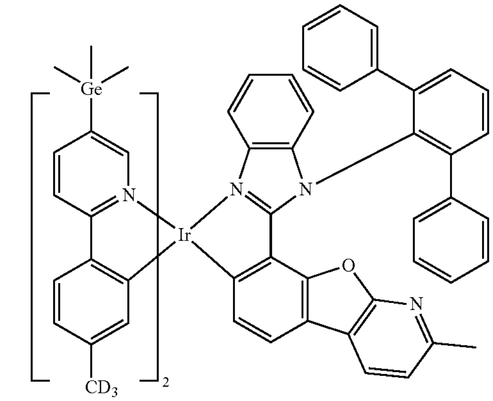
1256
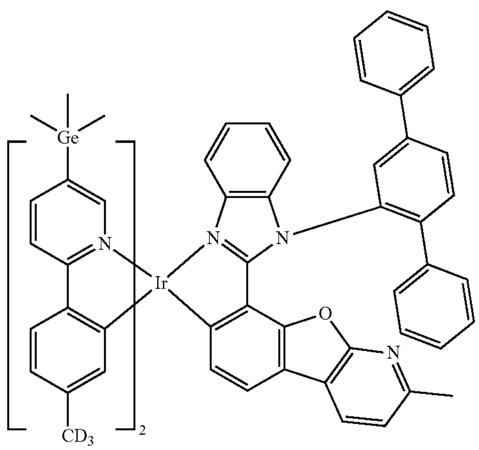
1257
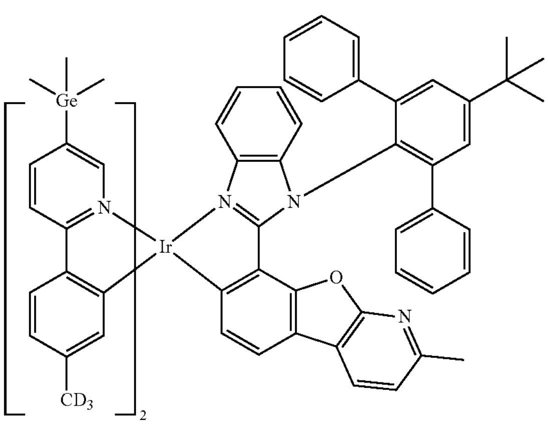
-continued
1258
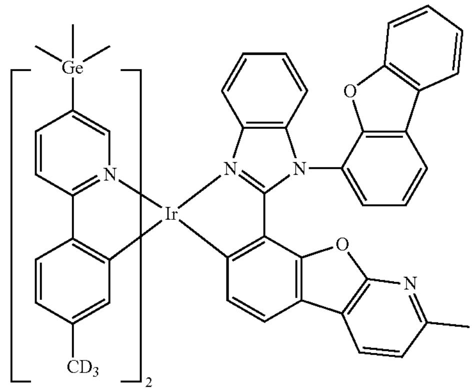
1259
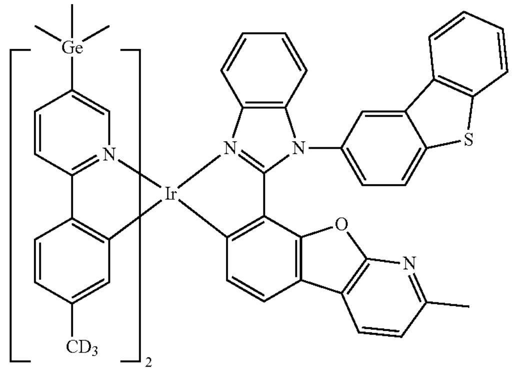
1260
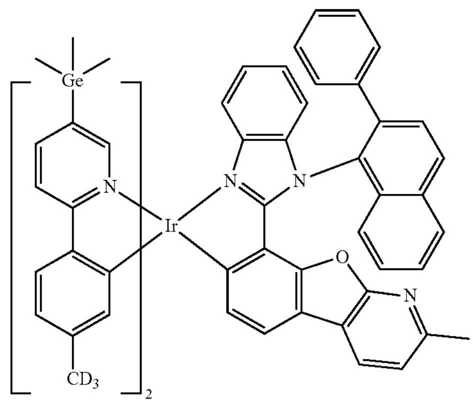
1261
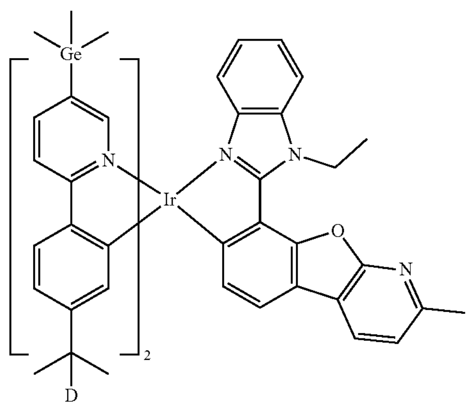

-continued
1262
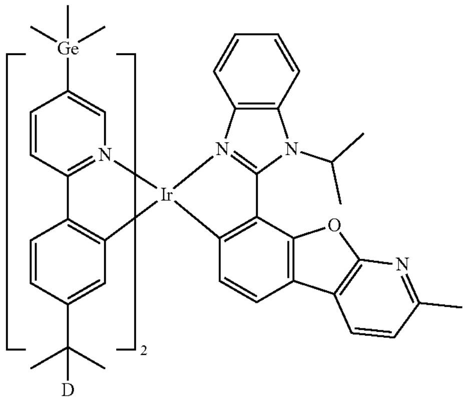
1263
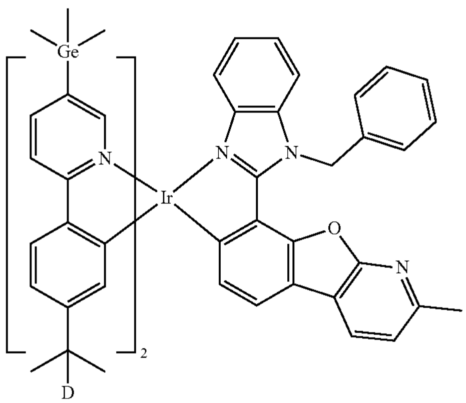
1264
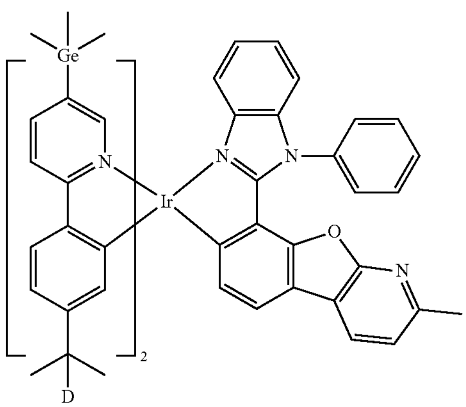
1265
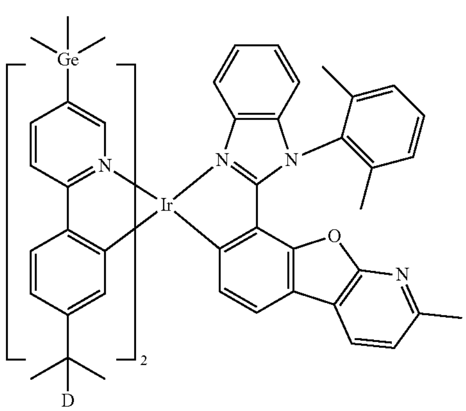
-continued
1266
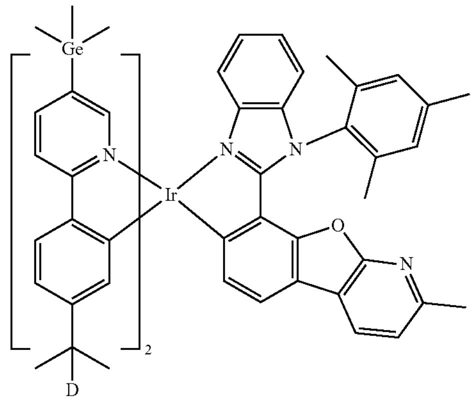
1267
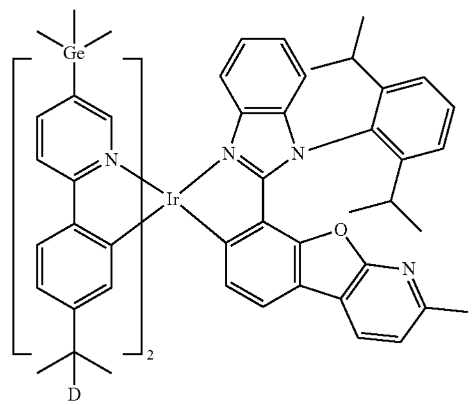
1268
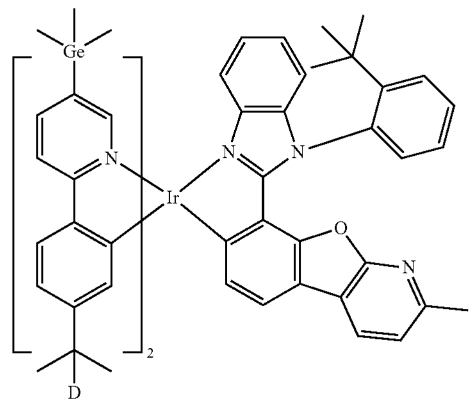
1269
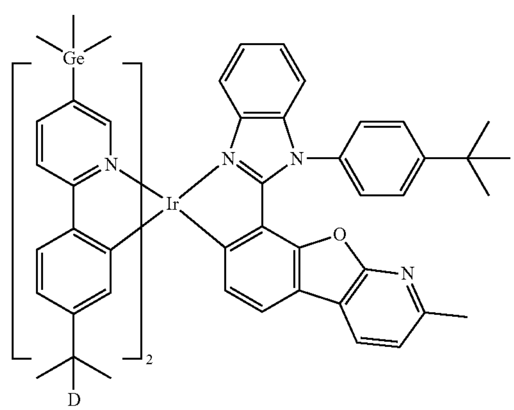

1270
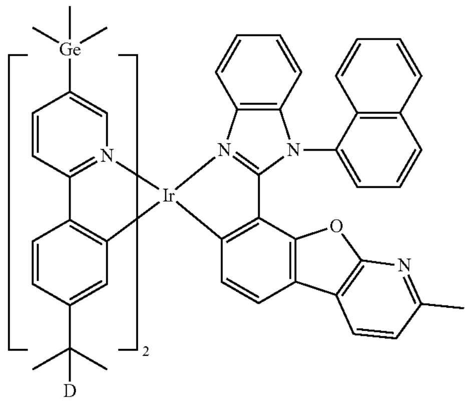
1271
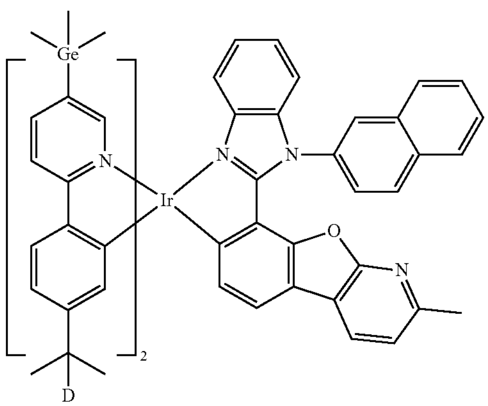
1272
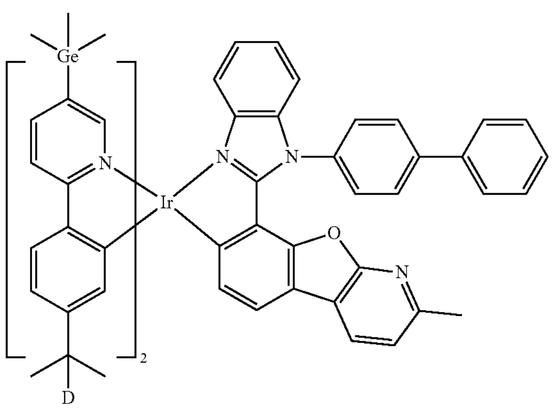
1273
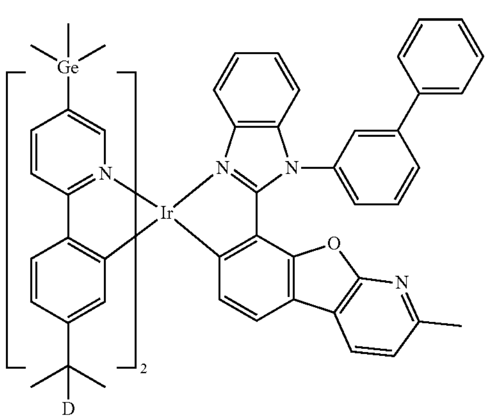
1274
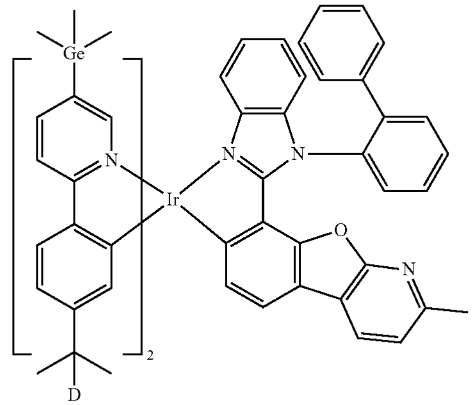
1275
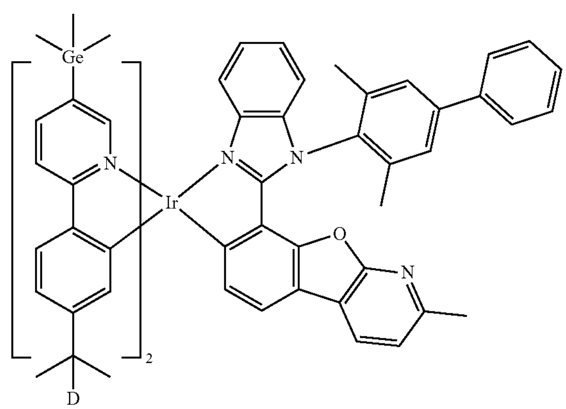
1275
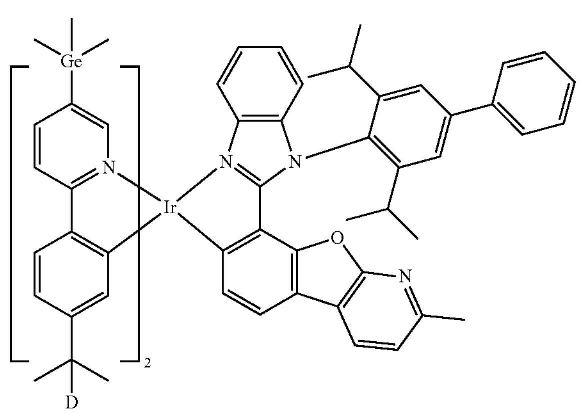

1277
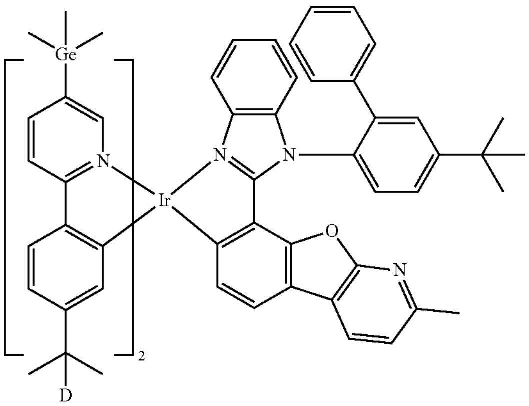
1278
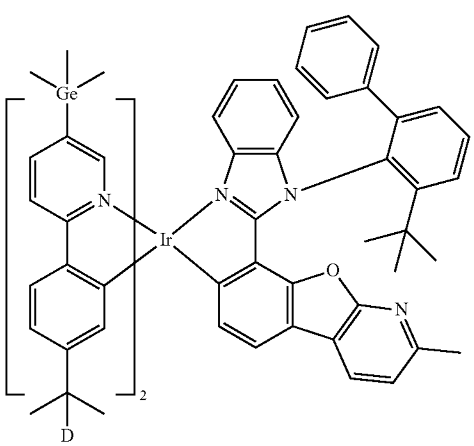
1279
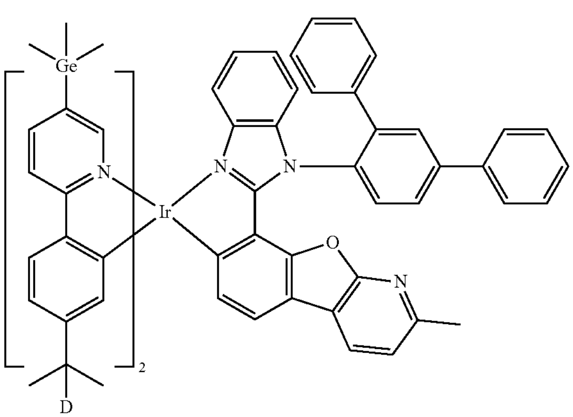
1280
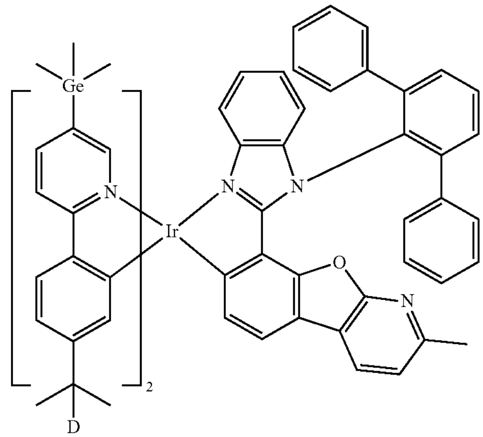
1281
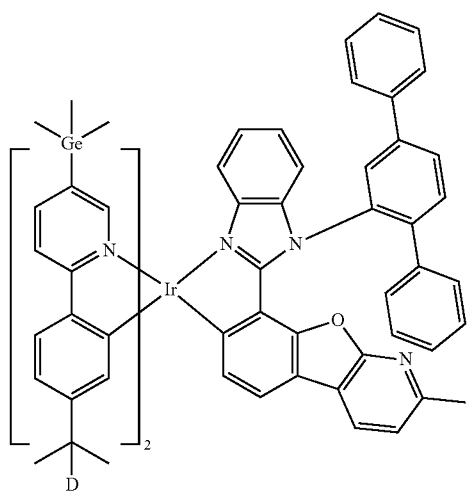
1282
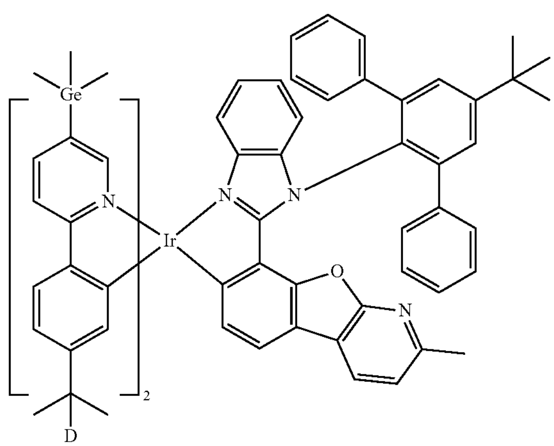

1283
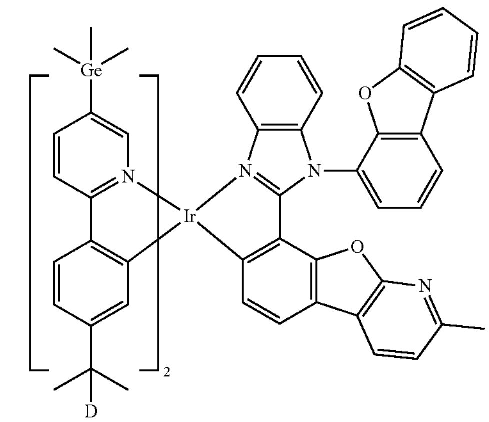
1284
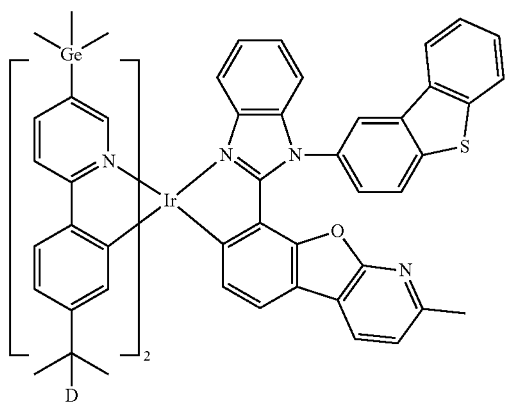
1285
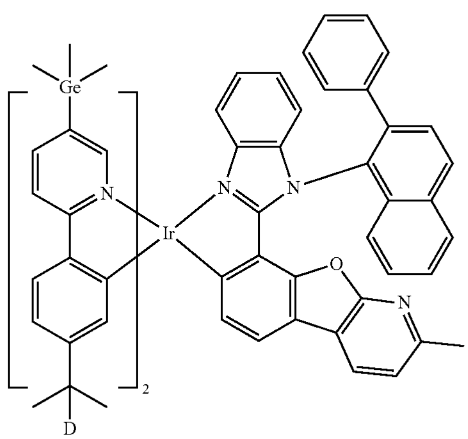
1286
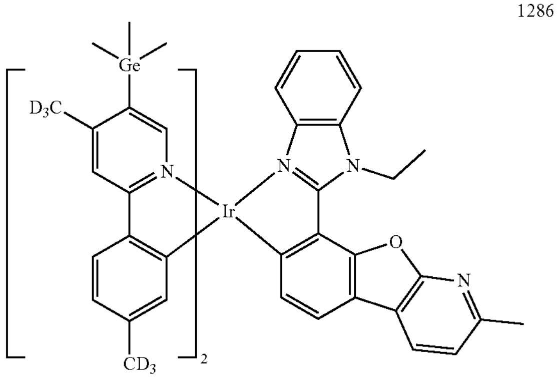
1287
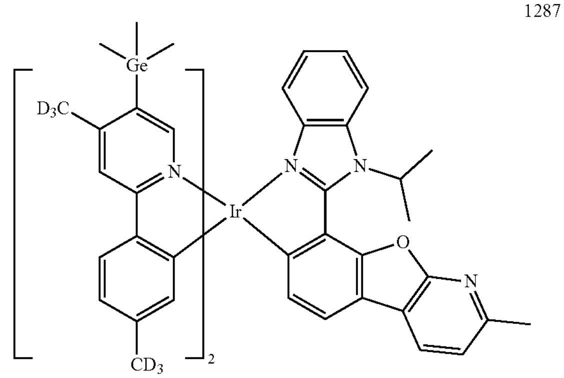
1288
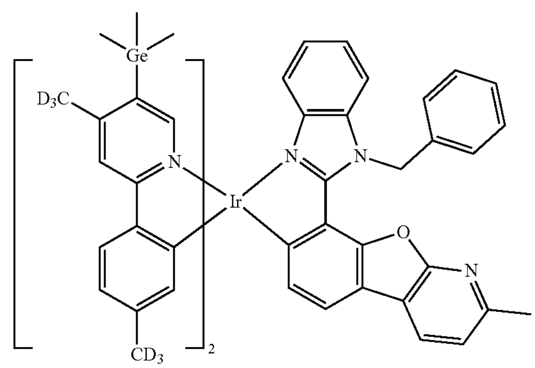
1289
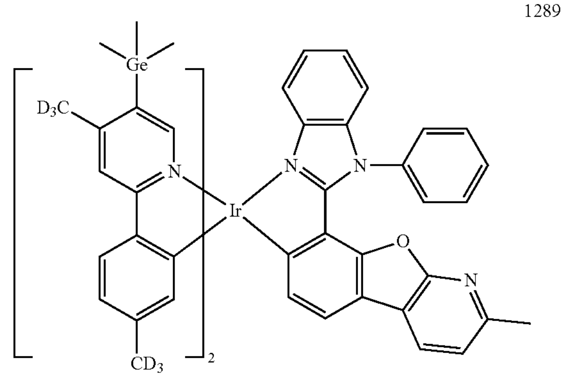
1290
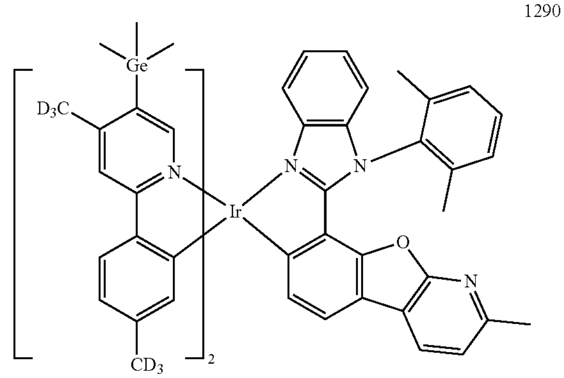

-continued
1291
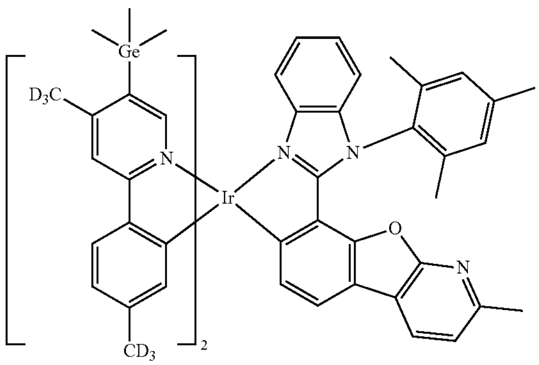
1292
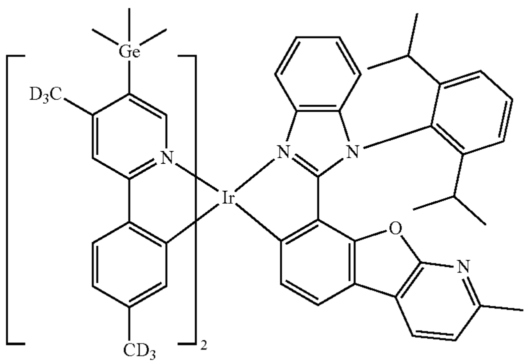
1293
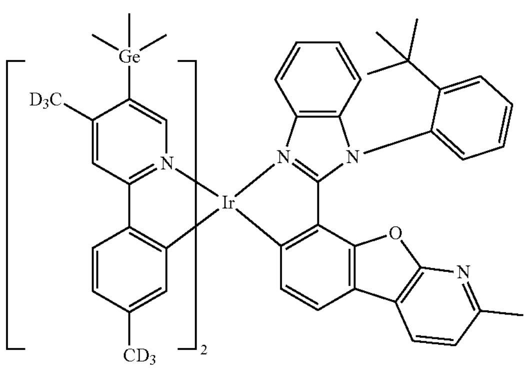
1294
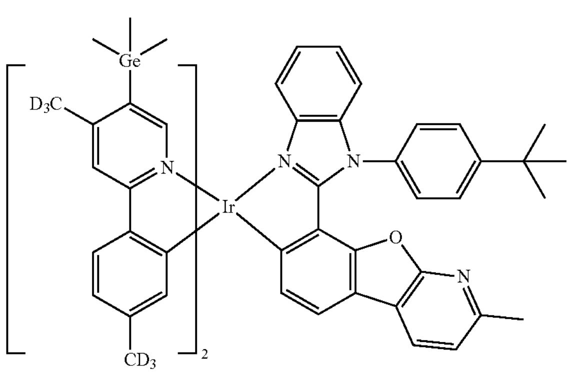
-continued
1295
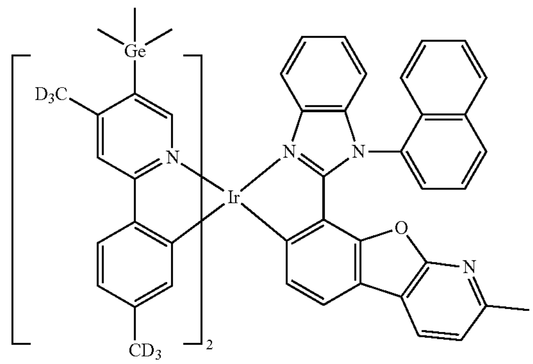
1296
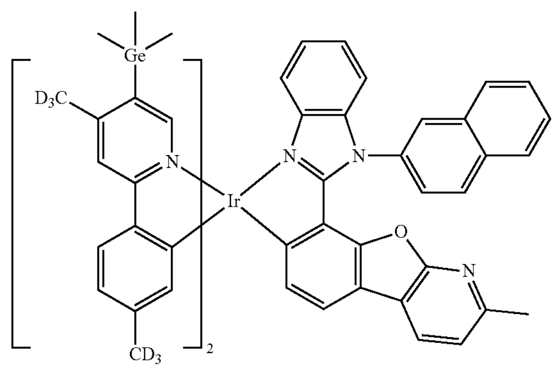
1297
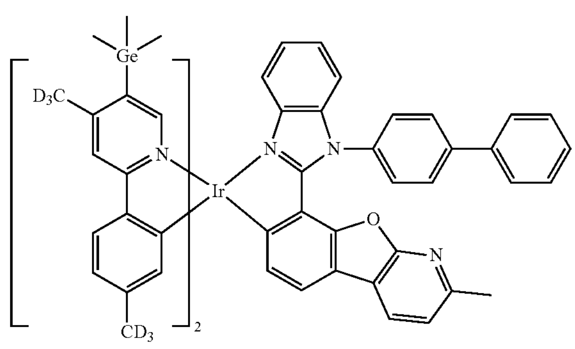
1298
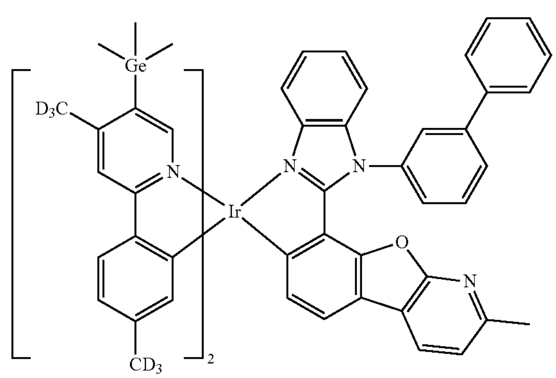

-continued
1299
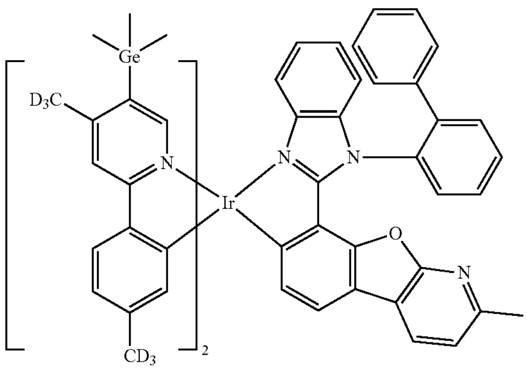
1300
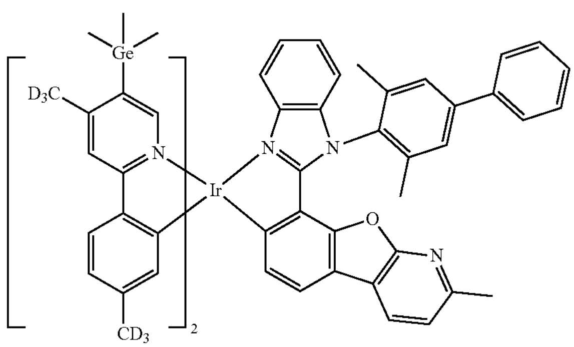
1301
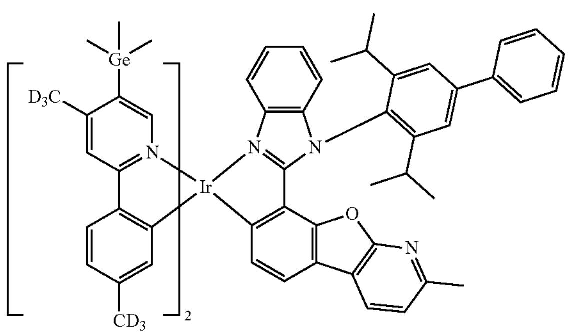
1302
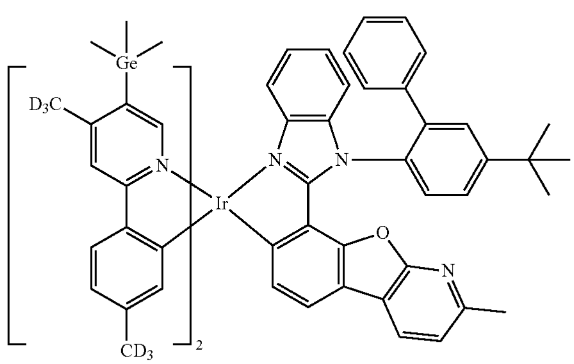
-continued
1303
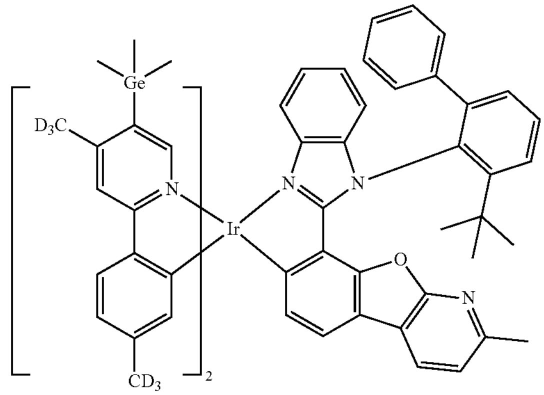
1304
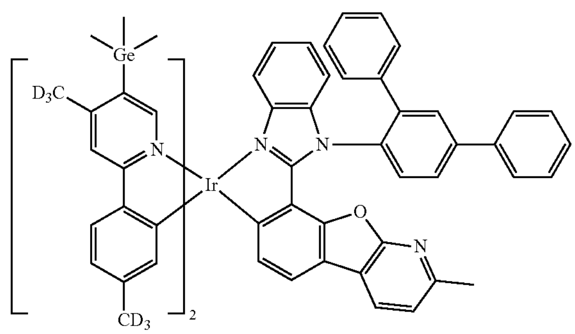
1305
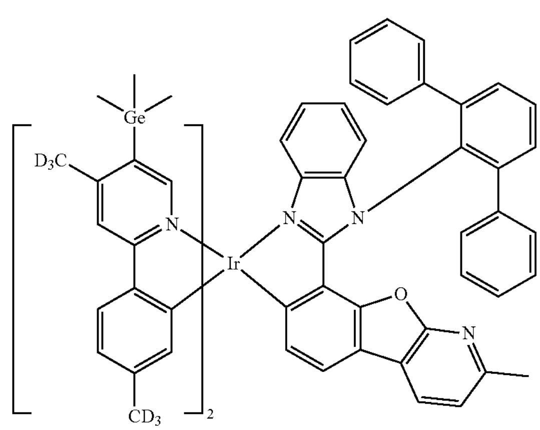

-continued
1306
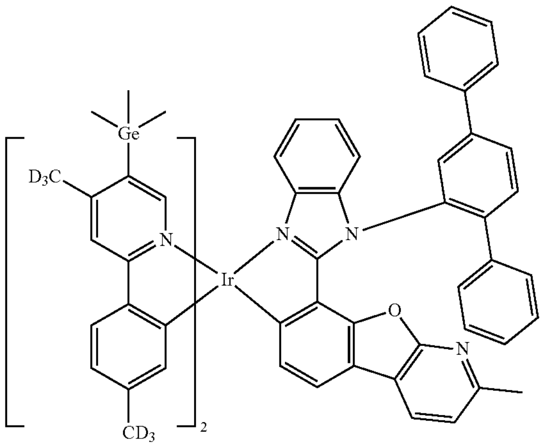
1307
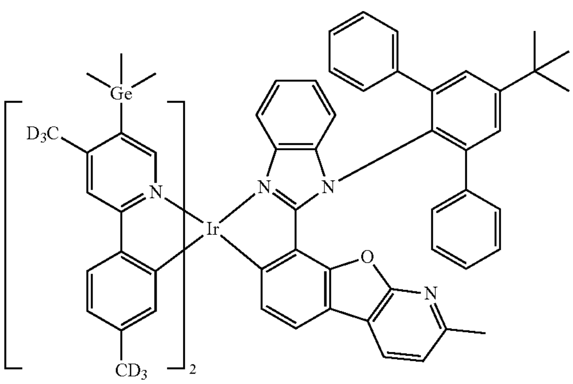
1308
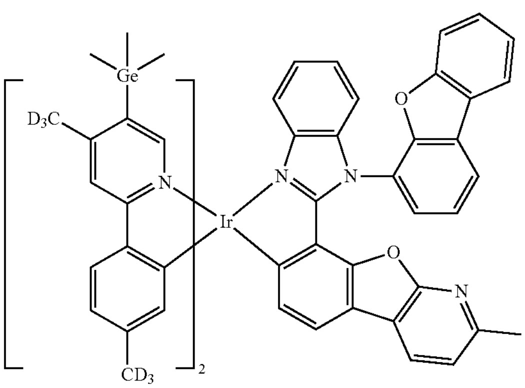
1309
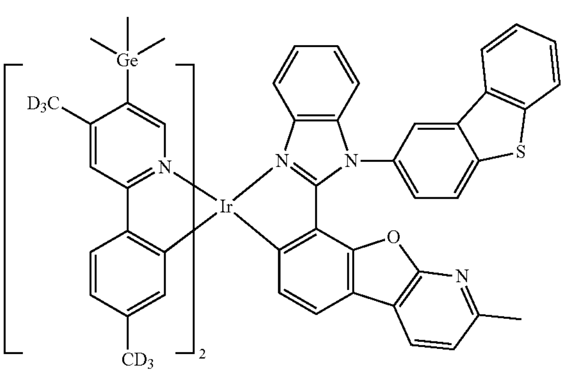
-continued
1310
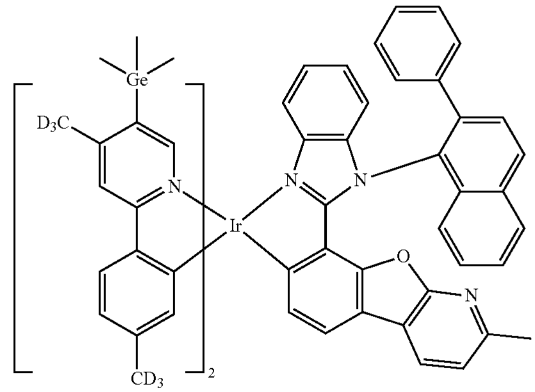
1311
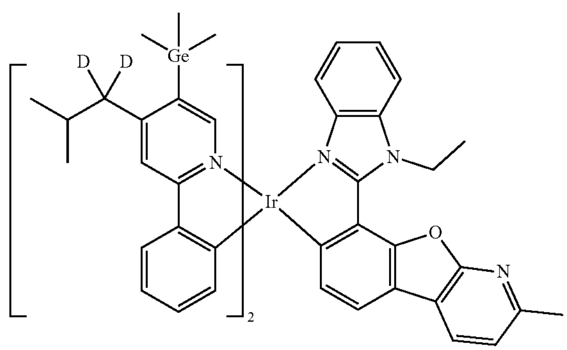
1312
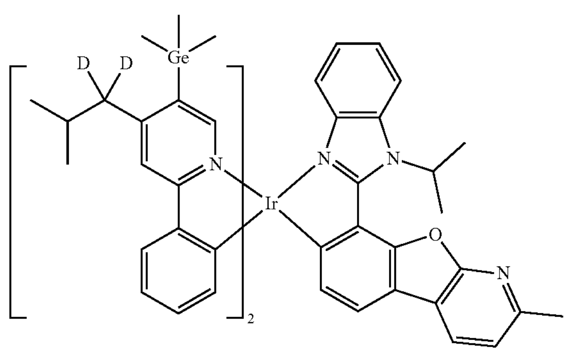
1313
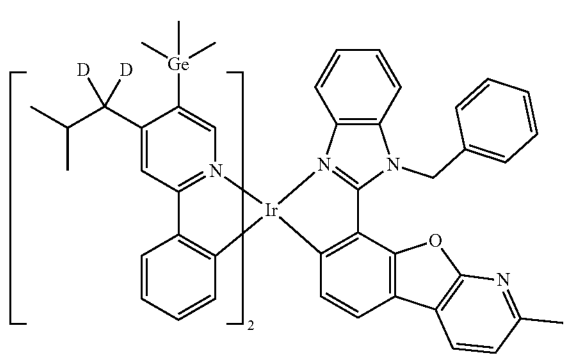

-continued
1314
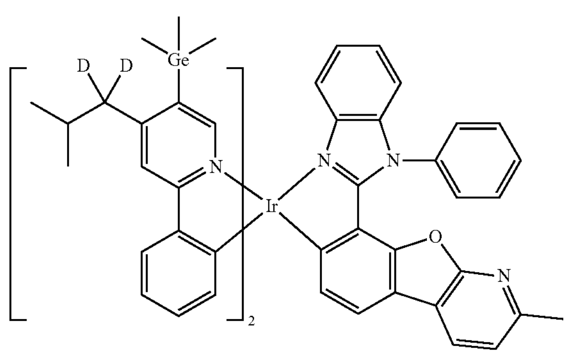
1315
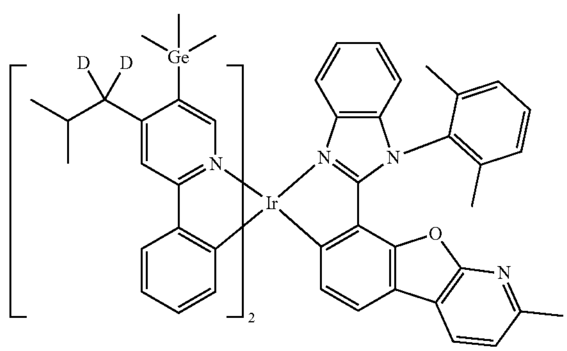
1316
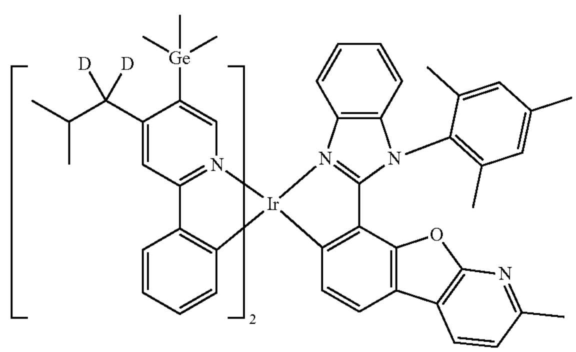
1317
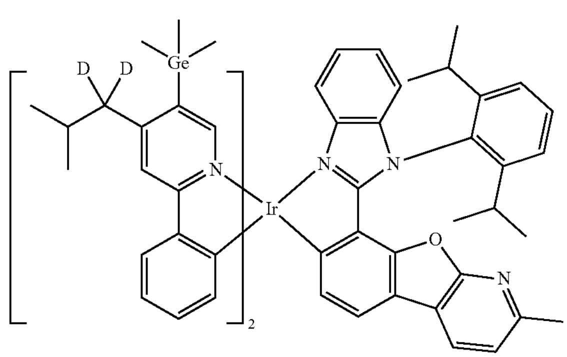
-continued
1318
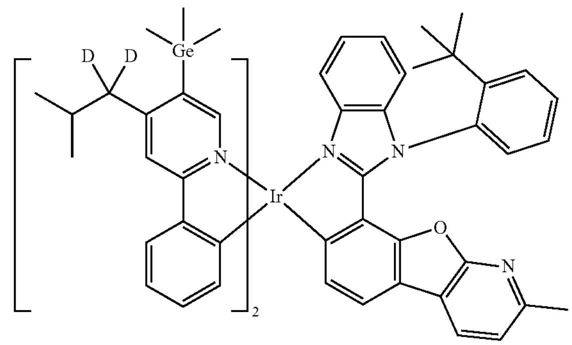
1319
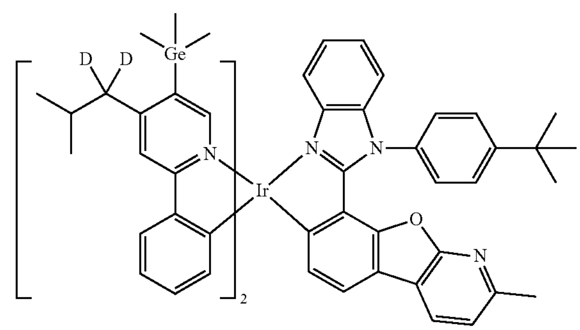
1320
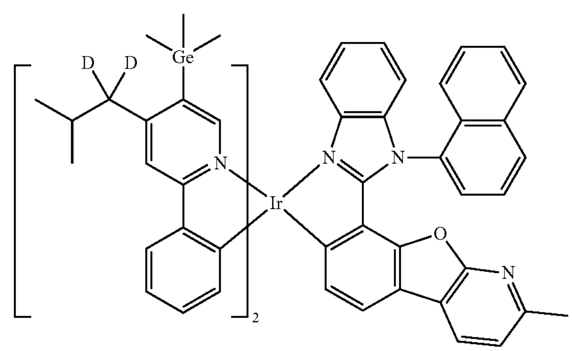
1321
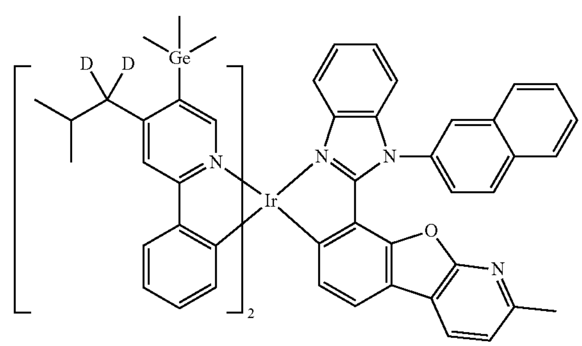

1322
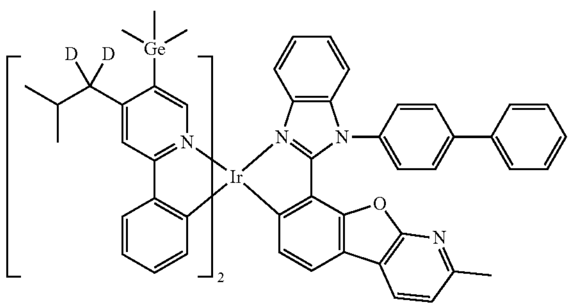
1323
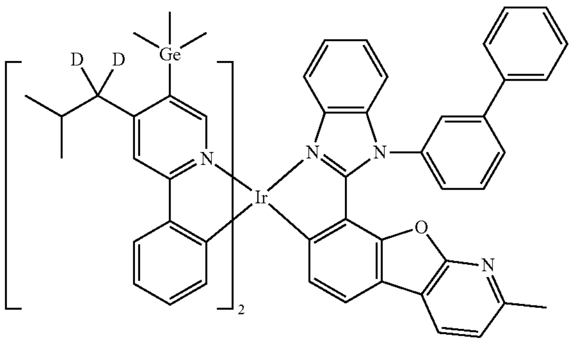
1324
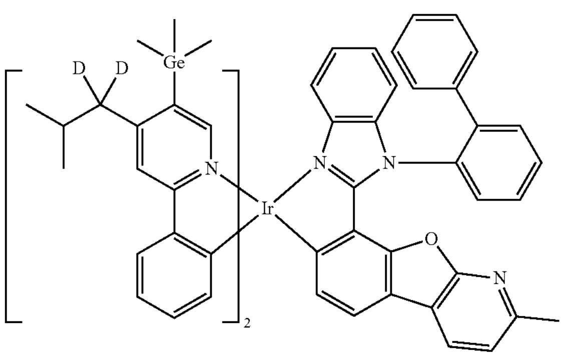
1325
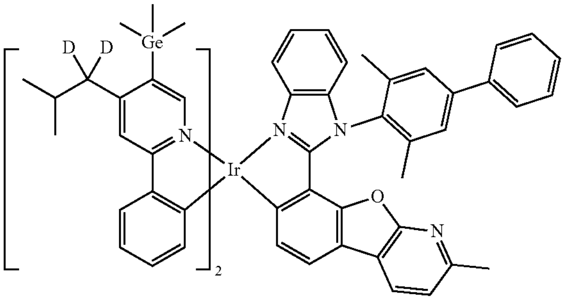
1326
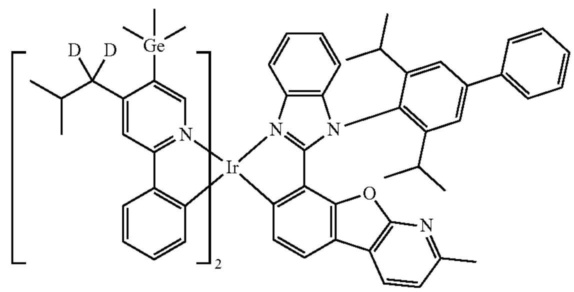
1327
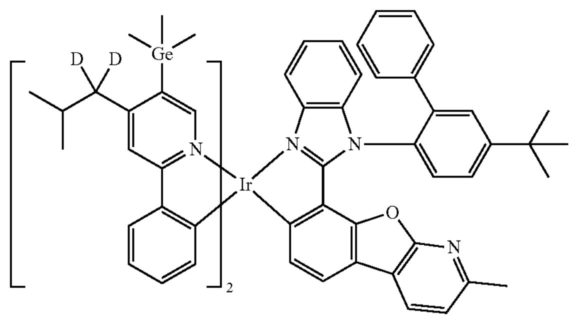
1328
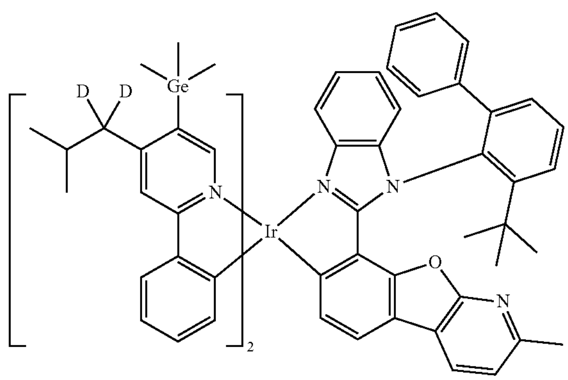
1329
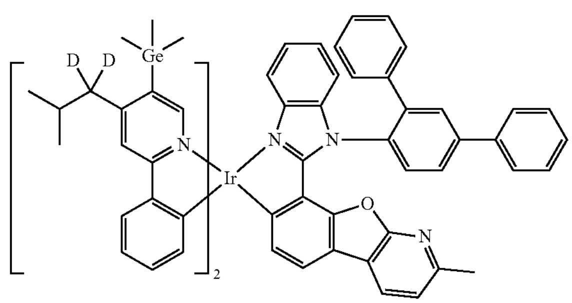

-continued
1330
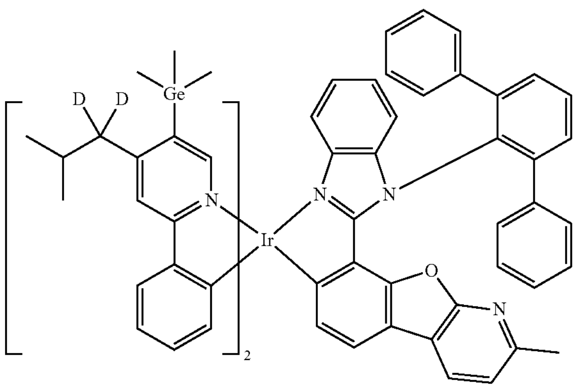
1331
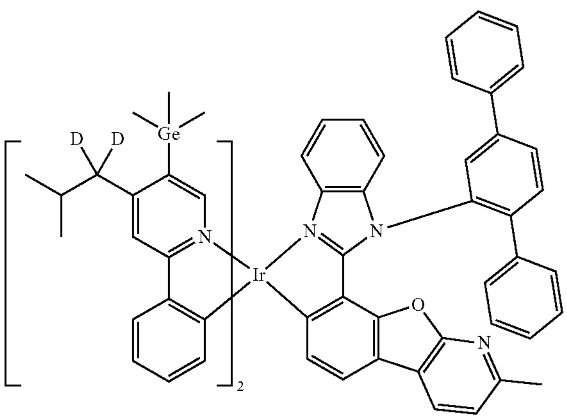
1332
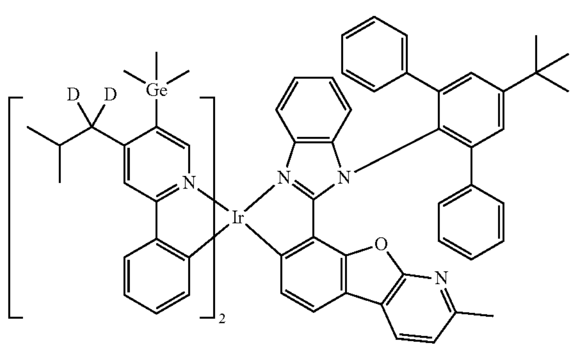
1333
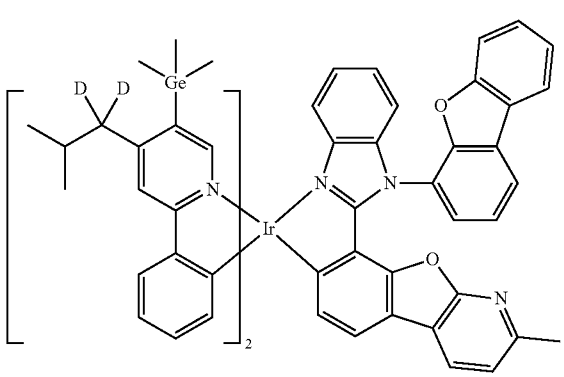
-continued
1334
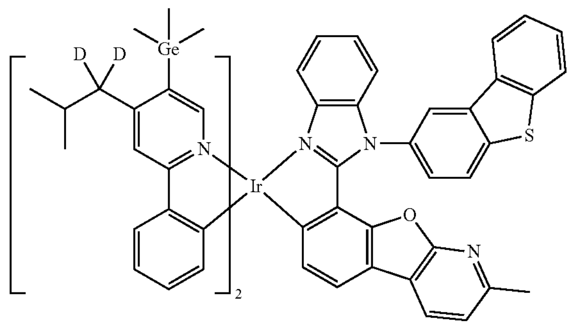
1335
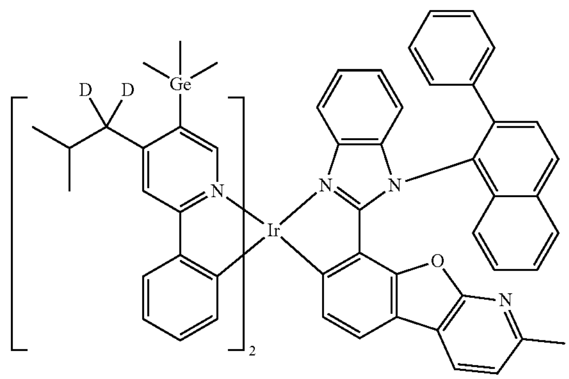
1336
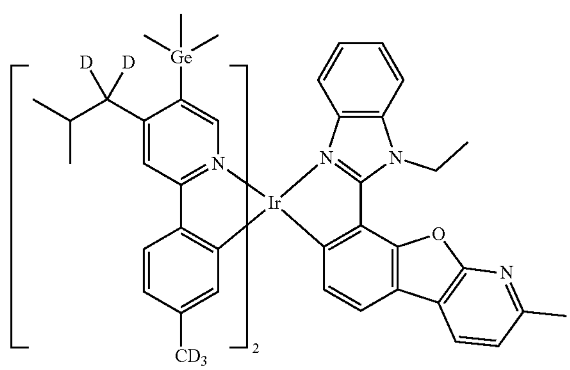
1337
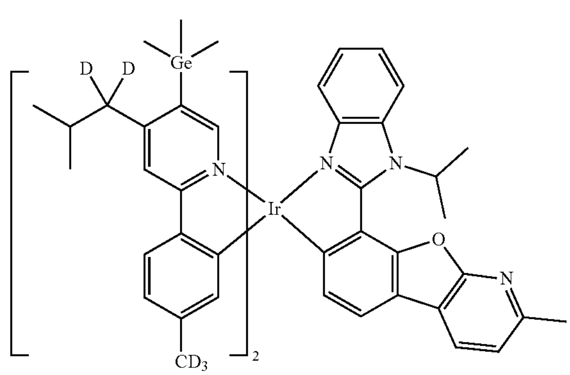

-continued
1338
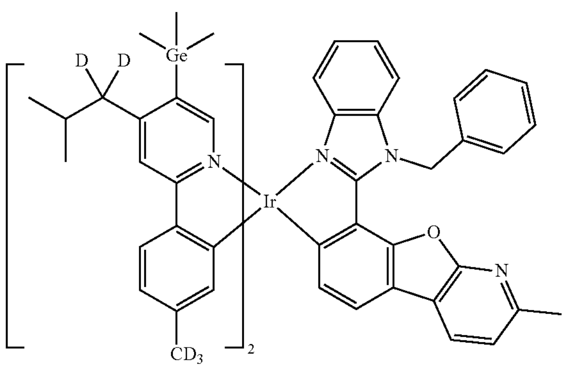
1339
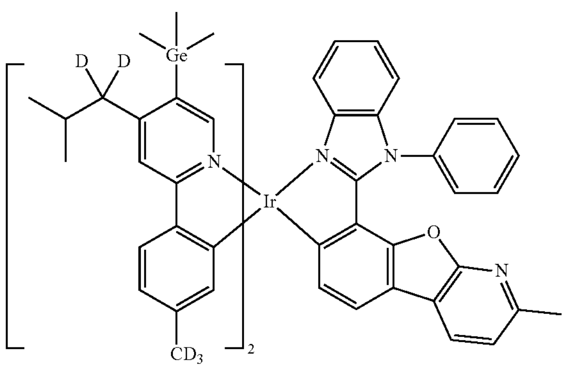
1340
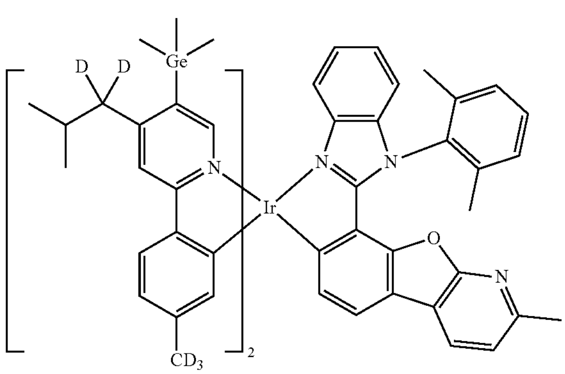
1341
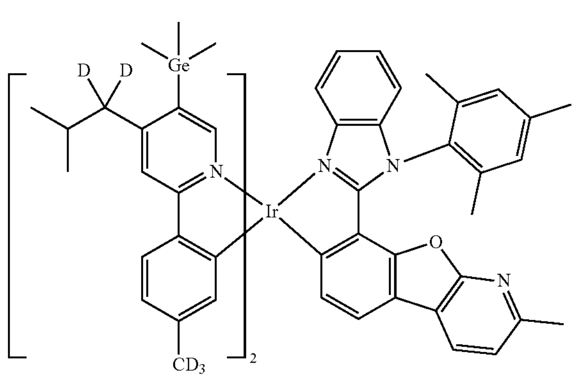
-continued
1342
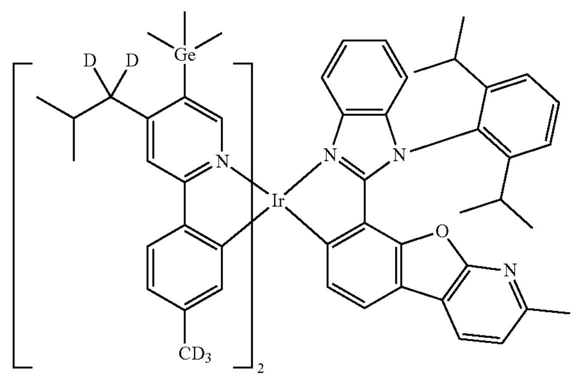
1343
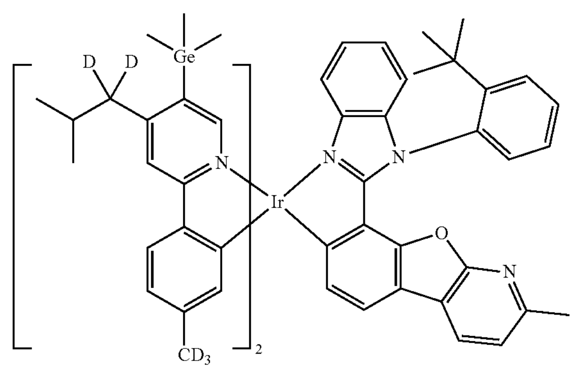
1344
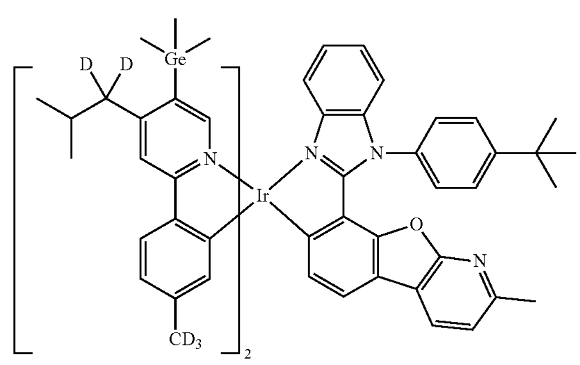
1345
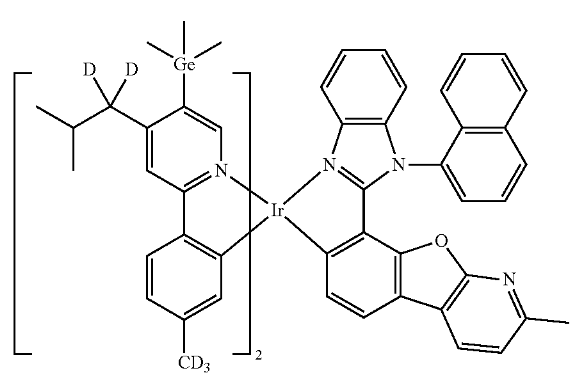

1346
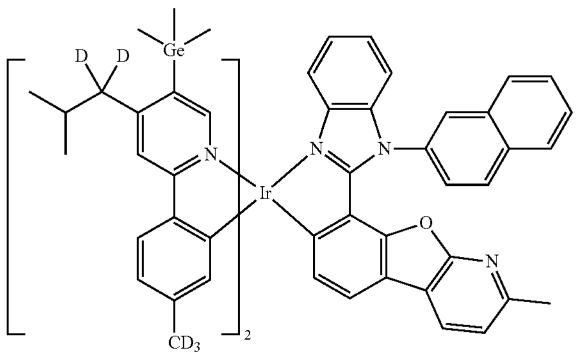
1347
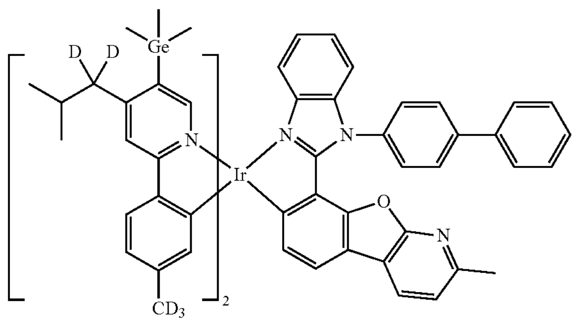
1348
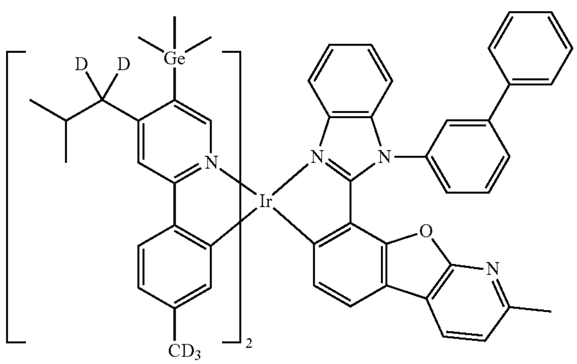
1349
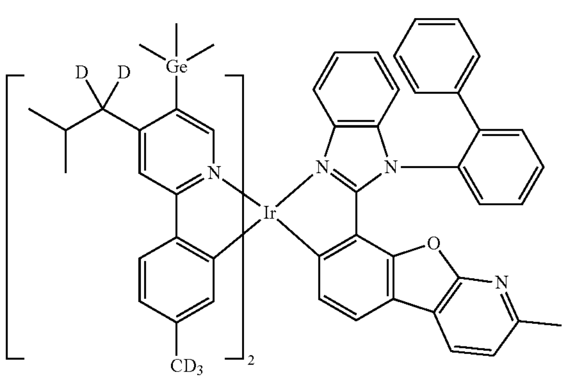
1350
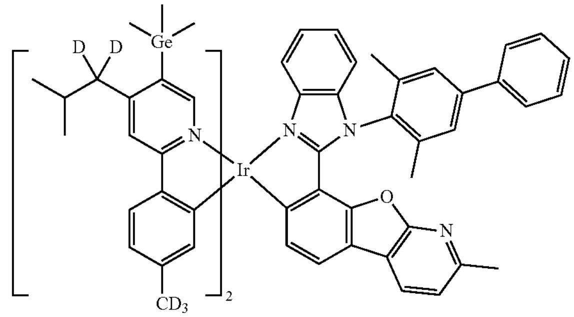
1351
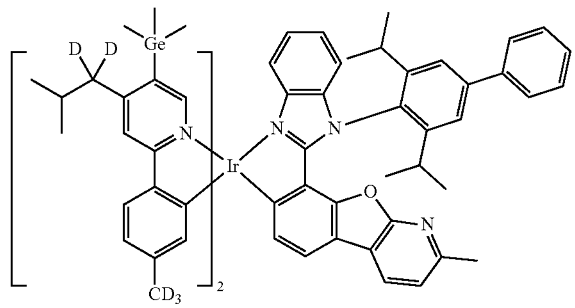
1352
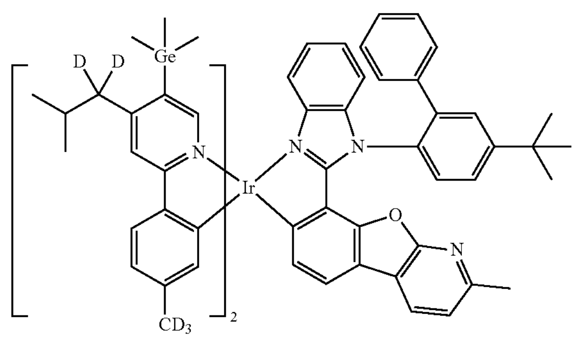
1353
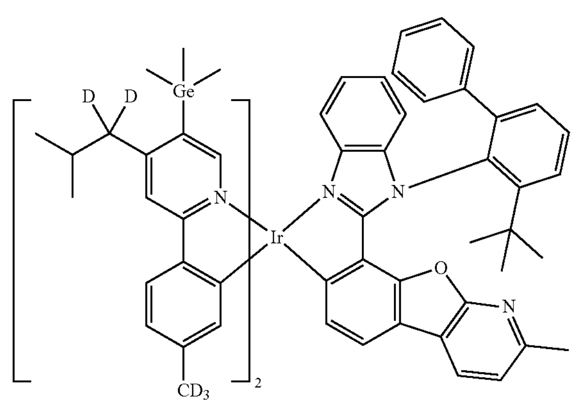

-continued
1354
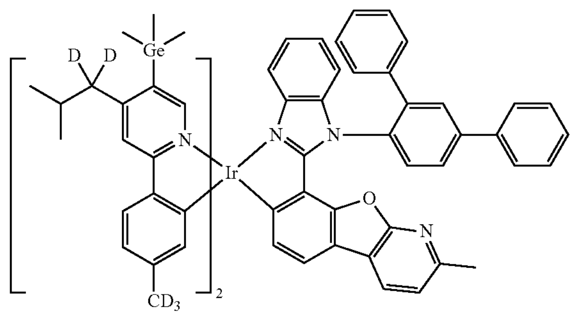
1355
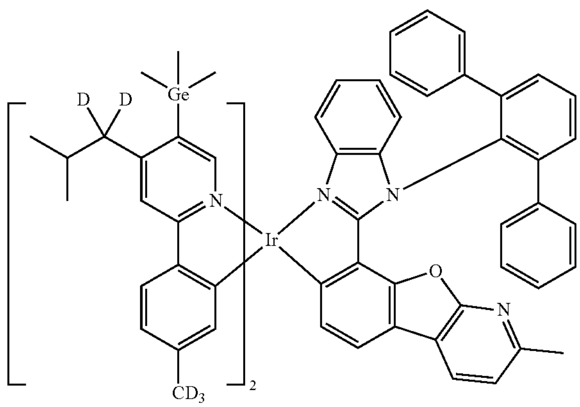
1356
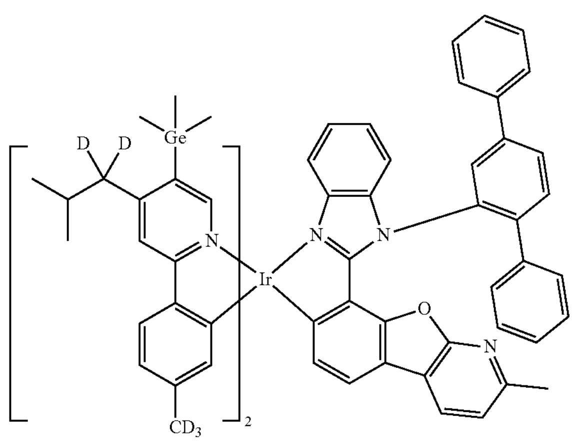
1357
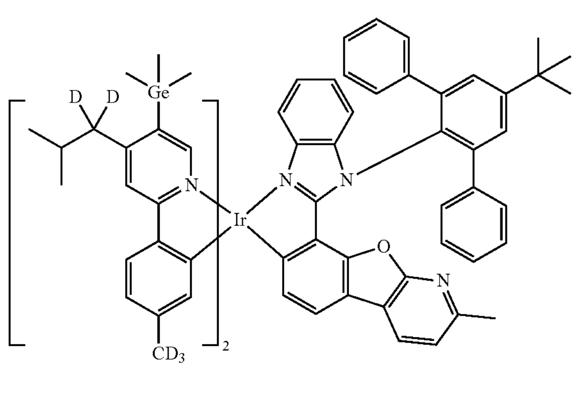
-continued
1358
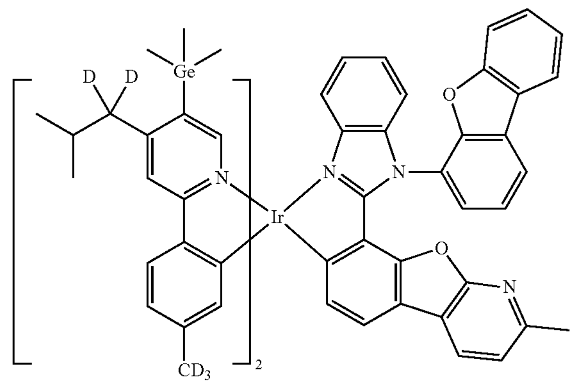
1359
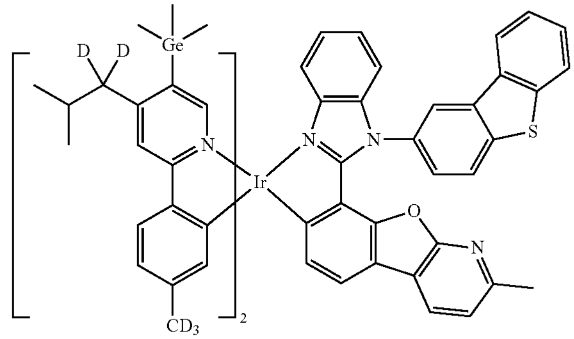
1360
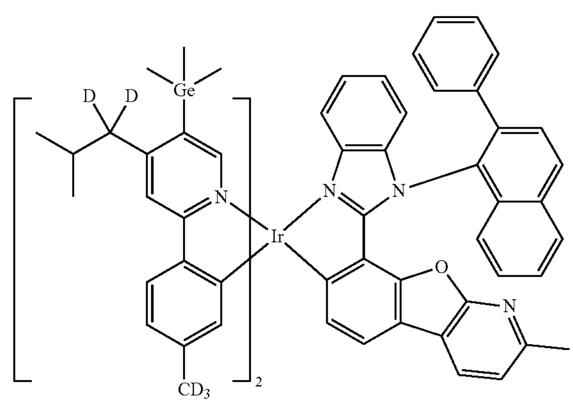
1361
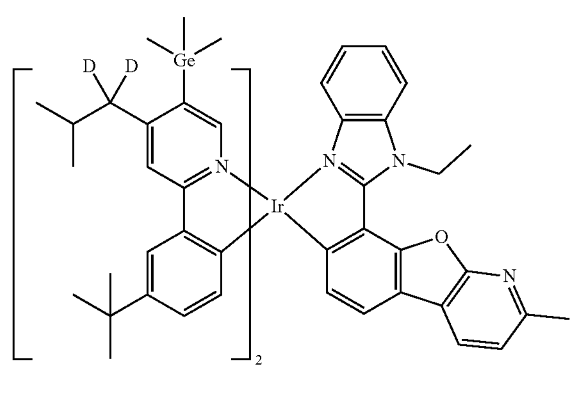

-continued
1362
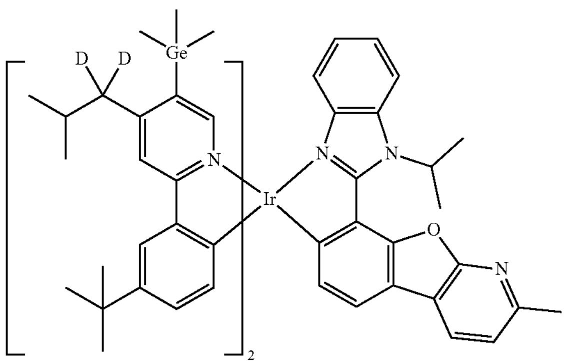
1363
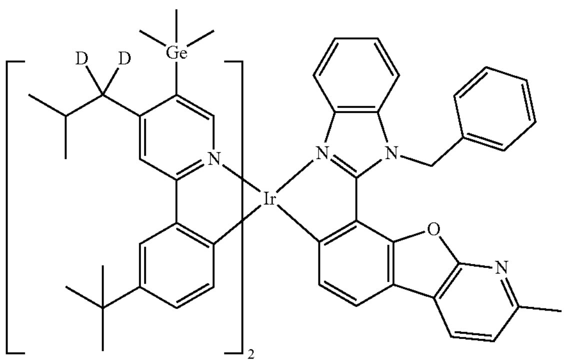
1364
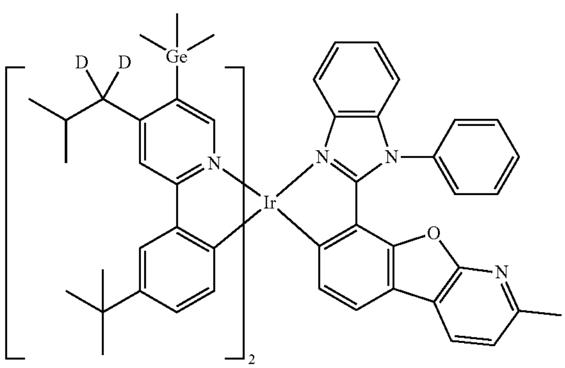
1365
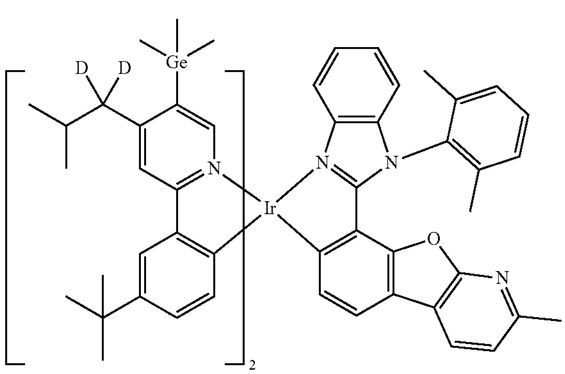
-continued
1366
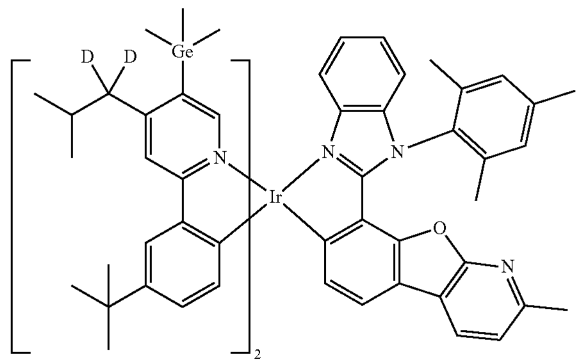
1367
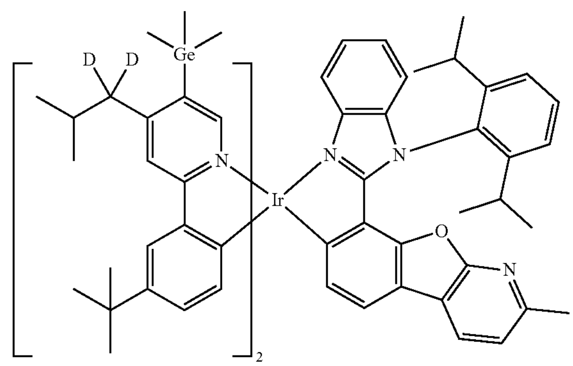
1368
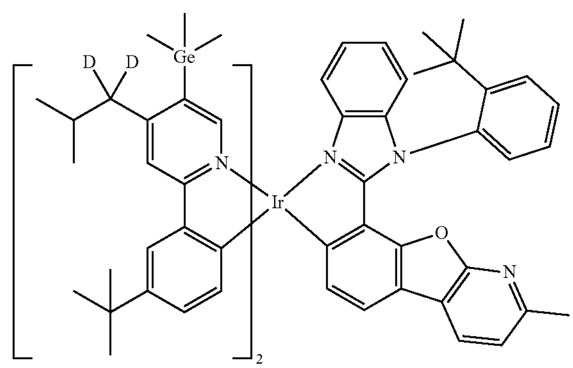
1369
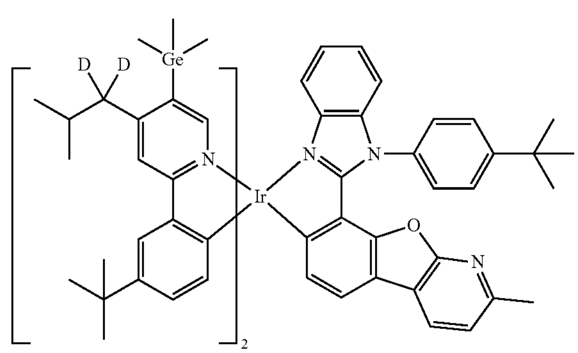

1370
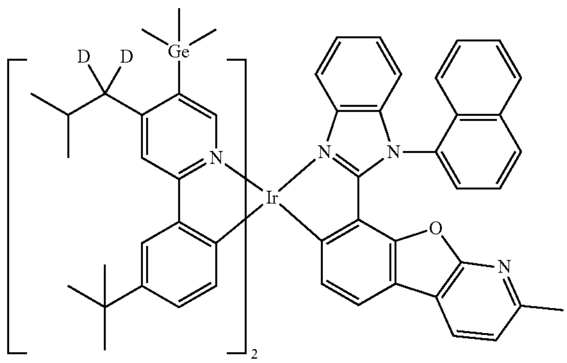
1371
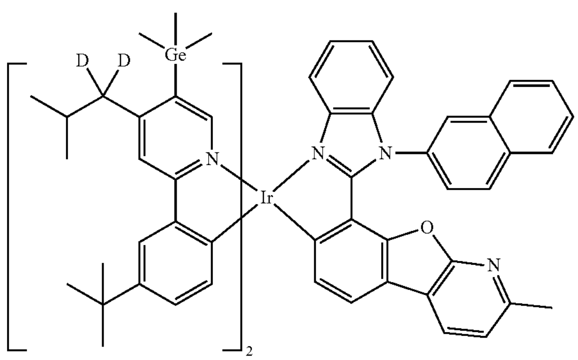
1372
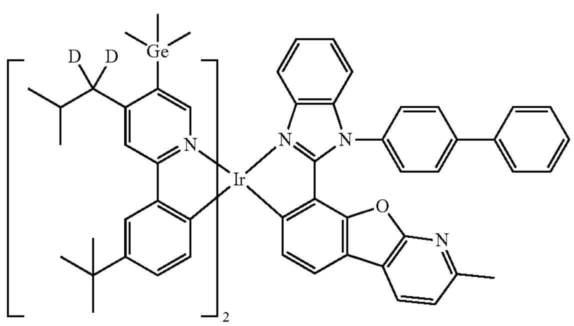
1373
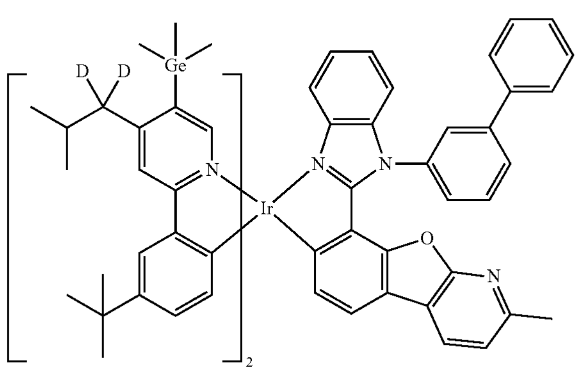
1374
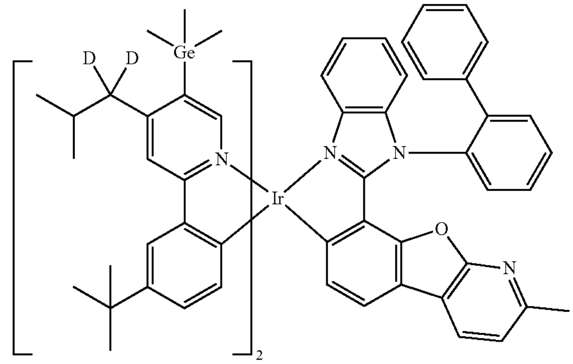
1375
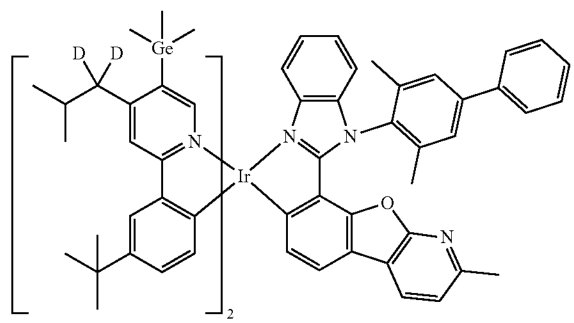
1376
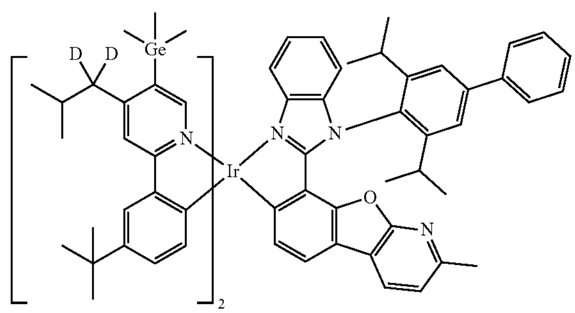
1377
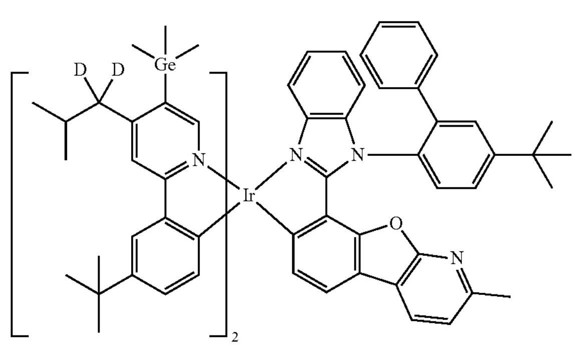

-continued
1378
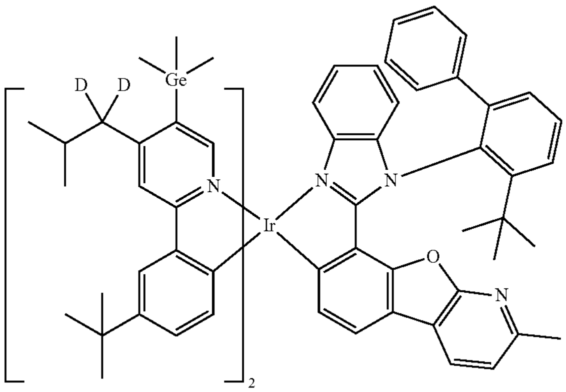
1379
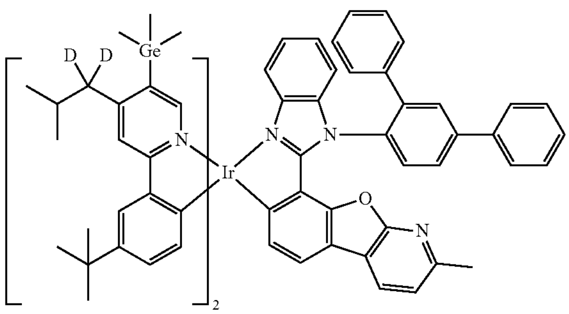
1380
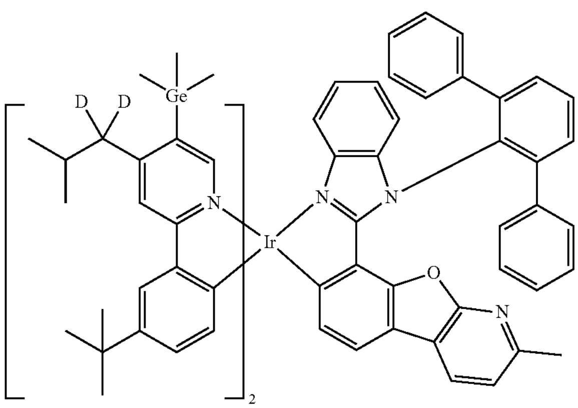
1381
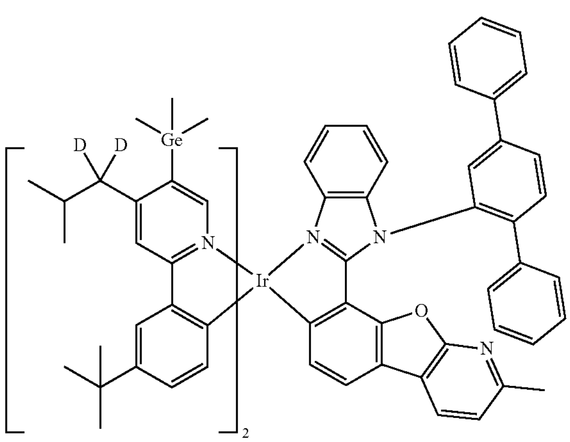
-continued
1382
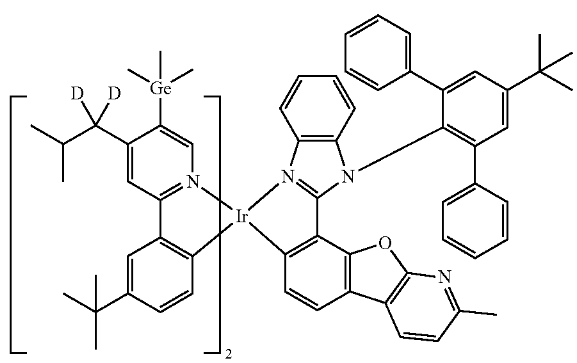
1383
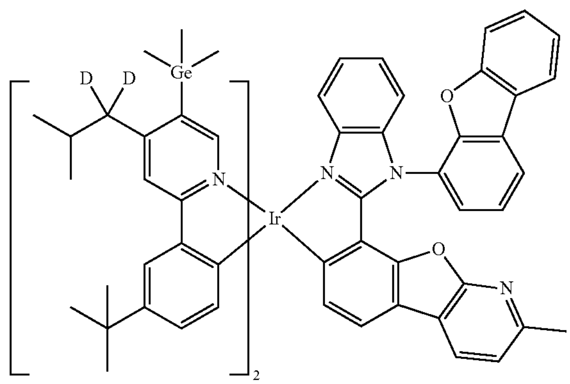
1384
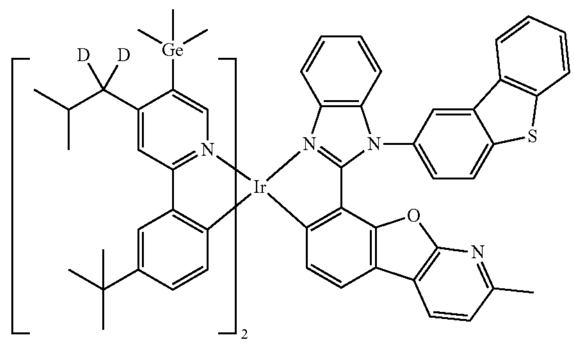
1385
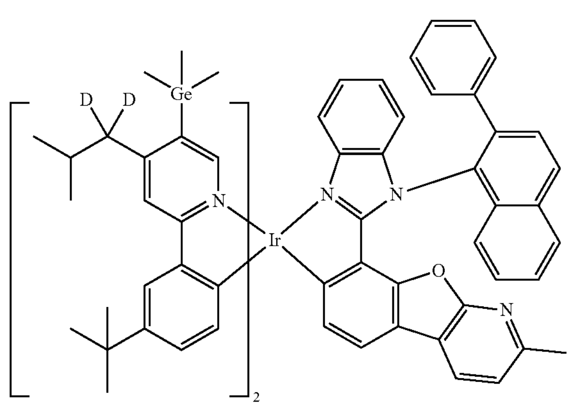

1386
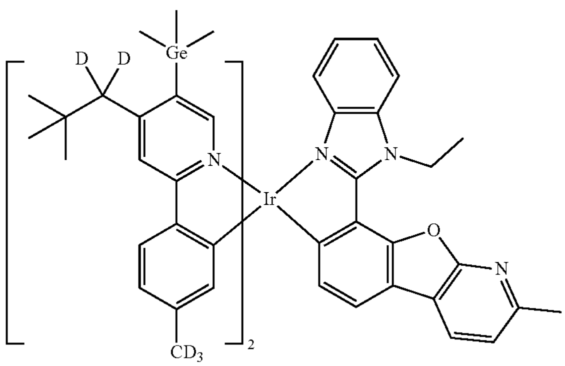
1387
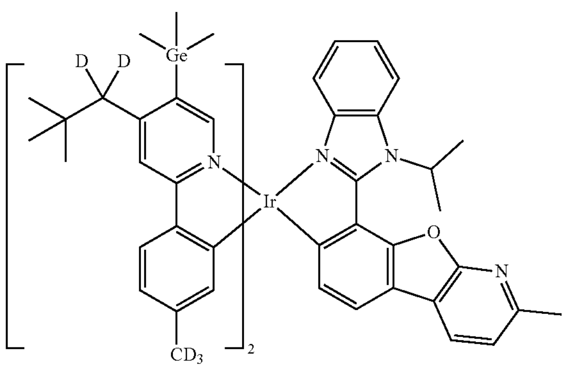
1388
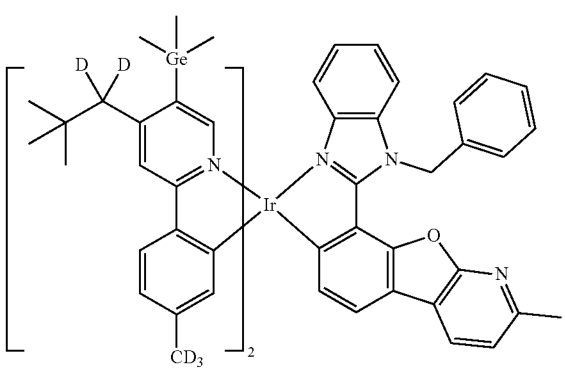
1389
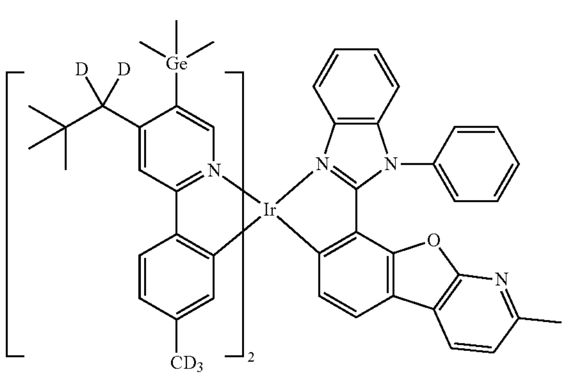
1390
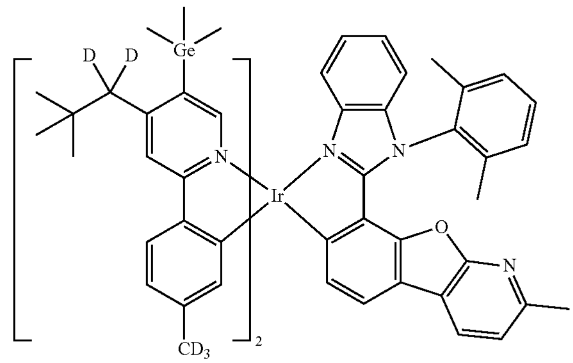
1391
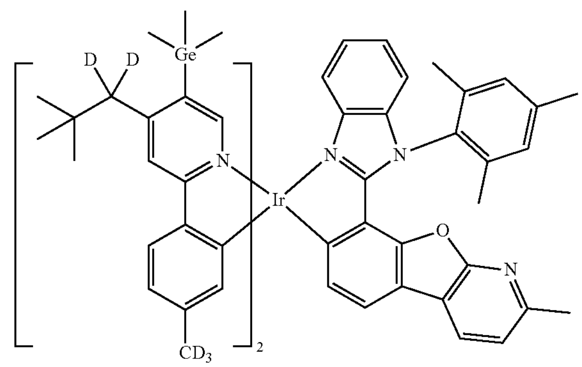
1392
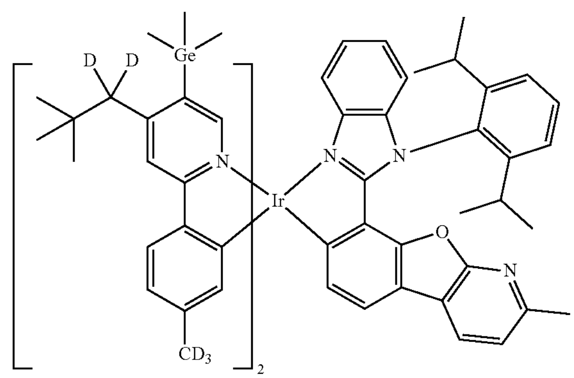
1393
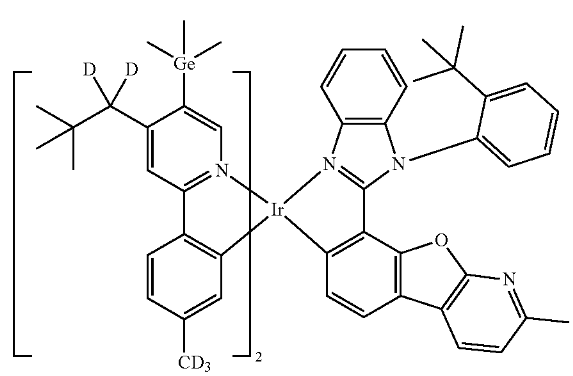

-continued
1394
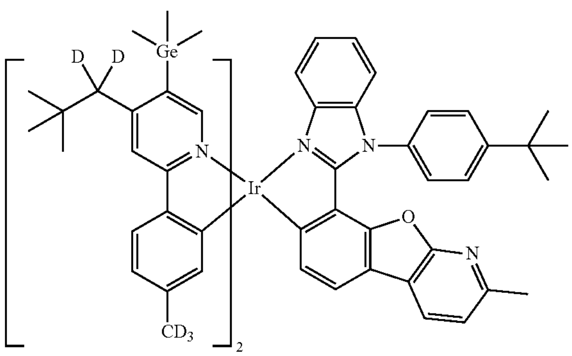
1395
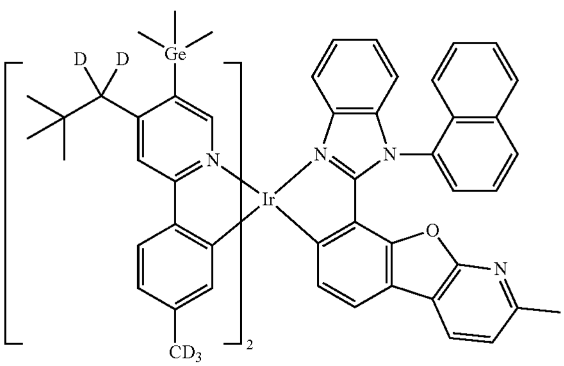
1396
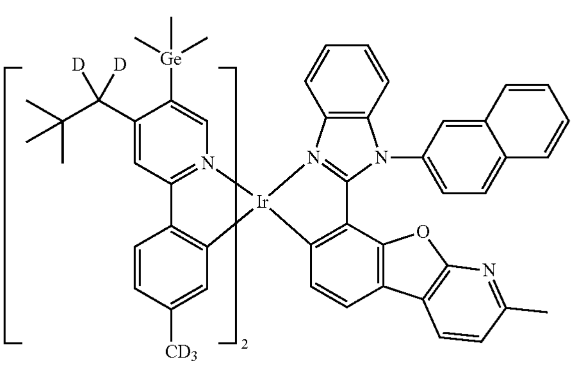
1397
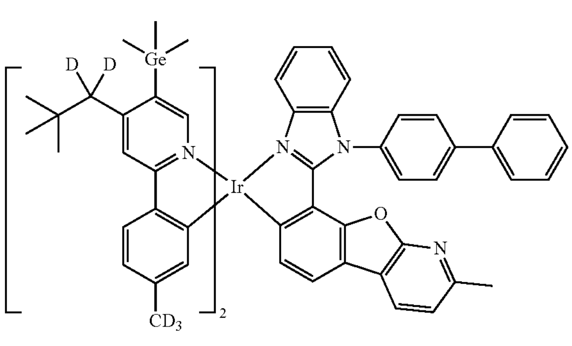
-continued
1398
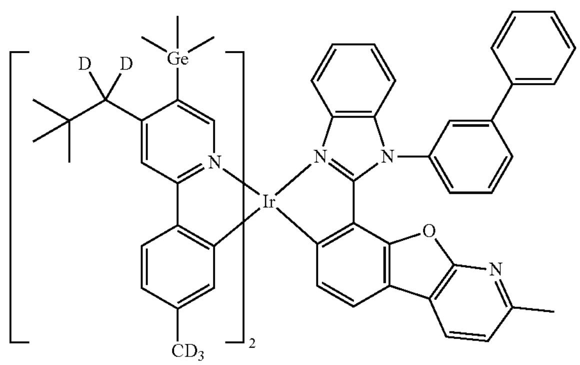
1399
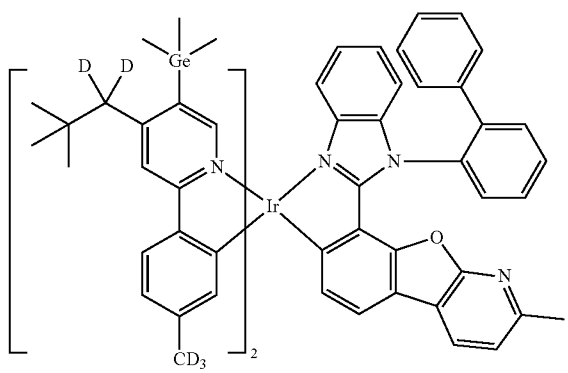
1400
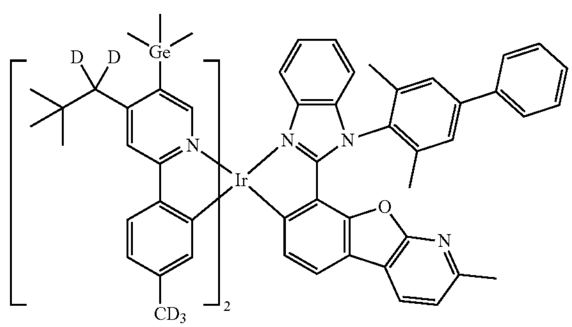
1401
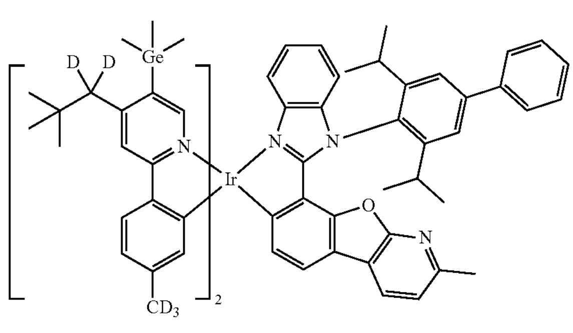

-continued
1402
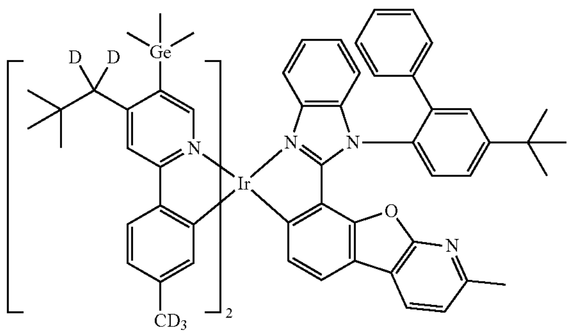
1403
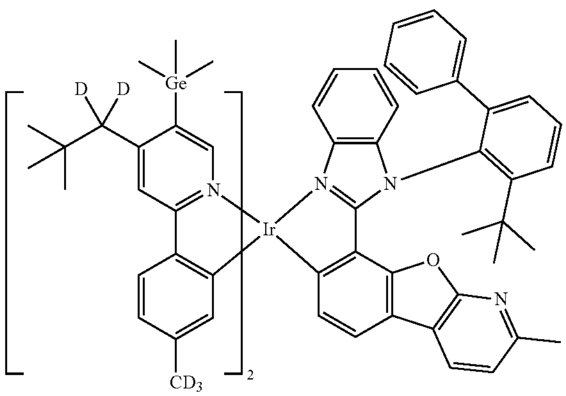
1404
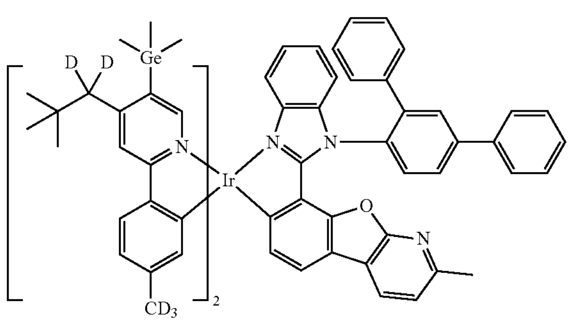
1405
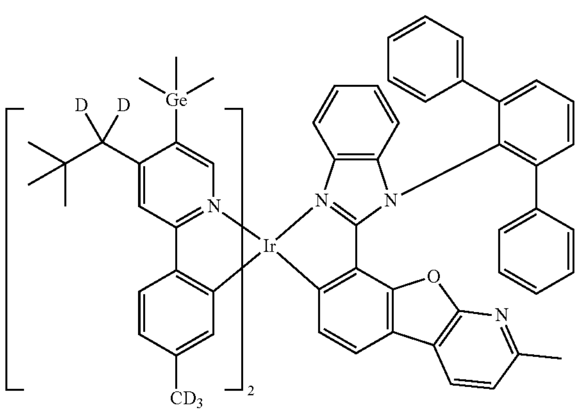
-continued
1406
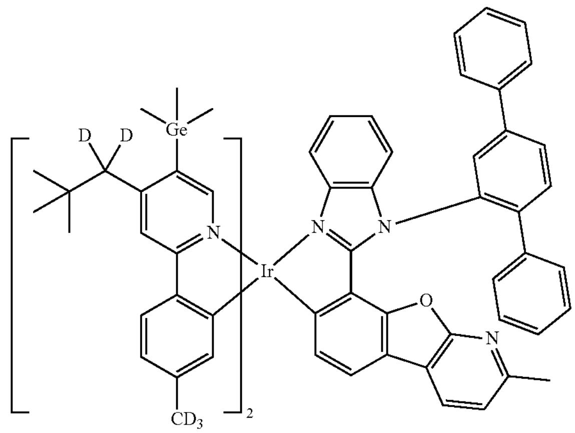
1407
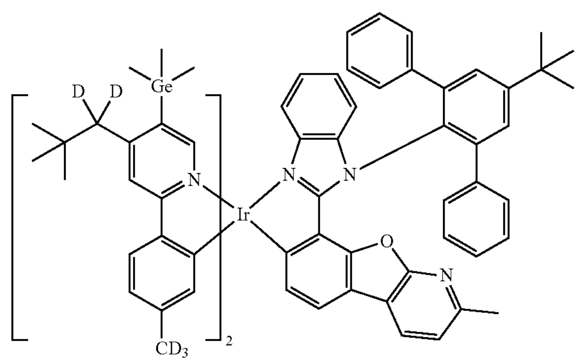
1408
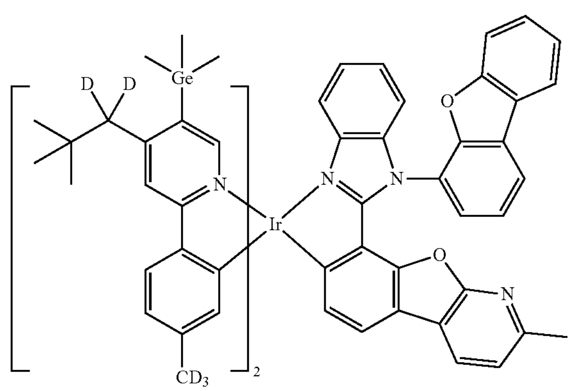
1409
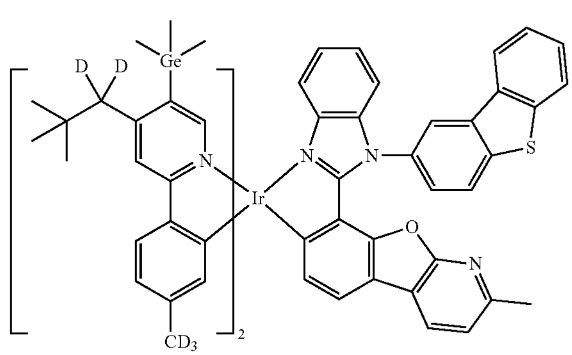

-continued
1410
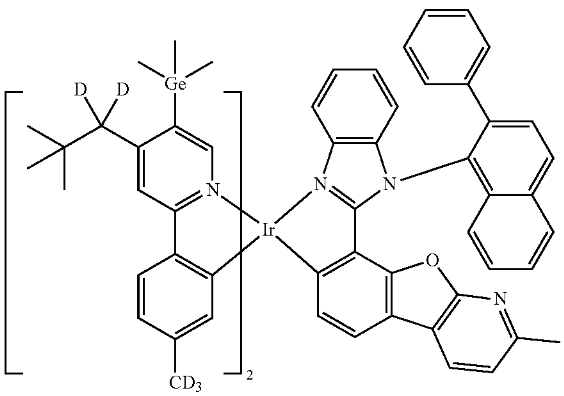
1411
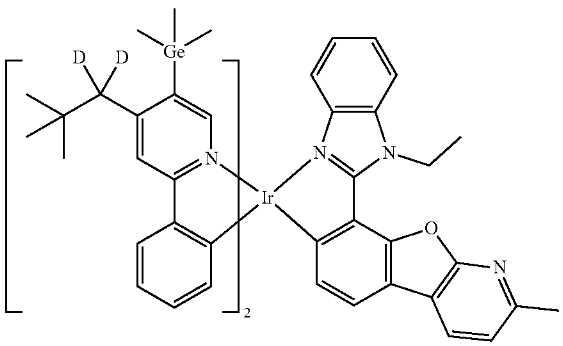
1412
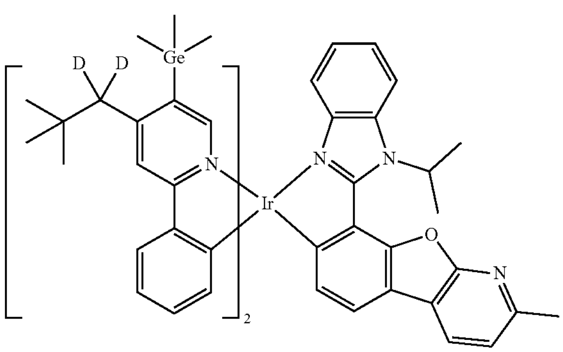
1413
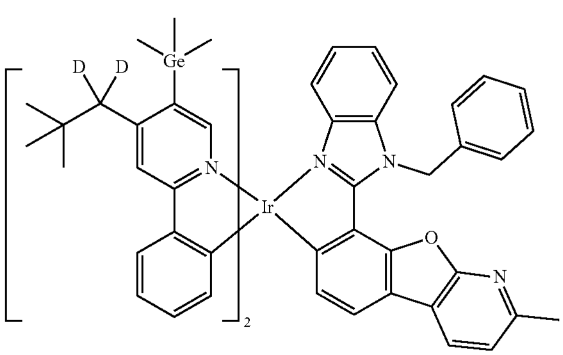
-continued
1414
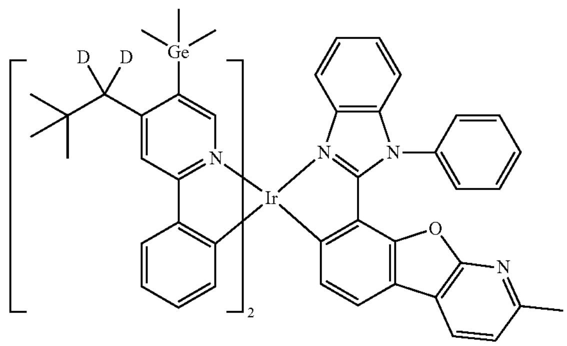
1415
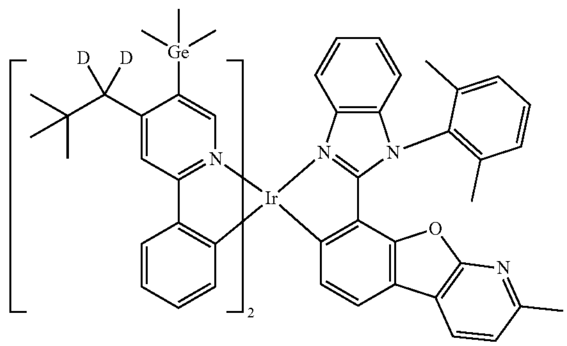
1416
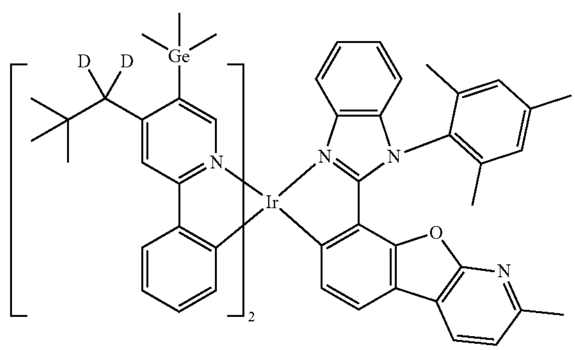
1417
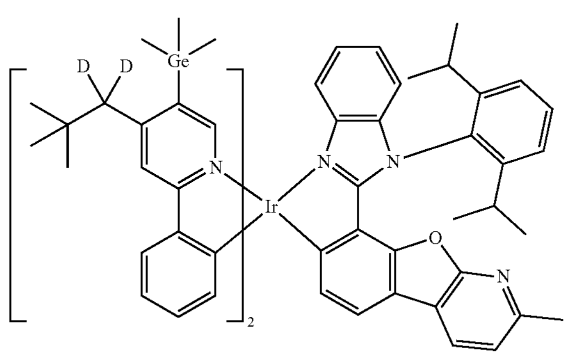

-continued
1418
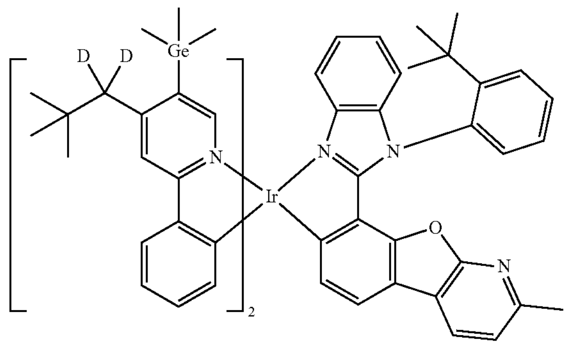
1419
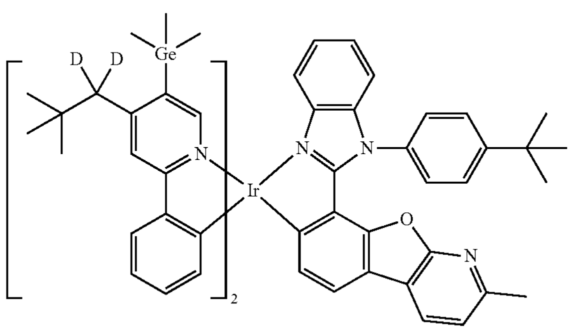
1420
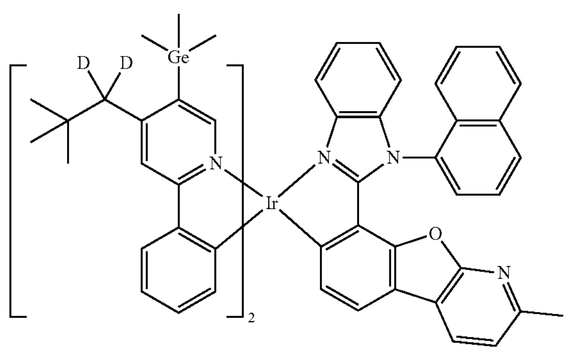
1421
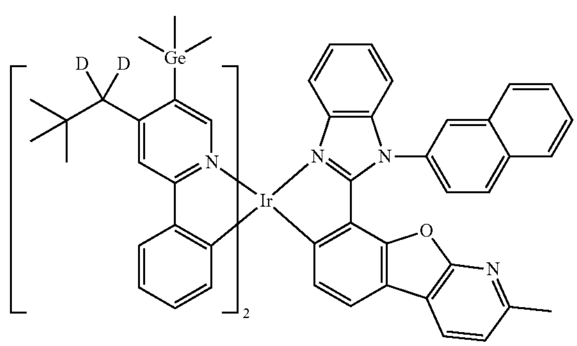
-continued
1422
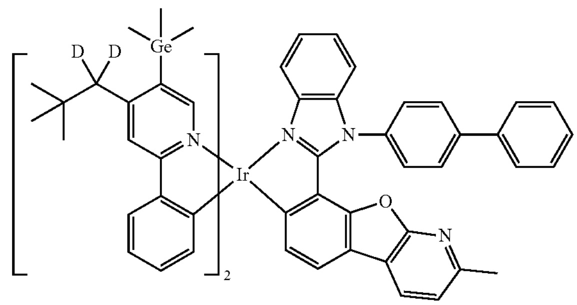
1423
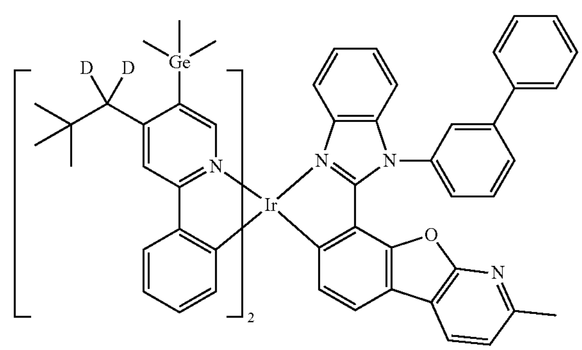
1424
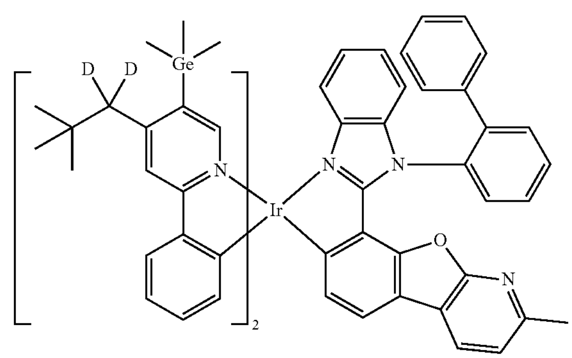
1425
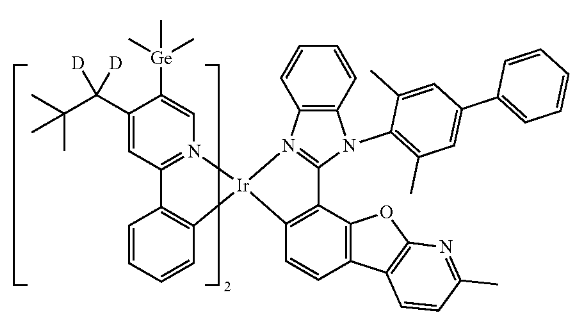

1426
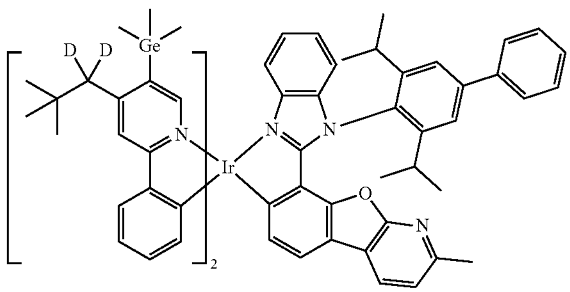
1427
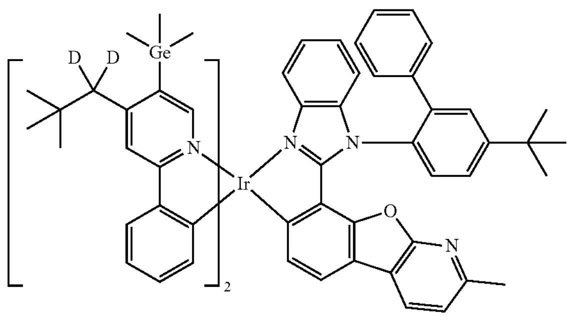
1428
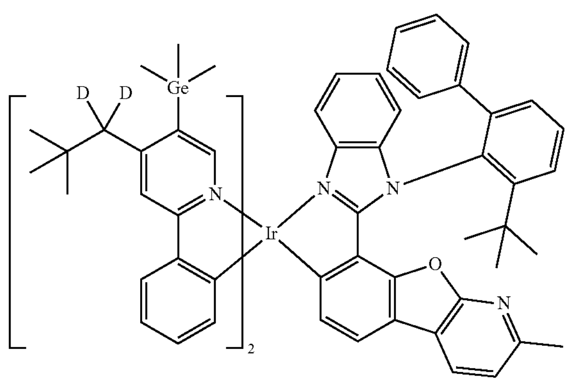
1429
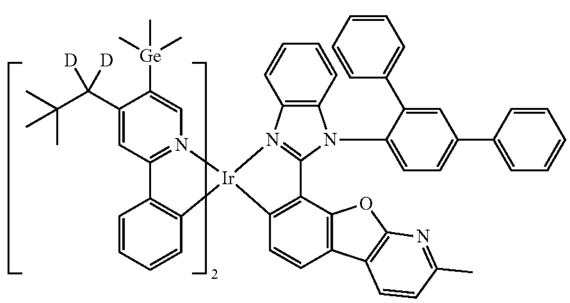
1430
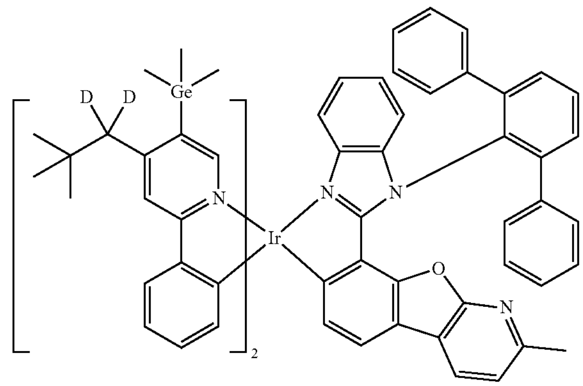
1431
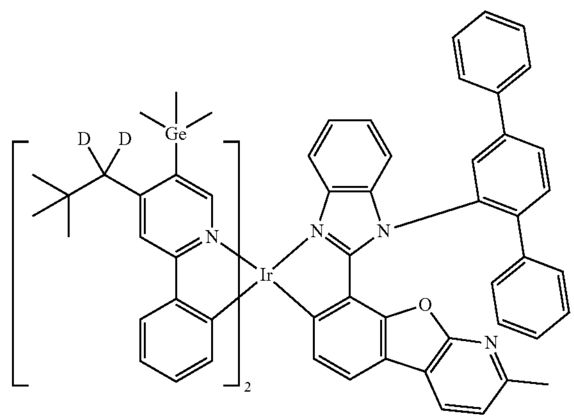
1432
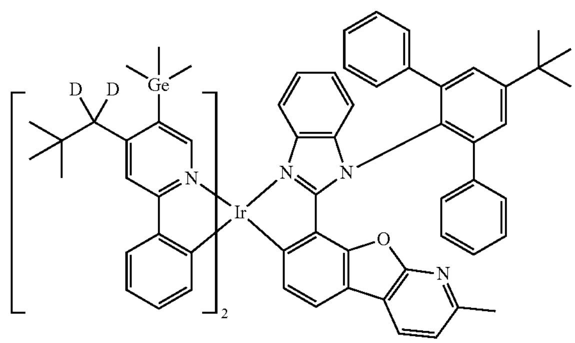
1433
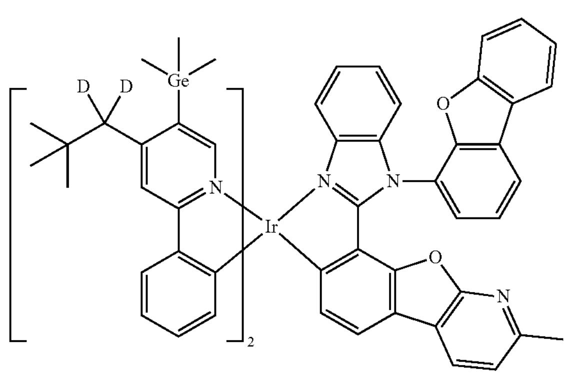

-continued
1434
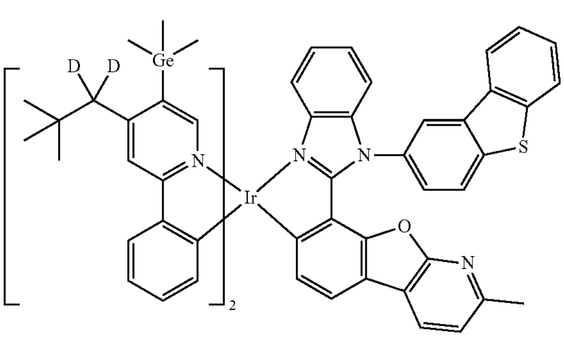
1435
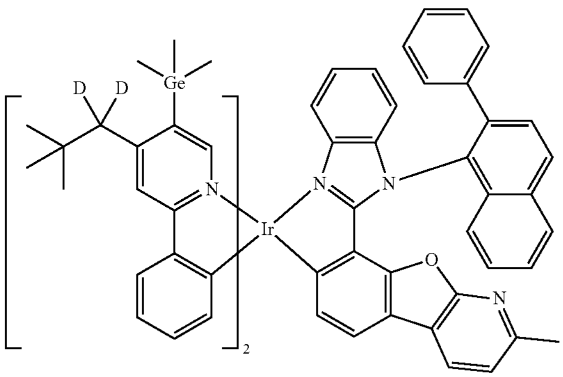
1436
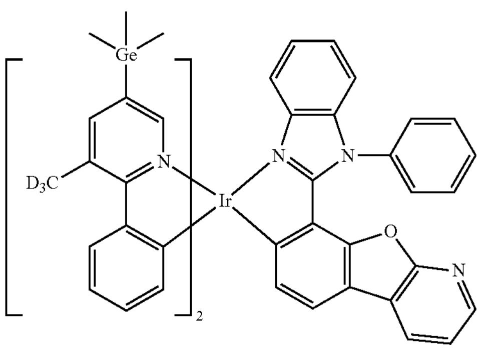
1437
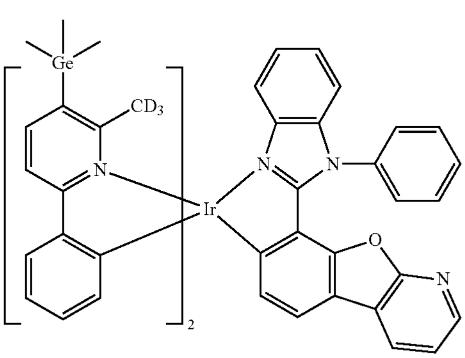
-continued
1438
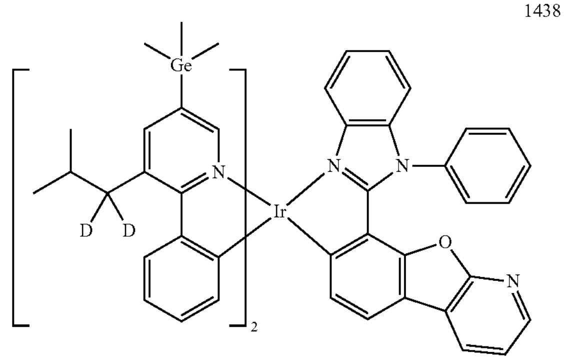
1439
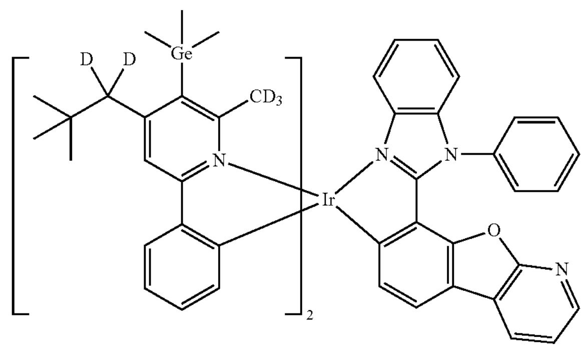
1440
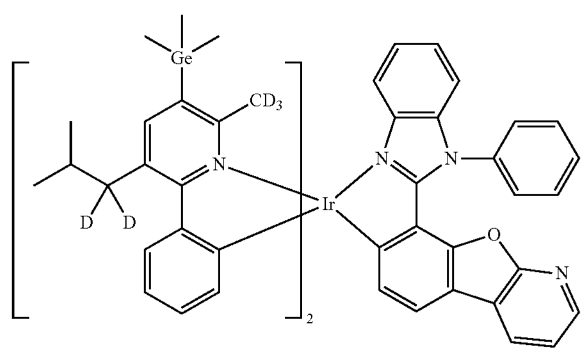
1441
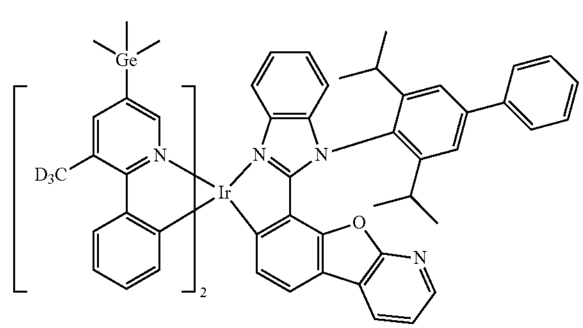

-continued
1442
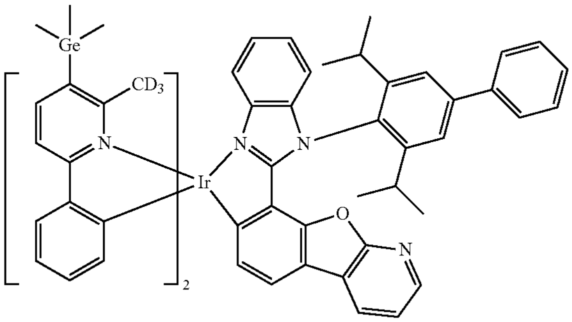
1443
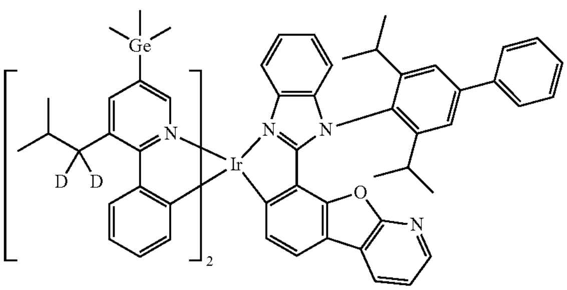
1444
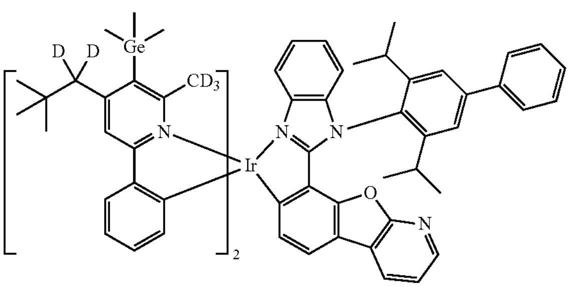
1445
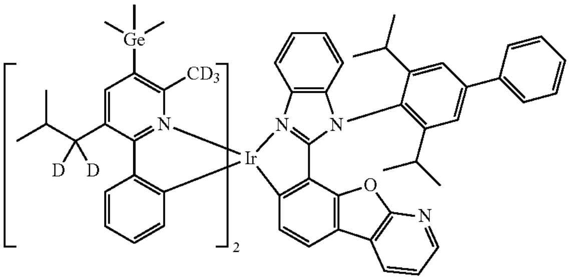
1446
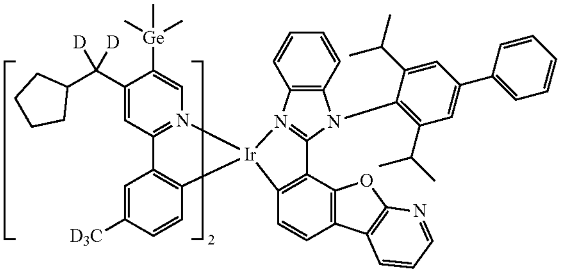
-continued
1447
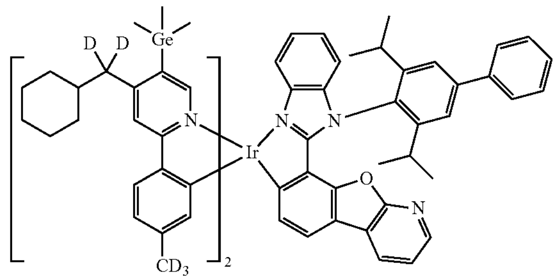
1448
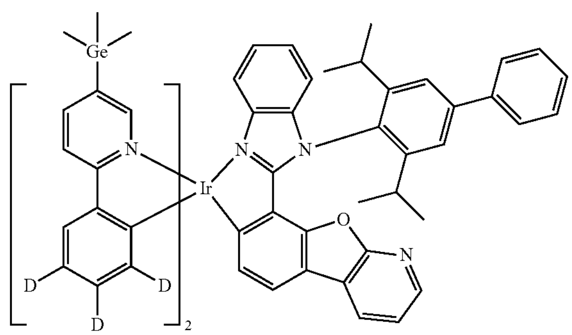
1449
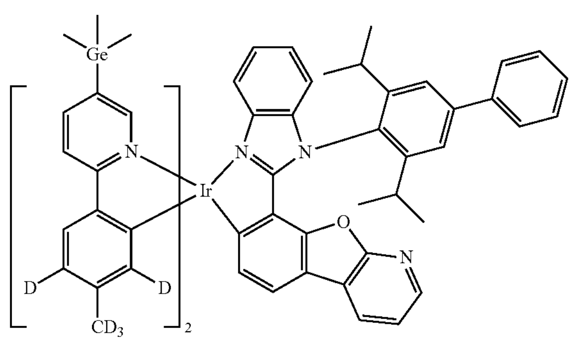
1450
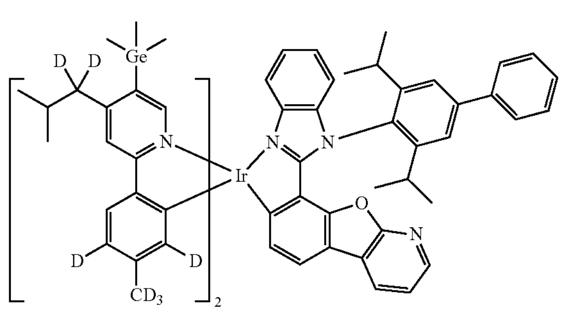

-continued
1451
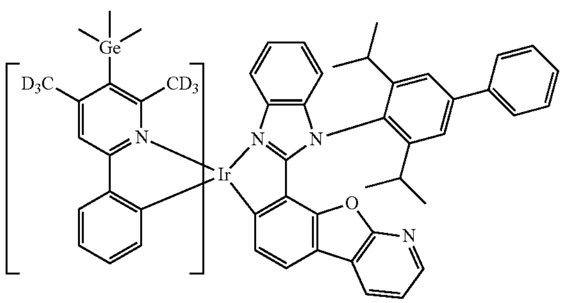
1452
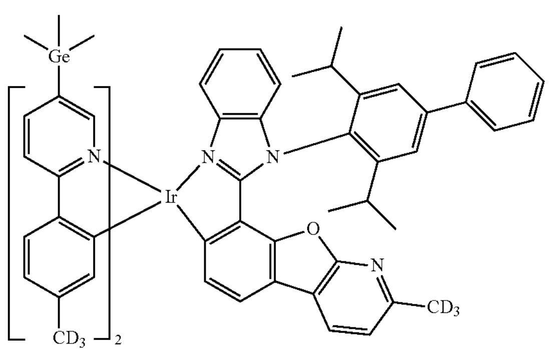
1453
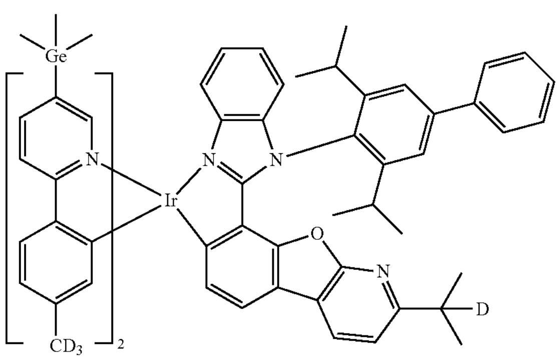
1454
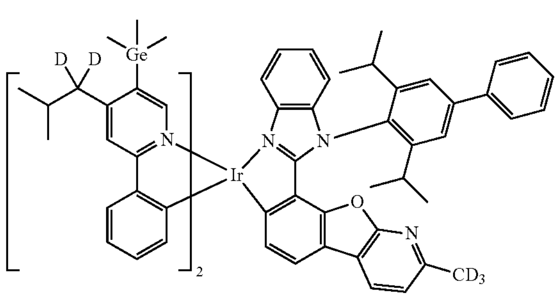
-continued
1455
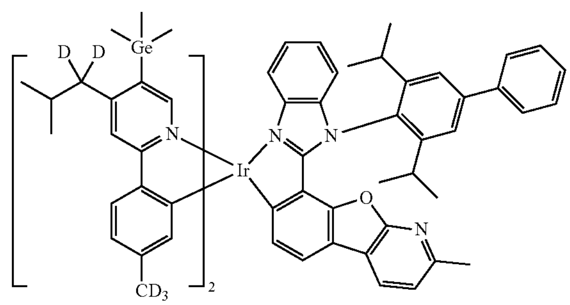
1456
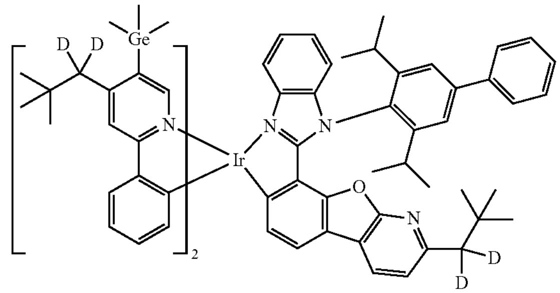
1457
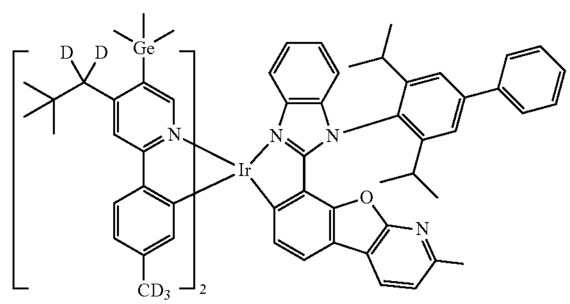
1458
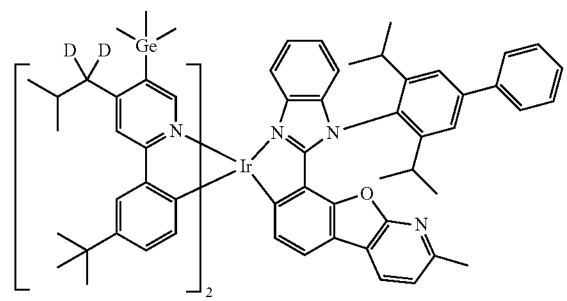
1459
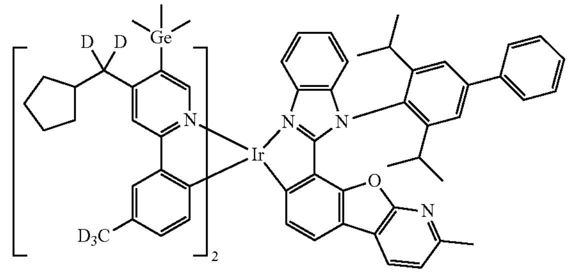

-continued
1460
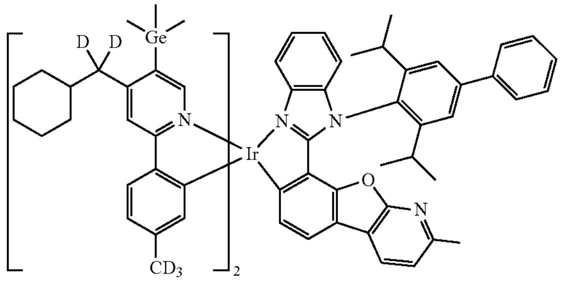
1461
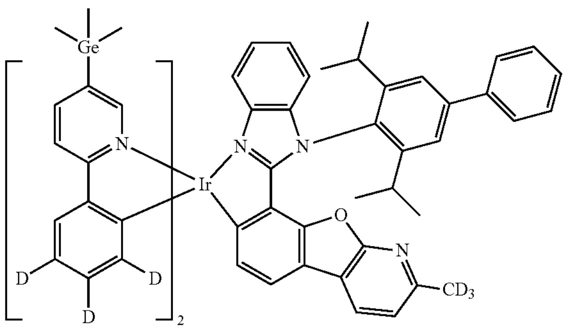
1462
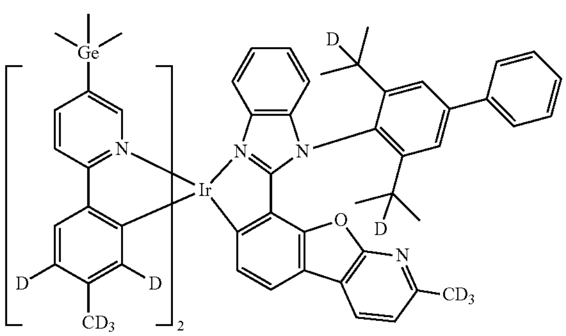
1463
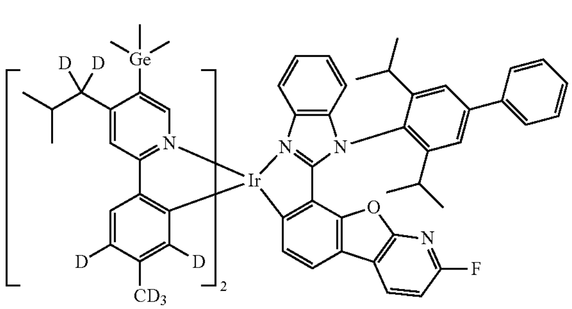
-continued
1464
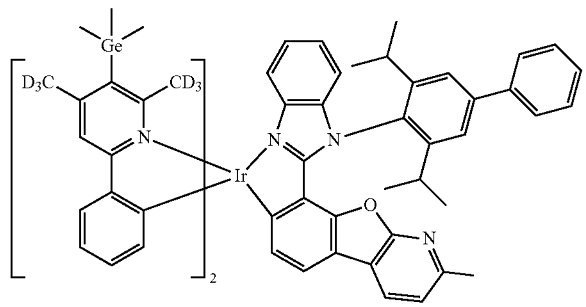
1465
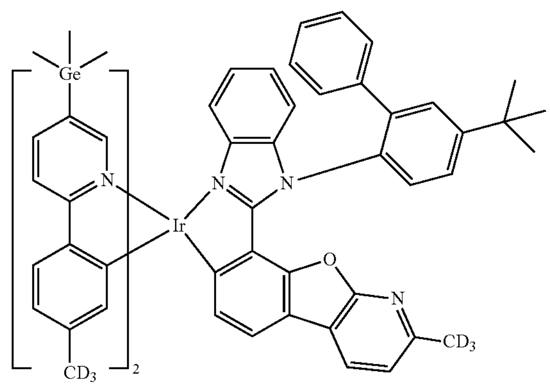
1466
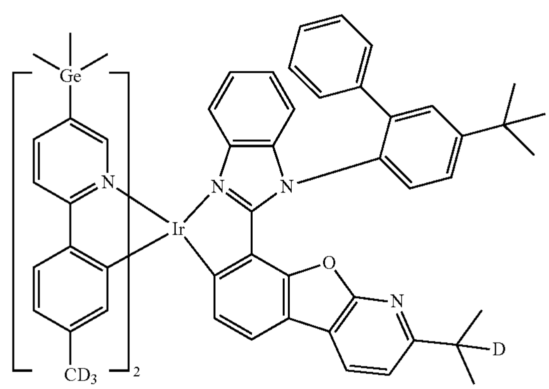
1467
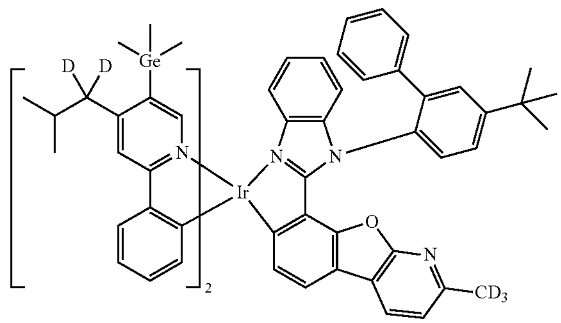

-continued
1468
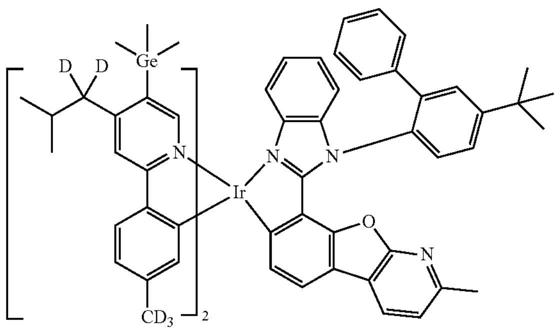
1469
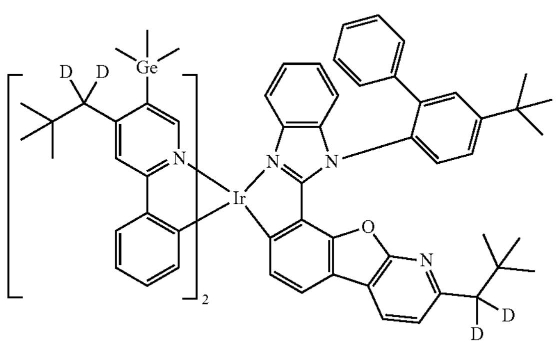
1470
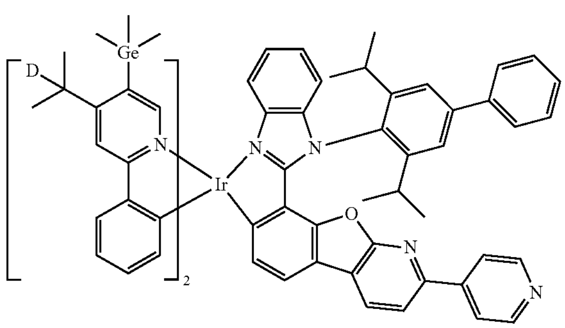
1471
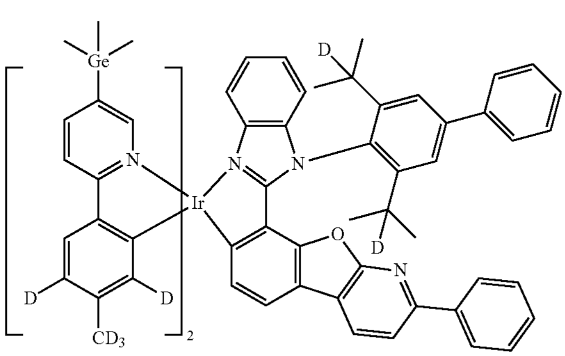
-continued
1472
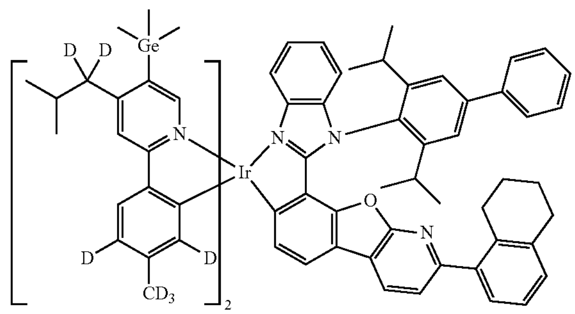
1473
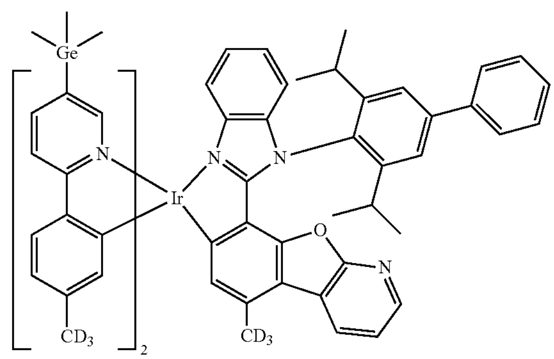
1474
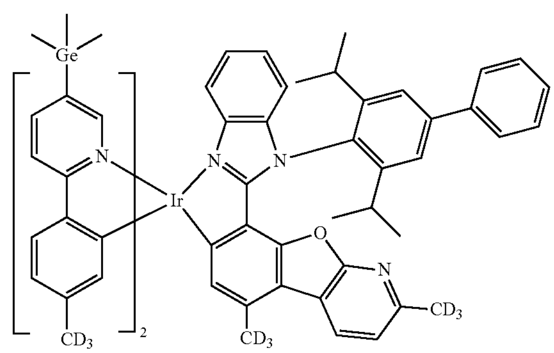
1475
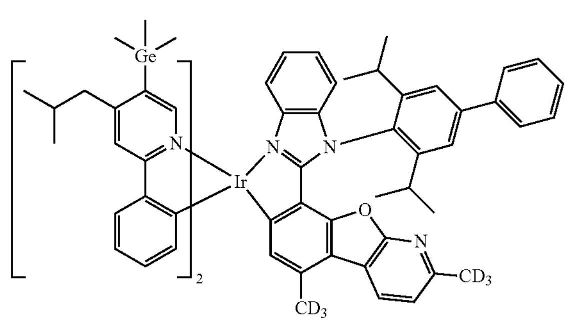

1476
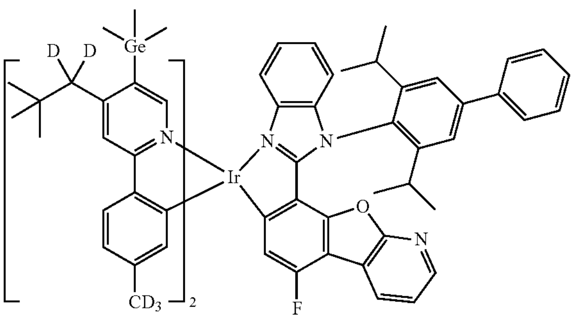
1477
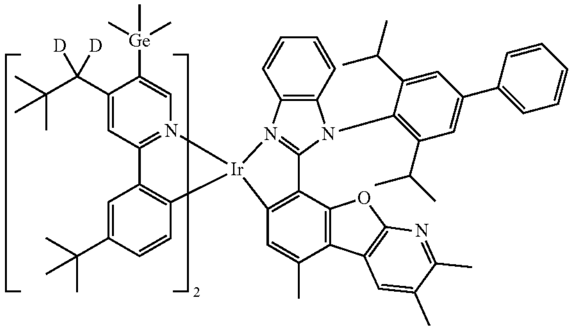
1478
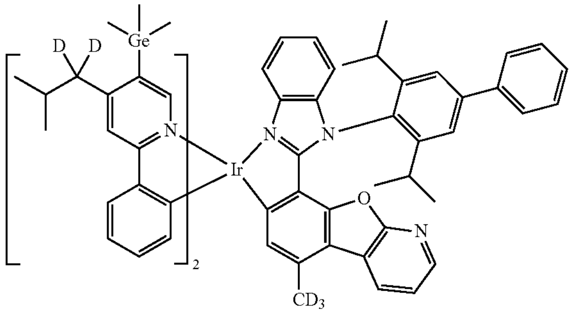
1479
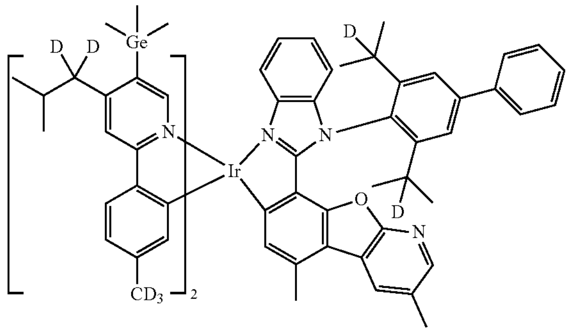
1480
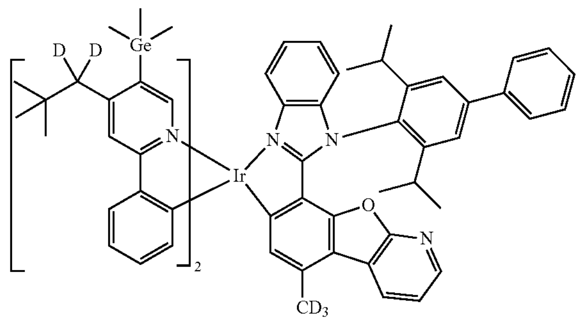
1481
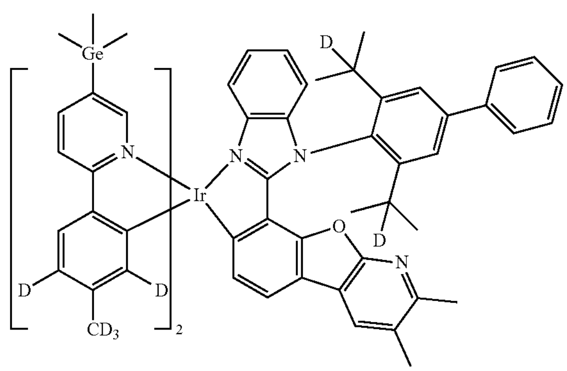
1482
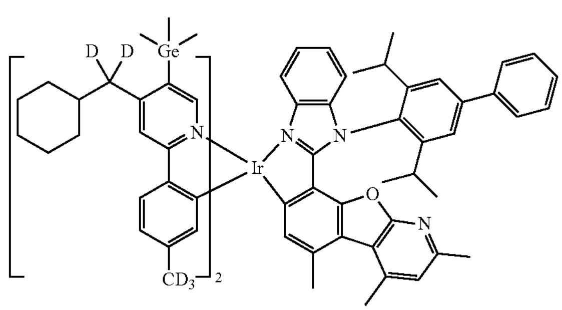
1483
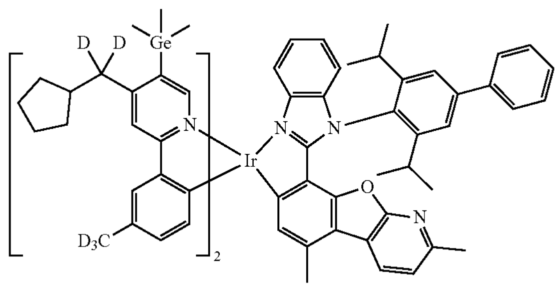

-continued
1484
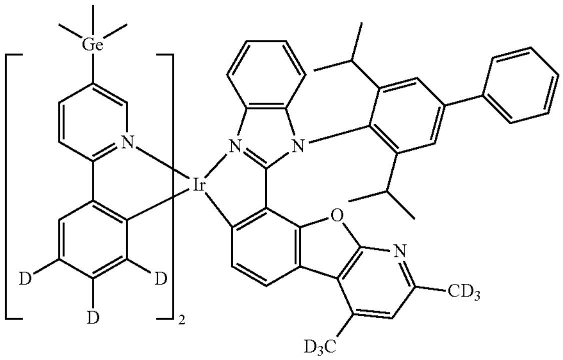
1485
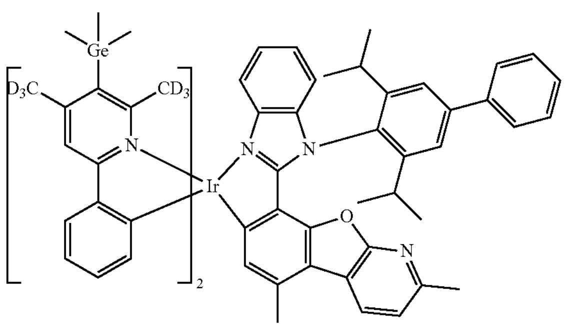
1486
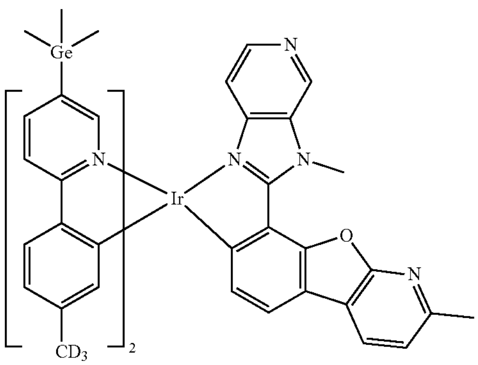
1487
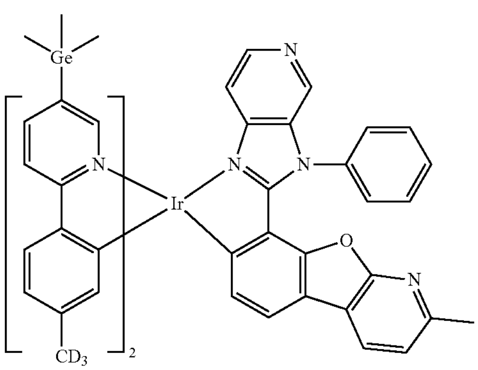
-continued
1488
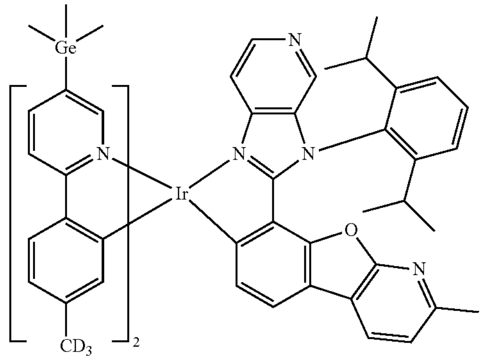
1489
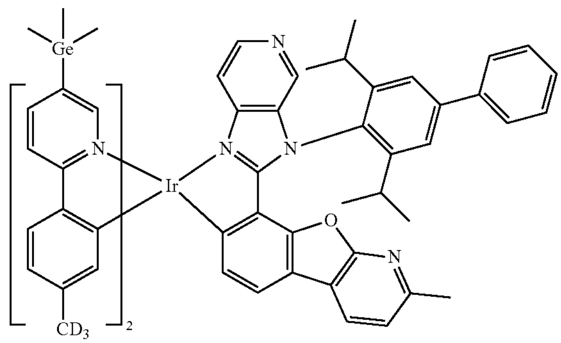
1490
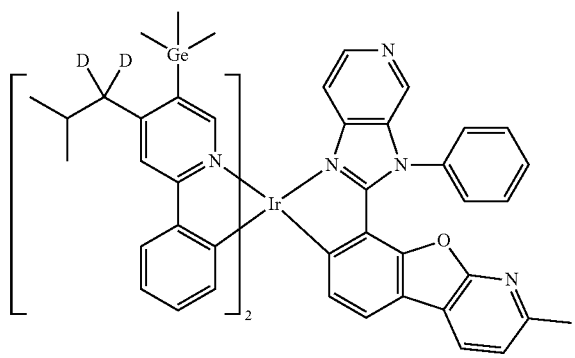
1491
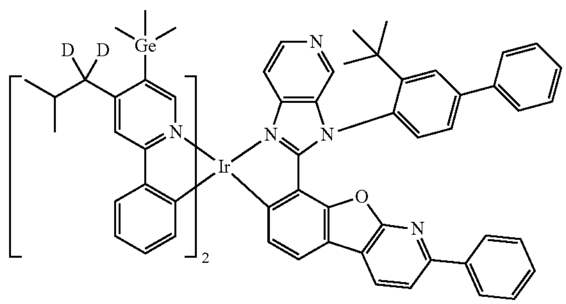

-continued
1492
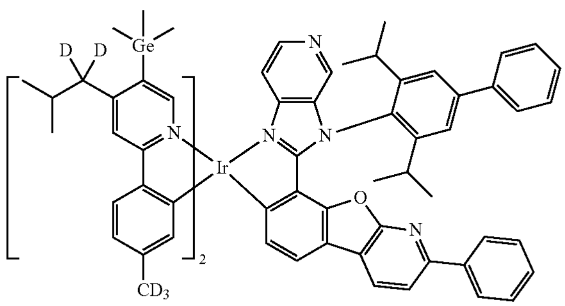
1493
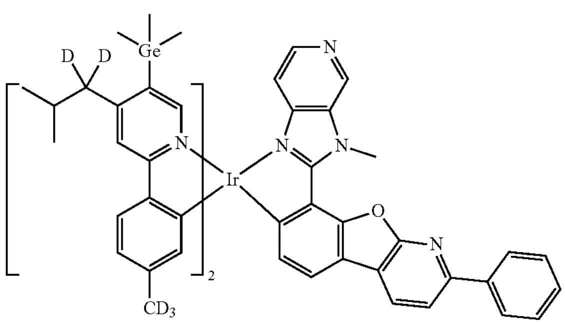
1494
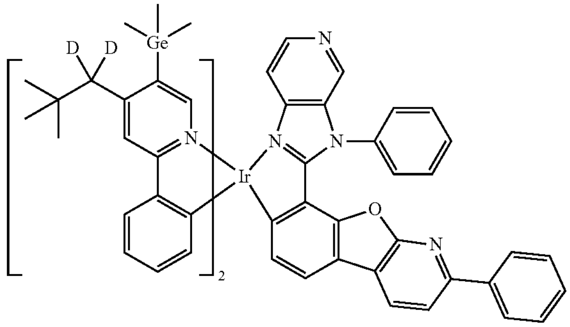
1495
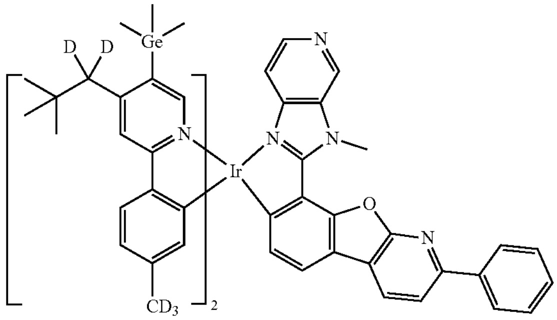
-continued
1496
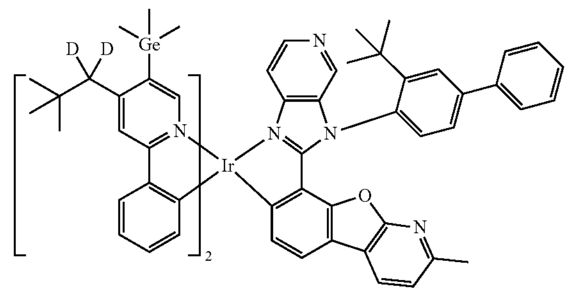
1497
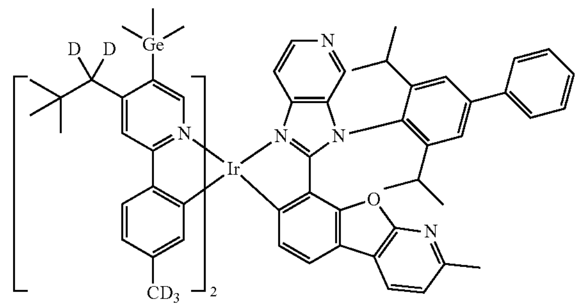
1498
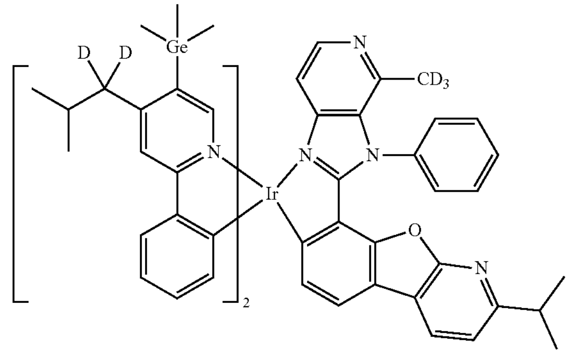
1499
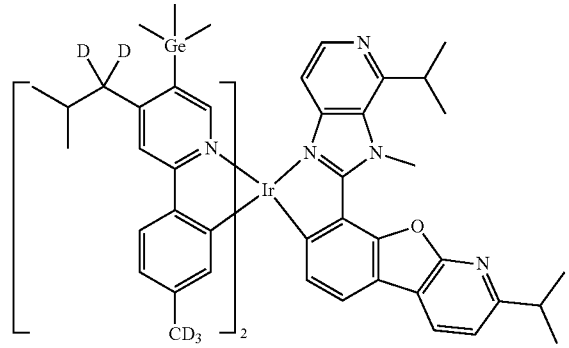

-continued
1500
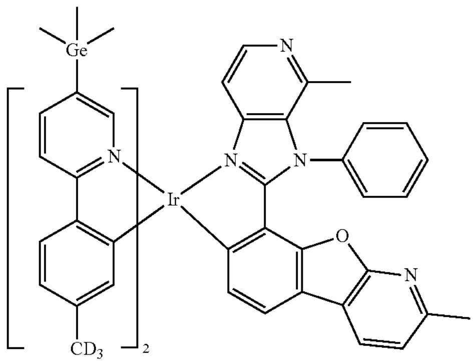
1501
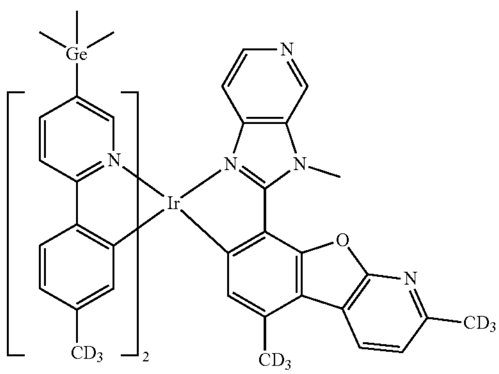
1502
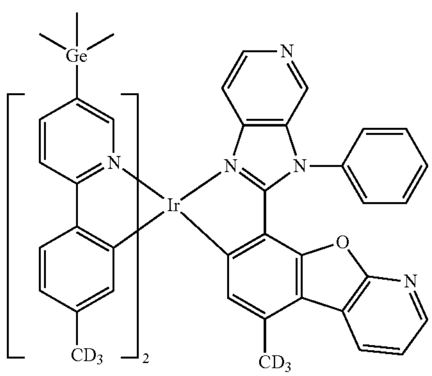
1503
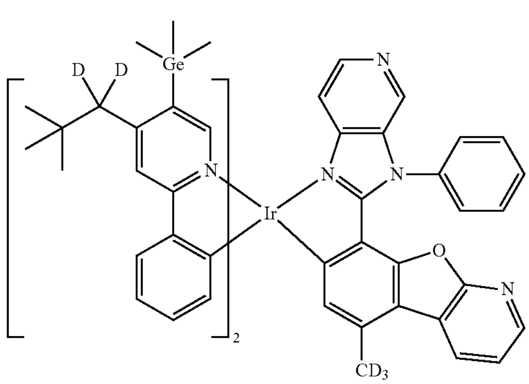
-continued
1504
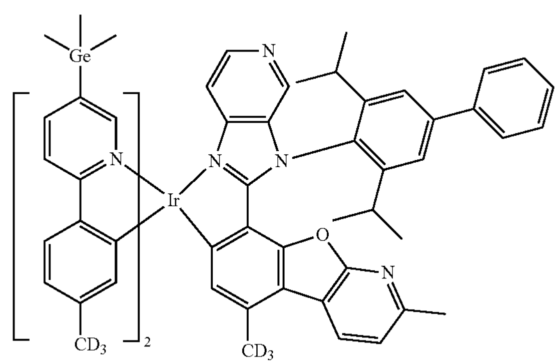
1505
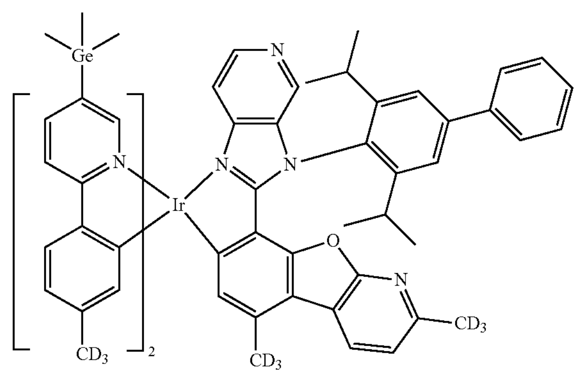
1506
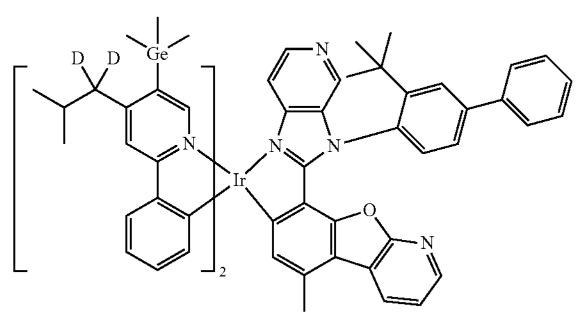
1507
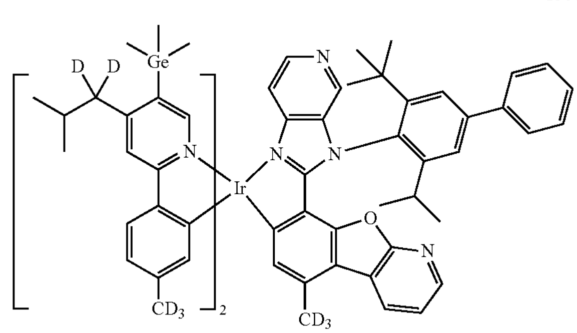

1508
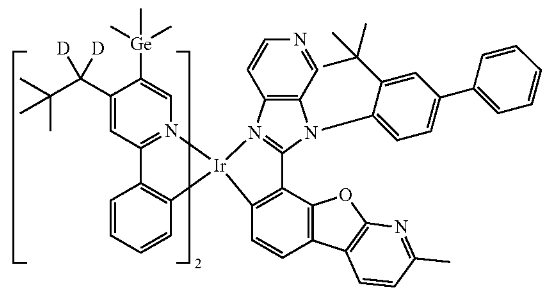
1509
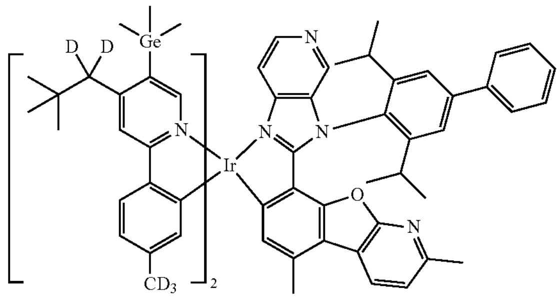
1510
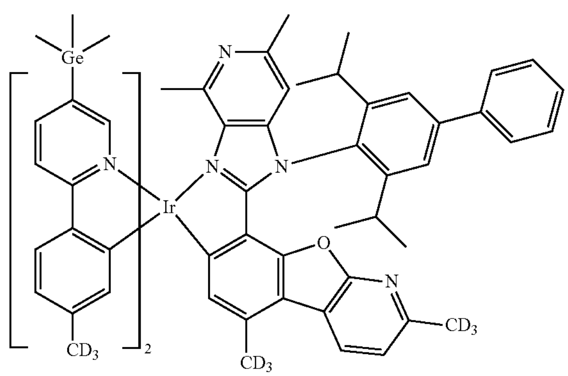
1511
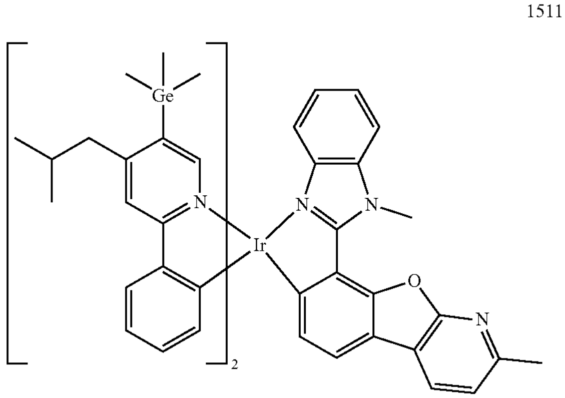
1512
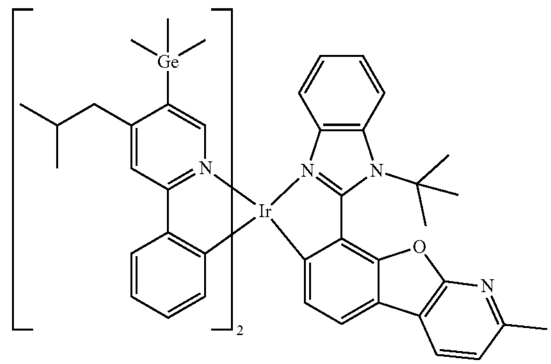
1513
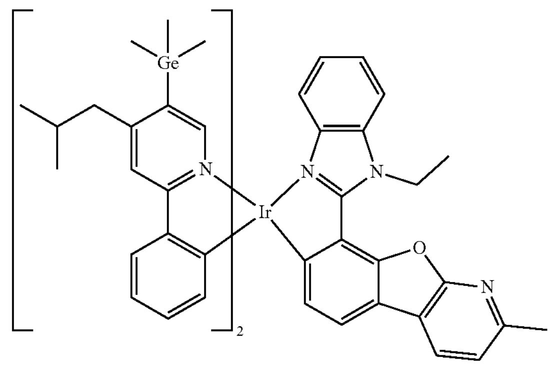
1514
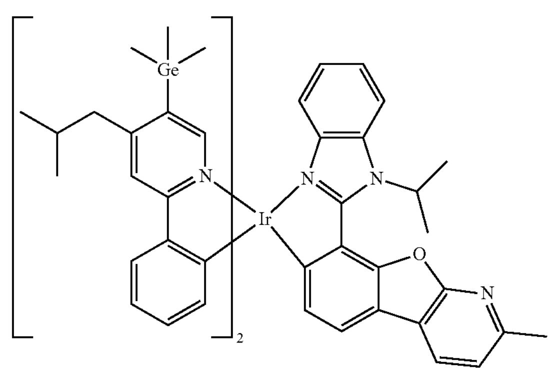
1515
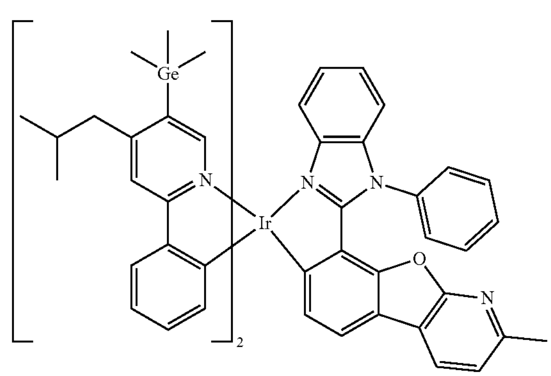

-continued
1516
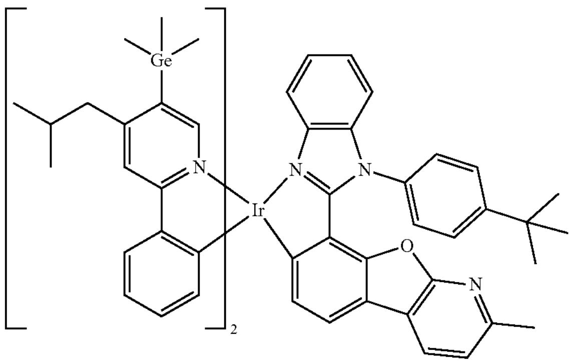
1517
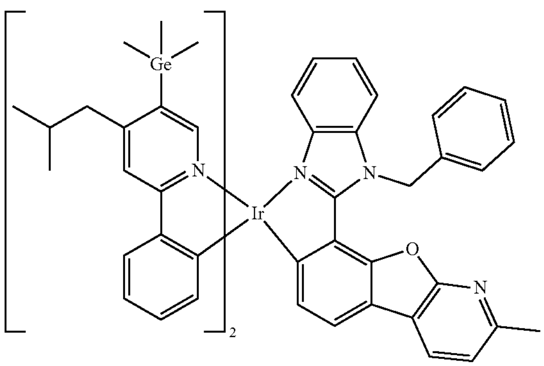
1518
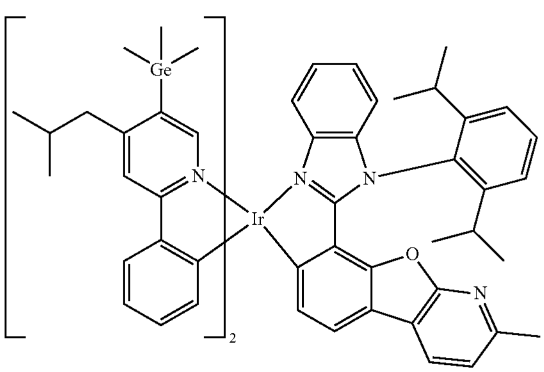
1519
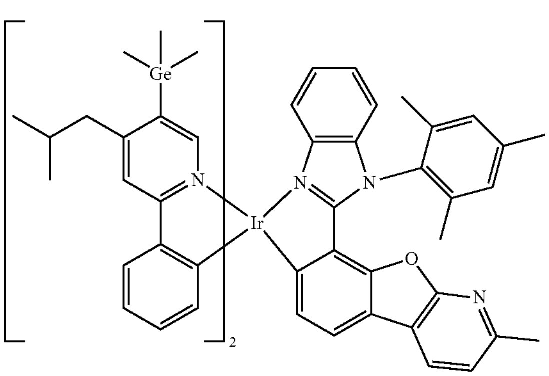
-continued
1520
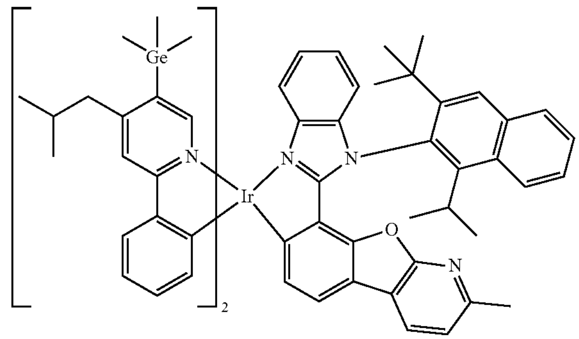
1521
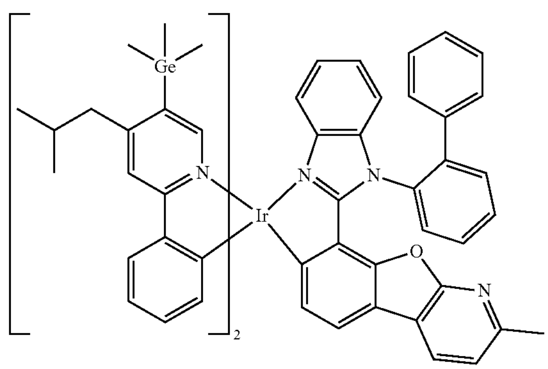
1522
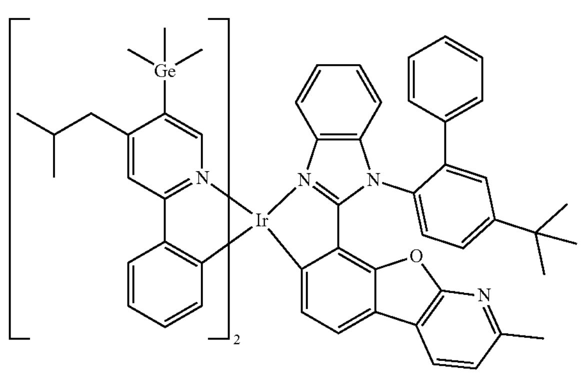
1523
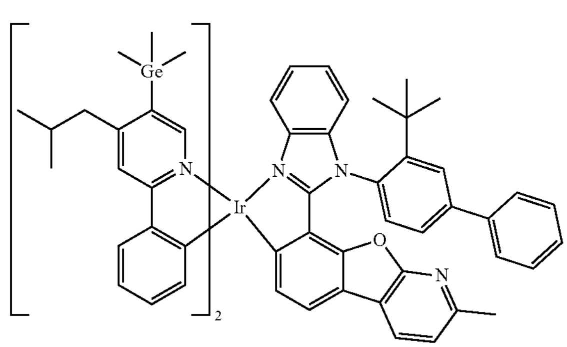

-continued
1524
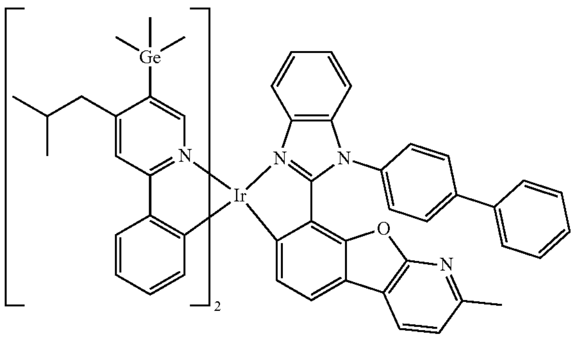
1525
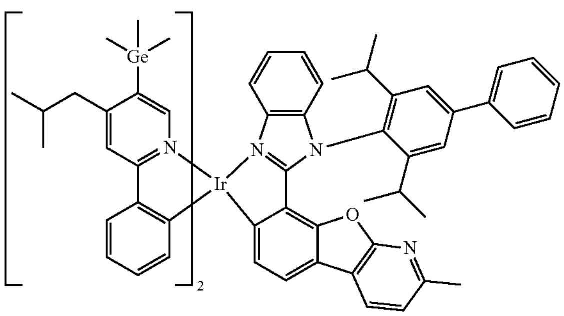
1526
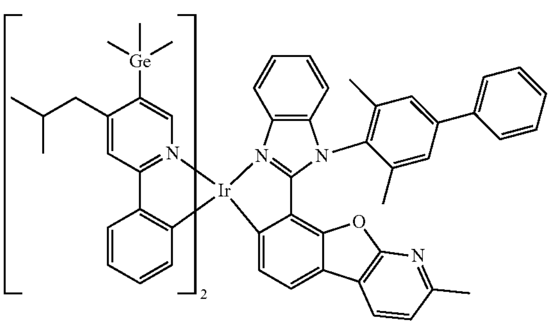
1527
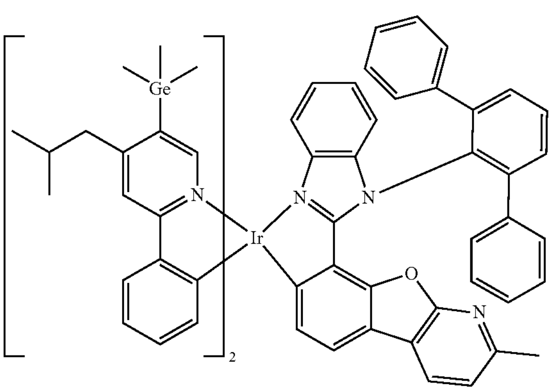
-continued
1528
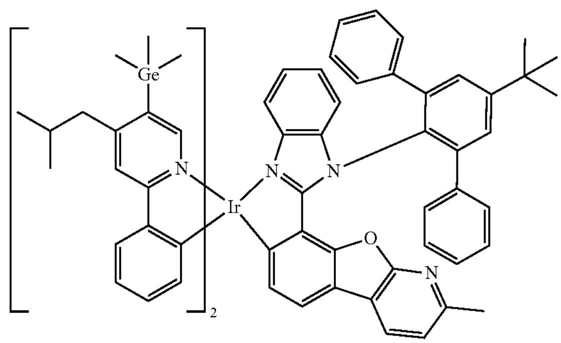
1529
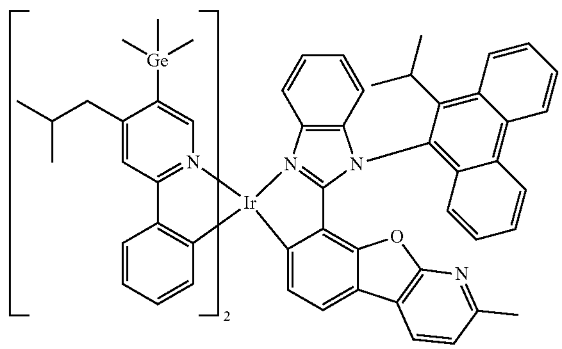
1530
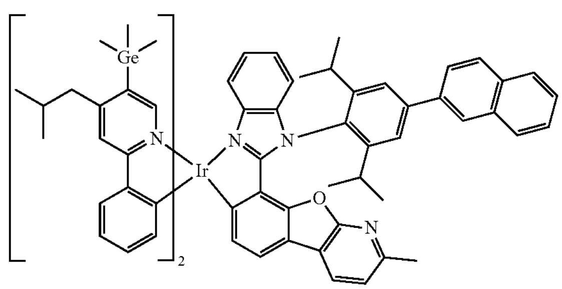
1531
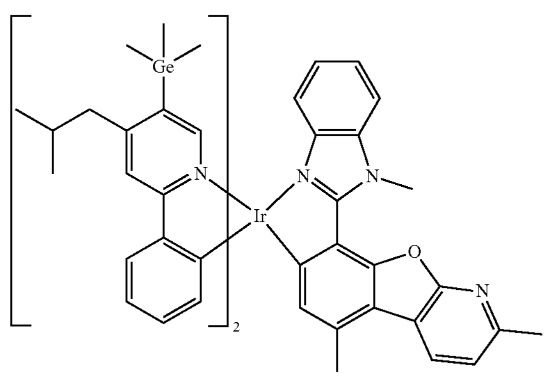

-continued
1532
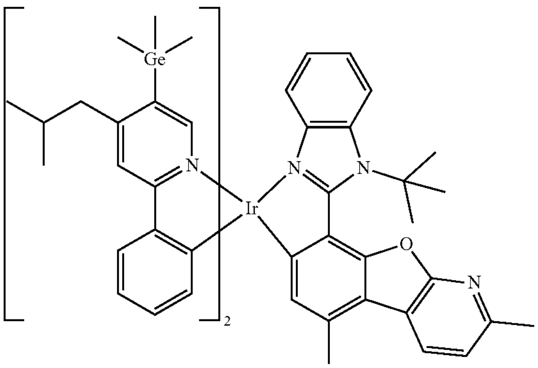
1533
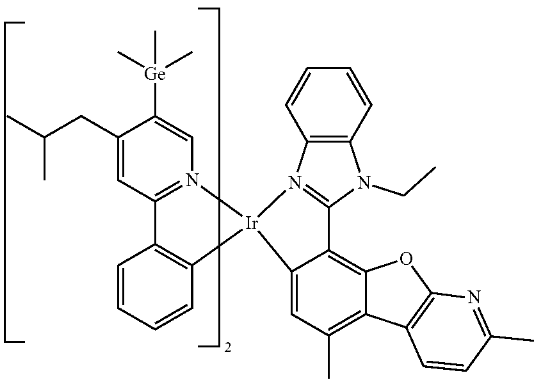
1534
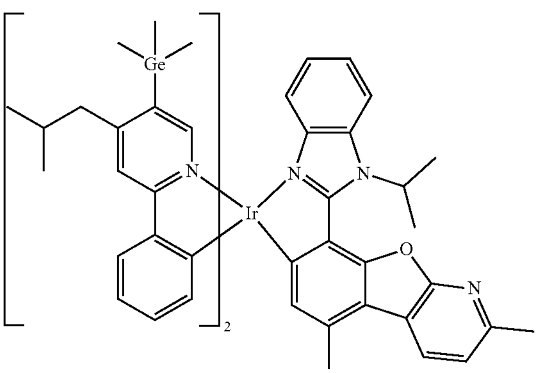
1535
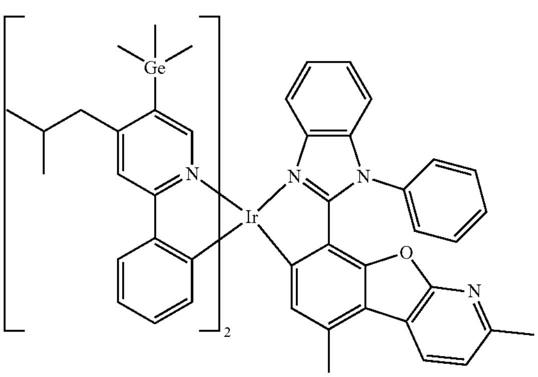
-continued
1536
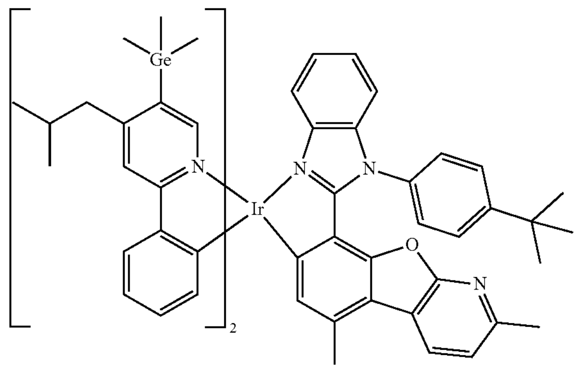
1537
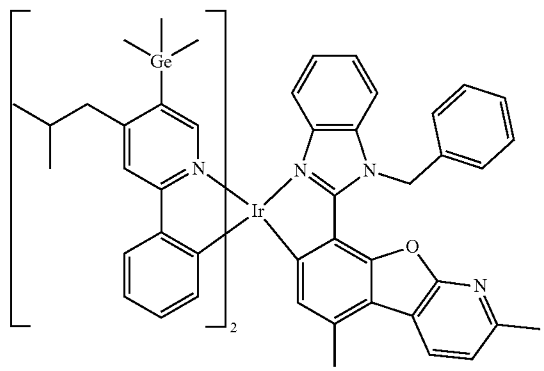
1538
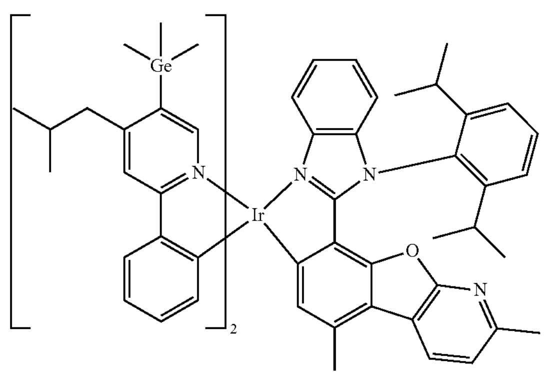
1539
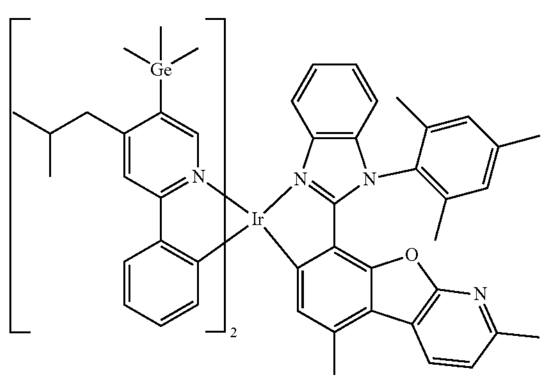

-continued
1540
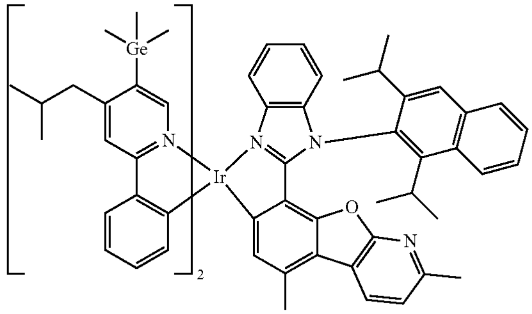
1541
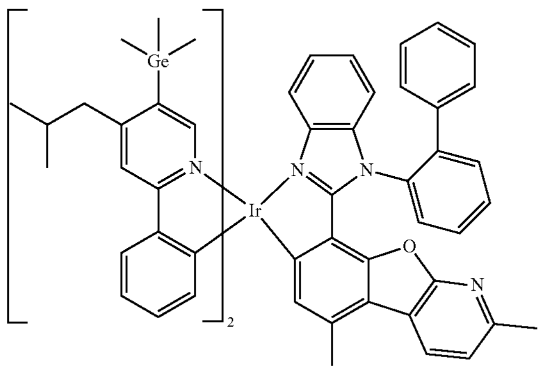
1542
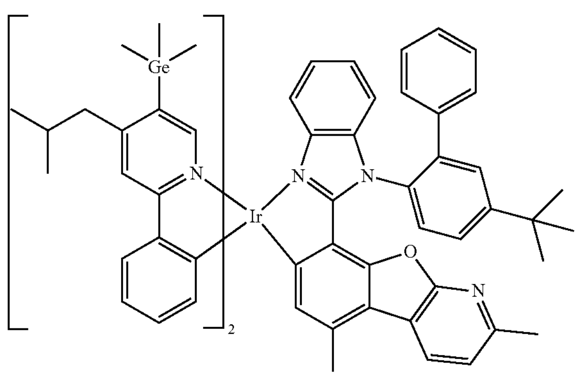
1543
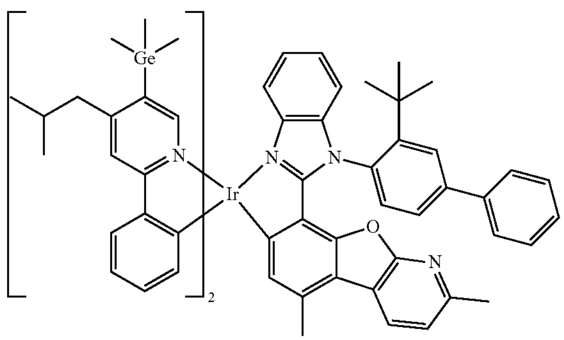
-continued
1544
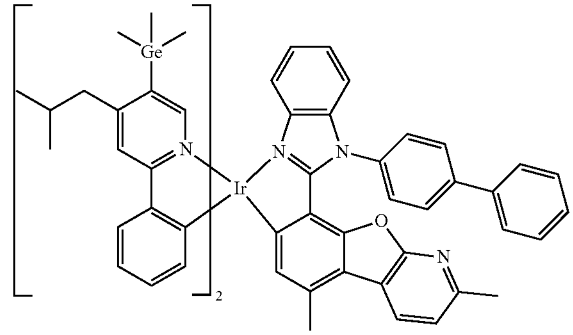
1545
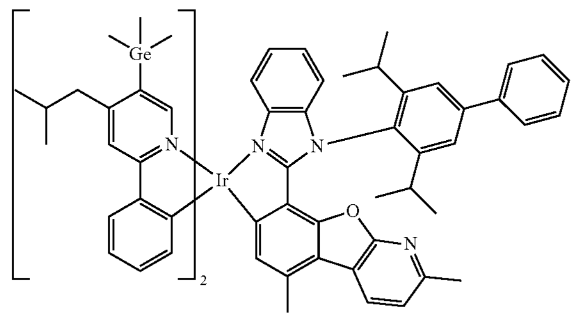
1546
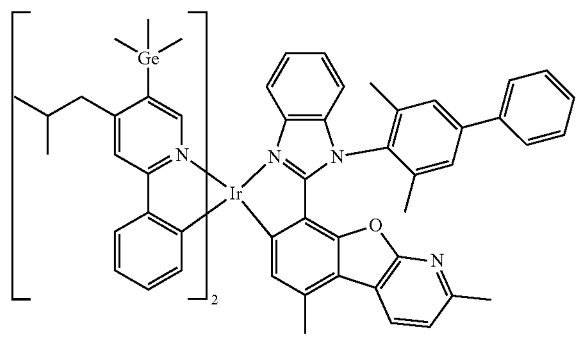
1547
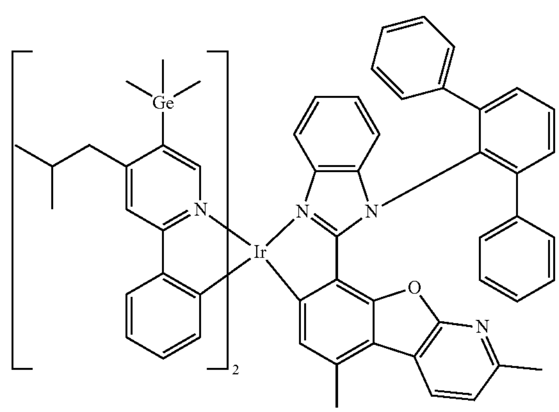

-continued
1548
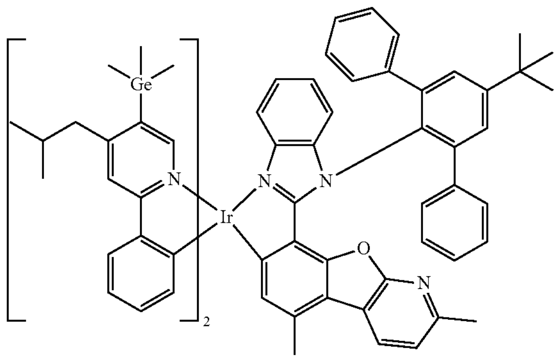
1549
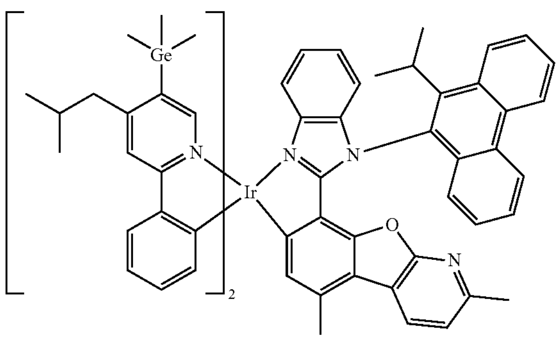
1550
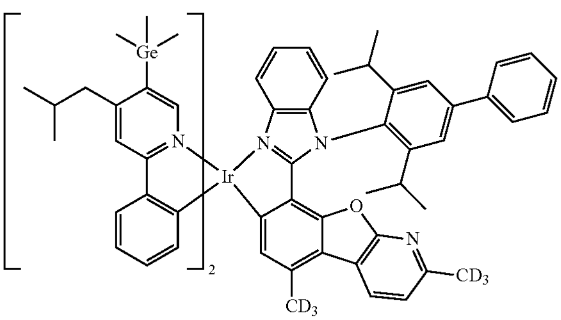
1551
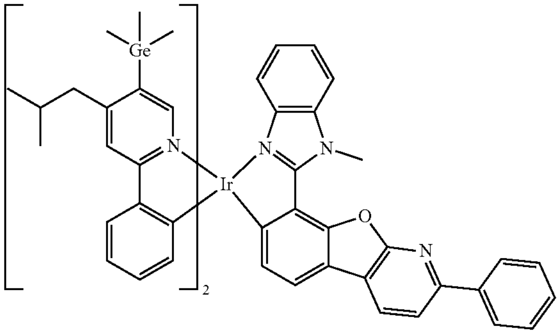
-continued
1552
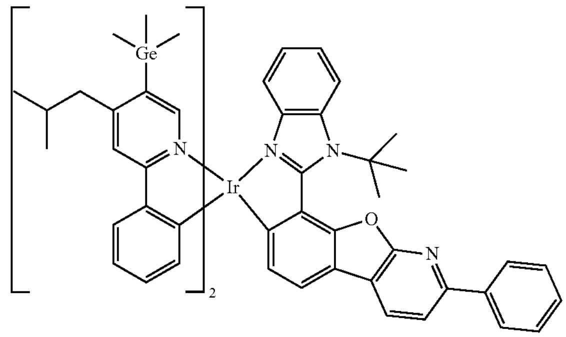
1553
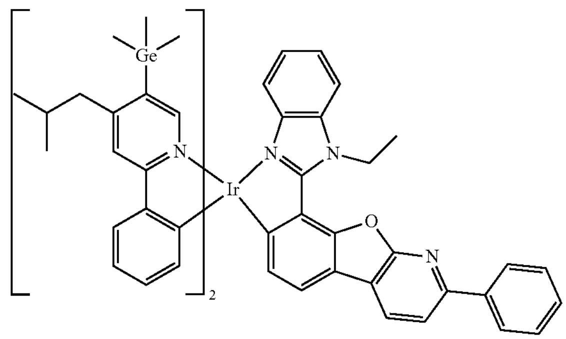
1554
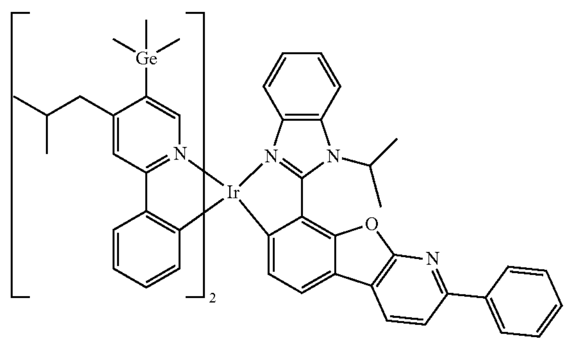
1555
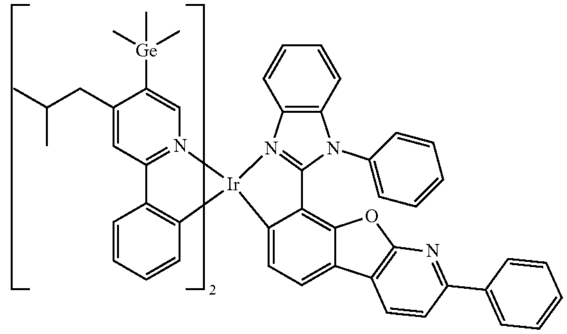

1556
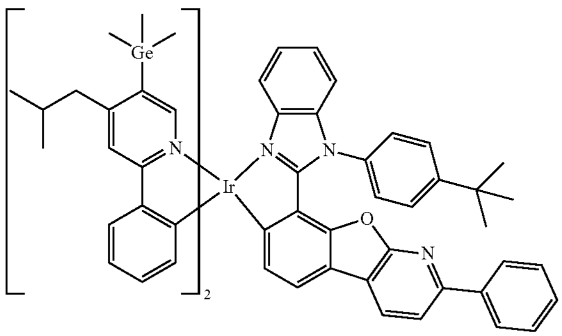
1557
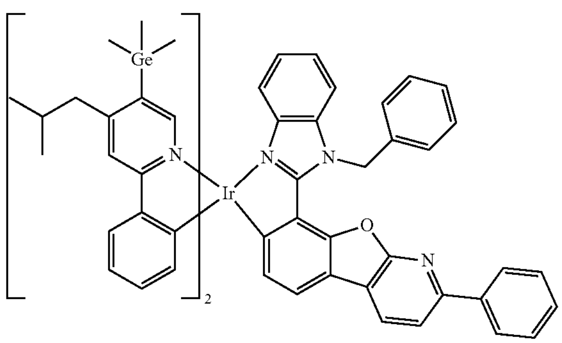
1558
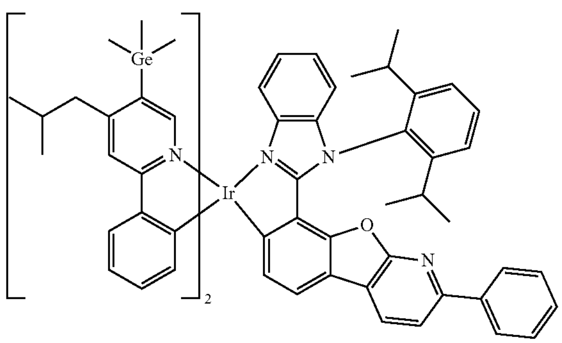
1559
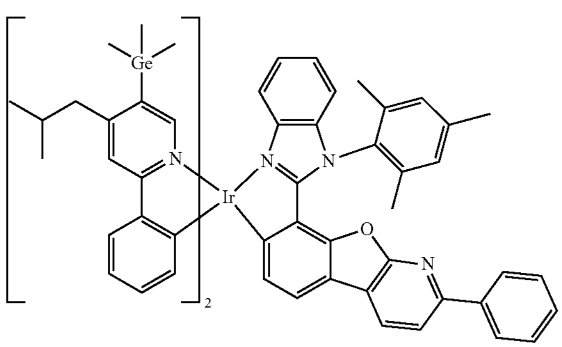
1560
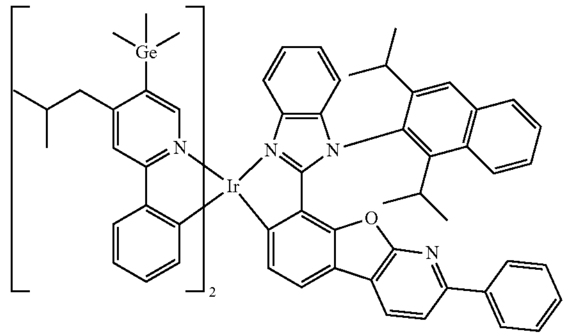
1561
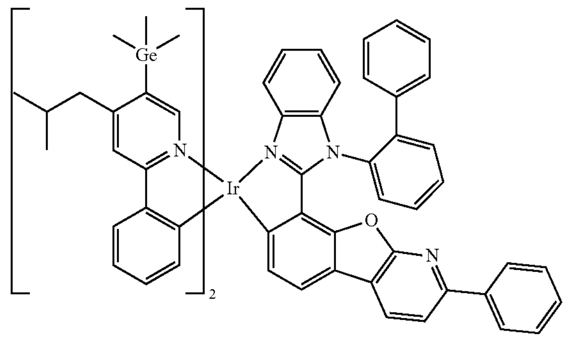
1562
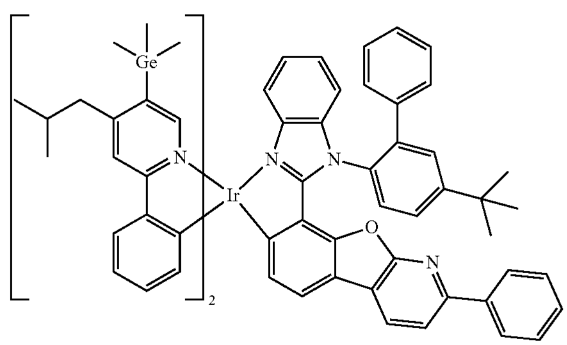
1563
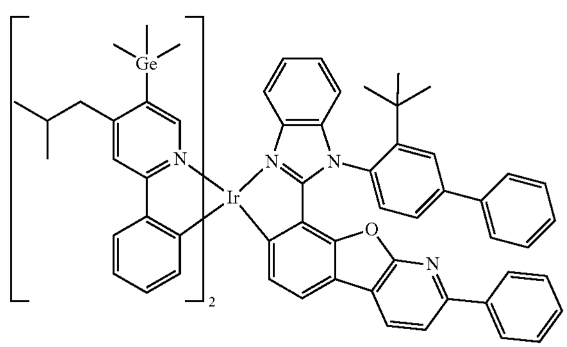

1564
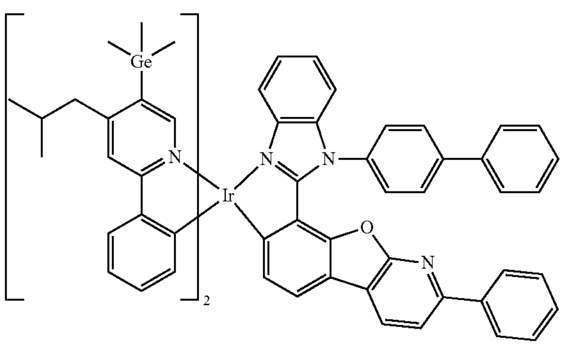
1565
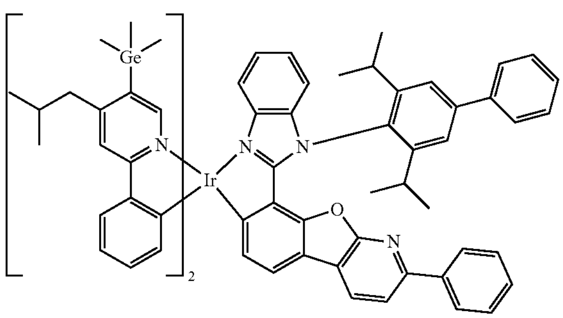
1566
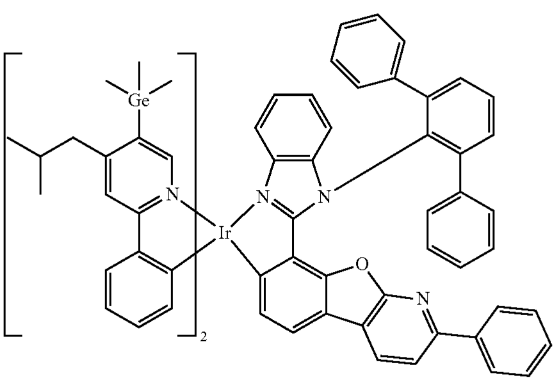
1567
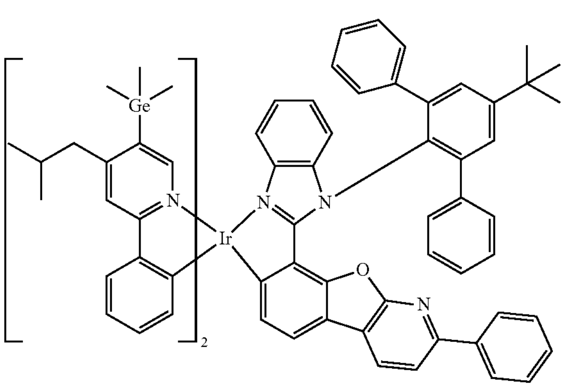
1568
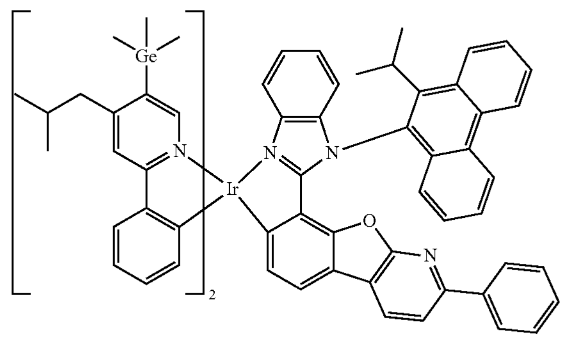
1569
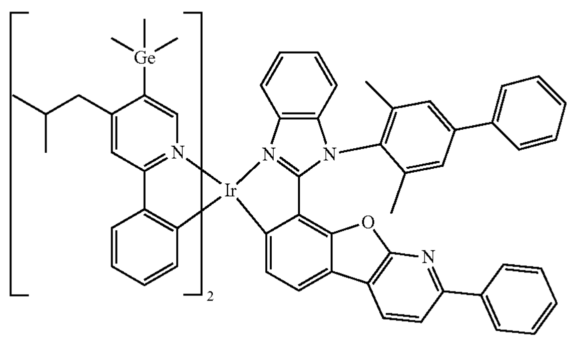
1570
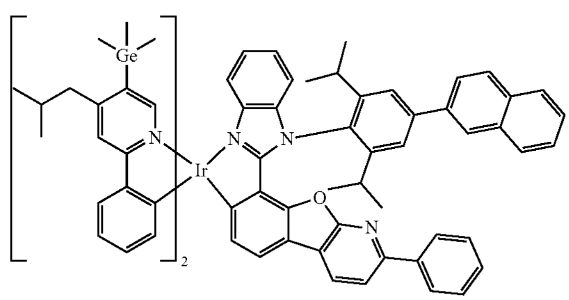
1571
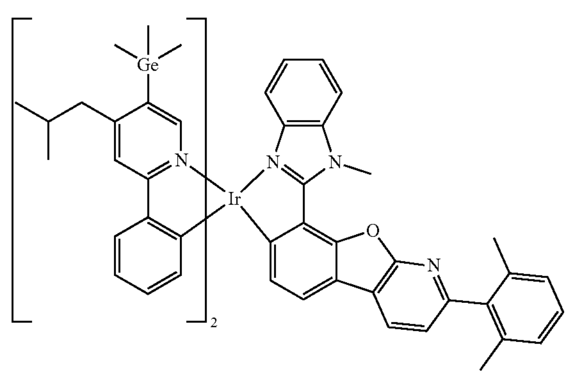

1572
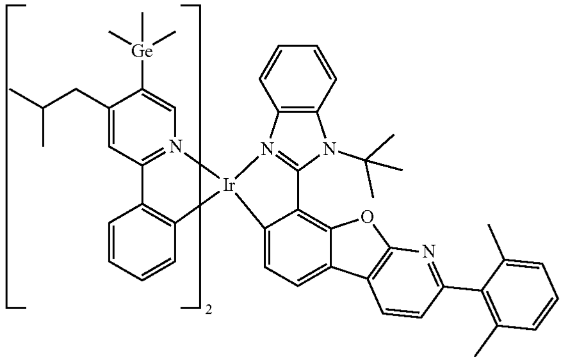
1573
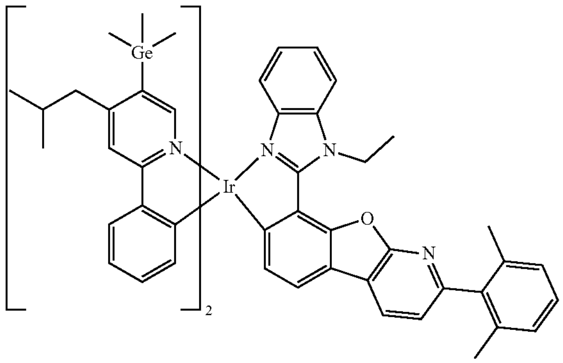
1574
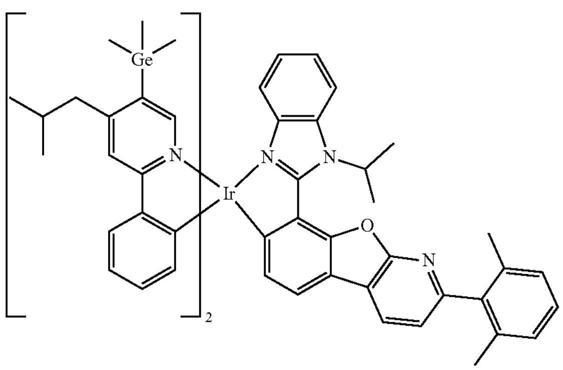
1575
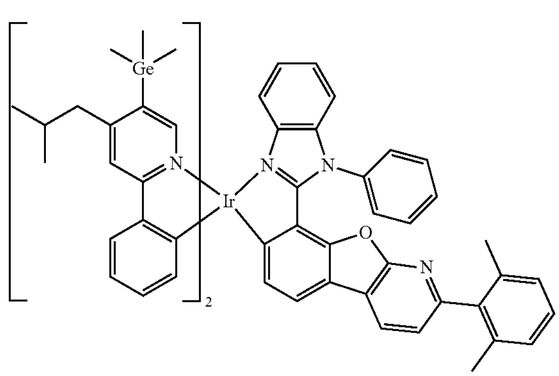
1576
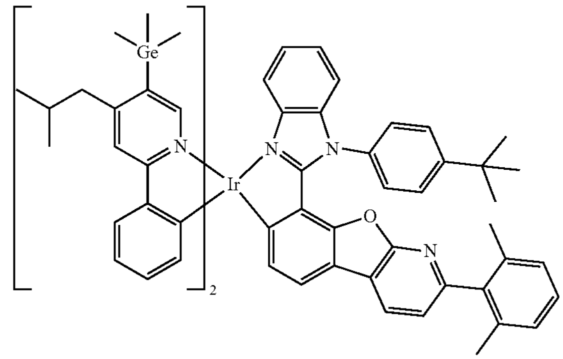
1577
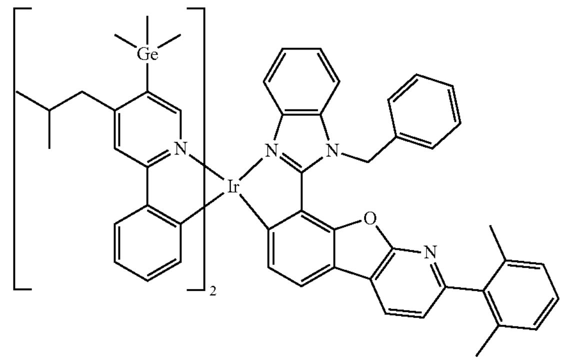
1578
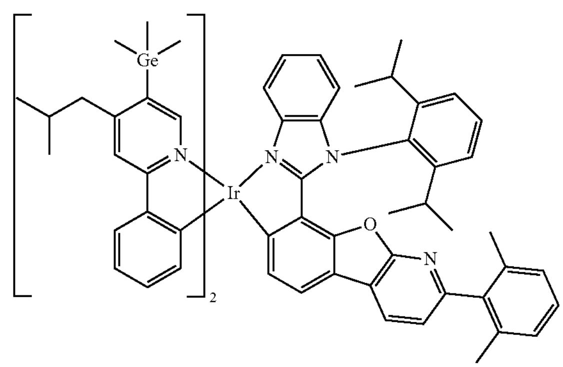
1579
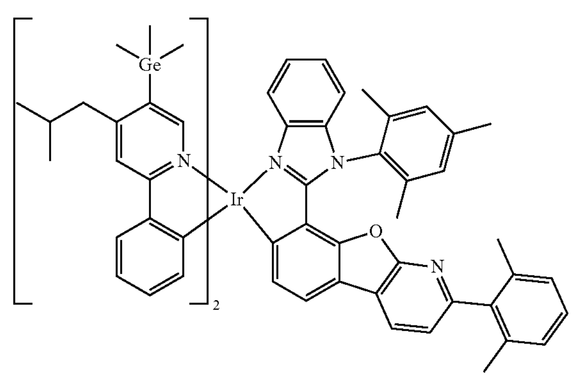

-continued
1580
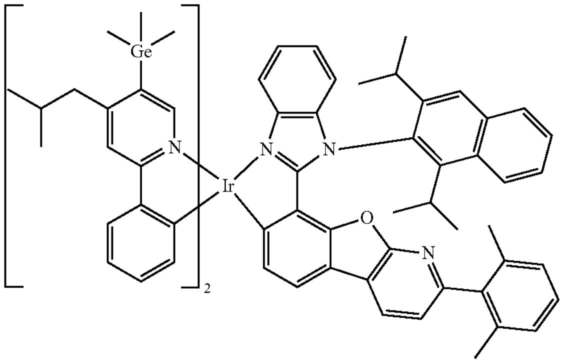
1581
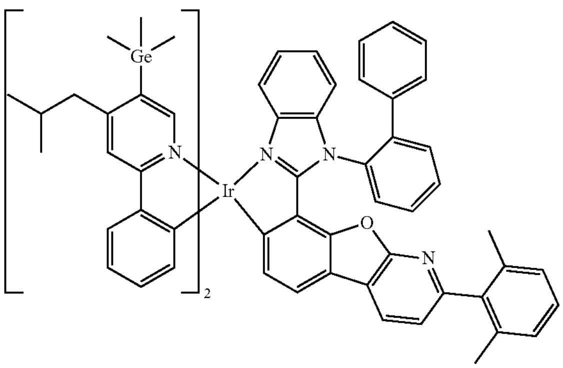
1582
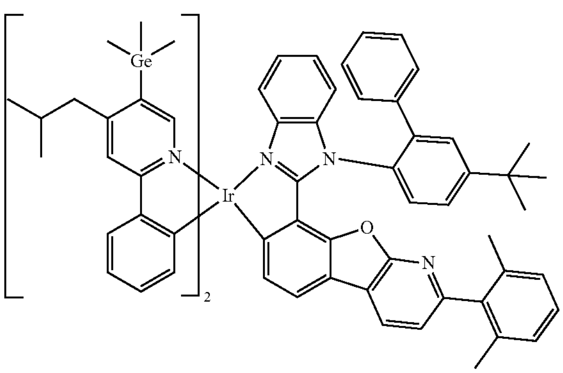
1583
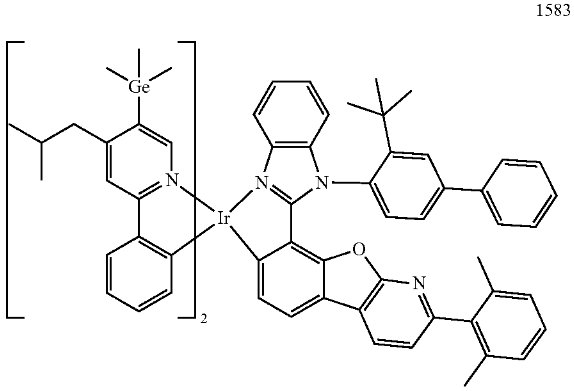
-continued
1584
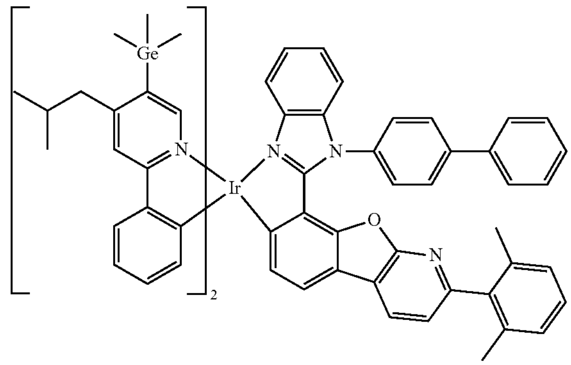
1585
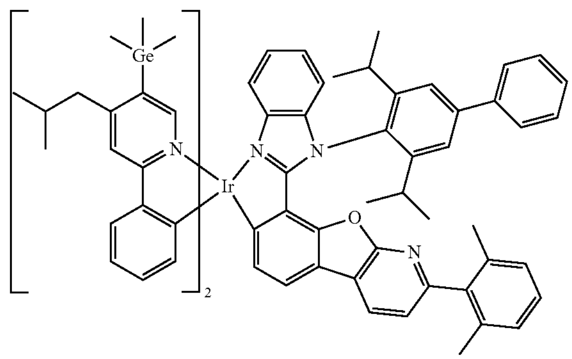
1586
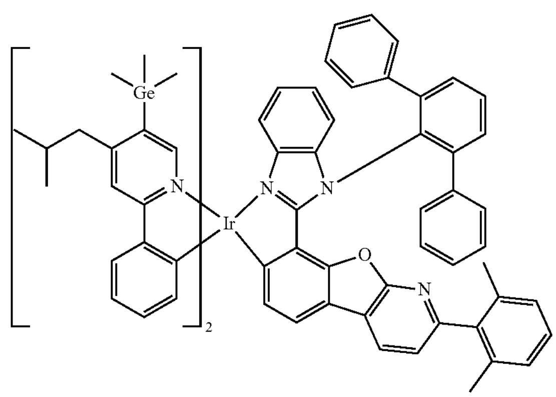
1587
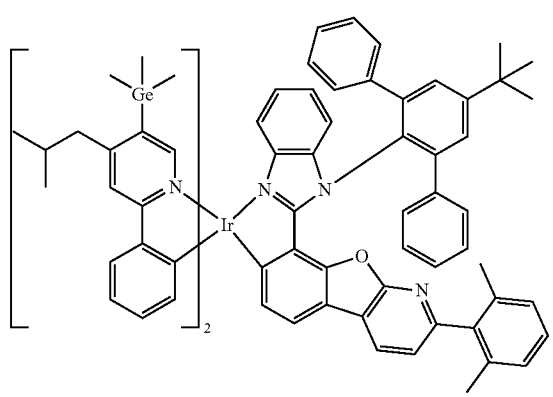

1588
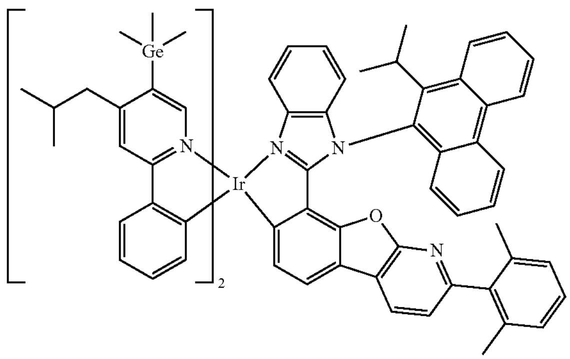
1589
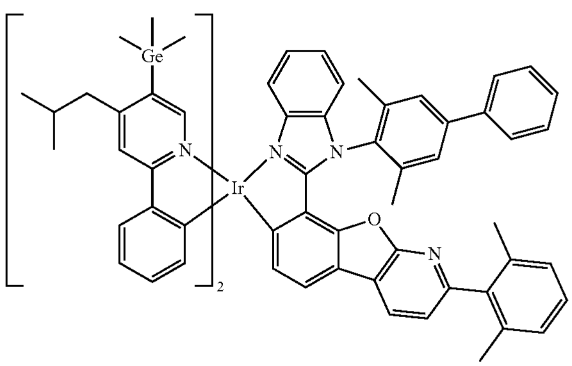
1590
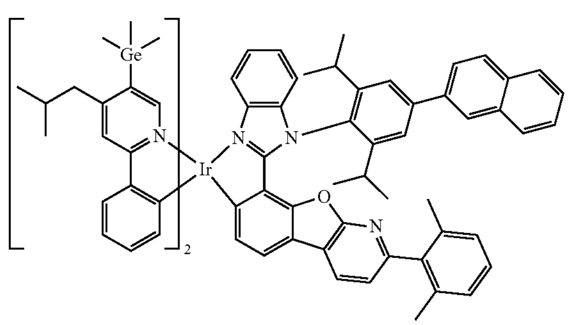
1591
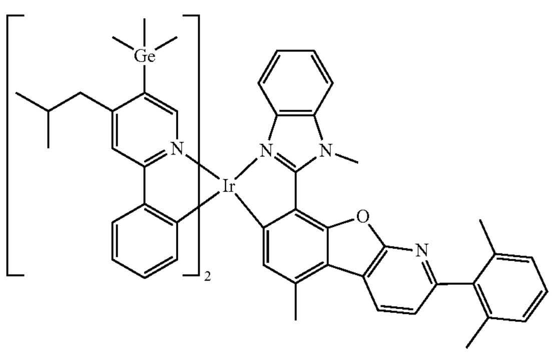
1592
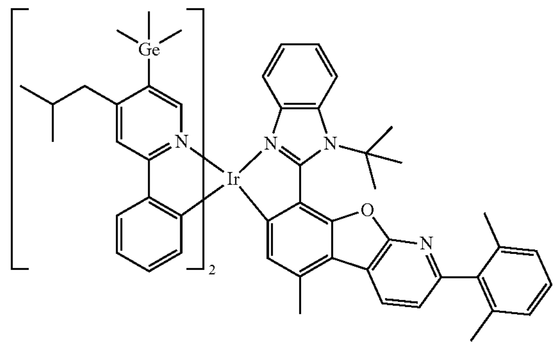
1593
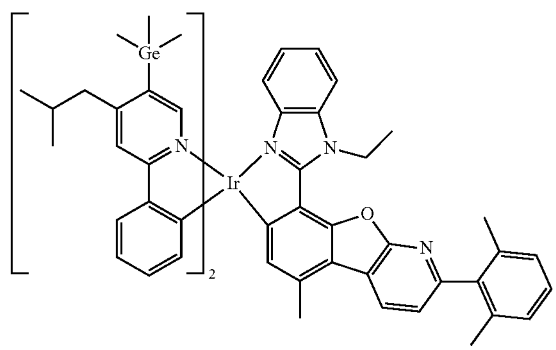
1594
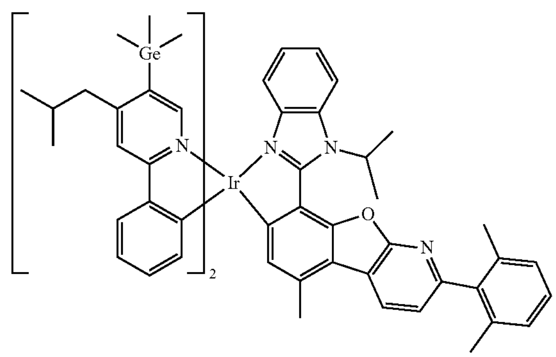
1595
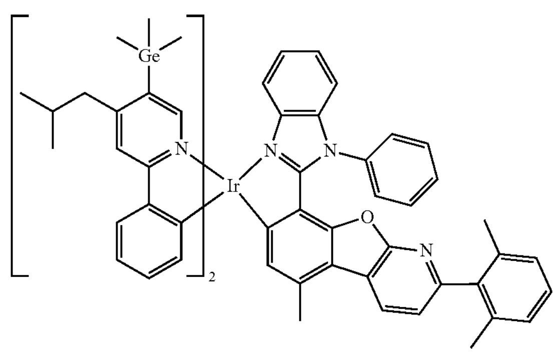

-continued
1596
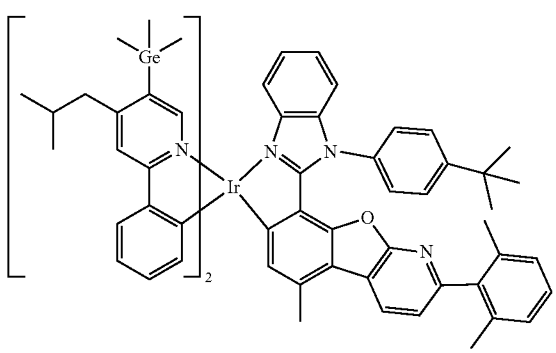
1597
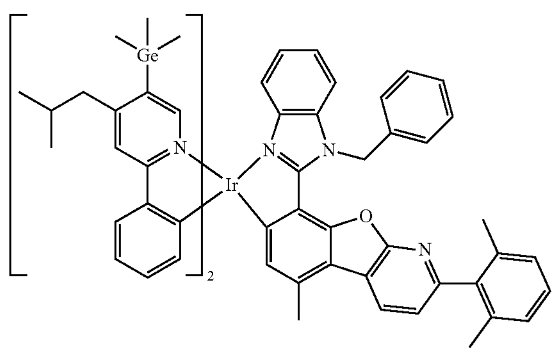
1598
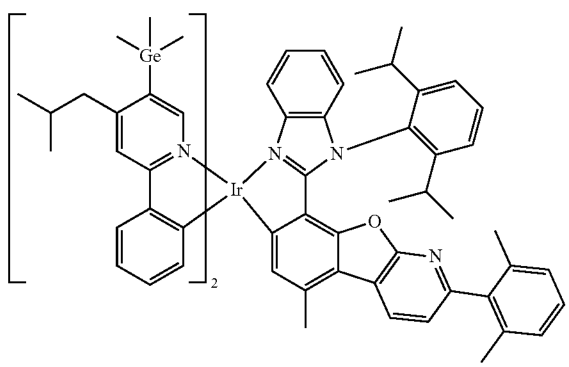
1599
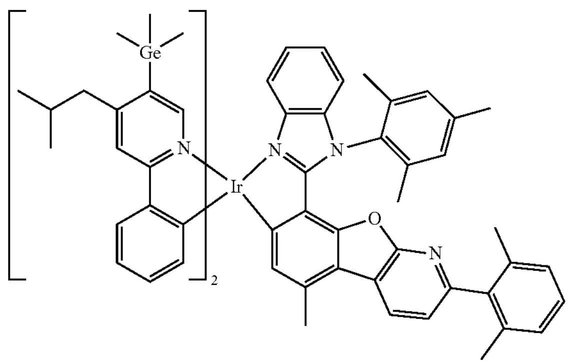
-continued
1600
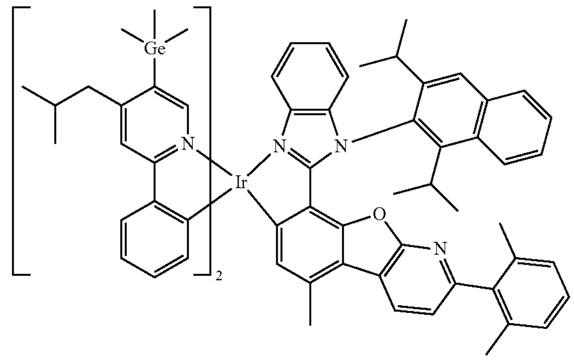
1601
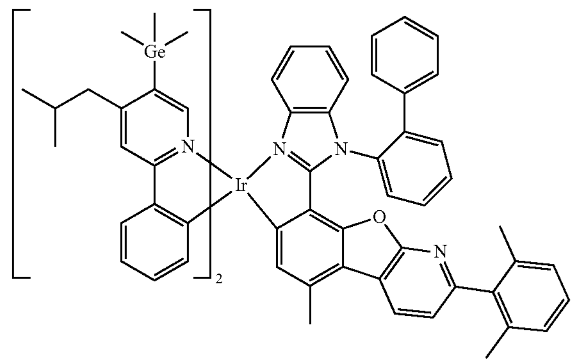
1602
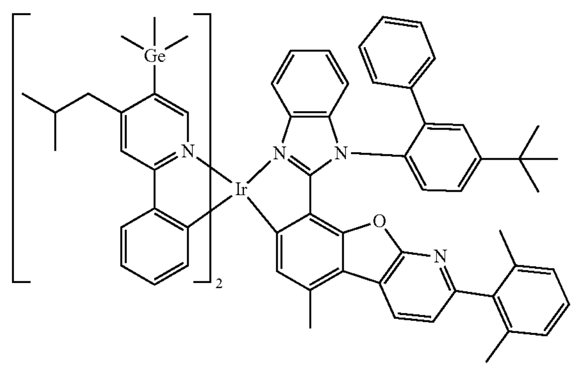
1603
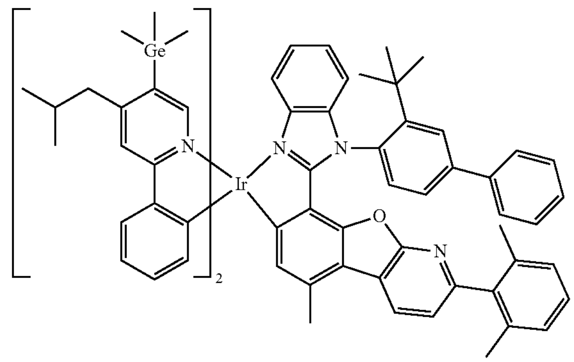

1604
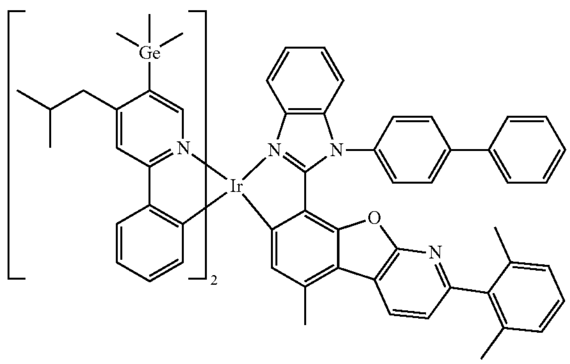
1605
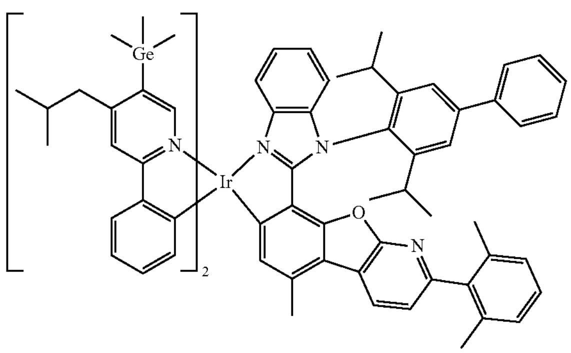
1606
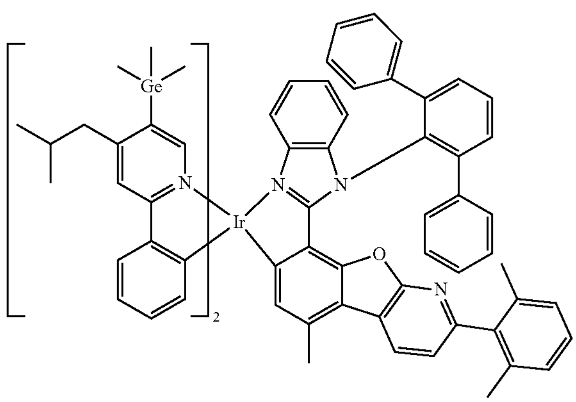
1607
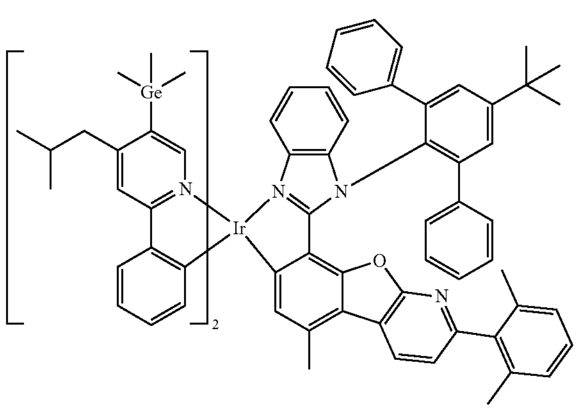
1608
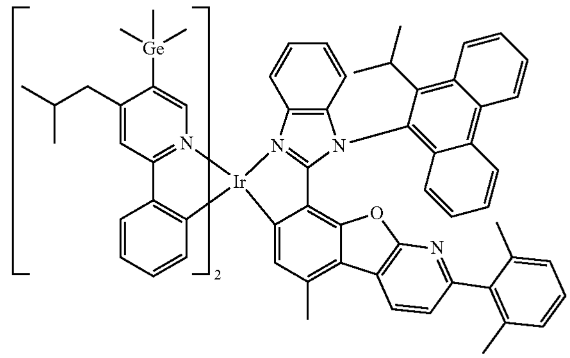
1609
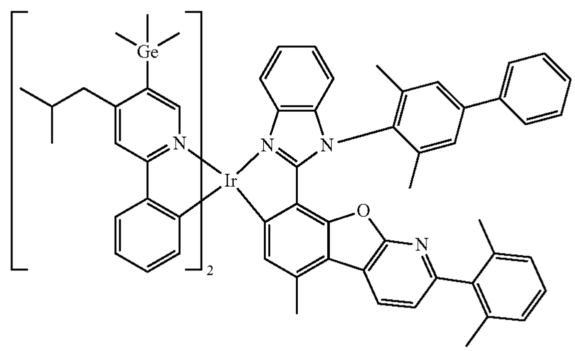
1610
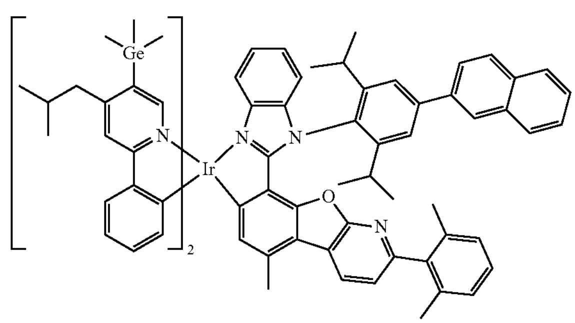
1611
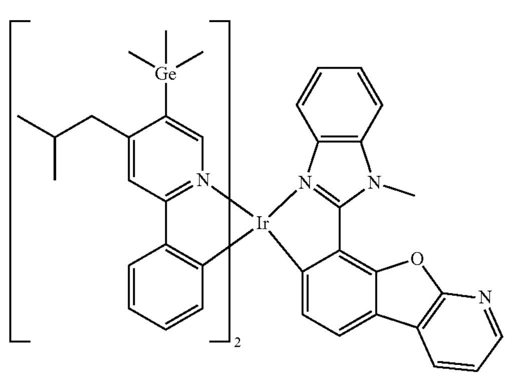

-continued
1612
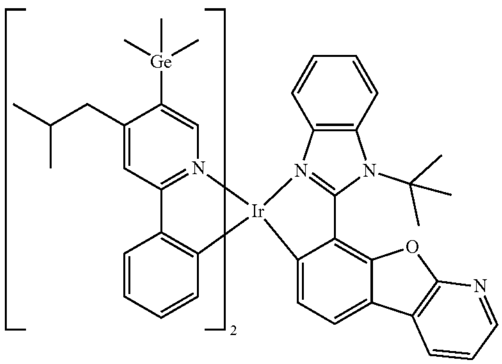
1613
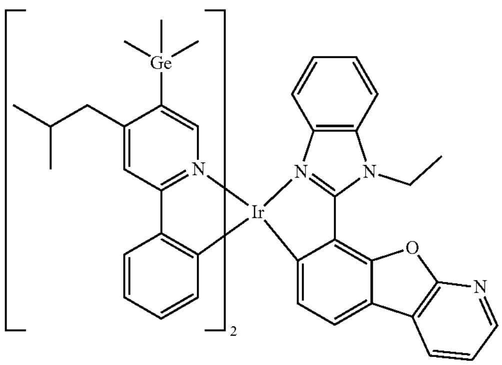
1614
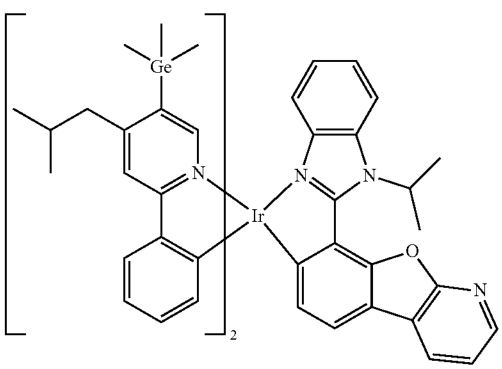
1615
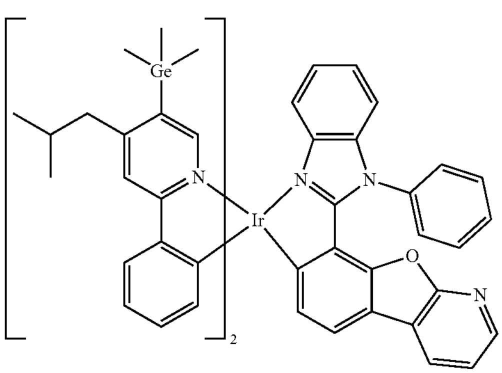
-continued
1616
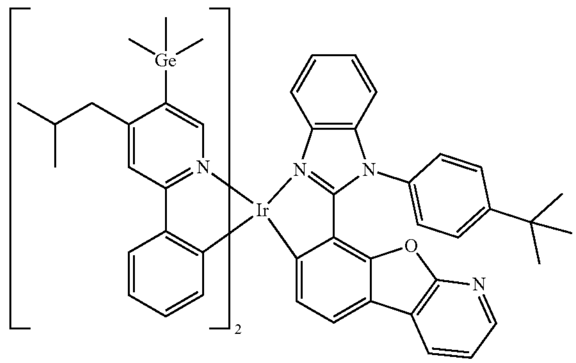
1617
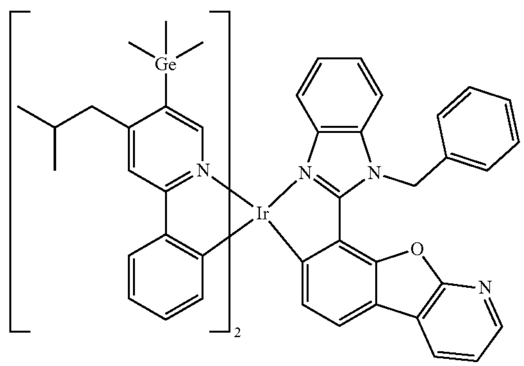
1618
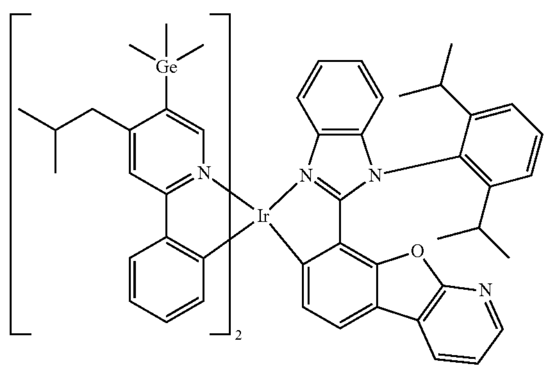
1619
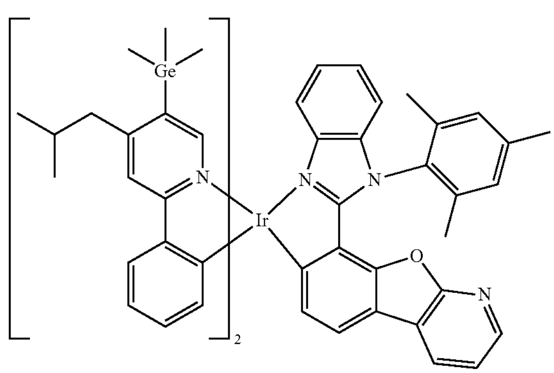

-continued
1620
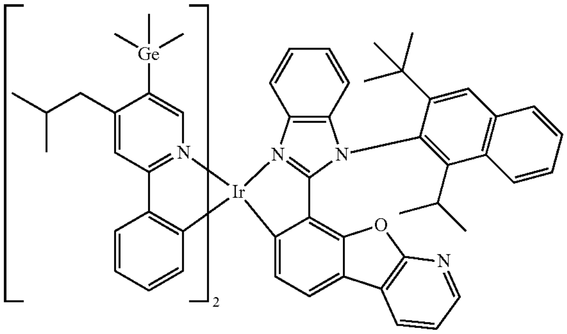
1621
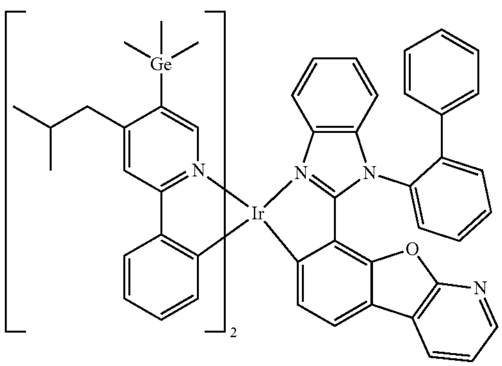
1622
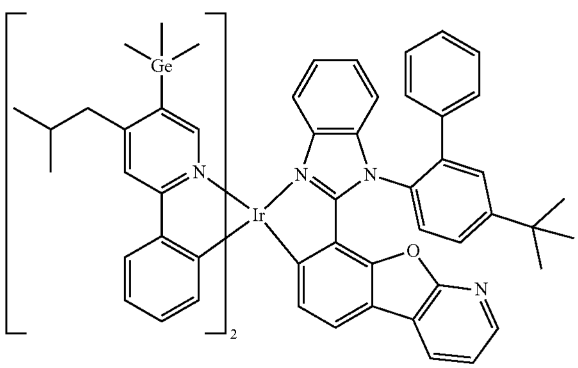
1623
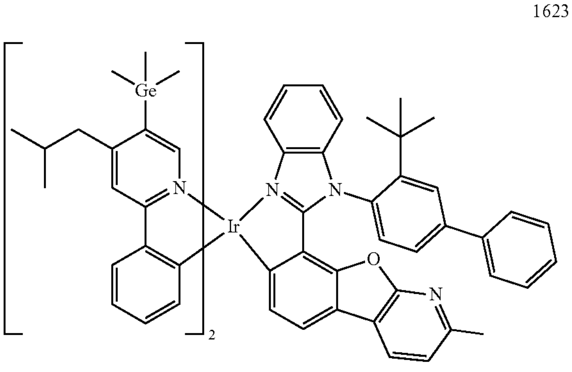
-continued
1624
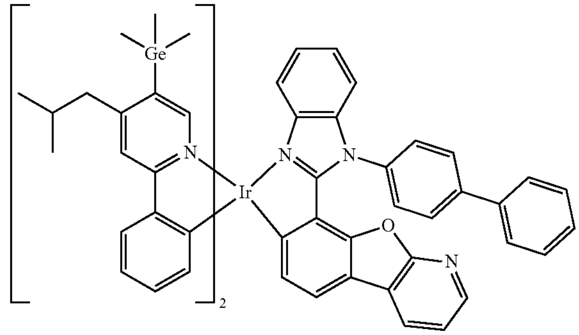
1625
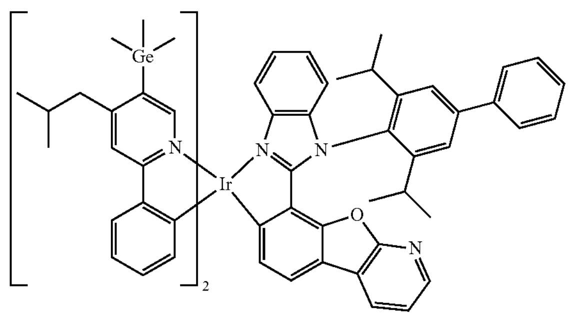
1626
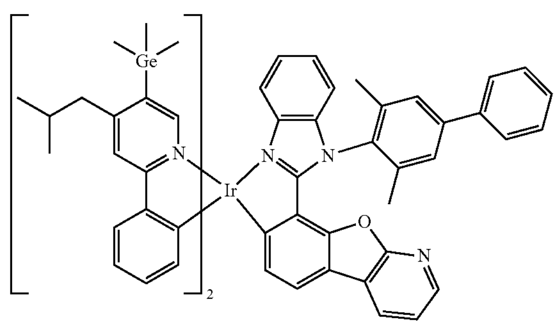
1627
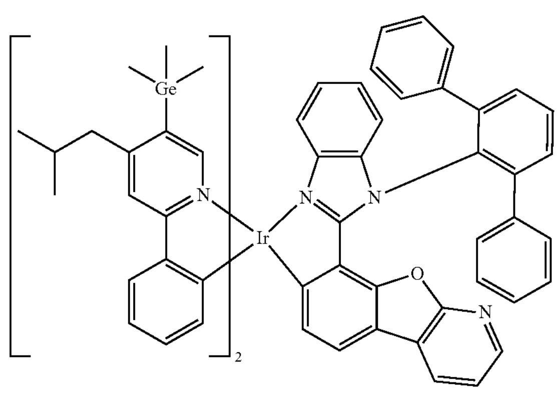

-continued
1628
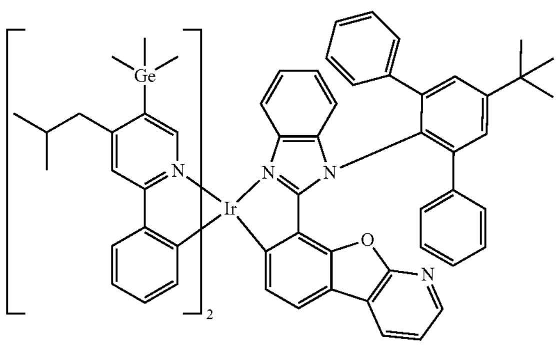
1629
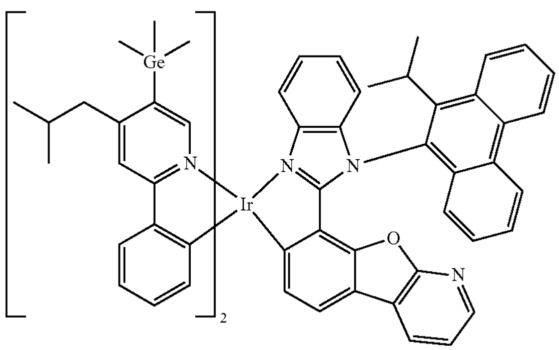
1630
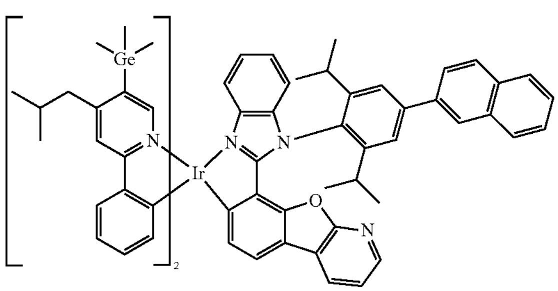
1631
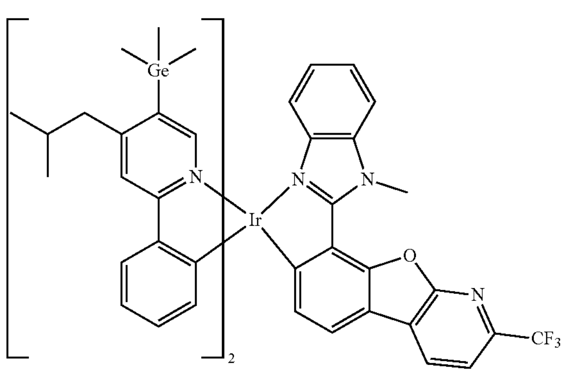
-continued
1632
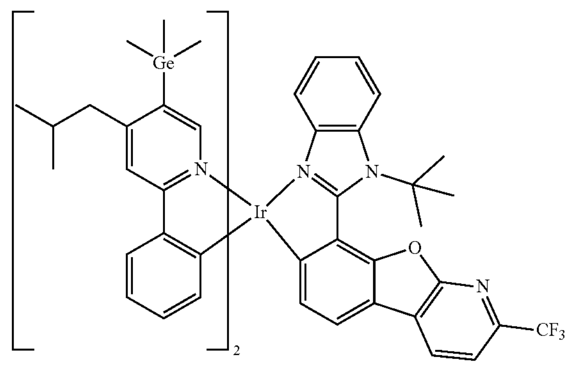
1633
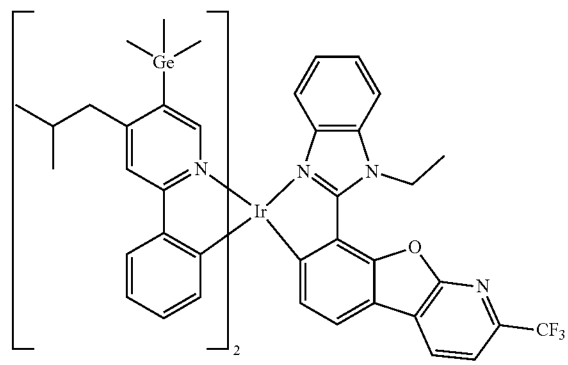
1634
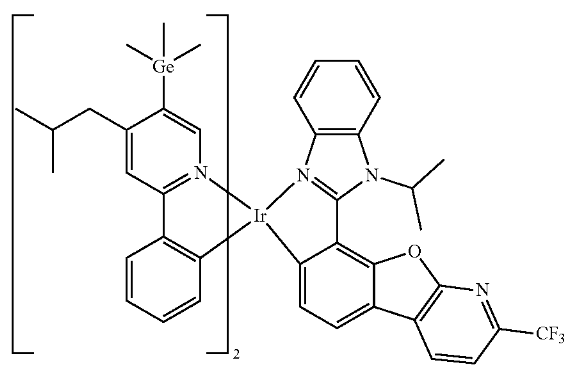
1635
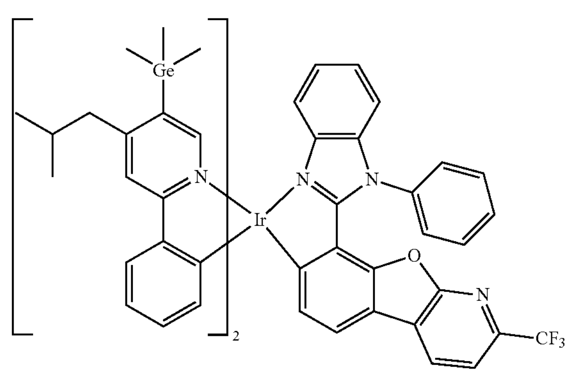

-continued
1636
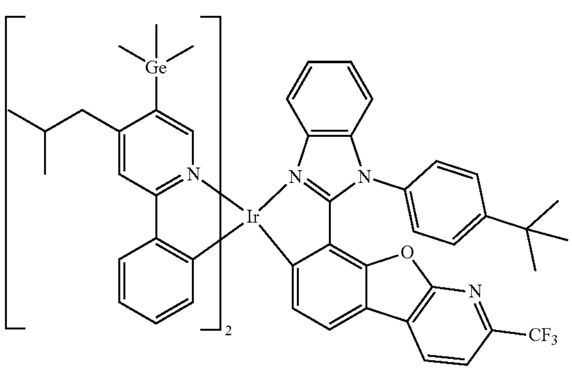
1637
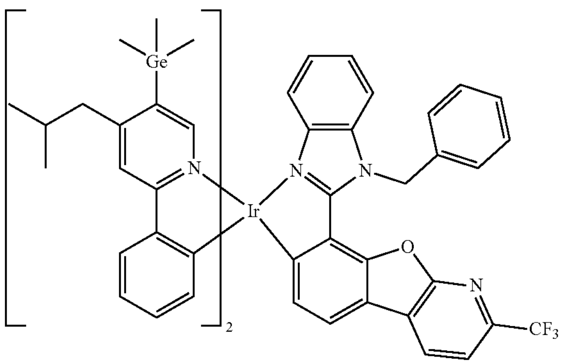
1638
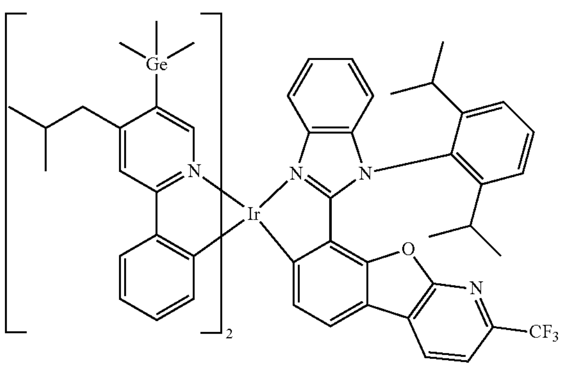
1639
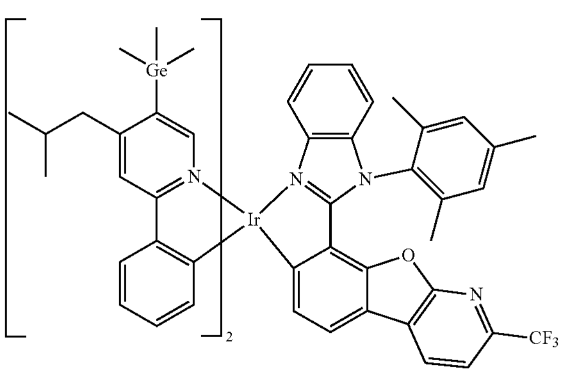
-continued
1640
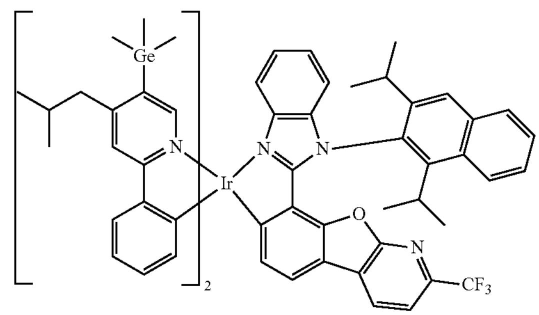
1641
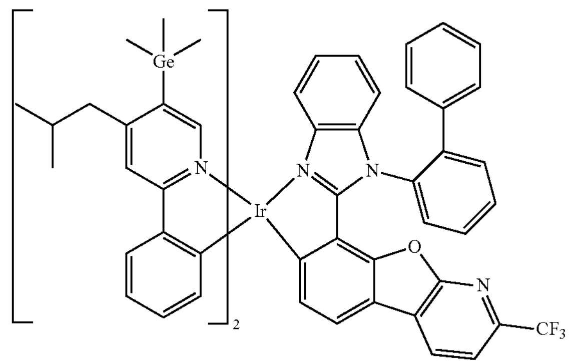
1642
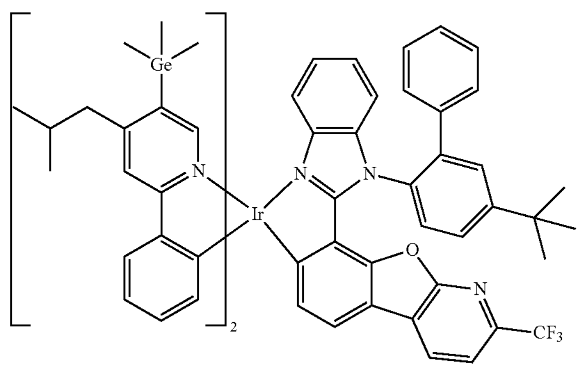
1643
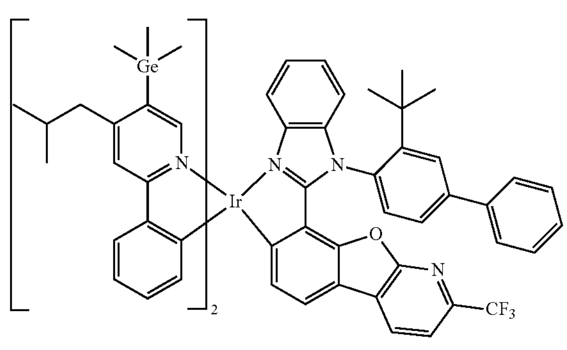

1644
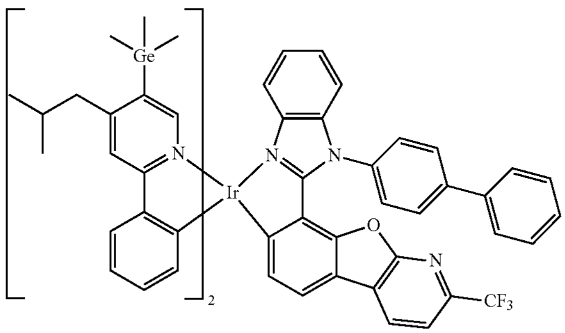
1645
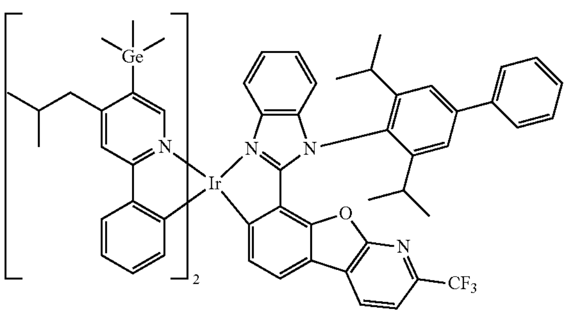
1646
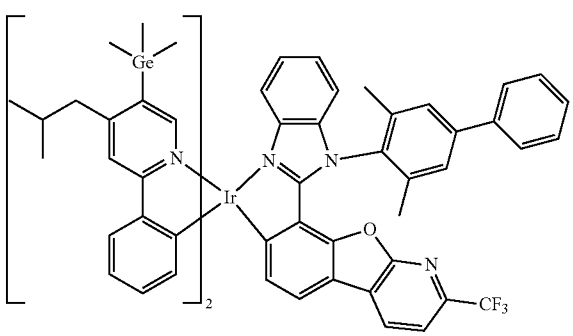
1647
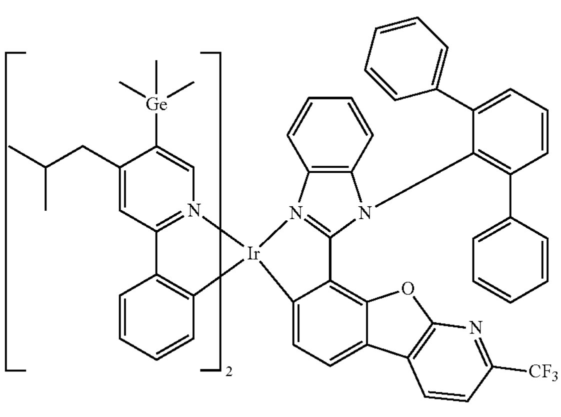
1648
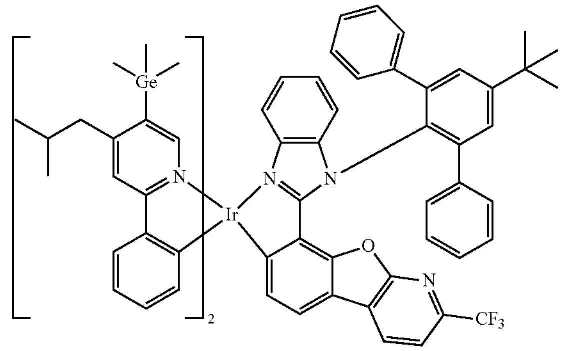
1649
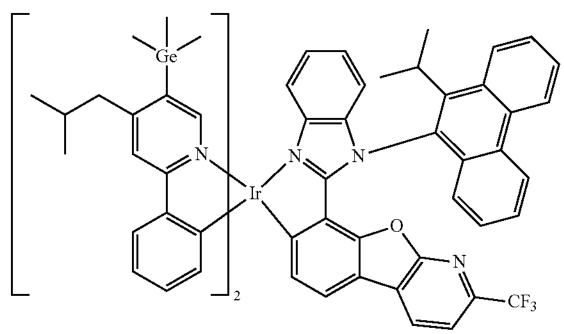
1650
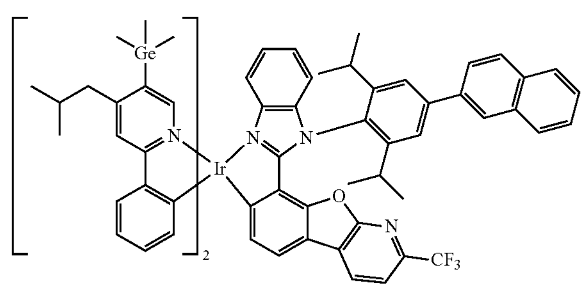
1651
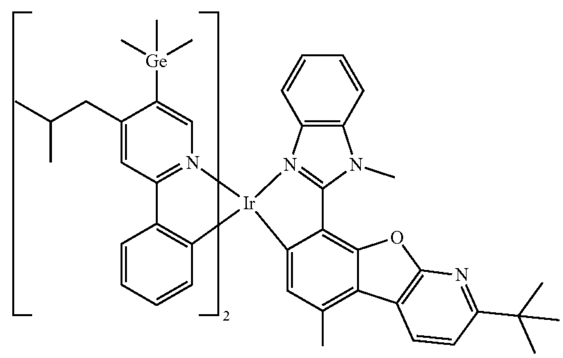

-continued
1652
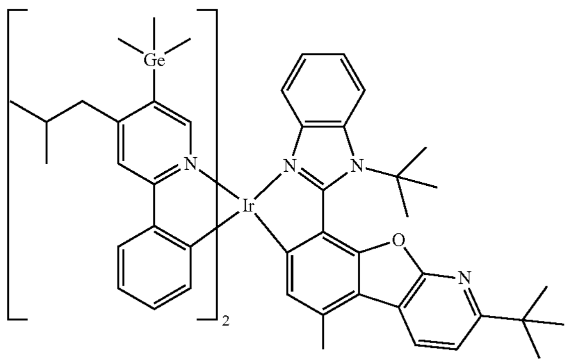
1653
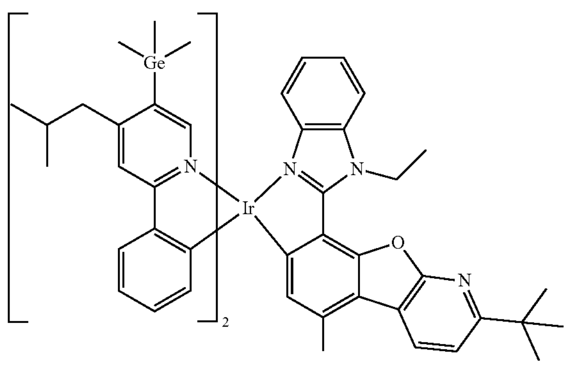
1654
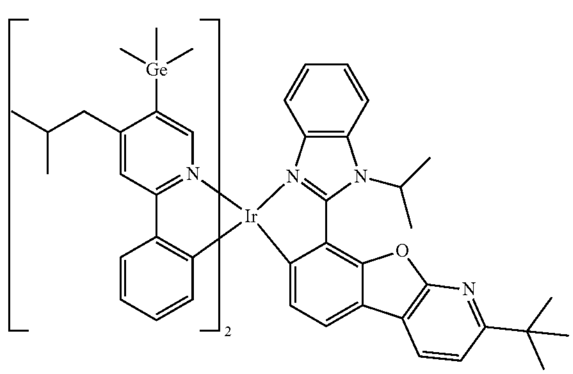
1655
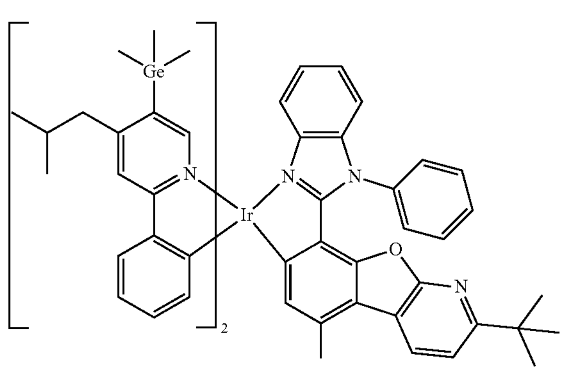
-continued
1656
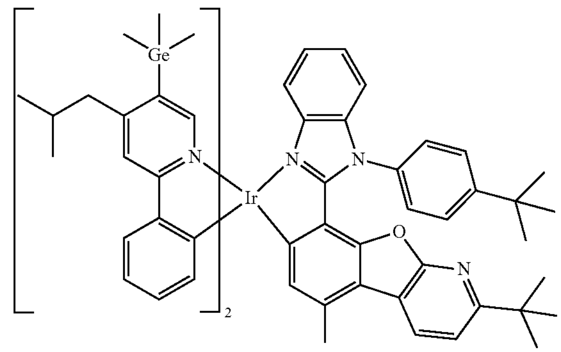
1657
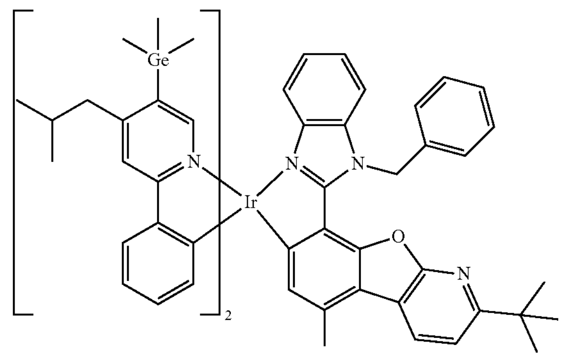
1658
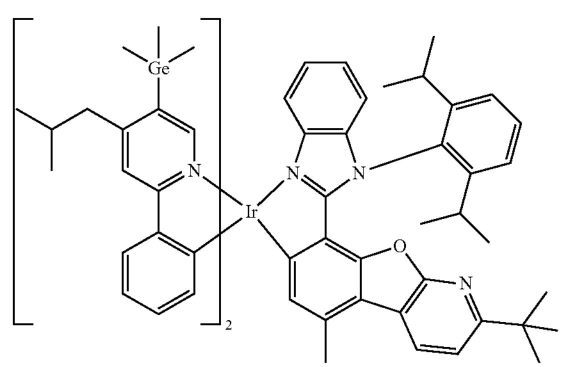
1659
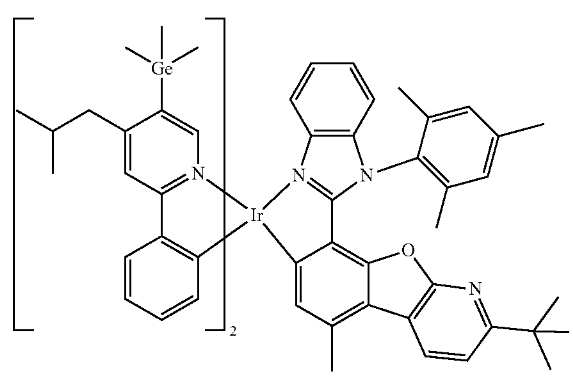

1660
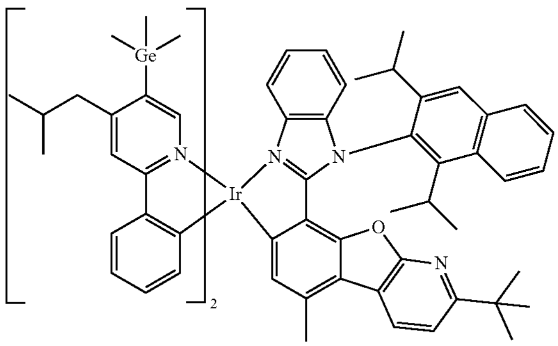
1661
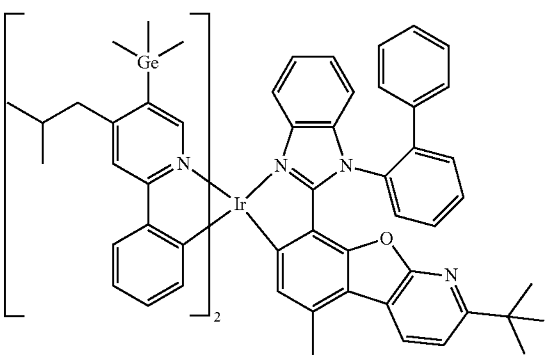
1662
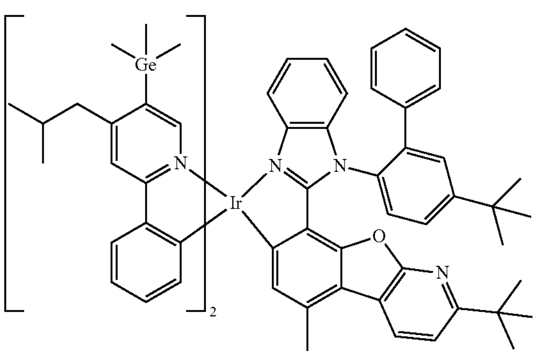
1663
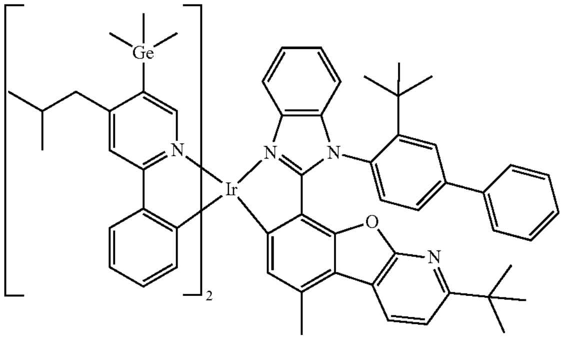
1664
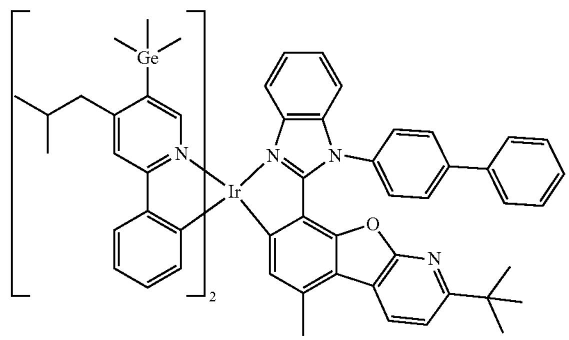
1665
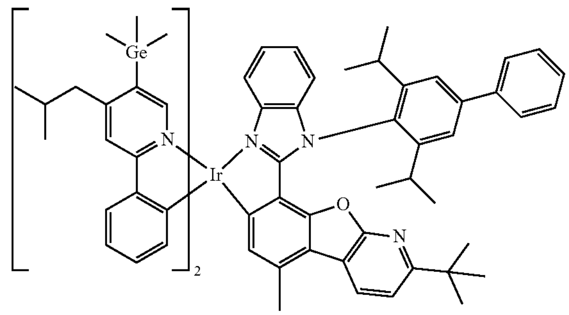
1666
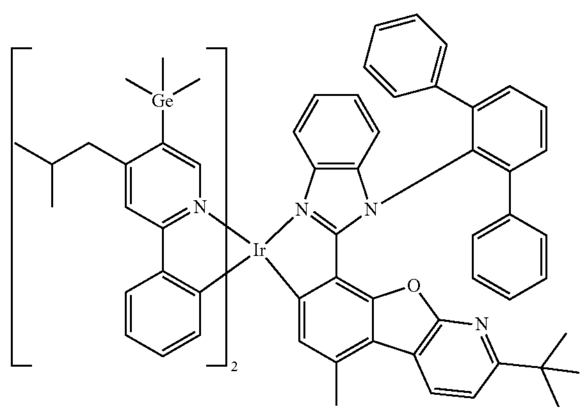
1667
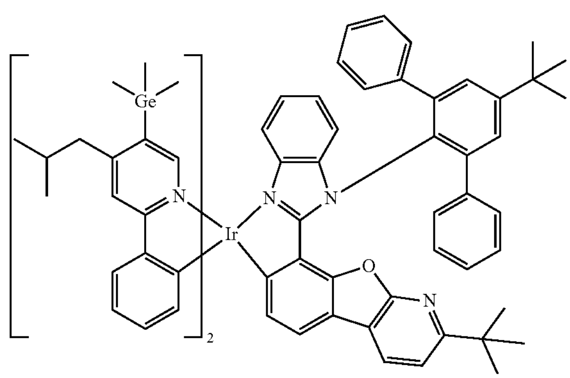

-continued
1668
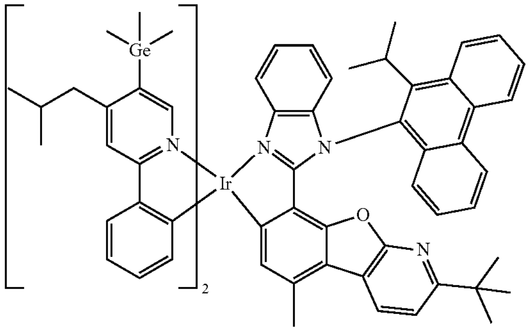
1669
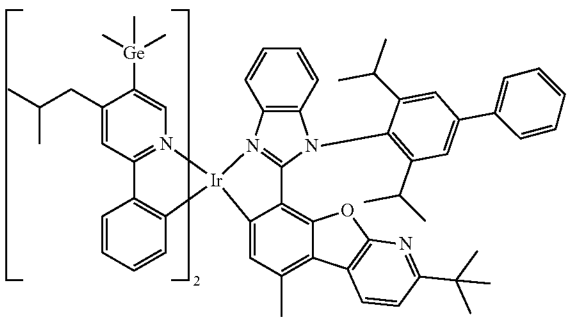
1670
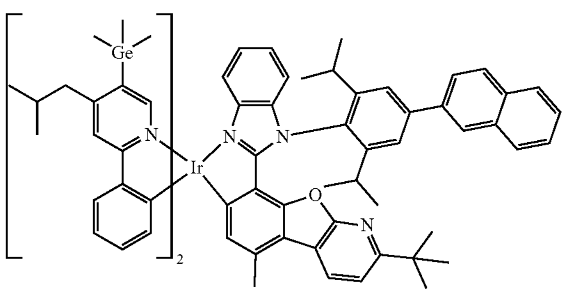
1671
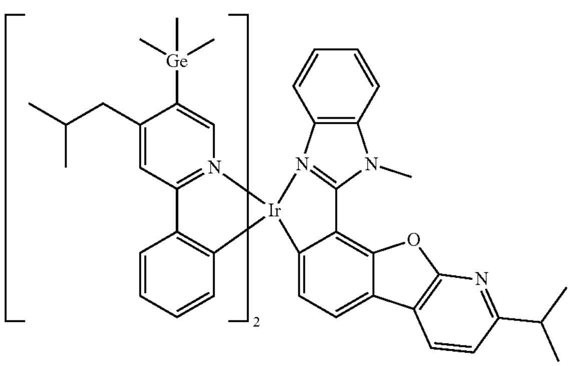
-continued
1672
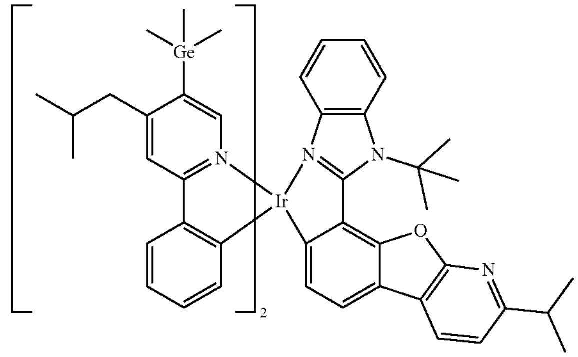
1673
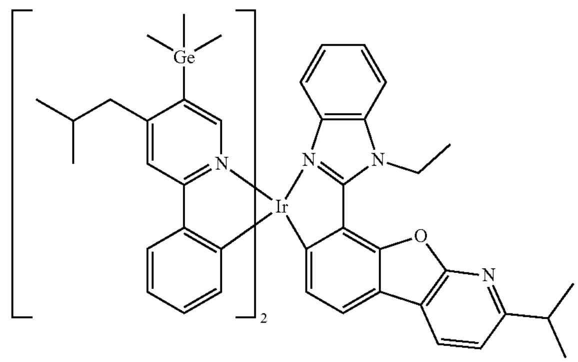
1674
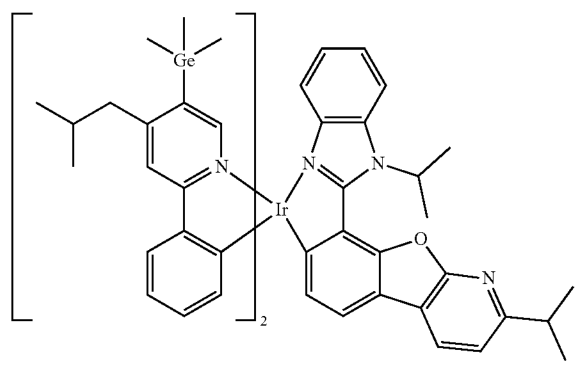
1675
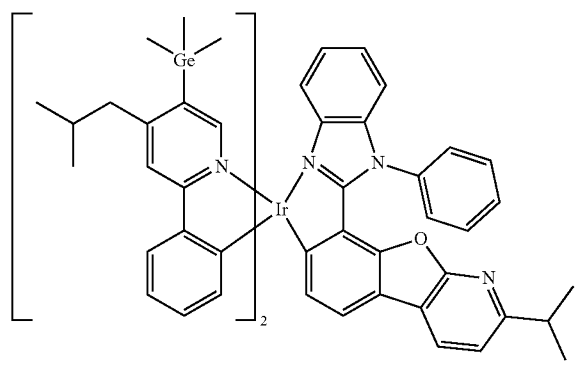

-continued
1676
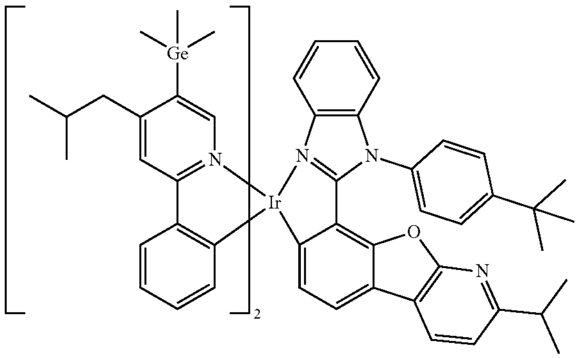
1677
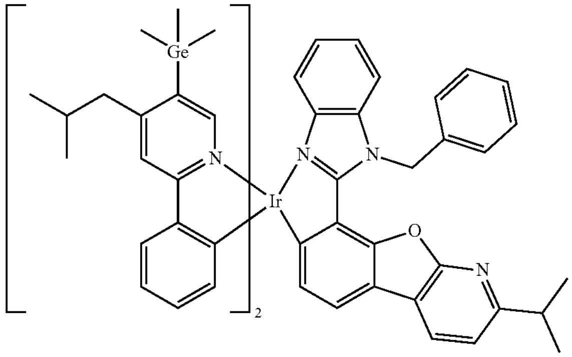
1678
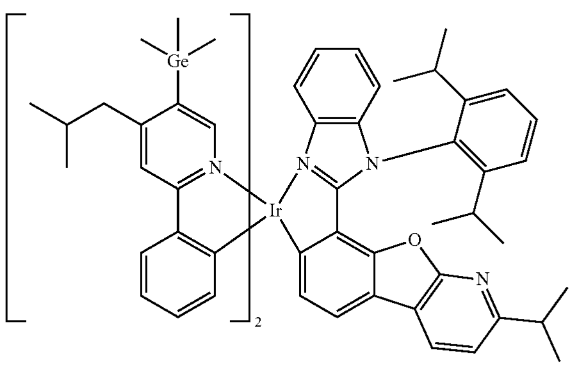
1679
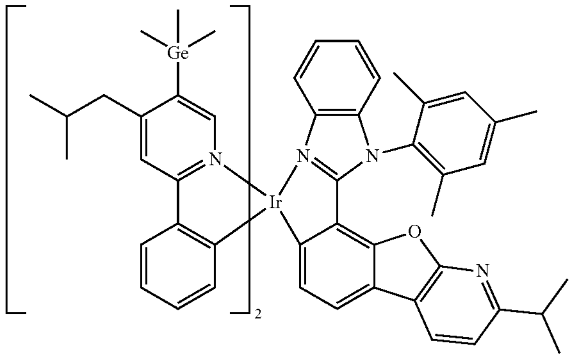
-continued
1680
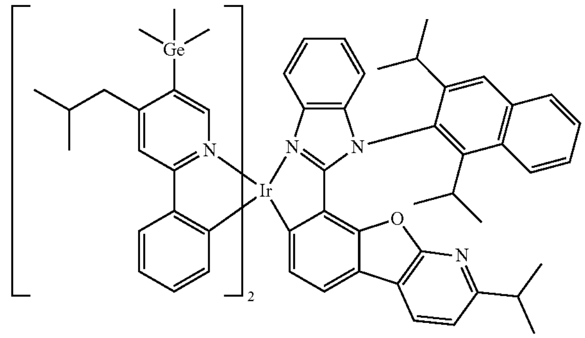
1681
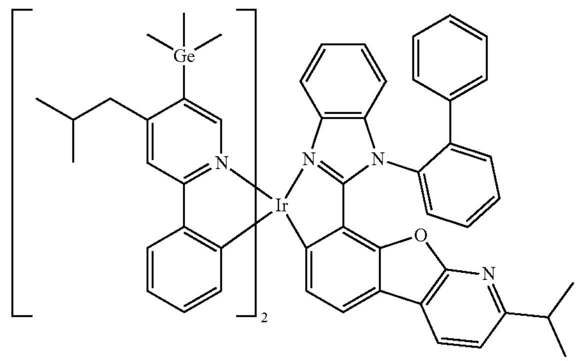
1682
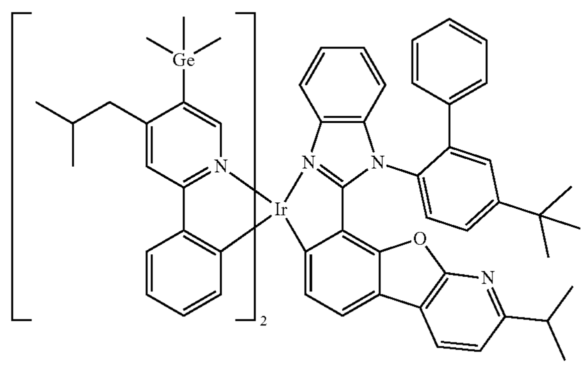
1683
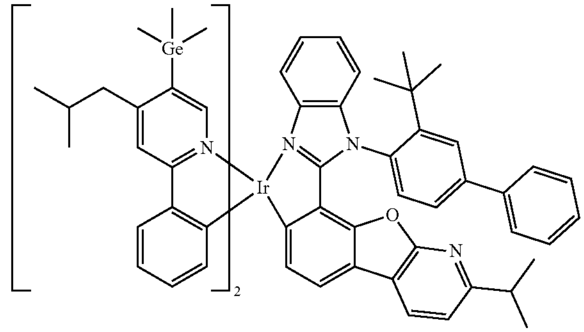

-continued
1684
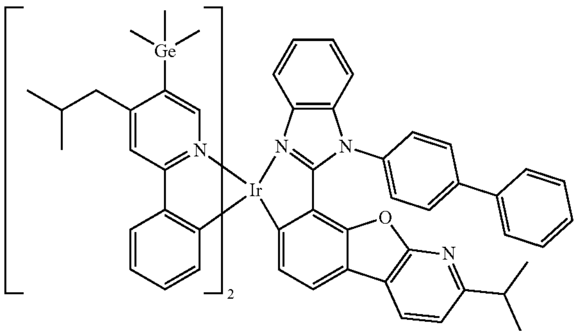
1685
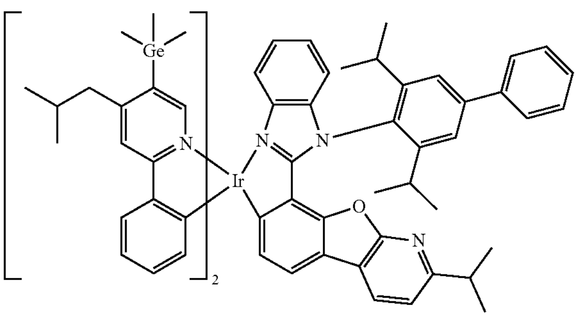
1686
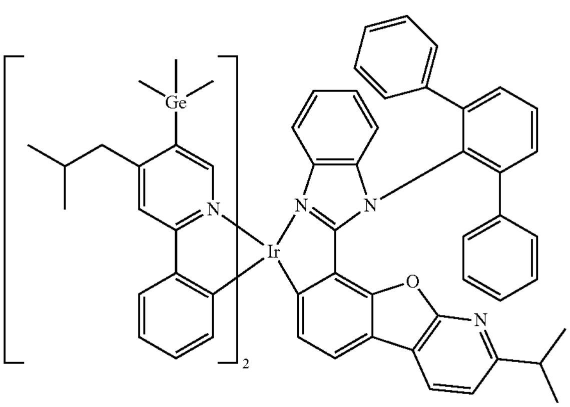
1687
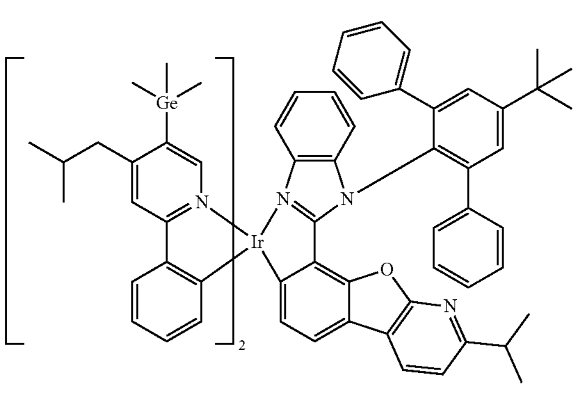
-continued
1688
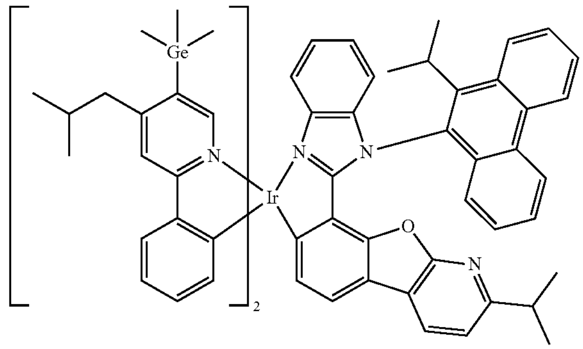
1689
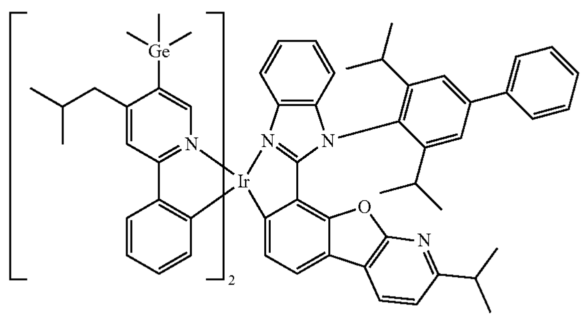
1690
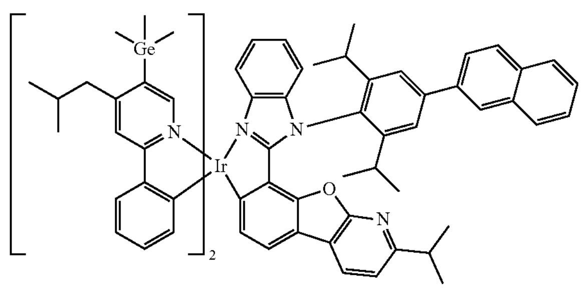
1691
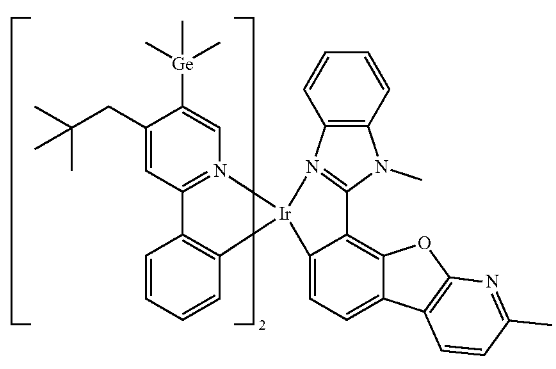

-continued
1692
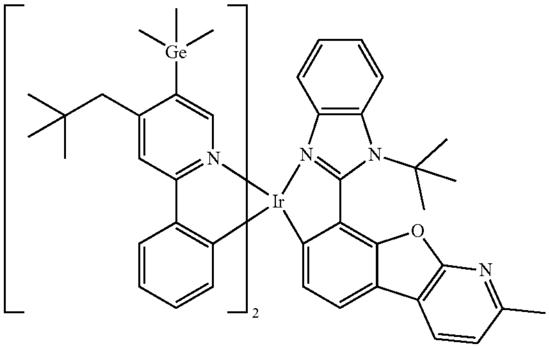
1693
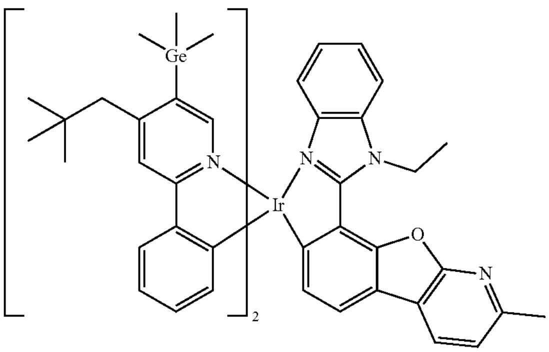
1694
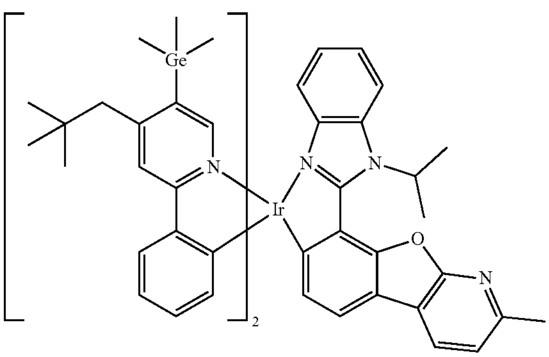
1695
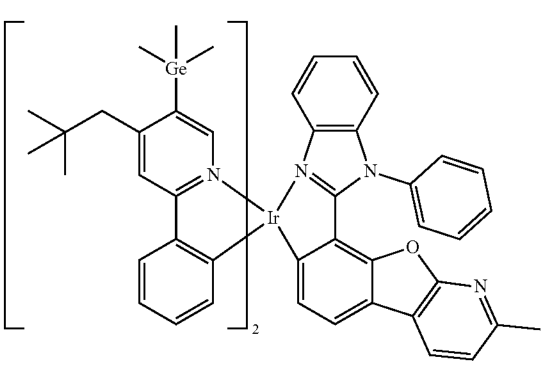
-continued
1696
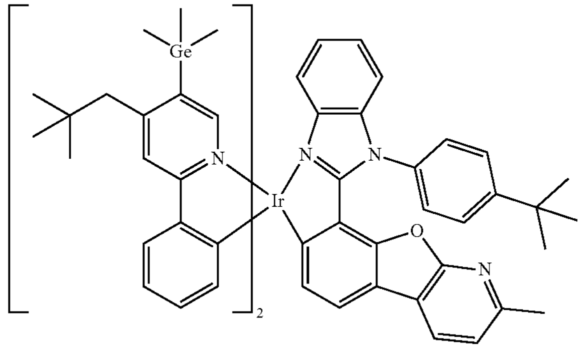
1697
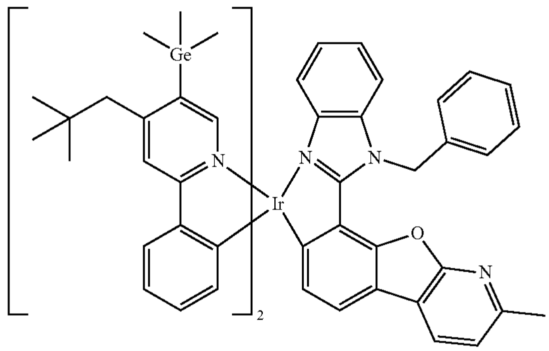
1698
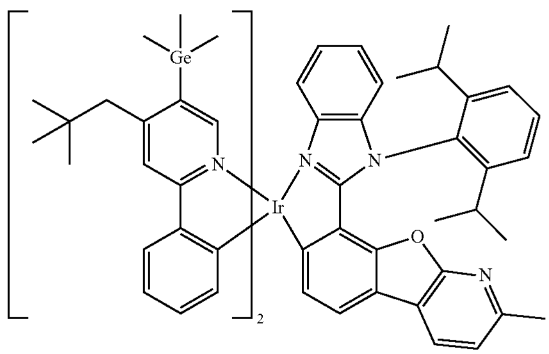
1699
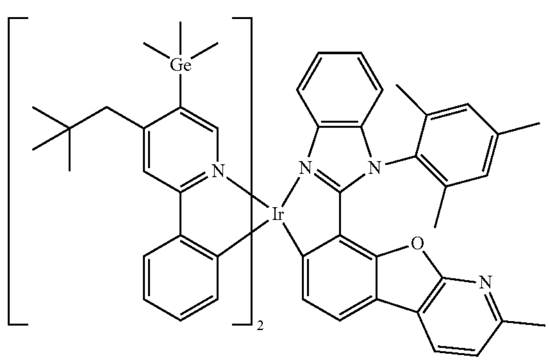

-continued
1700
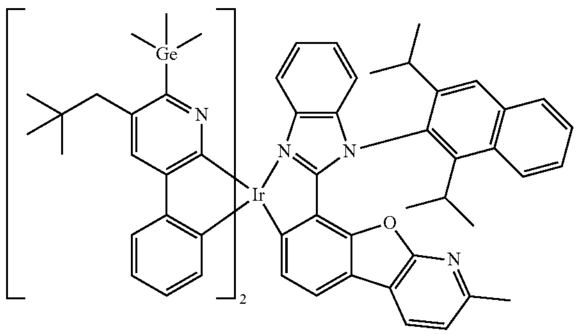
1701
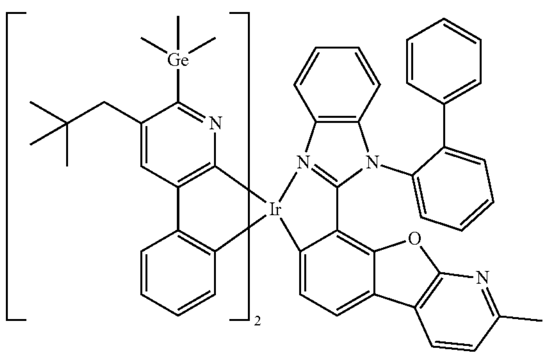
1702
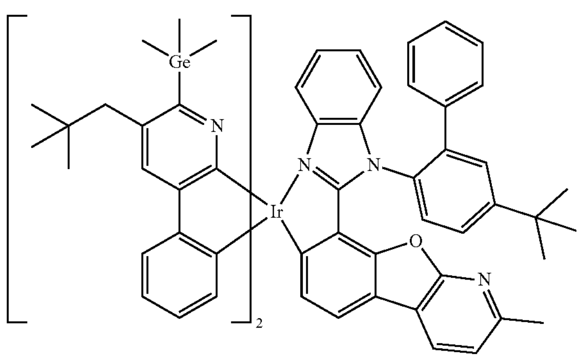
1703
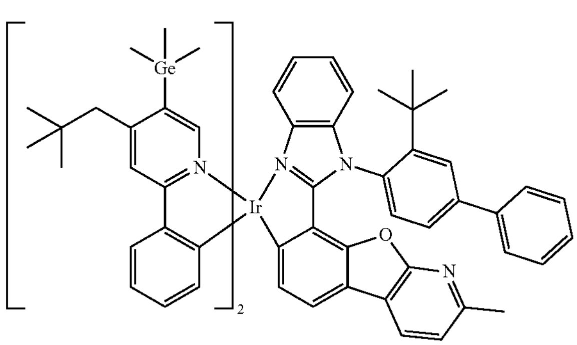
-continued
1704
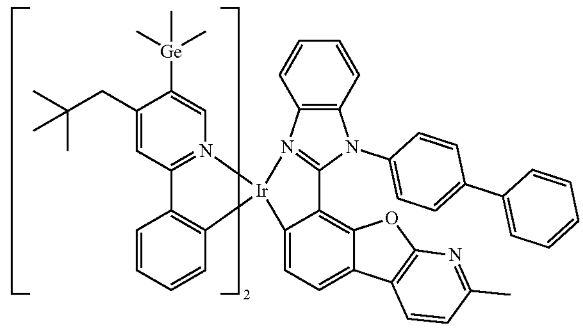
1705
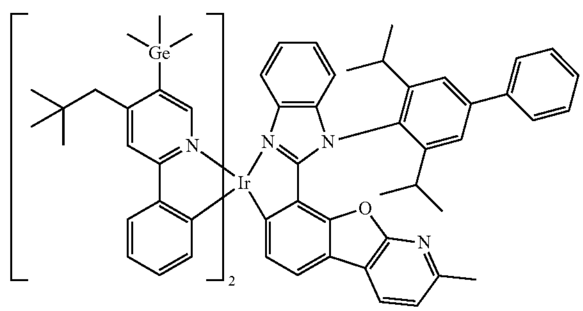
1706
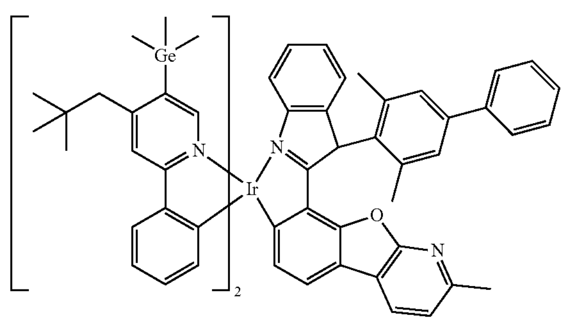
1707
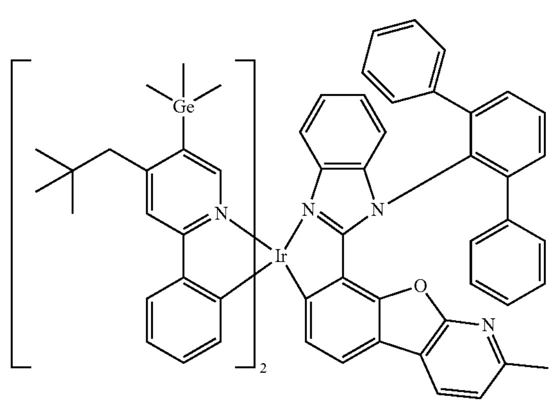

-continued
1708
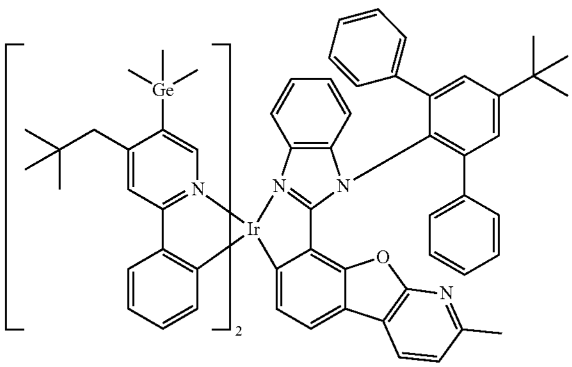
1709
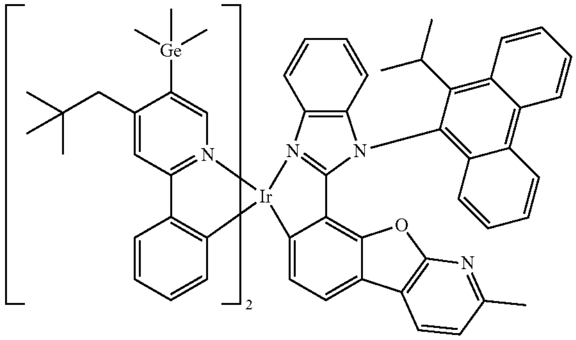
1710
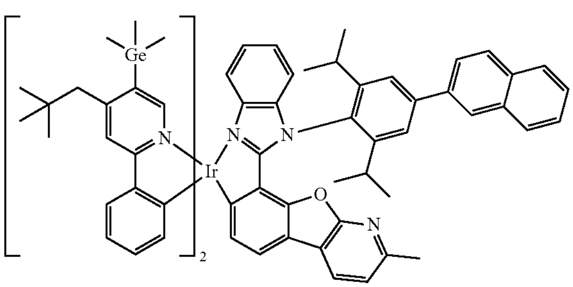
1711
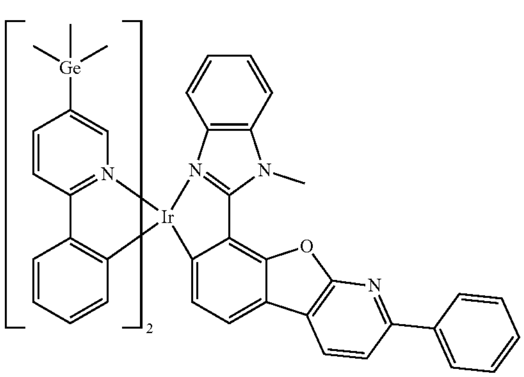
-continued
1712
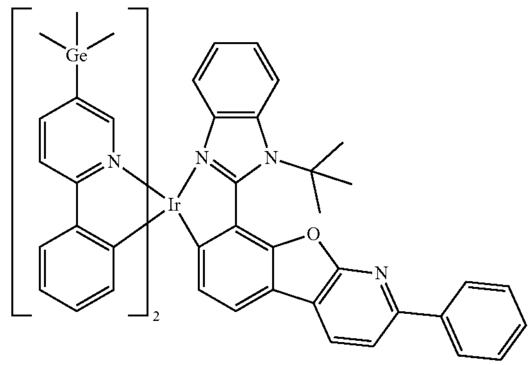
1713
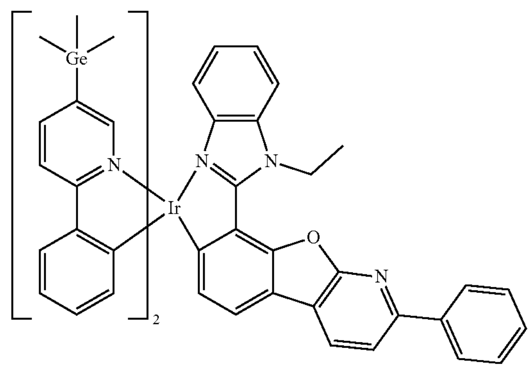
1714
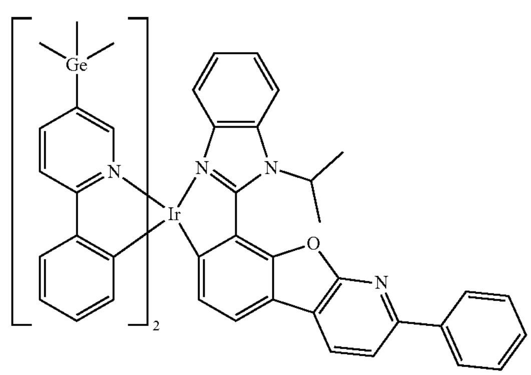
1715
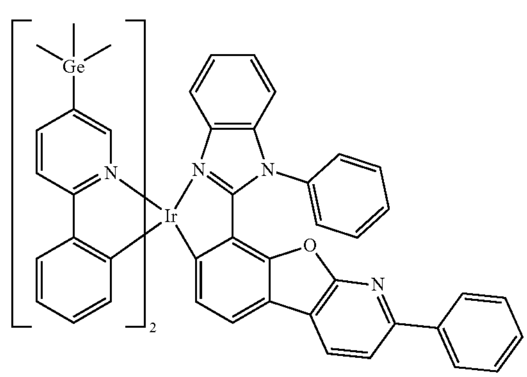

-continued
1716
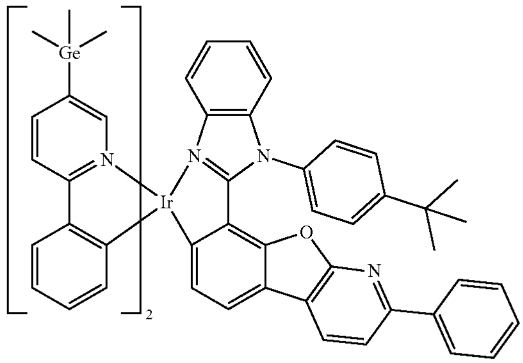
1717
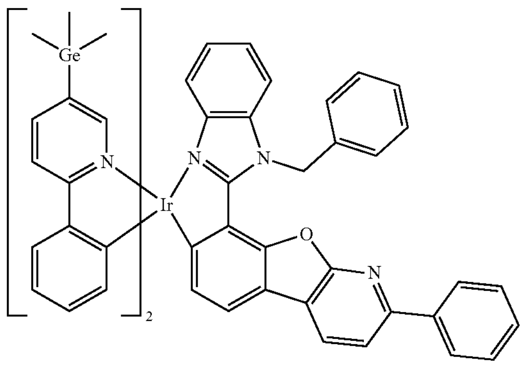
1718
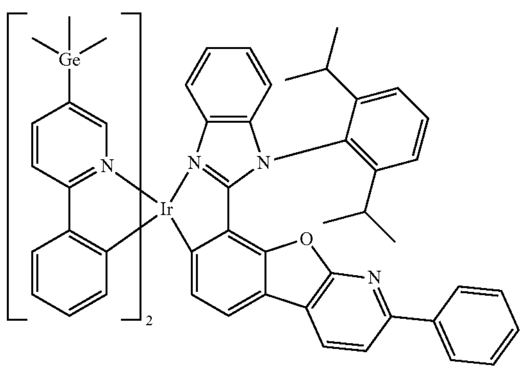
1719
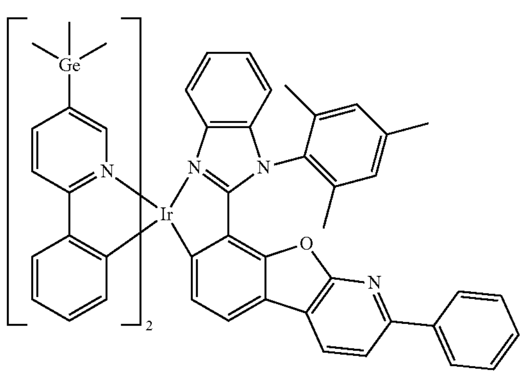
-continued
1720
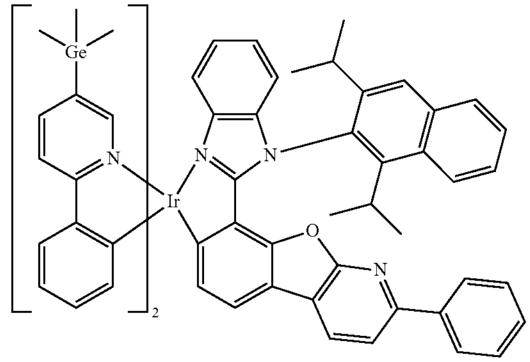
1721
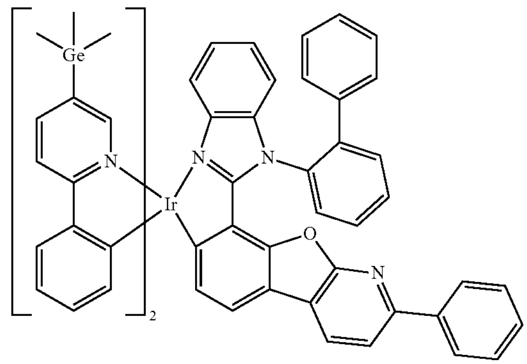
1722
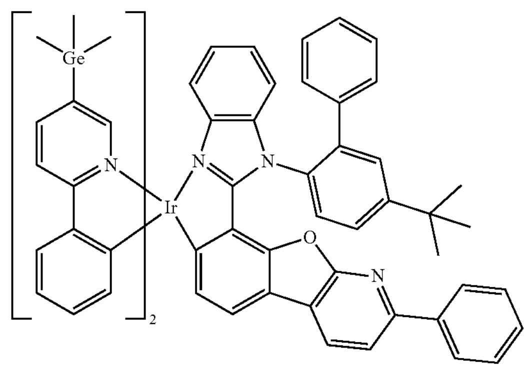
1723
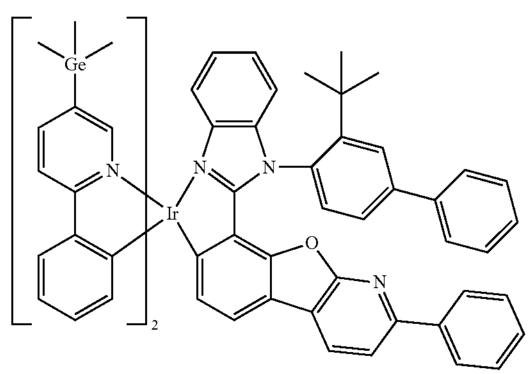

-continued
1724
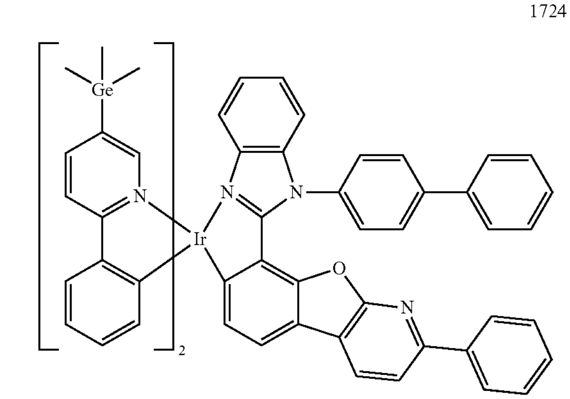
1725
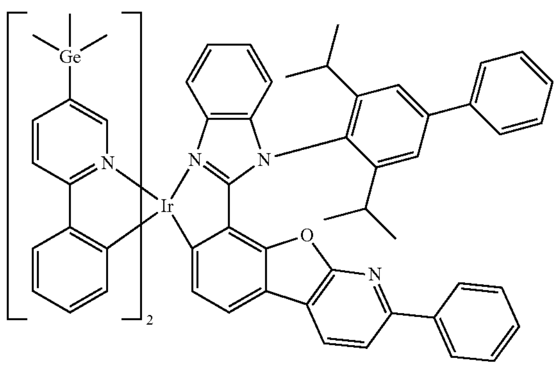
1726
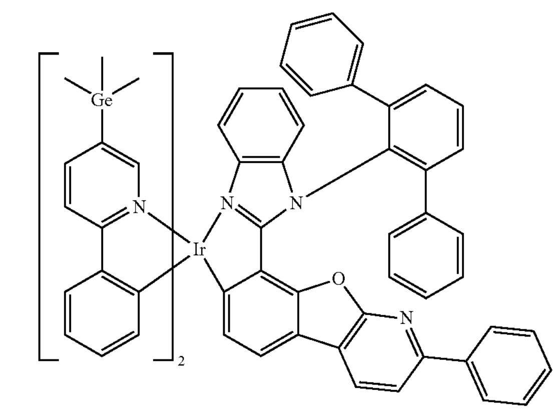
1727
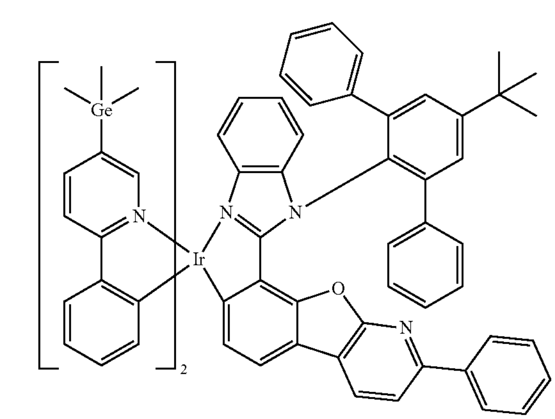
-continued
1728
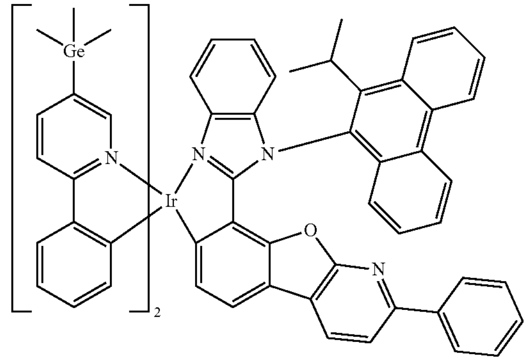
1729
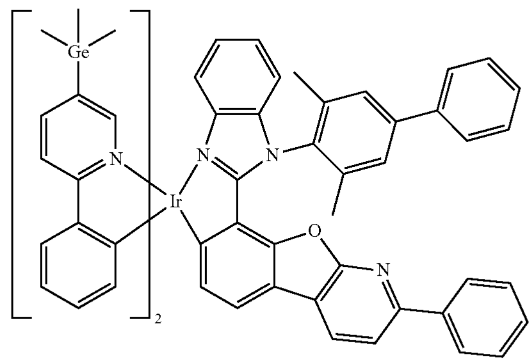
1730
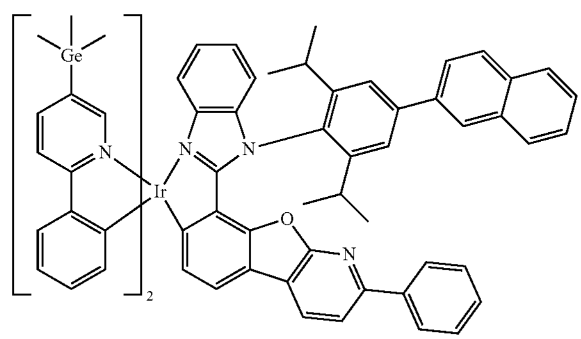
1731
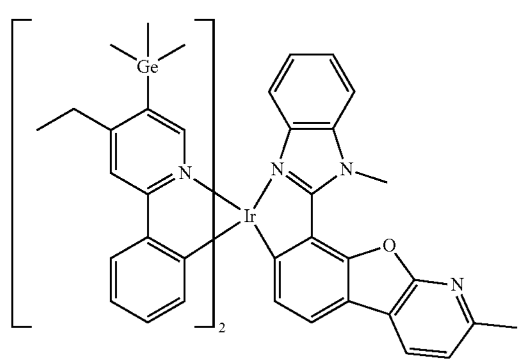

-continued
1732
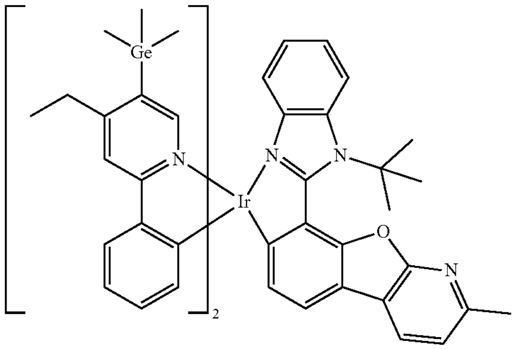
1733
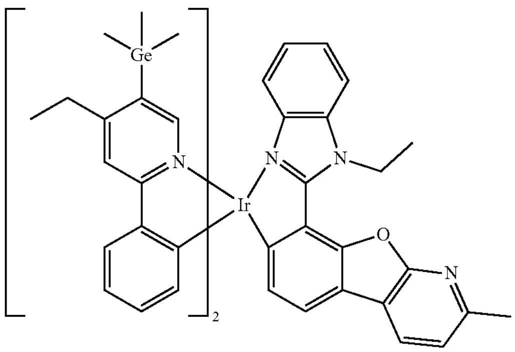
1734
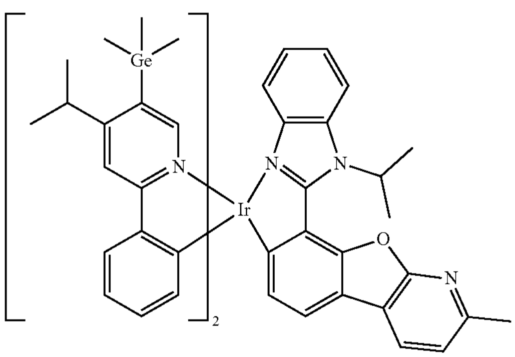
1735
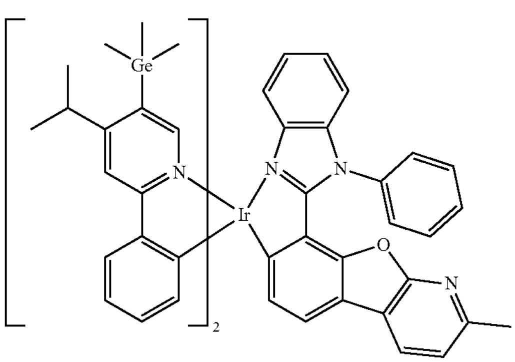
-continued
1736
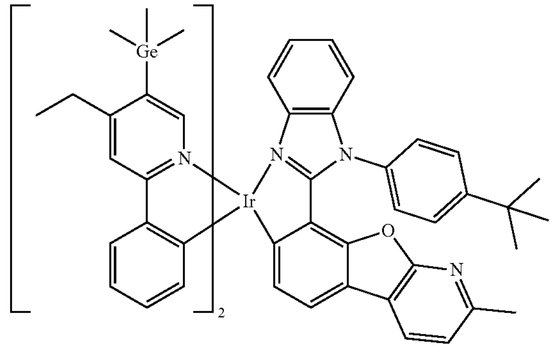
1737
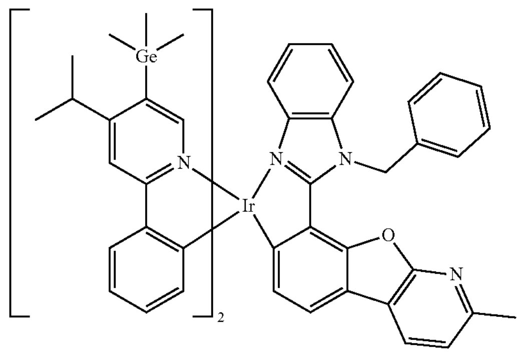
1738
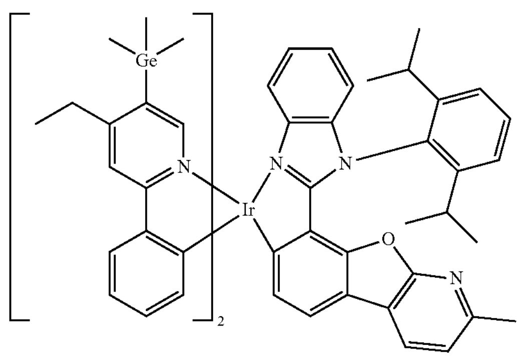
1739
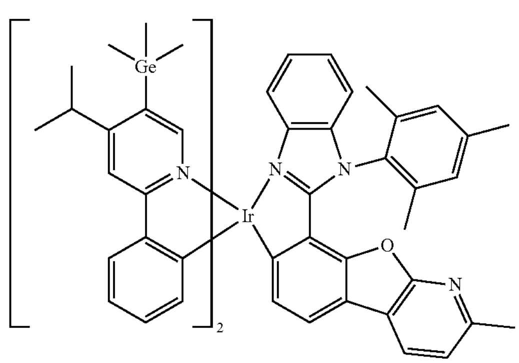

1740
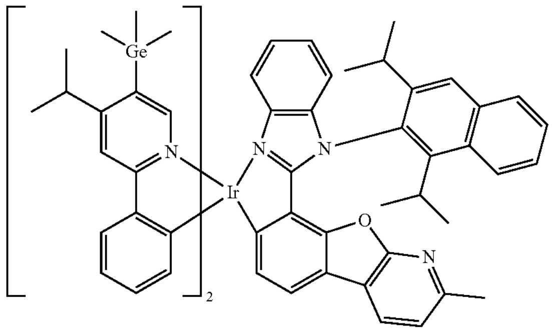
1741
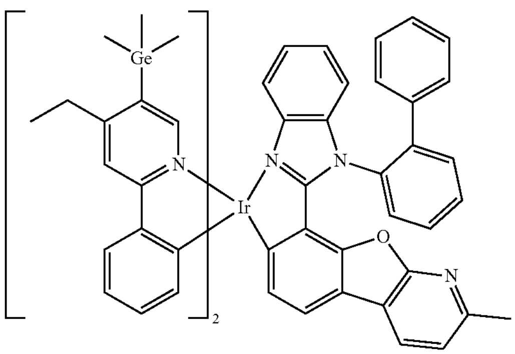
1742
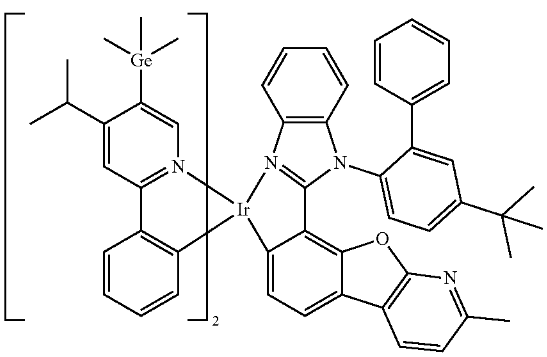
1743
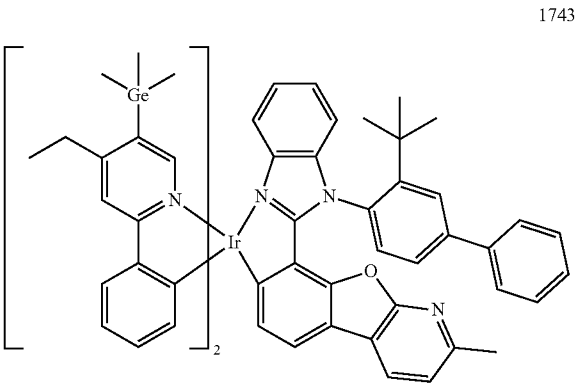
1744
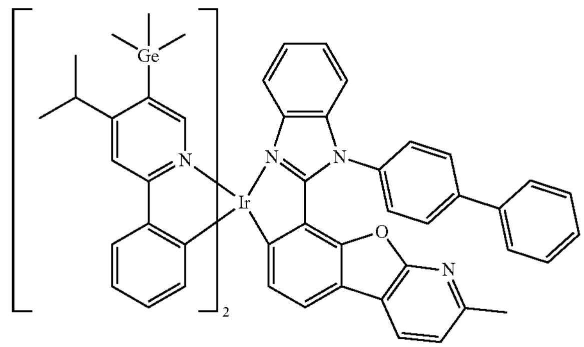
1745
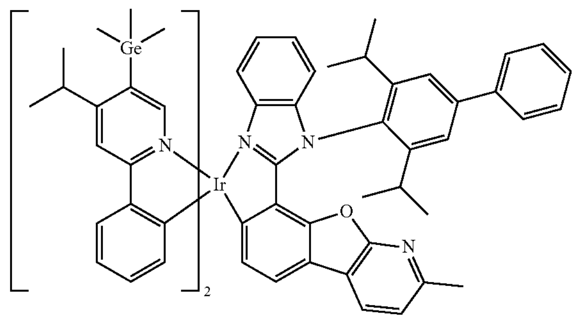
1746
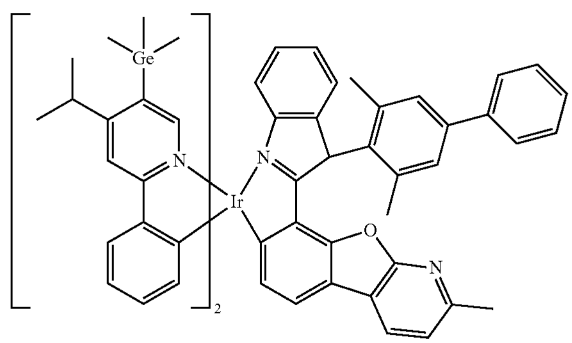
1747
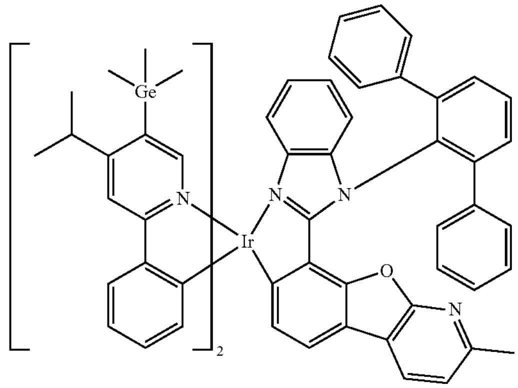

-continued
1748
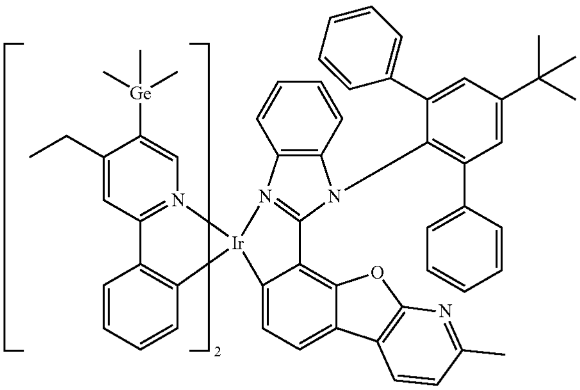
1749
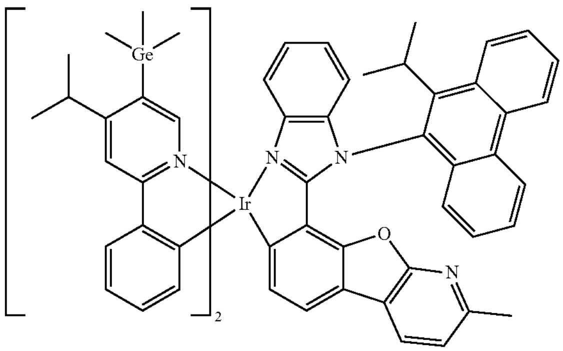
1750
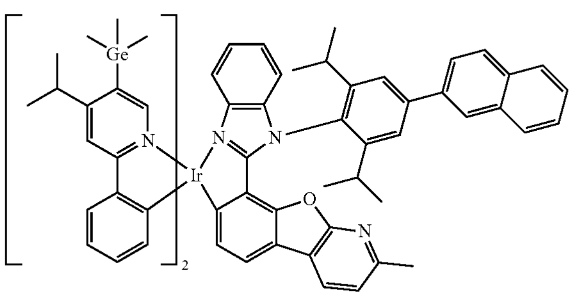
1751
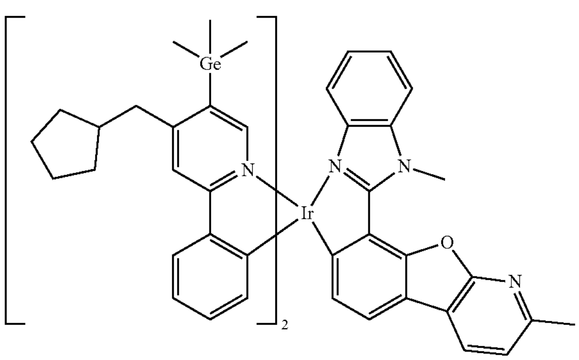
-continued
1752
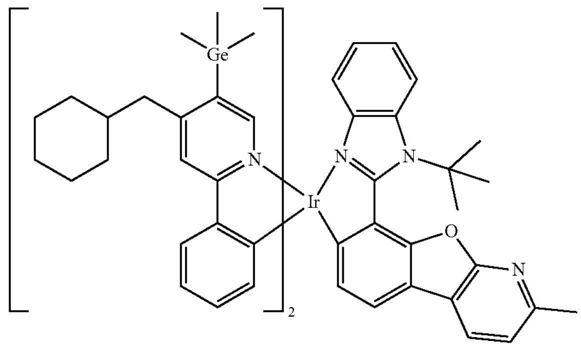
1753
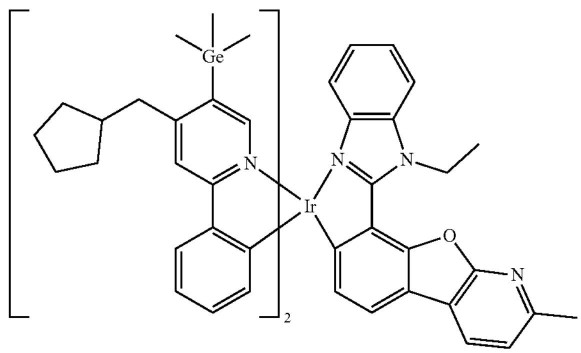
1754
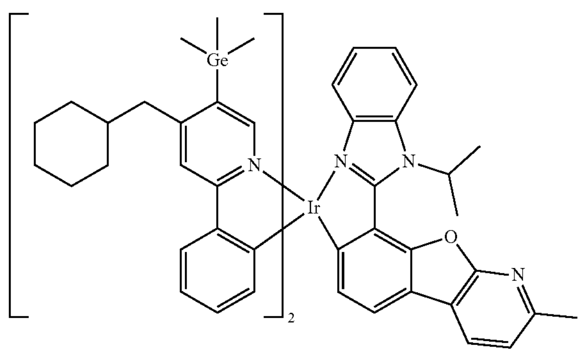
1755
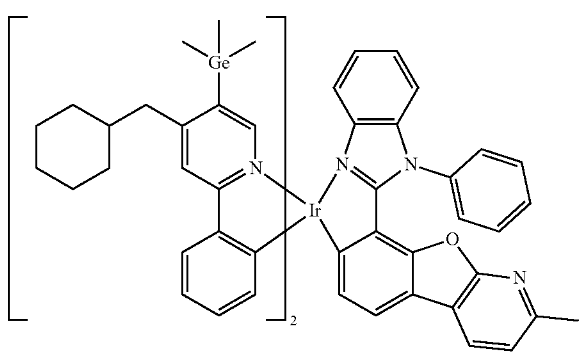

-continued
1756
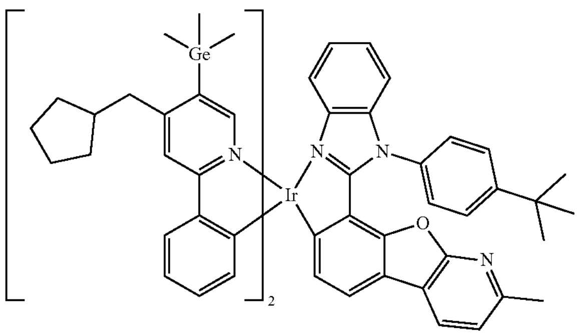
1757
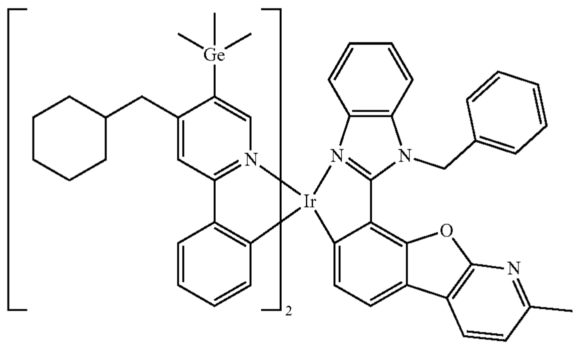
1758
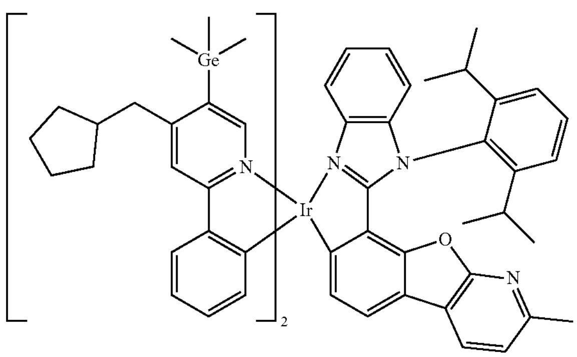
1759
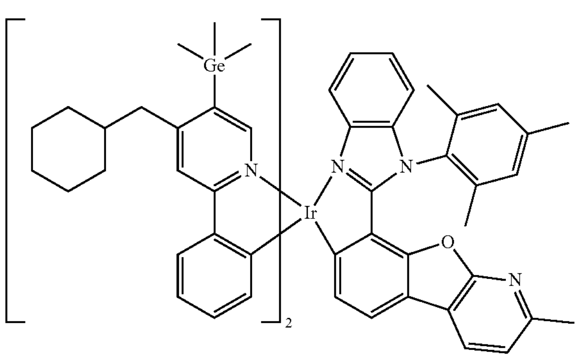
-continued
1760
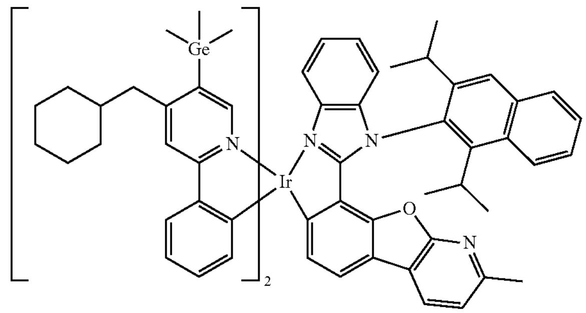
1761
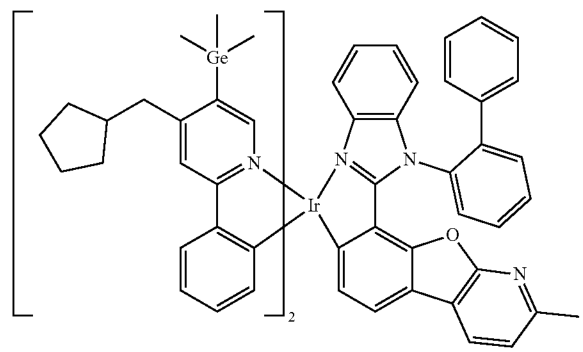
1762
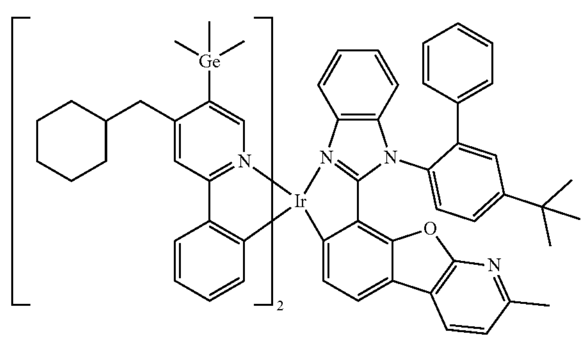
1763
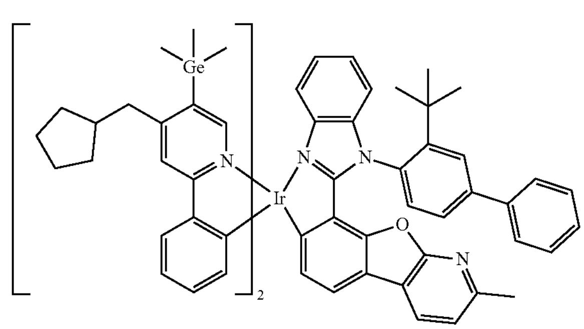

-continued
1764
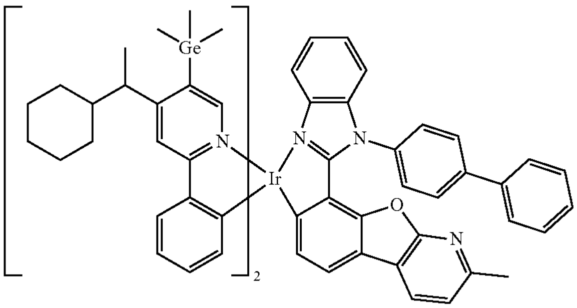
1765
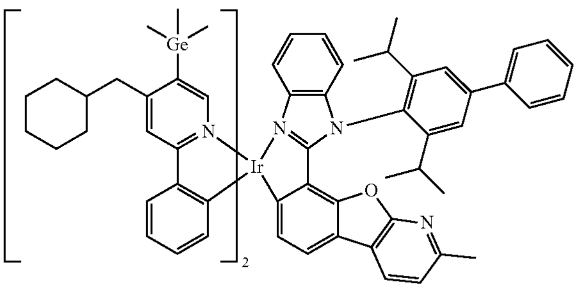
1766
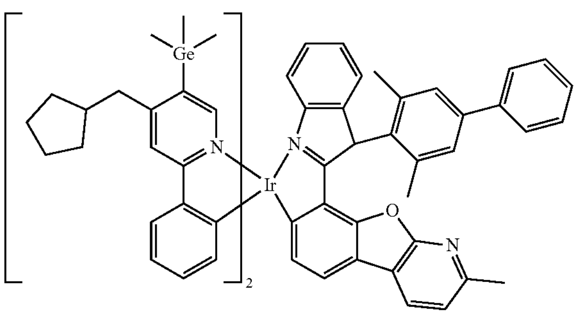
1767
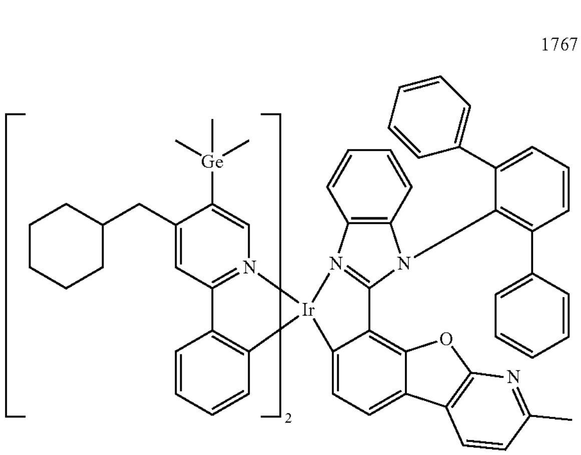
-continued
1768
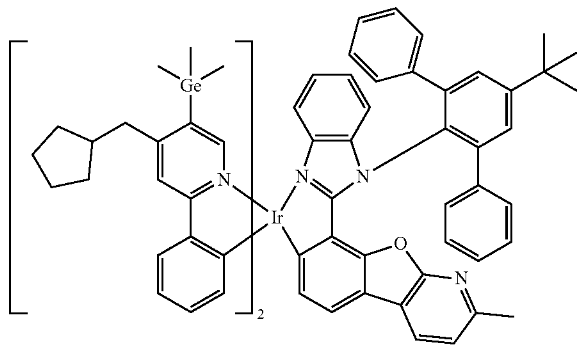
1769
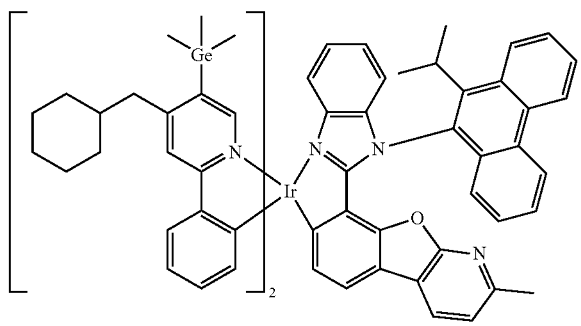
1770
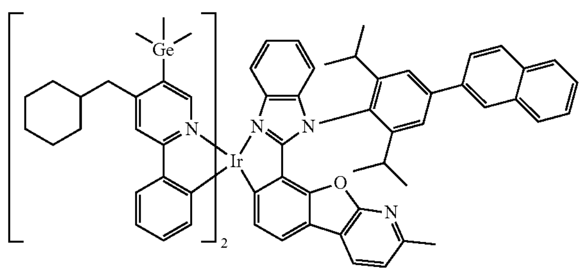
1771
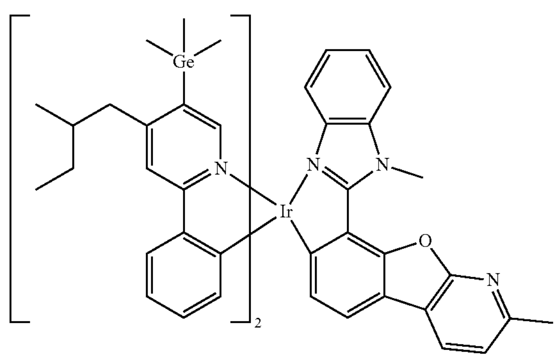

-continued
1772
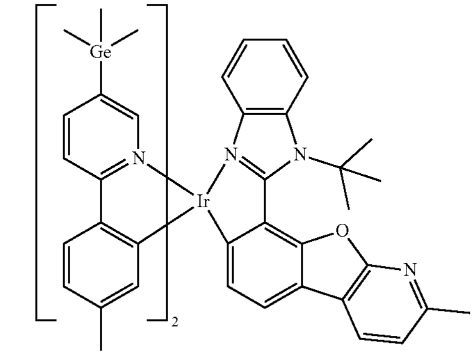
1773
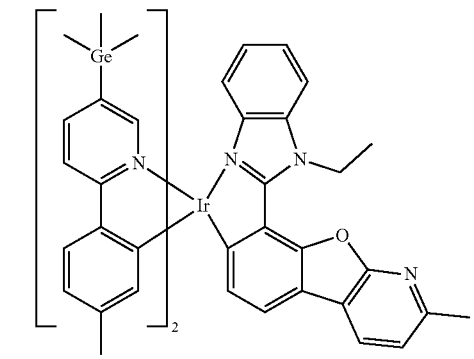
1774
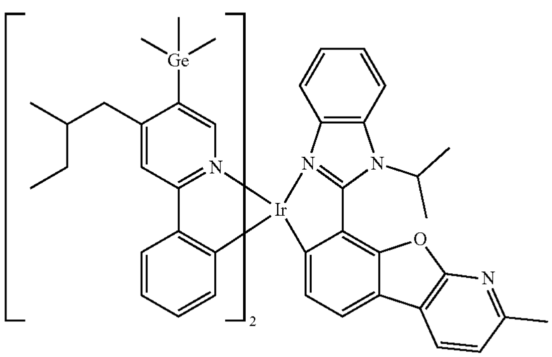
1775
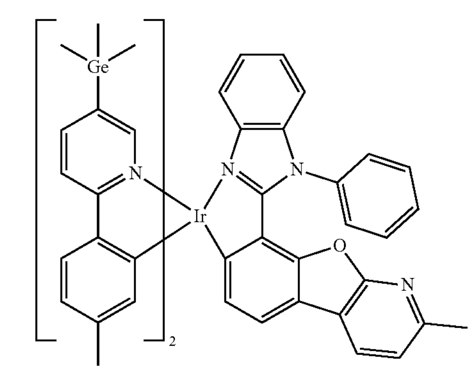
-continued
1776
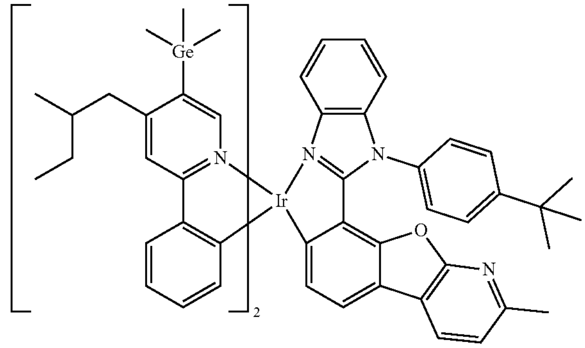
1777
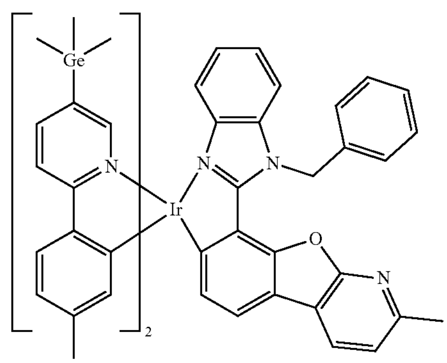
1778
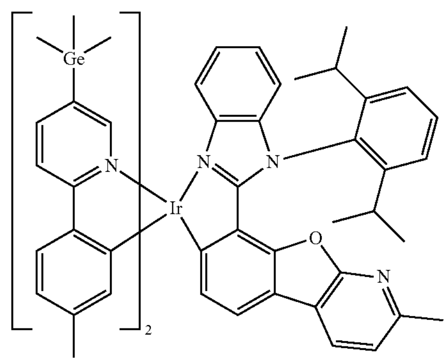
1779
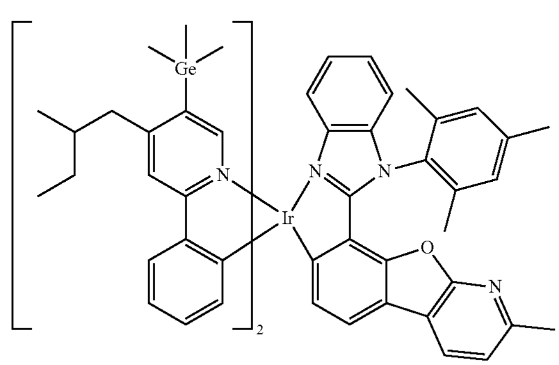

-continued
1780
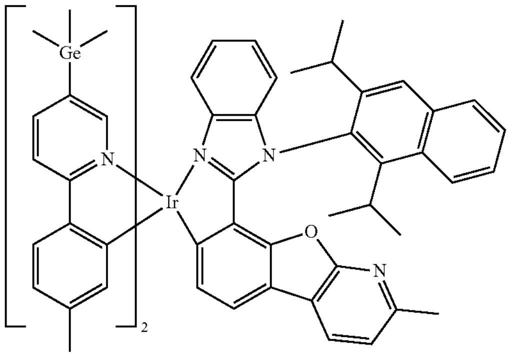
1781
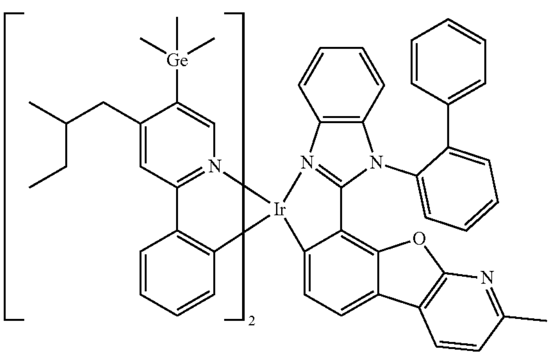
1782
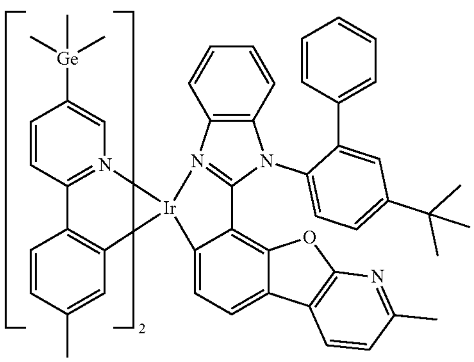
1783
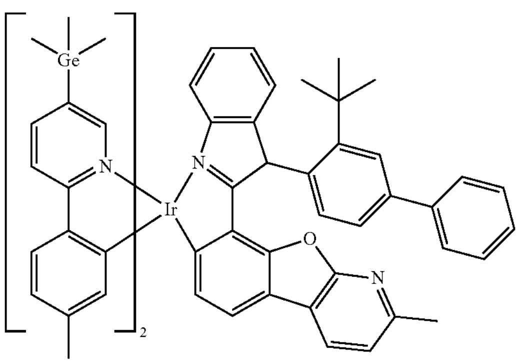
-continued
1784
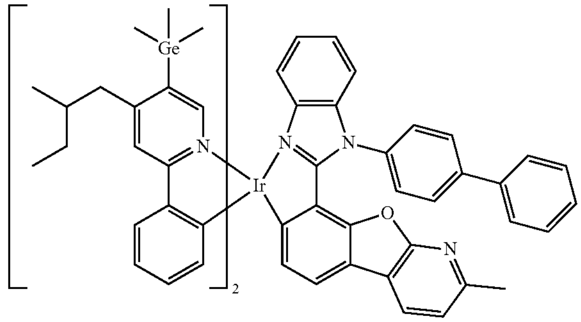
1785
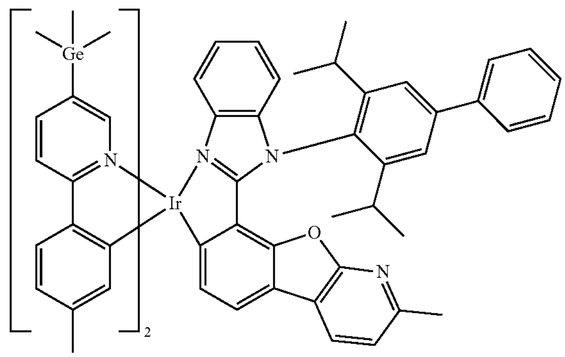
1786
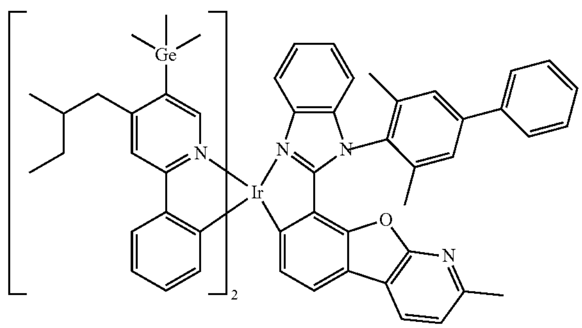
1787
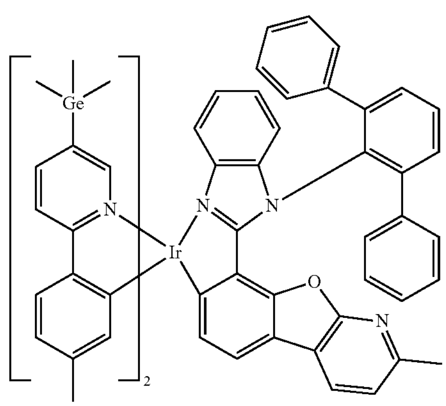

-continued
1788
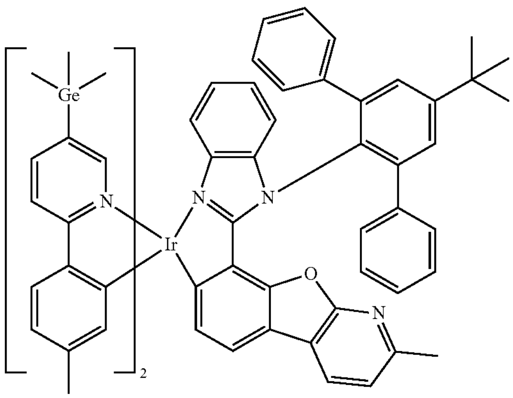
1789
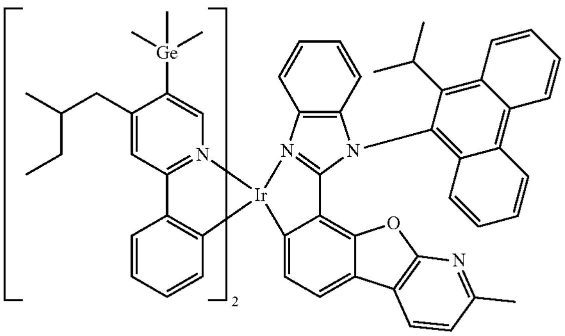
1790
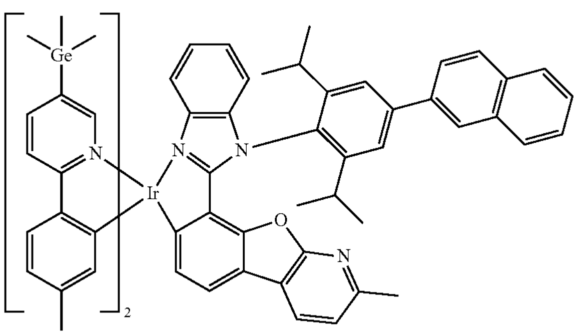
1791
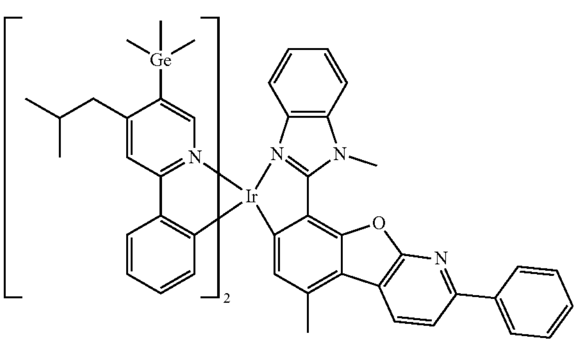
-continued
1792
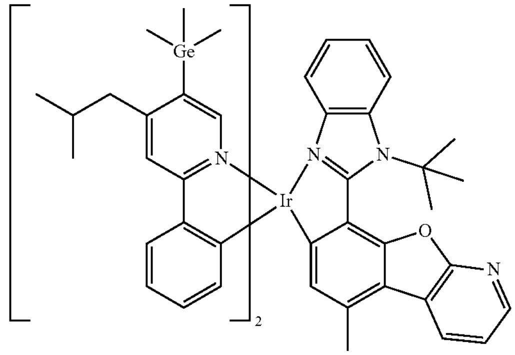
1793
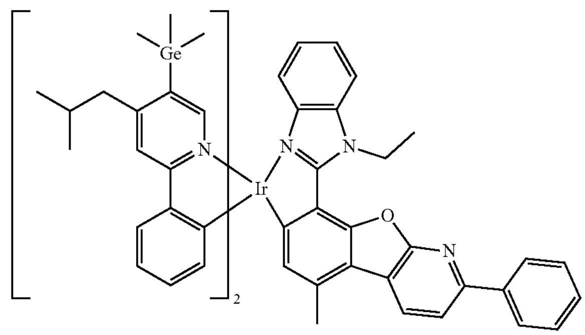
1794
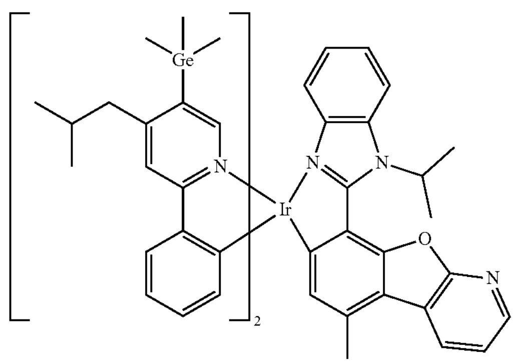
1795
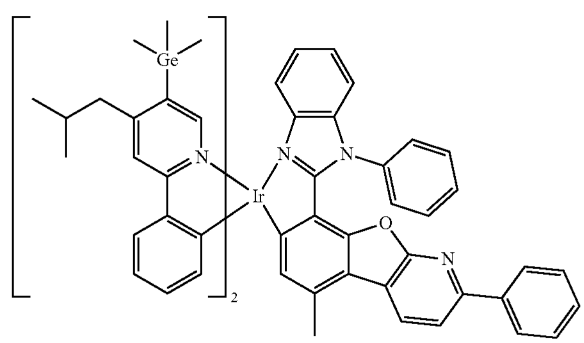

-continued
1796
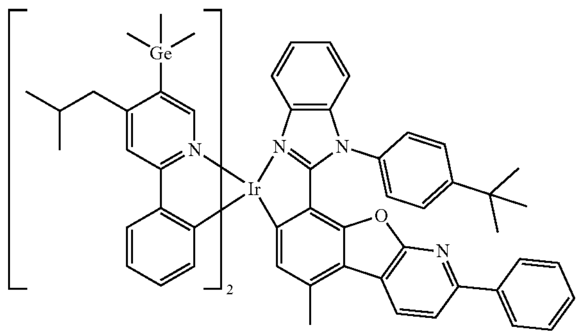
1797
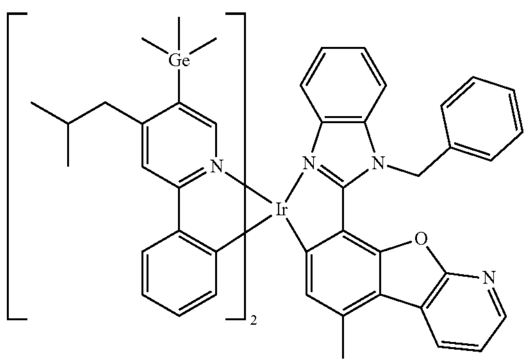
1798
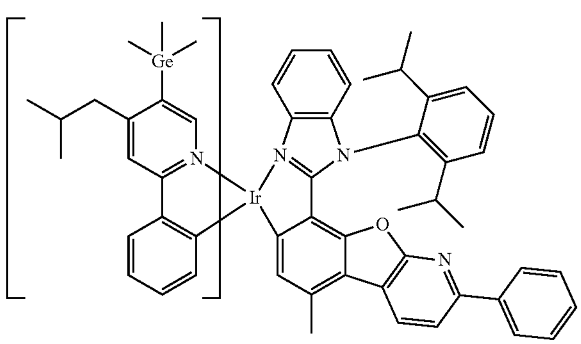
1799
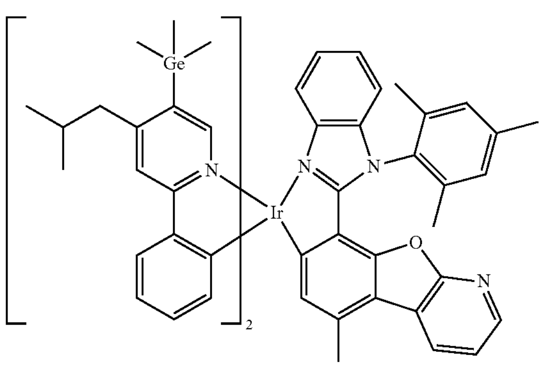
-continued
1800
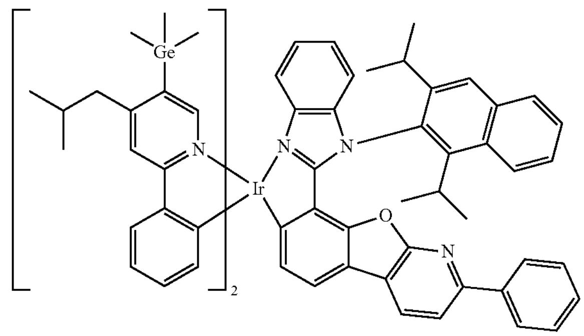
1801
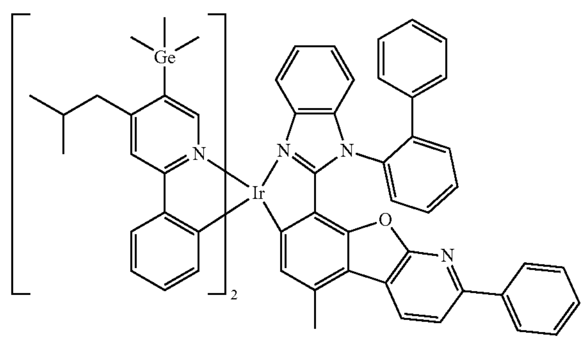
1802
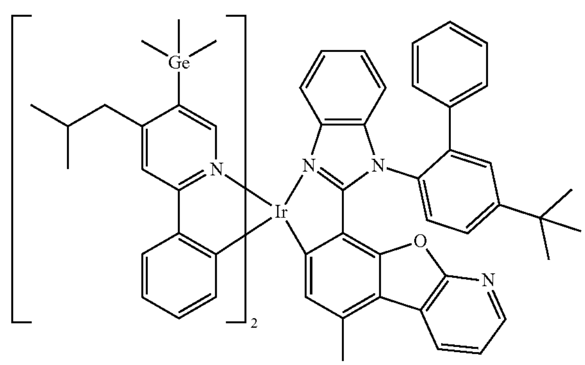
1803
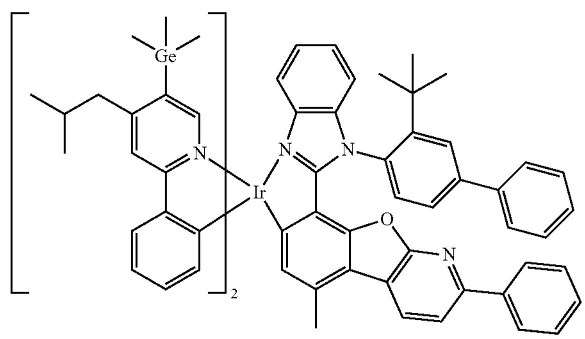

1804
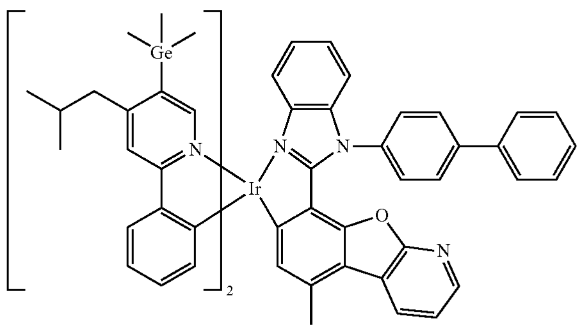
1805
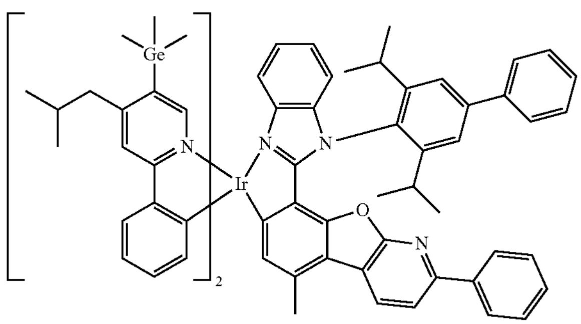
1806
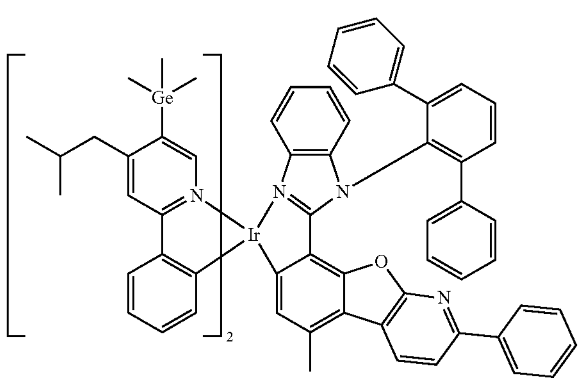
1807
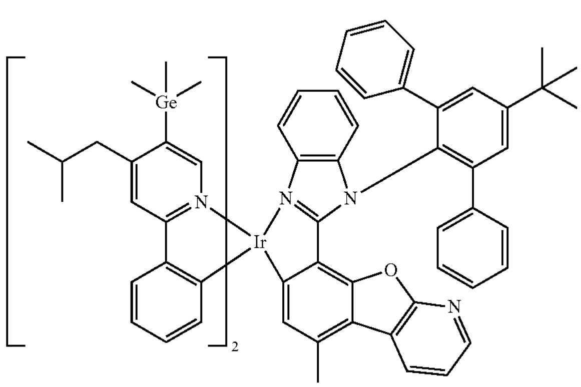
1808
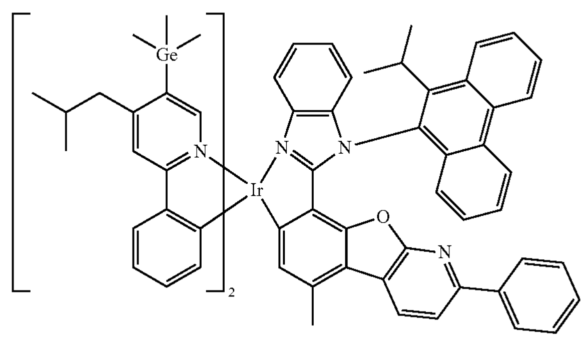
1809
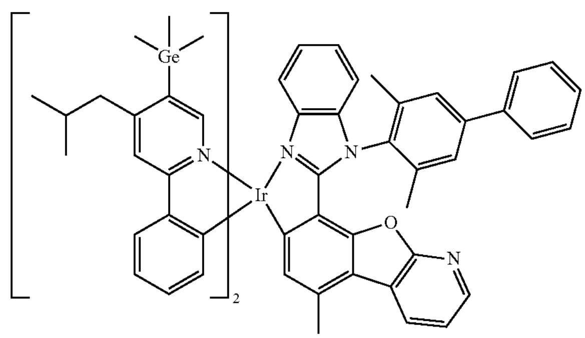
1810
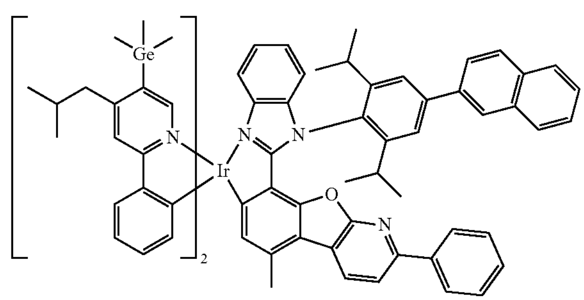
1811
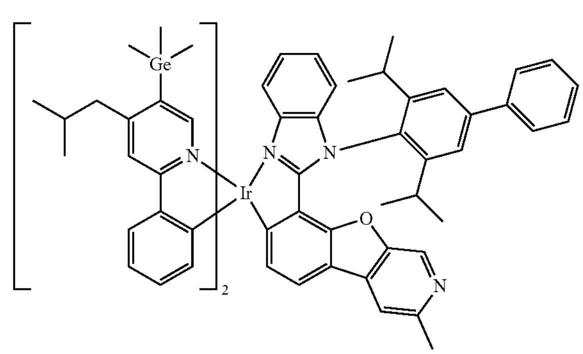

-continued
1812
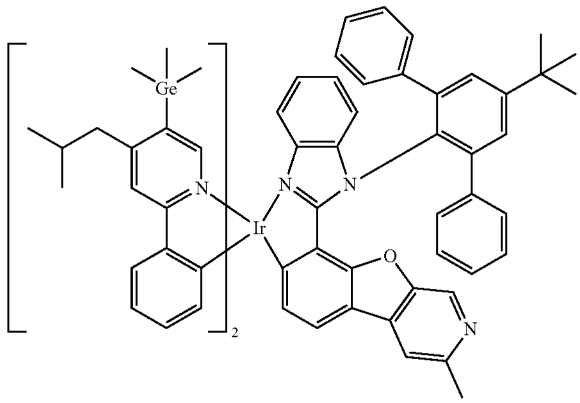
1813
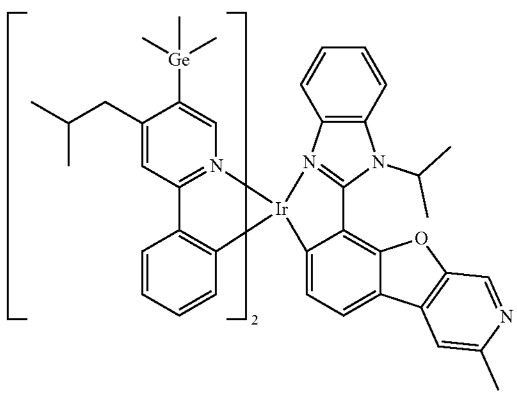
1814
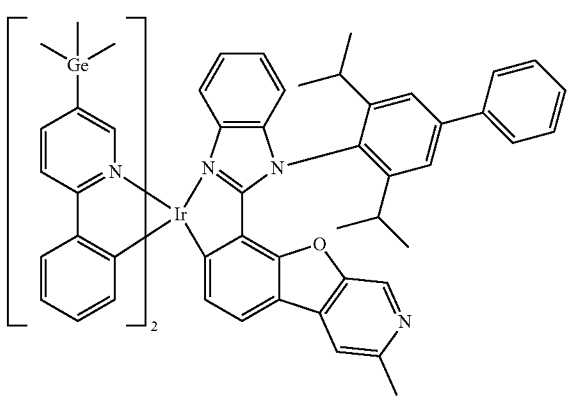
1815
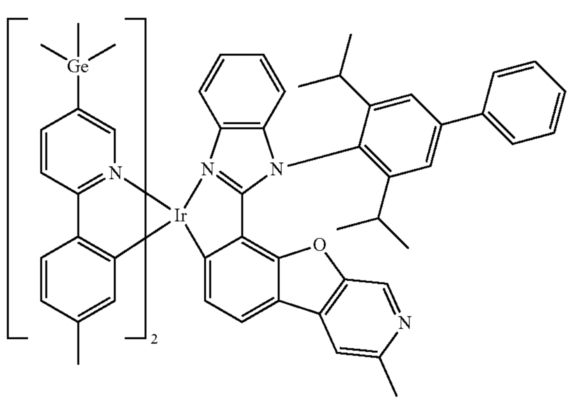
-continued
1816
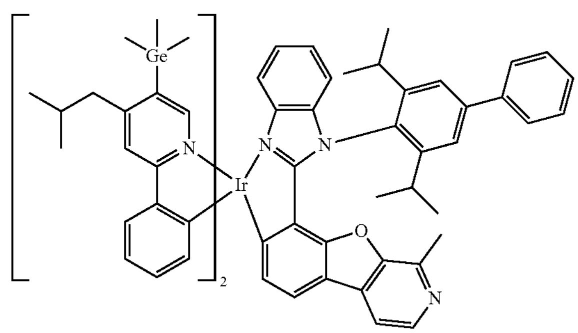
1817
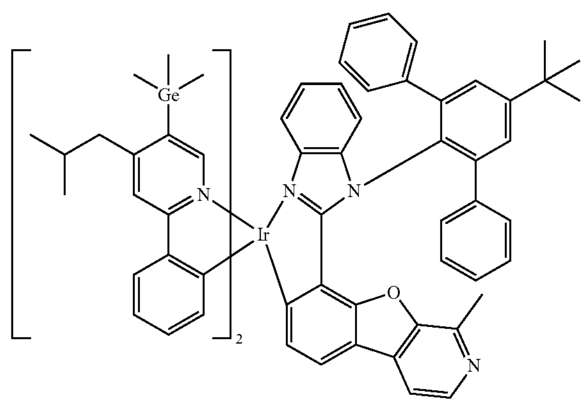
1818
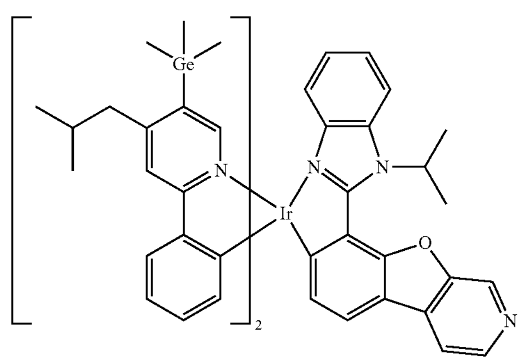
1819
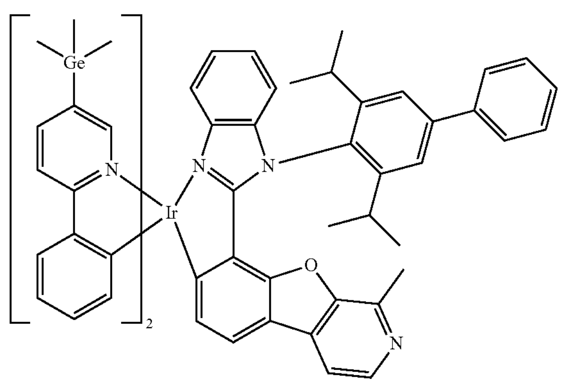

1820
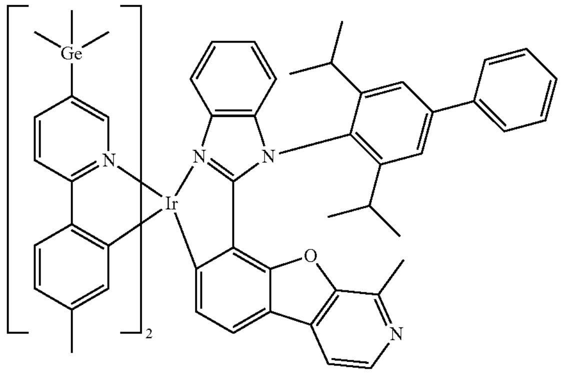
1821
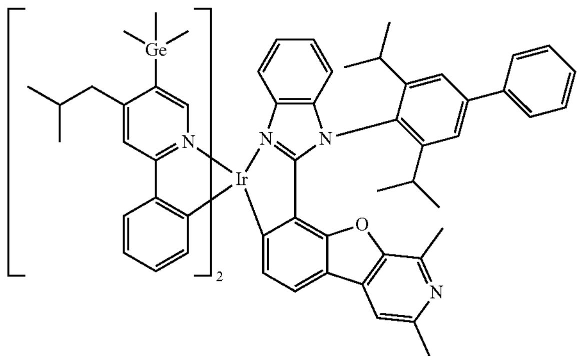
1822
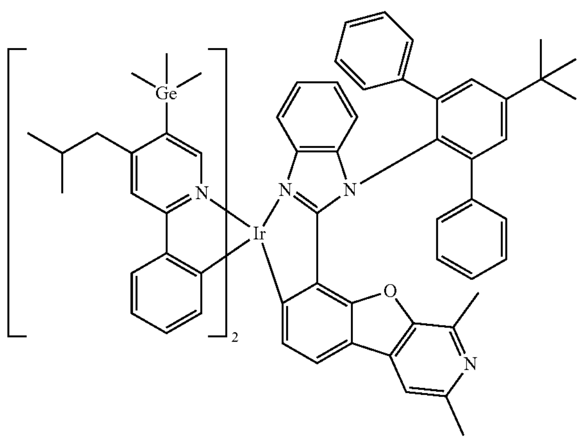
1823
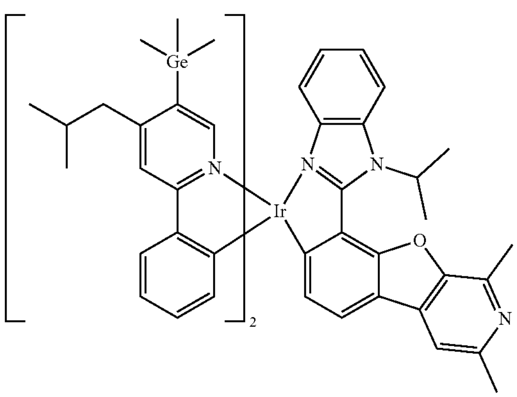
1824
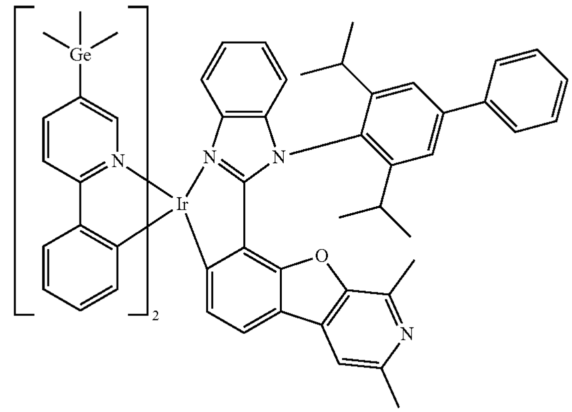
1825
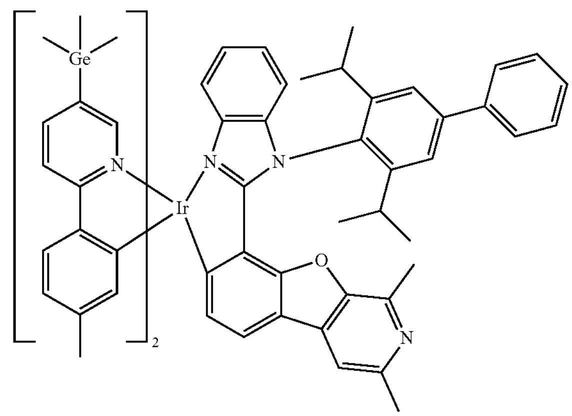
1826
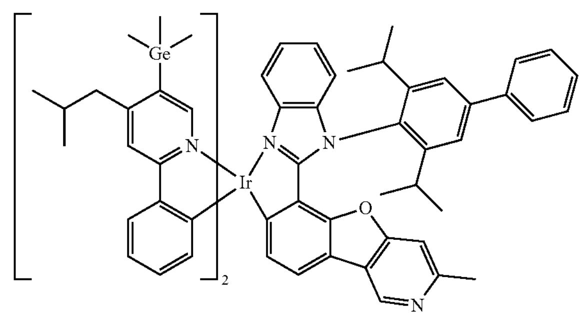
1827
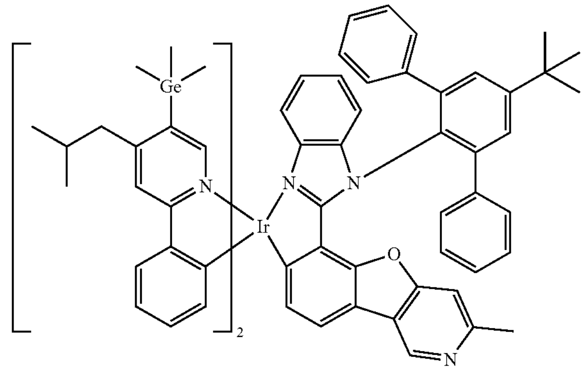

-continued
1828
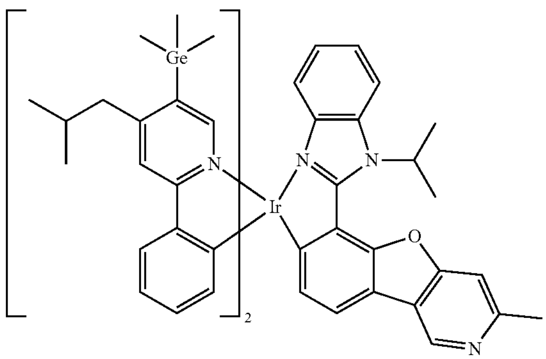
1829
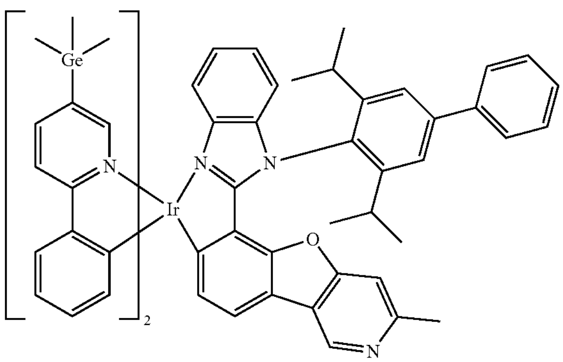
1830
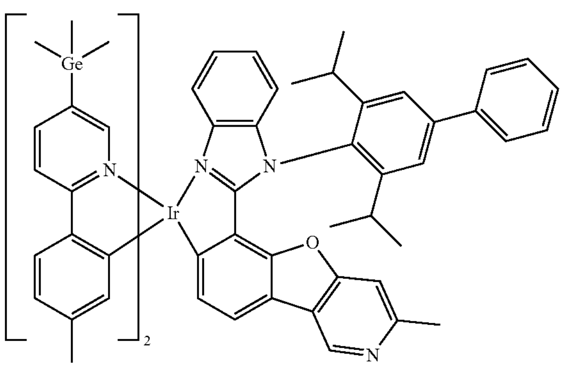
1831
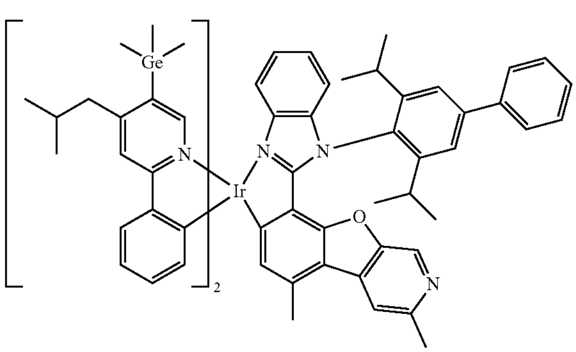
-continued
1832
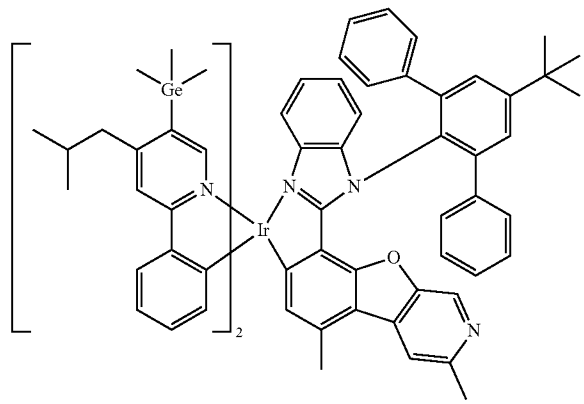
1833
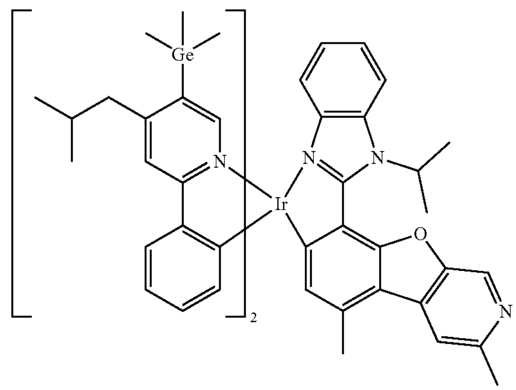
1834
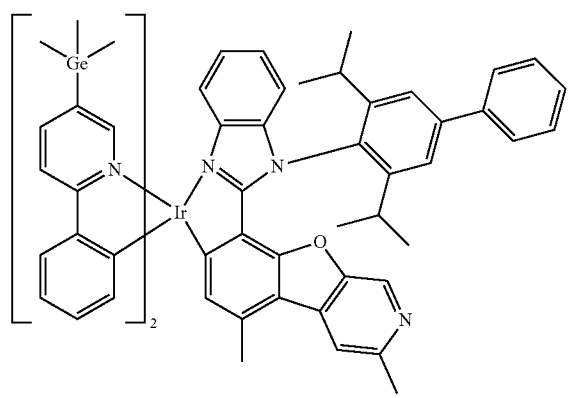
1835
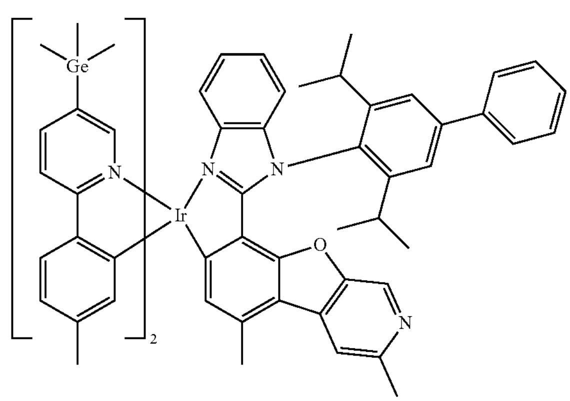

-continued
1836
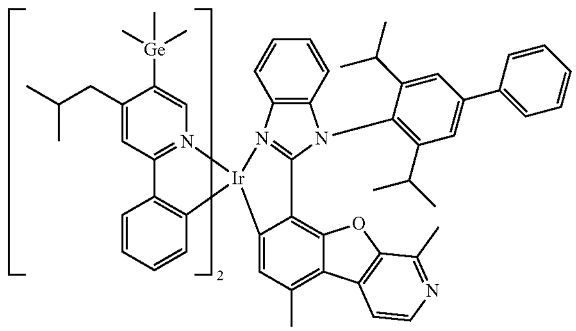
1837
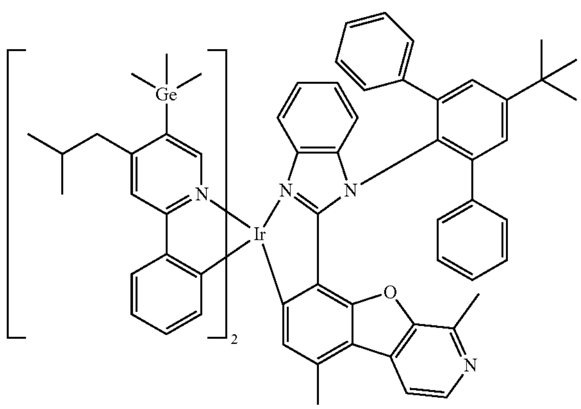
1838
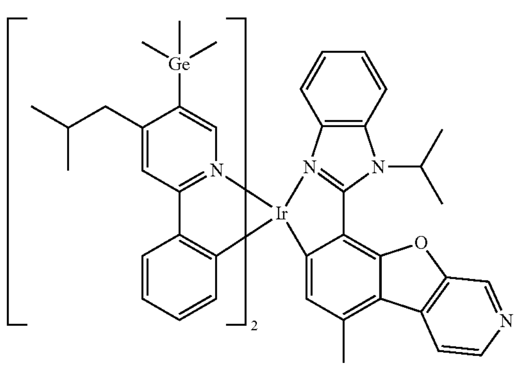
1839
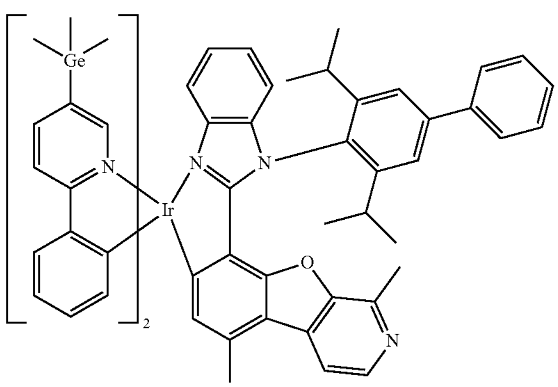
-continued
1840
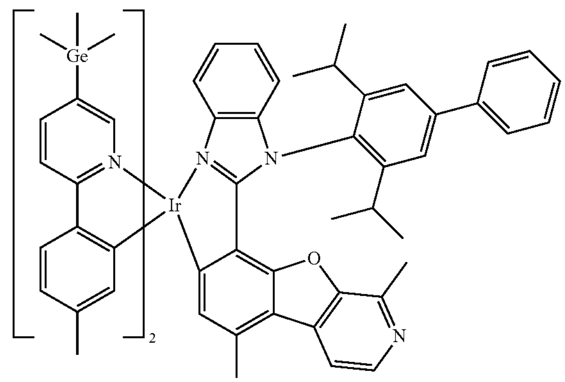
1841
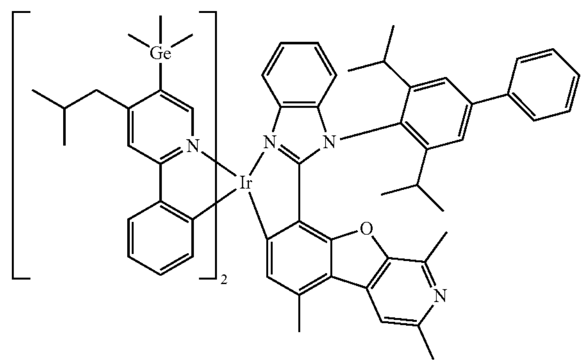
1842
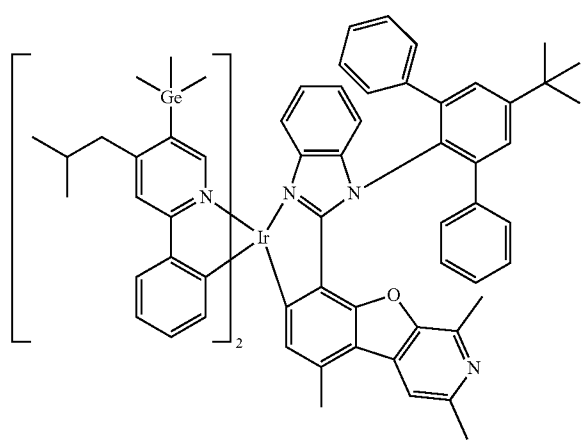
1843
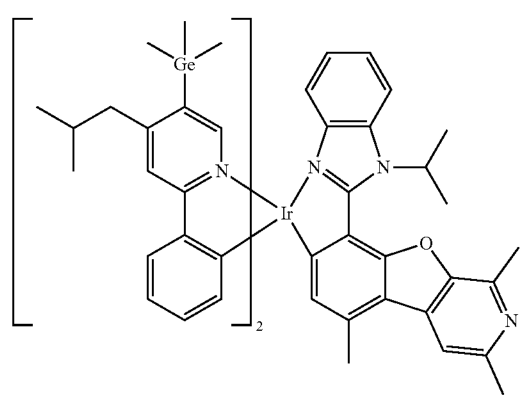

1844
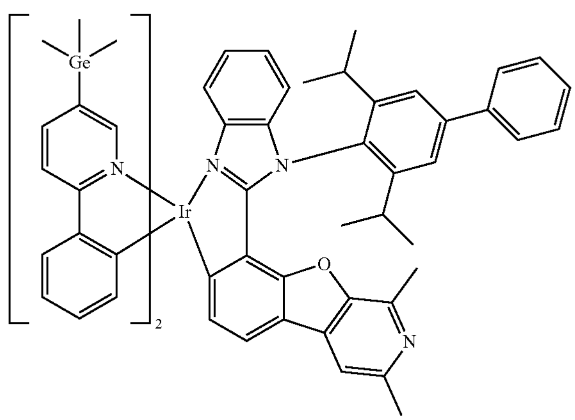
1845
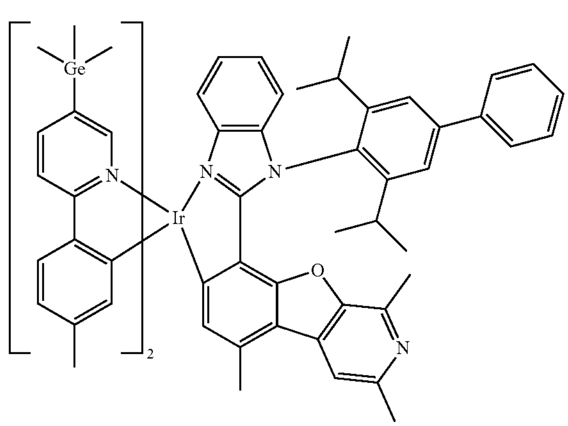
1846
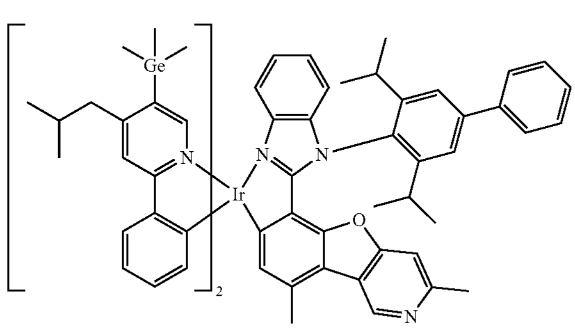
1847
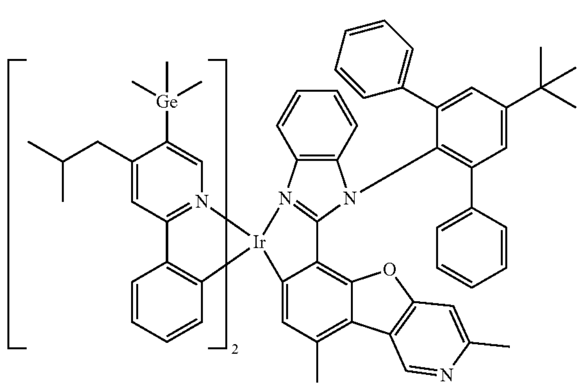
1848
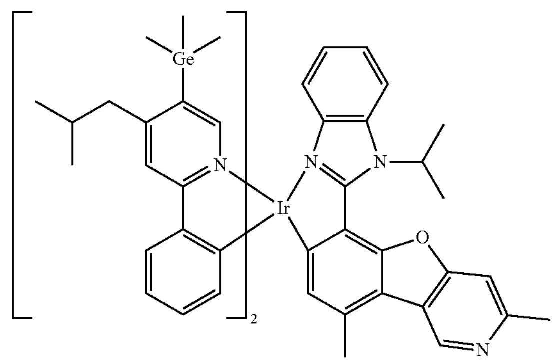
1849
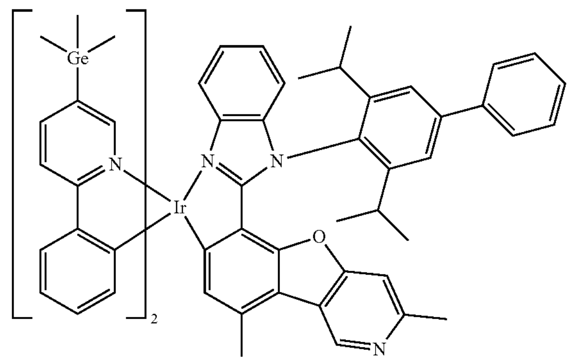
1850
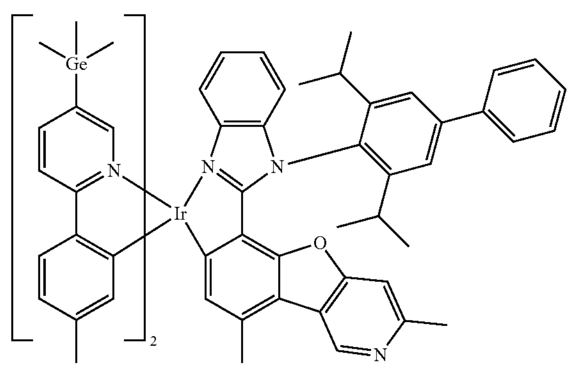
1851
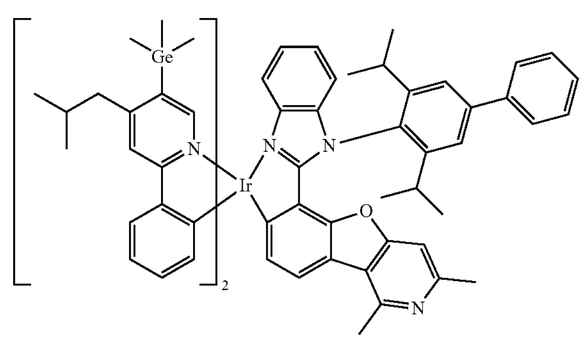

1852
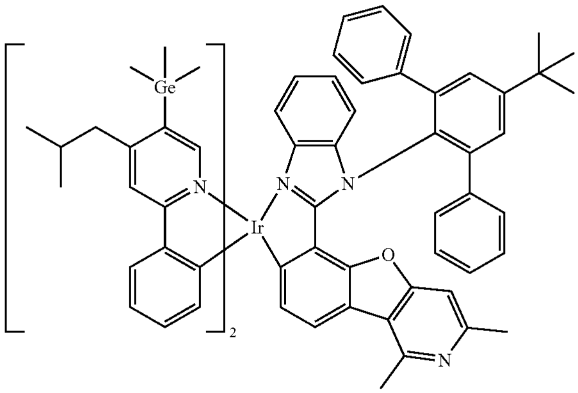
1853
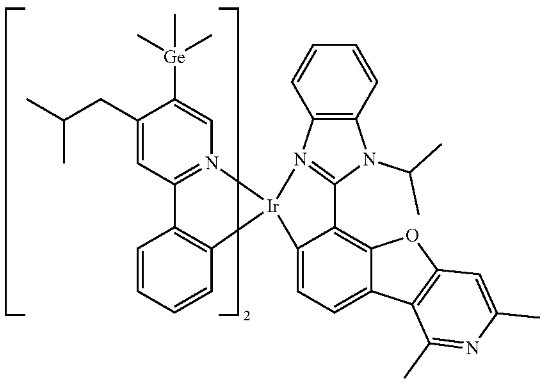
1854
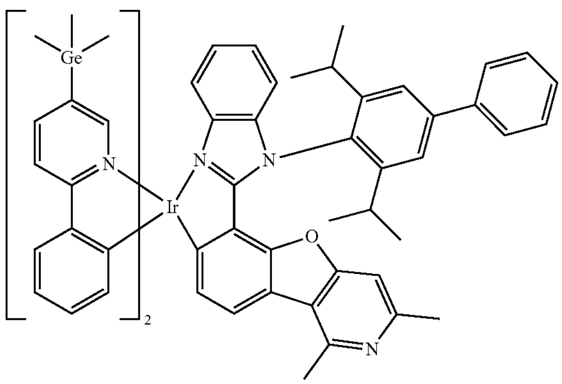
1855
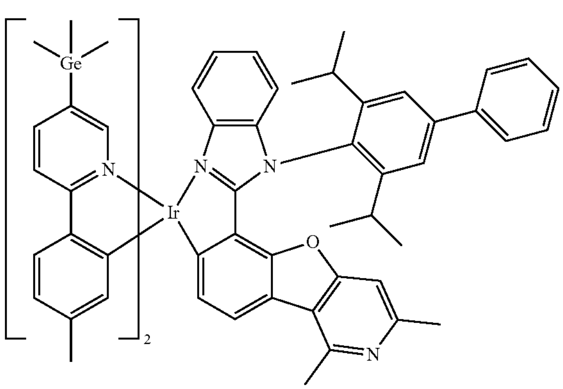
1856
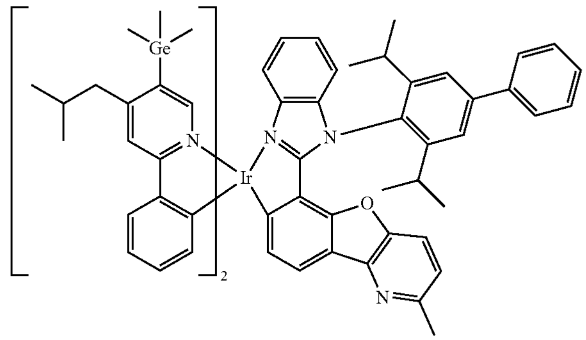
1857
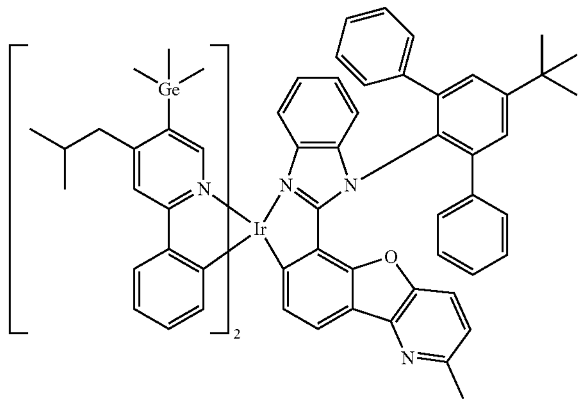
1858
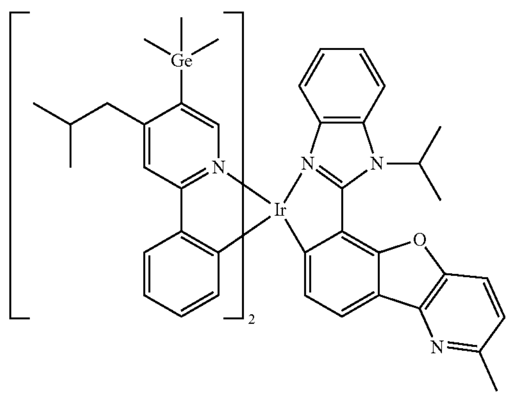
1859
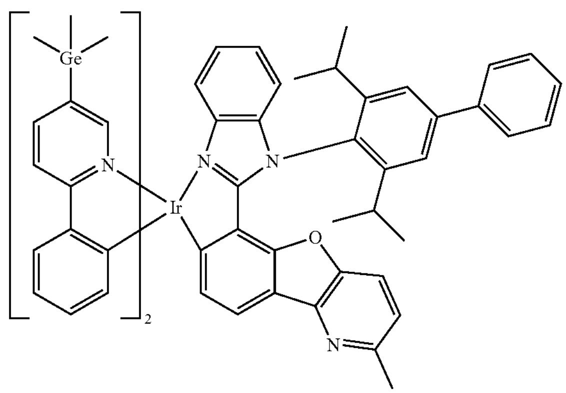

1860
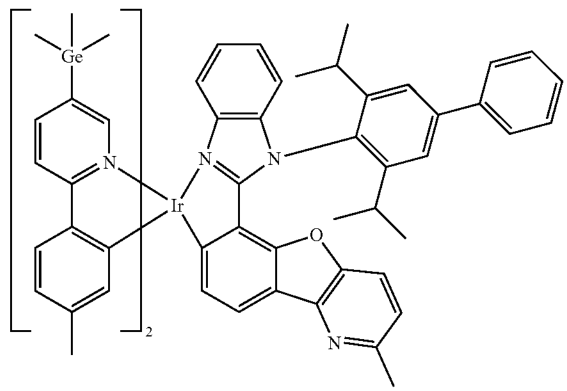
1861
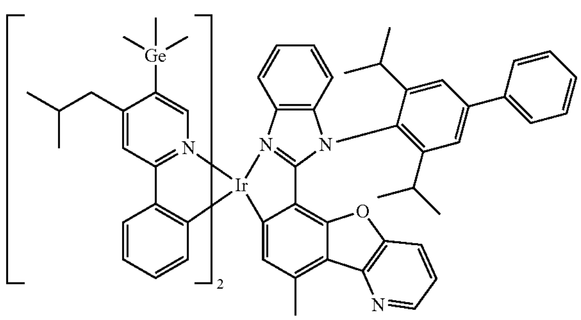
1862
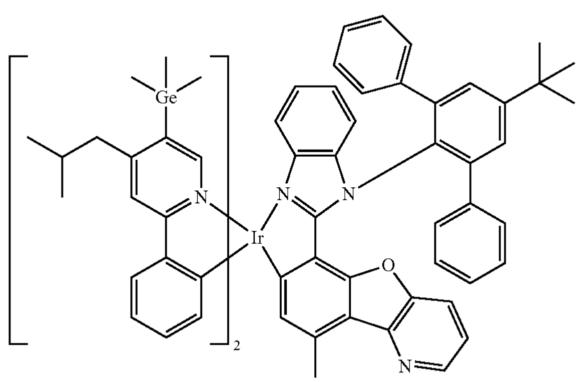
1863
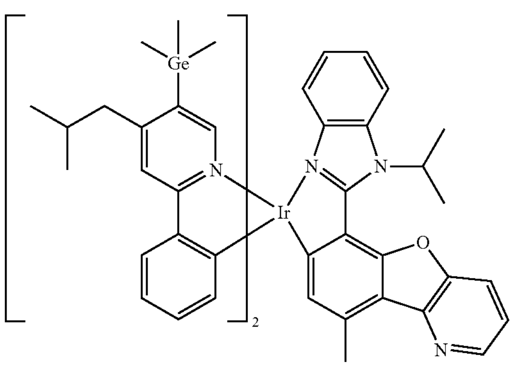
1864
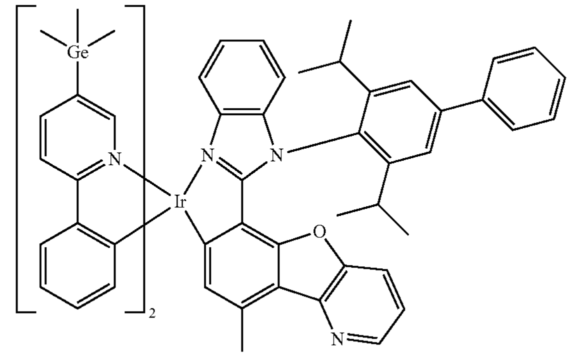
1865
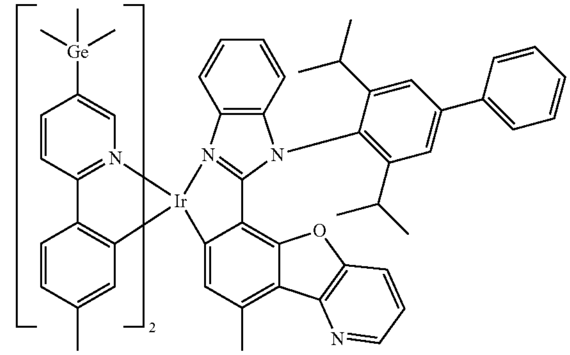
1866
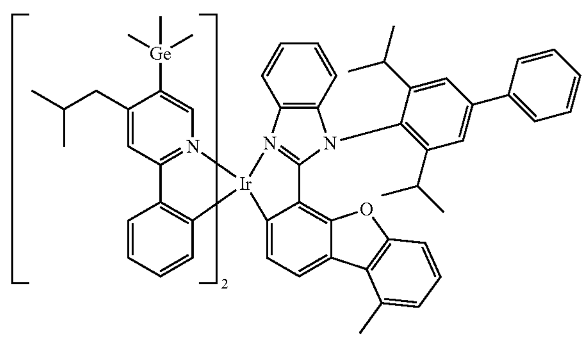
1867
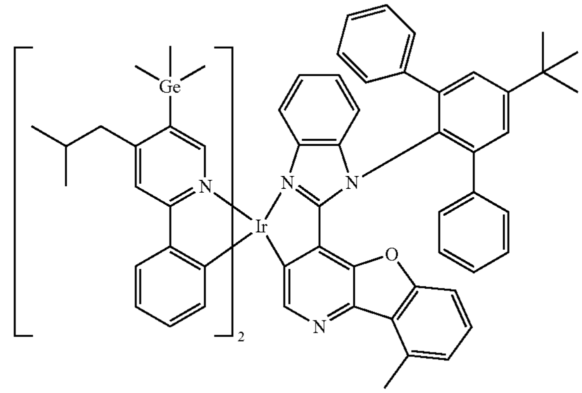

-continued
1868
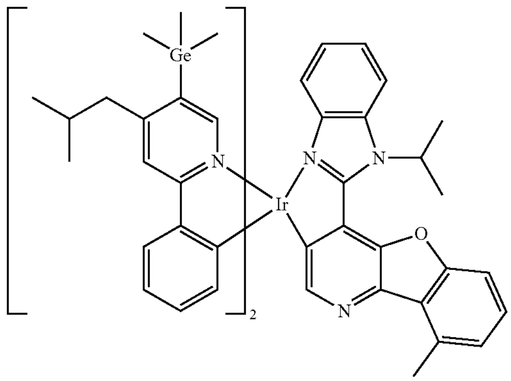
1869
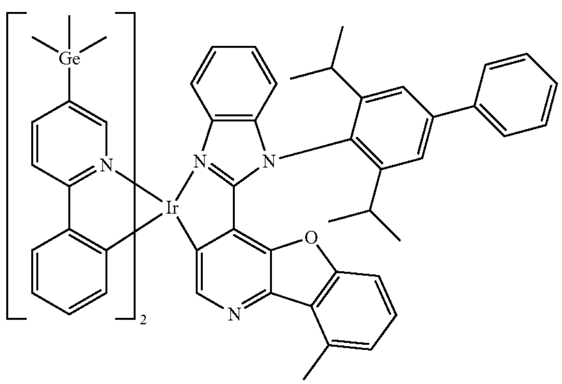
1870
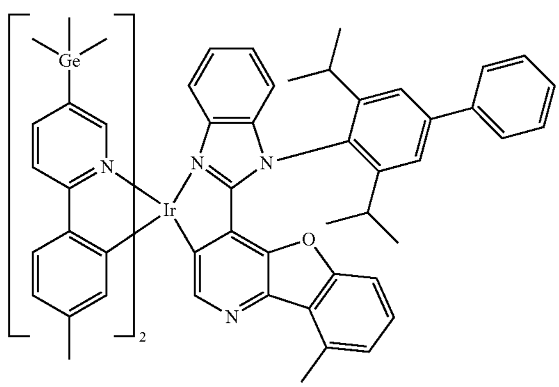
1871
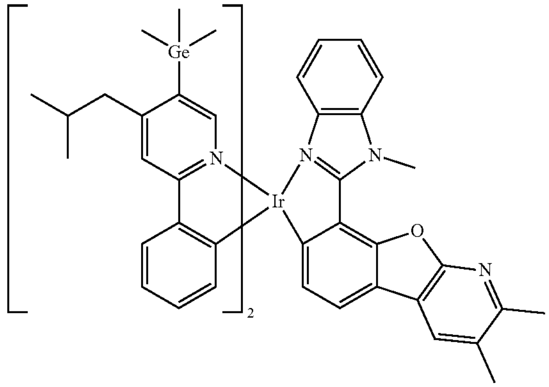
-continued
1872
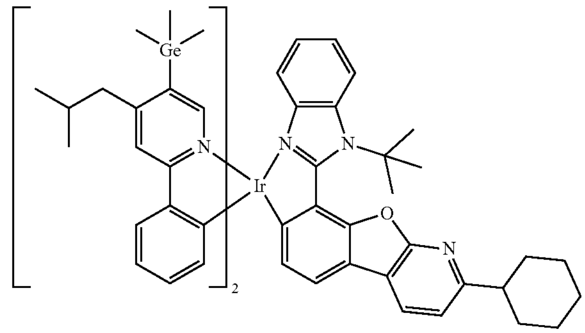
1873
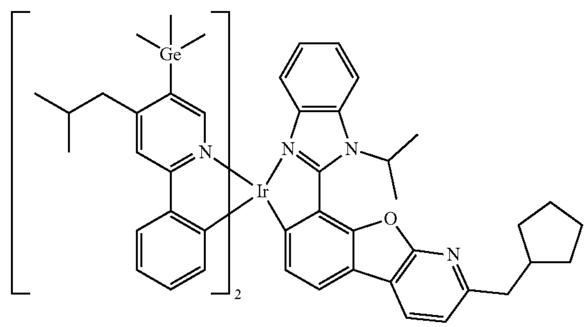
1874
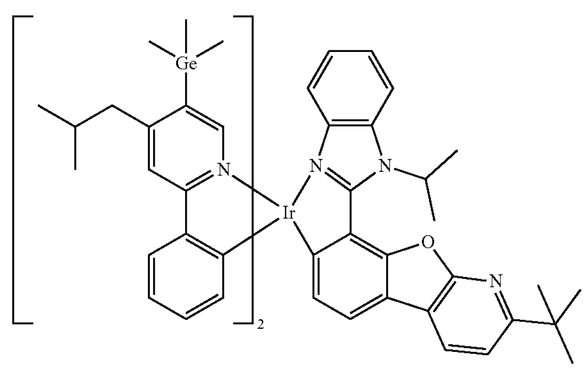
1875
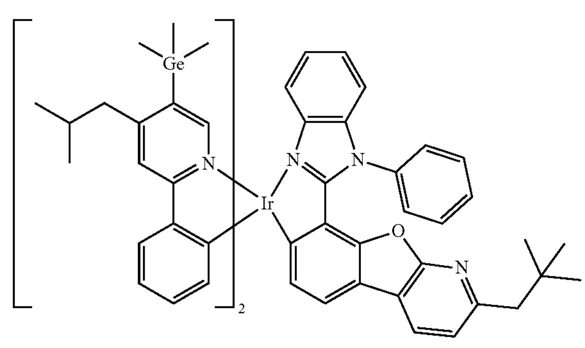

-continued
1876
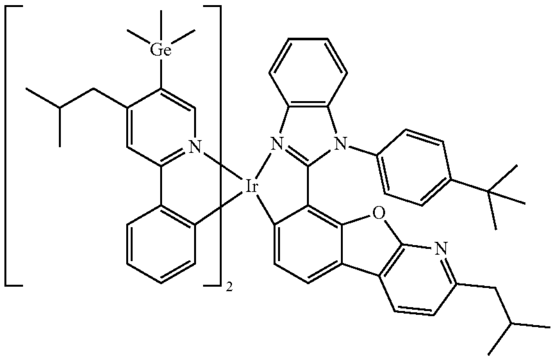
1877
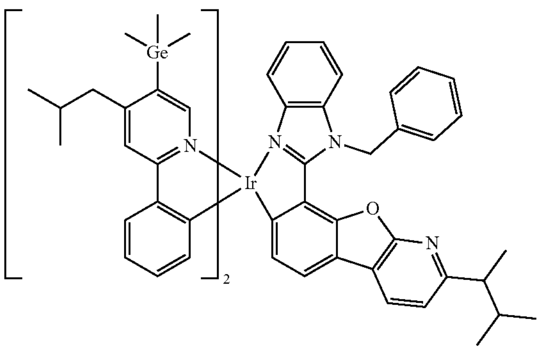
1878
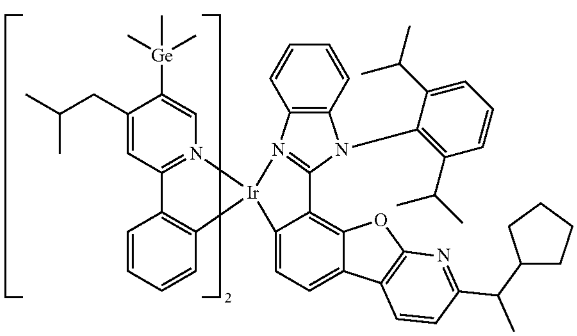
1879
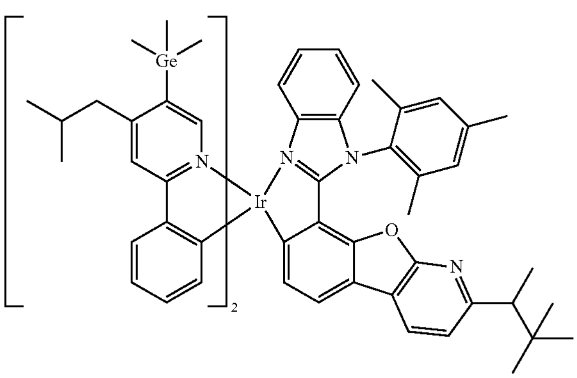
-continued
1880
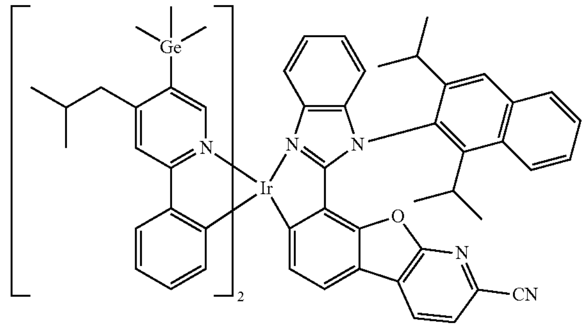
1881
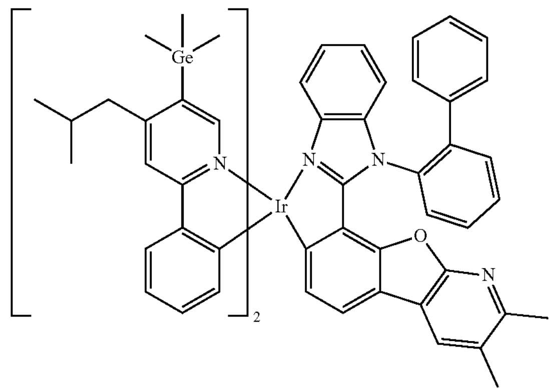
1882
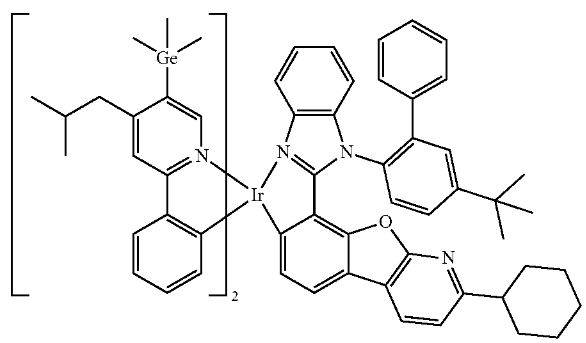
1883
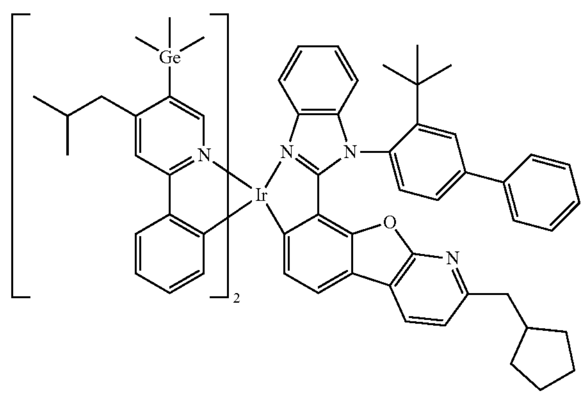

-continued
1884
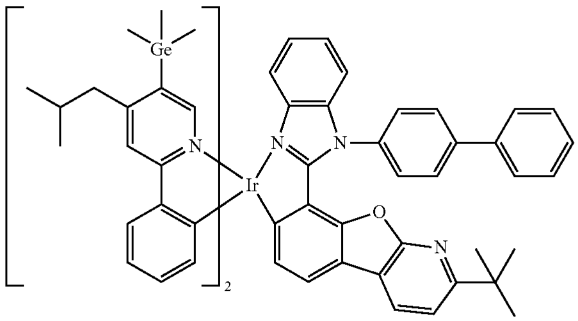
1885
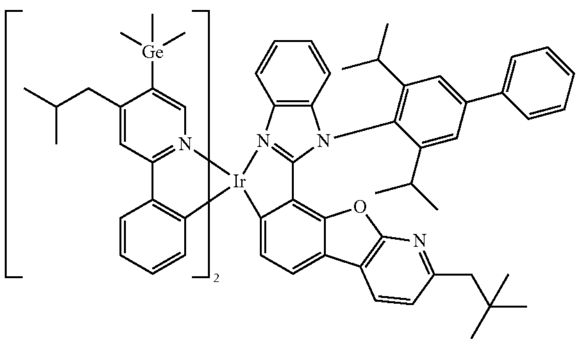
1886
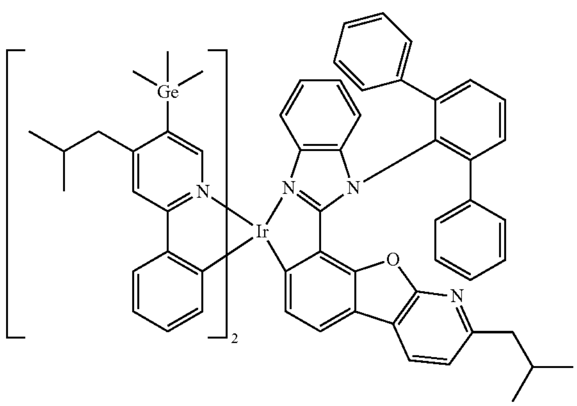
1887
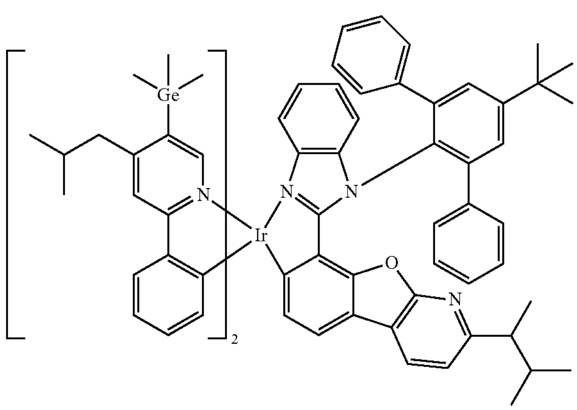
-continued
1888
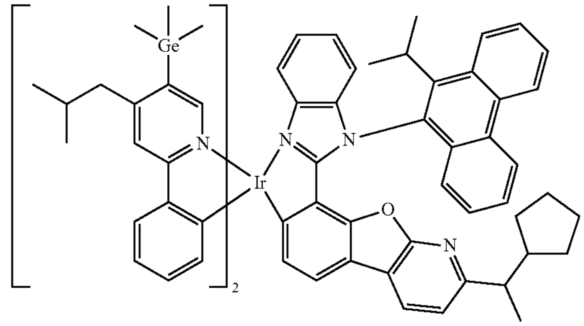
1889
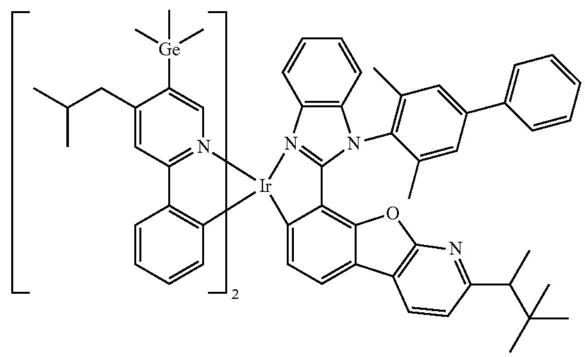
1890
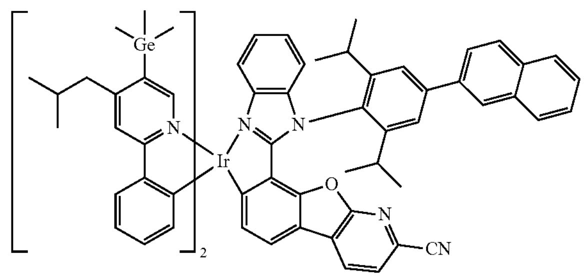
1891
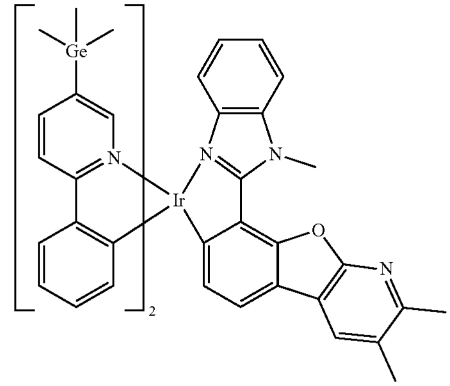

1892
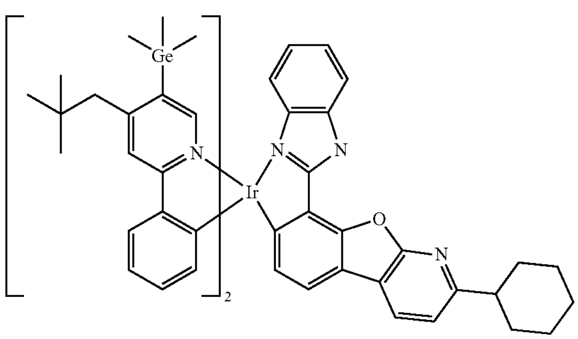
1893
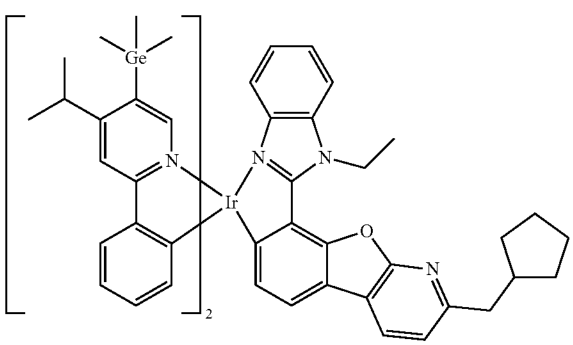
1894
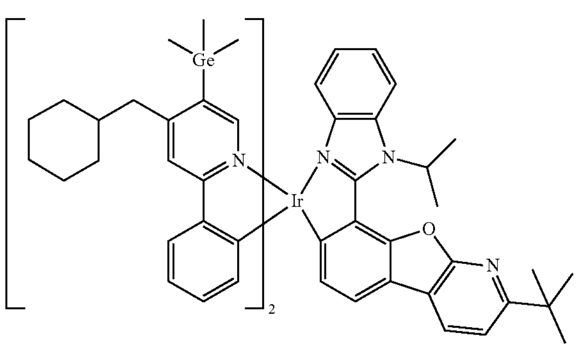
1895
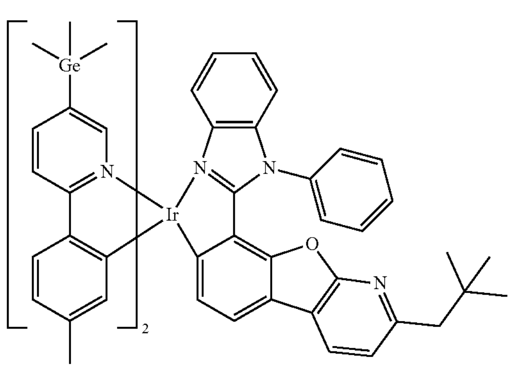
1896
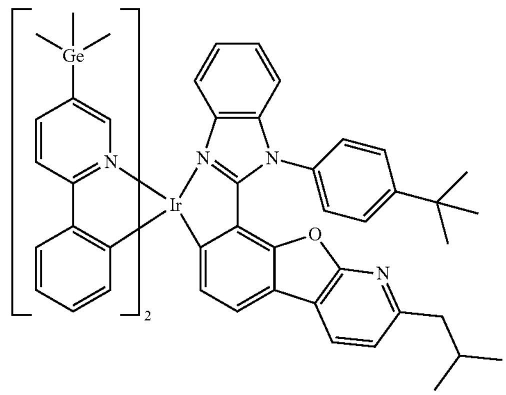
1897
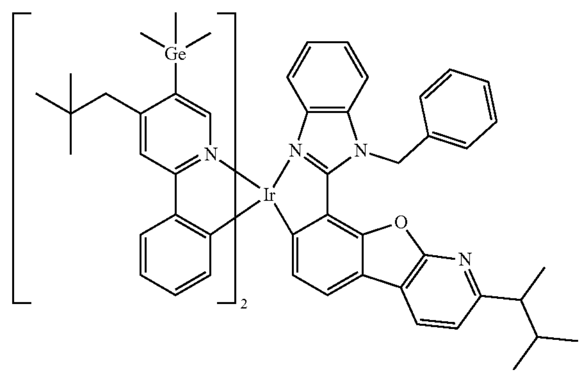
1898
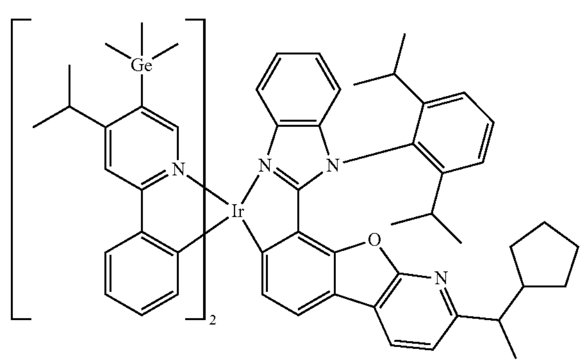
1899
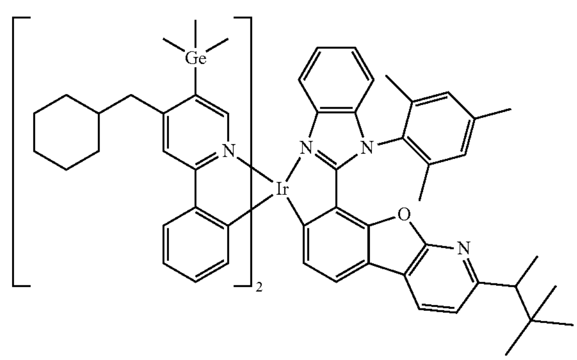

-continued
1900
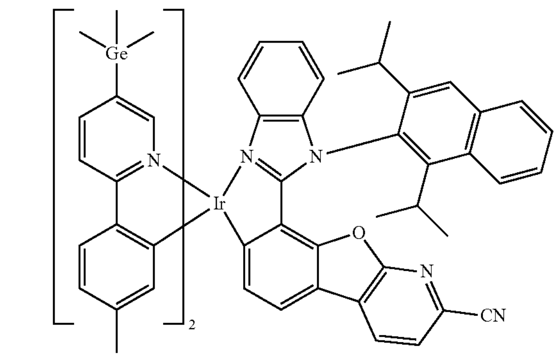
1901
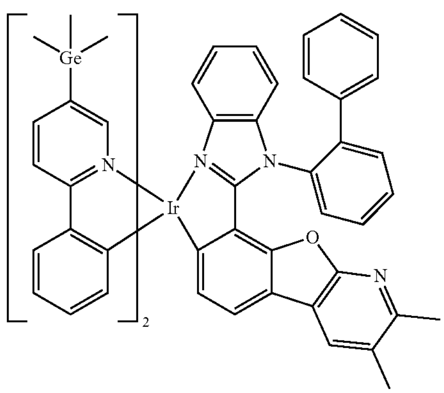
1902
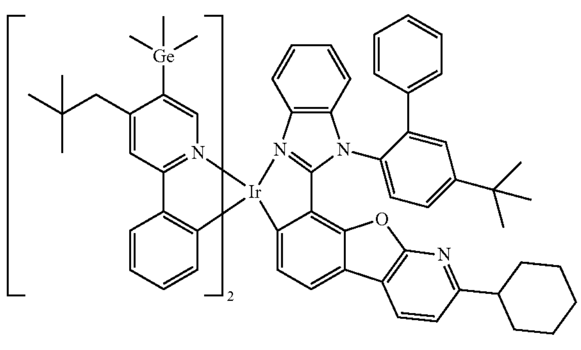
1903
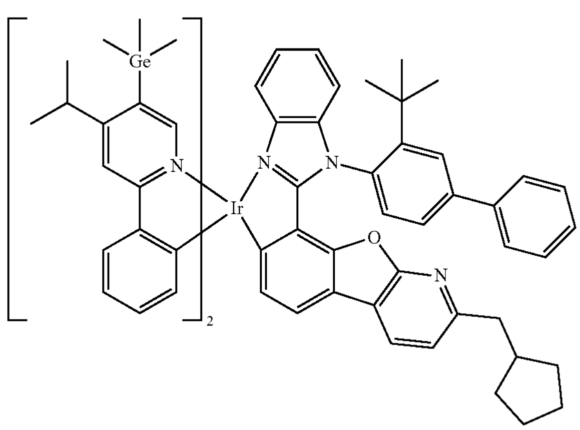
-continued
1904
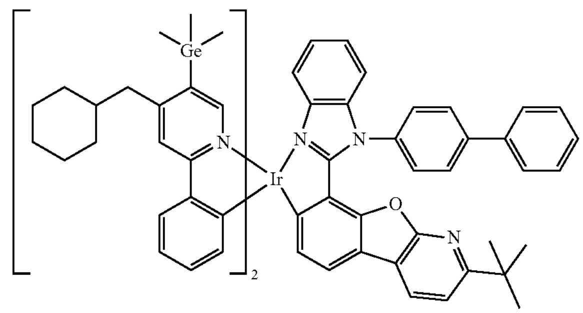
1905
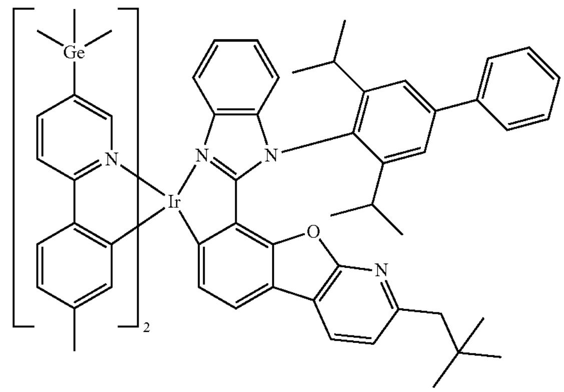
1906
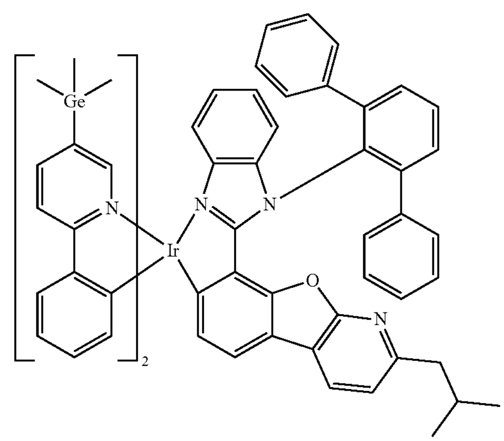
1907
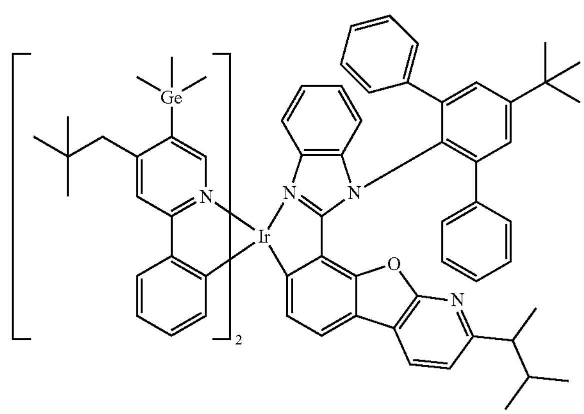

-continued
1908
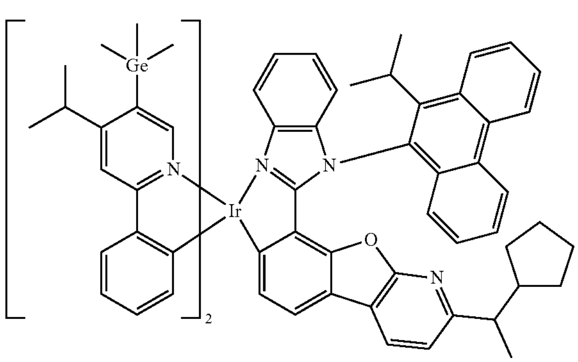
1909
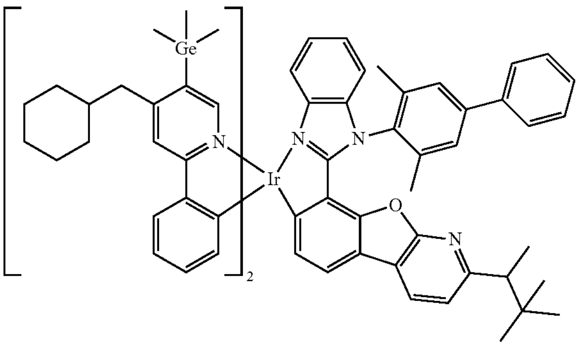
1910
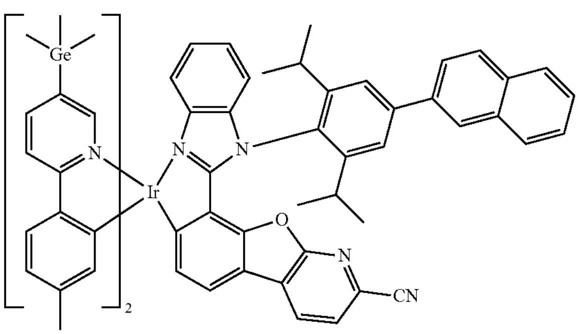
1911
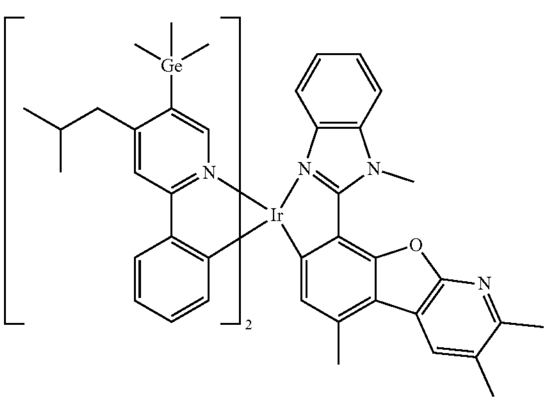
-continued
1912
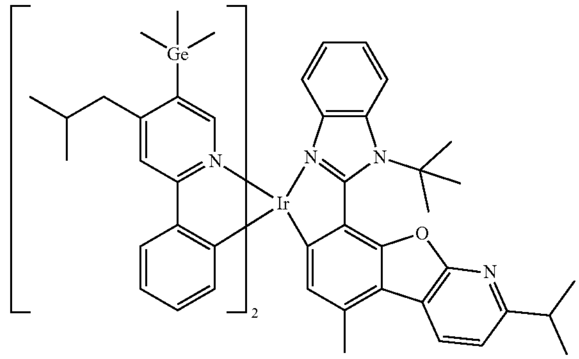
1913
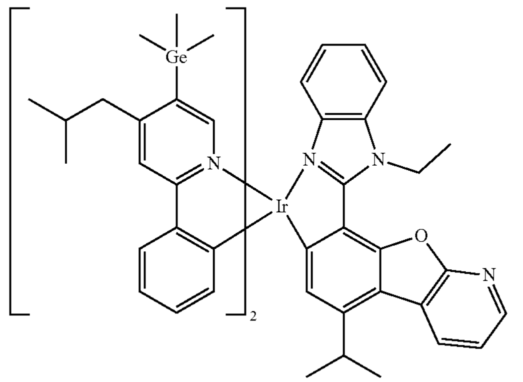
1914
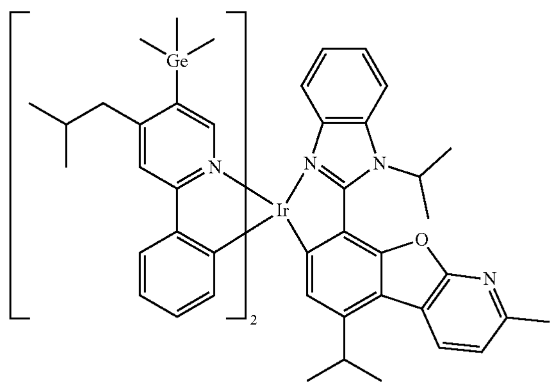
1915
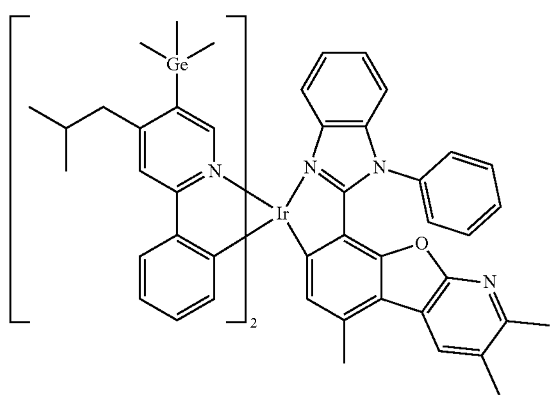

1916
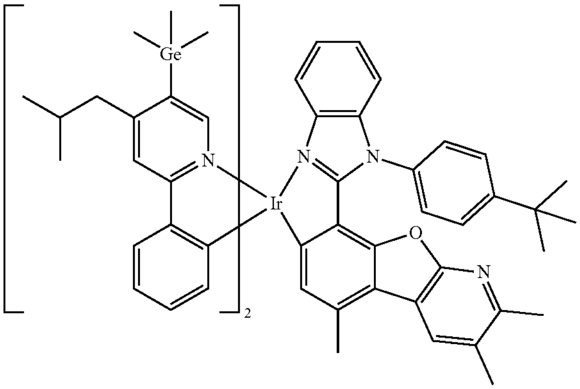
1917
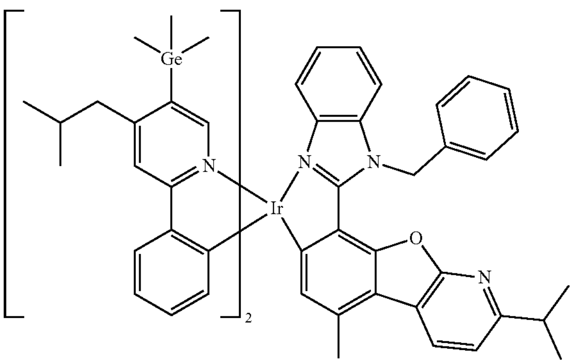
1918
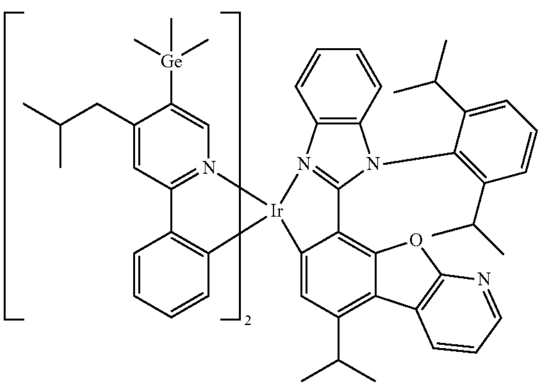
1919
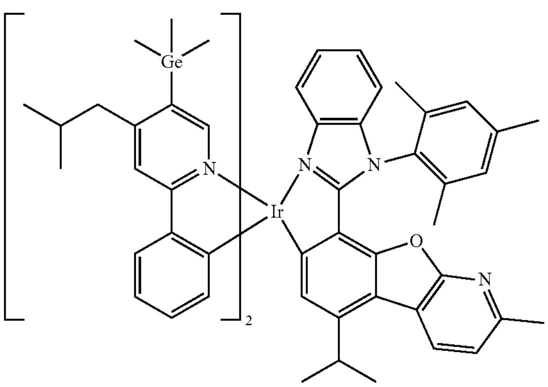
1920
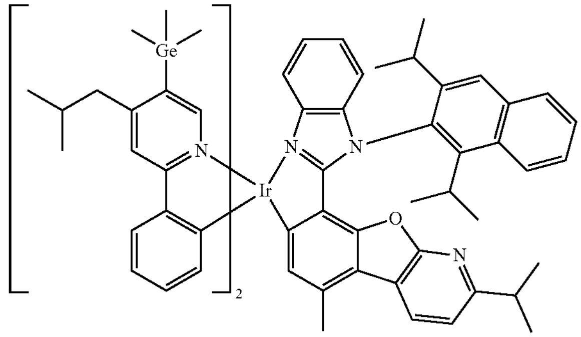
1921
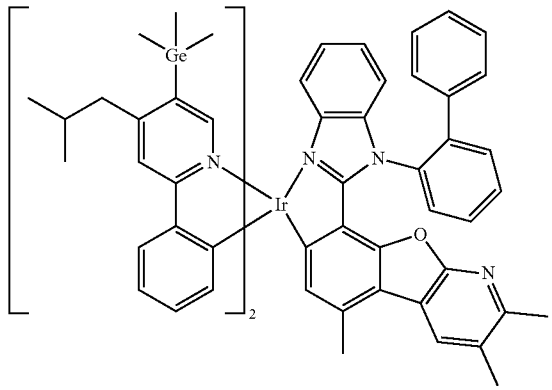
1922
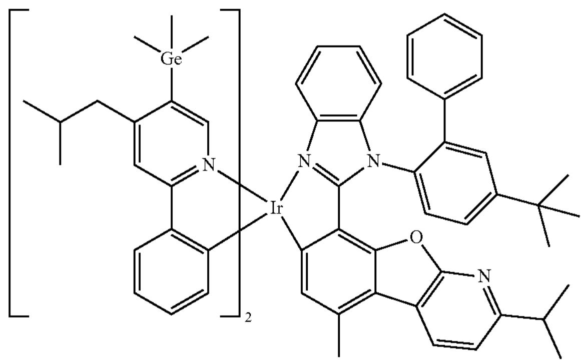
1923
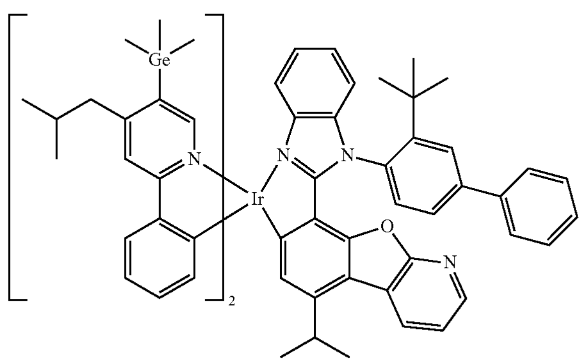

-continued
1924
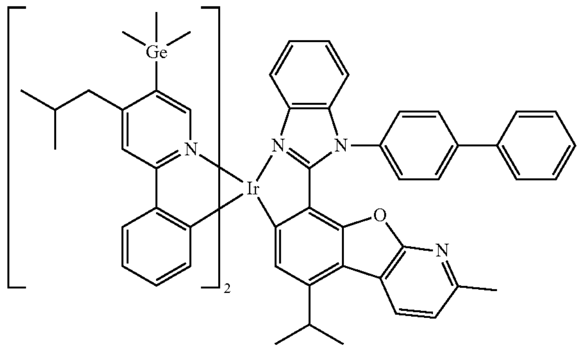
1925
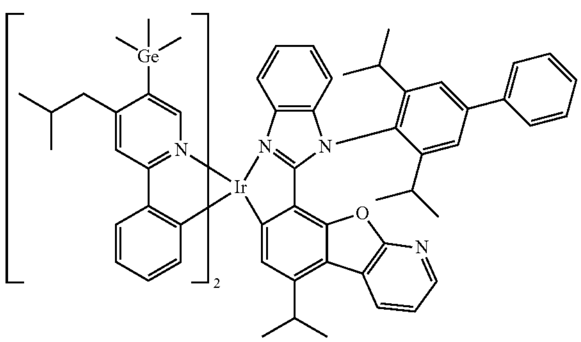
1926
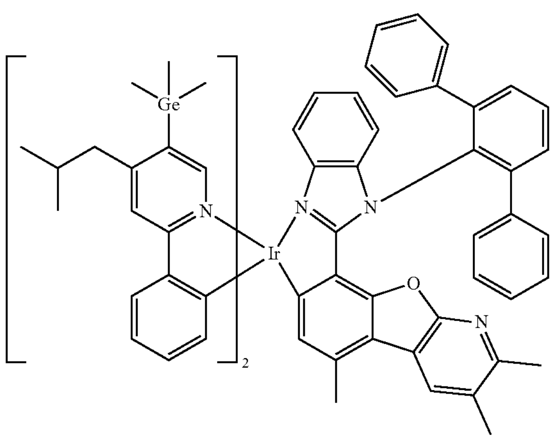
1927
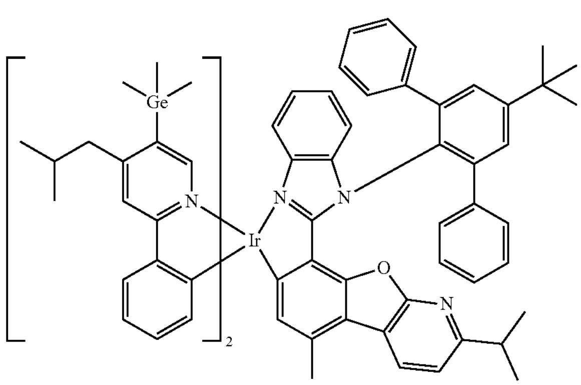
-continued
1928
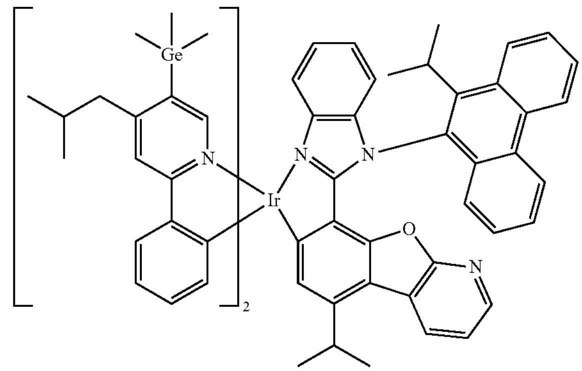
1929
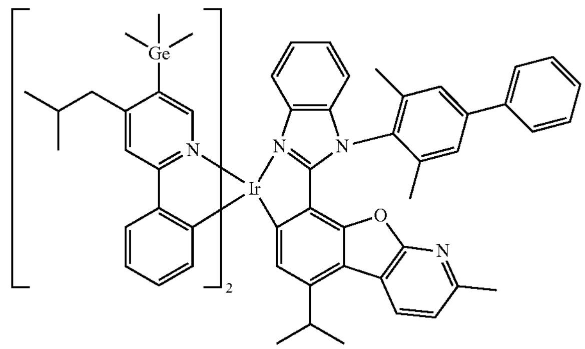
1930
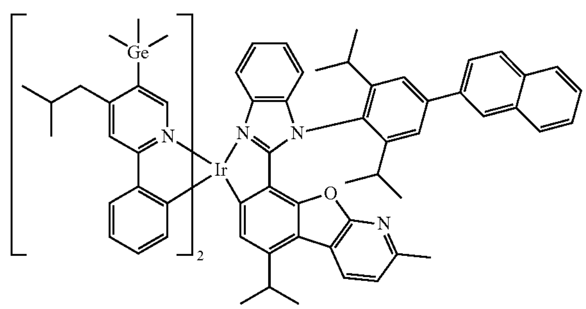
1931
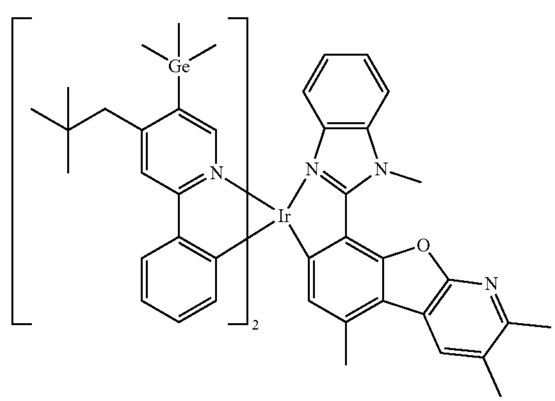

1932
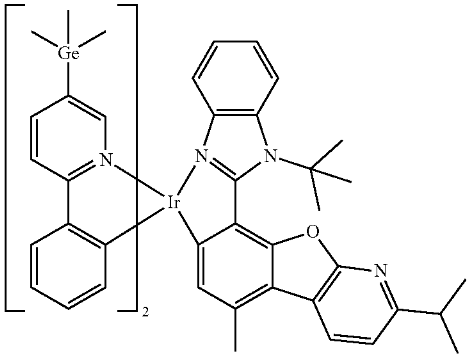
1933
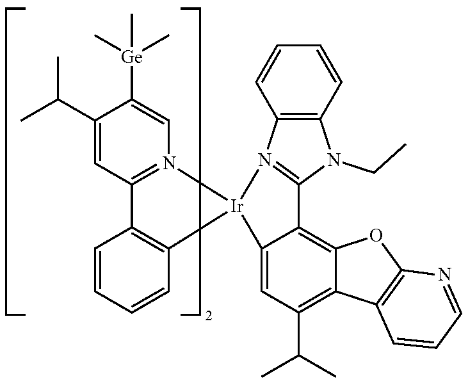
1934
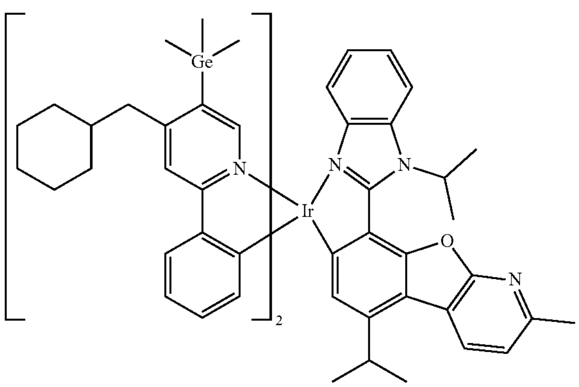
1935
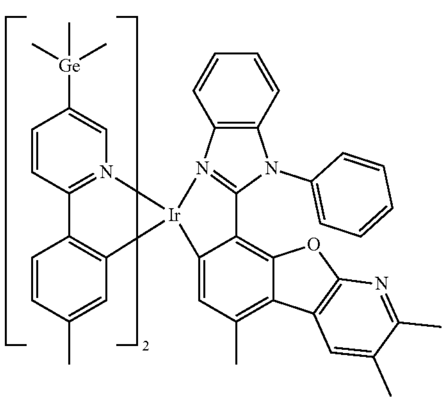
1936
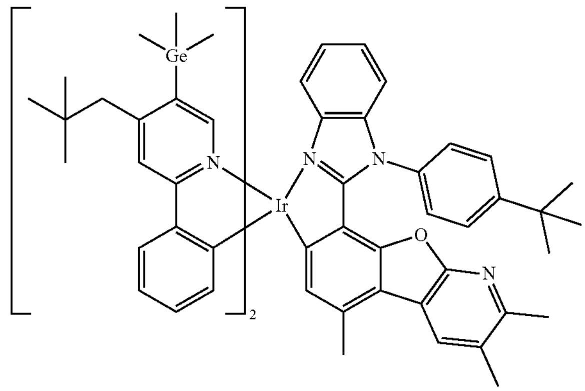
1937
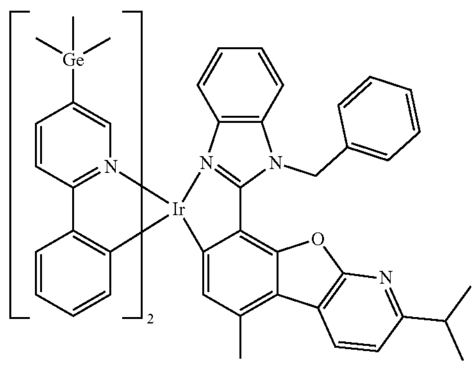
1938
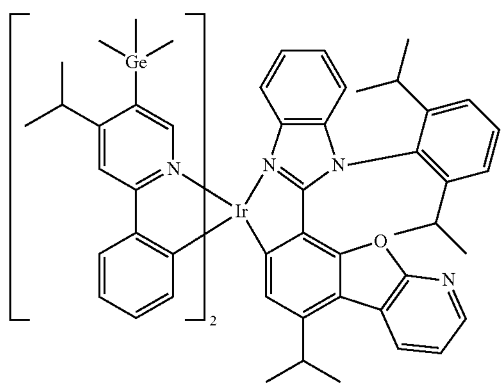
1939
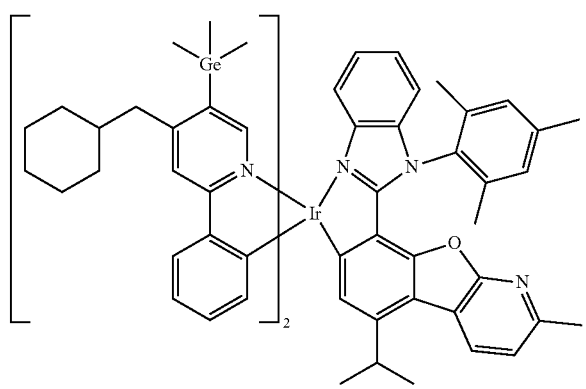

-continued
1940
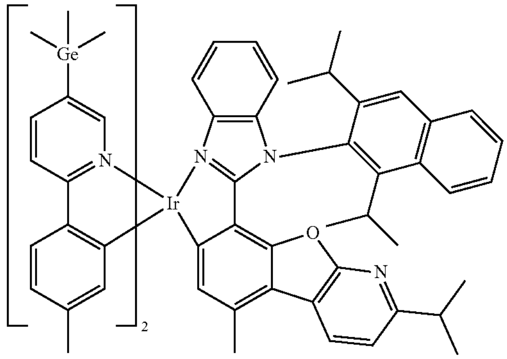
1941
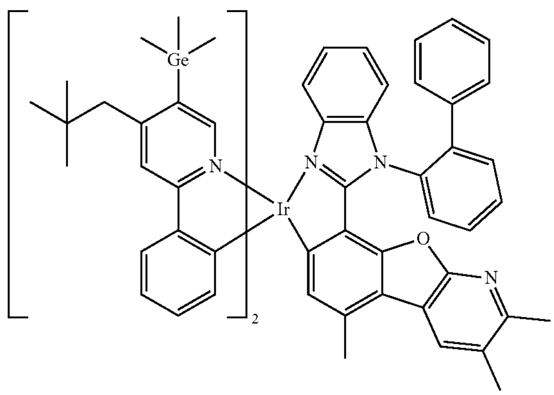
1942
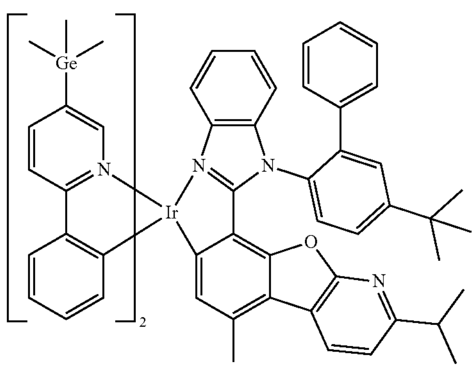
1943
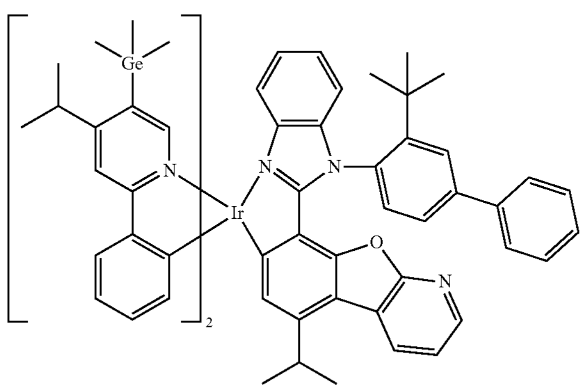
-continued
1944
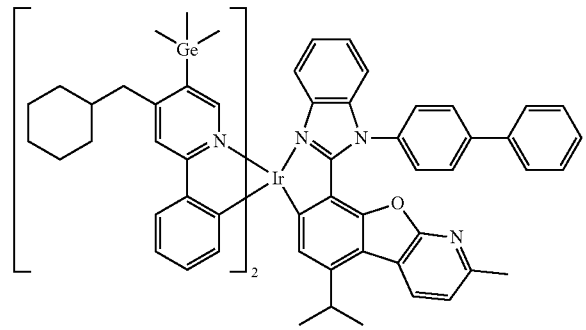
1945
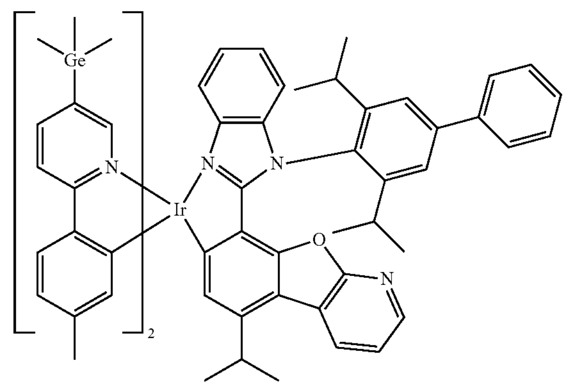
1946
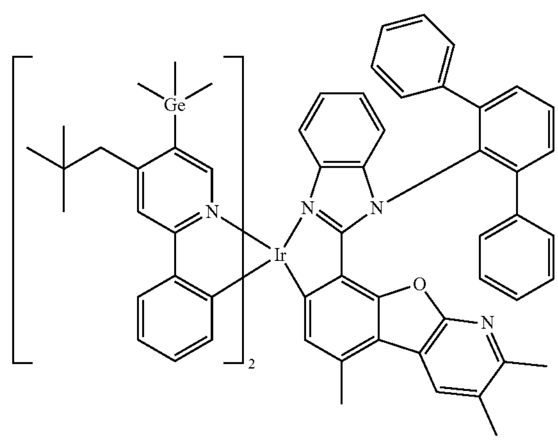
1947
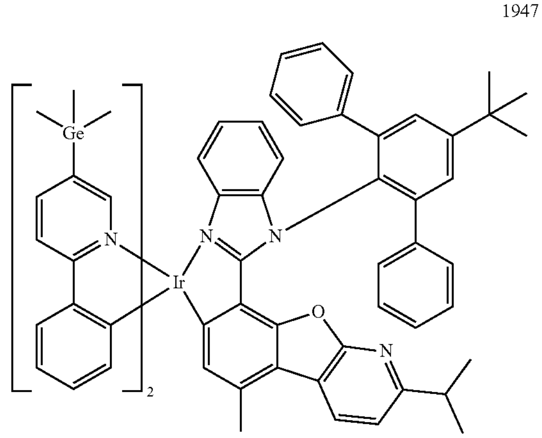

1948
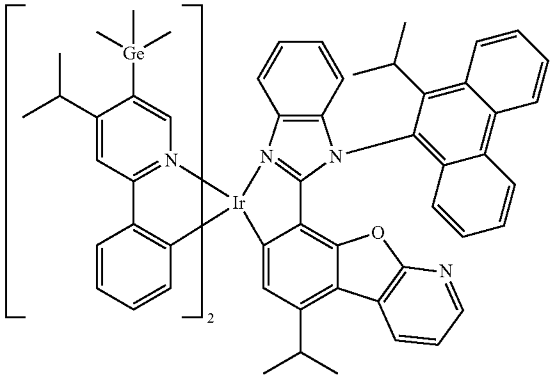
1949
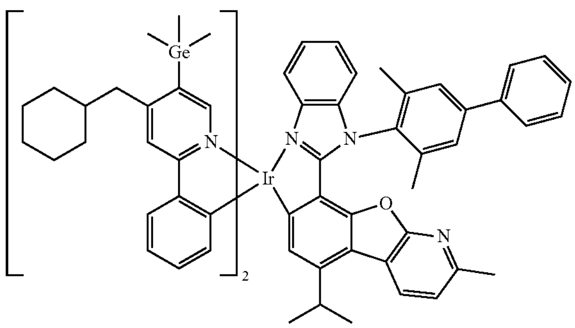
1950
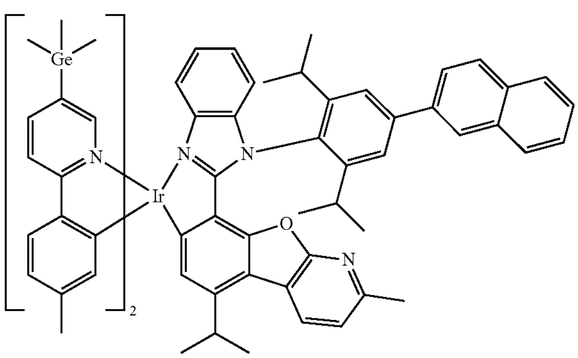
1951
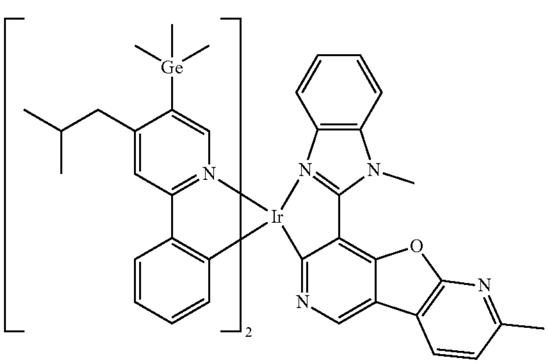
1952
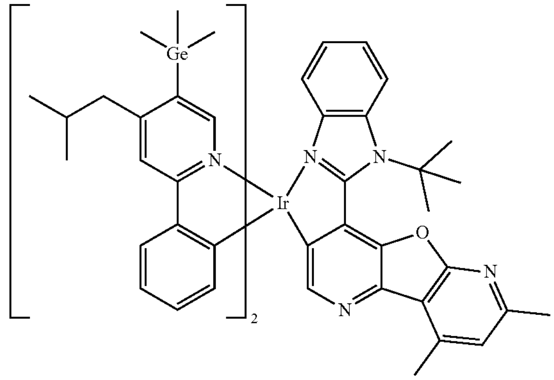
1953
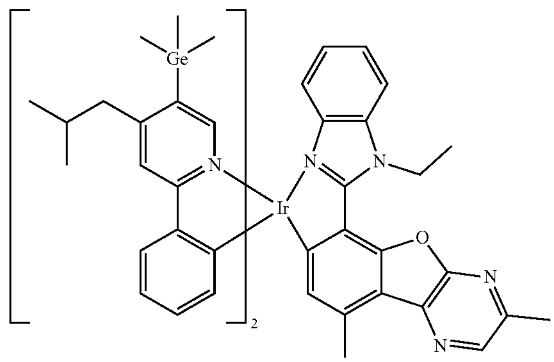
1954
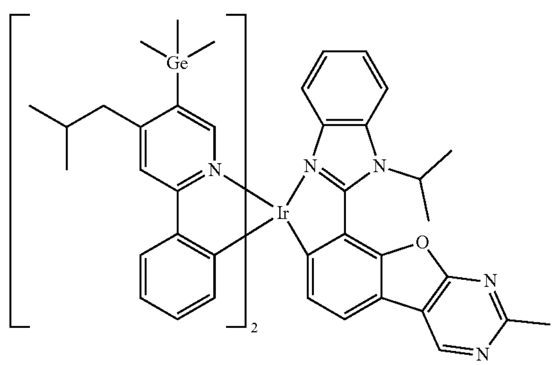
1955
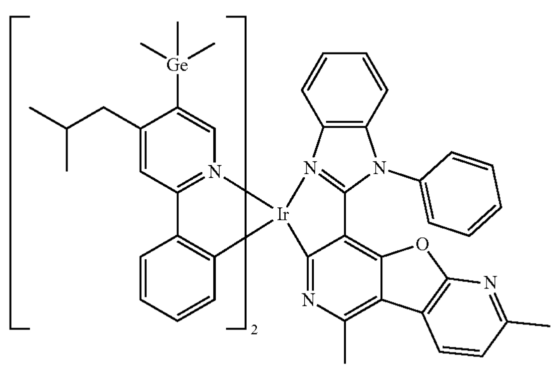

1956
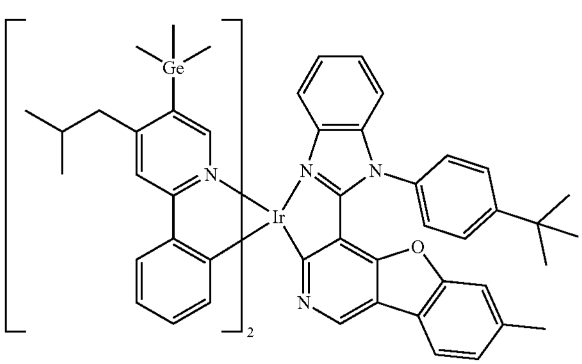
1957
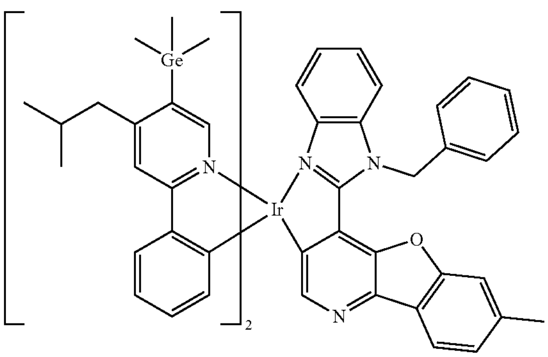
1958
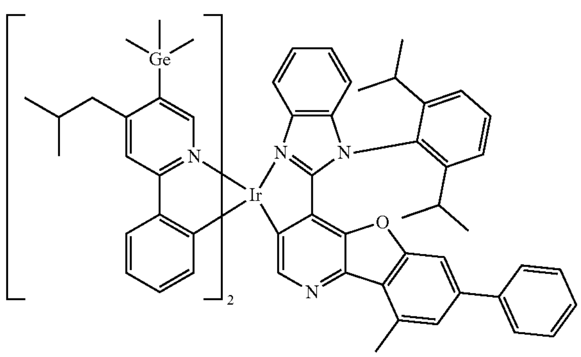
1959
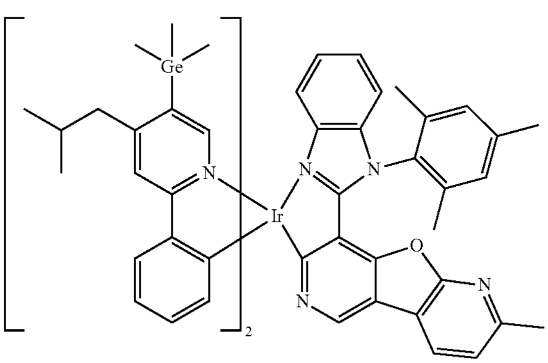
1960
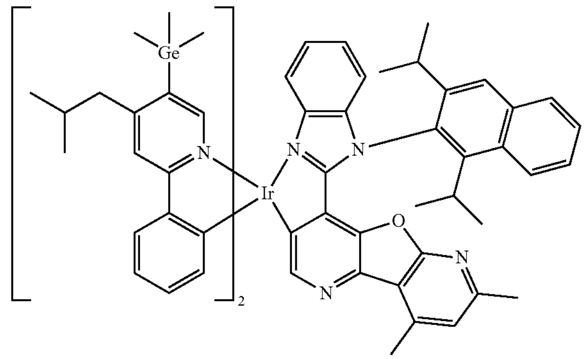
1961
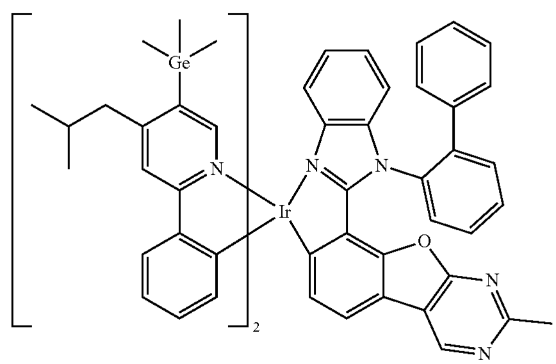
1962
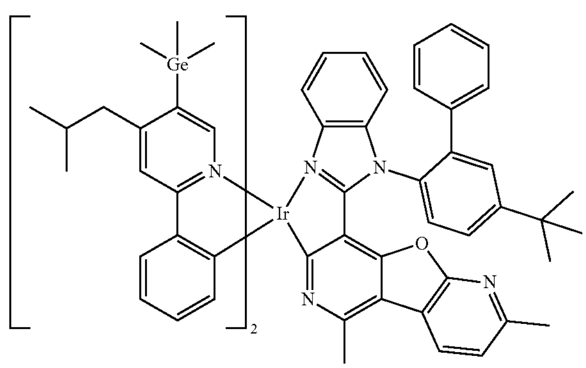
1963
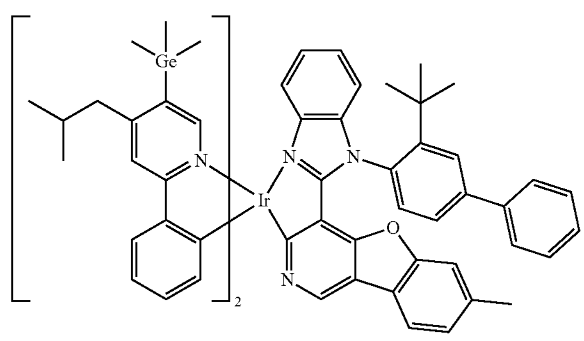

-continued
1964
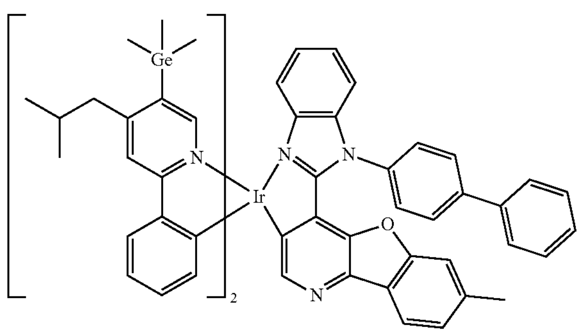
1965
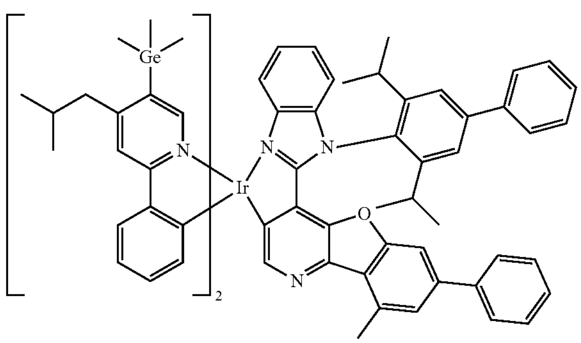
1966
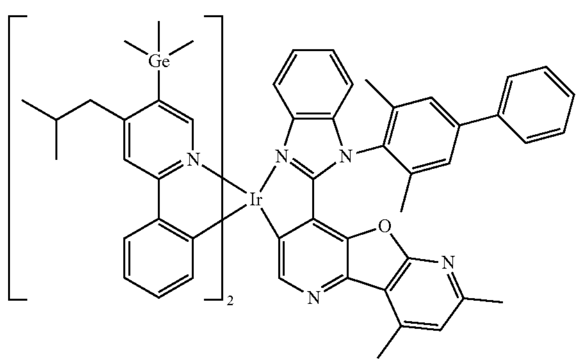
1967
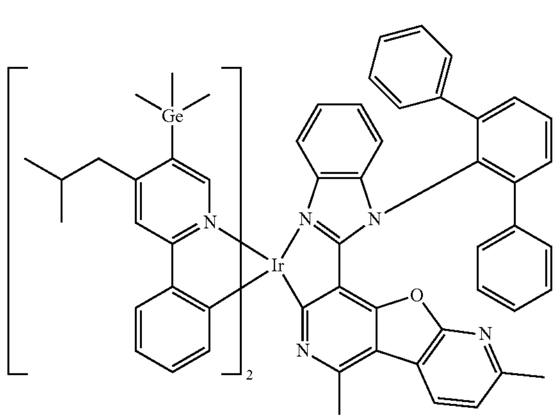
-continued
1968
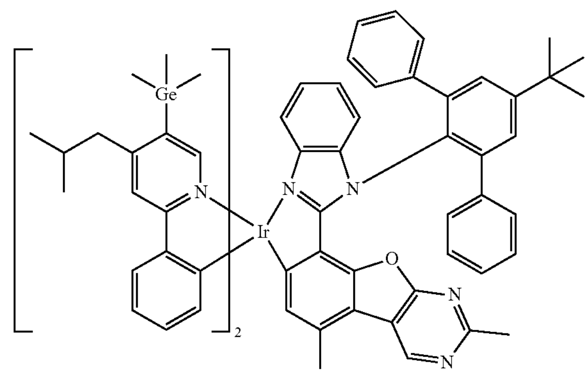
1969
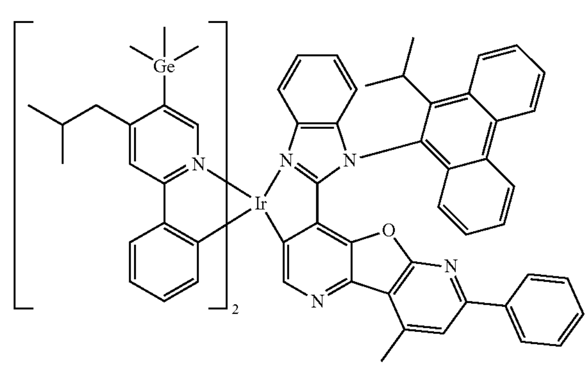
1970
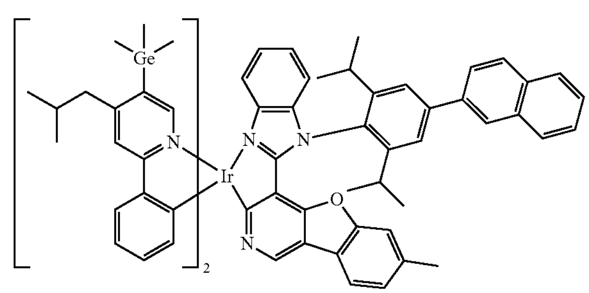
1971
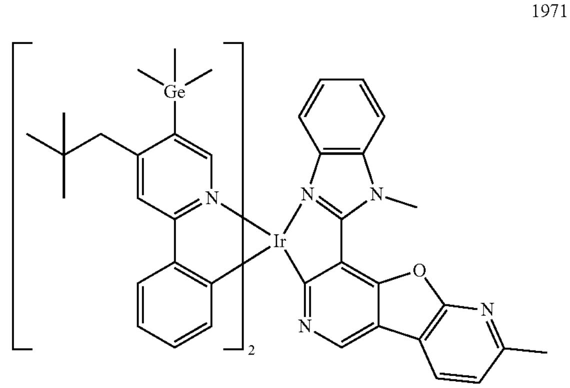

-continued
1972
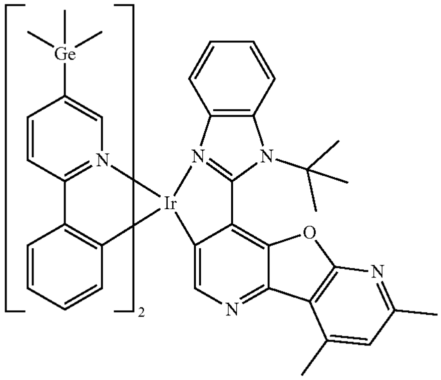
1973
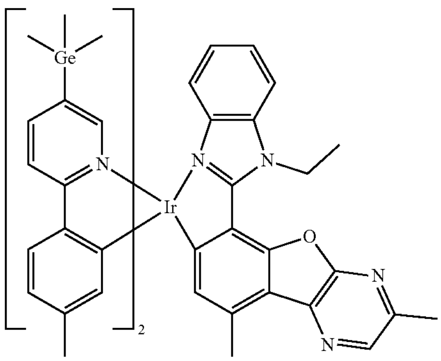
1974
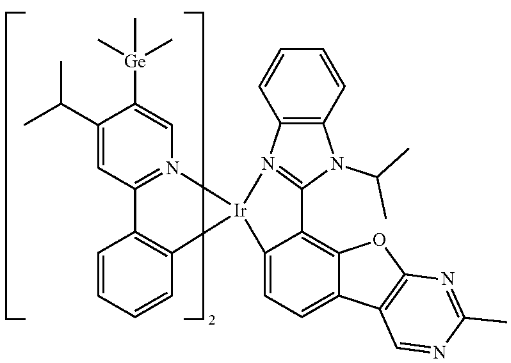
1975
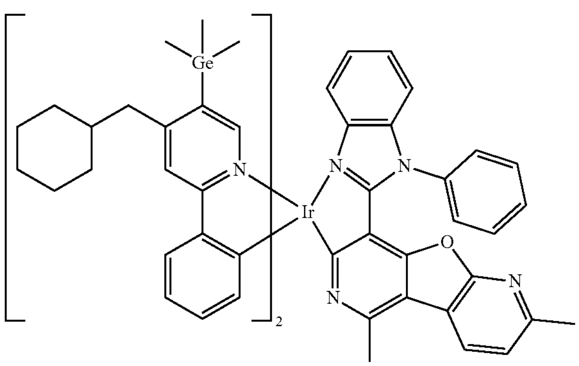
-continued
1976
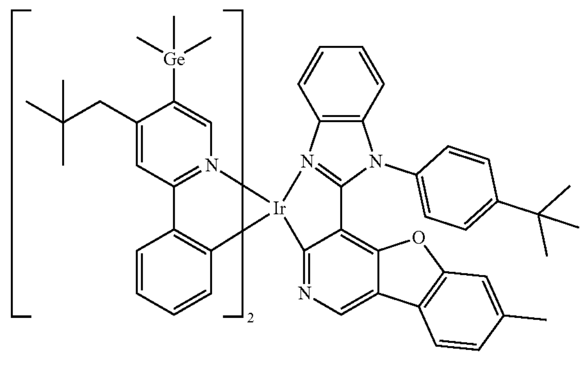
1977
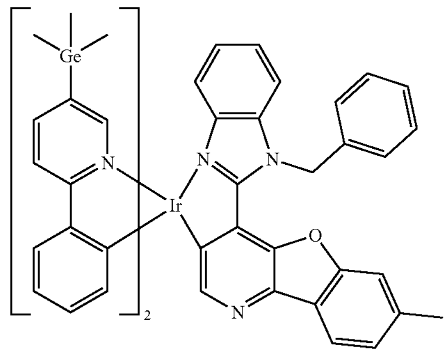
1978
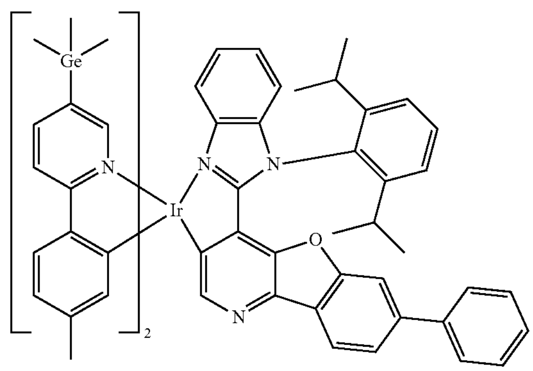
1979
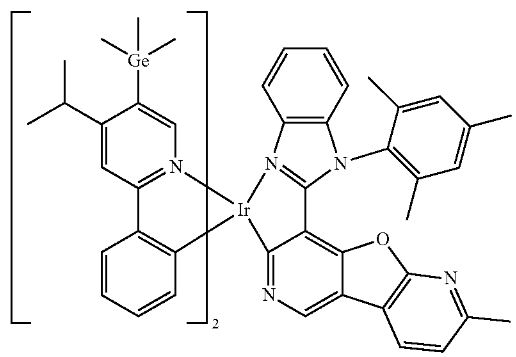

-continued
1980
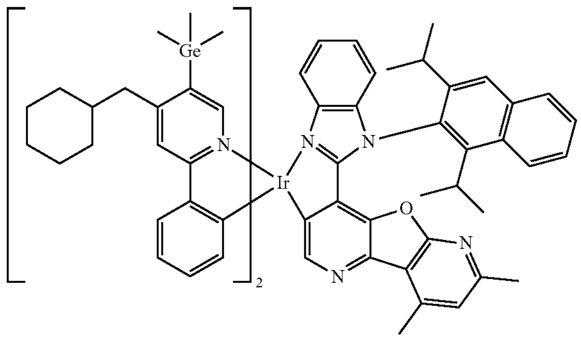
1981
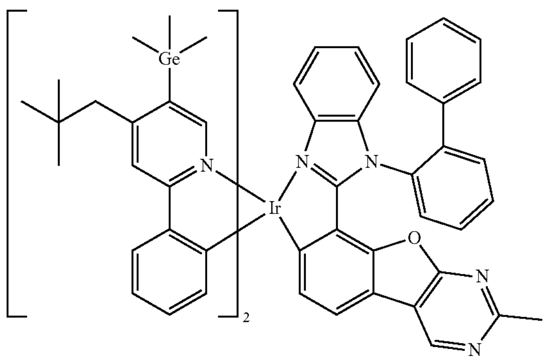
1982
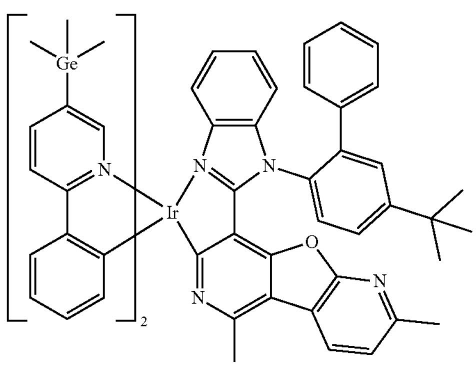
1983
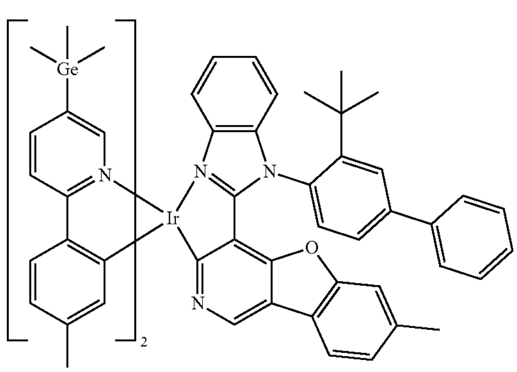
-continued
1984
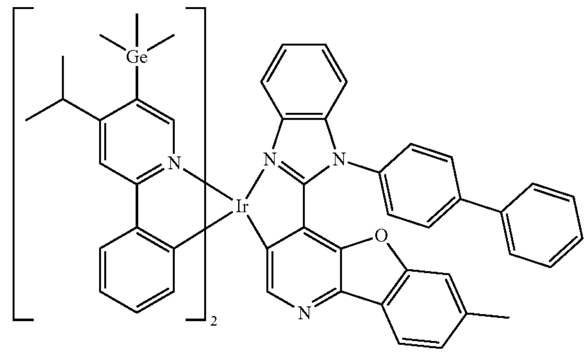
1985
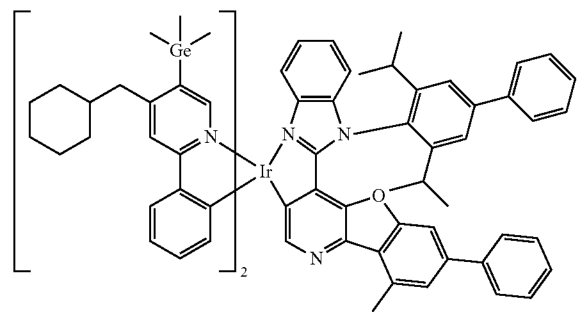
1986
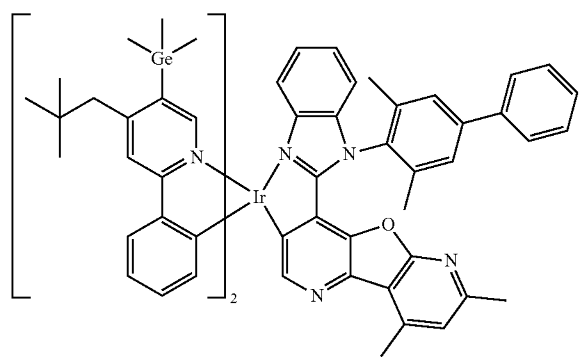
1987
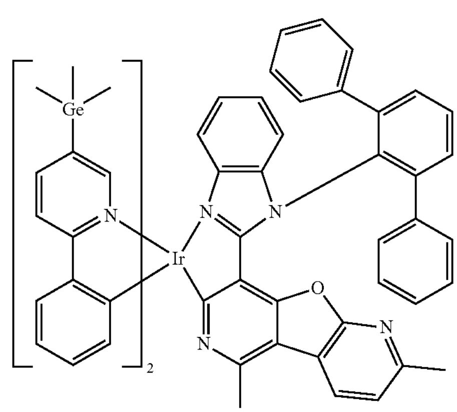

-continued
1988
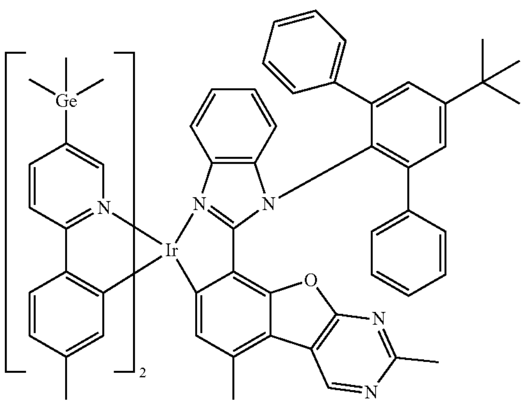
1989
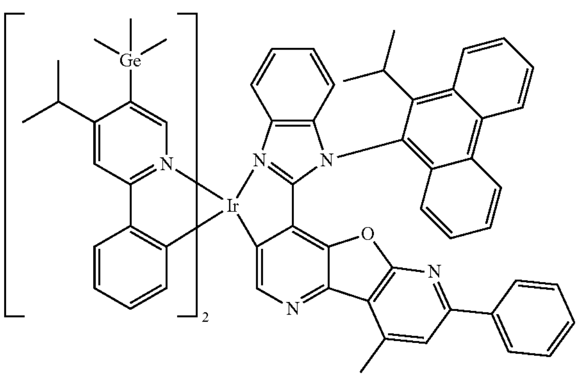
1990
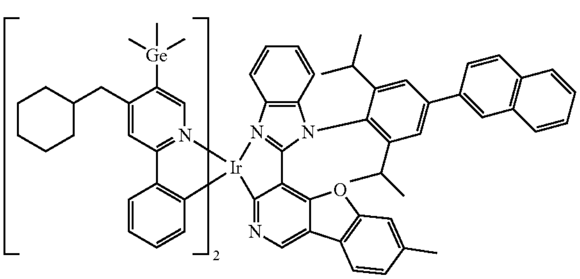
1991
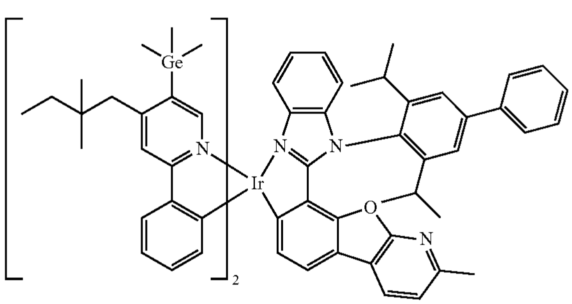
-continued
1992
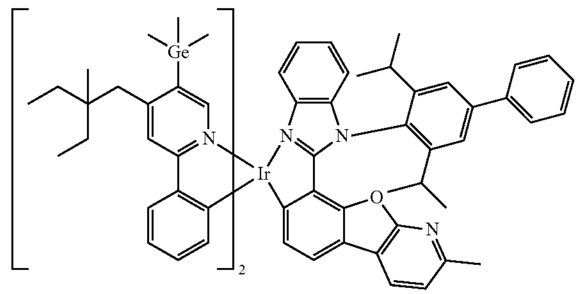
1993
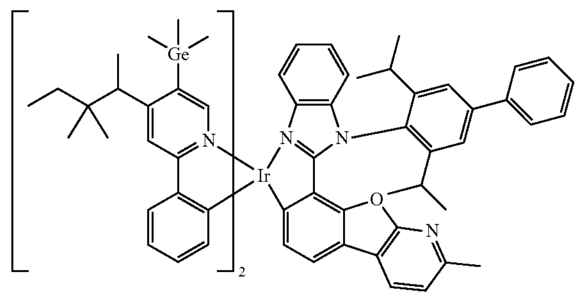
1994
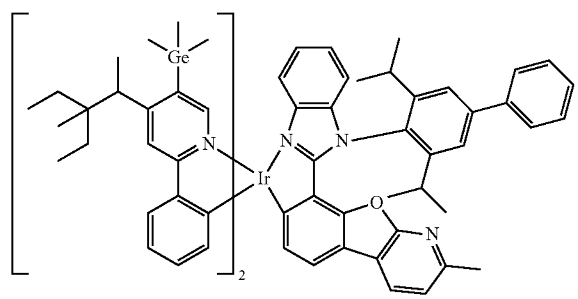
1995
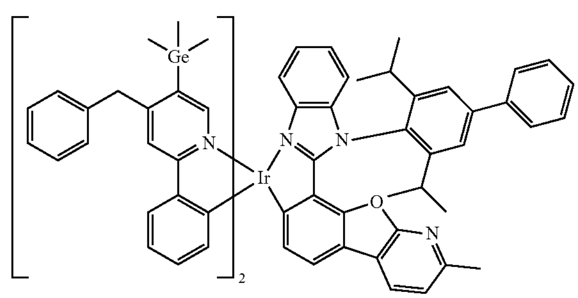
1996
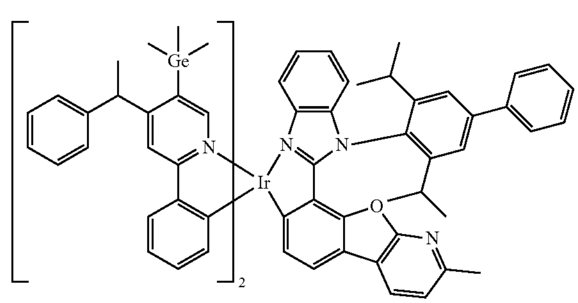

-continued
1997
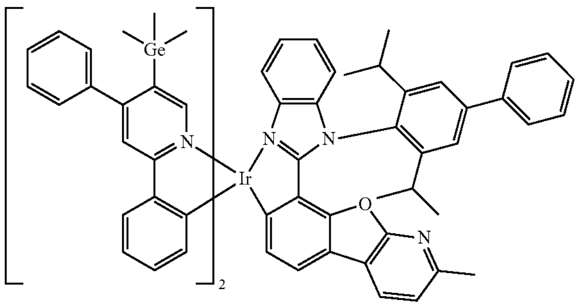
1998
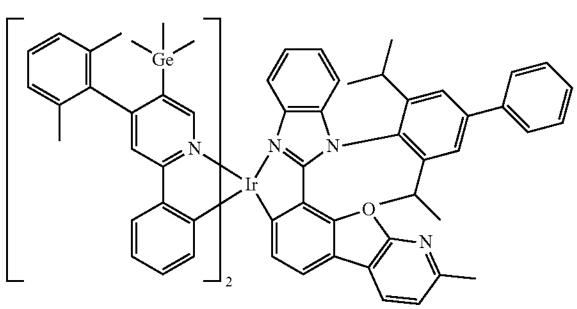
1999
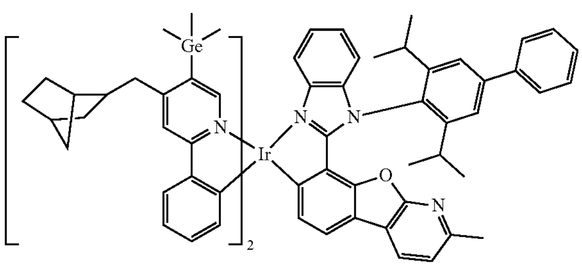
2000
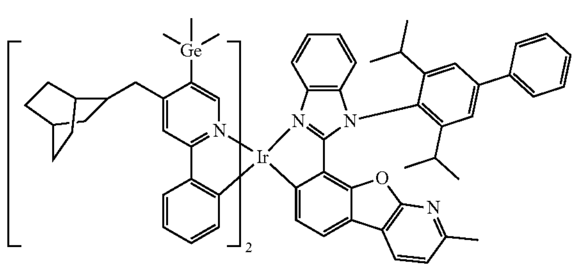
2001
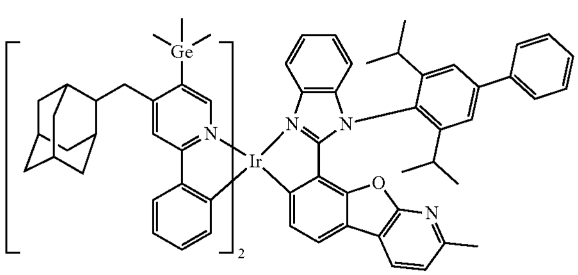
-continued
2002
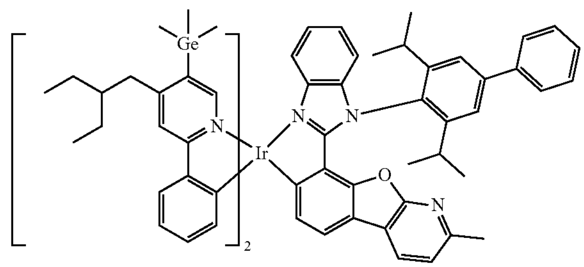
2003
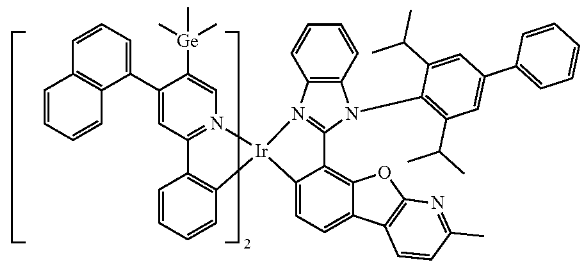
2004
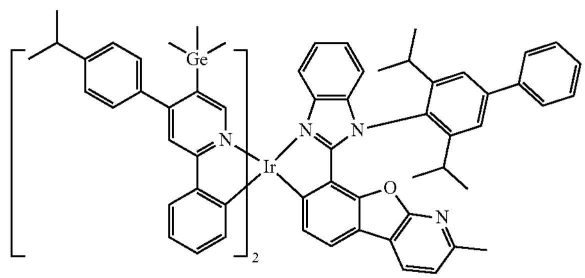
2005
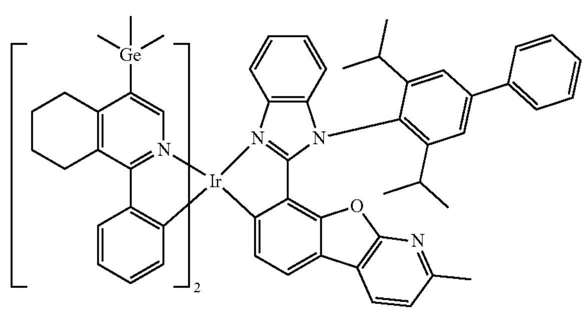
2006
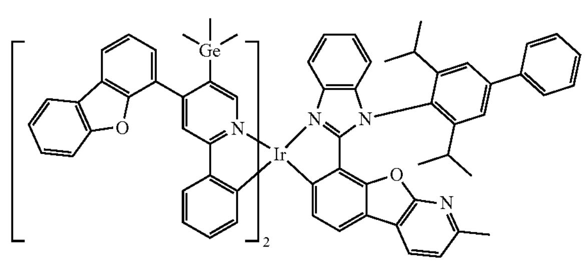

-continued
2007
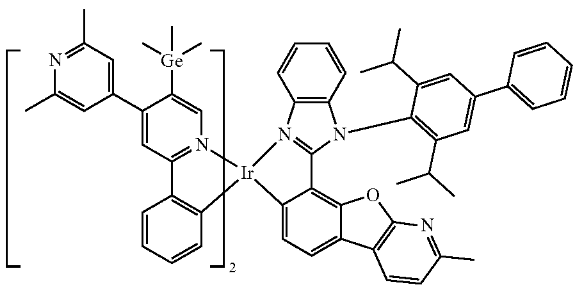
2008
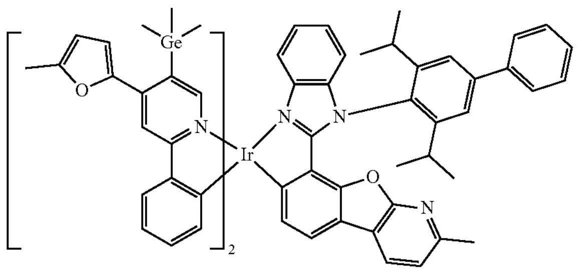
2009
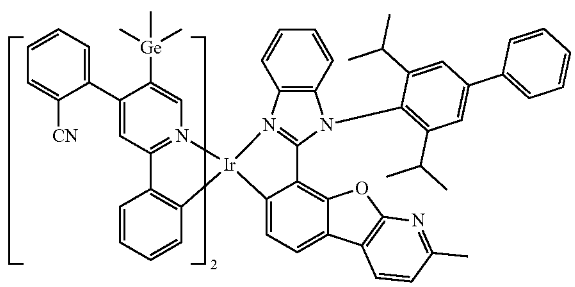
2010
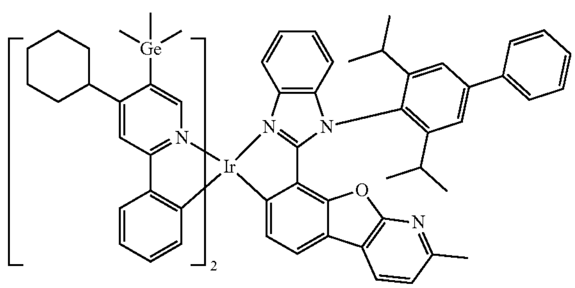
2011
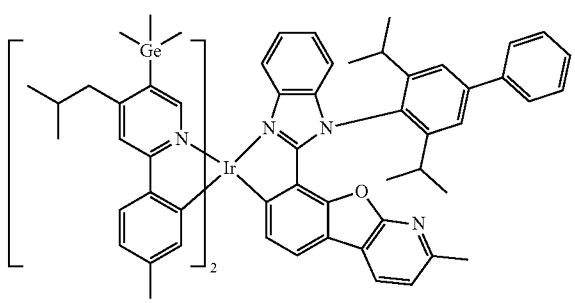
2012
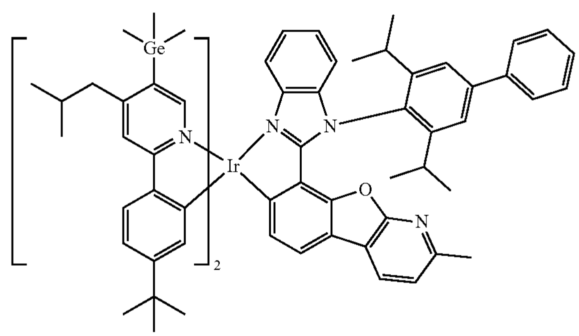
2013
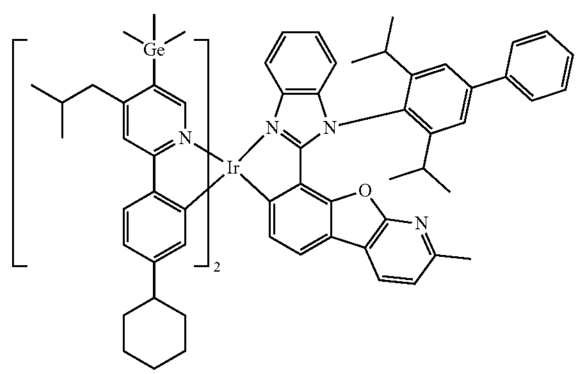
2014
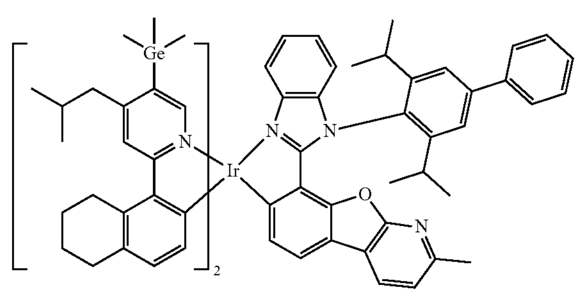
2015
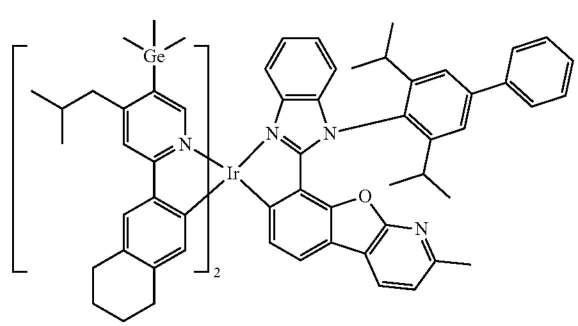

-continued
2016
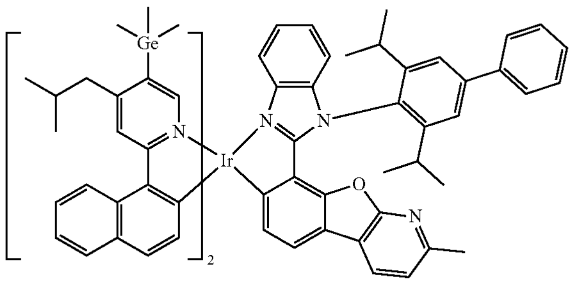
2017
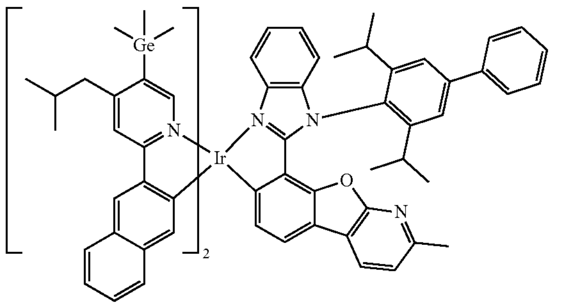
2018
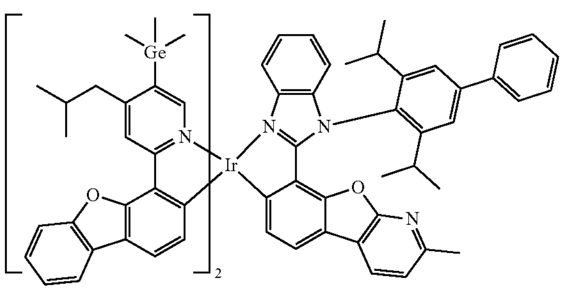
2019
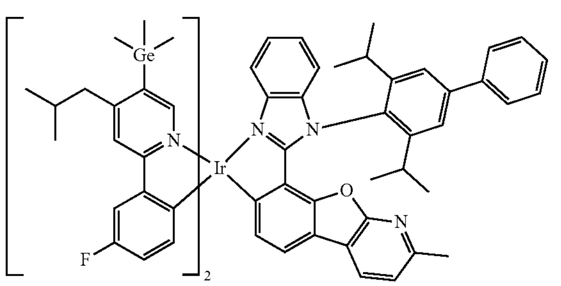
2020
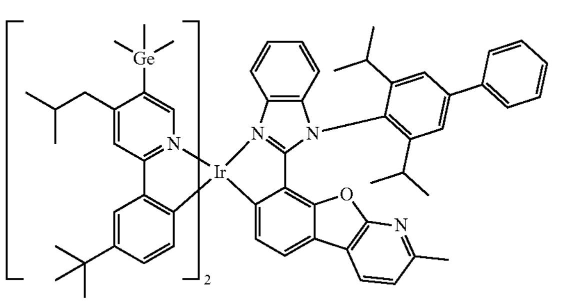
-continued
2021
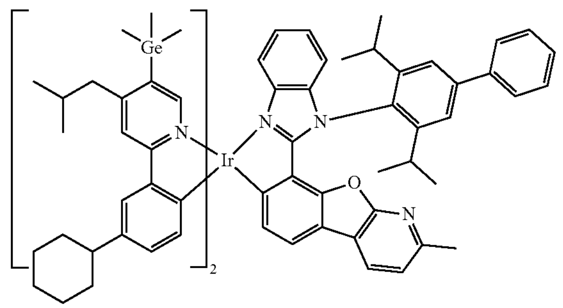
2022
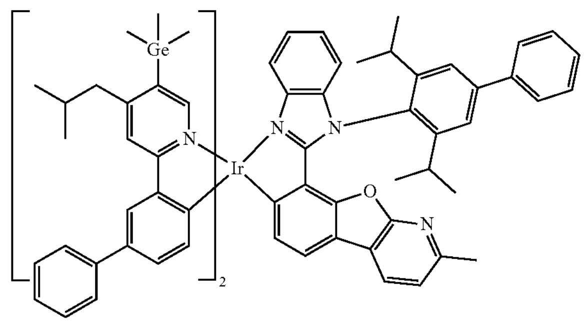
2023
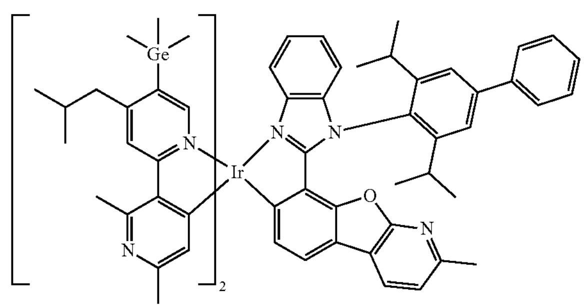
2024
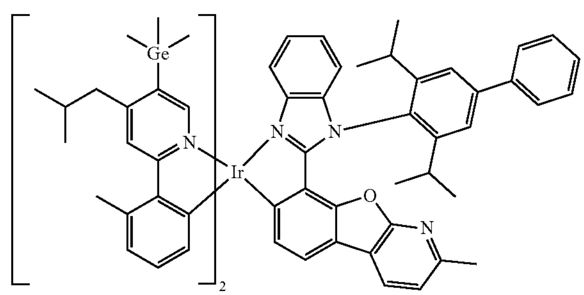
2025
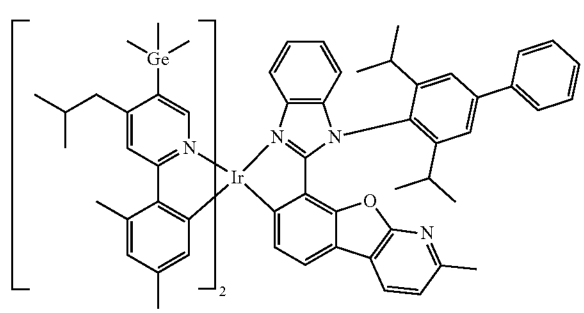

-continued
2026
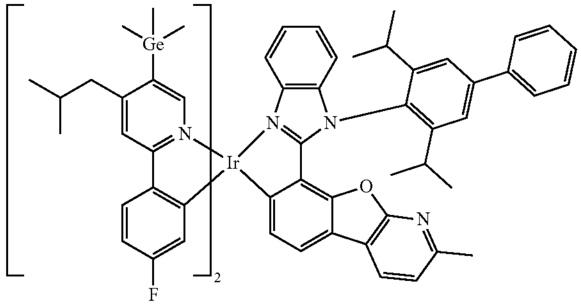
2027
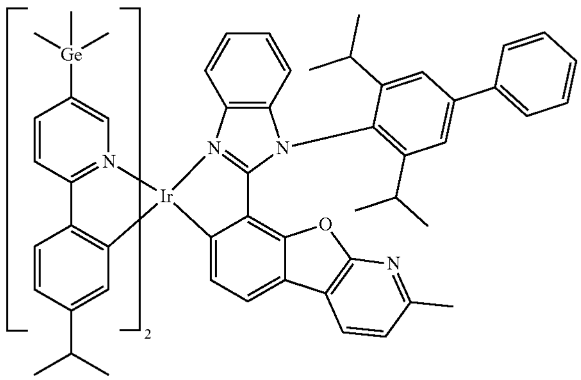
2028
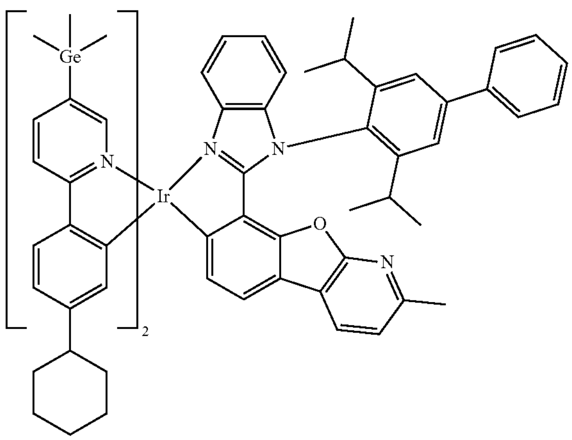
2029
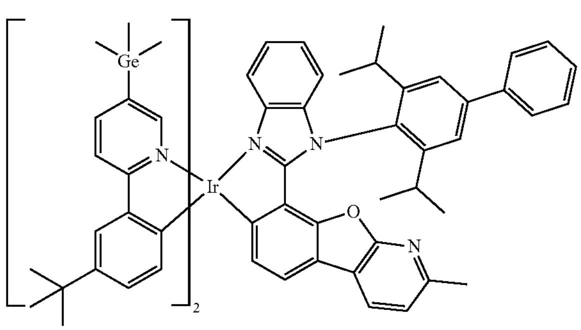
-continued
2030
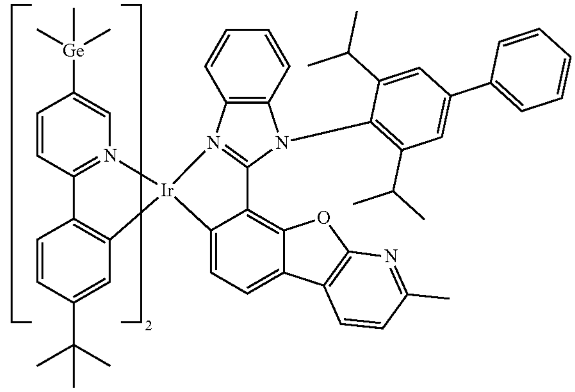
2031
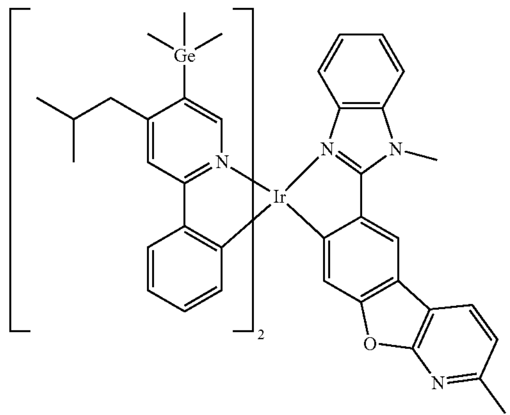
2032
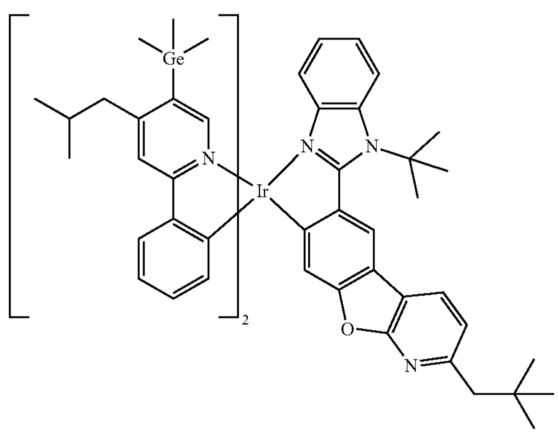

-continued
2033
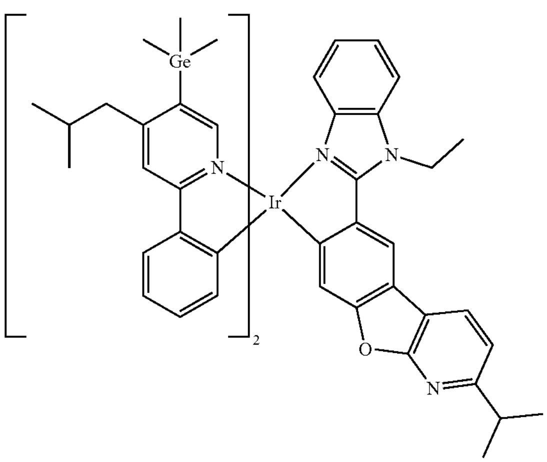
2034
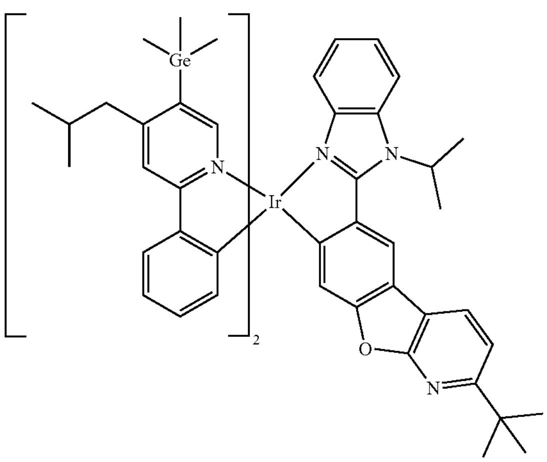
2035
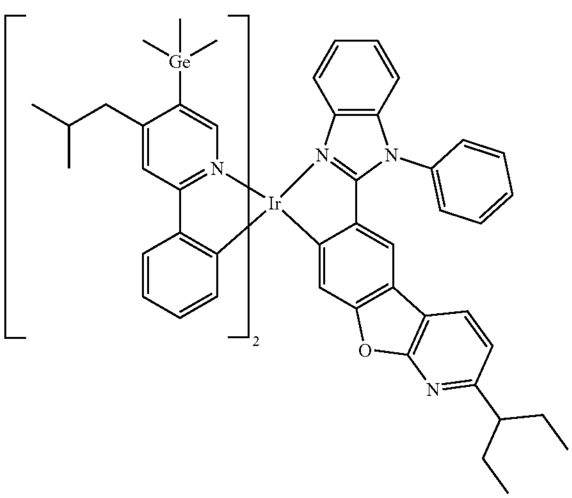
-continued
2036
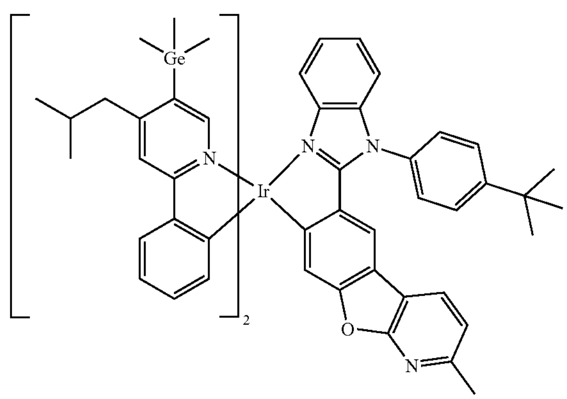
2037
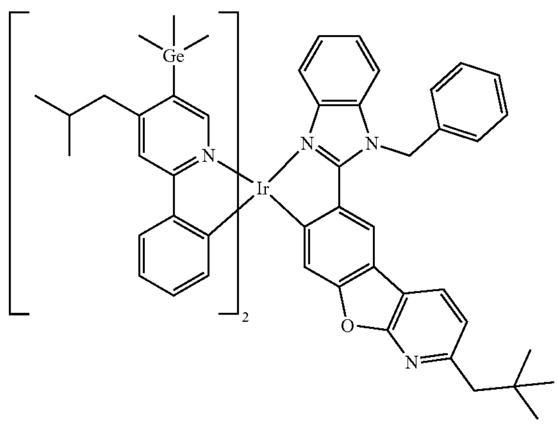
2038
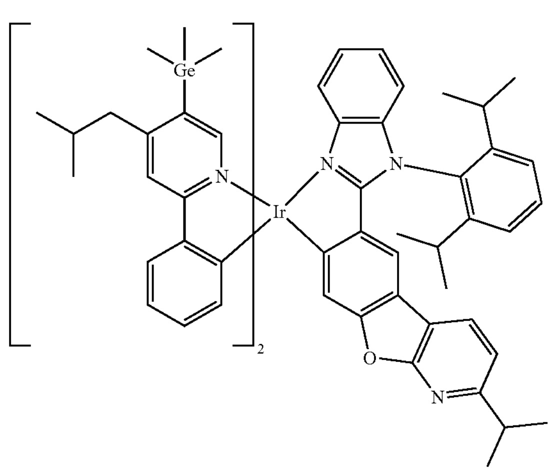

2039
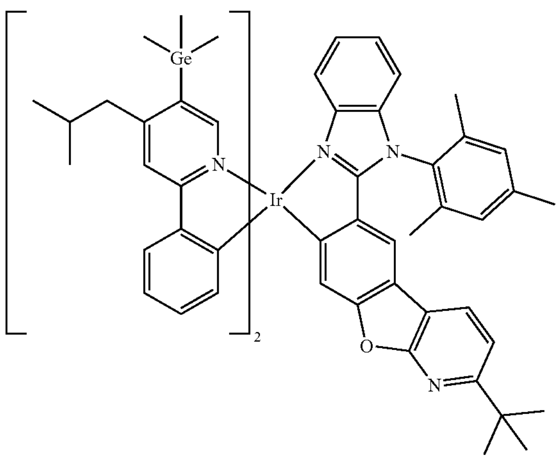
2040
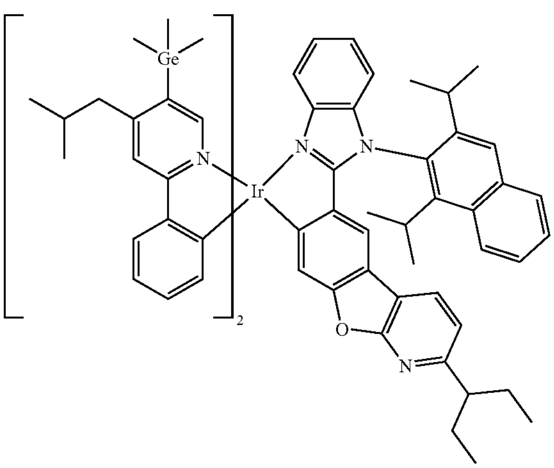
2041
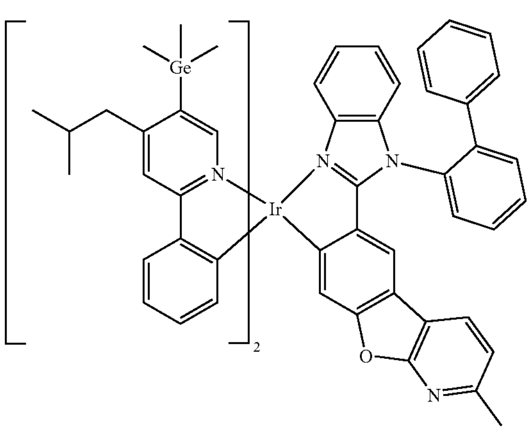
2042
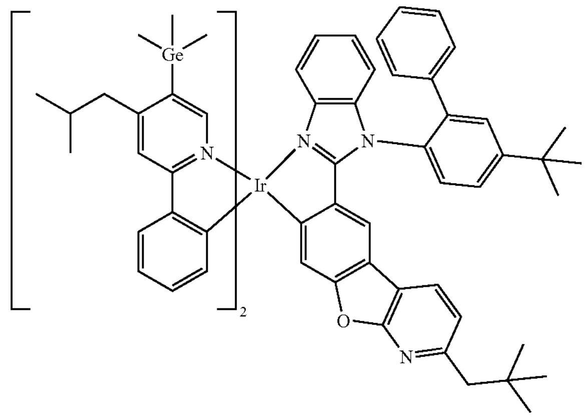
2043
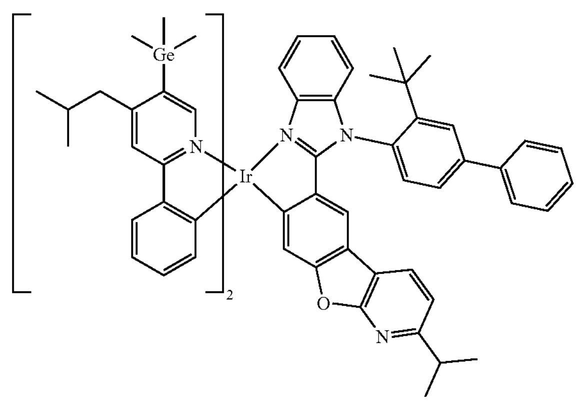
2044
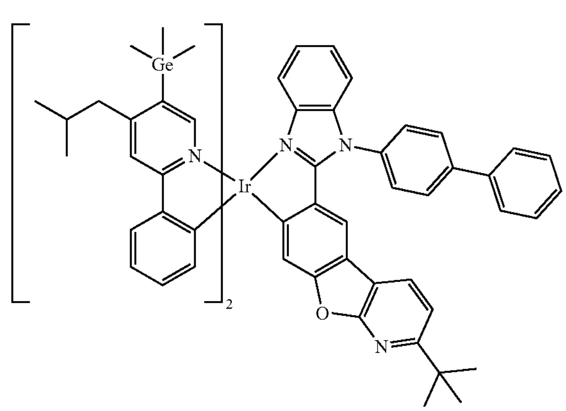

2045
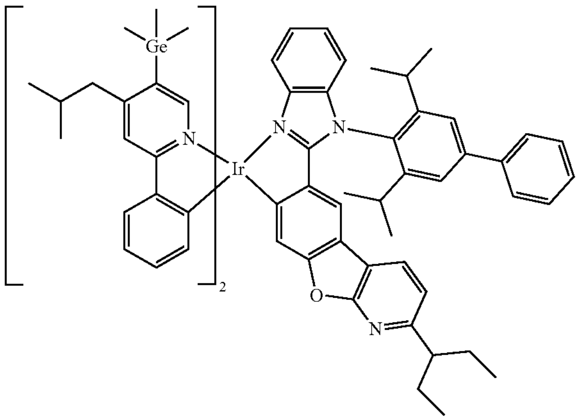
2046
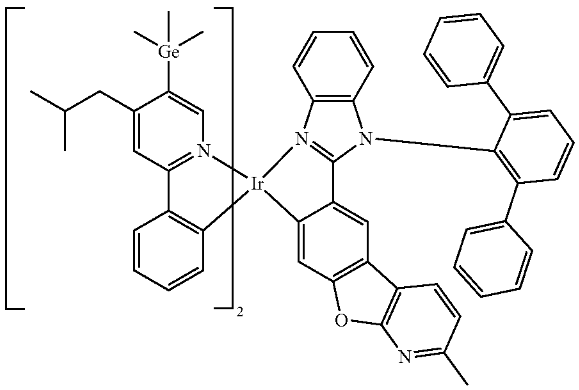
2047
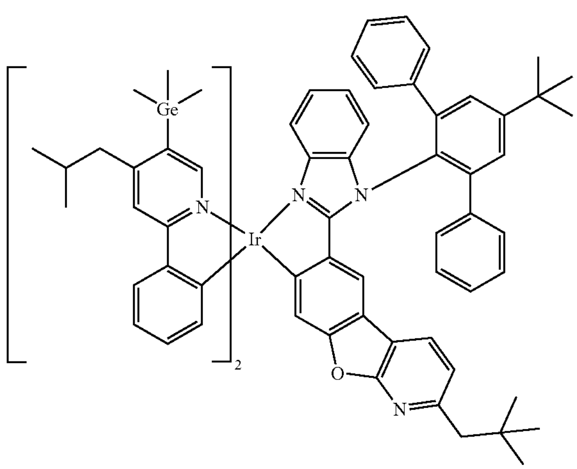
2048
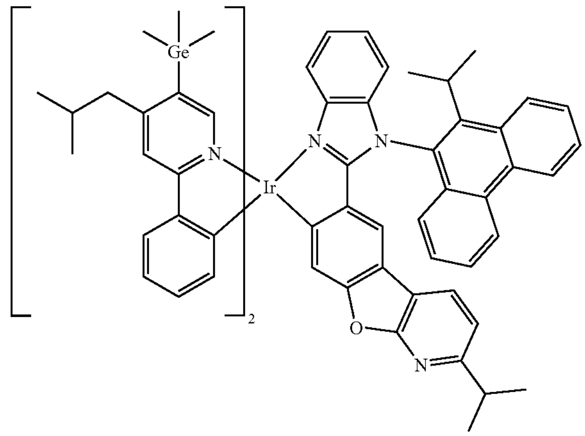
2049
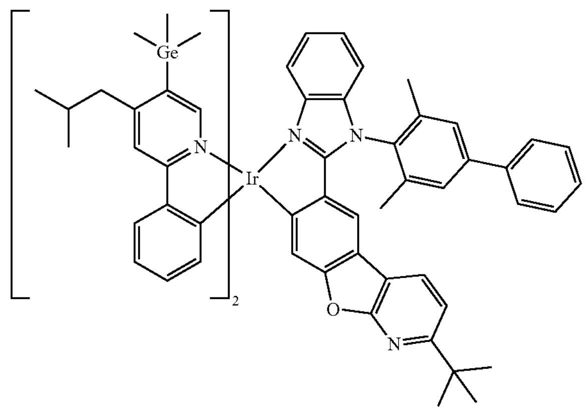
2050
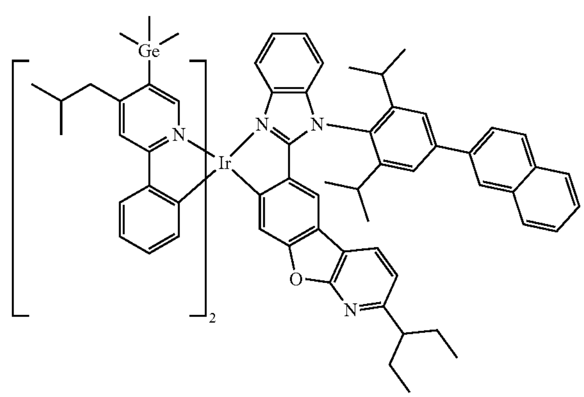

2051
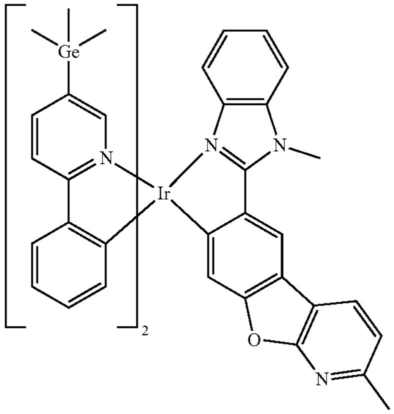
2052
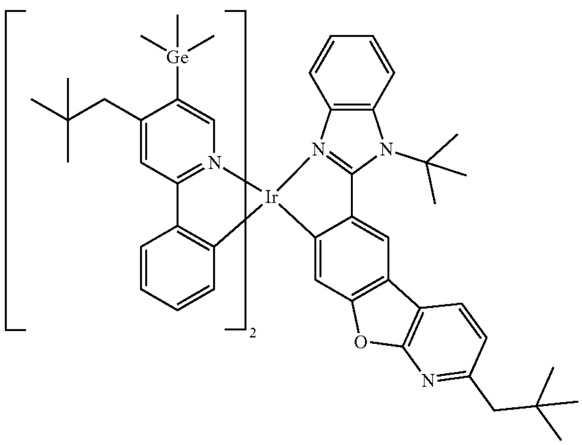
2053
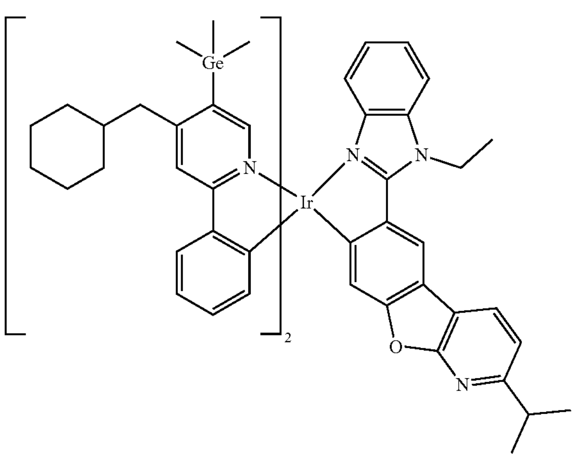
2054
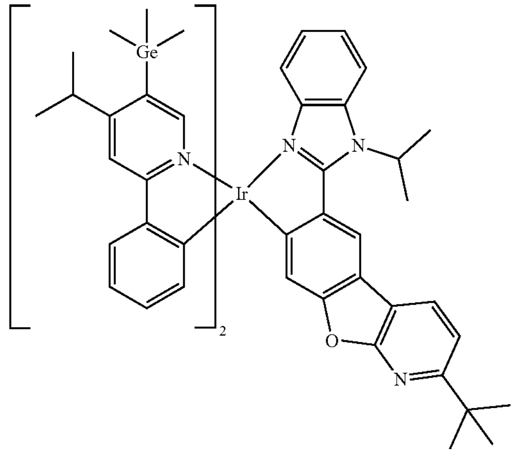
2055
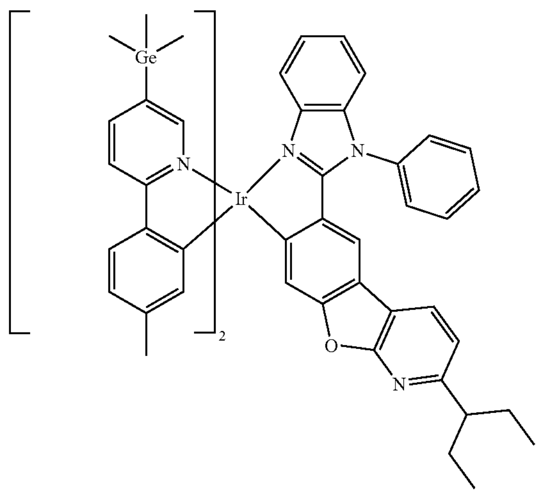
2056
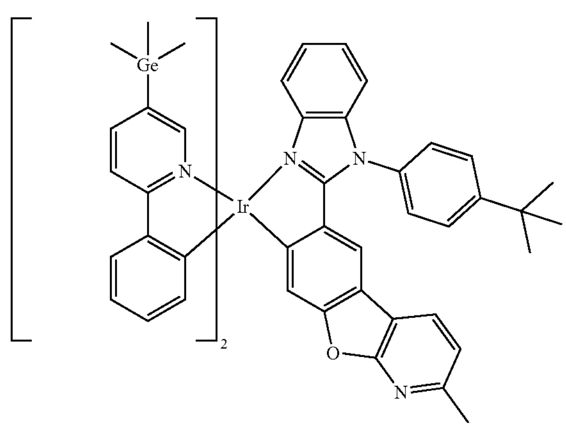

2057
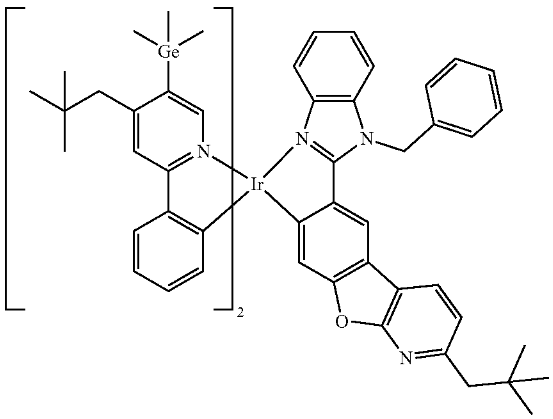
2058
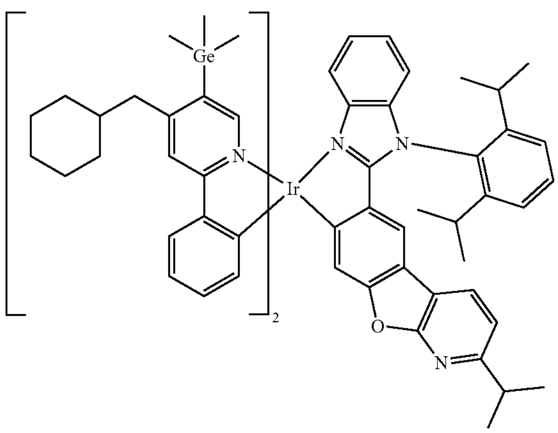
2059
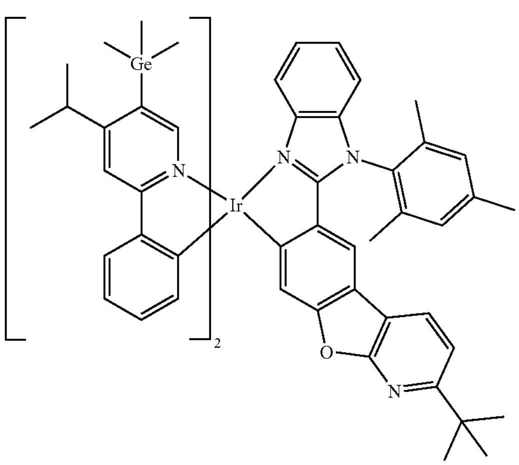
2060
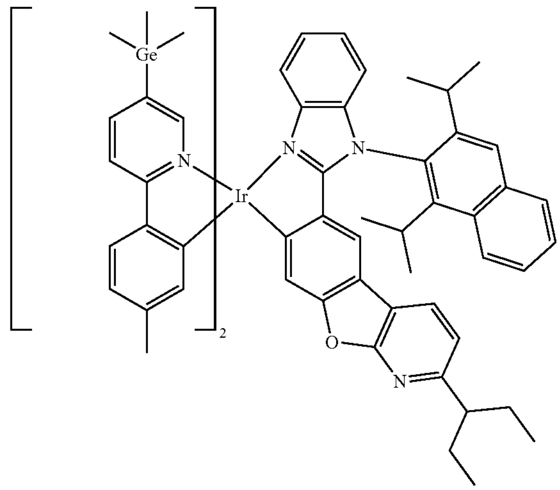
2061
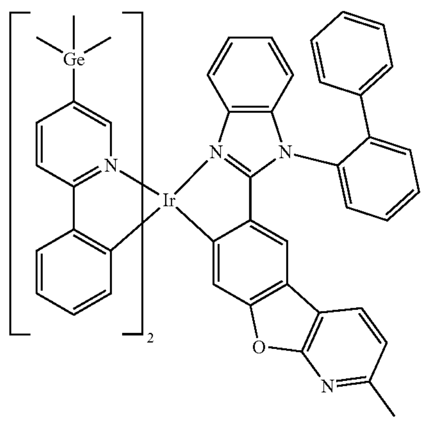
2062
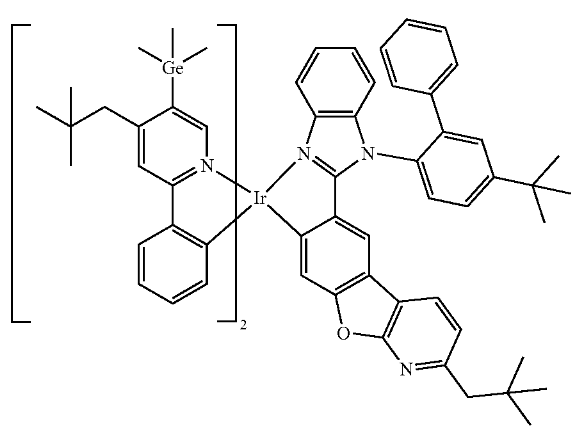

-continued
2063
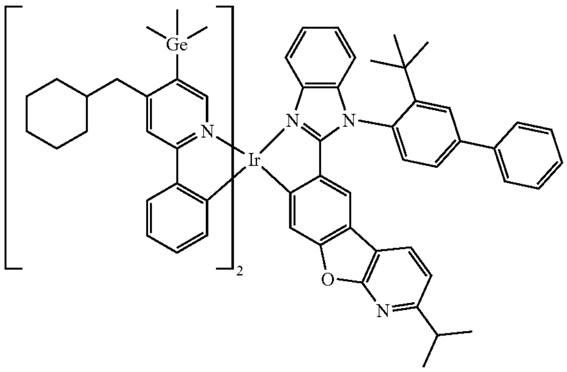
2064
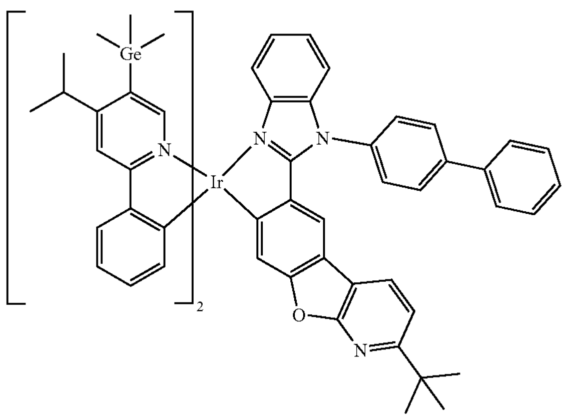
2065
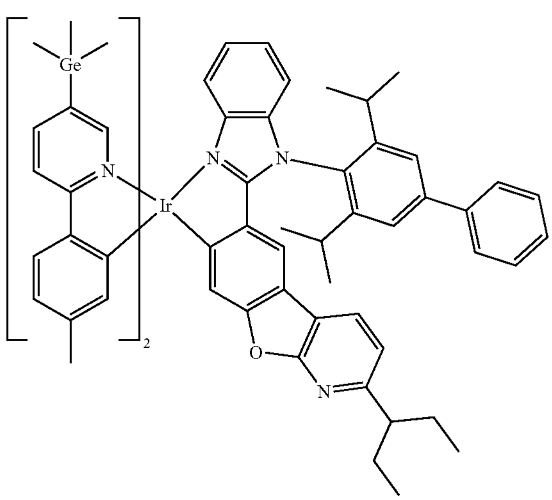
-continued
2066
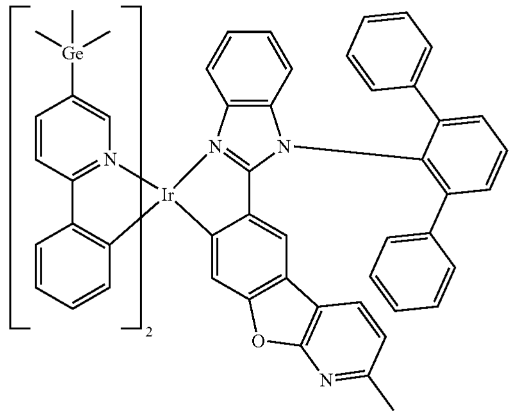
2067
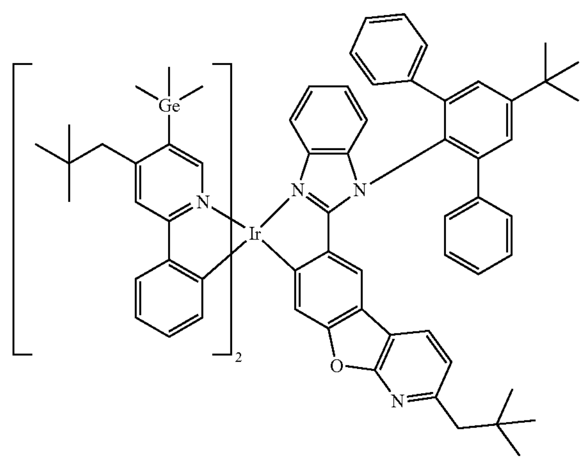
2068
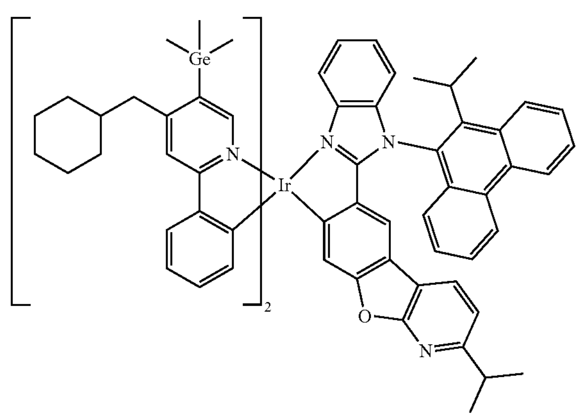

-continued
2069
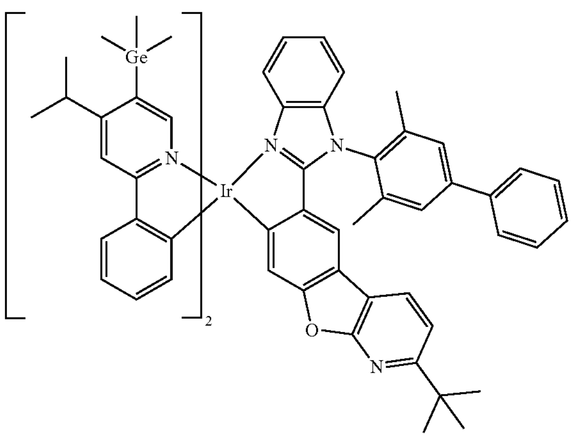
2070
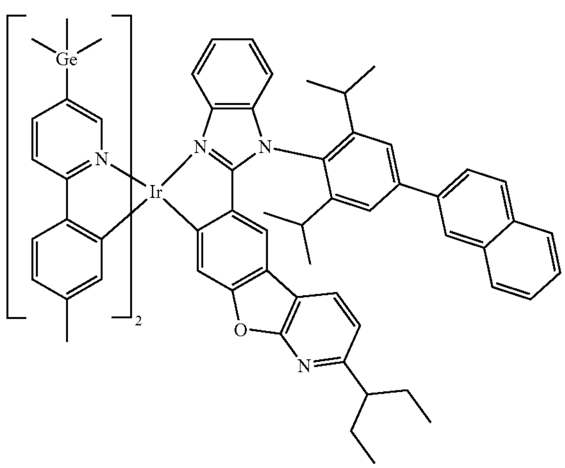
2071
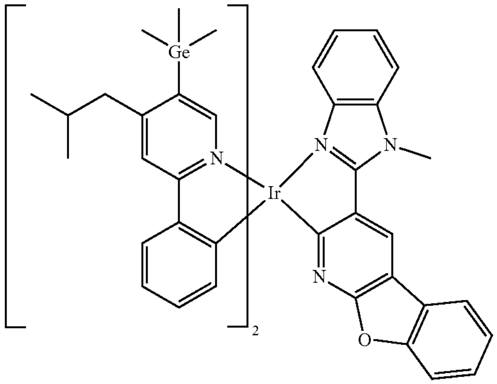
-continued
2072
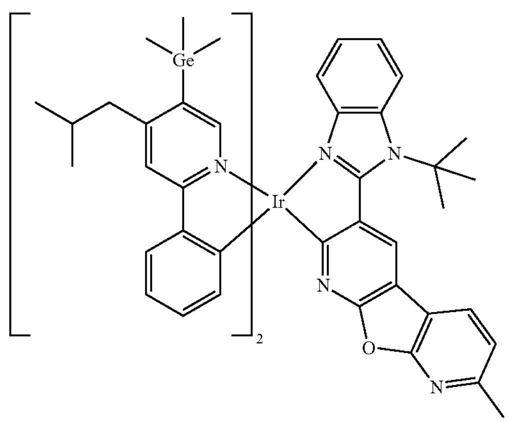
2073
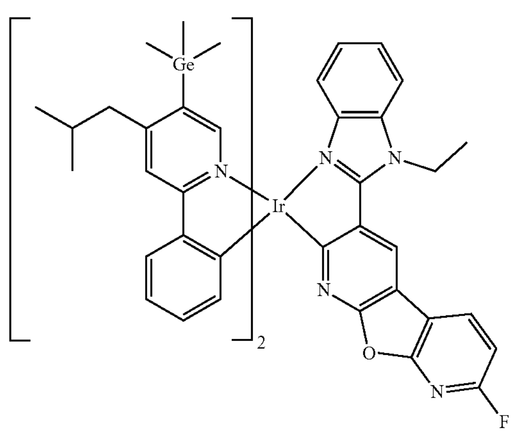
2074
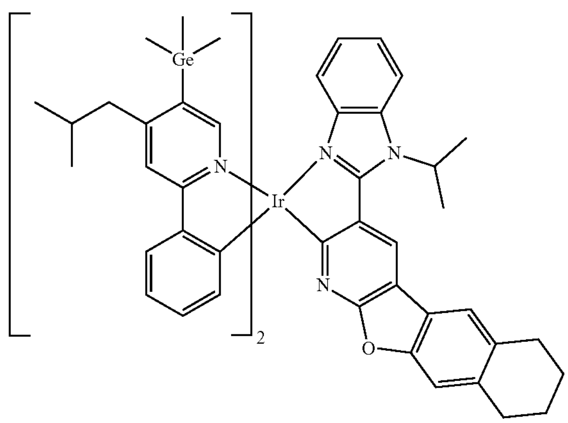

-continued
2075
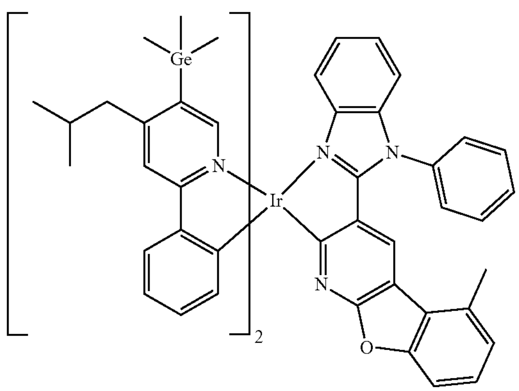
2076
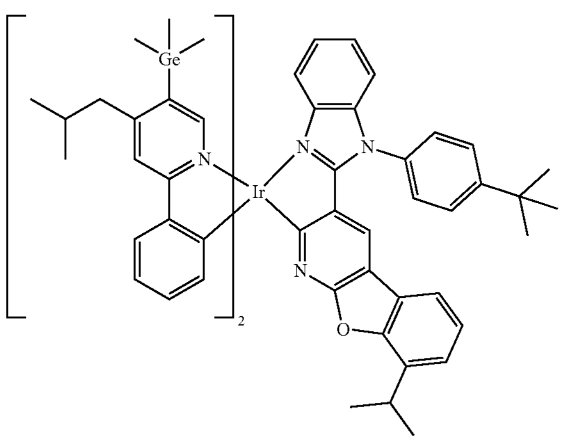
2077
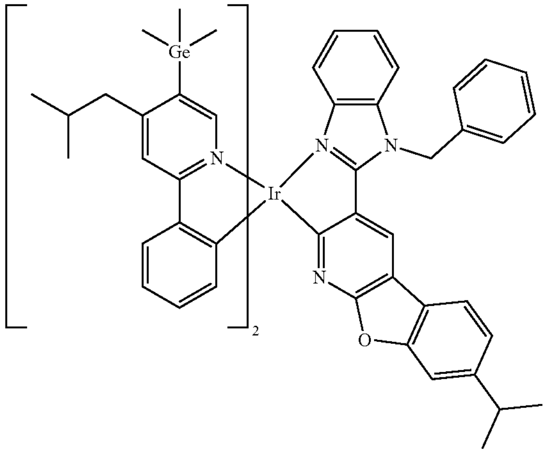
-continued
2078
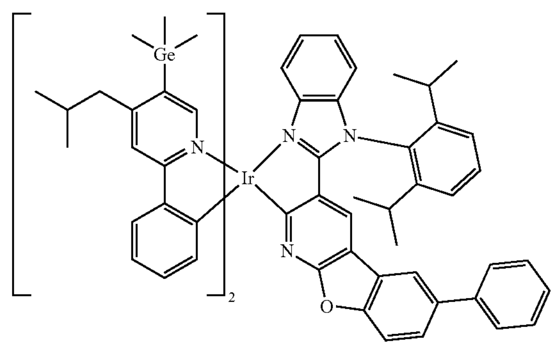
2079
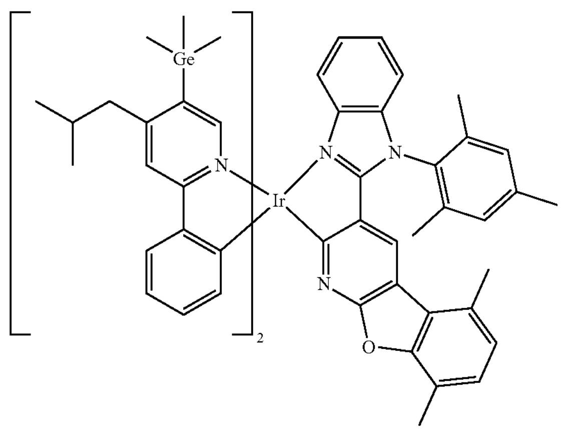
2080
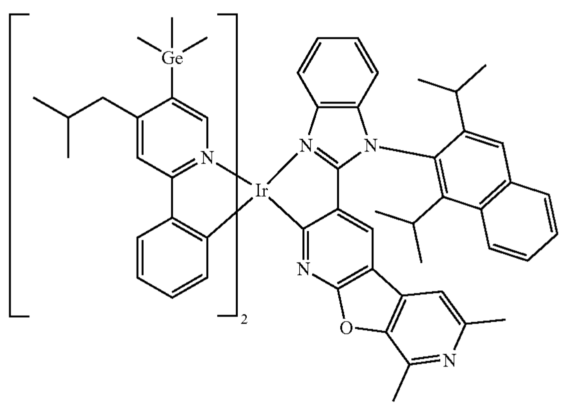
2081
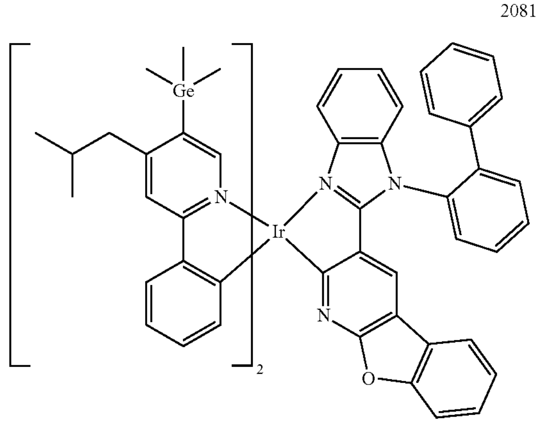

-continued
2082
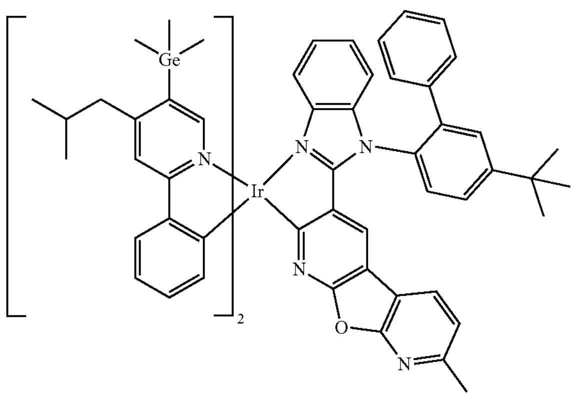
2083
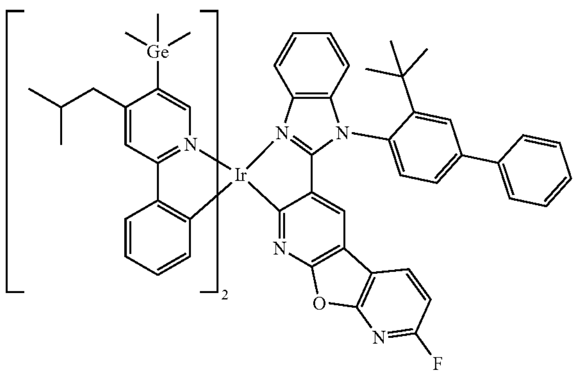
2084
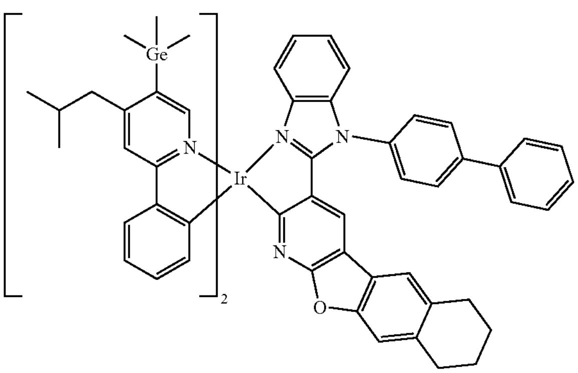
2085
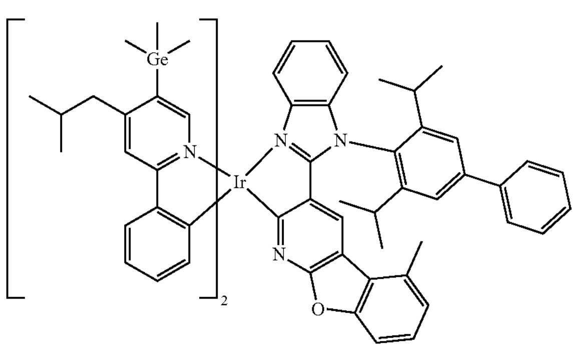
-continued
2086
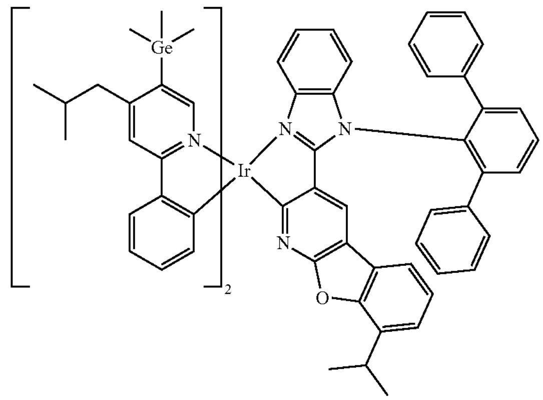
2087
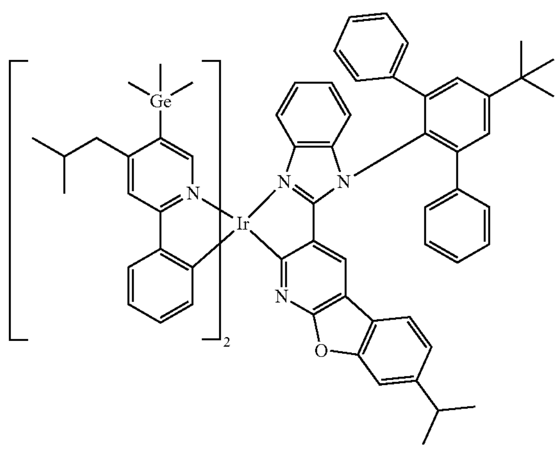
2088
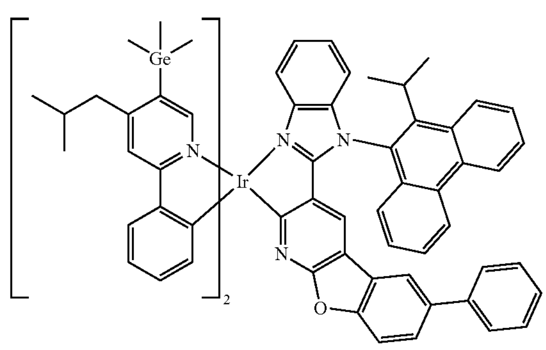

2089
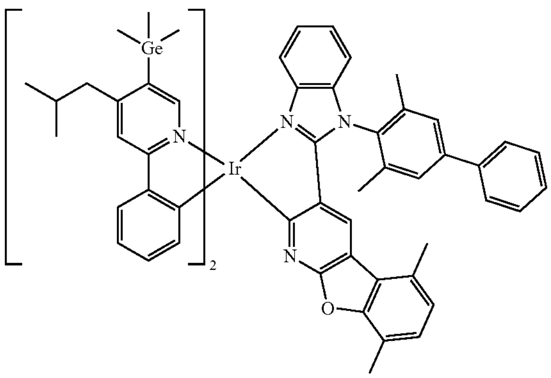
2090
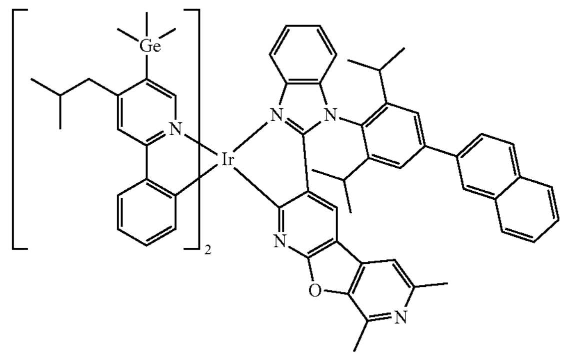
2091
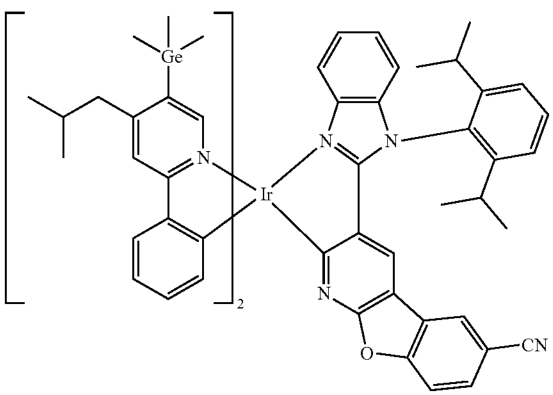
2092
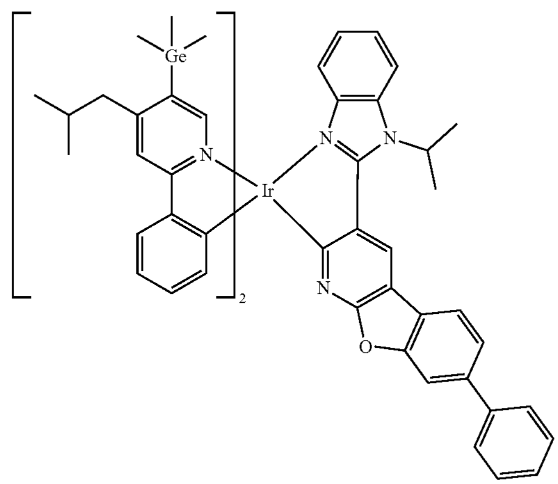
2093
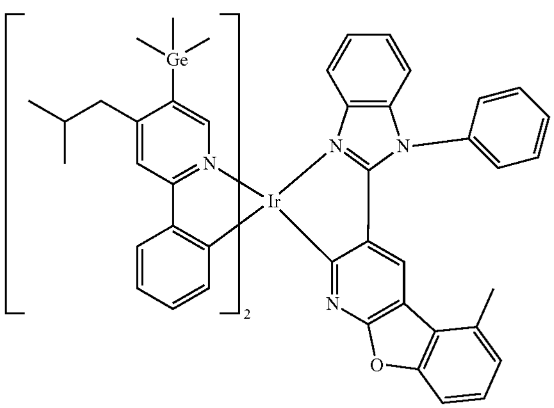
2094
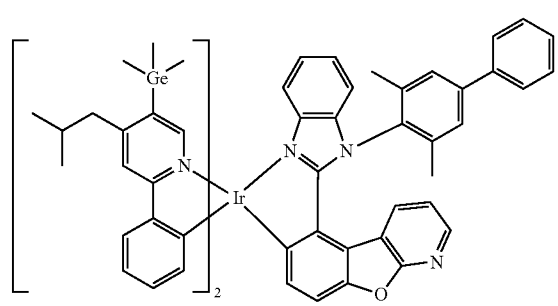

-continued
2095
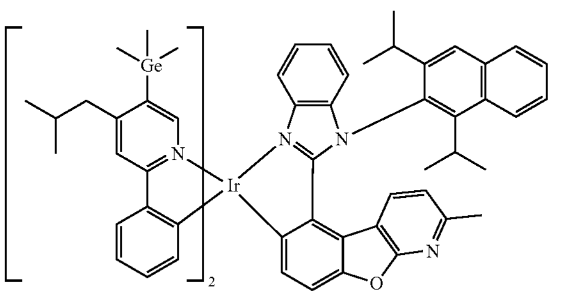
2096
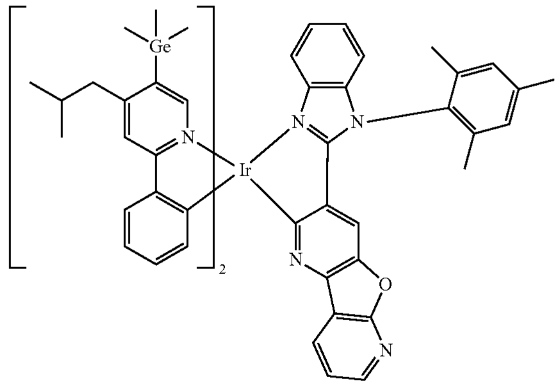
2097
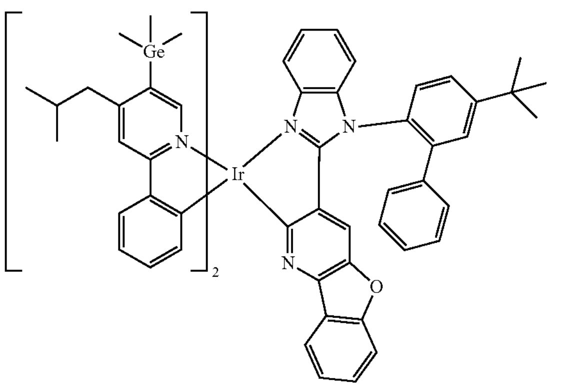
2098
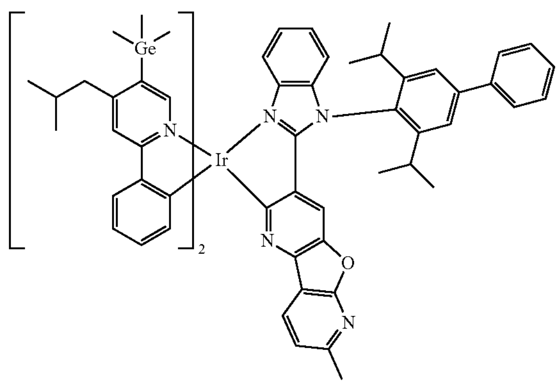
2099
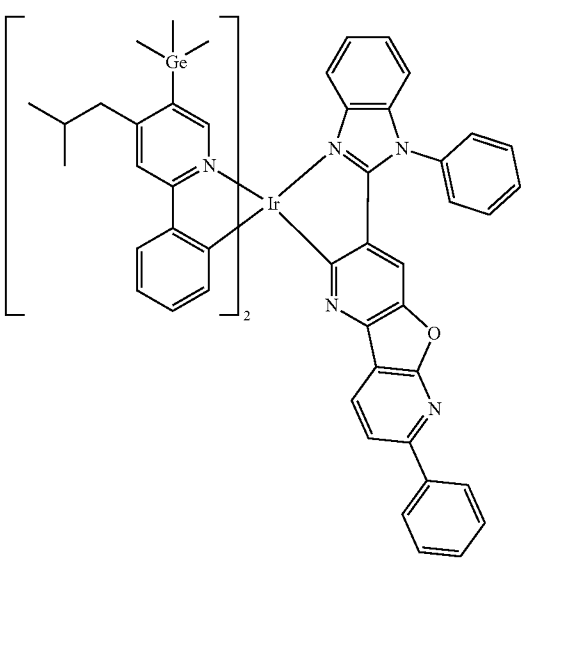
2100
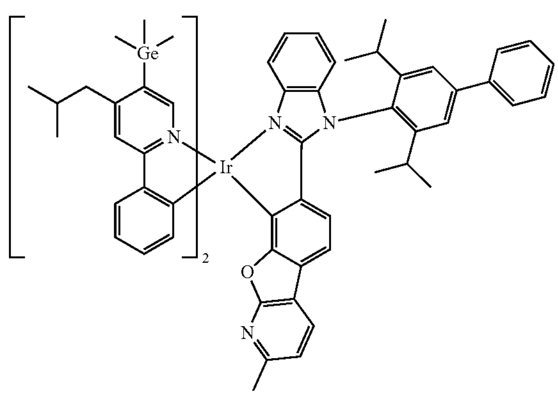

-continued
2101
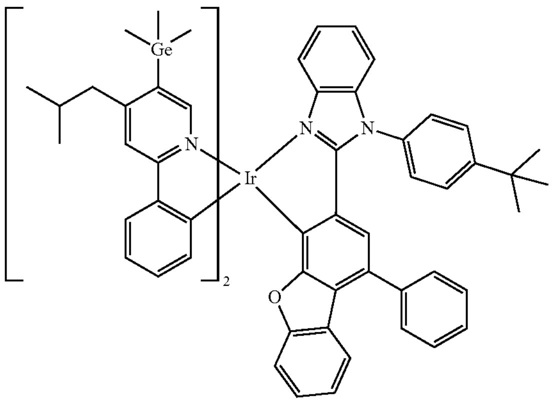
2102
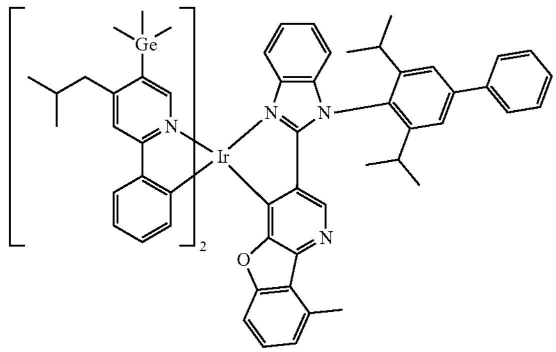
2103
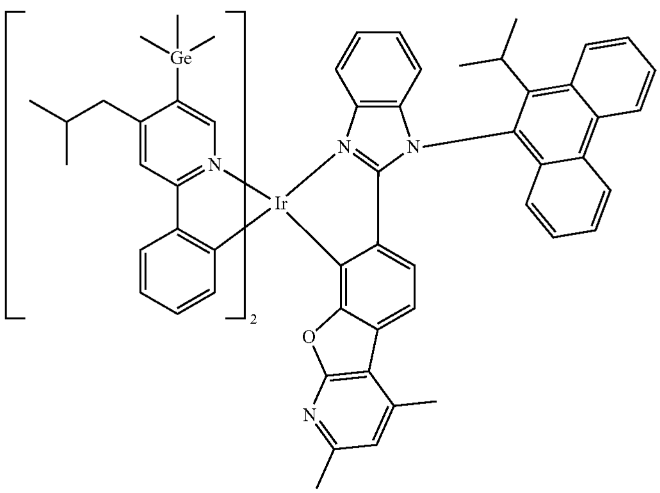
2104
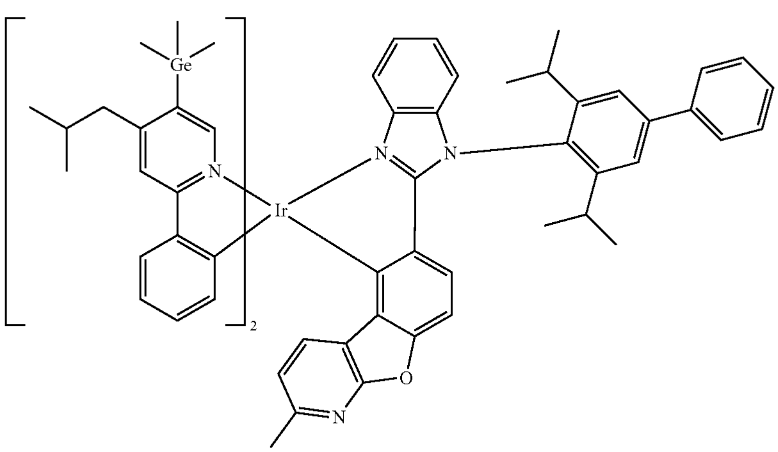

-continued
2105
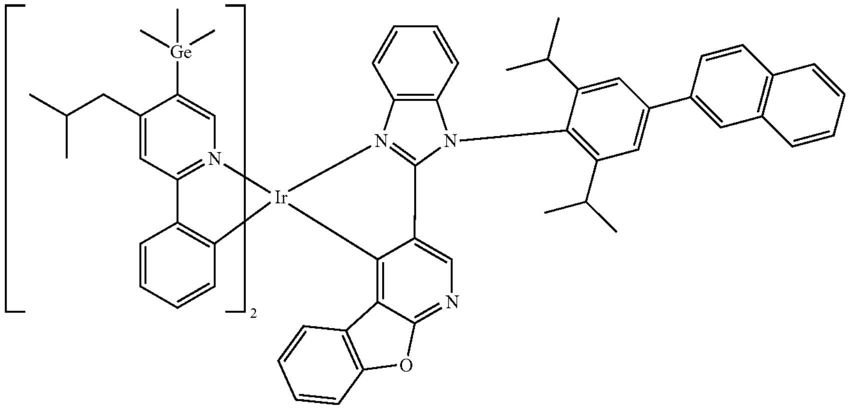
2106
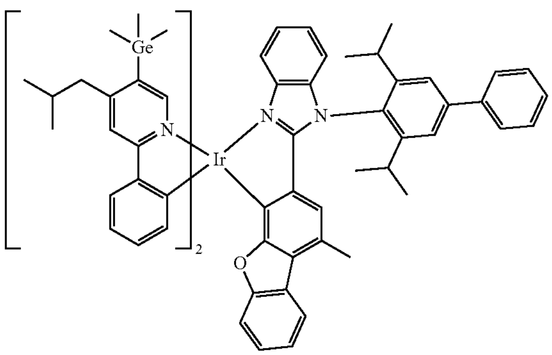
2107
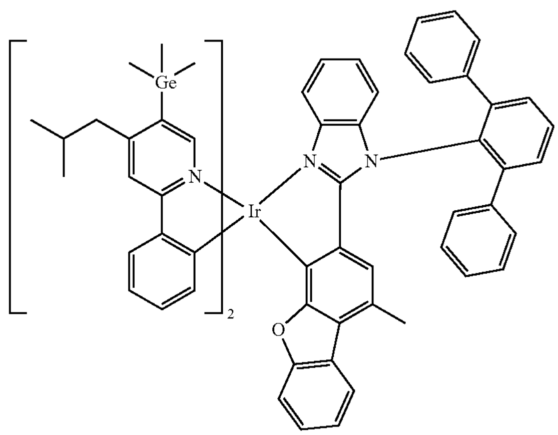
2108
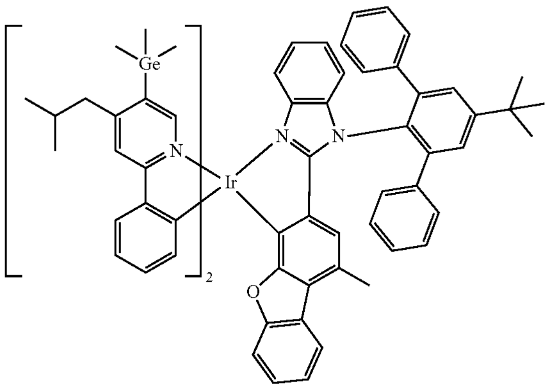
2109
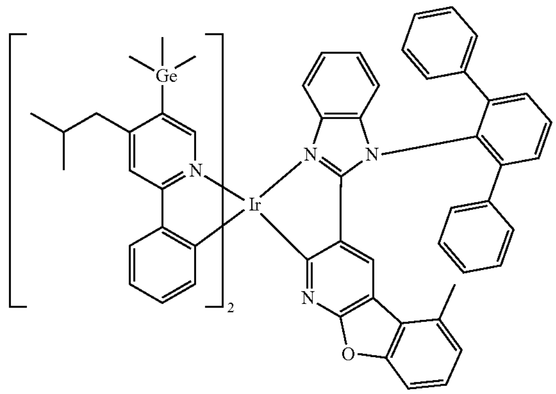

-continued
2110
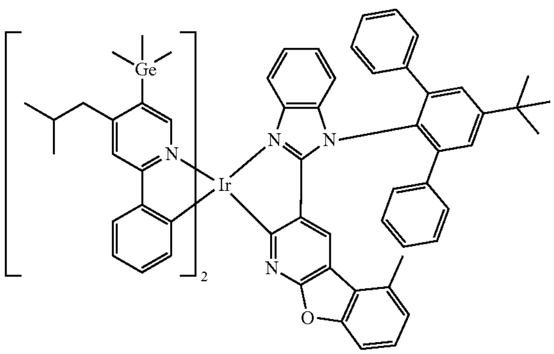
2111
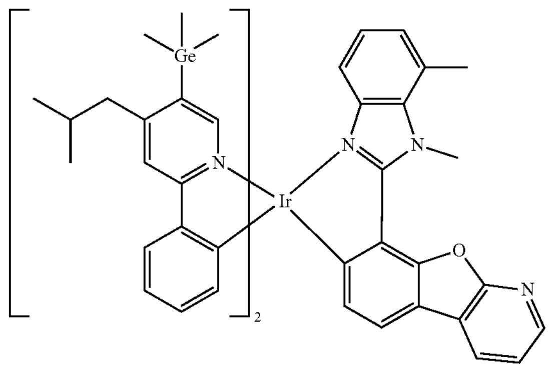
2112
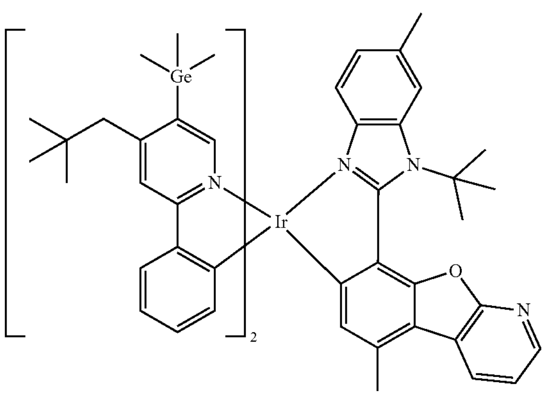
2113
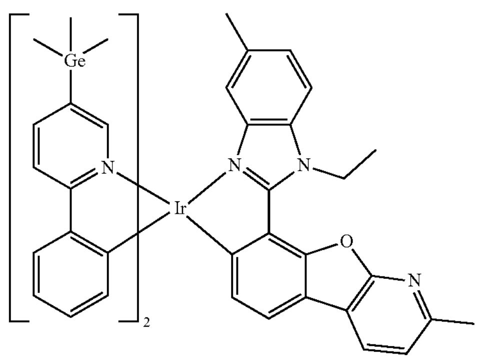
2114
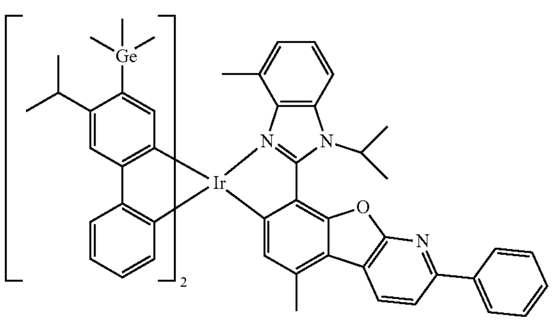
2115
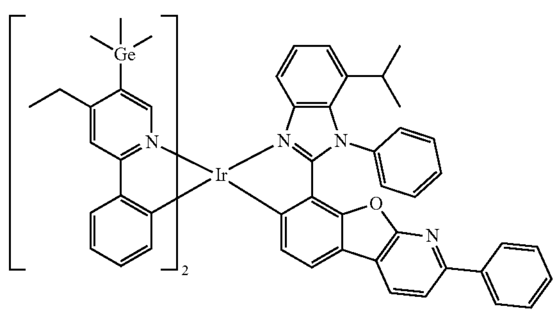
2116
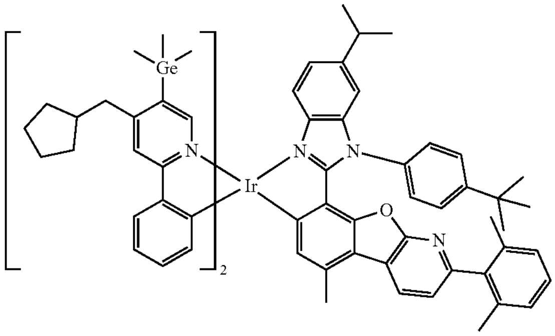
2117
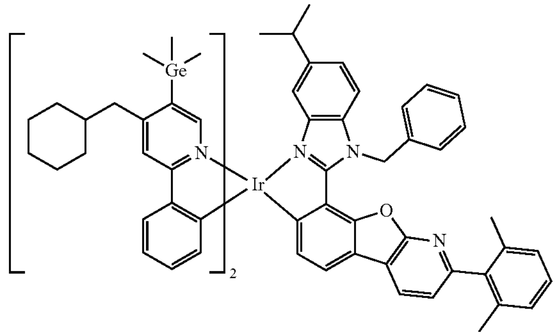

-continued
2118
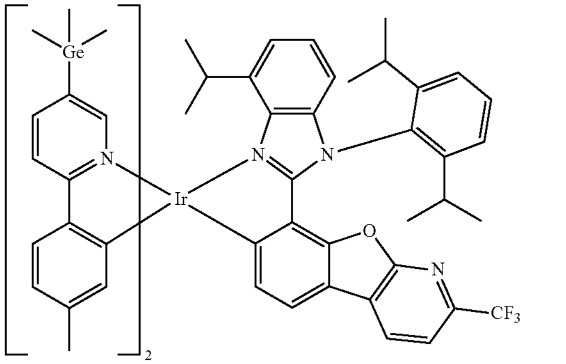
2119
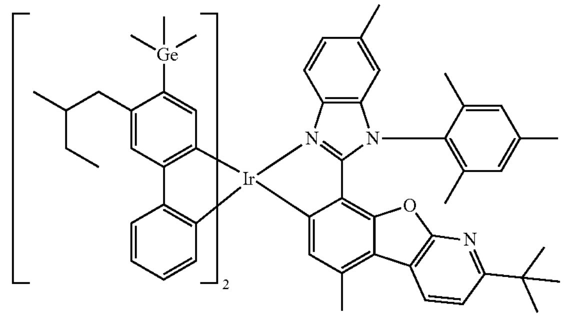
2120
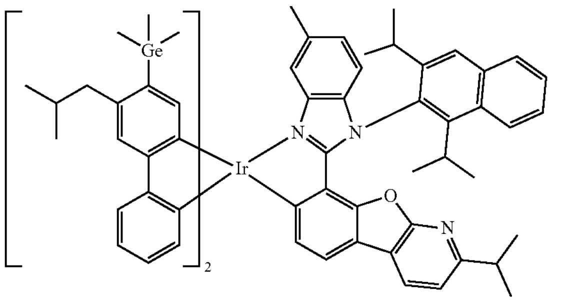
2121
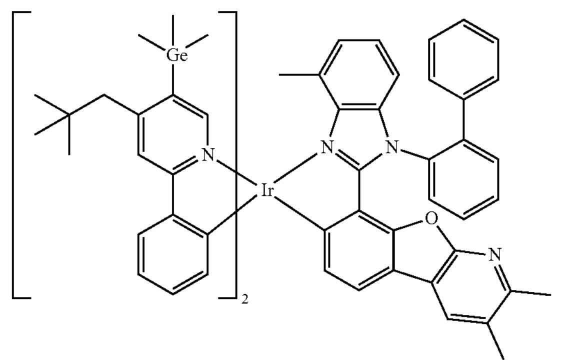
2122
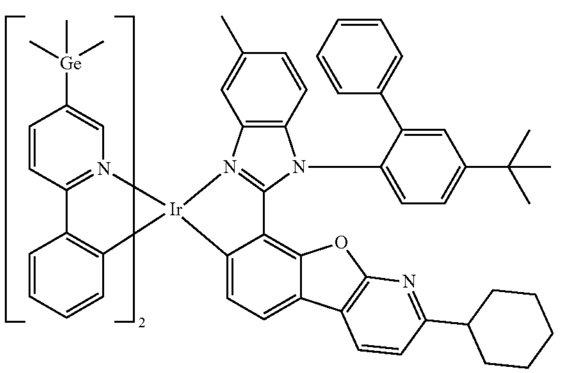
2123
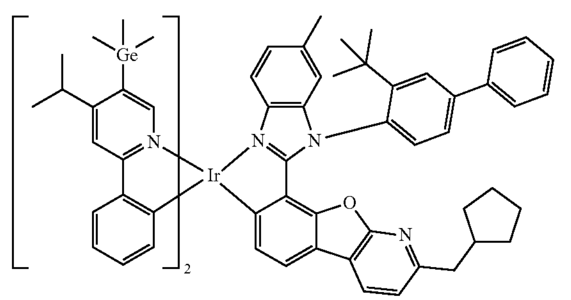
2124
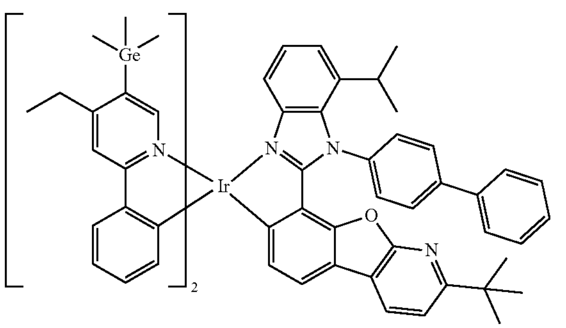
2125
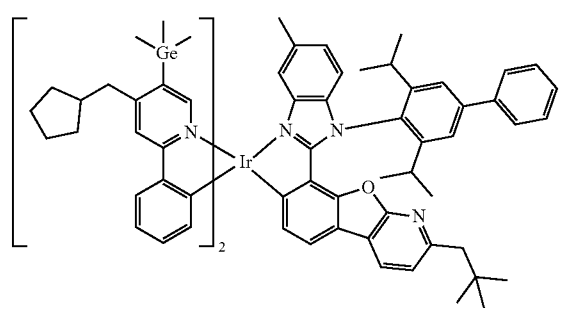

-continued
2126
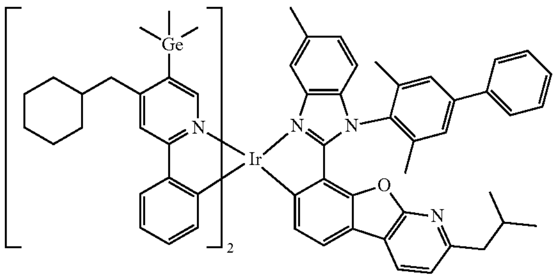
2127
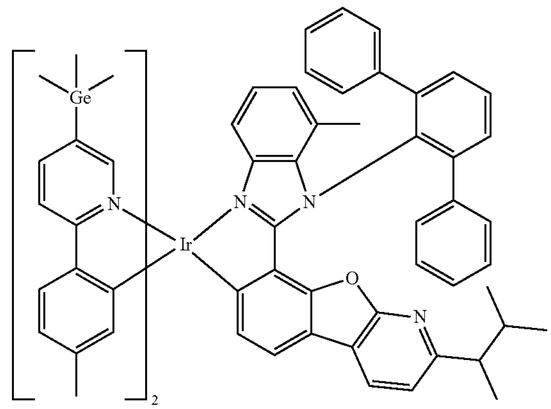
2128
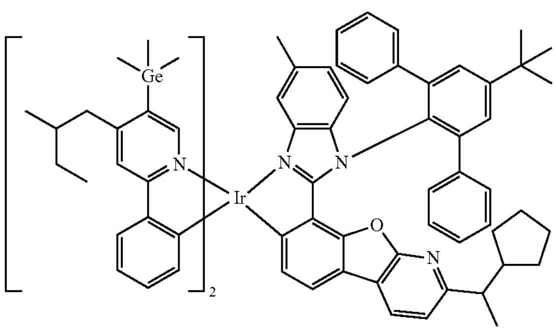
2129
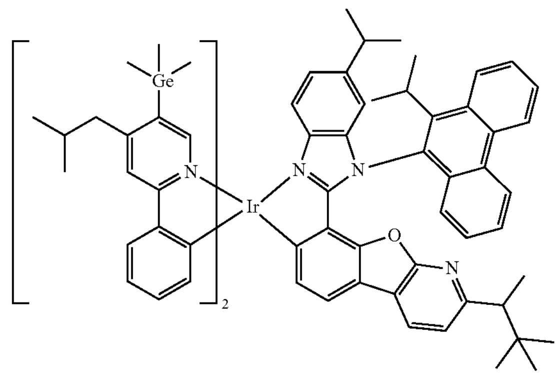
2130
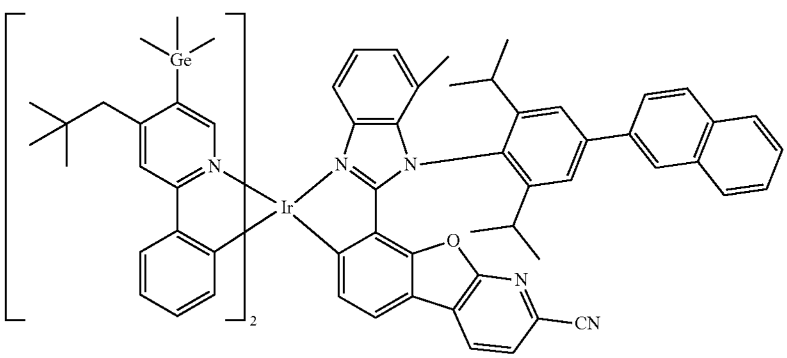
2131
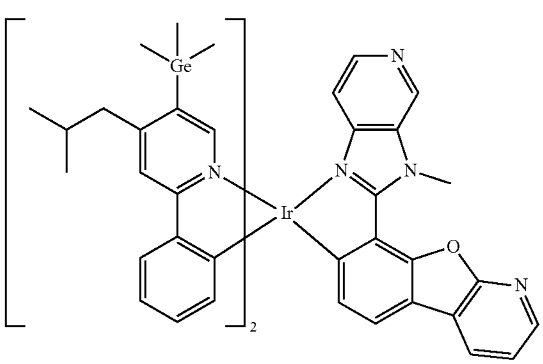
2132
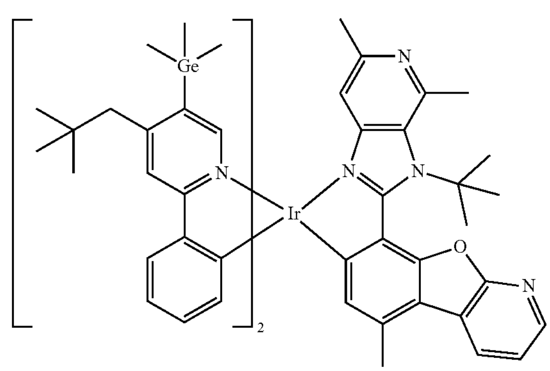

-continued
2133
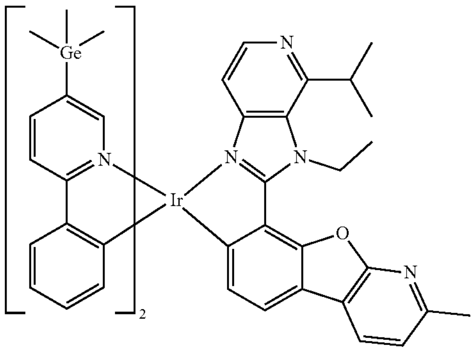
2134
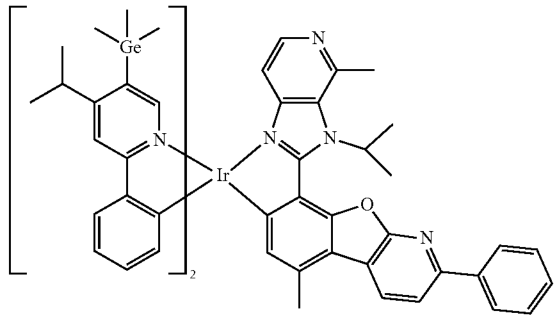
2135
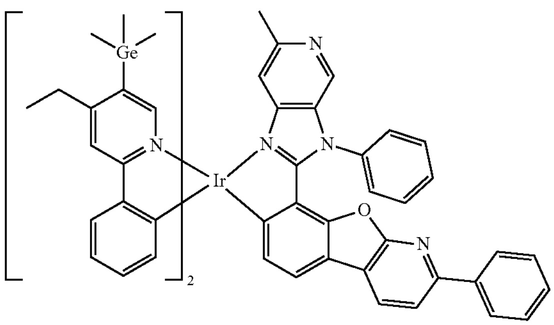
2136
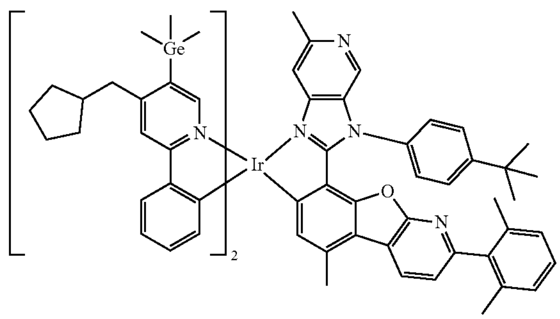
2137
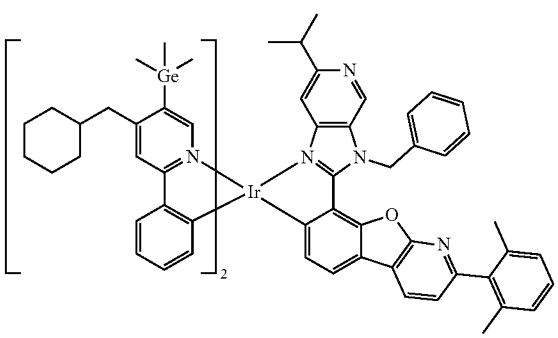
2138
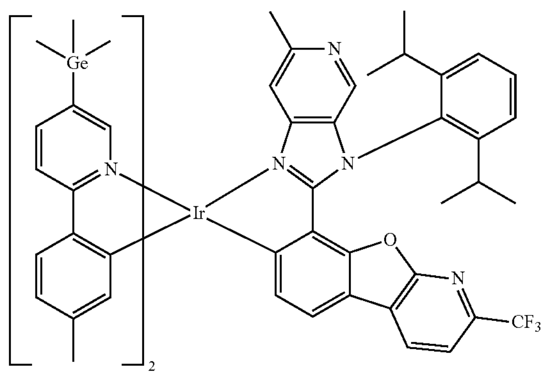
2139
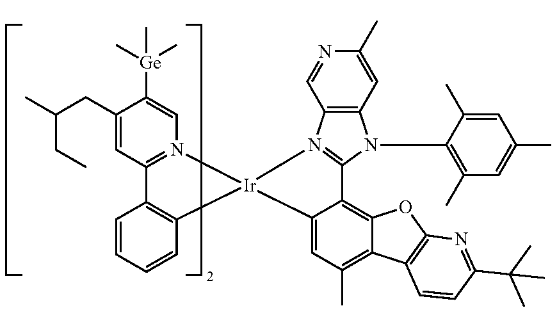
2140
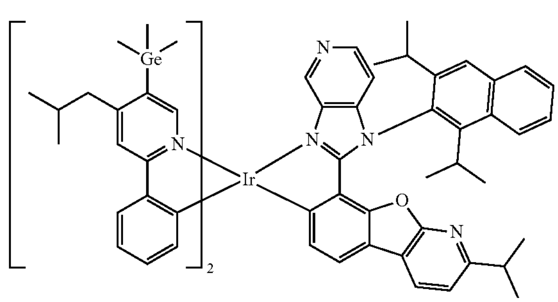

-continued
2141
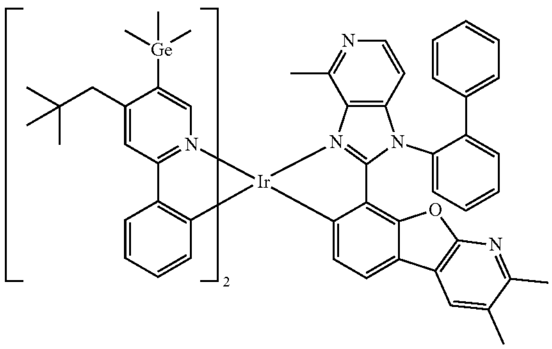
2142
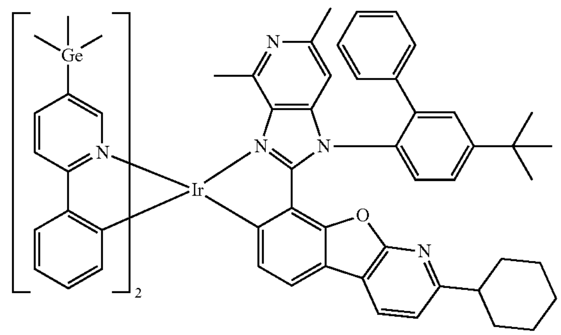
2143
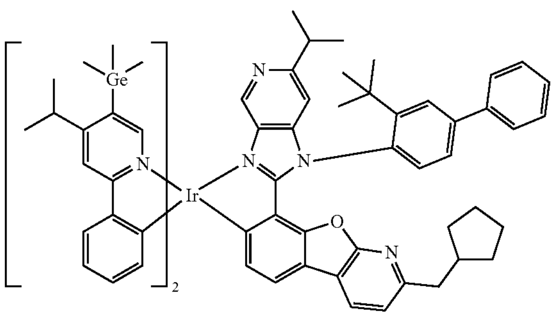
2144
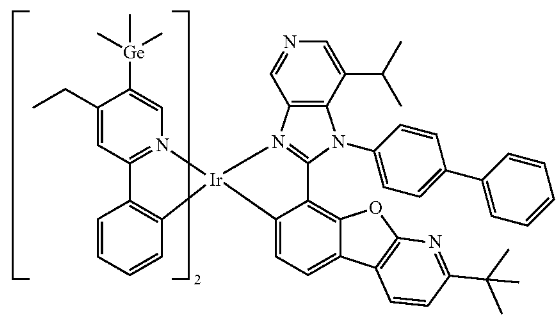
2145
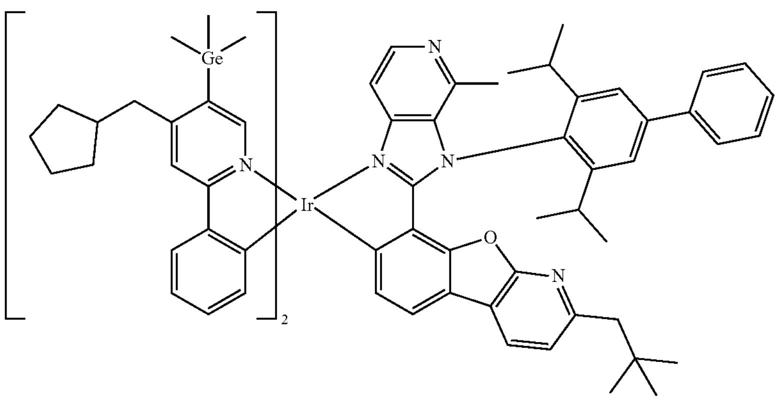
2146
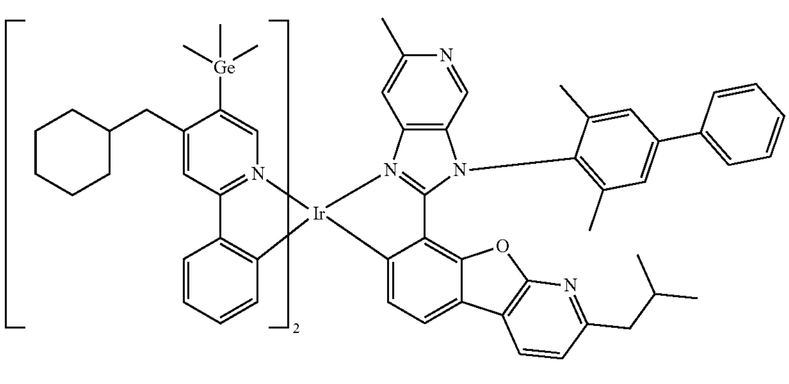

-continued
2147
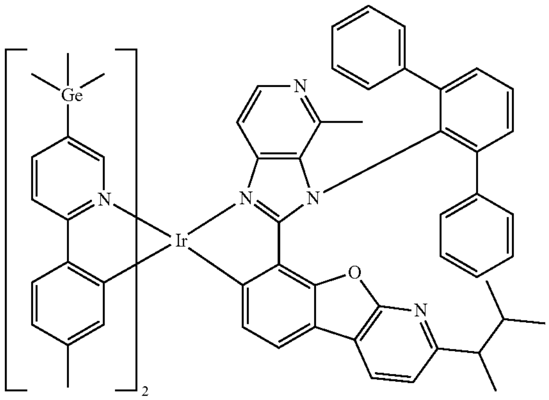
2148
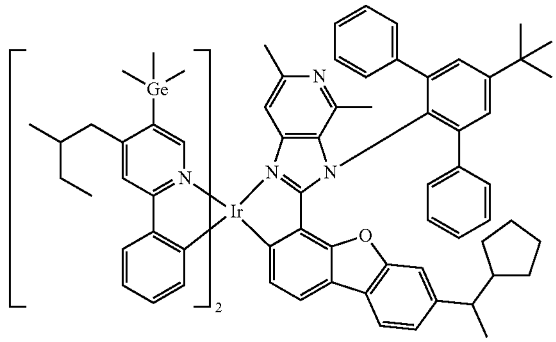
2149
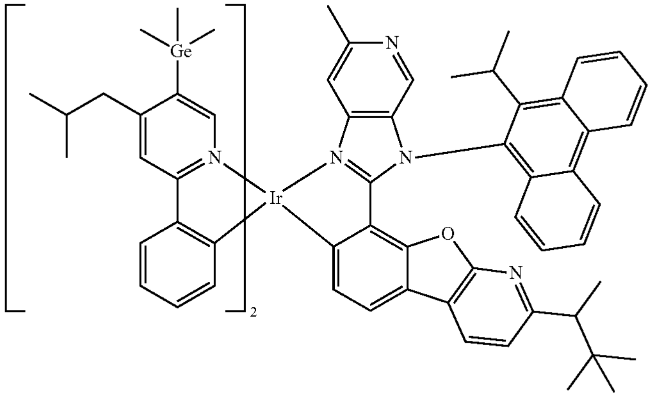
2150
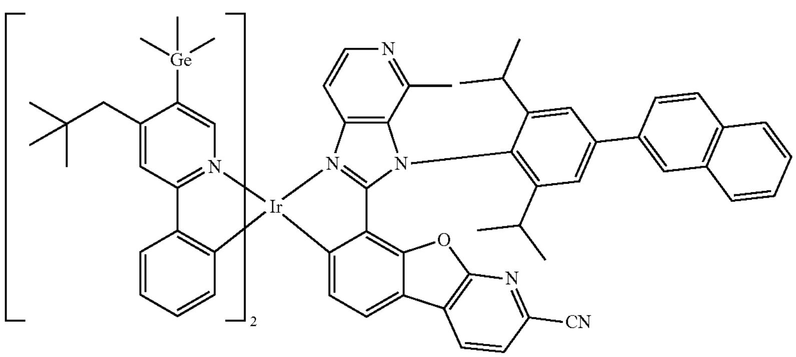
2151
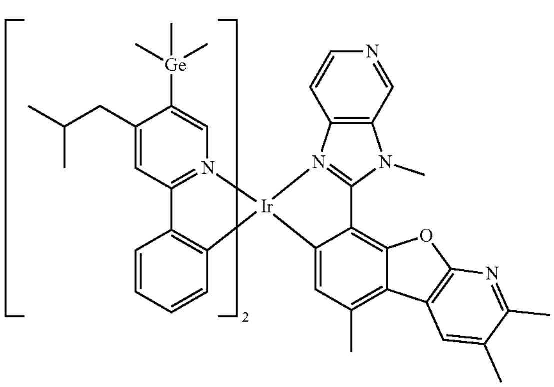
2152
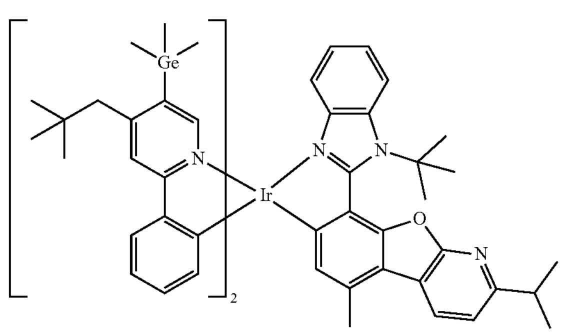

-continued
2153
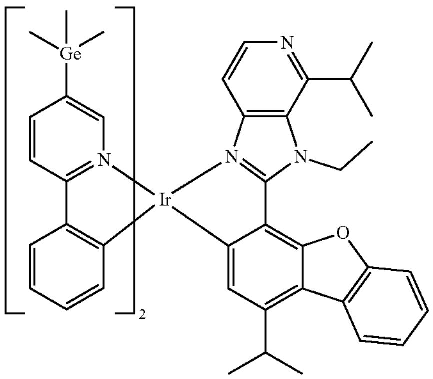
2154
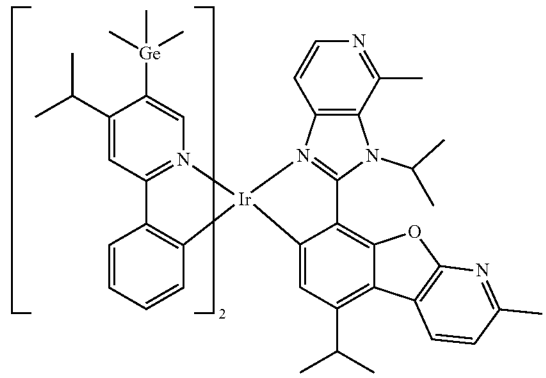
2155
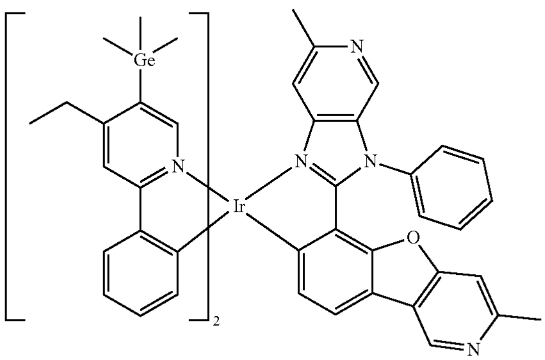
2156
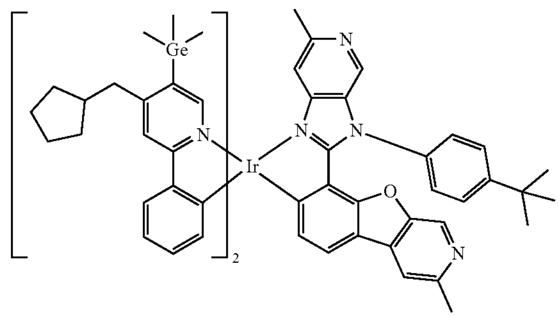
2157
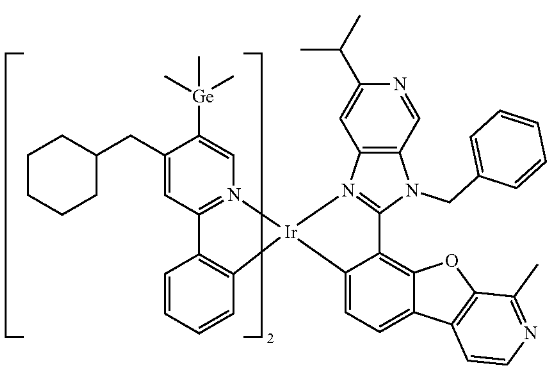
2158
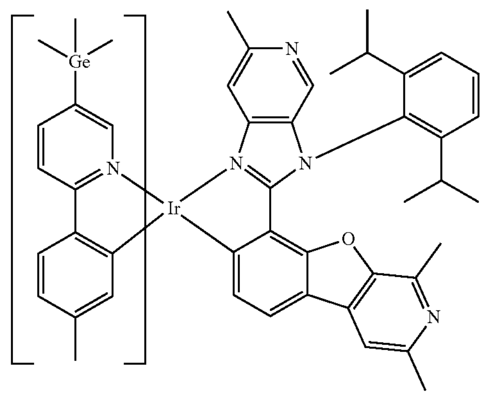
2159
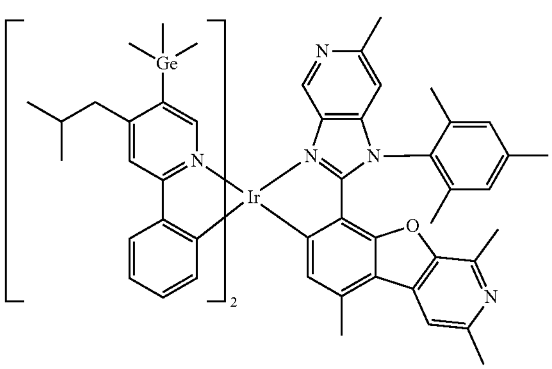
2160
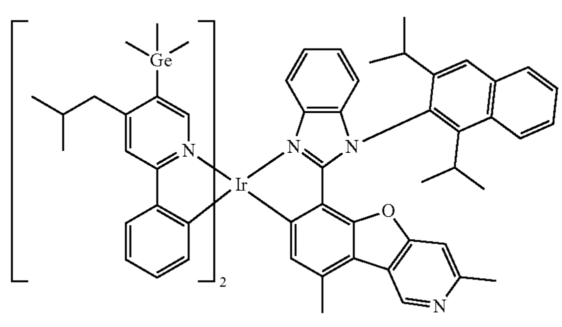

-continued
2161
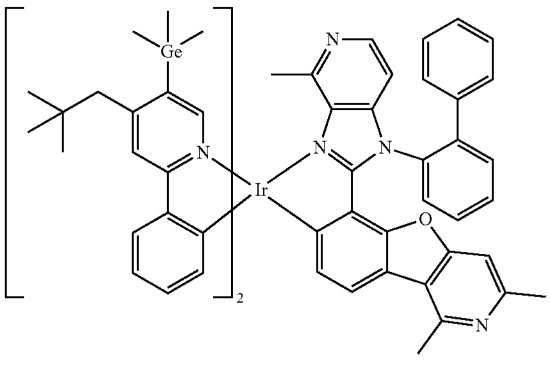
2162
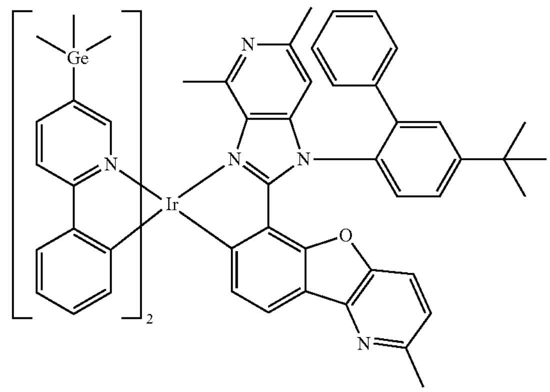
2163
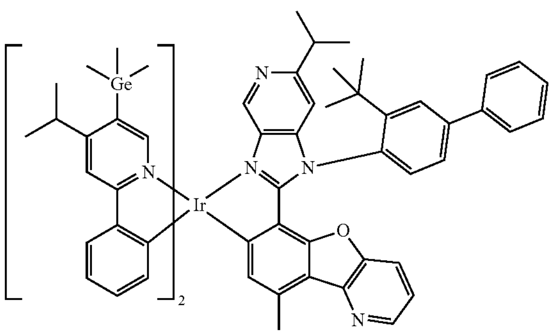
2164
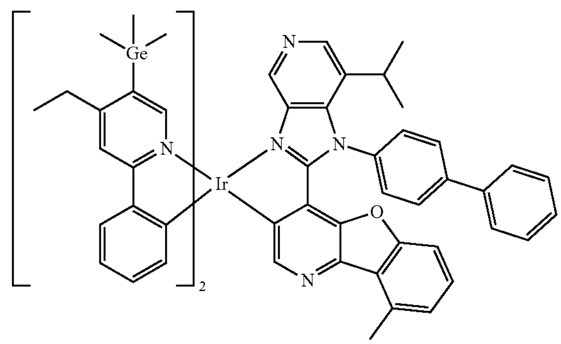
2165
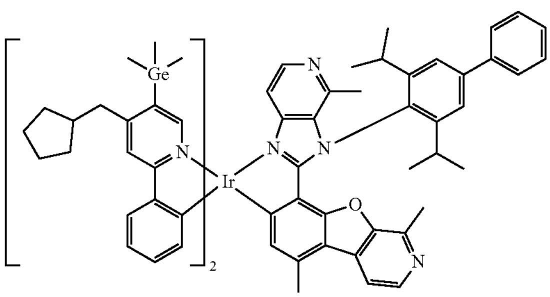
2166
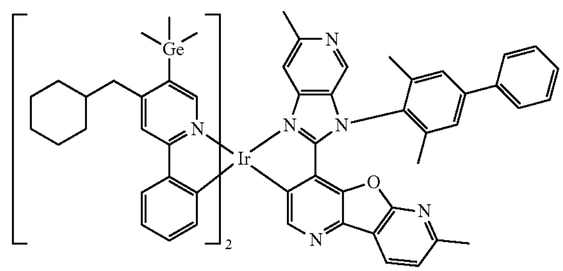
2167
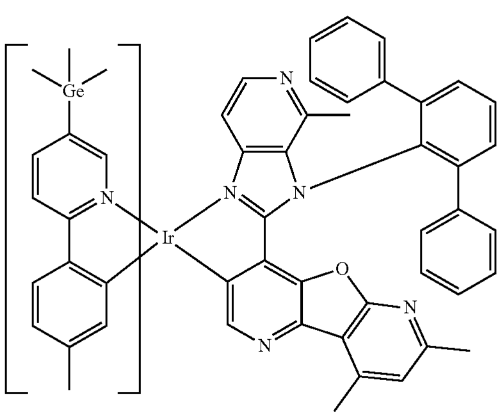
2168
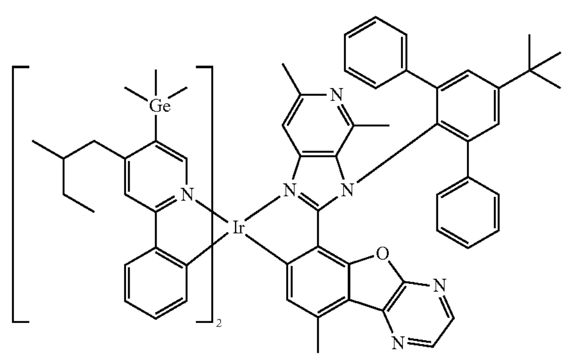

-continued
2169
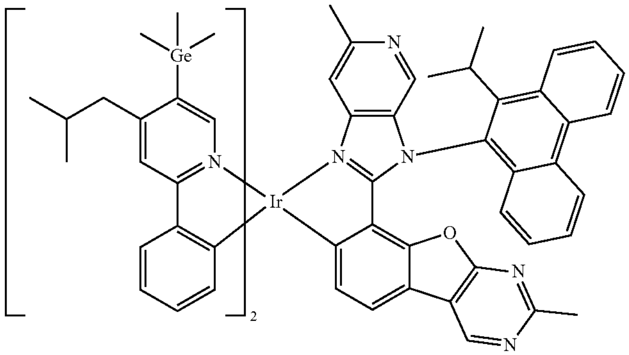
2170
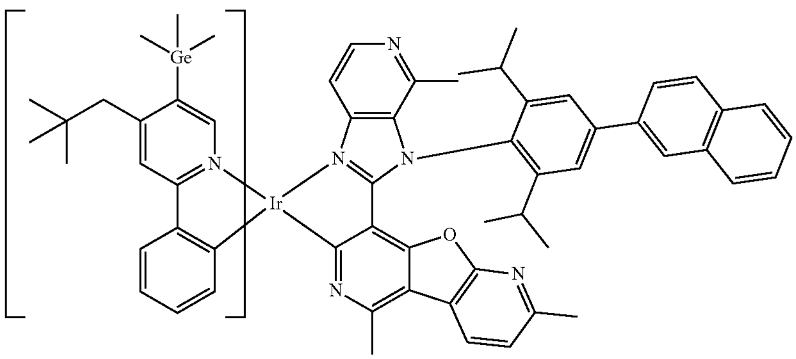
2171
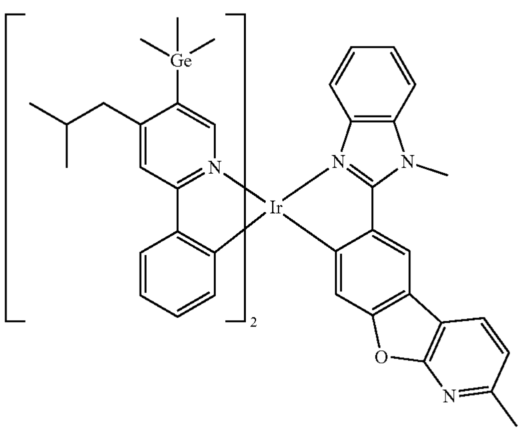
2172
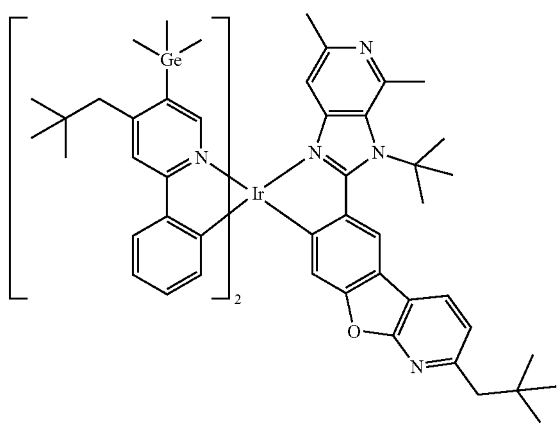
2173
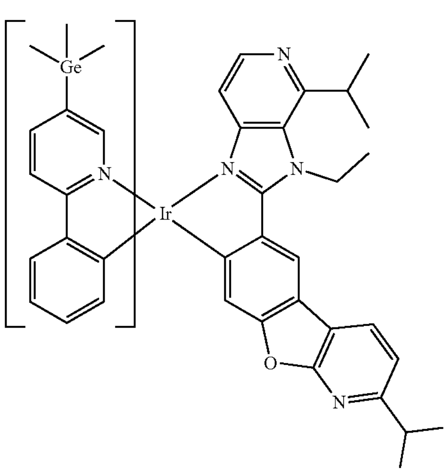
2174
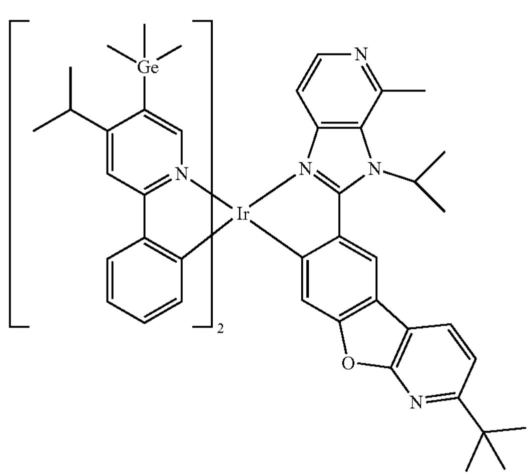

-continued
2175
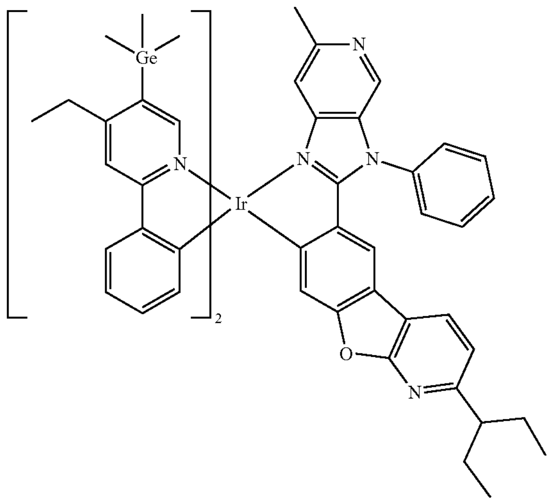
2176
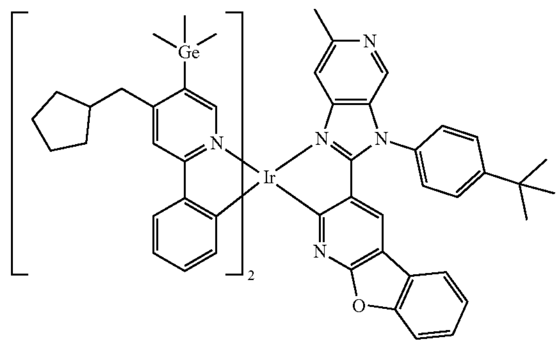
2177
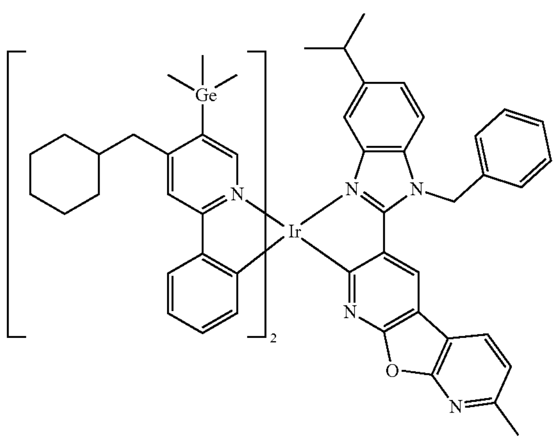
2178
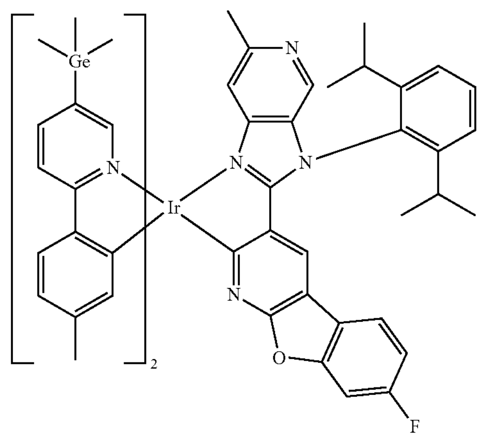
2179
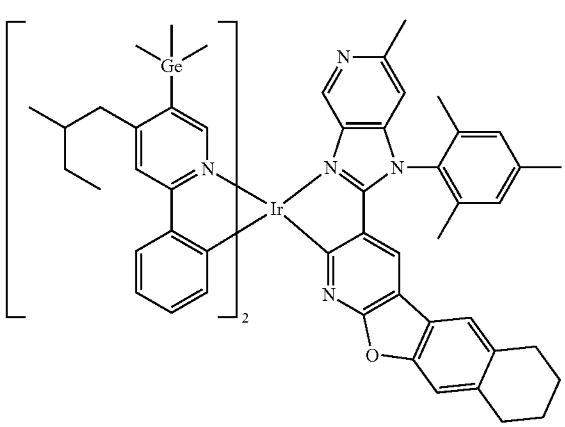
-continued
2180
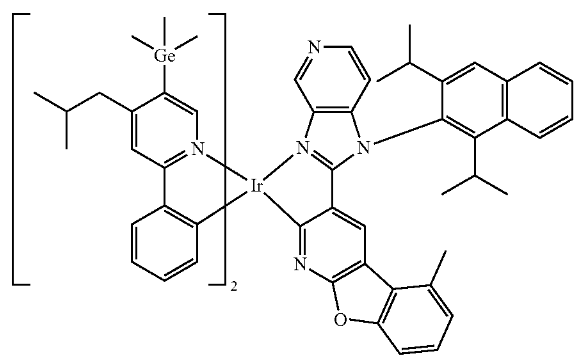

-continued
2181
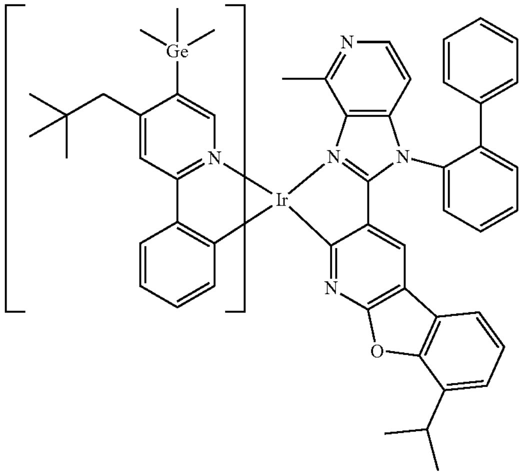
2182
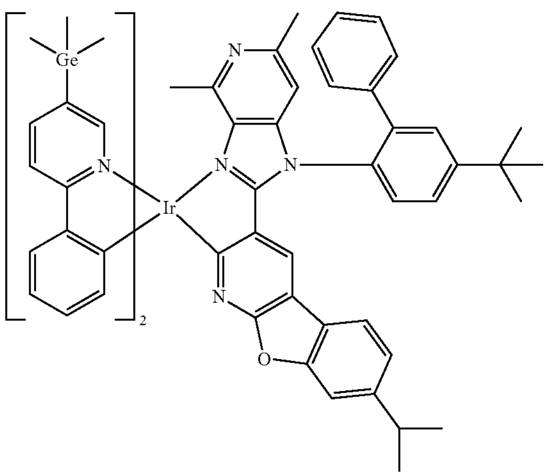
2183
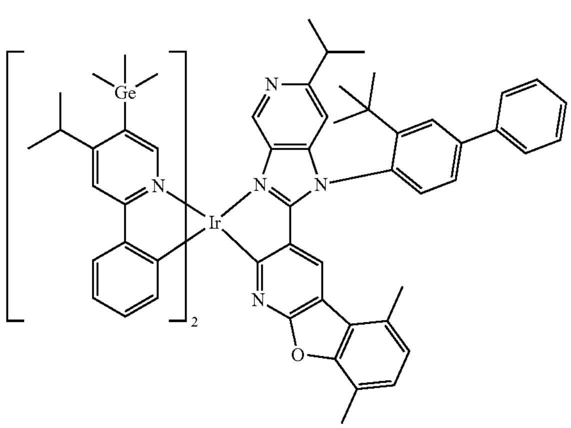
-continued
2184
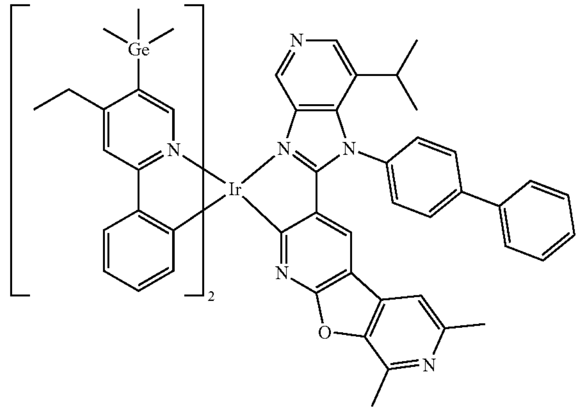
2185
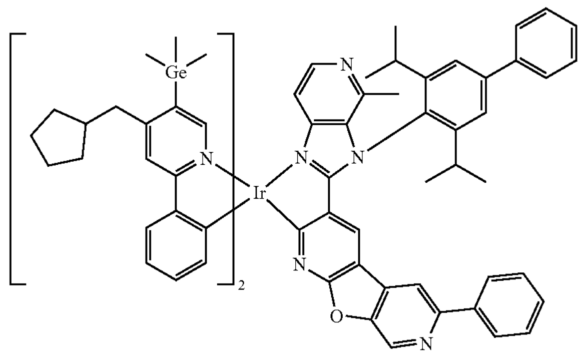
2186
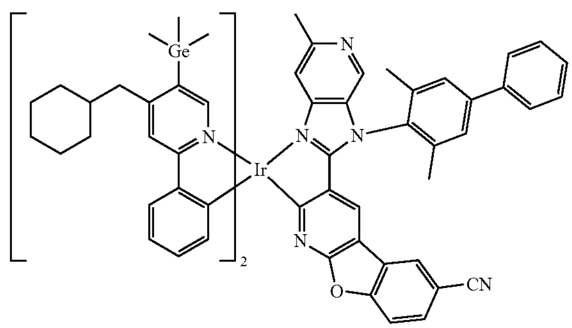

-continued
2187
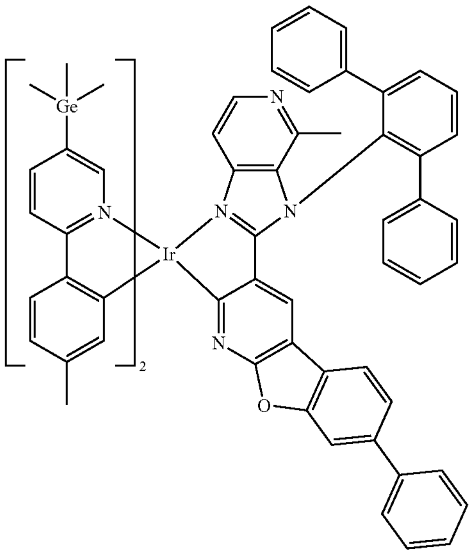
2188
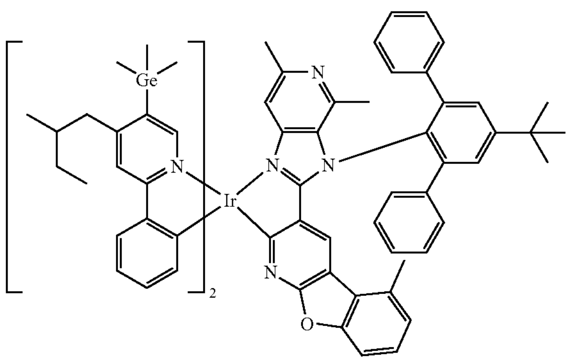
2189
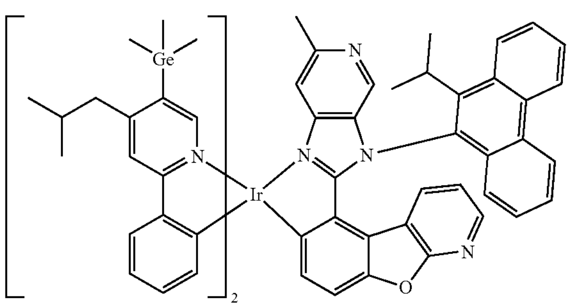
2190
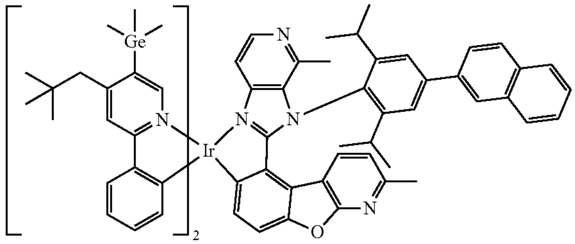
-continued
2191
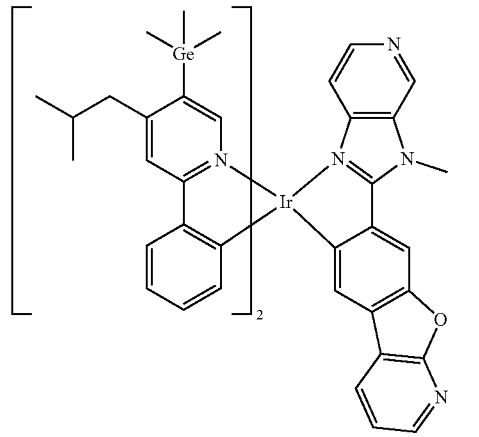
2192
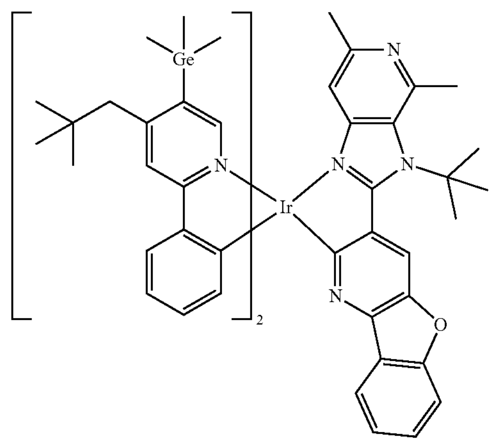
2193
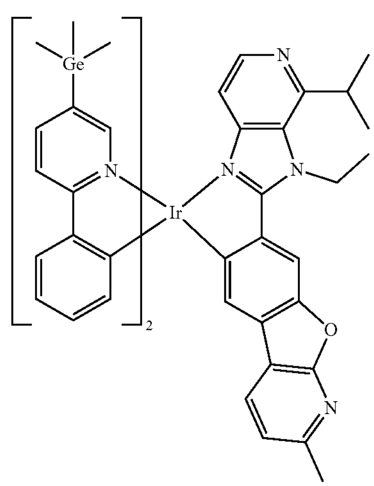

-continued
2194
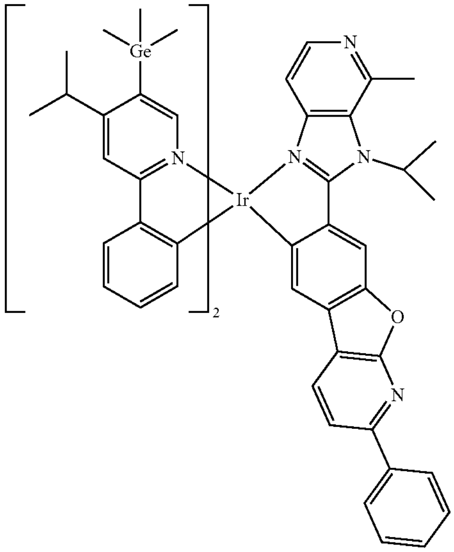
2195
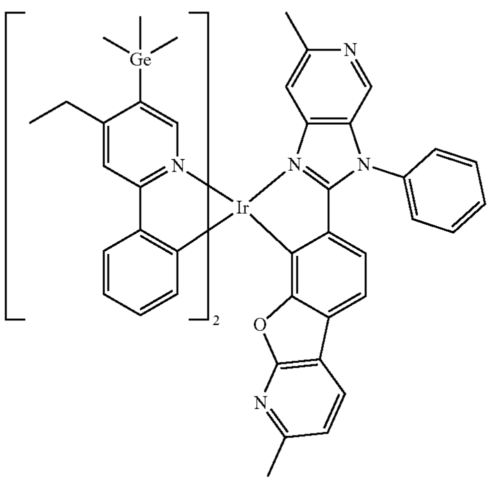
2196
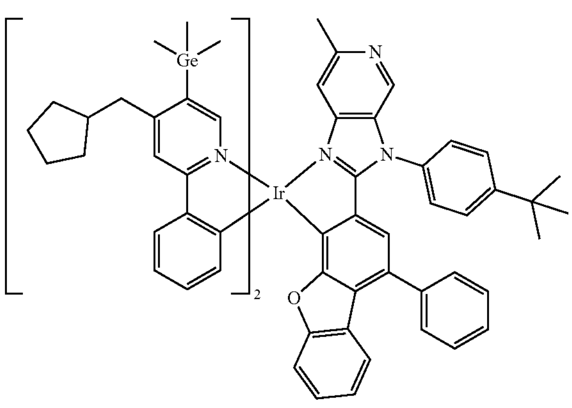
-continued
2197
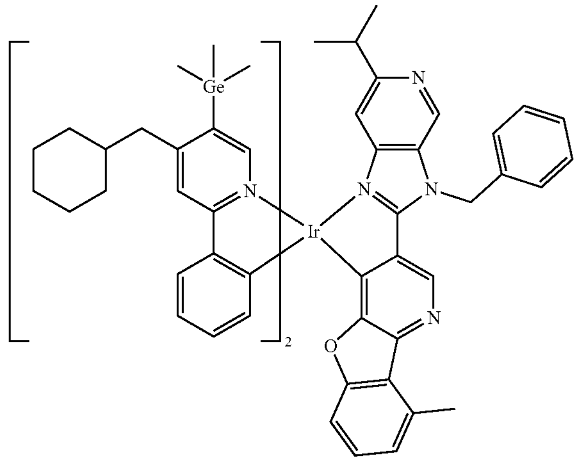
2198
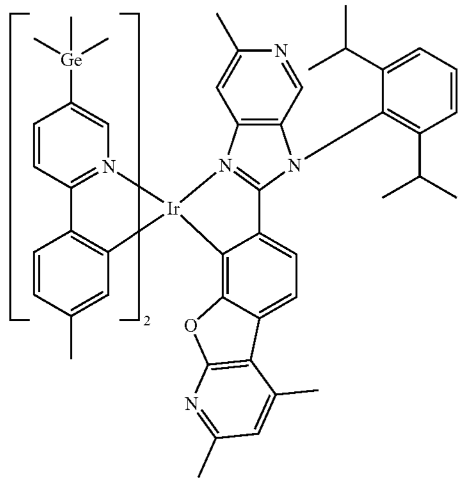
2199
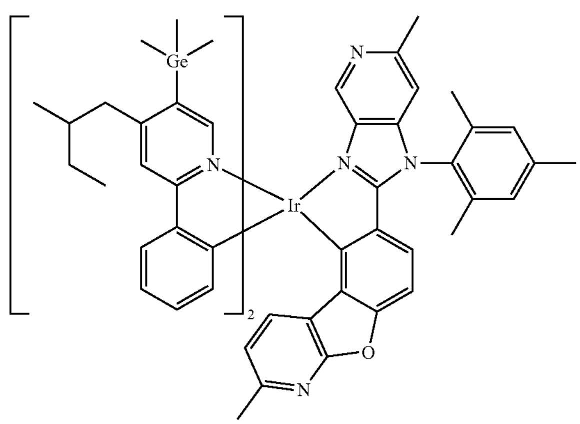

2200
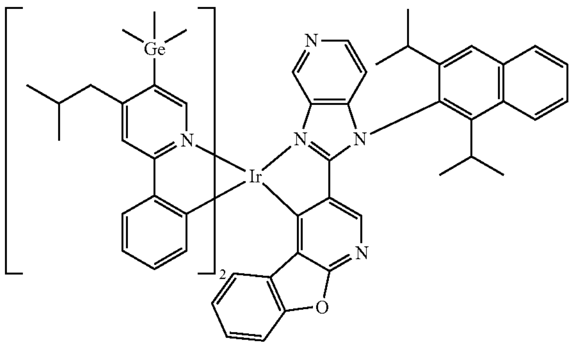
2201
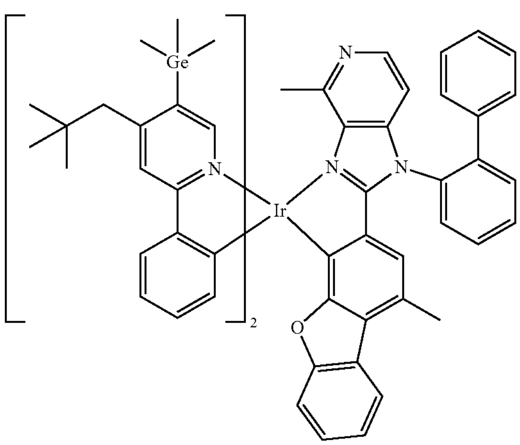
2202
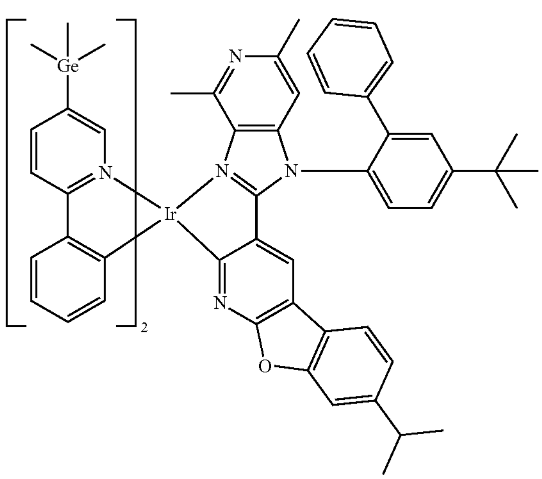
2203
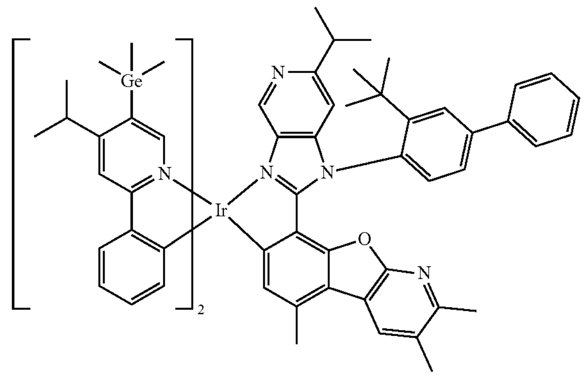
2204
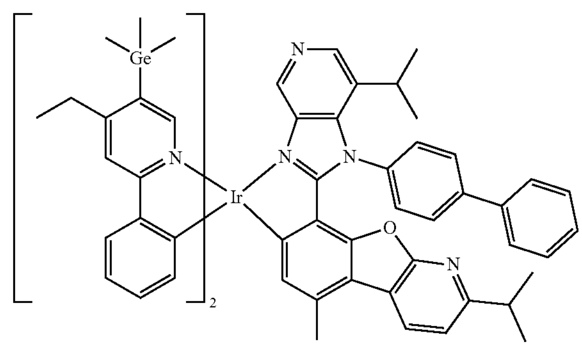
2205
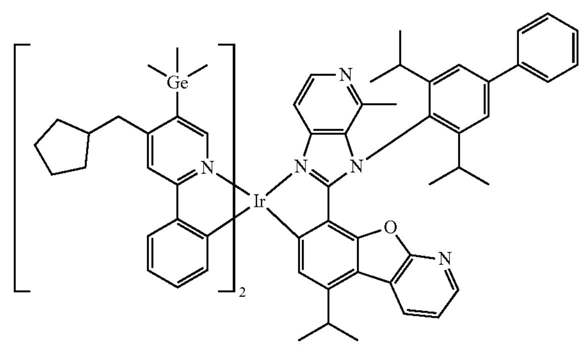
2206
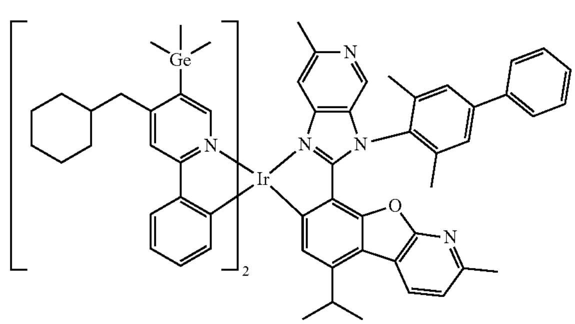

-continued
2207
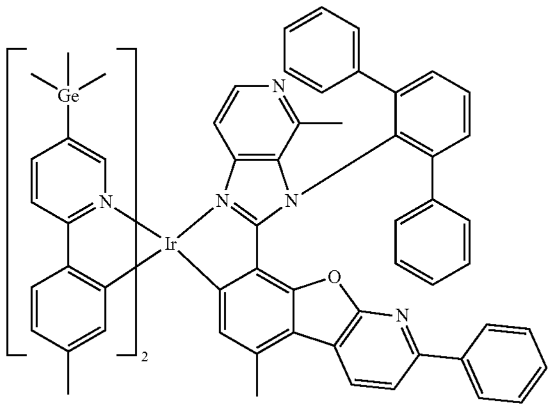
2208
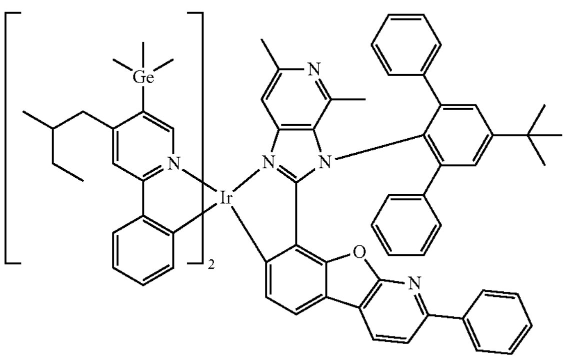
2209
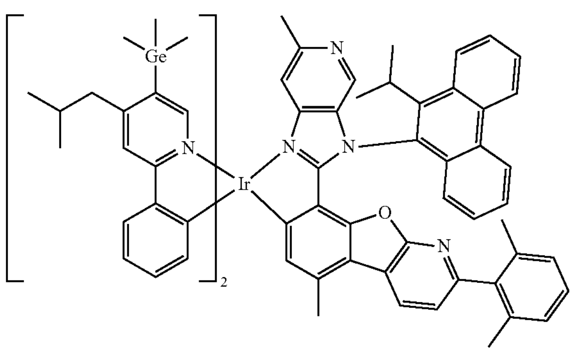
2210
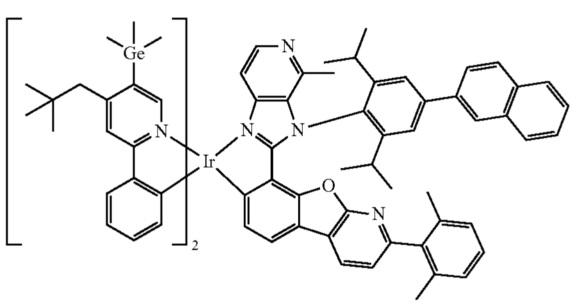
-continued
2211
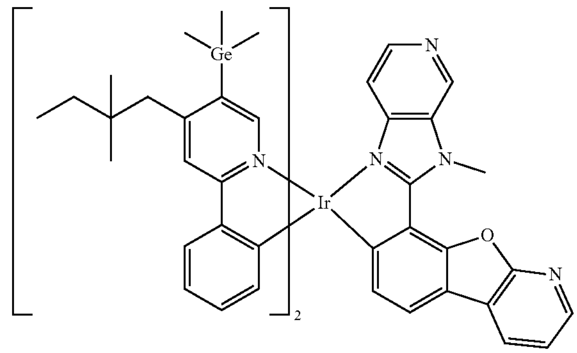
2212
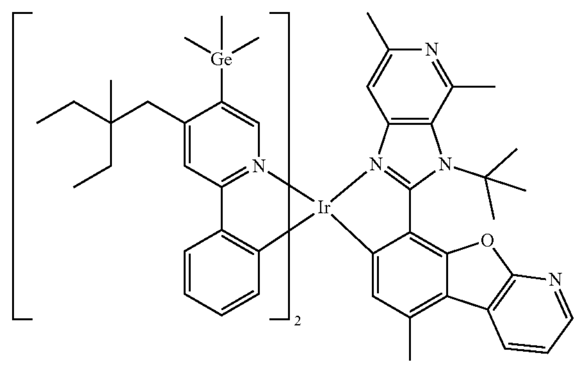
2213
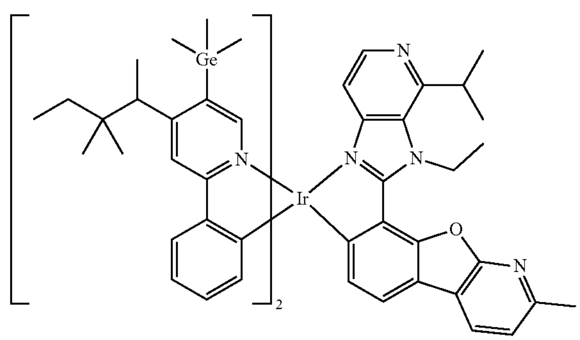
2214
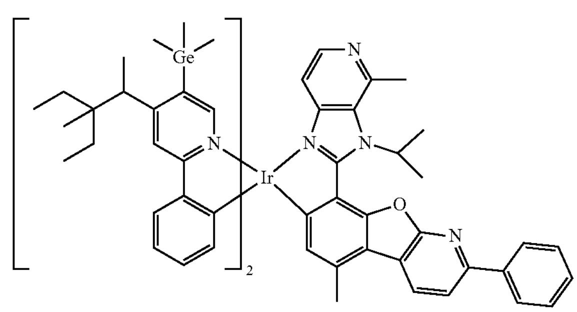

-continued
2215
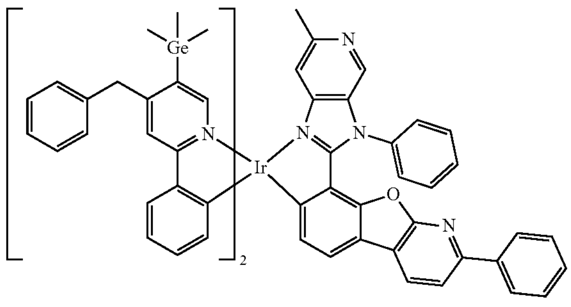
2216
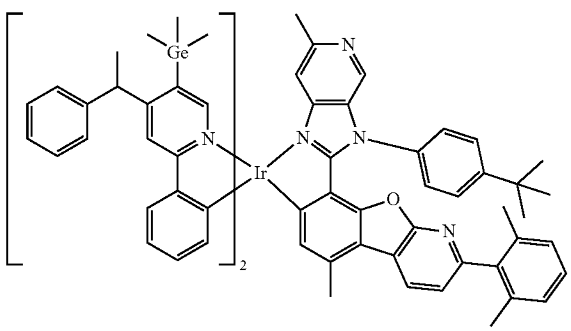
2217
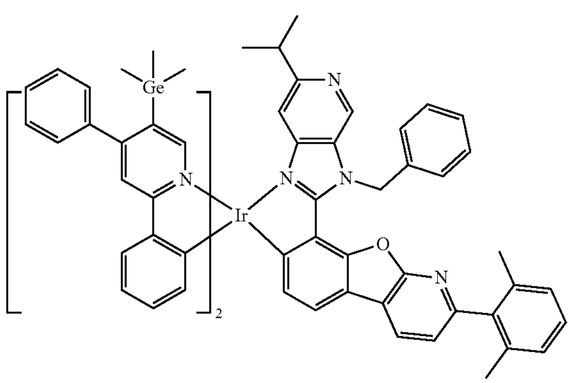
2218
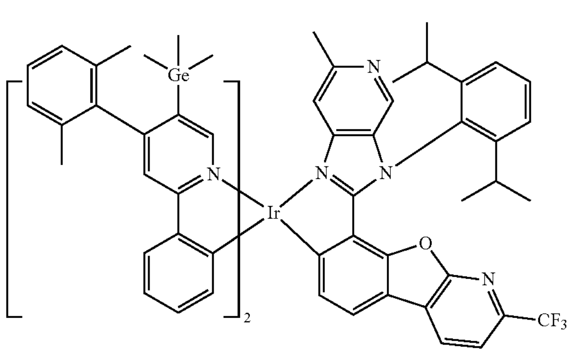
-continued
2219
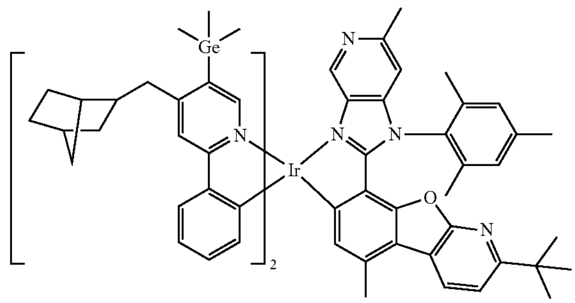
2220
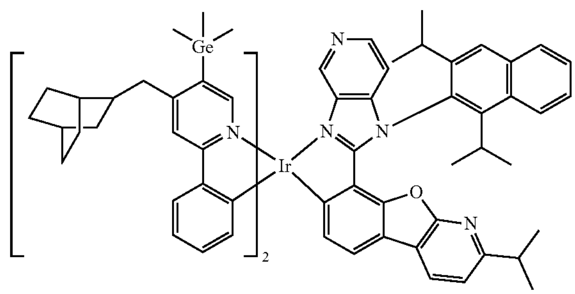
2221
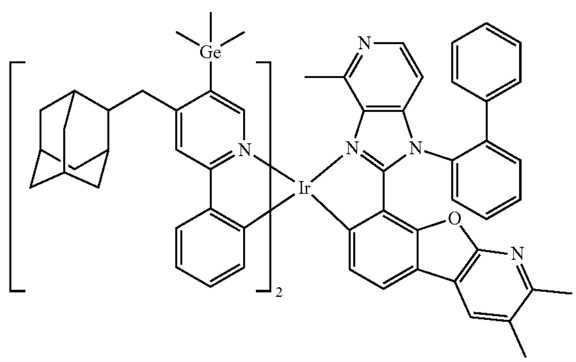
2222
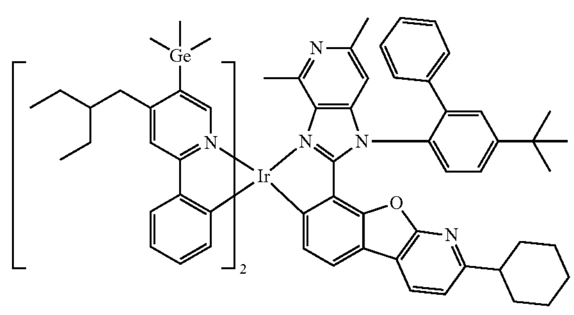

2223
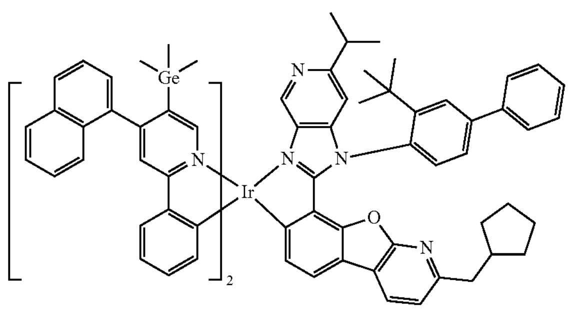
2224
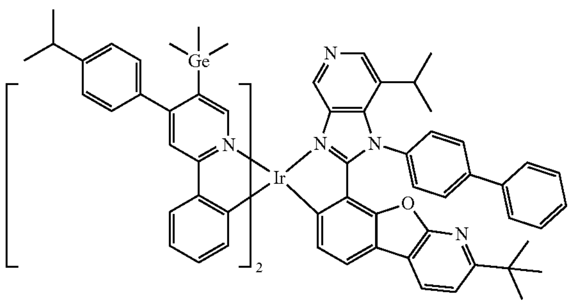
2225
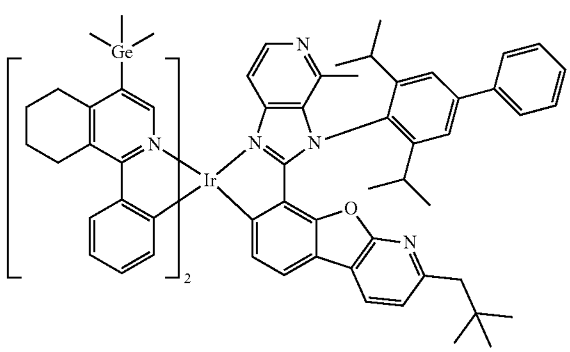
2226
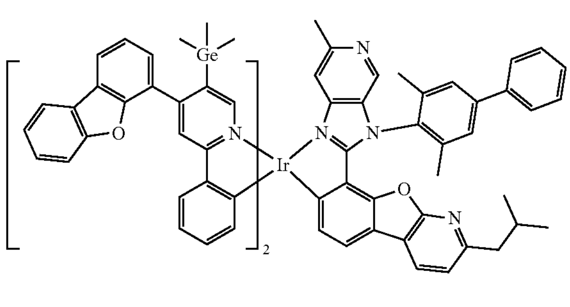
2227
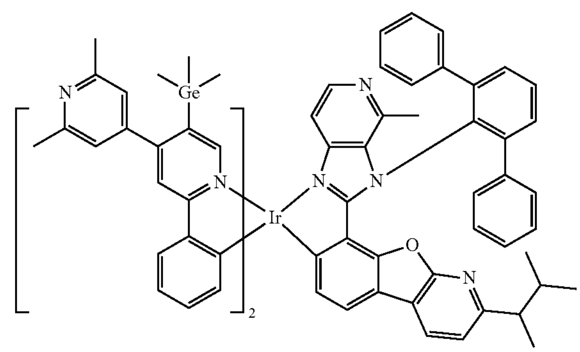
2228
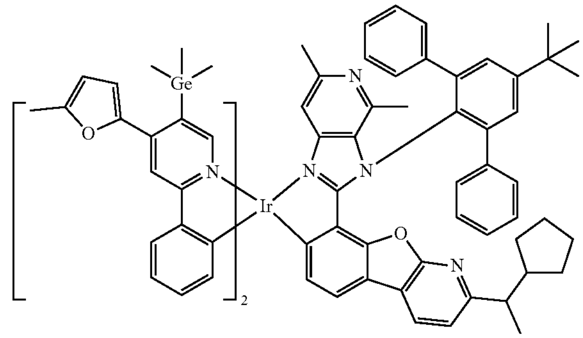
2229
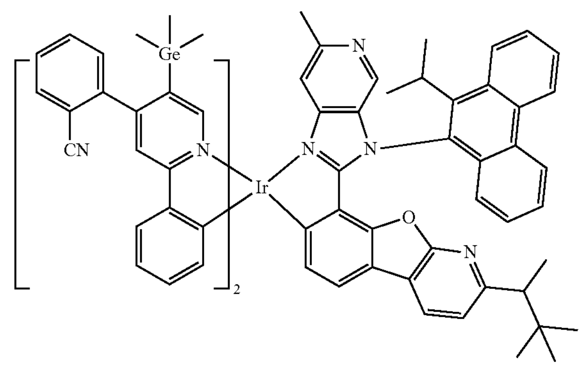
2230
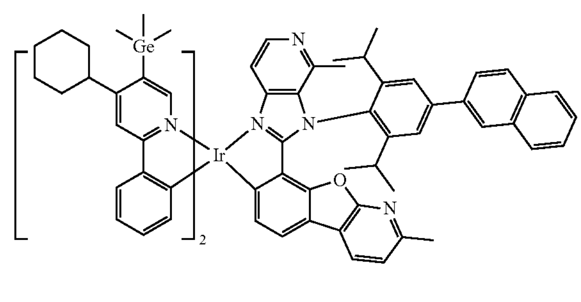

-continued
2231
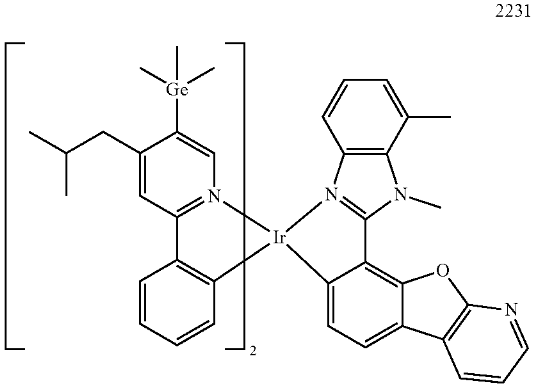
2232
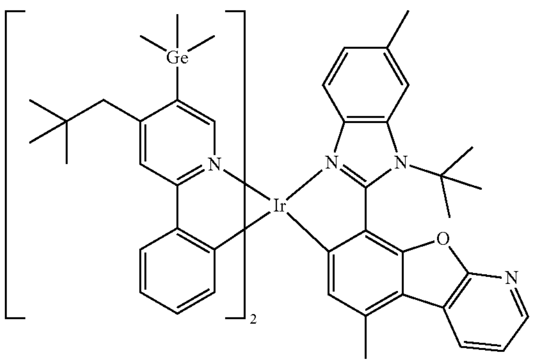
2233
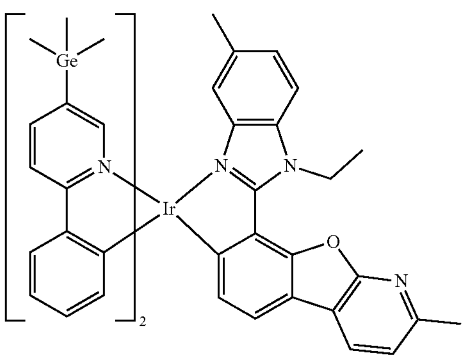
2234
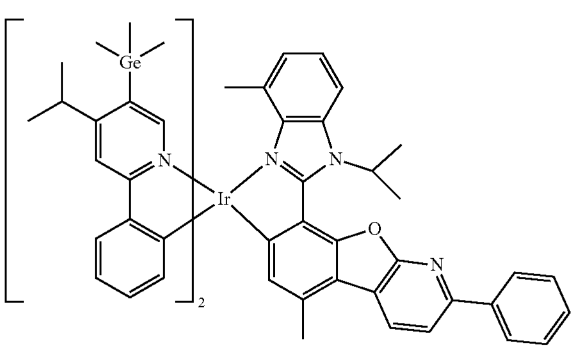
-continued
2235
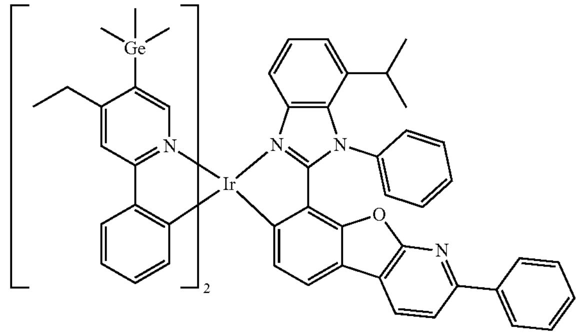
2236
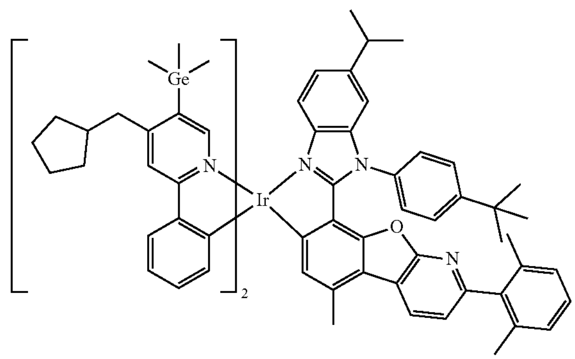
2237
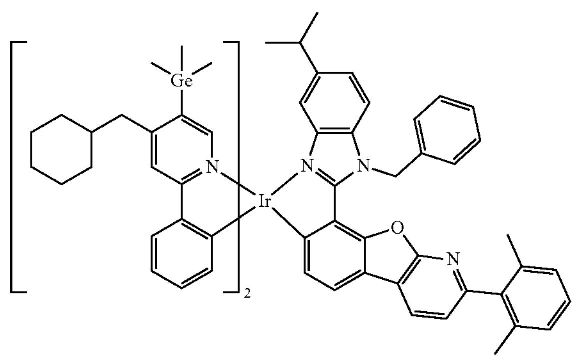
2238
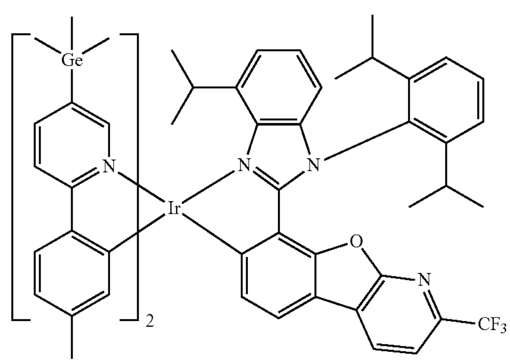

-continued
2239
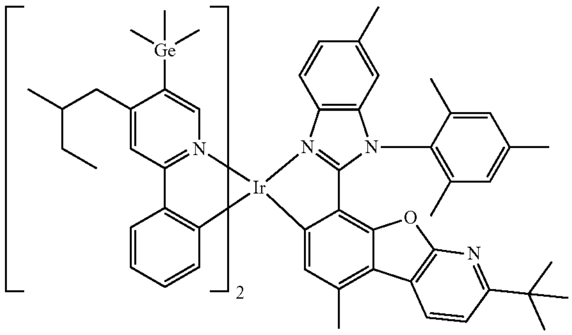
2240
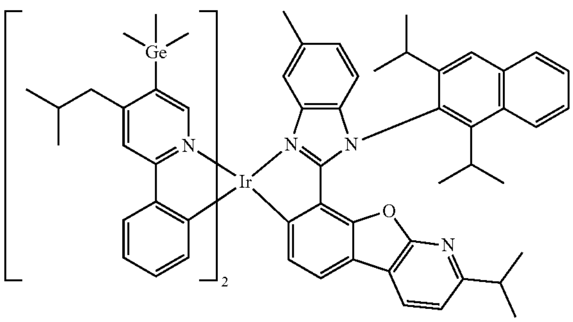
2241
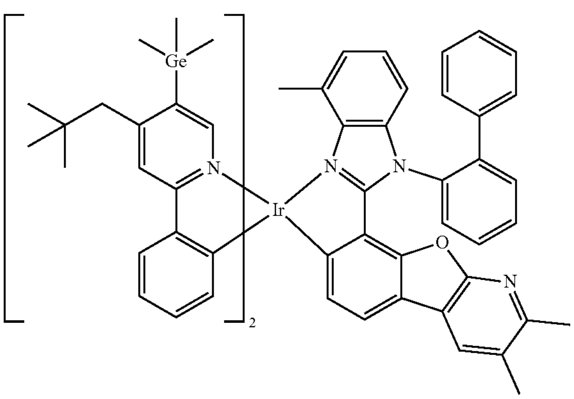
2242
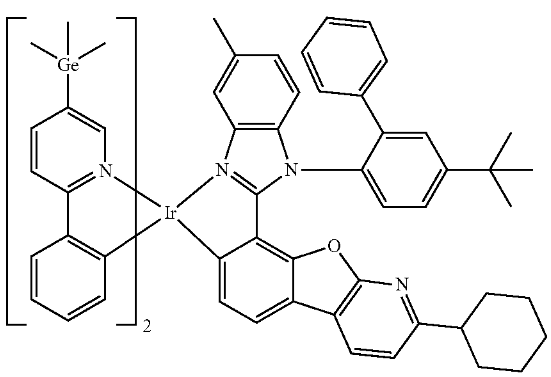
-continued
2243
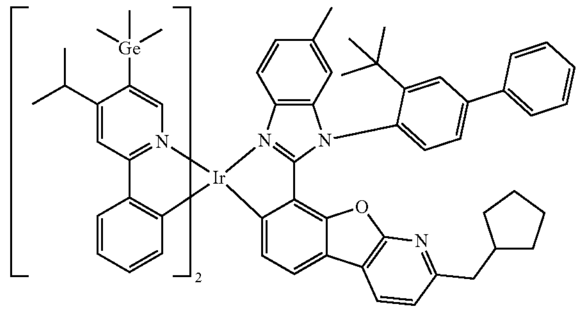
2244
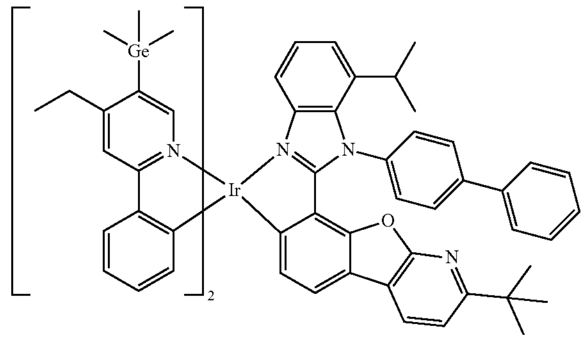
2245
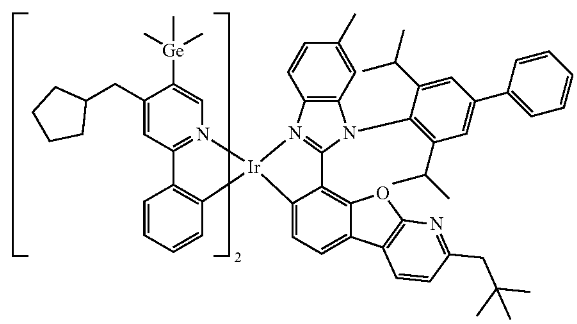
2246
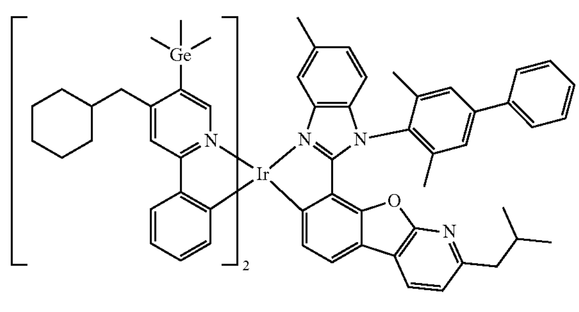

2247
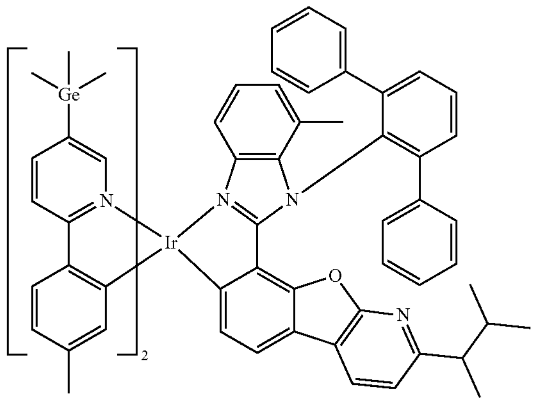
2248
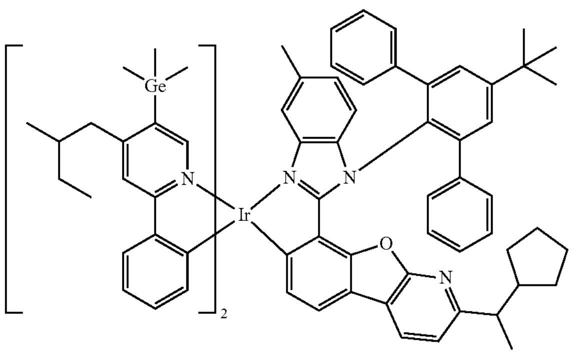
2249
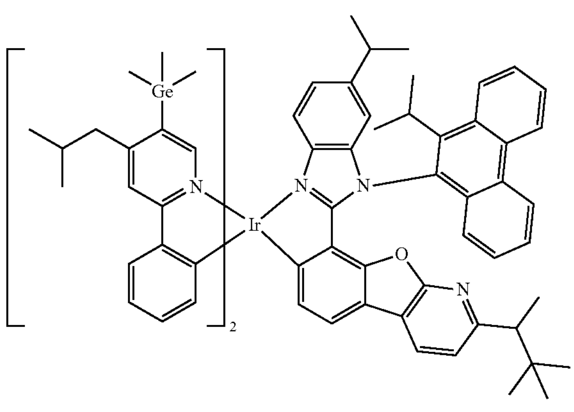
2250
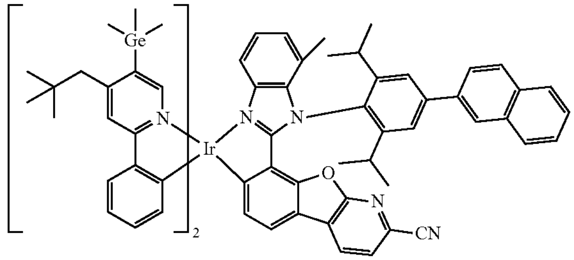
2251
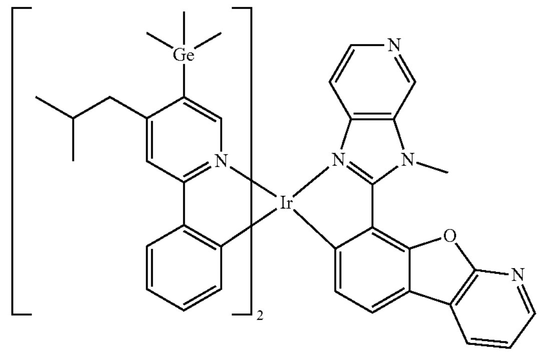
2252
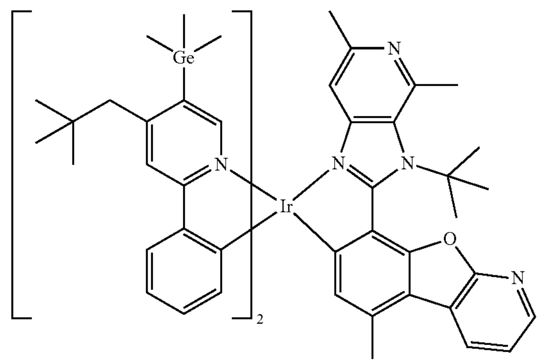
2253
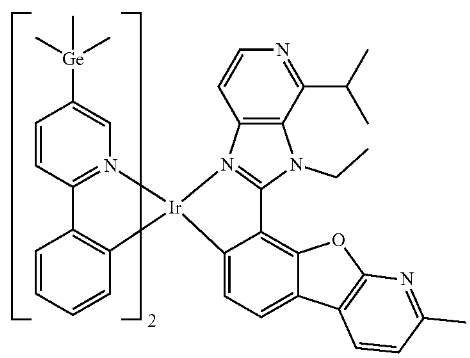
2254
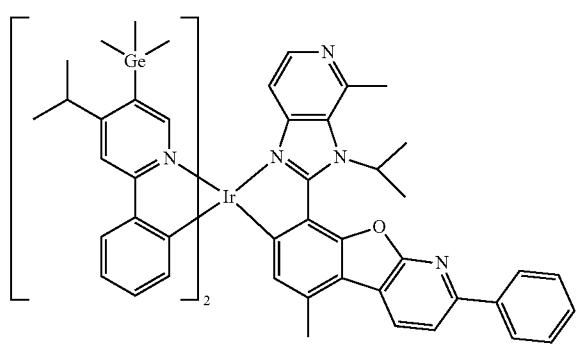

-continued
2255
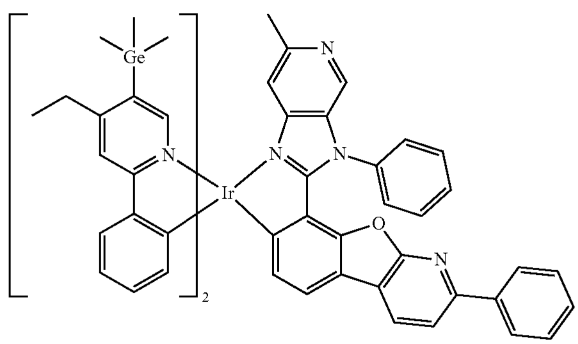
2256
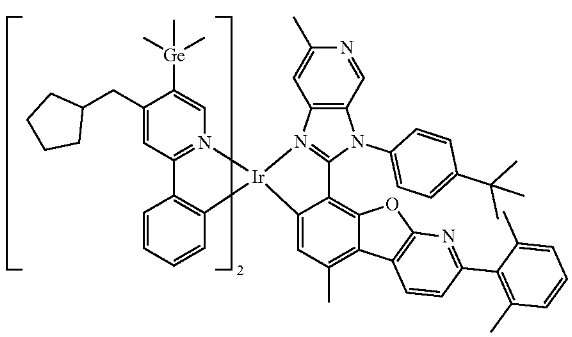
2257
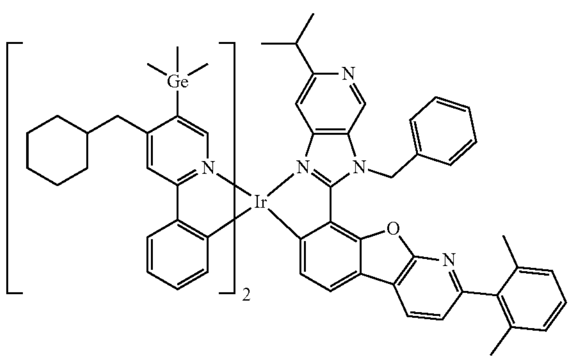
2258
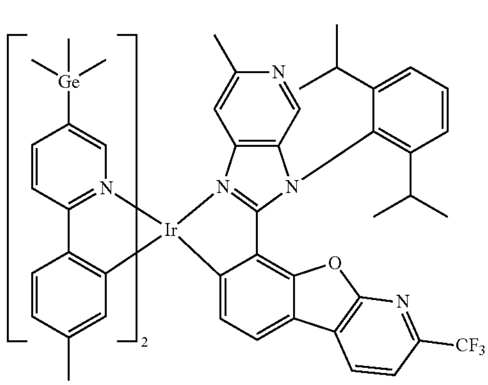
-continued
2259
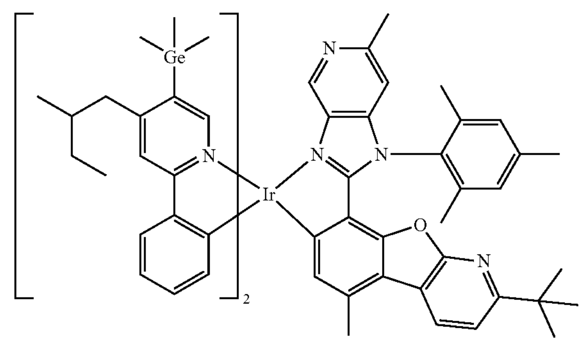
2260
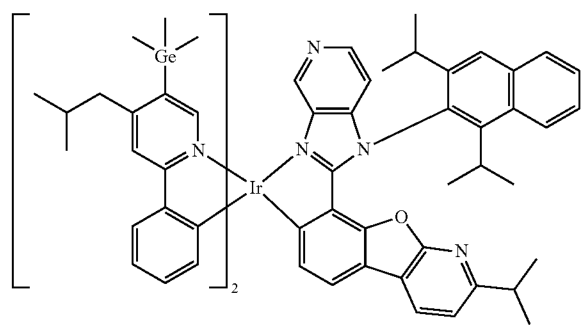
2261
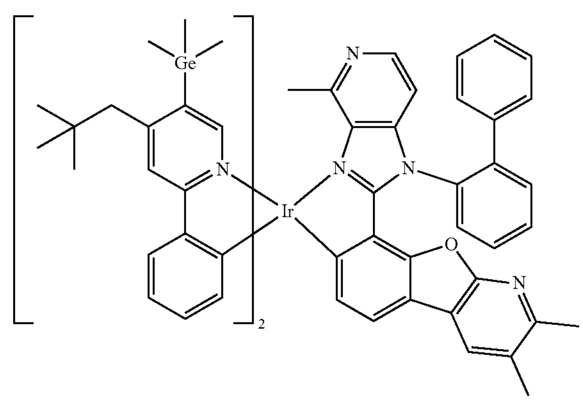
2262
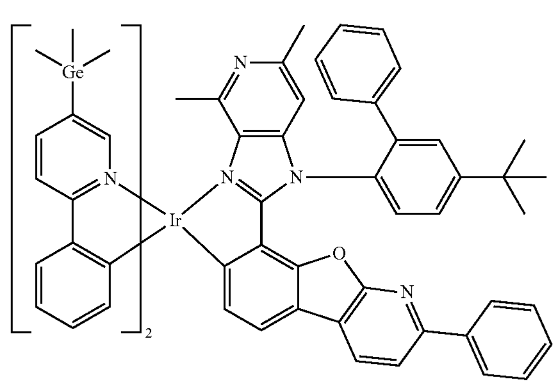

-continued
2263
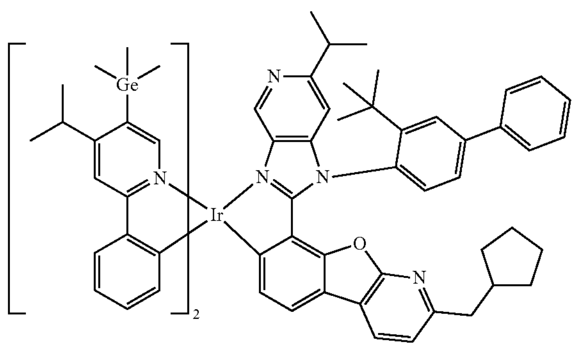
2264
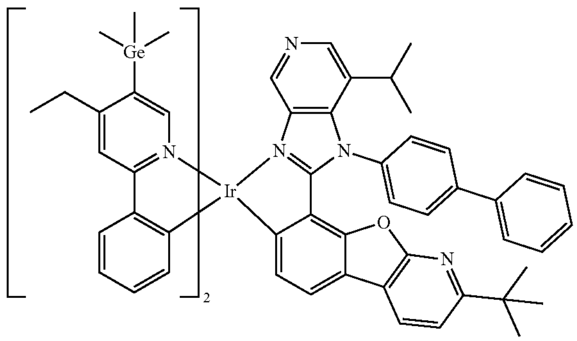
2265
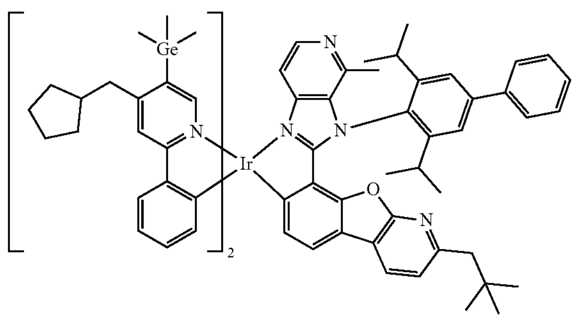
-continued
2266
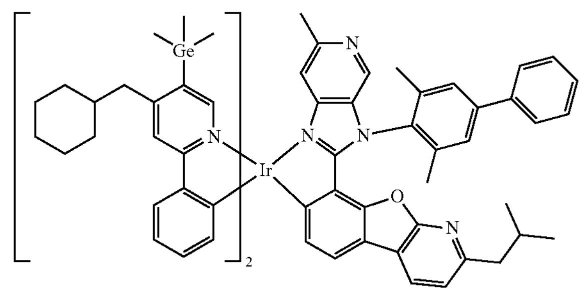
2267
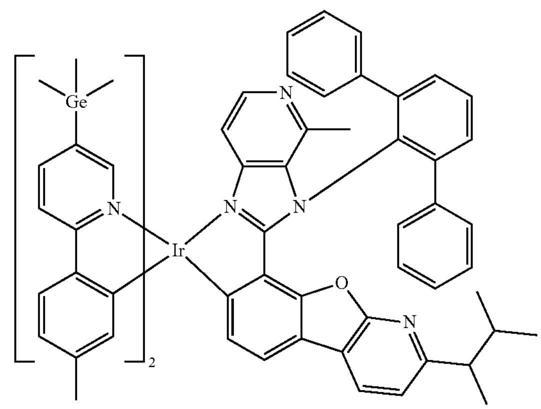
2268
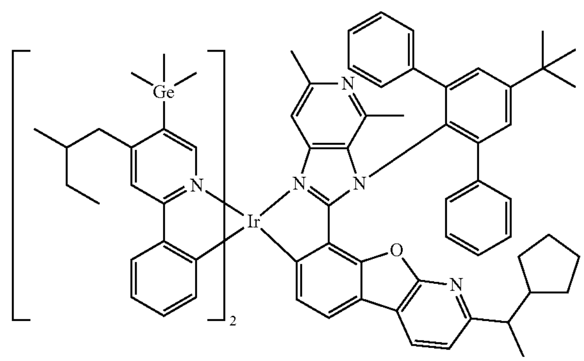
2269
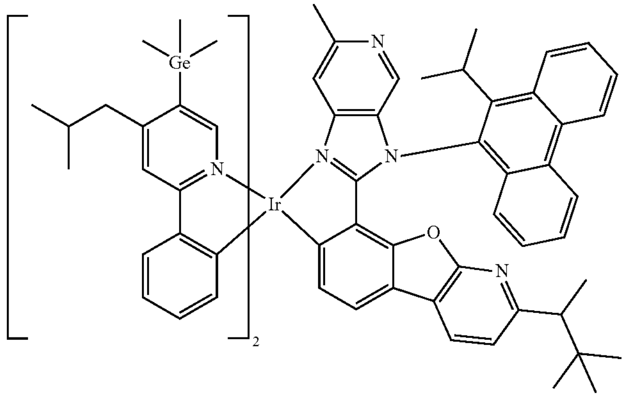

-continued
2270
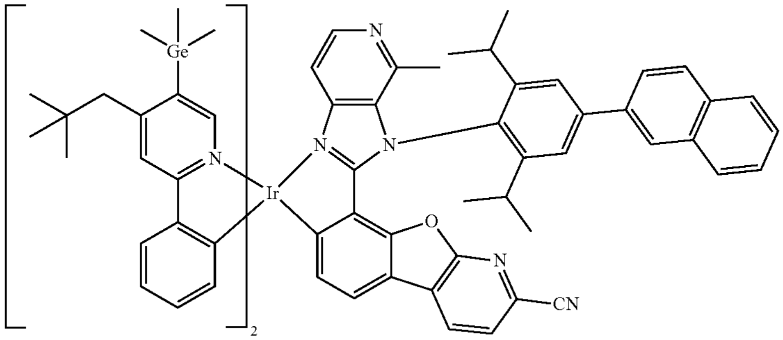
2271
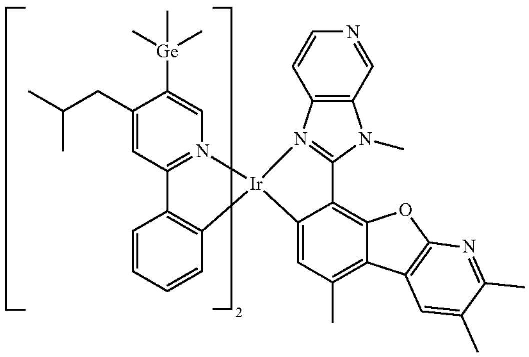
2272
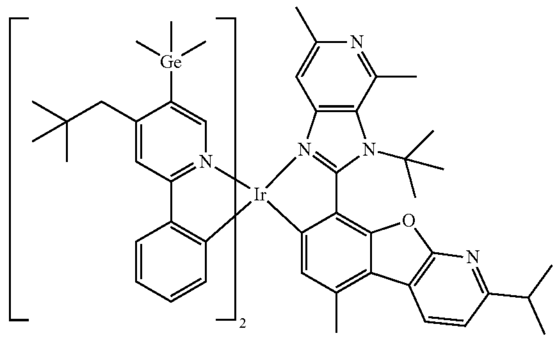
2273
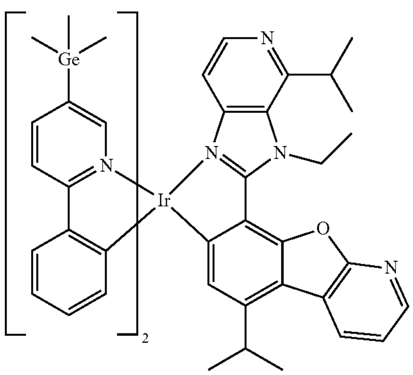
2274
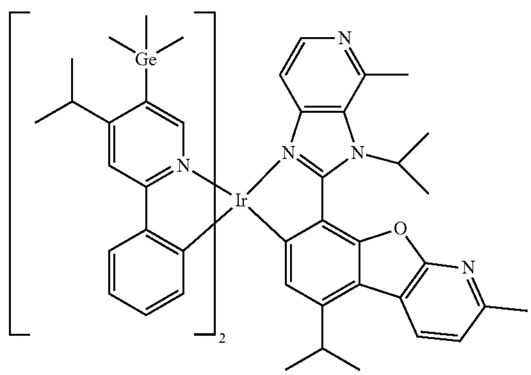
2275
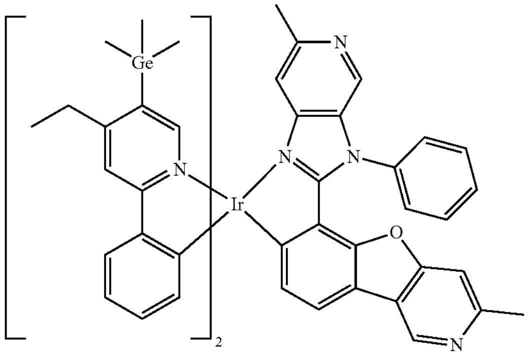
2276
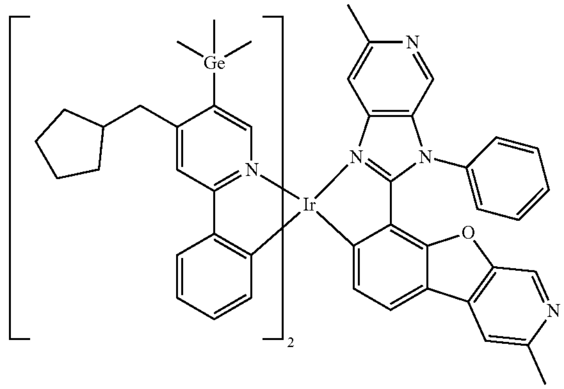

-continued
2277
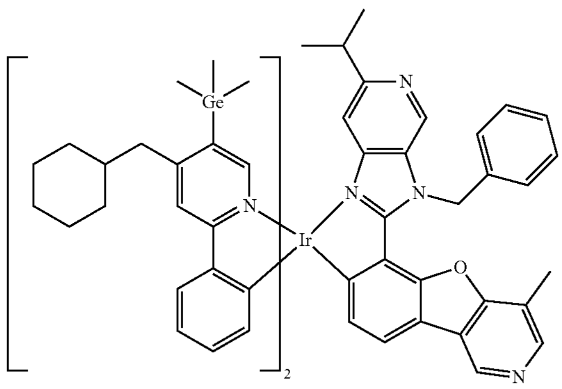
2278
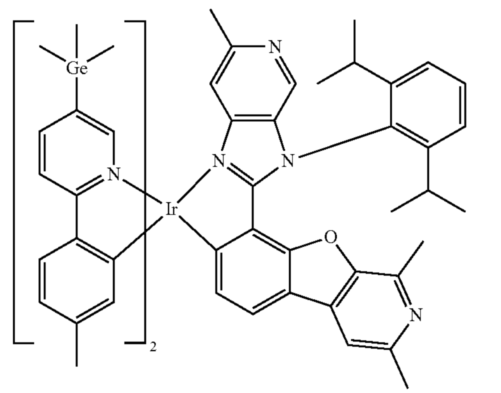
2279
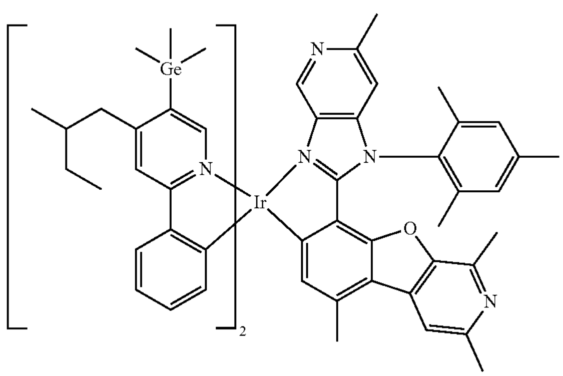
2280
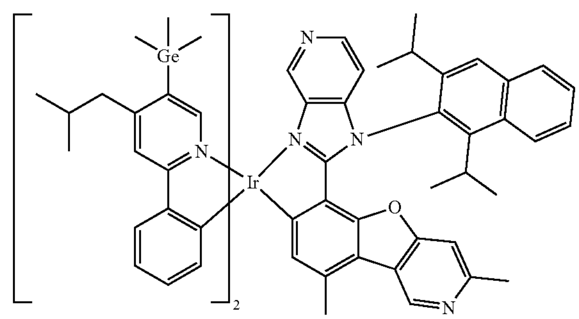
2281
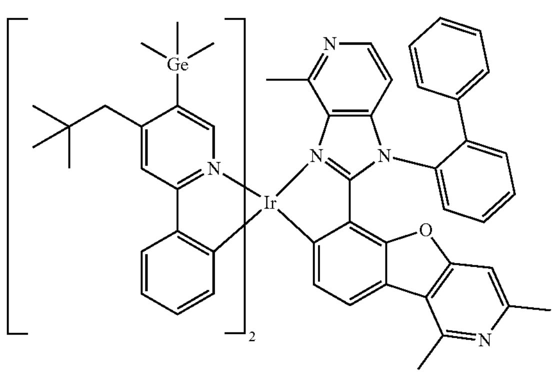
2282
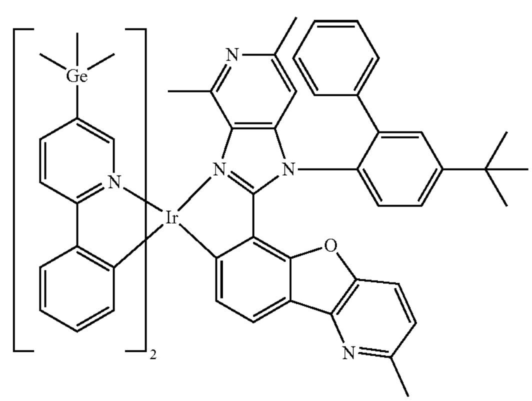
2283
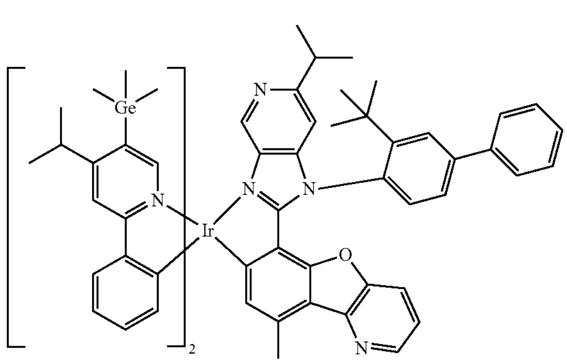
2284
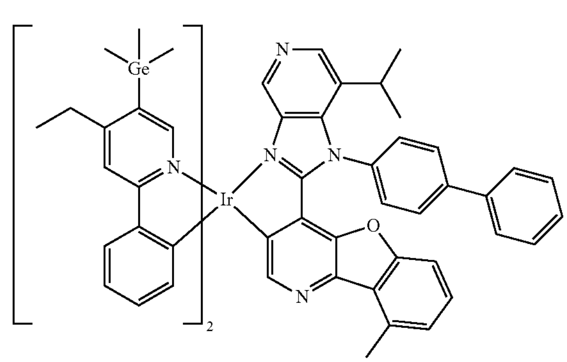

-continued
2285
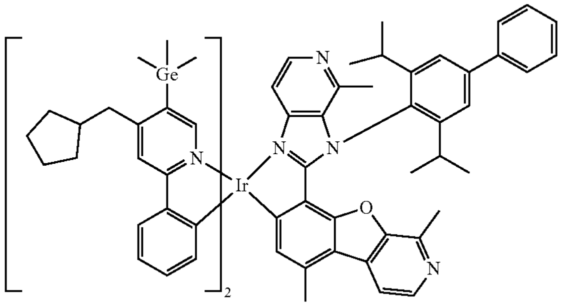
2286
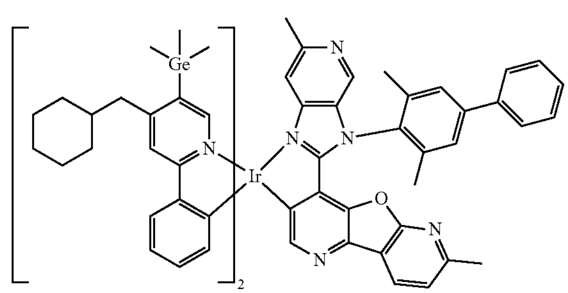
2287
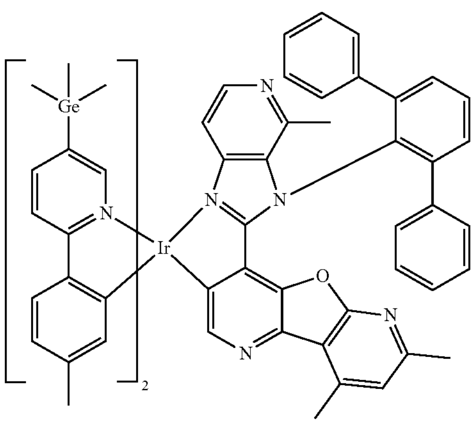
2288
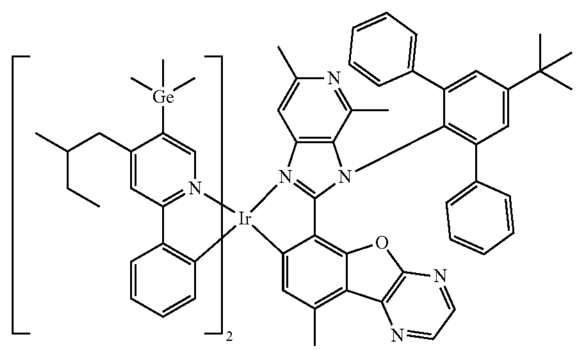
2289
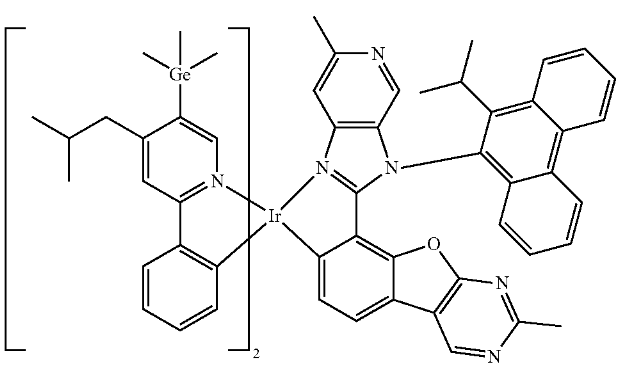
2290
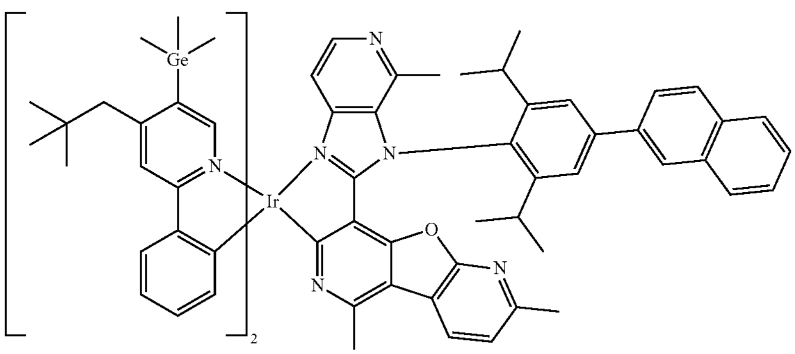

-continued
2291
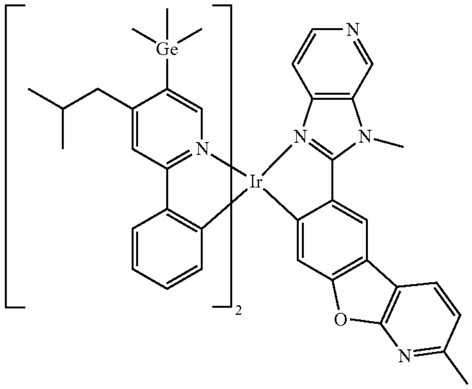
2292
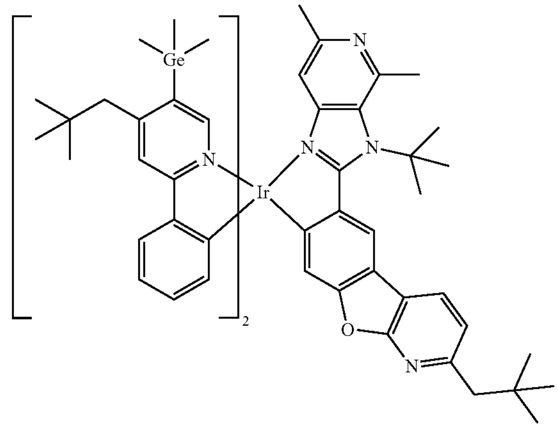
2293
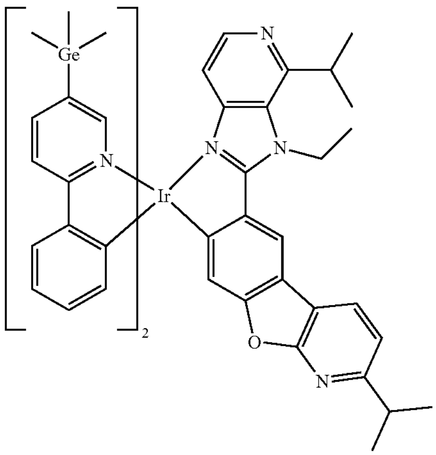
2294
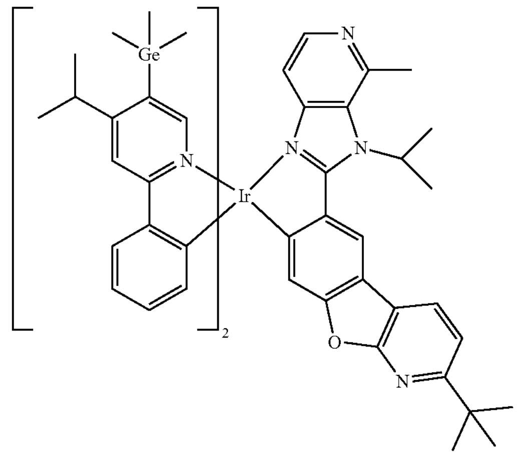
2295
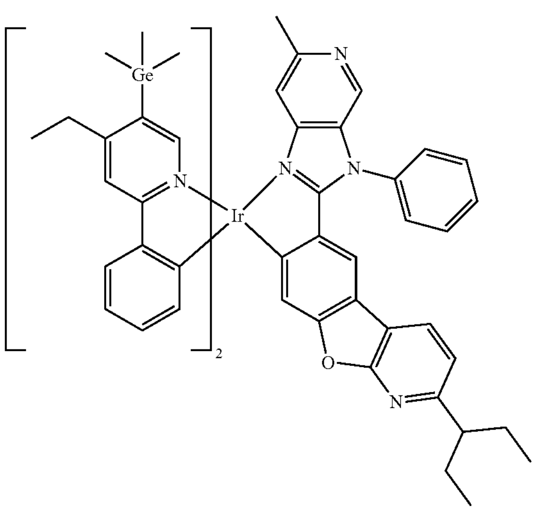
2296
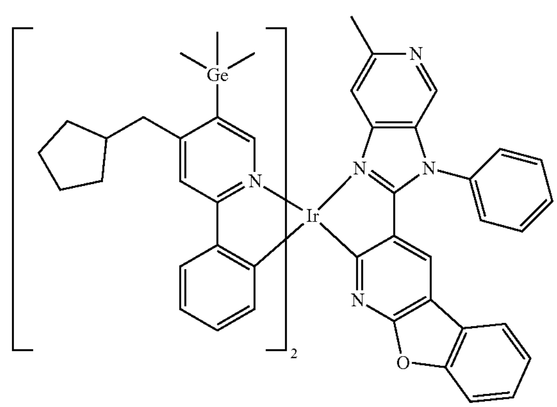

-continued
2297
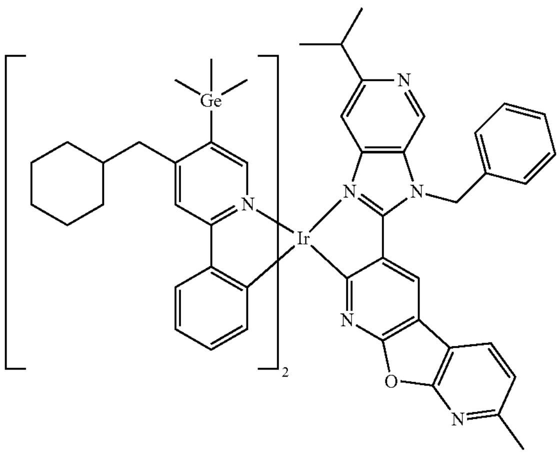
2298
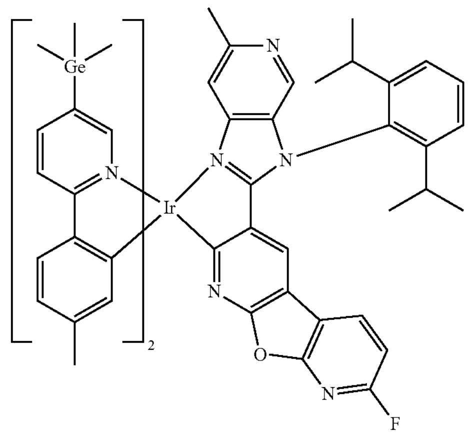
2299
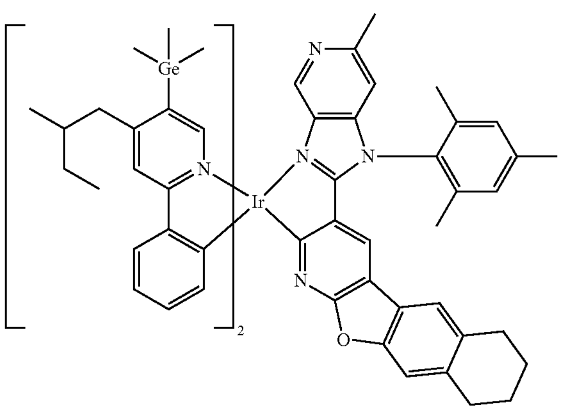
2300
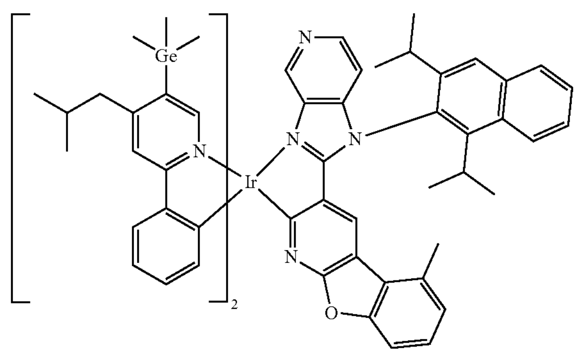
2301
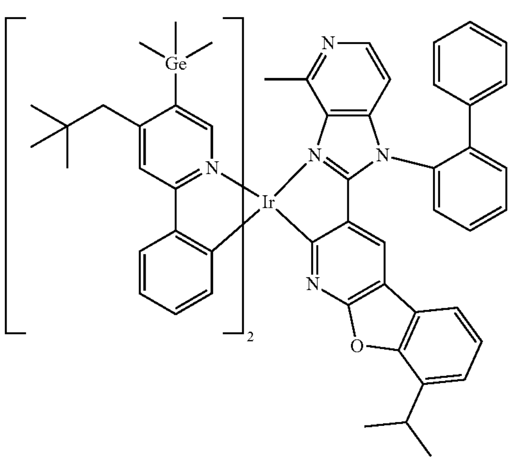
2302
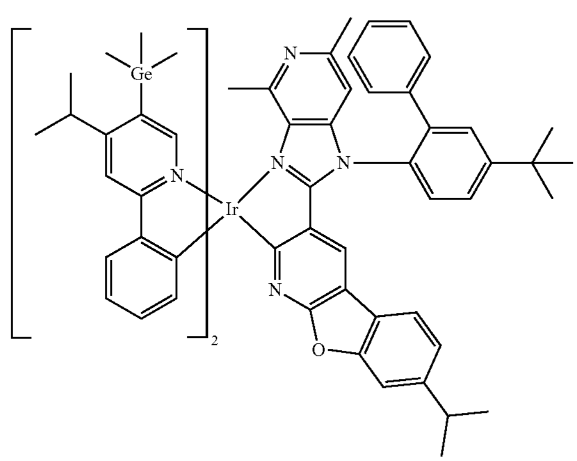

-continued
2303
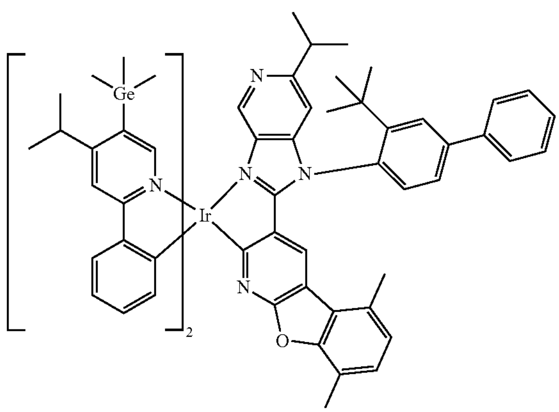
2304
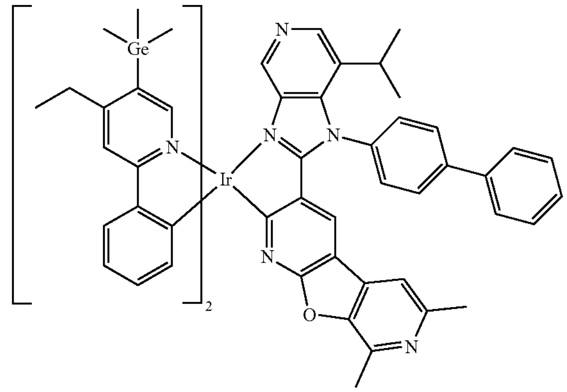
2305
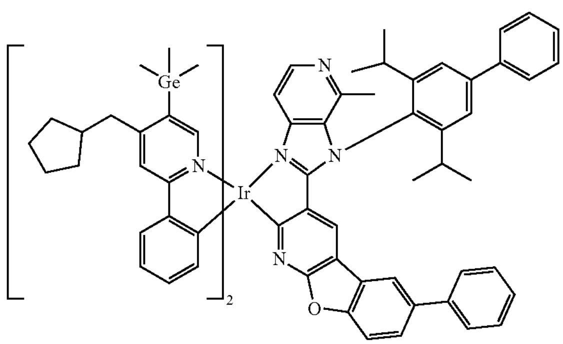
2306
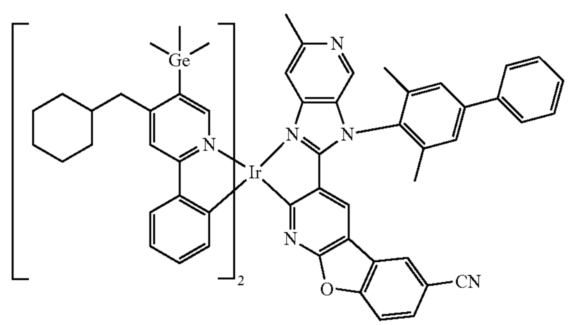
2307
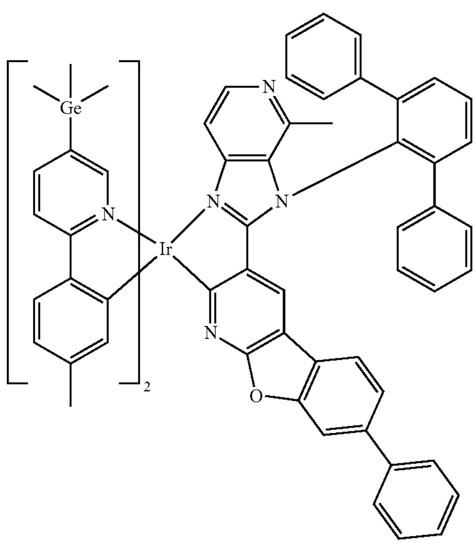
2308
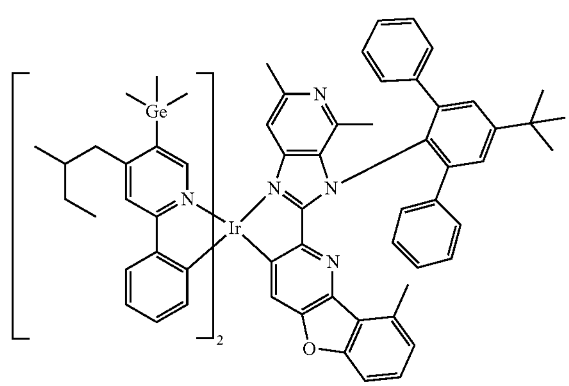

-continued
2309
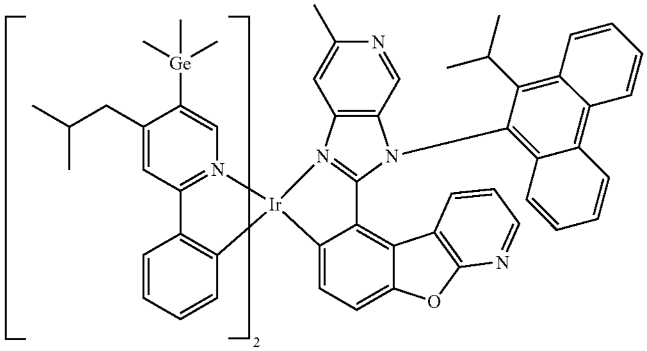
2310
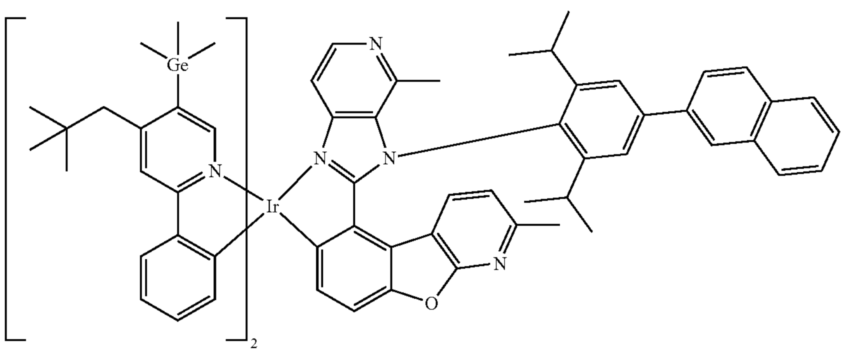
2311
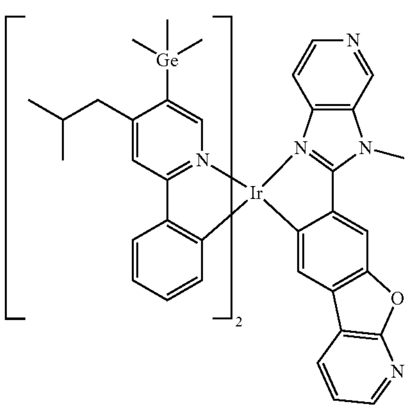
2312
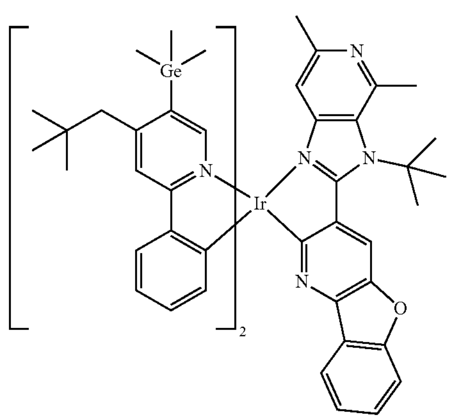

-continued
2313
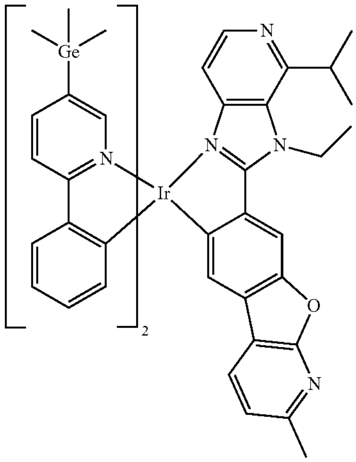
2314
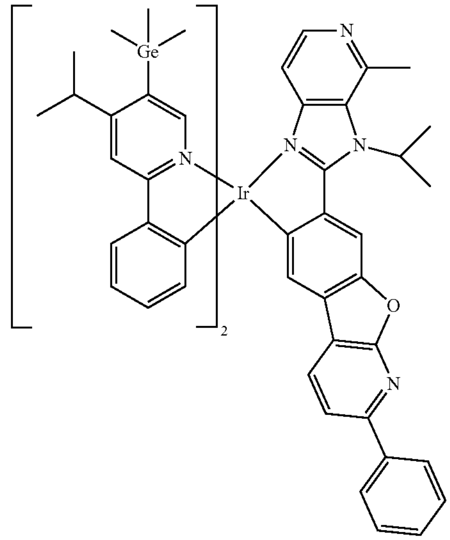
2315
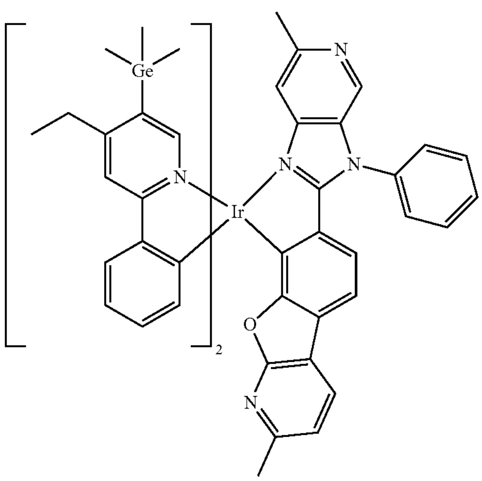
2316
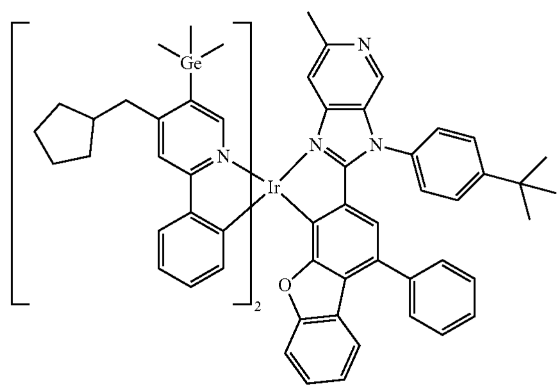
2317
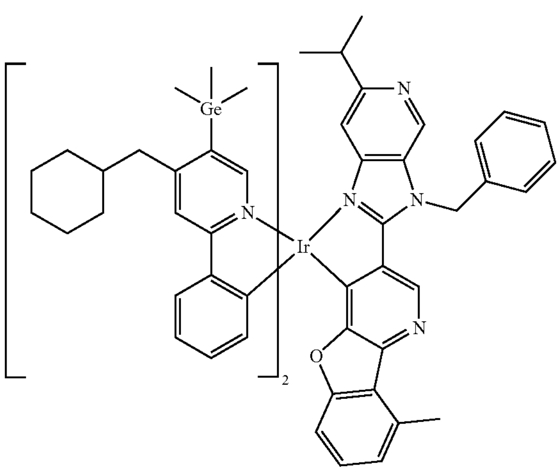
2318
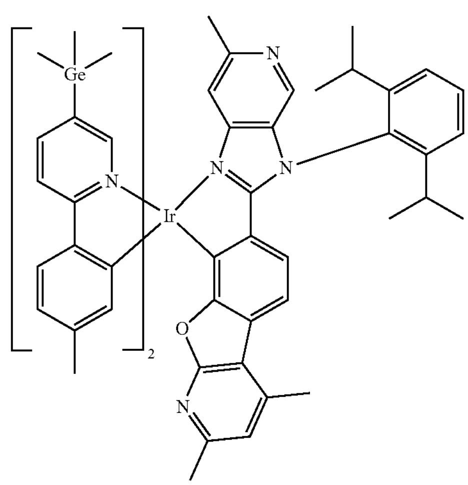

-continued
2319
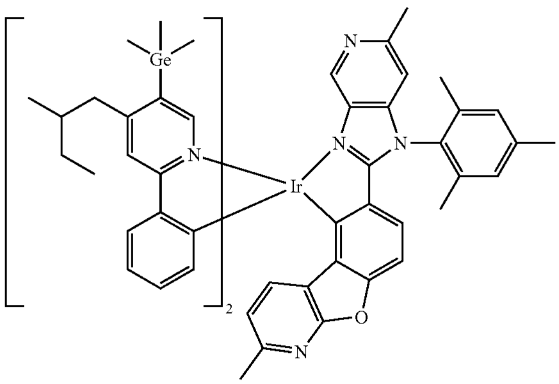
2320
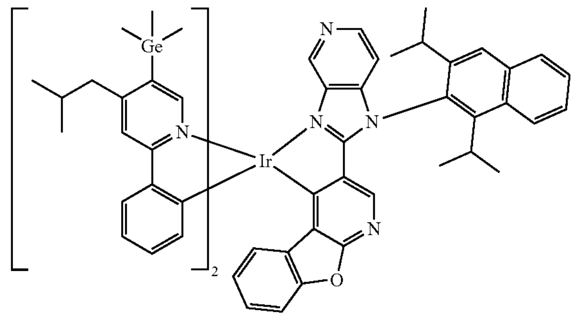
2321
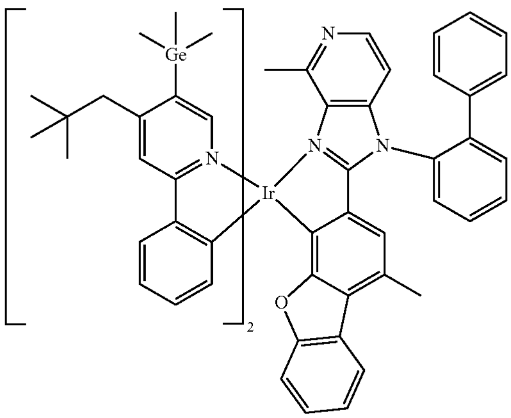
2322
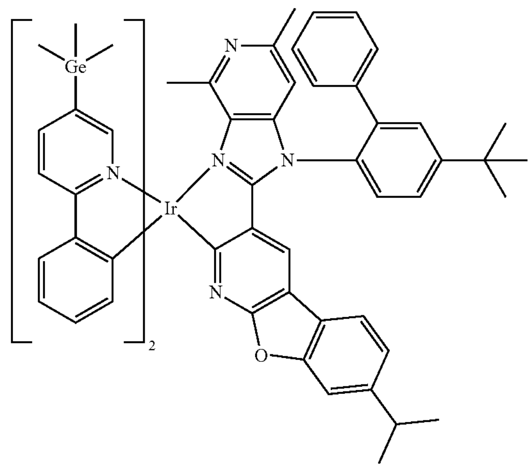
2323
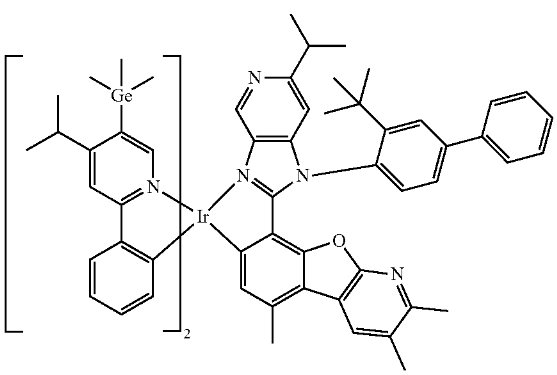
2324
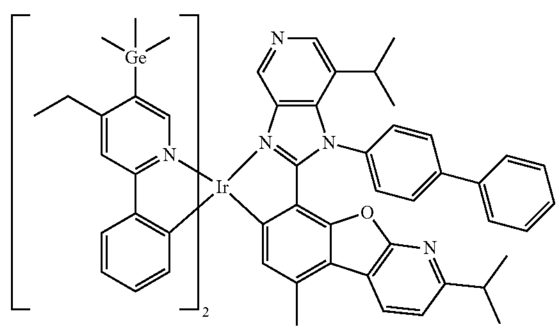
2325
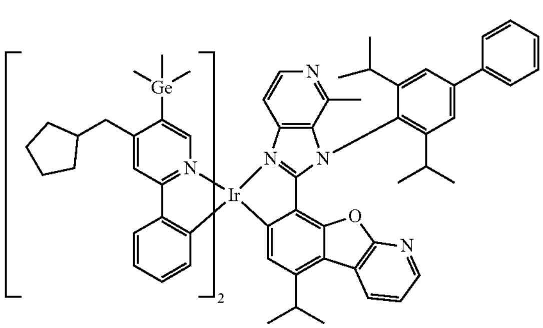
2326
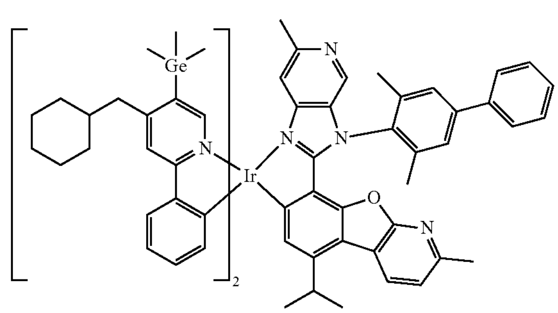

-continued
2327
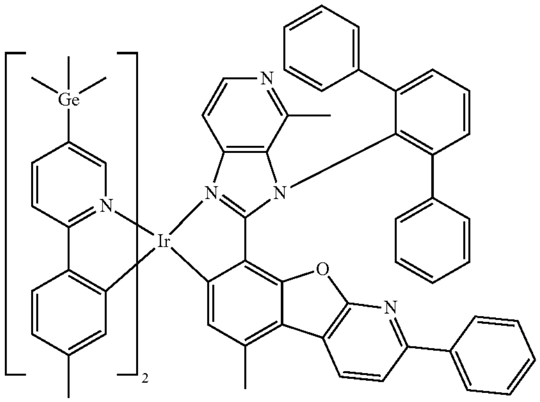
2328
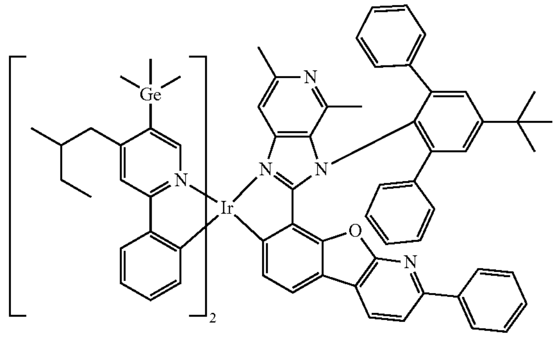
2329
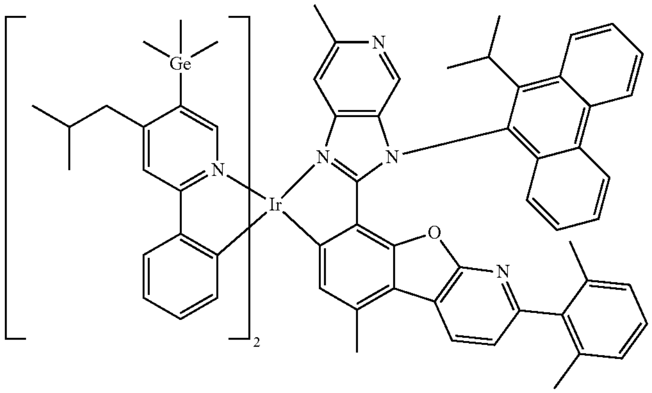
2330
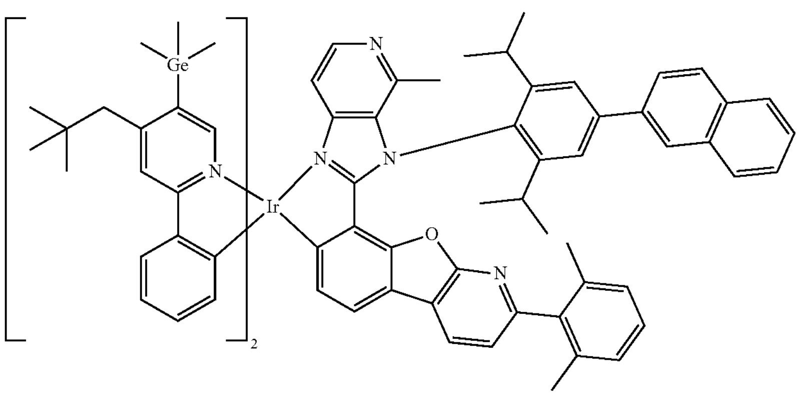
2331
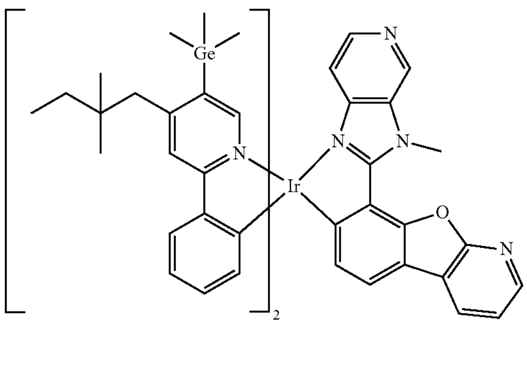
2332
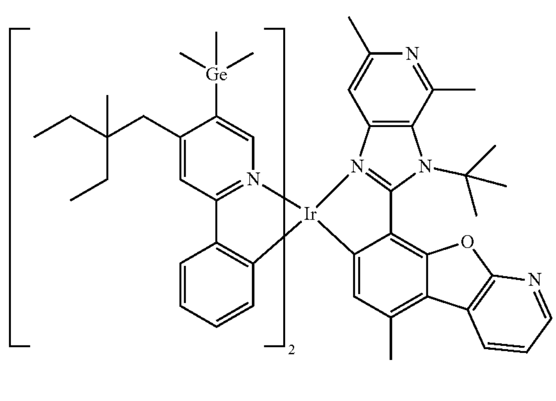

-continued
2333
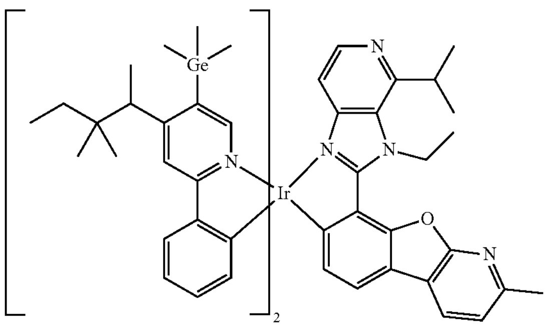
2334
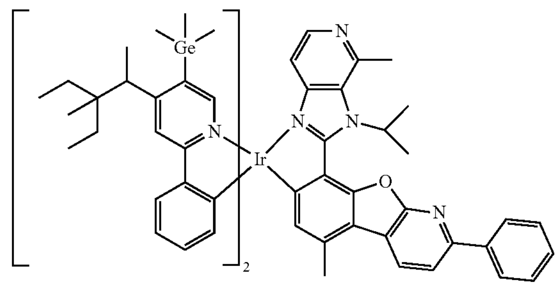
2335
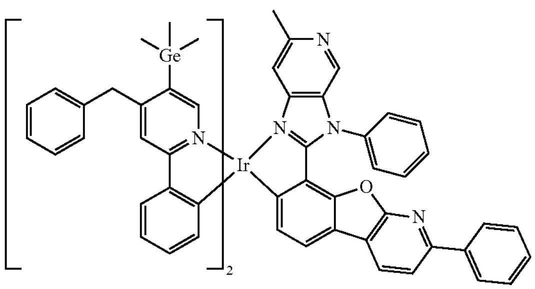
2336
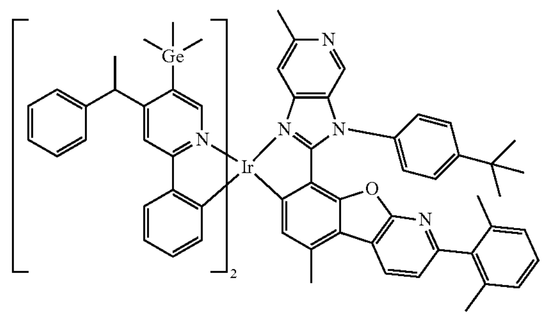
2337
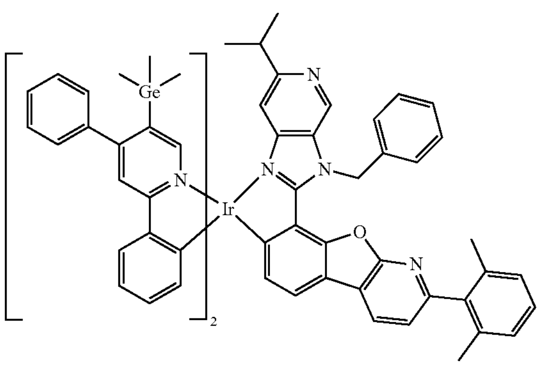
2338
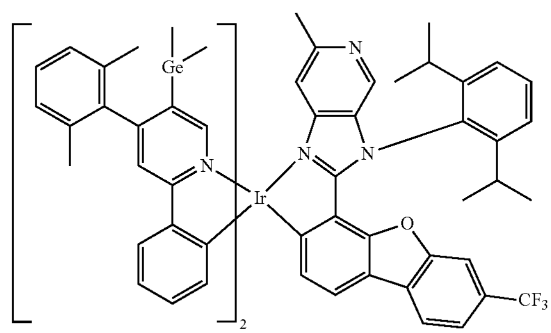
2339
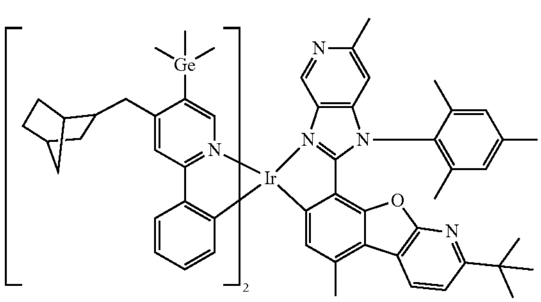
2340
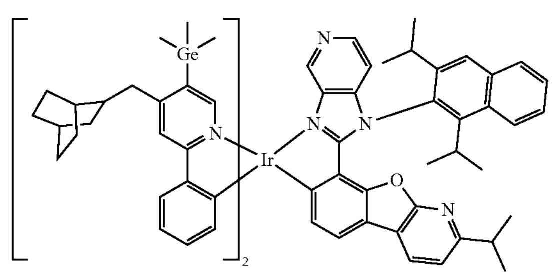

-continued
2341
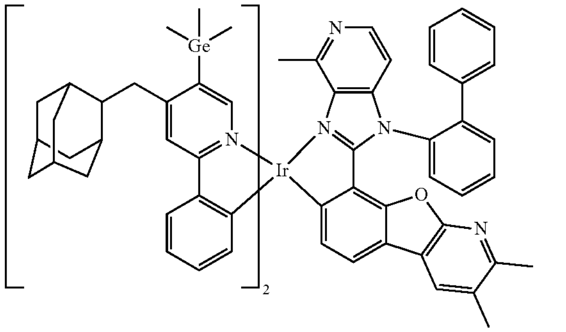
2342
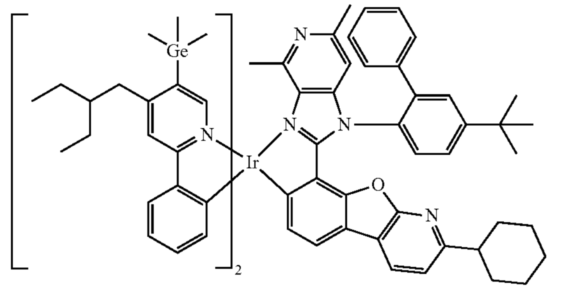
2343
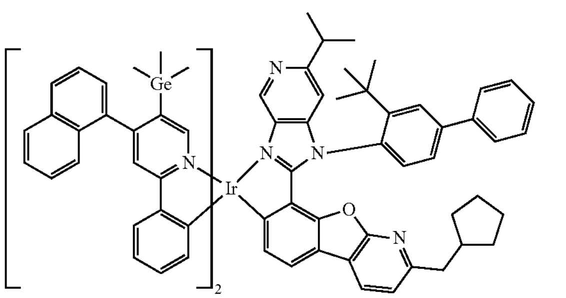
2344
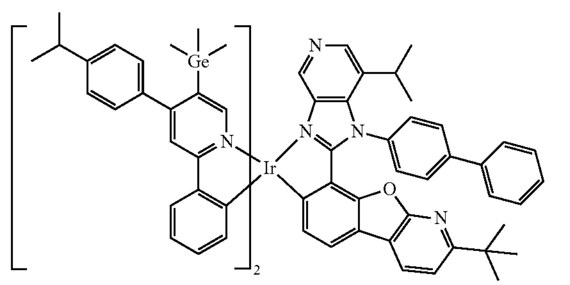
2345
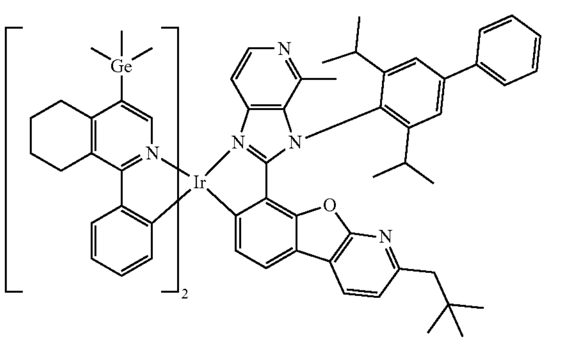
2346
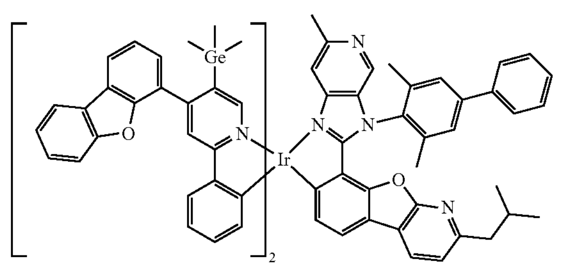
2347
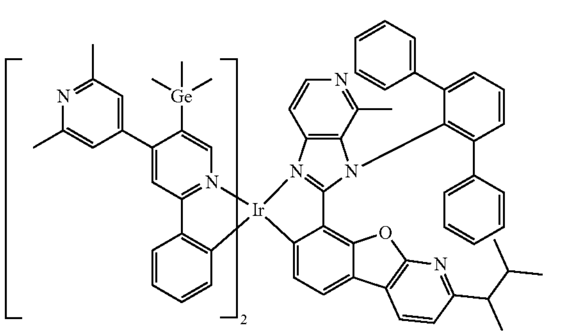
2348
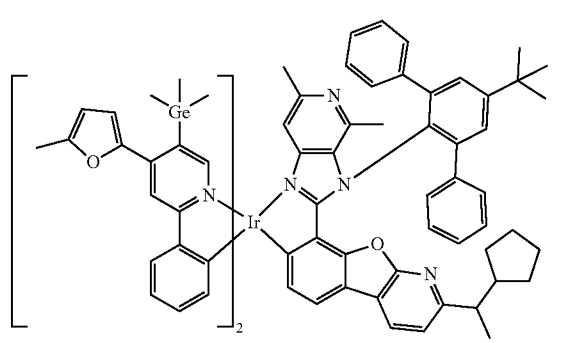

-continued
2349
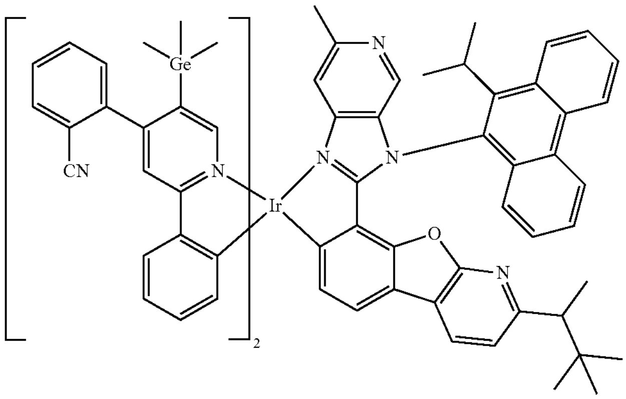
2350
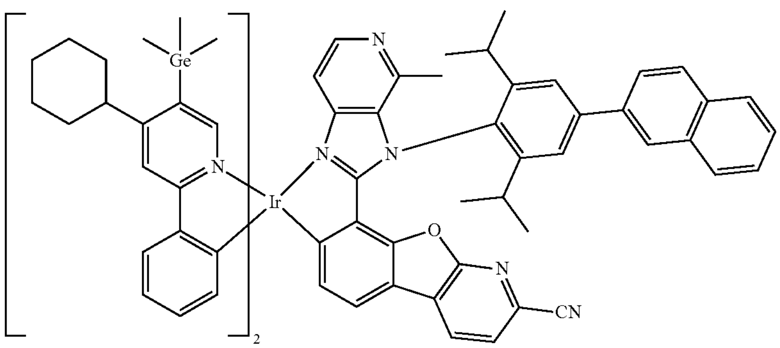
2351
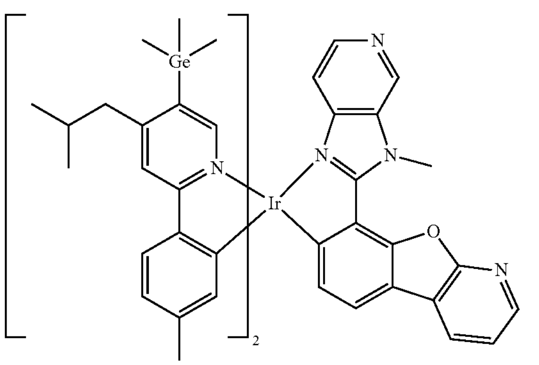
2352
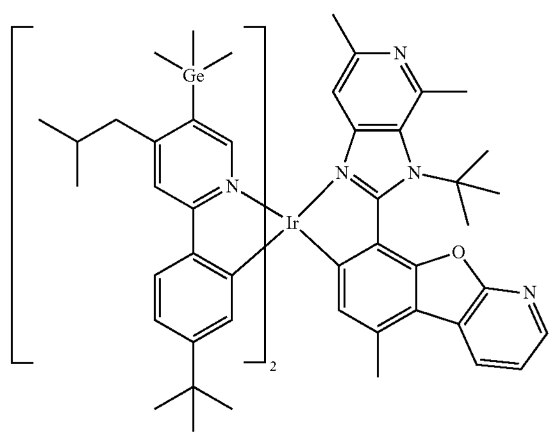
2353
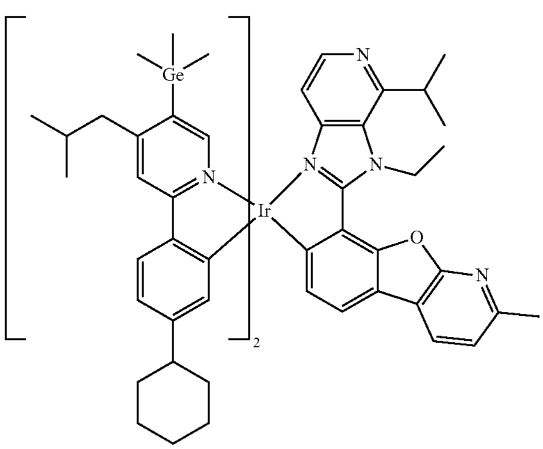
2354
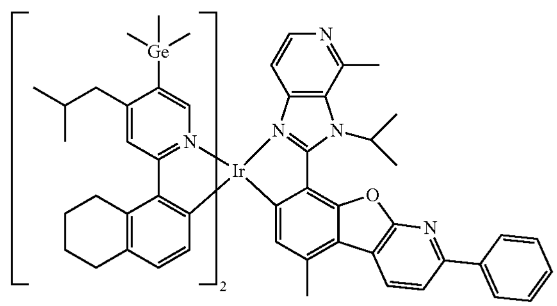

-continued
2355
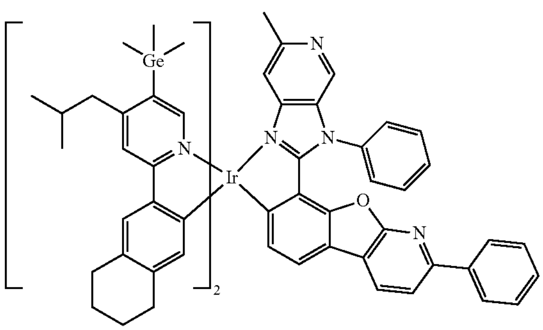
2356
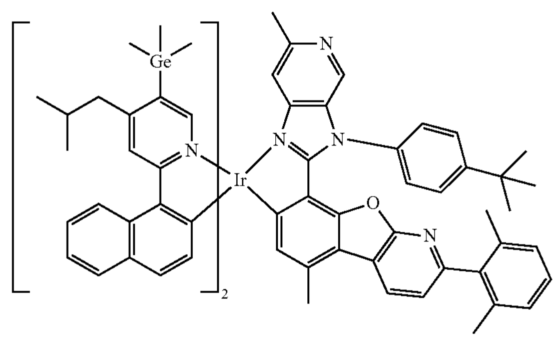
2357
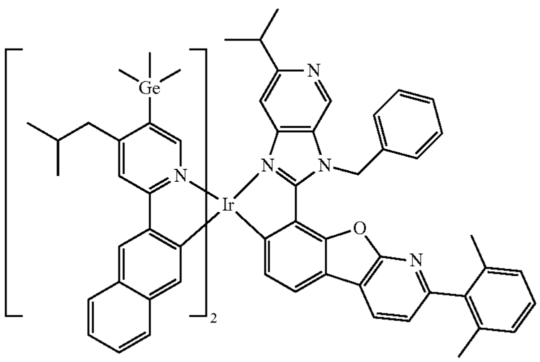
2358
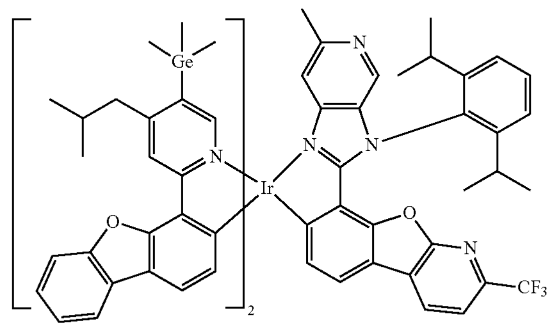
2359
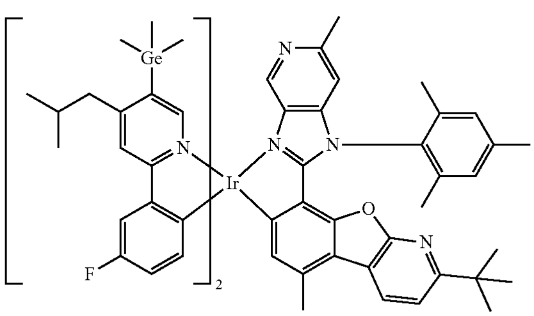
-continued
2361
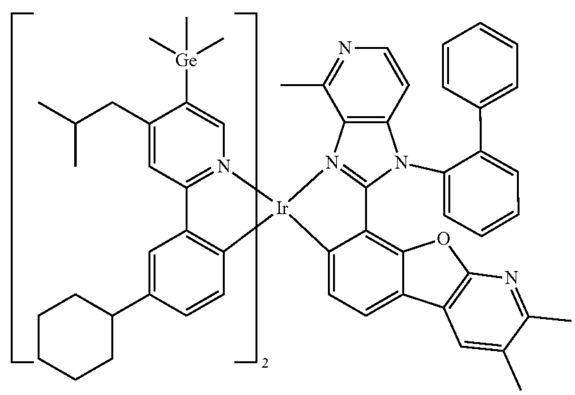
2360
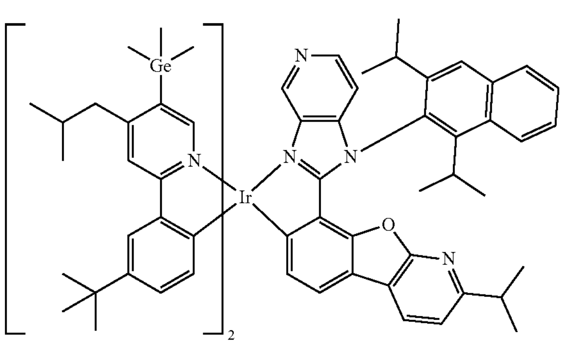
2362
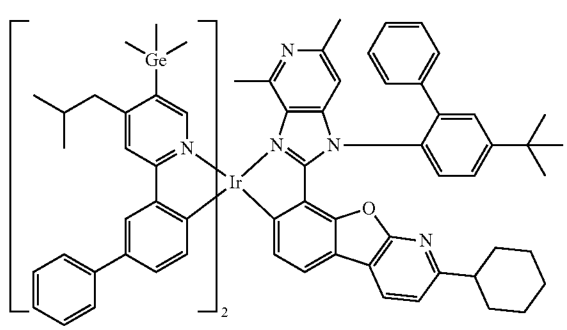

-continued
2363
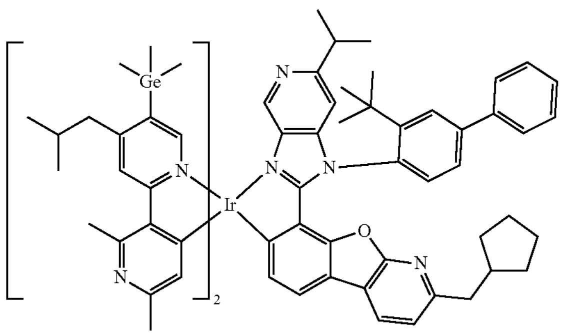
2364
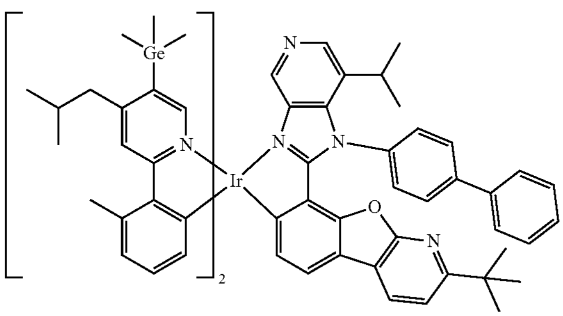
2365
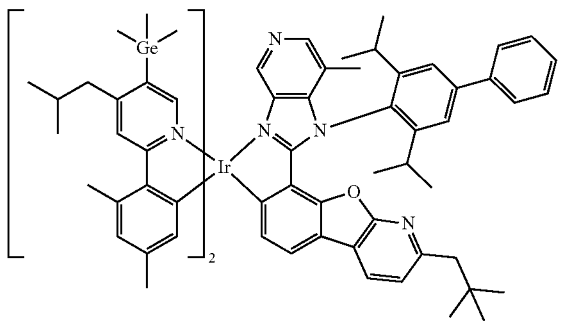
2366
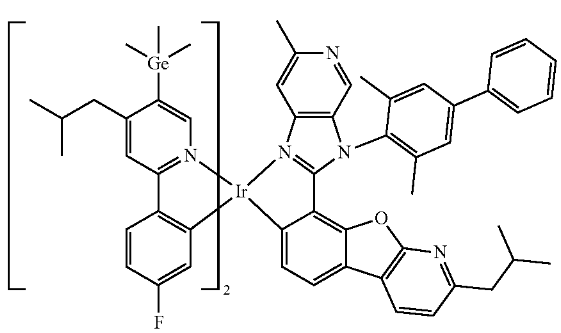
-continued
2367
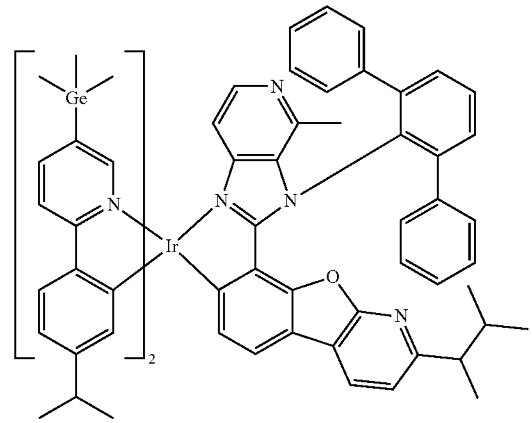
2368
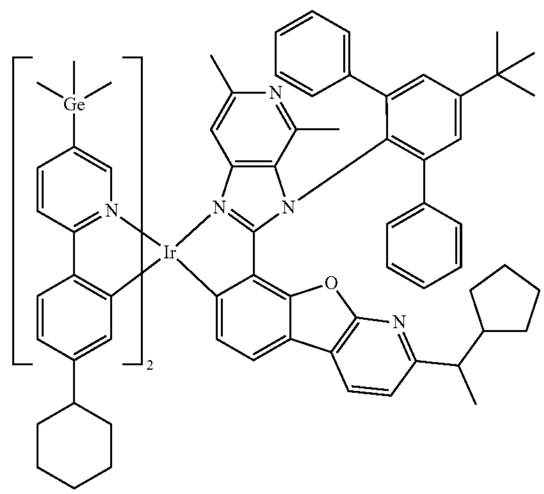
2369
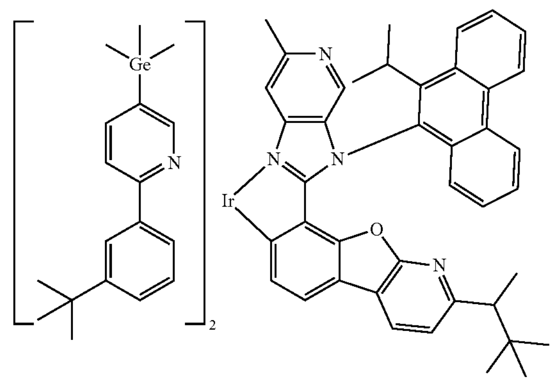

-continued
2370
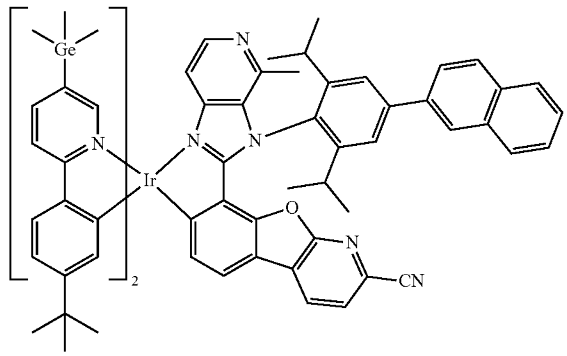
2371
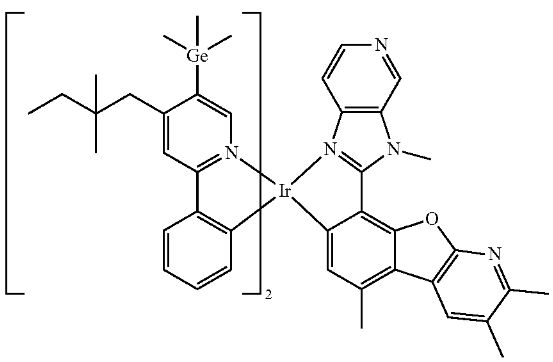
2372
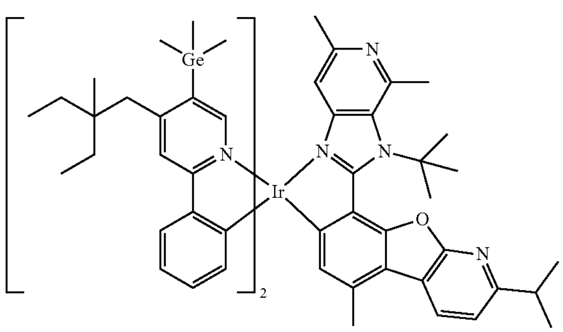
2373
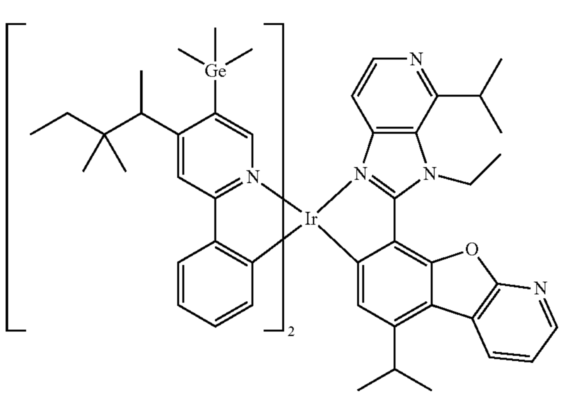
-continued
2374
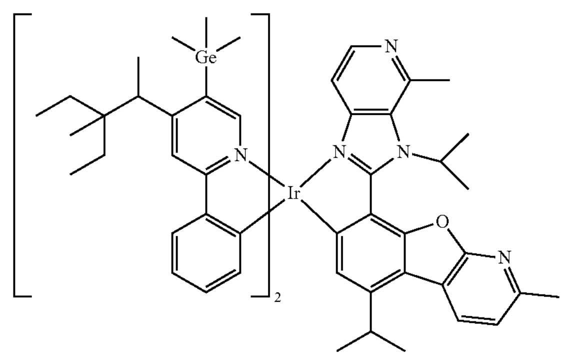
2375
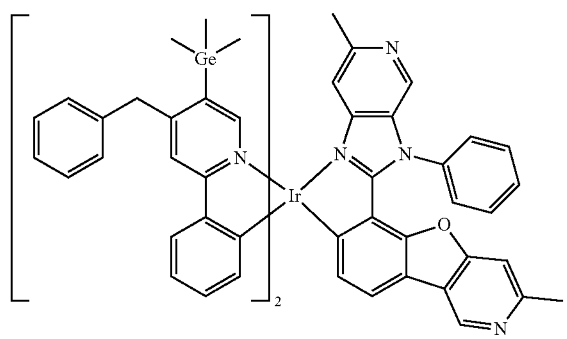
2376
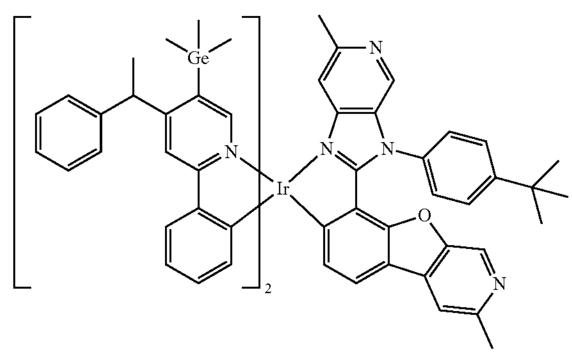
2377
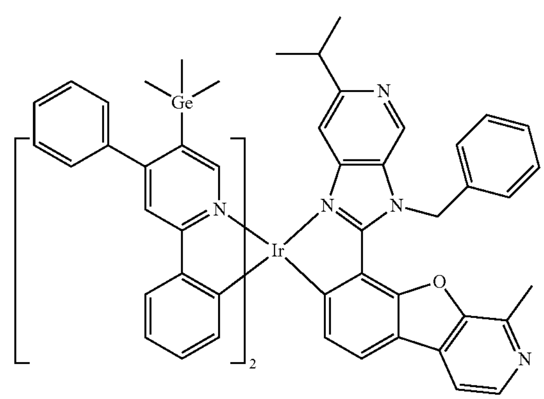

-continued
2378
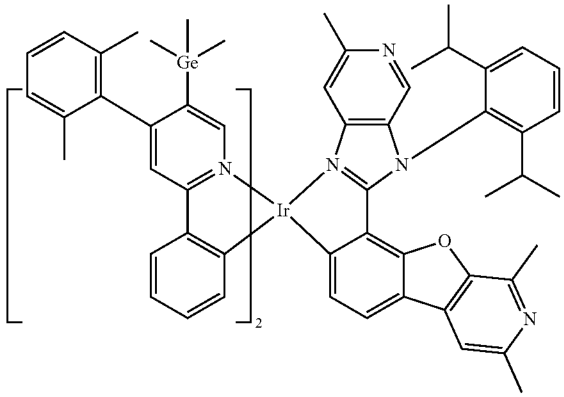
2379
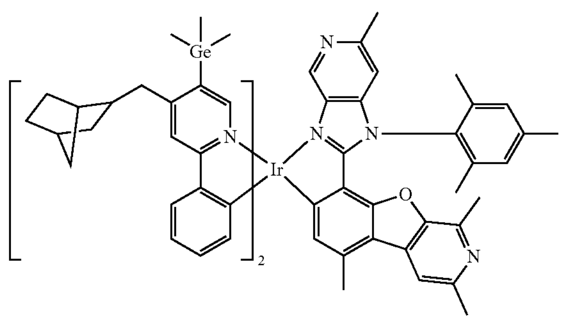
2380
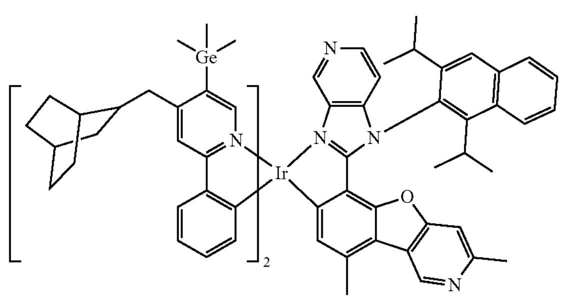
2381
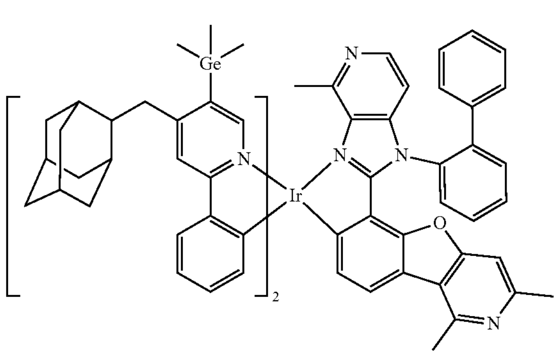
-continued
2382
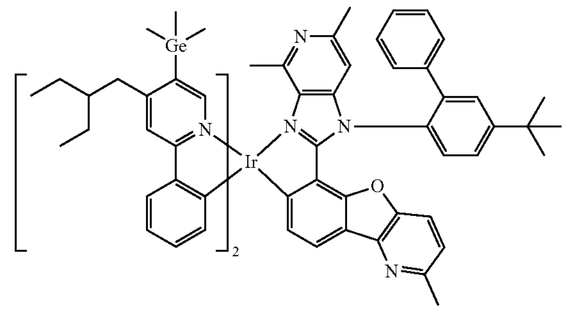
2383
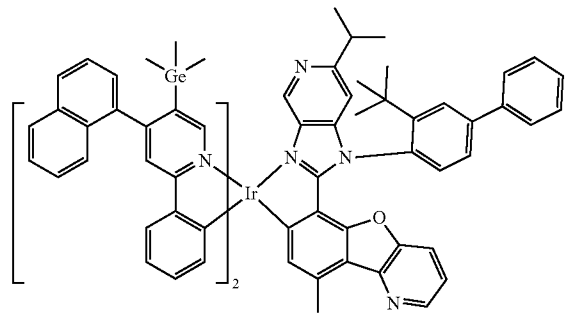
2384
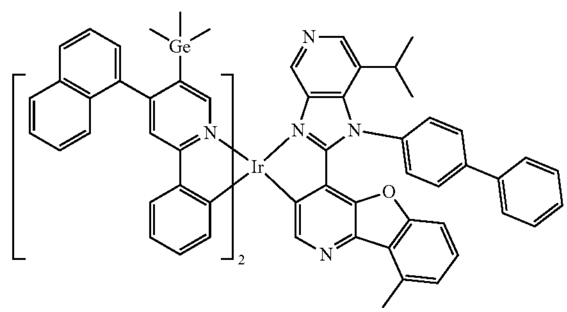
2385
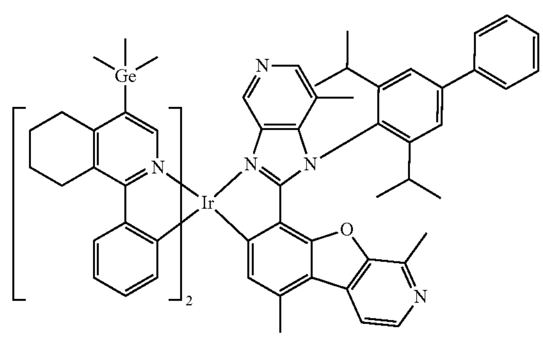
2386
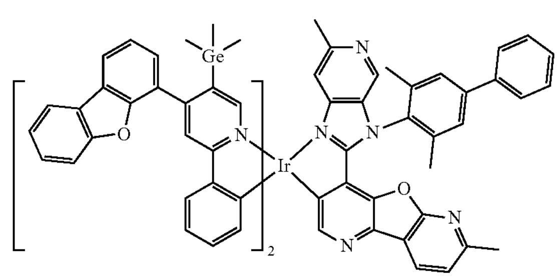

-continued
2387
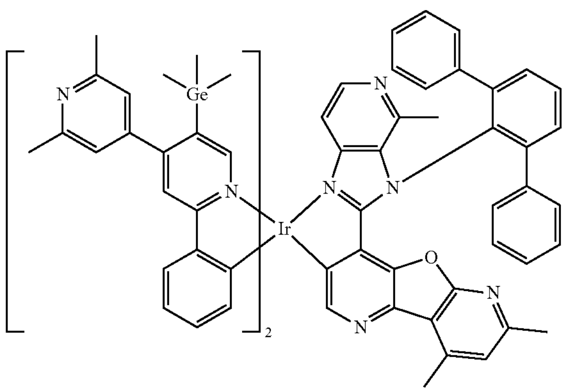
2388
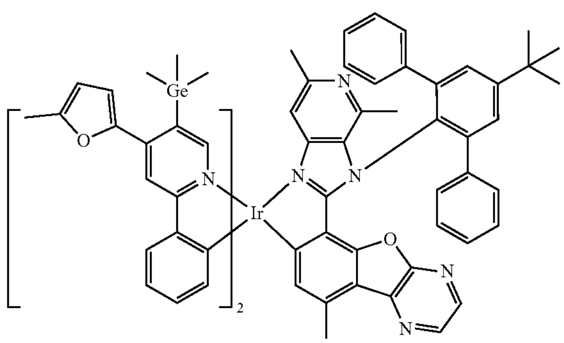
2389
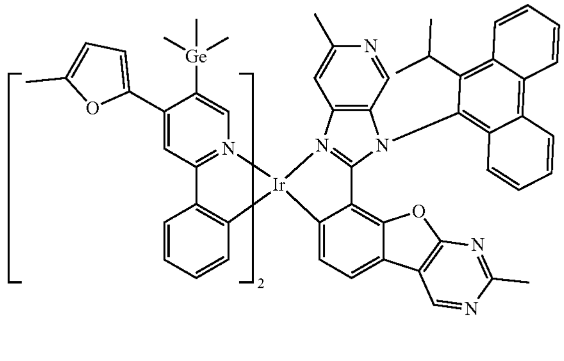
2390
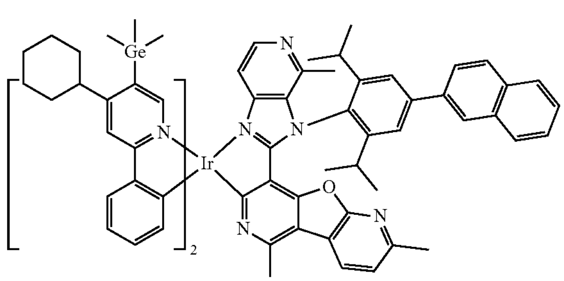
-continued
2391
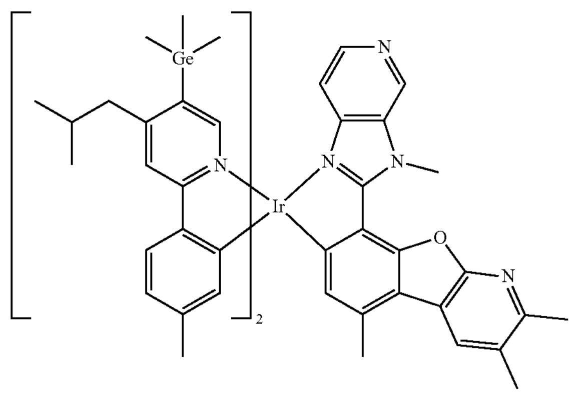
2392
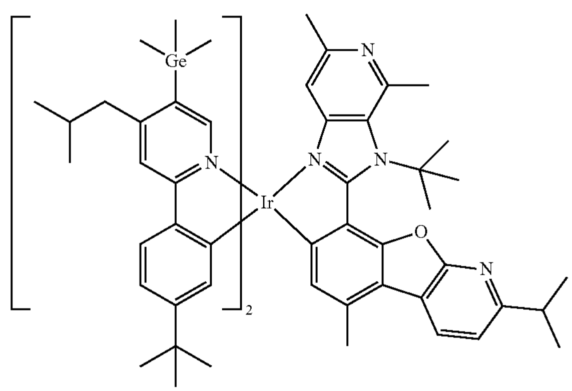
2393
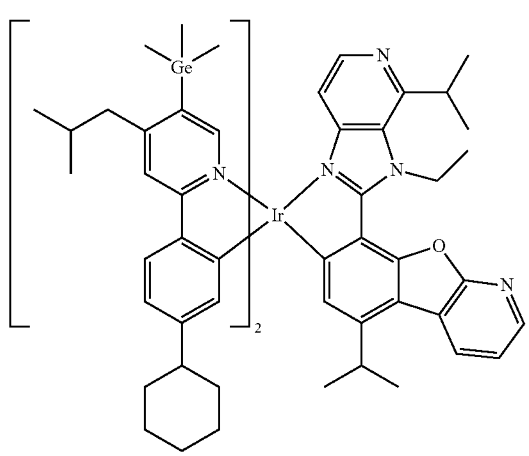

2394
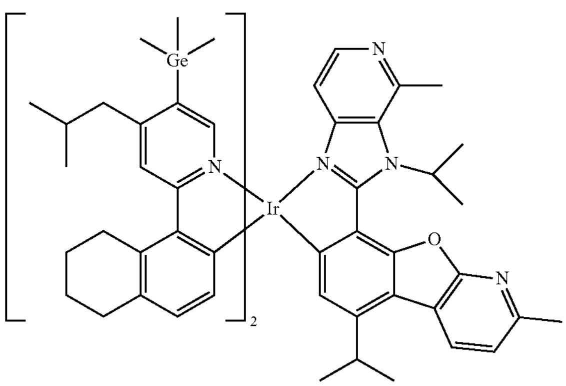
2395
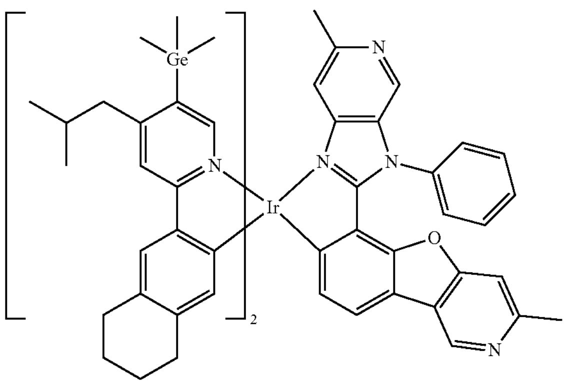
2396
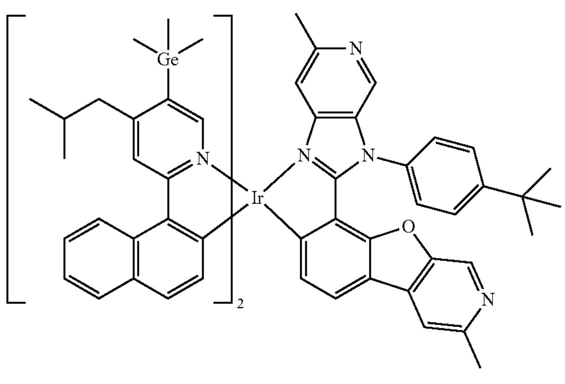
2397
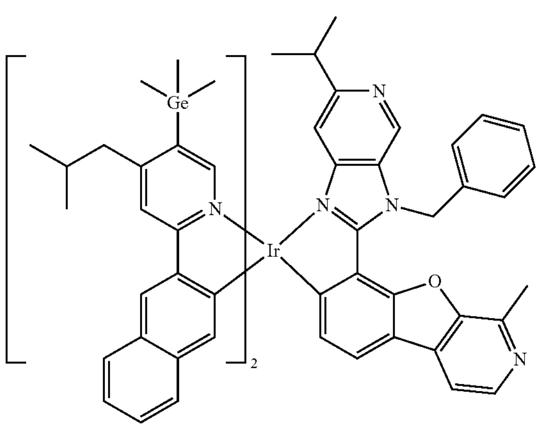
2398
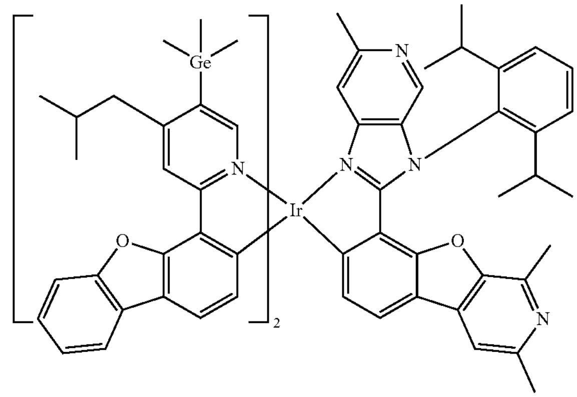
2399
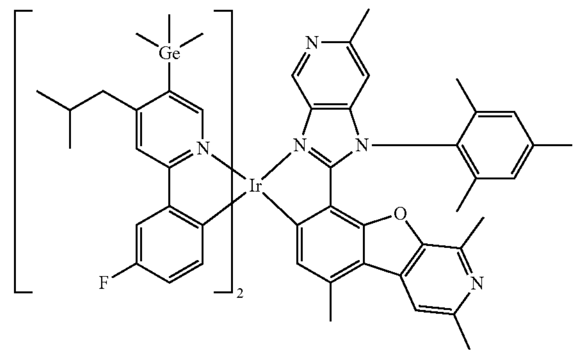
2400
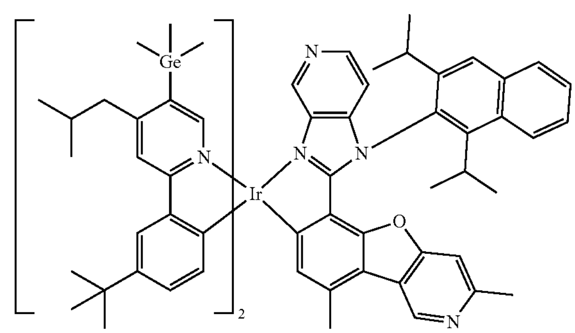
2401
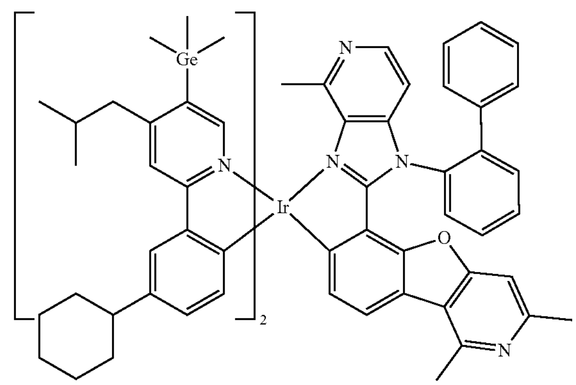

-continued
2402
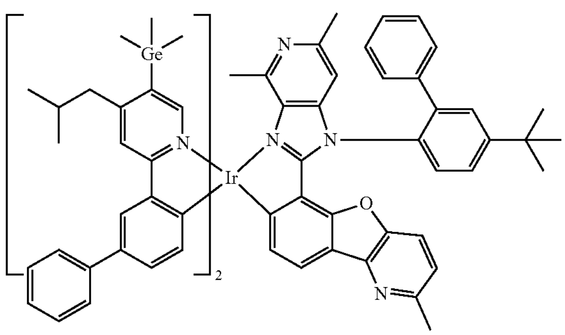
2403
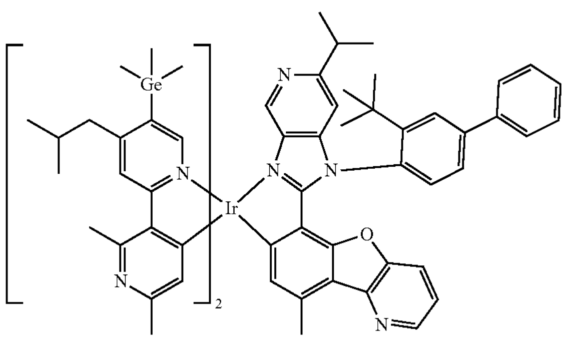
2404
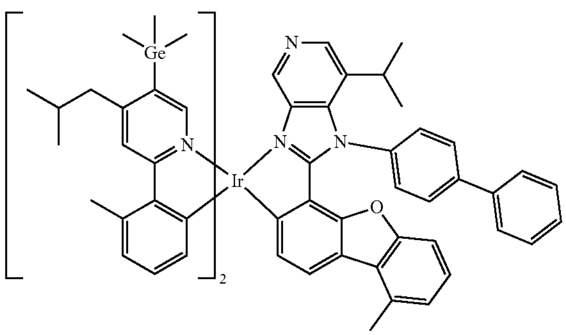
2405
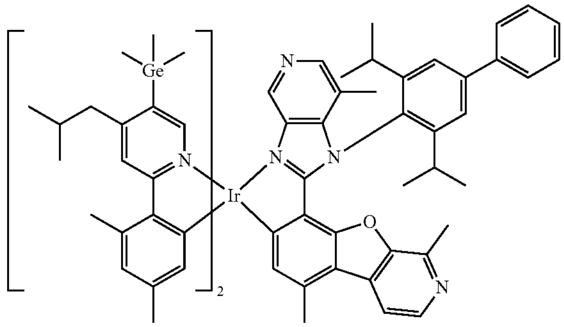
-continued
2406
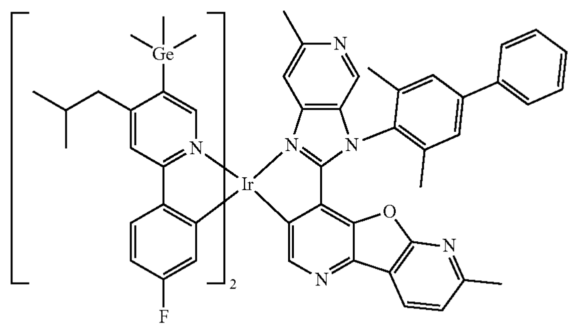
2407
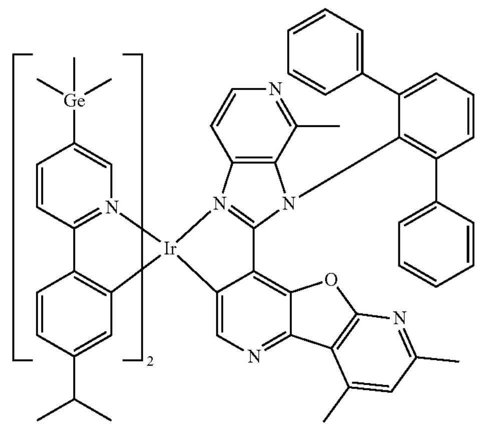
2408
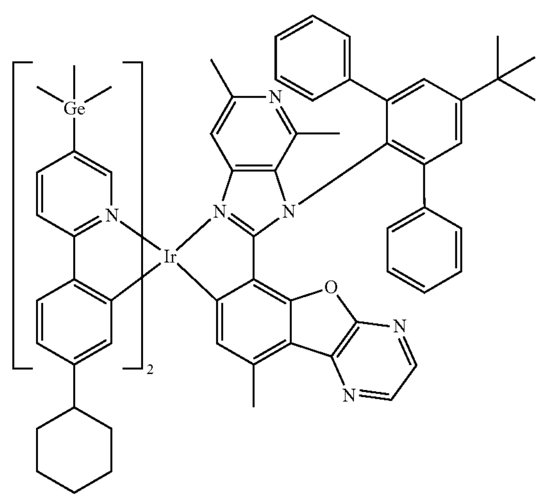

-continued
2409
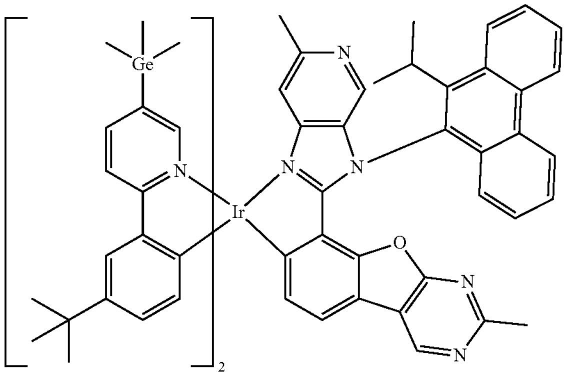
2410
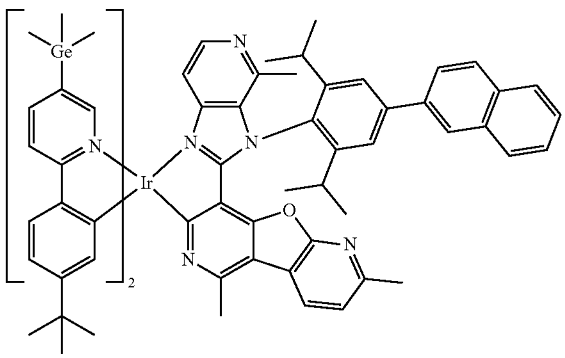
2411
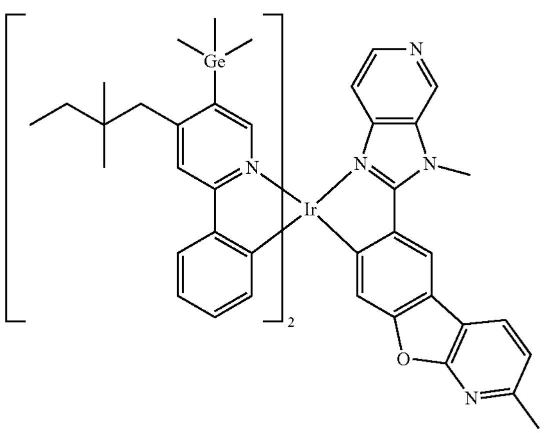
2412
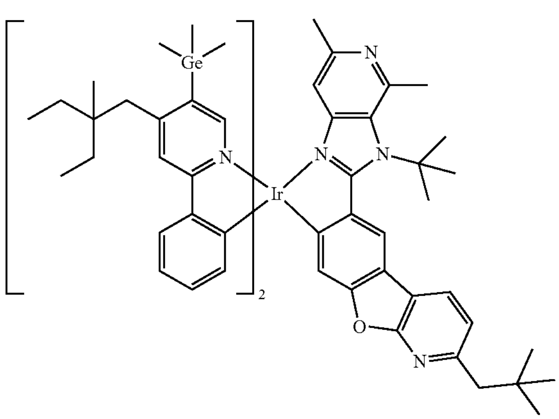
-continued
2413
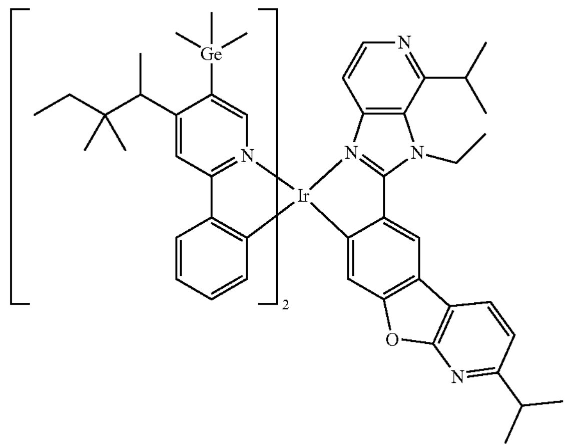
2414
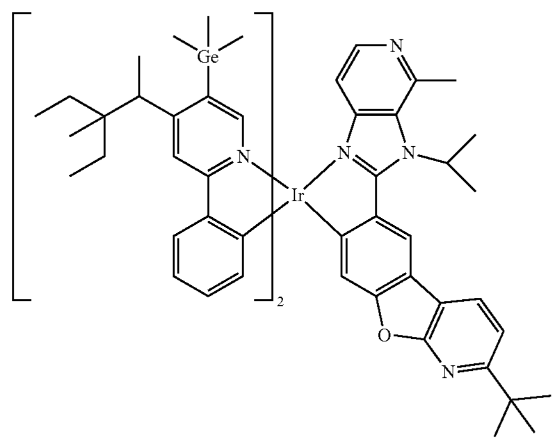
2415
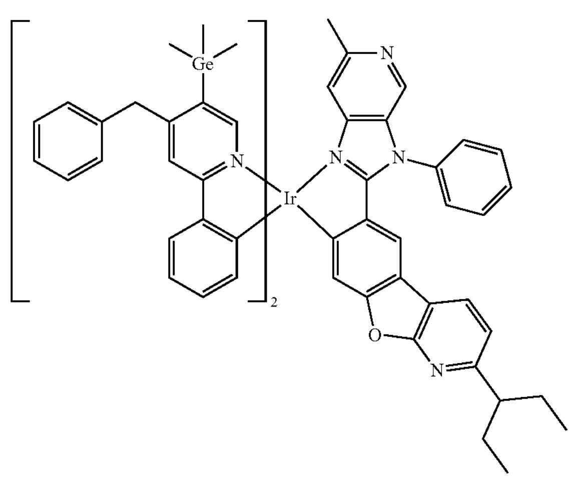

-continued
2416
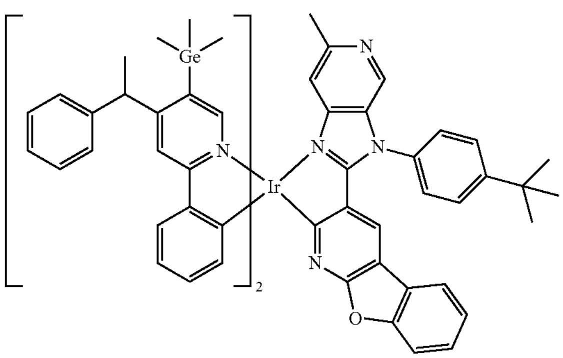
2417
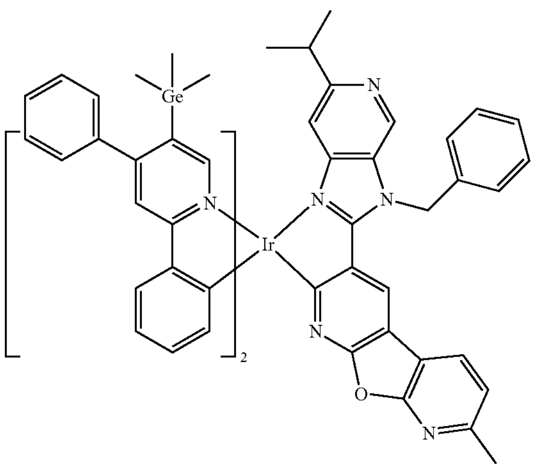
2418
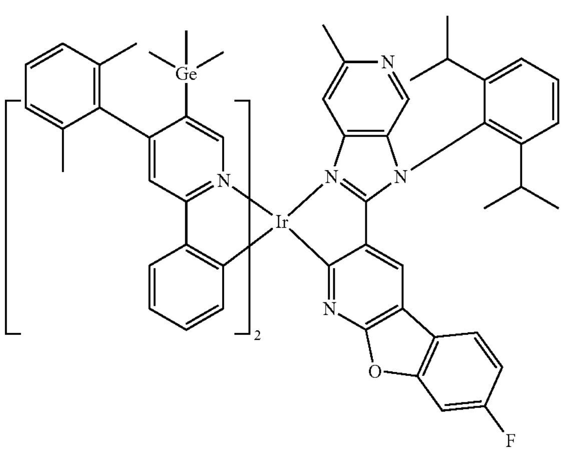
-continued
2419
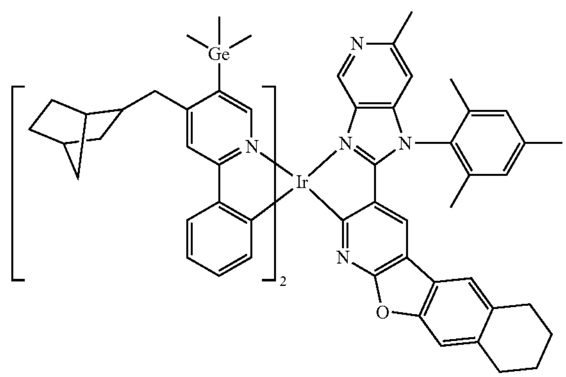
2420
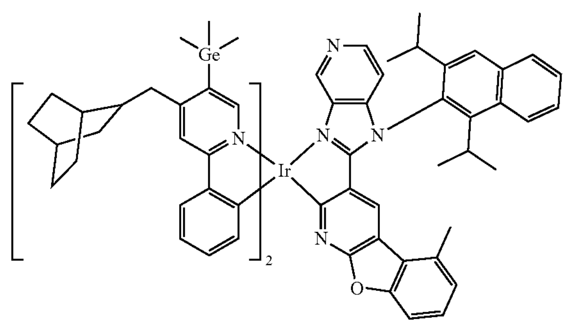
2421
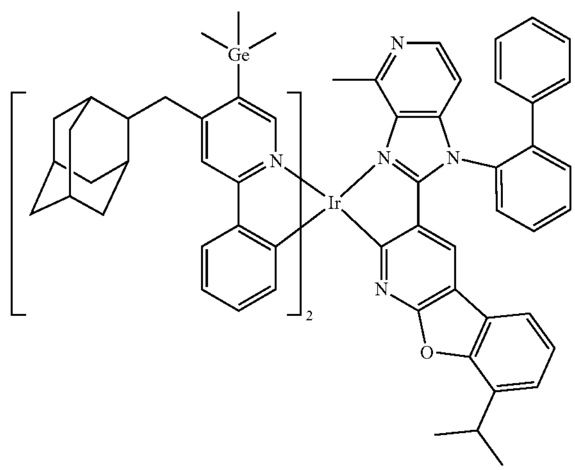
2422
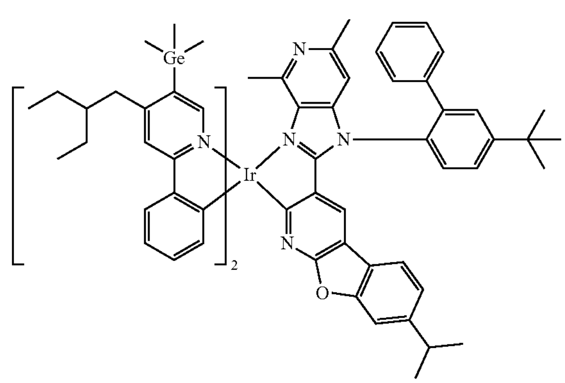

-continued
2423
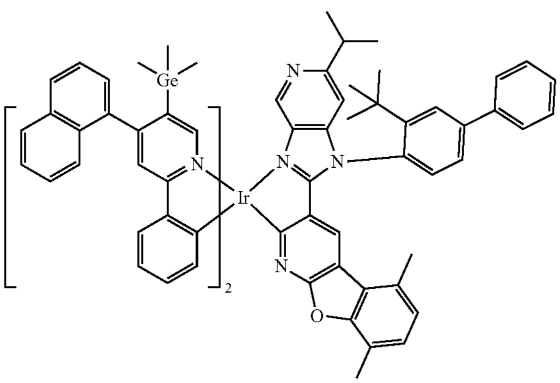
2424
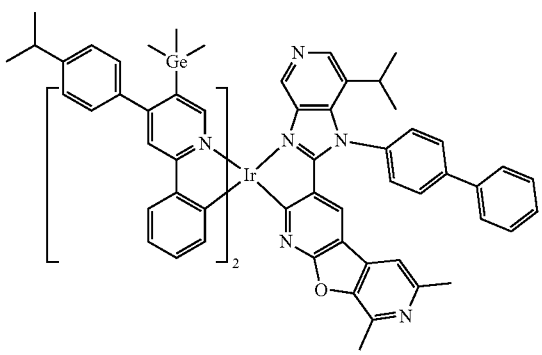
2425
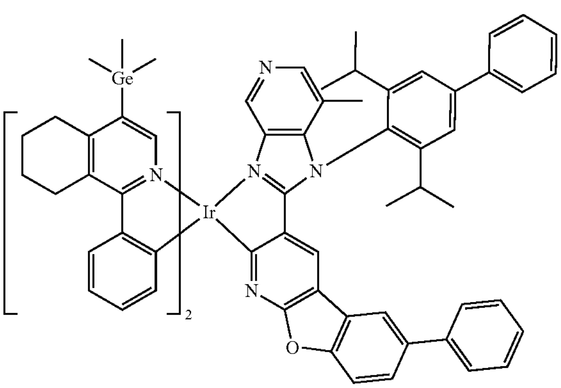
2426
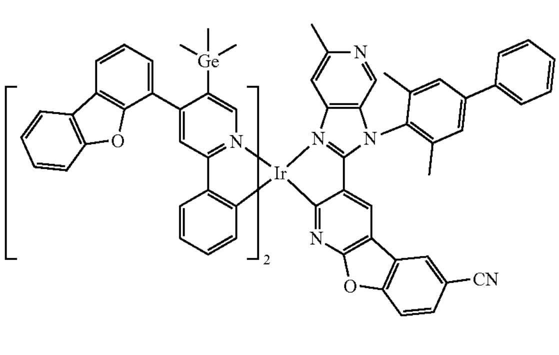
-continued
2427
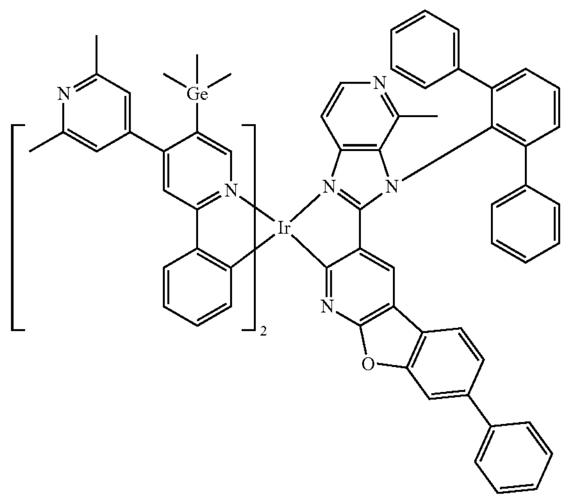
2428
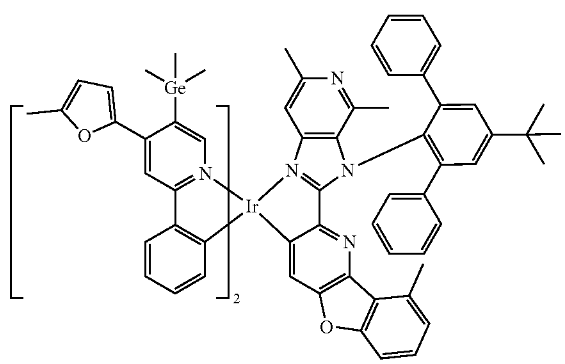
2429
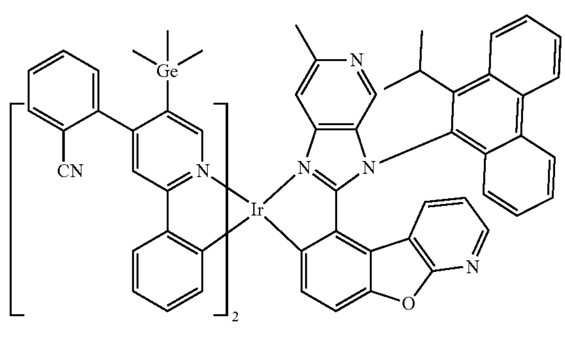
2430
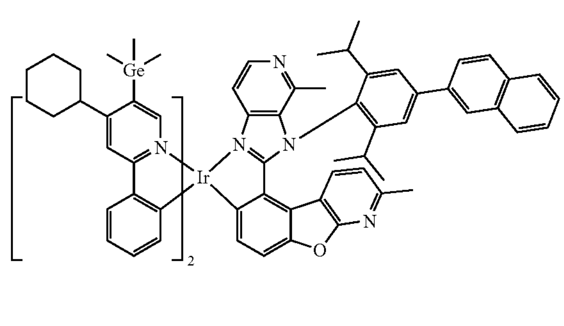

-continued
2431
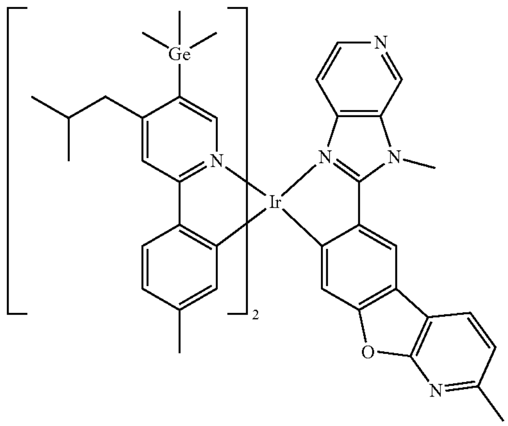
2432
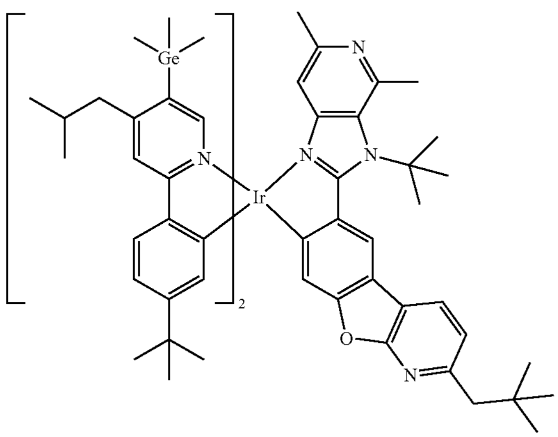
2433
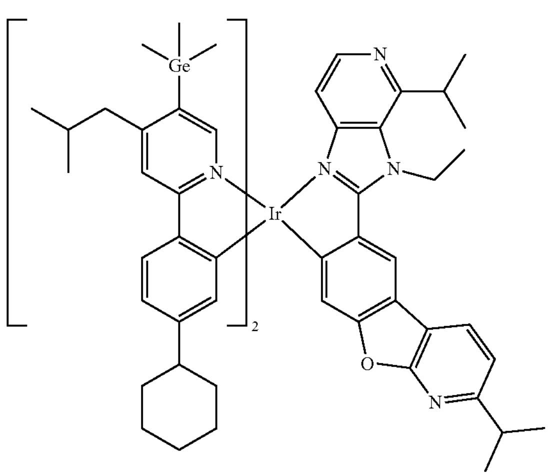
-continued
2434
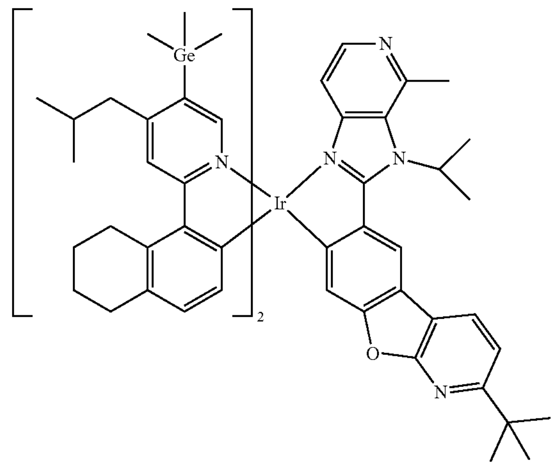
2435
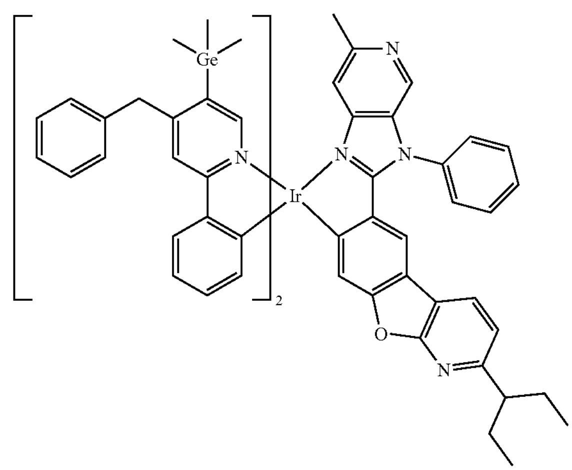
2436
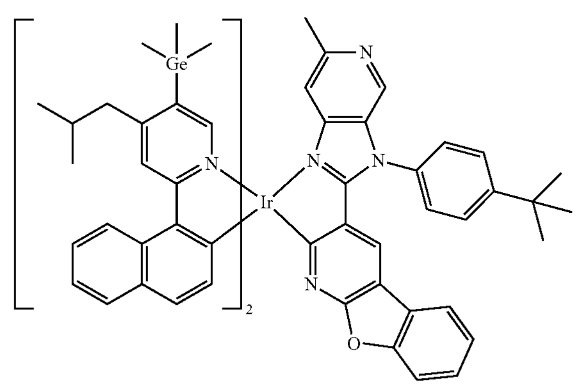

-continued
2437
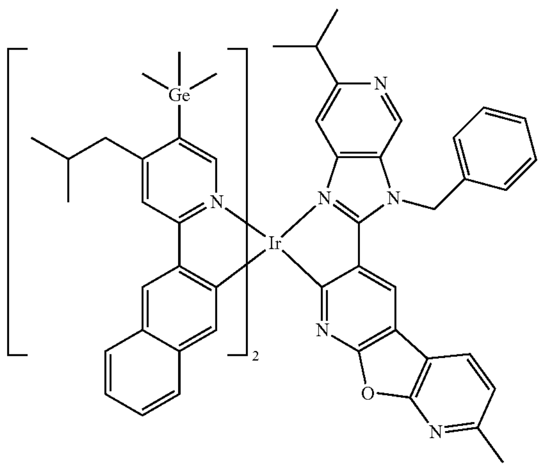
2438
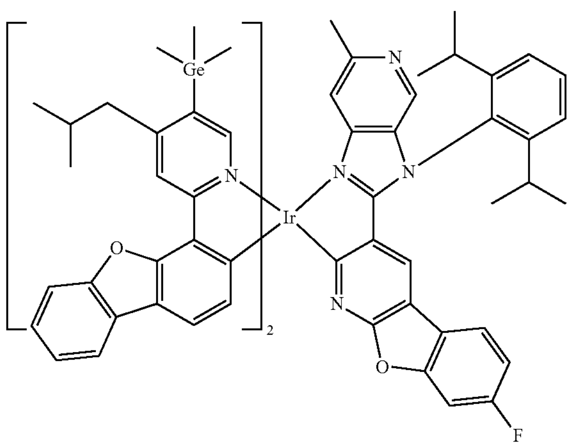
2439
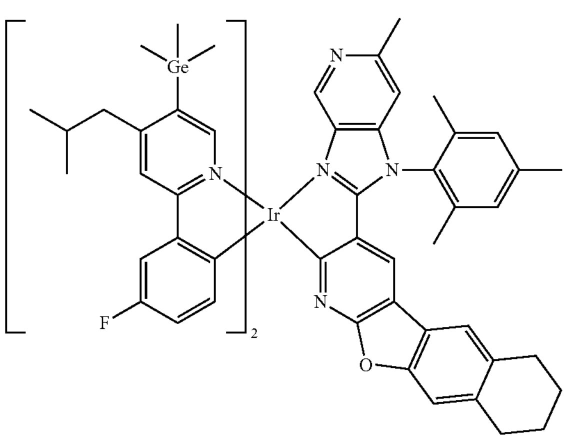
-continued
2440
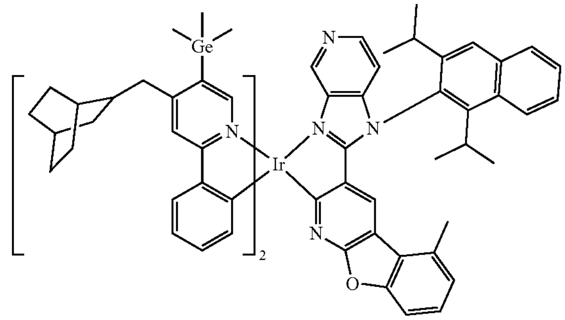
2441
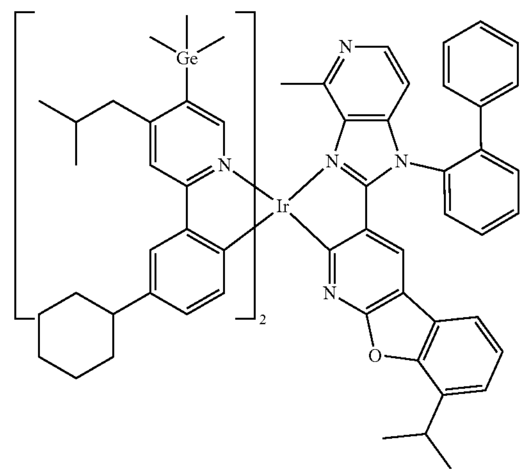
2442
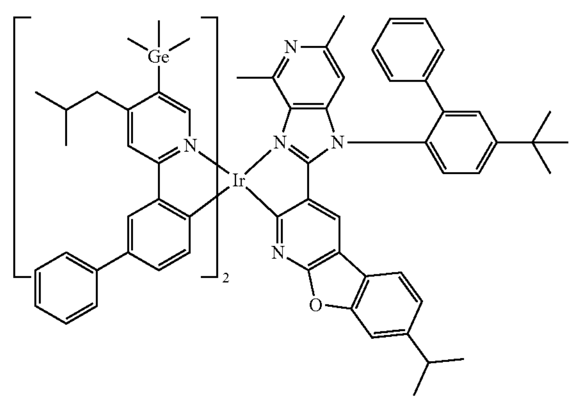

2443
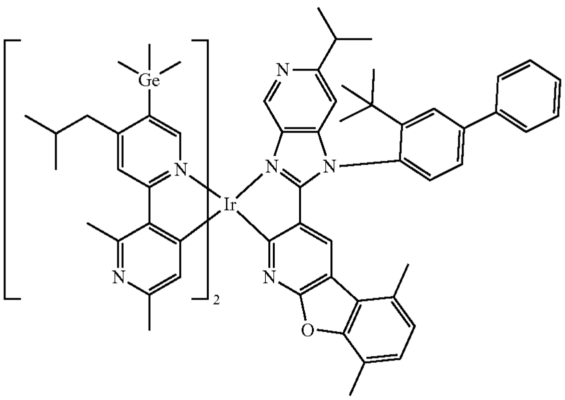
2444
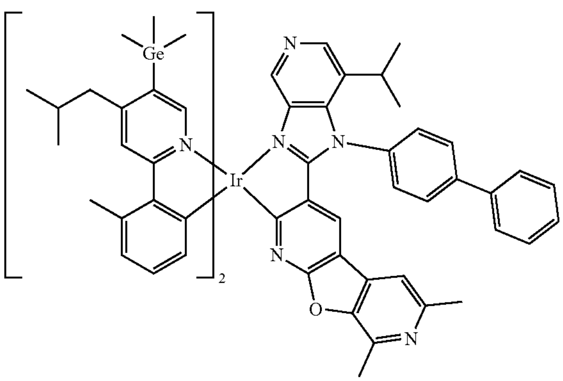
2445
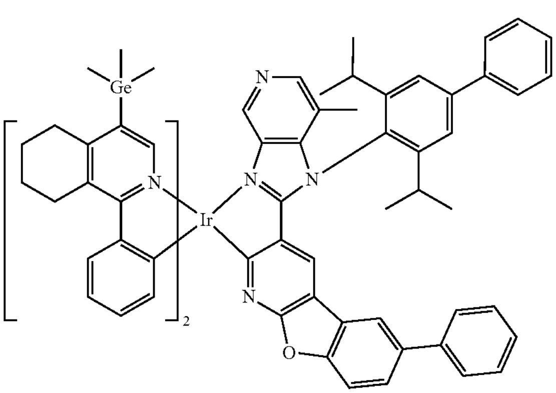
2446
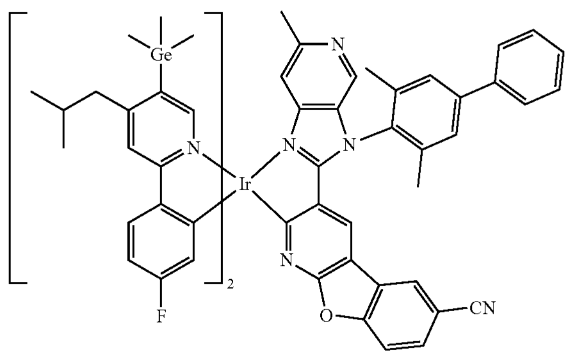
2447
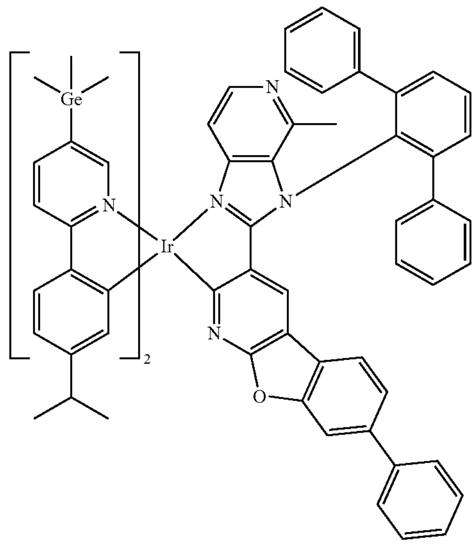
2448
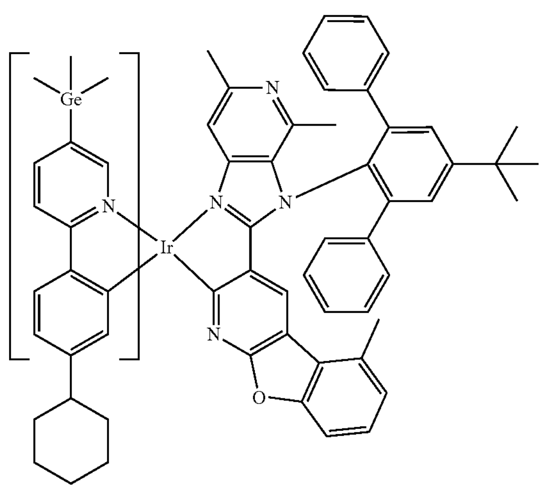

2449
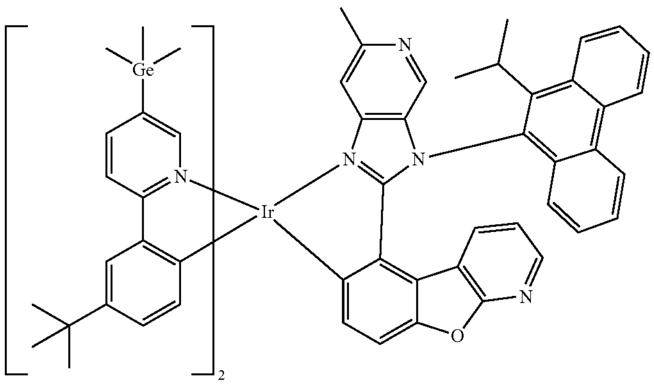
2450
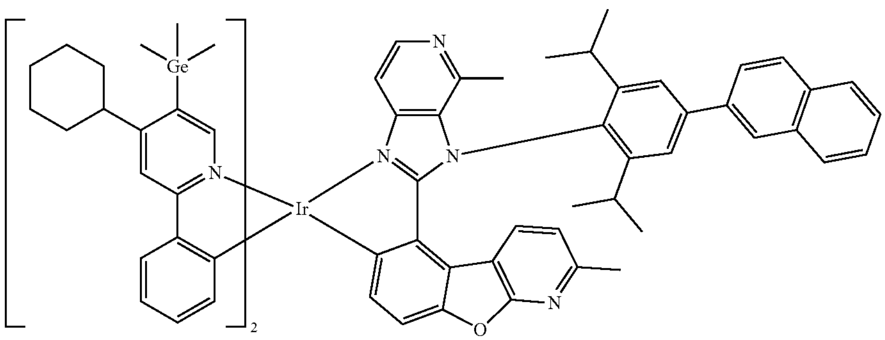
2451
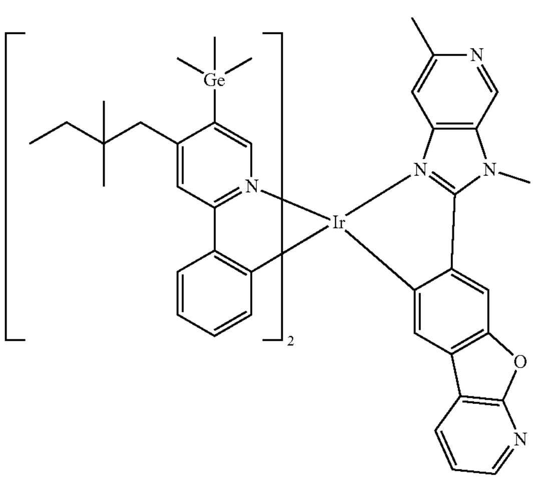
2452
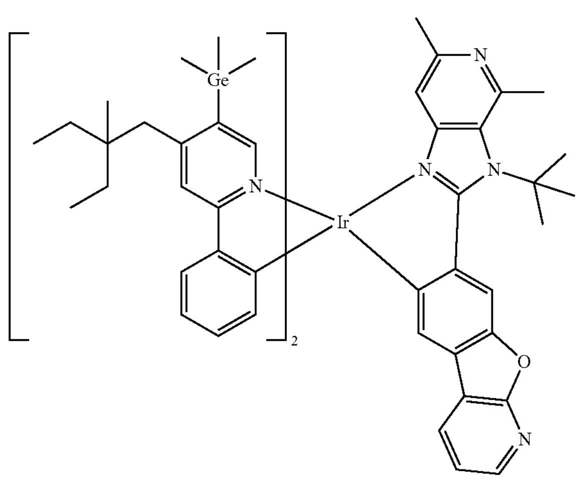

-continued
2453
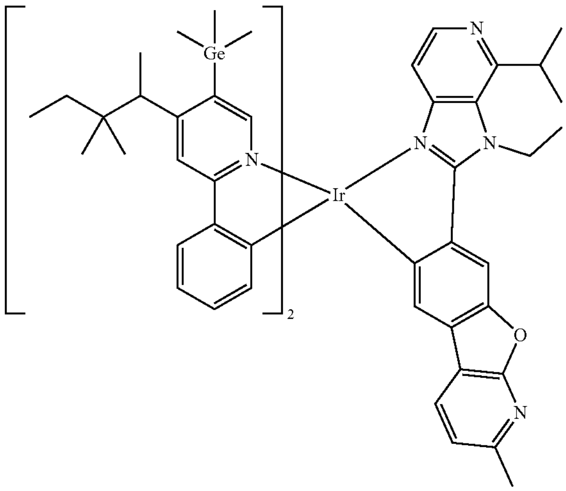
2454
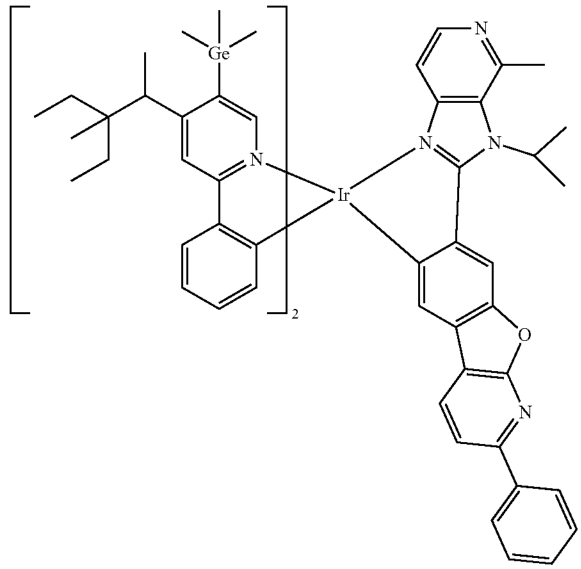
2455
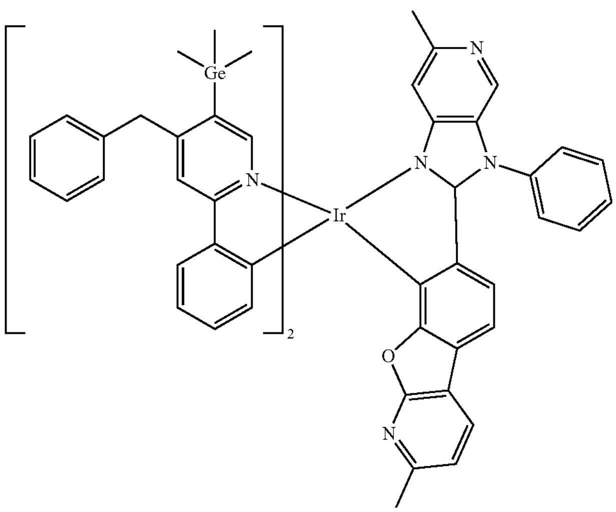
2456
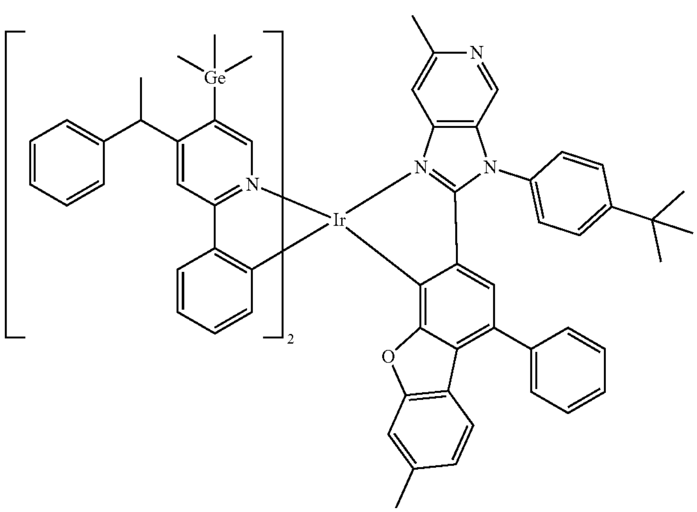

-continued
2457
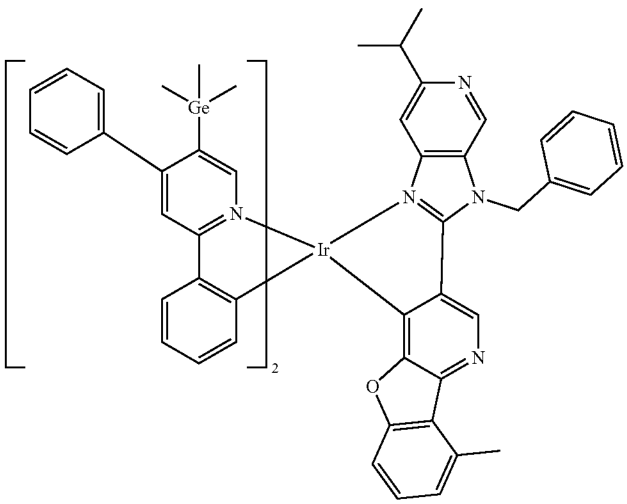
2458
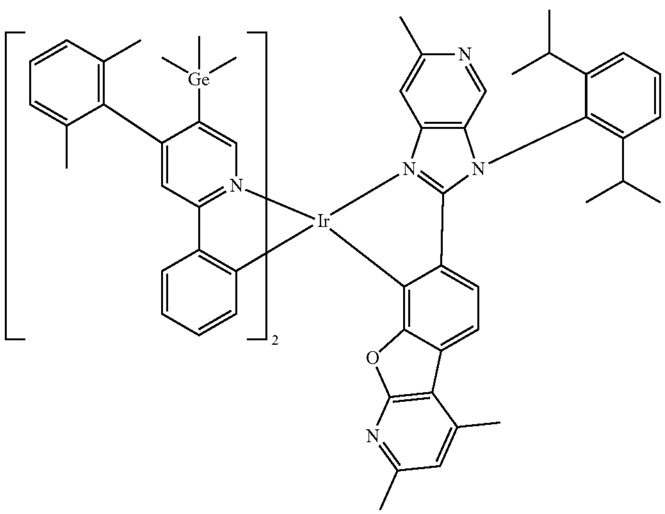
2459
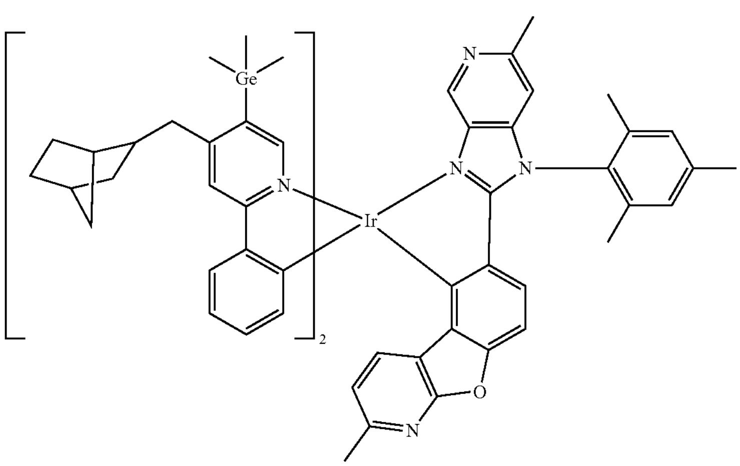

-continued
2460
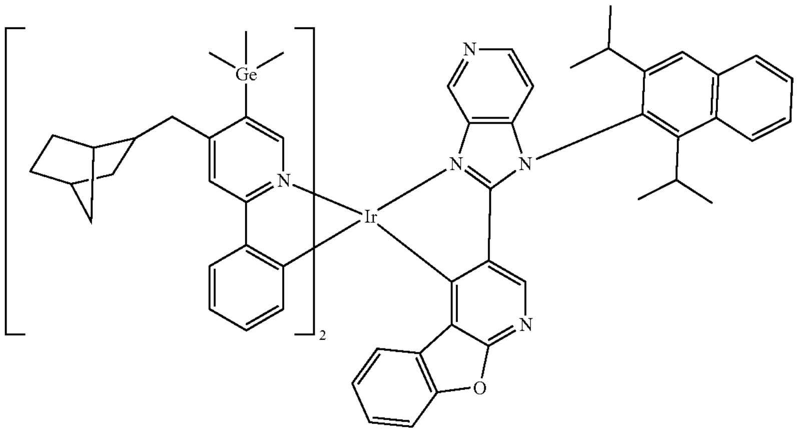
2461
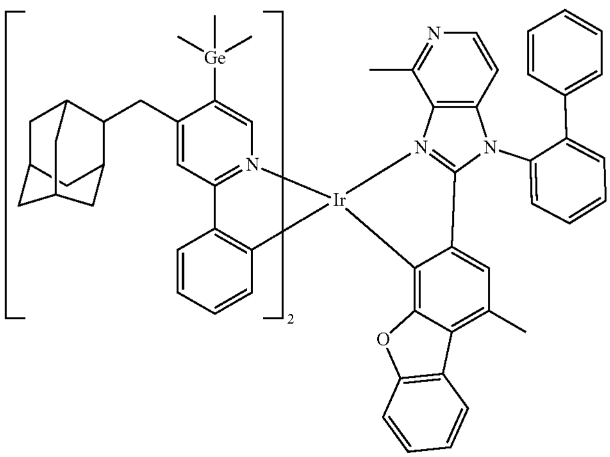
2462
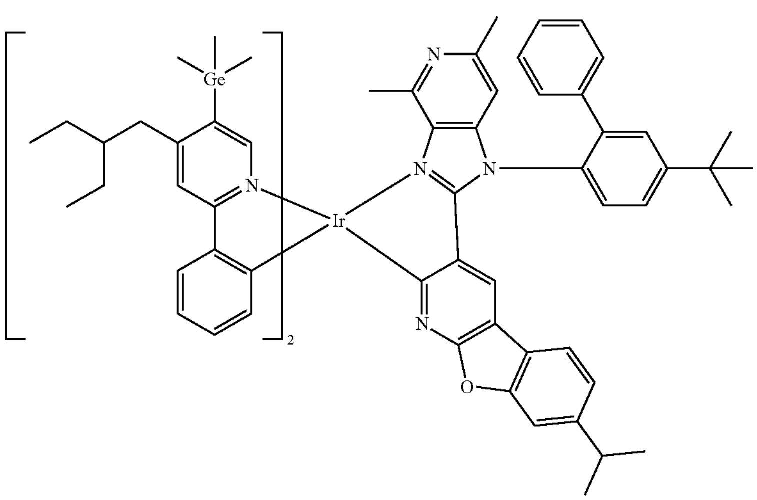

-continued
2463
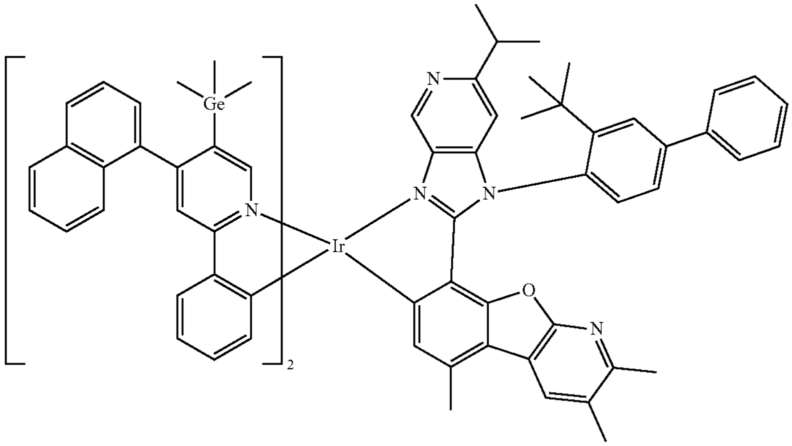
2464
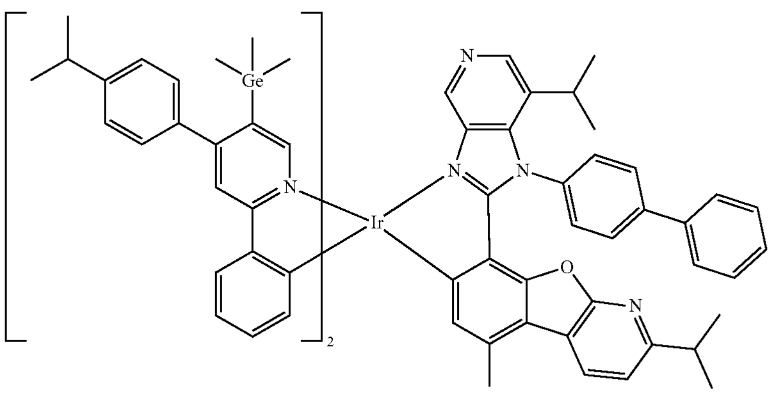
2465
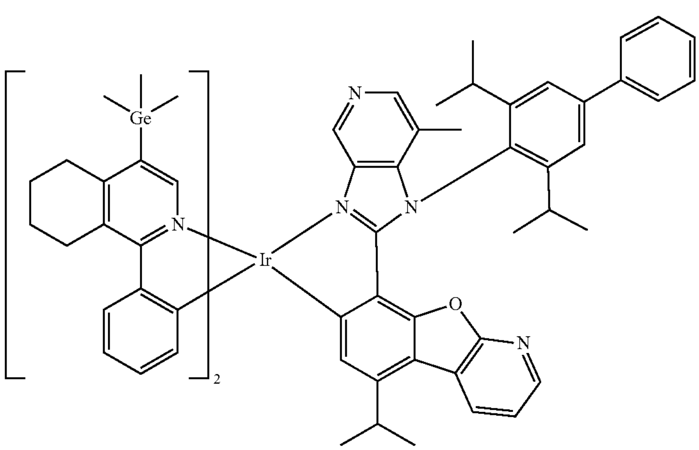

-continued
2466
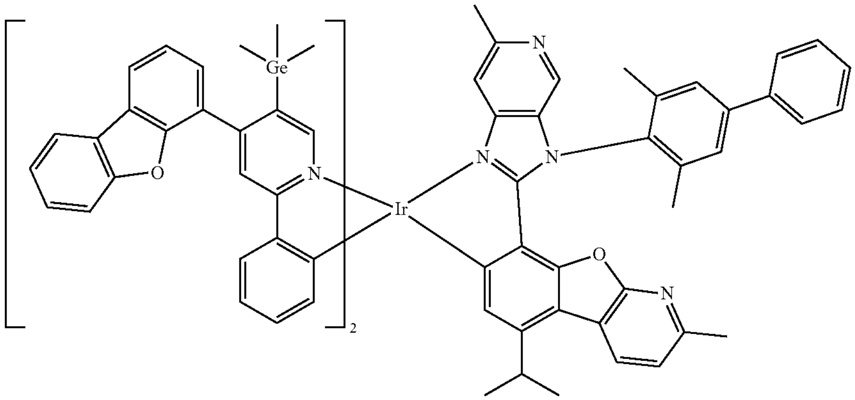
2467
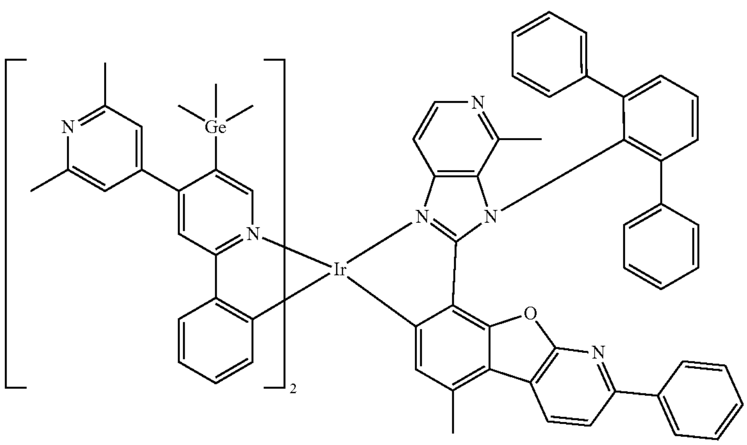
2468
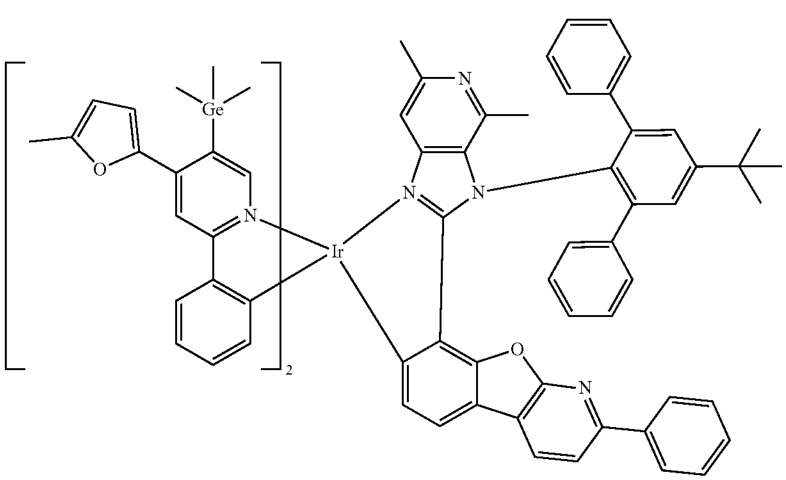

-continued
2469
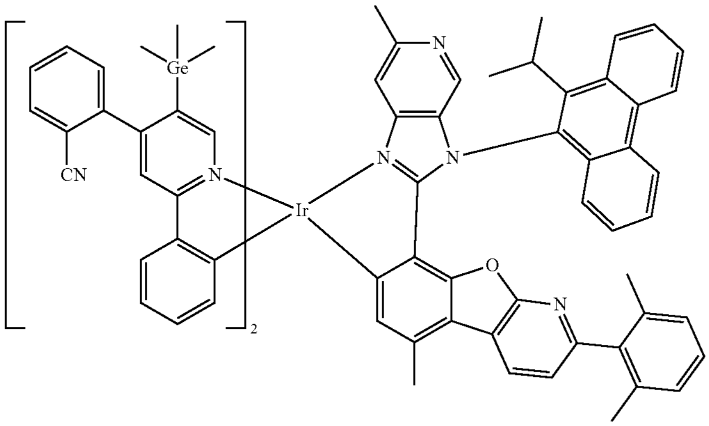
2470
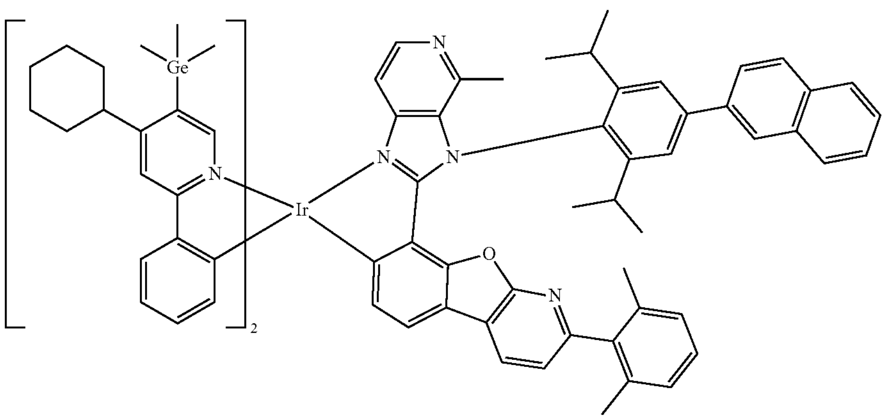
2471
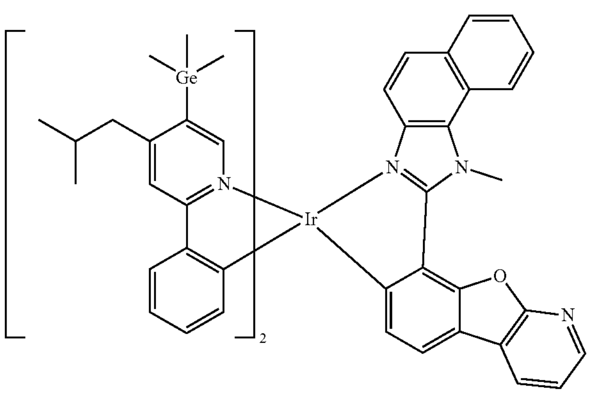
2472
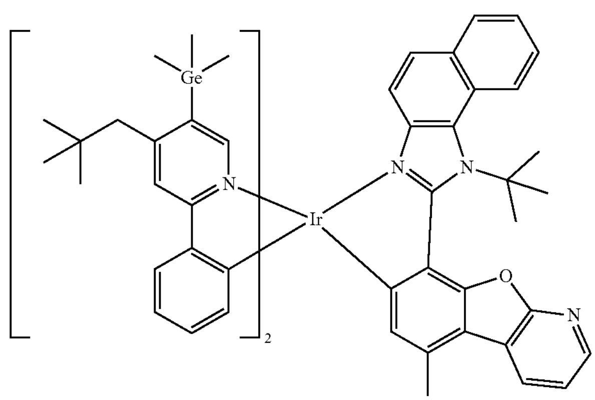
2473
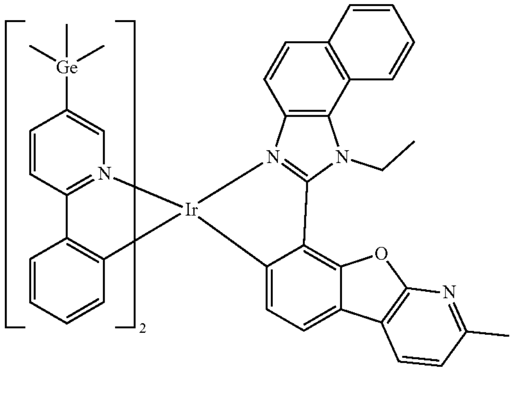

-continued
2474
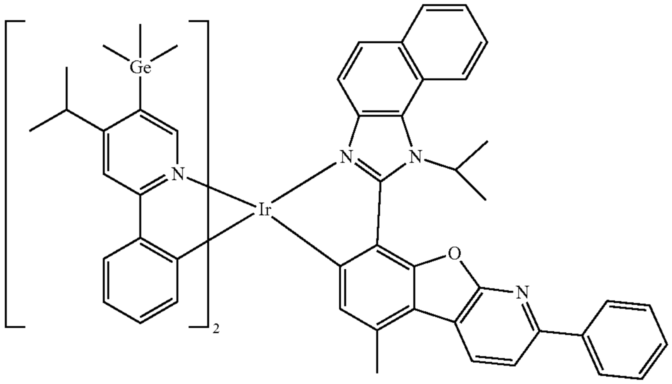
2475
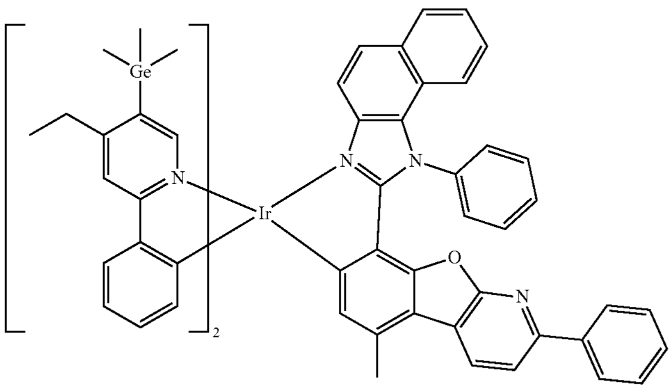
2476
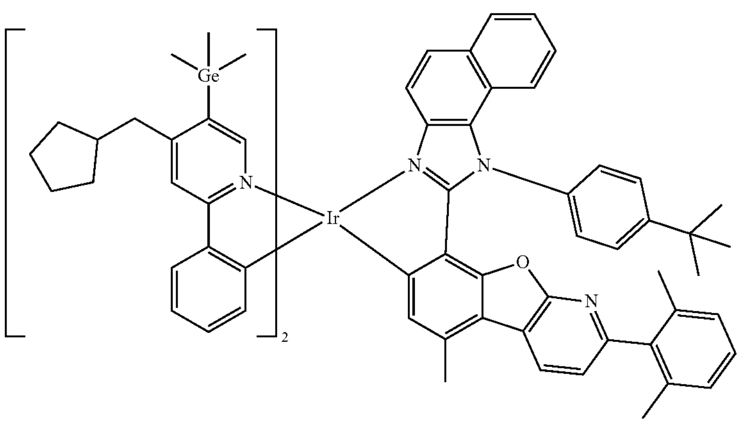
2477
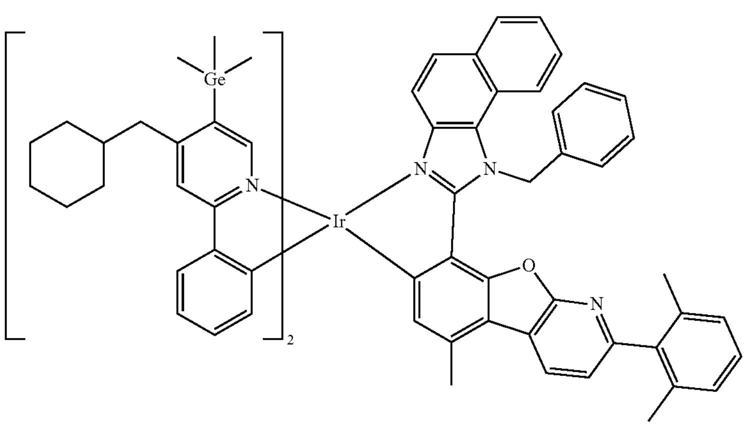

-continued
2478
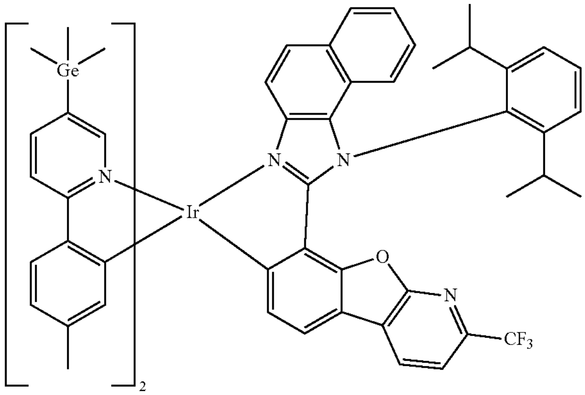
2479
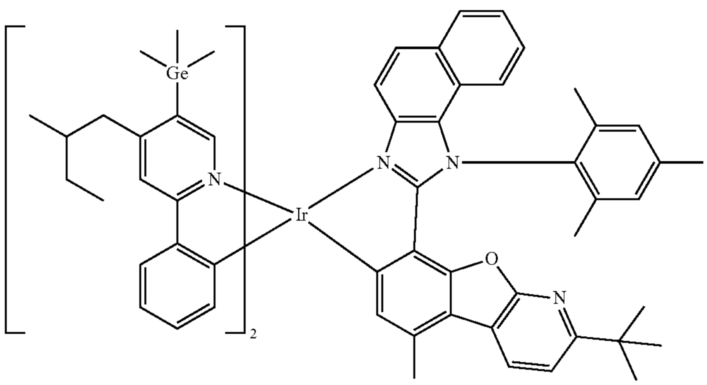
2480
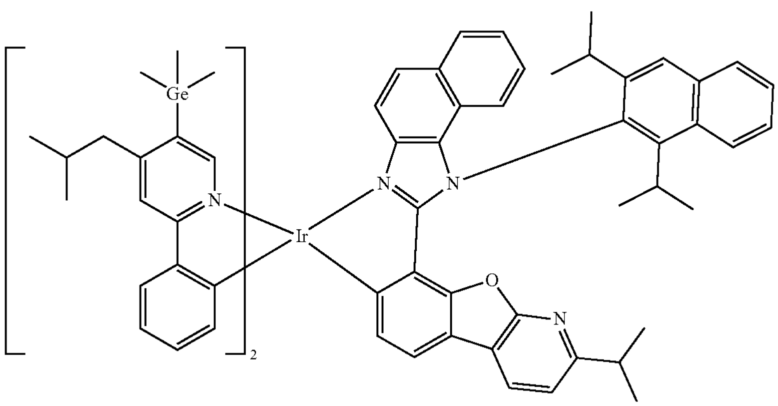
2481
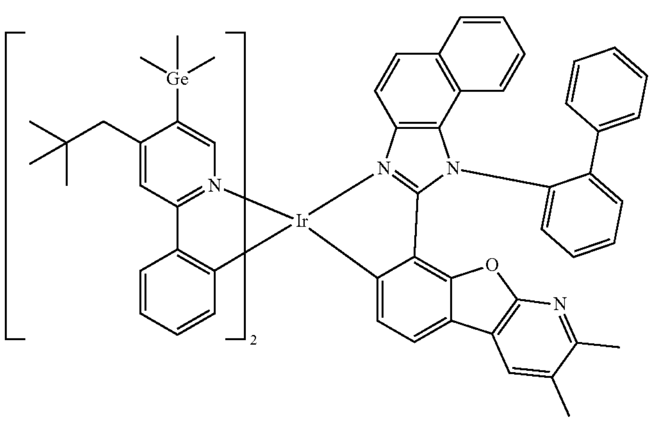

-continued
2482
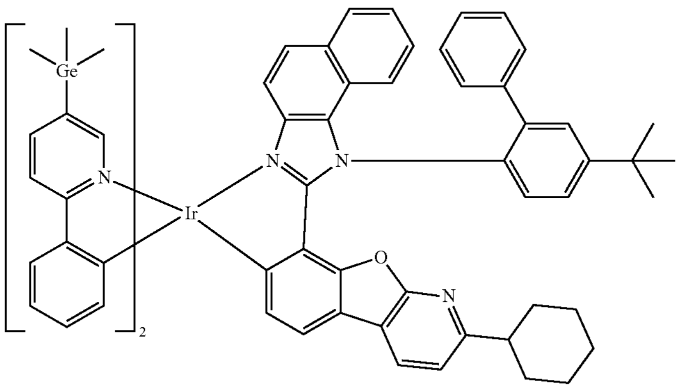
2483
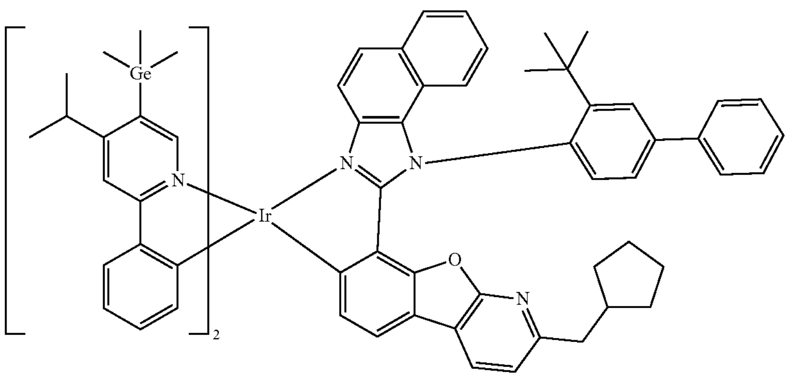
2484
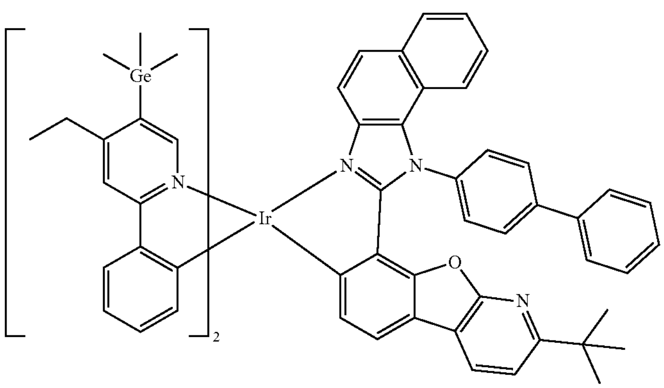
2485
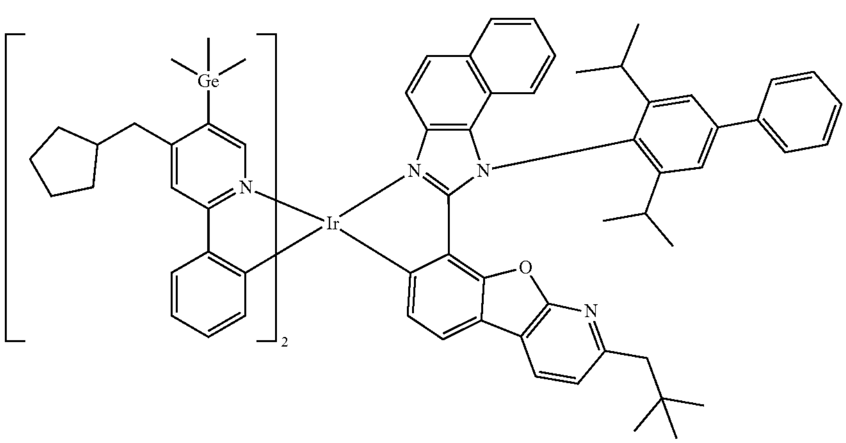

-continued
2486
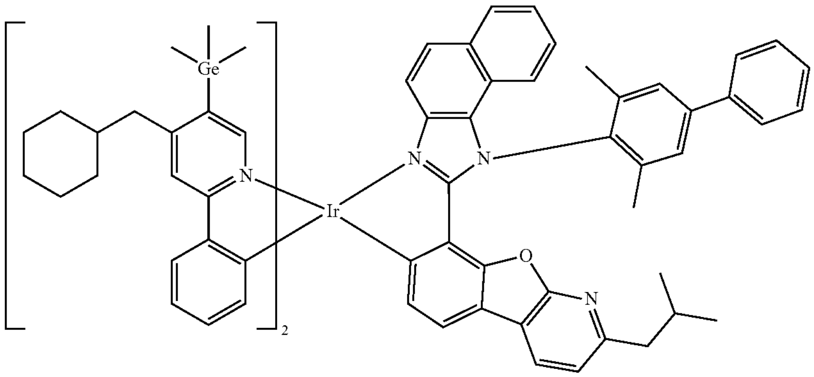
2487
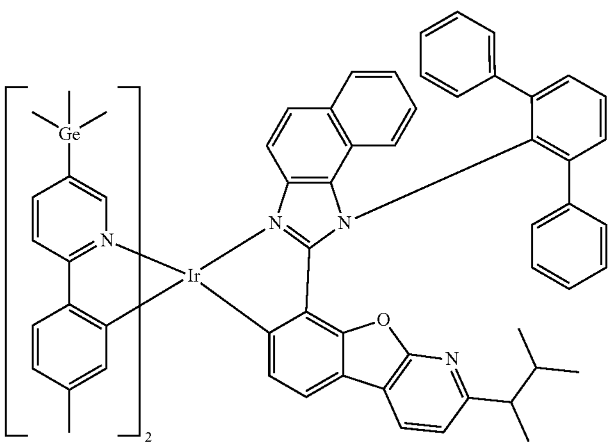
2488
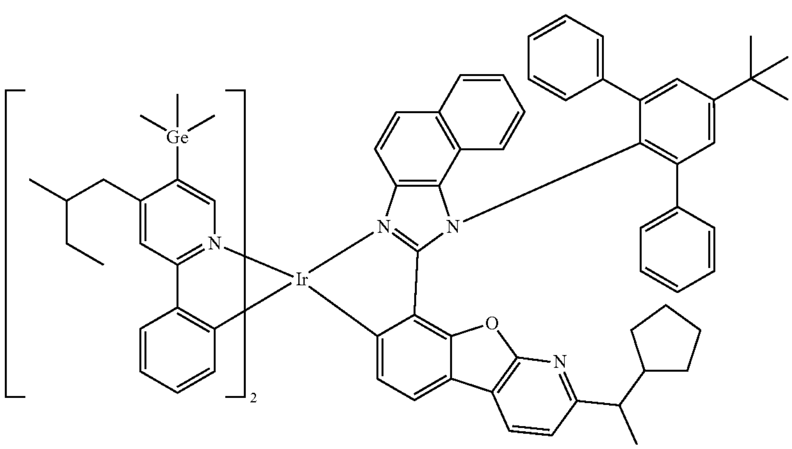

-continued
2489
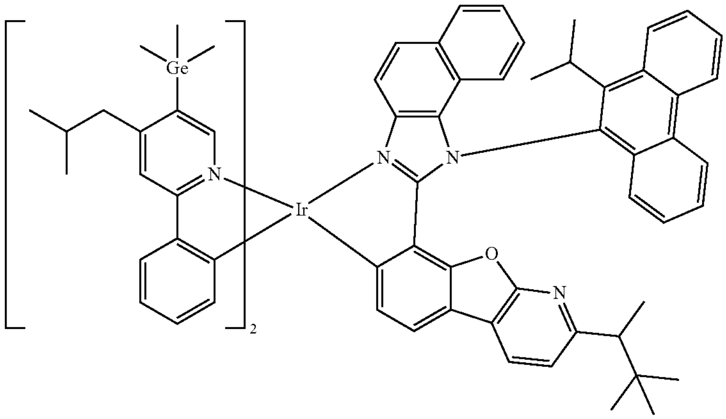
2490
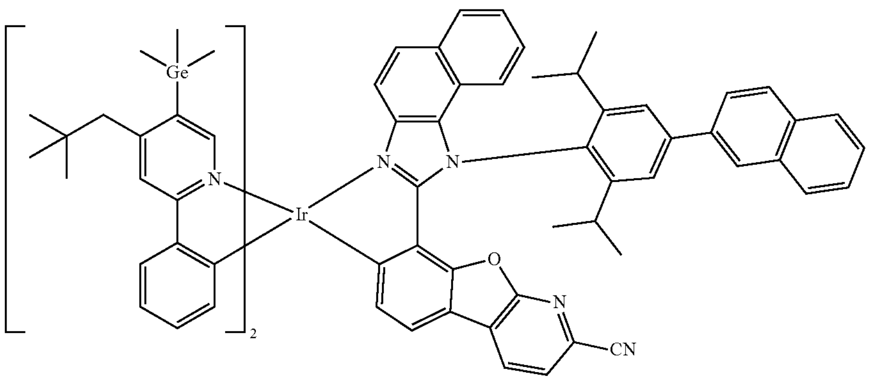
2491
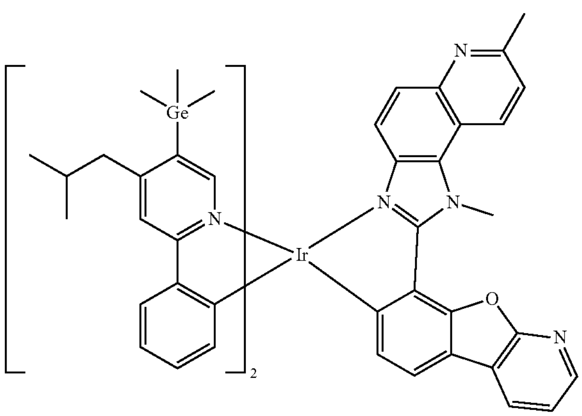
2492
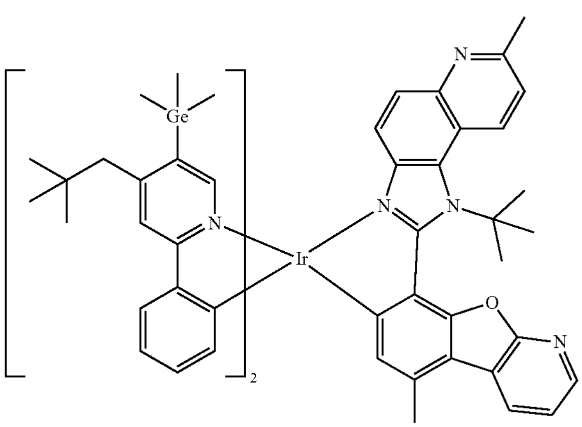

-continued
2493
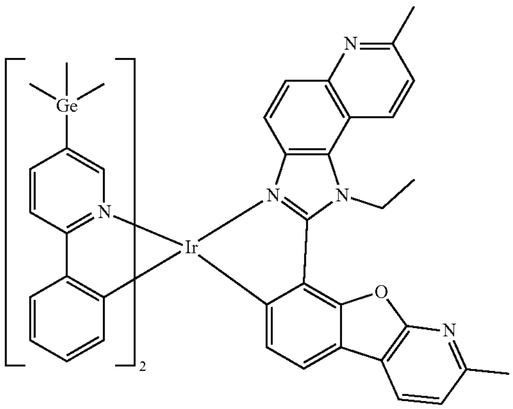
2494
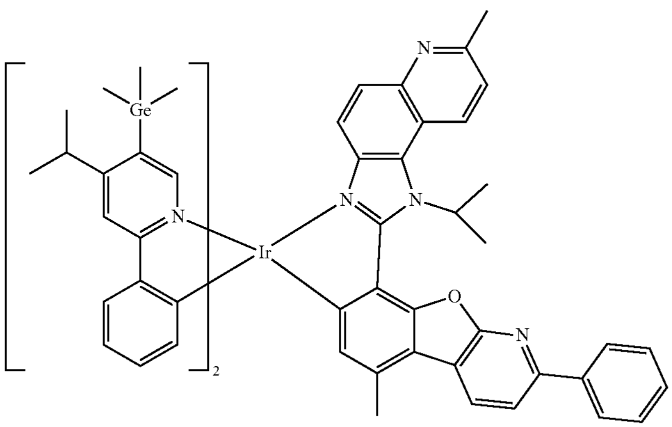
2495
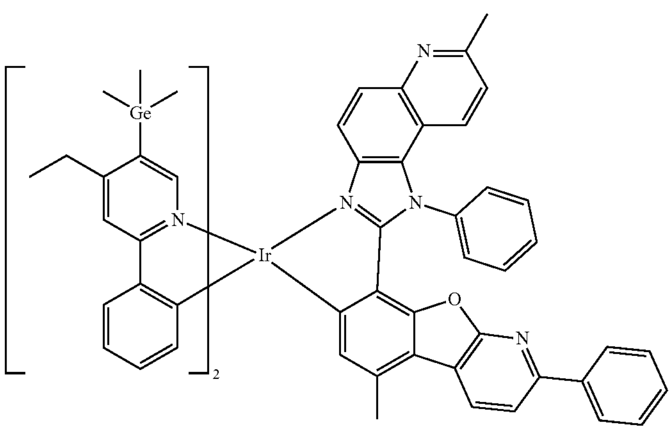

-continued
2496
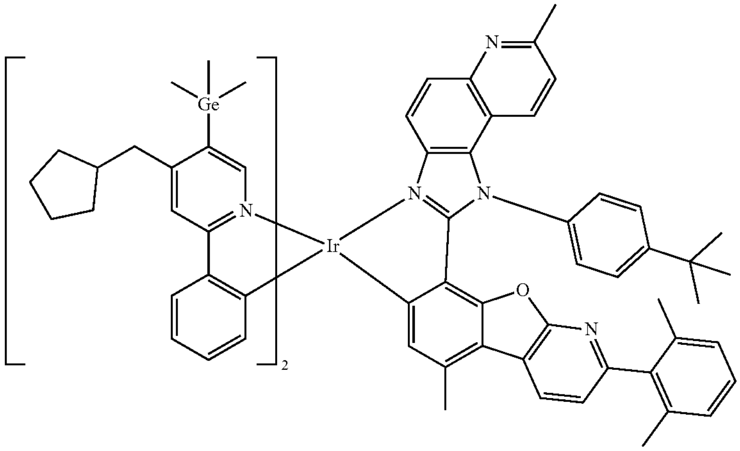
2497
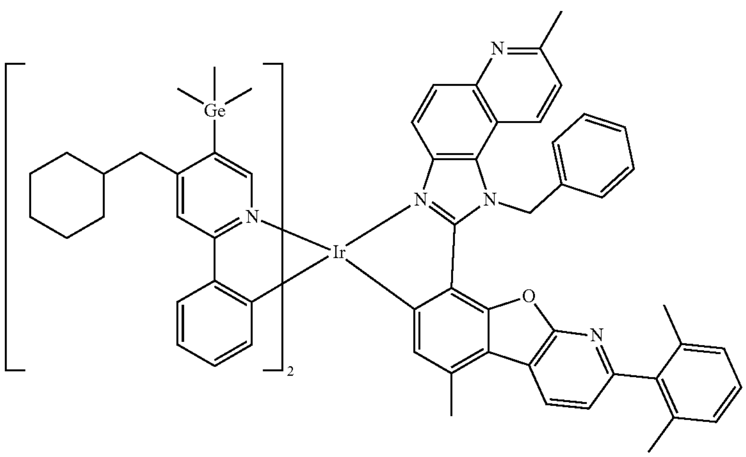
2498
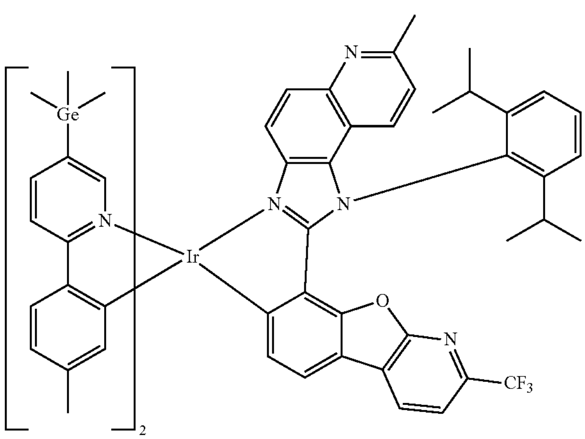

-continued
2499
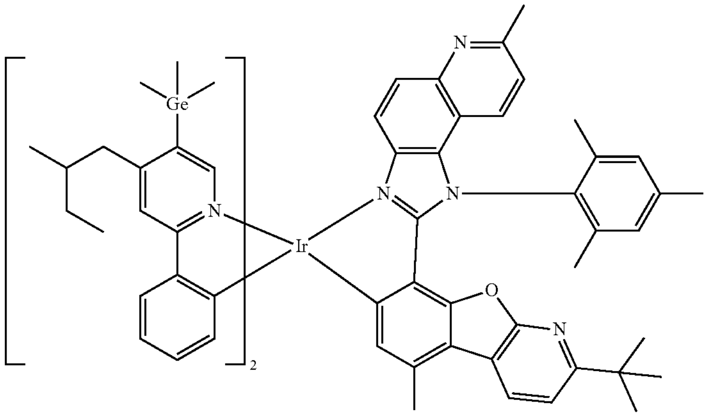
2500
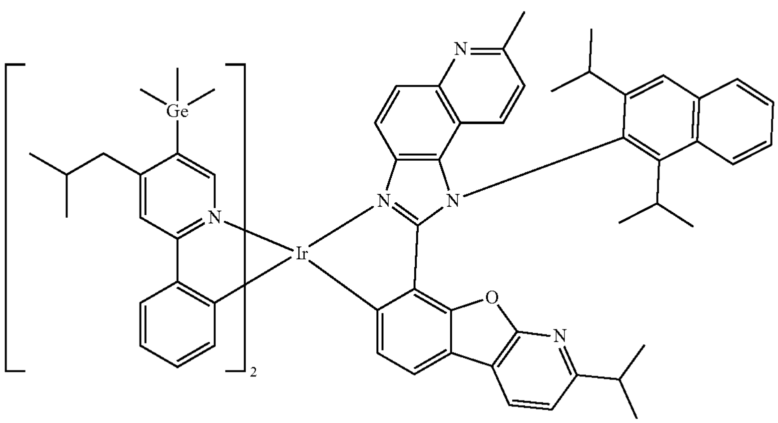
2501
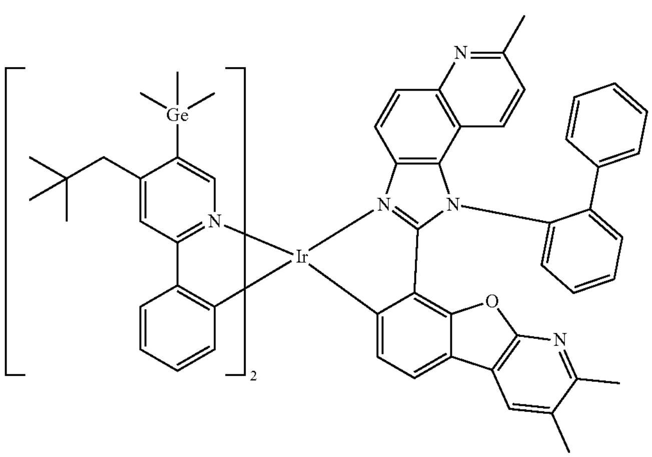

-continued
2502
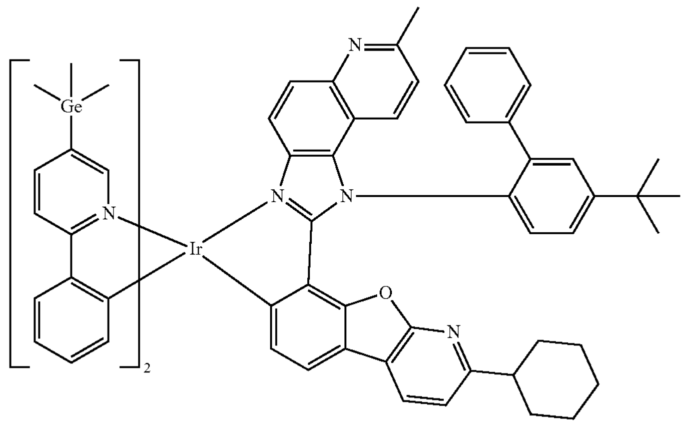
2503
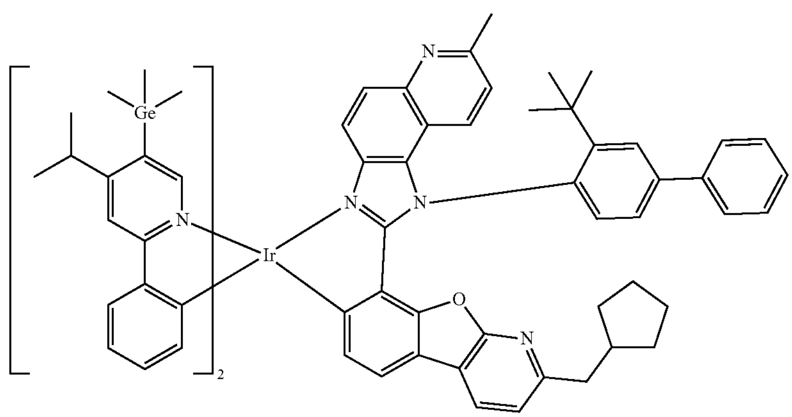
2504
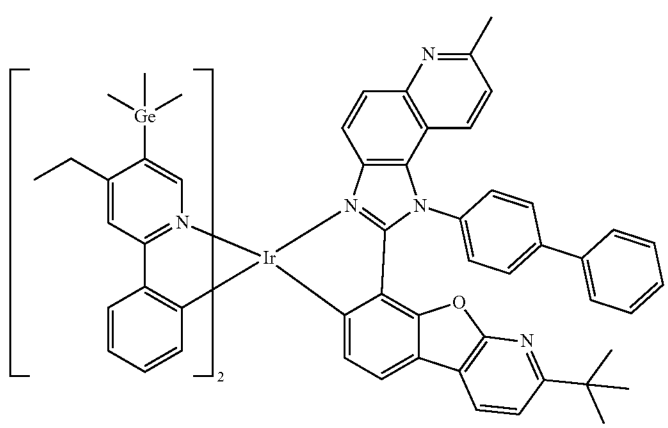

-continued
2505
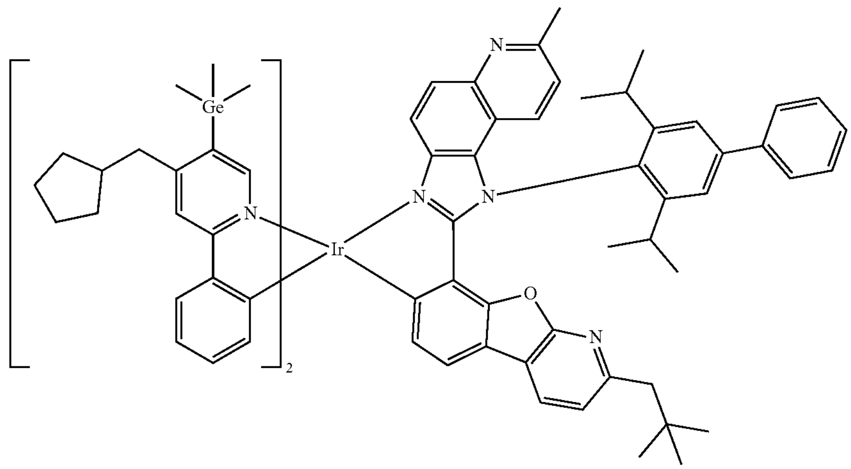
2506
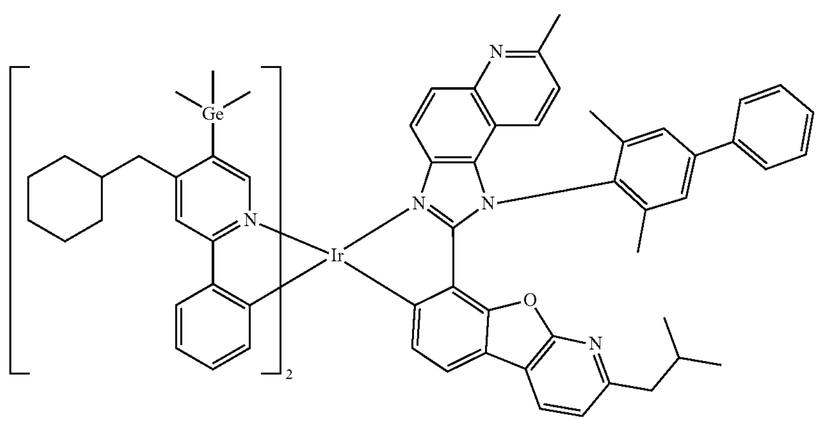
2507
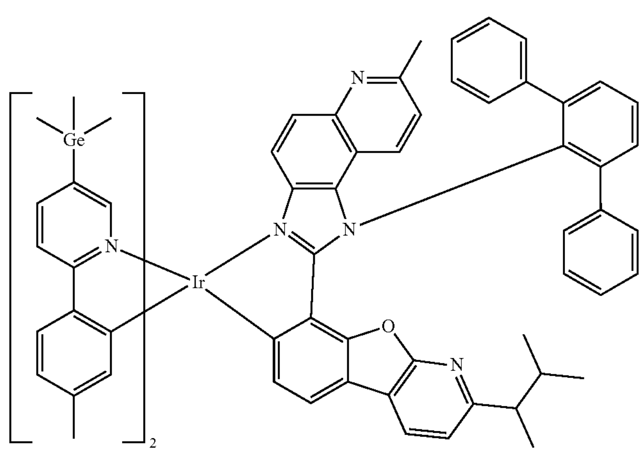

-continued
2508
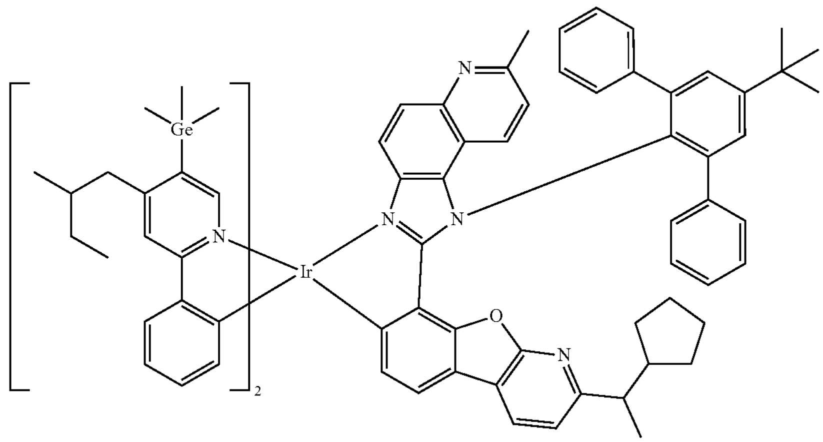
2509
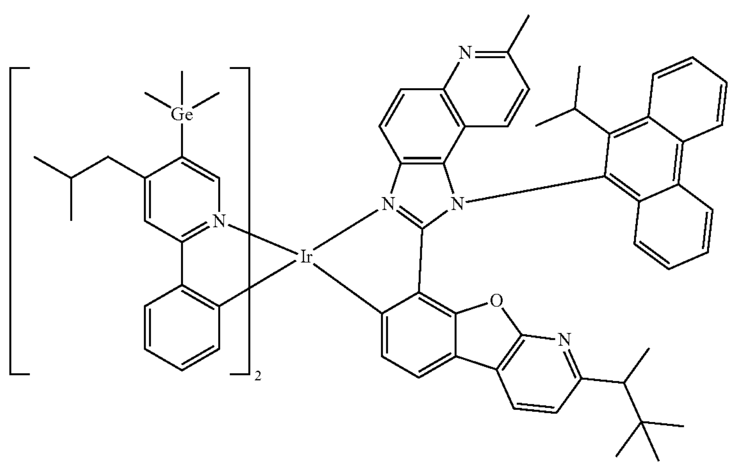
2510
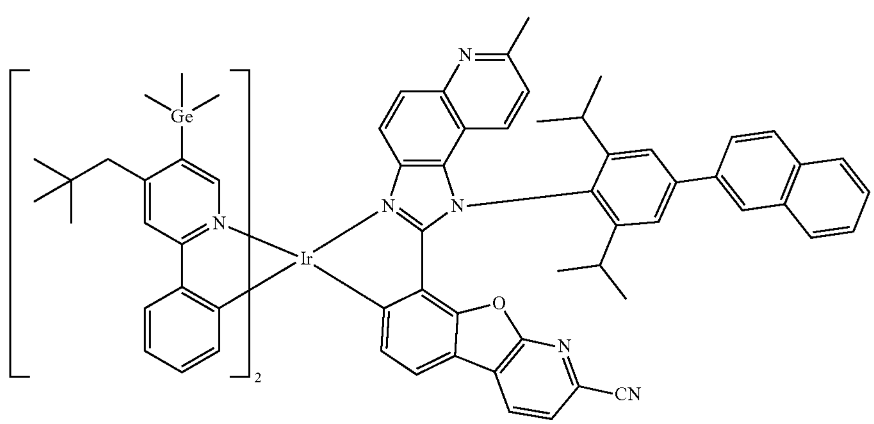

-continued
2511
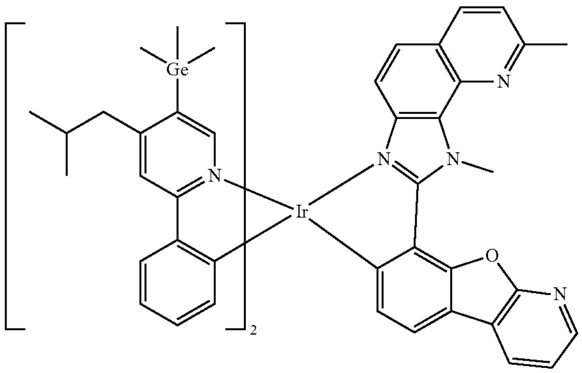
2512
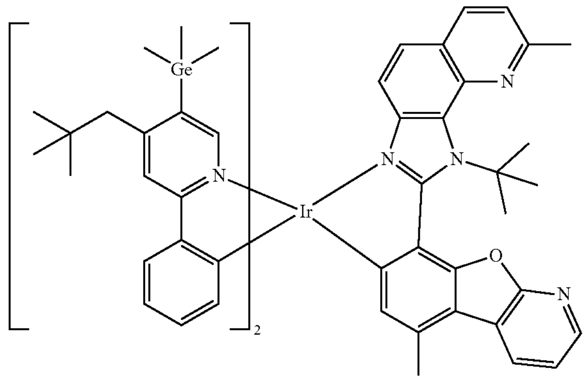
2513
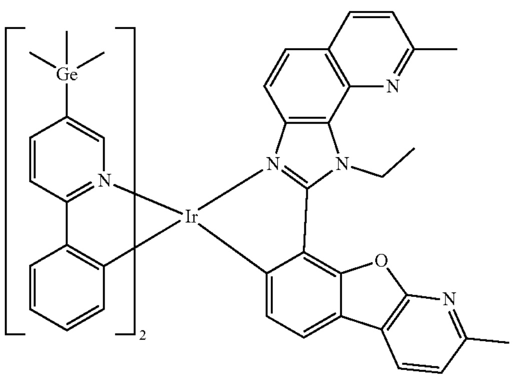
2514
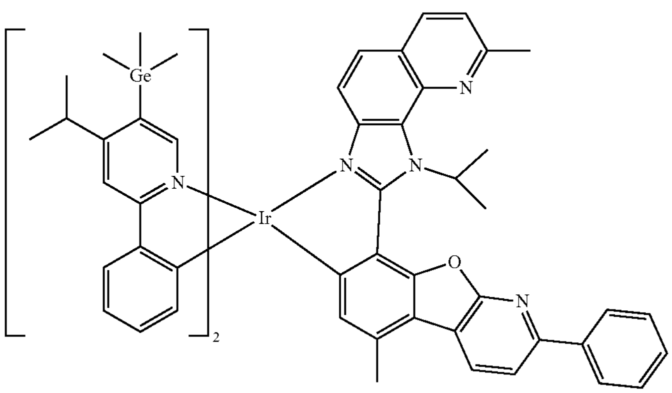
2515
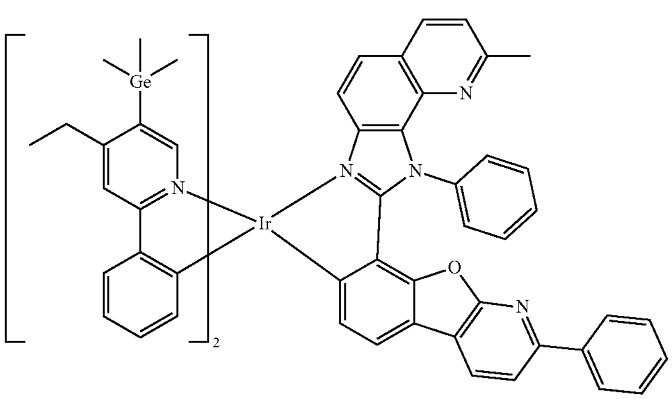

-continued
2516
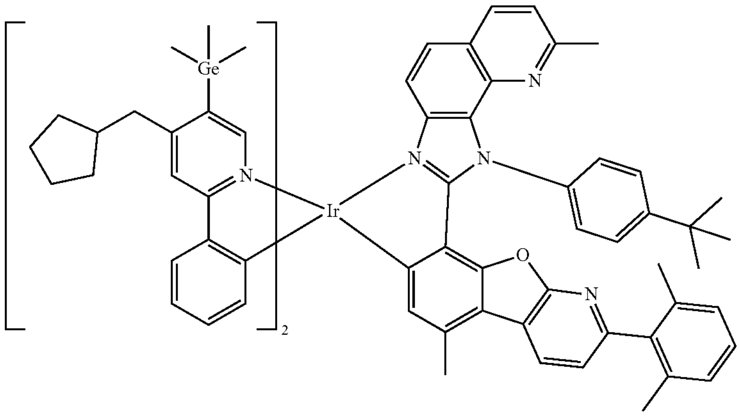
2517
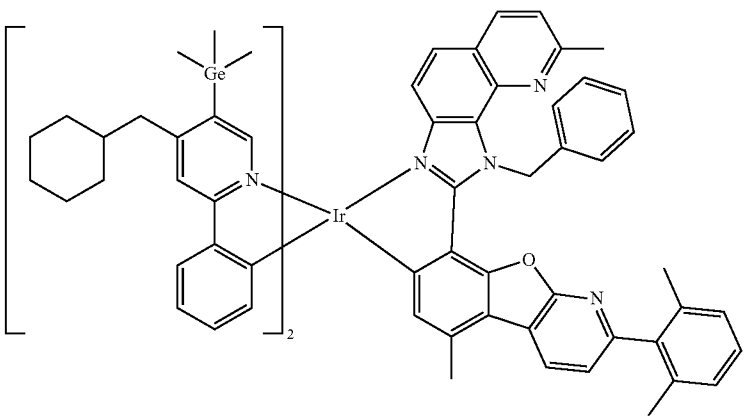
2518
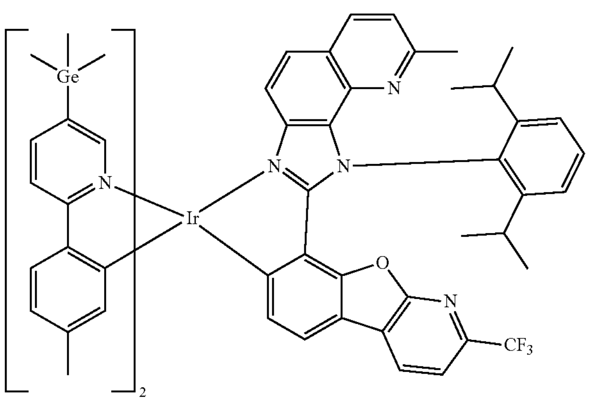
2519
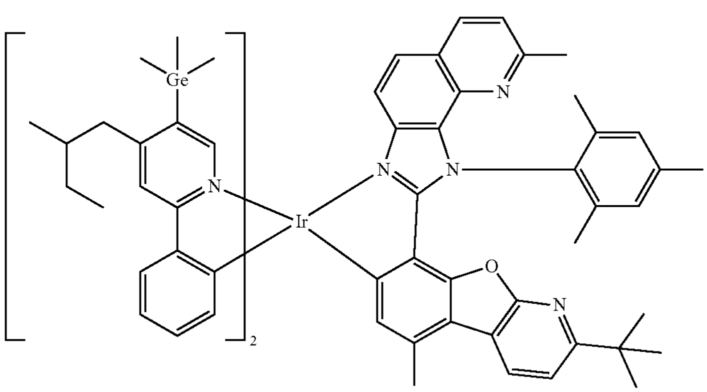

-continued
2520
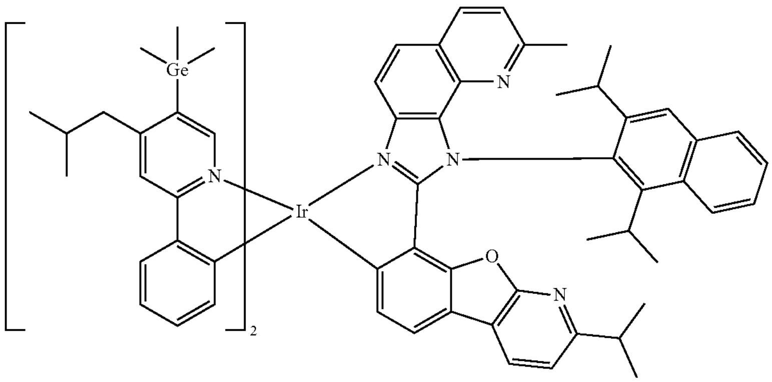
2521
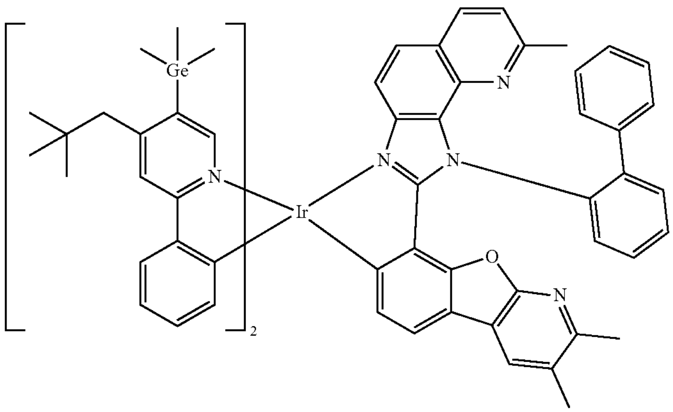
2522
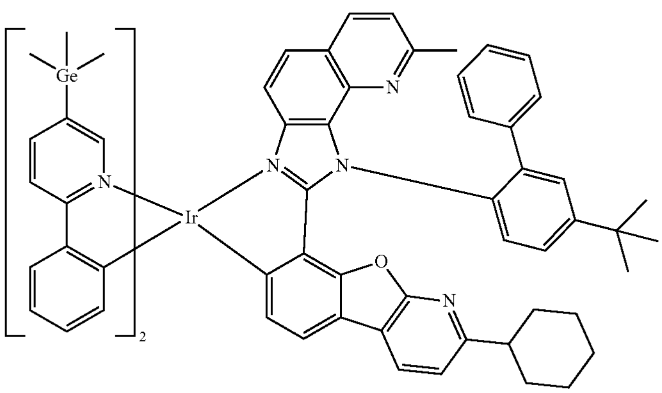
2523
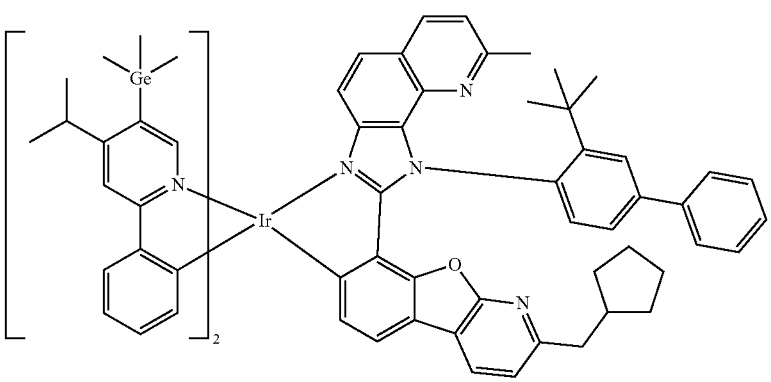

-continued
2524
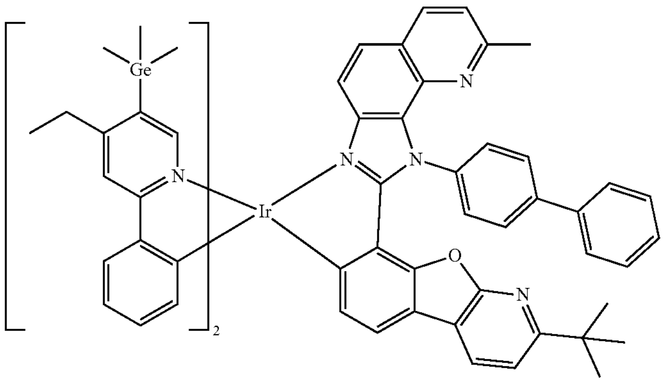
2525
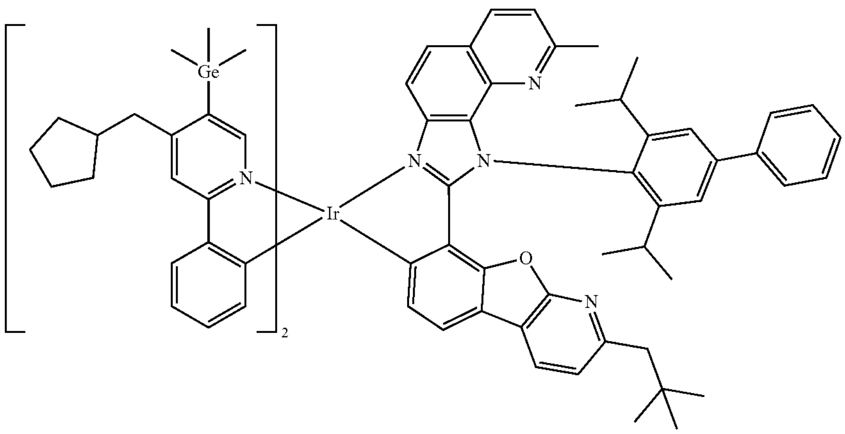
2526
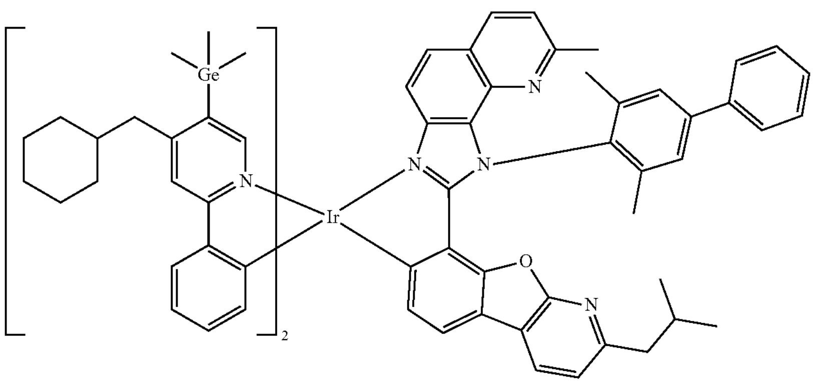
2527
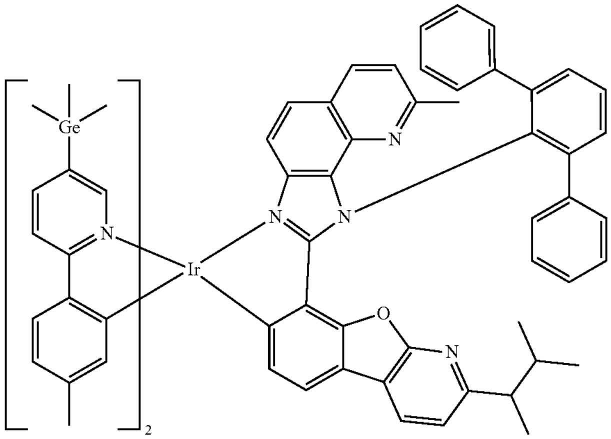

-continued
2528
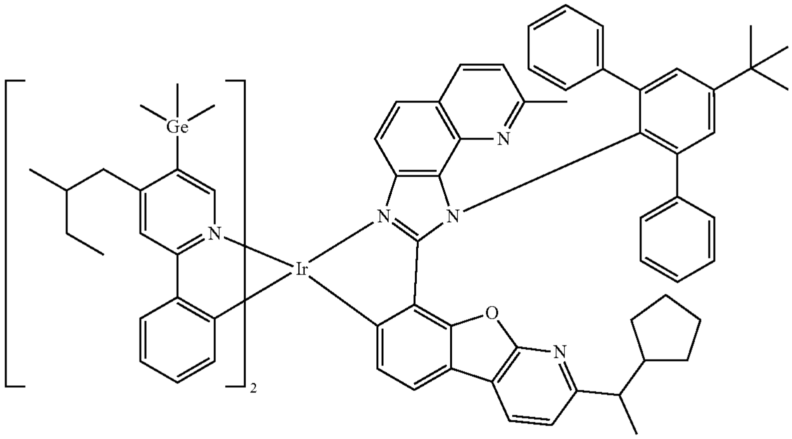
2529
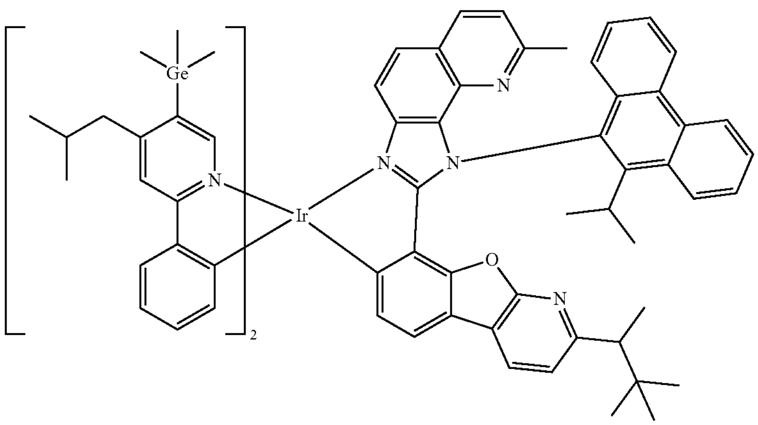
2530
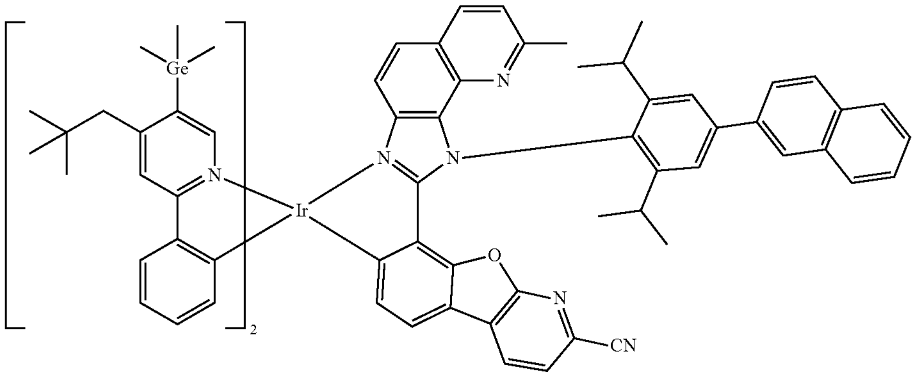

-continued
2531
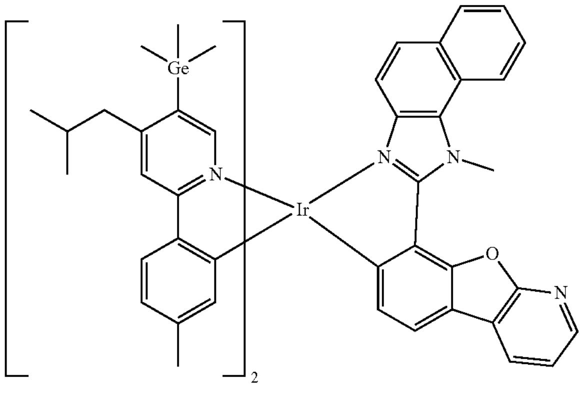
2532
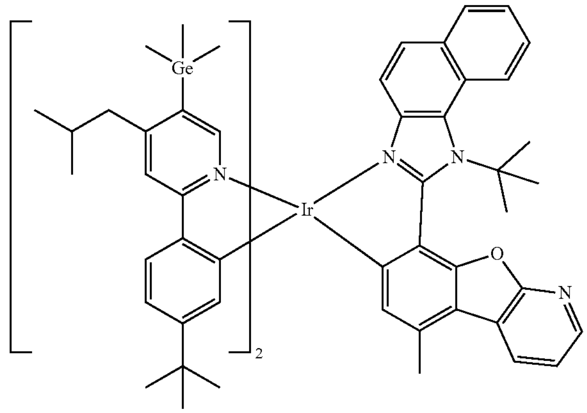
2533
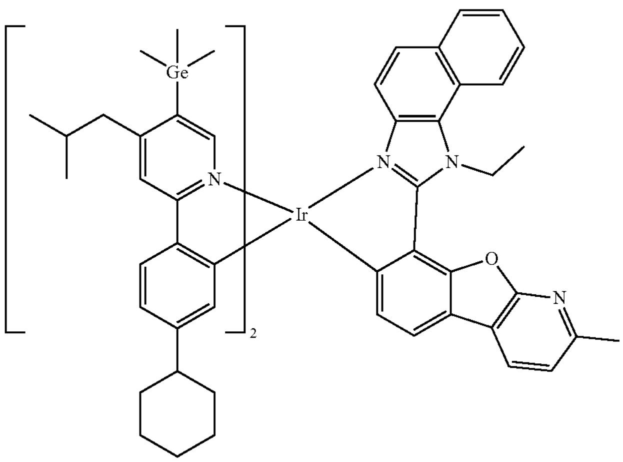
2534
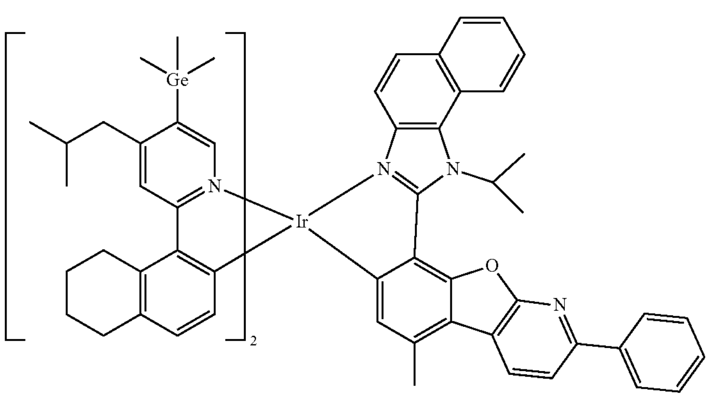

-continued
2535
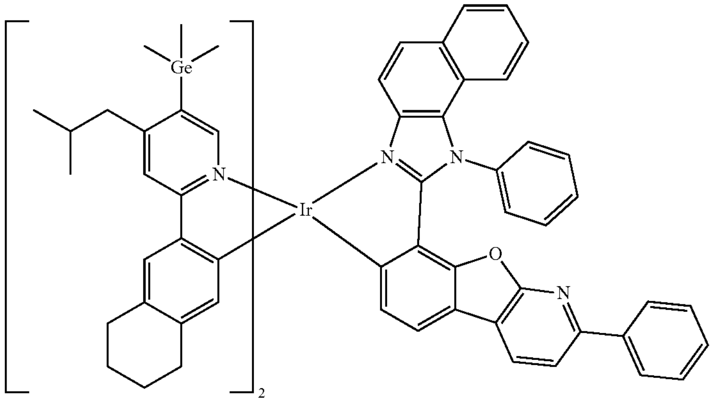
2536
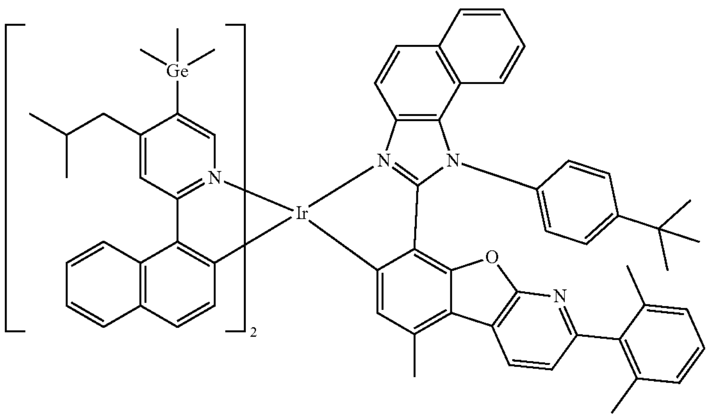
2537
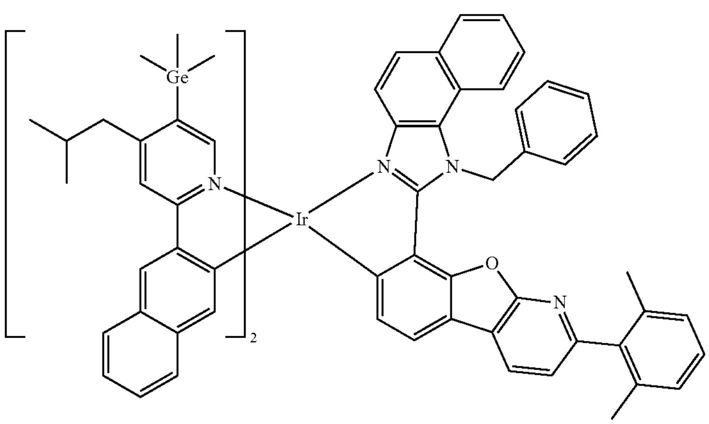
2538
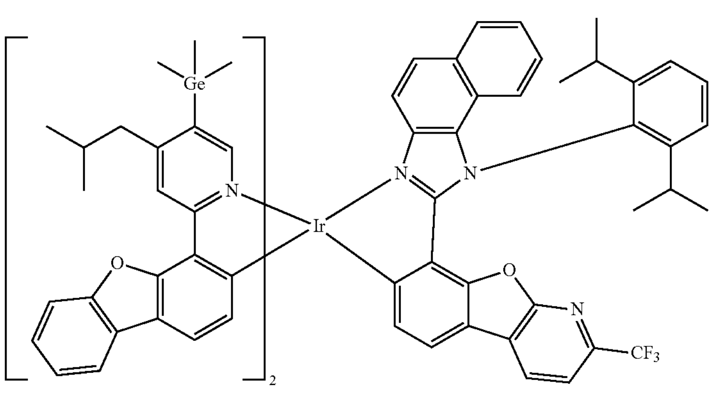

-continued
2539
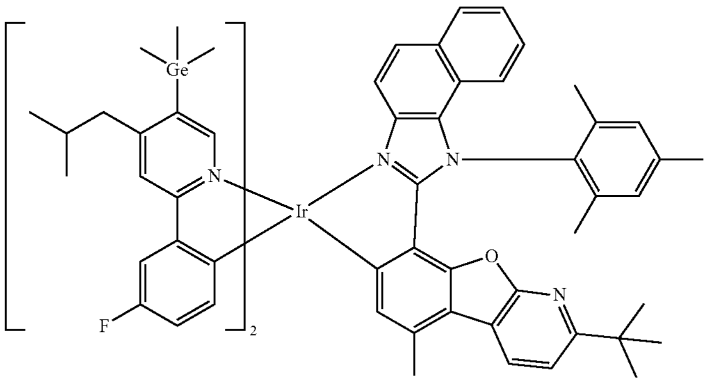
2540
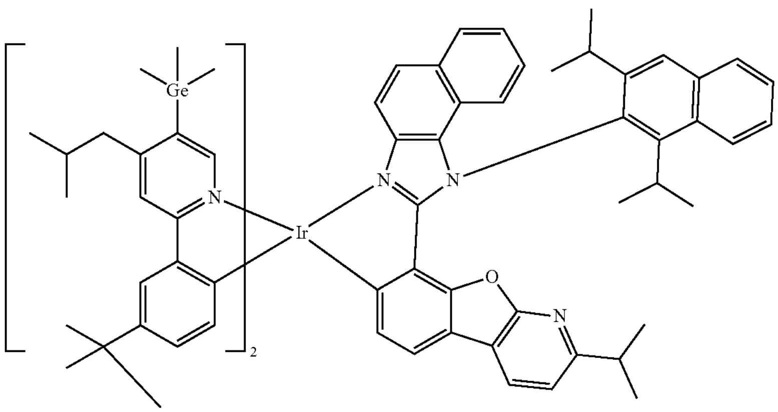
2541
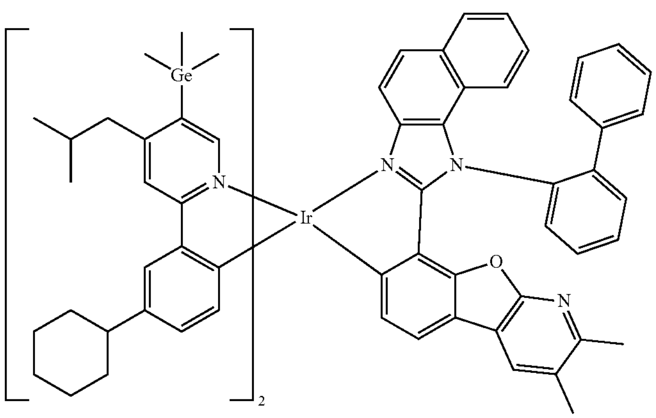
2542
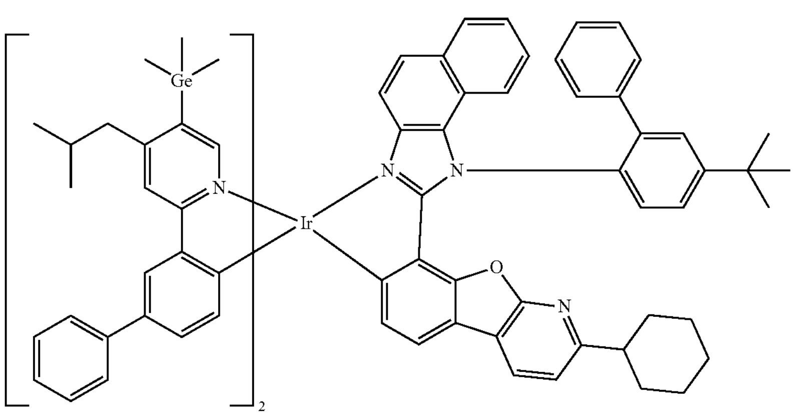

-continued
2543
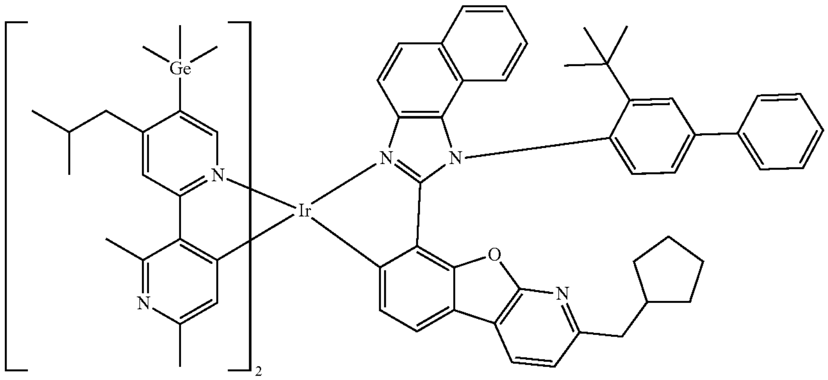
2544
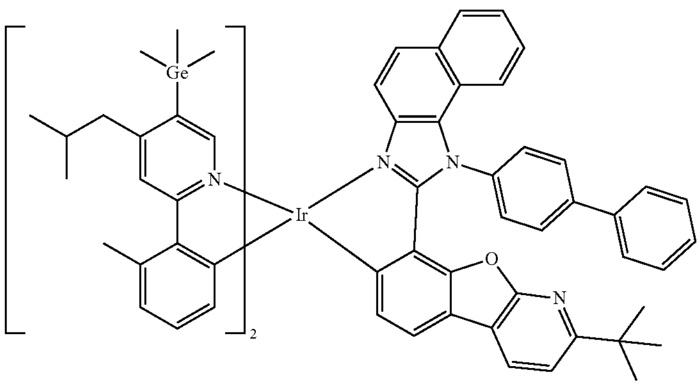
2545
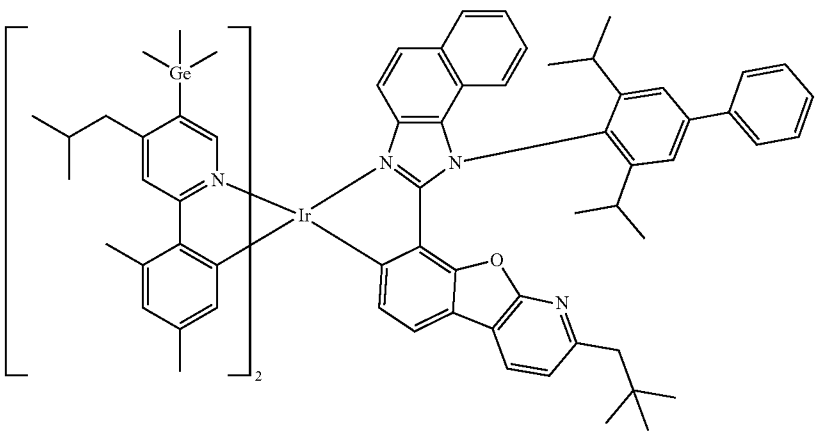
2546
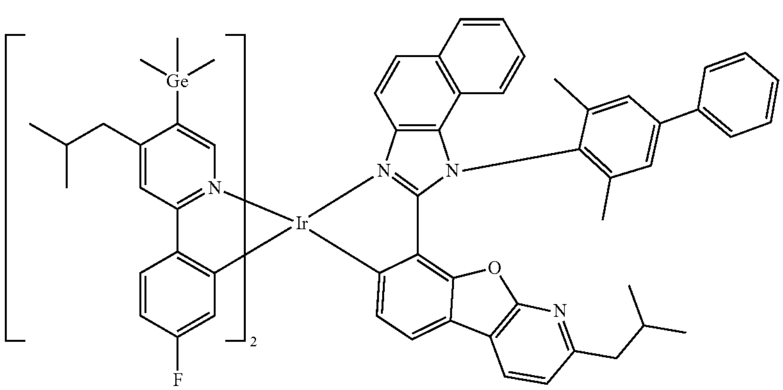

-continued
2547
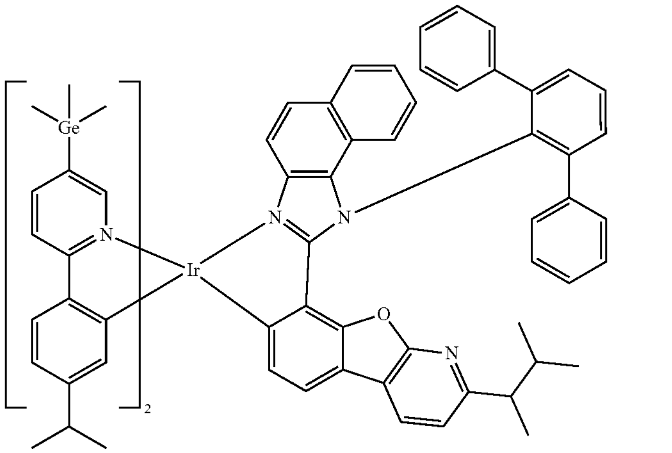
2548
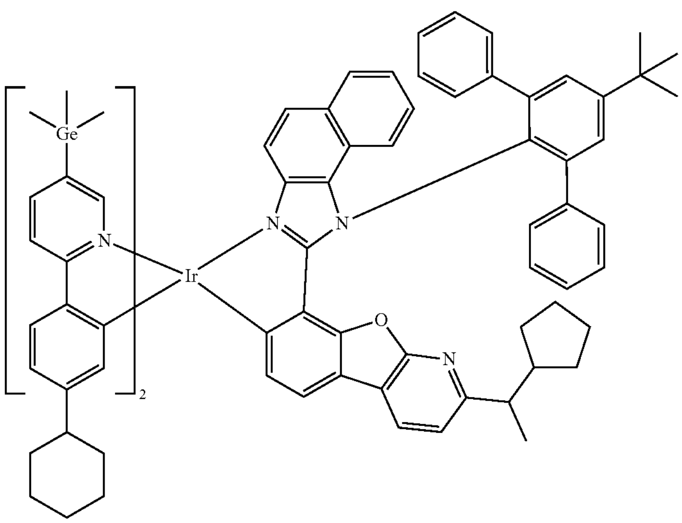
2549
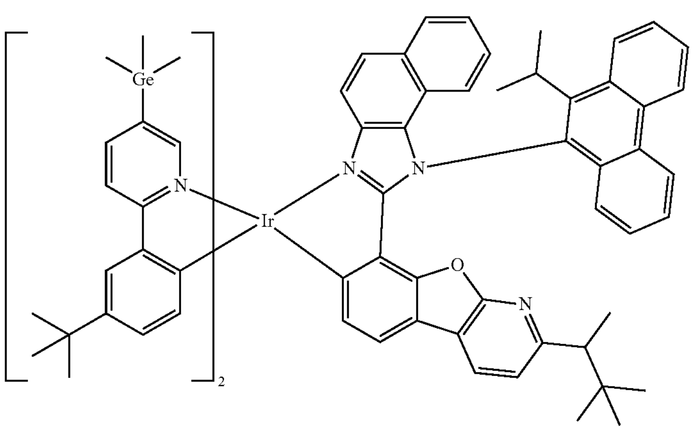

-continued
2550
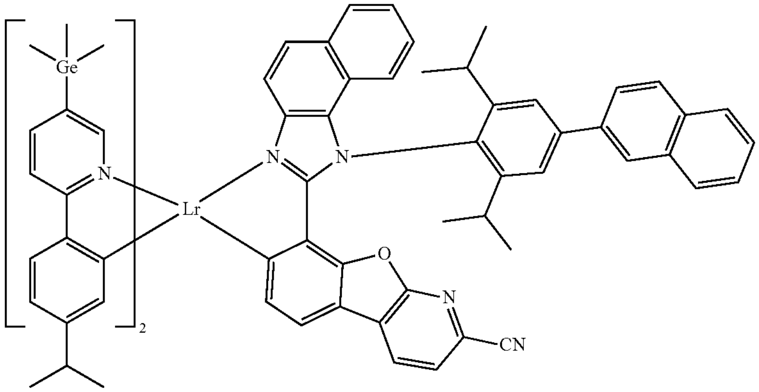
2551
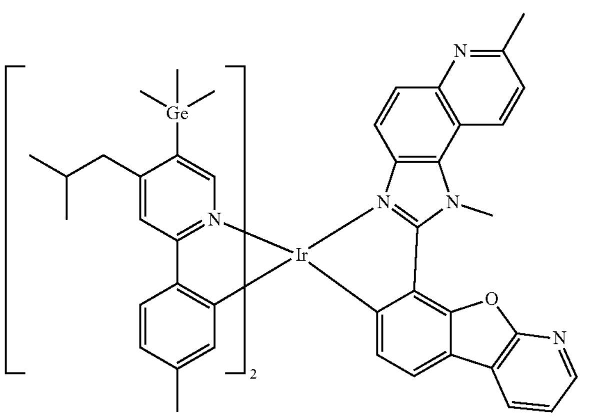
2552
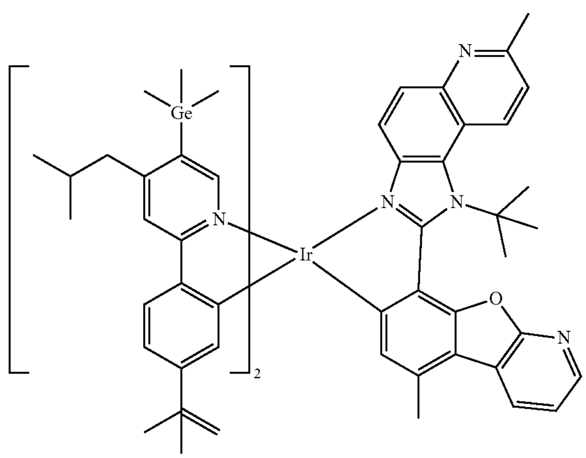
2553
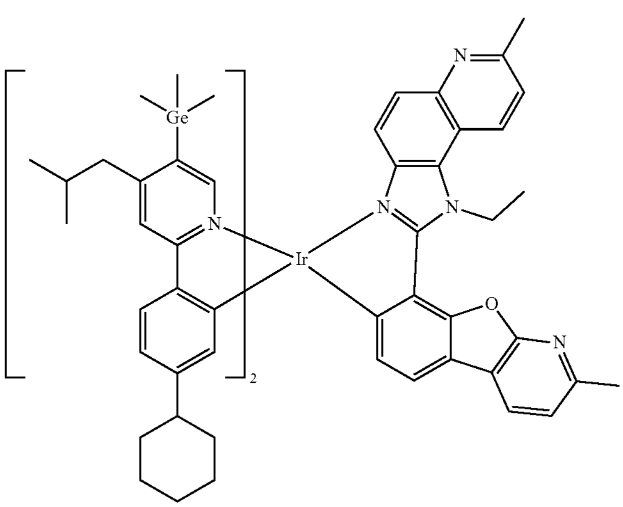

-continued
2554
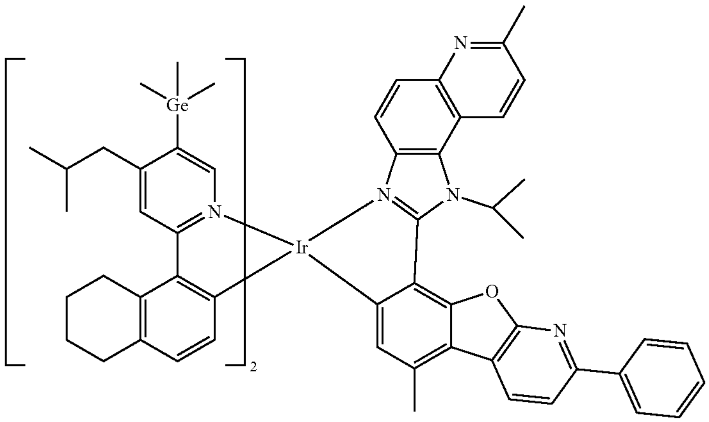
2555
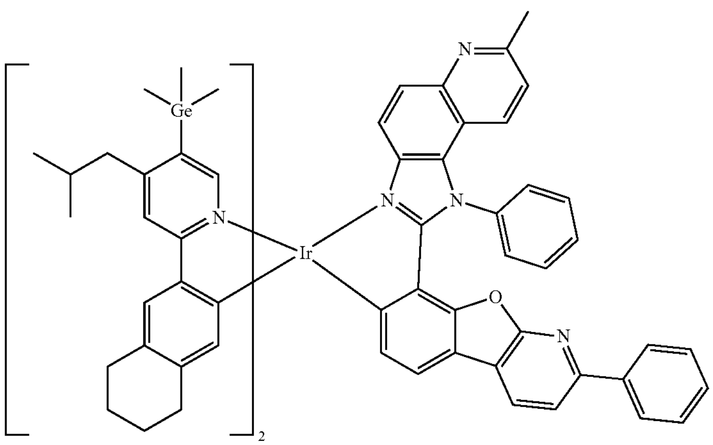
2556
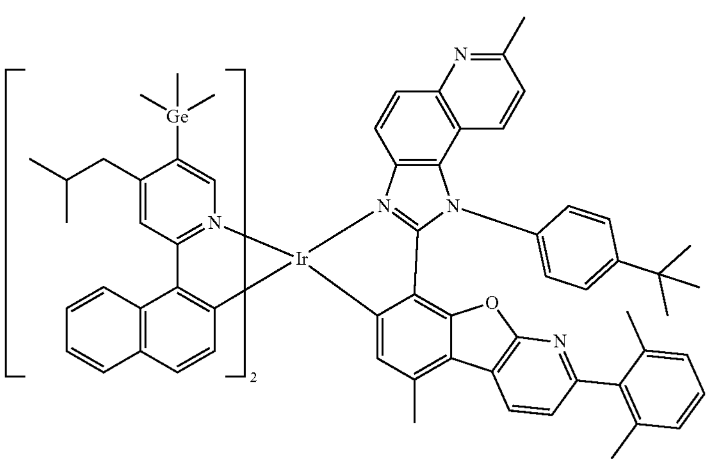

2557
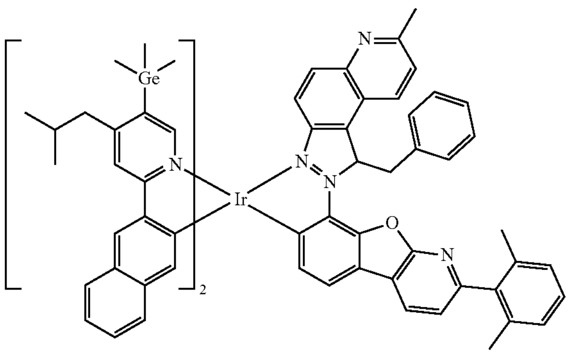
2558
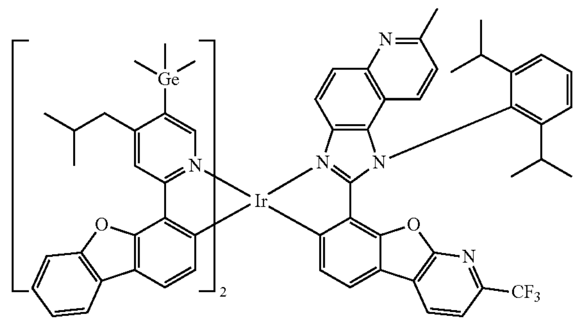
2559
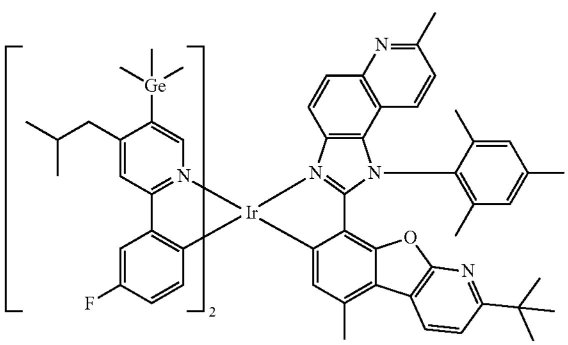
2560
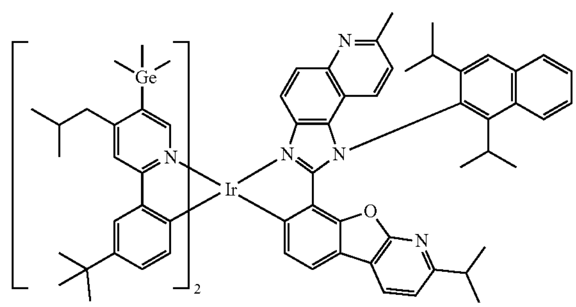
2561
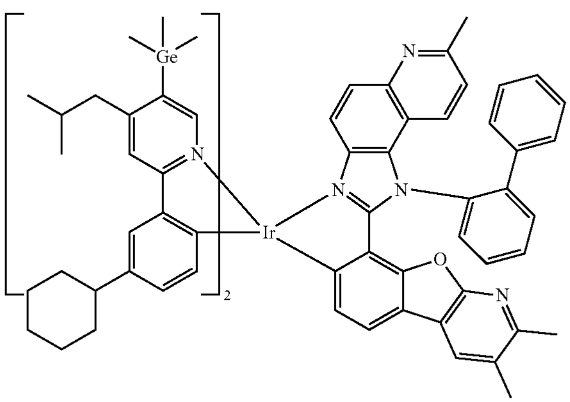
2562
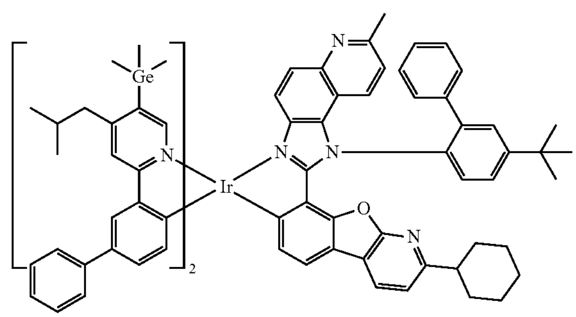
2563
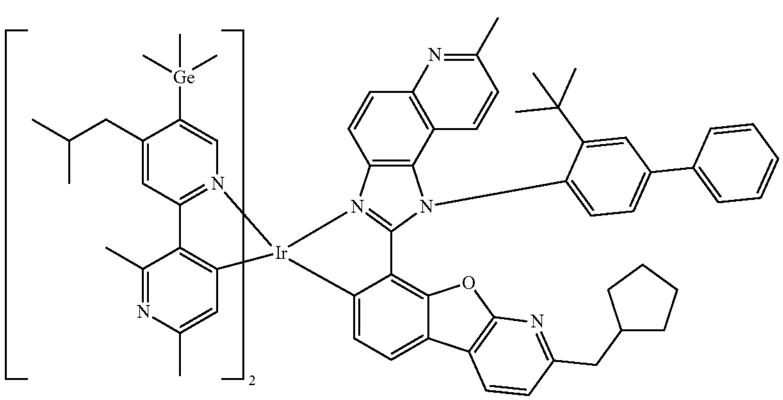

-continued
2564
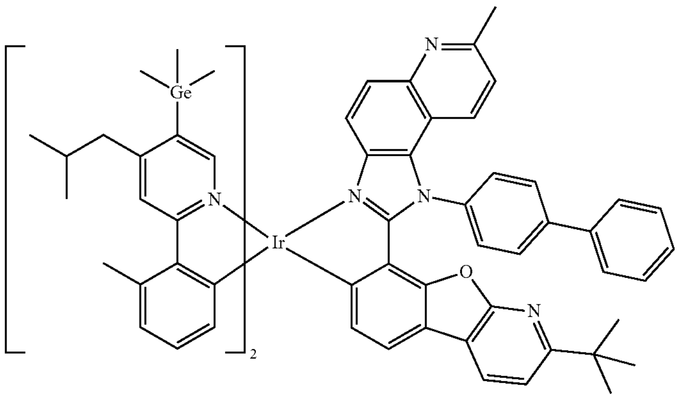
2565
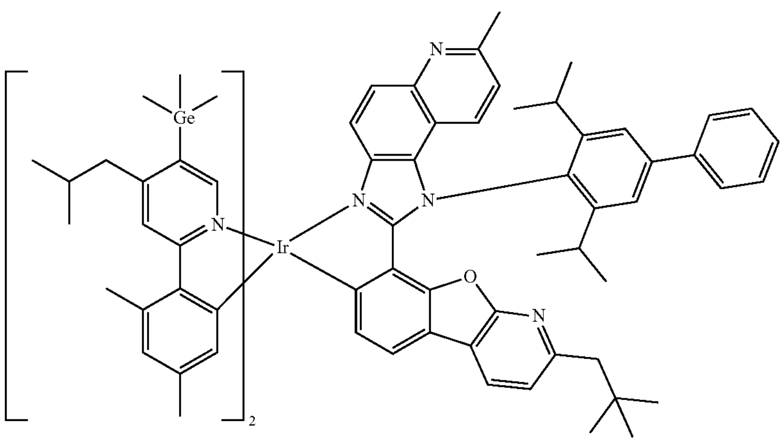
2566
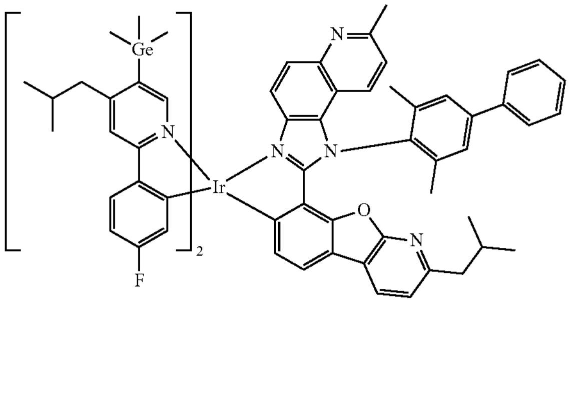
2567
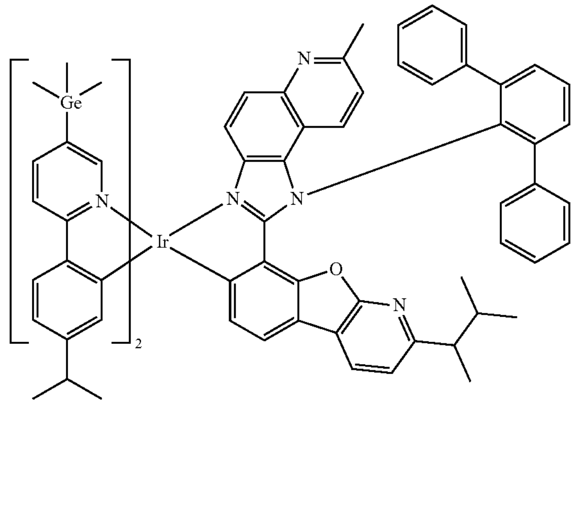

-continued
2568
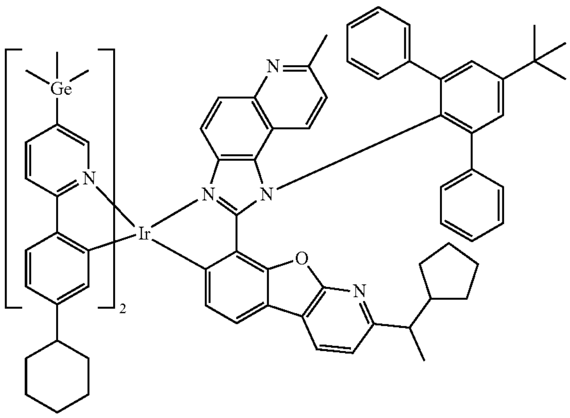
2569
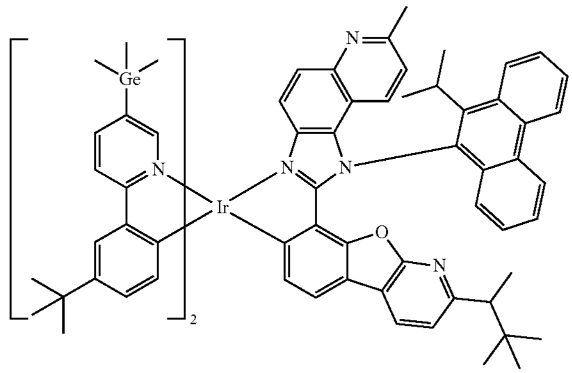
2570
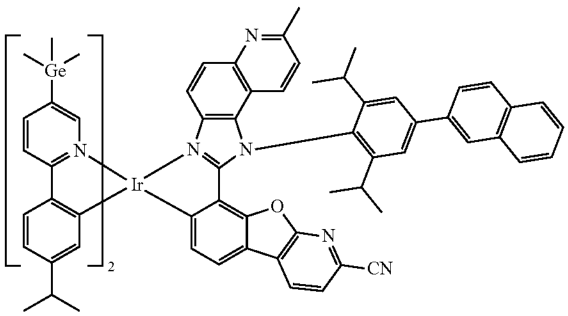
2571
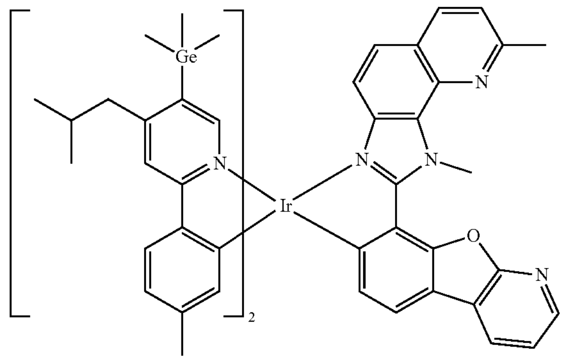
2572
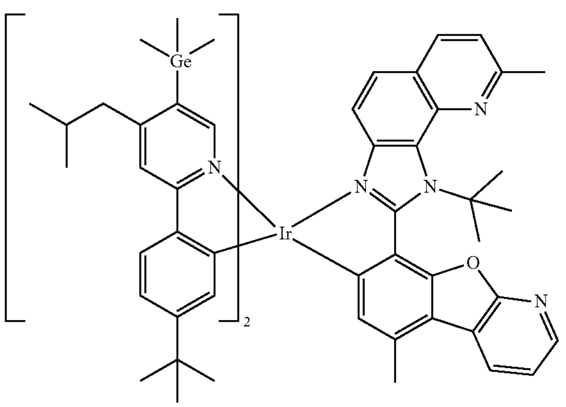
2573
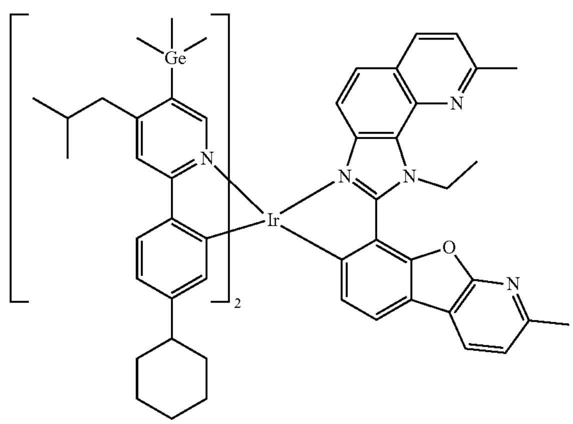
2574
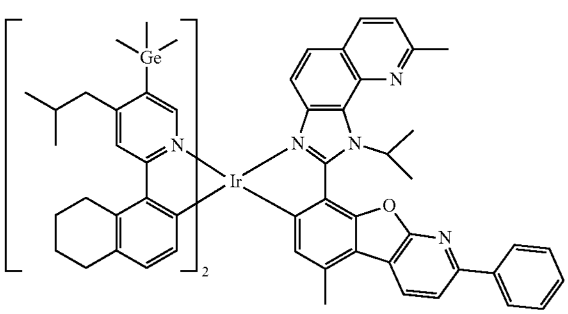
2575
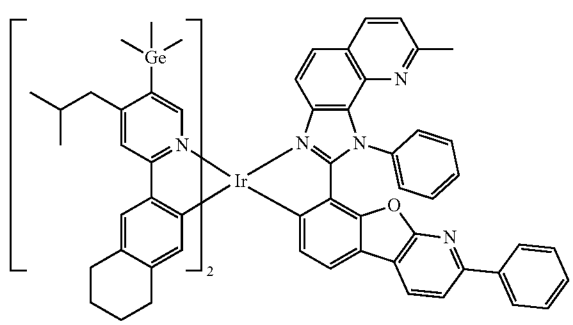

-continued
2576
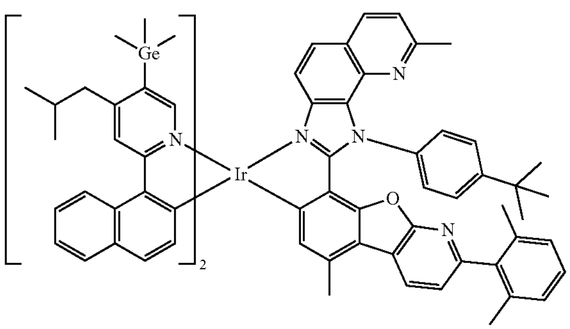
2577
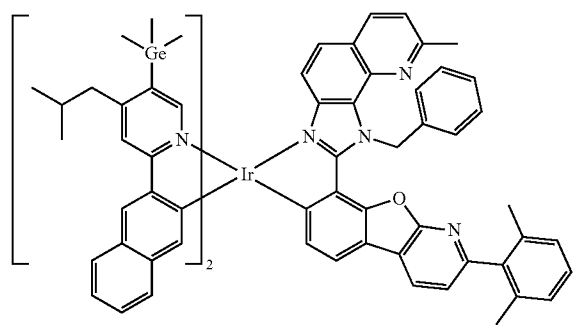
2578
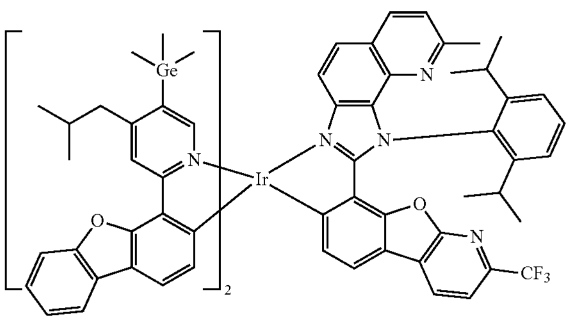
2579
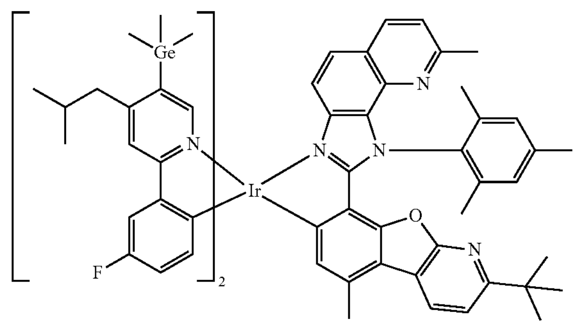
2580
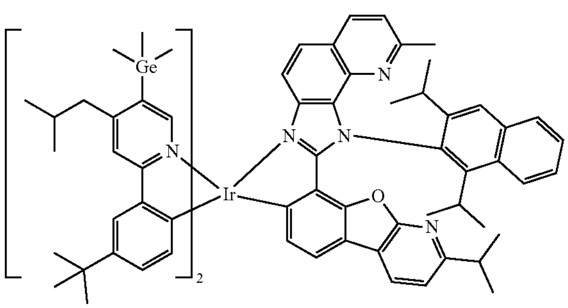
2581
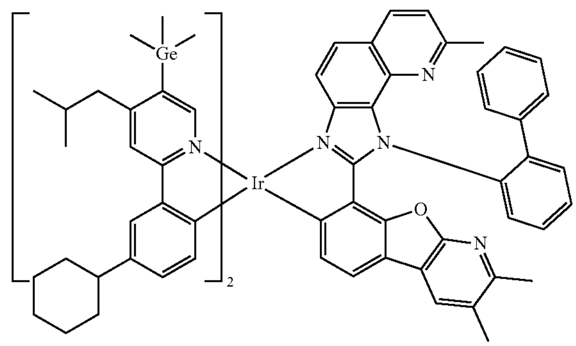
2582
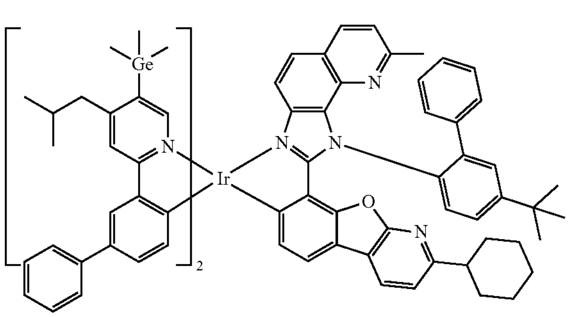
2583
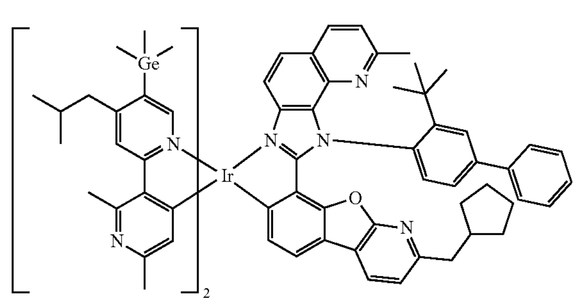

-continued
2584
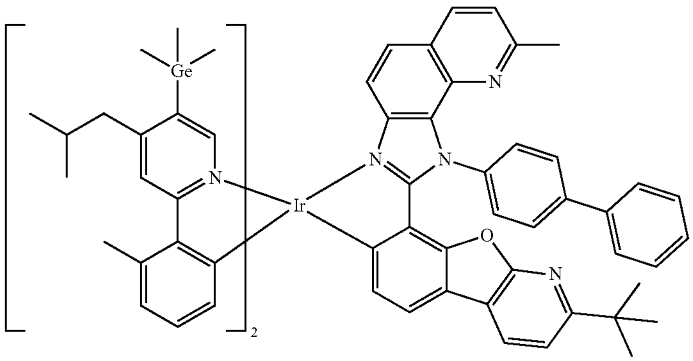
2585
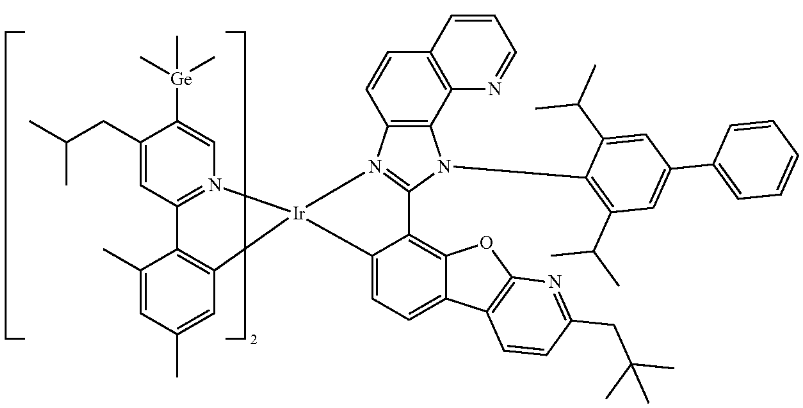
2586
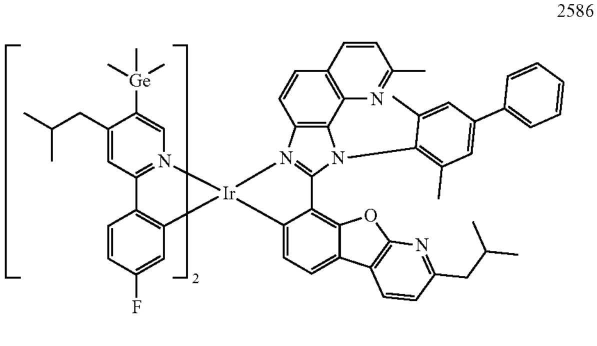
2587
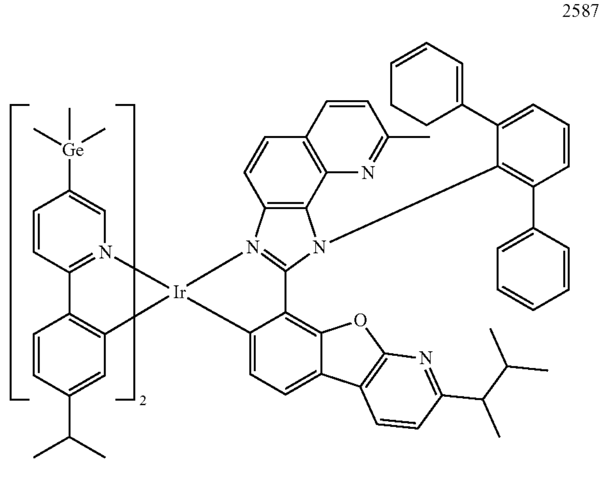

-continued
2588
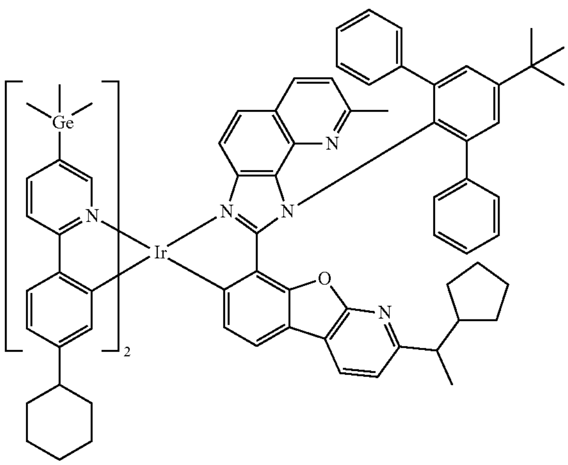
2589
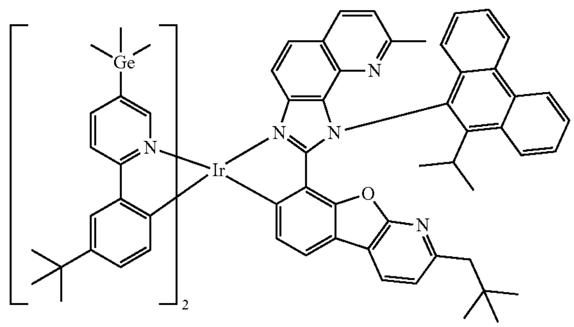
2590
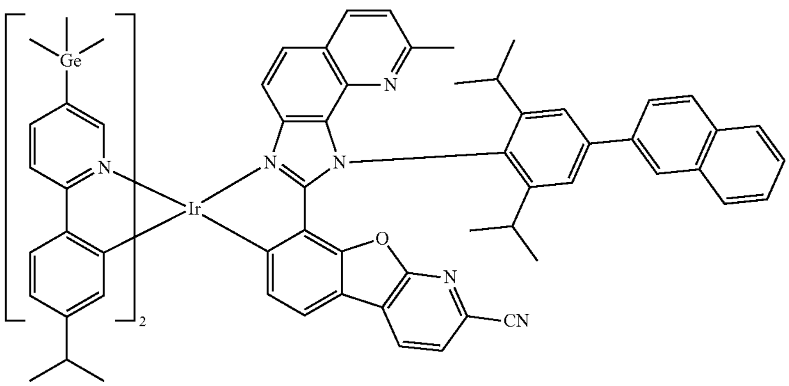
2591
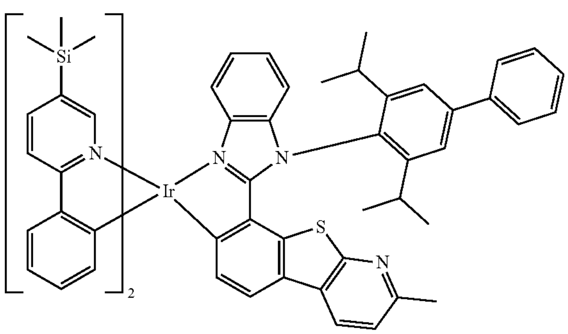
2592
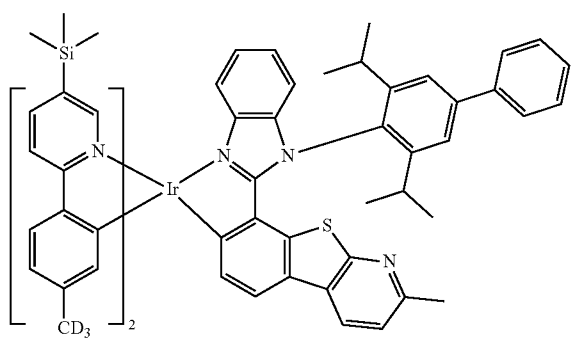
2593
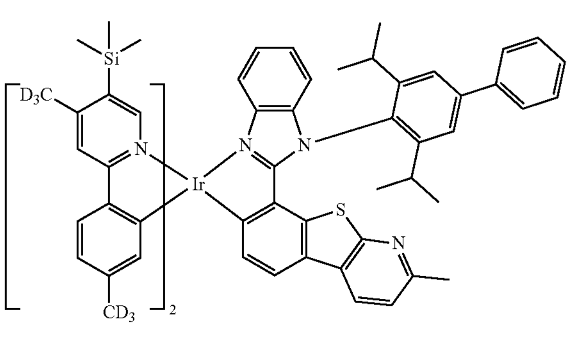
2594
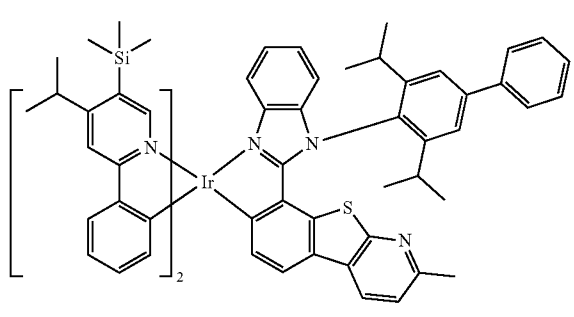

-continued
2595
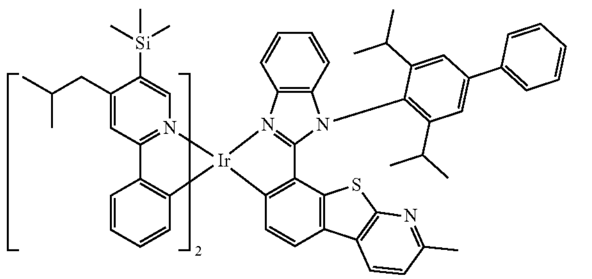
2596
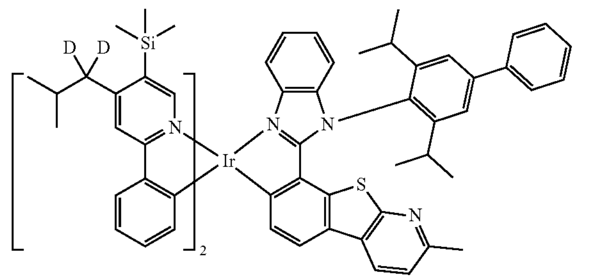
2597
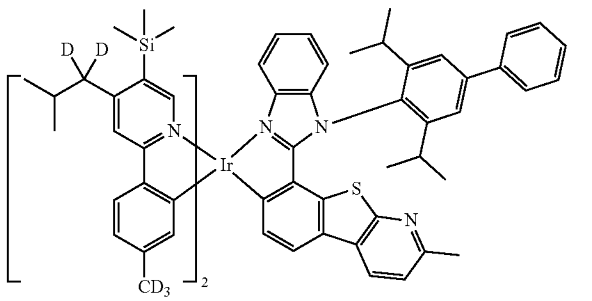
2598
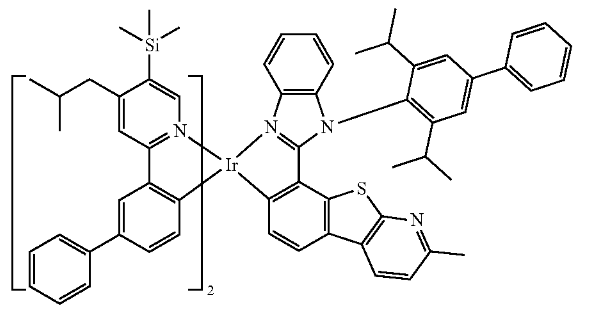
2599
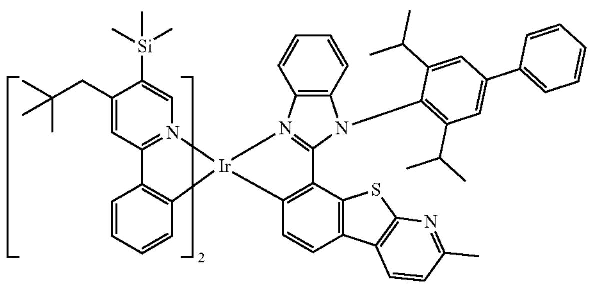
2600
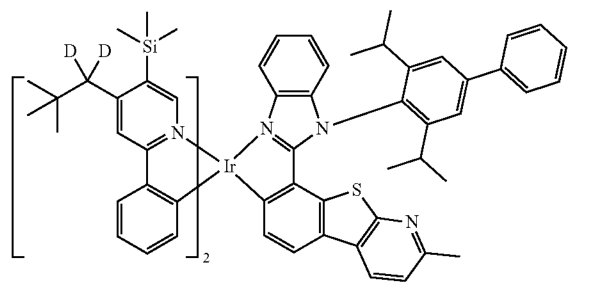
2601
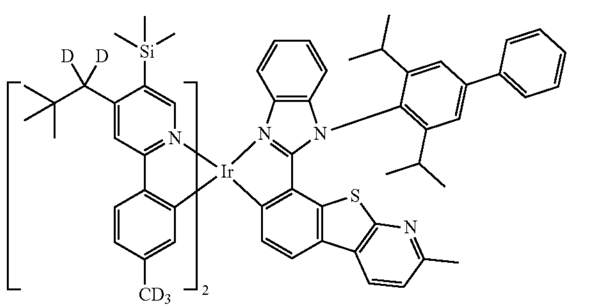
2602
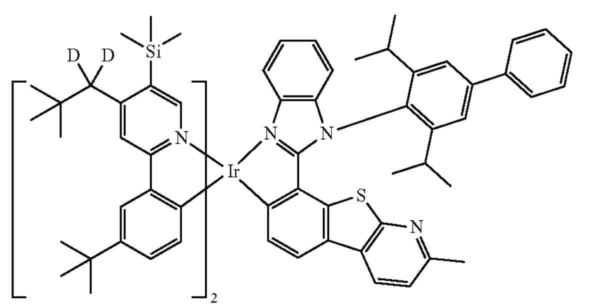
2603
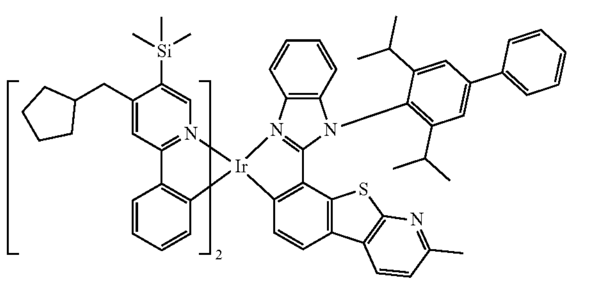
2604
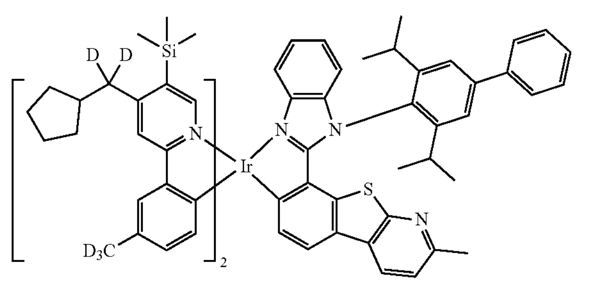

-continued
2605
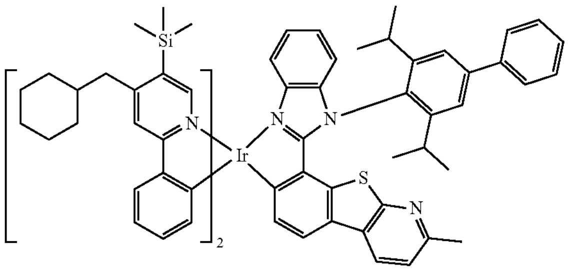
2606
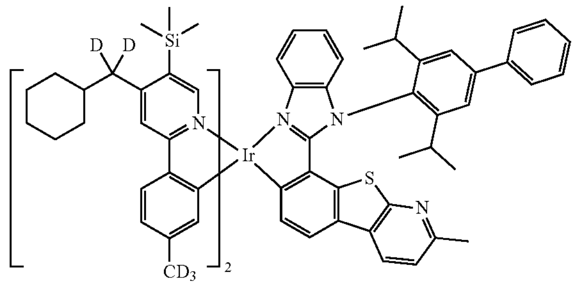
2607
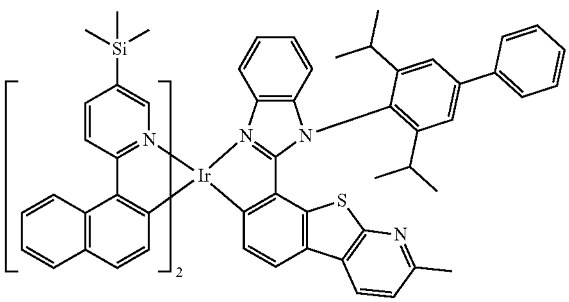
2608
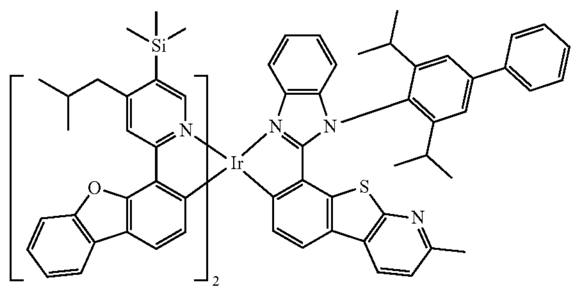
2609
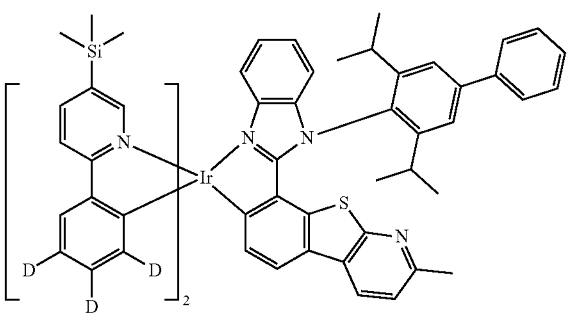
2610
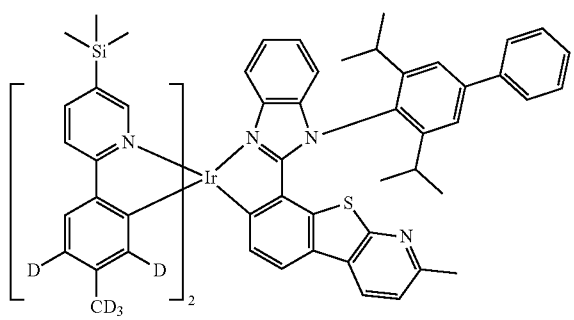
2611
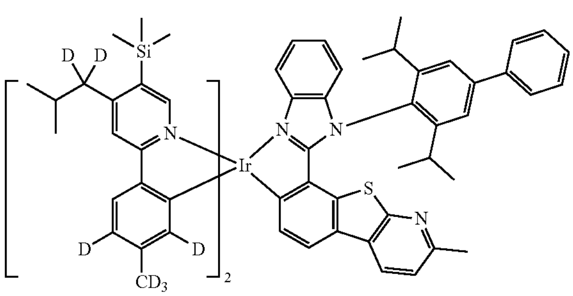
2612
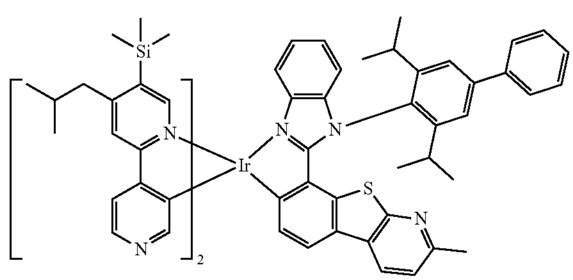
2613
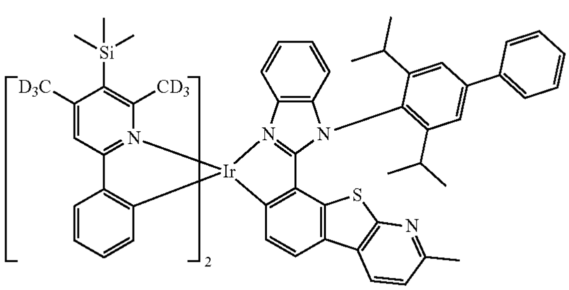
2614
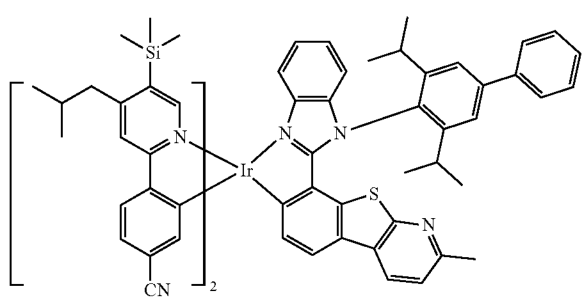

-continued
2615
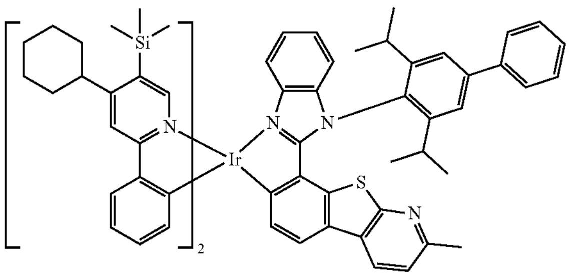
2616
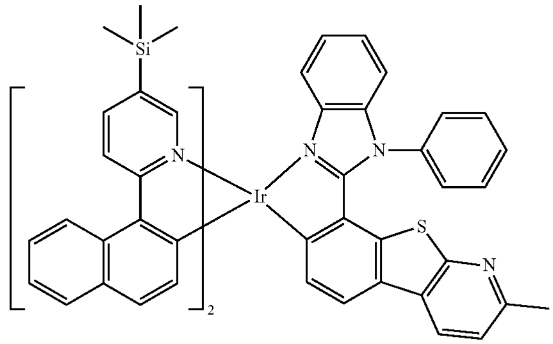
2617
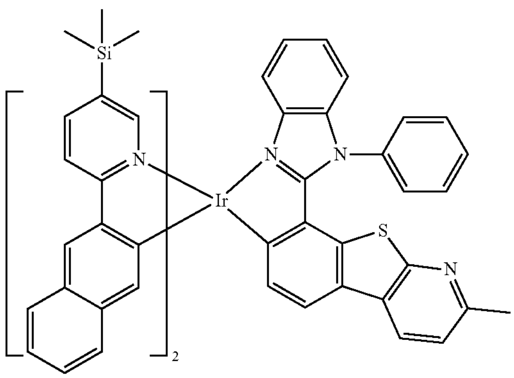
2618
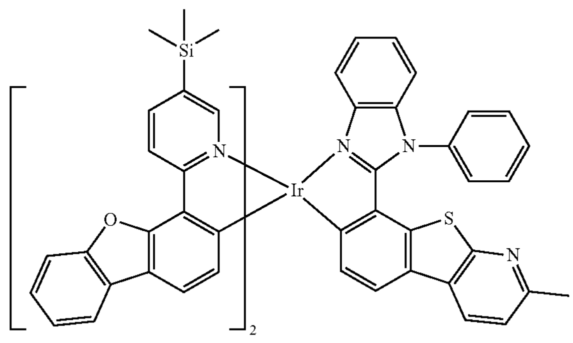
2619
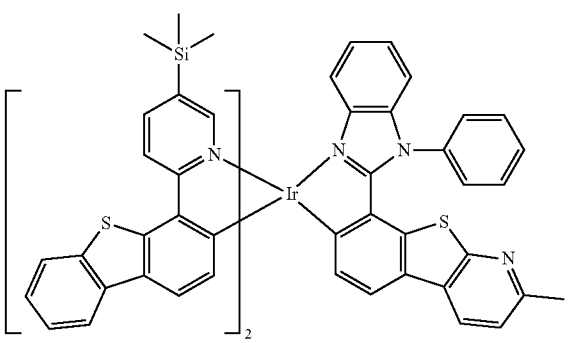
2620
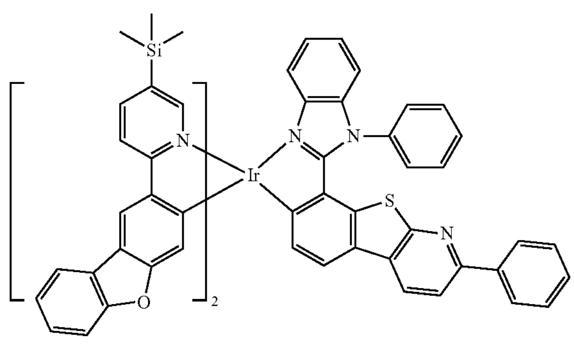
2621
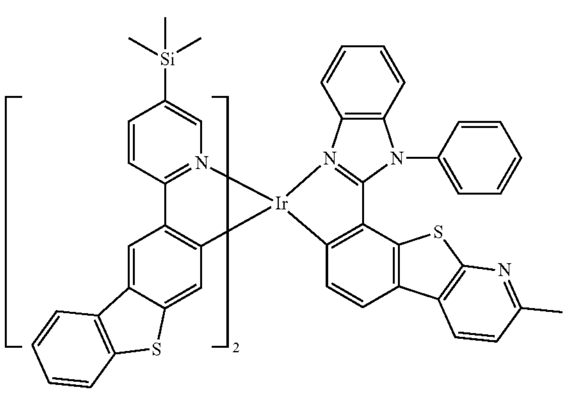
2622
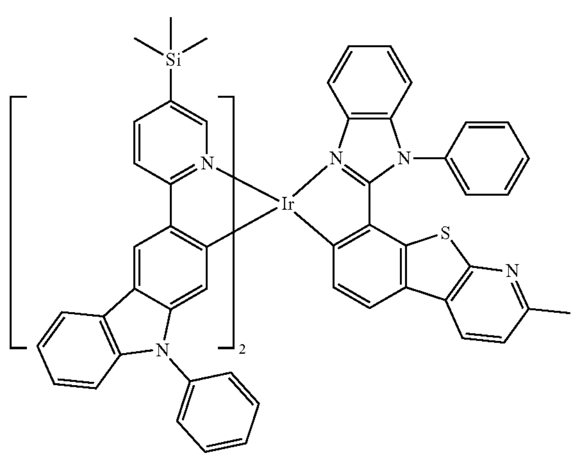

-continued
2623
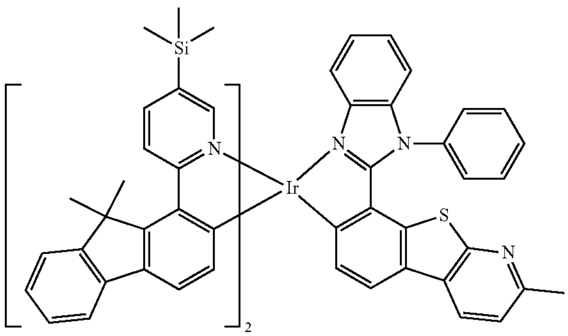
2624
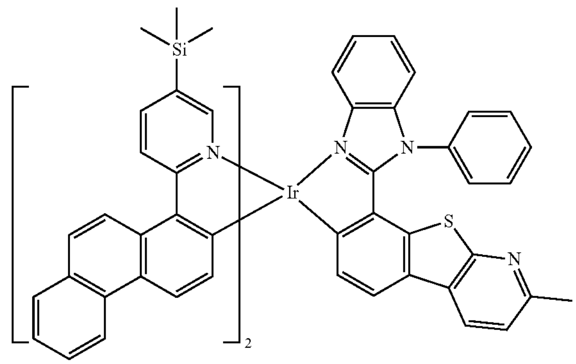
2625
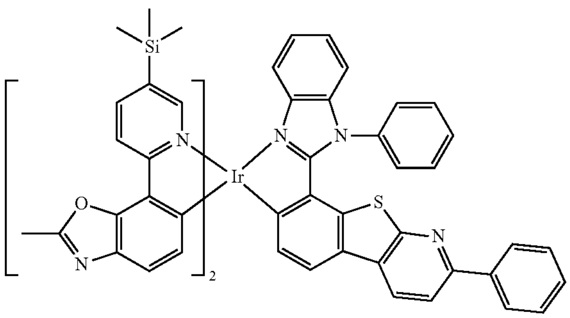
2626
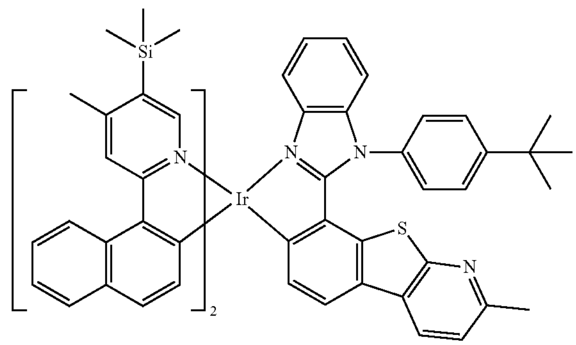
2627
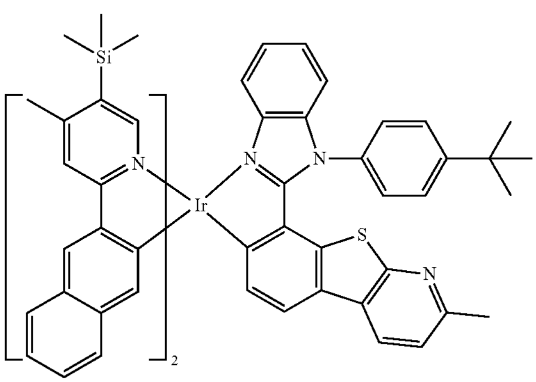
2628
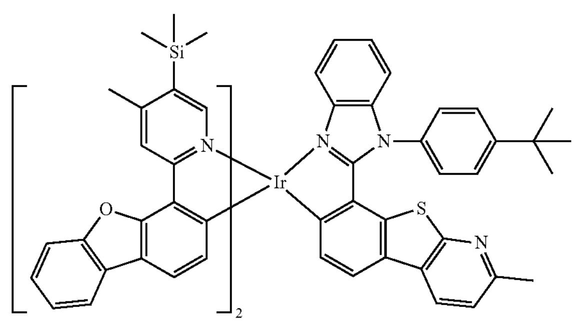
2629
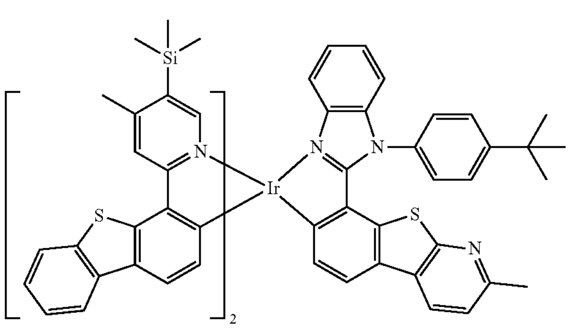
2630
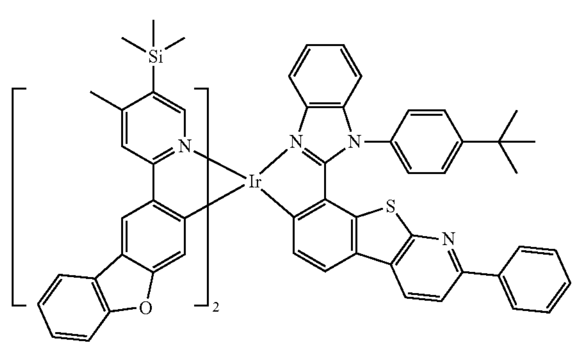

-continued
2631
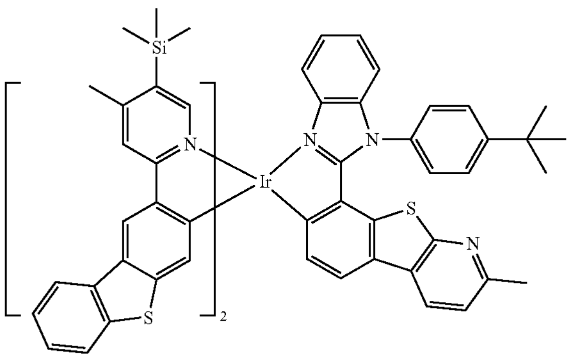
2632
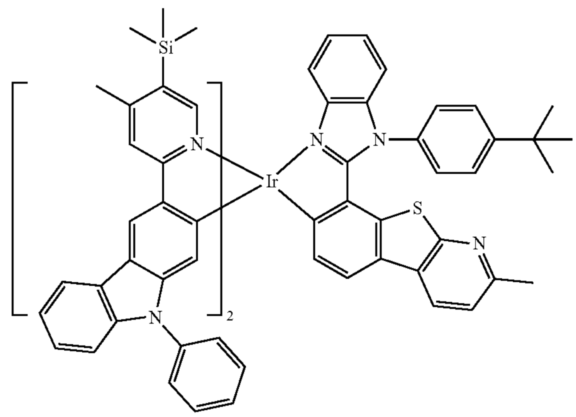
2633
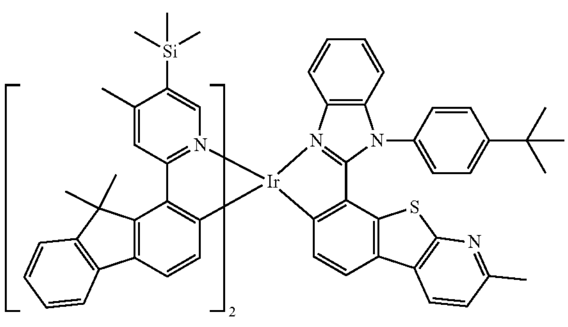
2634
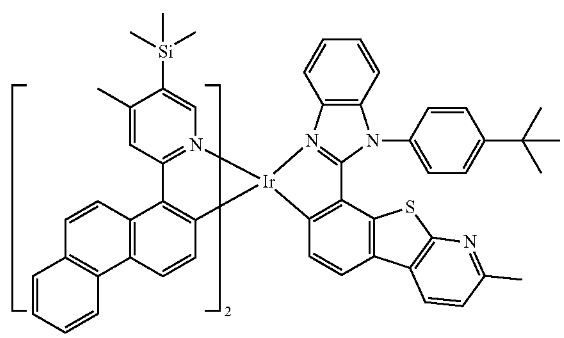
2635
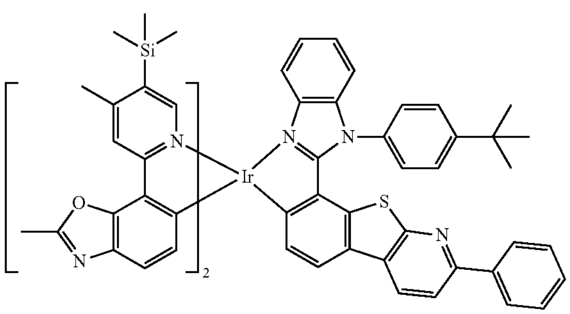
2636
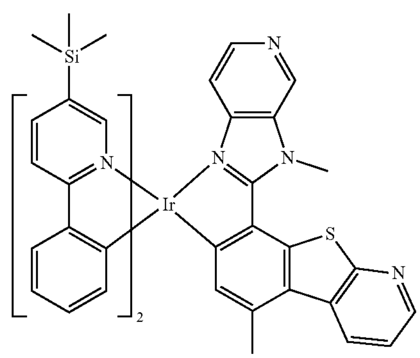
2637
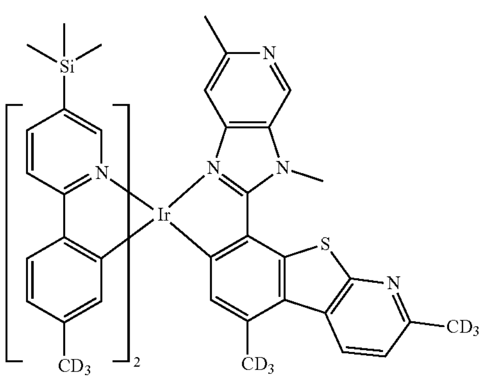
2638
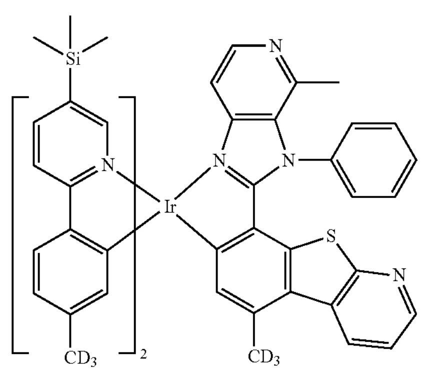

-continued
2639
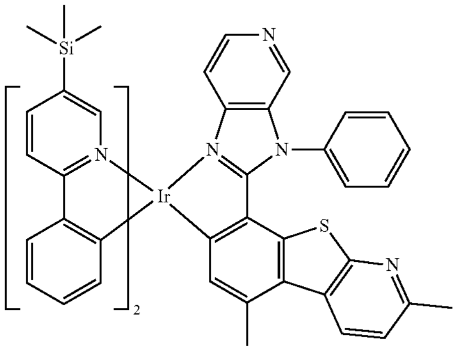
2640
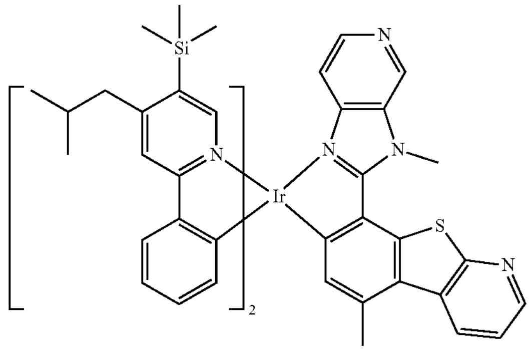
2641
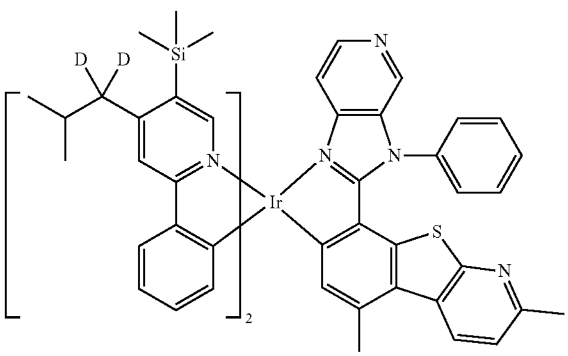
2642
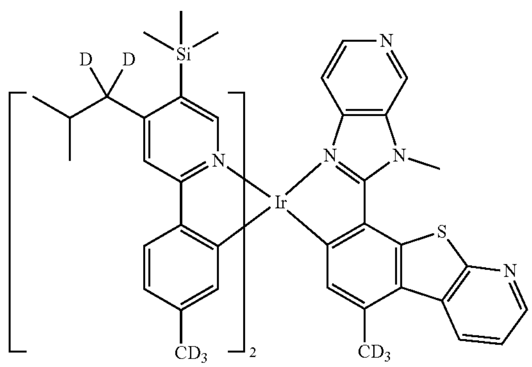
2643
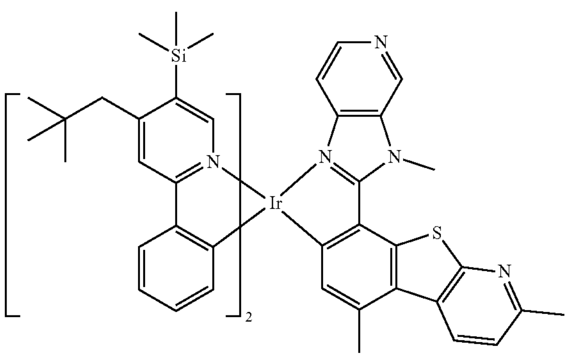
2644
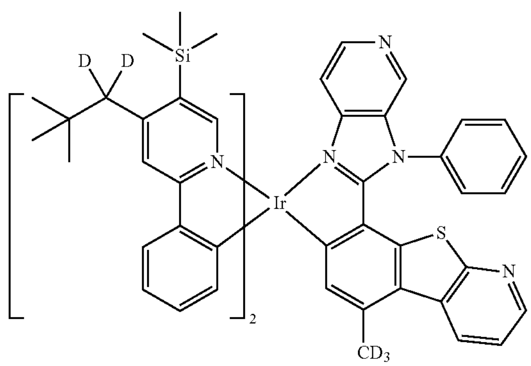
2645
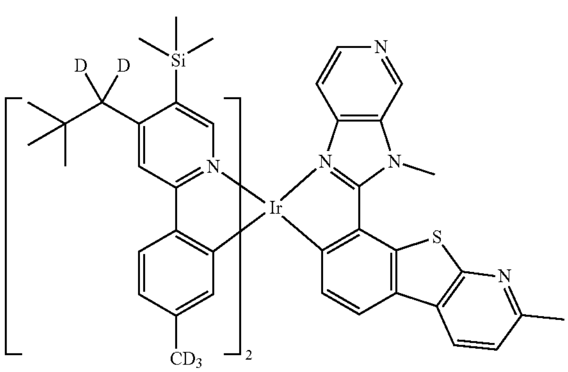
2646
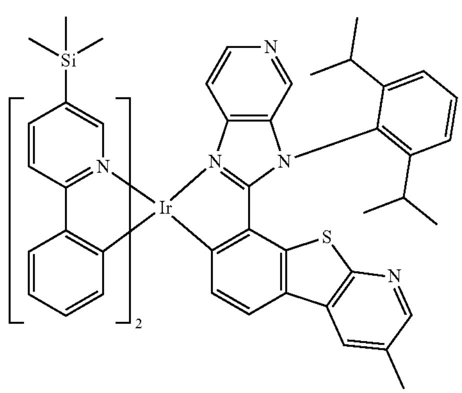

-continued
2647
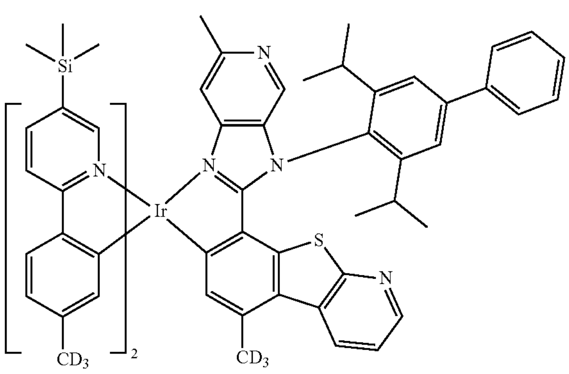
2648
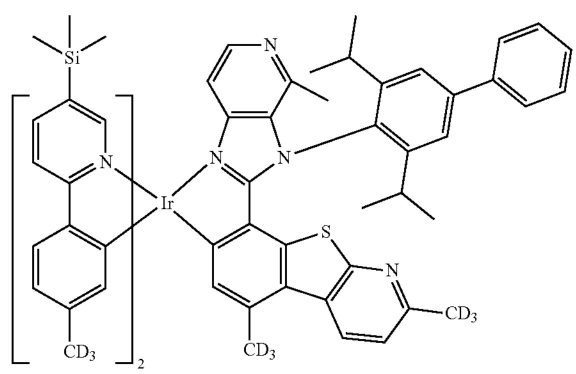
2649
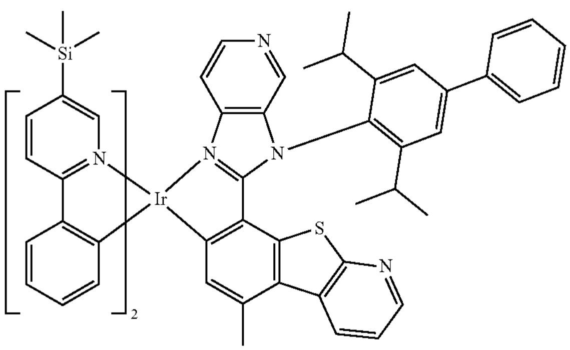
2650
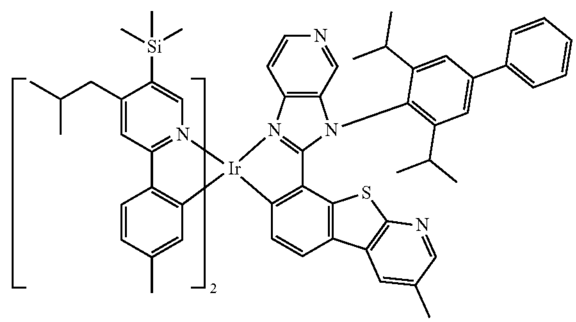
2651
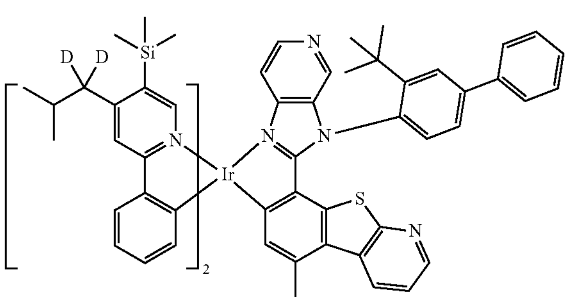
2652
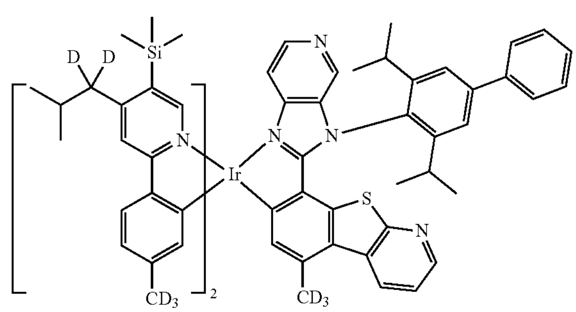
2653
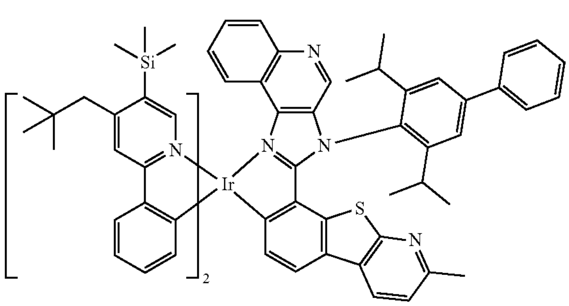
2651
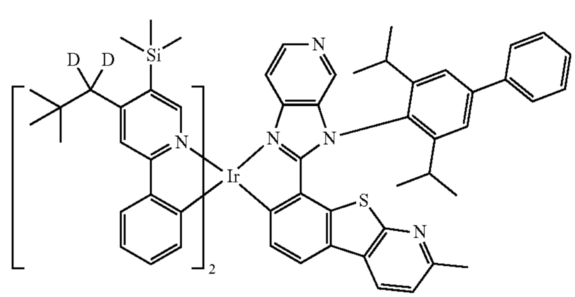

-continued
2655
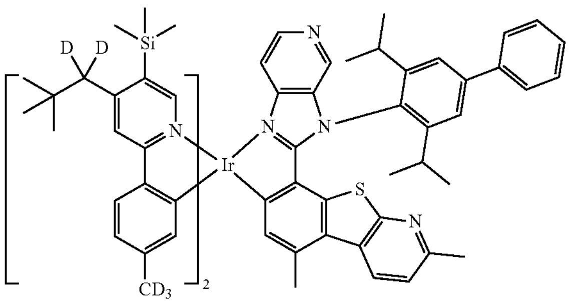
2656
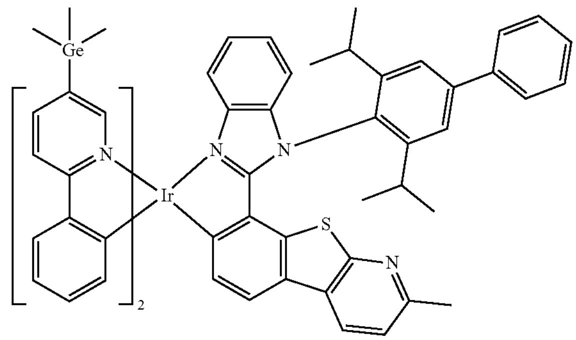
2657
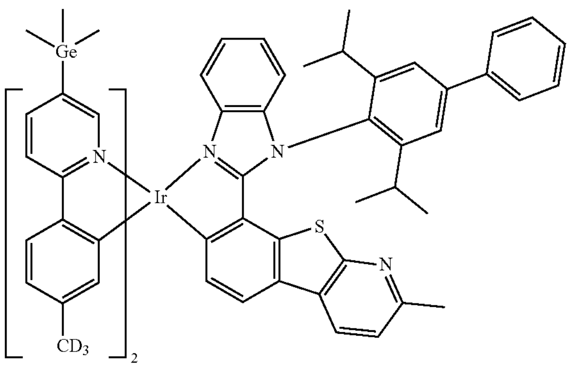
2658
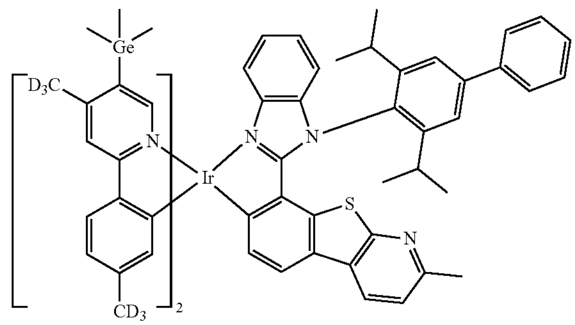
2659
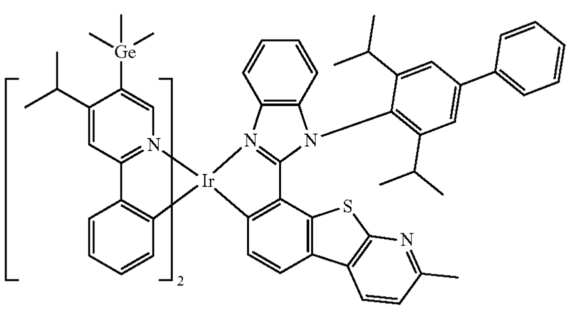
2660
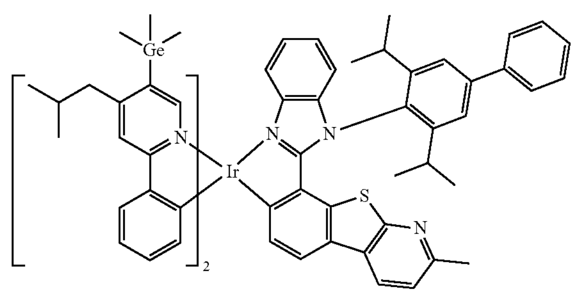
2661
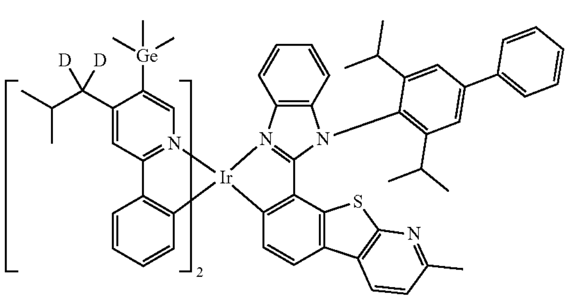
2662
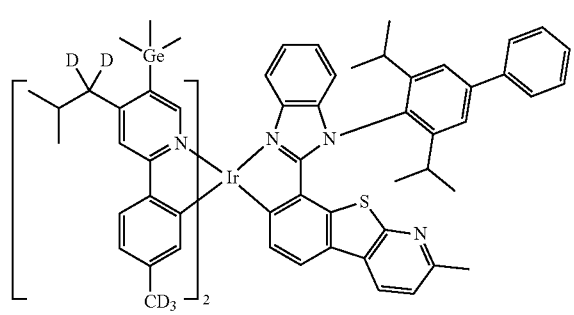

-continued
2663
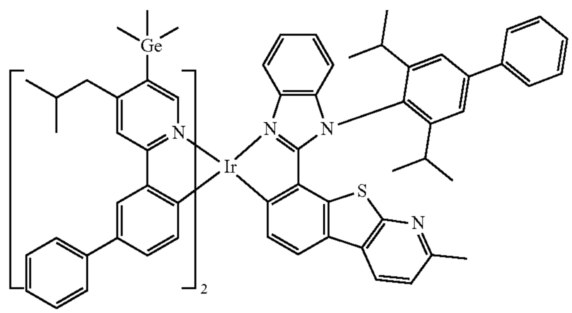
2664
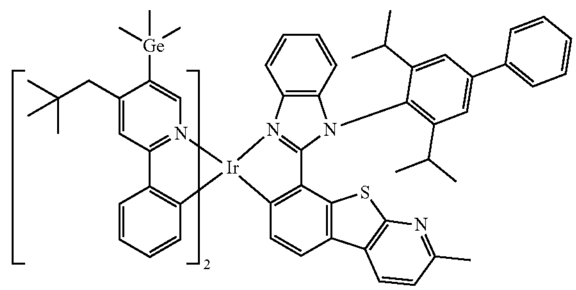
2665
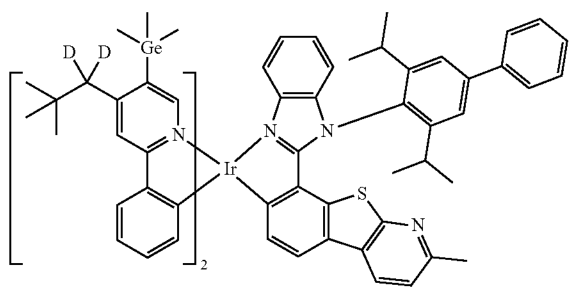
2666
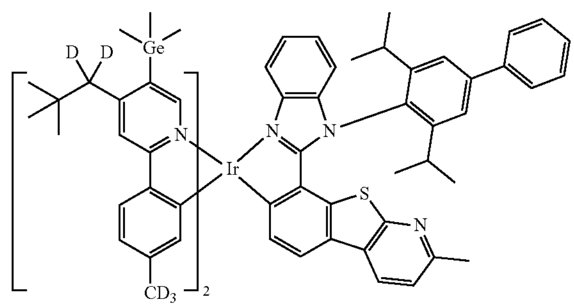
2667
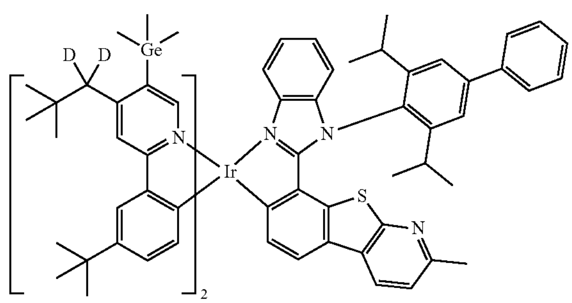
2668
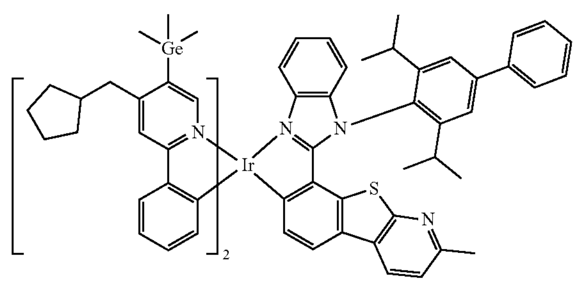
2669
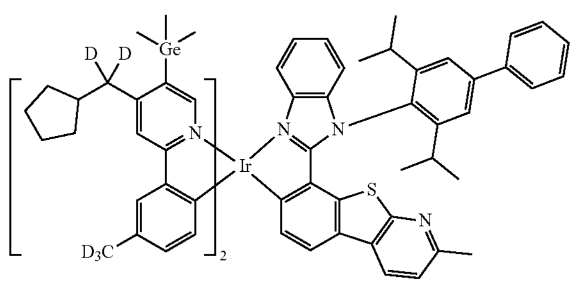
2670
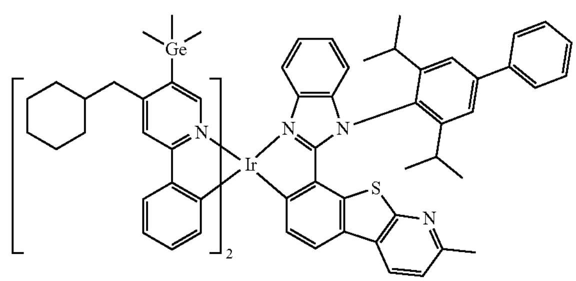
2671
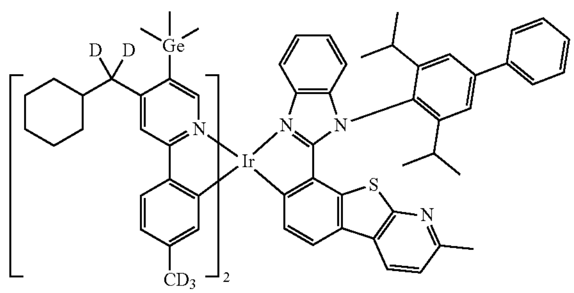
2672
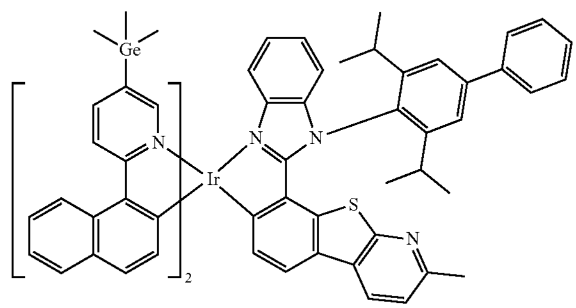

-continued
2673
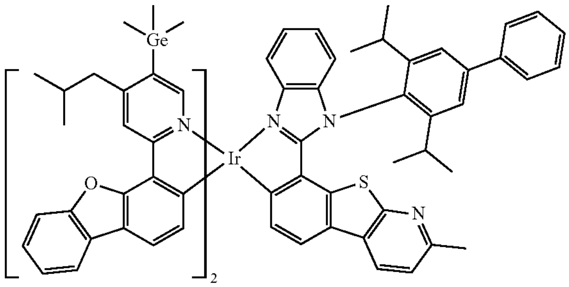
2674
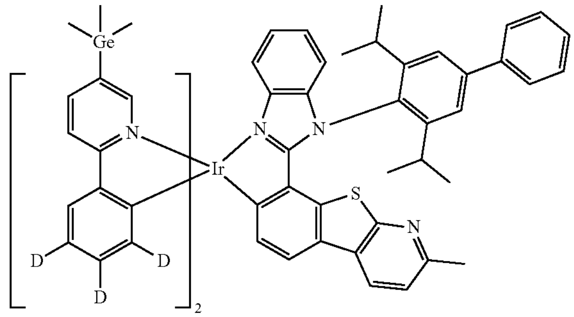
2675
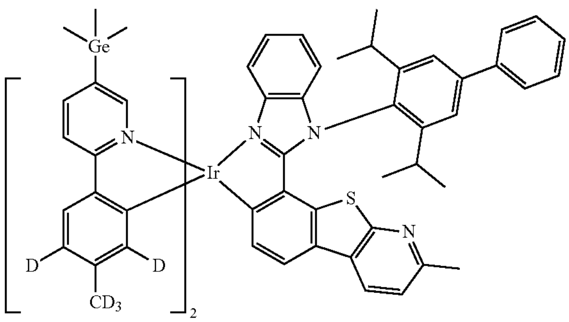
2676
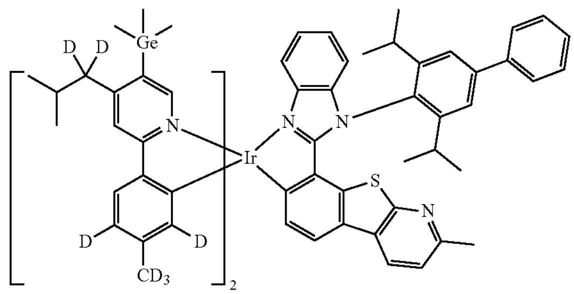
2677
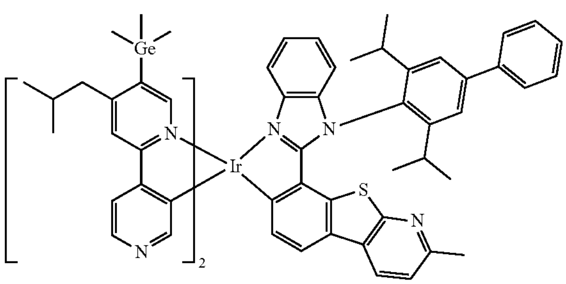
2678
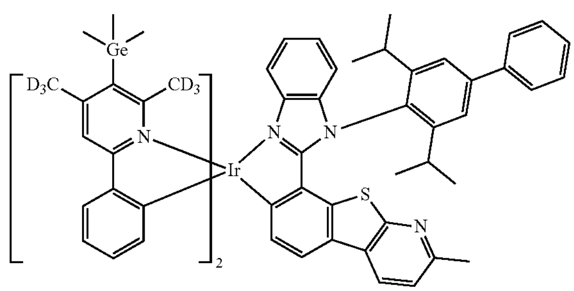
2679
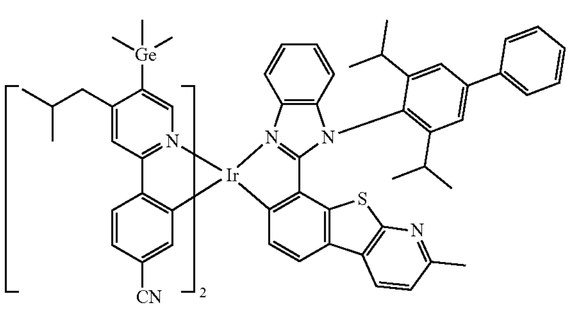
2680
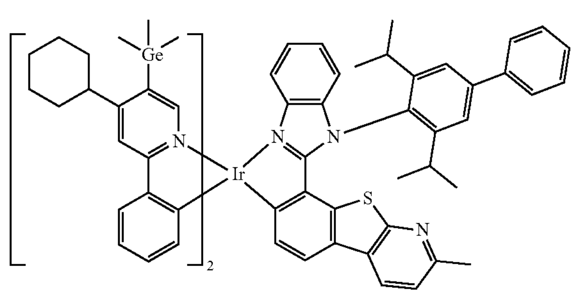

-continued
2681
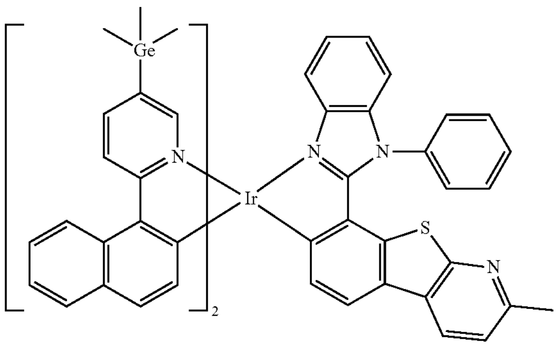
2682
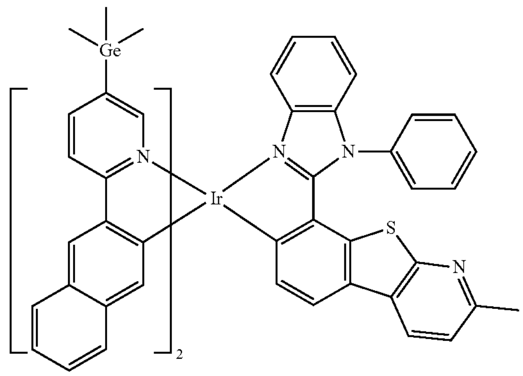
2683
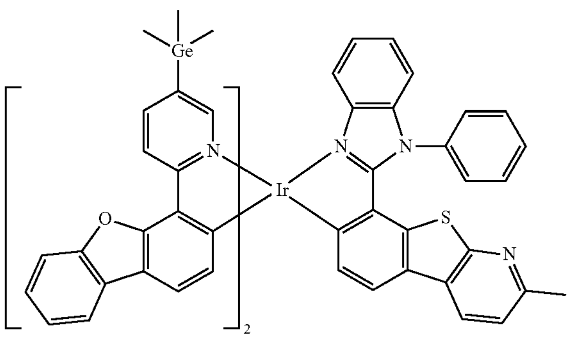
2684
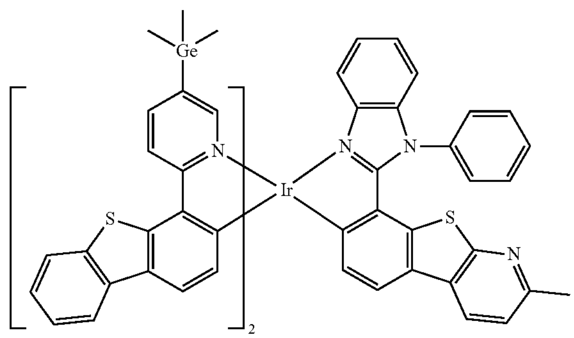
2685
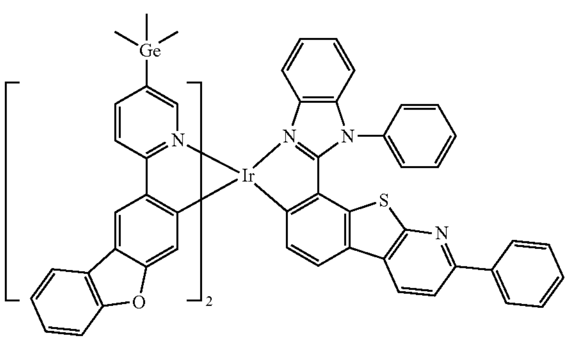
2686
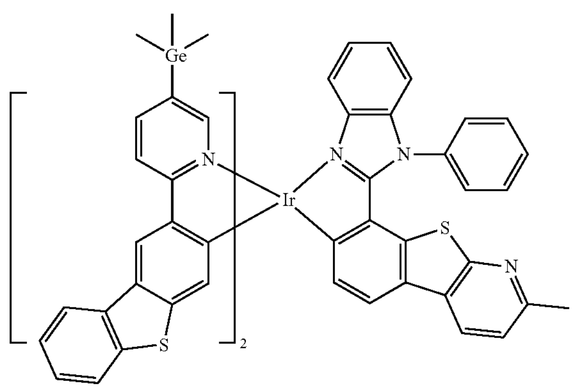
2687
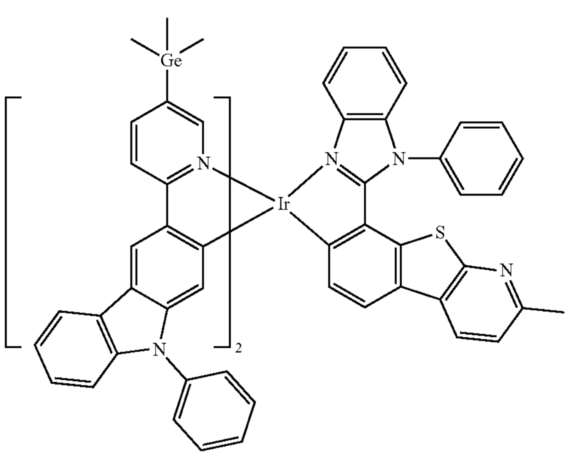
2688
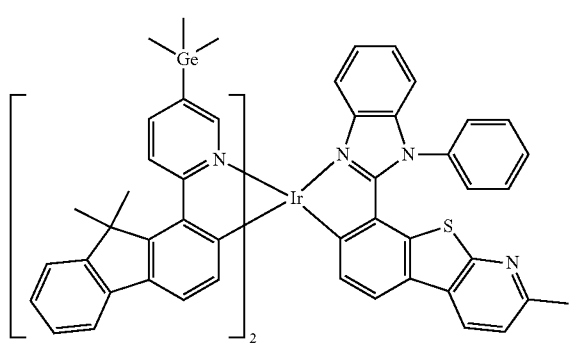

-continued
2689
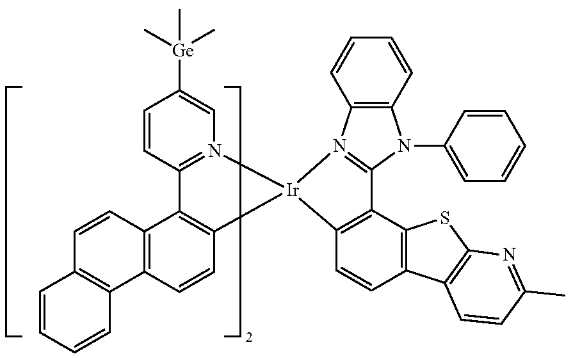
2690
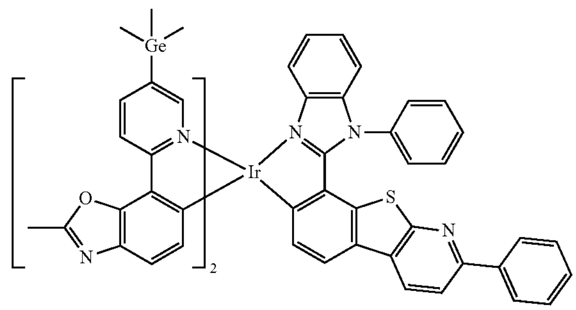
2691
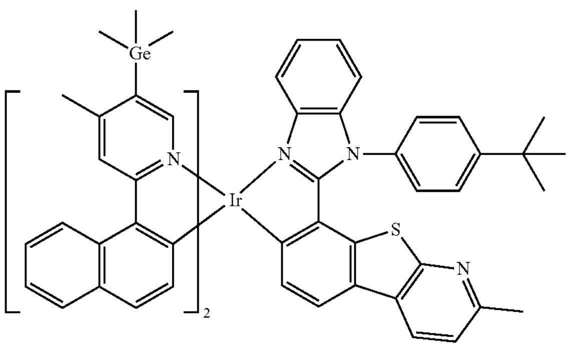
2692
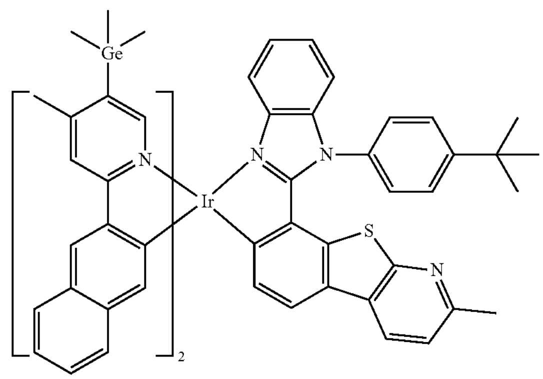
2693
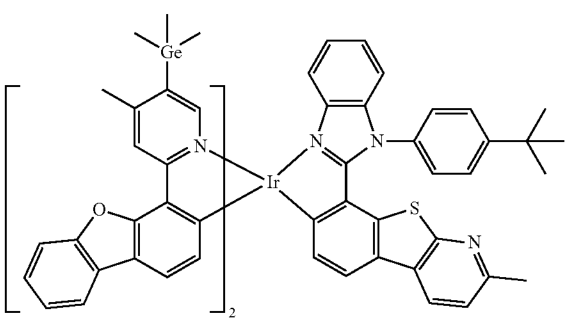
2694
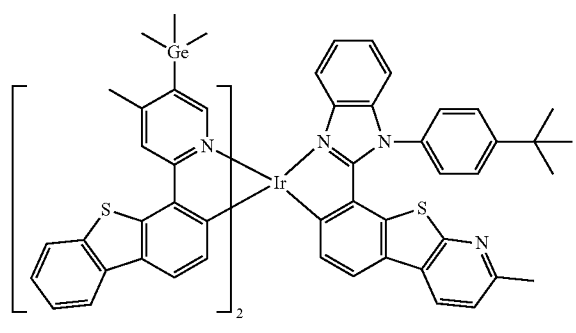
2695
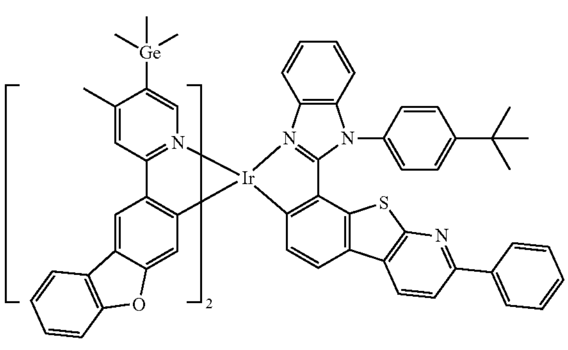
2696
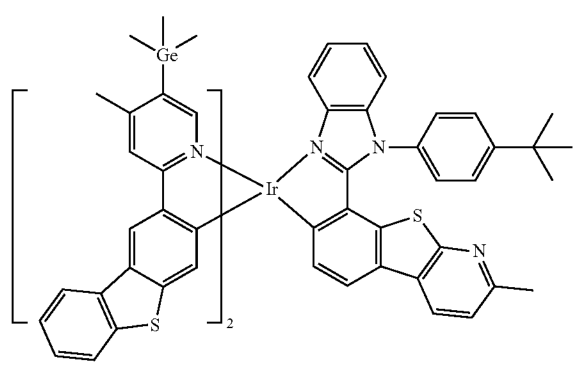

-continued
2697
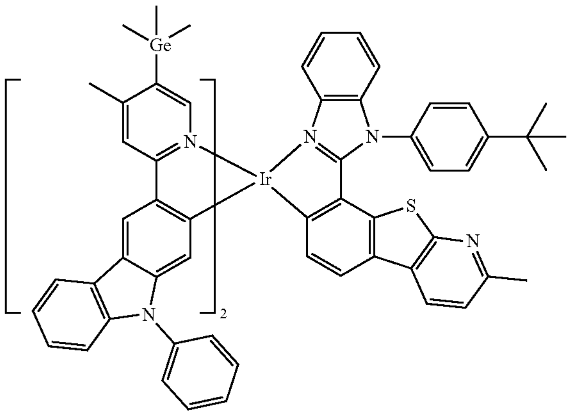
2698
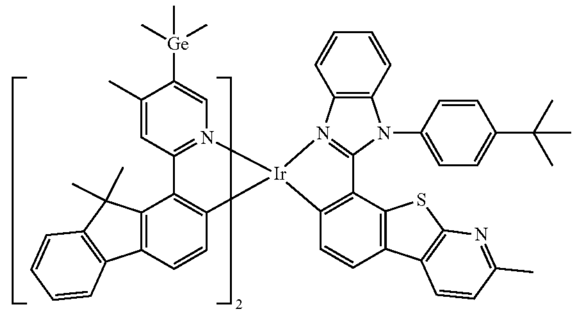
2699
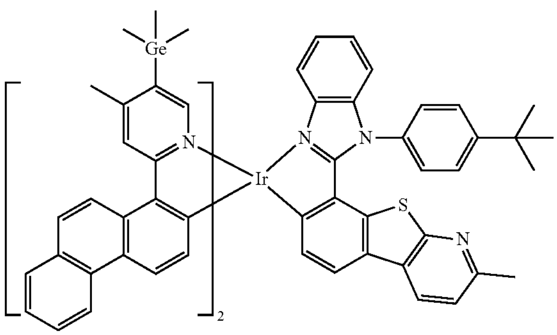
2700
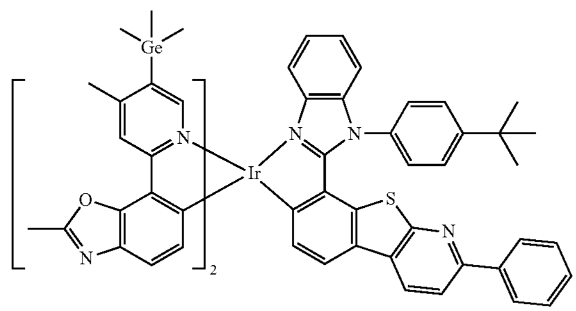
2701
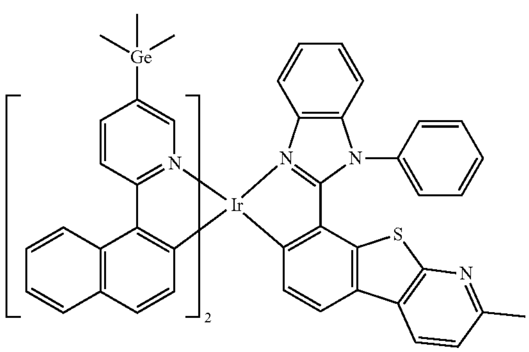
2702
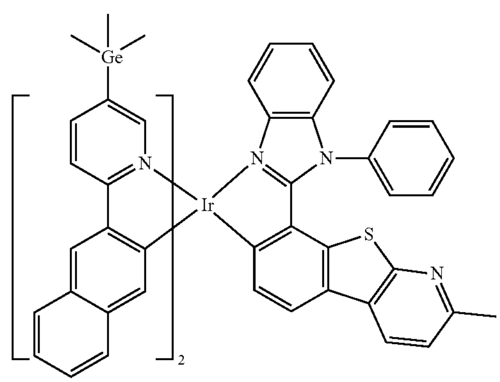
2703
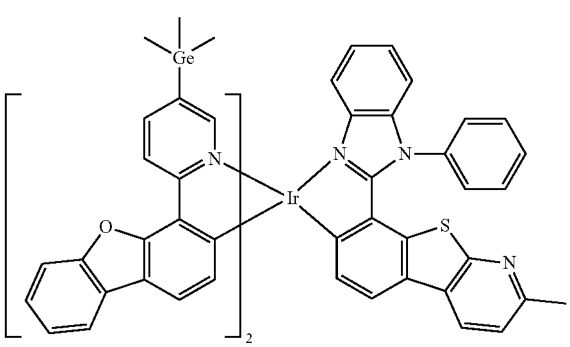
2704
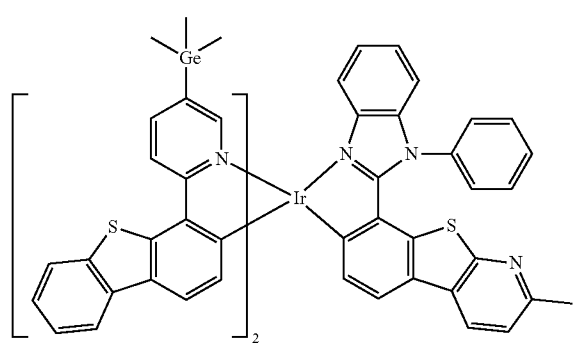

-continued
2705
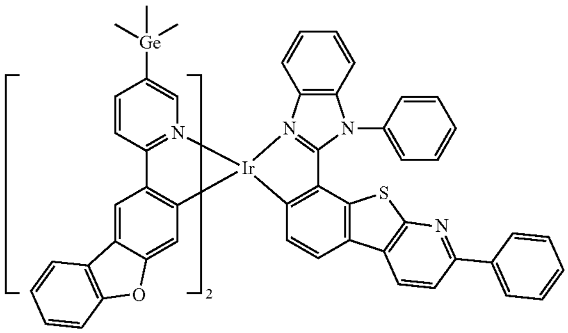
2706
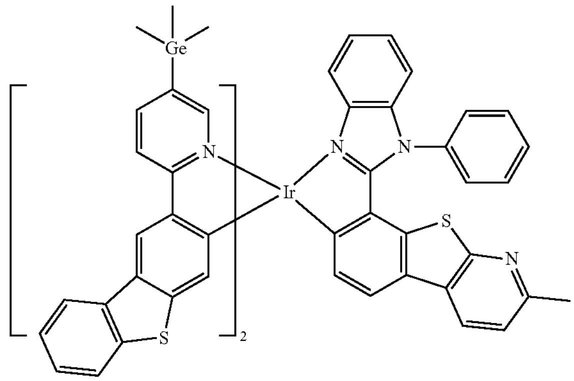
2707
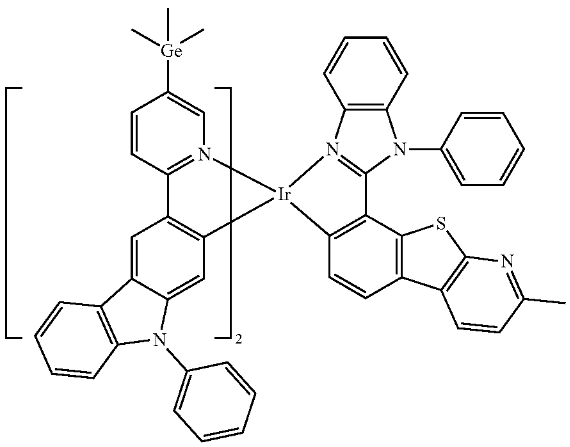
2708
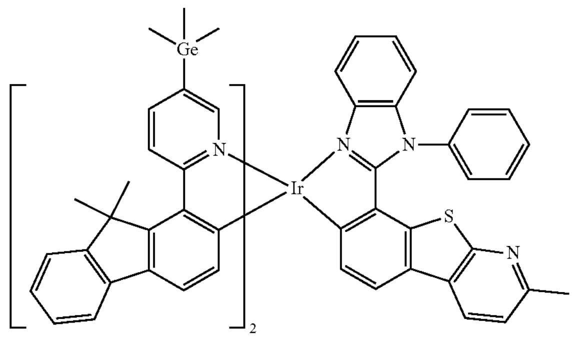
2709
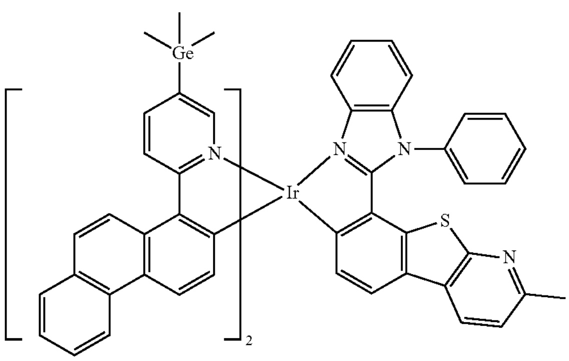
2710
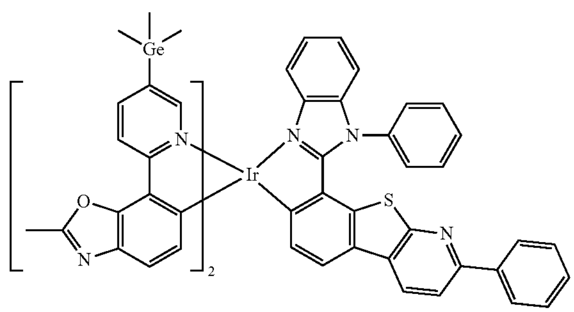
2711
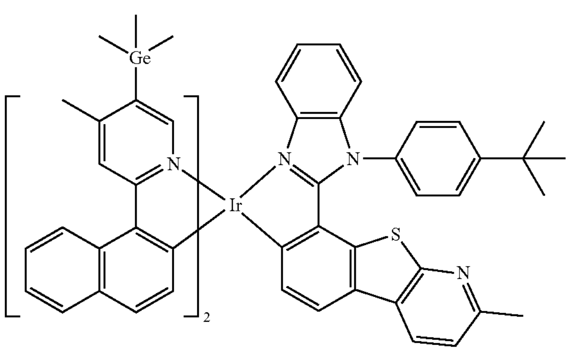
2712
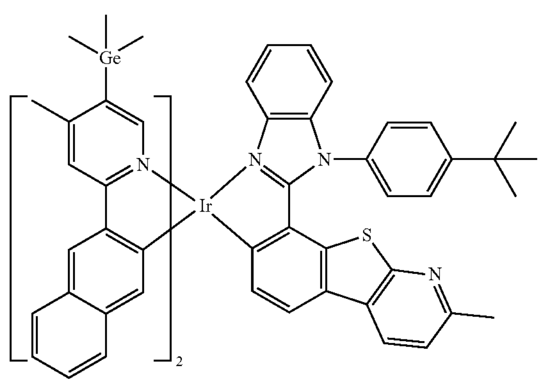

-continued
2713
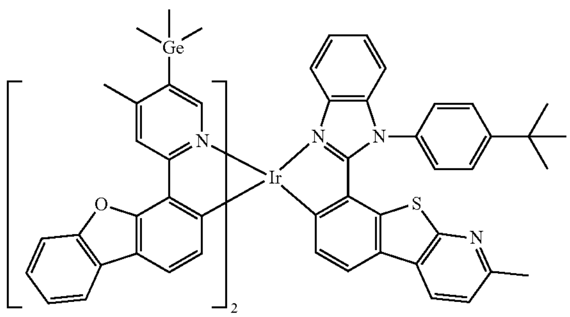
2714
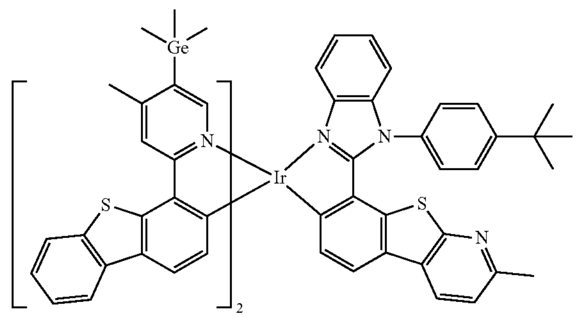
2715
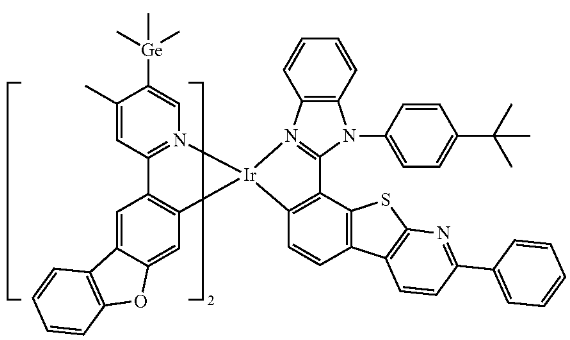
2716
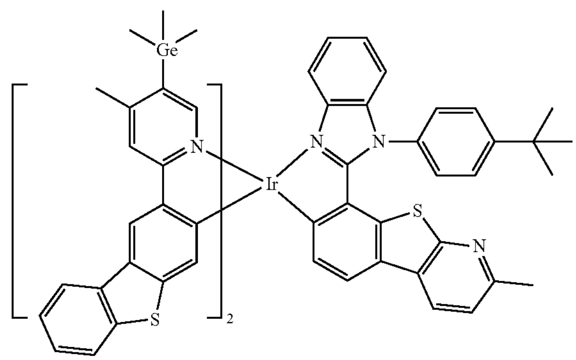
2717
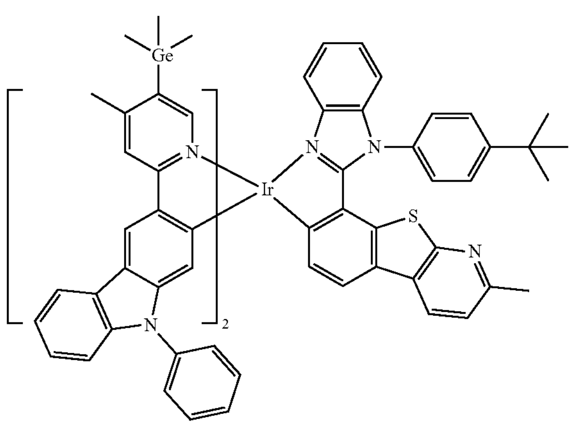
2718
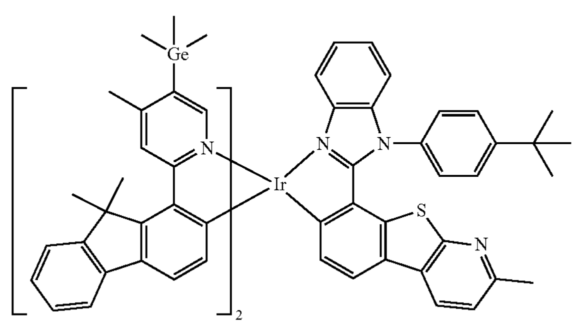
2719
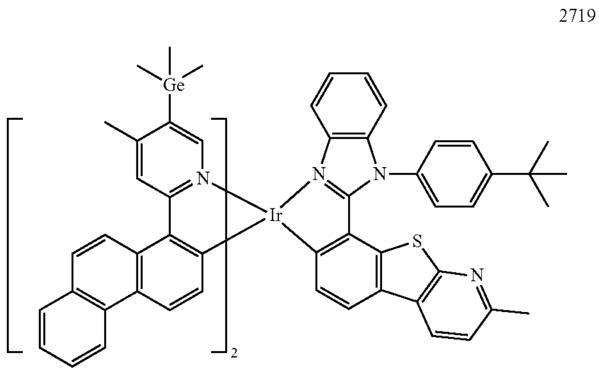
2720
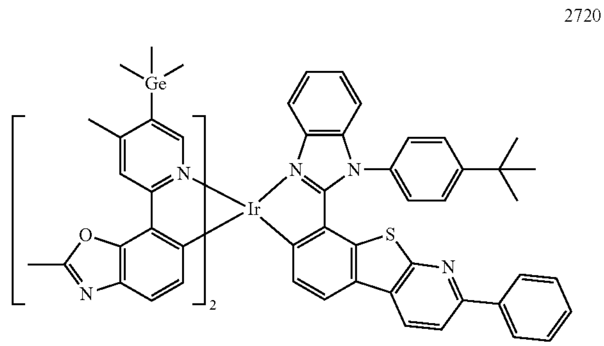

-continued
2721
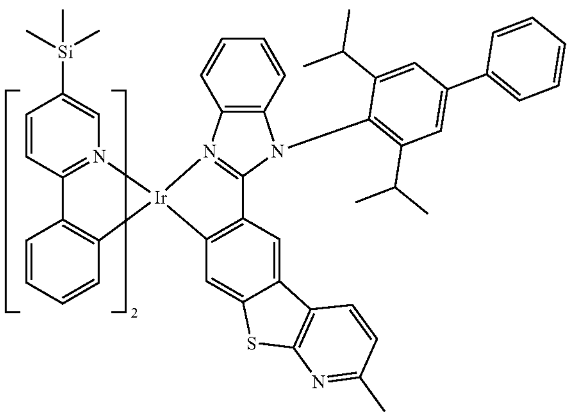
2722
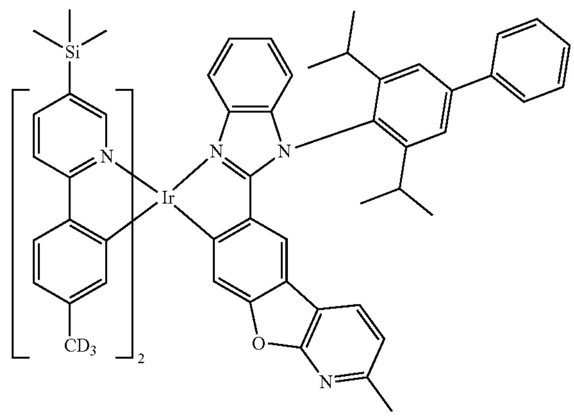
2723
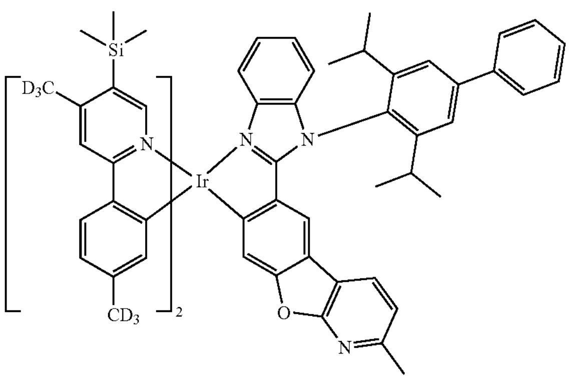
2724
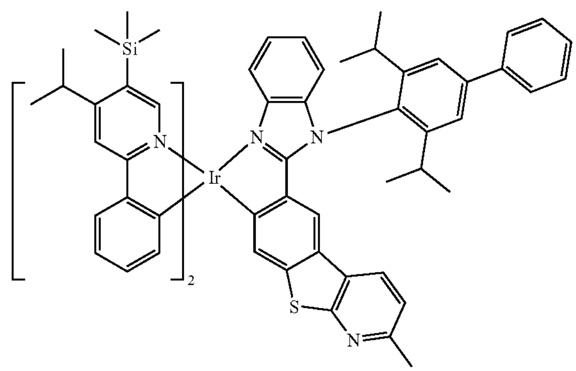
2725
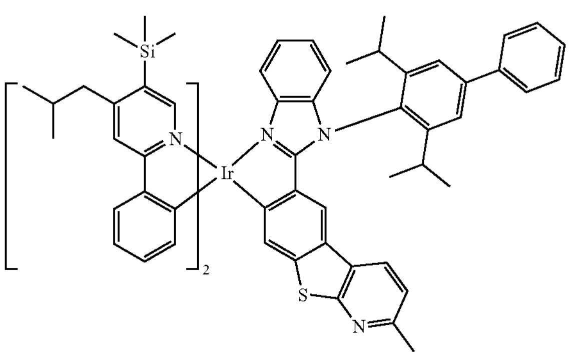
2726
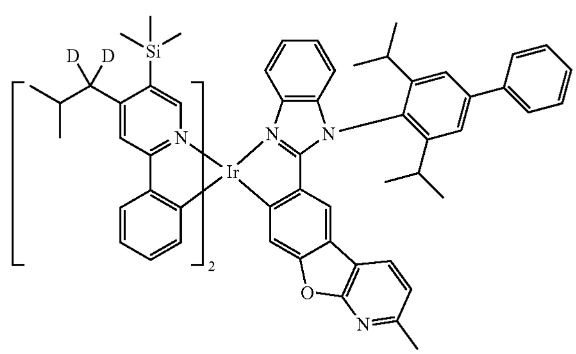
2727
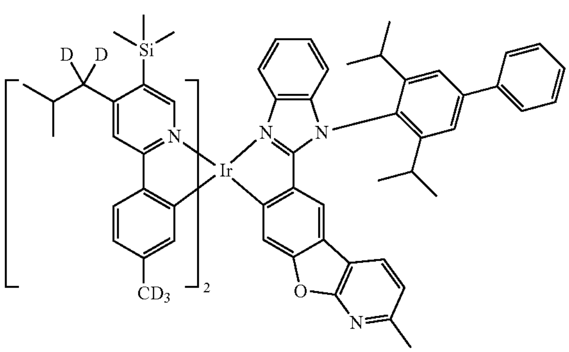
2728
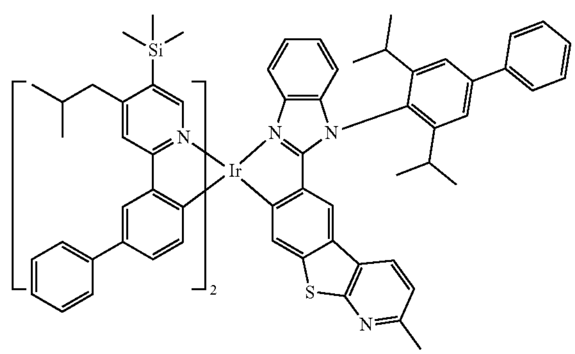

-continued
2729
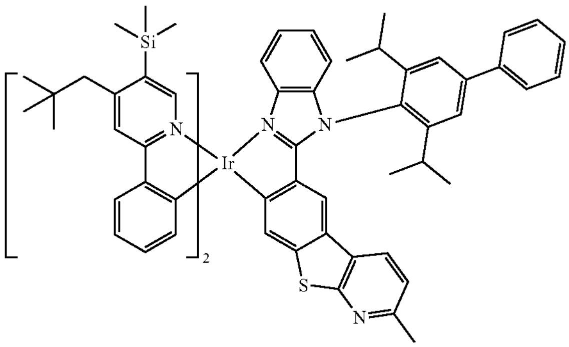
2730
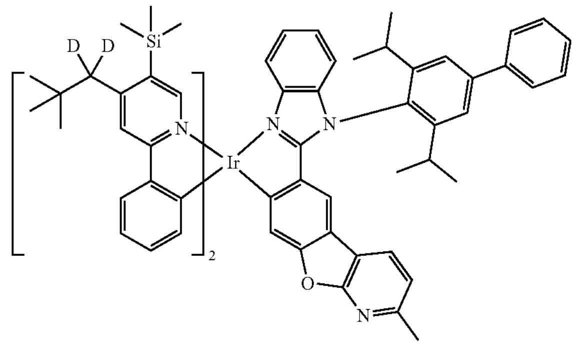
2731
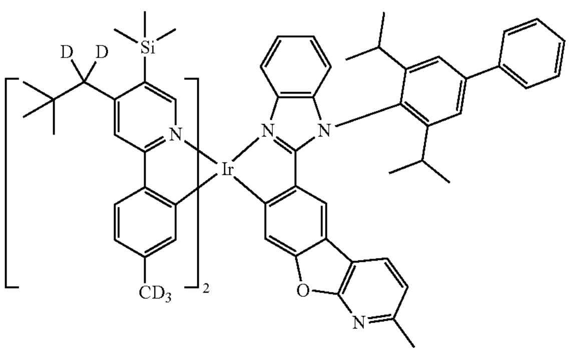
2732
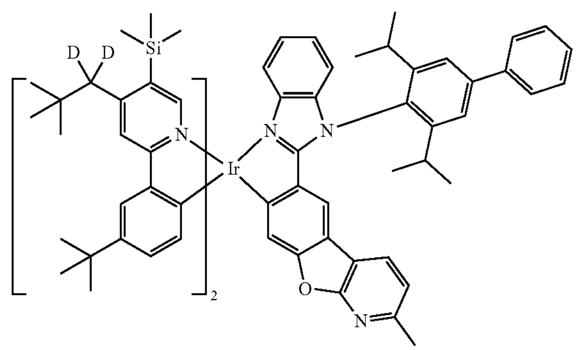
2733
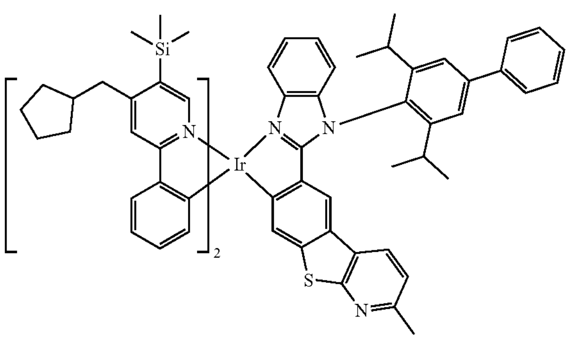
2734
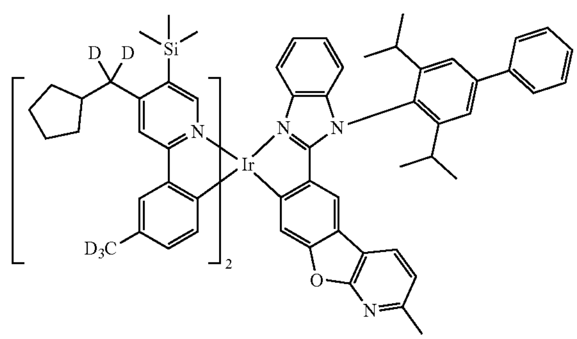
2735
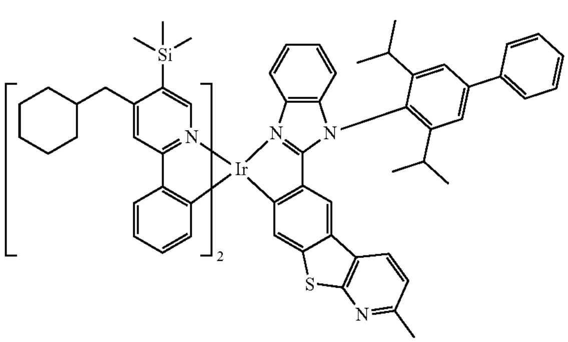
2736
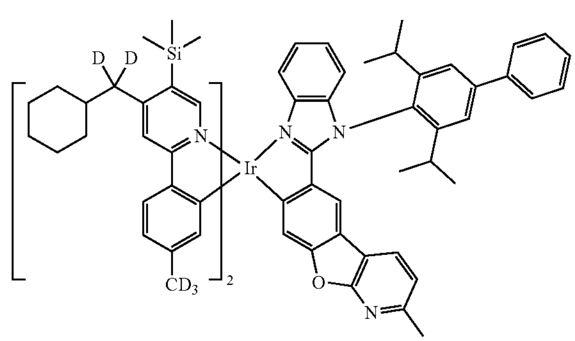

-continued
2737
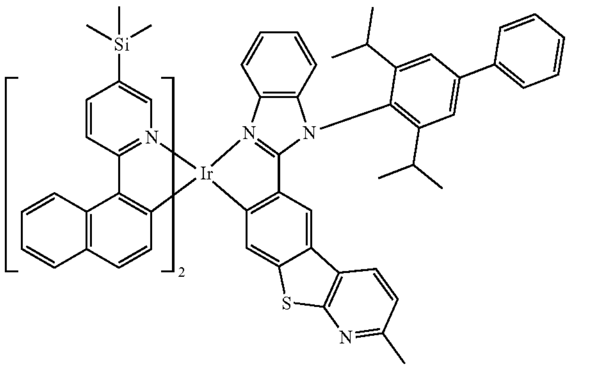
2738
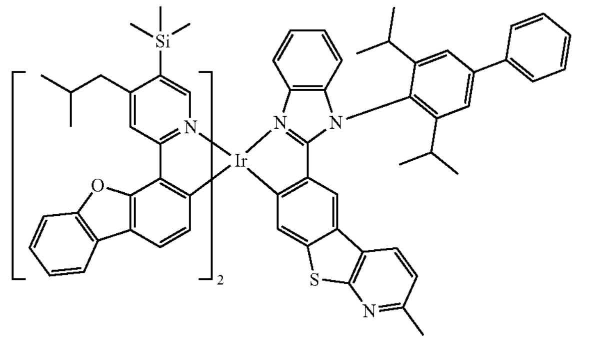
2739
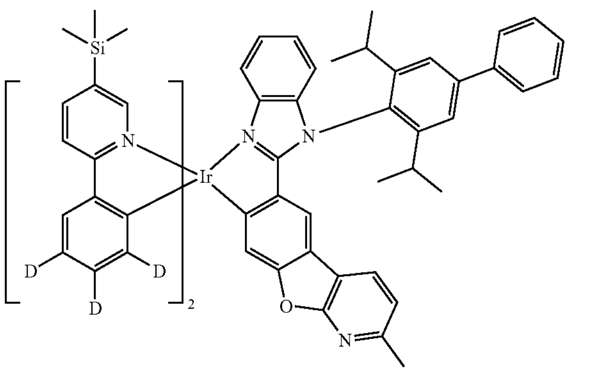
2740
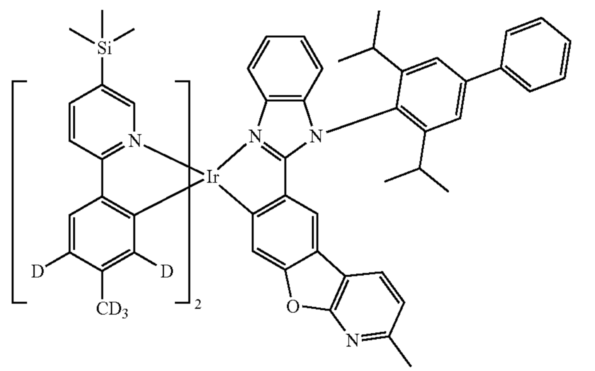
2741
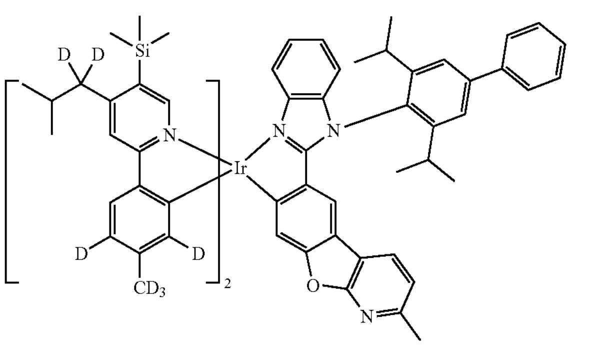
2742
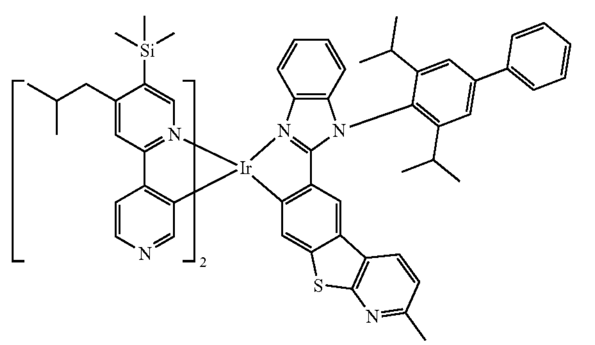
2743
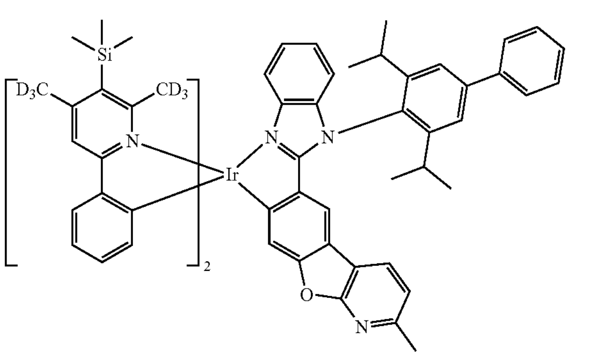
2744
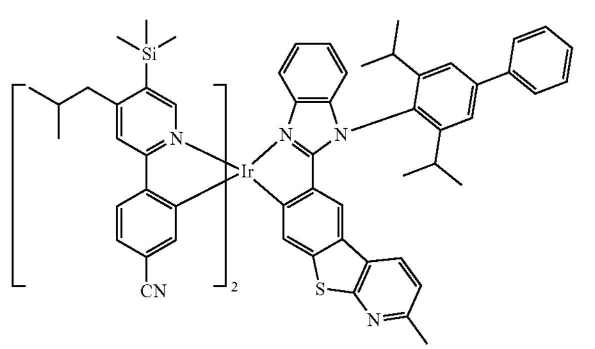

-continued
2745
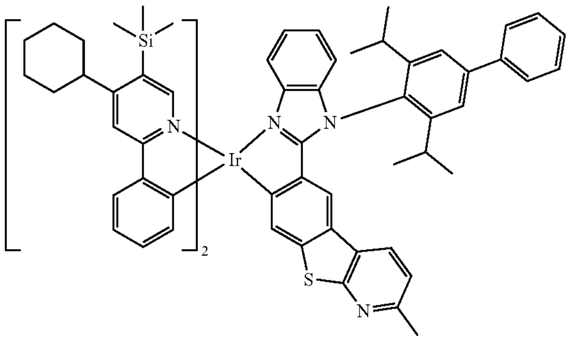
2746
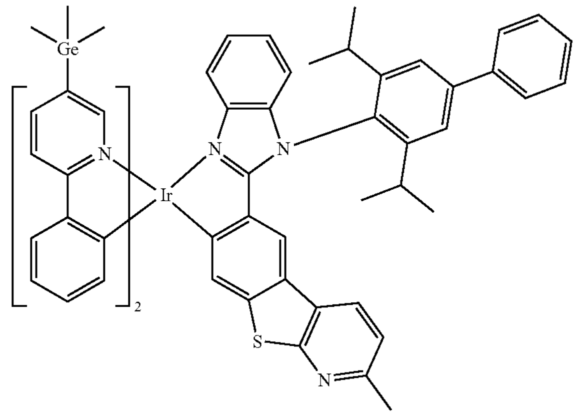
2747
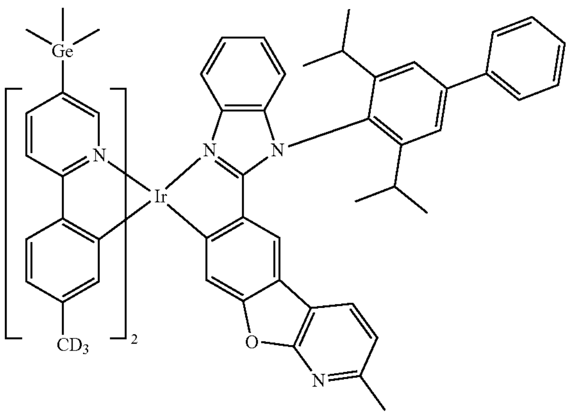
2748
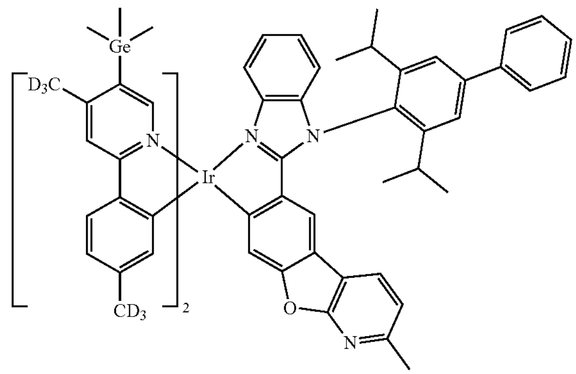
2749
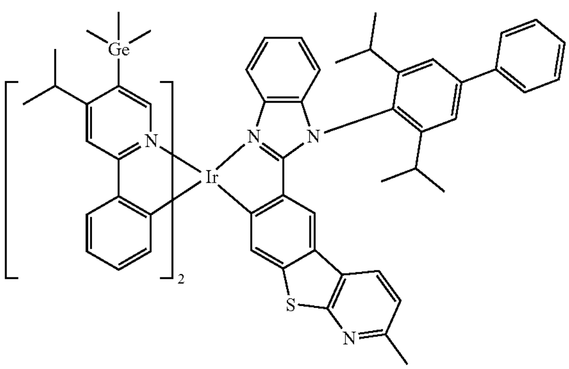
2750
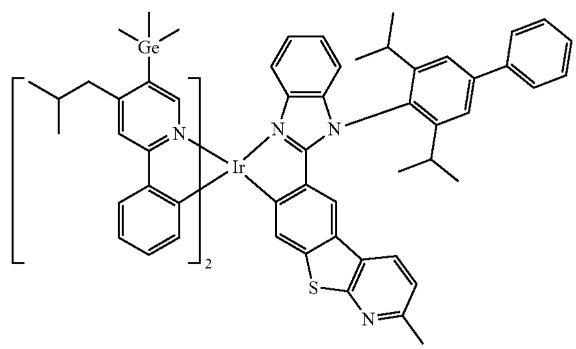
2751
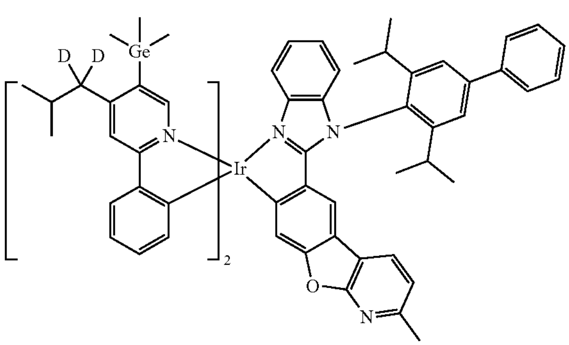
2752
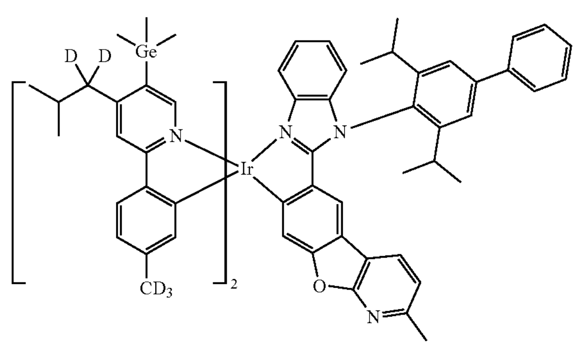

-continued
2753
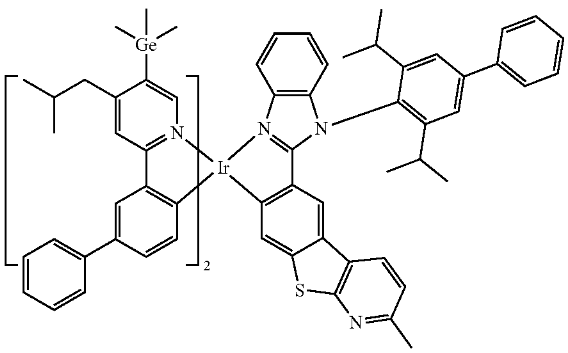
2754
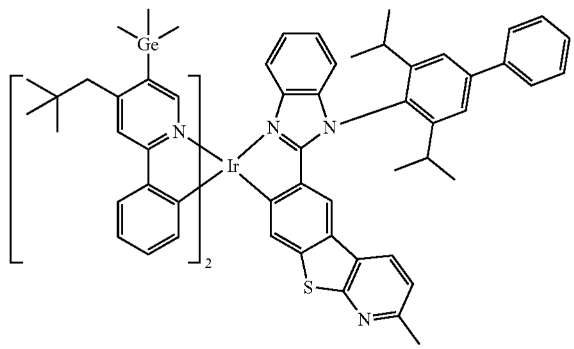
2755
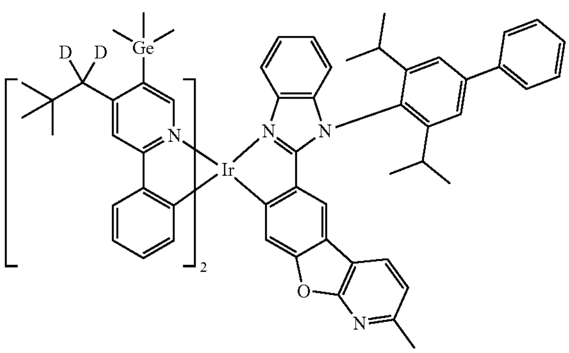
2756
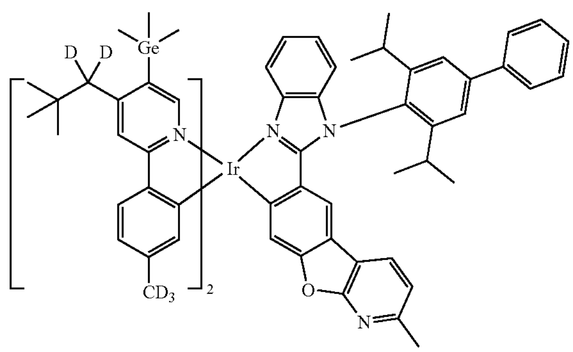
2757
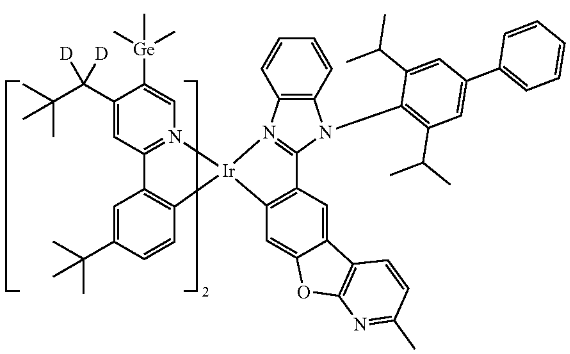
2758
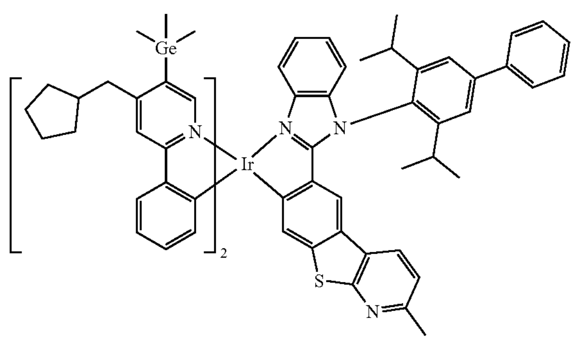
2759
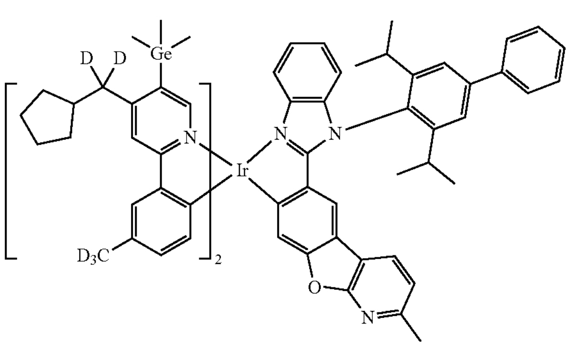
2760
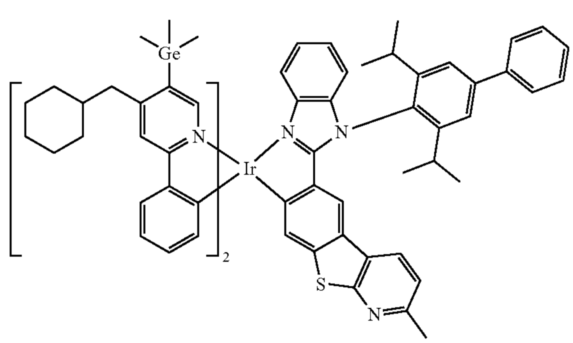

-continued
2761
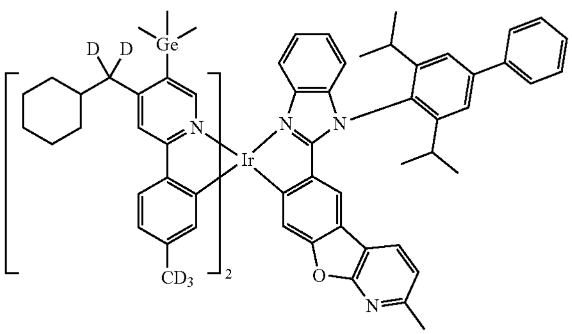
2762
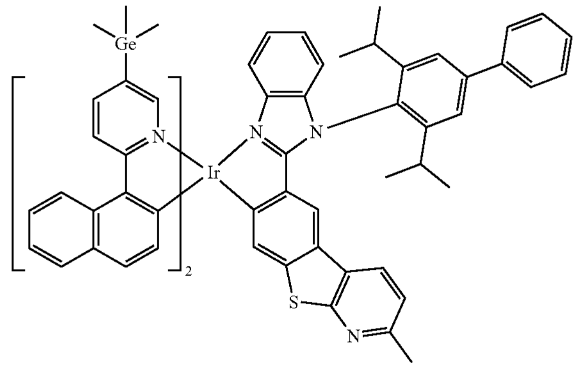
2763
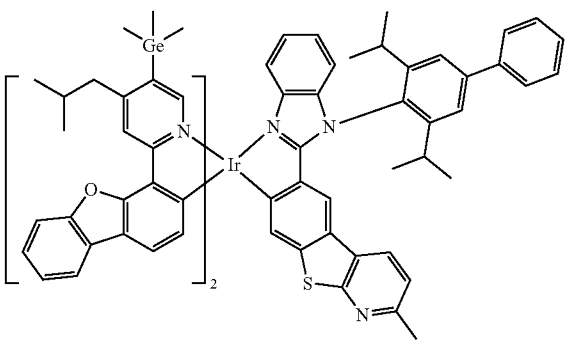
2764
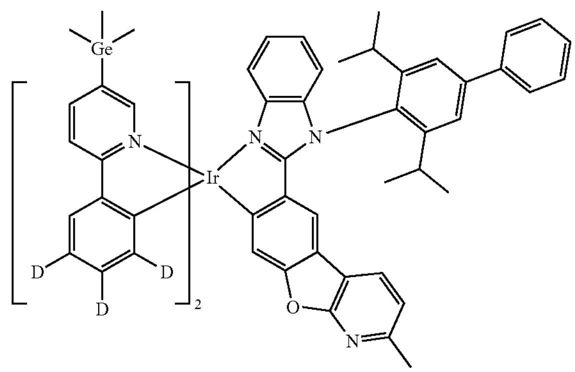
2765
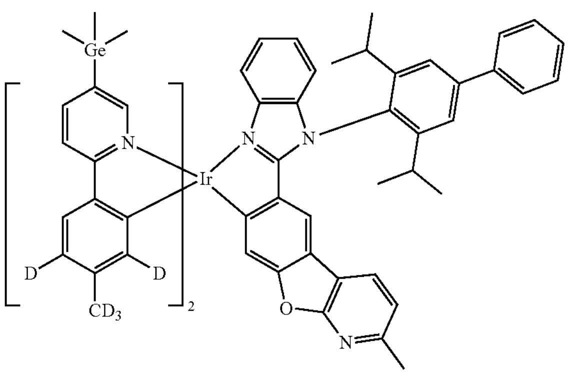
2766
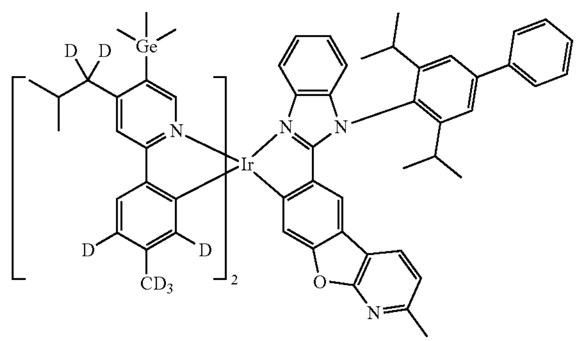
2767
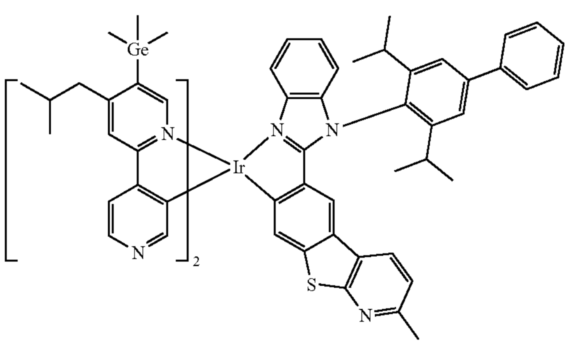
2768
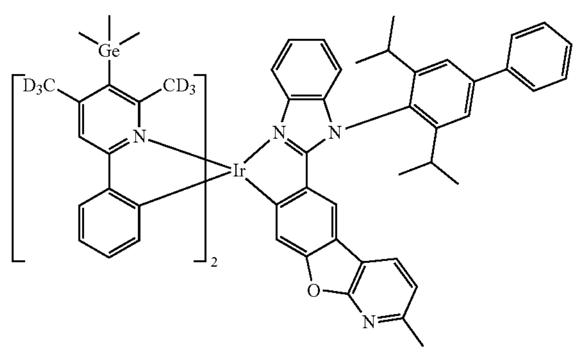

-continued
2769
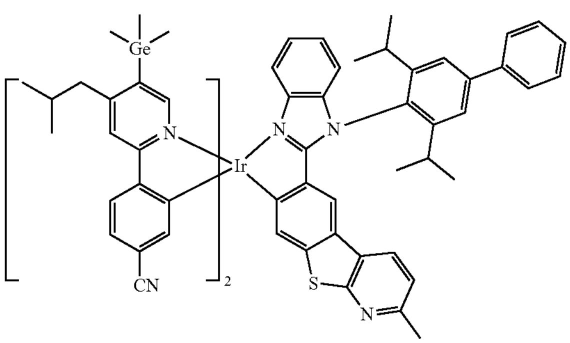
2770
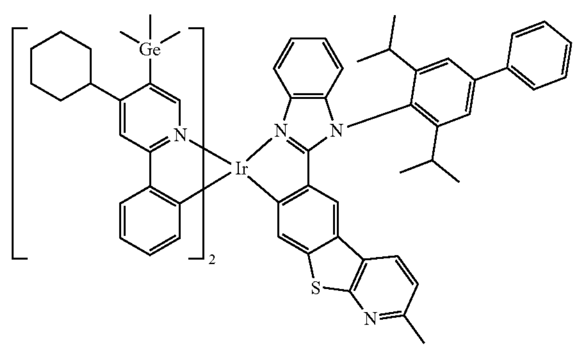
2771
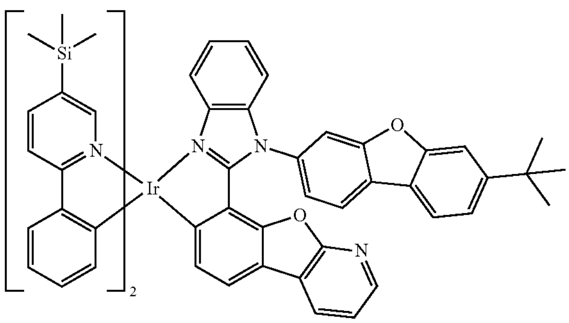
2772
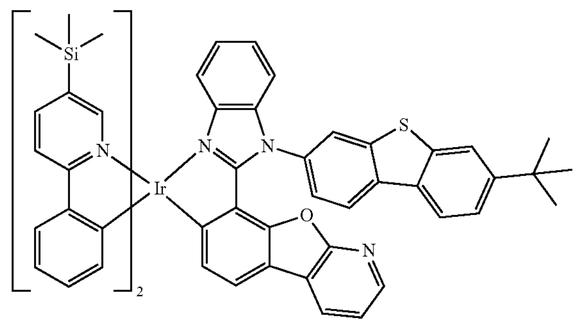
2773
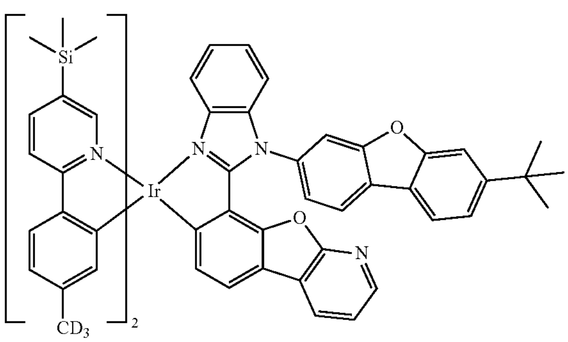
2774
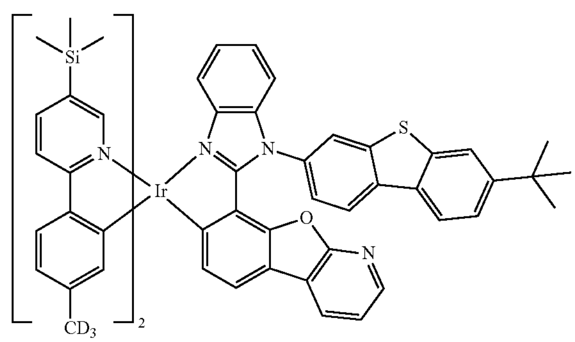
2775
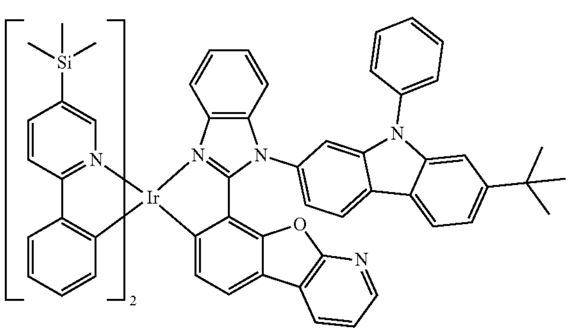
2776
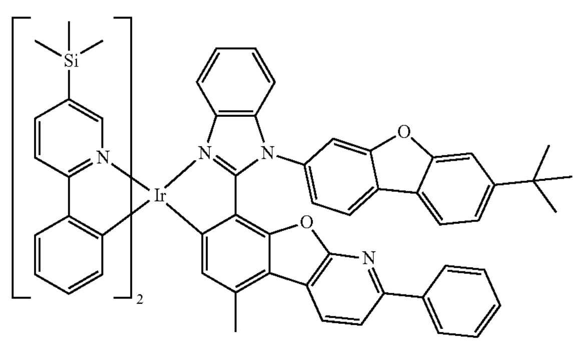

-continued
2777
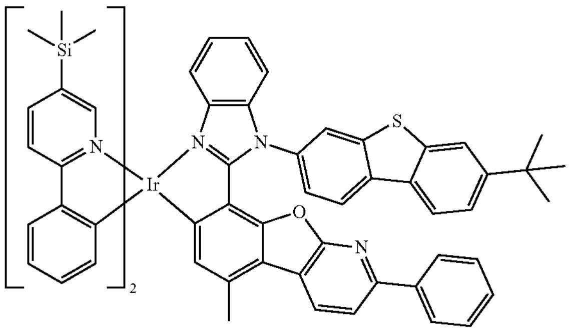
2778
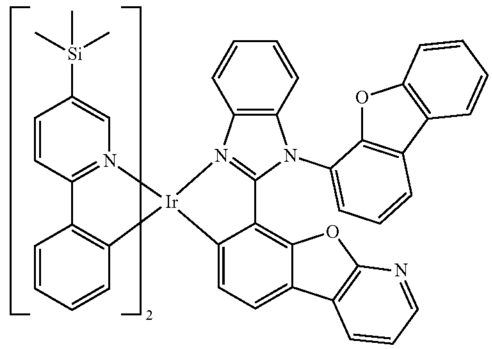
2779
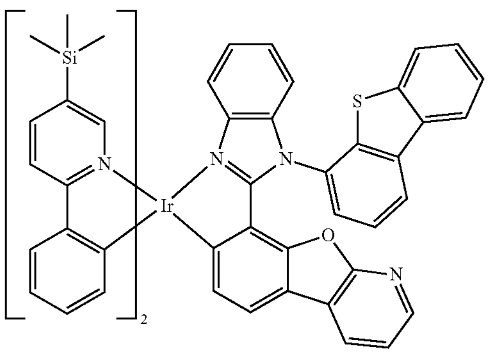
2780
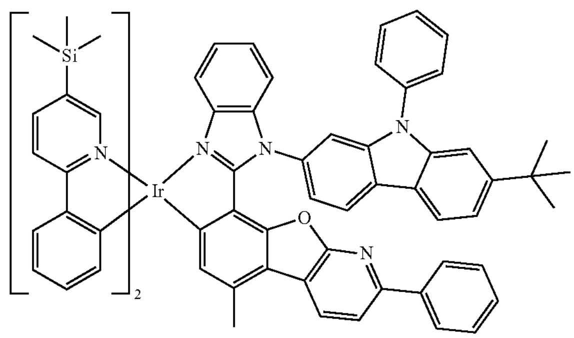
2781
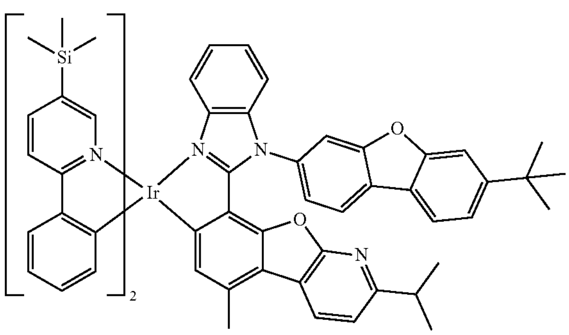
2782
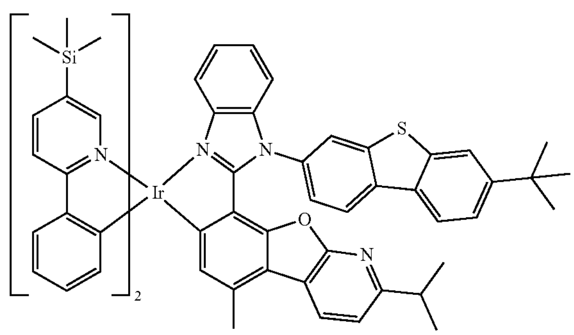
2783
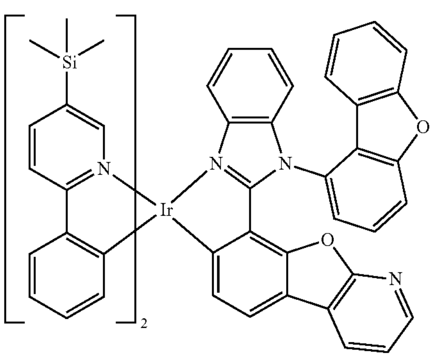
2784
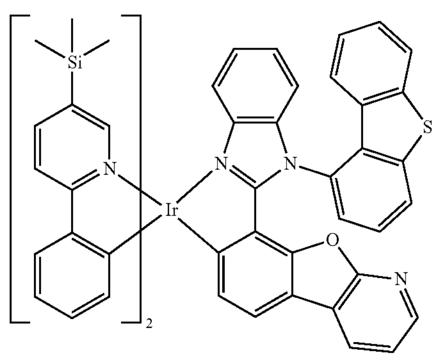

-continued
2785
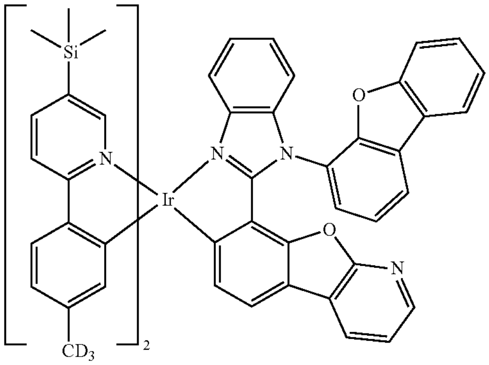
2786
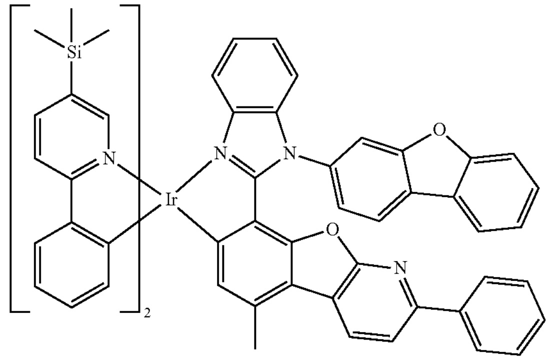
2787
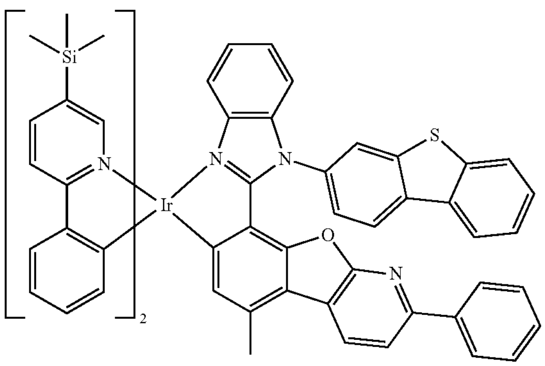
2788
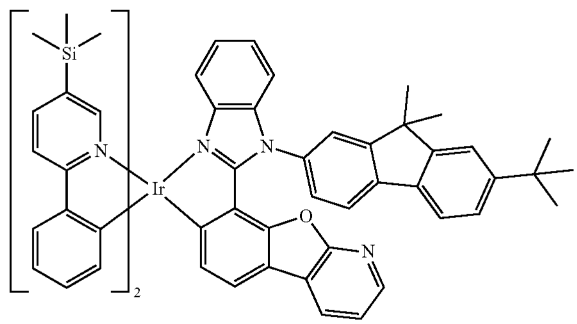
2789
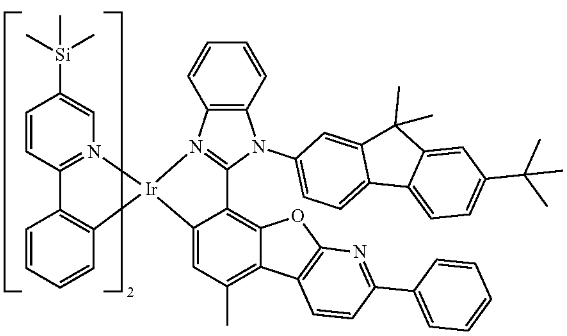
2790
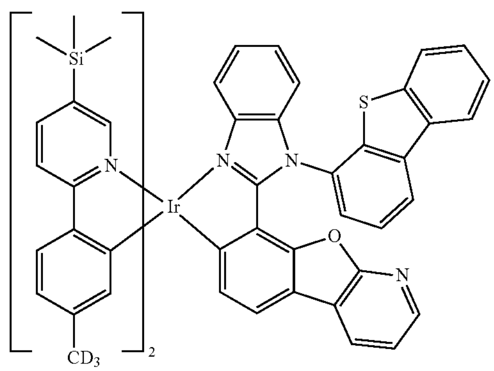
2791
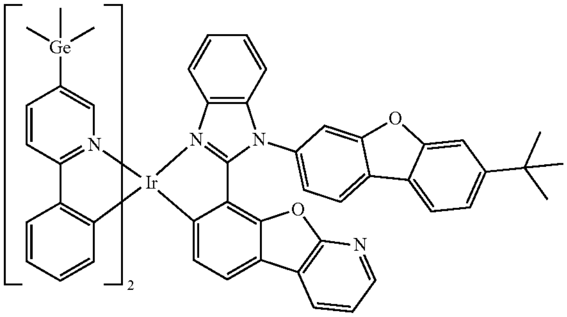
2792
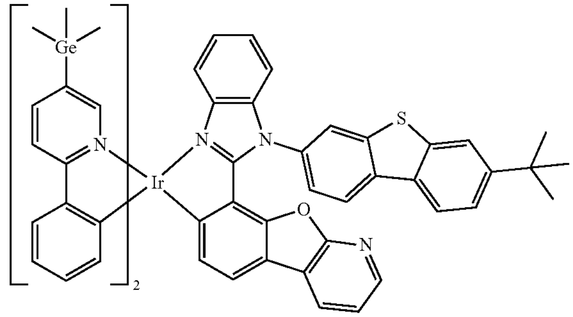

-continued
2793
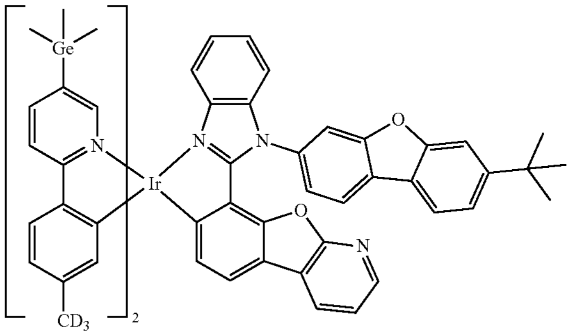
2794
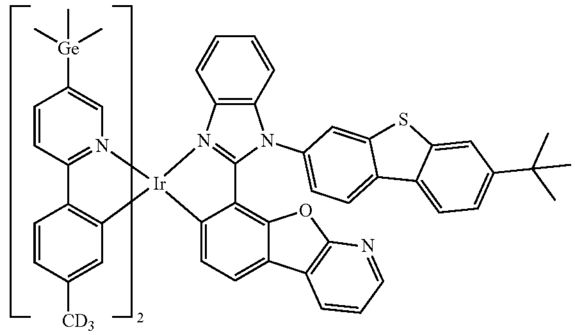
2795
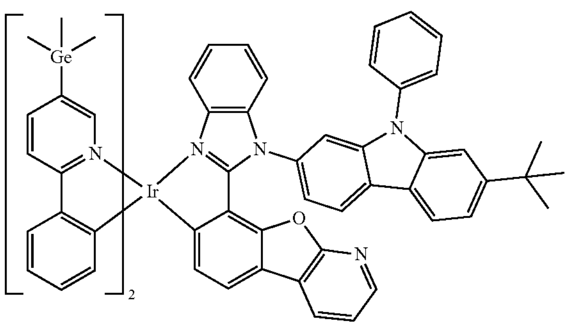
2796
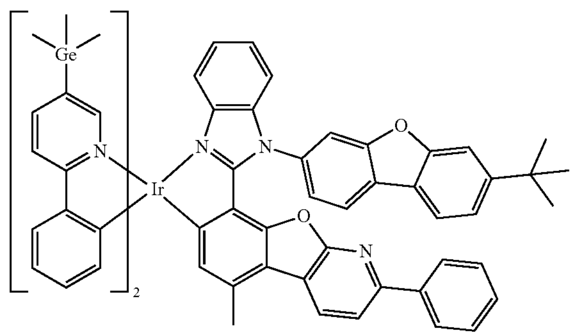
2797
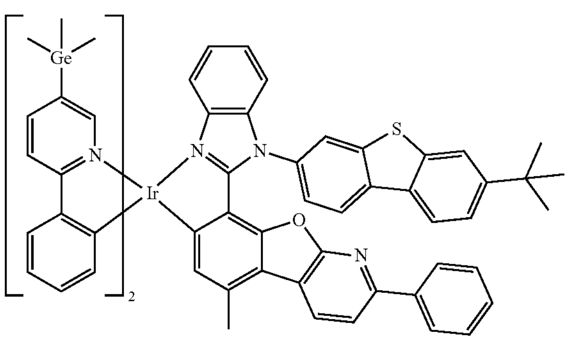
2798
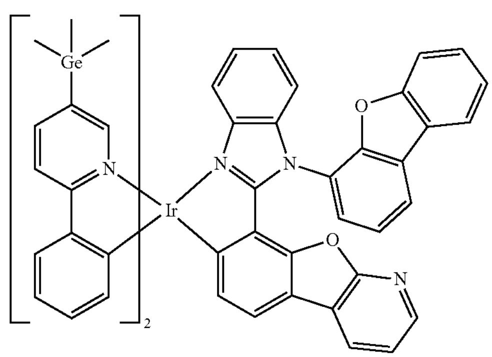
2799
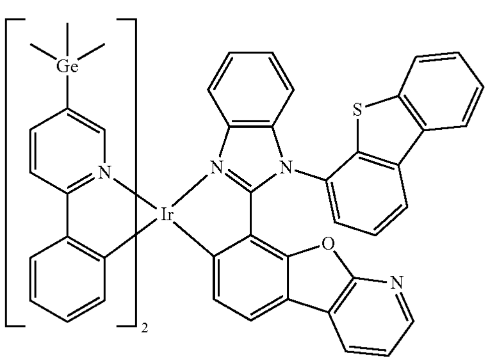
2800
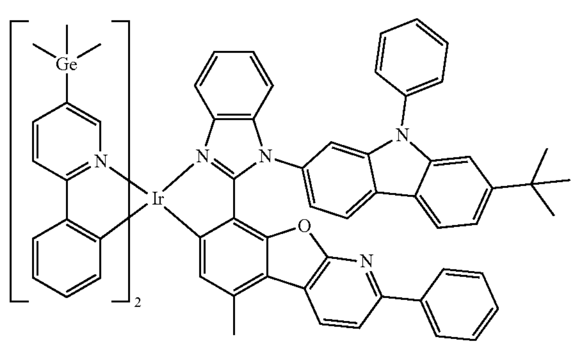

-continued
2801
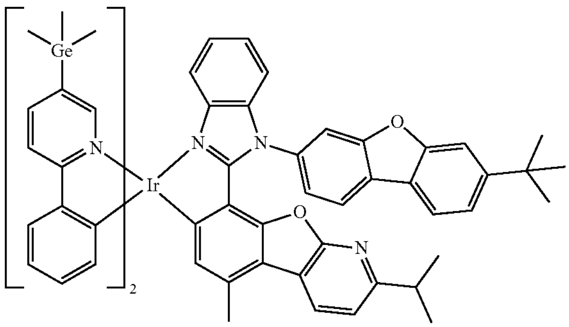
2802
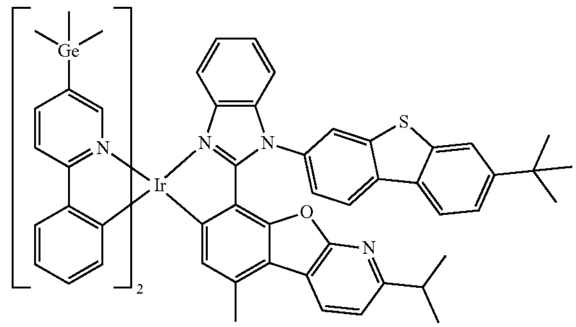
2803
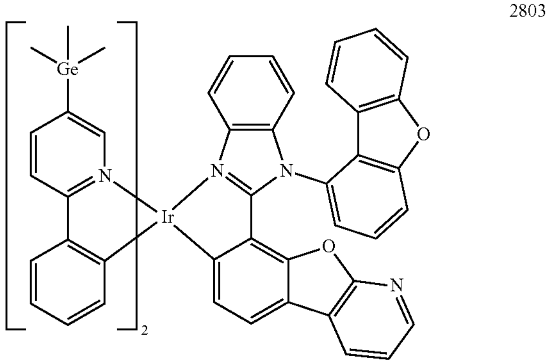
2804
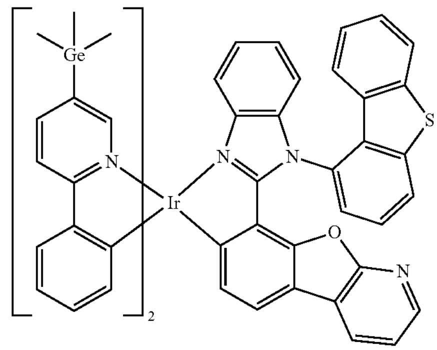
2805
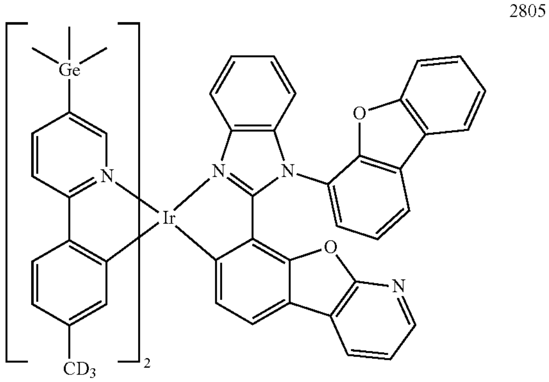
2806
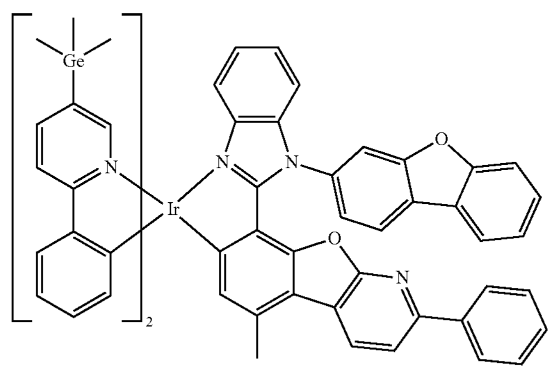
2807
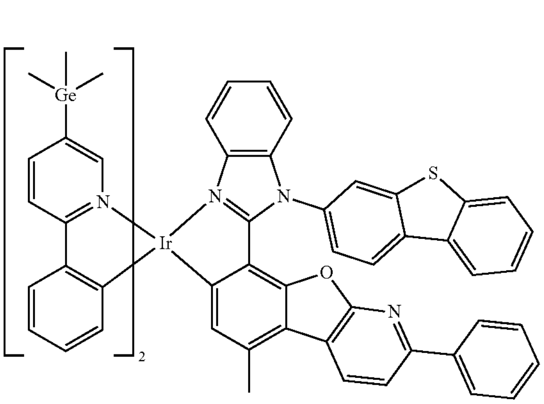
2808
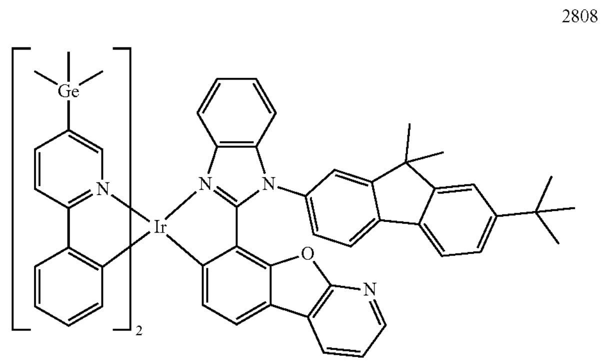

-continued
2809
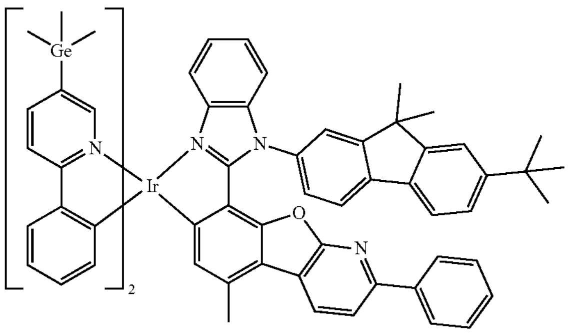
2810
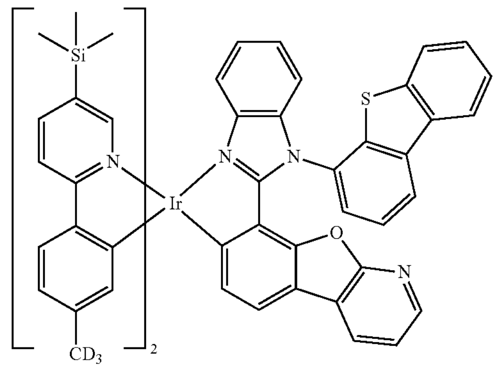
2811
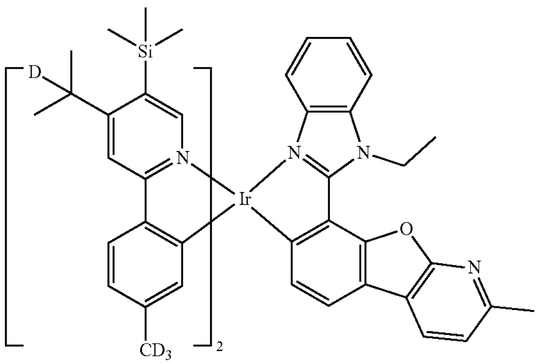
2812
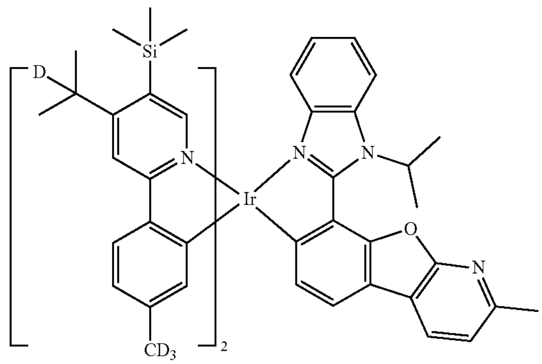
2813
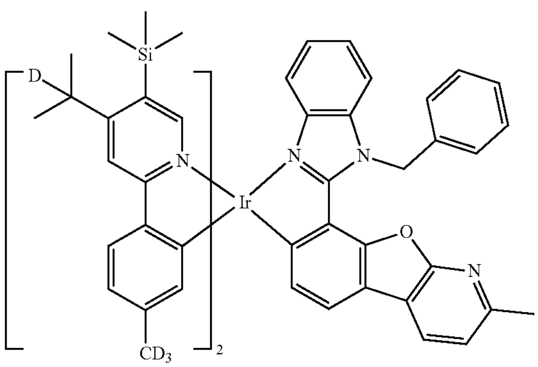
2814
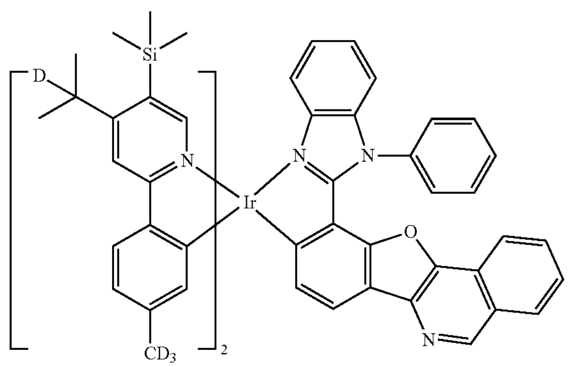
2815
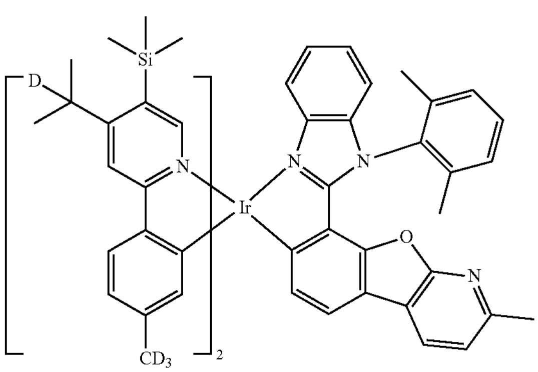
2816
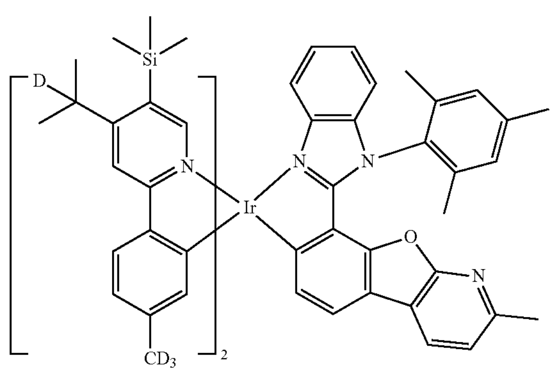

-continued
2817
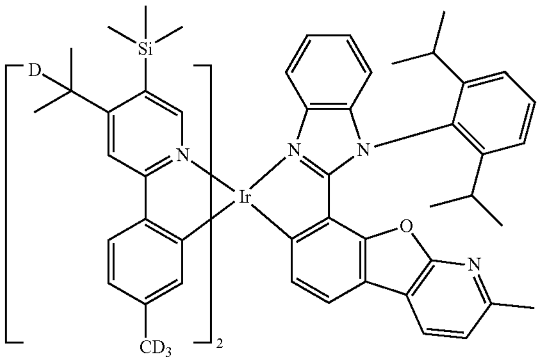
2818
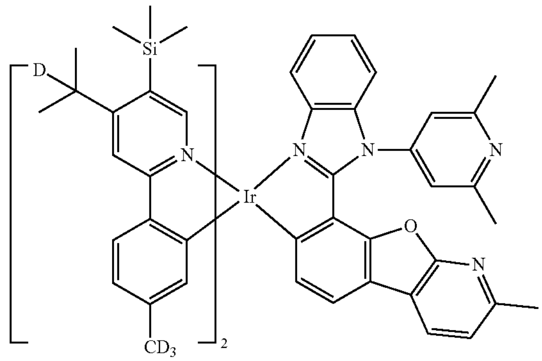
2819
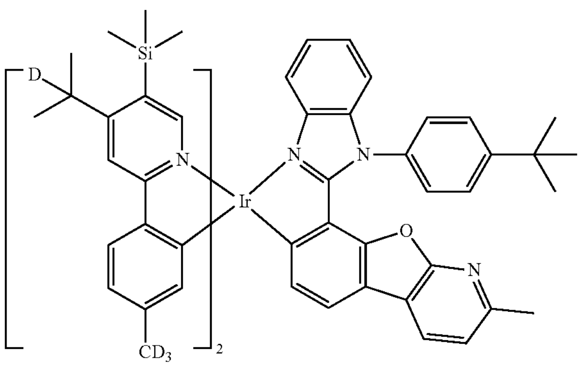
2820
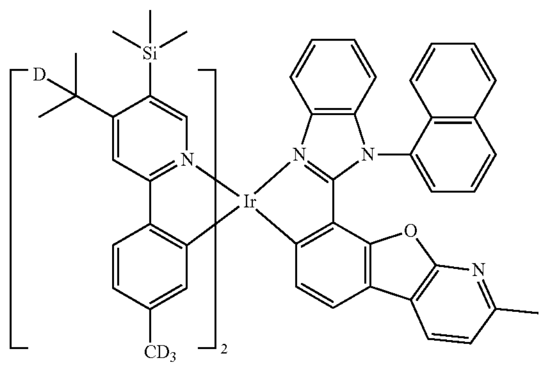
2821
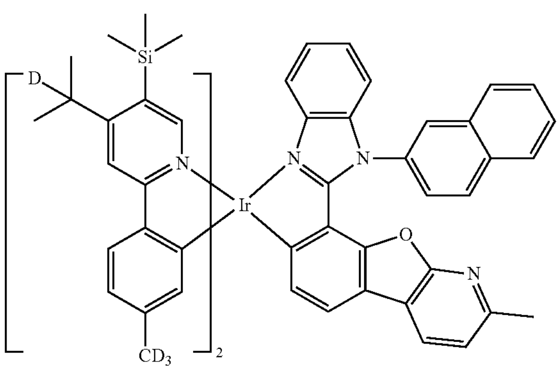
2822
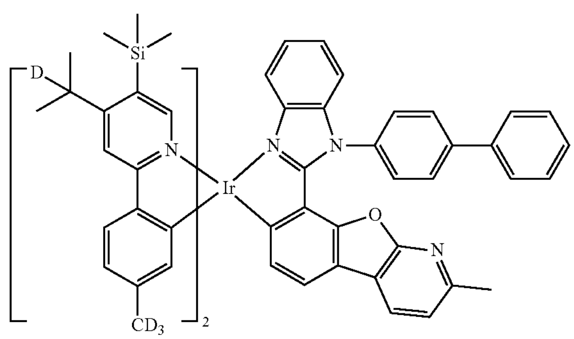
2823
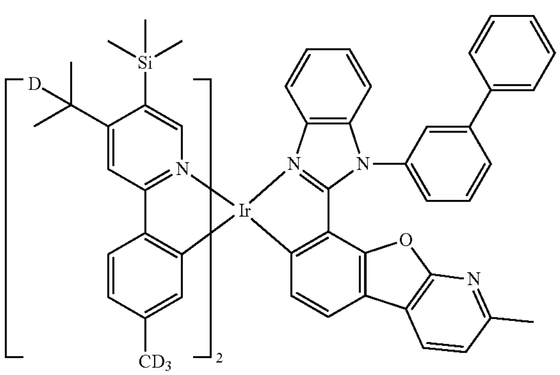
2824
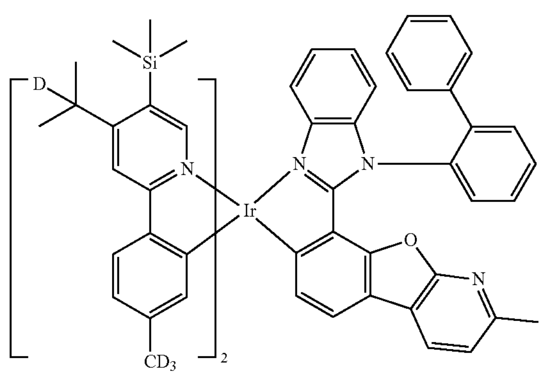

-continued
2825
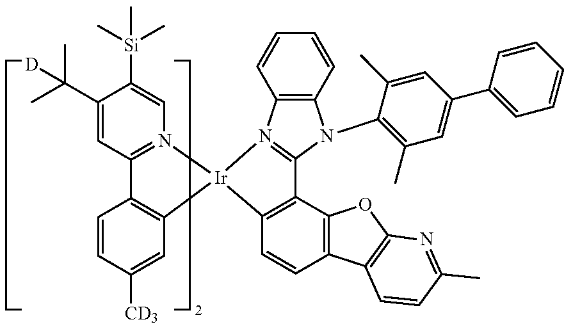
2826
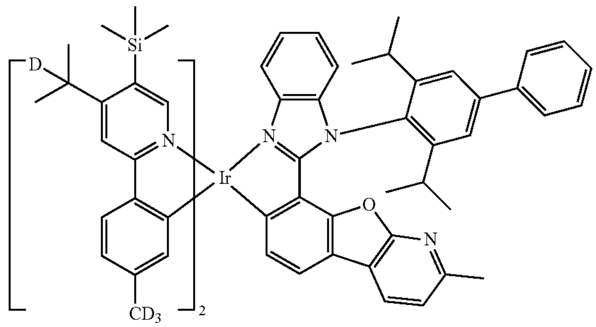
2827
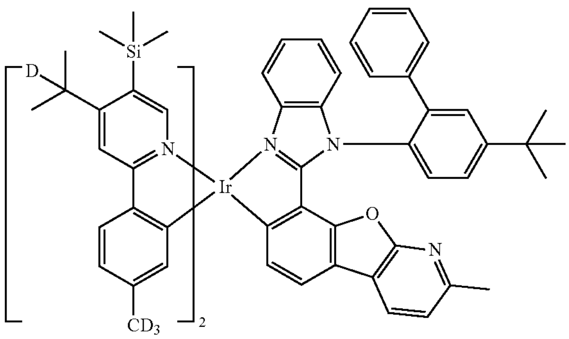
2828
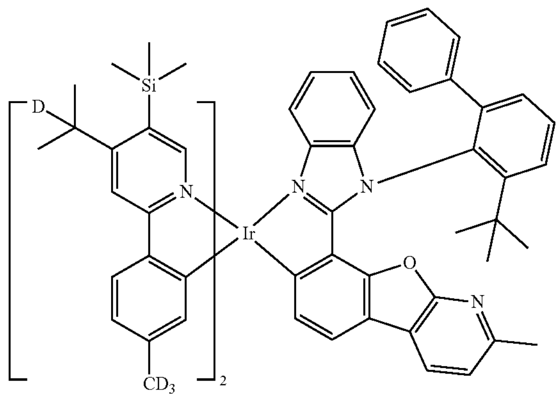
2829
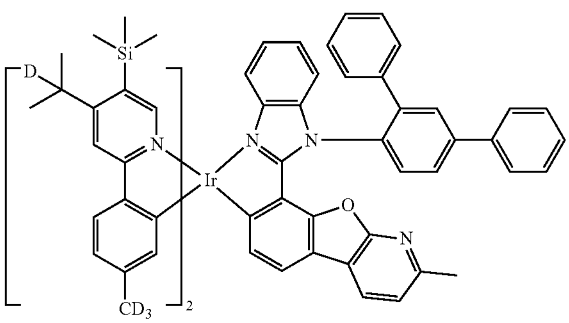
2830
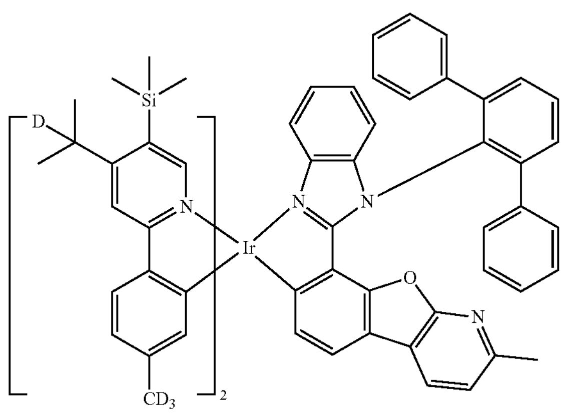
2831
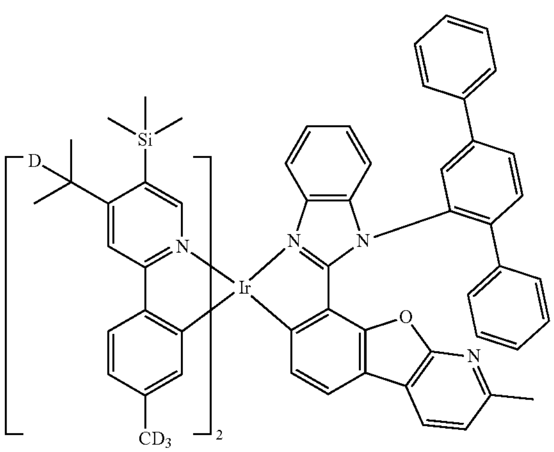
2832
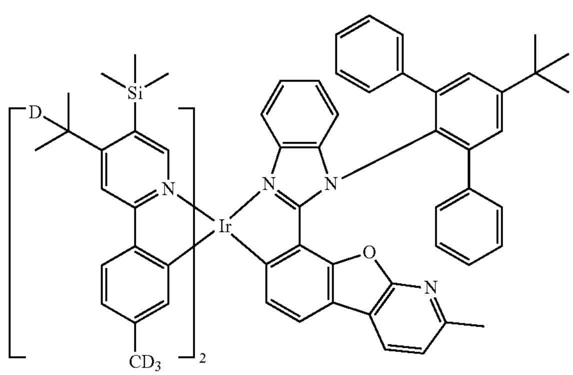

-continued
2833
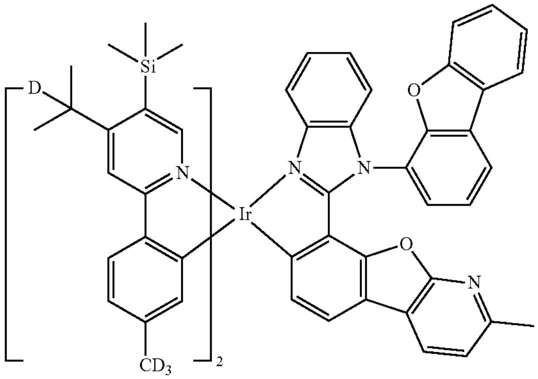
2834
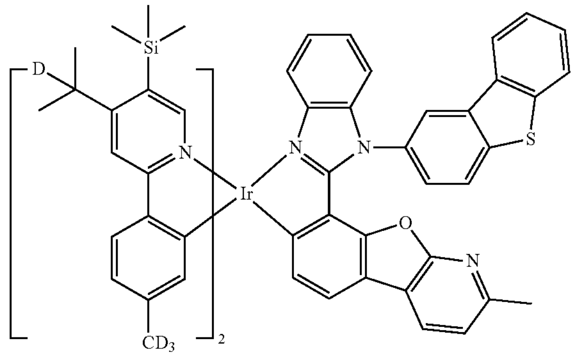
2835
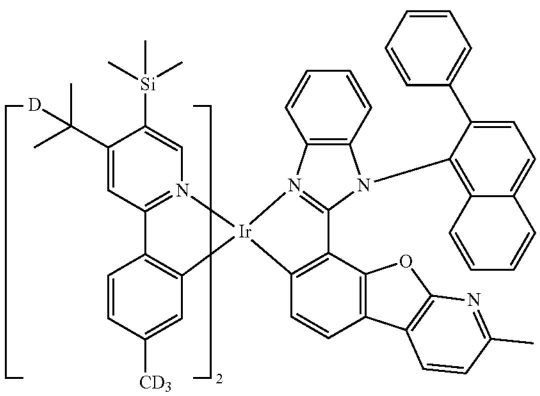
2836
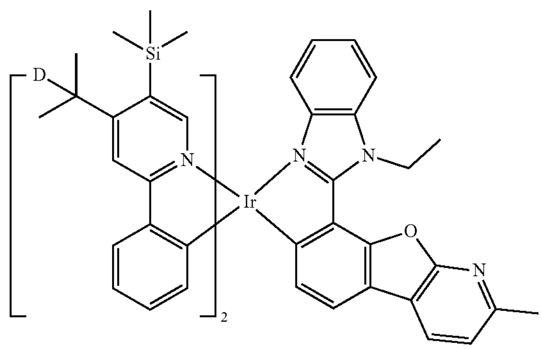
2837
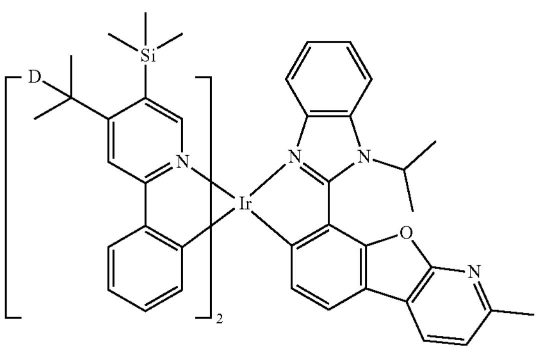
2838
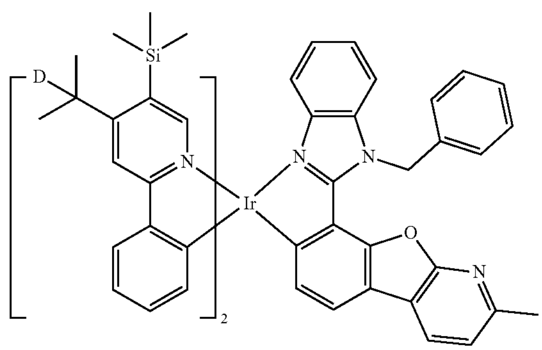
2839
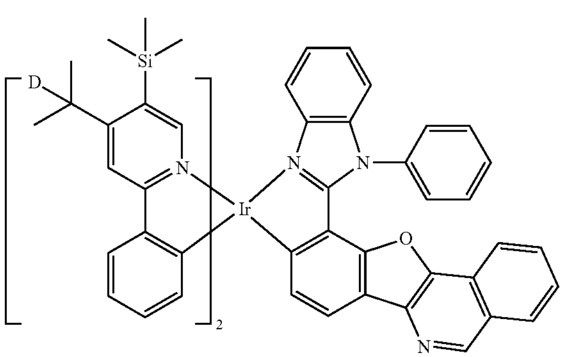
2840
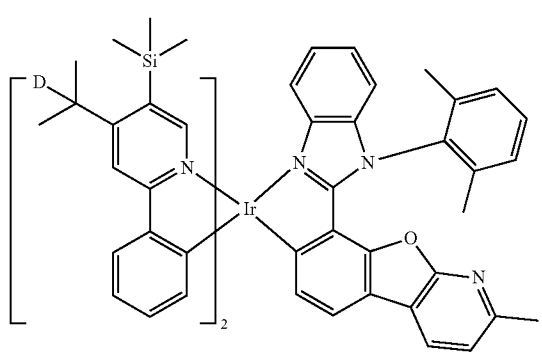

-continued
2841
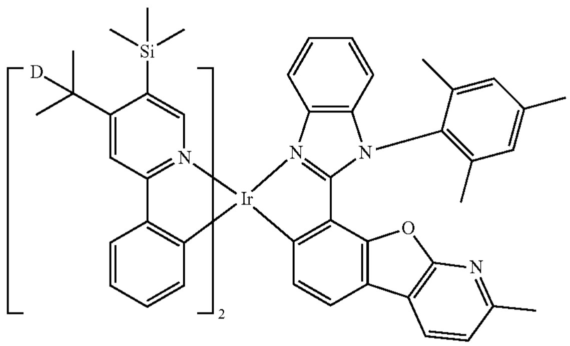
2842
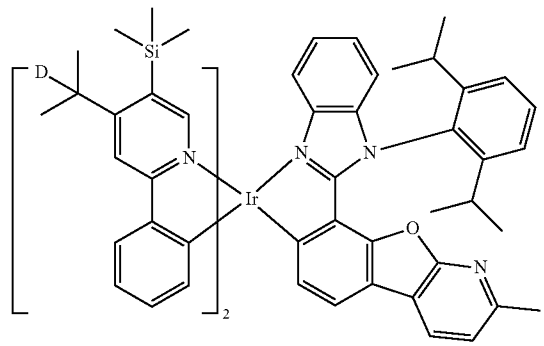
2843
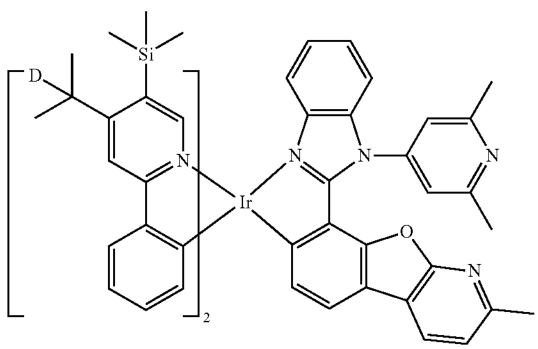
2844
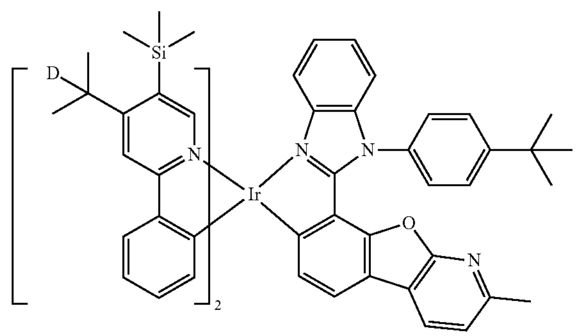
2845
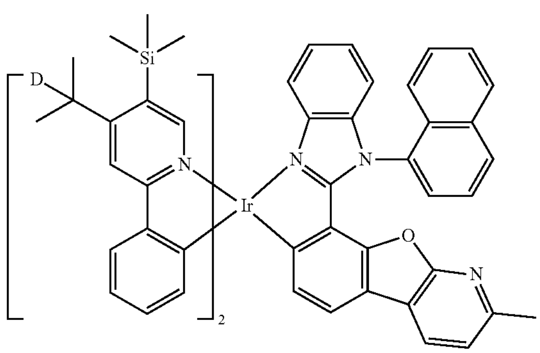
2846
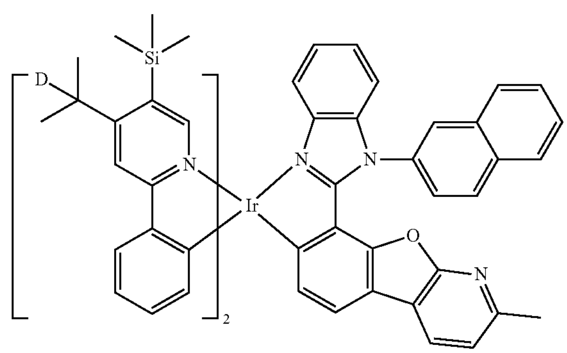
2847
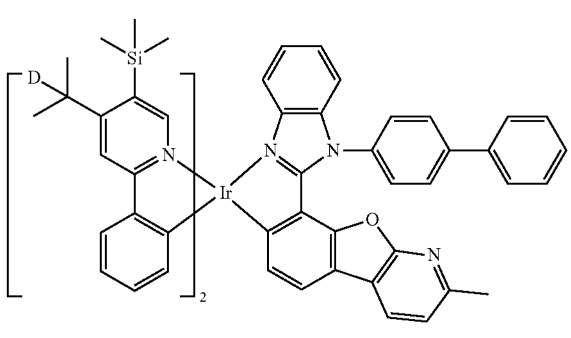
2848
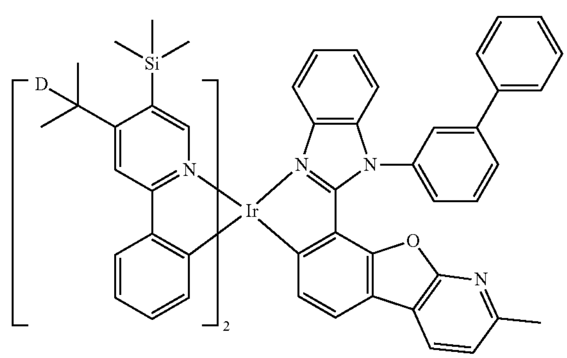

-continued
2849
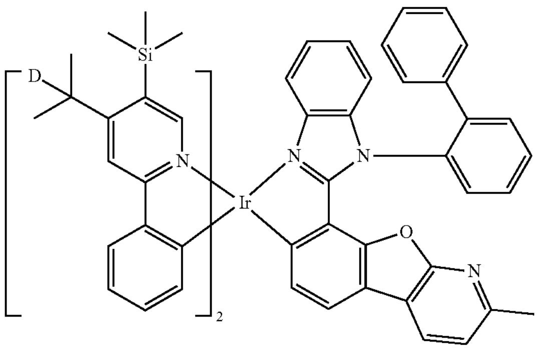
2850
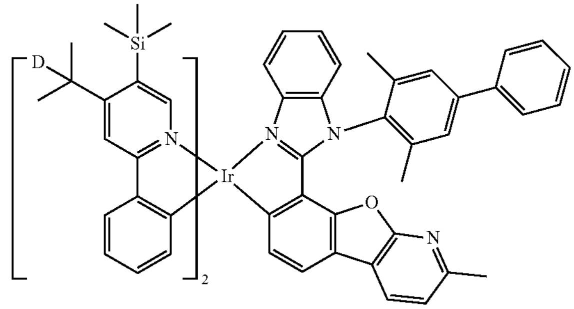
2851
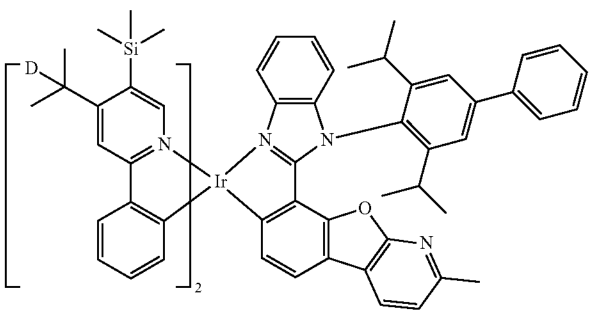
2852
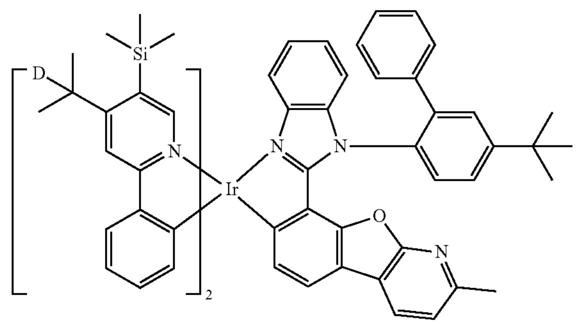
2853
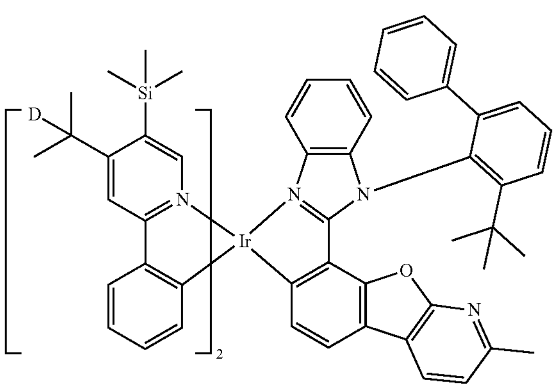
2854
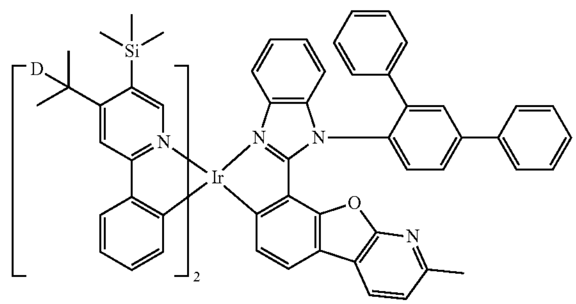
2855
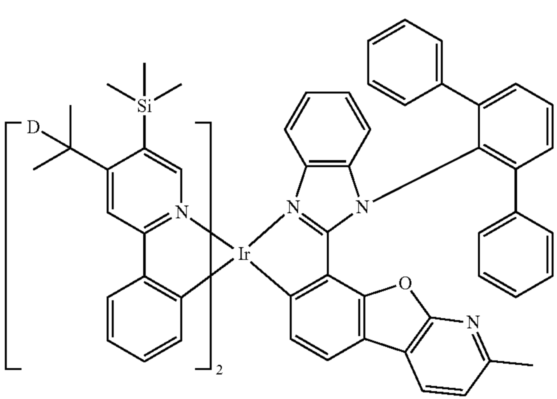
2856
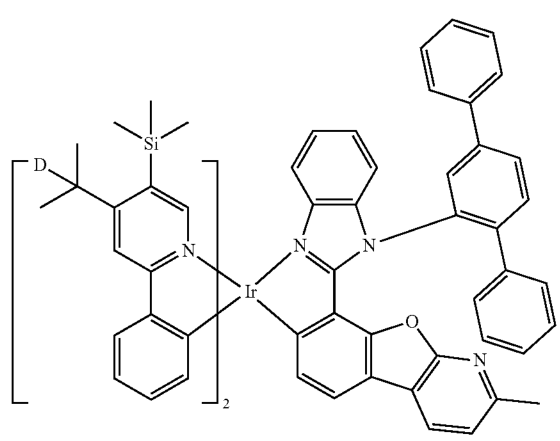

-continued
2857
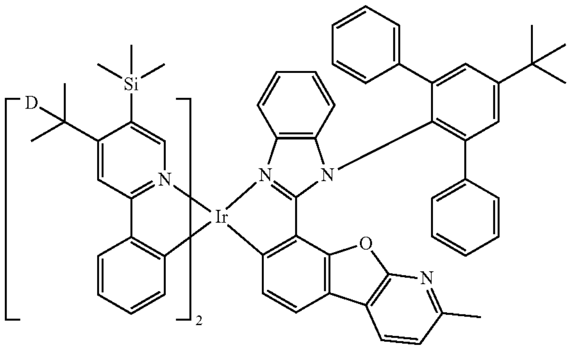
2858
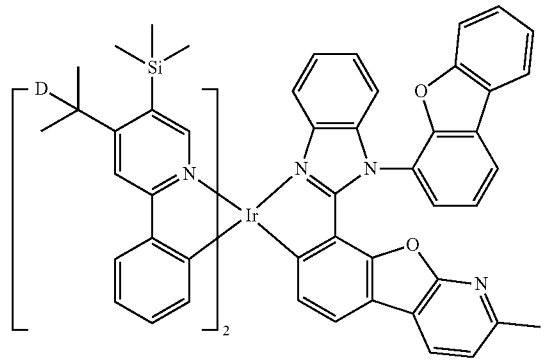
2859
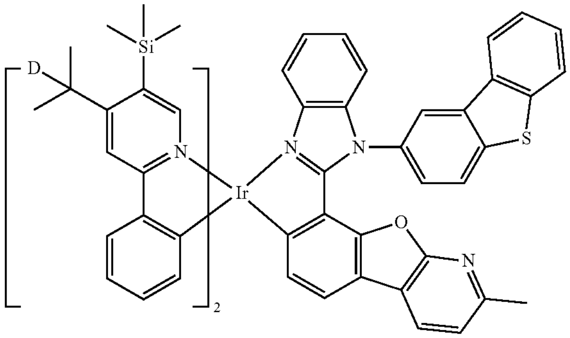
2860
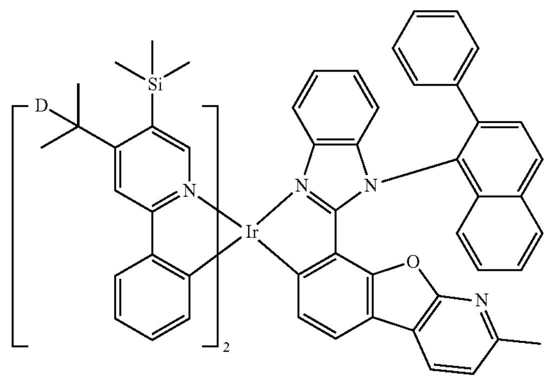
2861
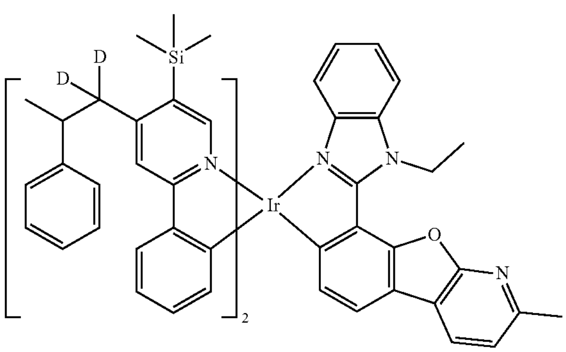
2862
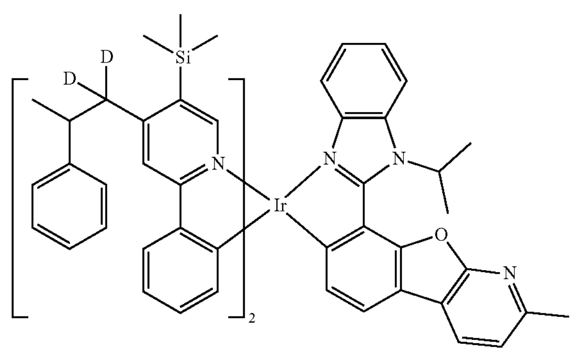
2863
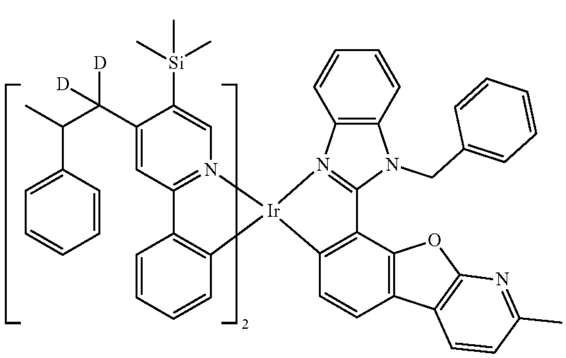
2864
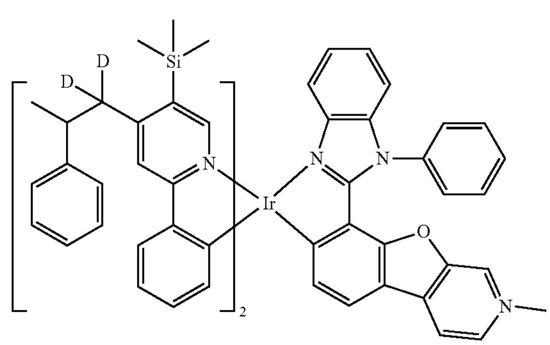

-continued
2865
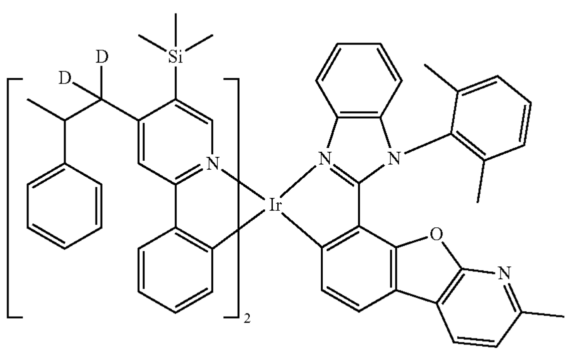
2866
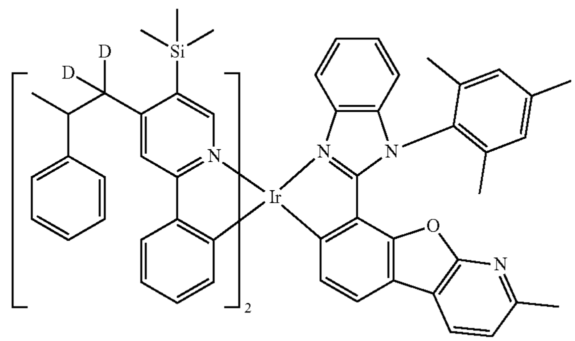
2867
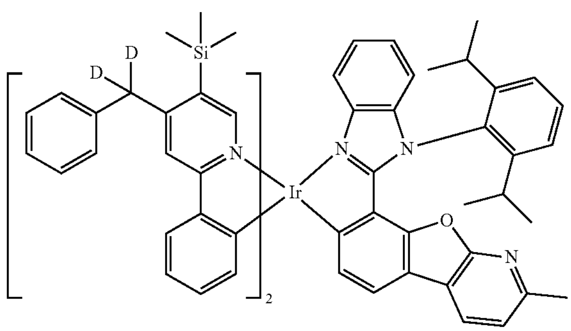
2868
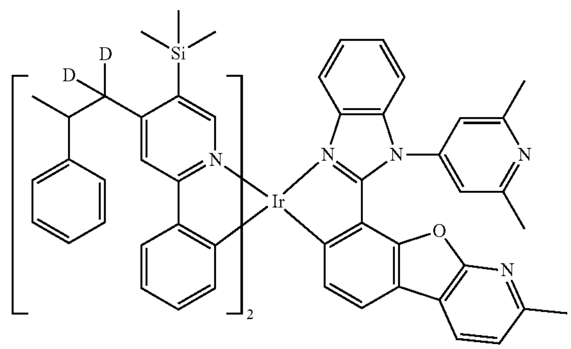
2869
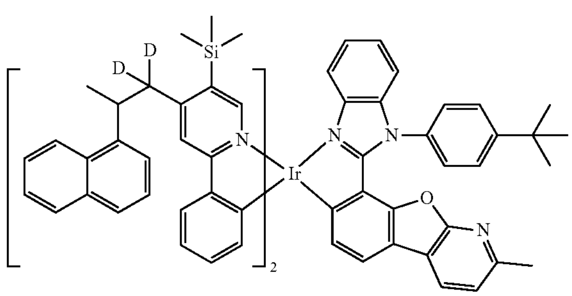
2870
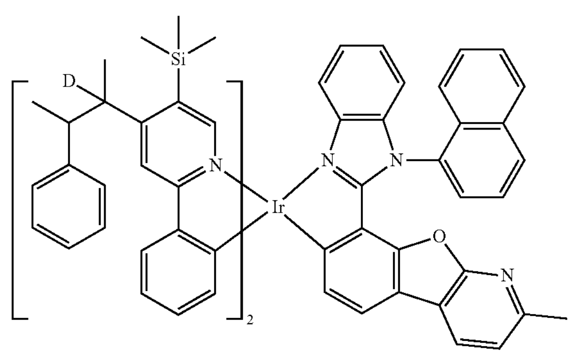
2871
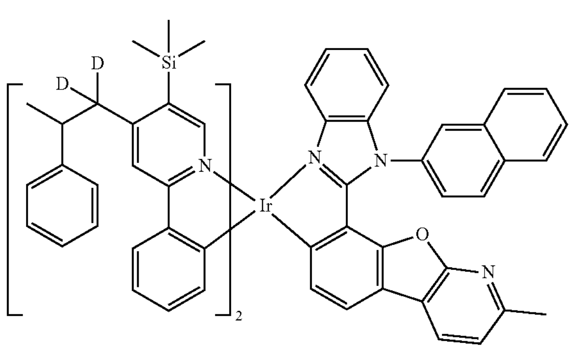
2872
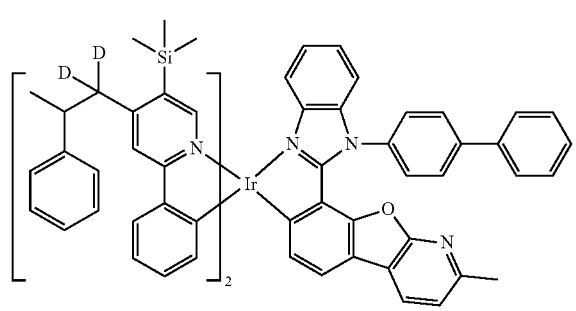

-continued
2873
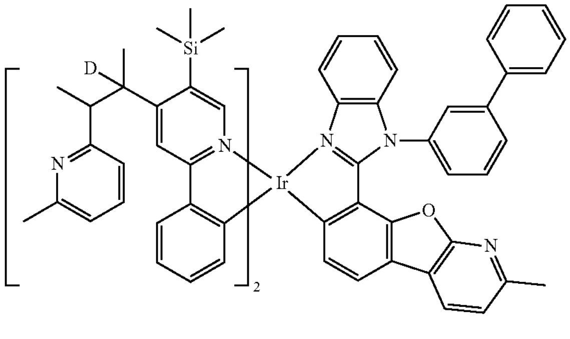
2874
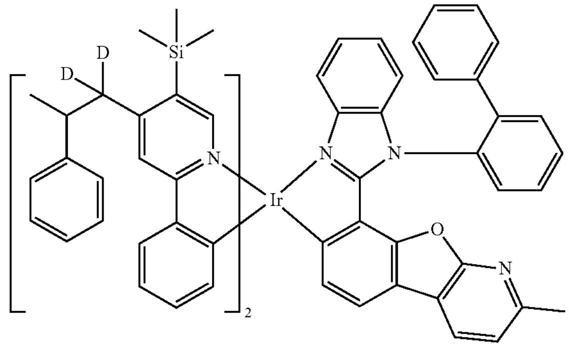
2875
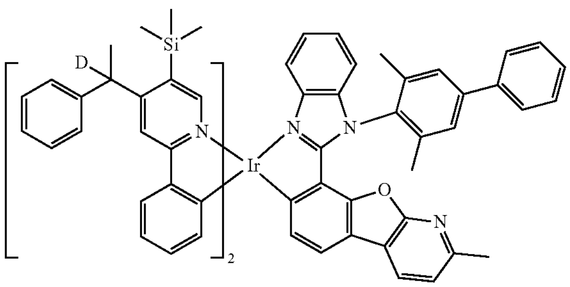
2876
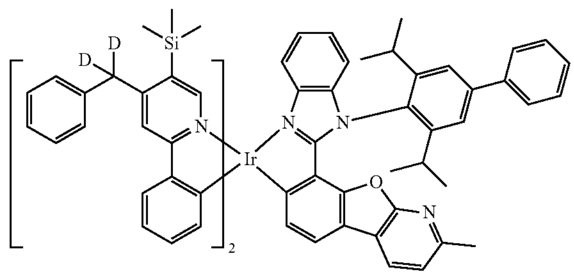
2877
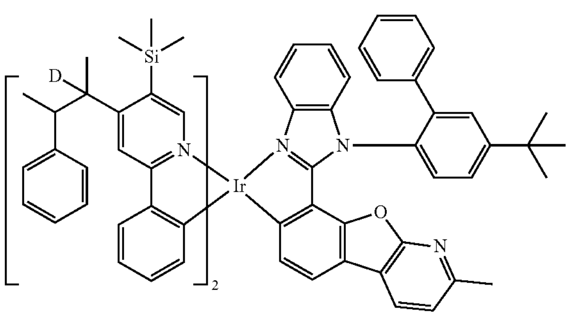
2878
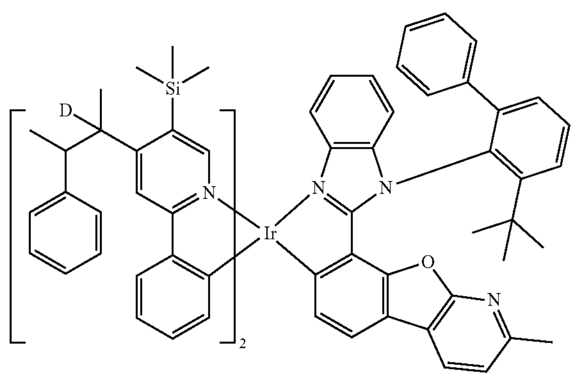
2879
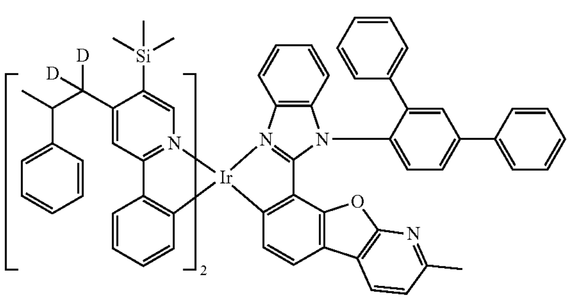
2880
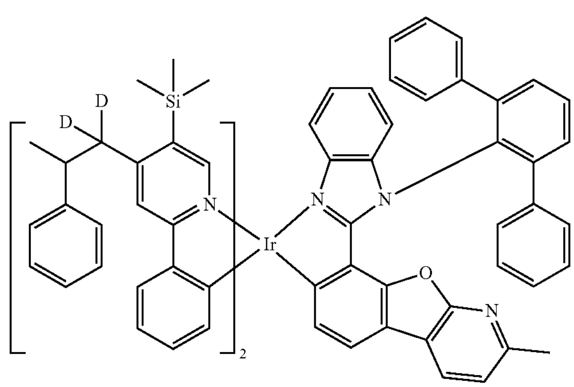

-continued
2881
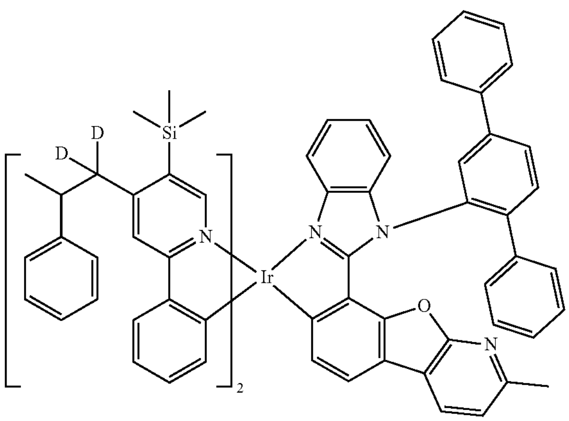
2882
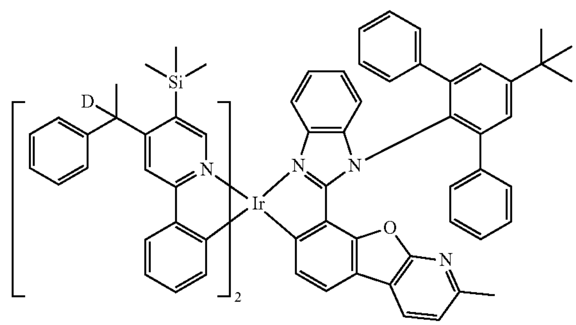
2883
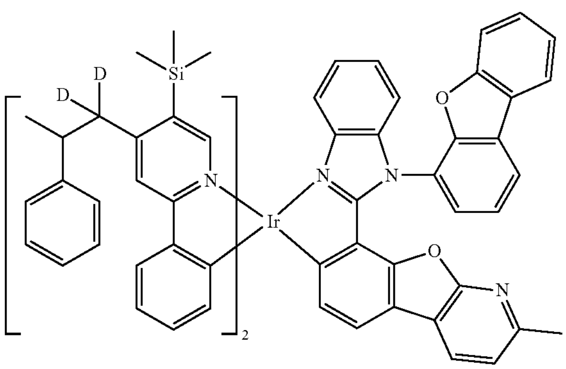
2884
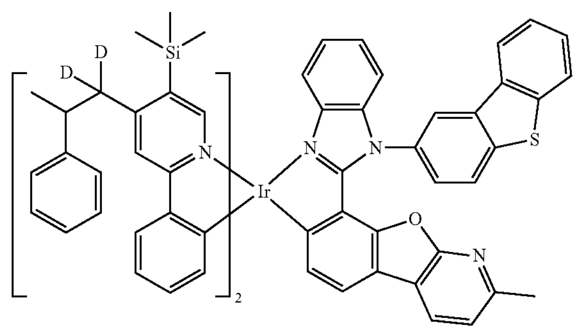
2885
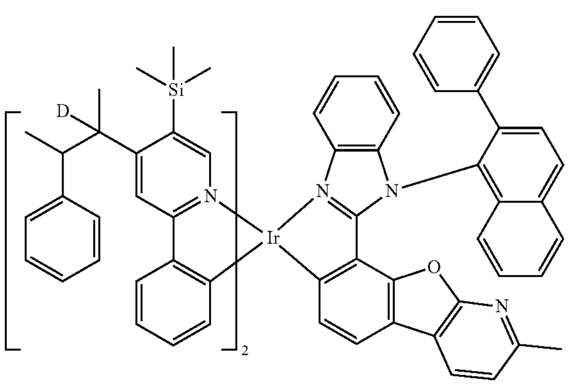
2886
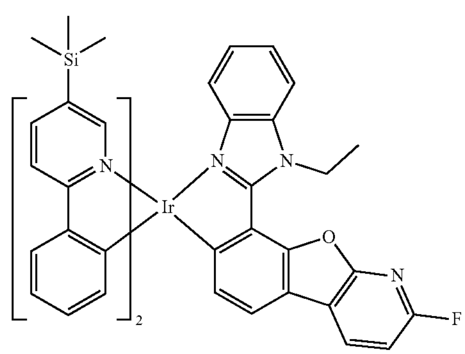
2887
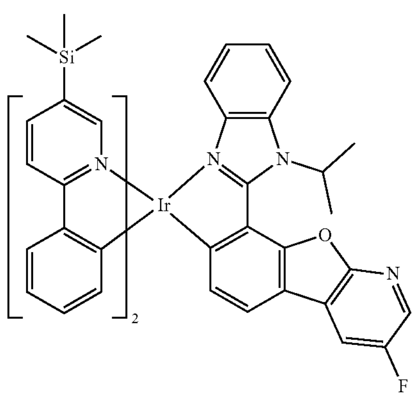
2888
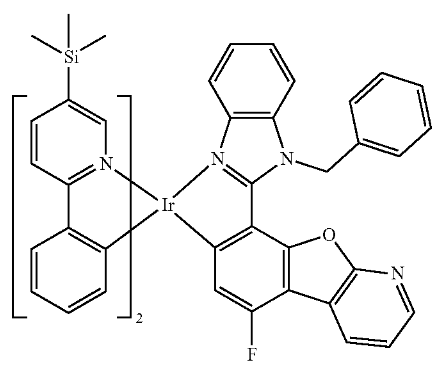

-continued
2889
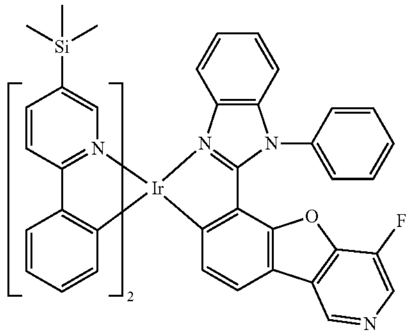
2890
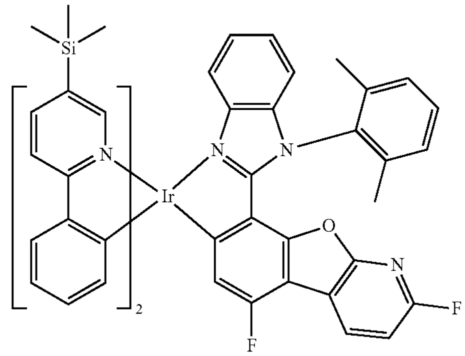
2891
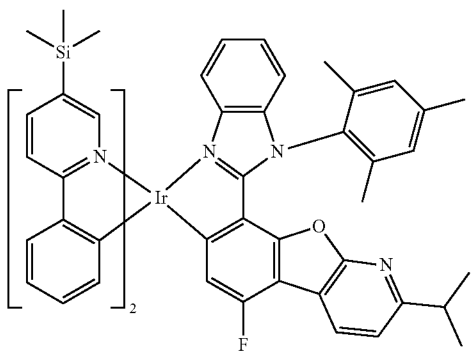
2892
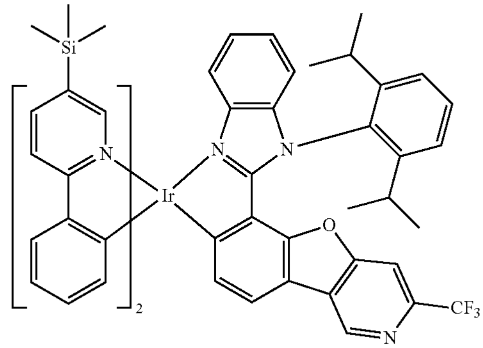
2893
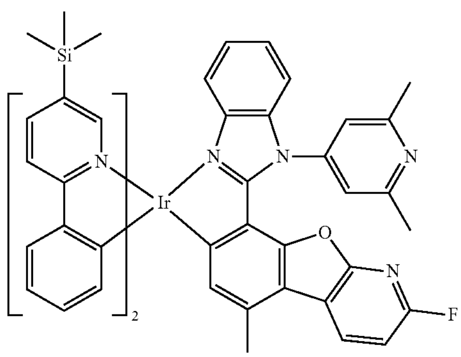
2894
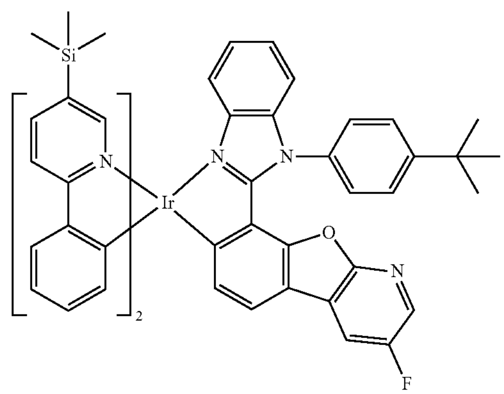
2895
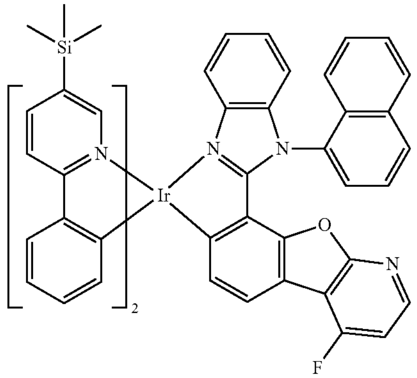
2896
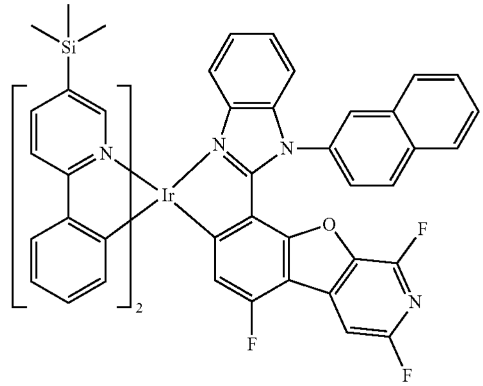

-continued
2897
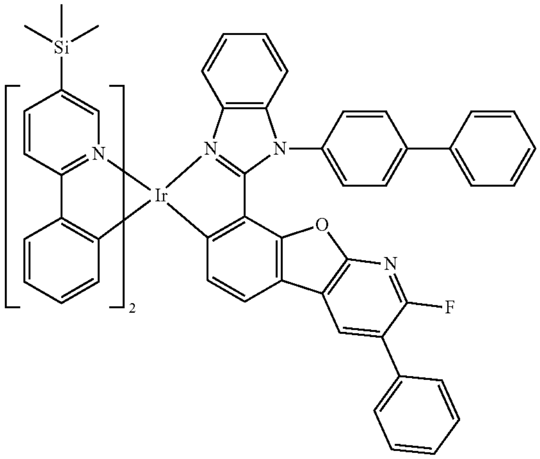
2898
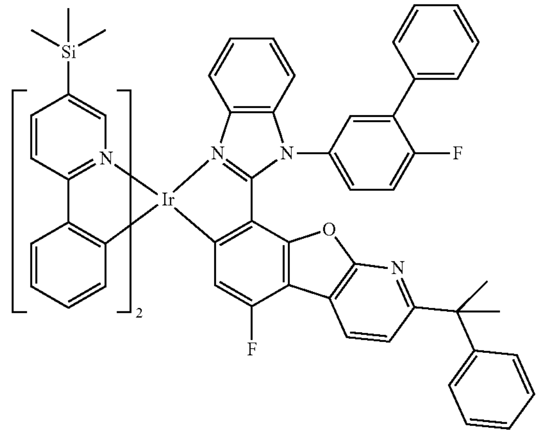
2899
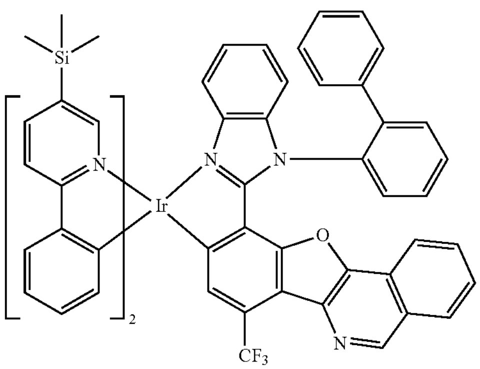
2900
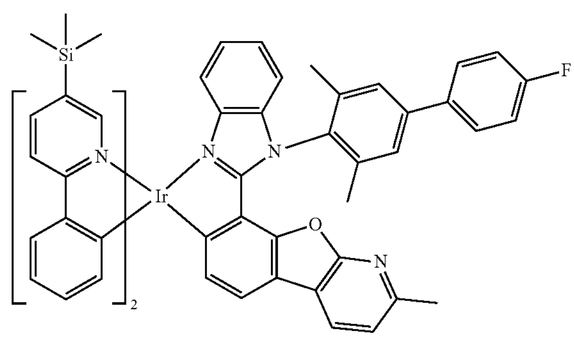
2901
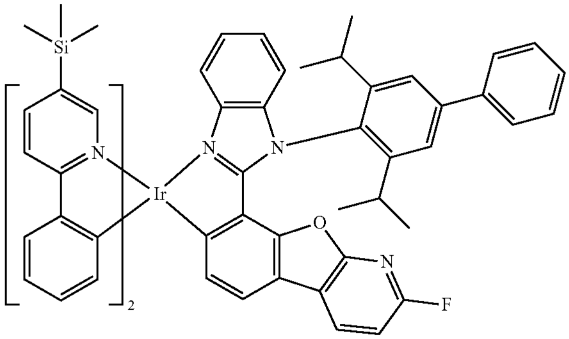
2902
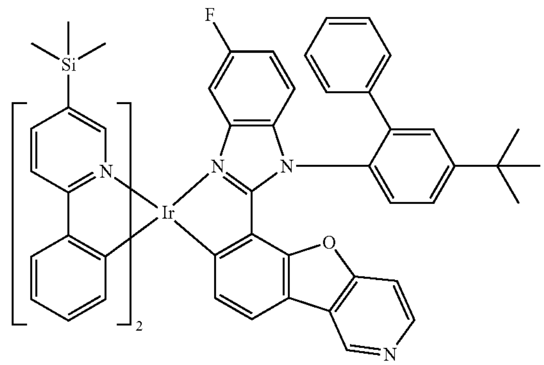

-continued
2903
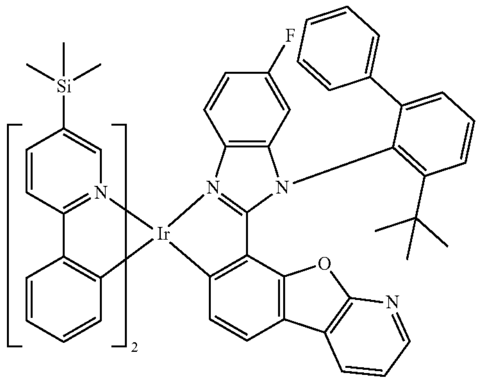
2904
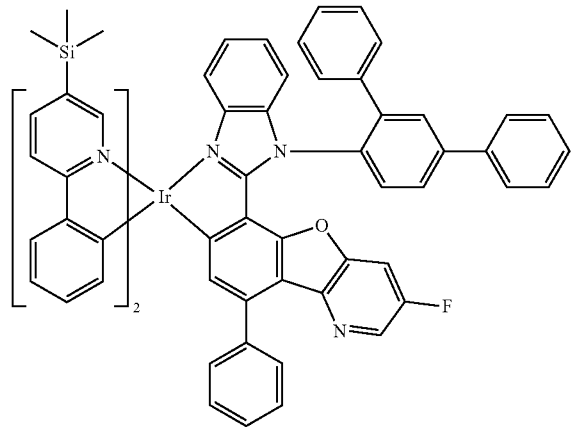
2905
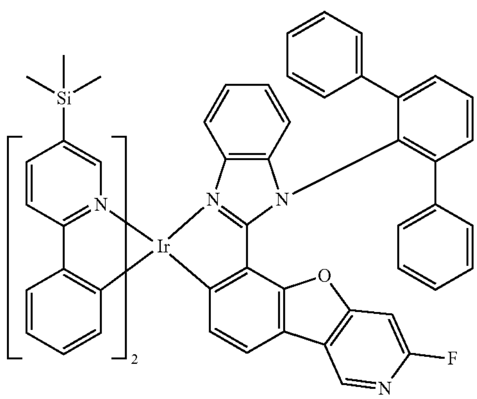
2906
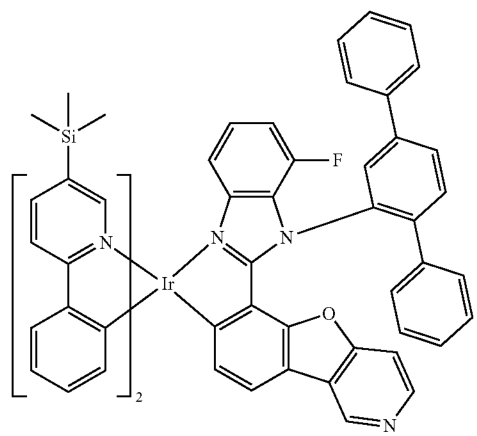
2907
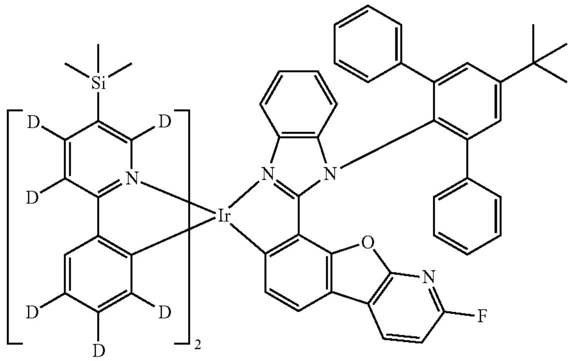
2908
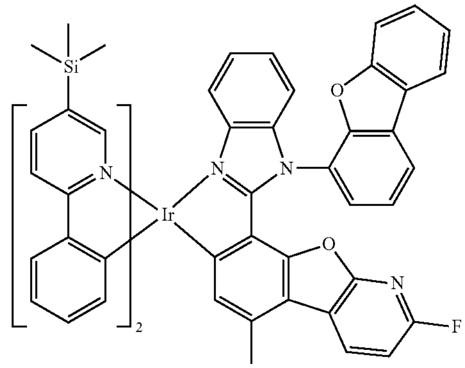

-continued
2909
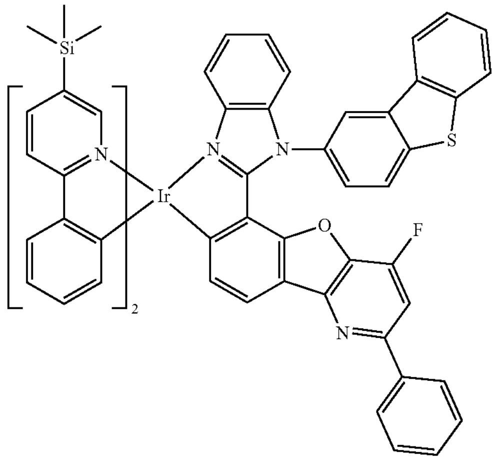
2910
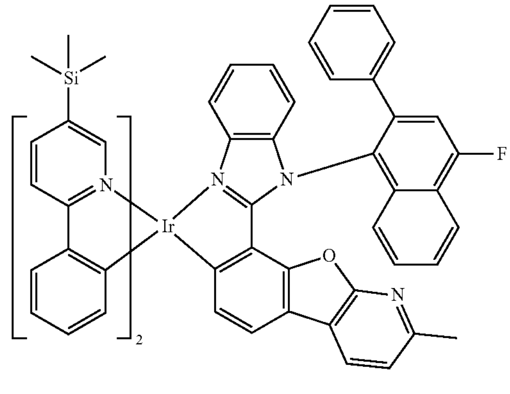
2911
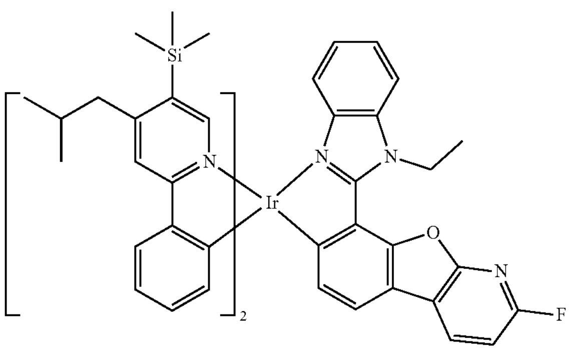
2912
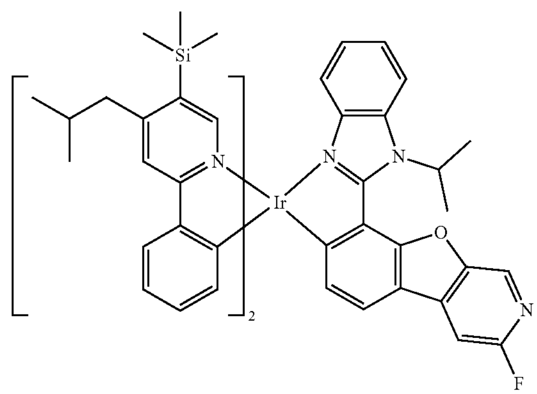
2913
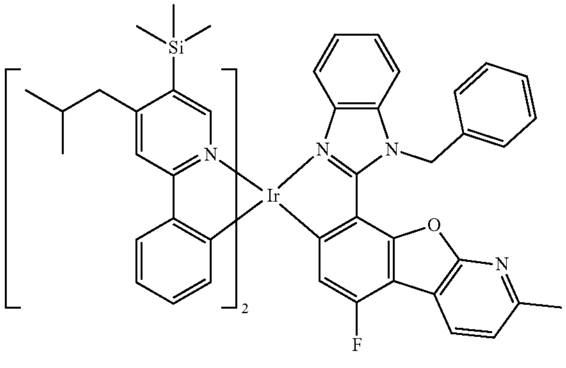
2914
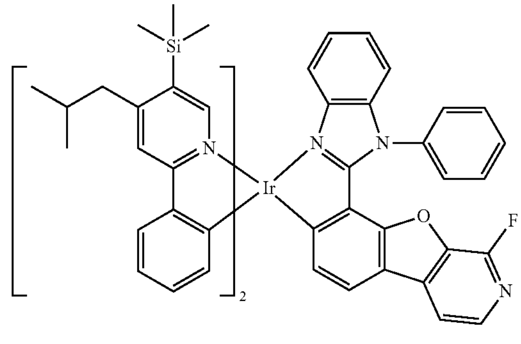

-continued
2915
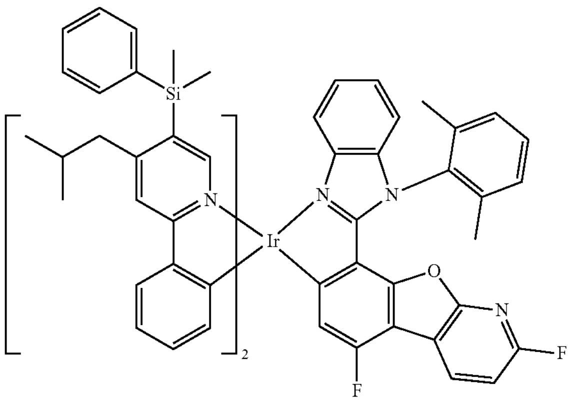
2916
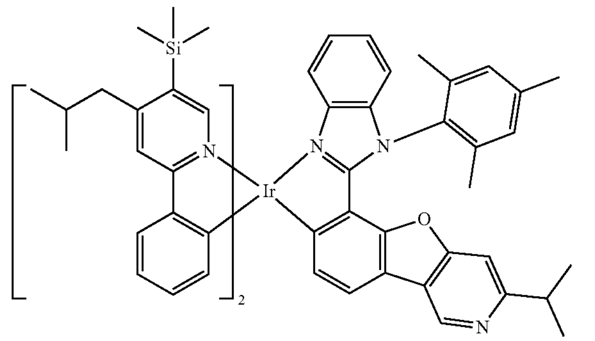
2917
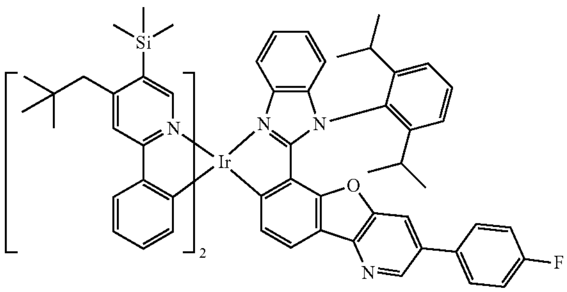
2918
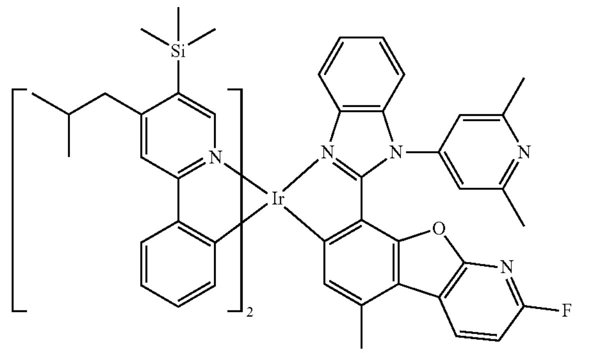
2919
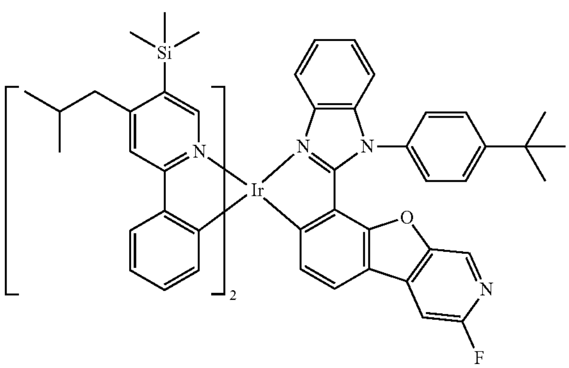
2920
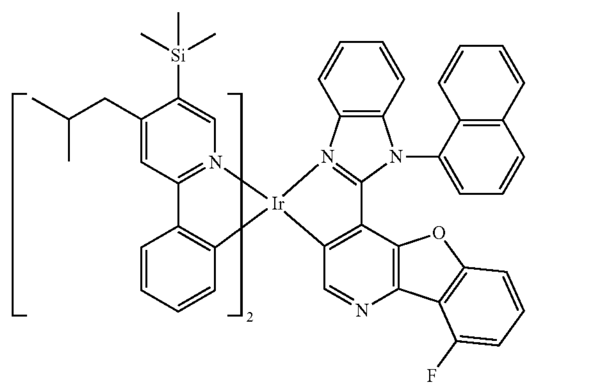
2921
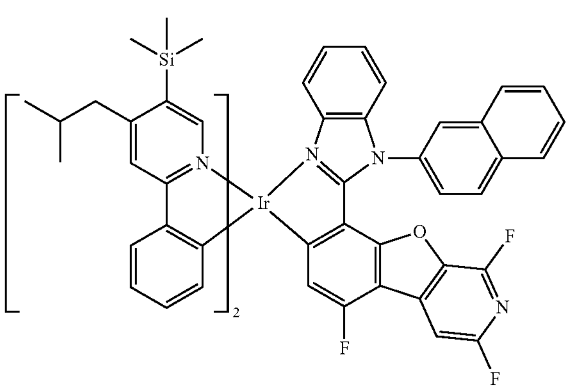
2922
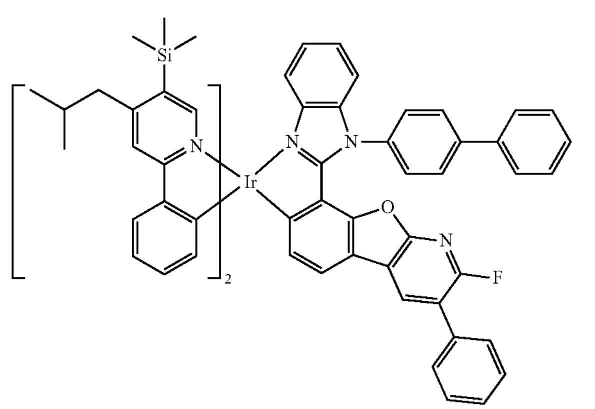

-continued
2923
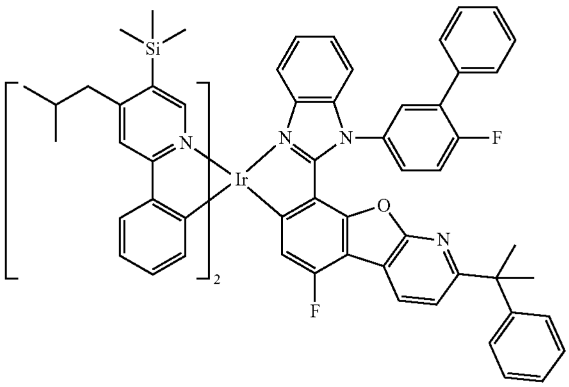
2924
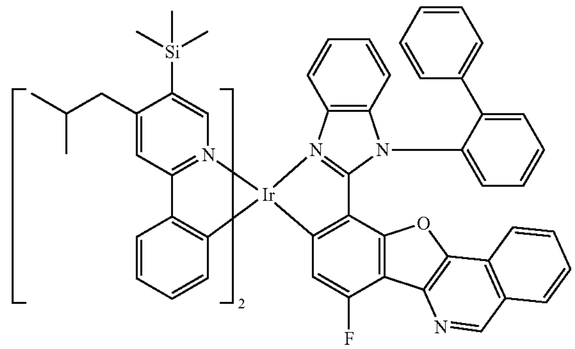
2925
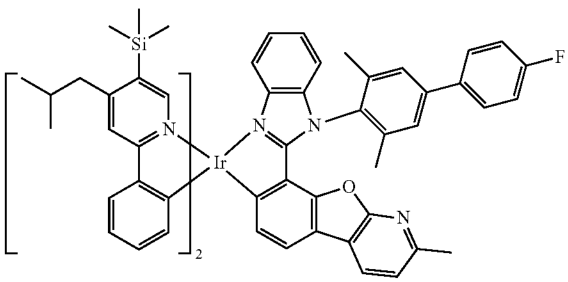
2926
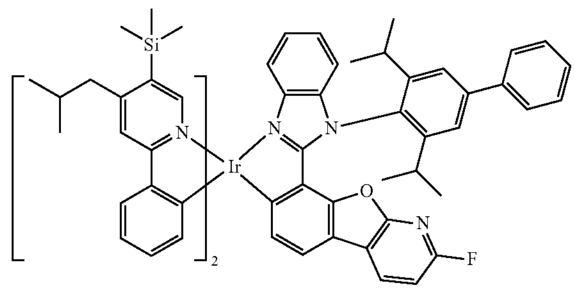
2927
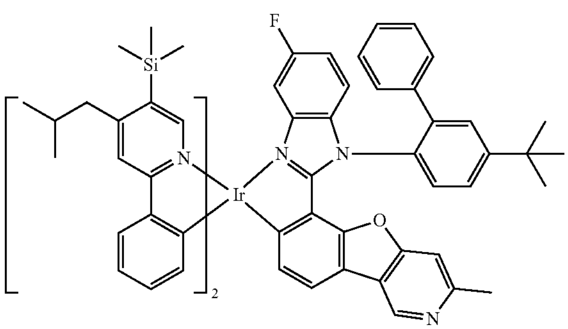
2928
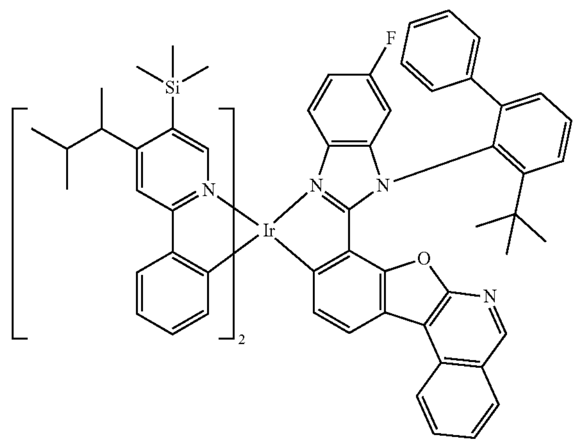
2929
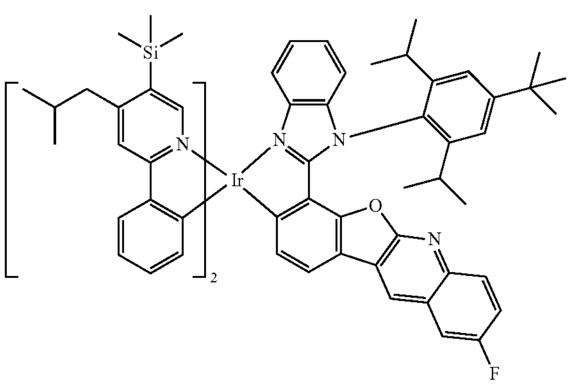
2930
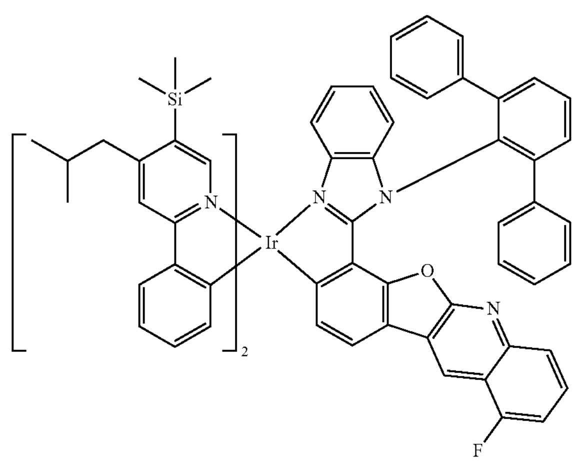

-continued
2931
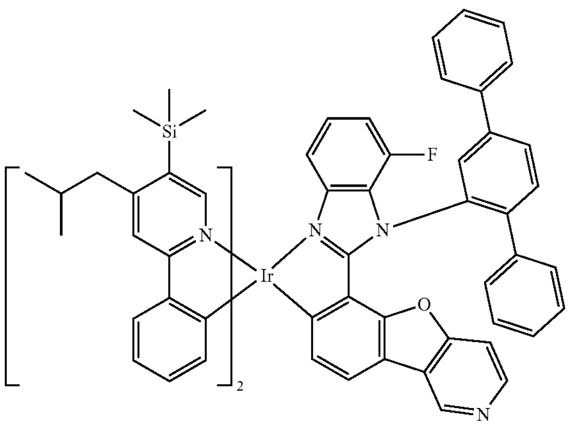
2932
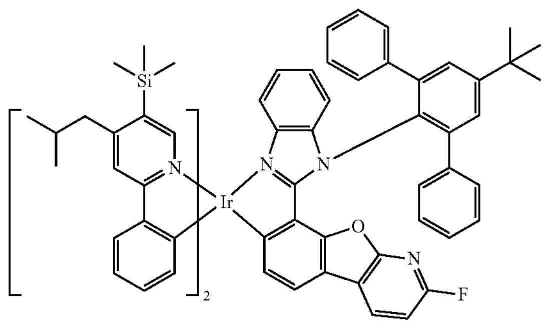
2933
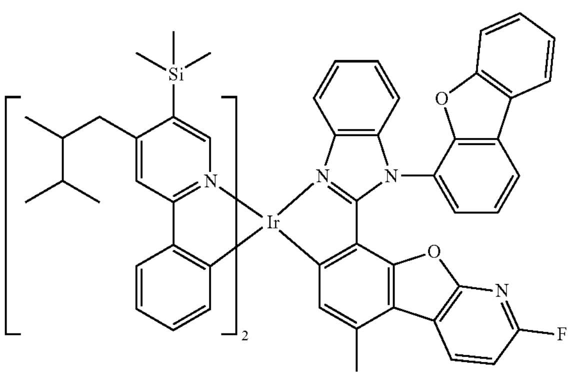
2934
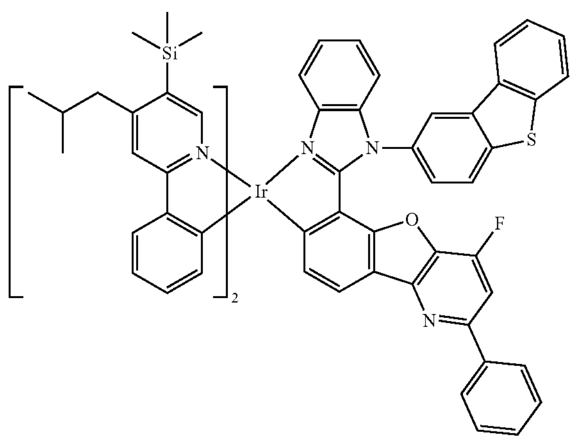
2935
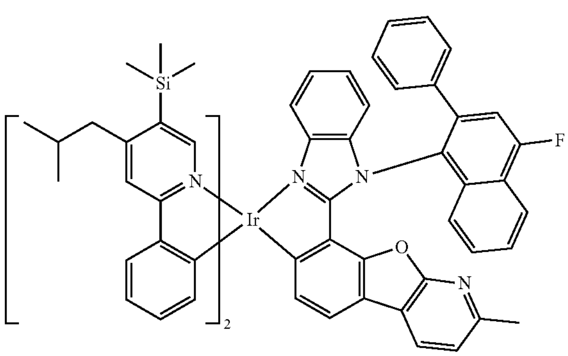
2936
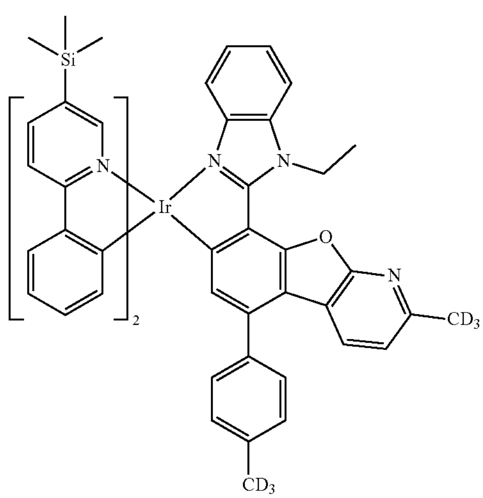

-continued
2937
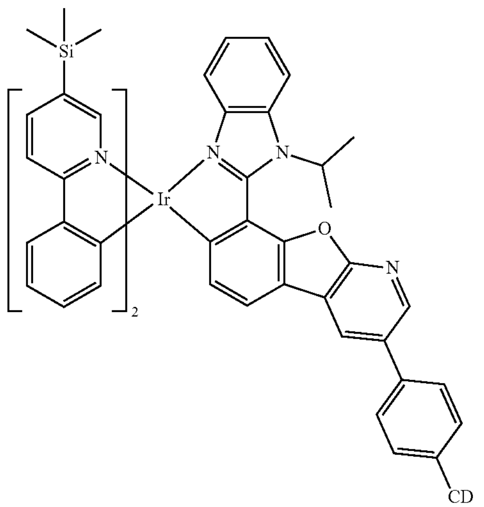
2938
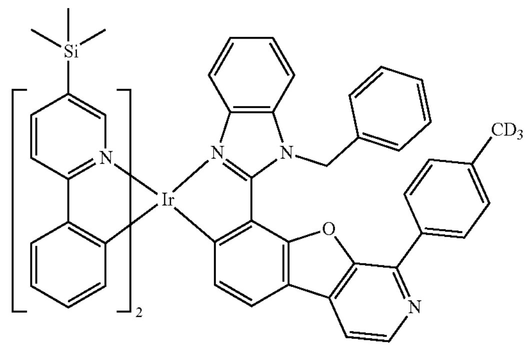
2939
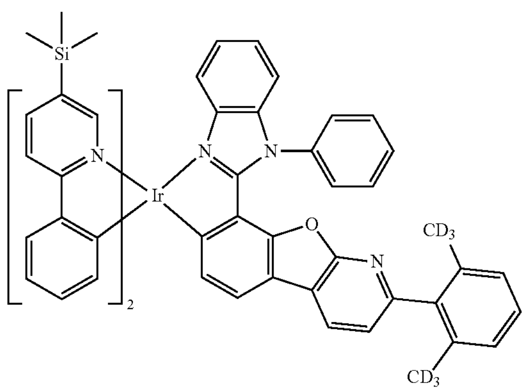
2940
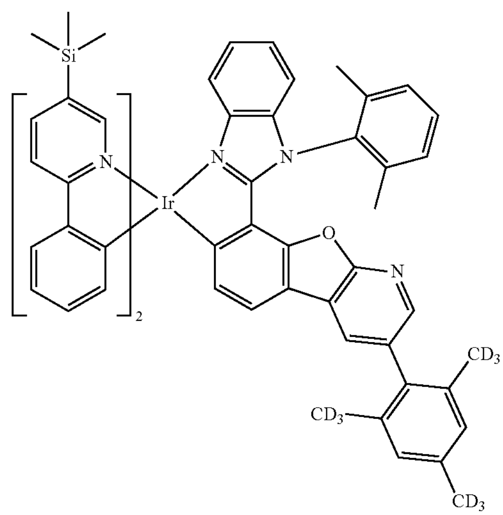
2941
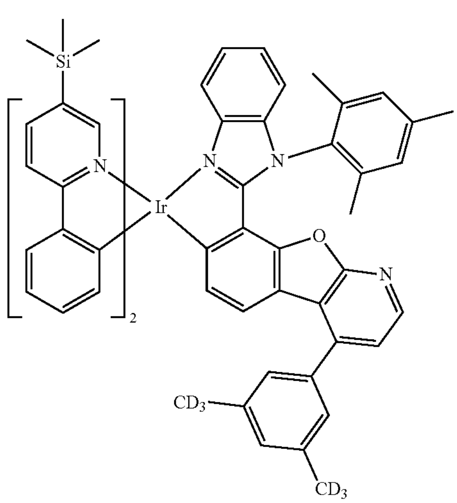
2942
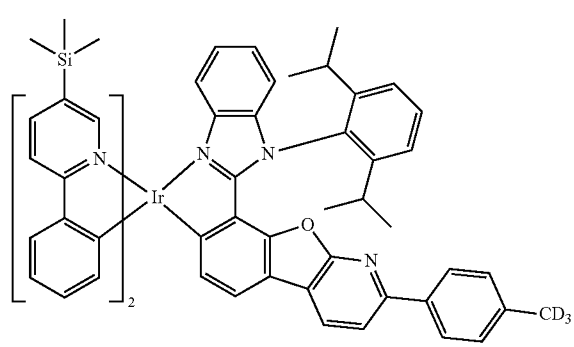

-continued
2943
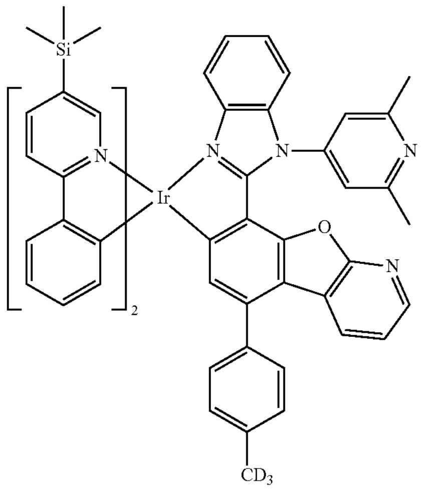
2944
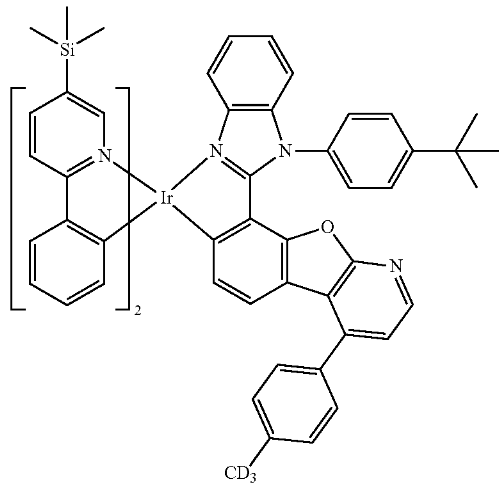
2945
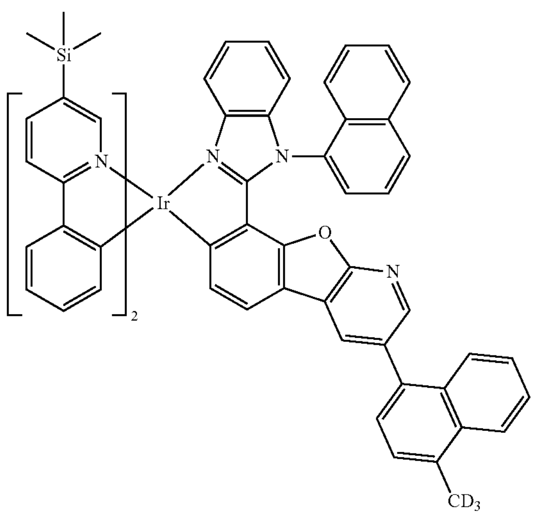
2946
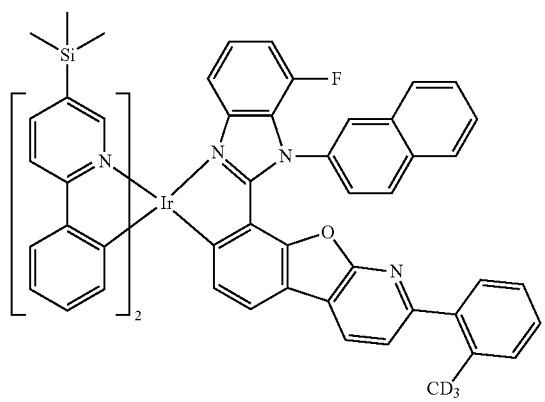
2947
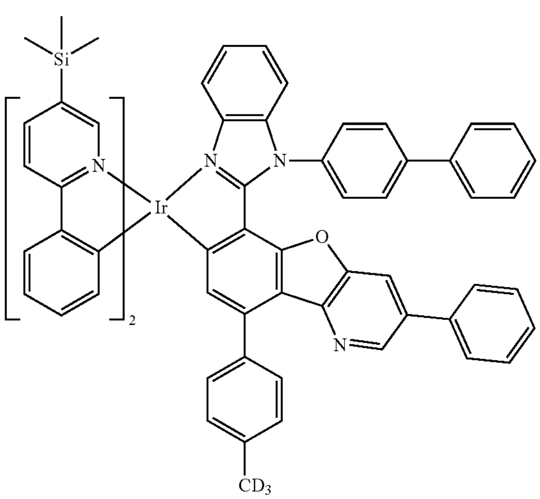
2948
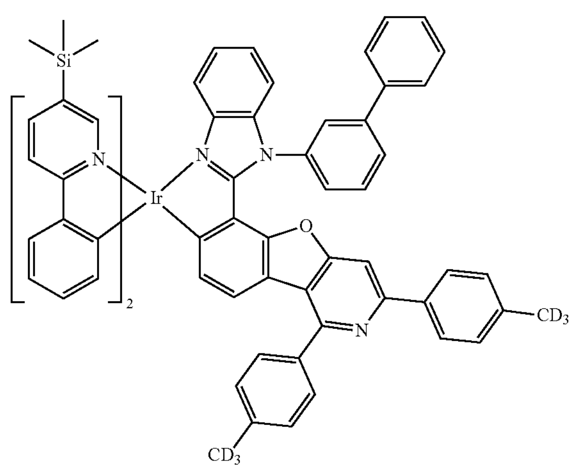

-continued
2949
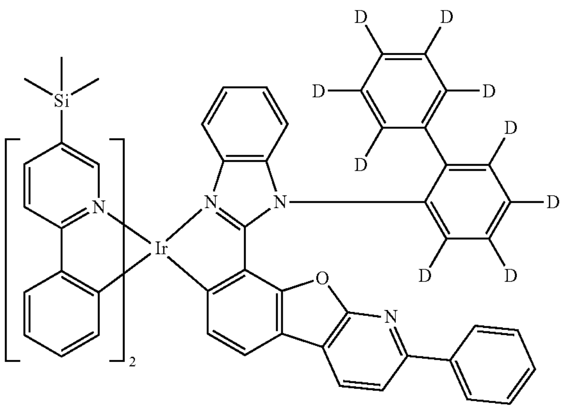
2950
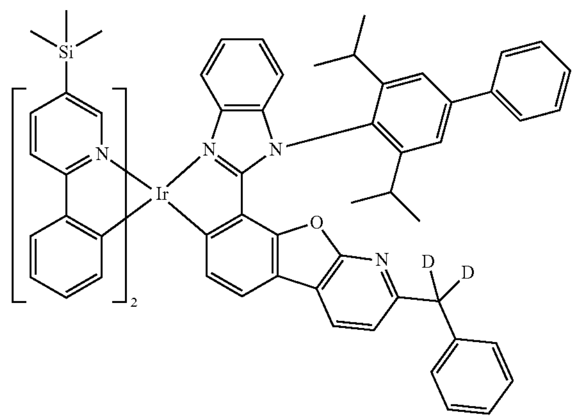
2951
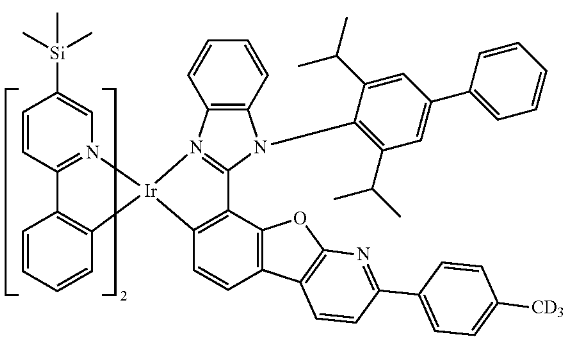
2952
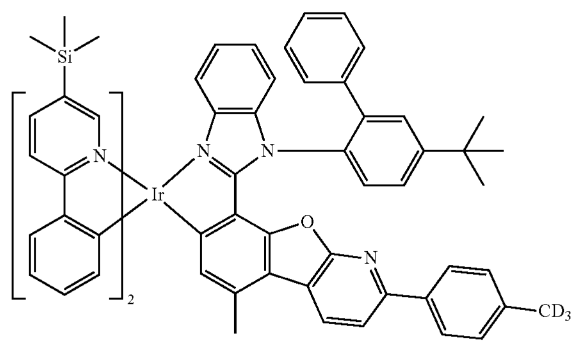
2953
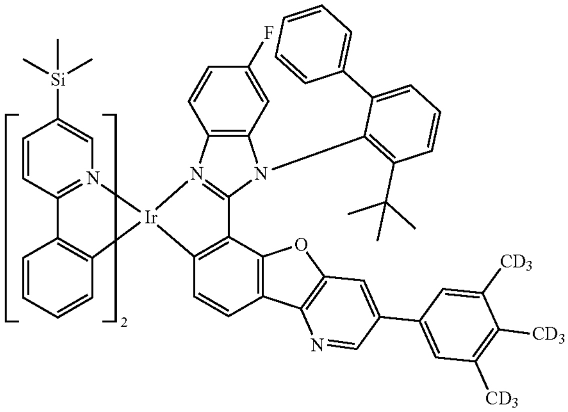
2954
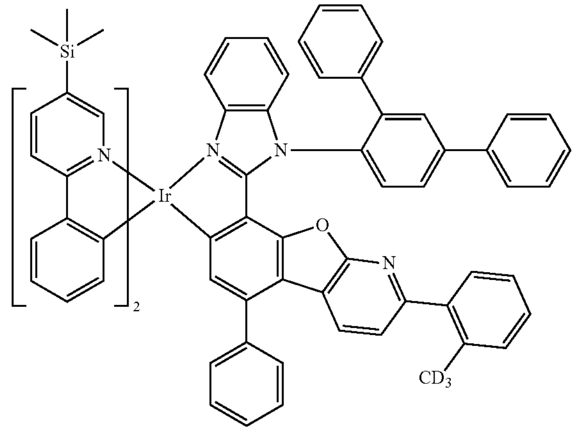

-continued
2955
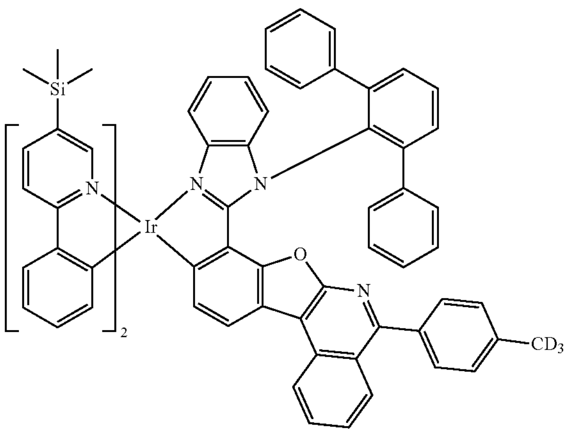
2956
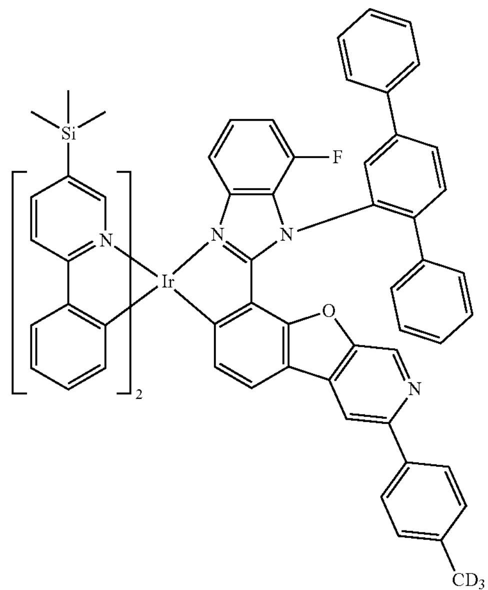
2957
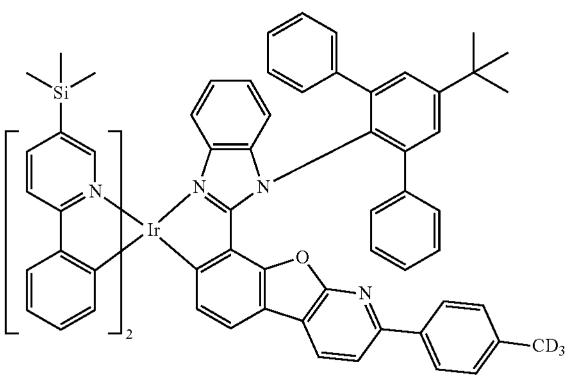
2958
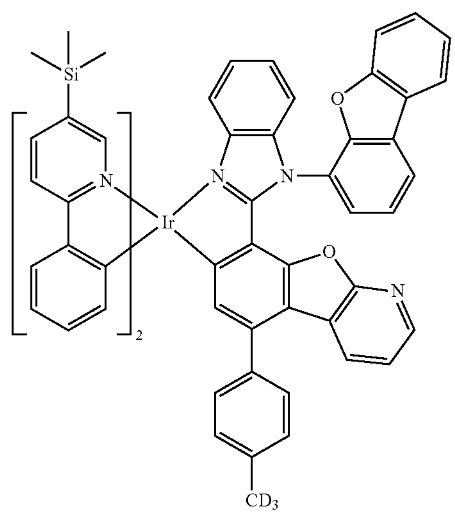
2959
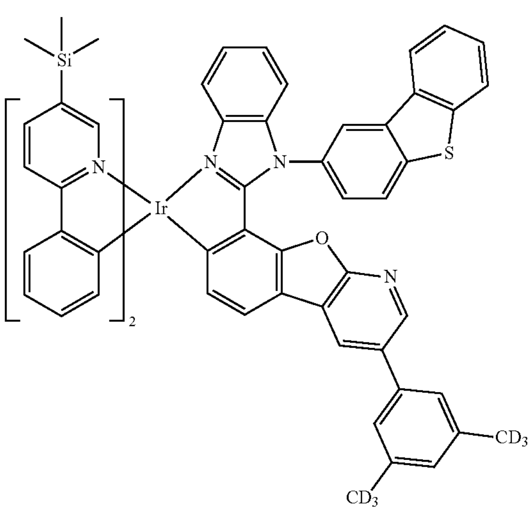
2960
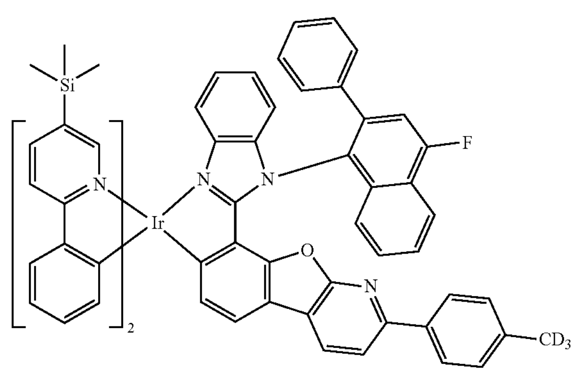

-continued
2961
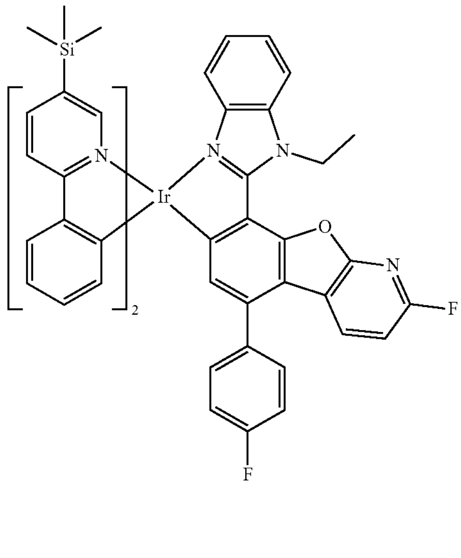
2962
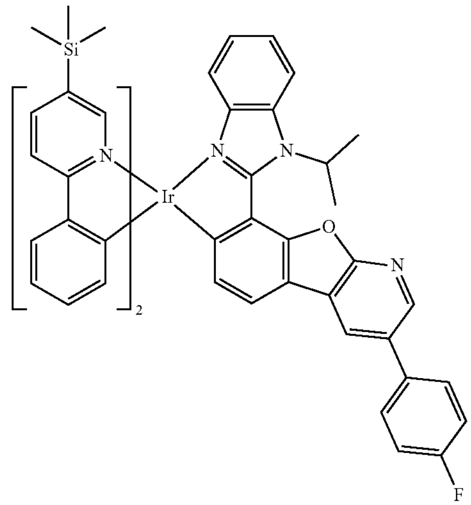
2963
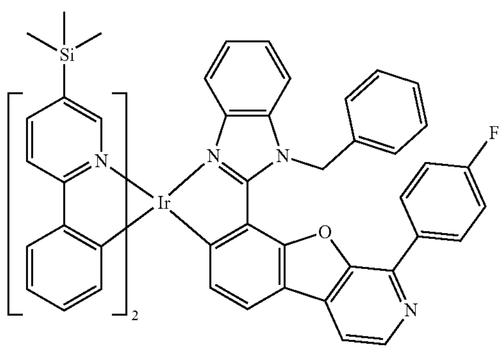
2964
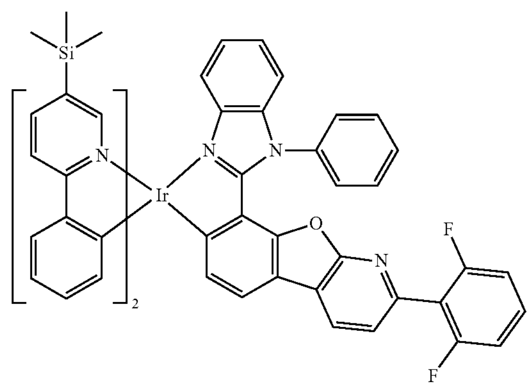
2965
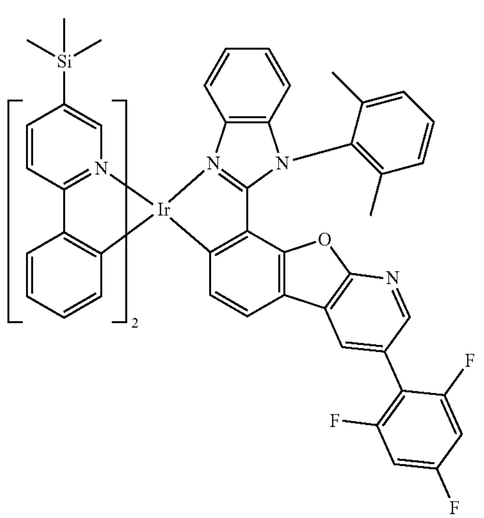
2966
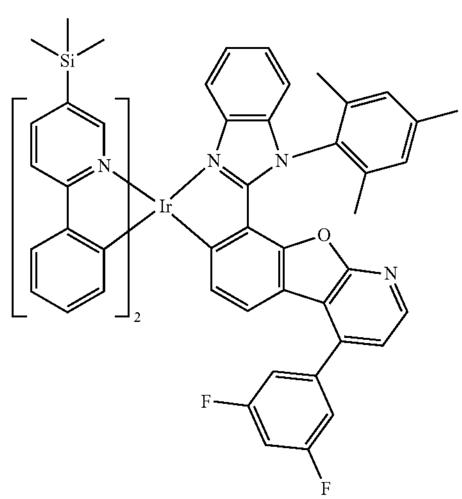

-continued
2967
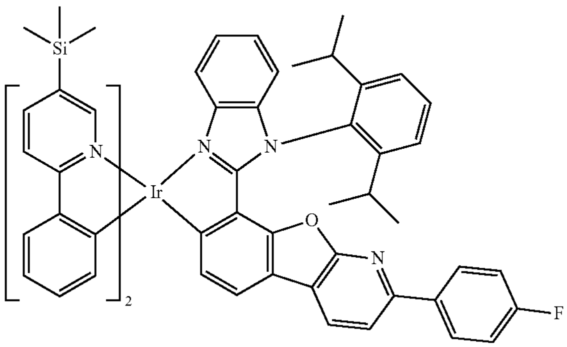
2968
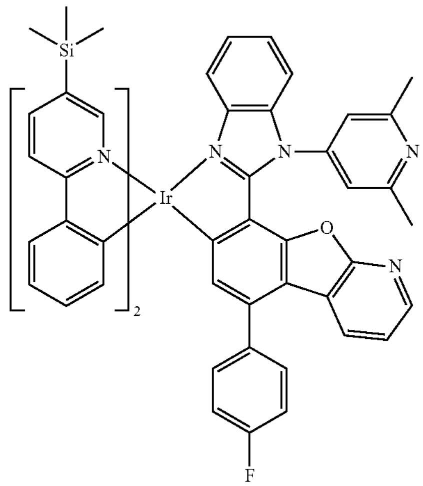
2969
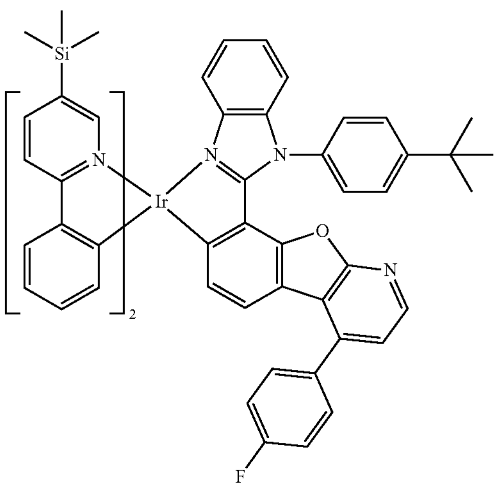
2970
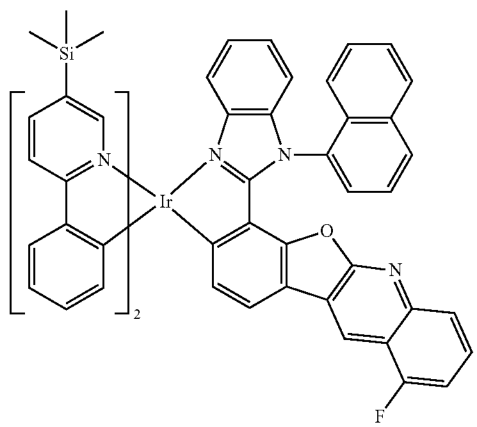
2971
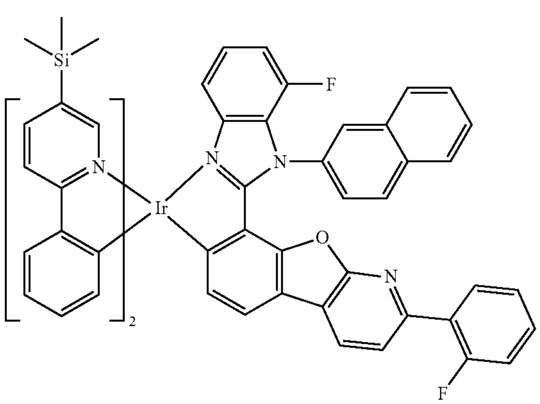
2972
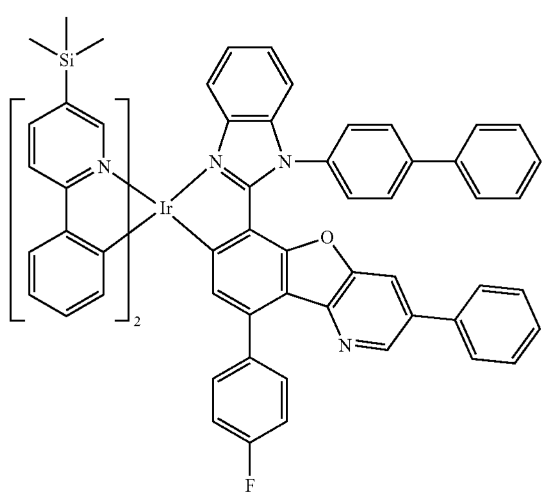

-continued
2973
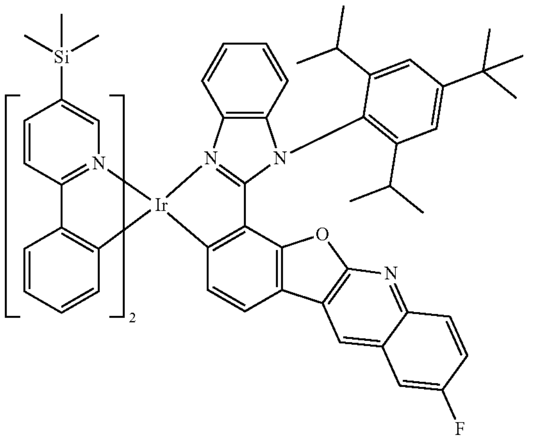
2974
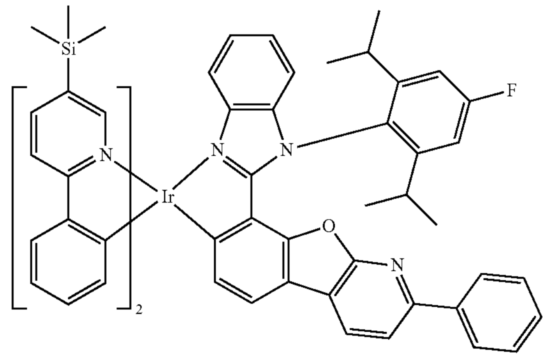
2975
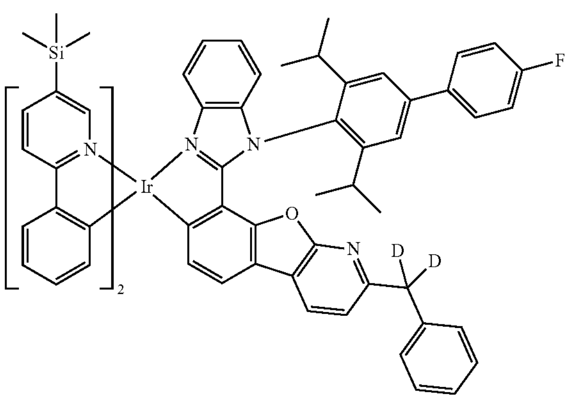
2976
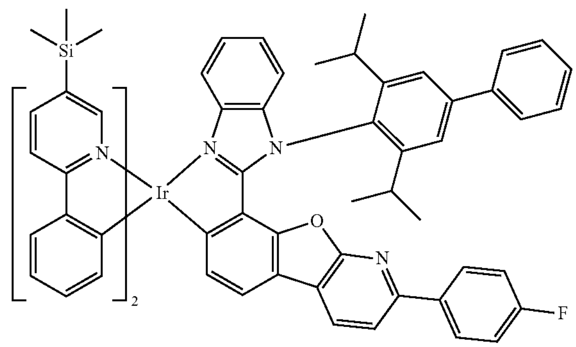
2977
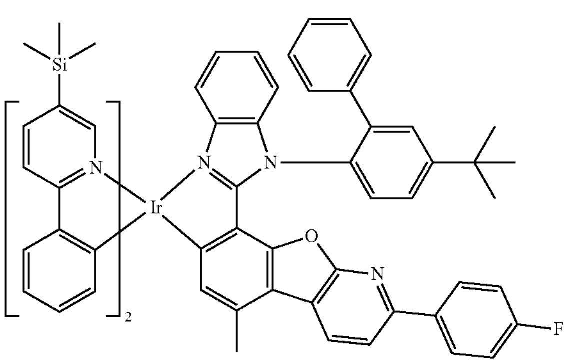
2978
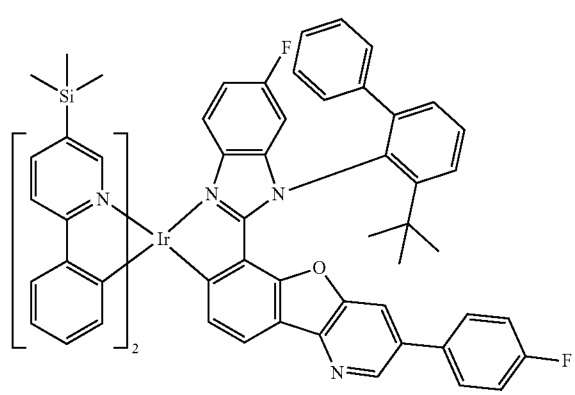

-continued
2979
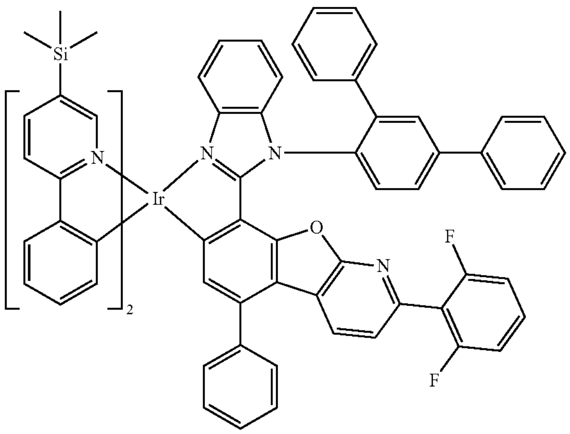
2980
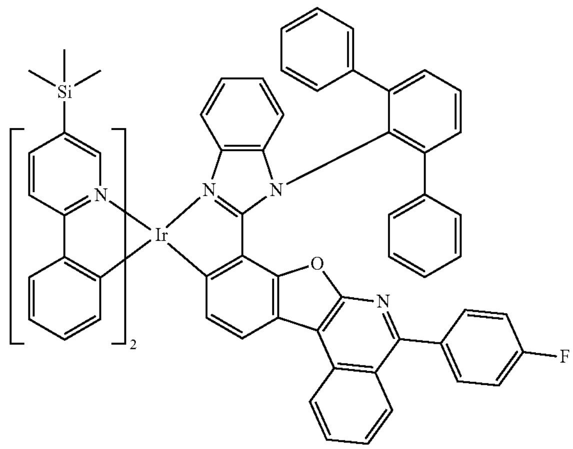
2981
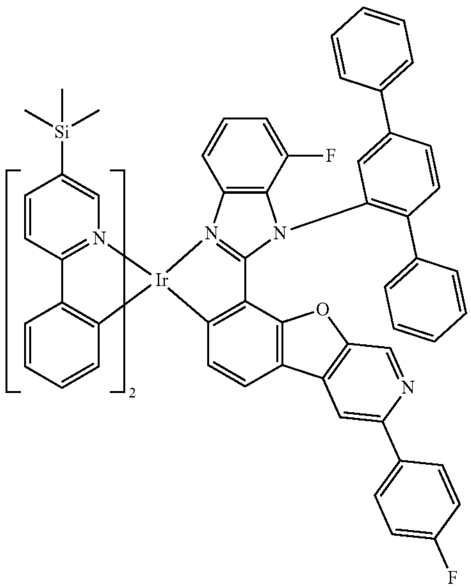
2982
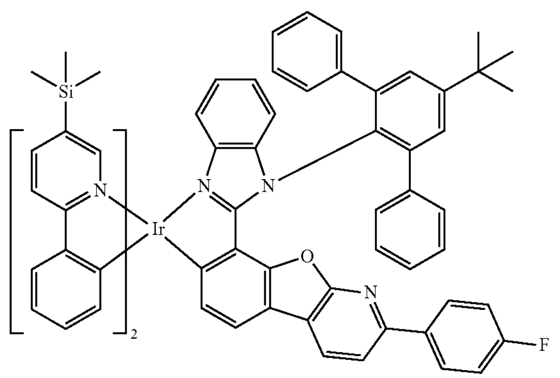
2983
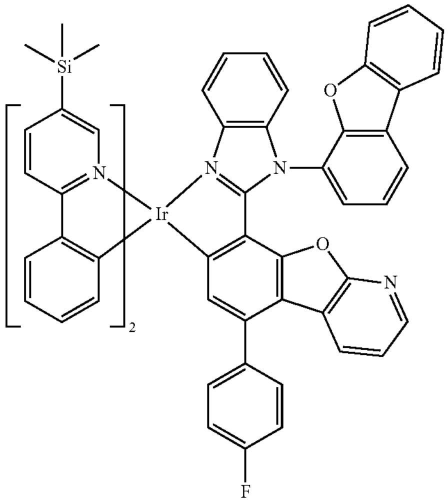
2984
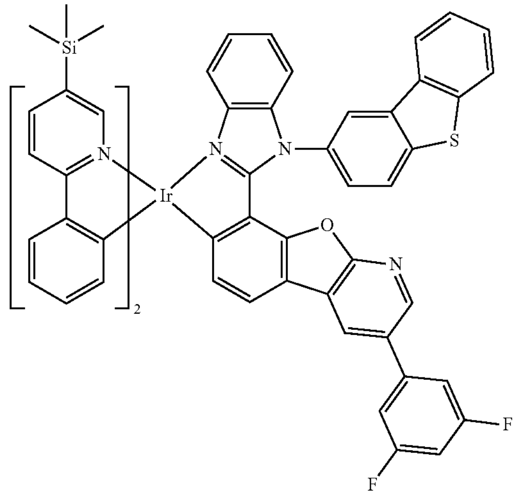

-continued
2985
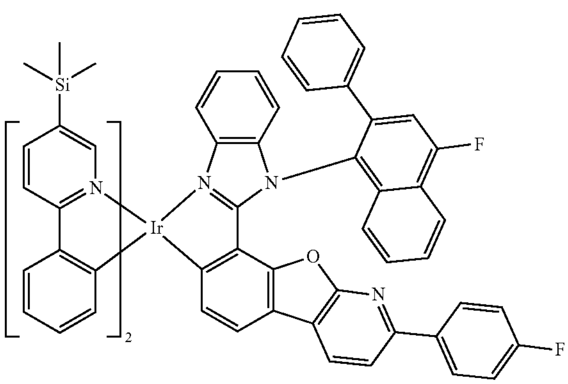
2986
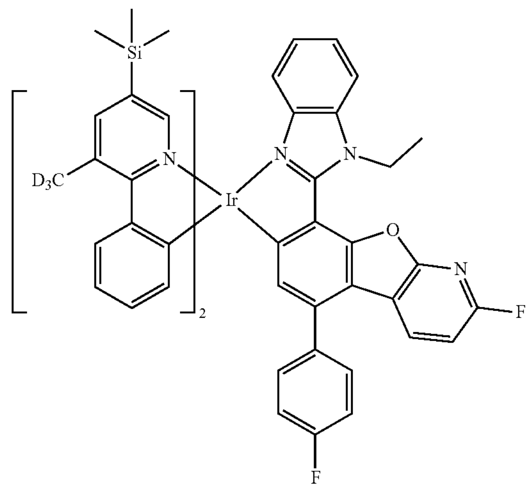
2987
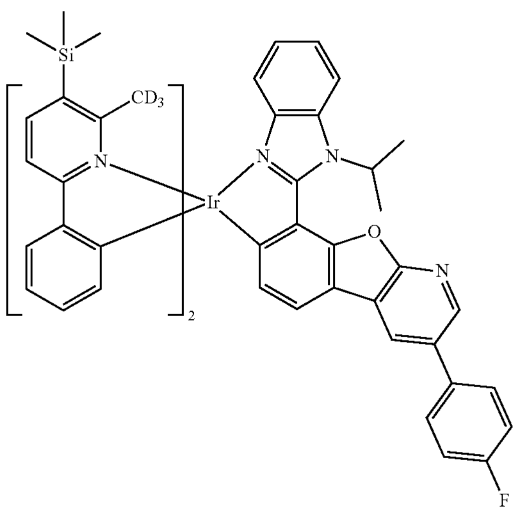
2988
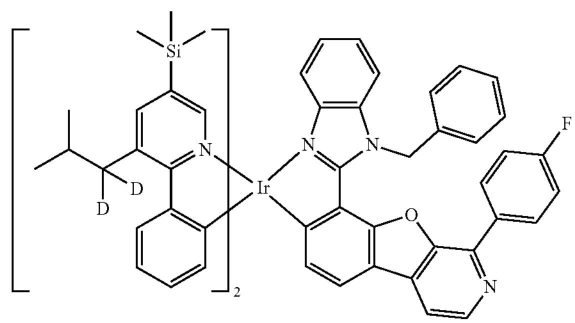
2989
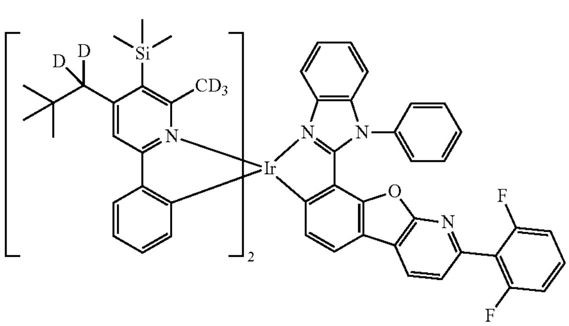
2990
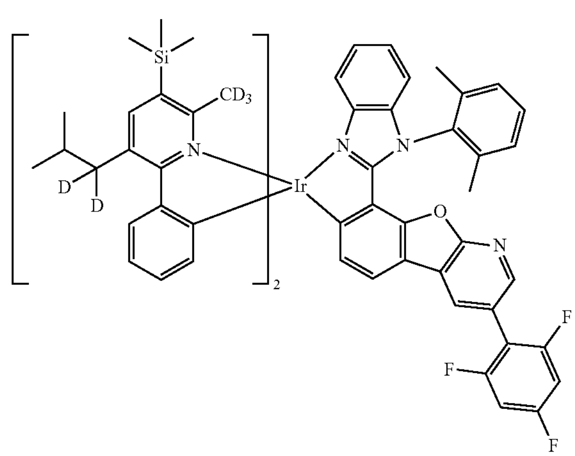

-continued
2991
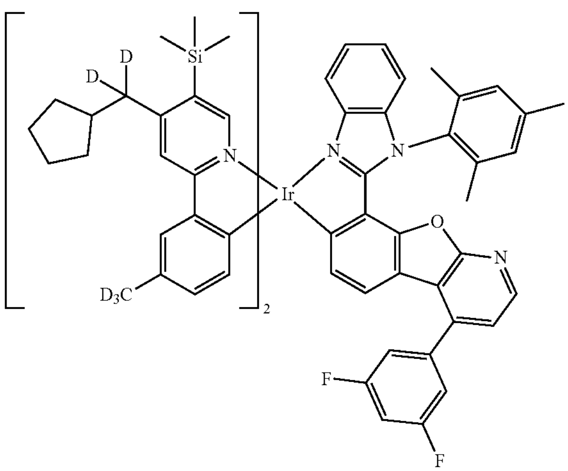
2992
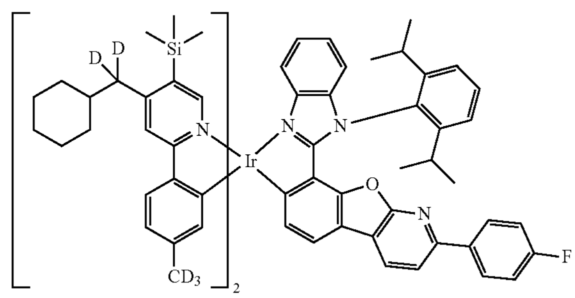
2993
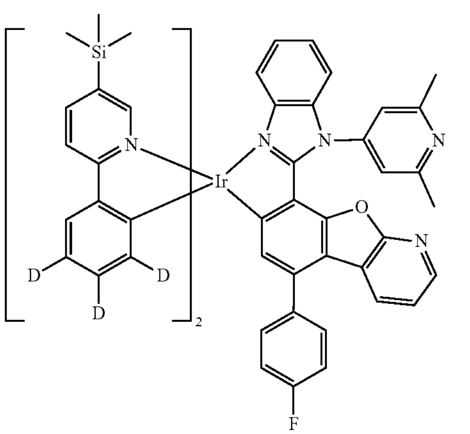
2994
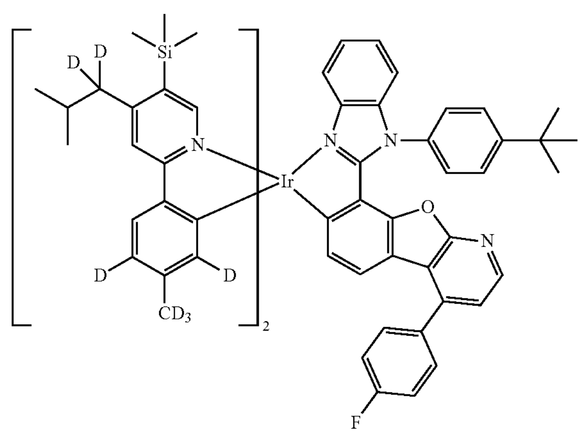
2995
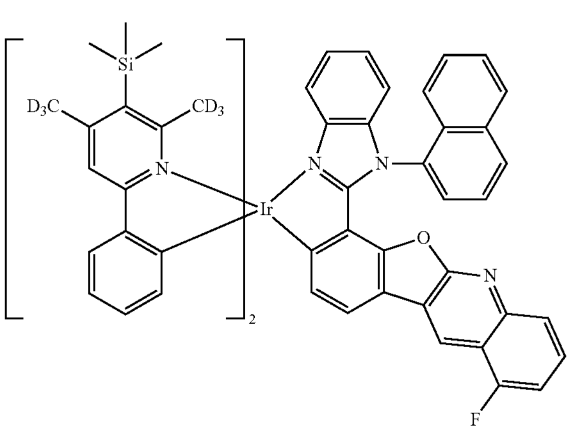
2996
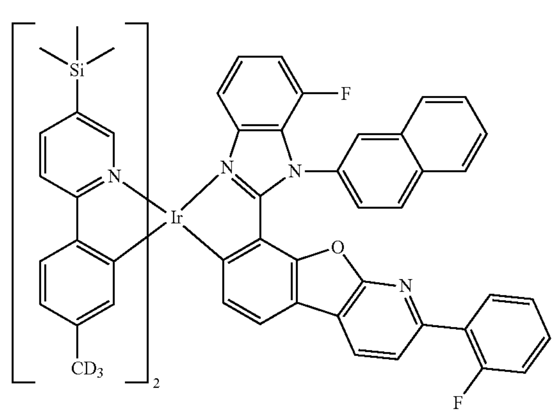

-continued
2997
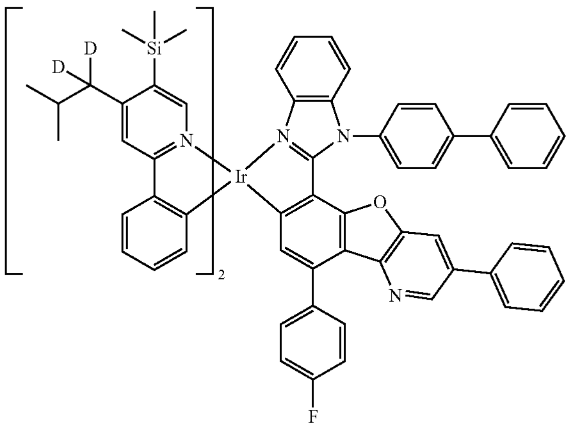
2998
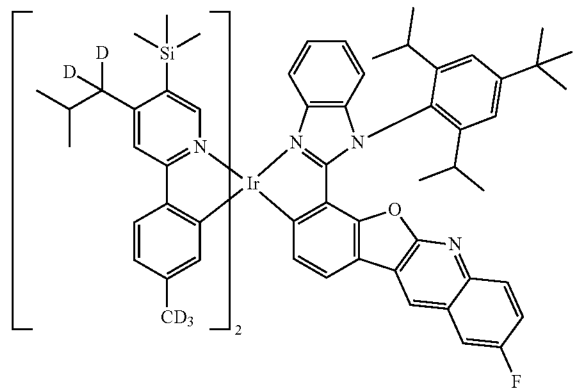
2999
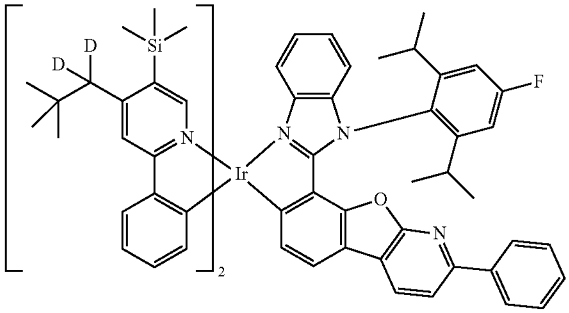
3000
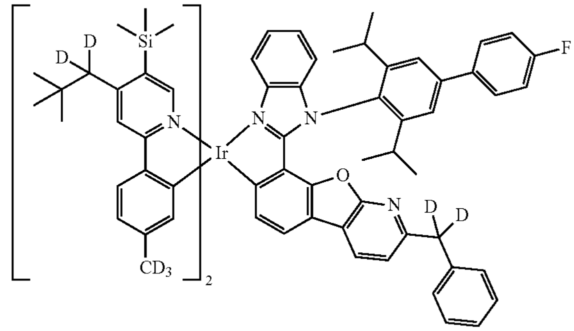
3001
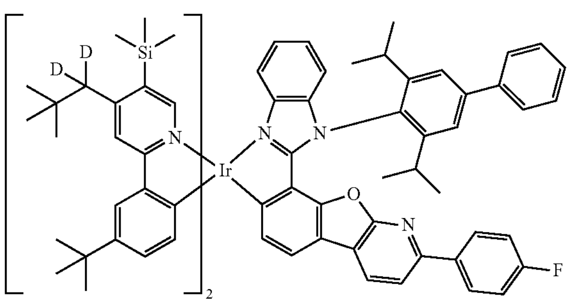
3002
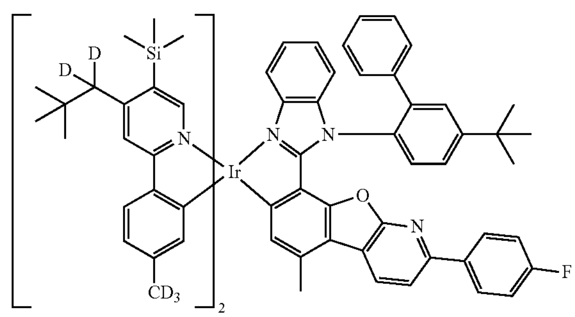
3003
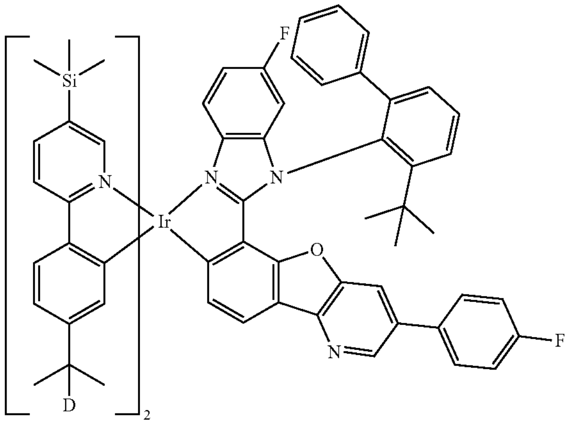
3004
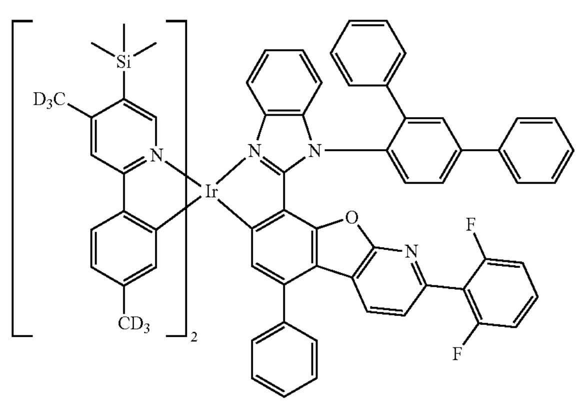

-continued
3005
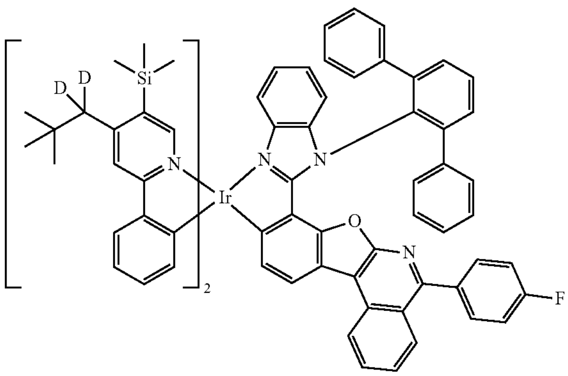
3006
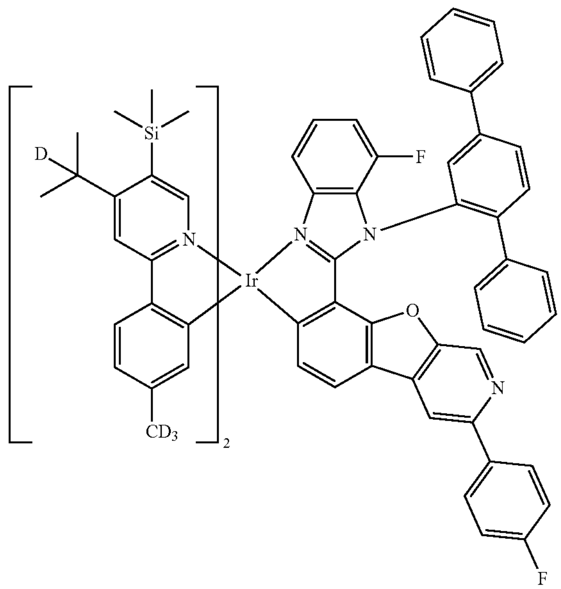
3007
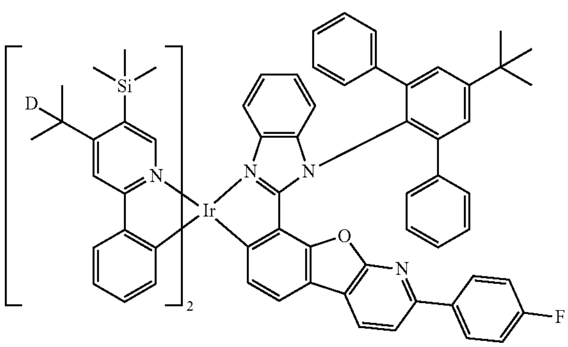
3008
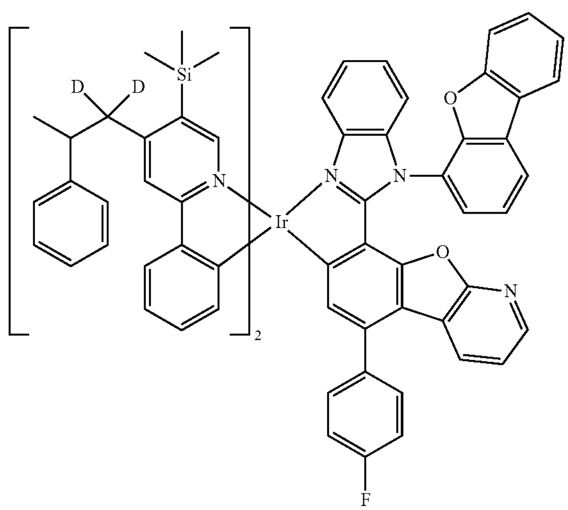
3009
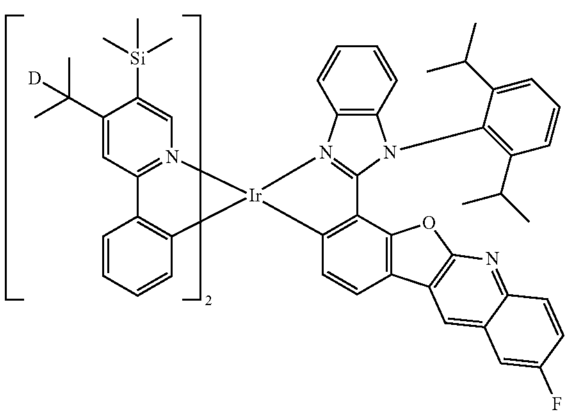
3010
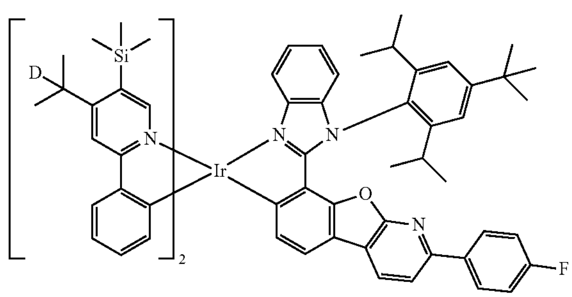

-continued
3011
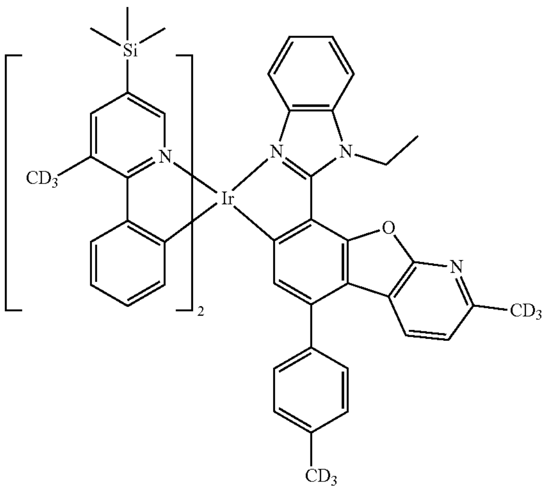
3012
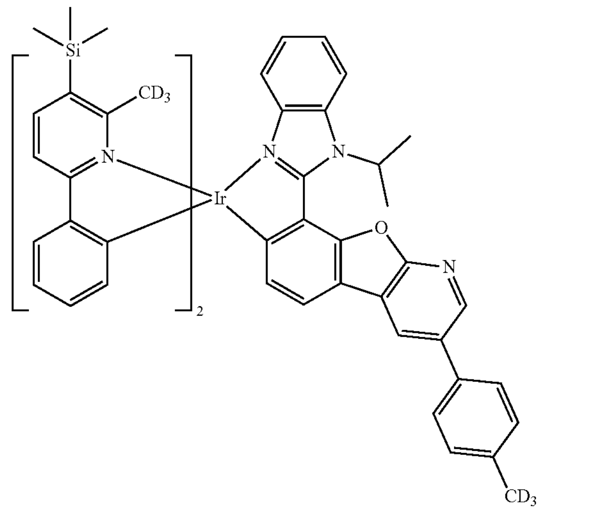
3013
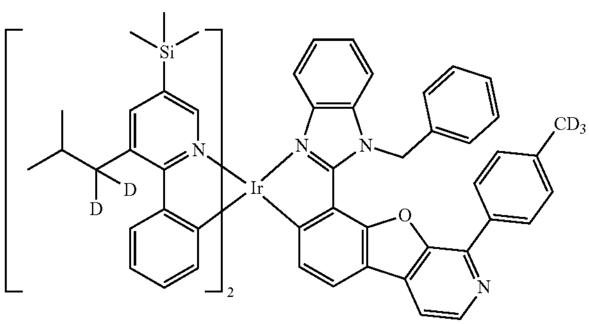
3014
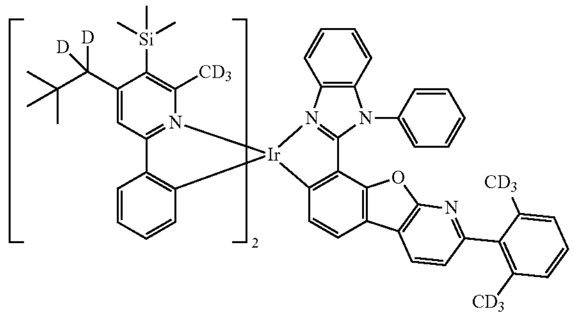
3015
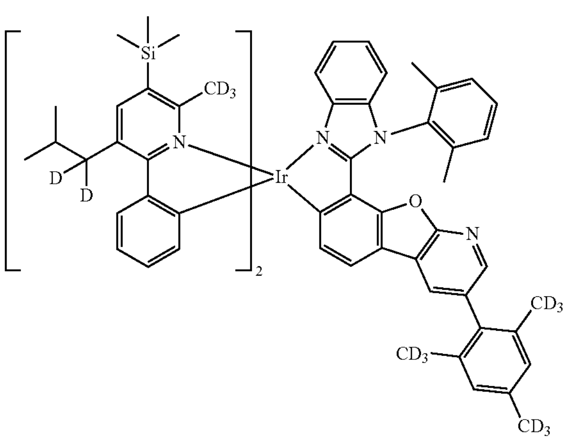
3016
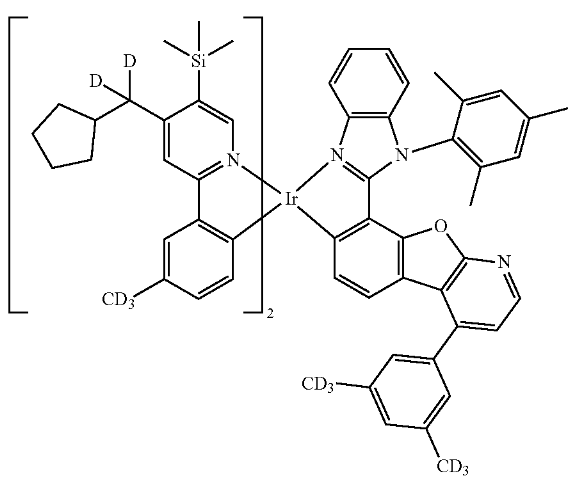

-continued
3017
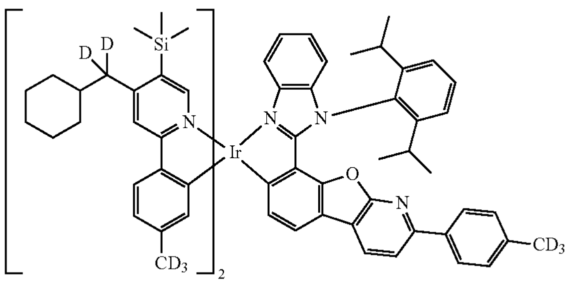
3018
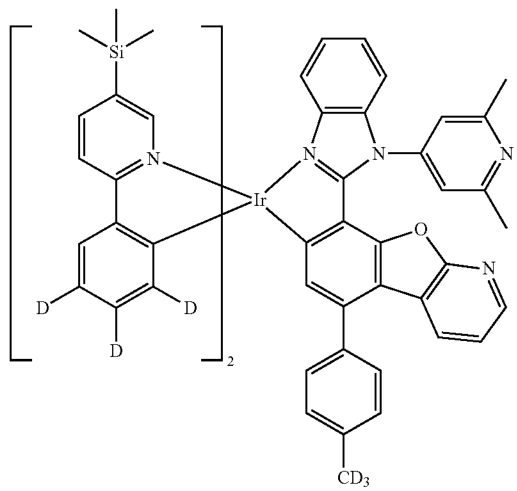
3019
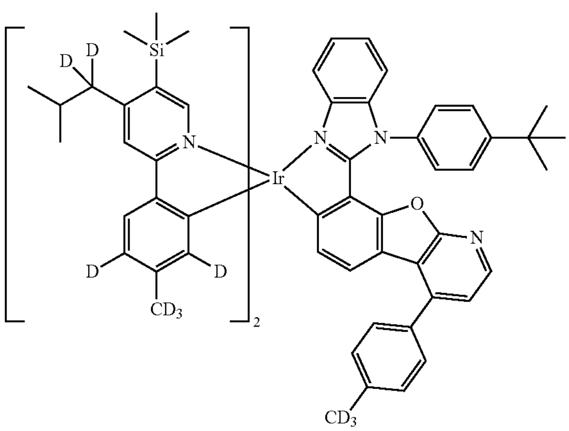
3020
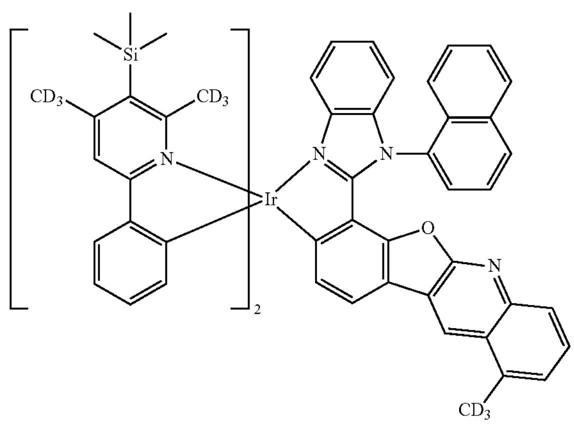
3021
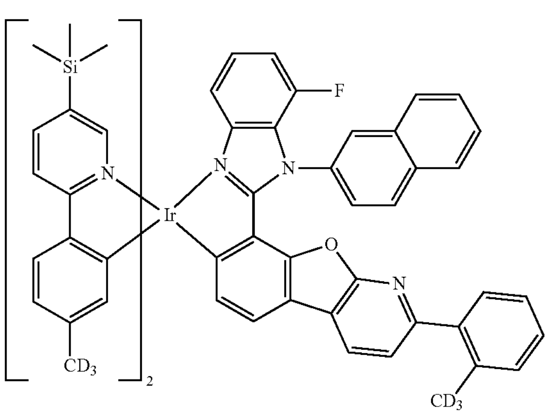
3022
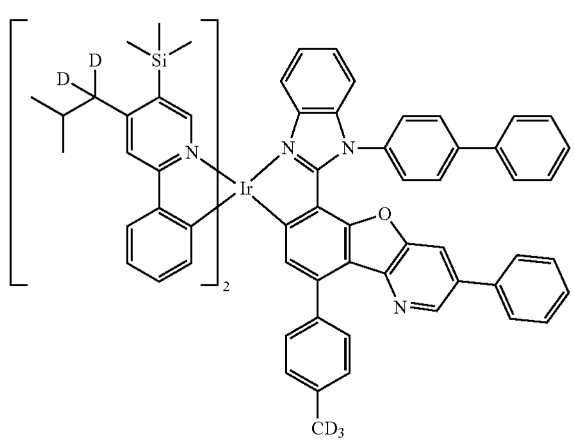

-continued
3023
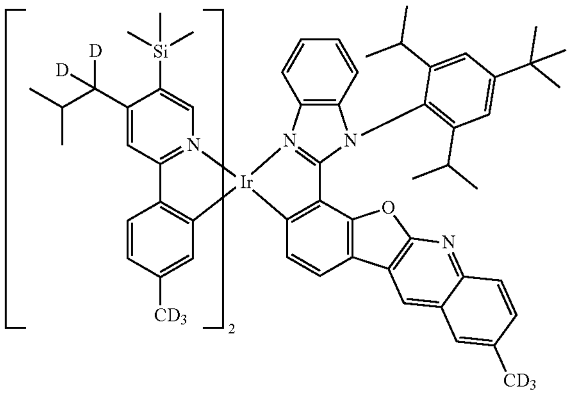
3024
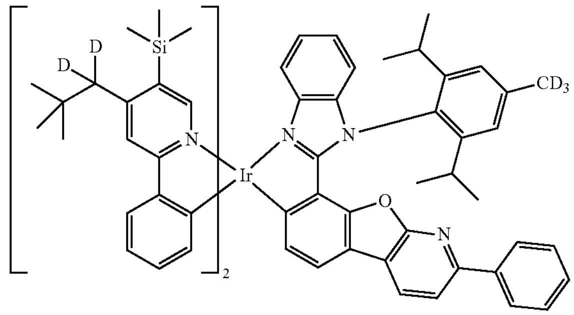
3025
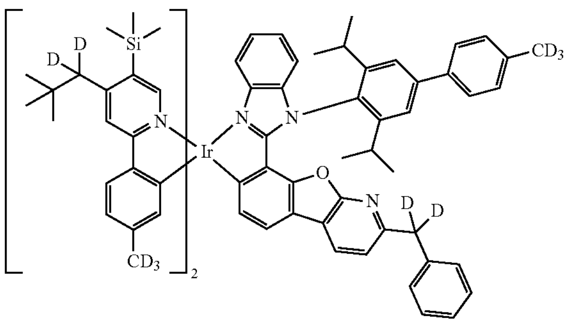
3026
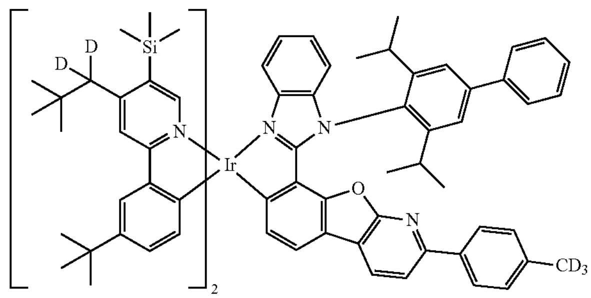
3027
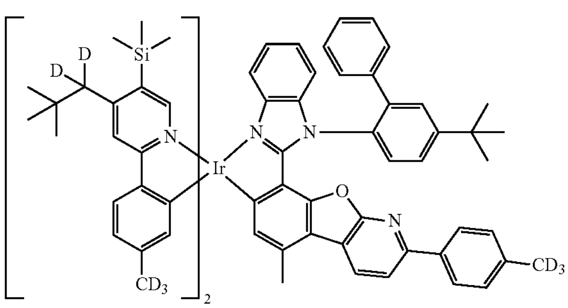
3028
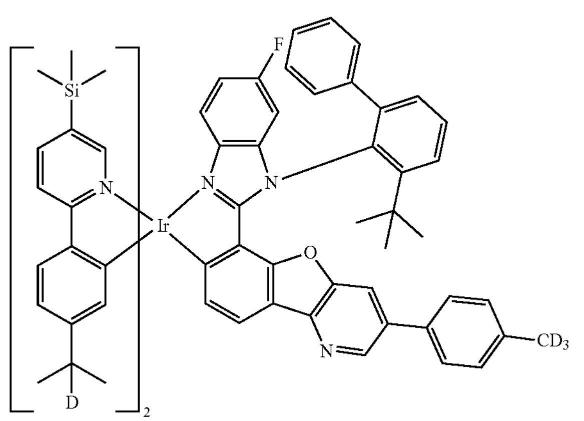
3029
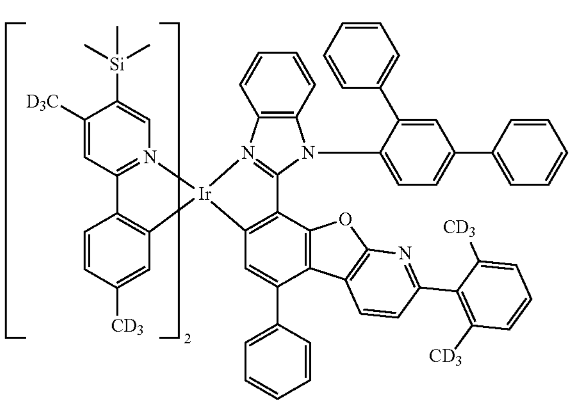
3030
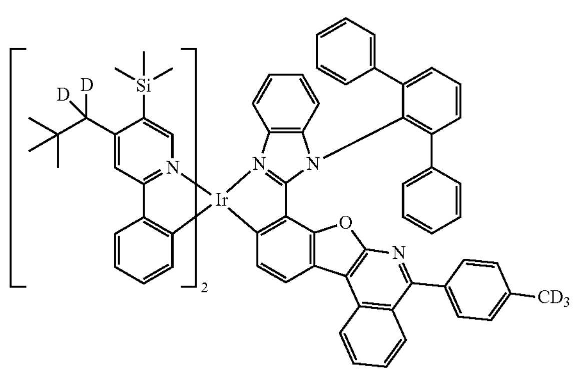

-continued
3031
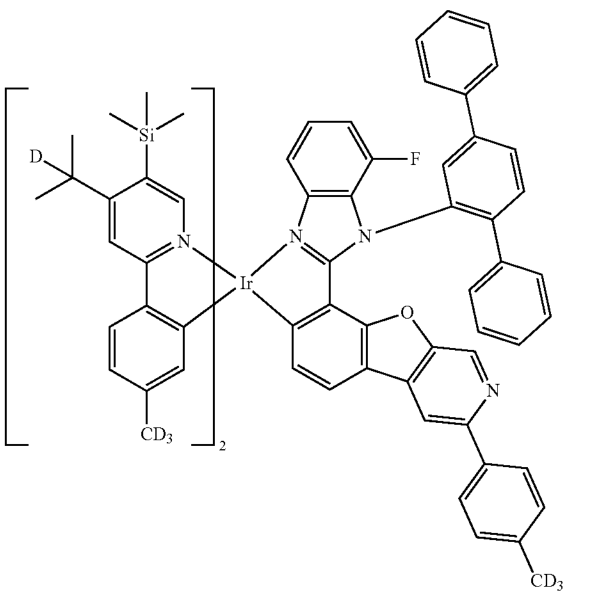
3032
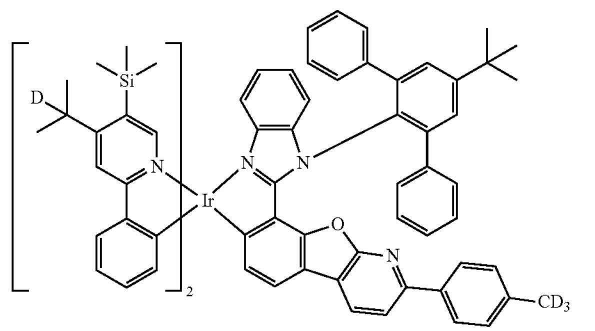
3033
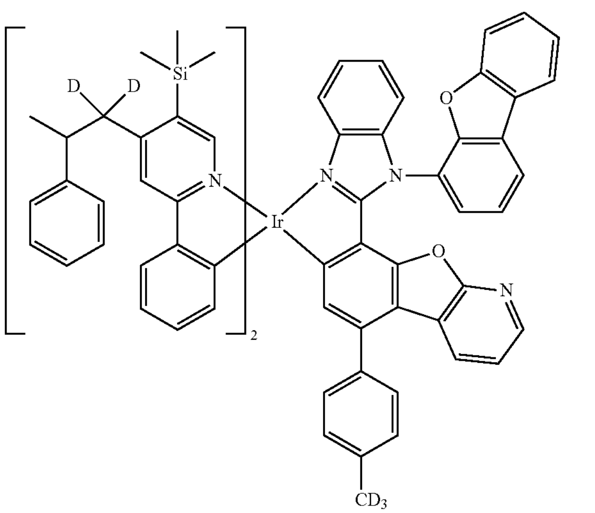
3034
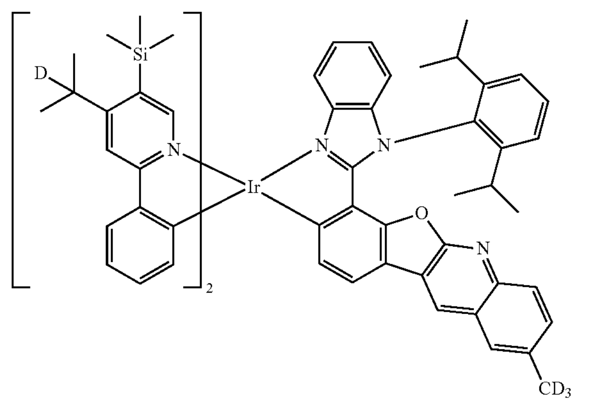
3035
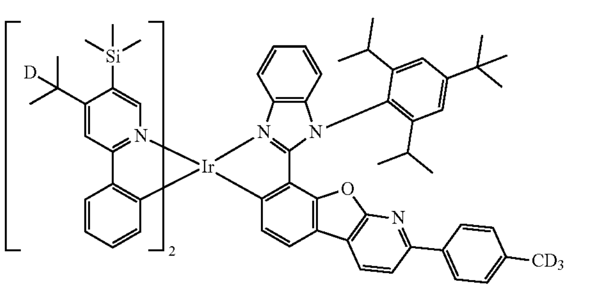
3036
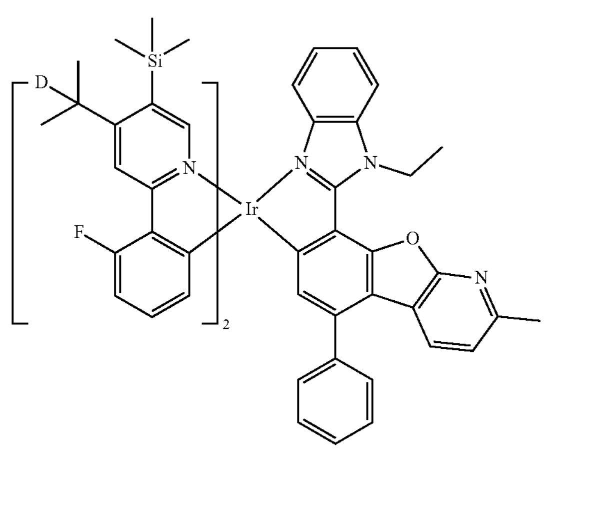

-continued
3037
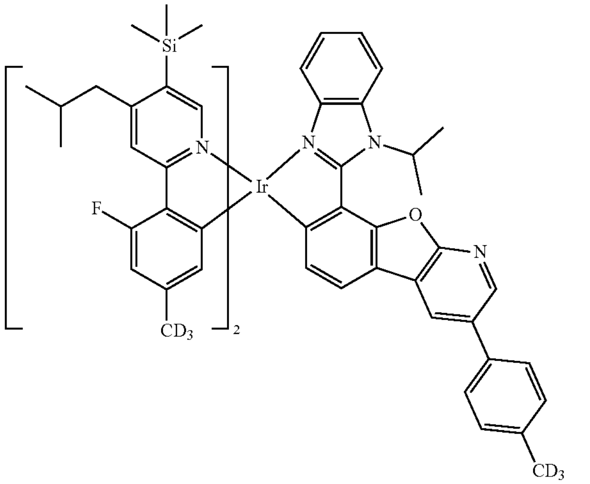
3038
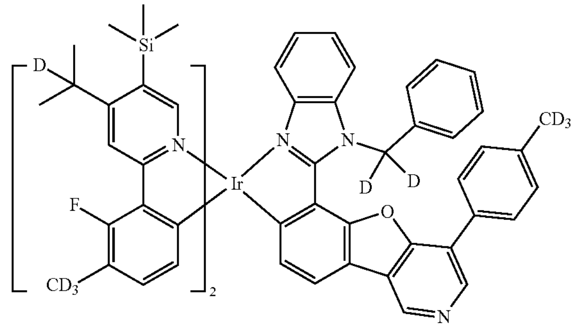
3039
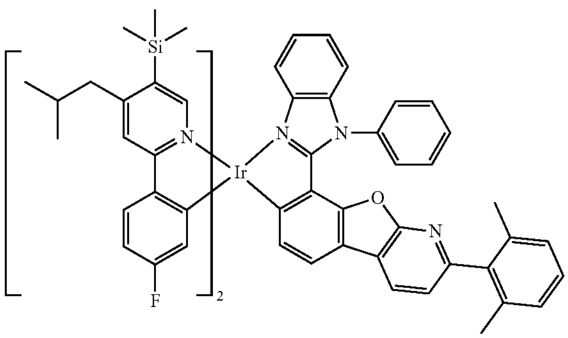
3040
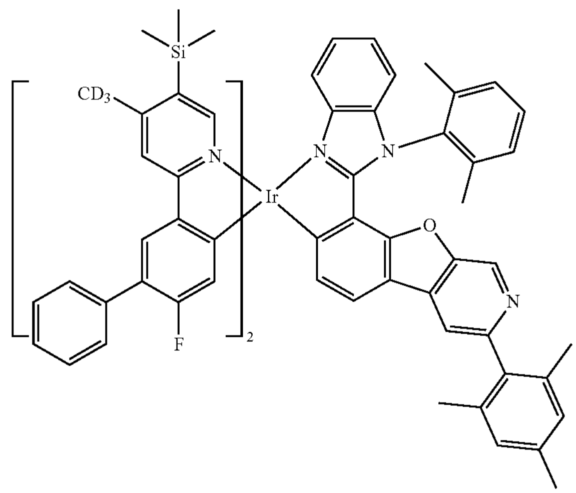
3041
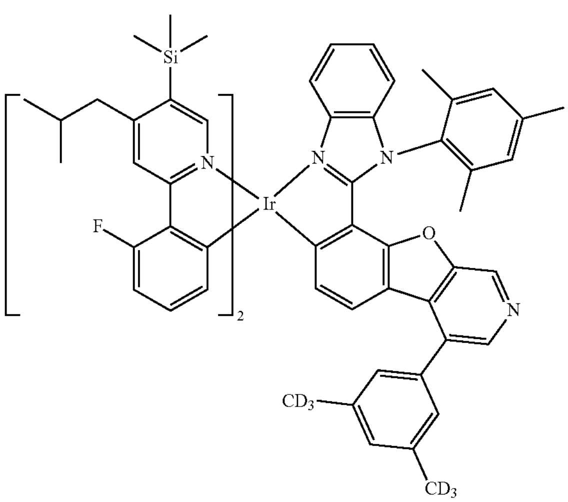
3042
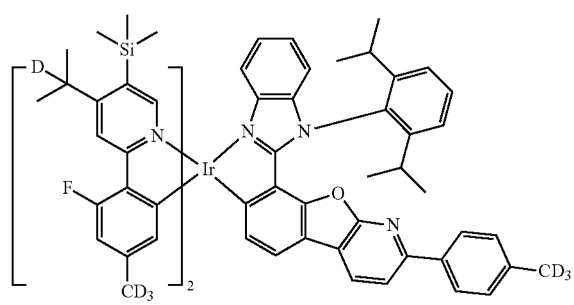

-continued
3043
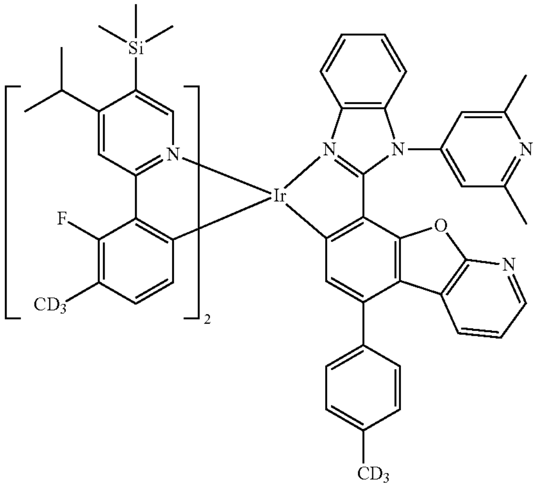
3044
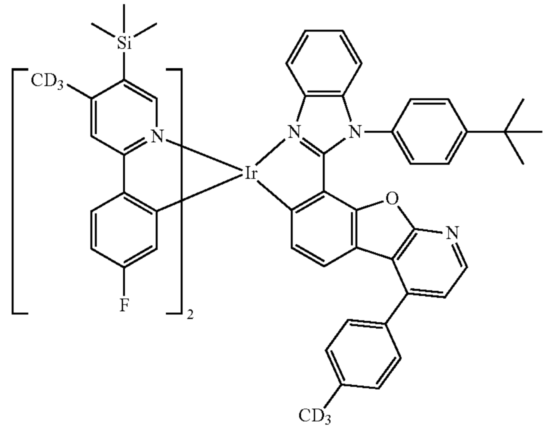
3045
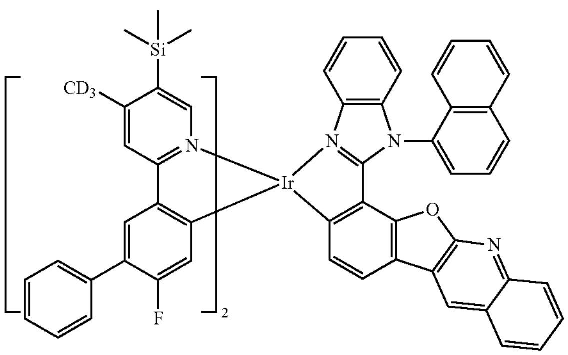
3046
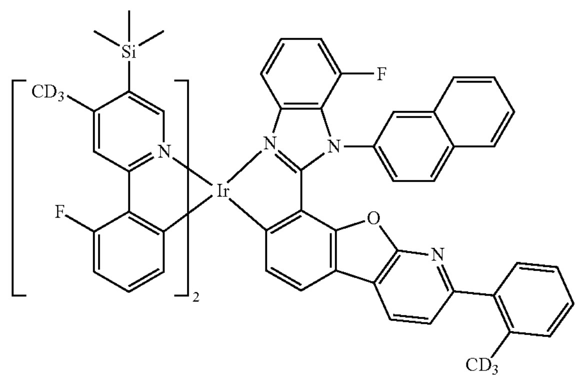
3047
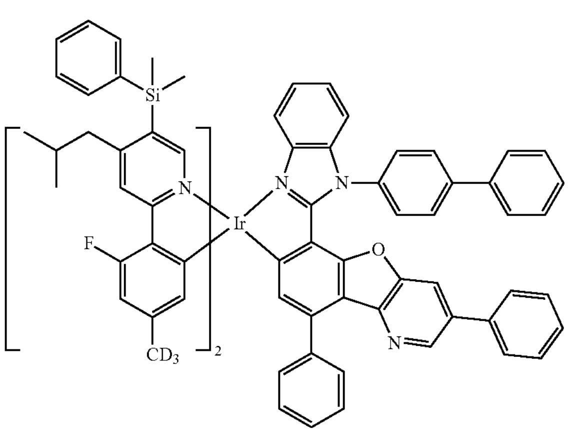
3048
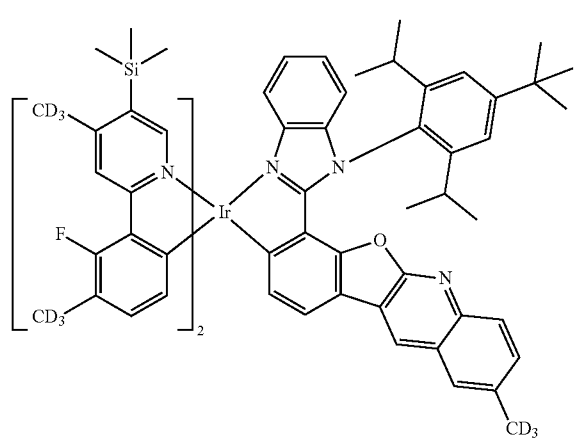

-continued
3049
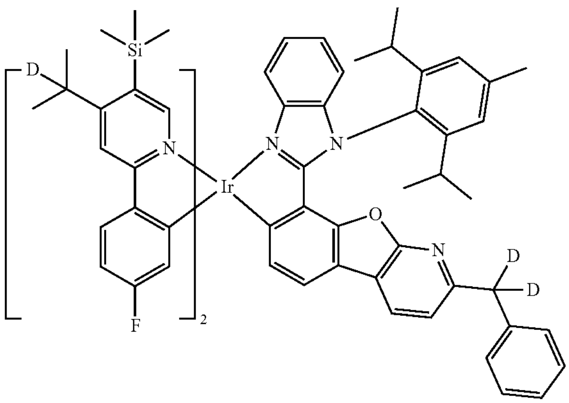
3050
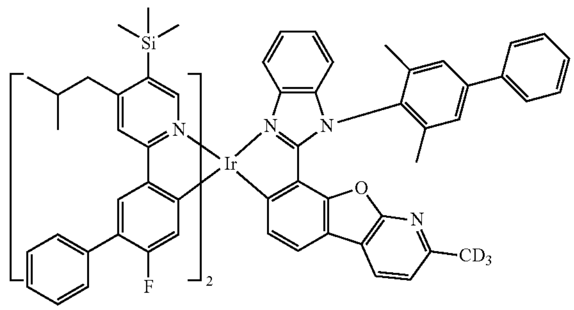
3051
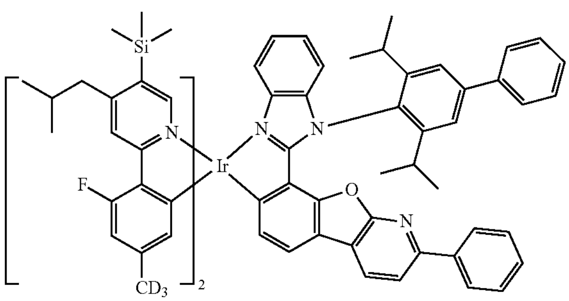
3052
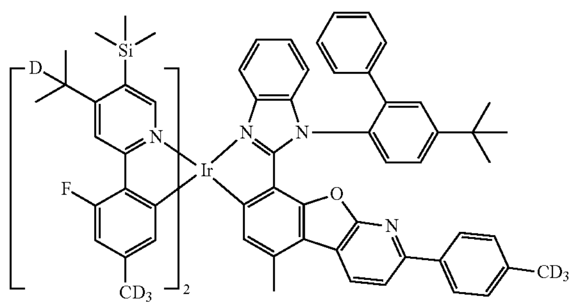
3053
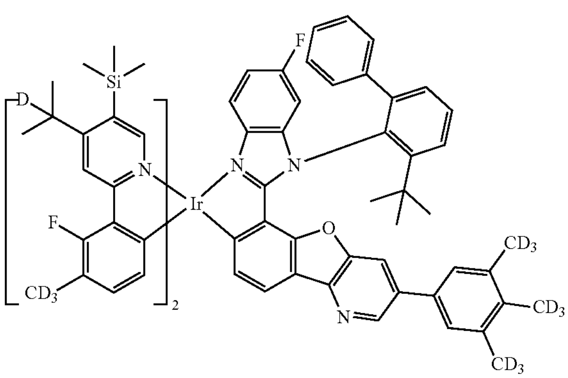
3054
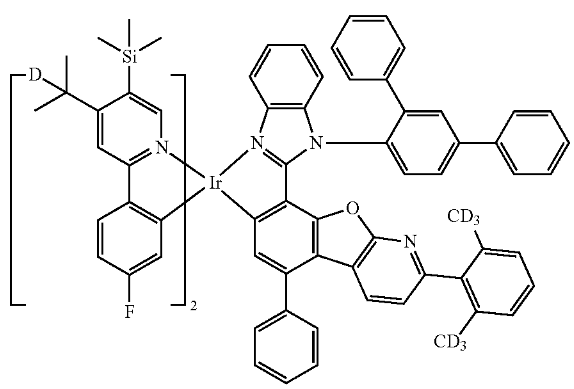

-continued
3055
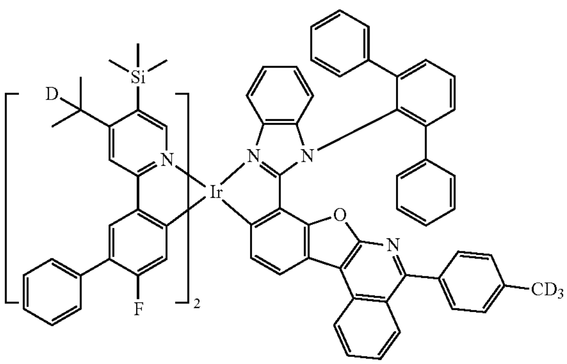
3056
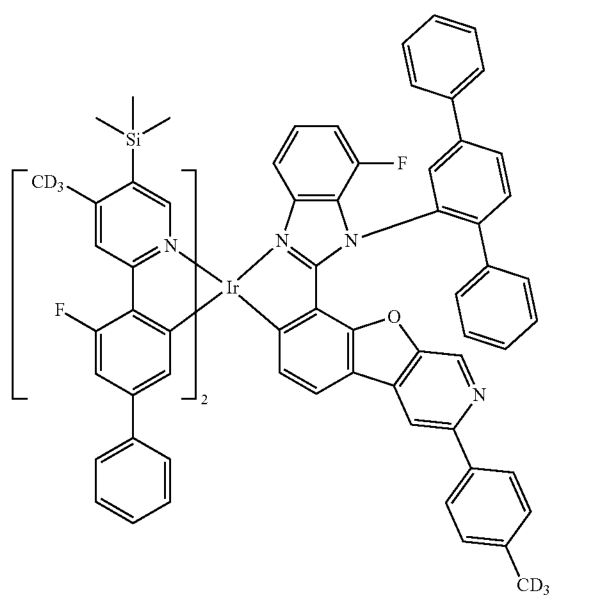
3057
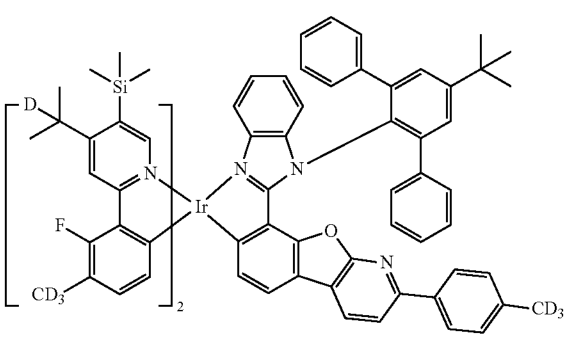
3058
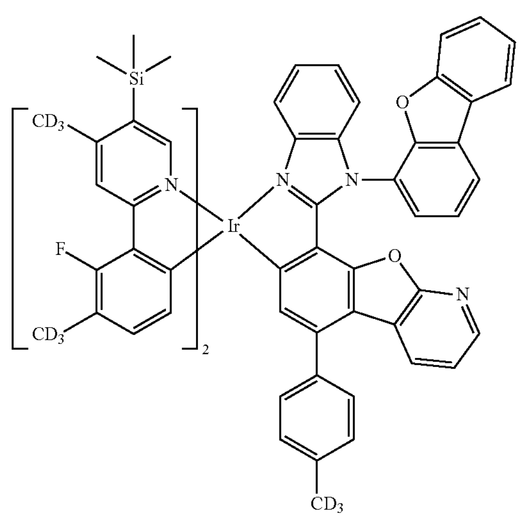
3059
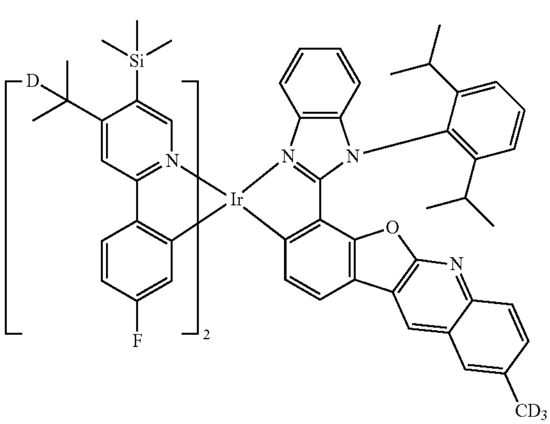
3060
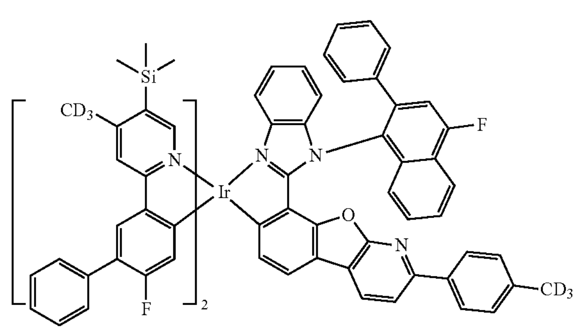

-continued
3061
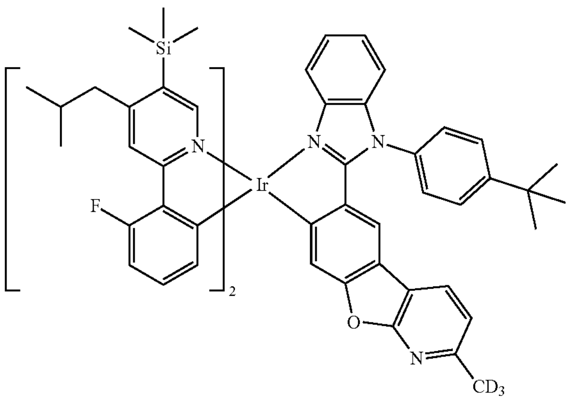
3062
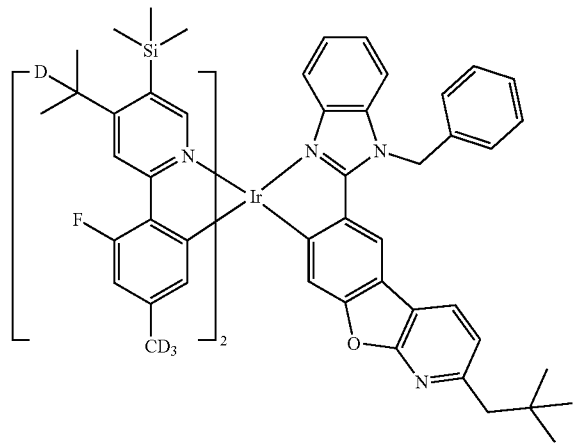
3063
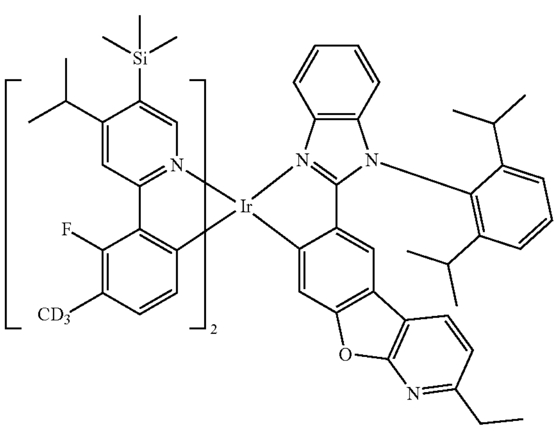
3064
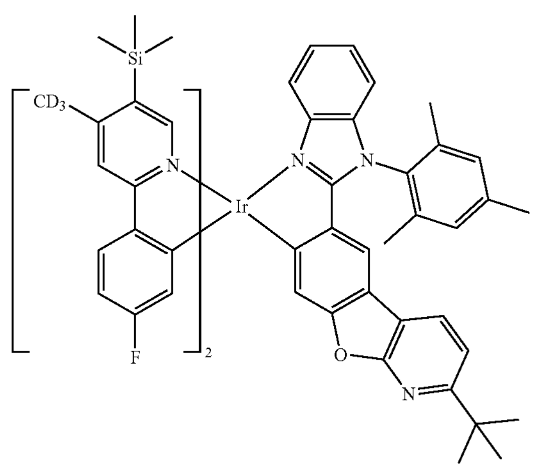
3065
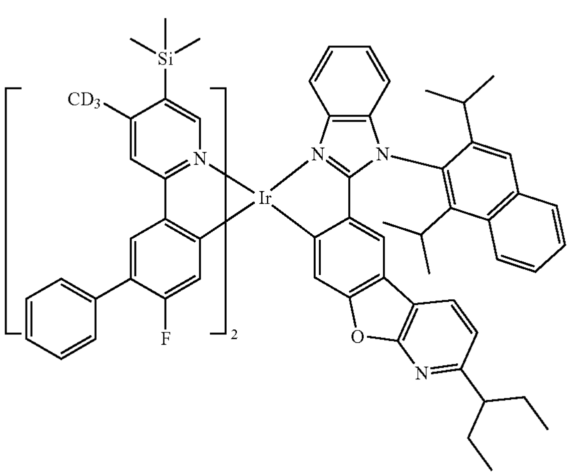
3066
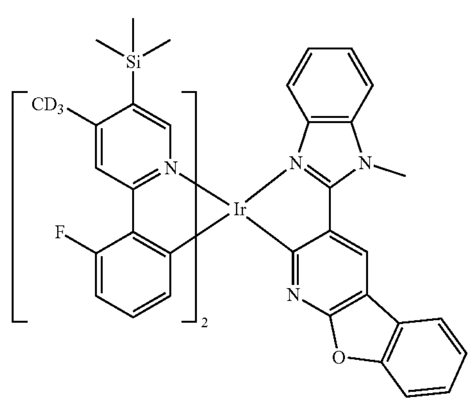

-continued
3067
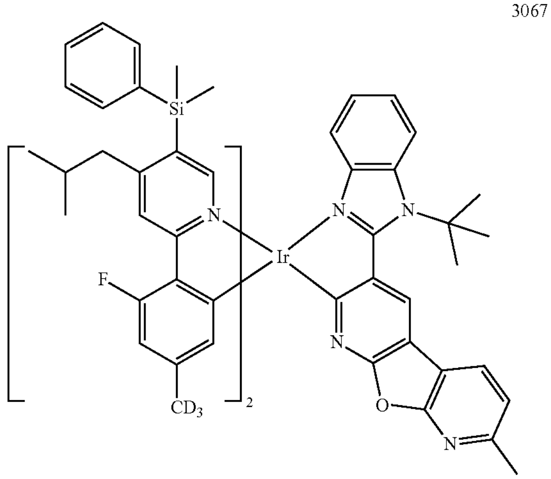
3068
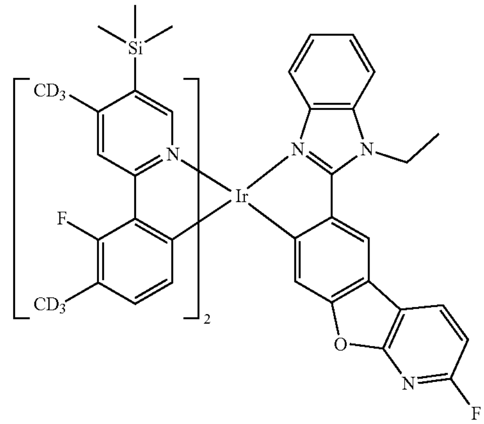
3069
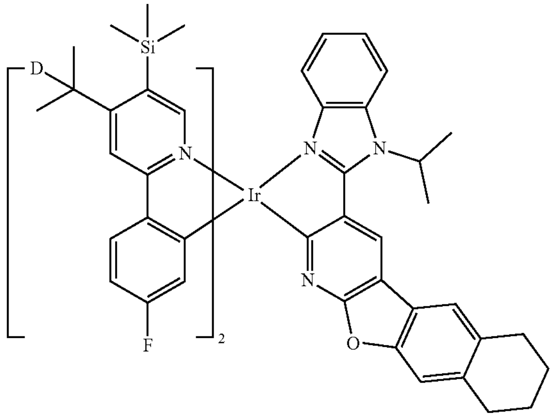
3070
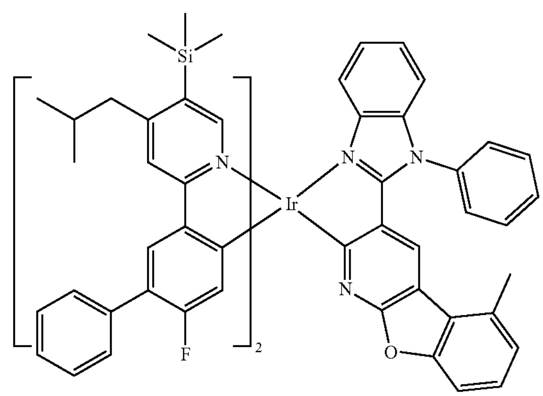
3071
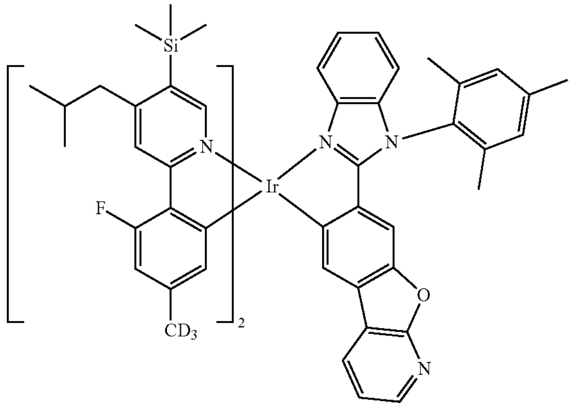
3072
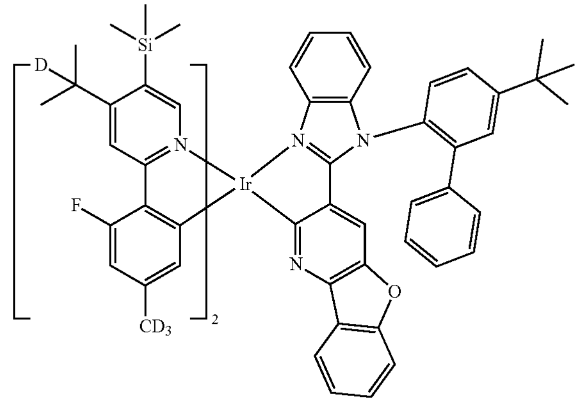

-continued
3073
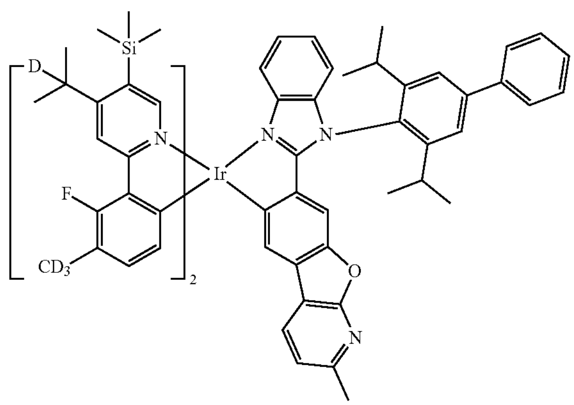
3074
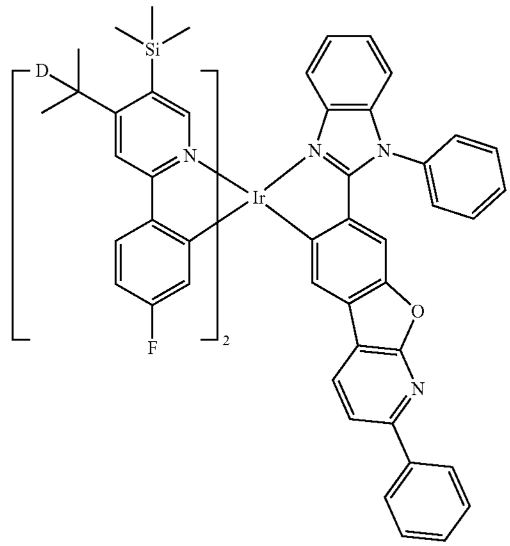
3075
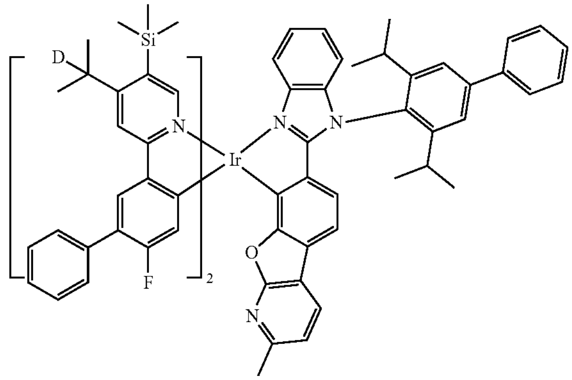
3076
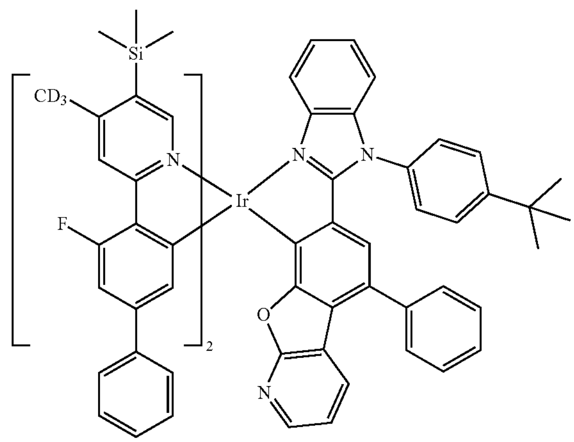
3077
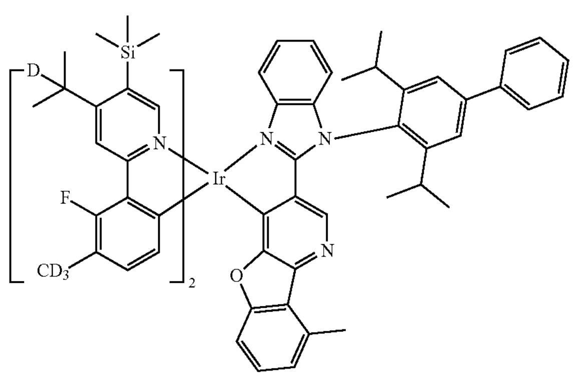
3078
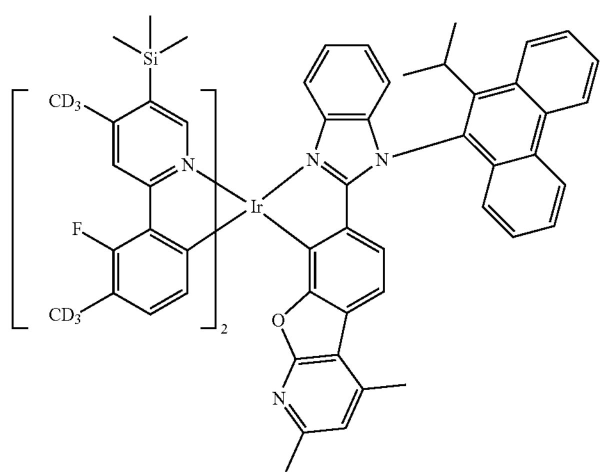

-continued
3079
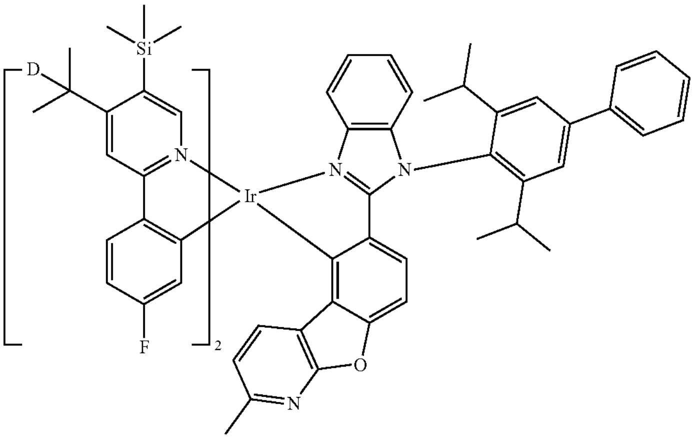
3080
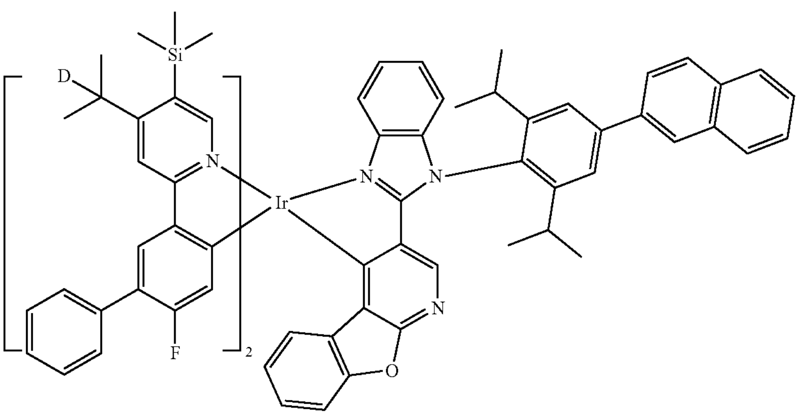
3081
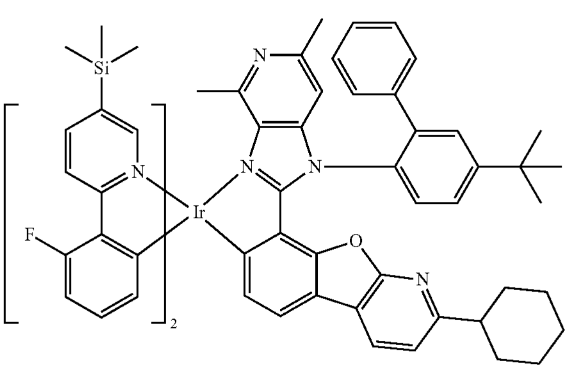
3082
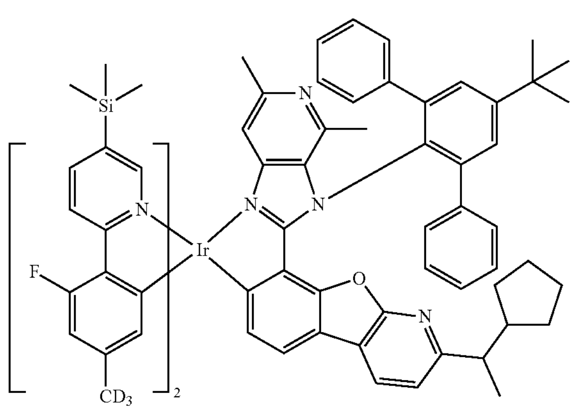

-continued
3083
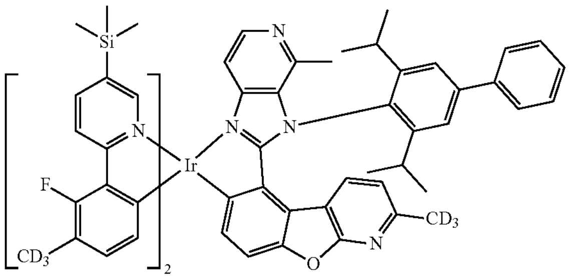
3084
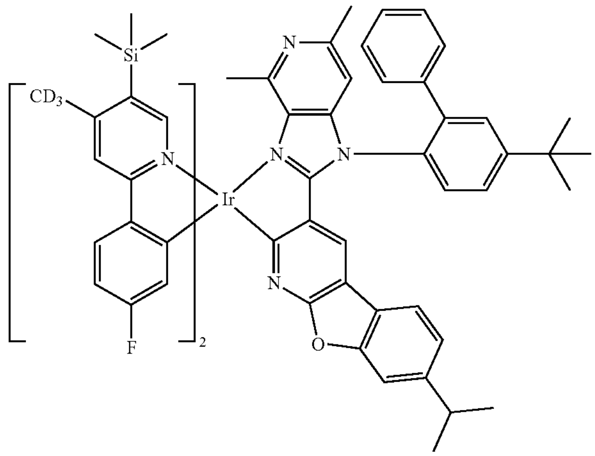
3085
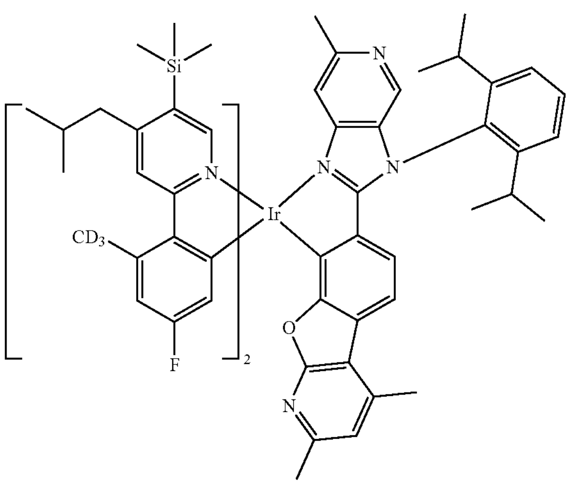
3086
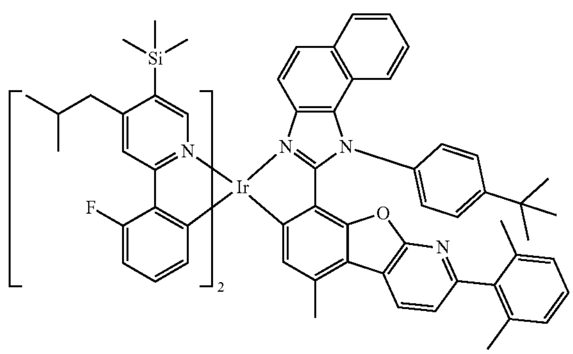
3087
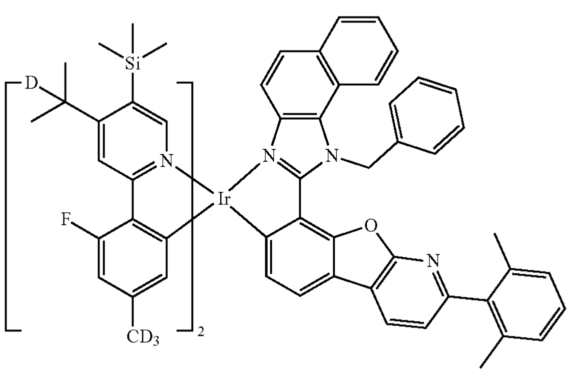
3088
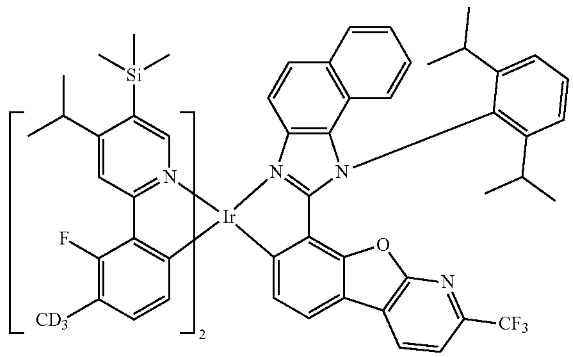

-continued
3089
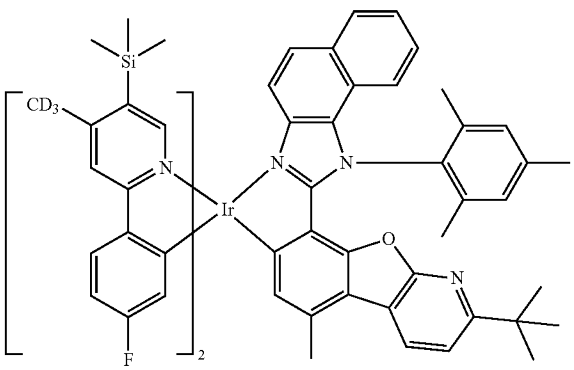
3090
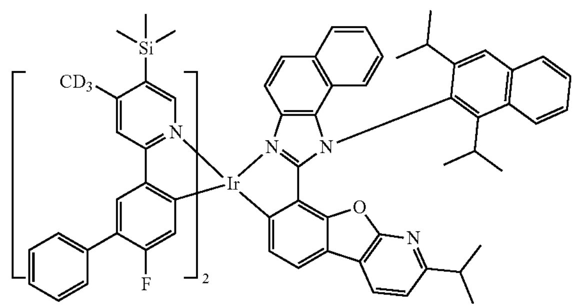
3091
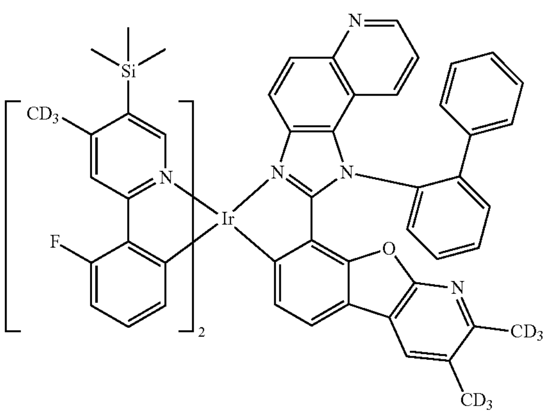
3092
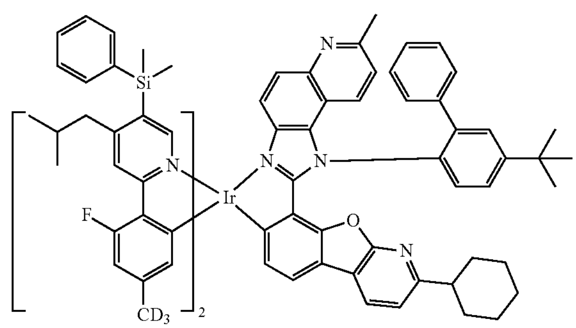
3093
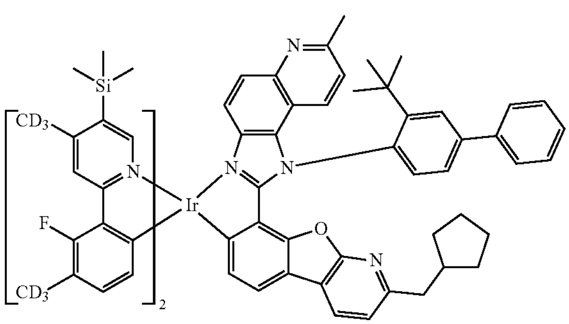
3094
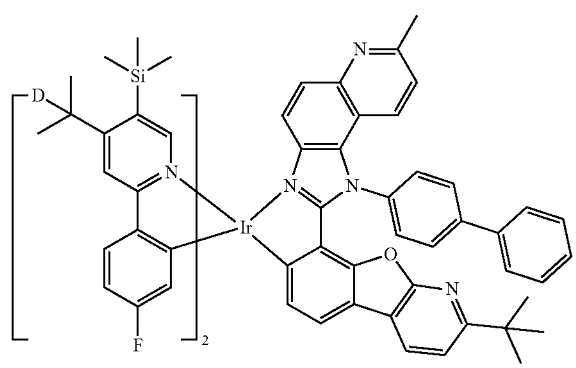
3095
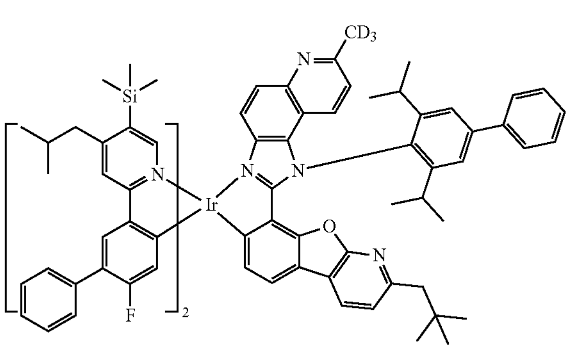
3096
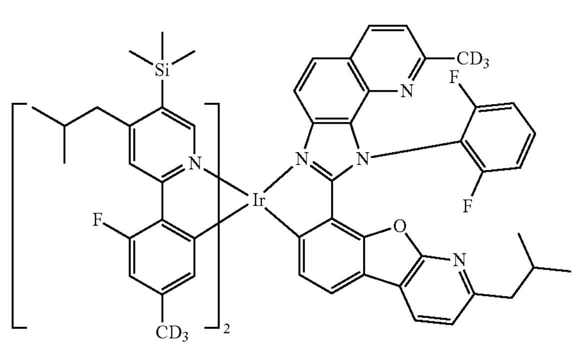

-continued
3097
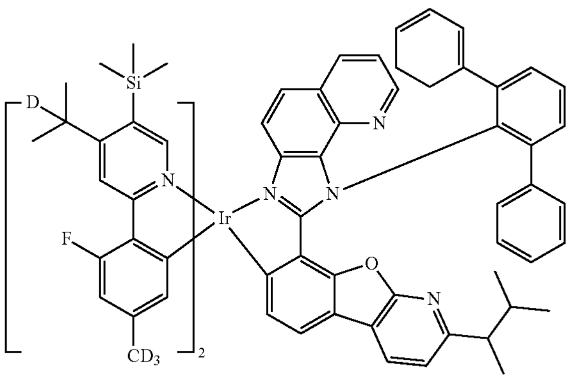
3098
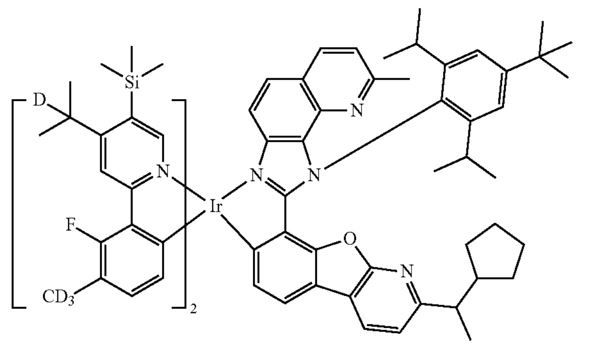
3099
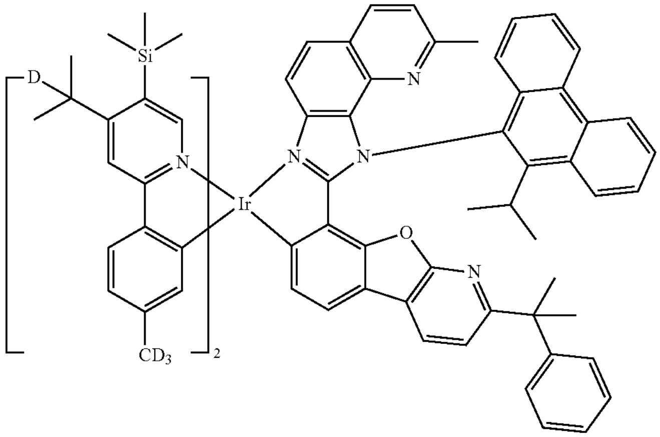
3100
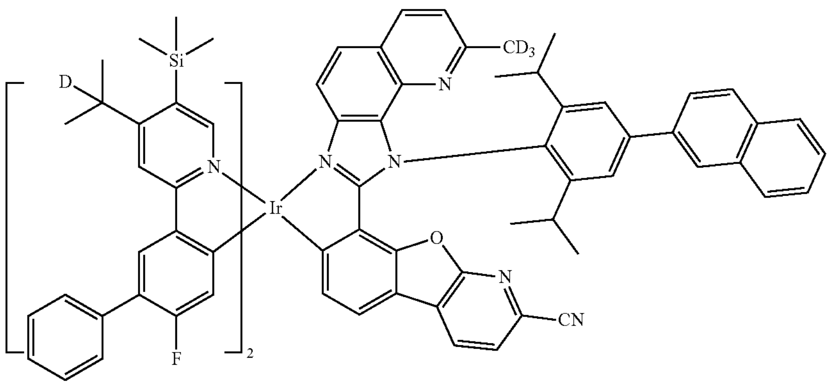
3101
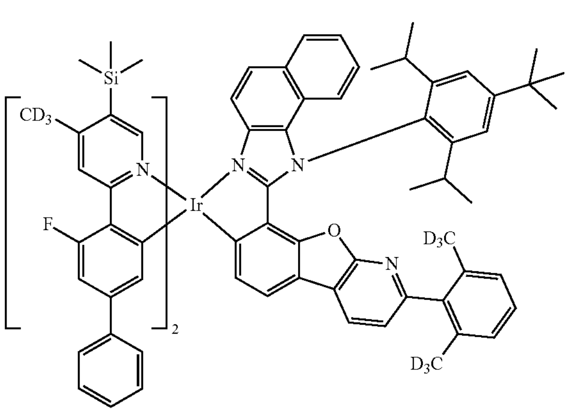
3102
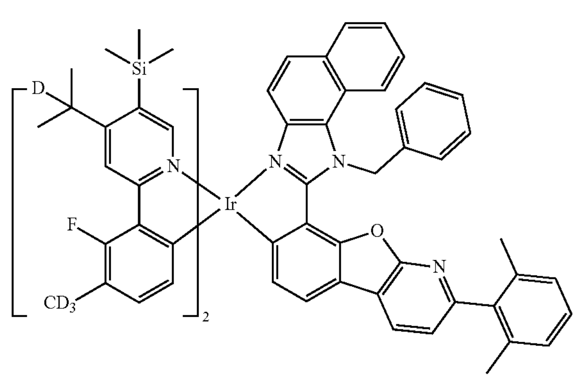

-continued
3103
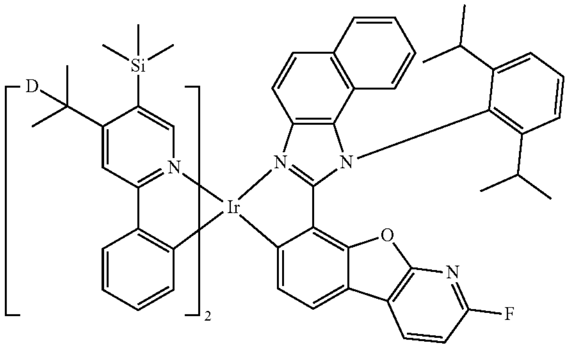
3104
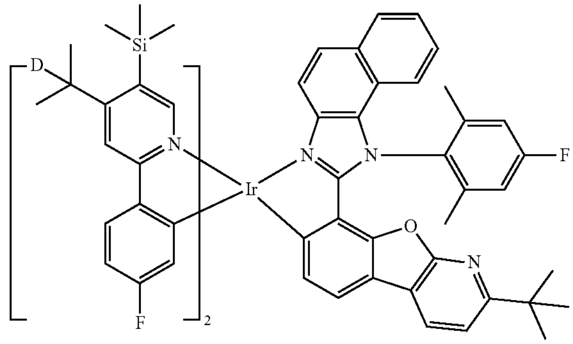
3105
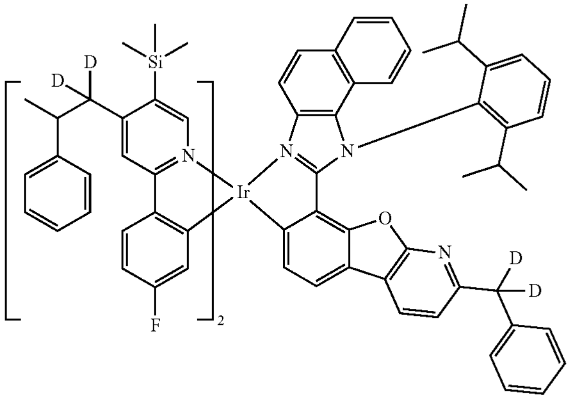
3106
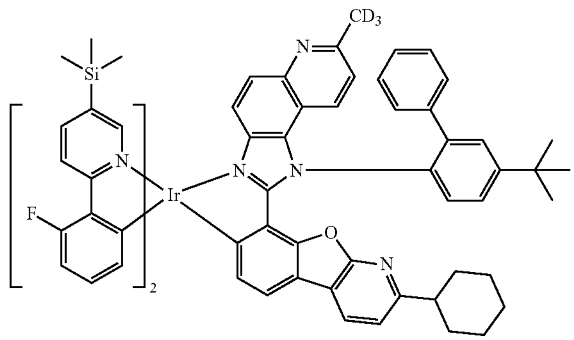
3107
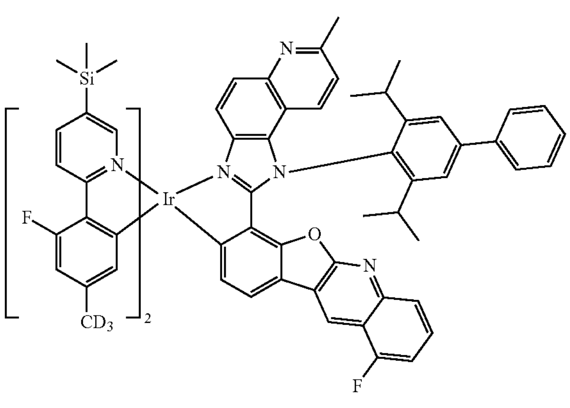
3108
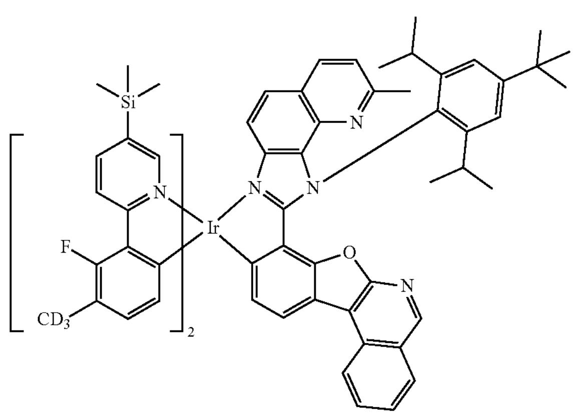
3109
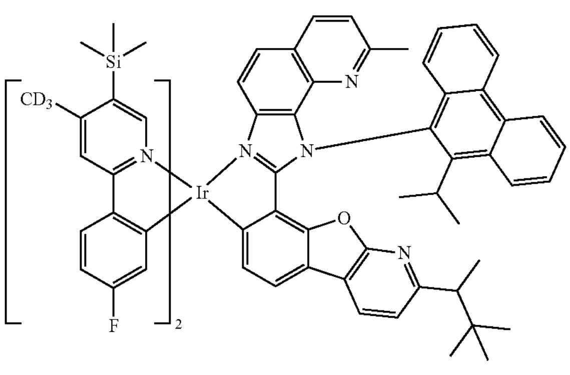
3110
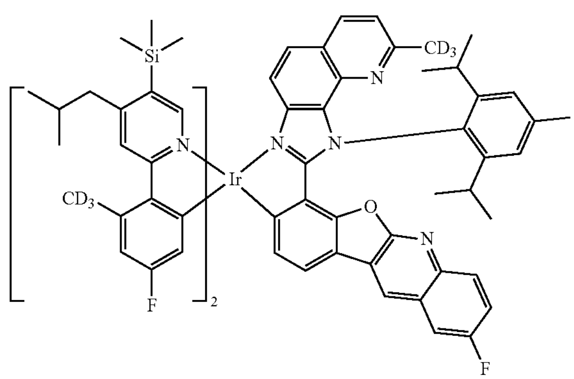

-continued
3111
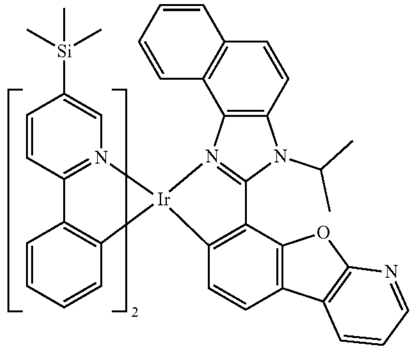
3112
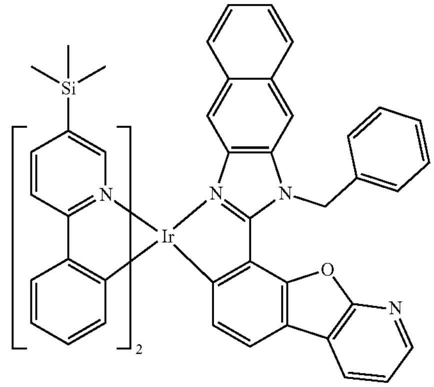
3113
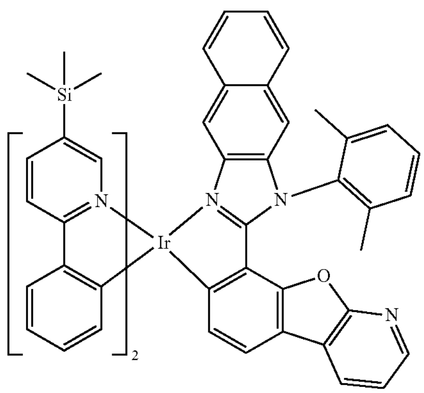
3114
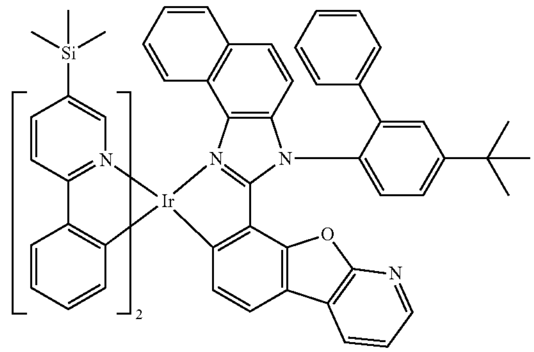
3115
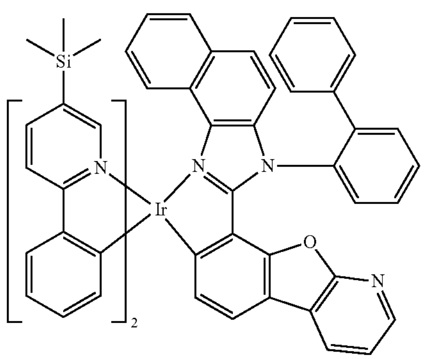
3116
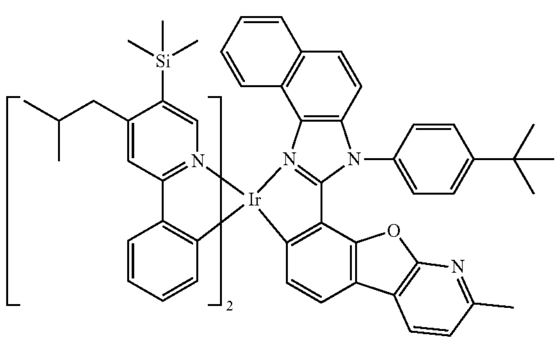
-continued
3117
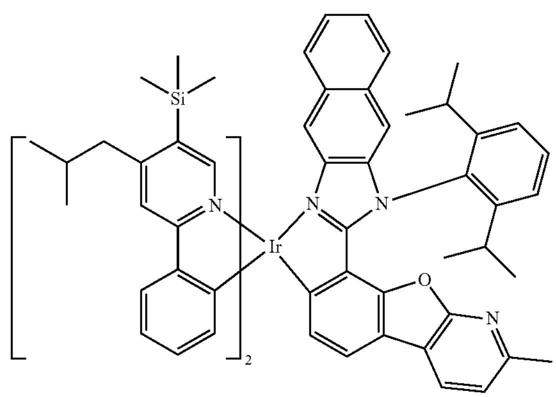
3118
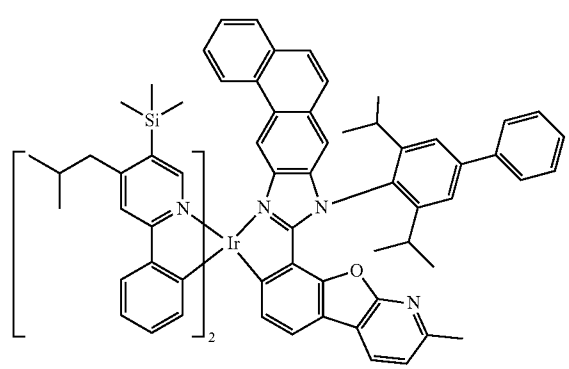

-continued
3119
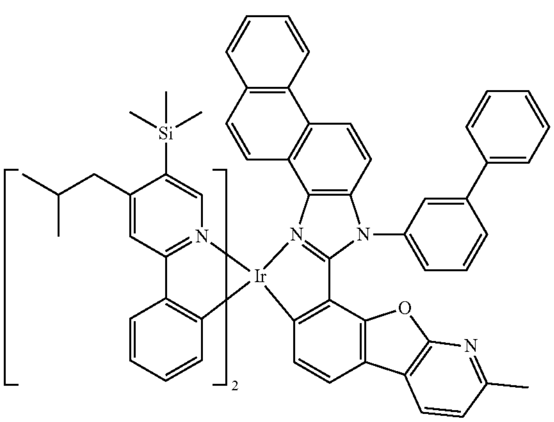
3120
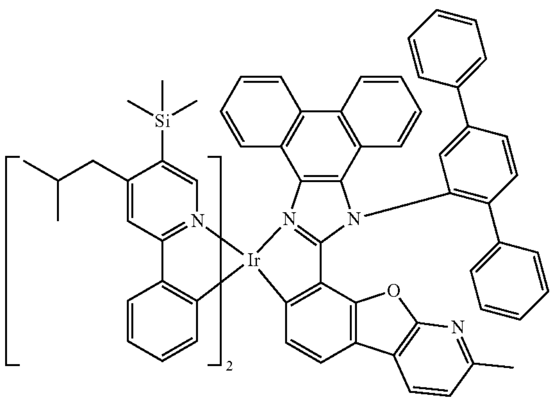
3121
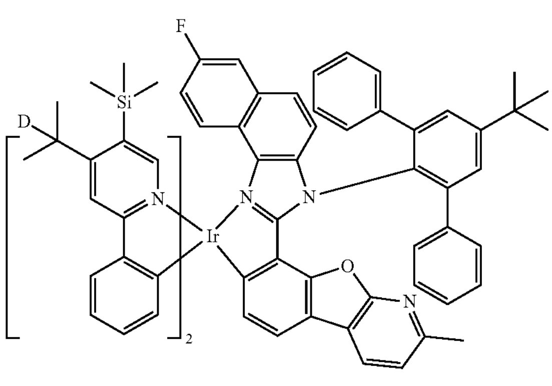
3122
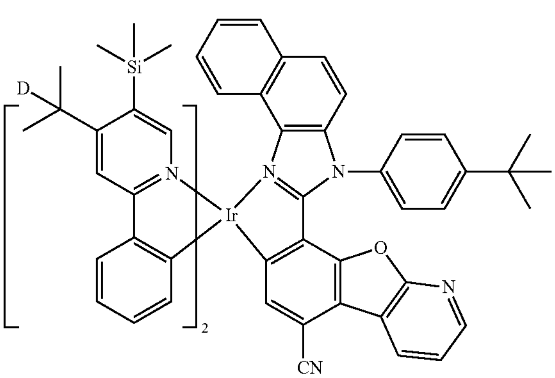
-continued
3123
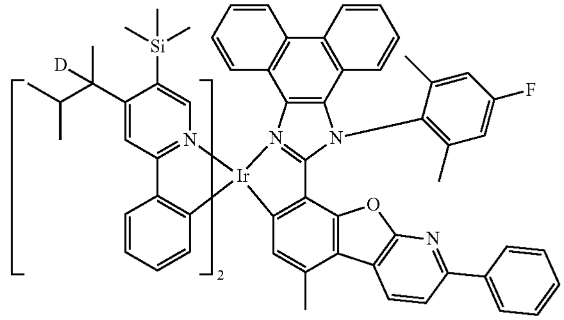
3124
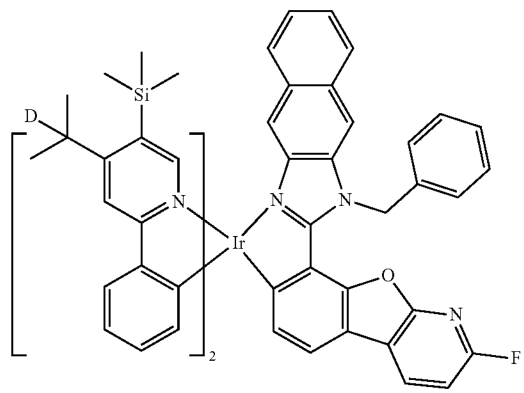
3125
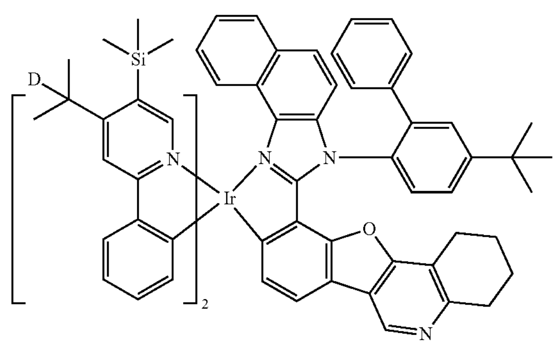
3126
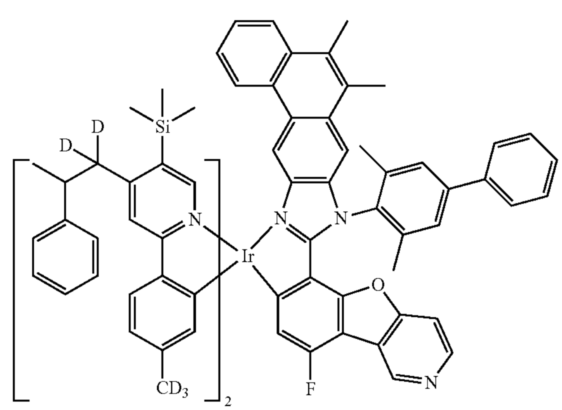

-continued
3127
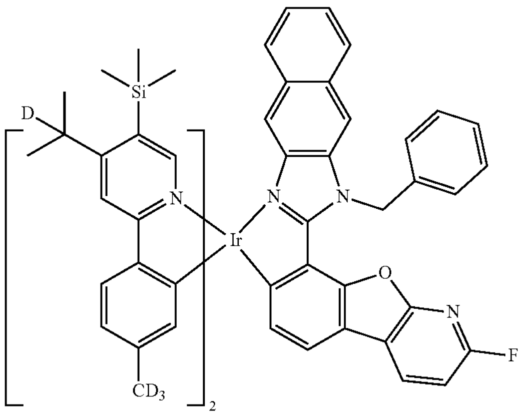
3128
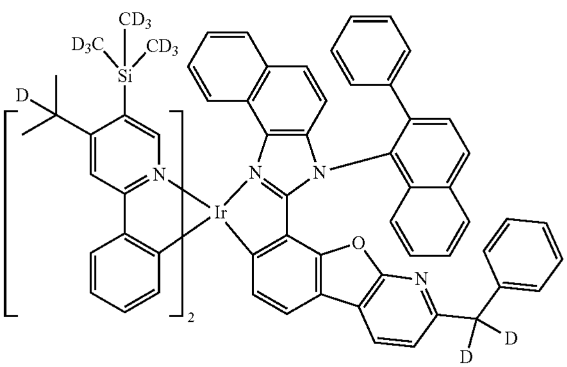
3129
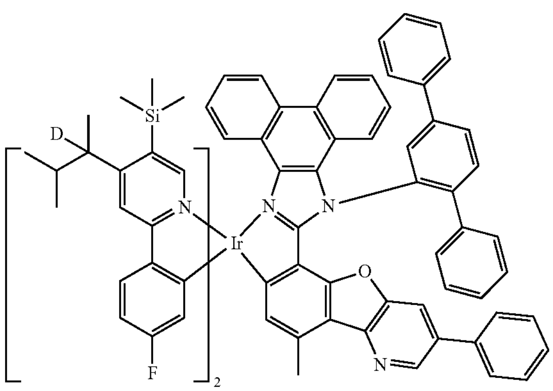
3130
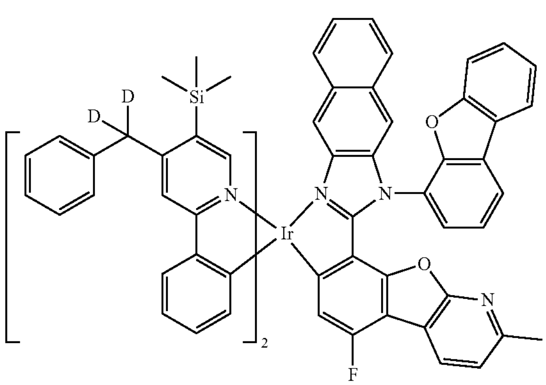
-continued
3131
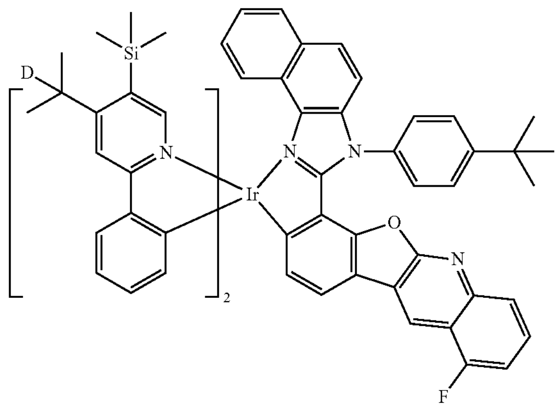
3132
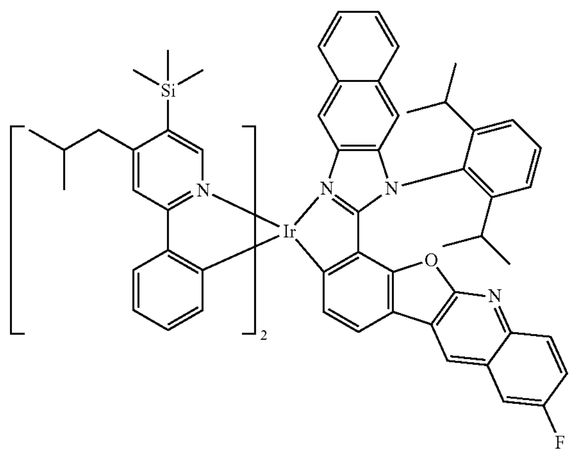
3133
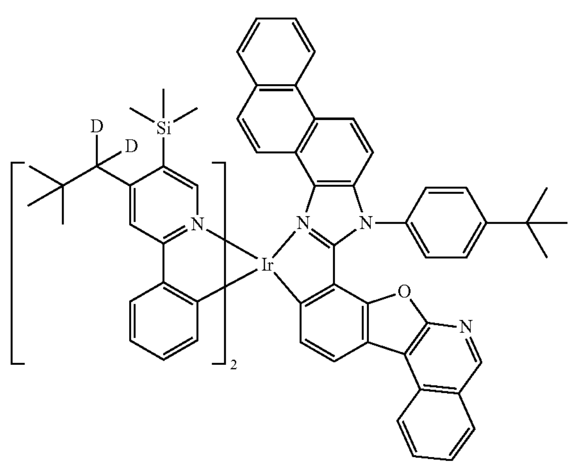

-continued
3134
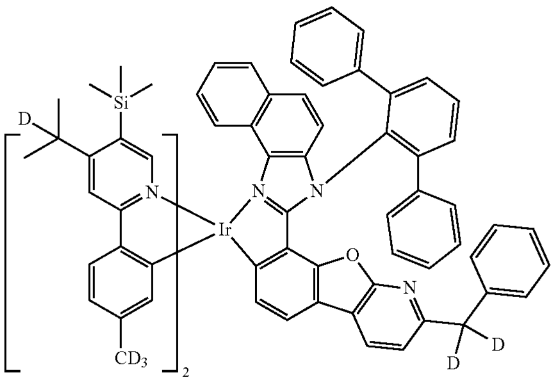
3135
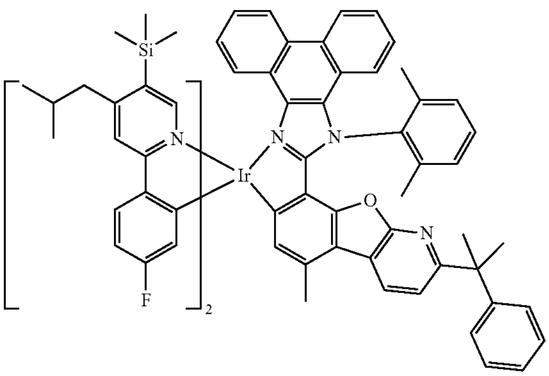
3136
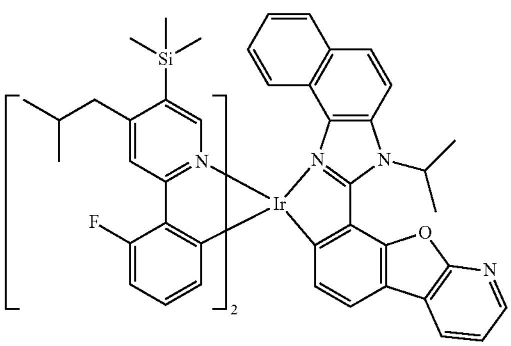
3137
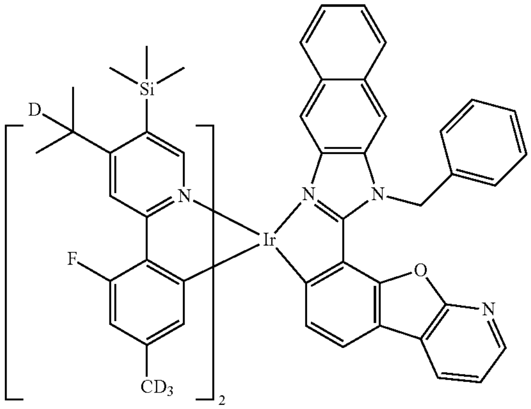
-continued
3138
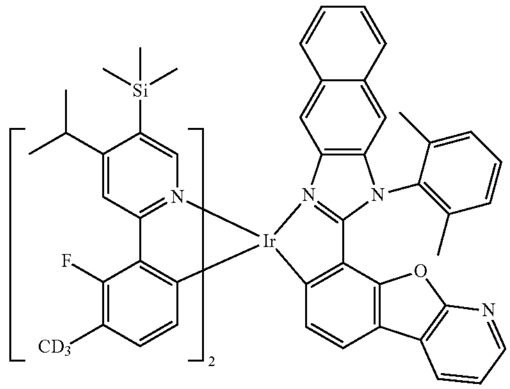
3139
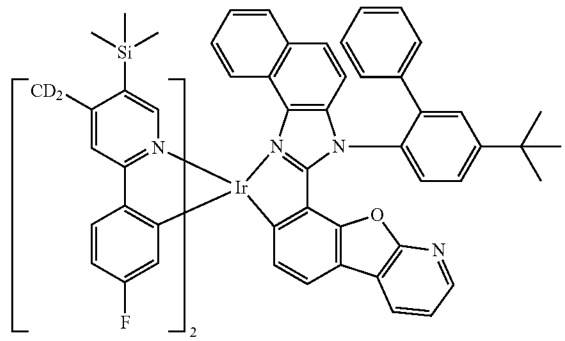
3140
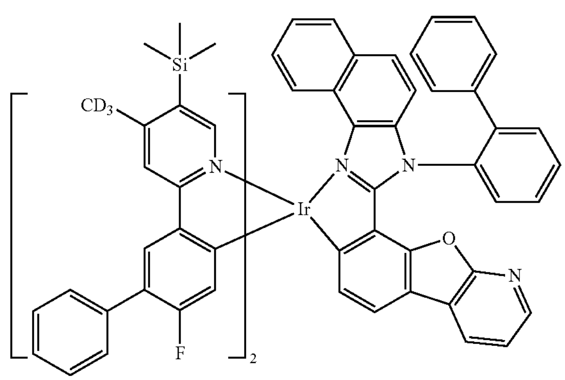
3141
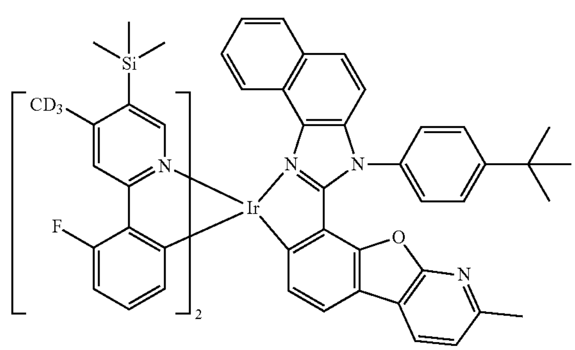

-continued
3142
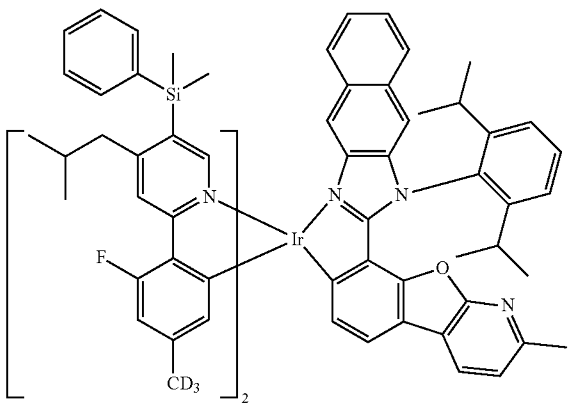
3143
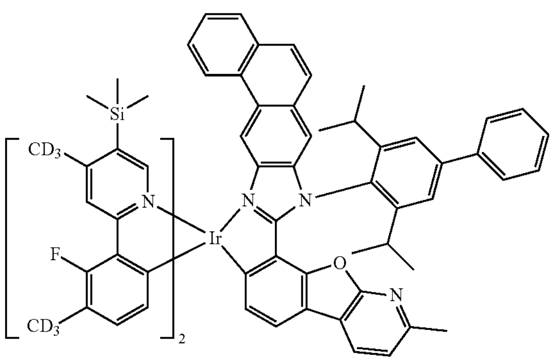
3144
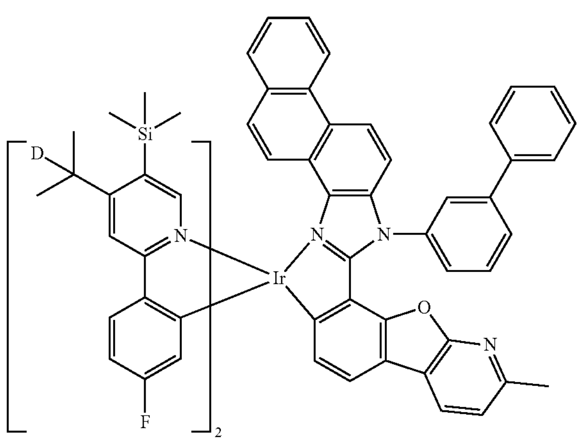
-continued
3145
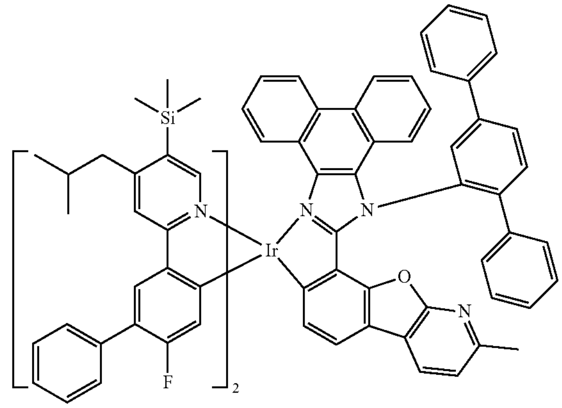
3146
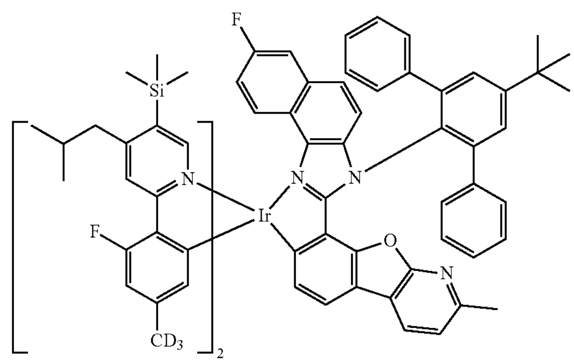
3147
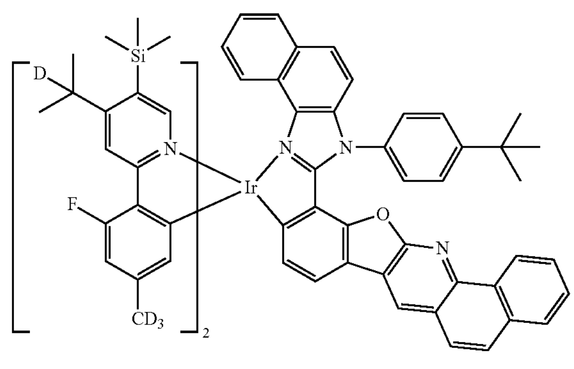
3148
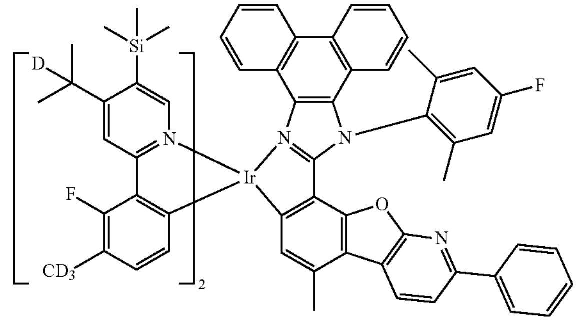

-continued
3149
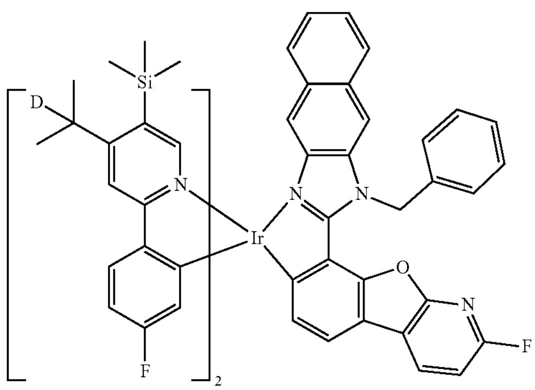
3150
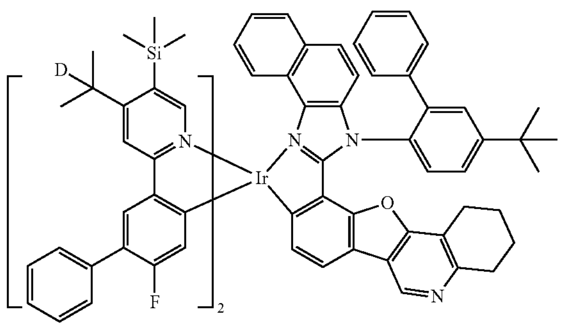
3151
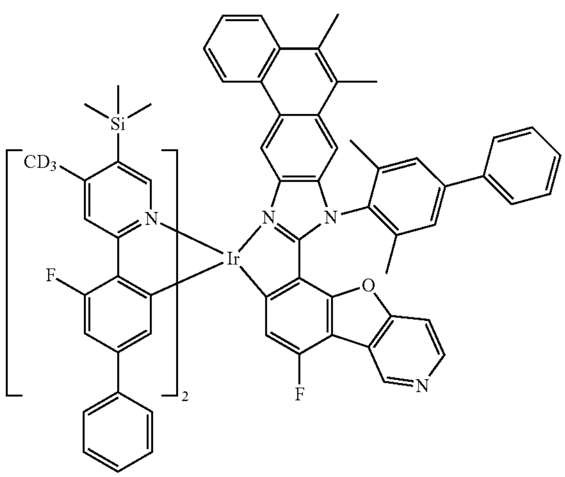
3152
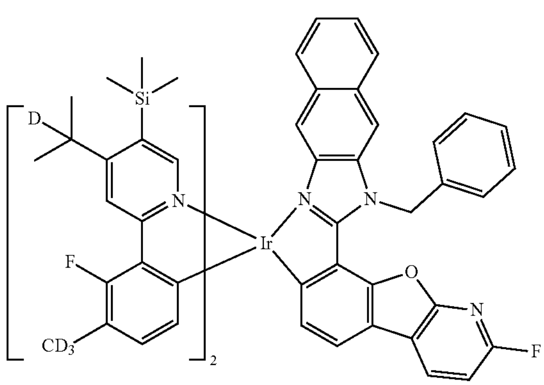
-continued
3153
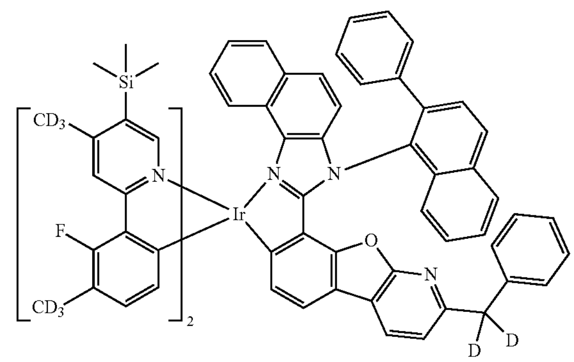
3154
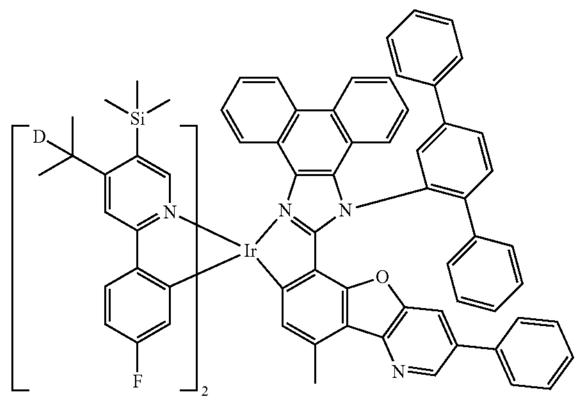
3155
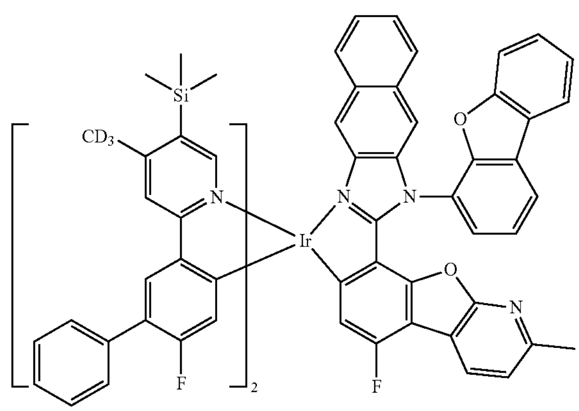
3156
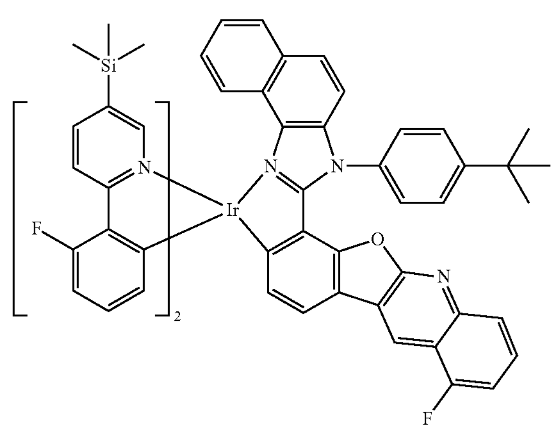

-continued
3157
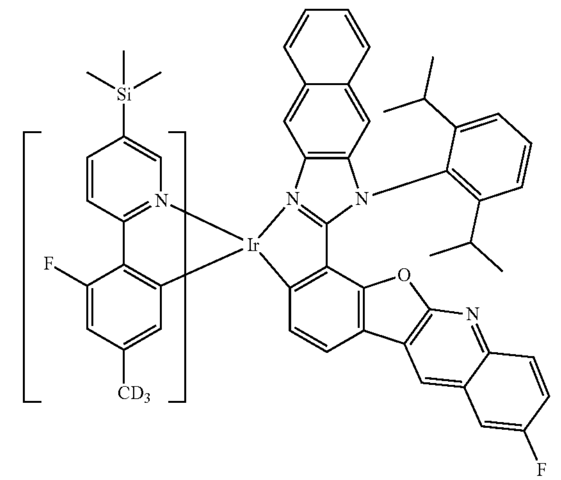
3158
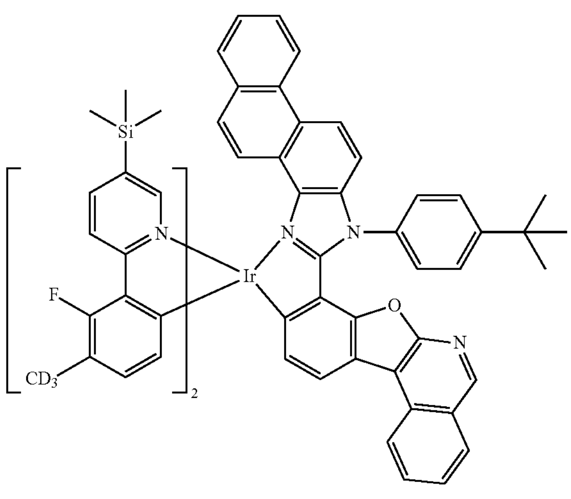
3159
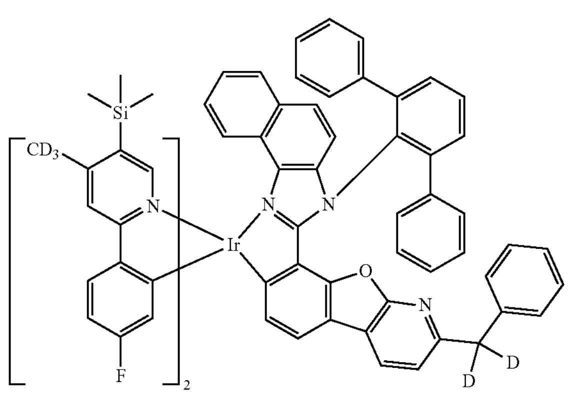
-continued
3160
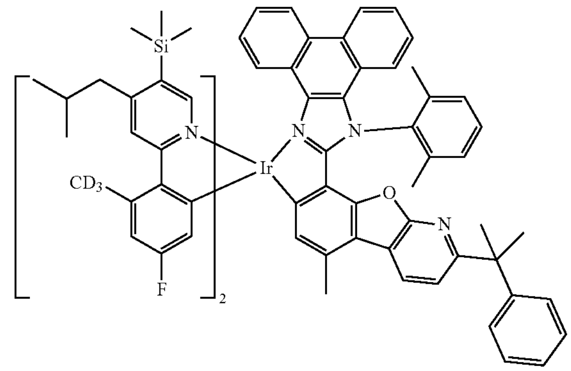
3161
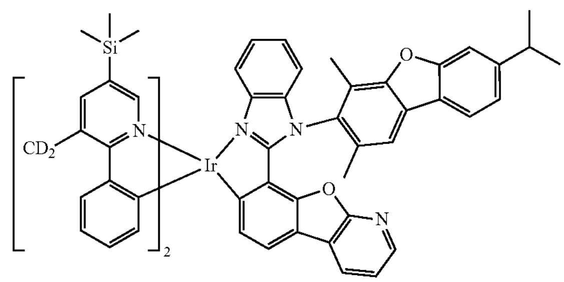
3162
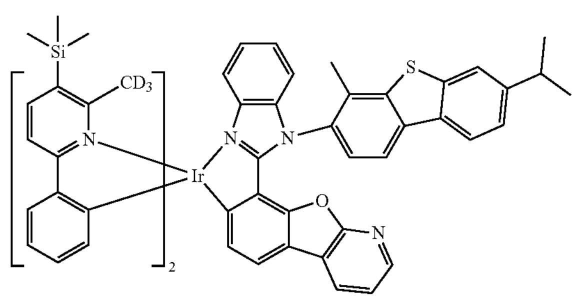
3163
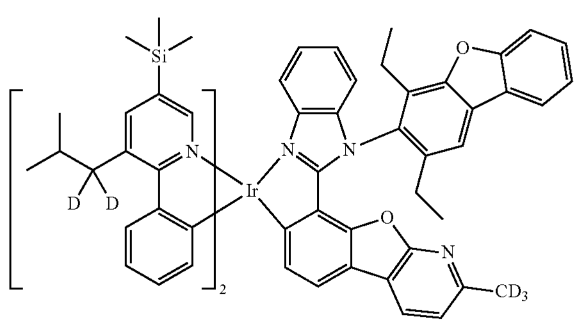

3164
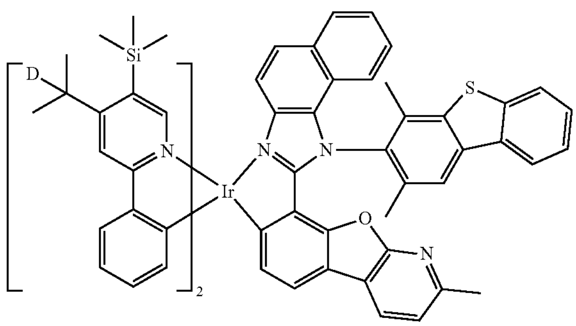
3165
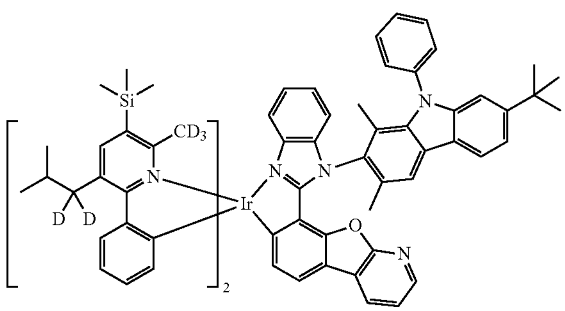
3166
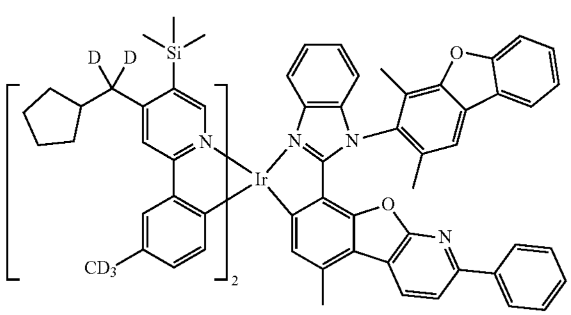
3167
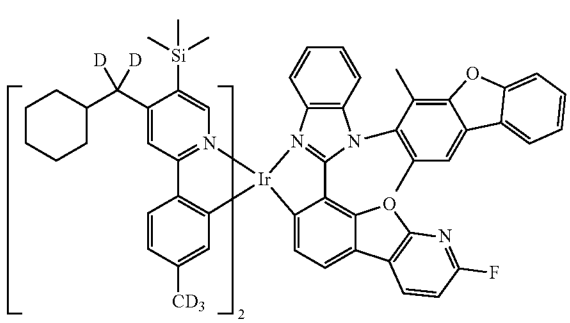
3168
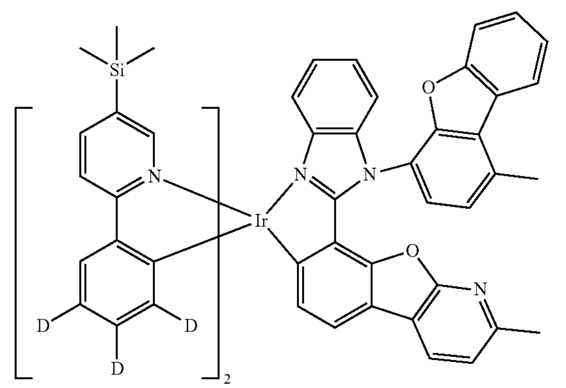
3169
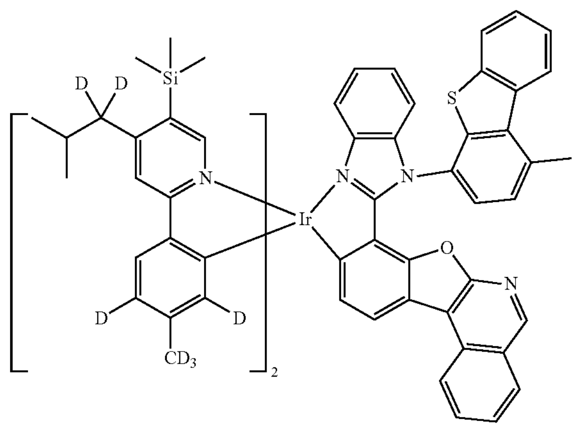
3170
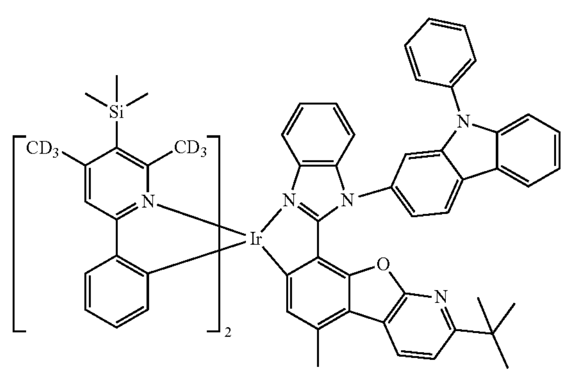
3171
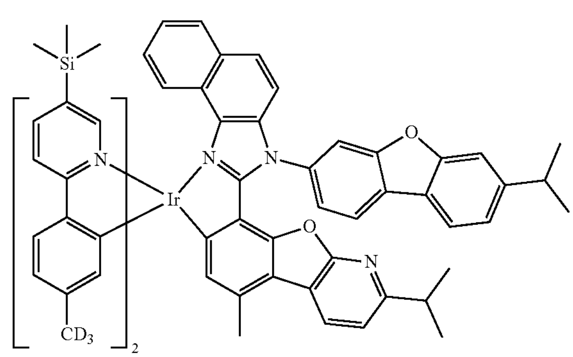

-continued
3172
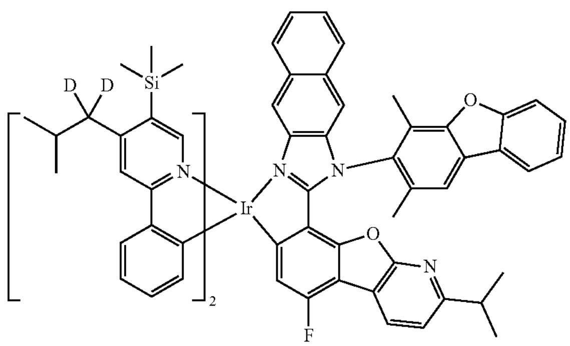
3173
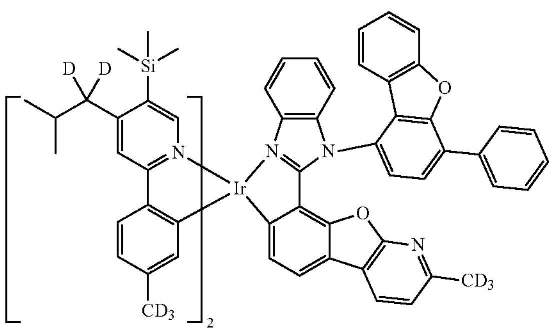
3174
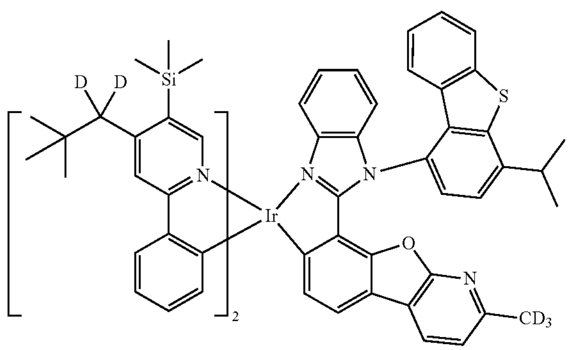
3175
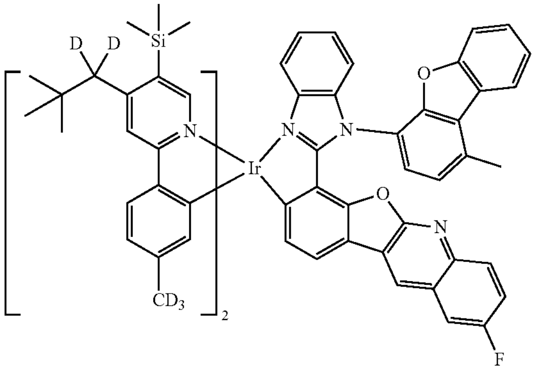
-continued
3176
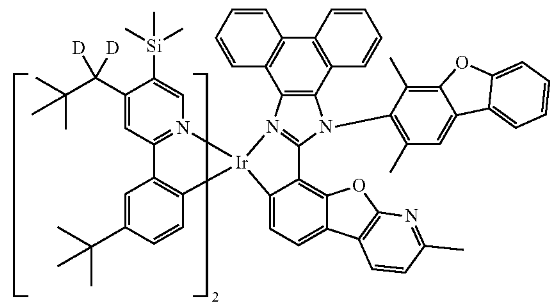
3177
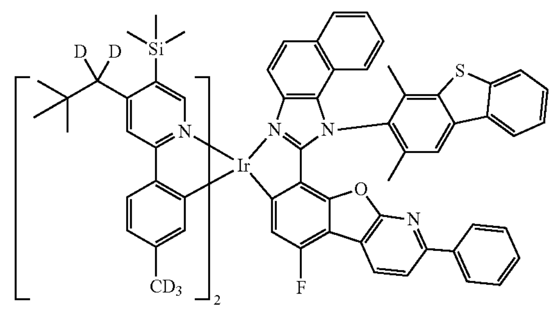
3178
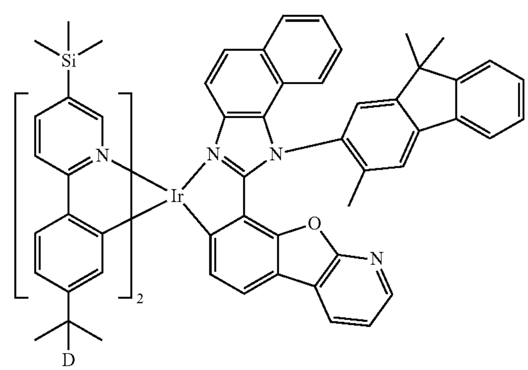
3179
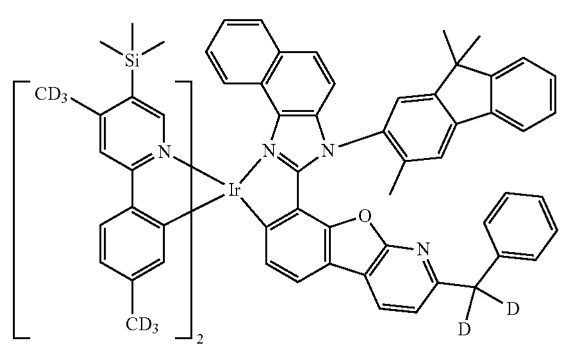

-continued
3180
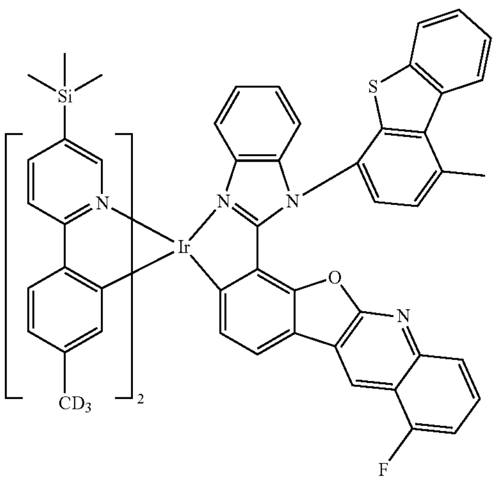
3181
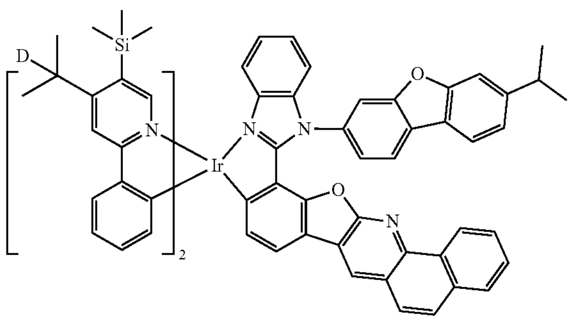
3182
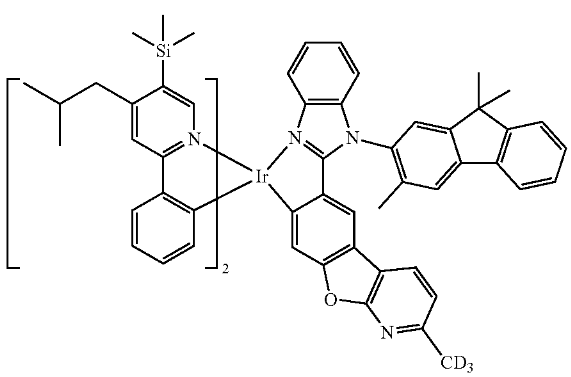
3183
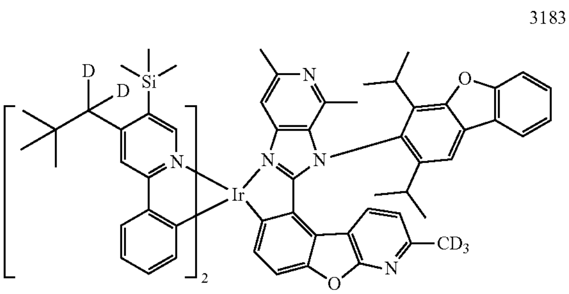
-continued
3184
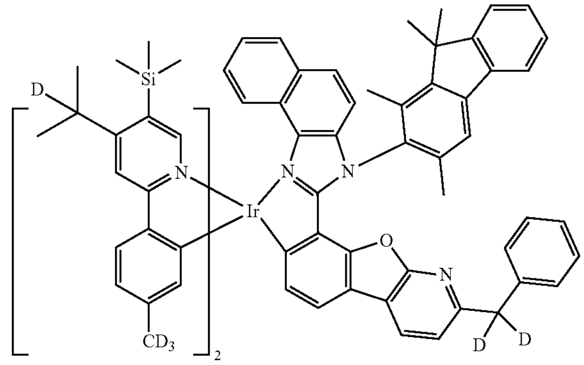
3185
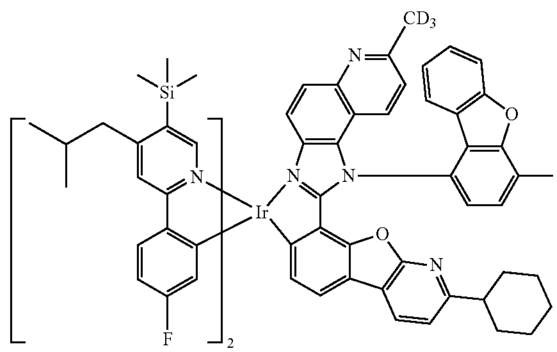
3186
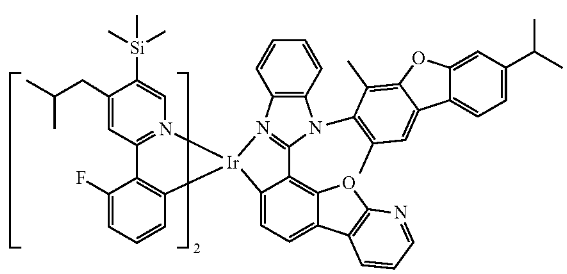
3187
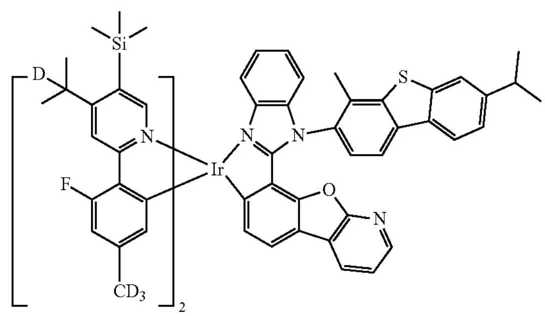

-continued
3188
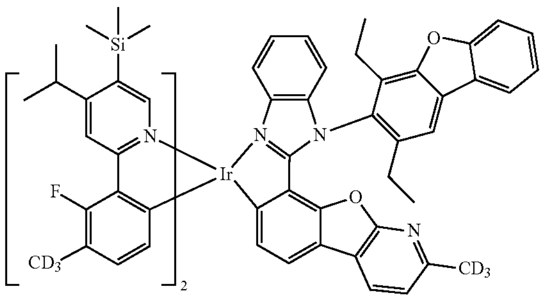
3189
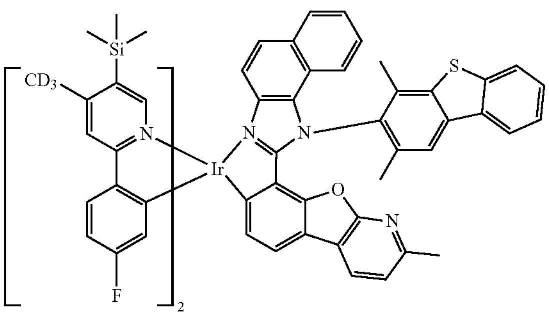
3190
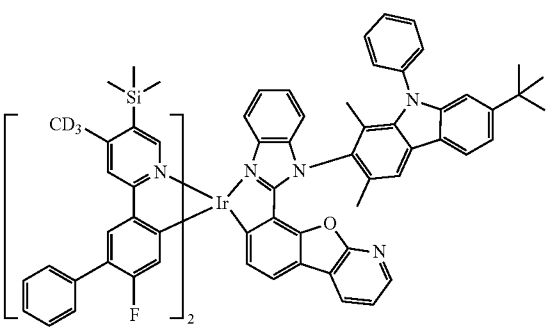
3191
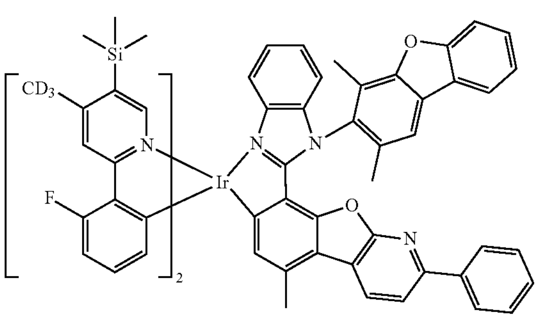
-continued
3192
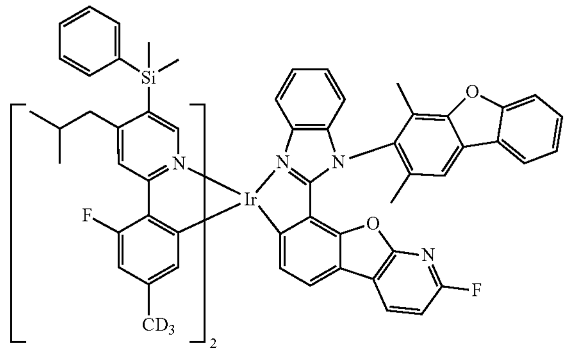
3193
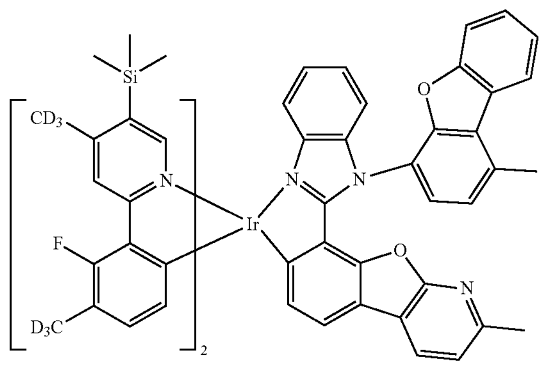
3194
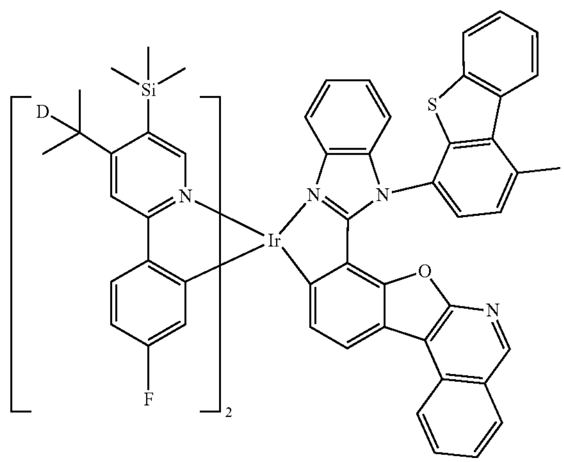
3195
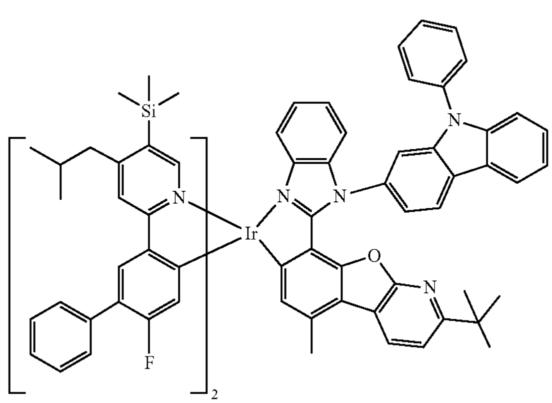

-continued
3196
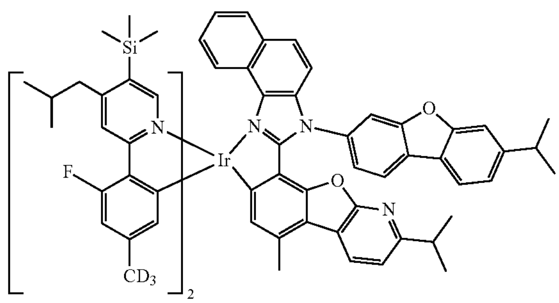
3197
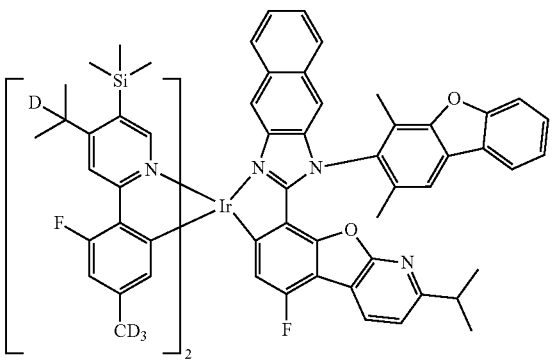
3198
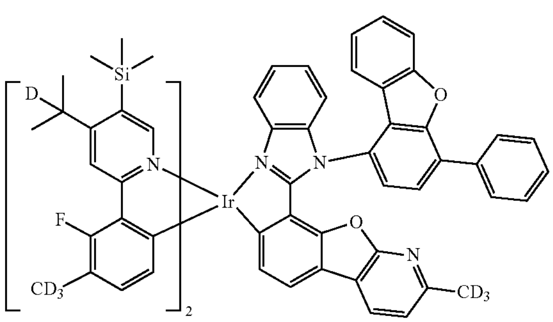
3199
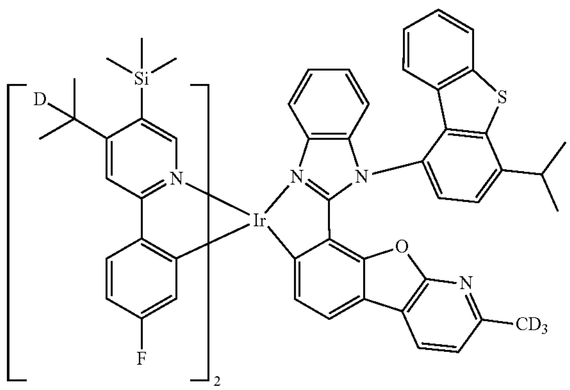
-continued
3200
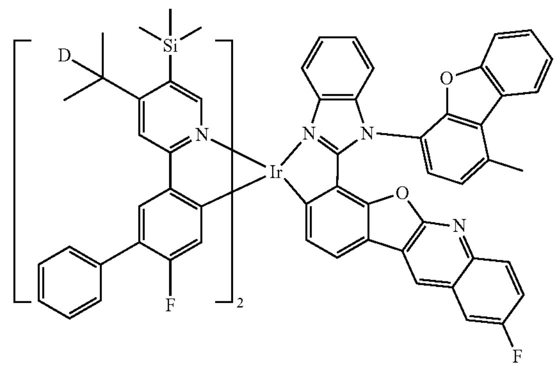
3201
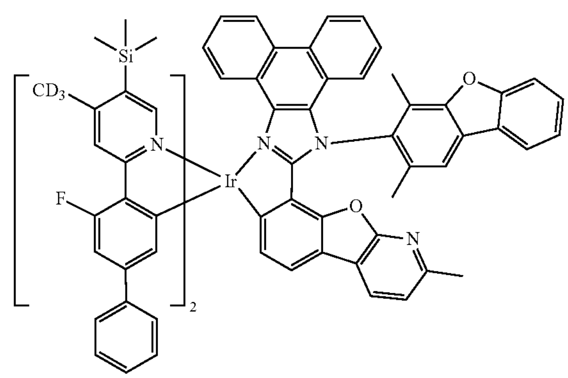
3202
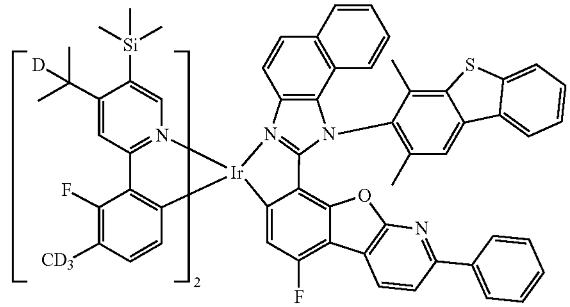

-continued
3203
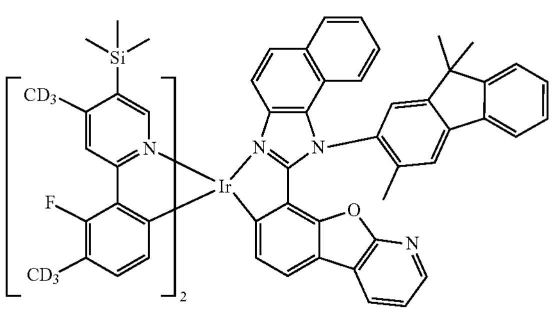
3204
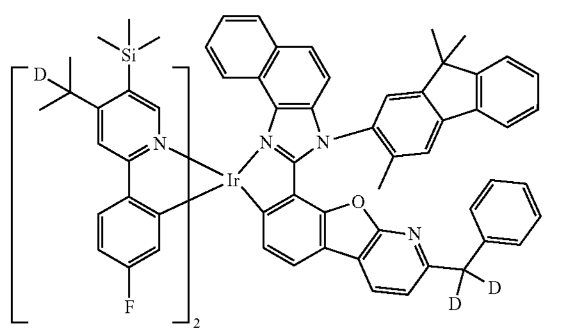
3205
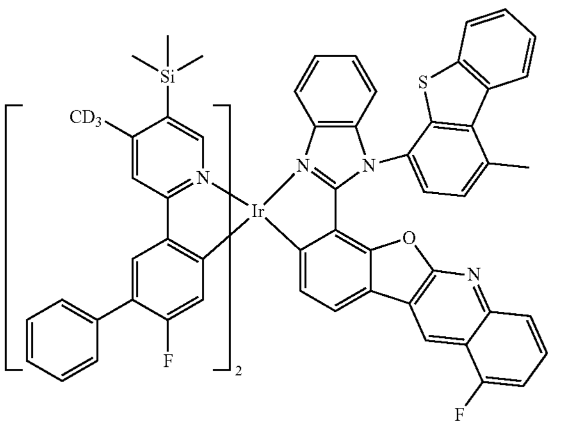
3206
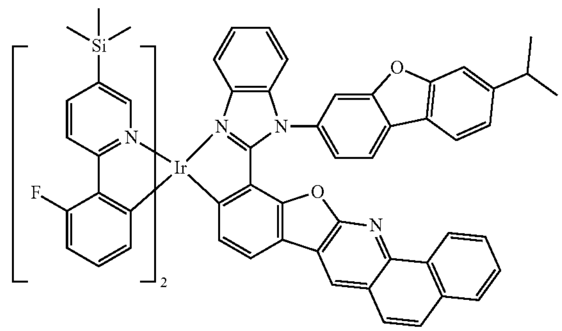
3207
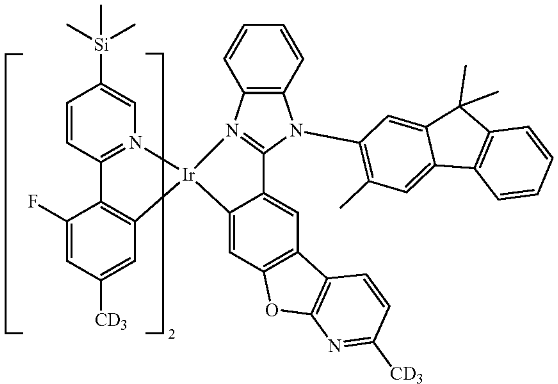
3208
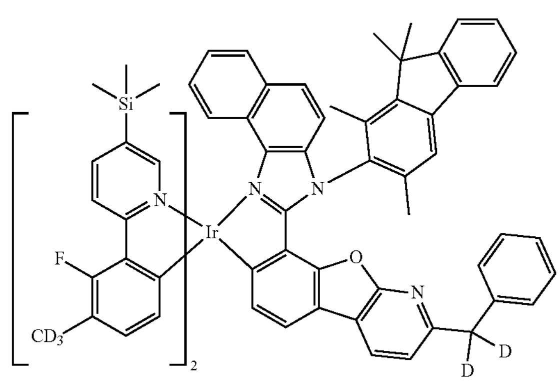

-continued
3209
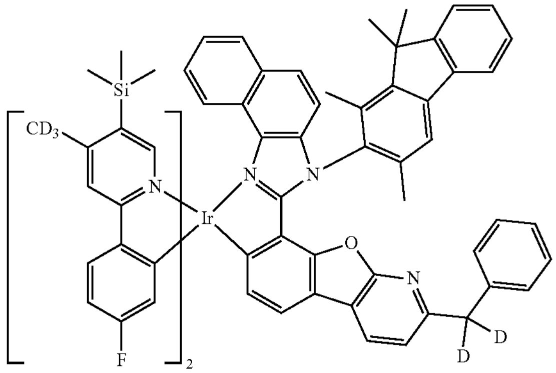
3210
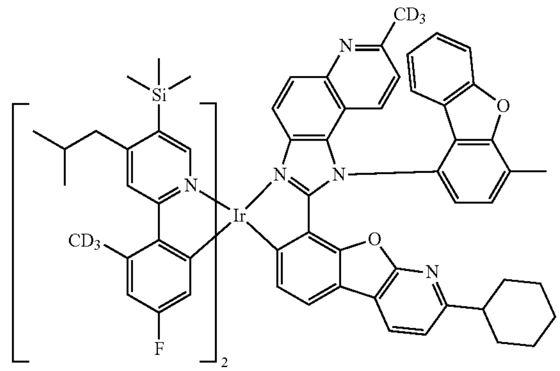
3211
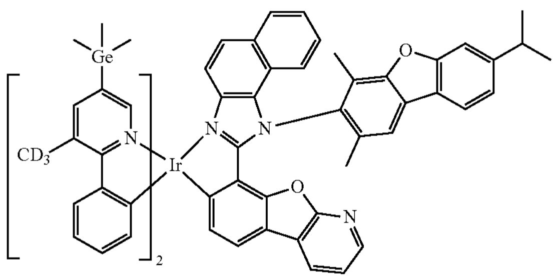
3212
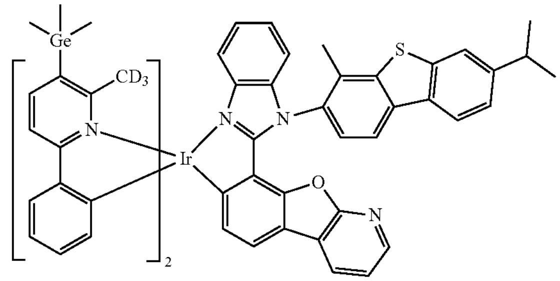
3213
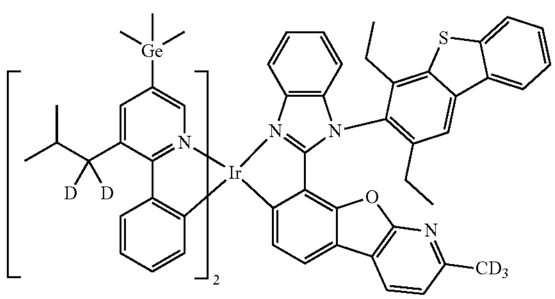
3214
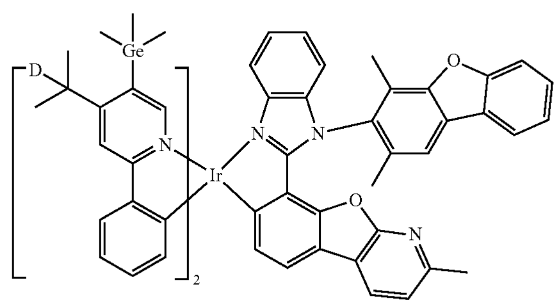
3215
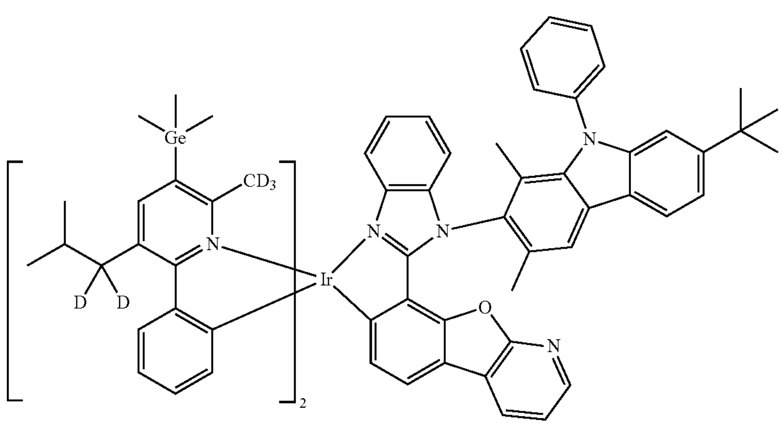

-continued
3216
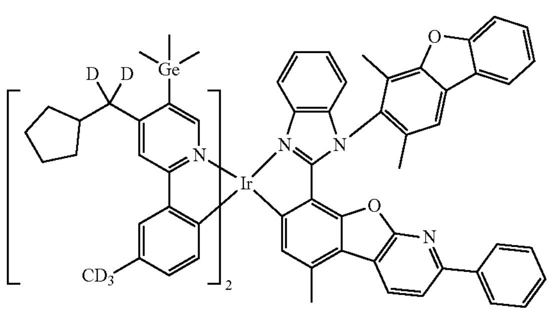
3217
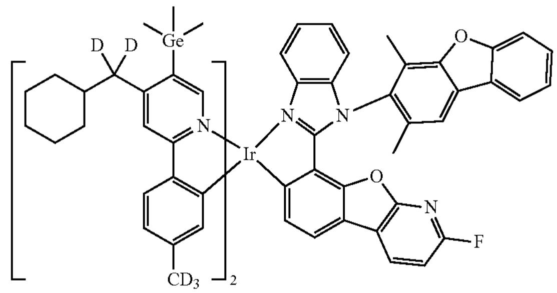
3218
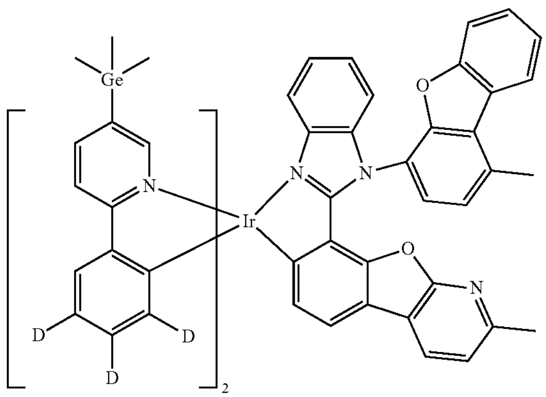
3219
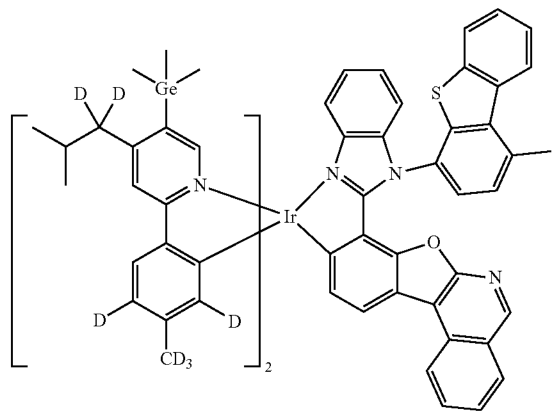
3220
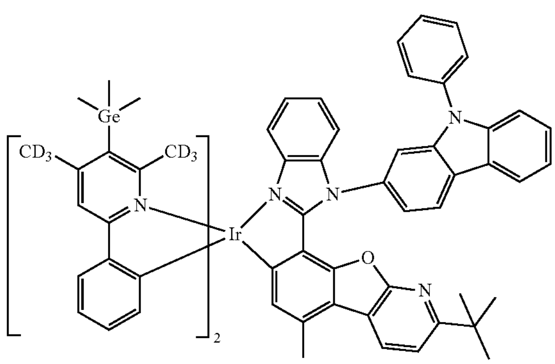
3221
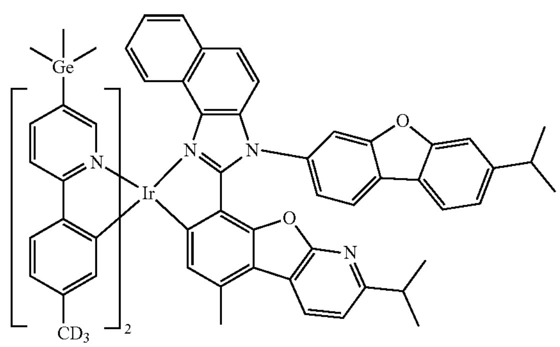
3222
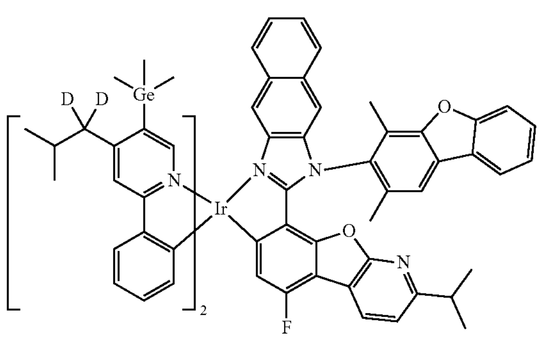
3223
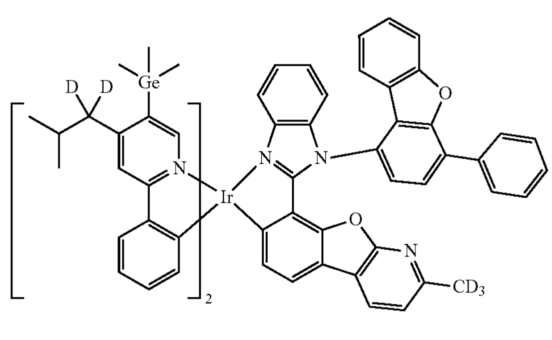

-continued
3224
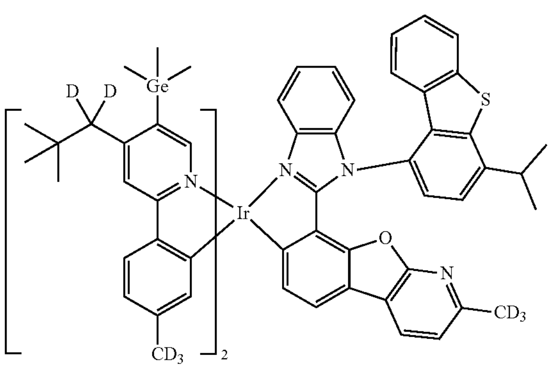
3225
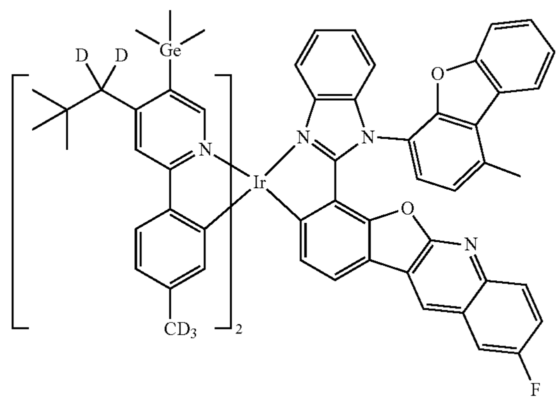
3226
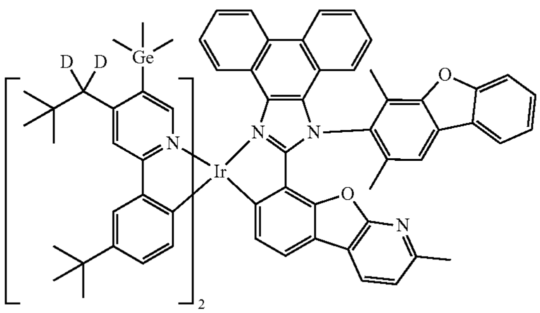
3227
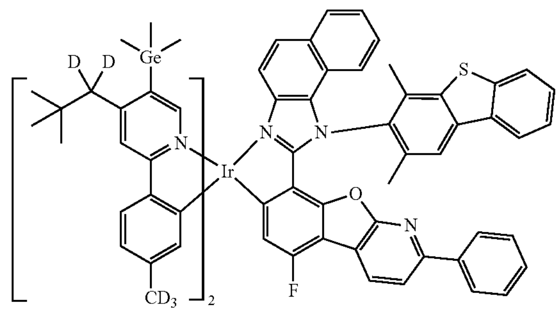
3228
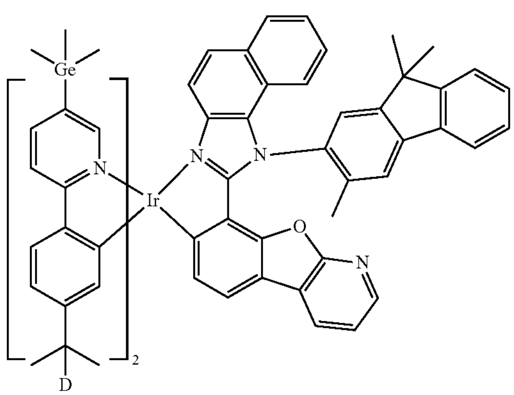
3229
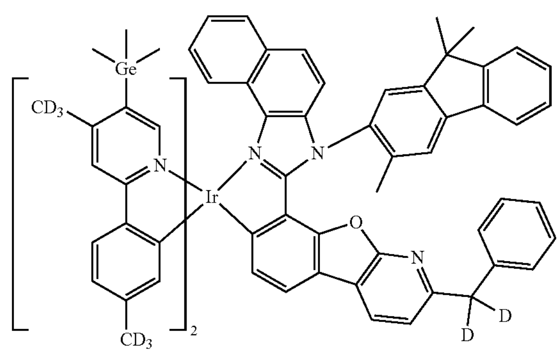
3230
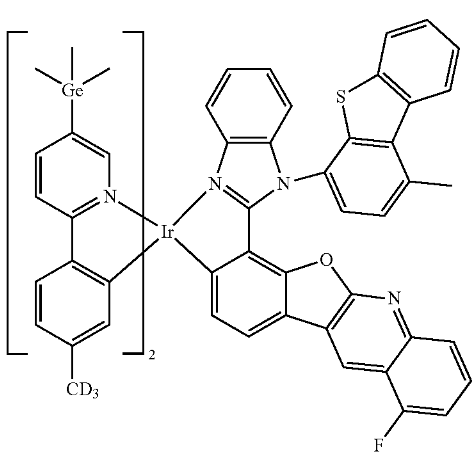
3231
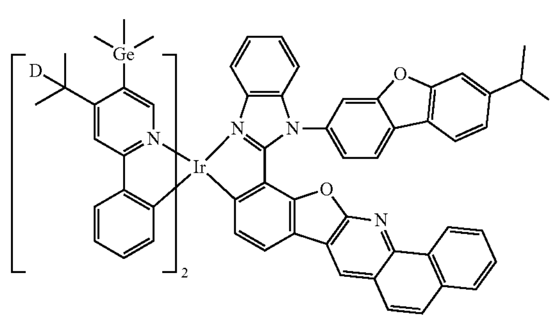

-continued
3232
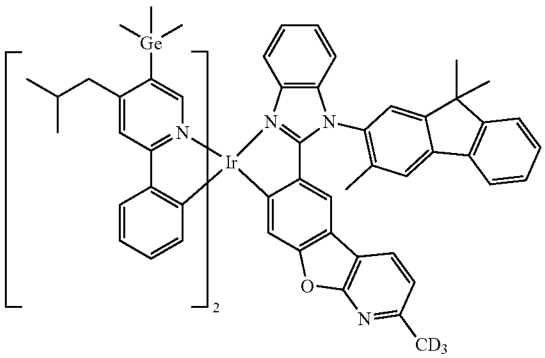
3233
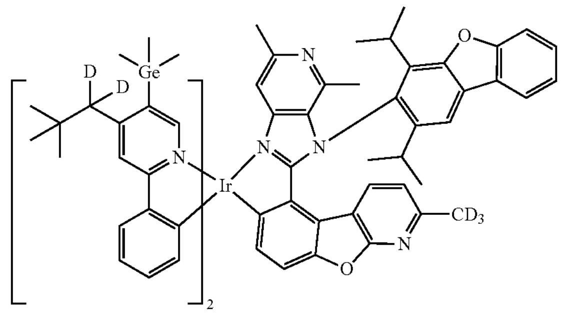
3234
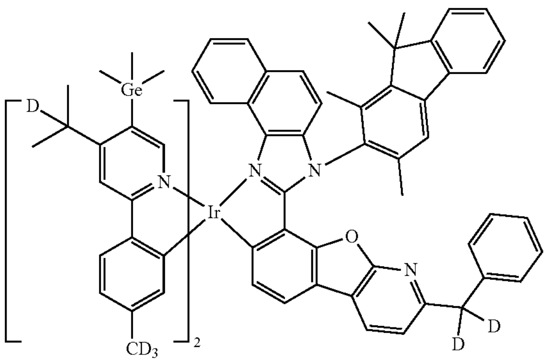
3235
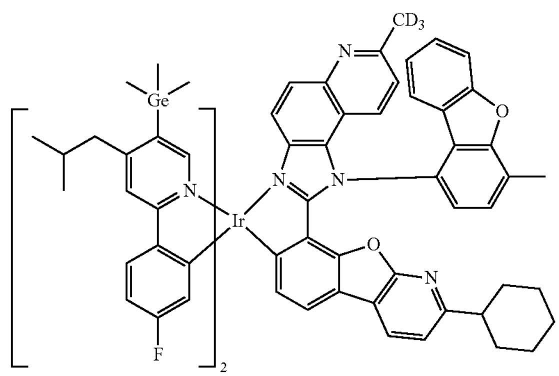
3236
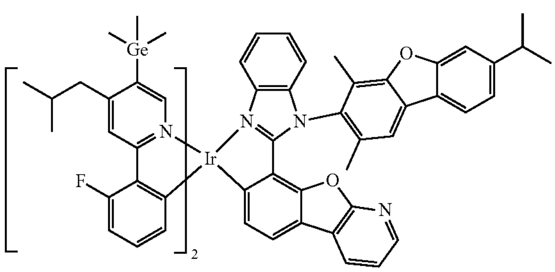
3237
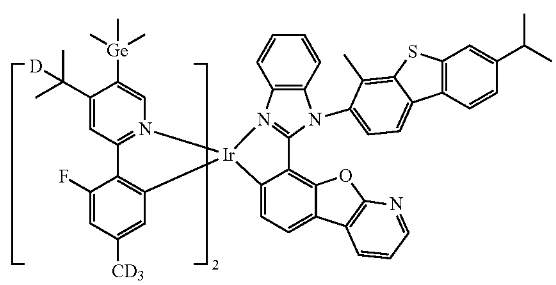
3238
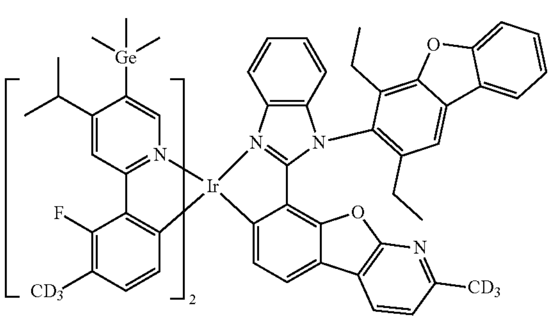
3239
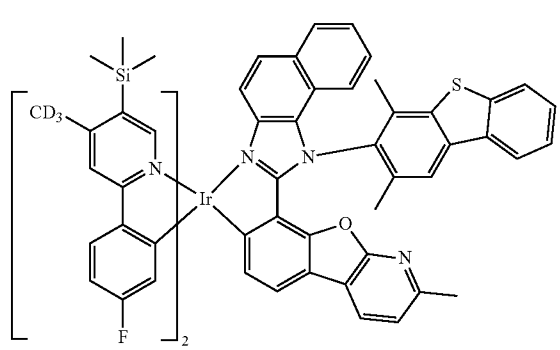

-continued
3240
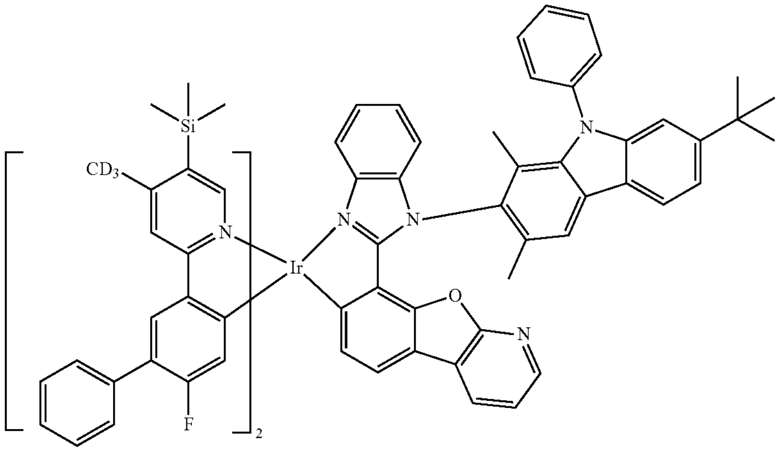
3241
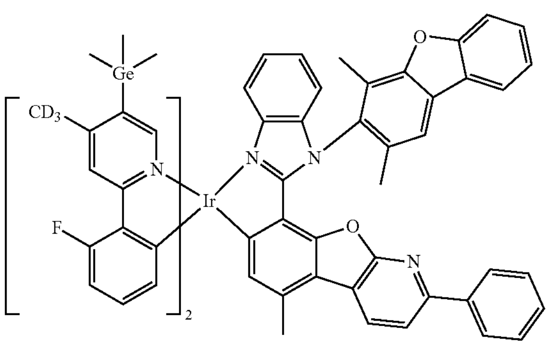
3242
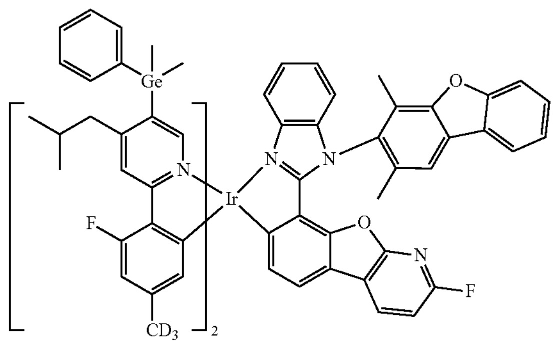
3243
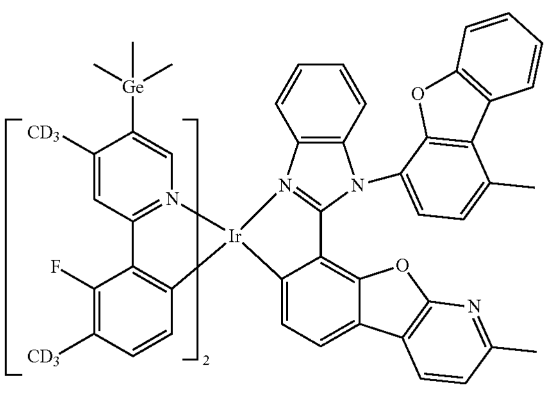
3244
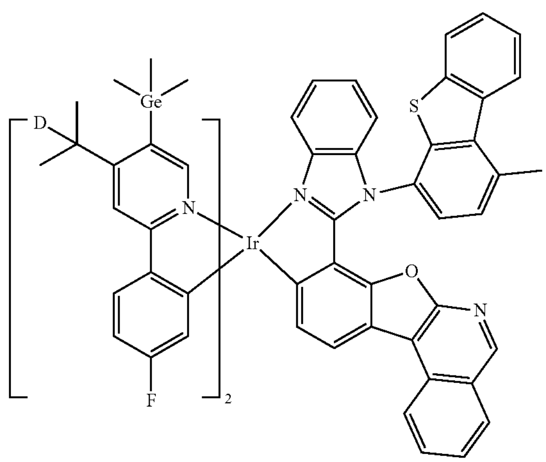

-continued
3245
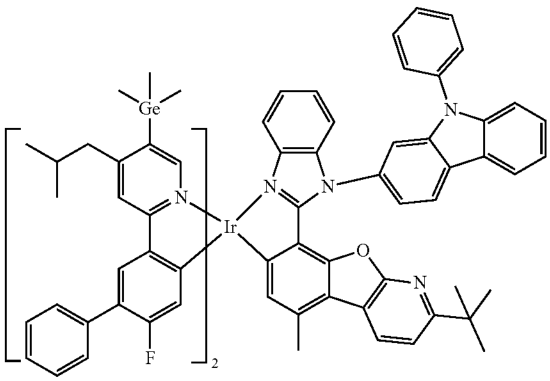
3246
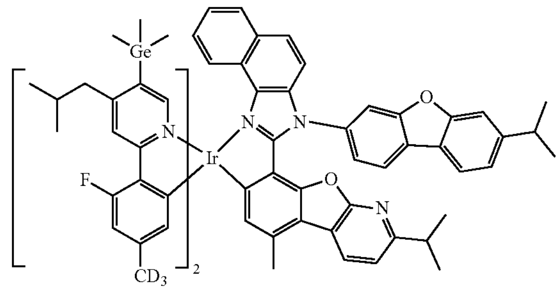
3247
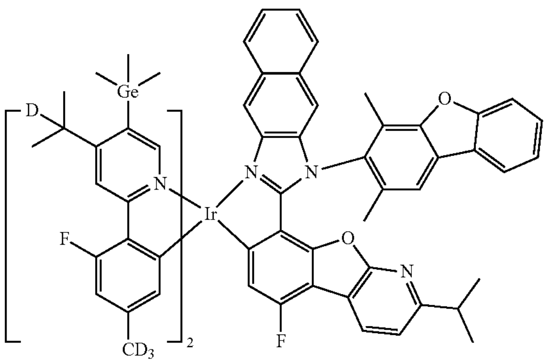
3248
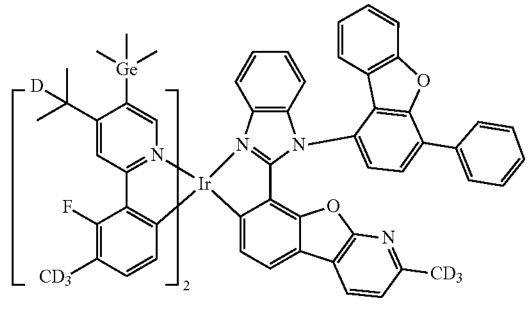
3249
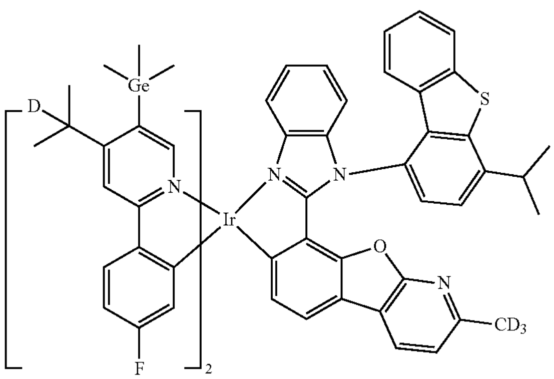
3250
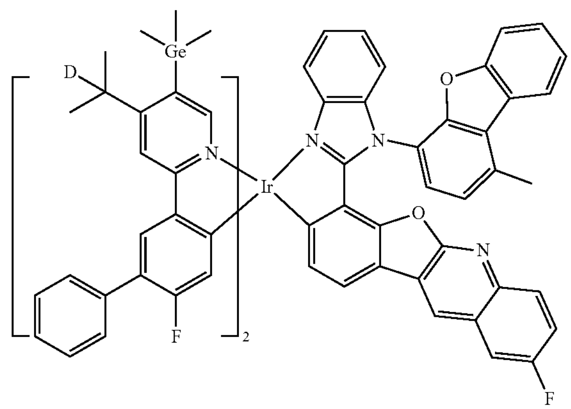
3251
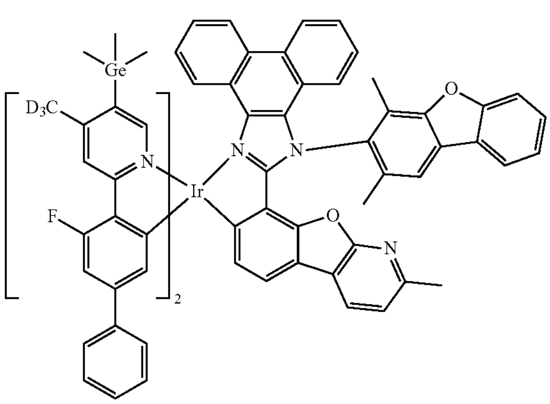
3252
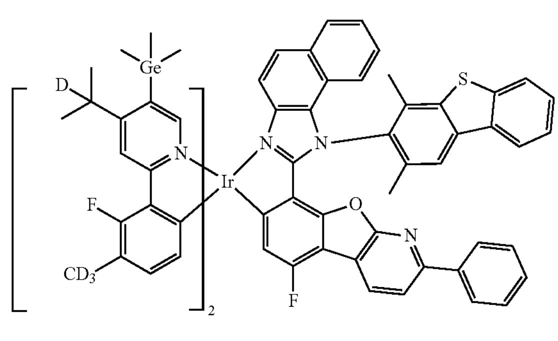

-continued
3253
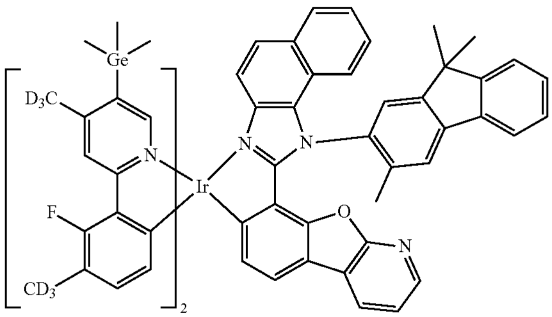
3254
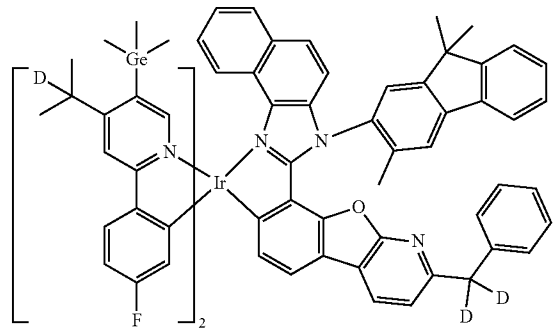
3255
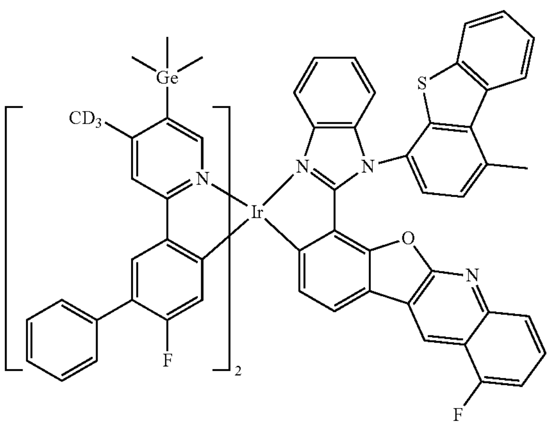
3256
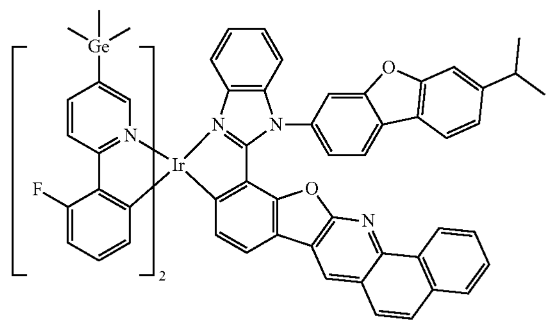
3257
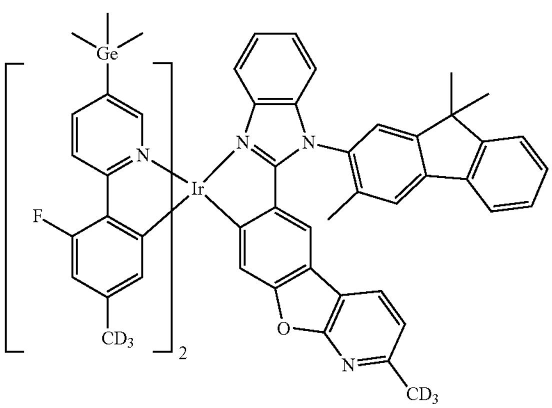
3258
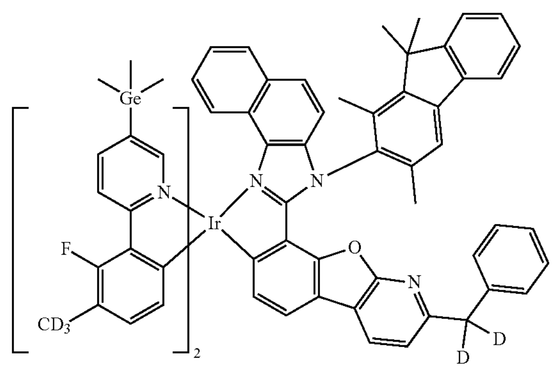
3259
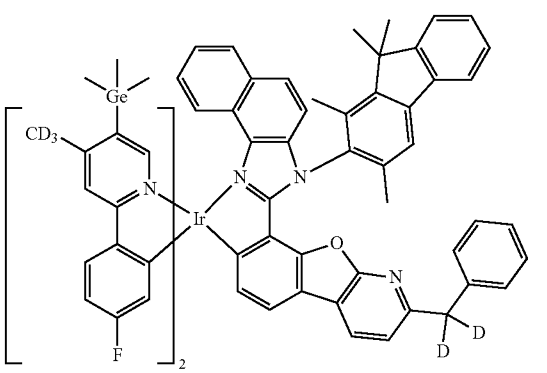
3260
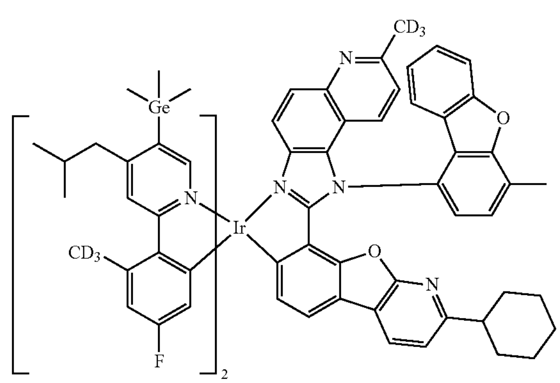

-continued
3261
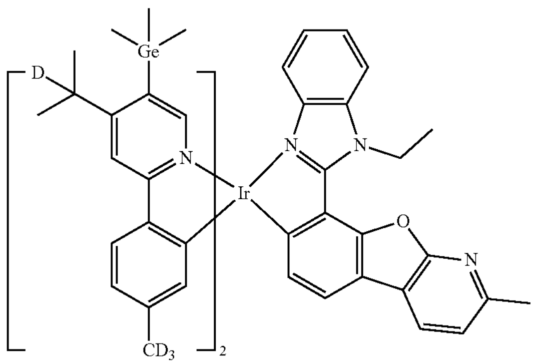
3262
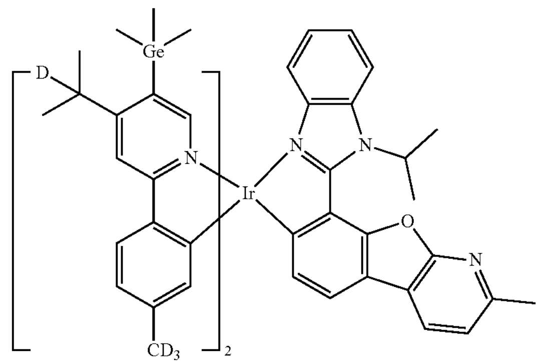
3263
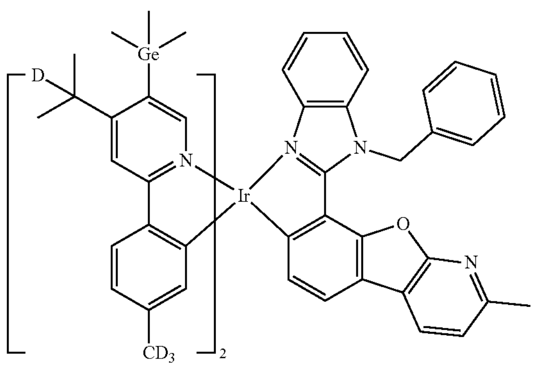
3264
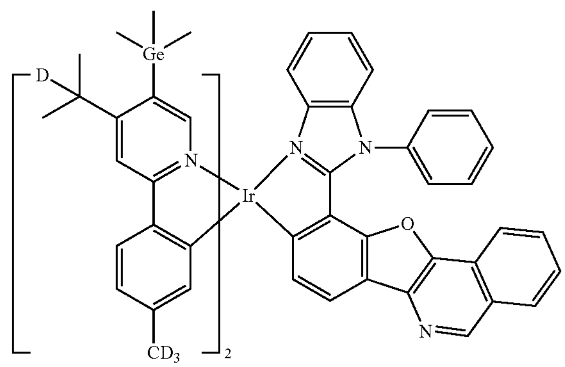
3265
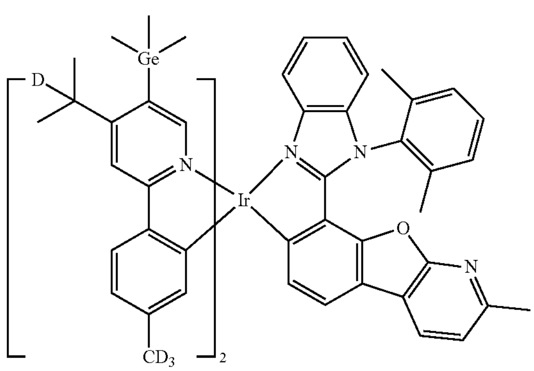
3266
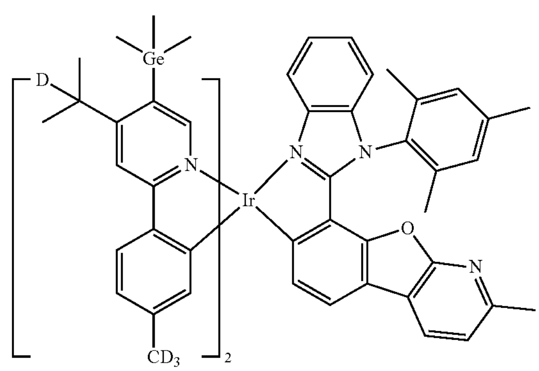
3267
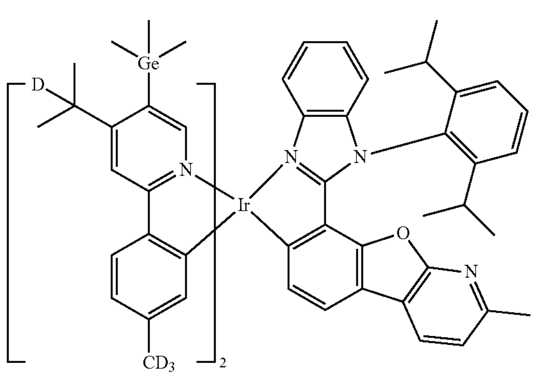
3268
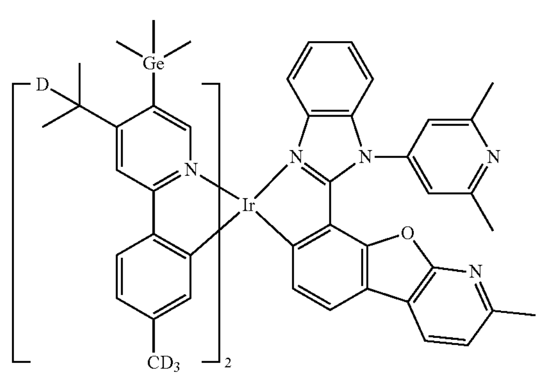

-continued
3269
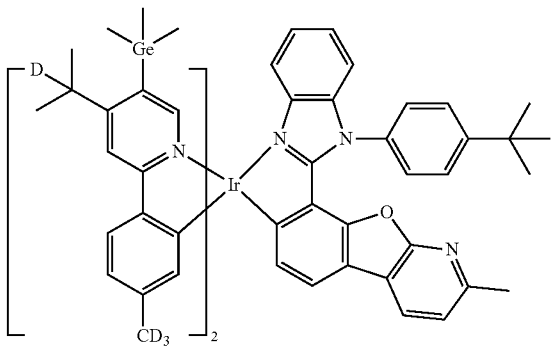
3270
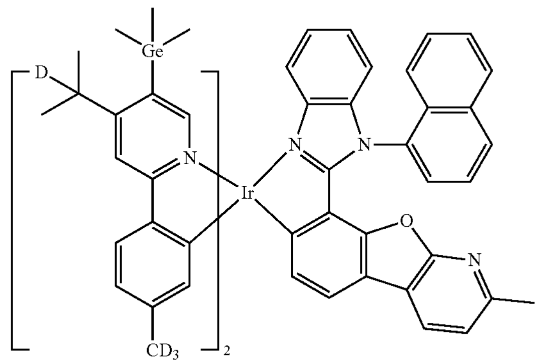
3271
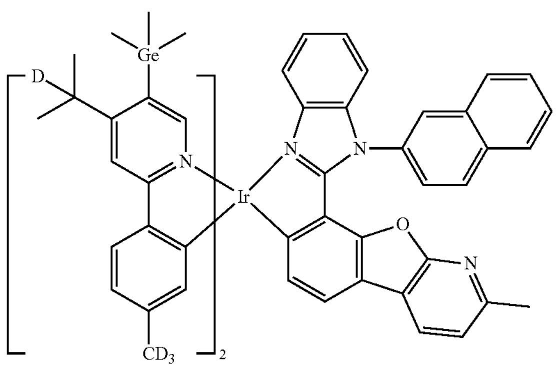
3272
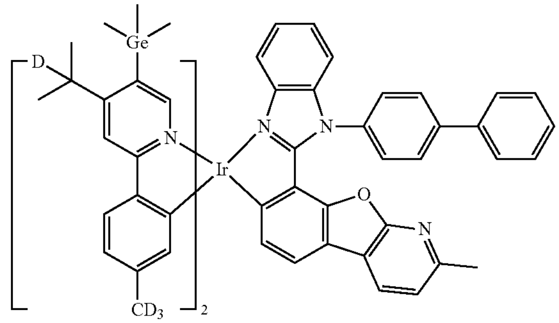
3273
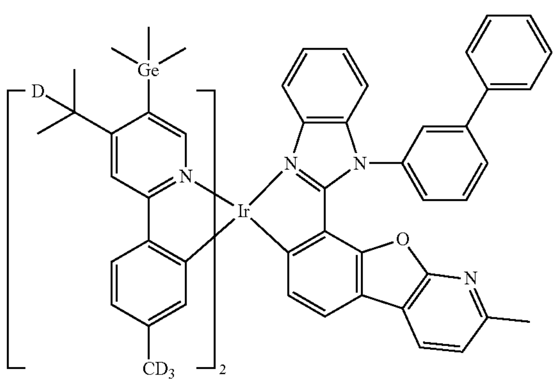
3274
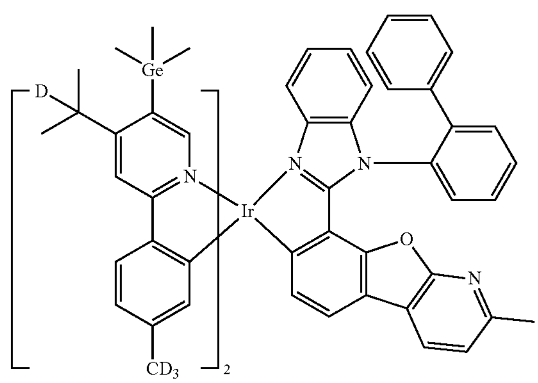
3275
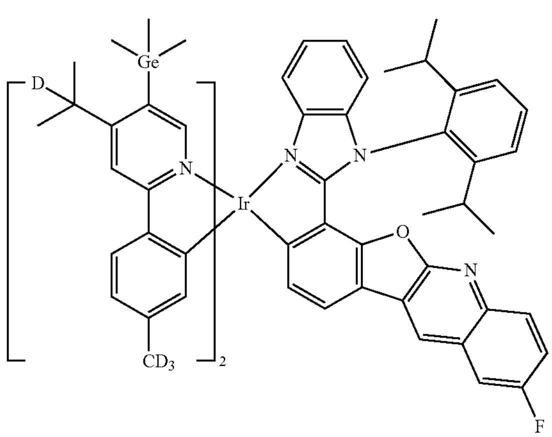
3276
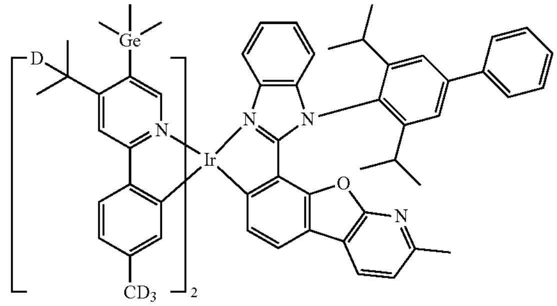

-continued
3277
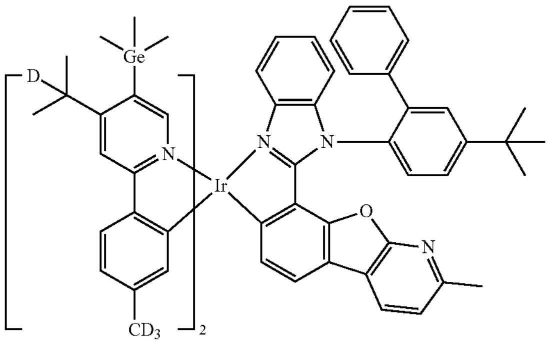
3278
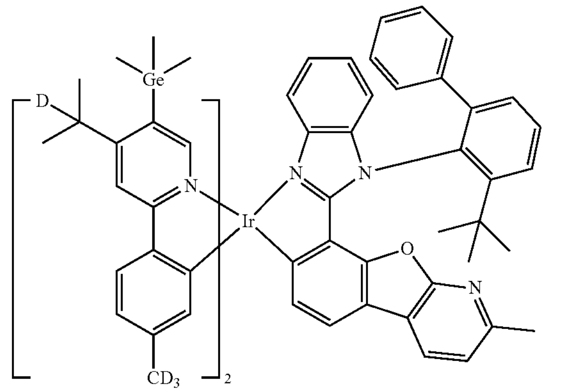
3279
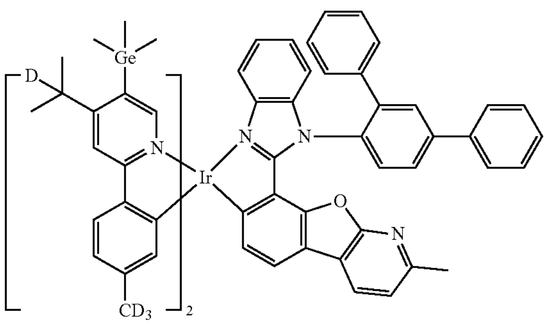
3280
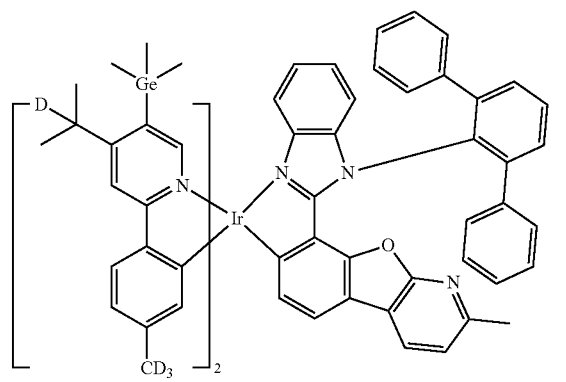
3281
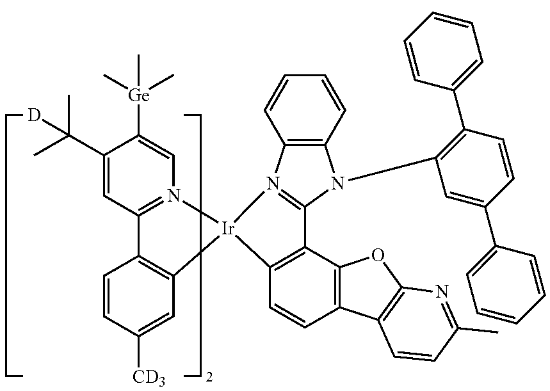
3282
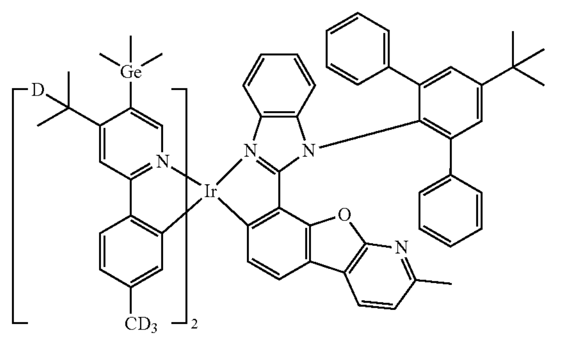
3283
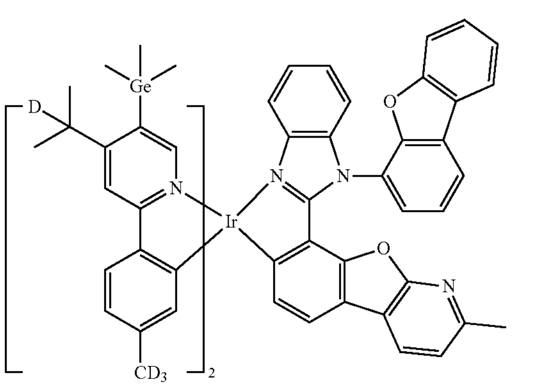
3284
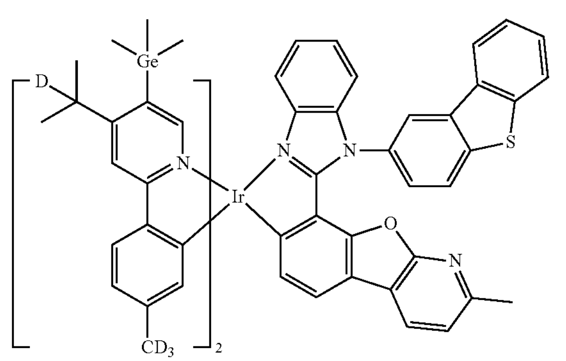

-continued
3285
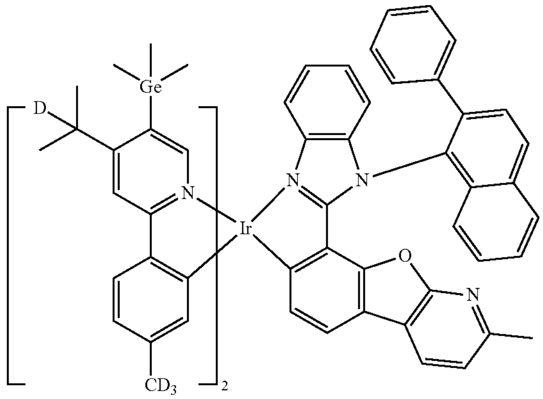
3286
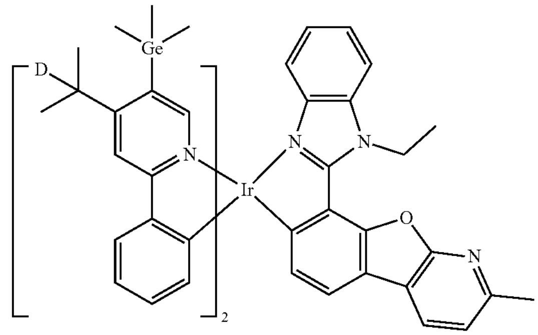
3287
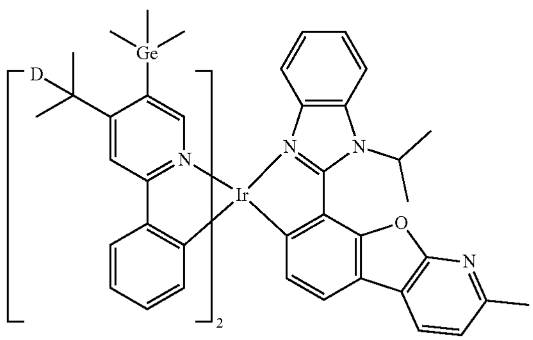
3288
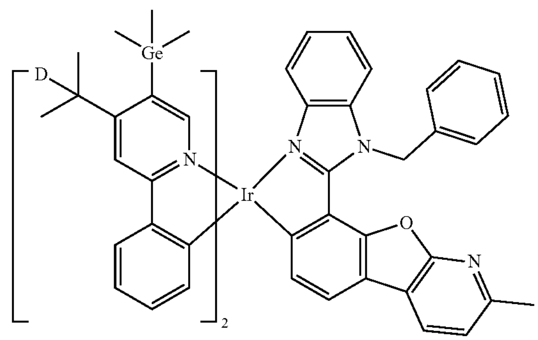
3289
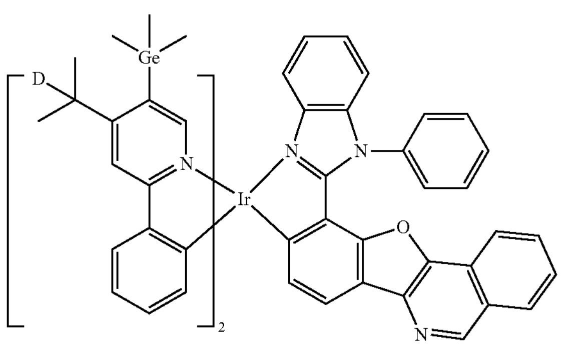
3290
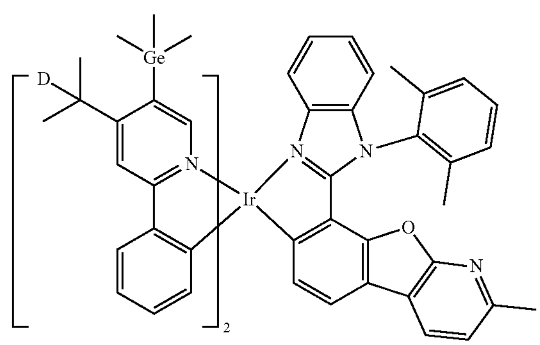
3291
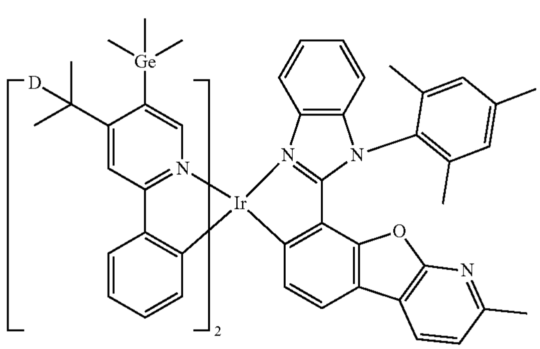
3292
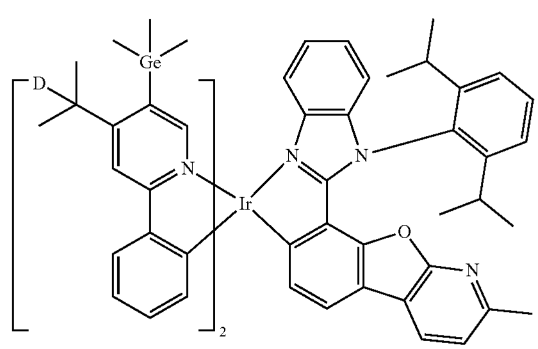

-continued
3293
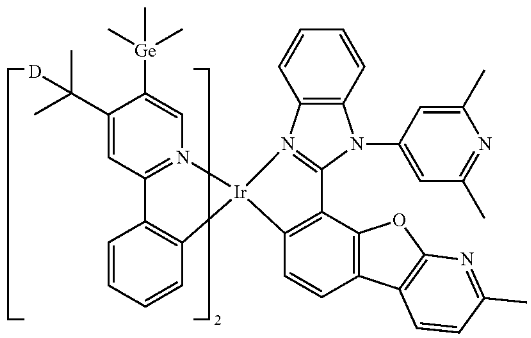
3294
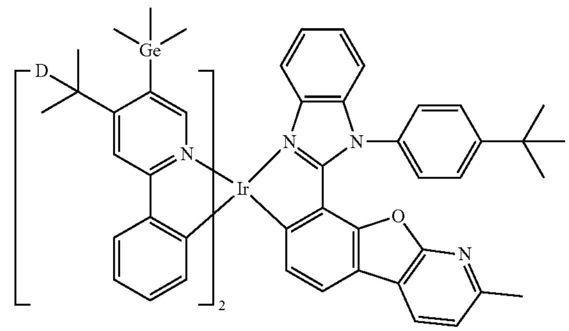
3295
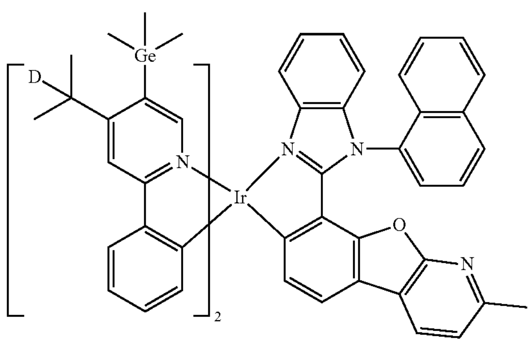
-continued
3298
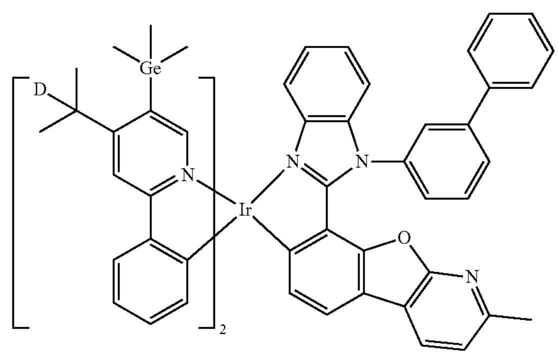
3296
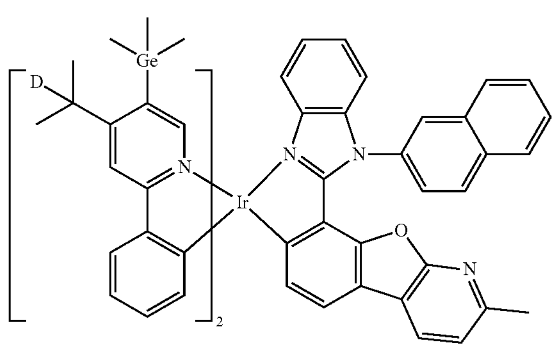
3299
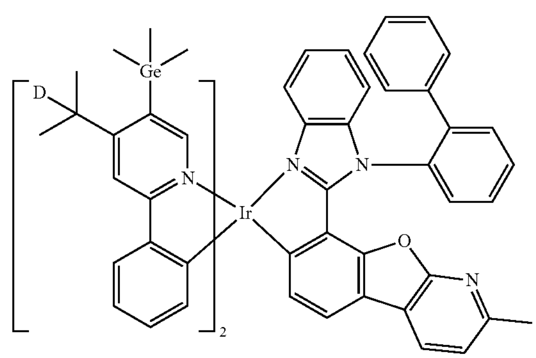
3297
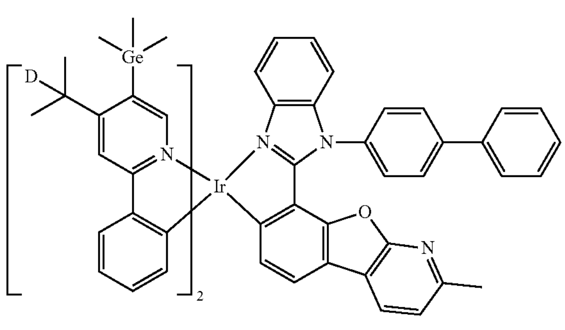
3300
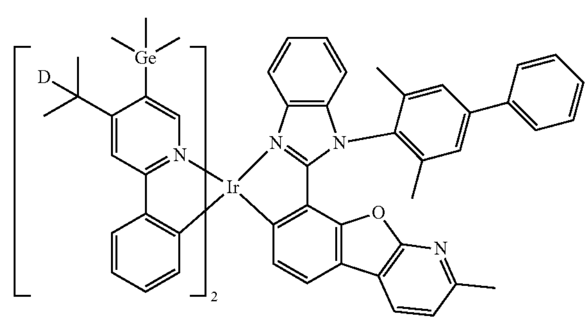

-continued
3301
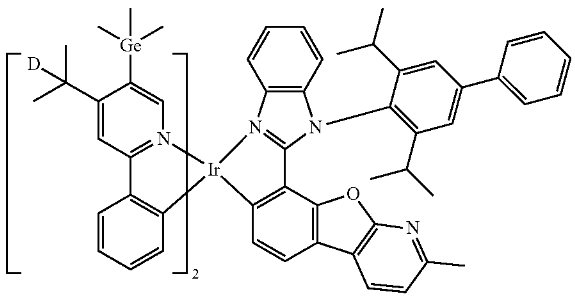
3302
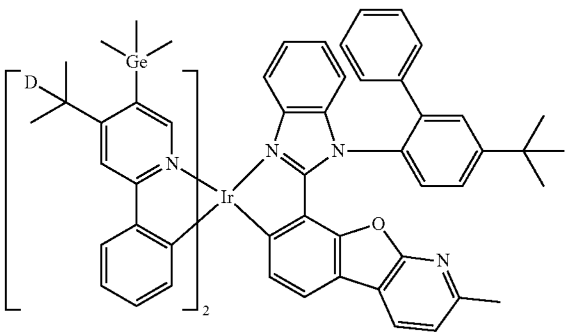
3303
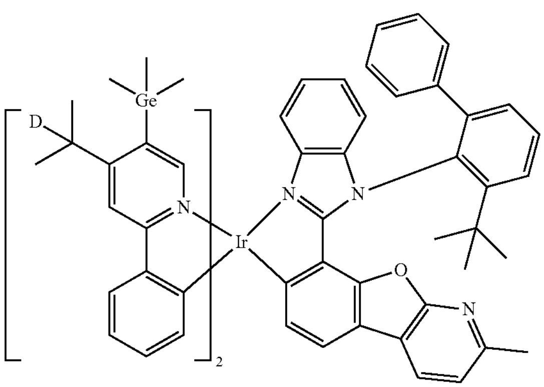
3304
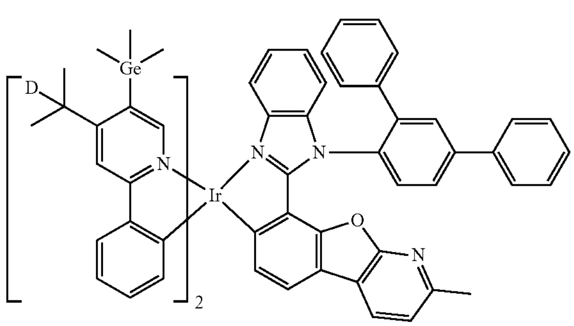
-continued
3305
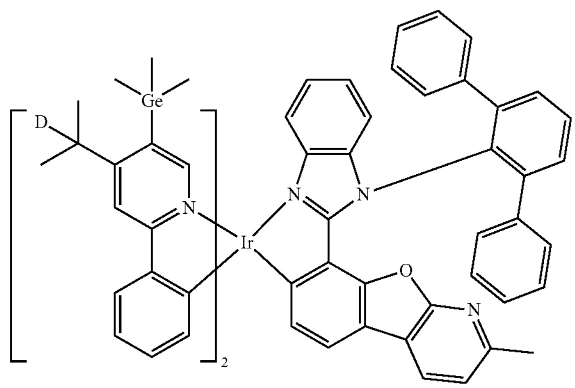
3306
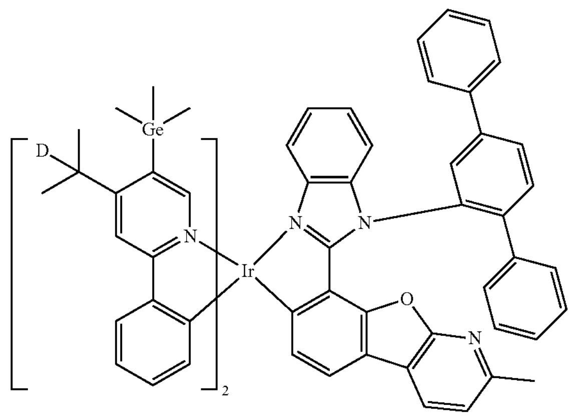
3307
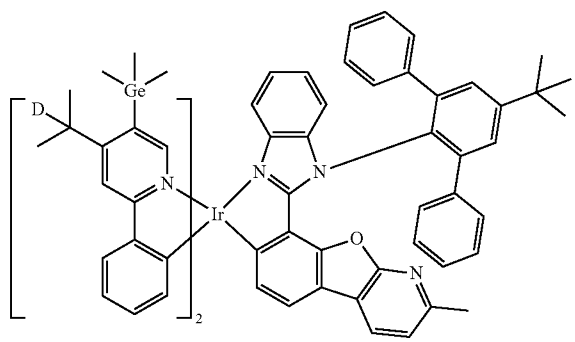
3308
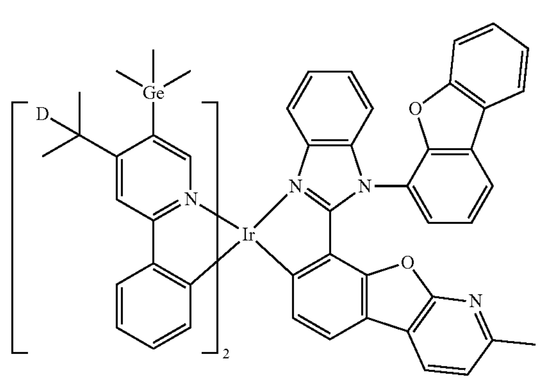

-continued
3309
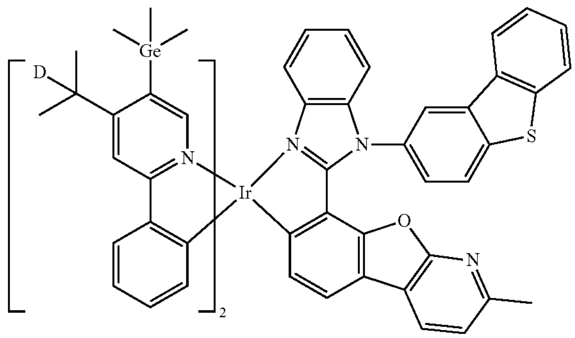
3310
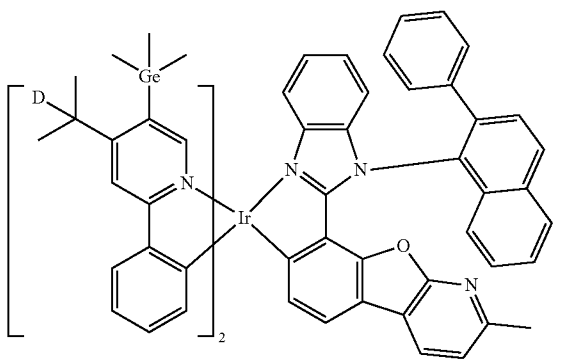
3311
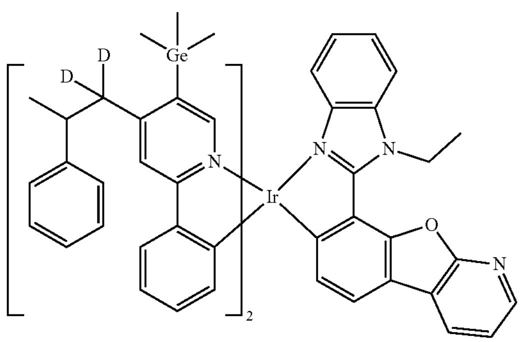
3312
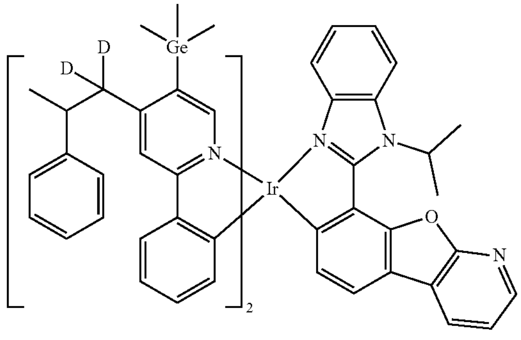
-continued
3313
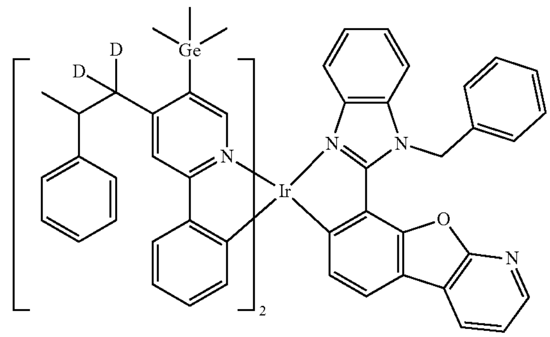
3314
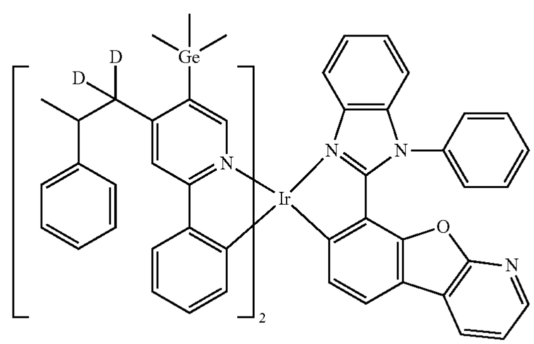
3315
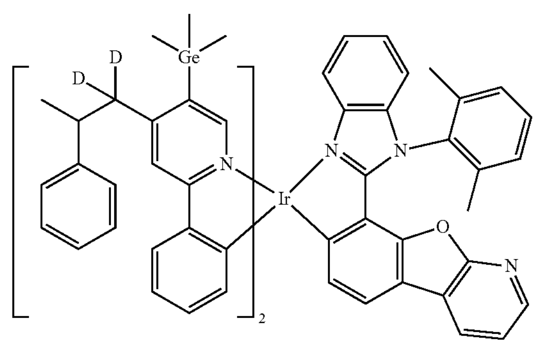
3316
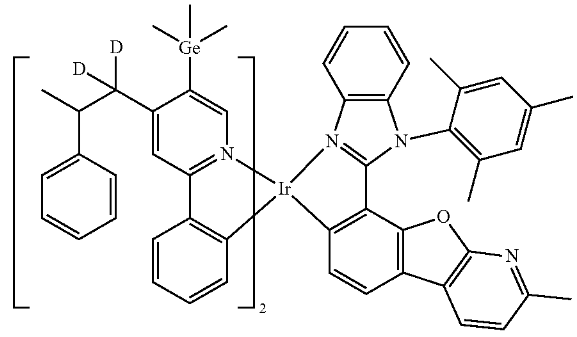

3317
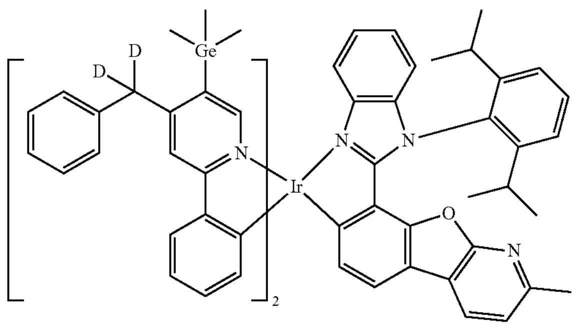
3318
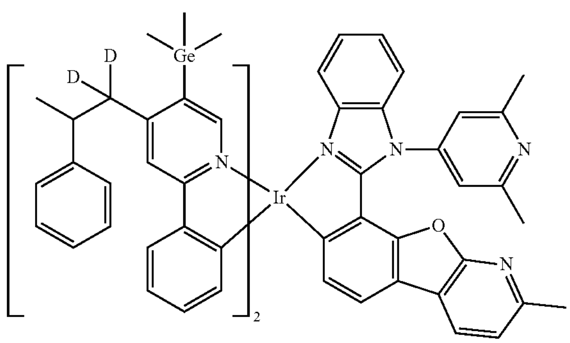
3319
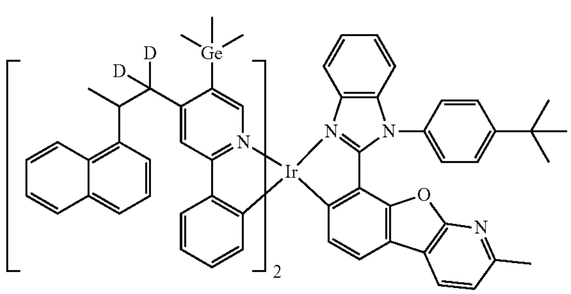
3320
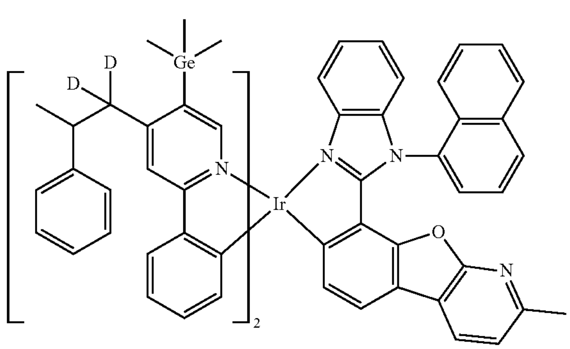
3321
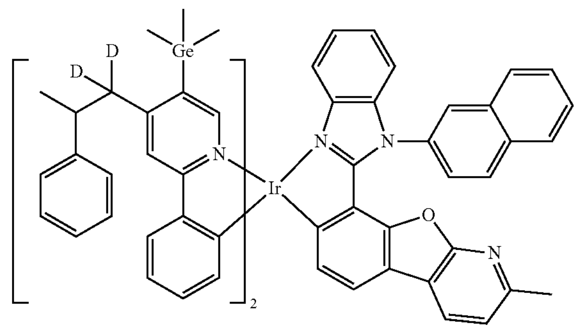
3322
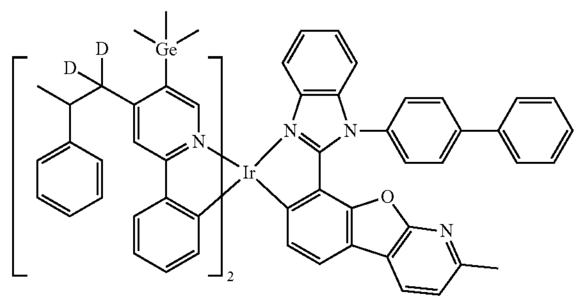
3223
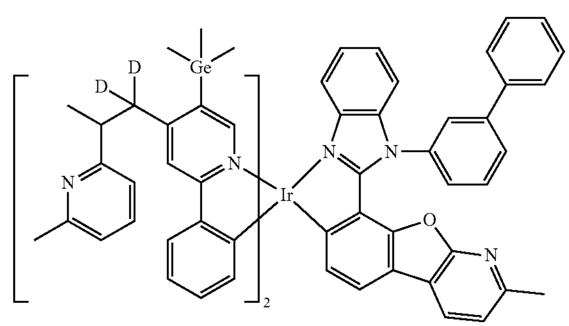
3224
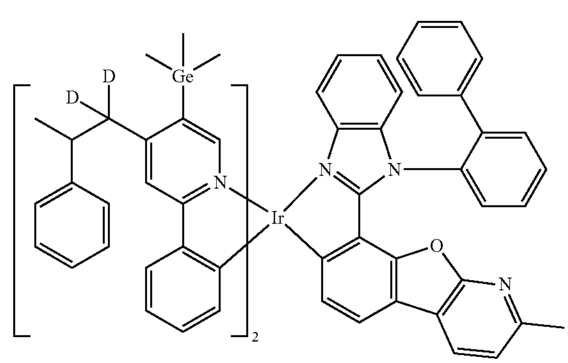

3325
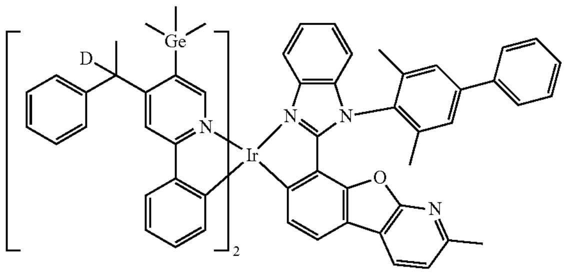
3326
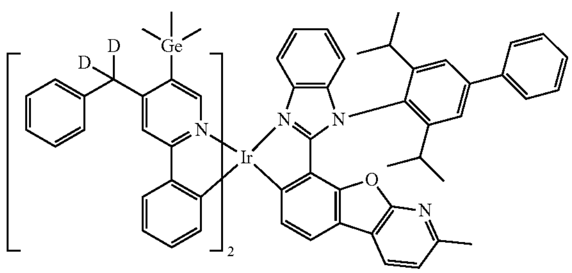
3327
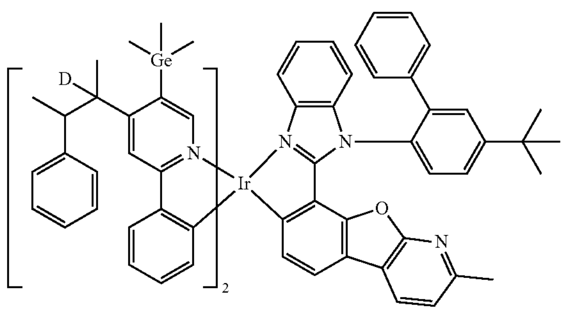
3328
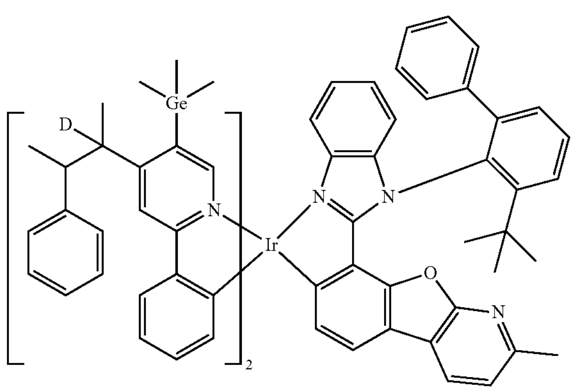
3329
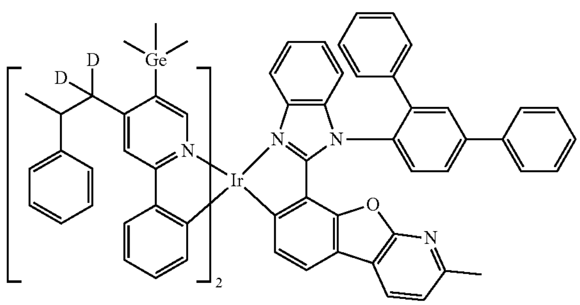
3330
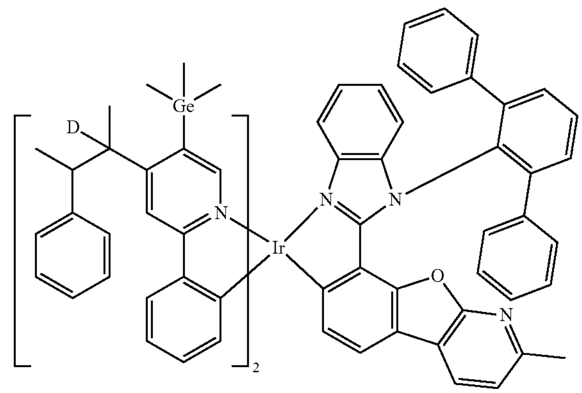
3331
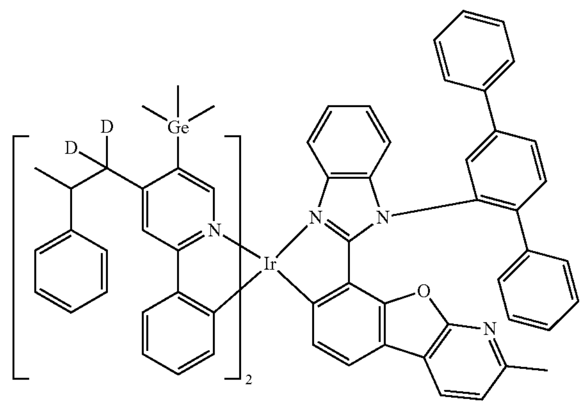
3332
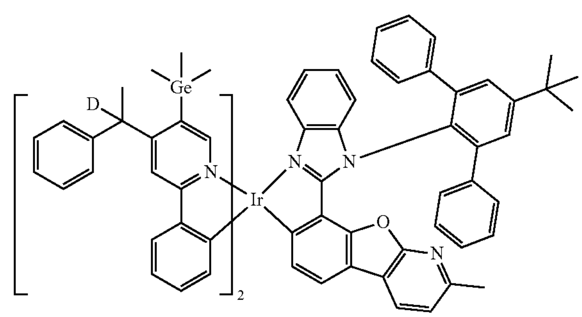
3333
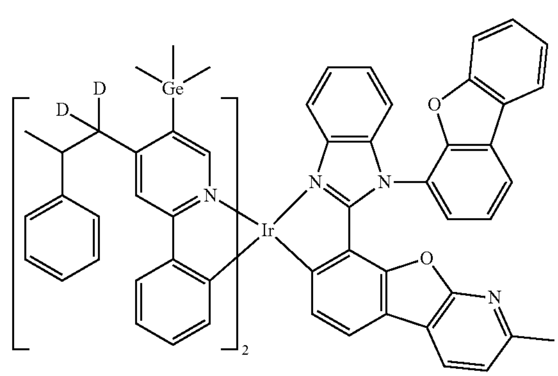

3334
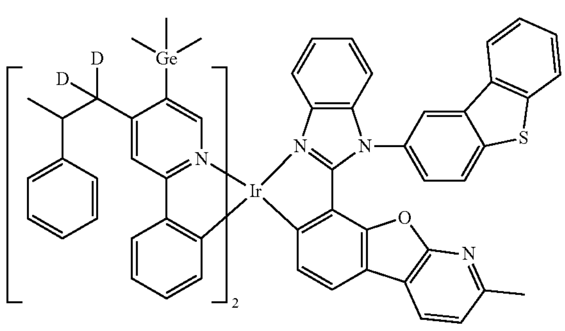
3335
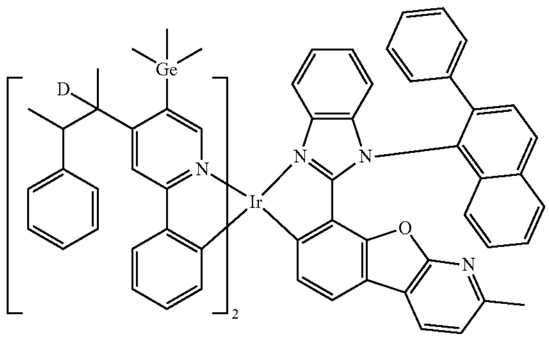
3336
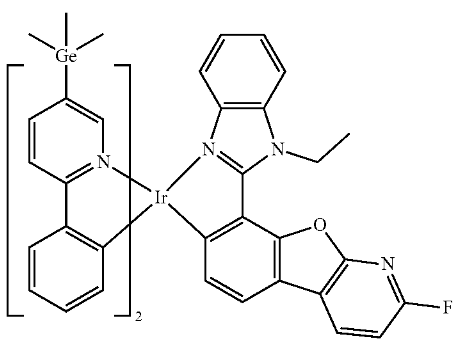
3337
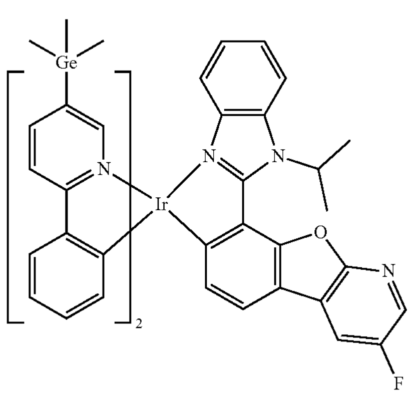
3338
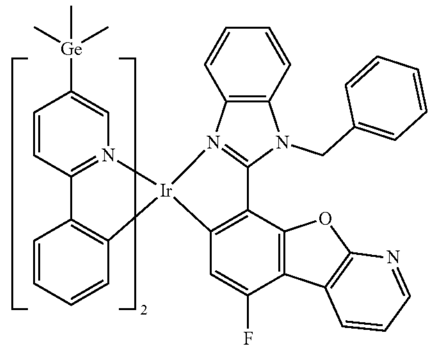
3339
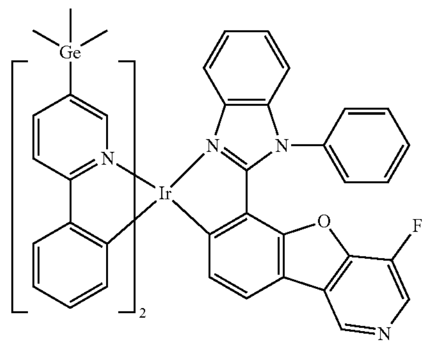
3340
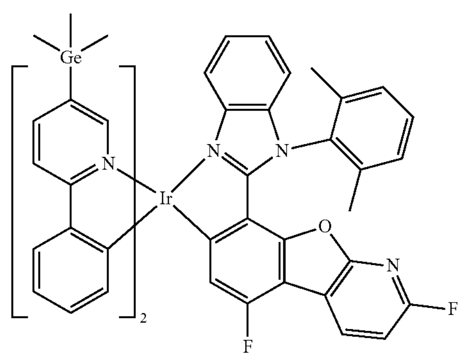
3341
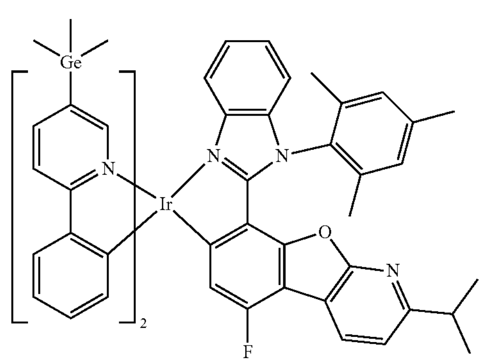

-continued
3342
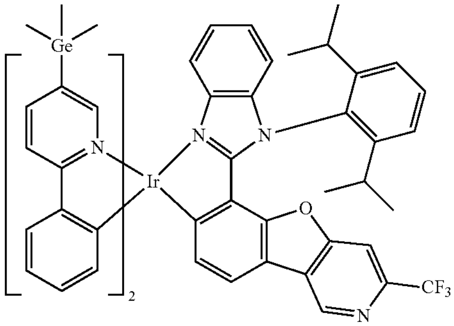
3343
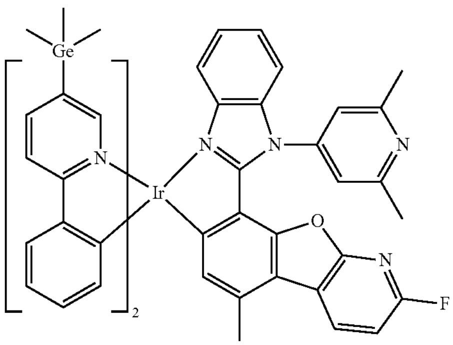
3344
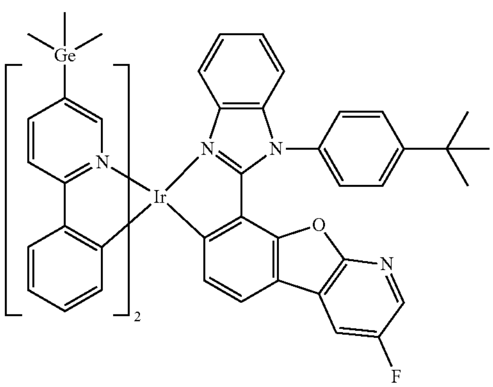
3345
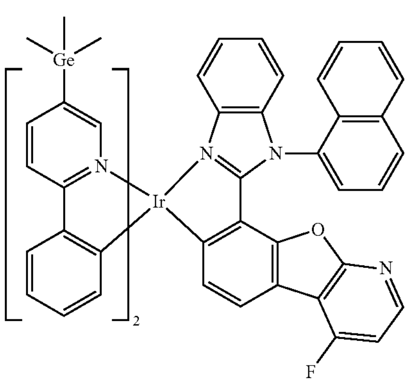
-continued
3346
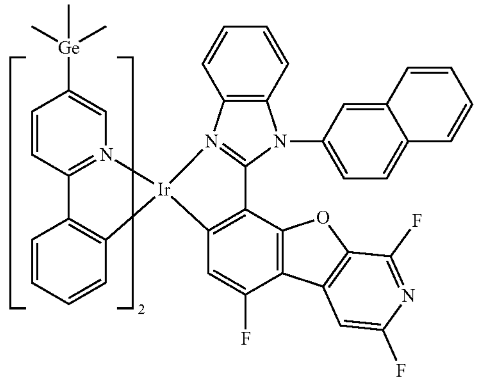
3347
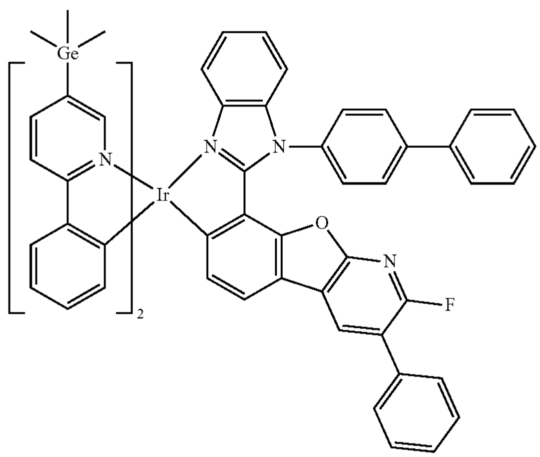
3348
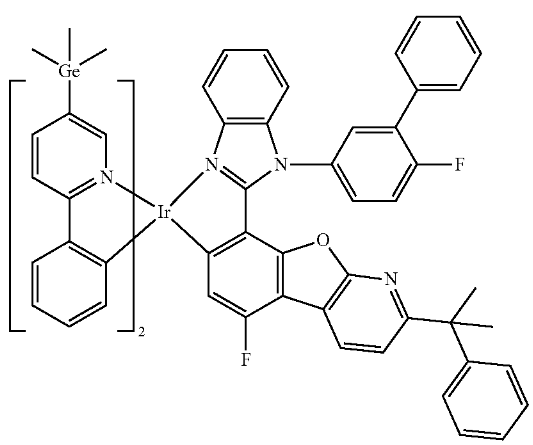

-continued
3349
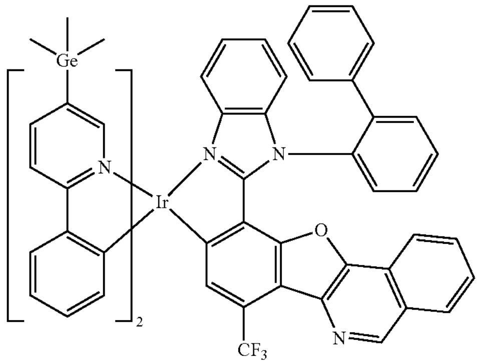
3350
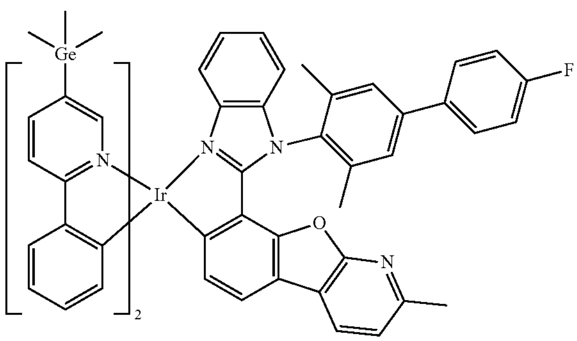
3351
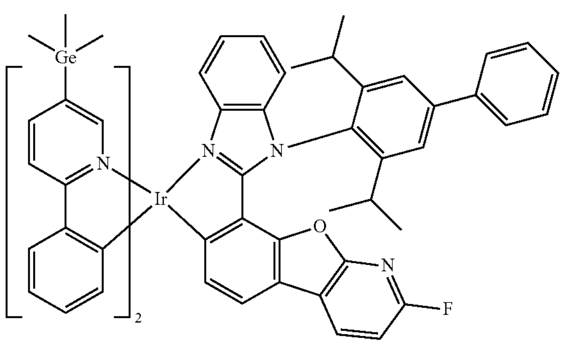
3352
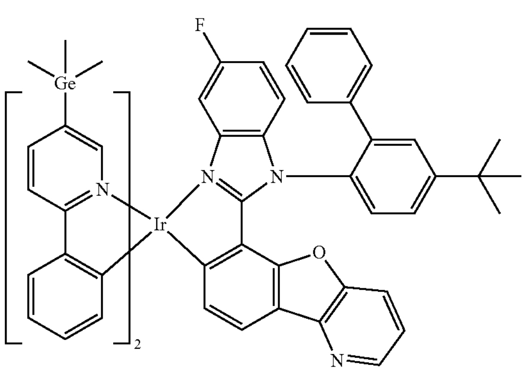
-continued
3353
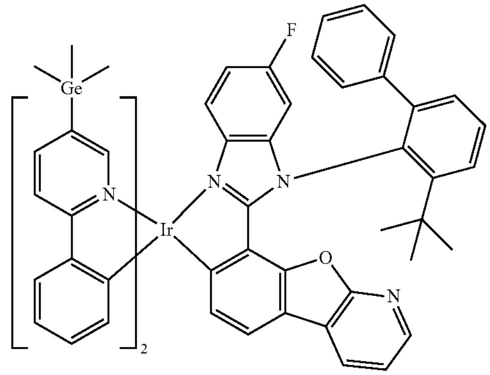
3354
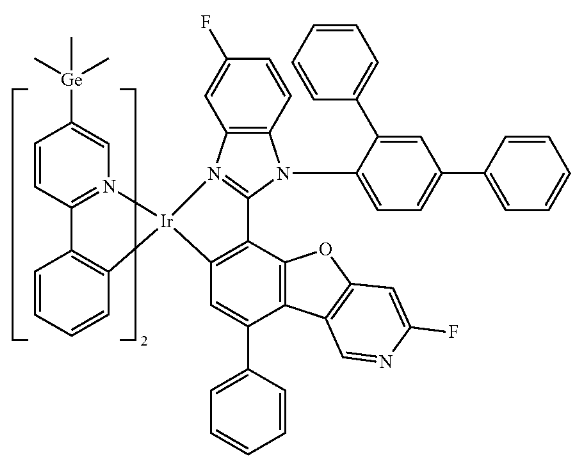
3355
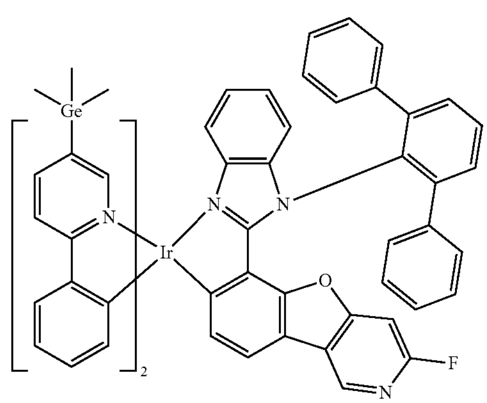

-continued
3356
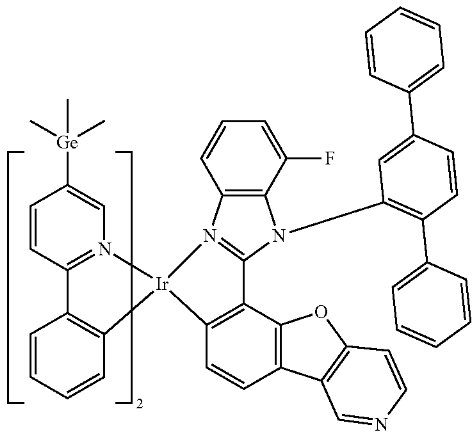
3357
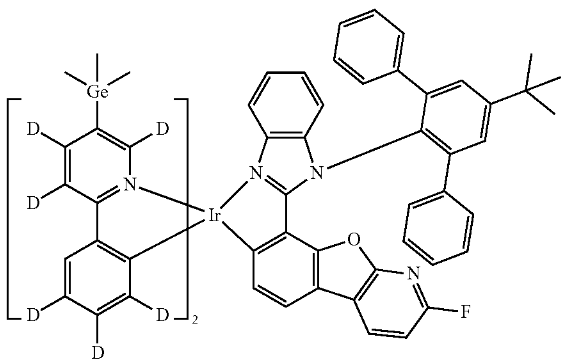
3358
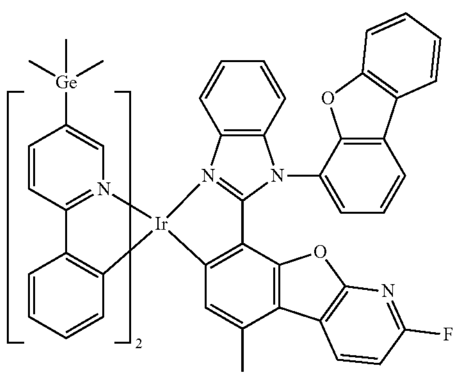
3359
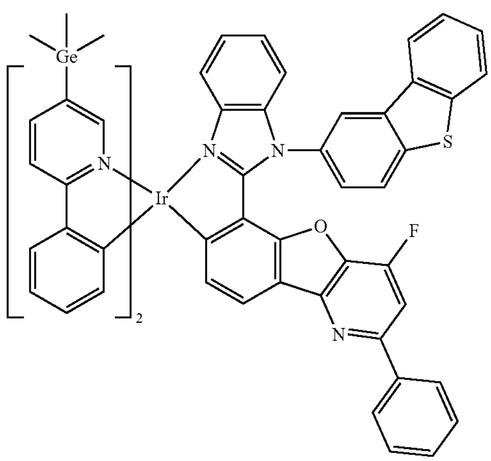
-continued
3360
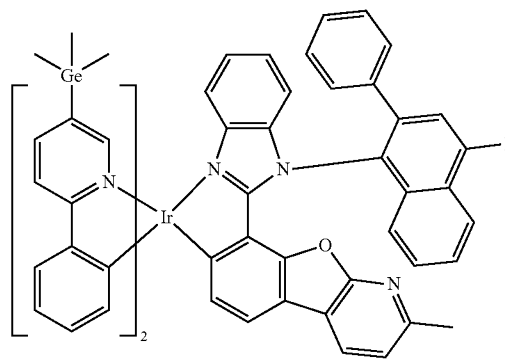
3361
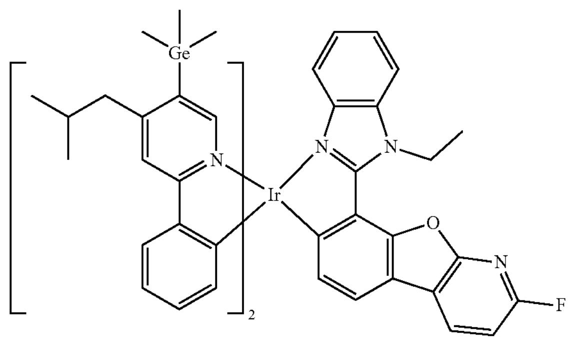
3362
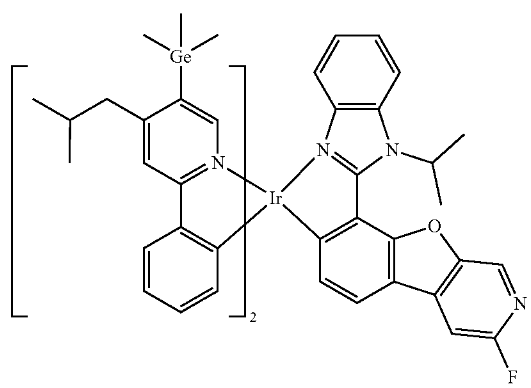
3363
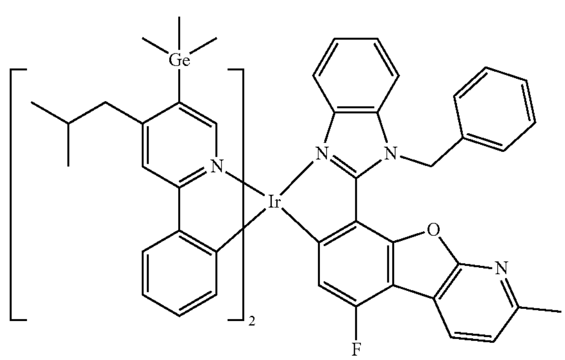

3364
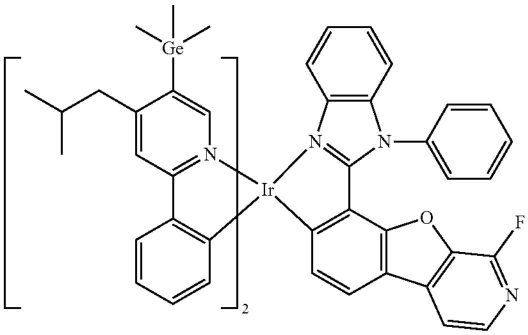
3365
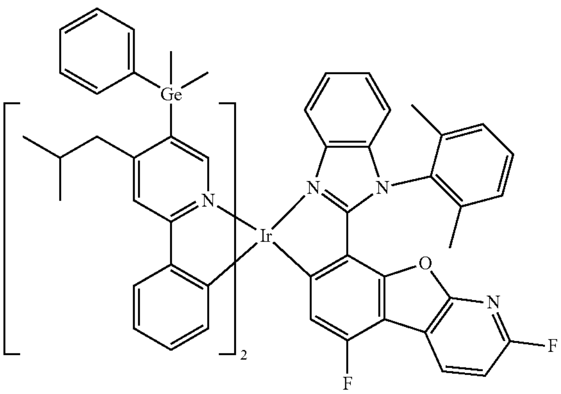
3366
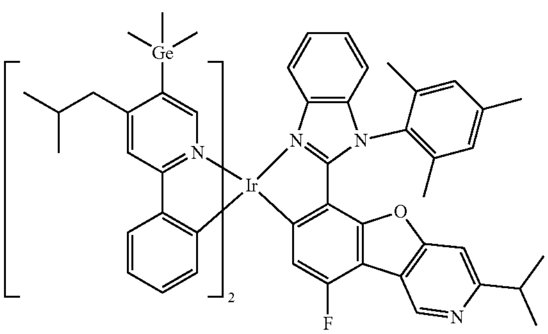
3367
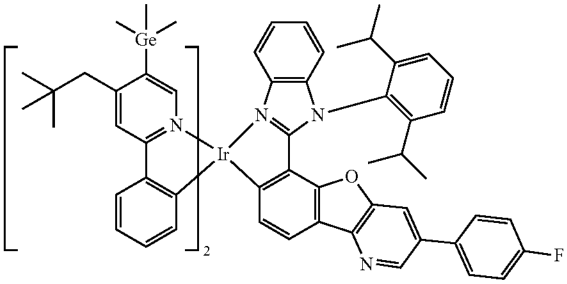
3368
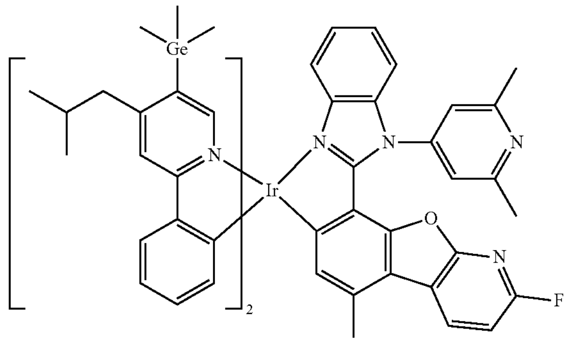
3369
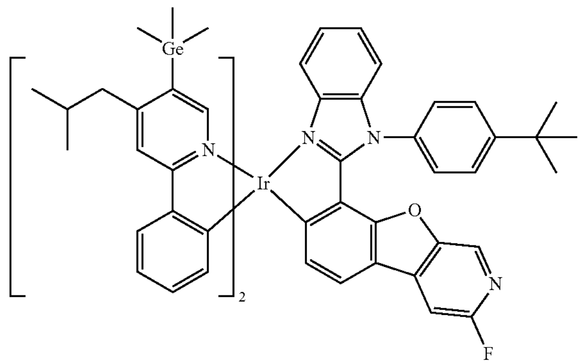
3370
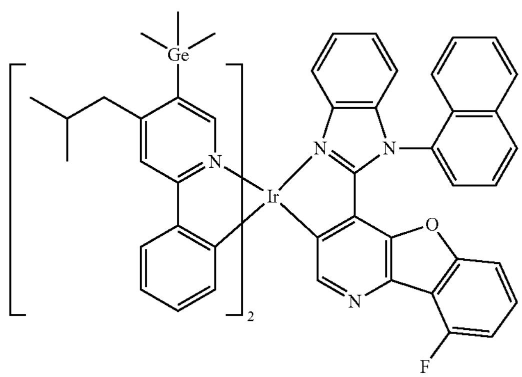
3371
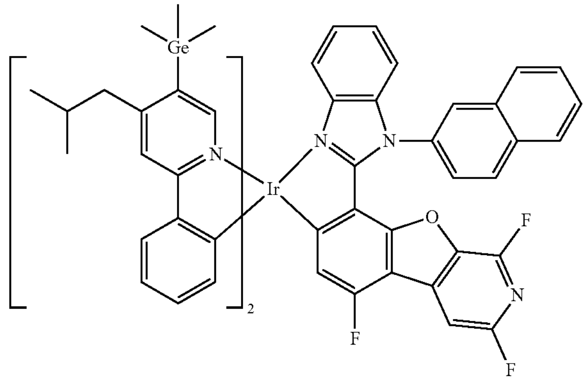

-continued
3372
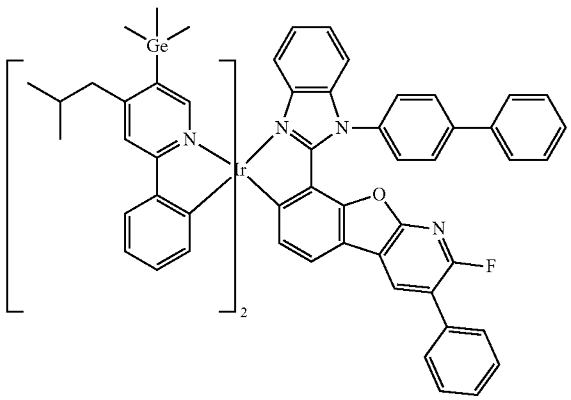
3373
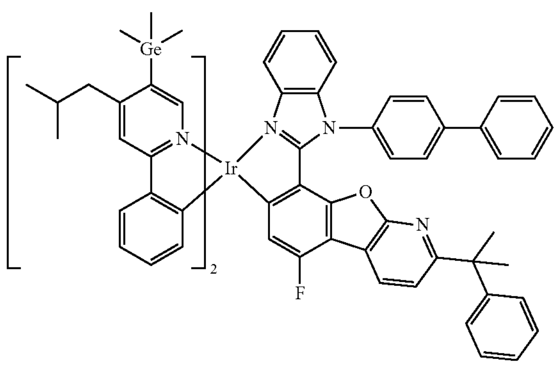
3374
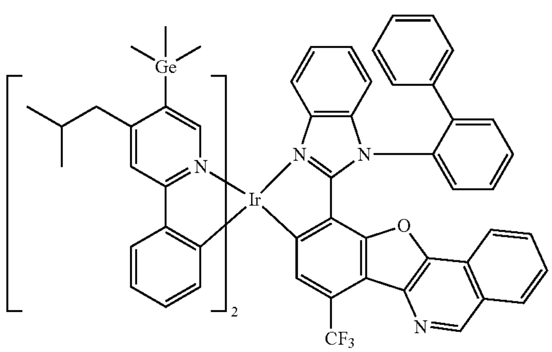
3375
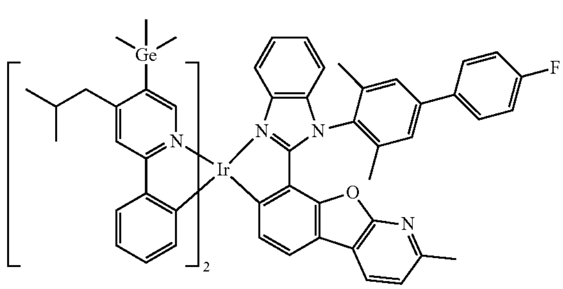
-continued
3376
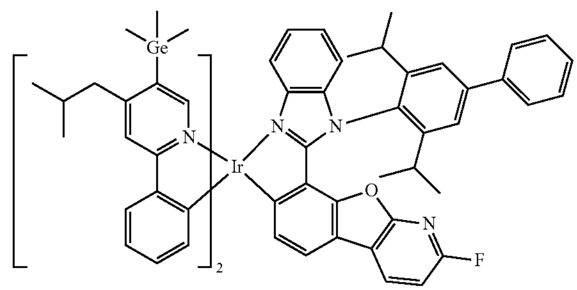
3377
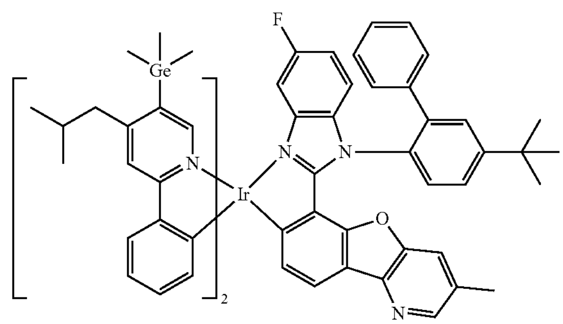
3378
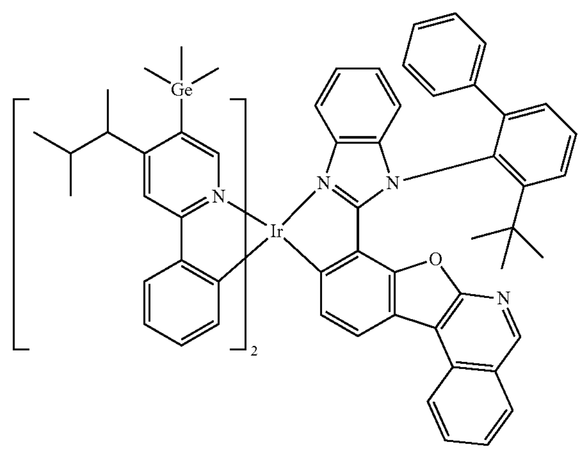
3379
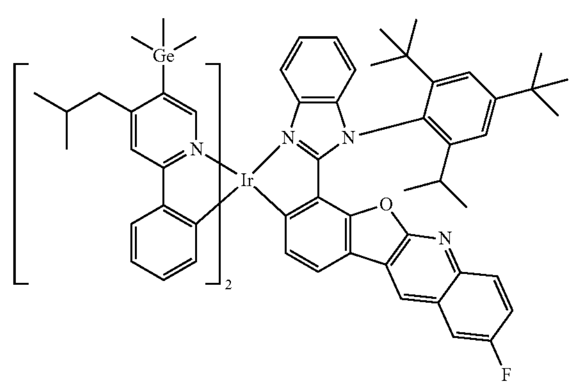

3380
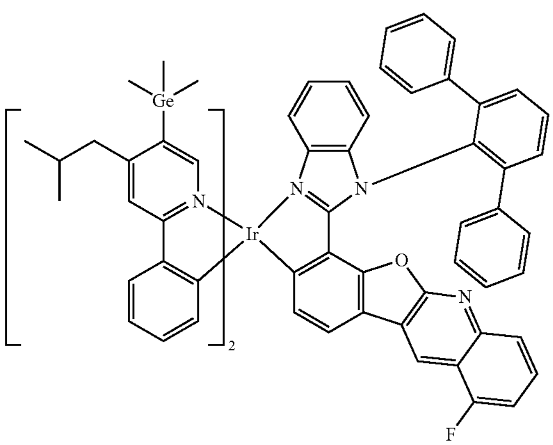
3381
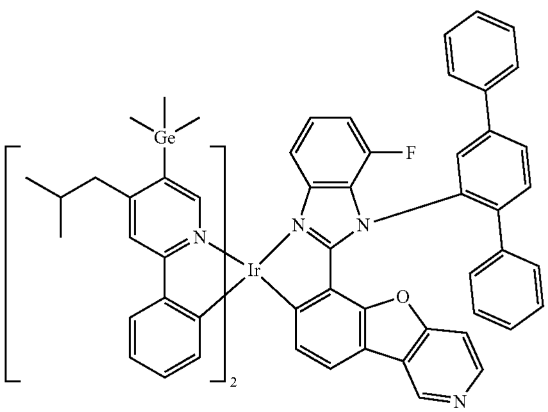
3382
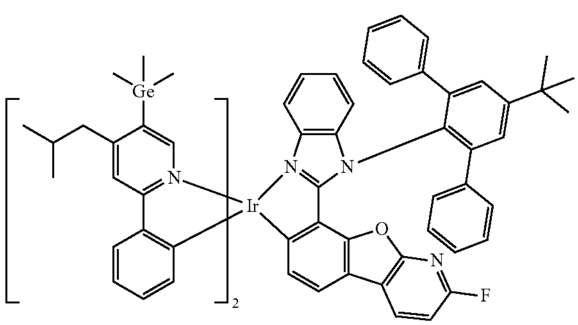
3383
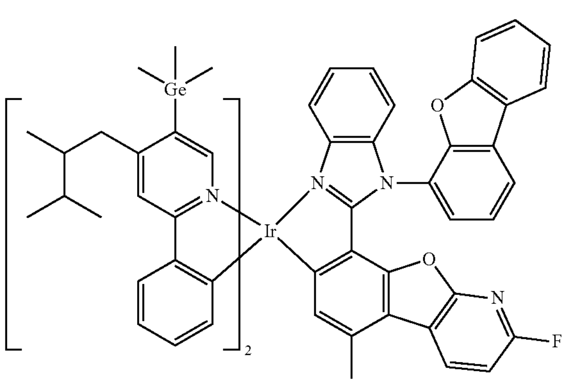
3384
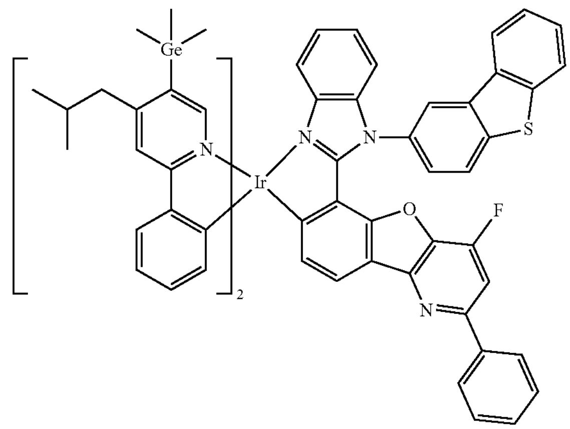
3385
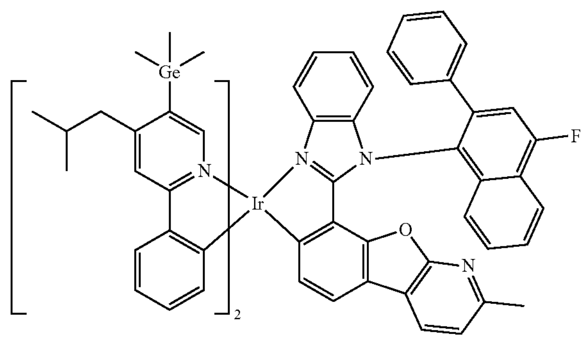
3386
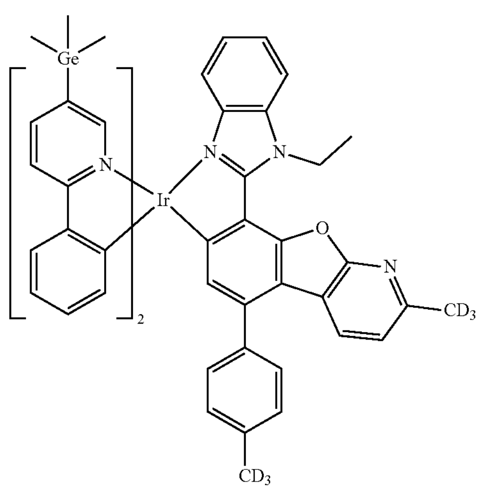

-continued
3387
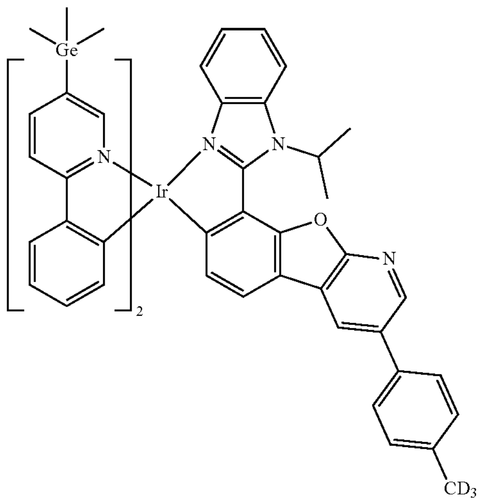
3388
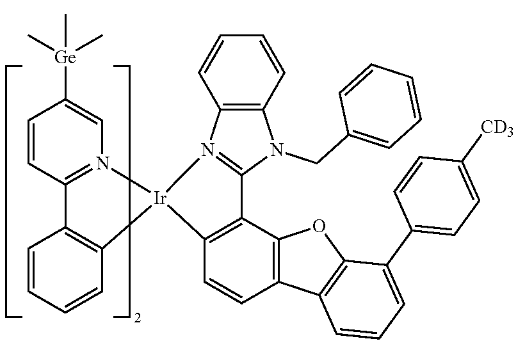
3389
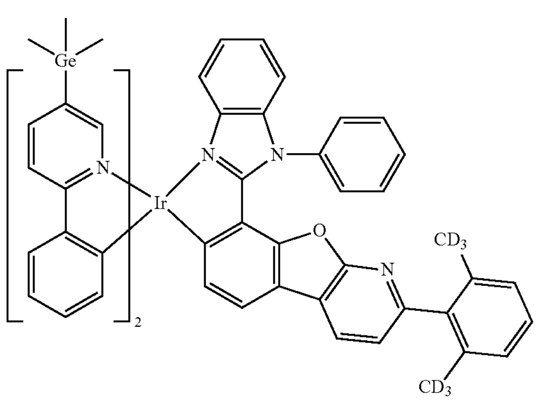
-continued
3390
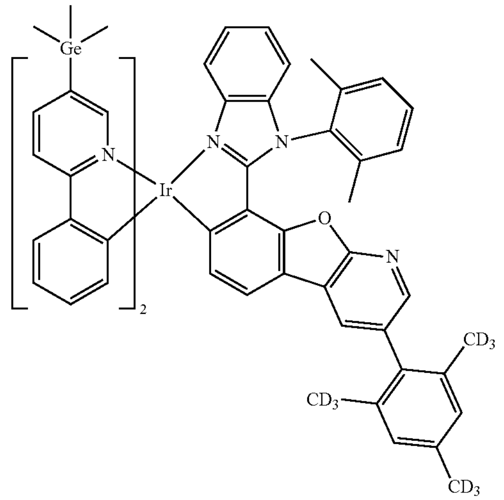
3391
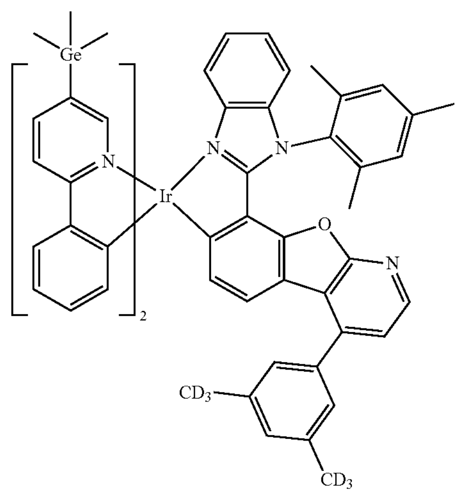
3392
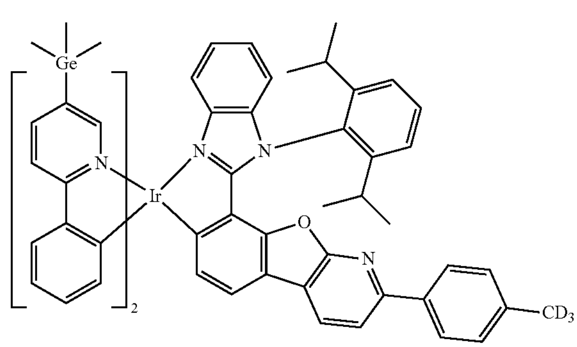

3393
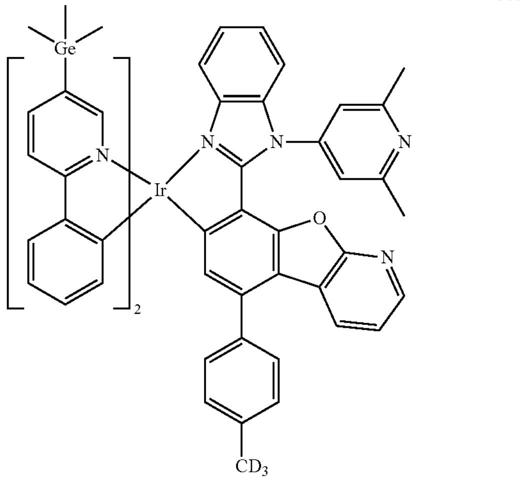
3394
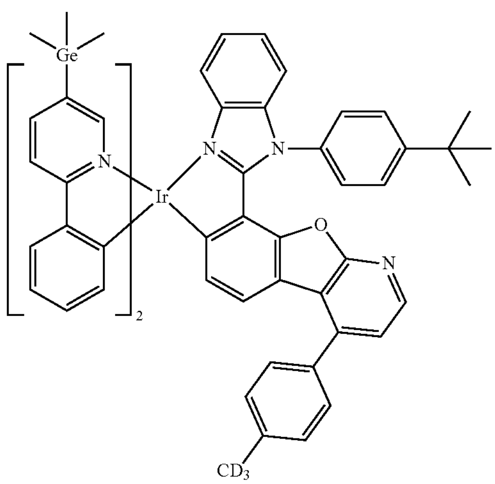
3395
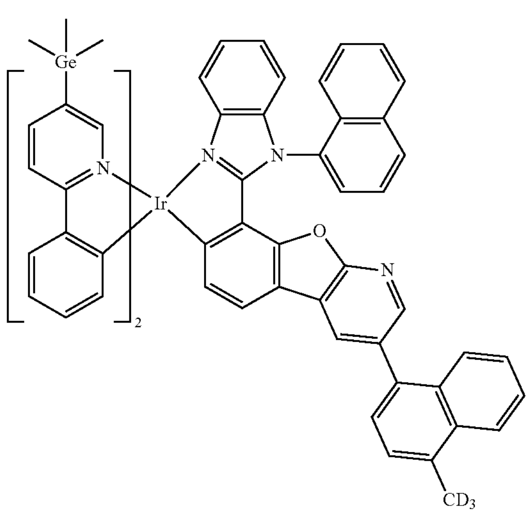
3396
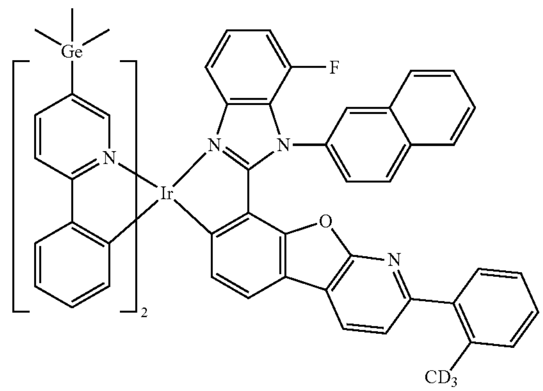
3397
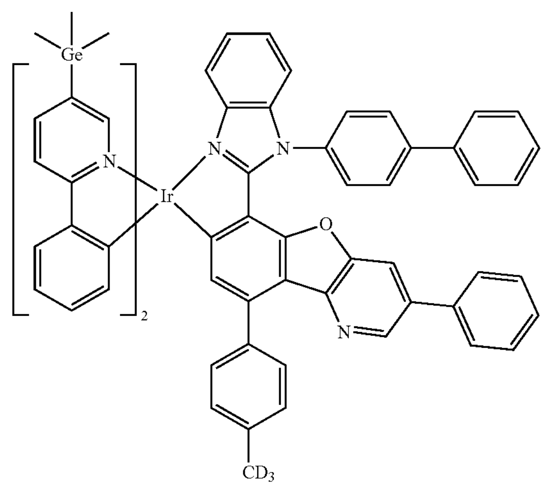
3398
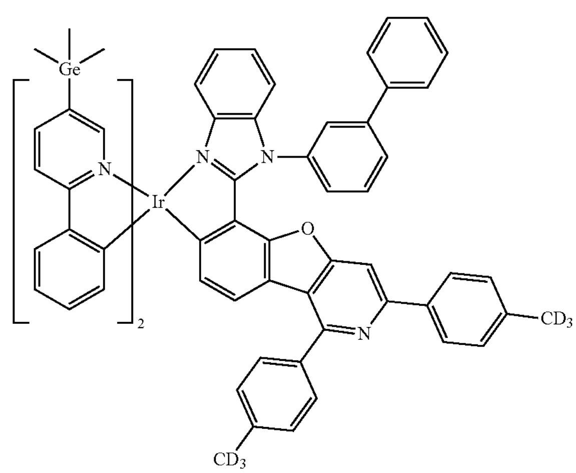

-continued
3399
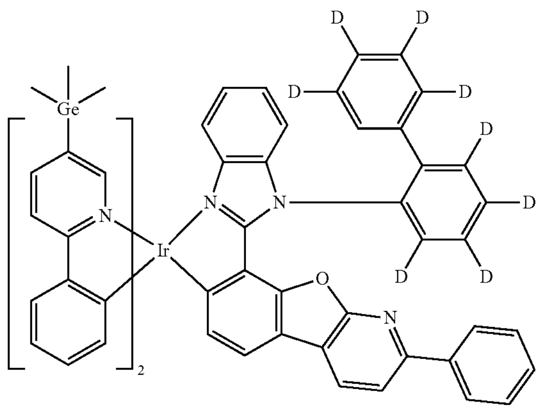
3400
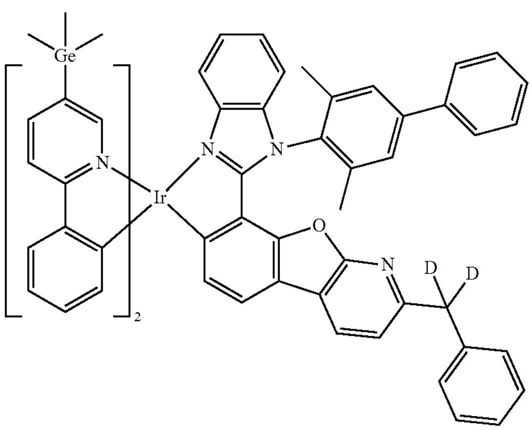
3401
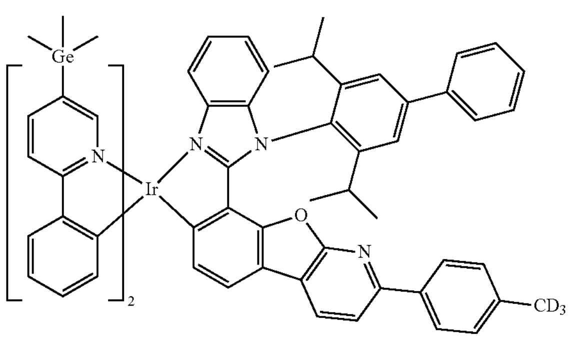
3402
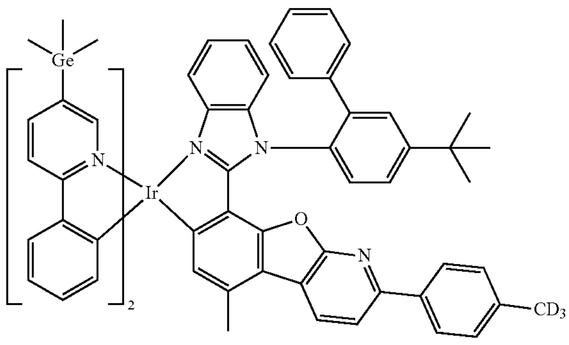
3403
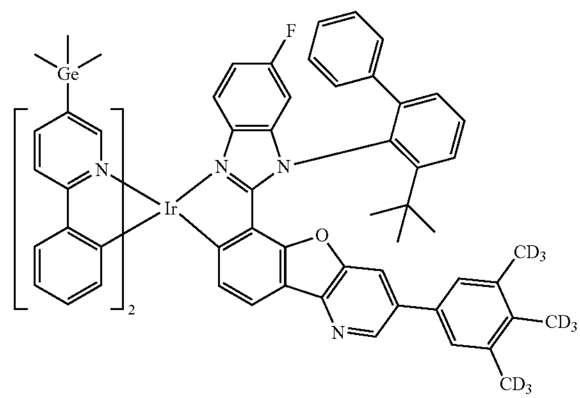
3404
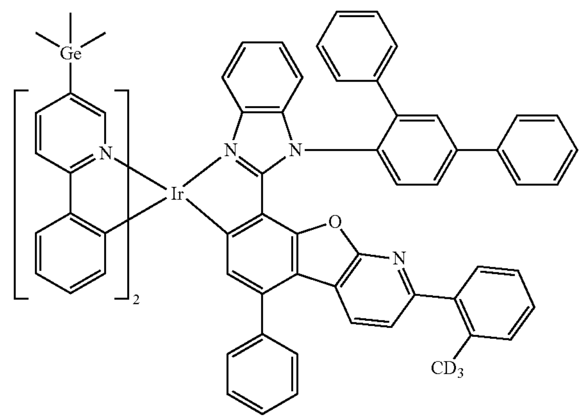
3405
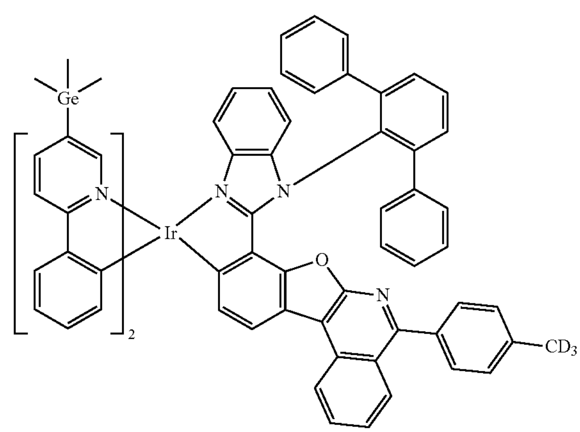

-continued
3406
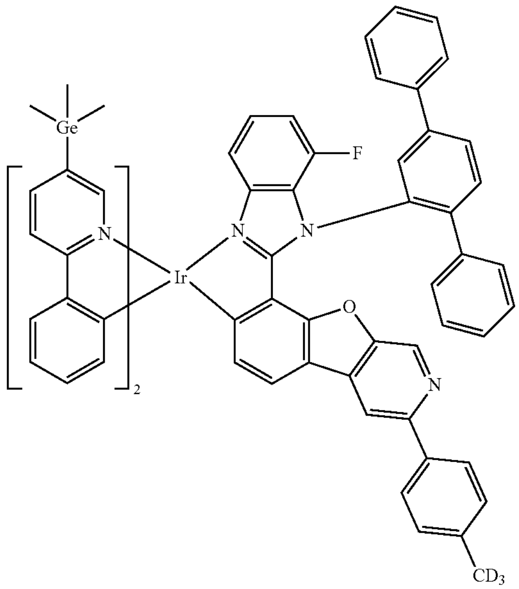
3407
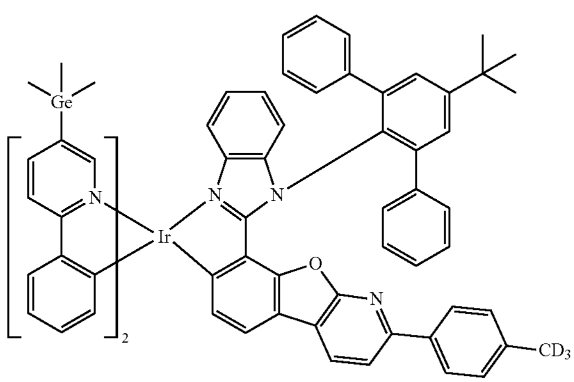
3408
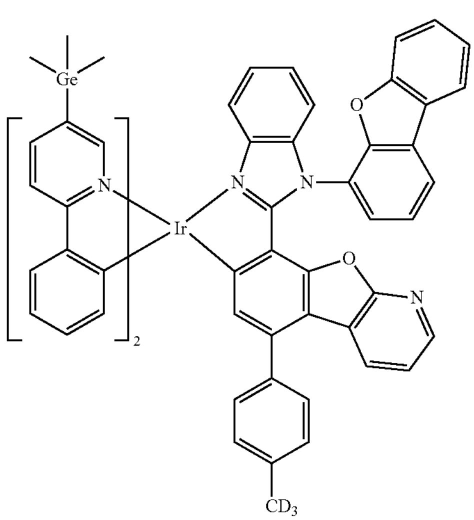
-continued
3409
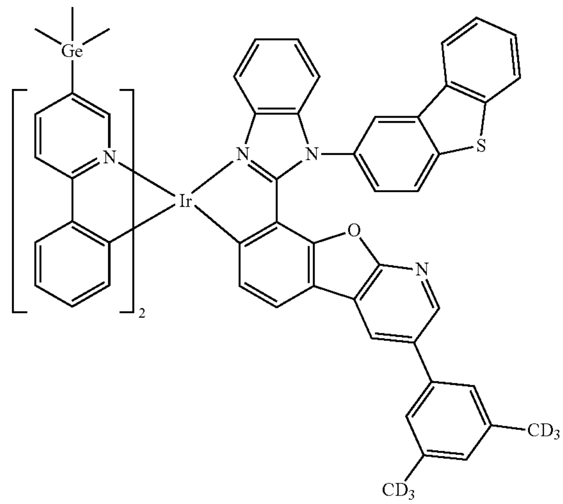
3410
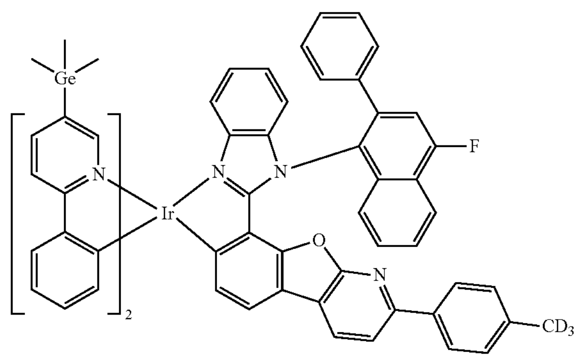
3411
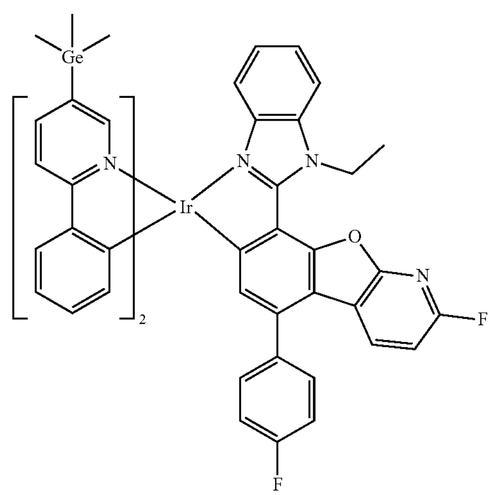

3412
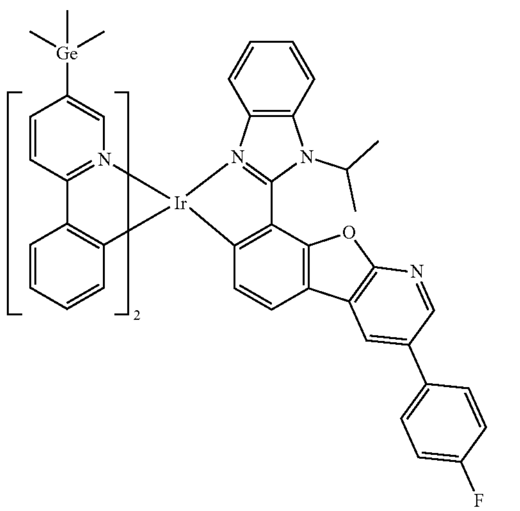
3413
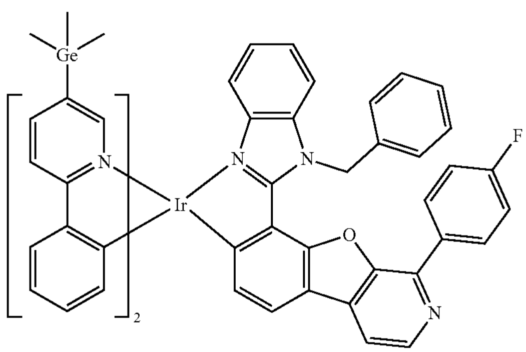
3414
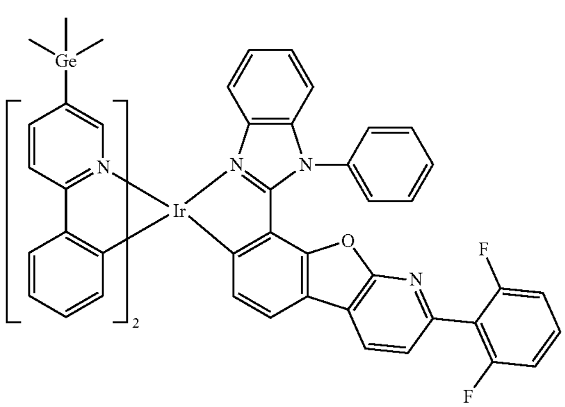
3415
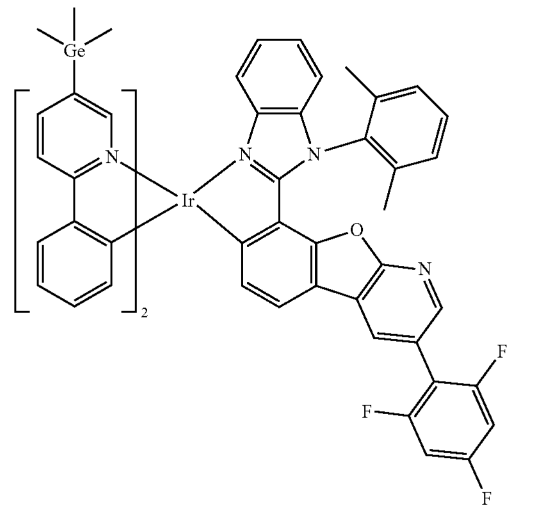
3416
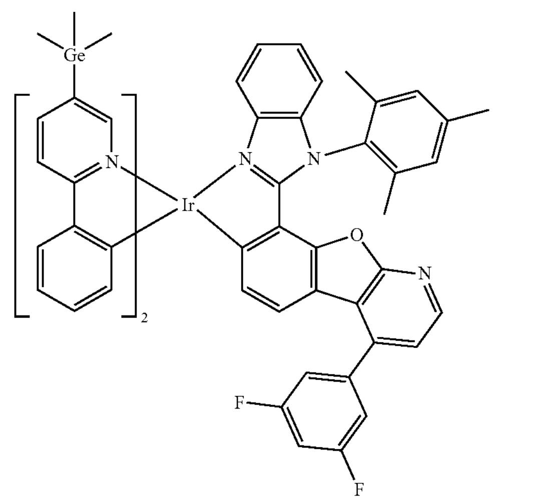
3417
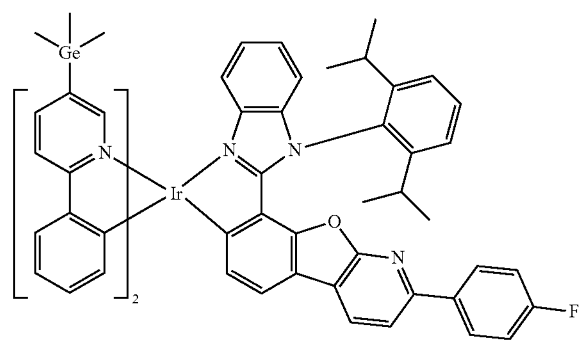

3418
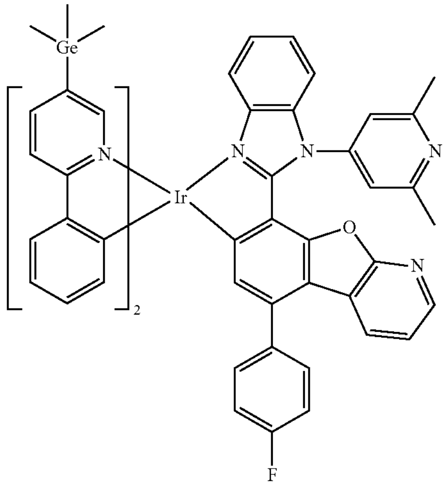
3419
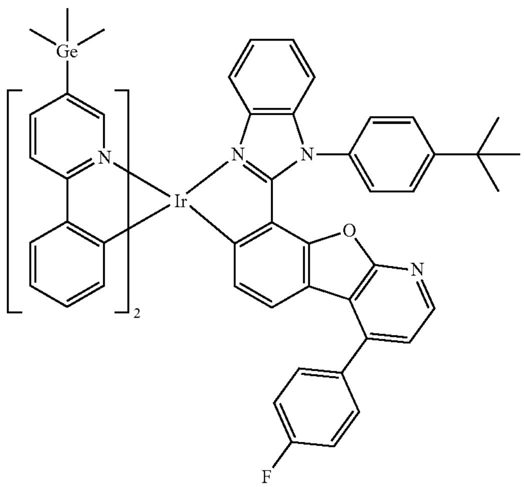
3420
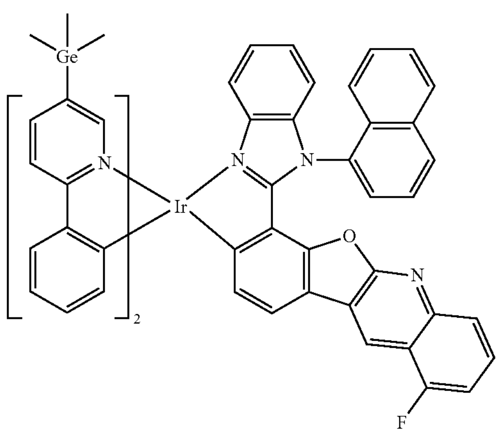
3421
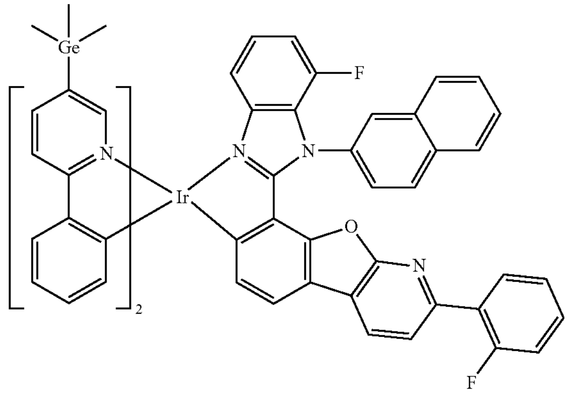
3422
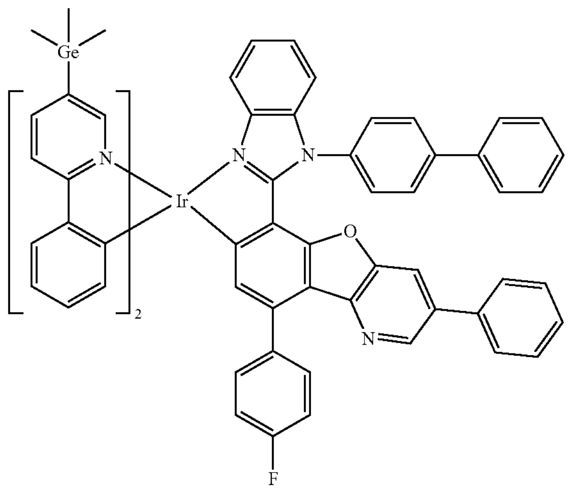
3423
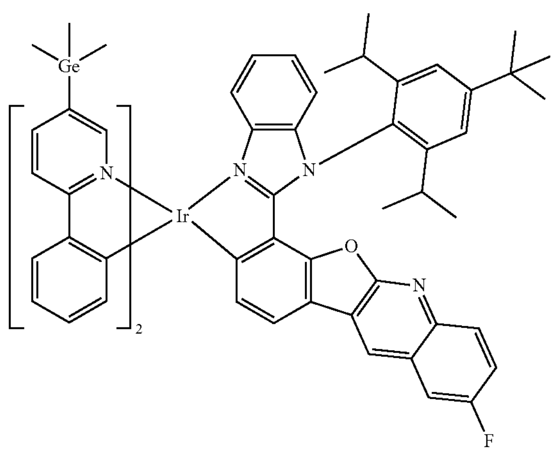

-continued
3424
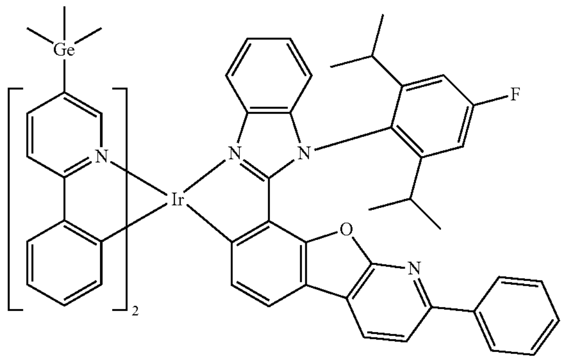
3425
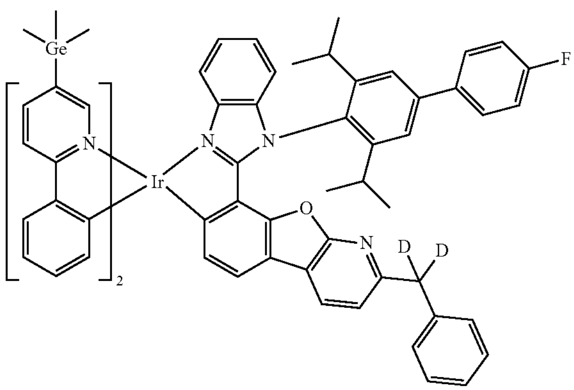
3426
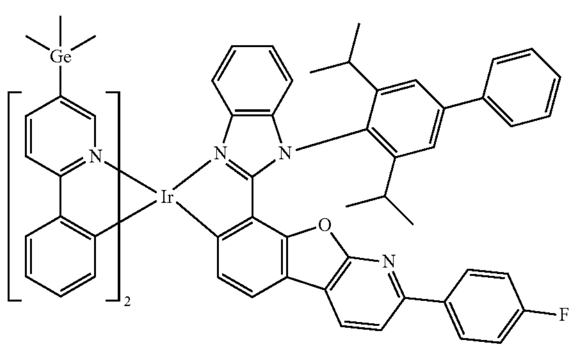
3427
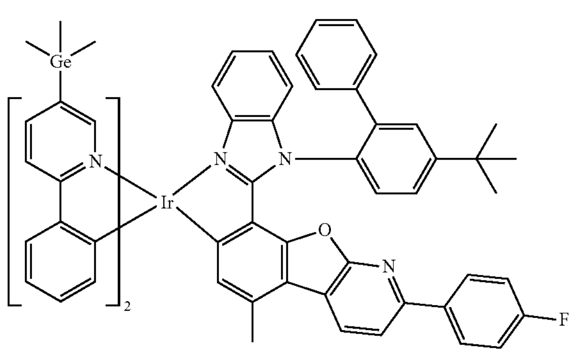
-continued
3428
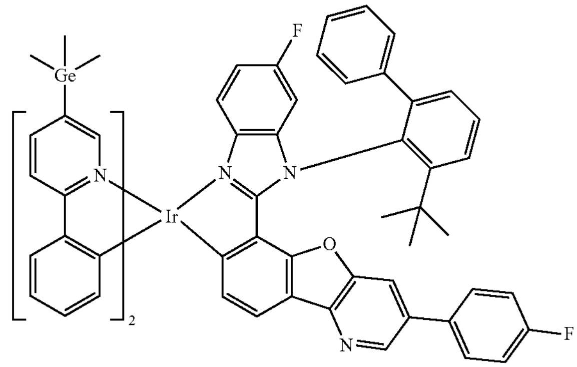
3429
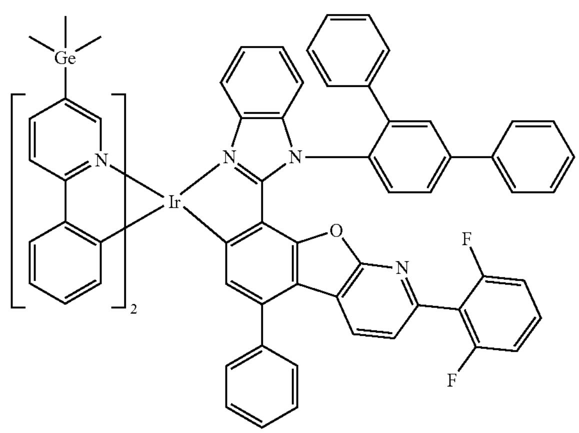
3430
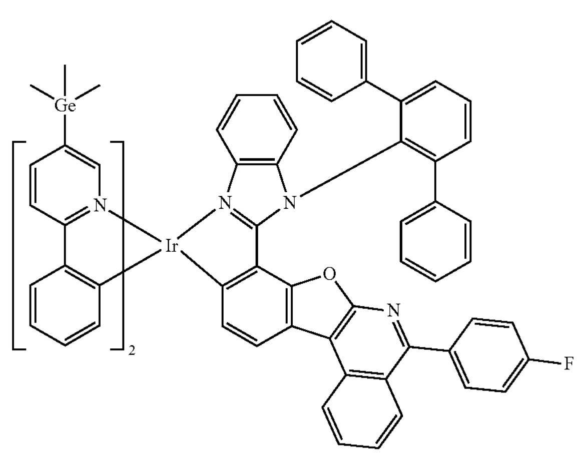

-continued
3431
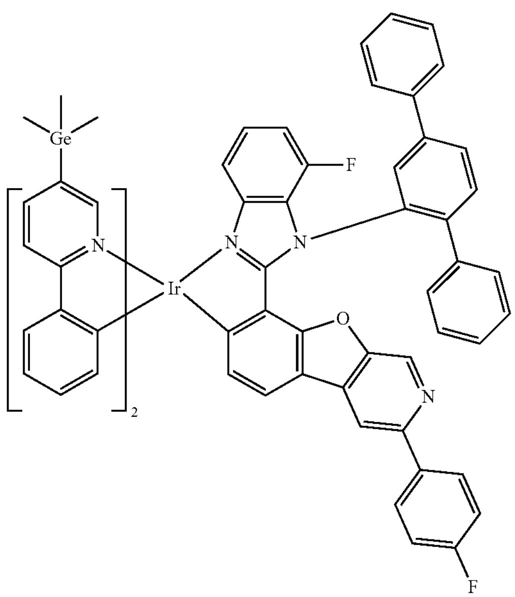
3432
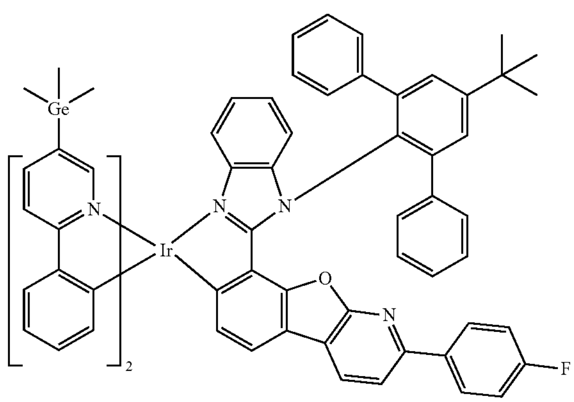
3433
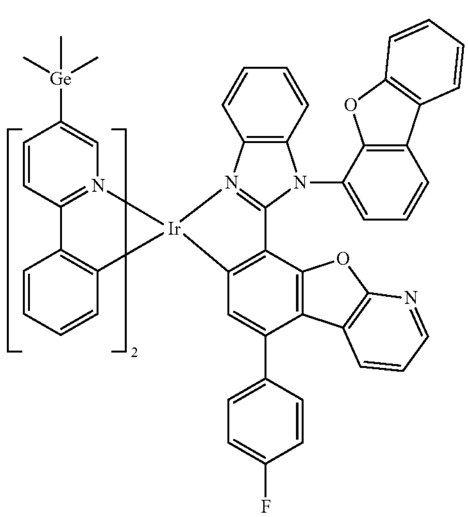
-continued
3434
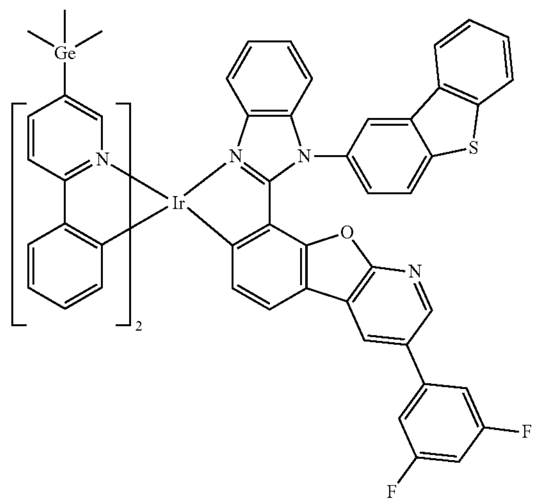
3435
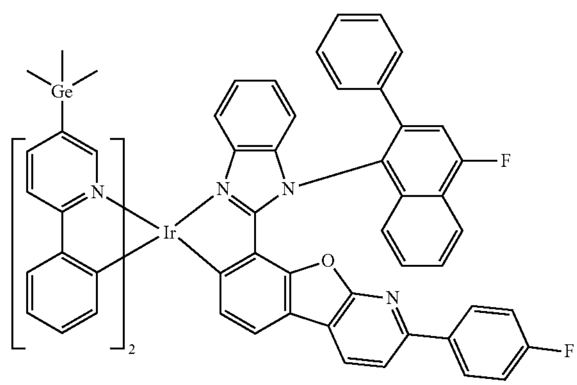
3436
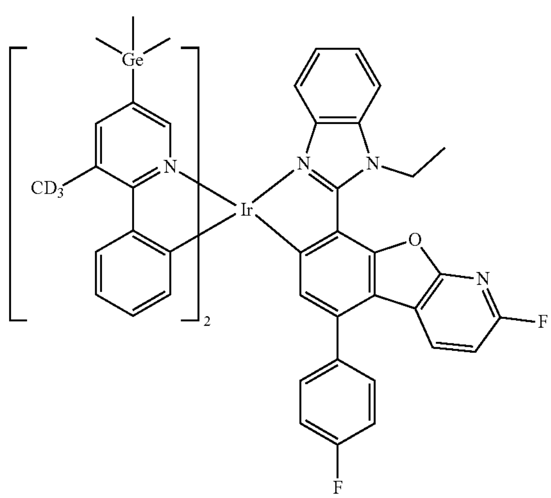

-continued
3437
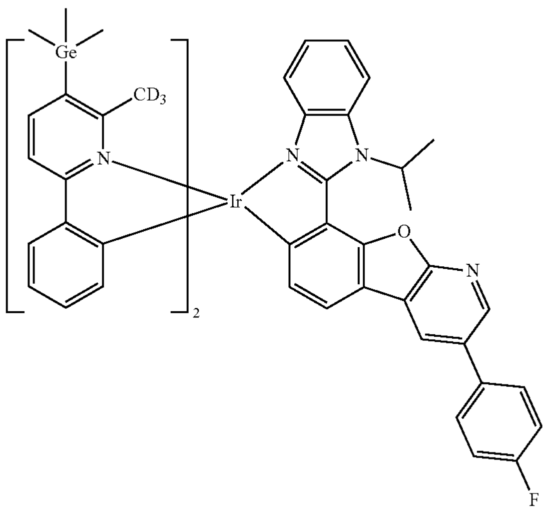
3438
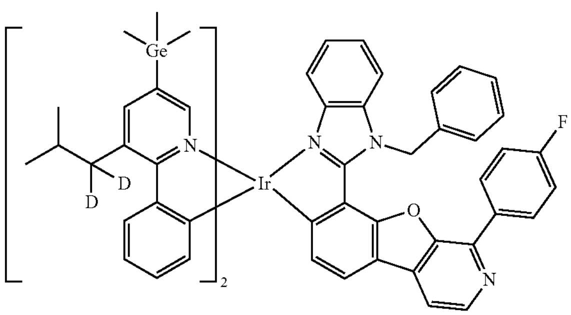
3439
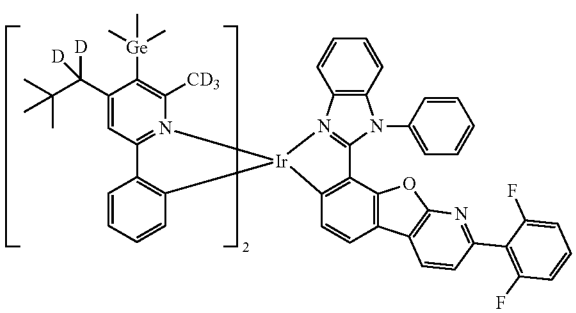
3440
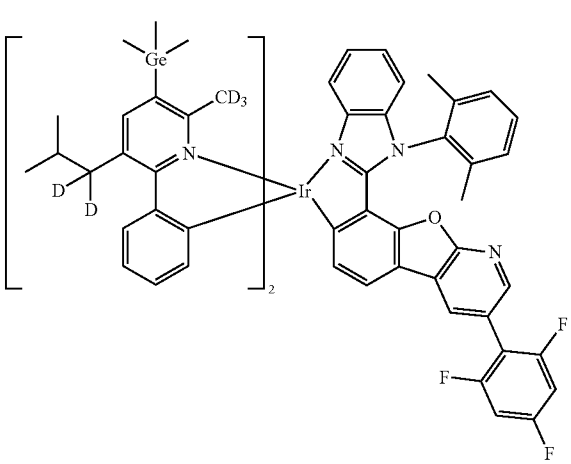
-continued
3441
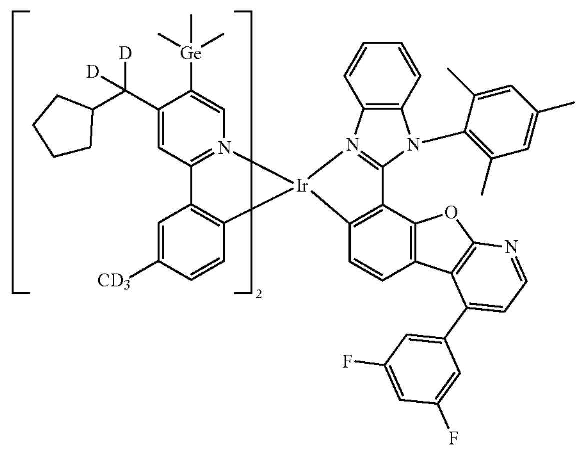
3442
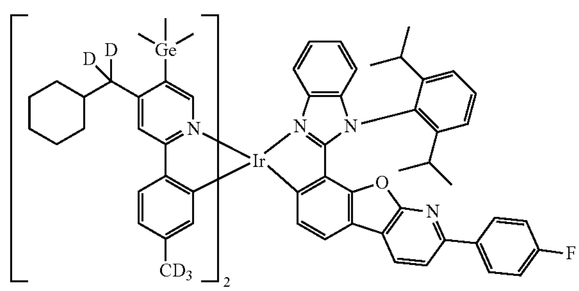
3443
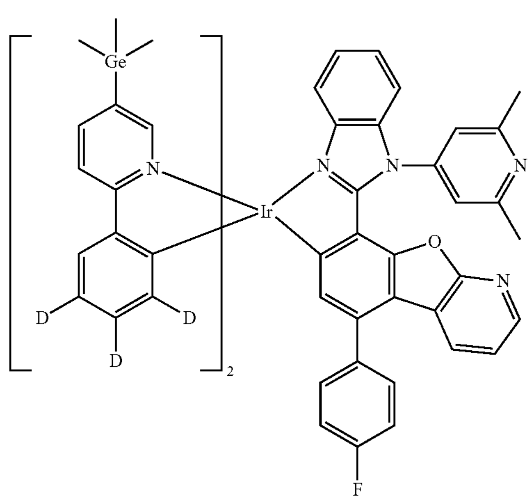

3444
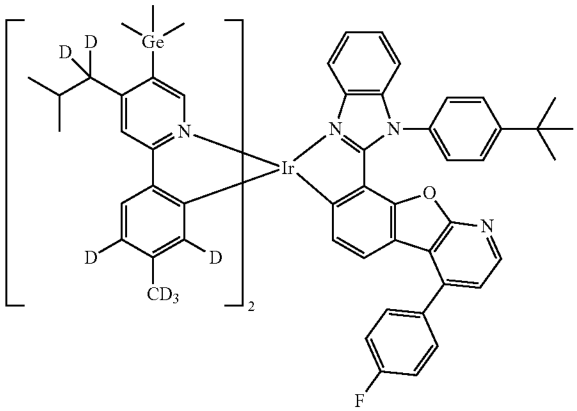
3445
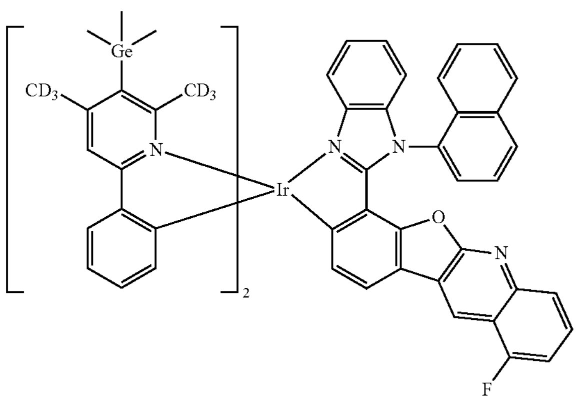
3446
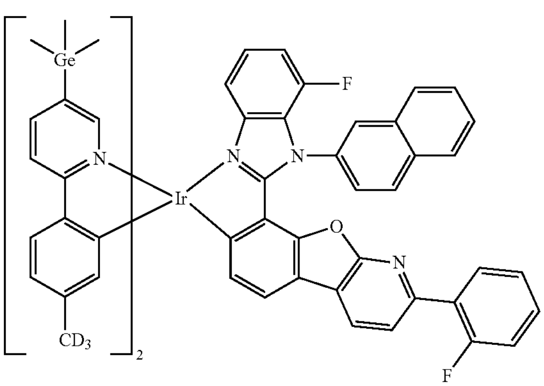
3447
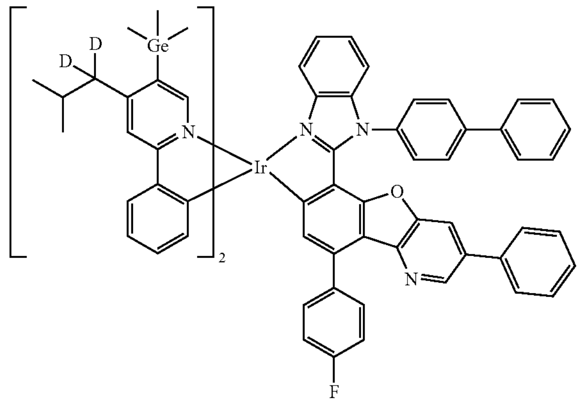
3448
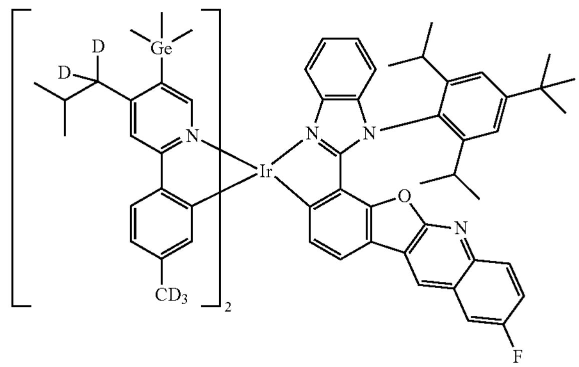
3449
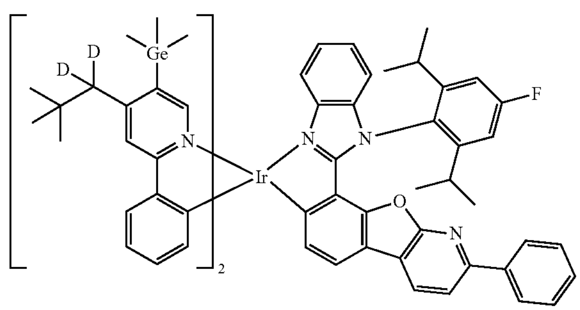
3450
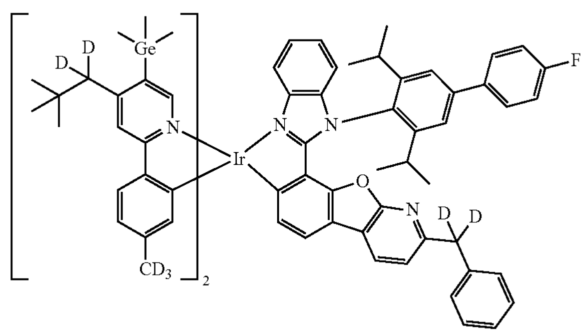

3451
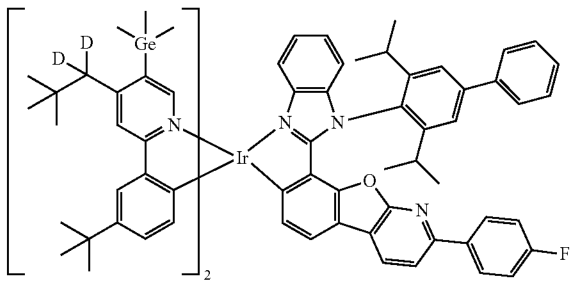
3452
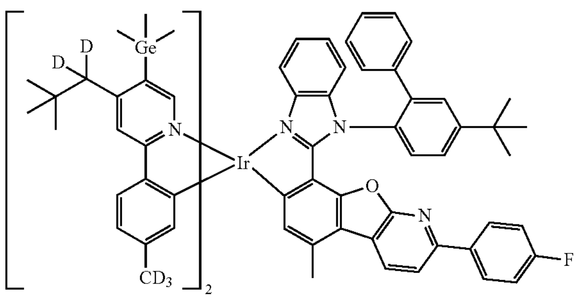
3453
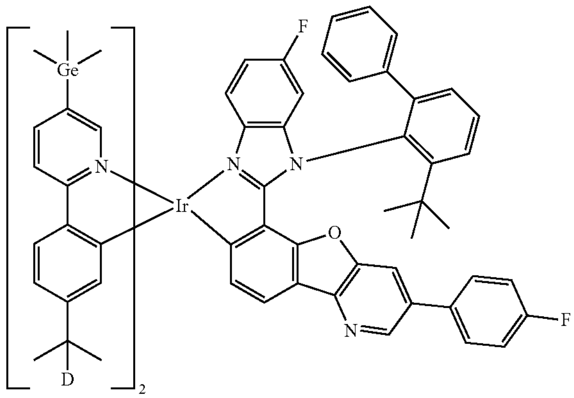
3454
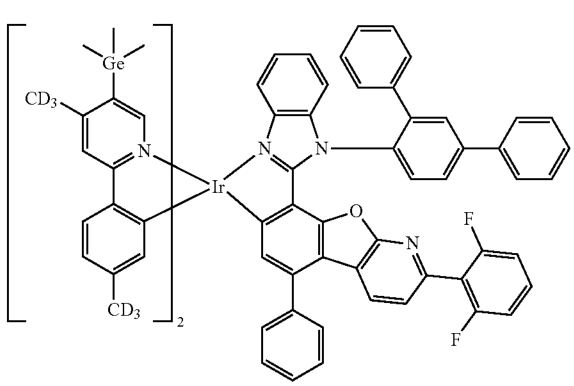
3455
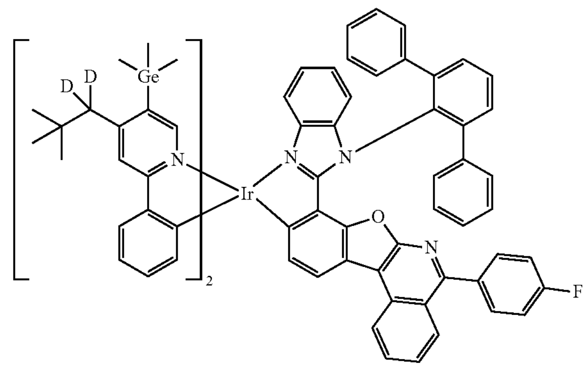
3456
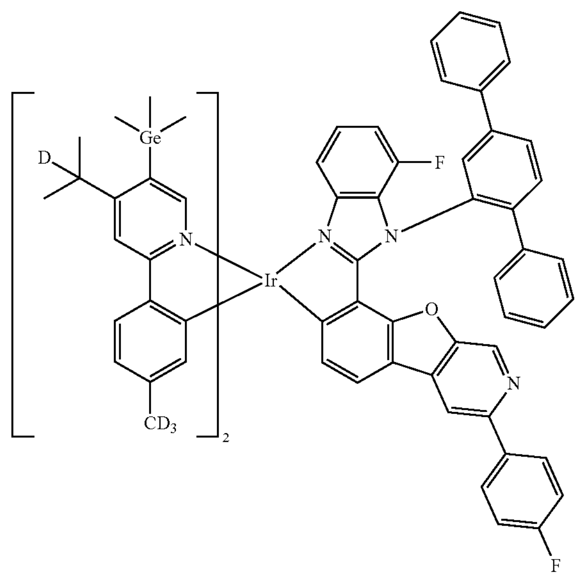
3457
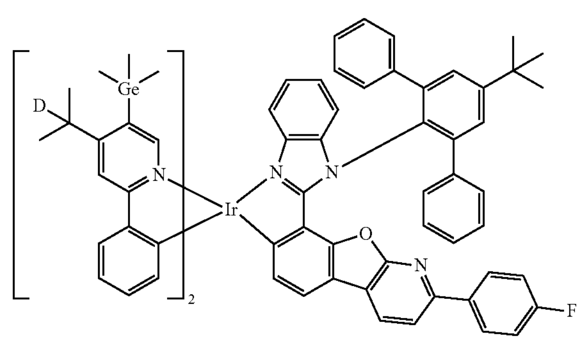

-continued
3458
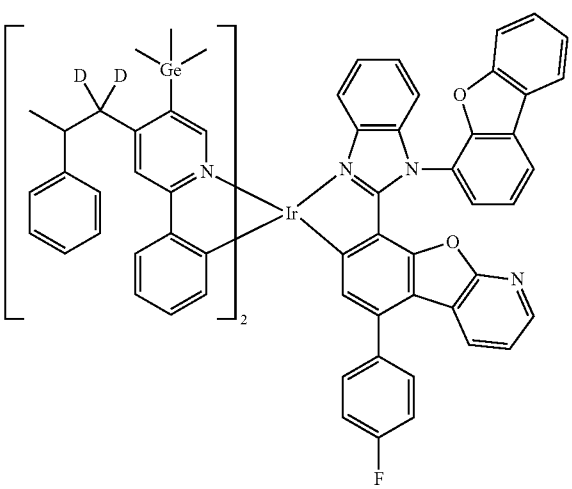
3459
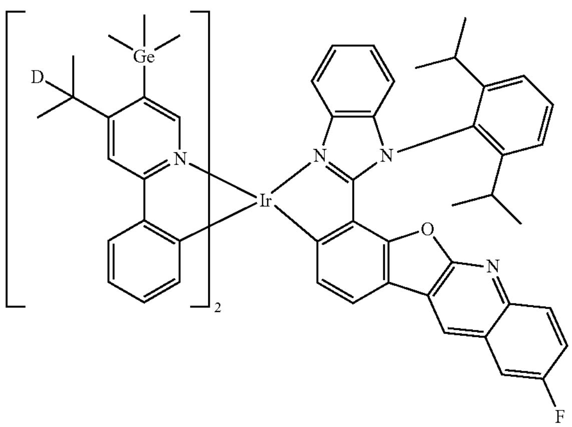
3460
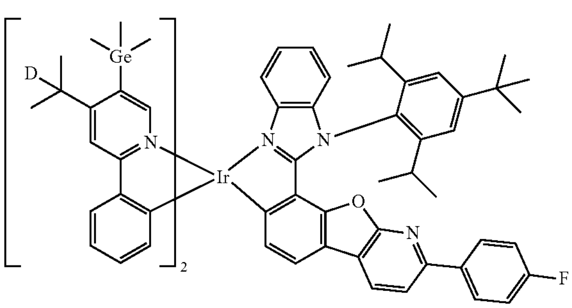
-continued
3461
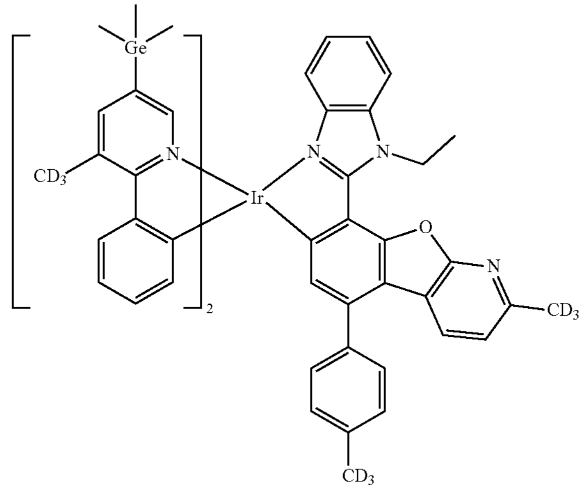
3462
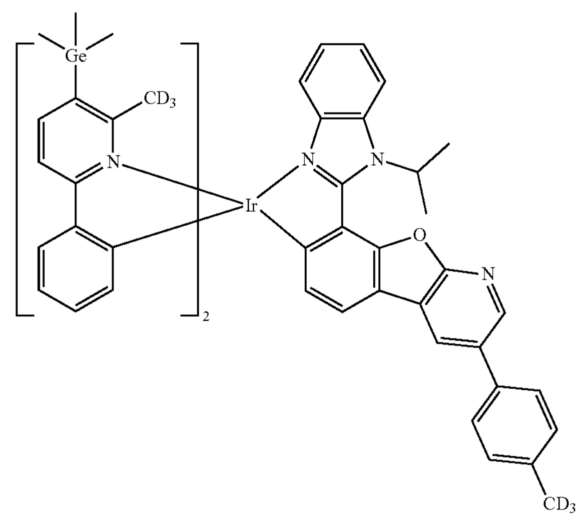
3463
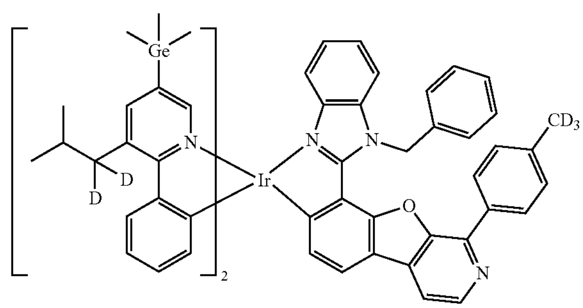

3464
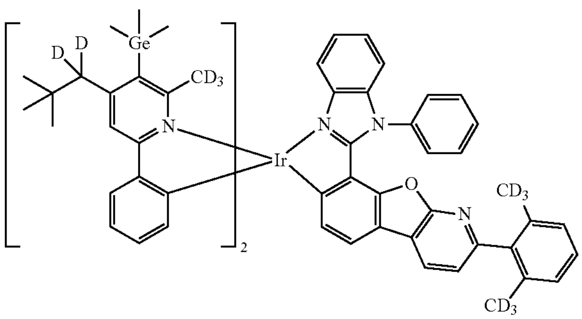
3465
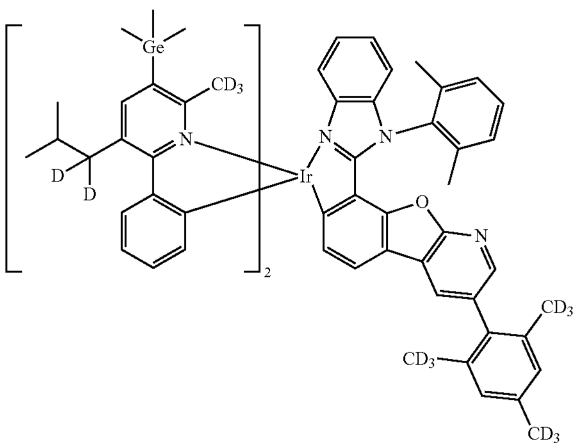
3466
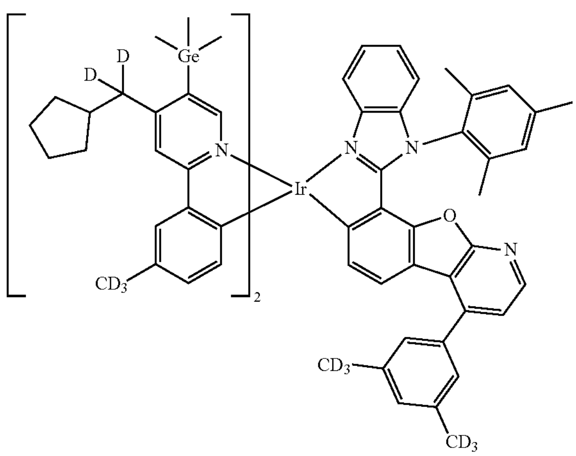
3467
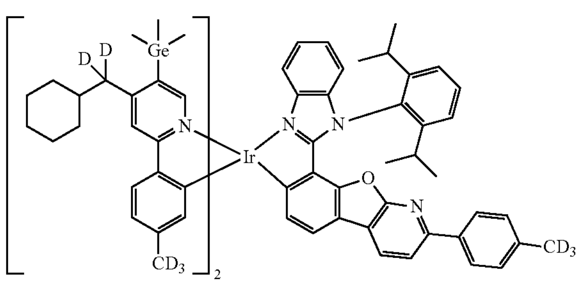
3468
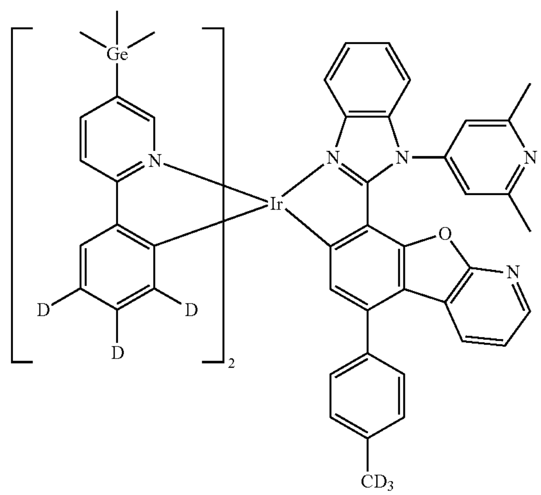
3469
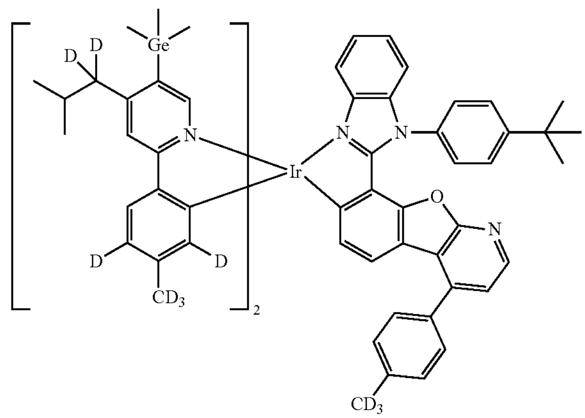
3470
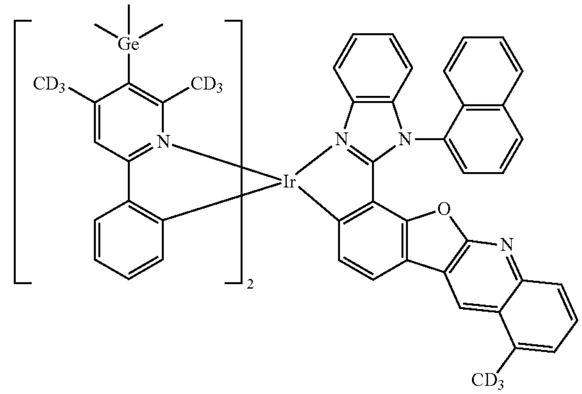

-continued
3471
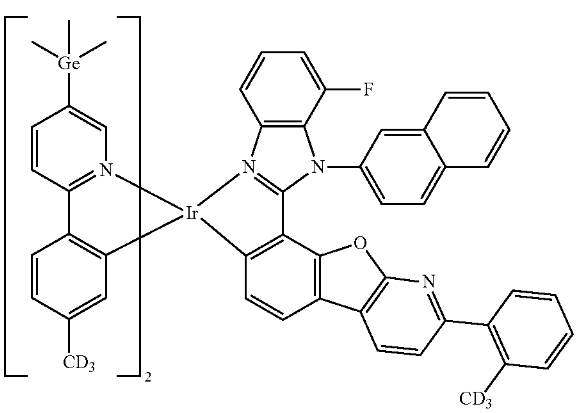
3472
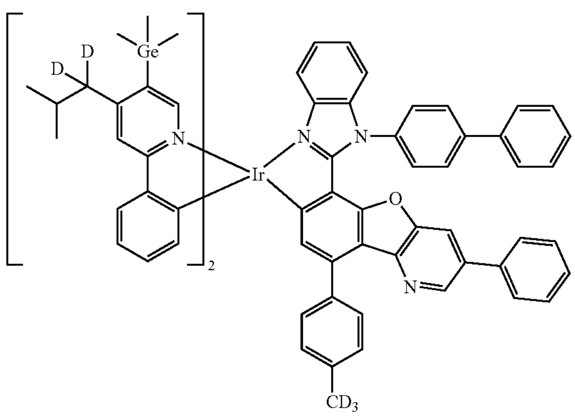
3473
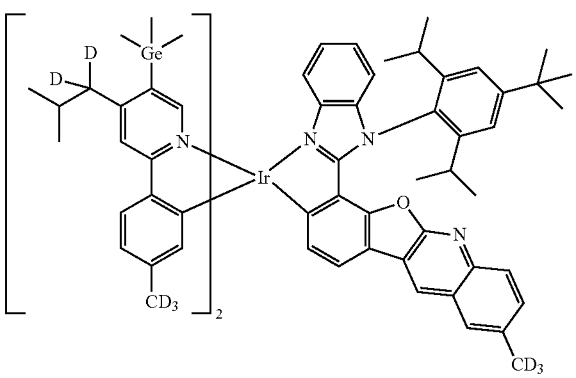
3474
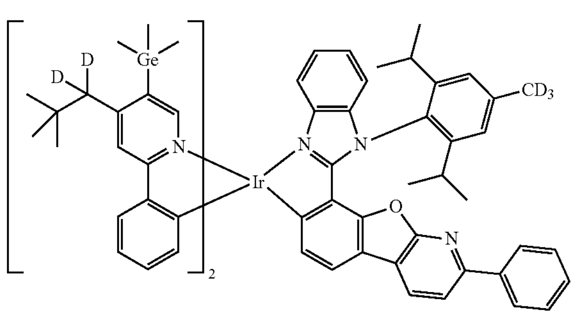
-continued
3475
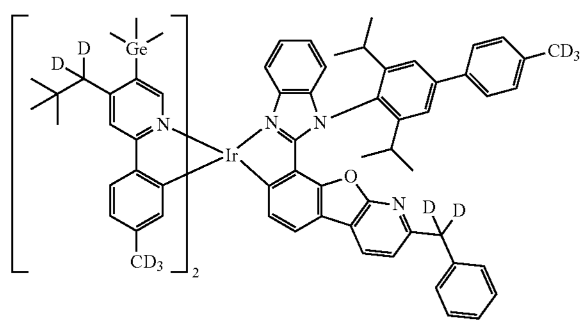
3476
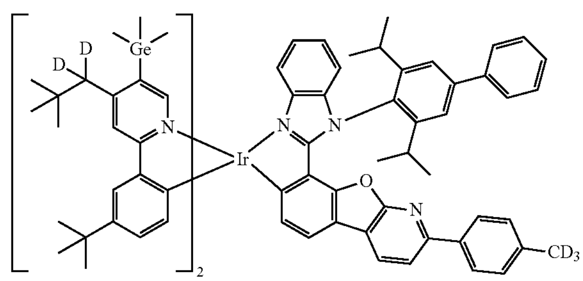
3477
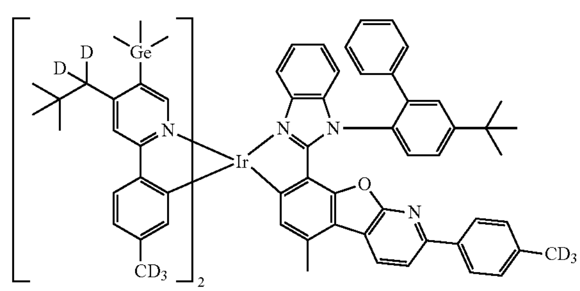
3478
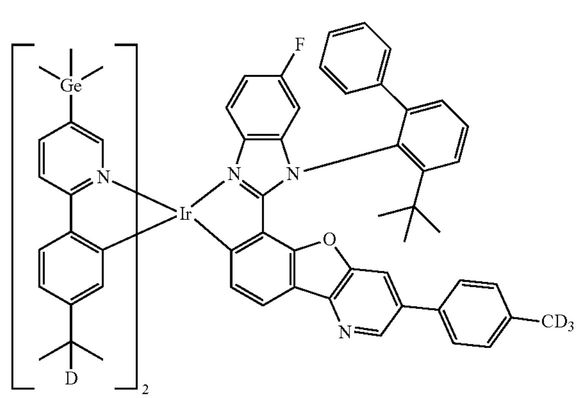

-continued
3479
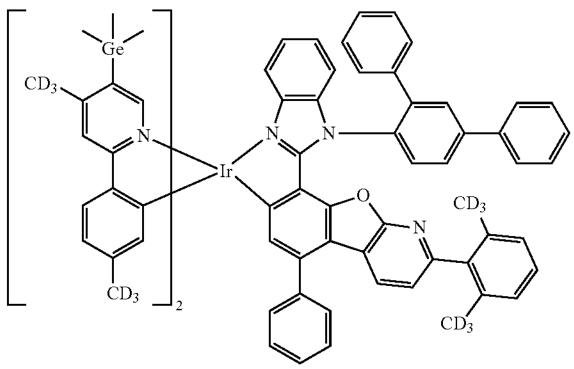
3480
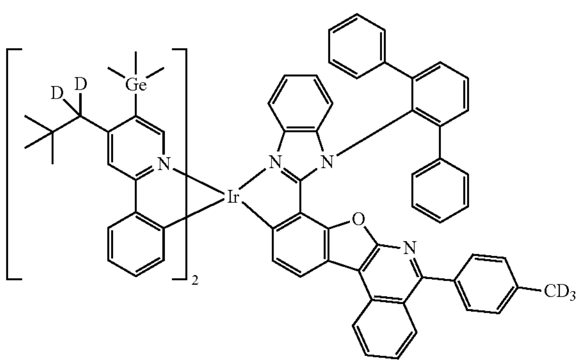
3481
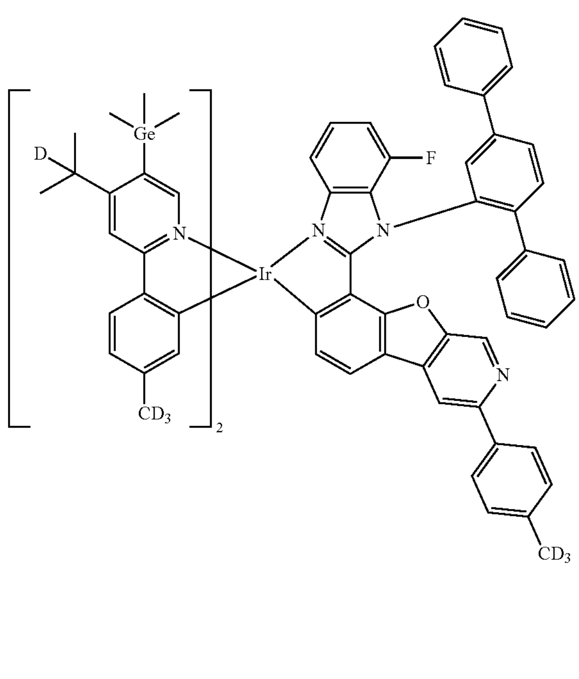
-continued
3482
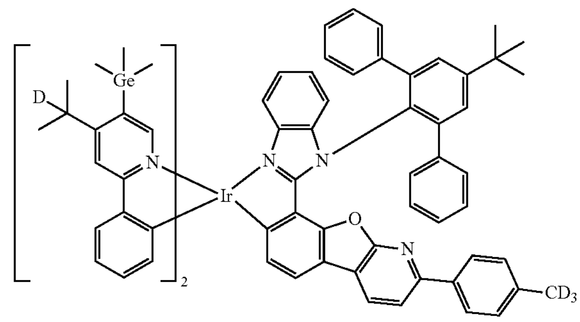
3483
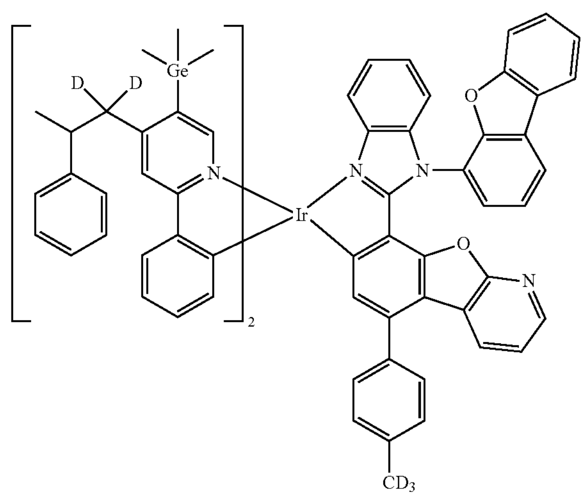
3484
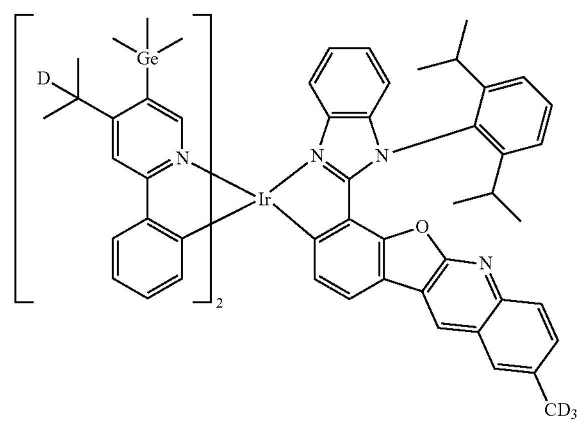
3485
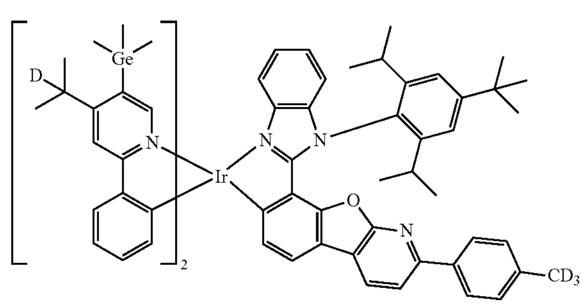

-continued
3486
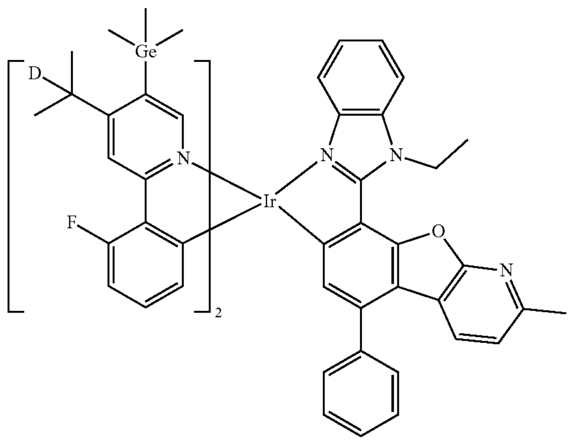
3487
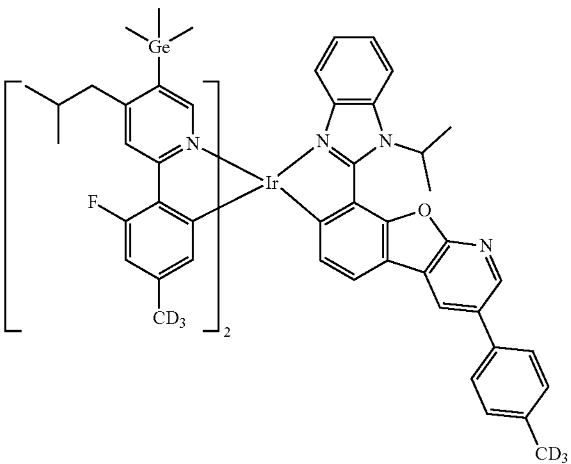
3488
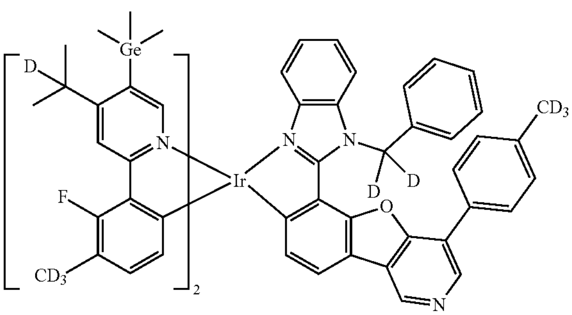
3489
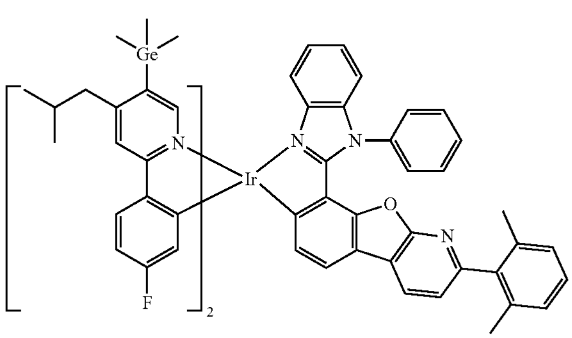
-continued
3490
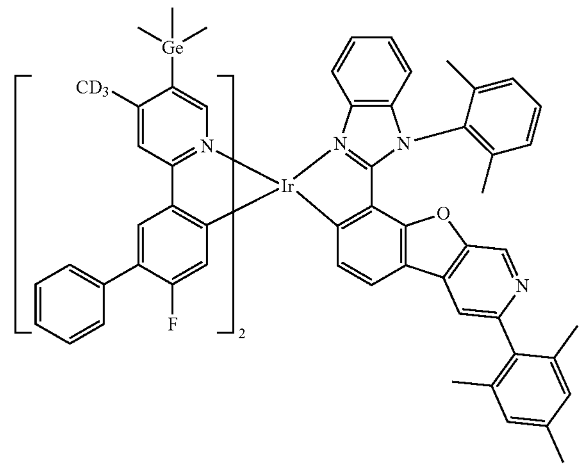
3491
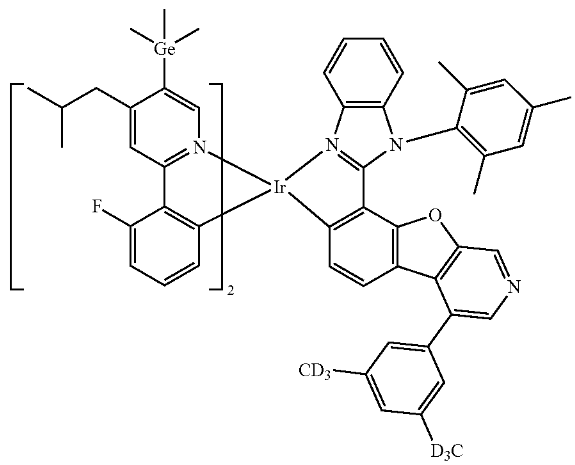
3492
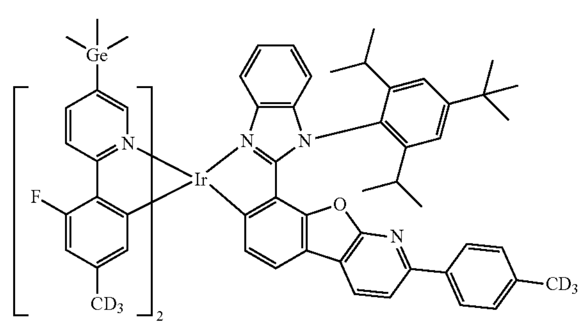

-continued
3493
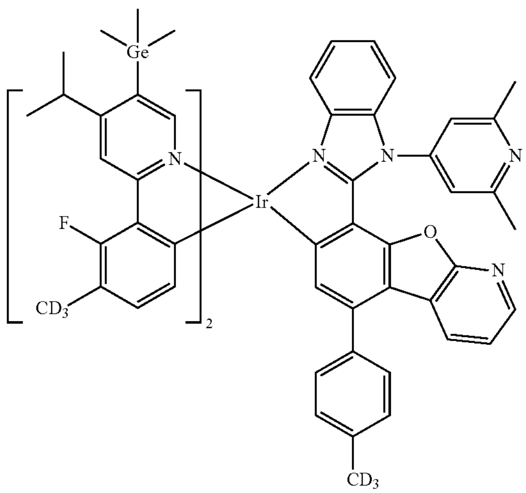
3494
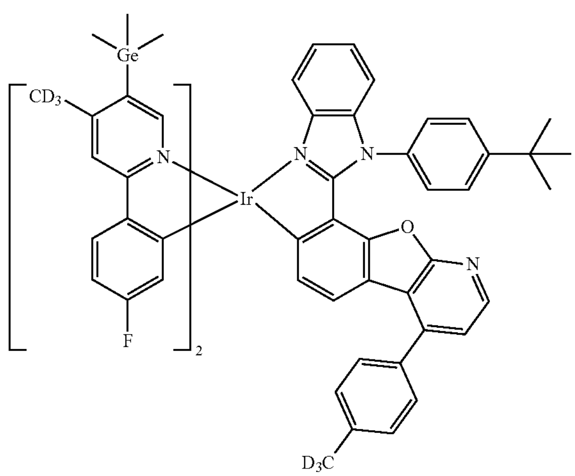
3495
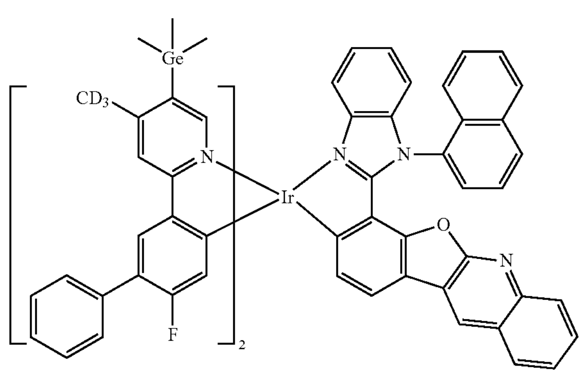
-continued
3496
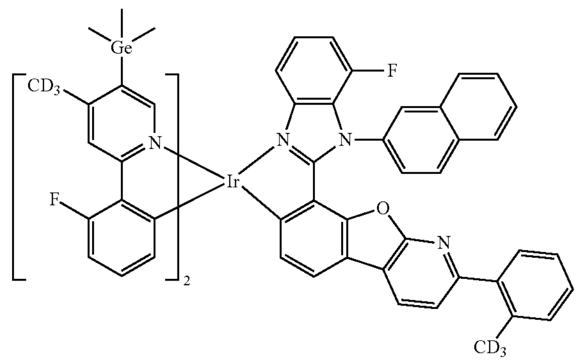
3497
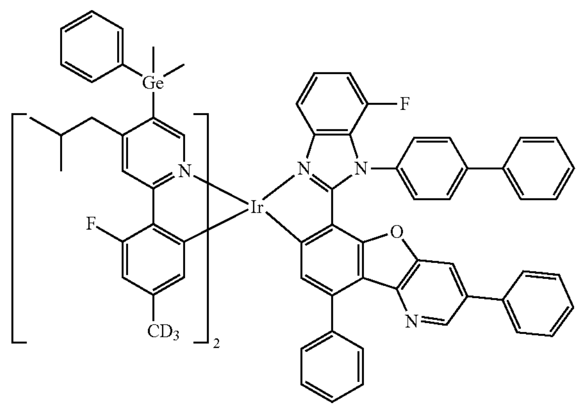
3498
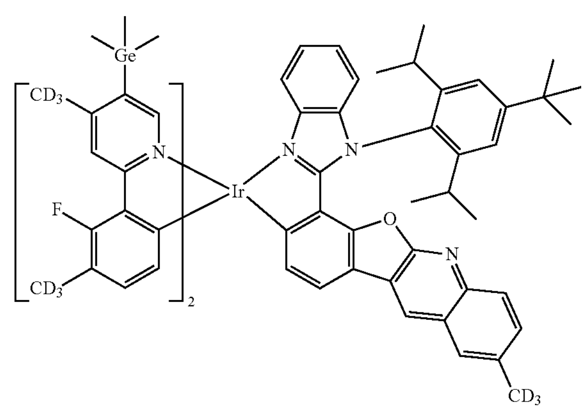
3499
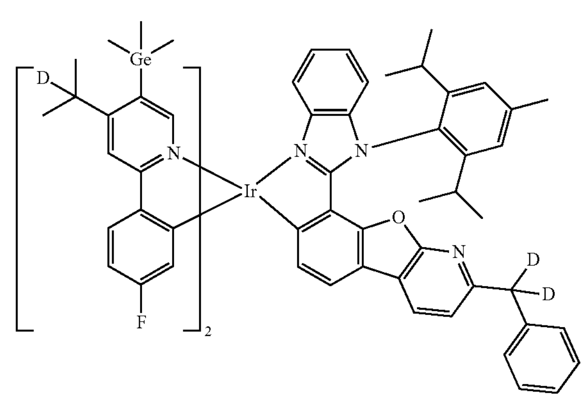

-continued
3500
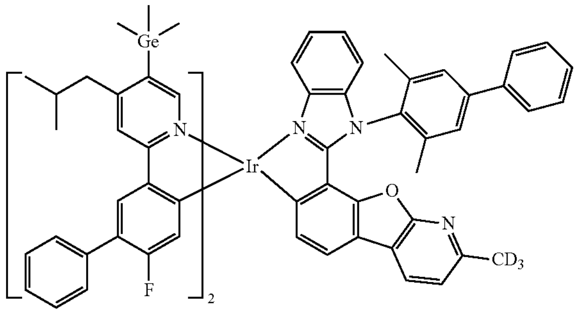
3501
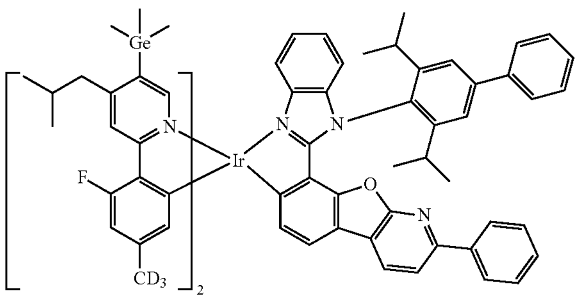
3502
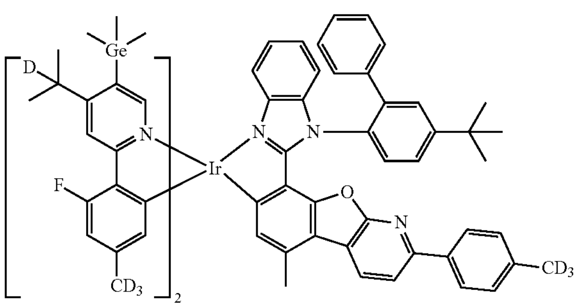
3503
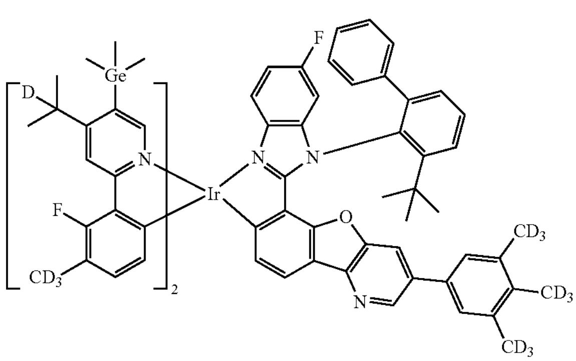
-continued
3504
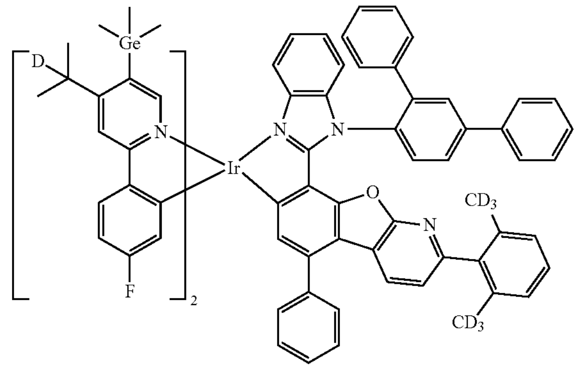
3505
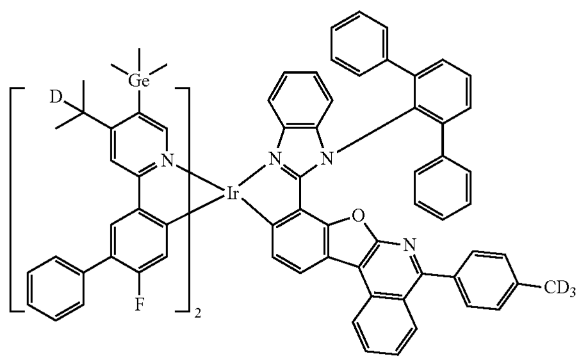
3506
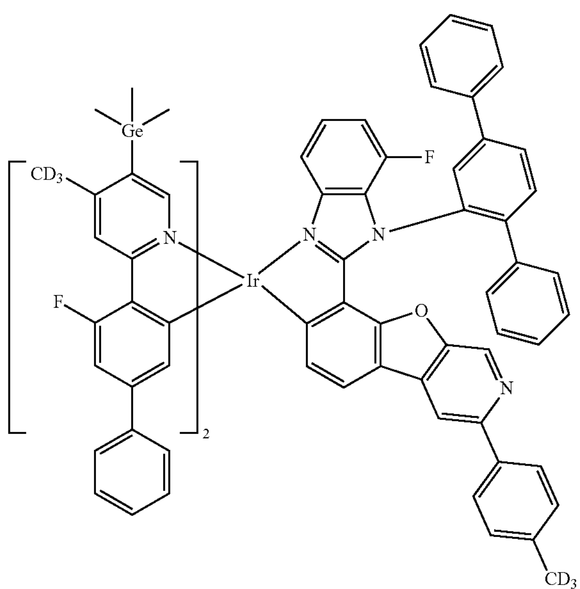

-continued
3507
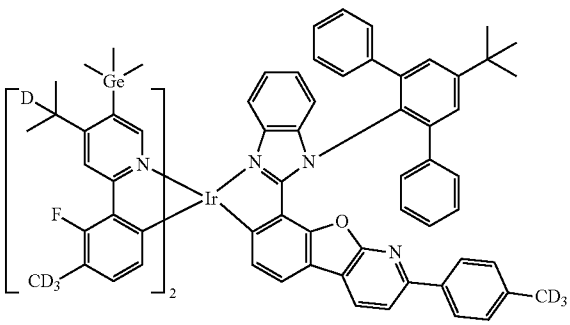
3508
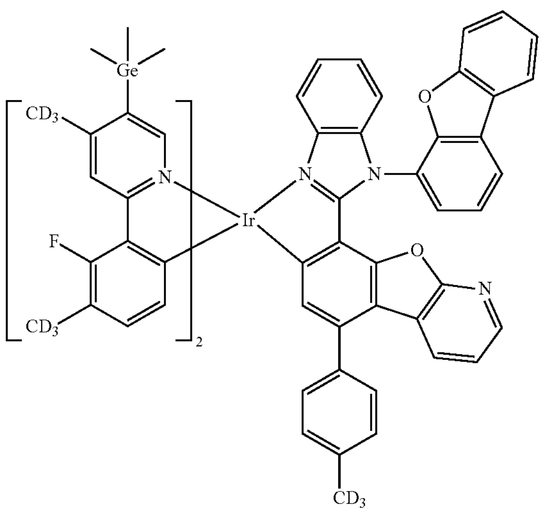
-continued
3509
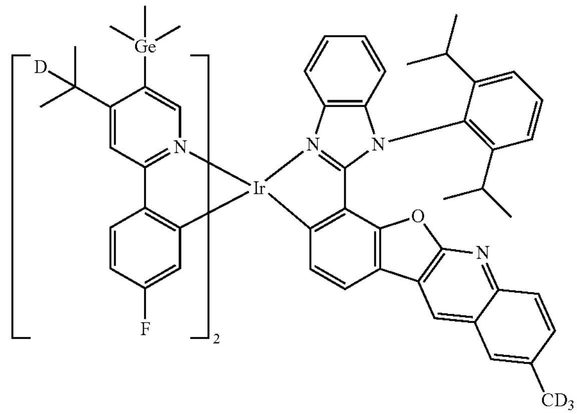
3510
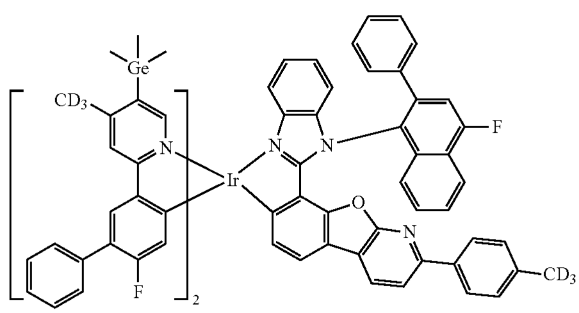
3511
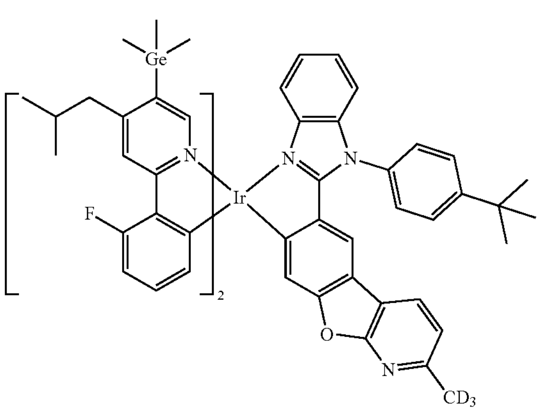
3512
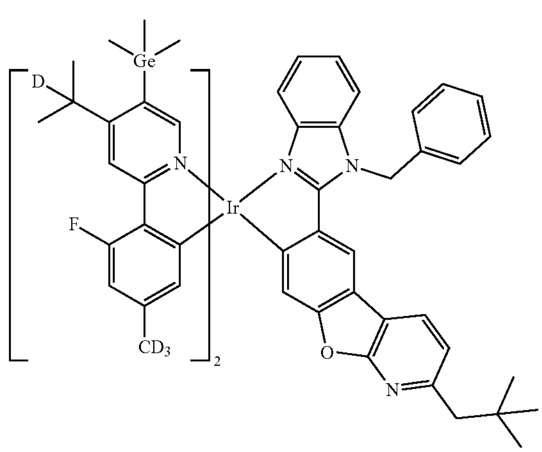

-continued
3513
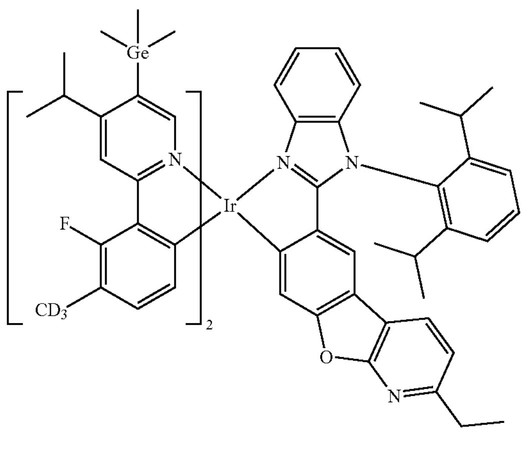
3514
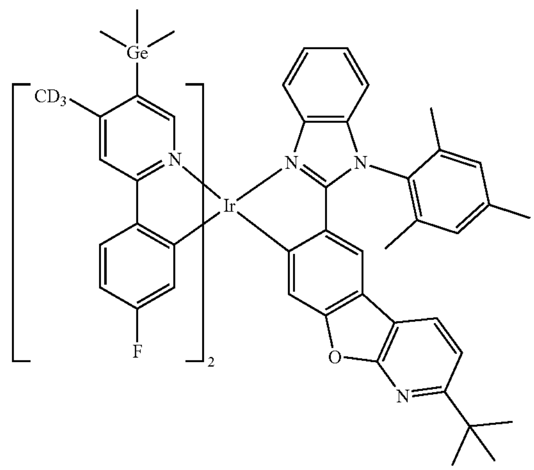
3515
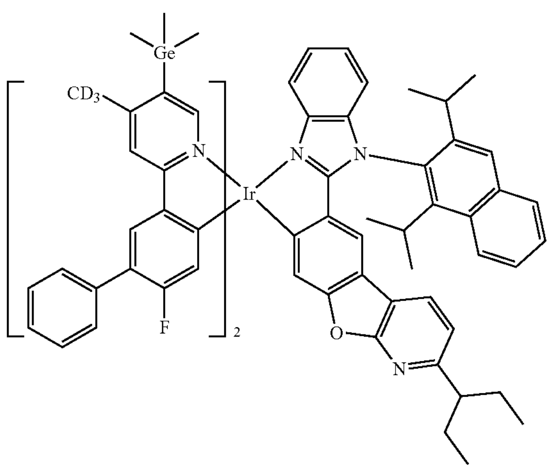
3516
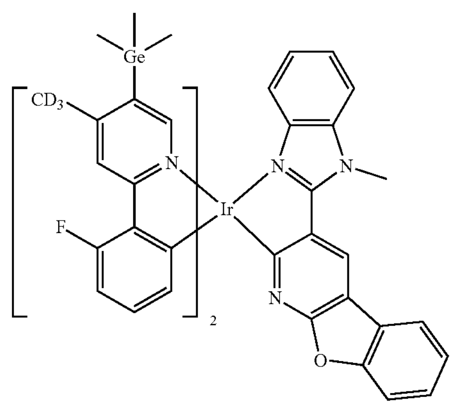
3517
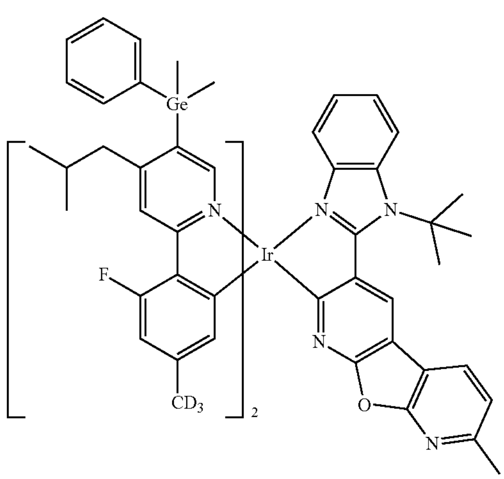
3518
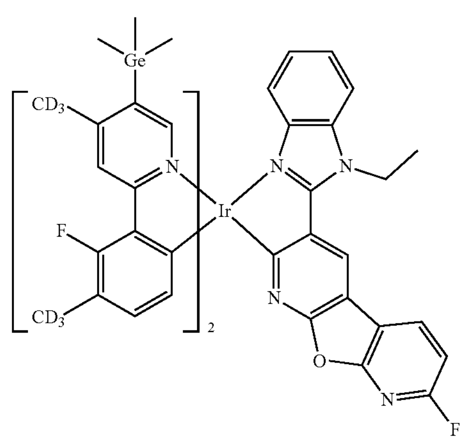

-continued
3519
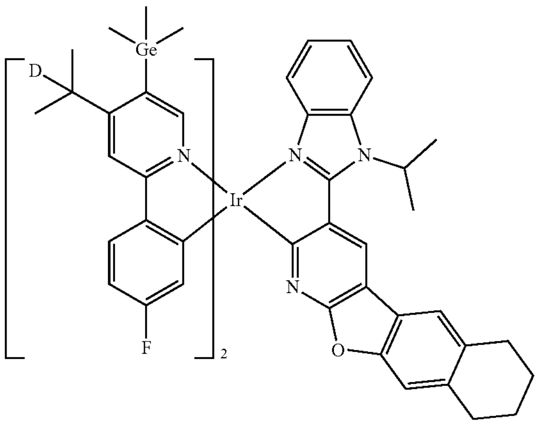
3520
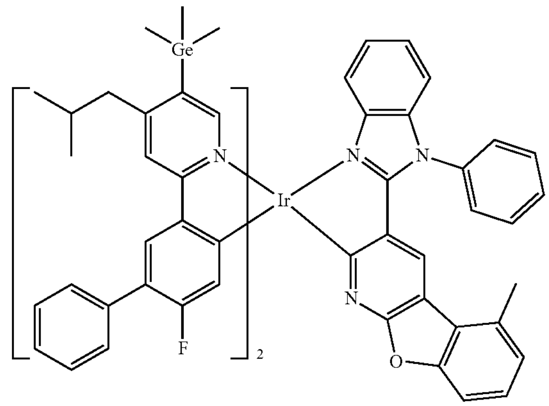
3521
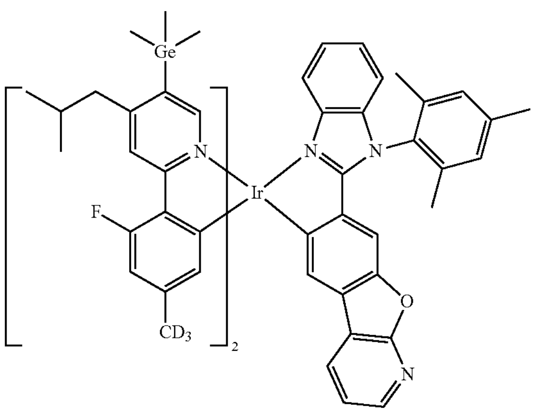
3522
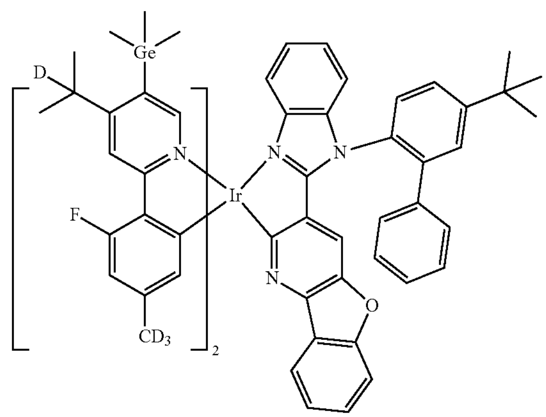
3523
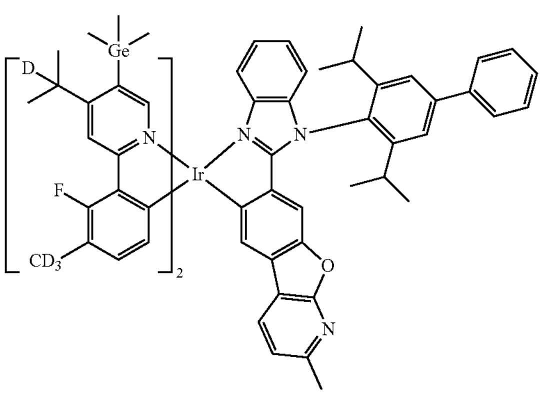
3524
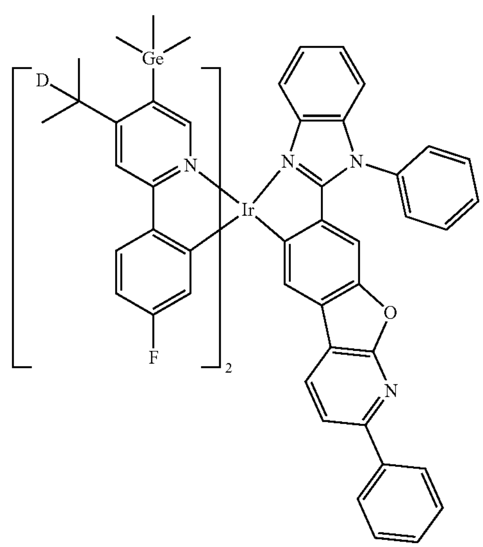

-continued
3525
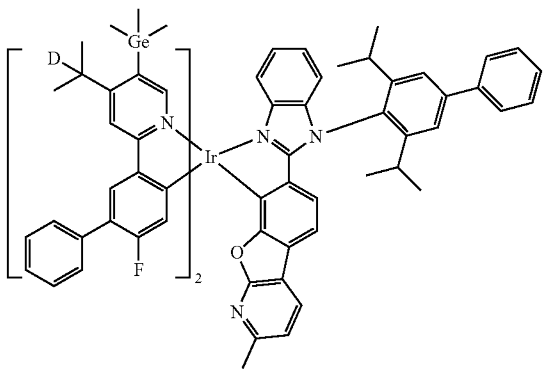
3526
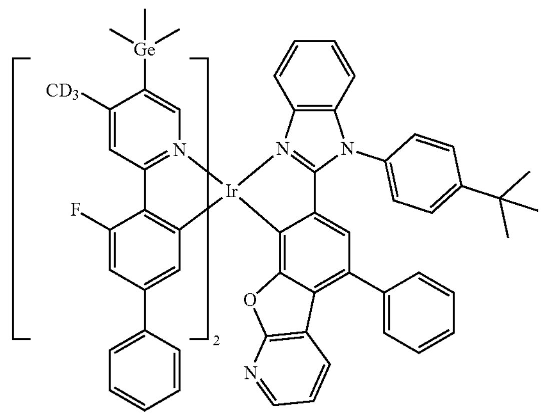
3527
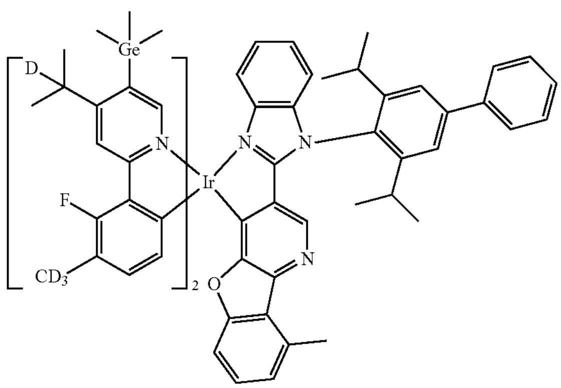
3528
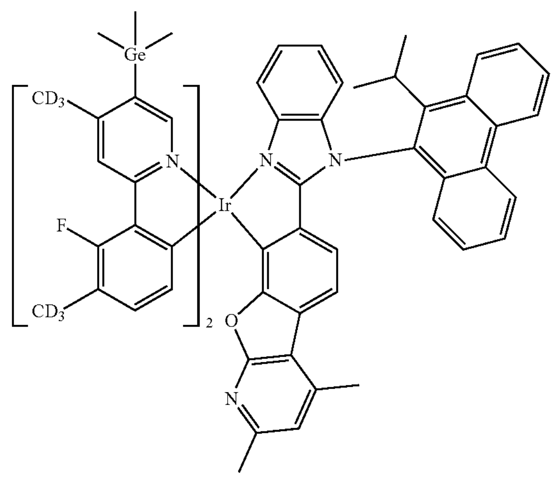
3529
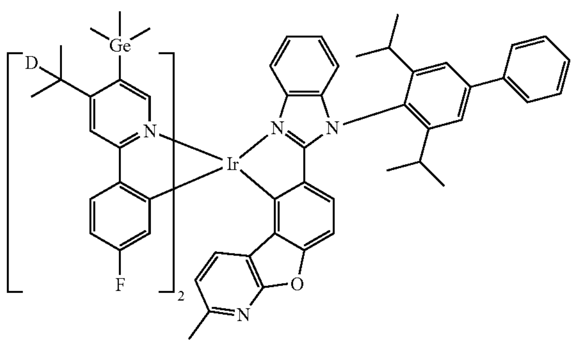
3530
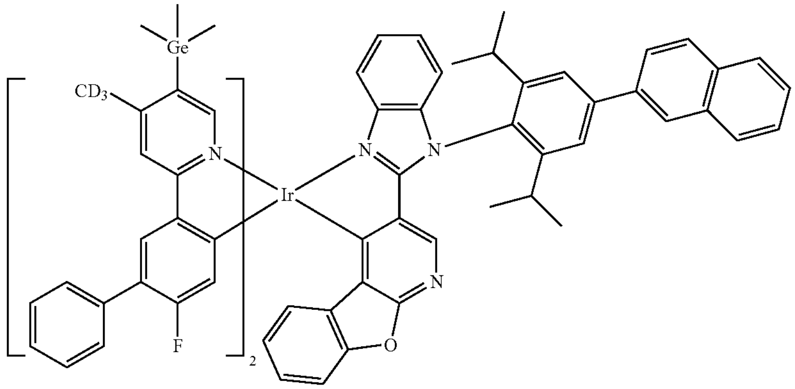

-continued
3531
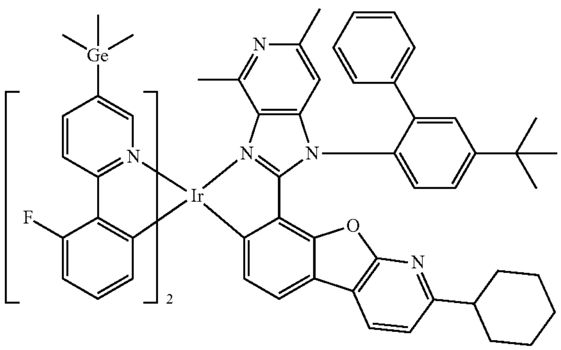
3532
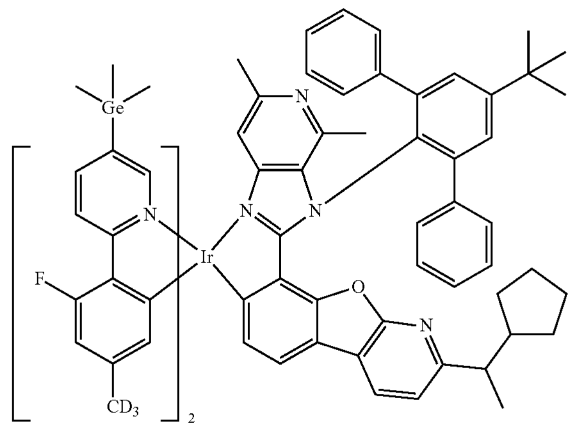
3533
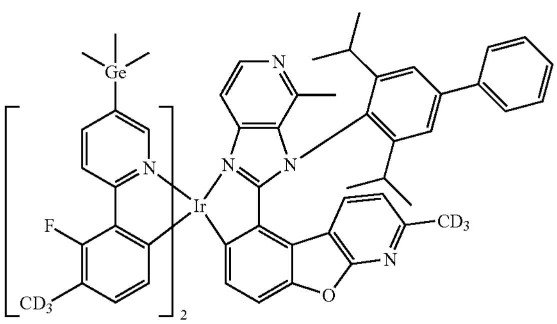
3534
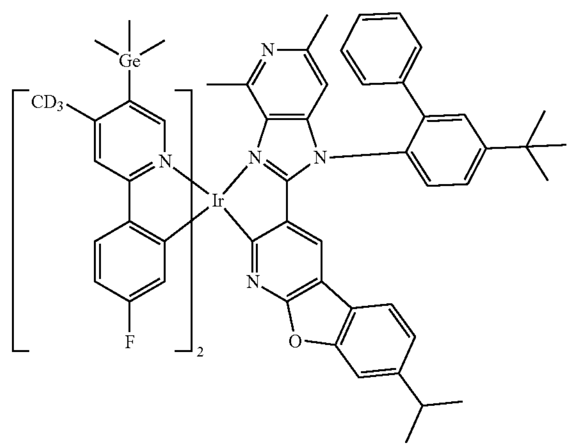
3535
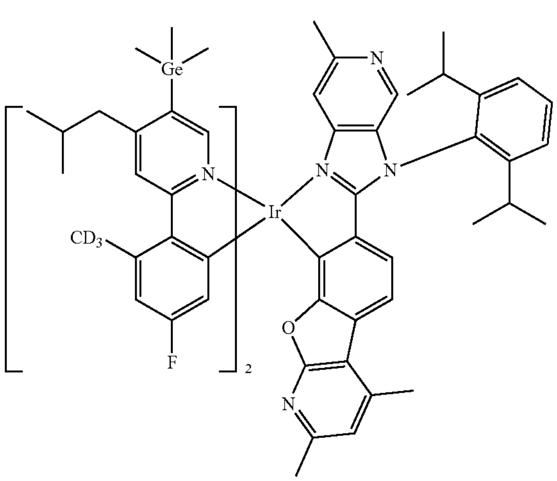
3536
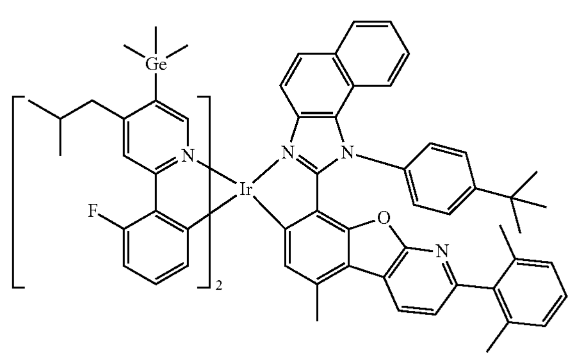

-continued
3537
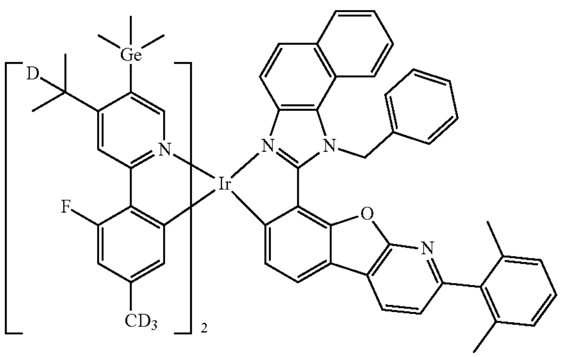
3538
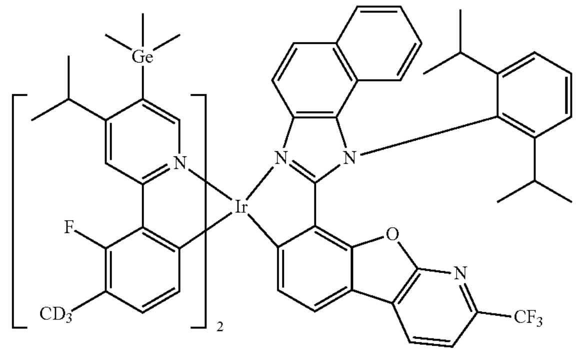
3539
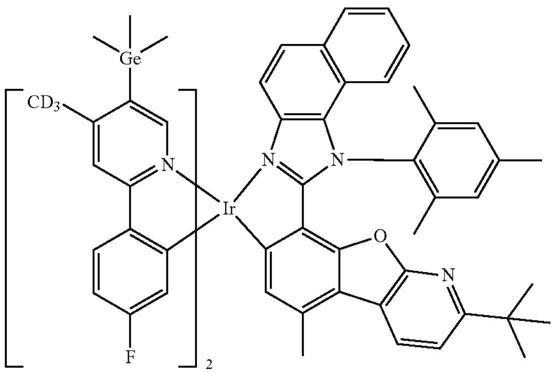
3540
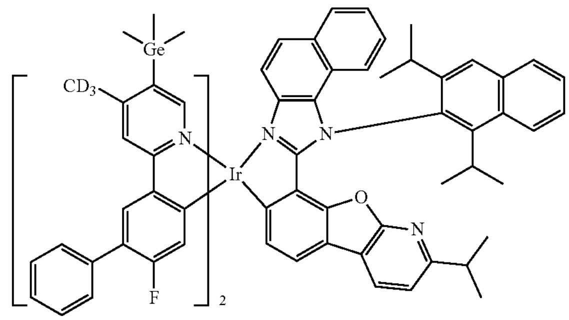
3541
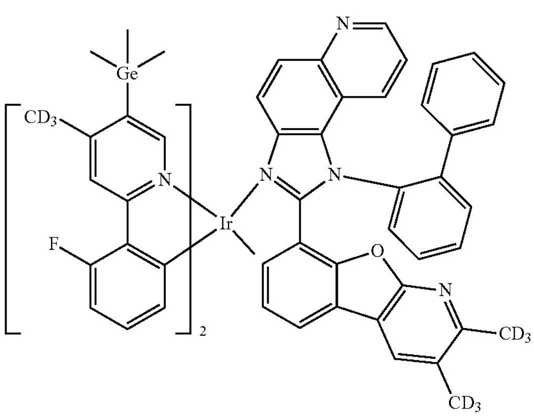
3542
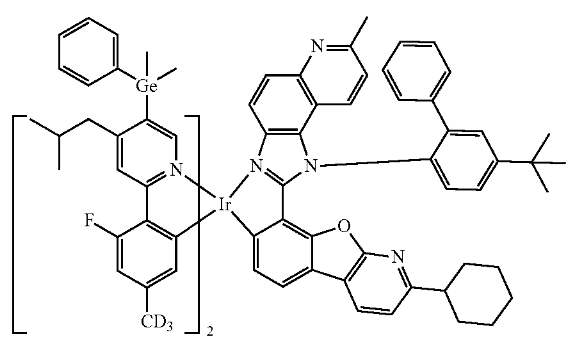
3543
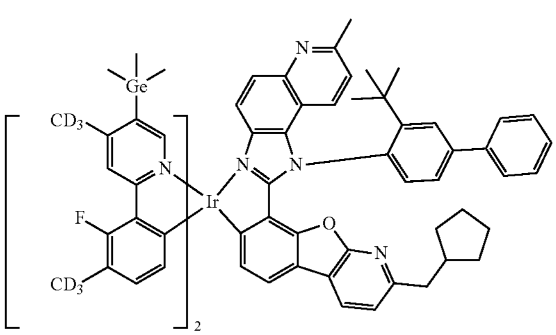
3544
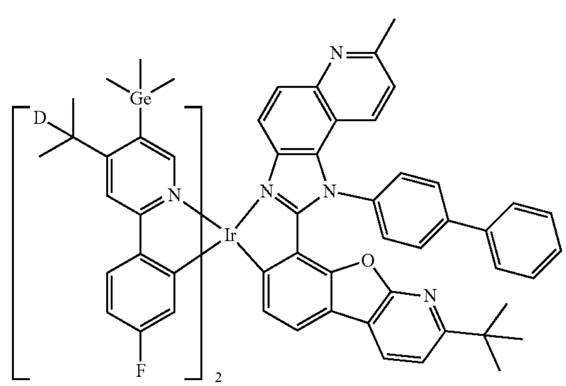

-continued
3545
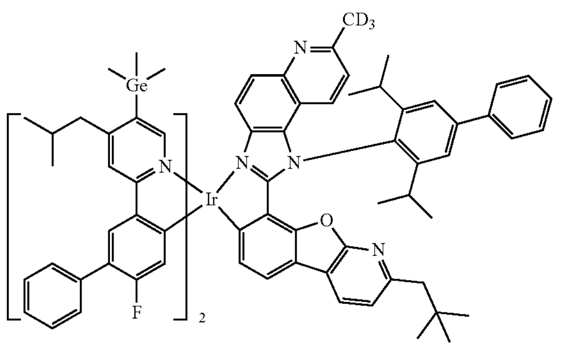
3546
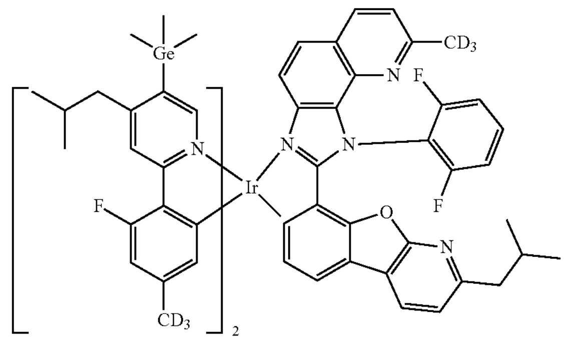
3547
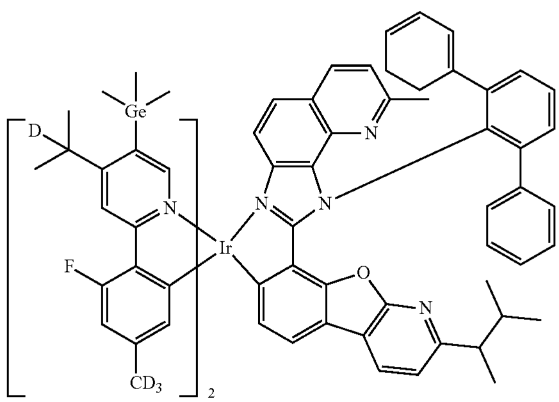
3548
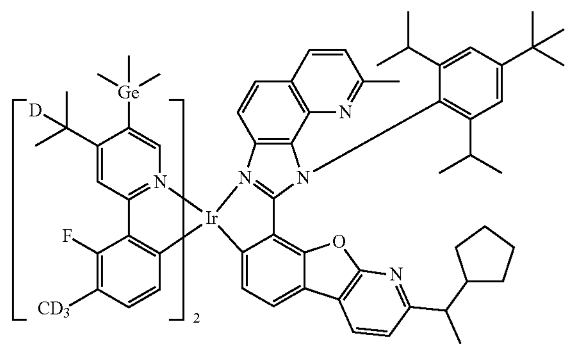
3549
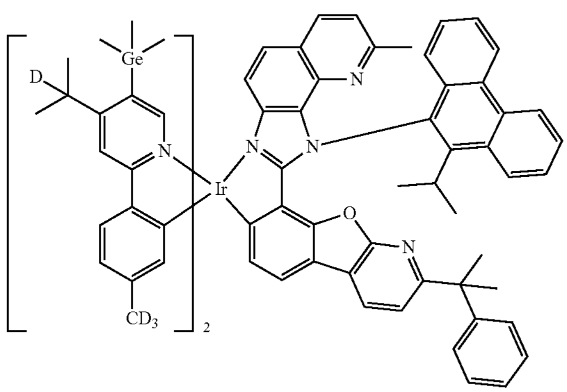
3550
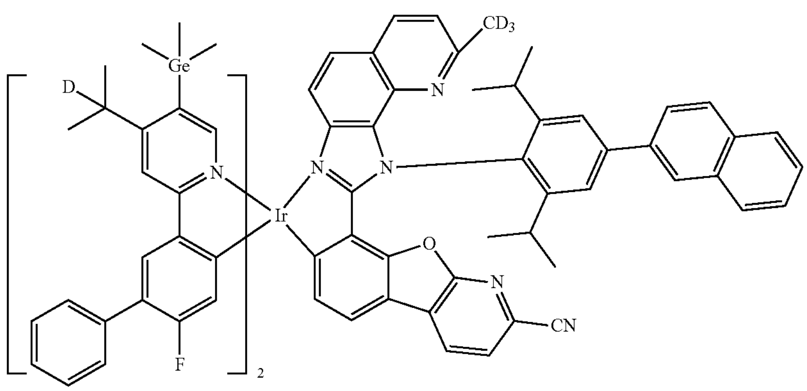

-continued
3551
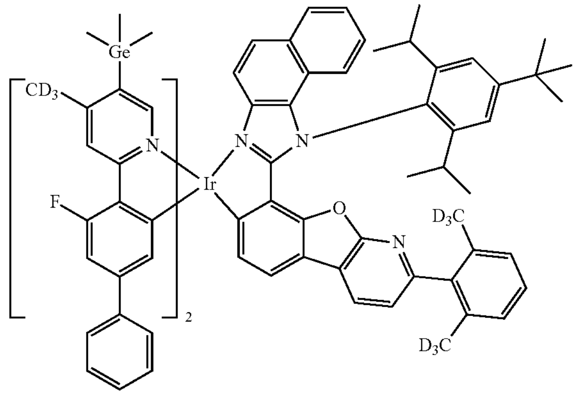
3552
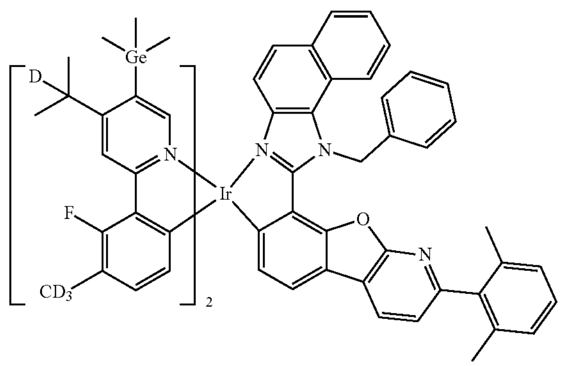
3553
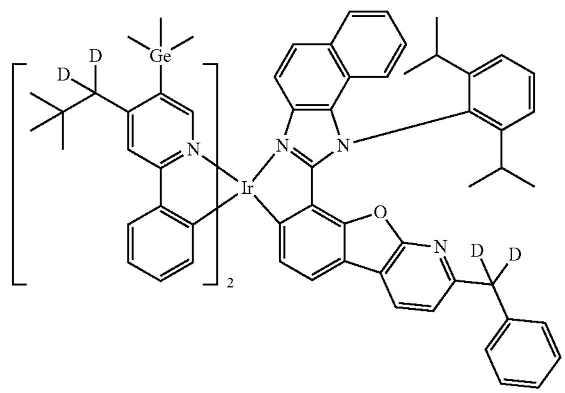
3554
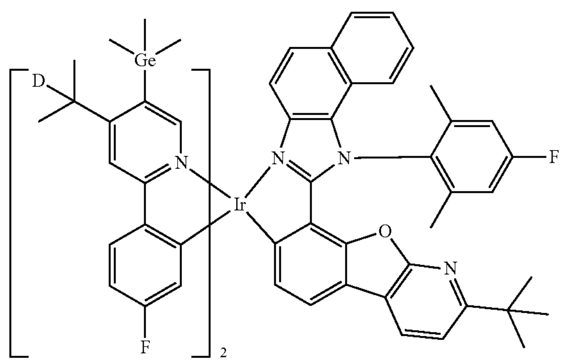
3555
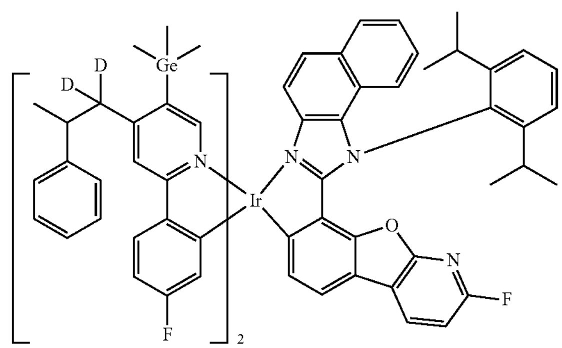
3556
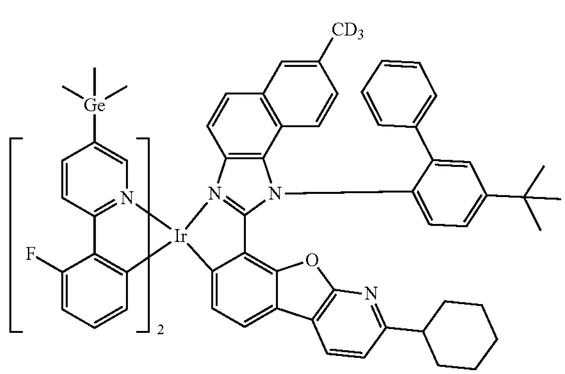
3557
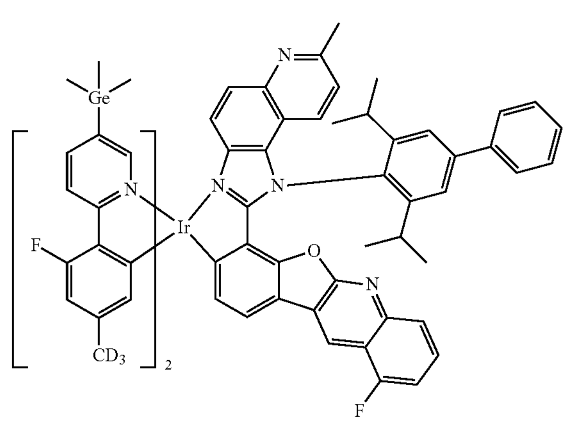

-continued
3558
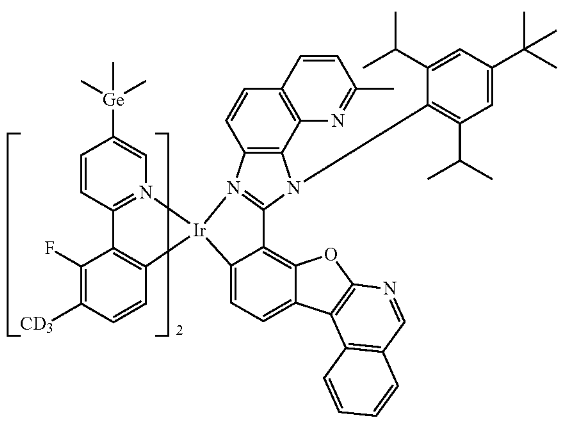
3559
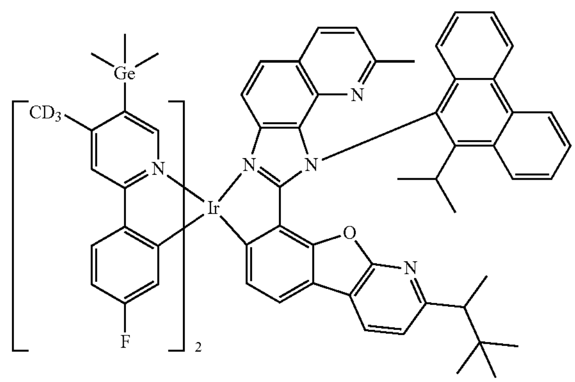
3560
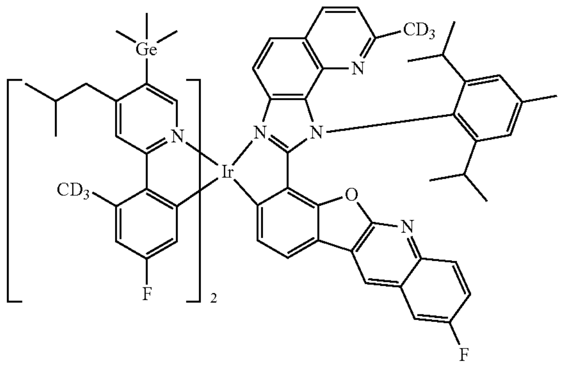
3561
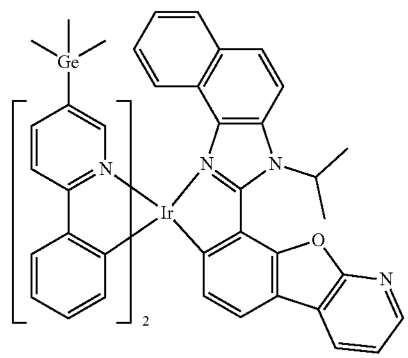
3562
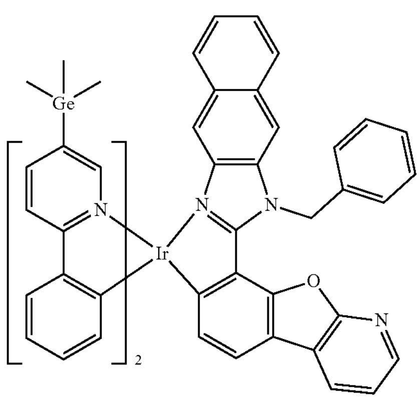
3563
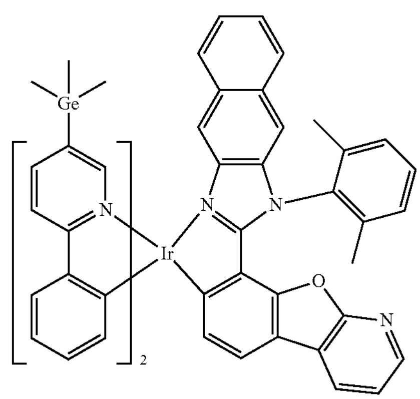
3564
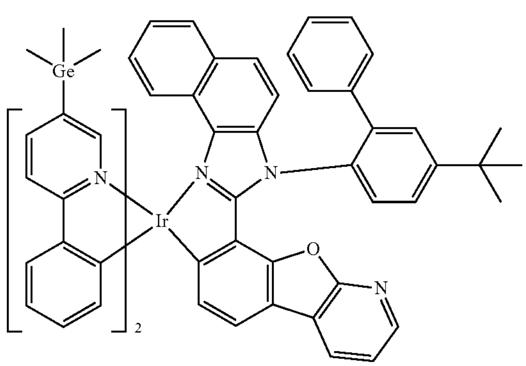
3565
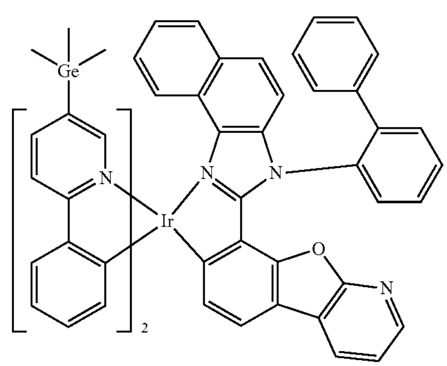

-continued
3566
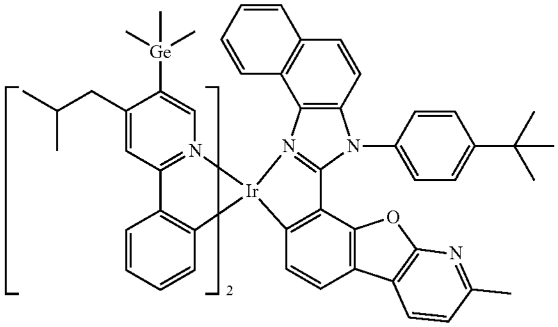
3567
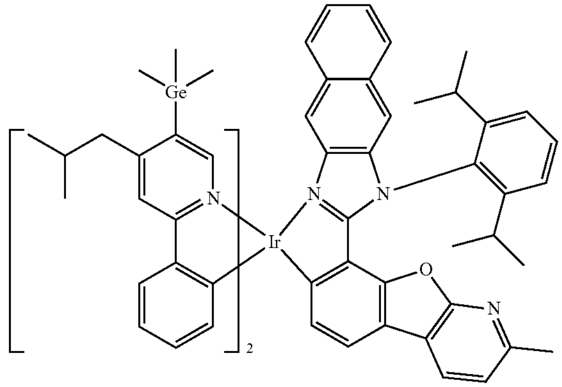
3568
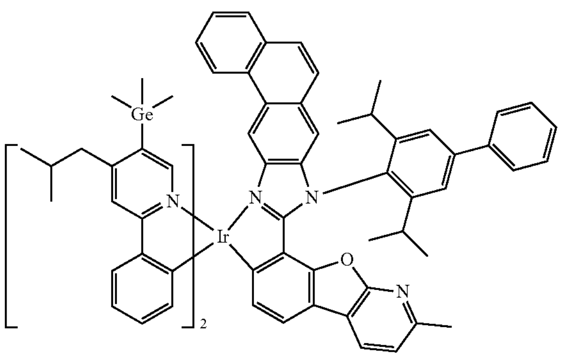
3569
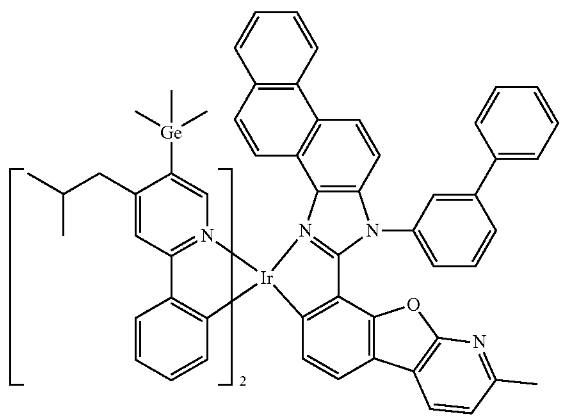
3570
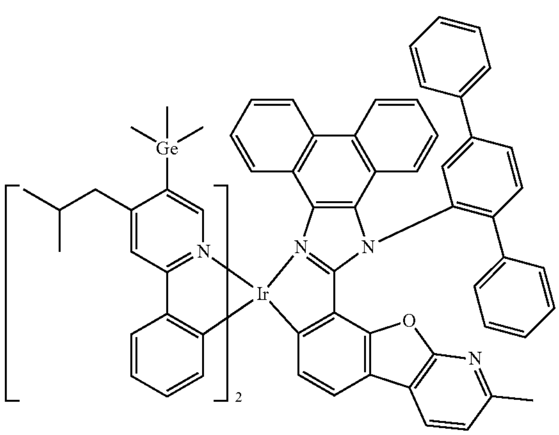
3571
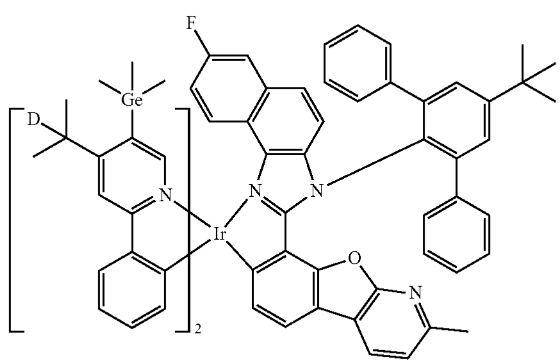

-continued
3572
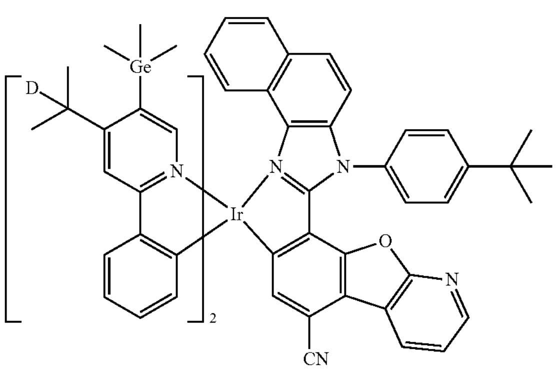
3573
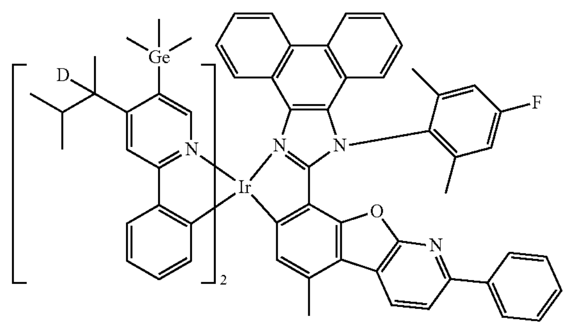
3574
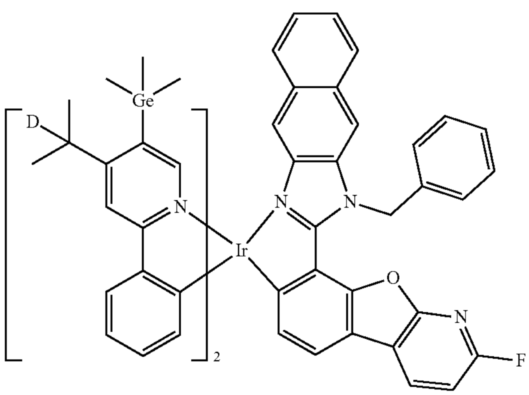
3575
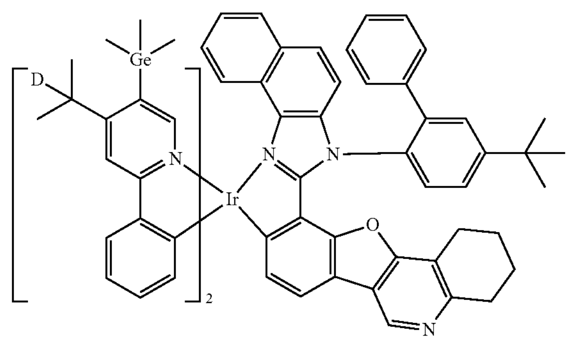
3576
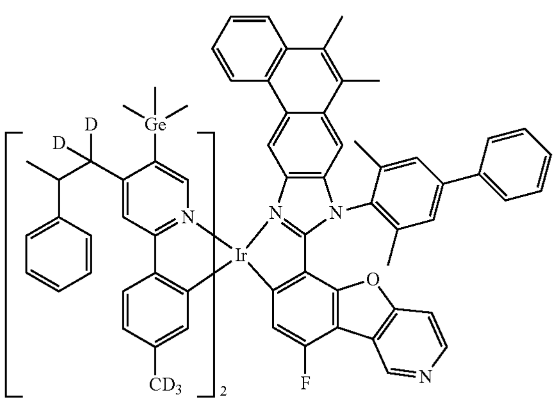
3577
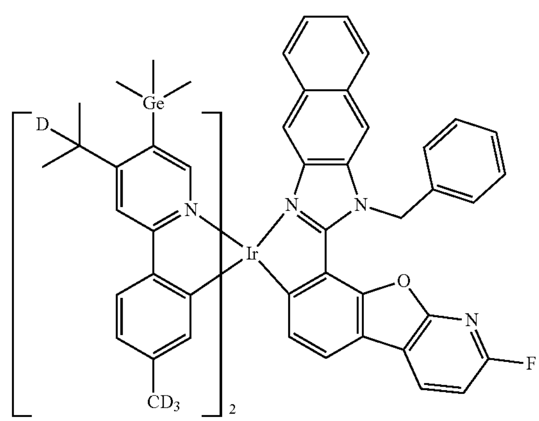
3578
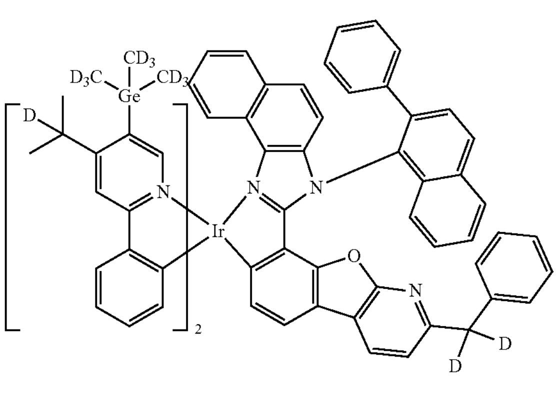
3579
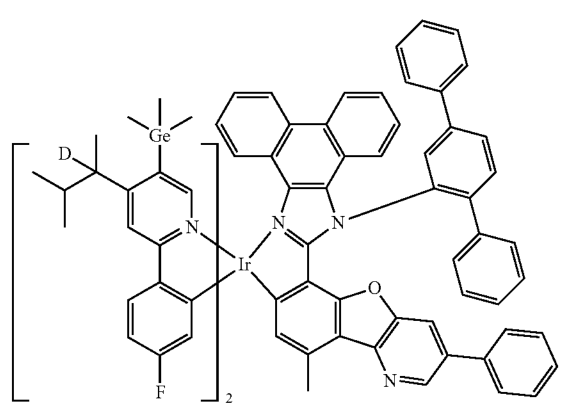

-continued
3580
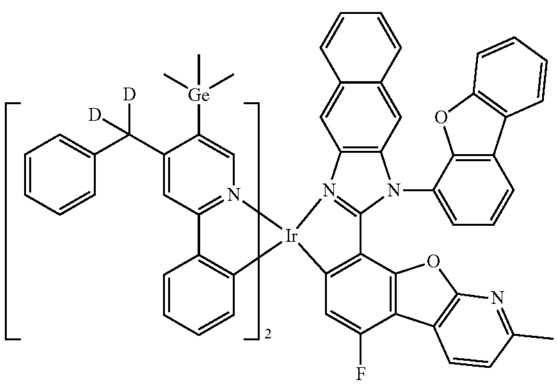
3581
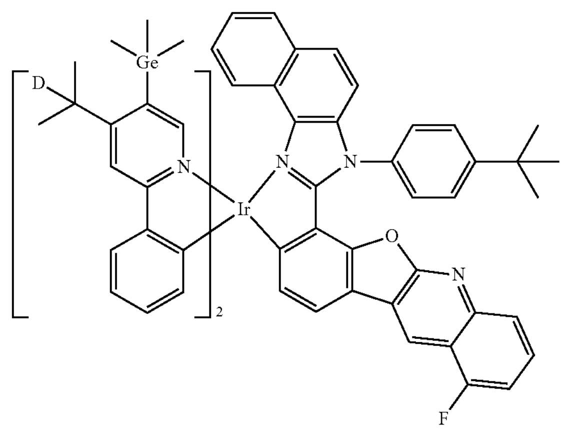
3582
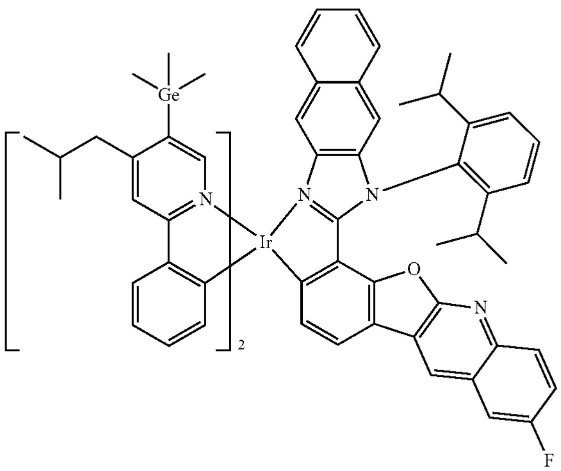
3583
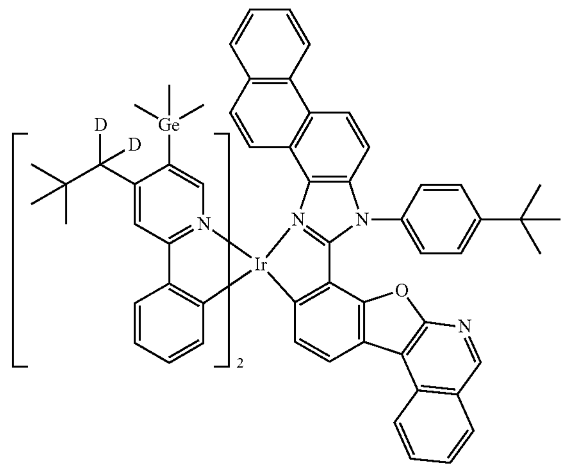
3584
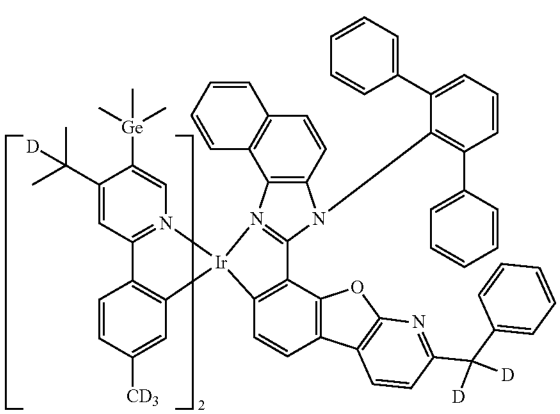
3585
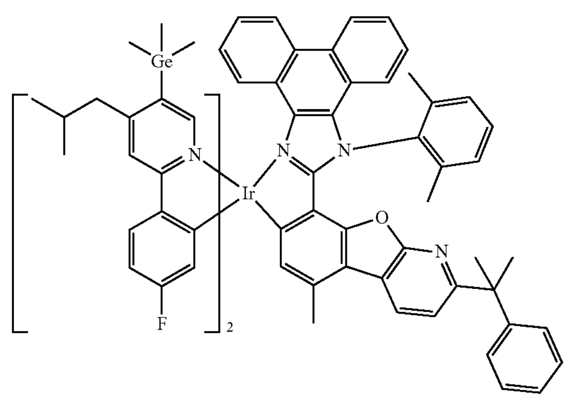

-continued
3586
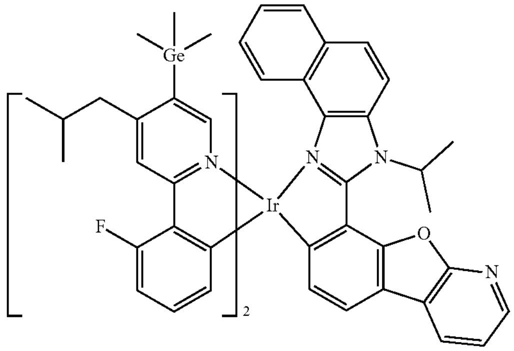
3587
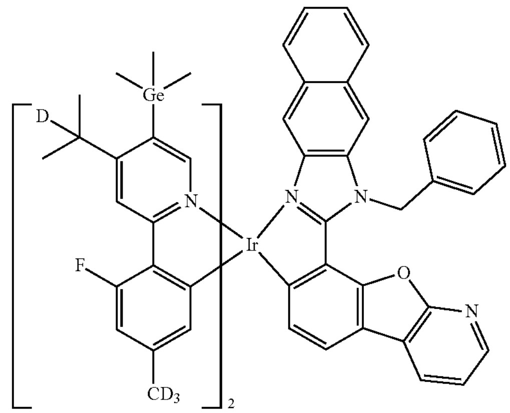
3588
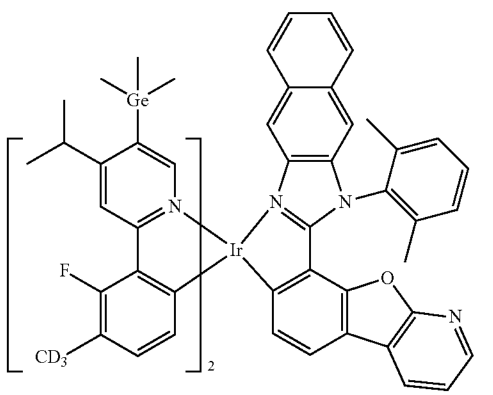
3589
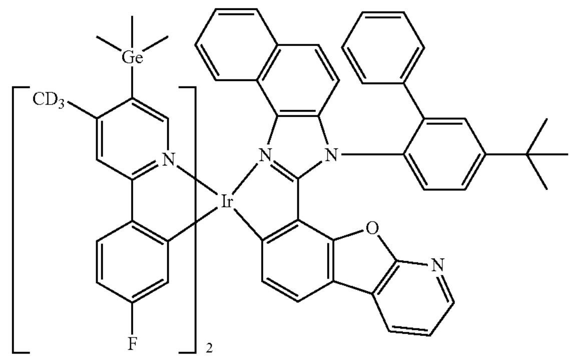
3590
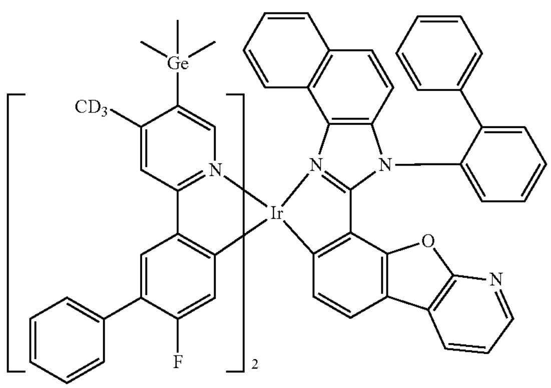
3591
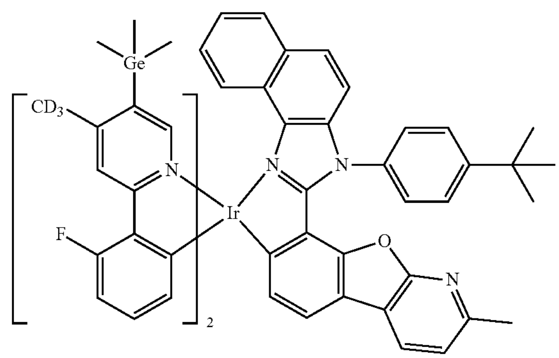

-continued
3592
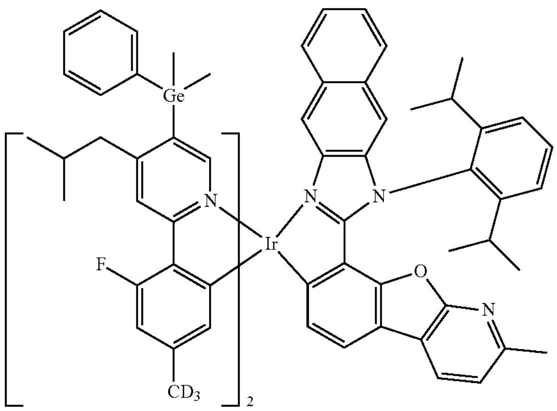
3593
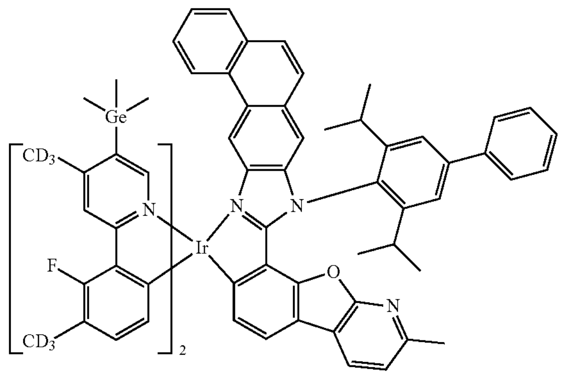
3594
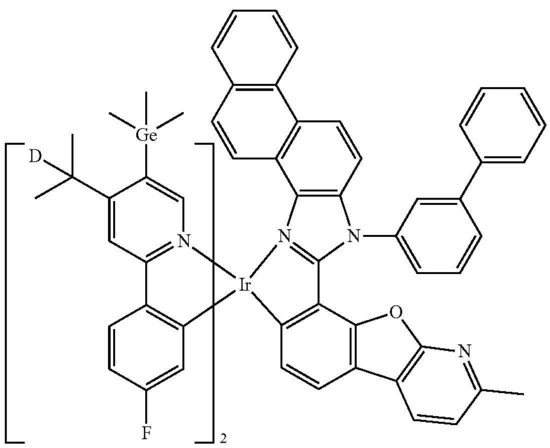
3595
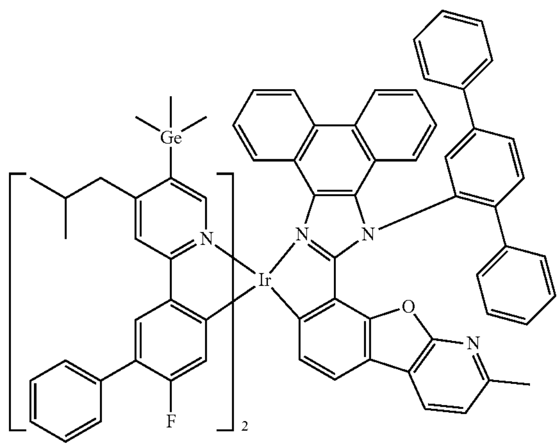
3596
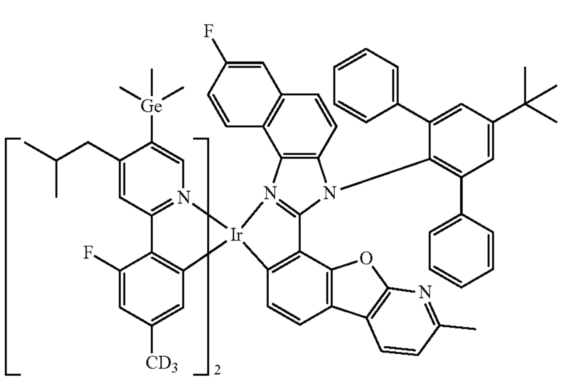
3597
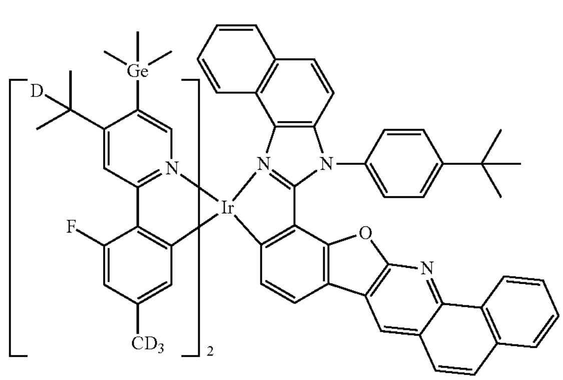

-continued
3598
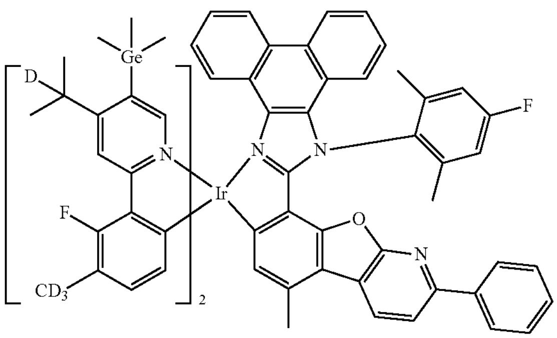
3599
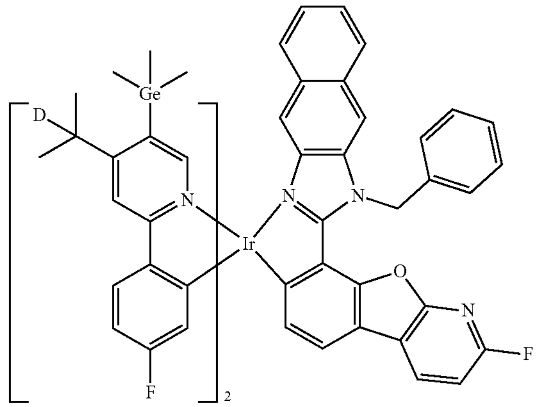
3600
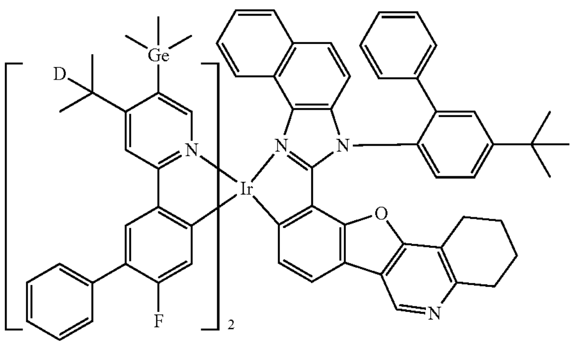
3601
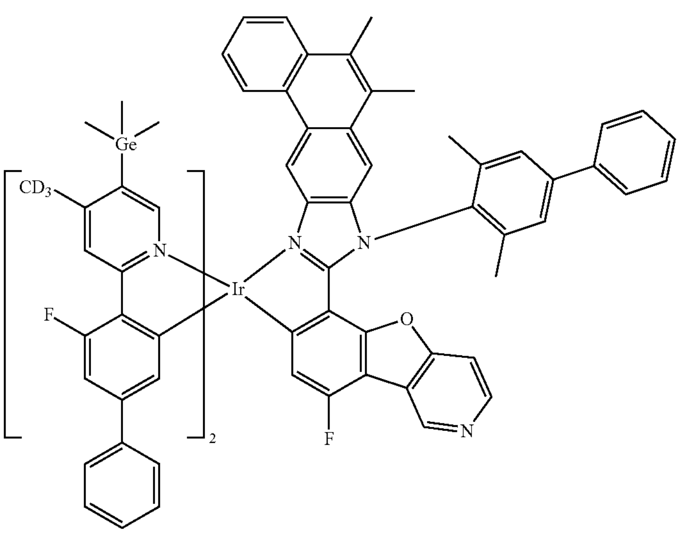

-continued
3602
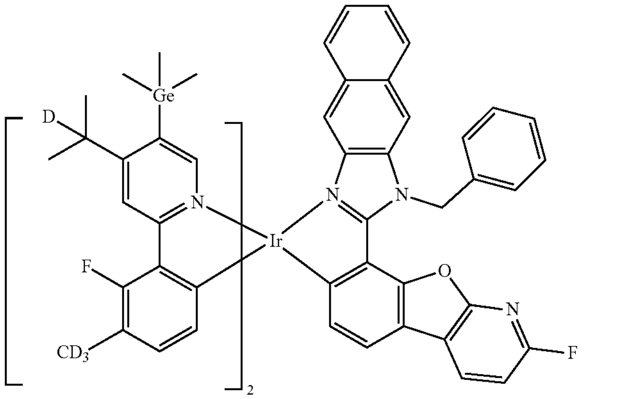
3603
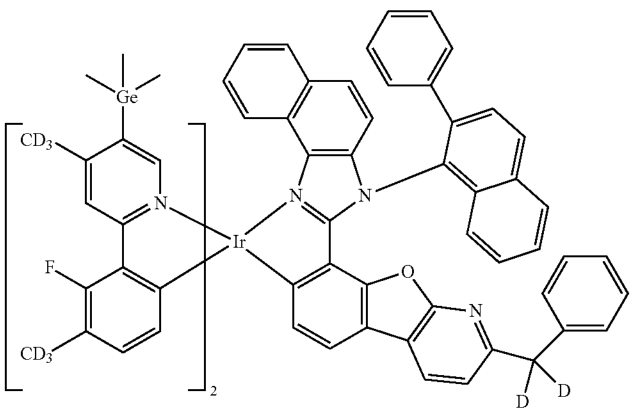
3604
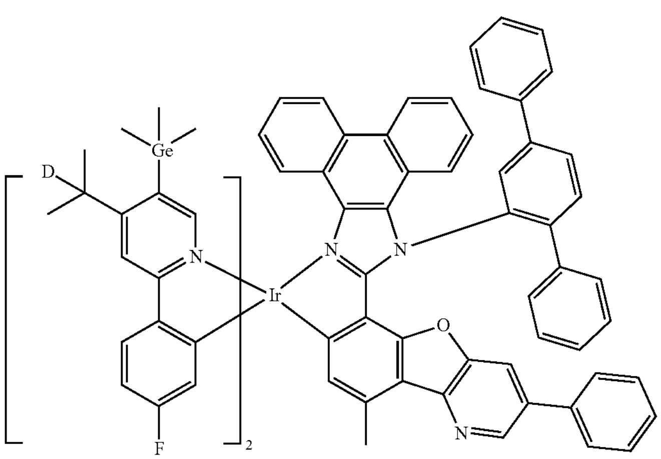

-continued
3605
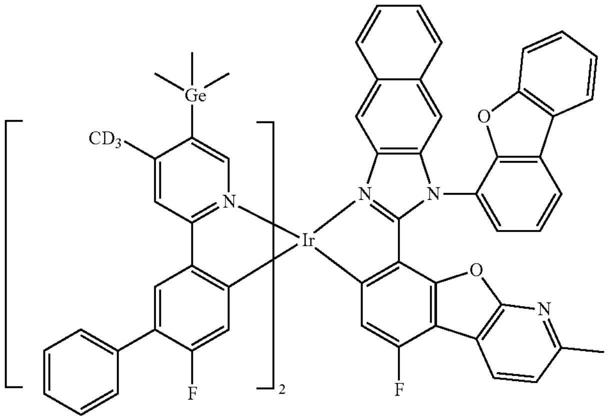
3606
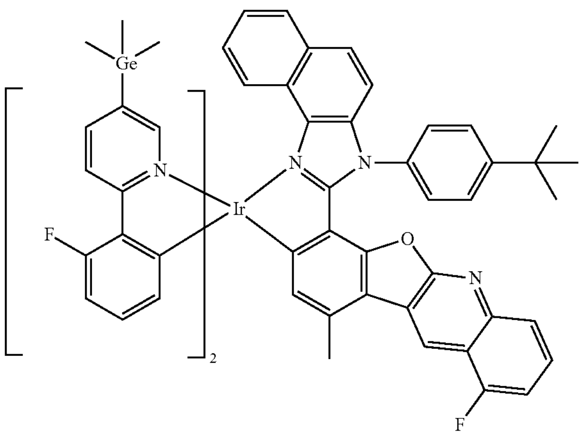
3607
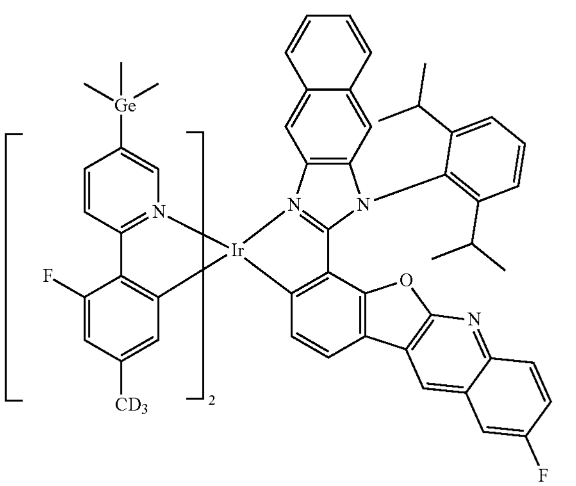

-continued
3608
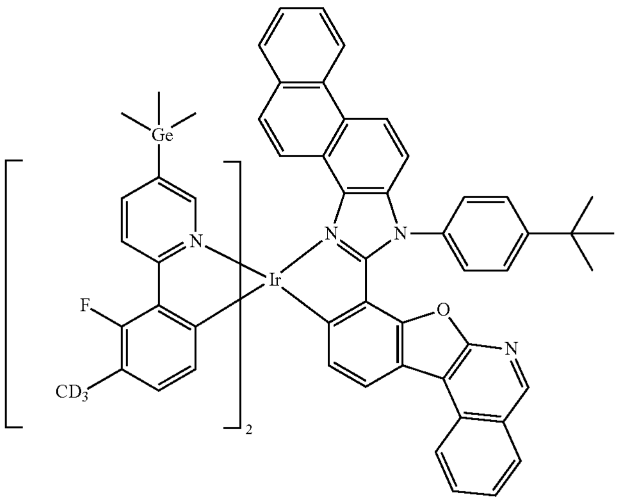
3609
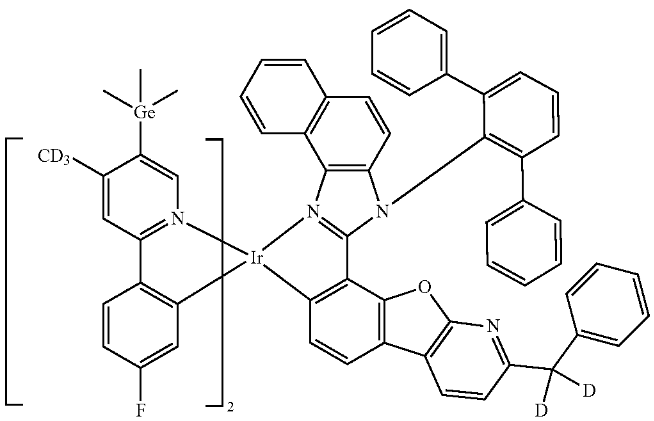
3610
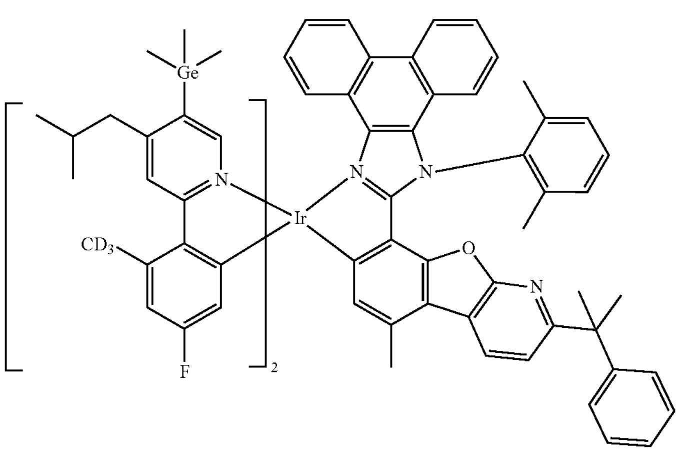

-continued
3611
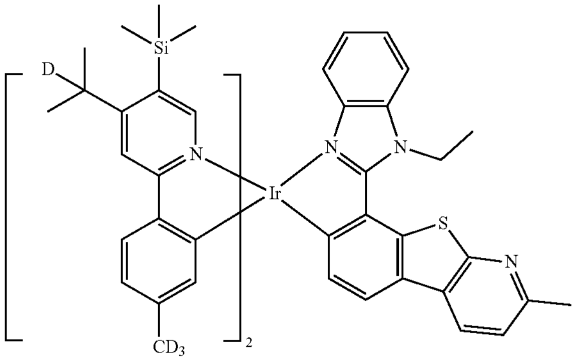
3612
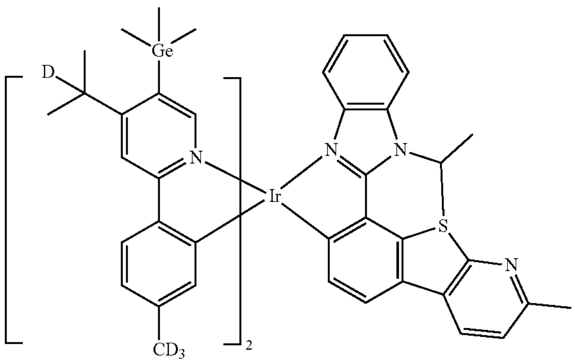
3613
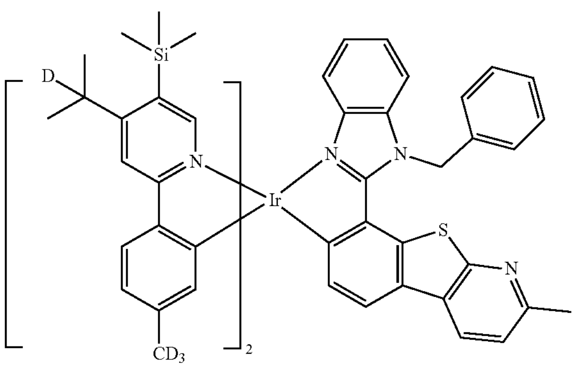
3614
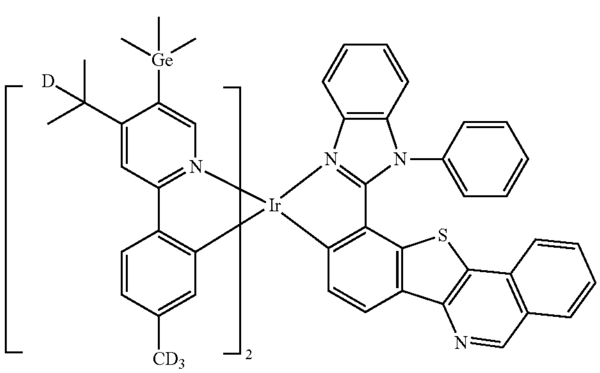

-continued
3615
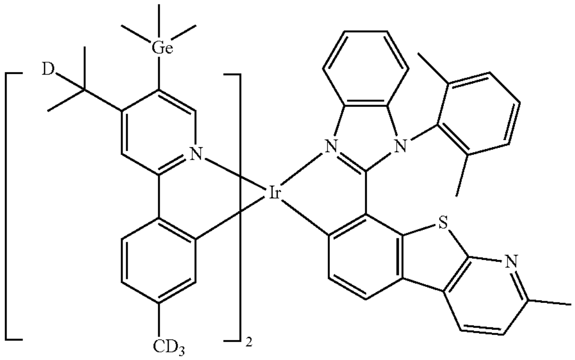
3616
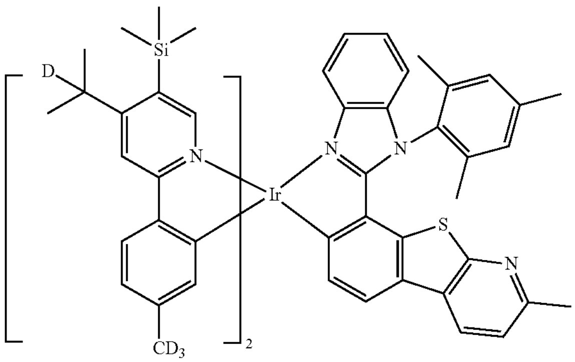
3617
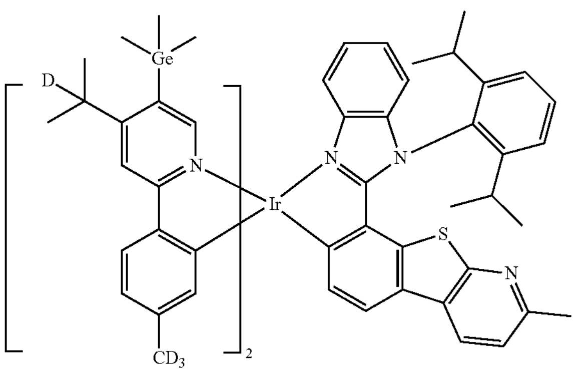
3618
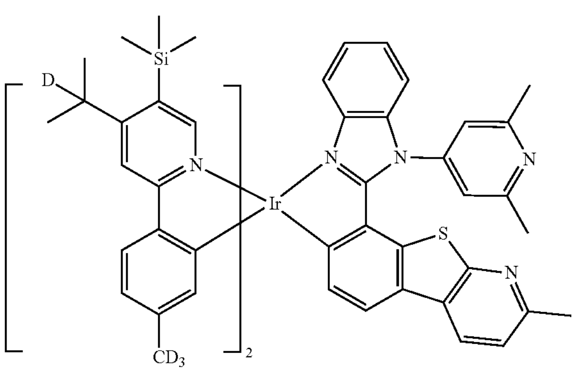

-continued
3619
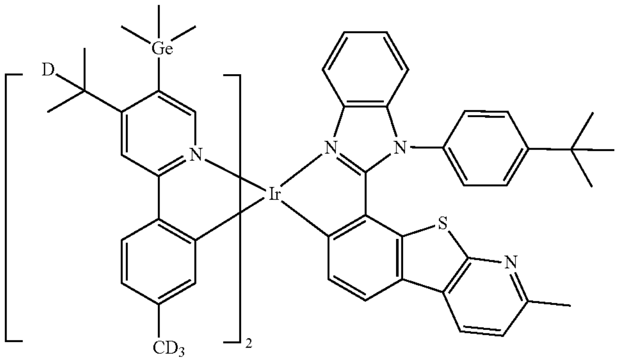
3620
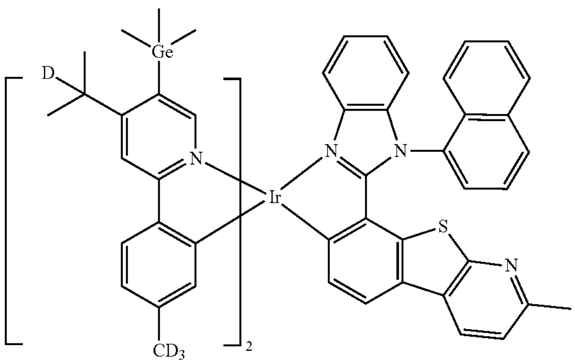
3621
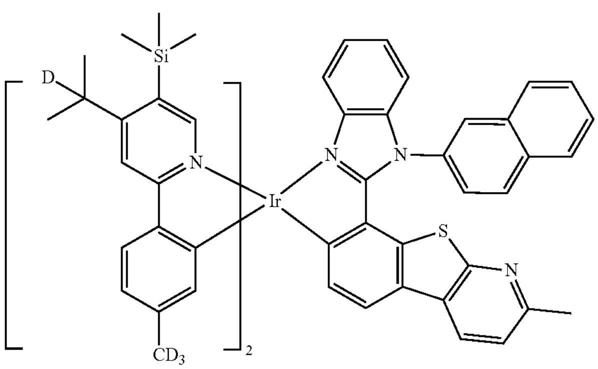
3622
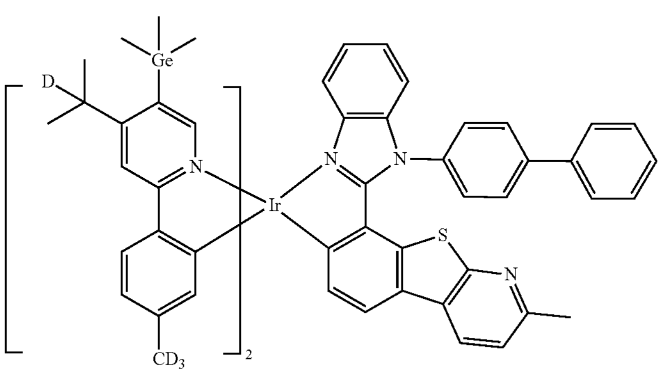

-continued
3623
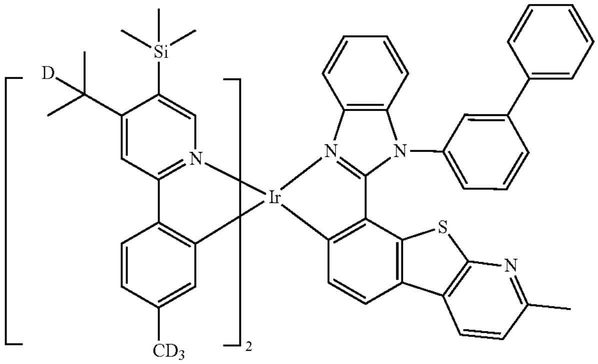
3624
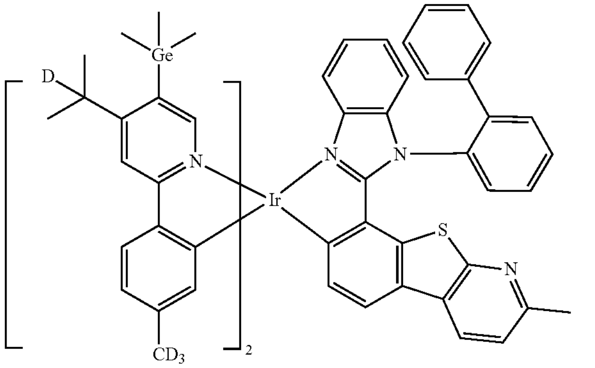
3625
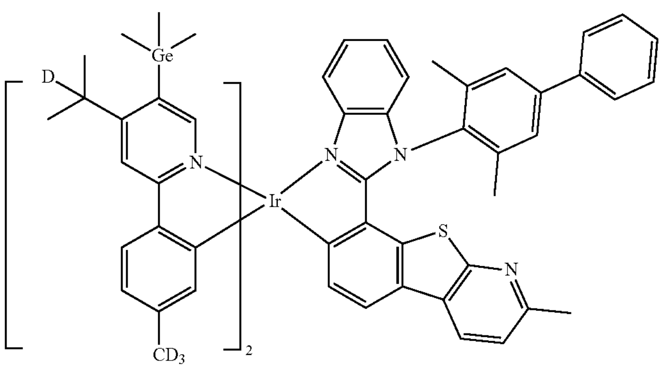
3626
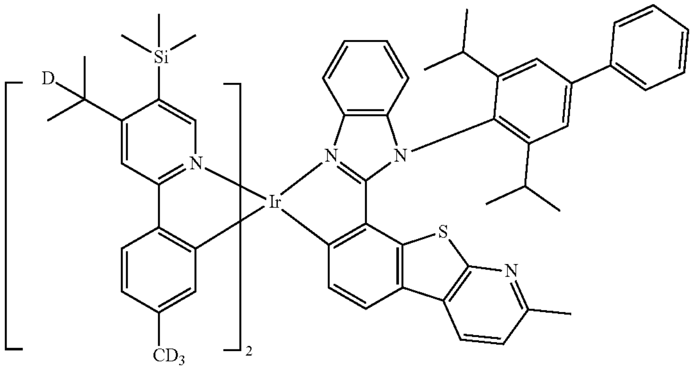

-continued
3627
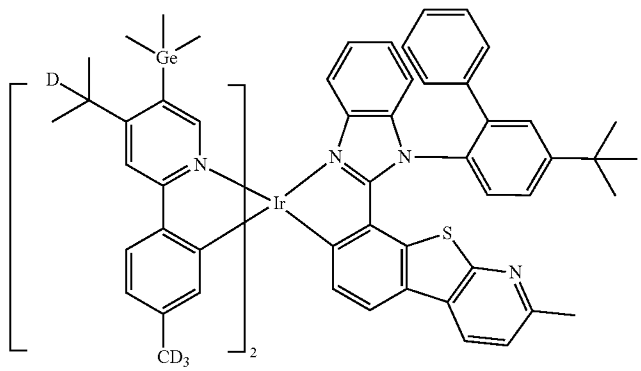
3628
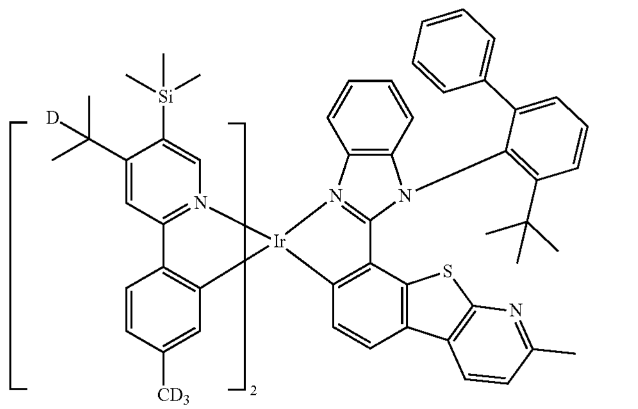
3629
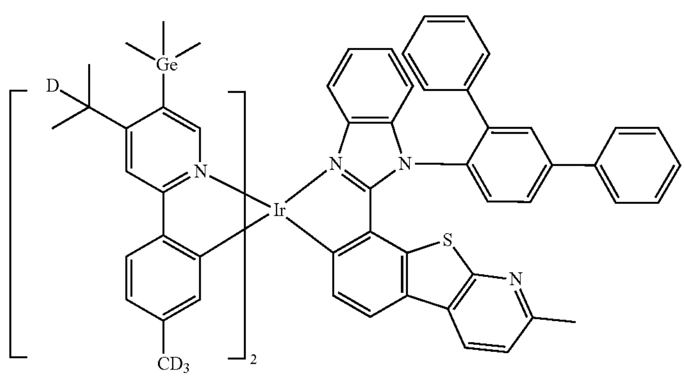
3630
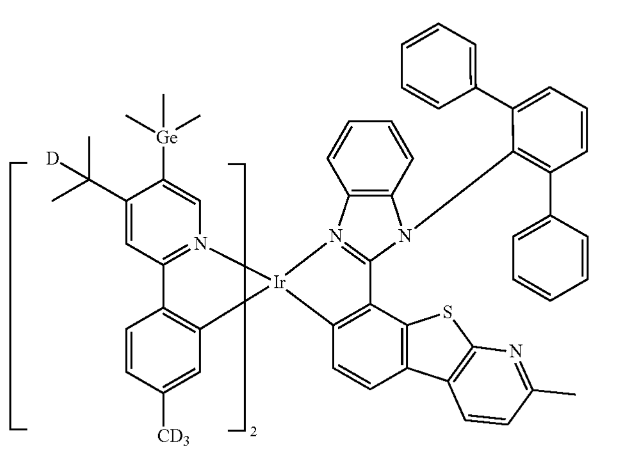

-continued
3631
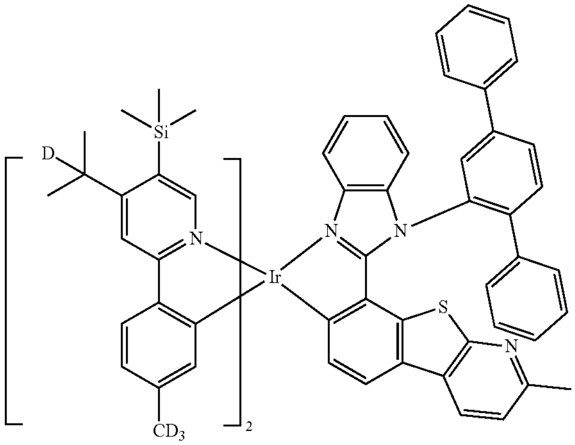
3632
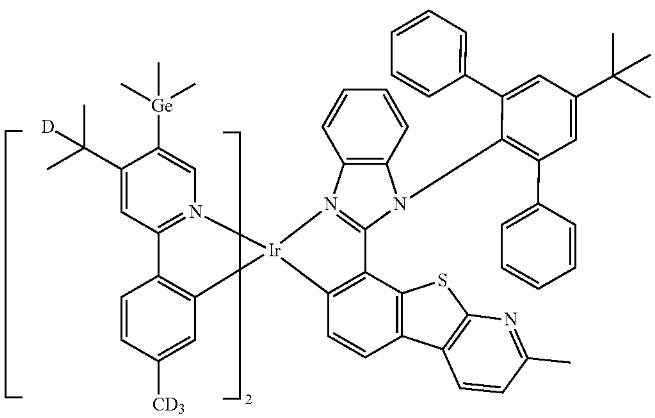
3633
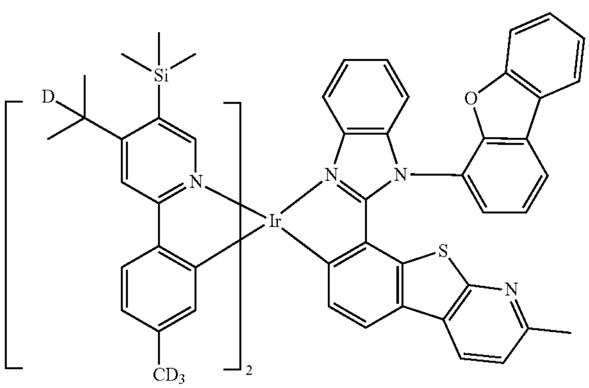
3634
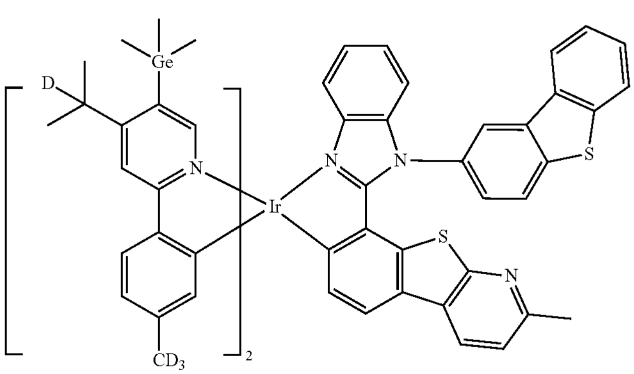

-continued
3635
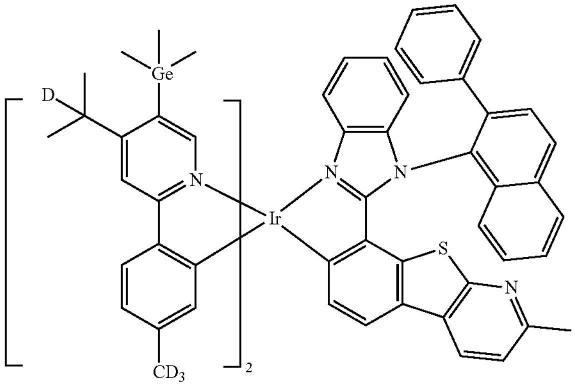
3636
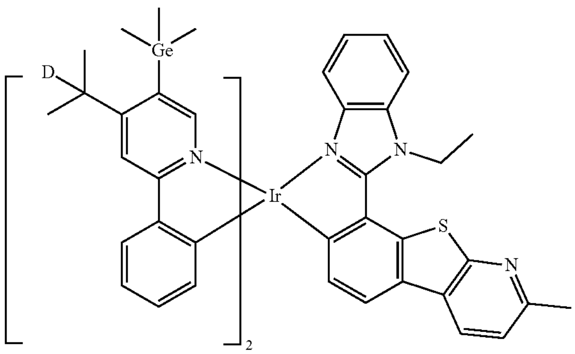
3637
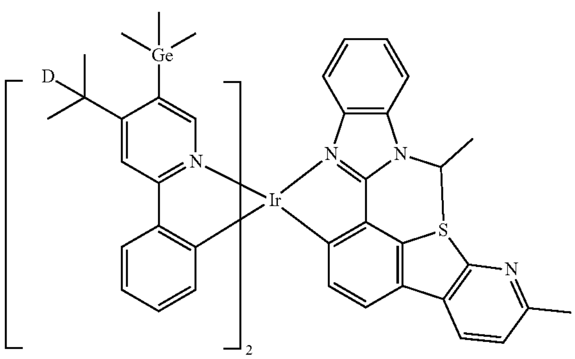
3638
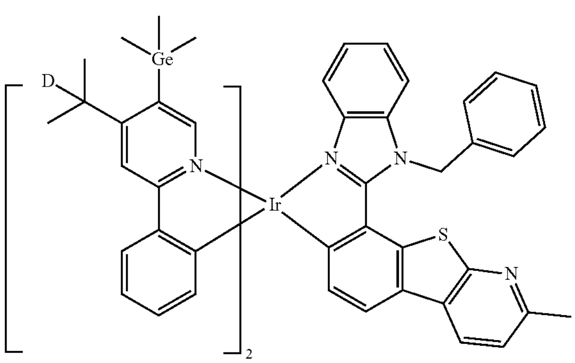

-continued
3639
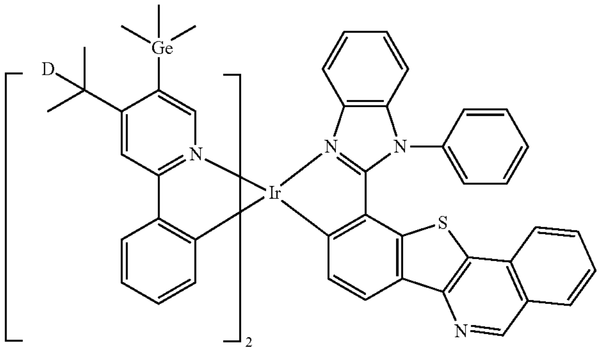
3640
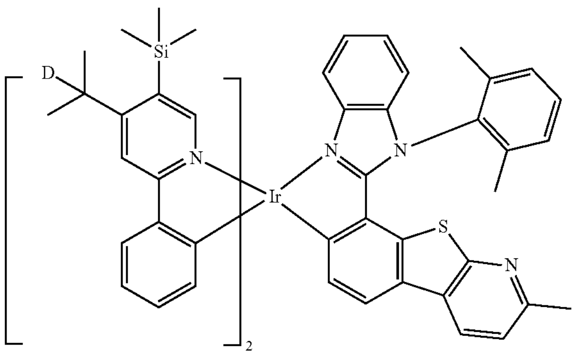
3641
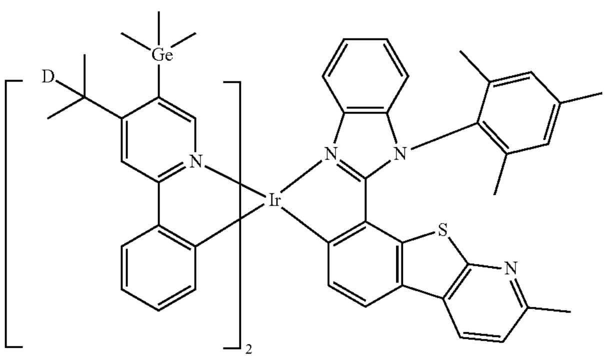
3642
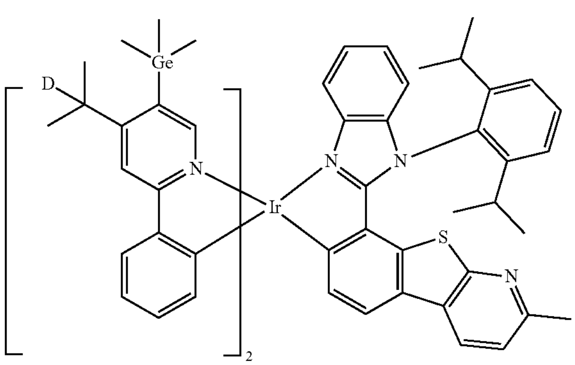

-continued
3643
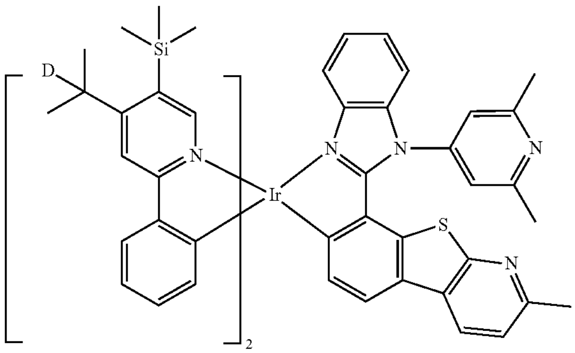
3644
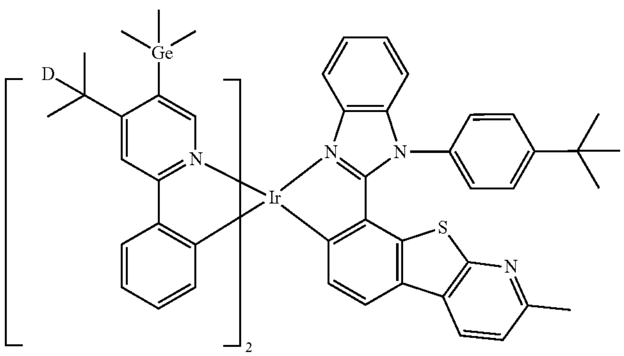
3645
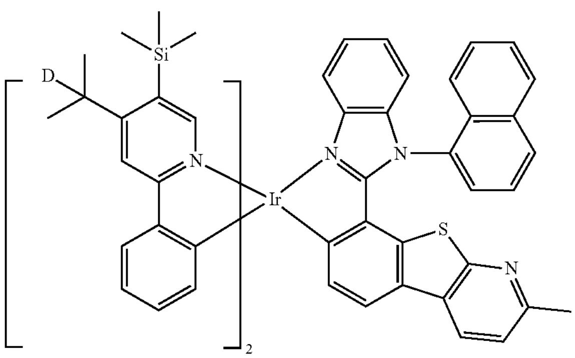
3646
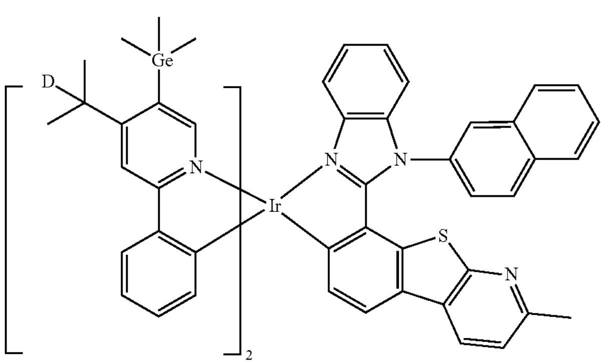

-continued
3647
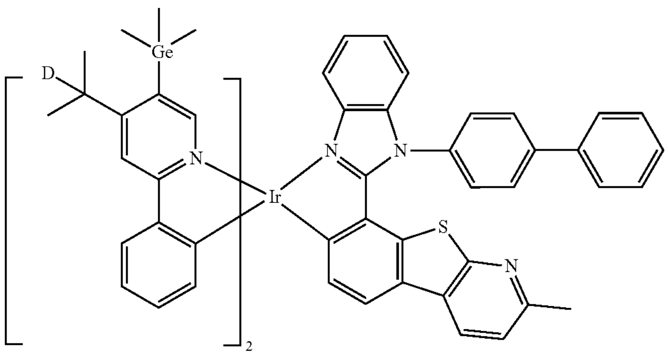
3648
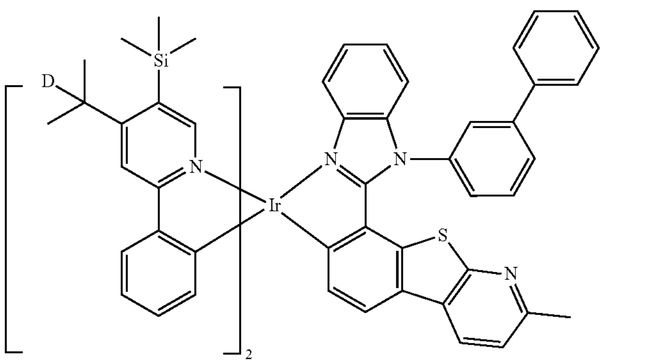
3649
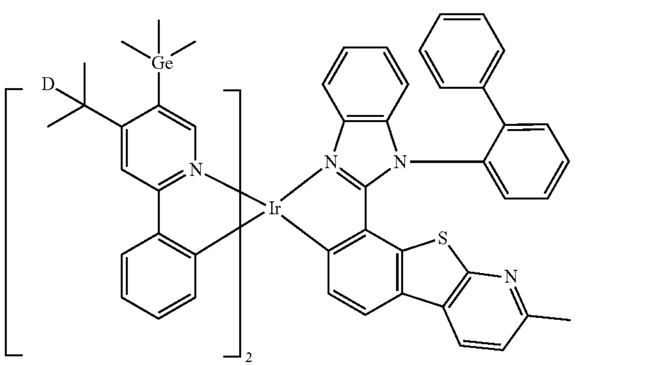
3650
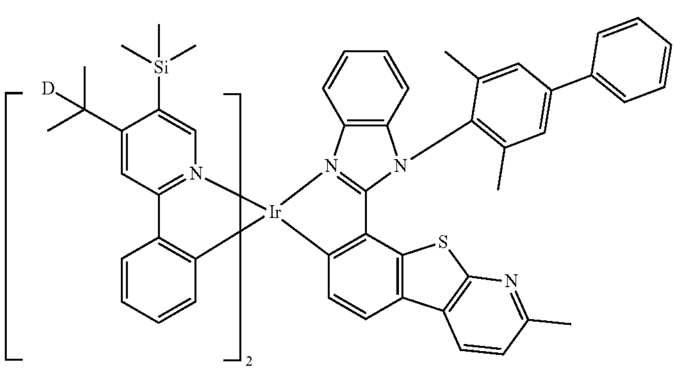

-continued
3651
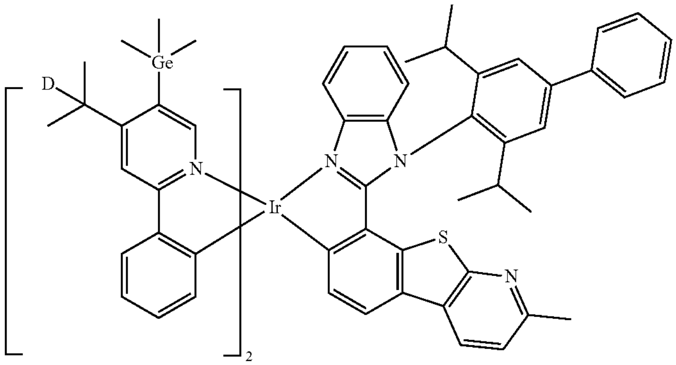
3652
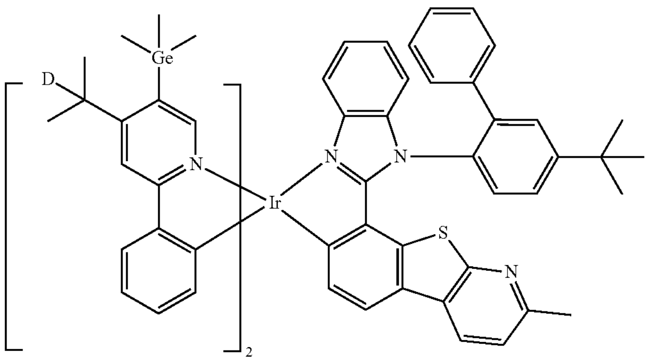
3653
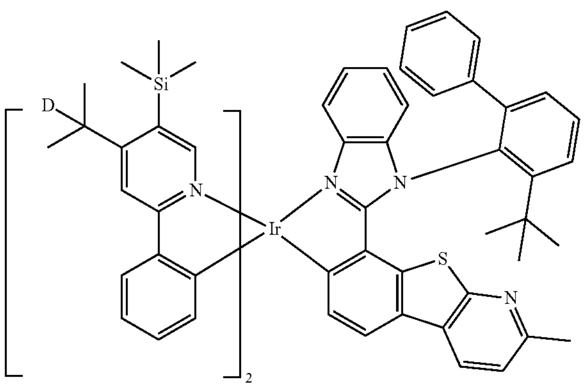
3654
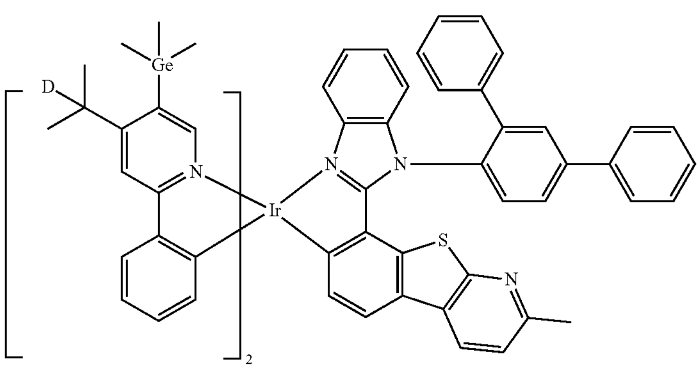

-continued
3655
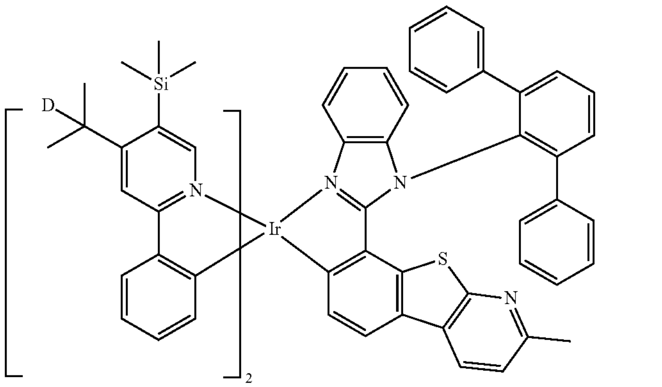
3656
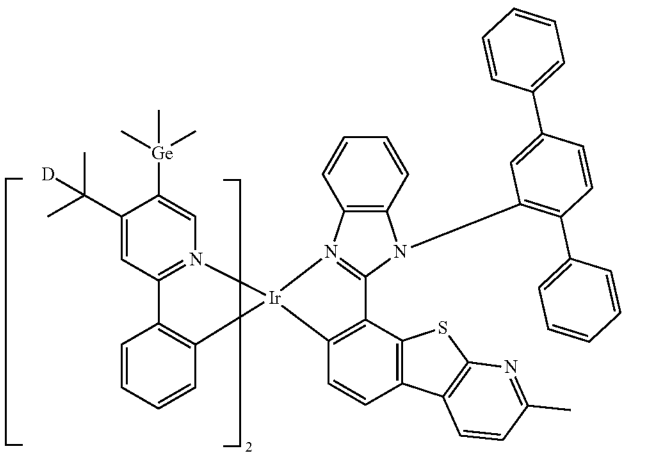
3657
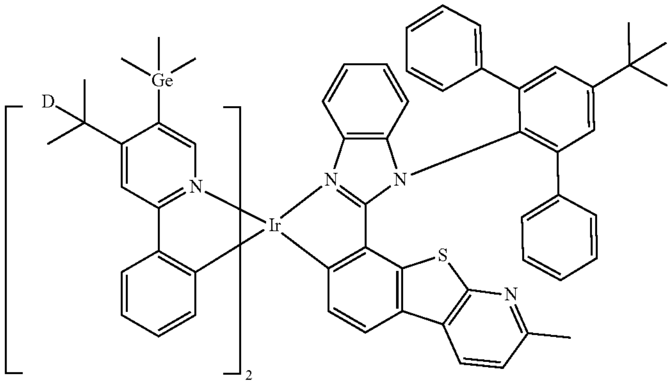
3658
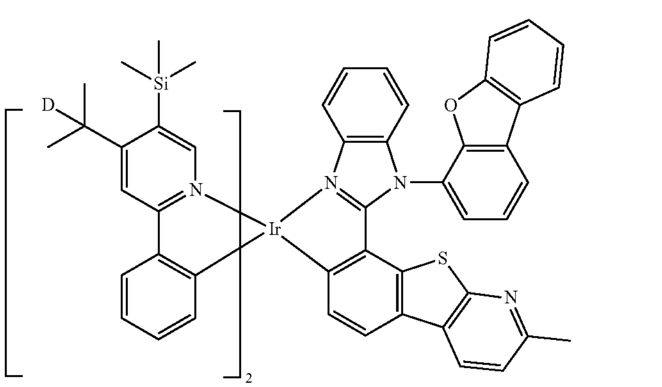

-continued
3659
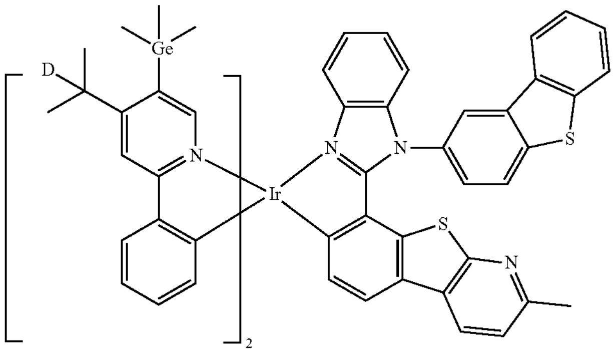
3660
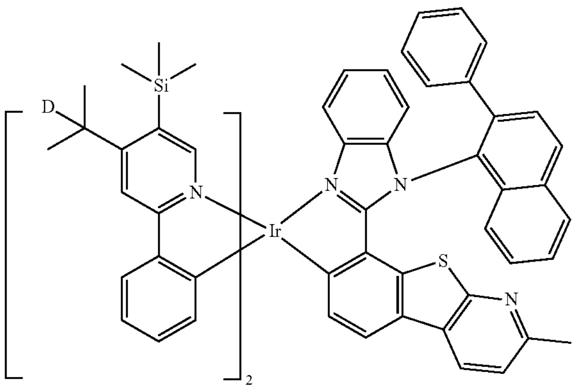
3661
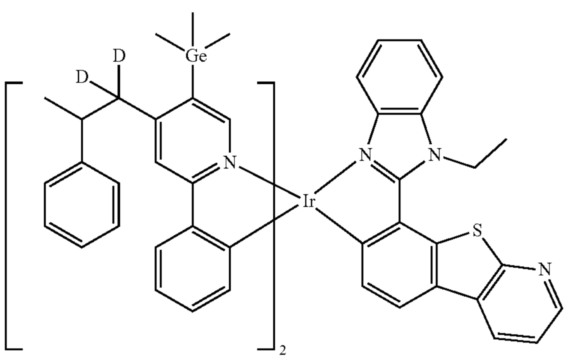
3662
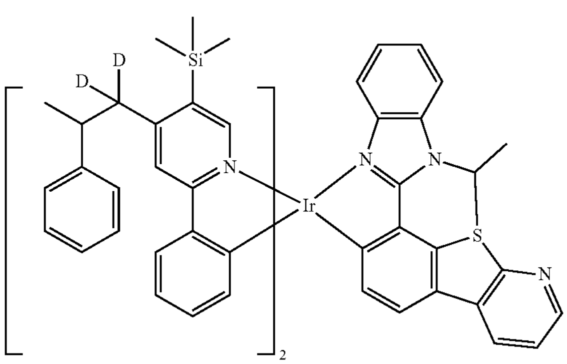

-continued
3663
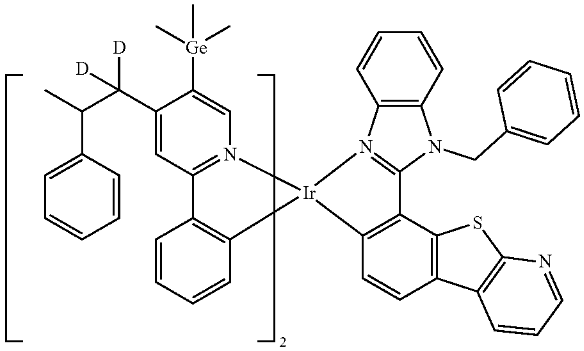
3664
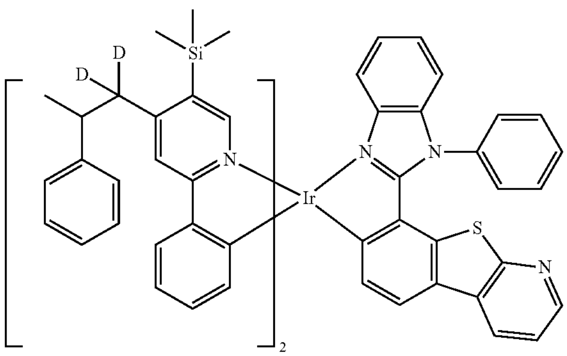
3665
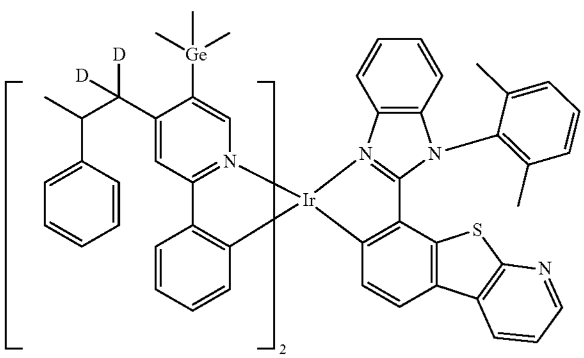
3666
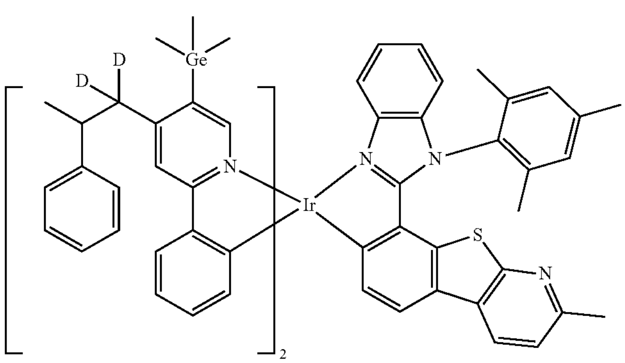

-continued
3667
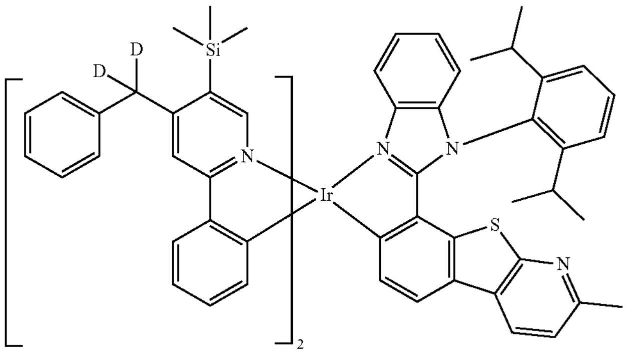
3668
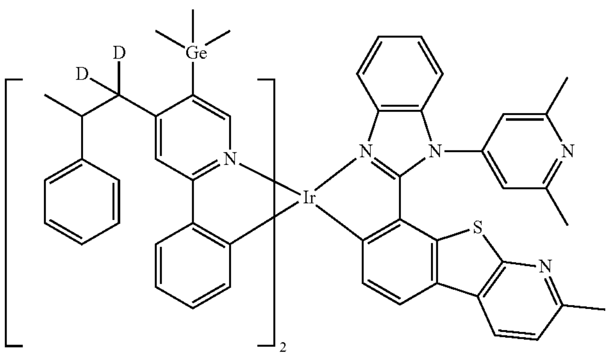
3669
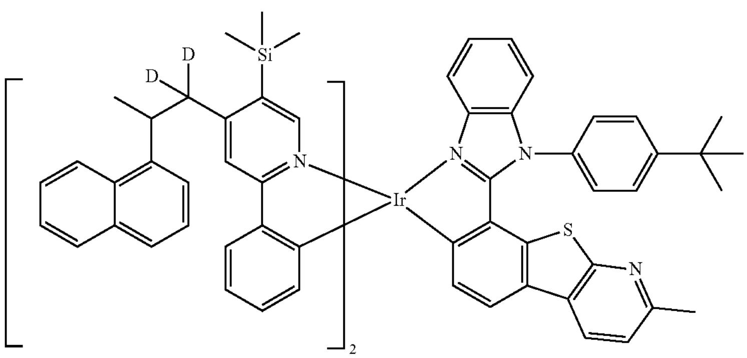
3670
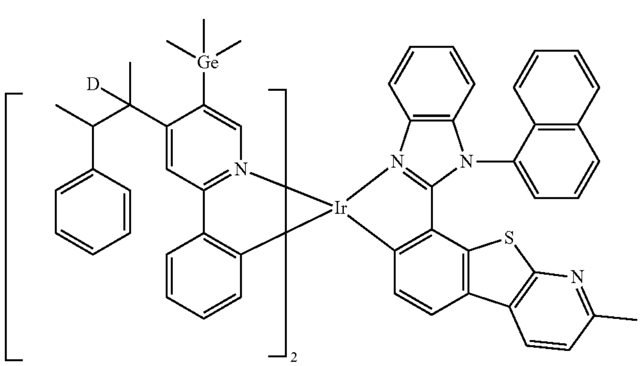

-continued
3671
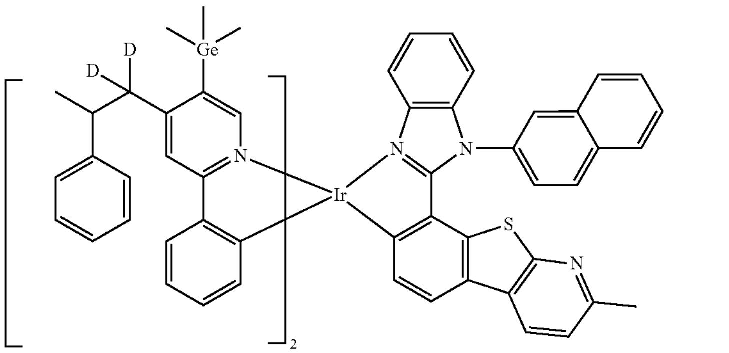
3672
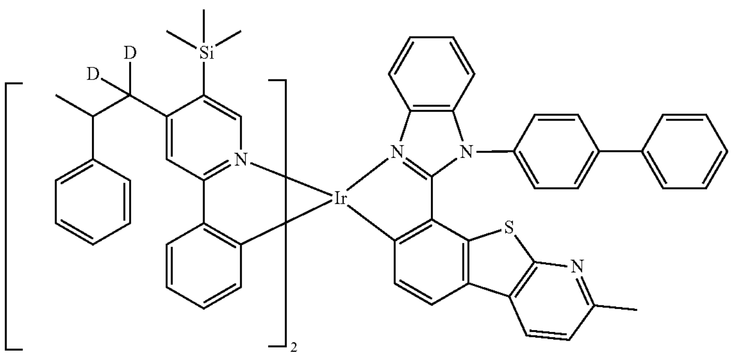
3673
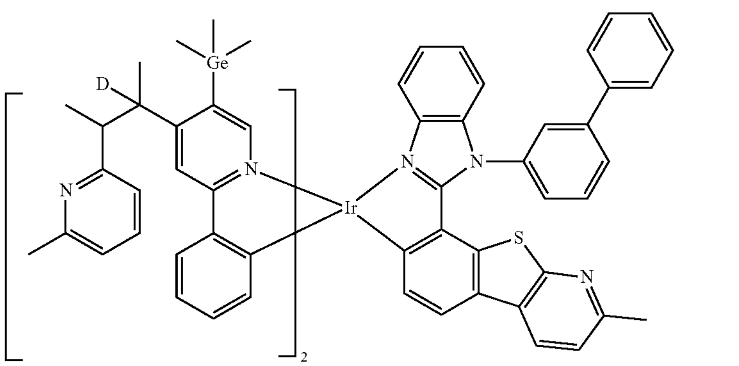
3674
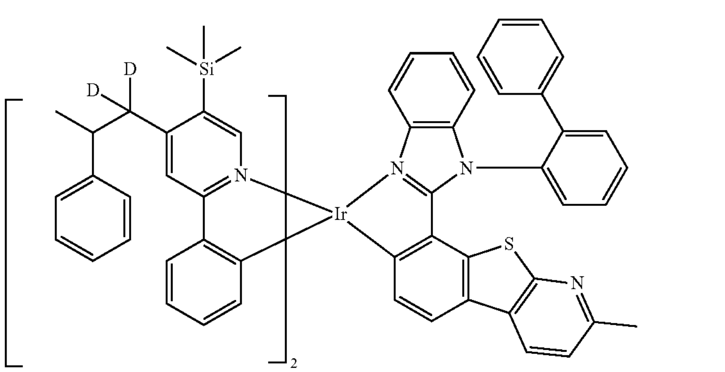

-continued
3675
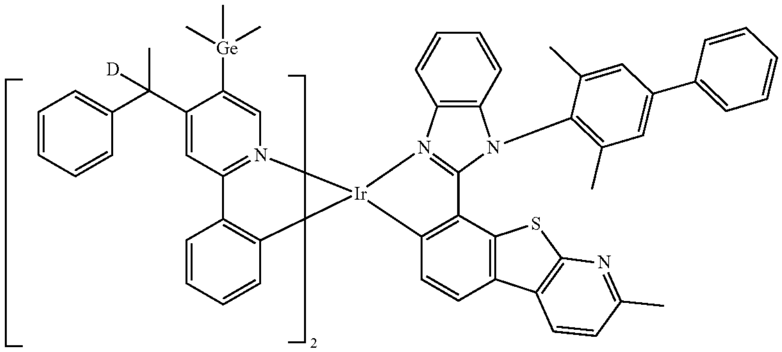
3676
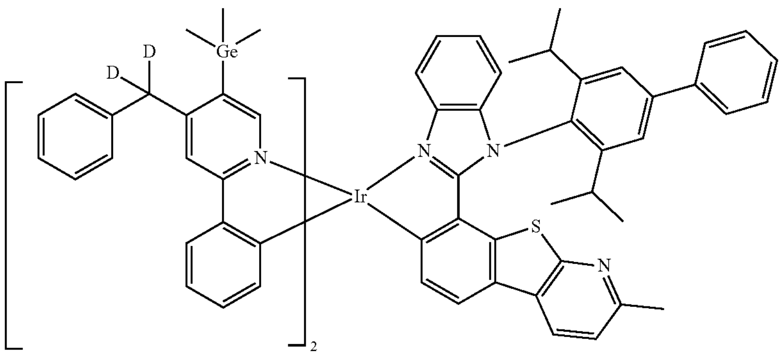
3677
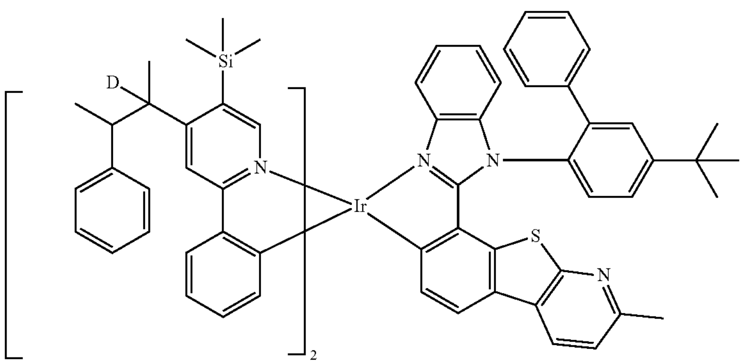
3678
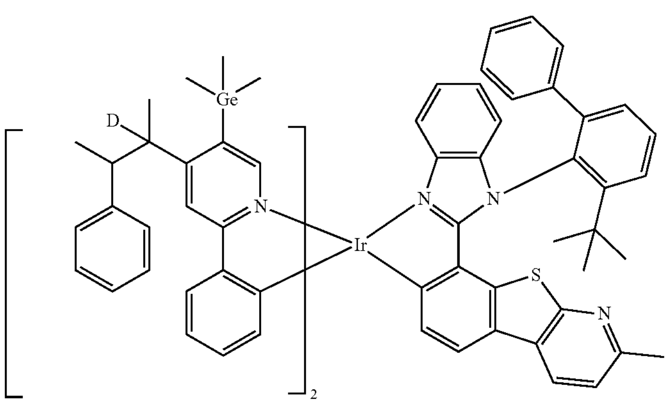

-continued
3679
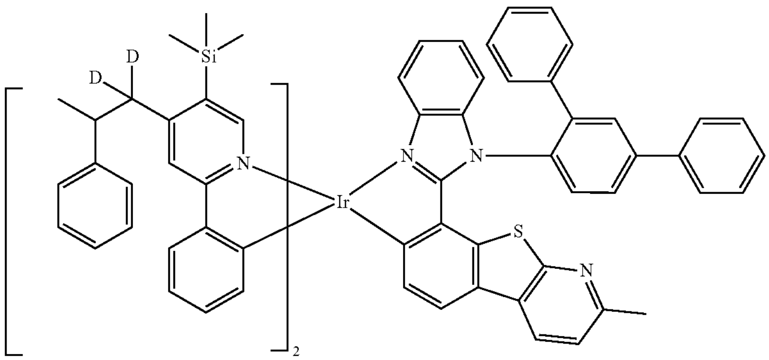
3680
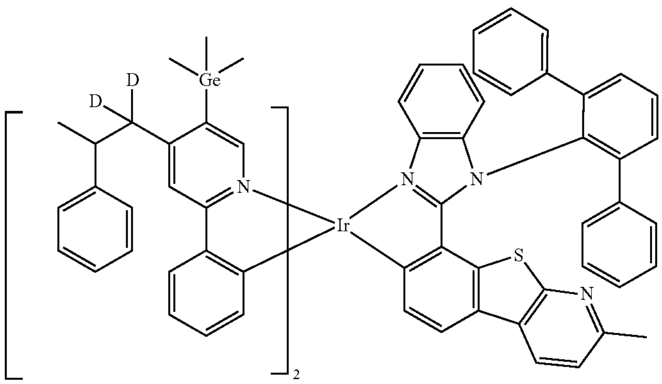
3681
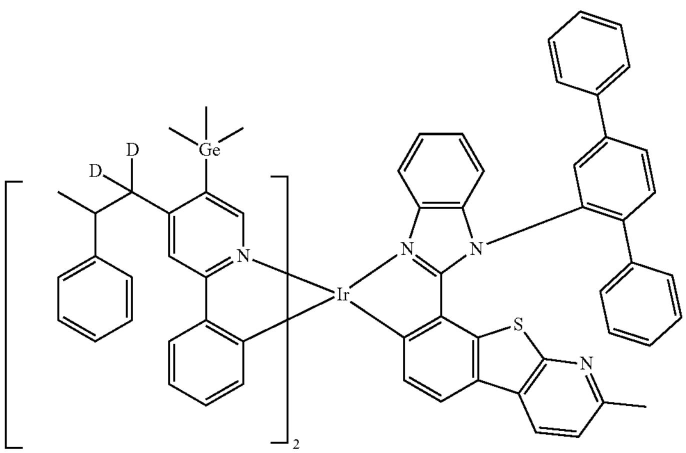
3682
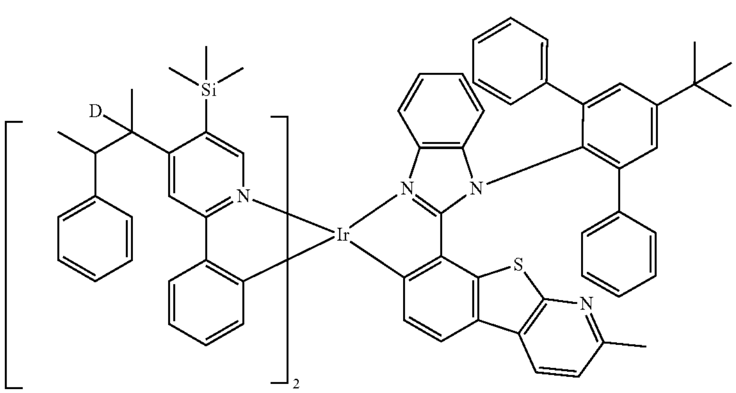

-continued
3683
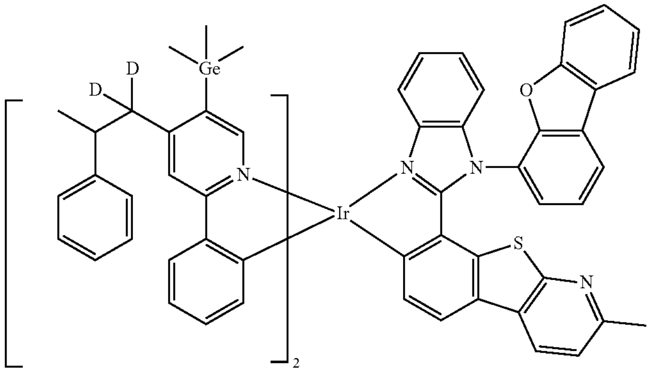
3684
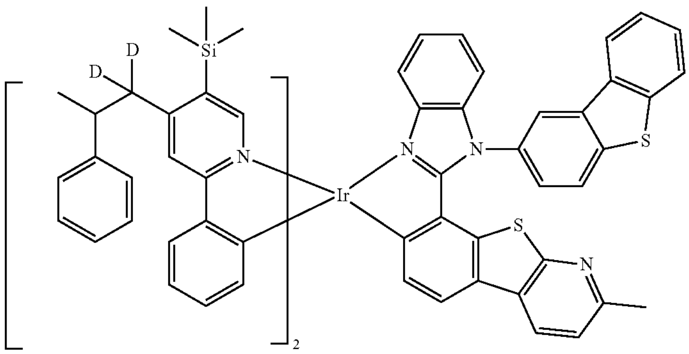
3685
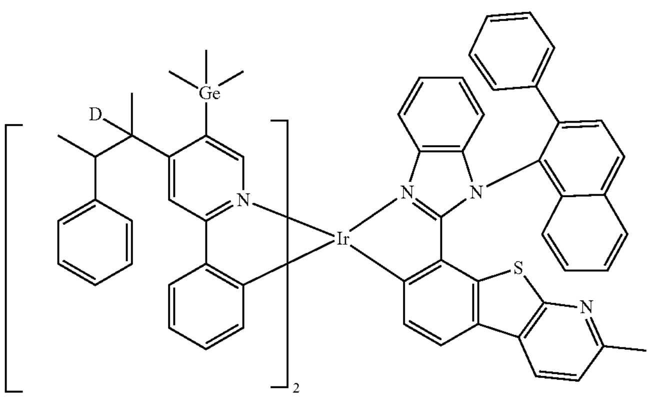
3686
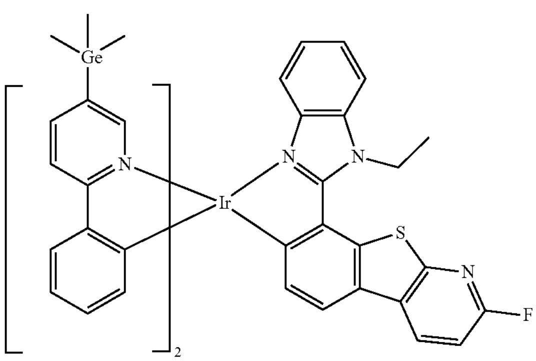

-continued
3687
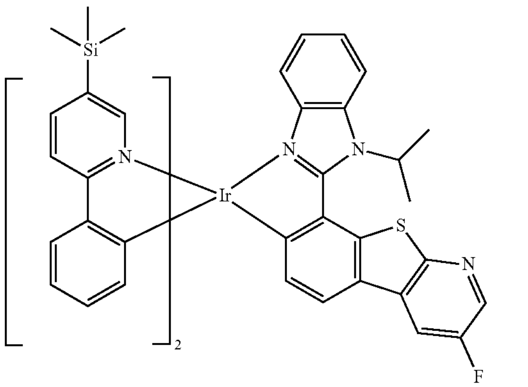
3688
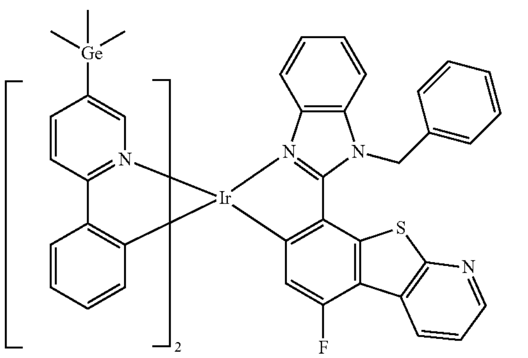
3689
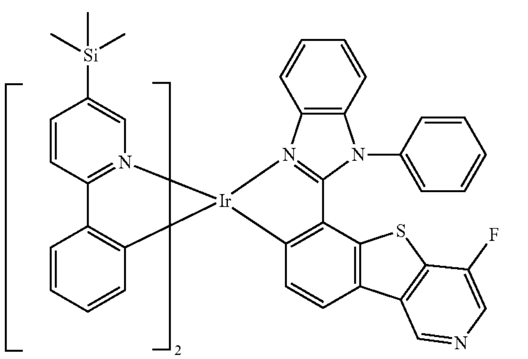
3690
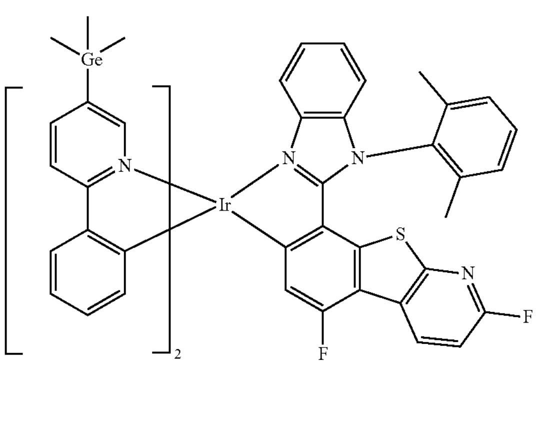

3691
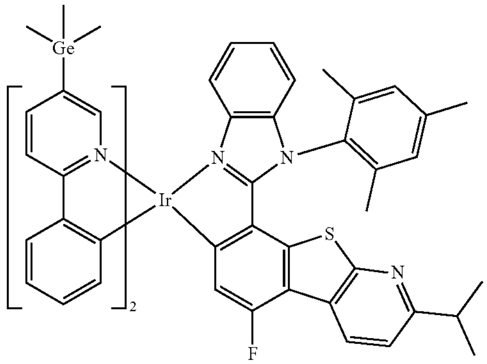
3692
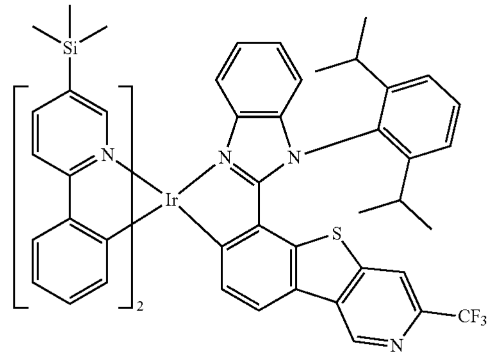
3693
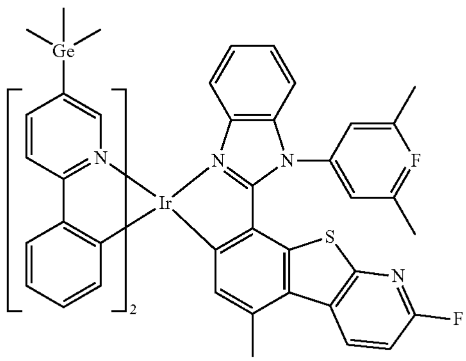
3694
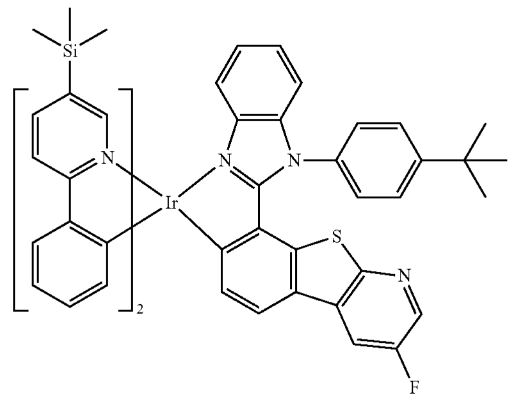
3695
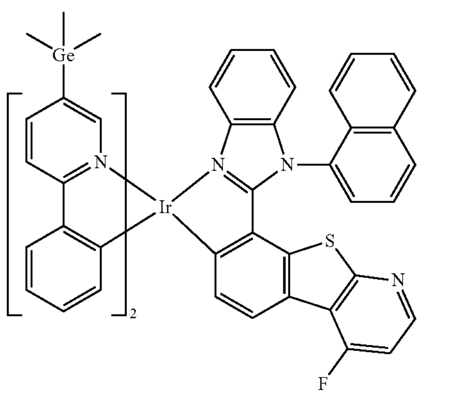
3696
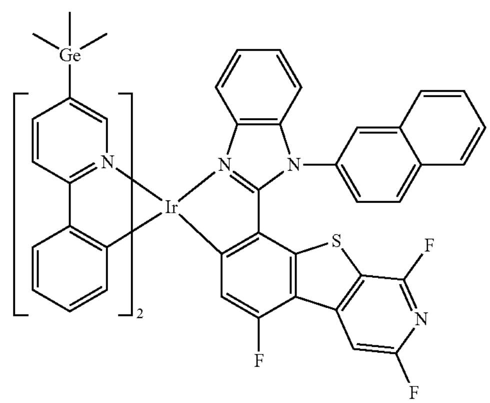
3697
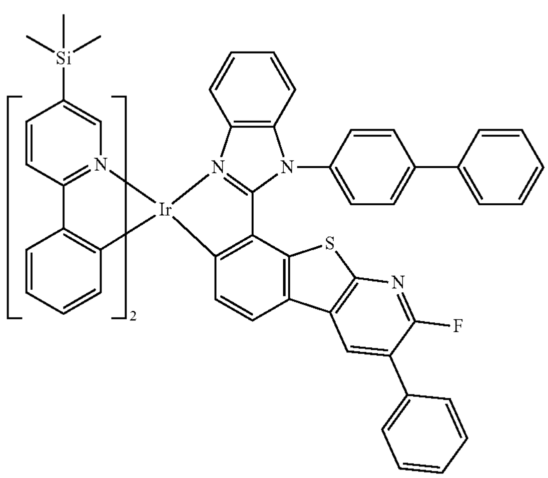
3698
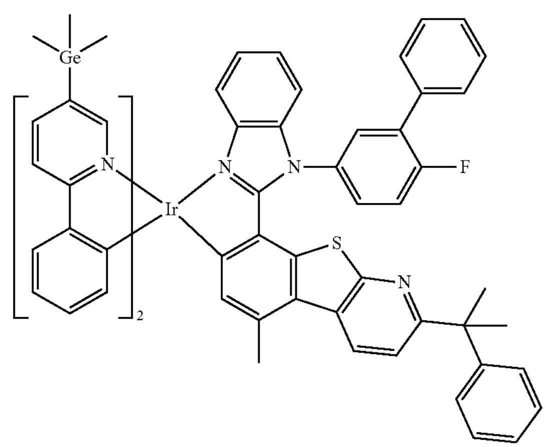

-continued
3699
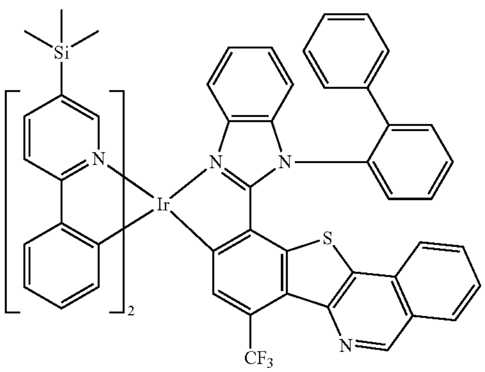
3700
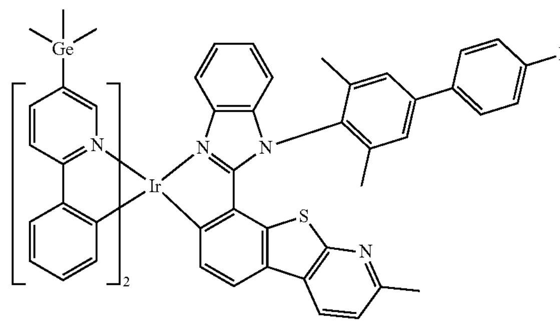
3701
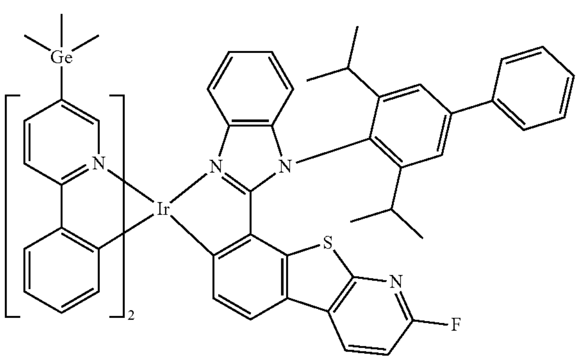
3702
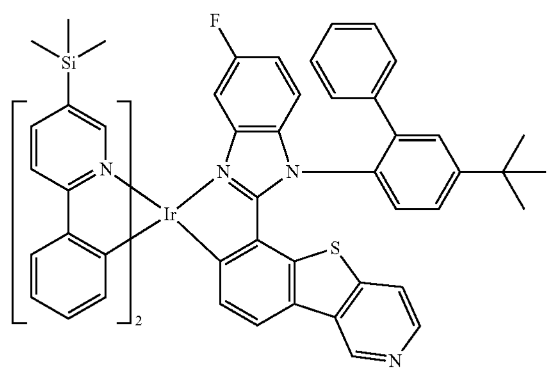
3703
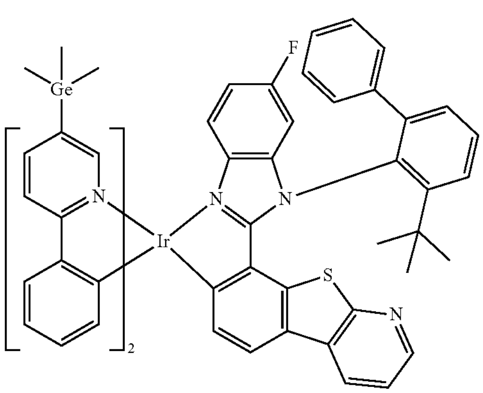
3704
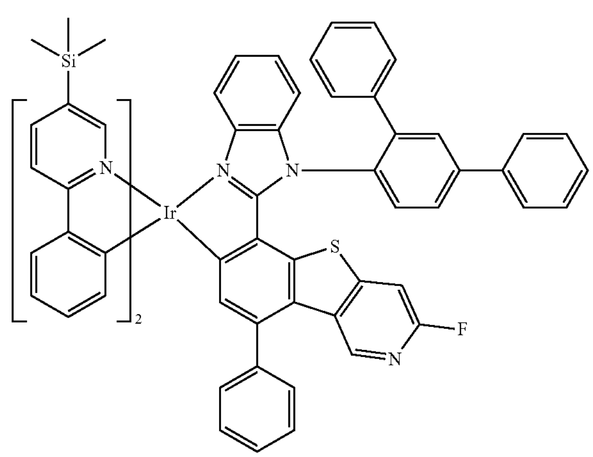

-continued
3705
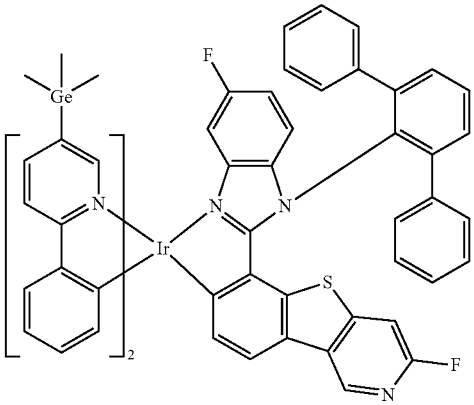
3706
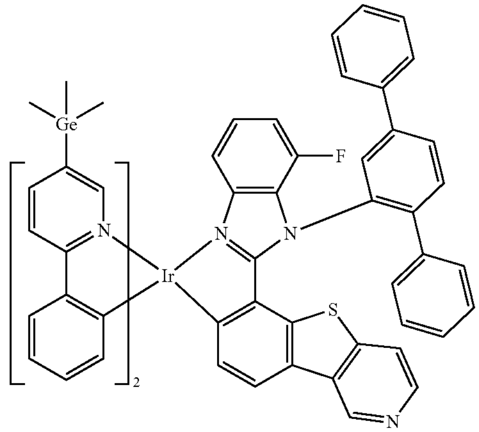
3707
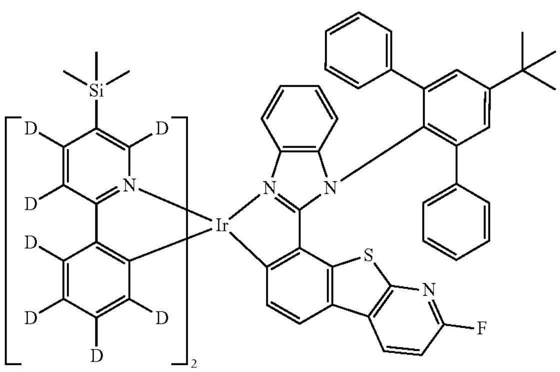
3708
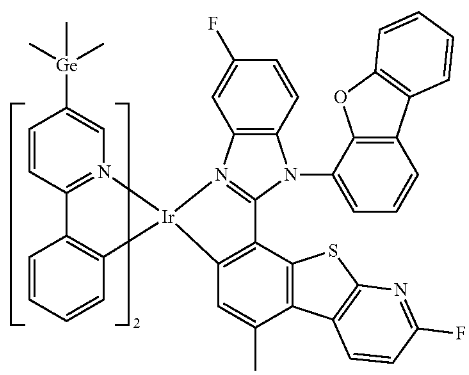
3709
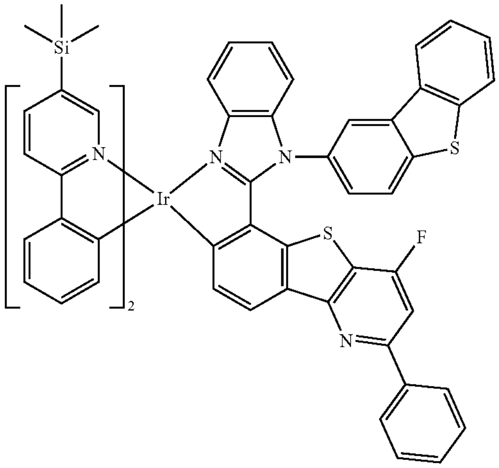
3710
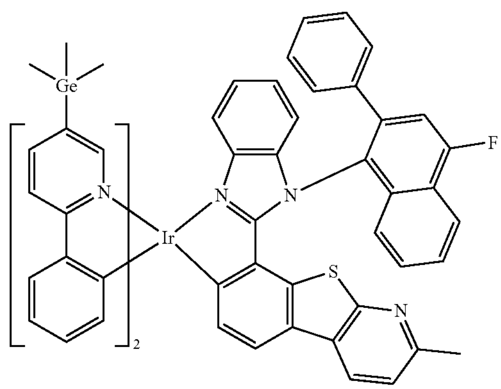

-continued
3711
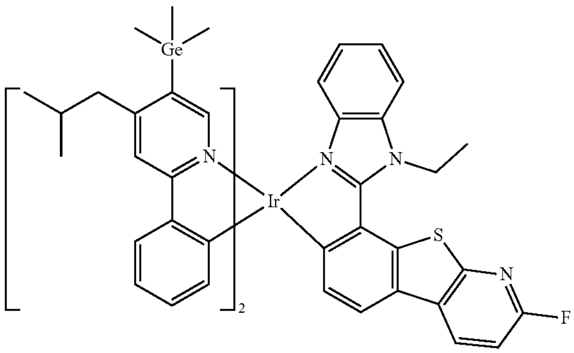
3712
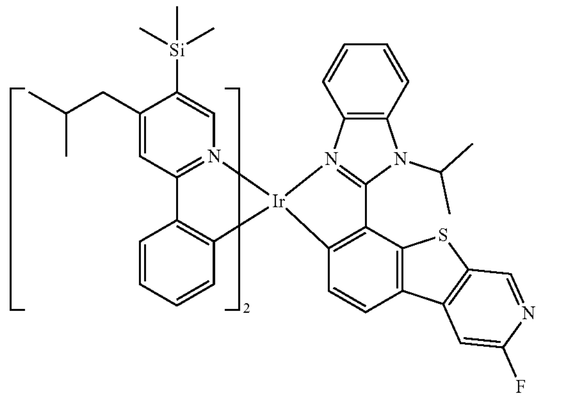
3713
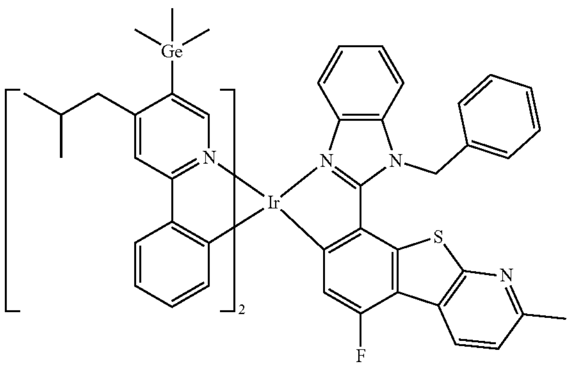
3714
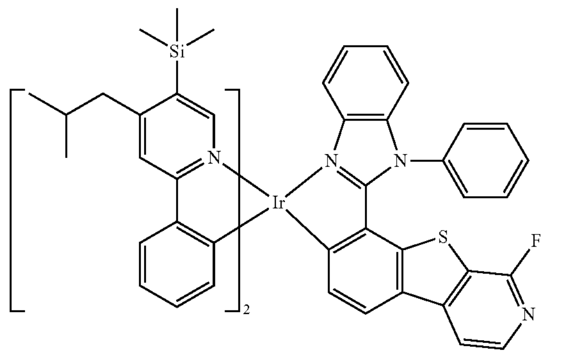
3715
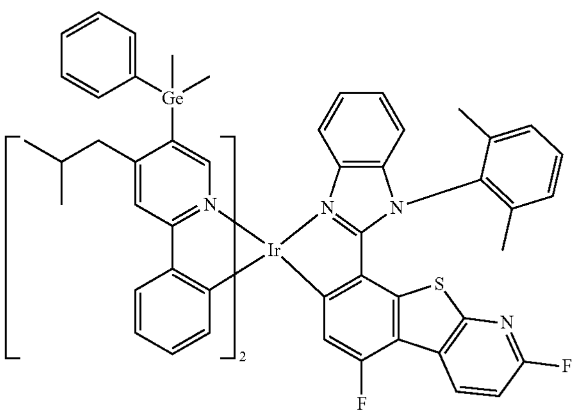
3716
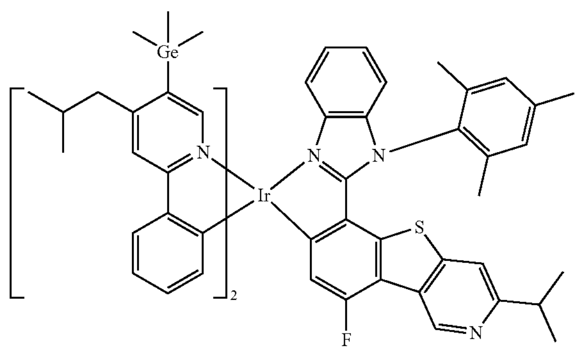
3717
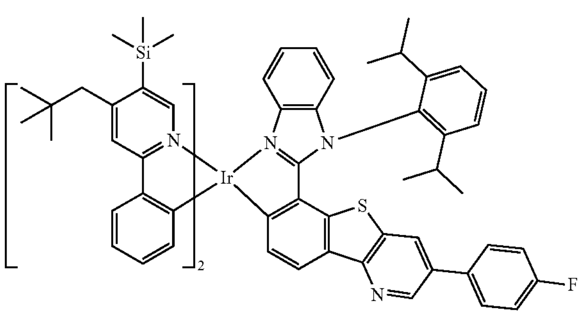
3718
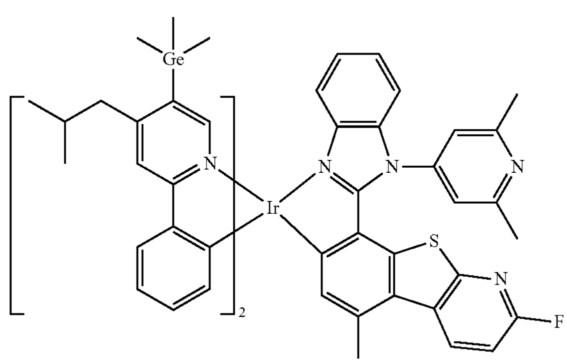

-continued
3719
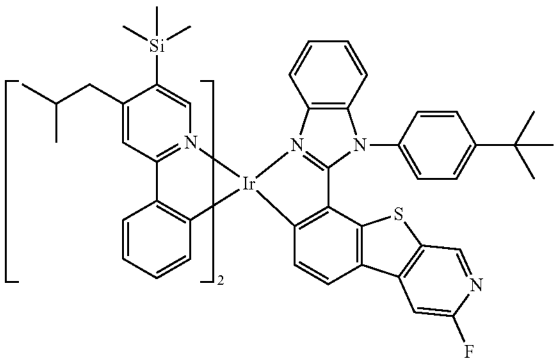
3720
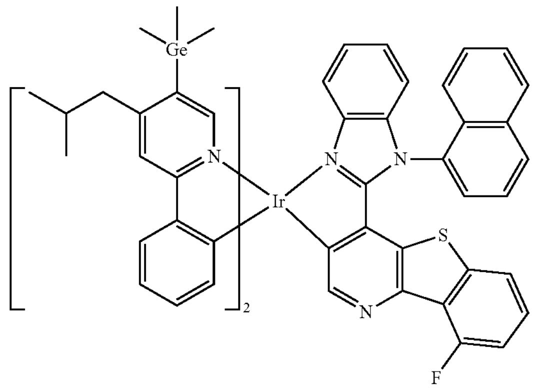
3721
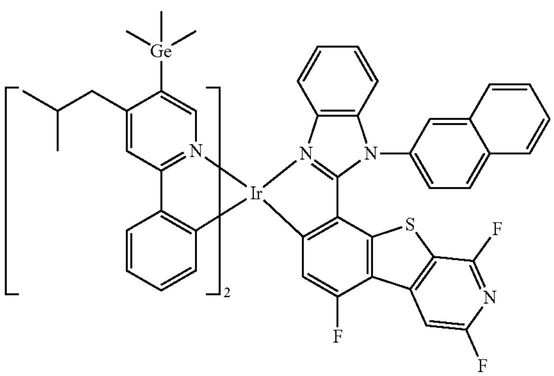
3722
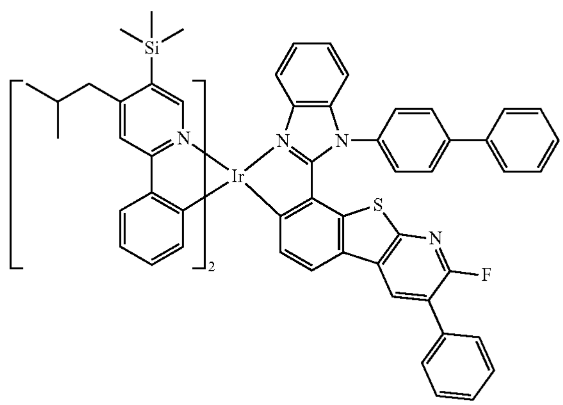
3723
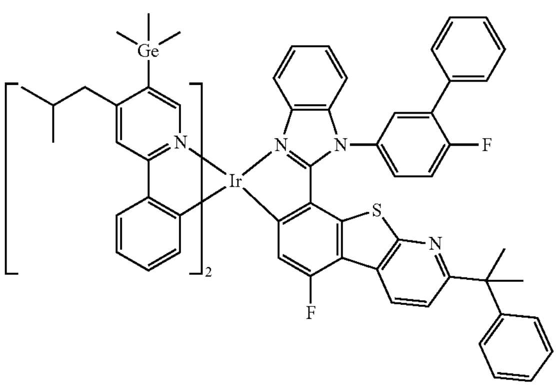
3724
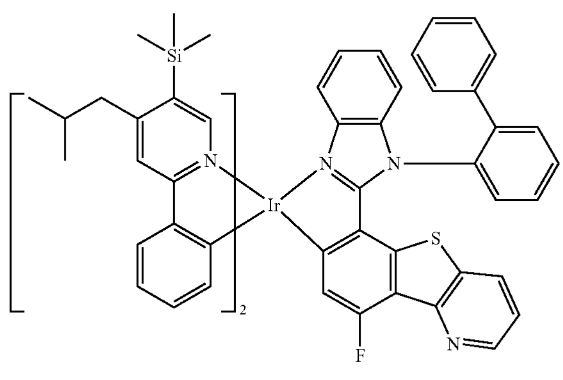
3725
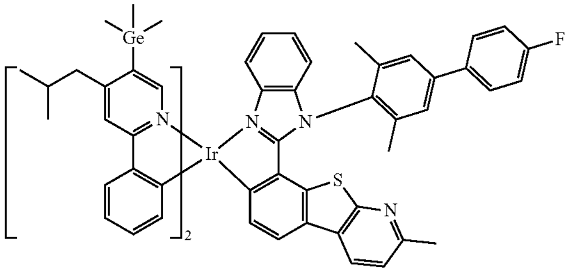
3726
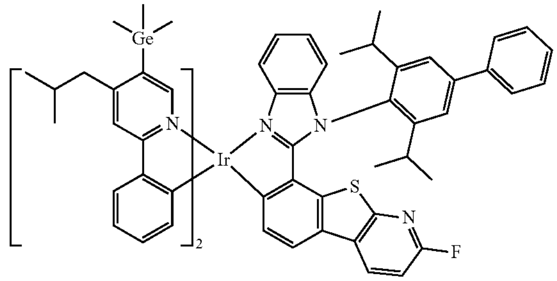

-continued
3727
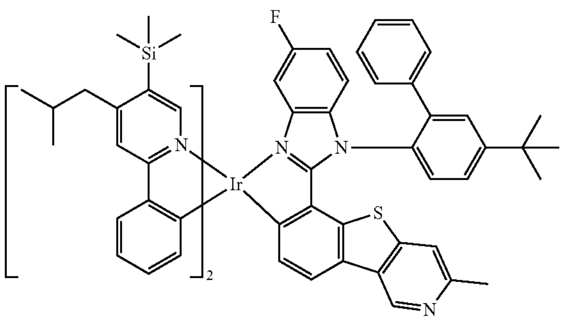
3728
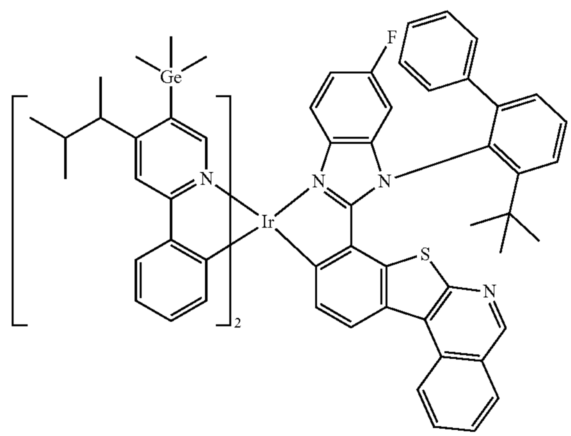
3729
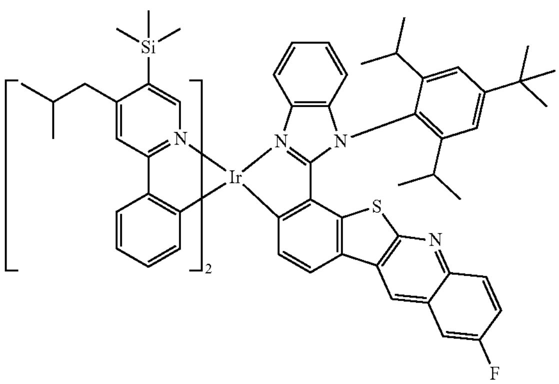
3730
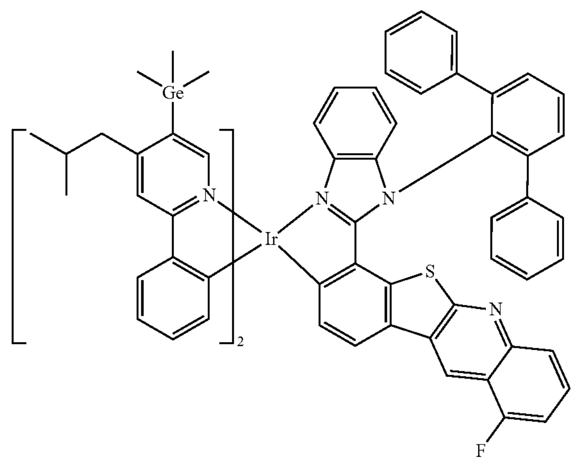
3731
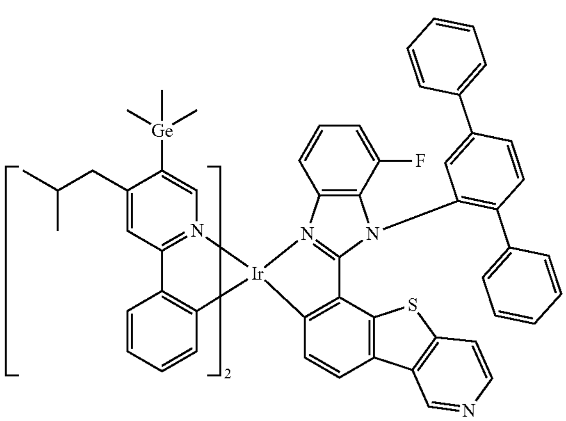
3732
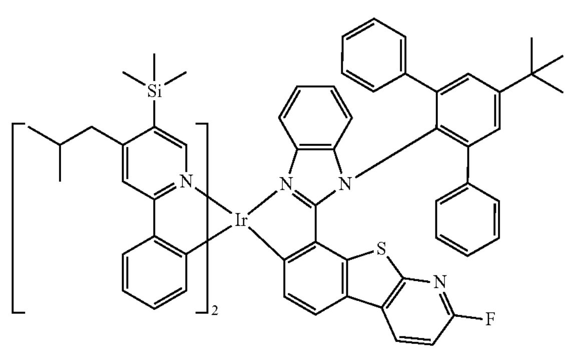

-continued
3733
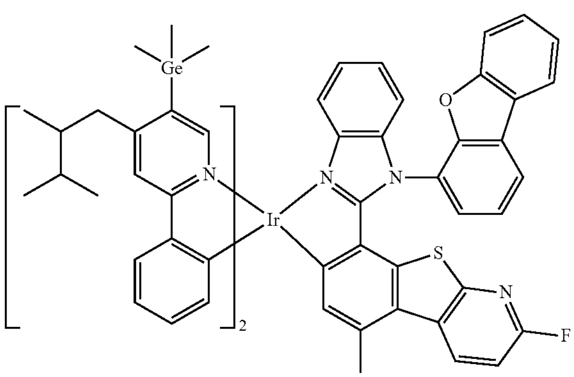
3734
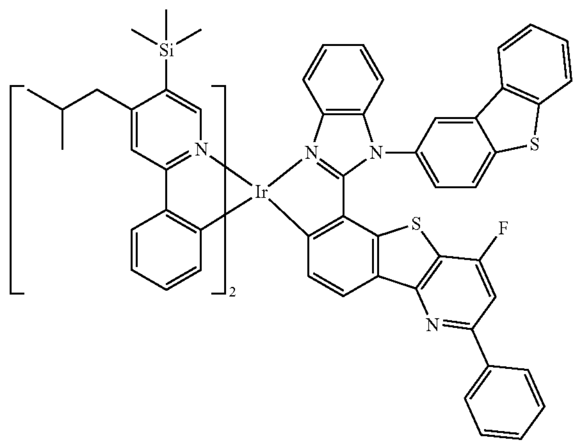
3735
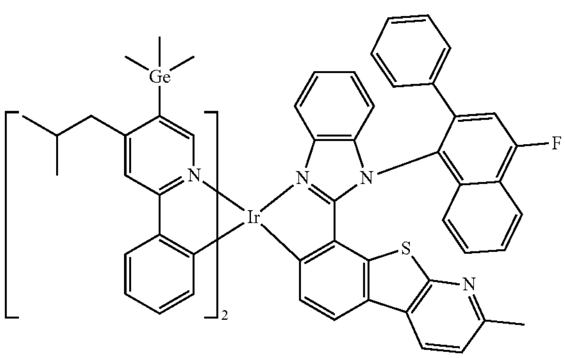
3736
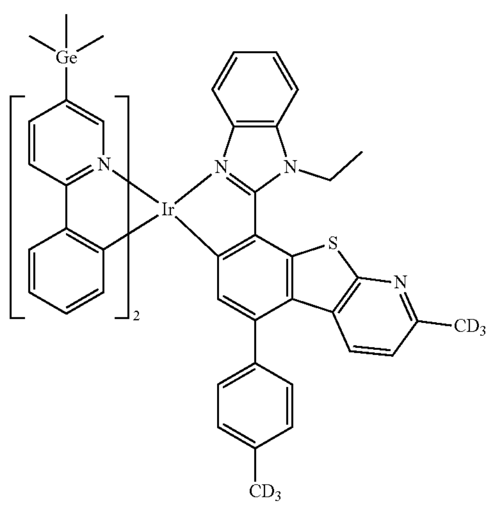
3737
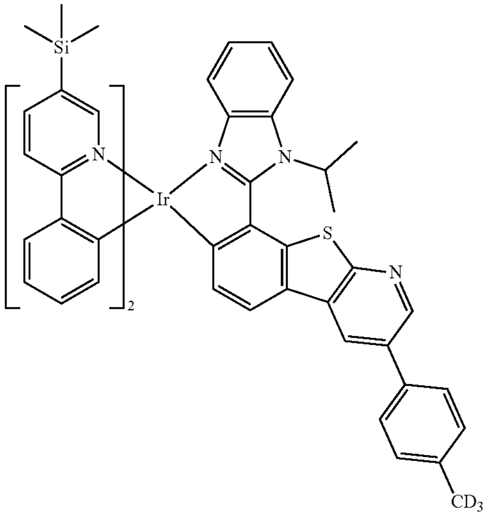
3738
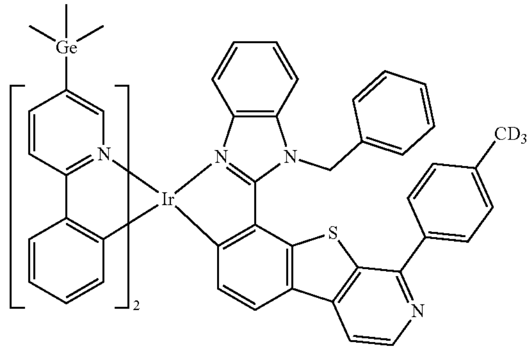

-continued
3739
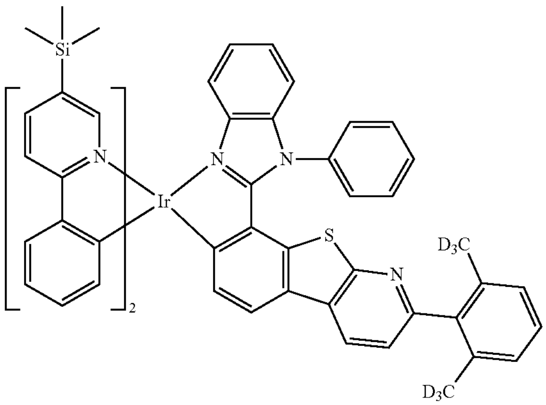
3740
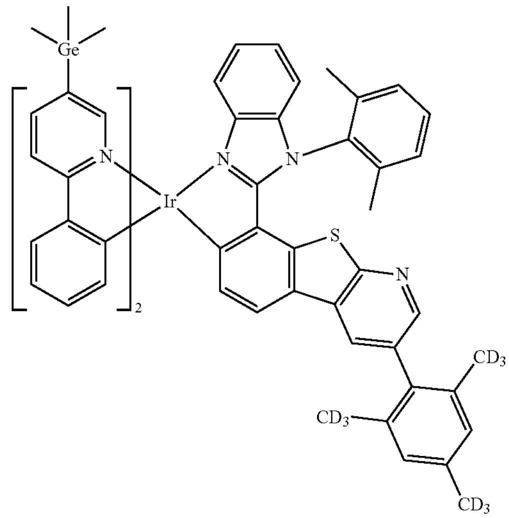
3741
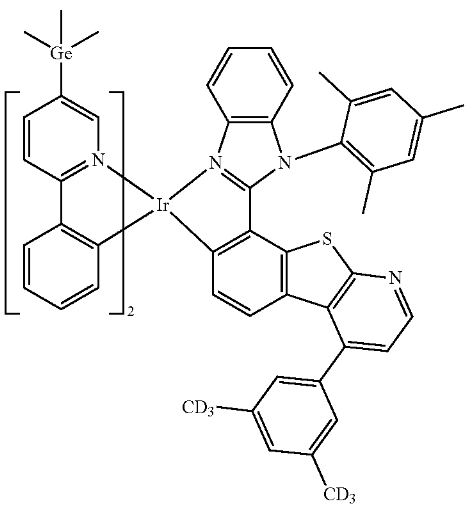
3742
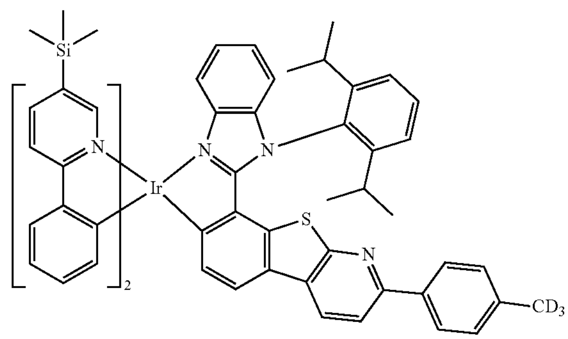
3743
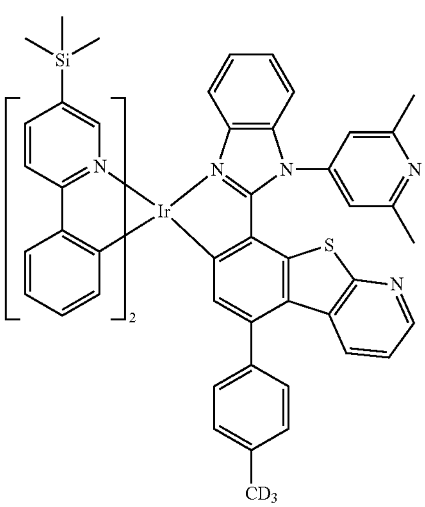
3744
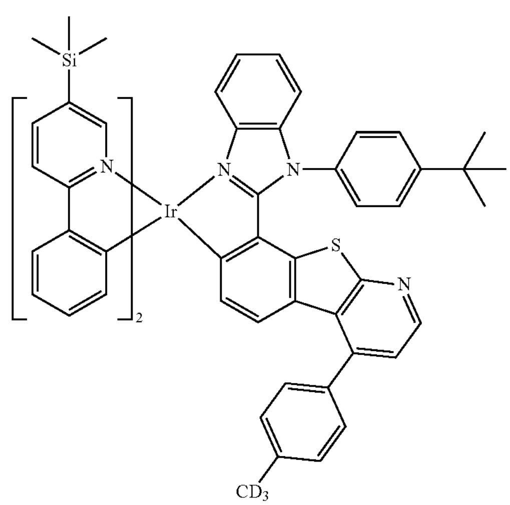

-continued
3745
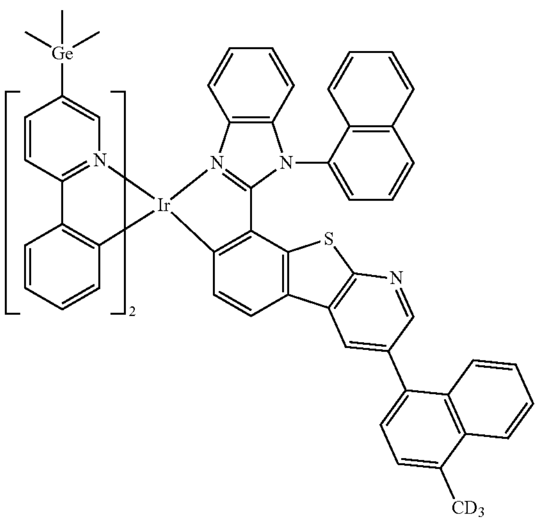
3746
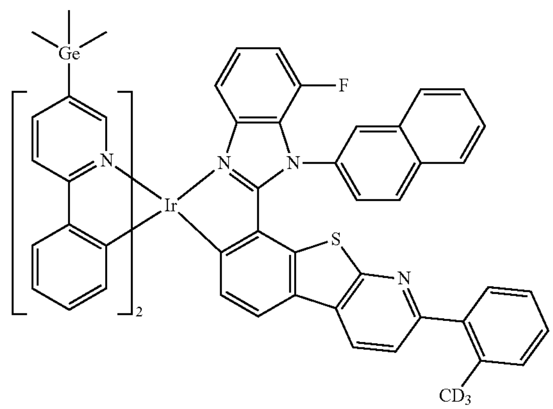
3747
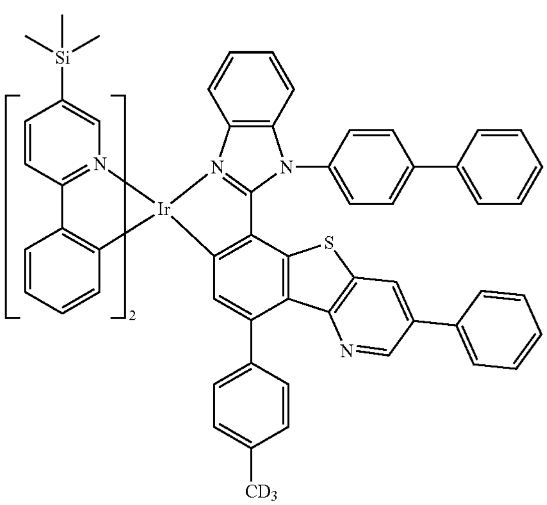
3748
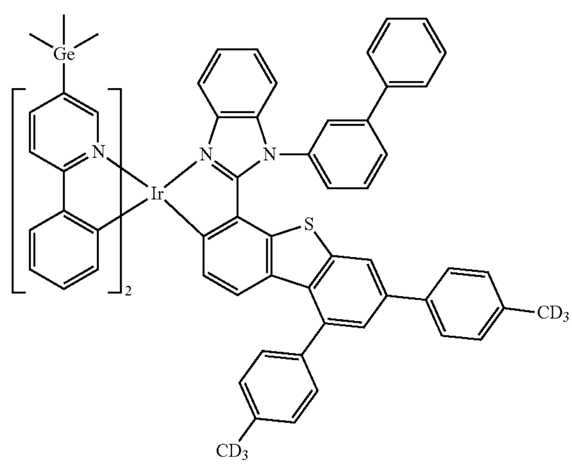
3749
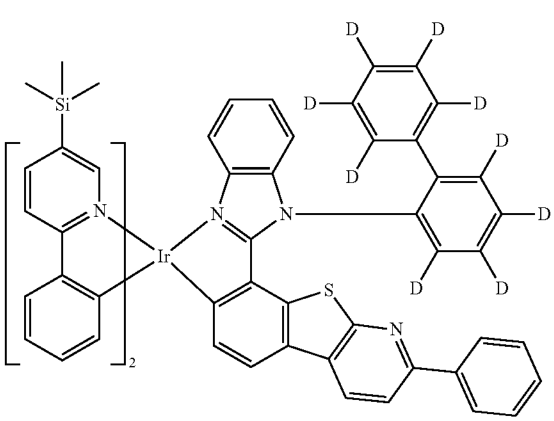
3750
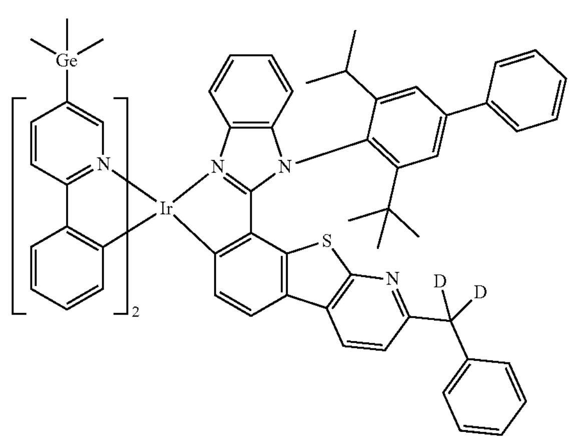

-continued
3751
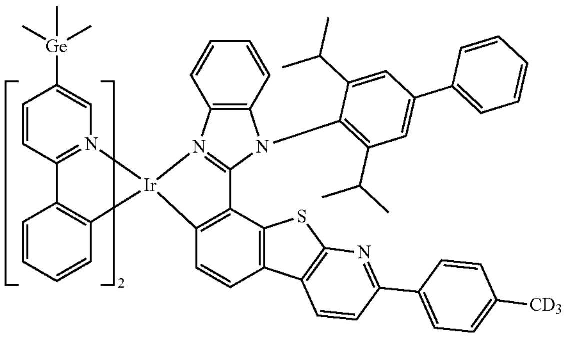
3752
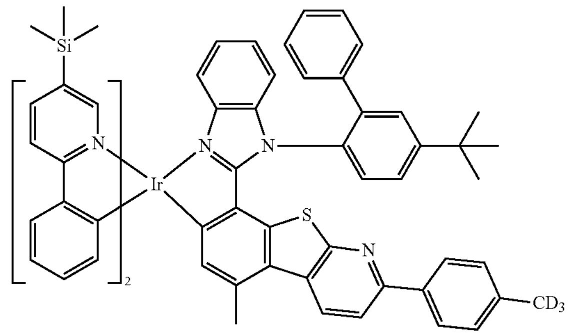
3753
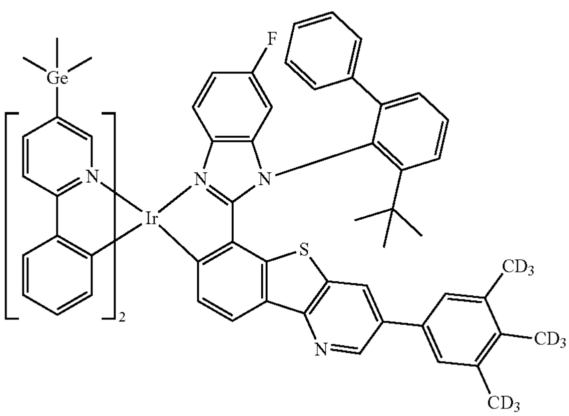
3754
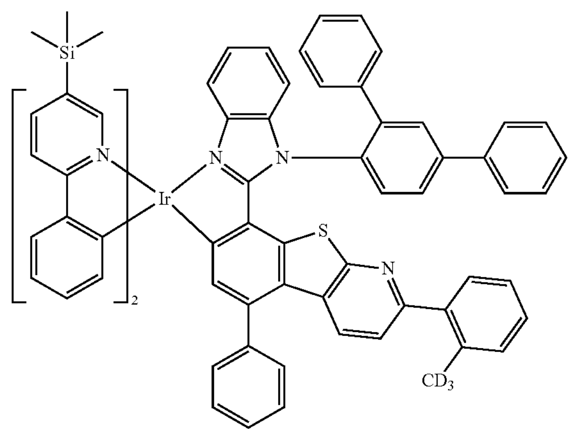
3755
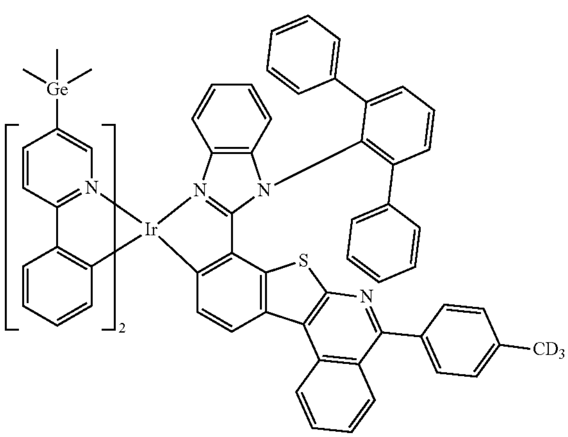
3756
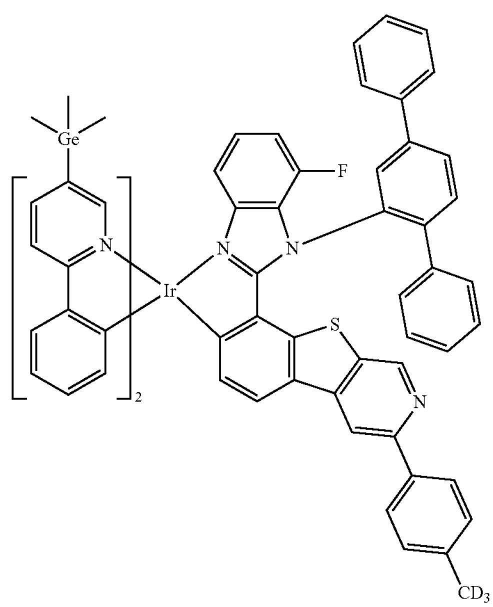

-continued
3757
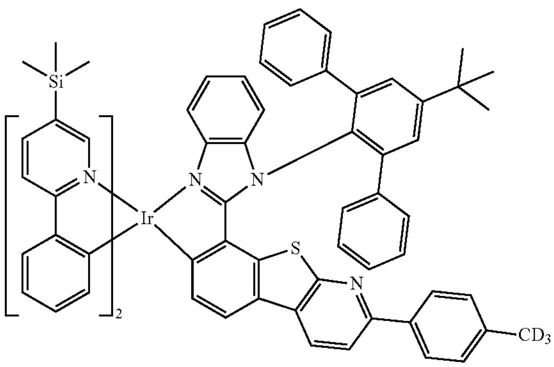
3758
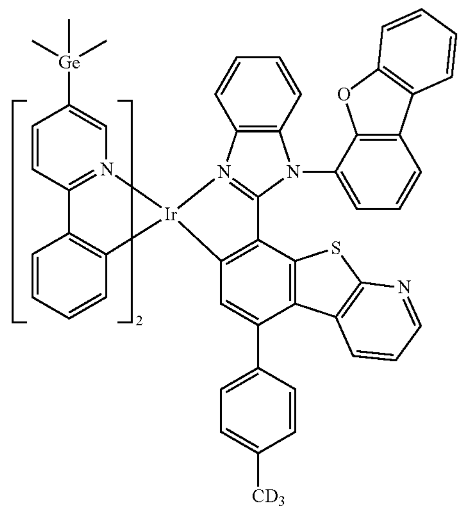
3759
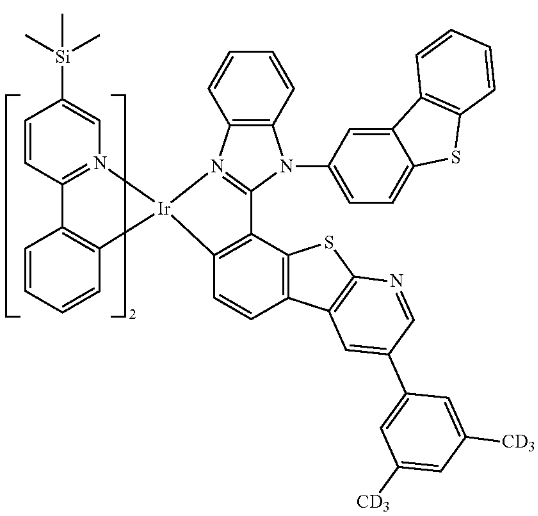
3760
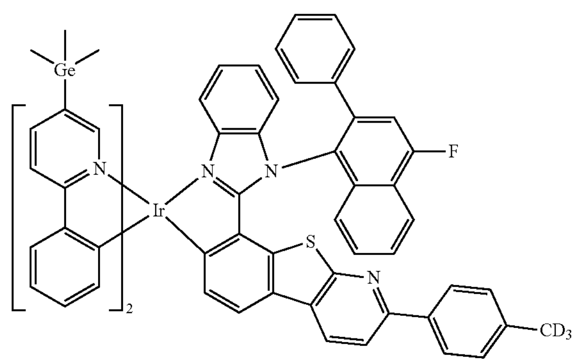
3761
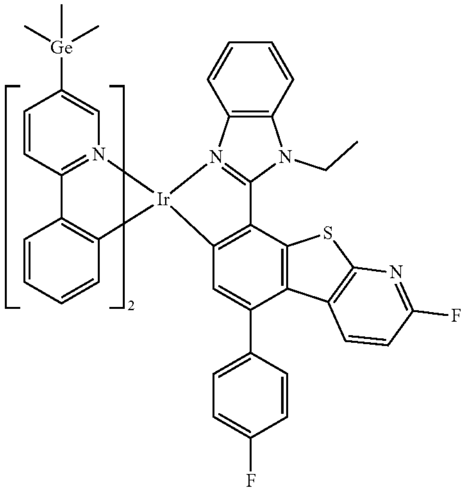
3762
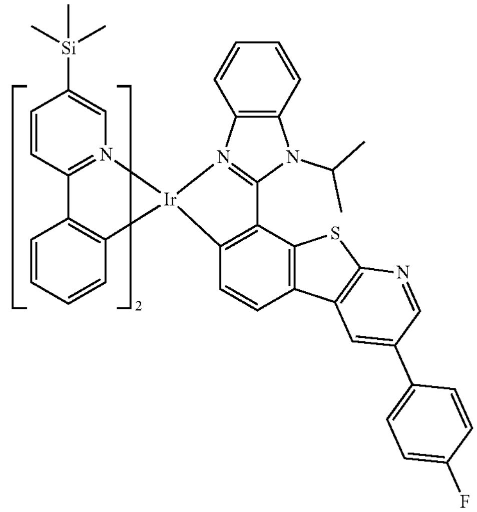

-continued
3763
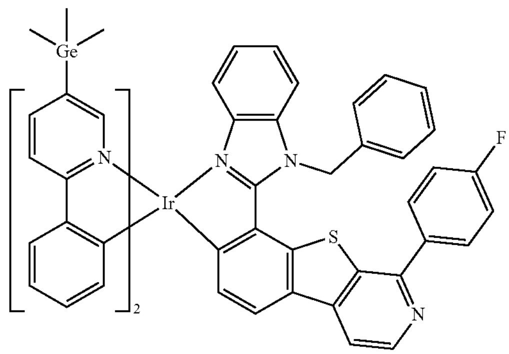
3764
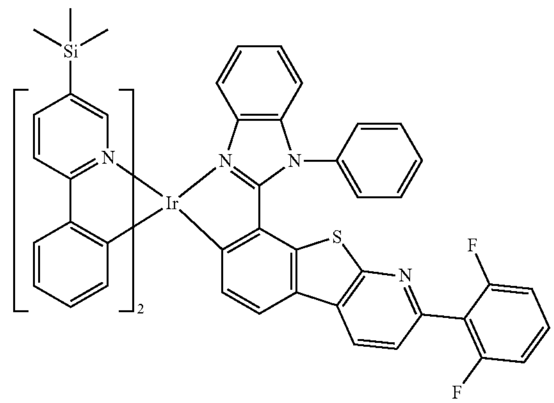
3765
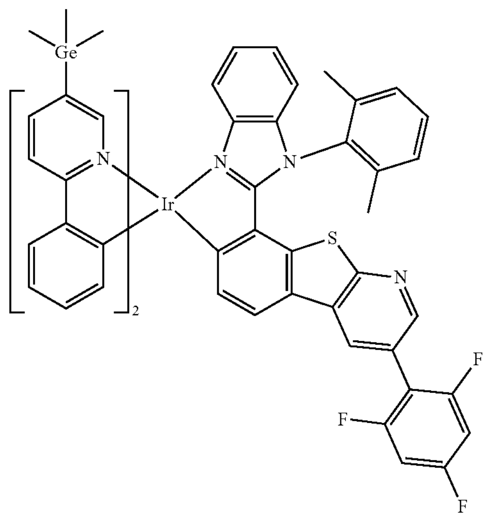
3766
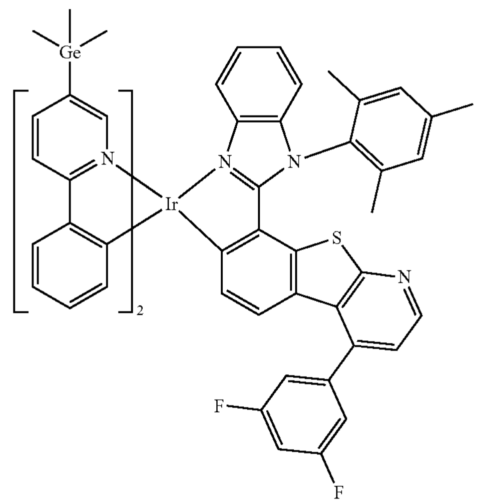
3767
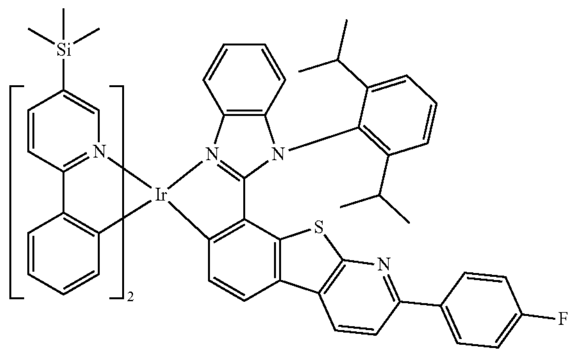
3768
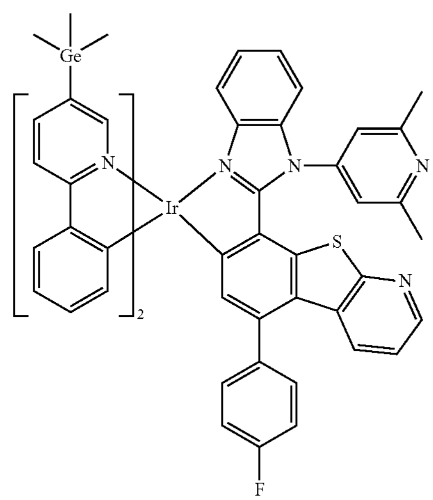

-continued
3769
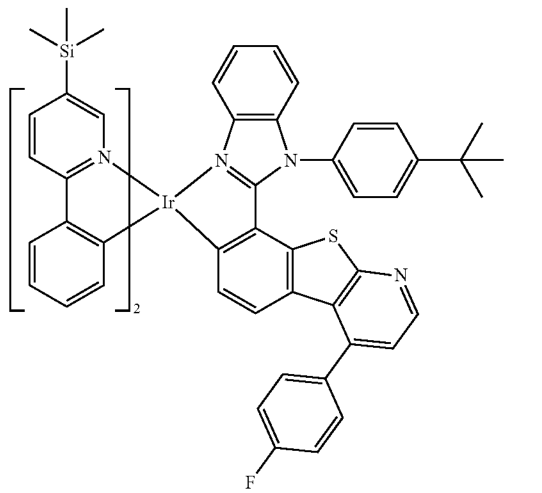
3770
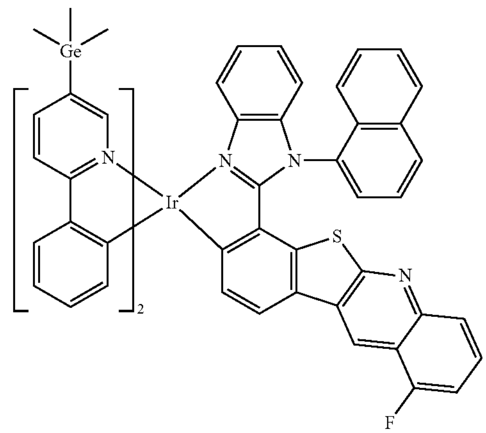
3771
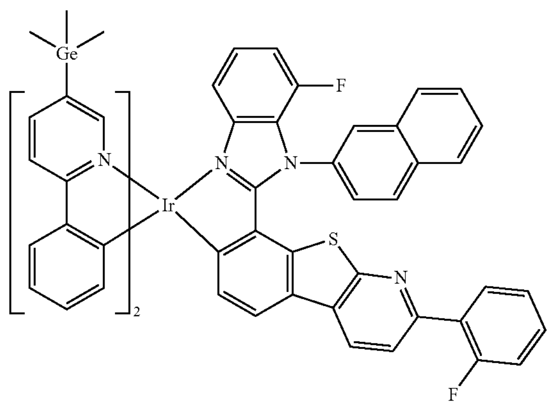
3772
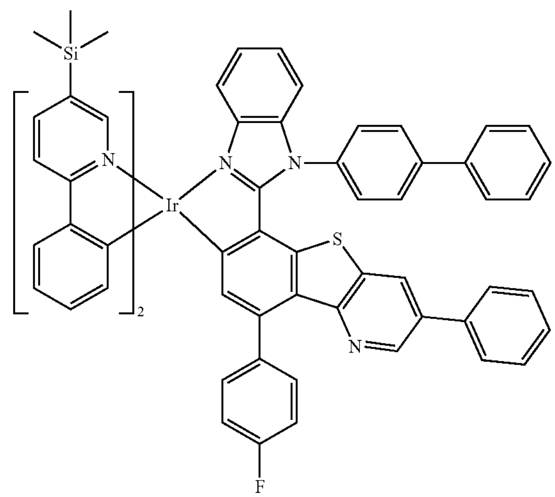
3773
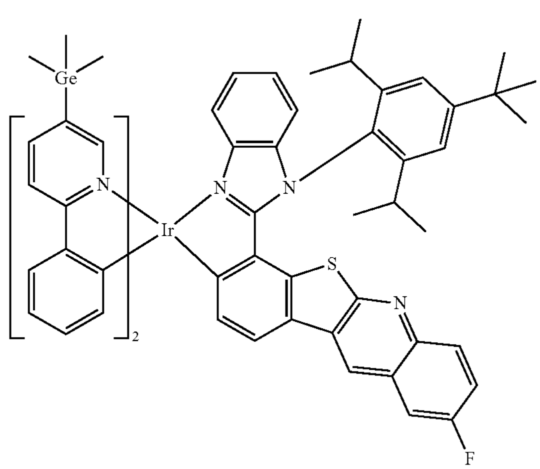
3774
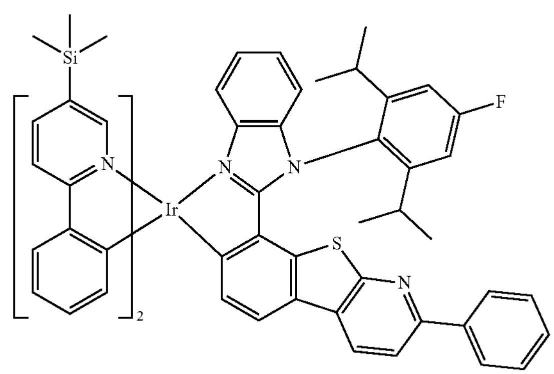

-continued
3775
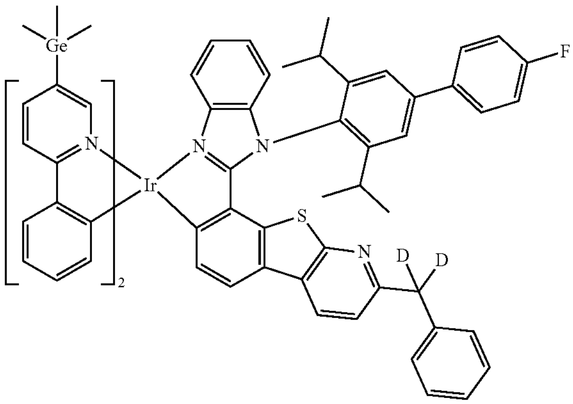
3776
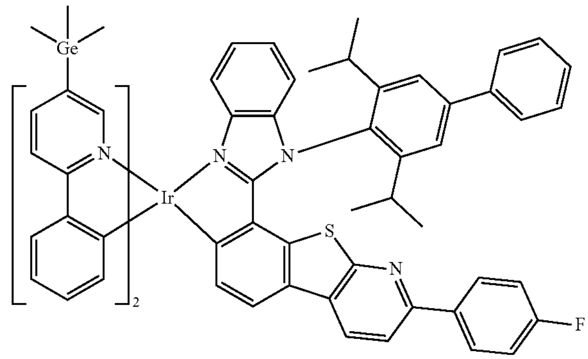
3777
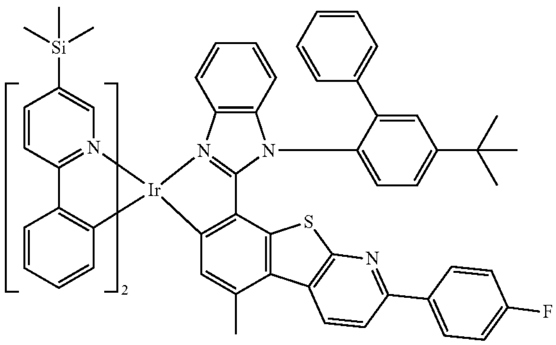
3778
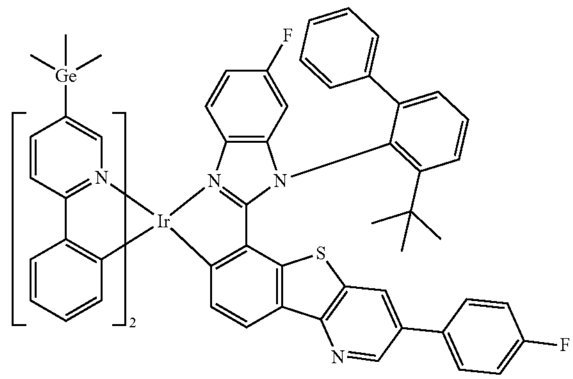
3779
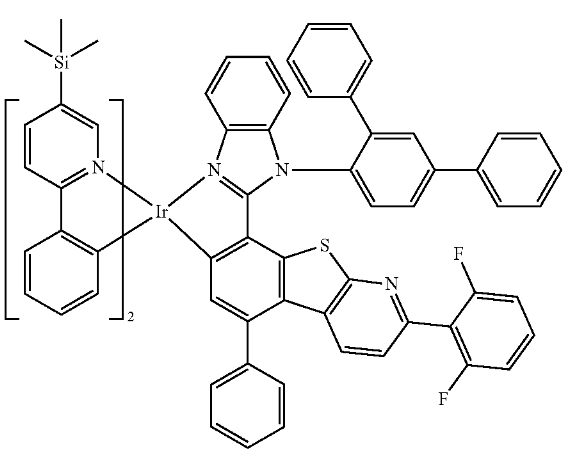
3780
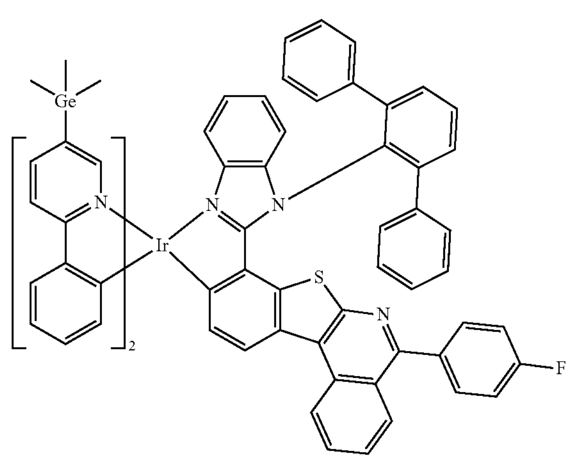

-continued
3781
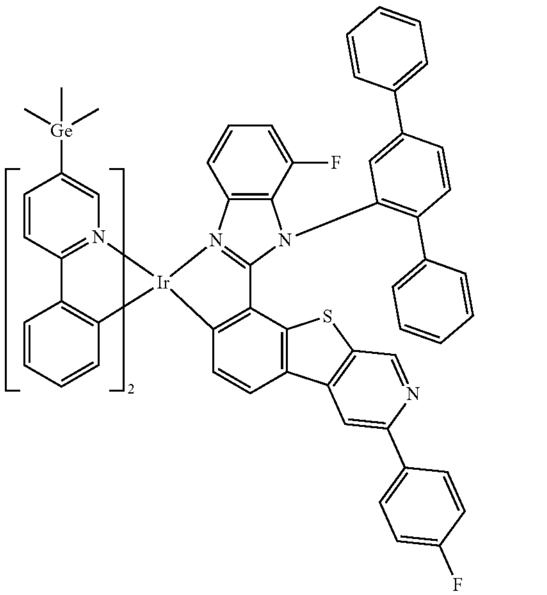
3782
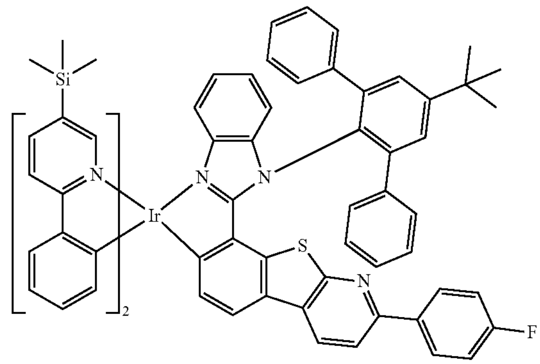
3783
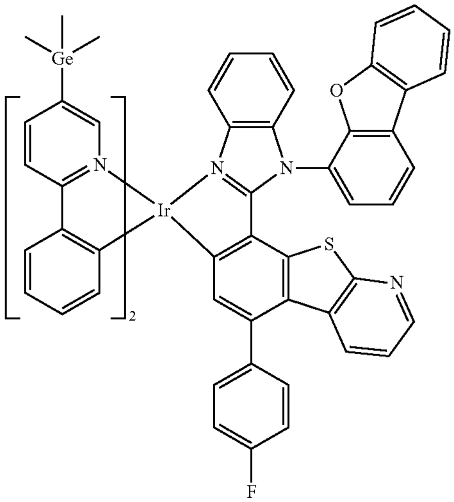
3784
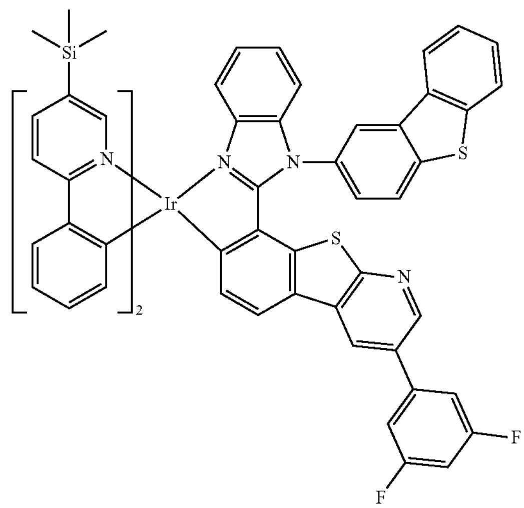
3785
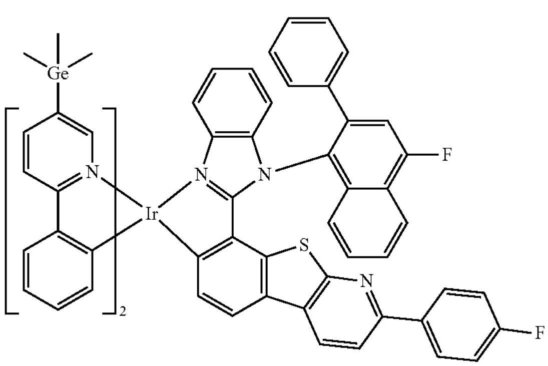
3786
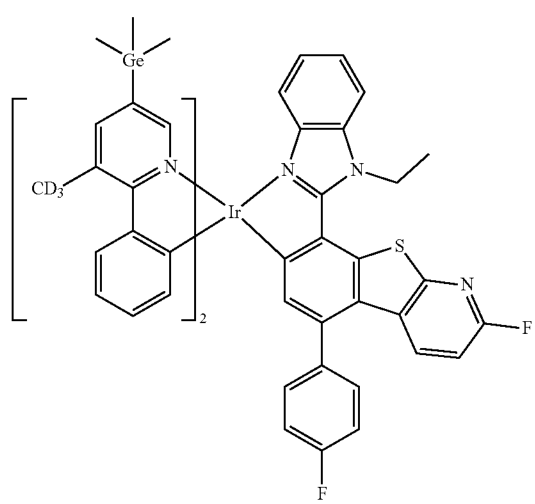

-continued
3787
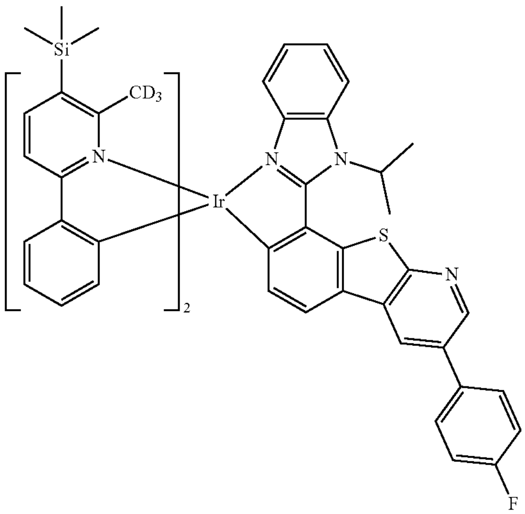
3788
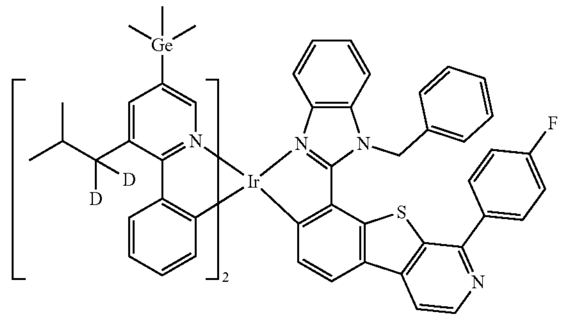
3789
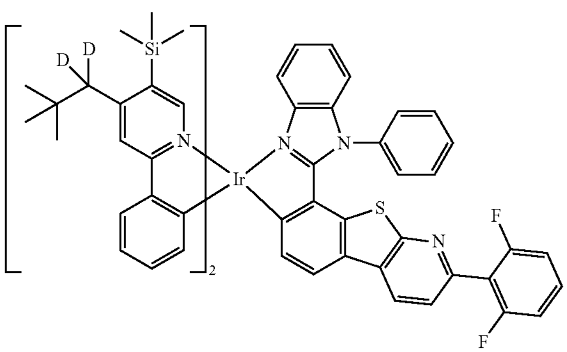
3790
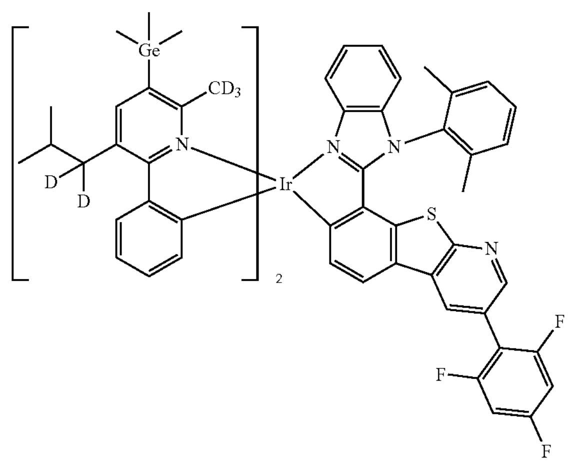
3791
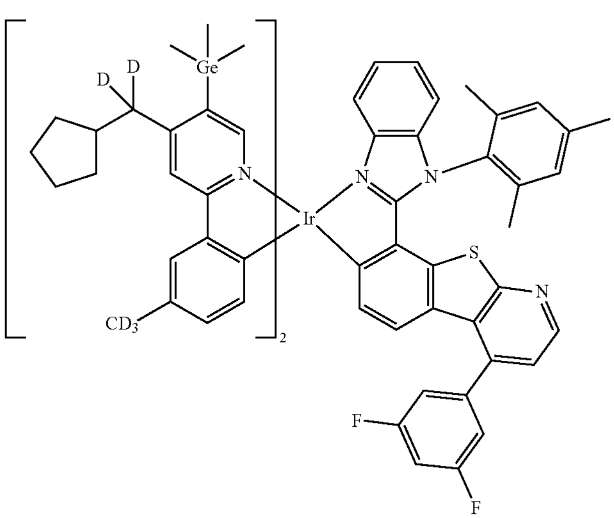

-continued
3792
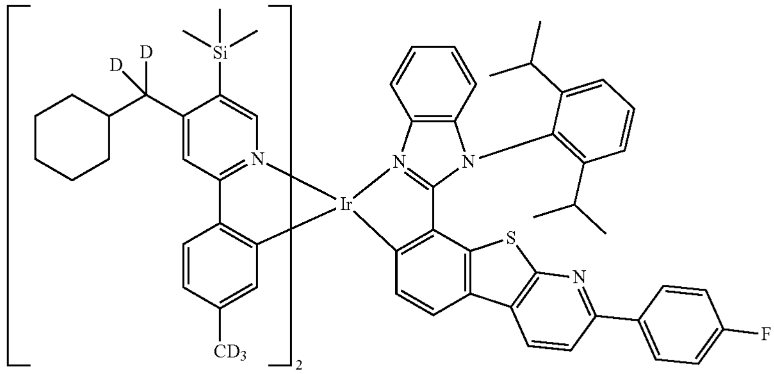
3793
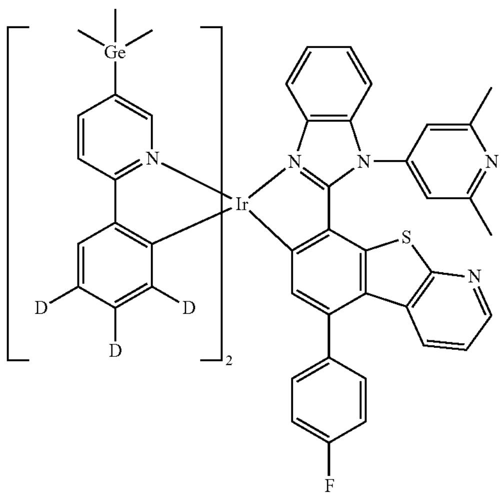
3794
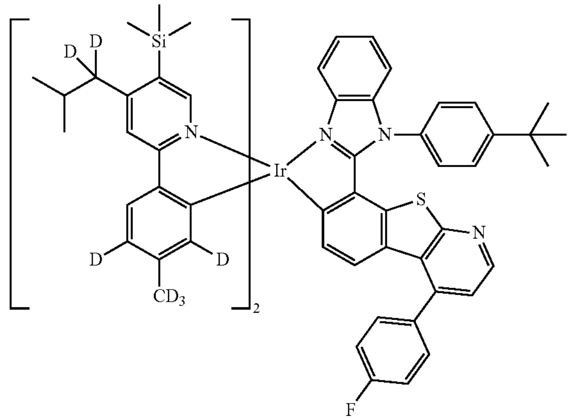
3795
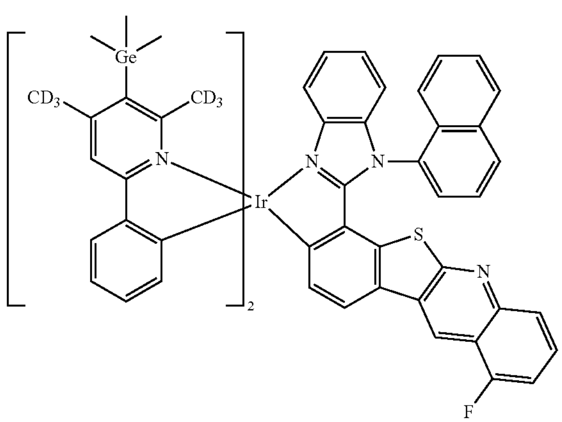
3796
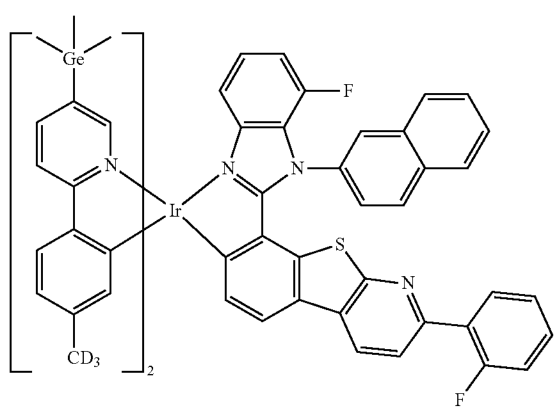

-continued
3797
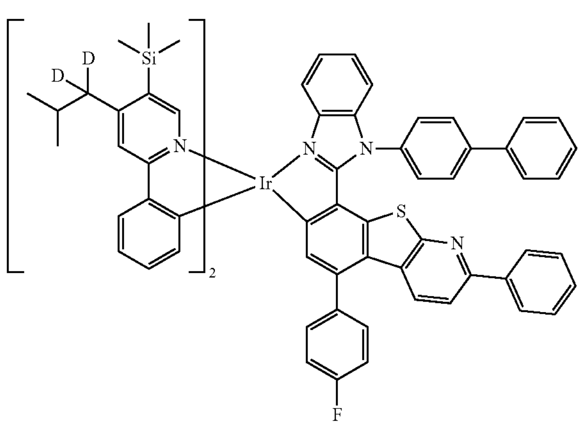
3798
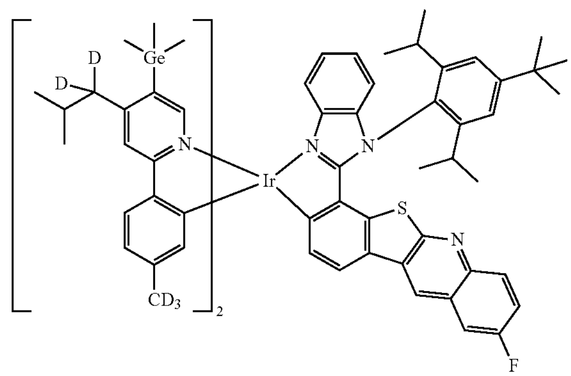
3799
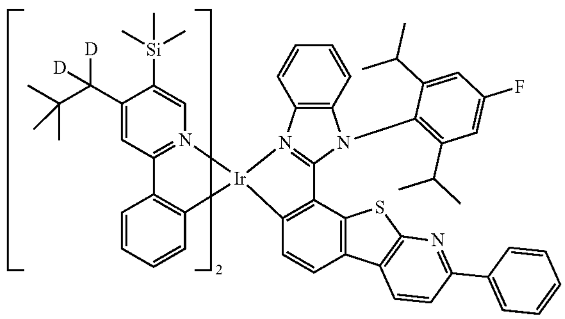
3800
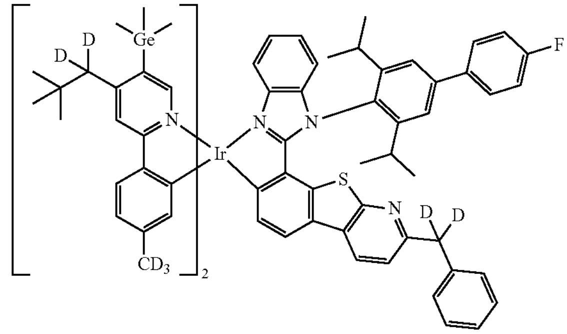
3801
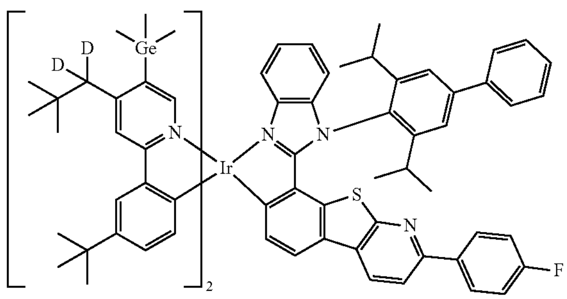
3802
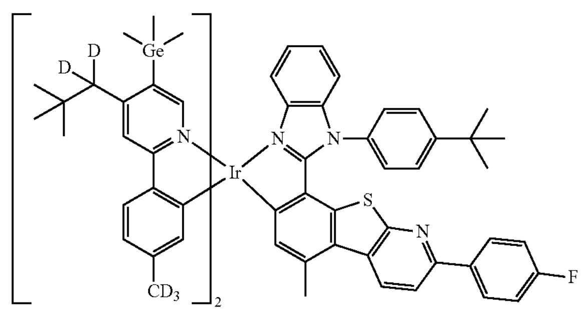
3803
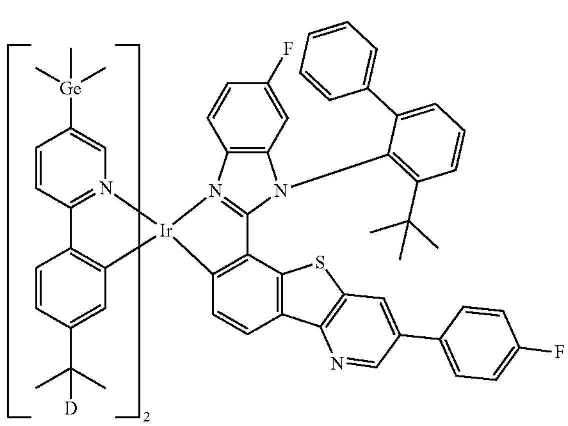
3804
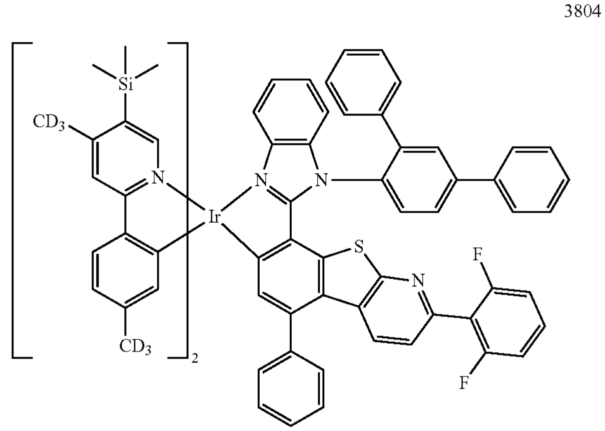

-continued
3805
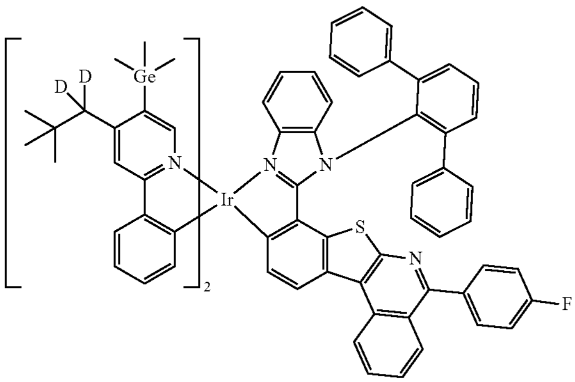
3806
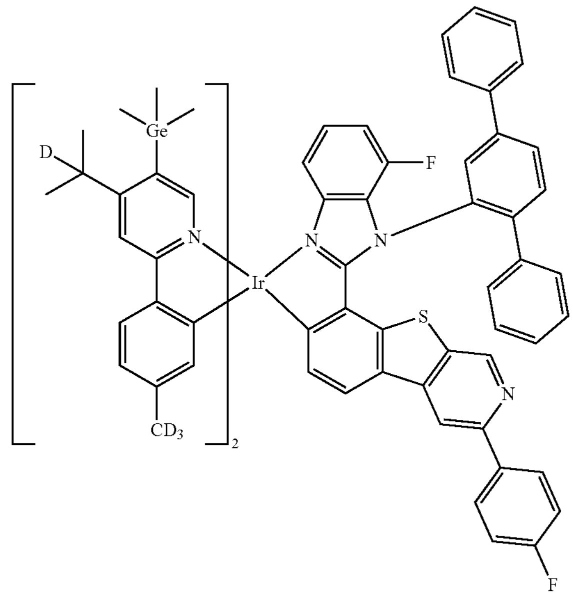
3807
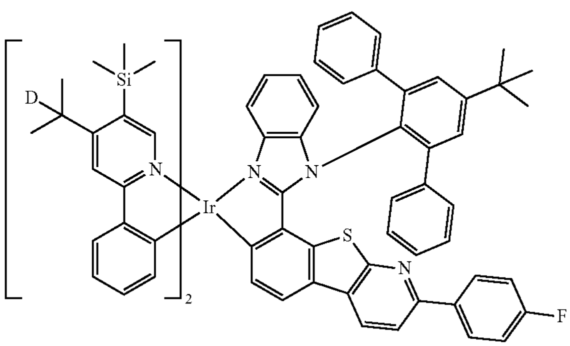
3808
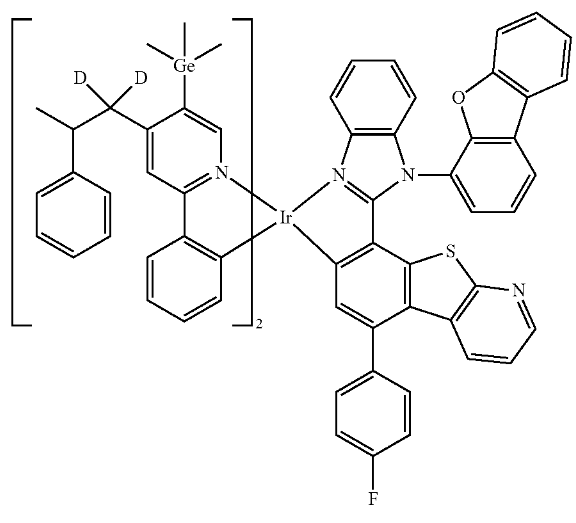
3809
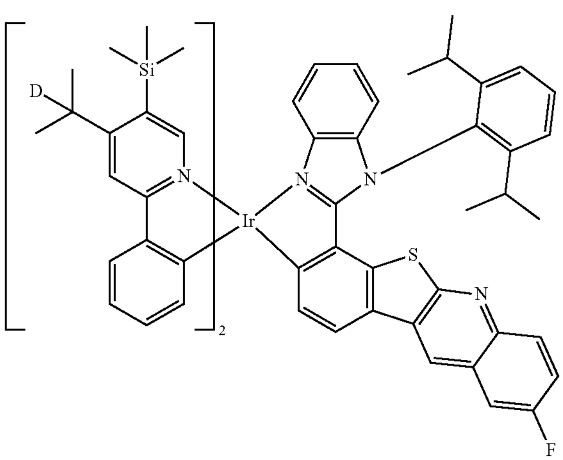
3810
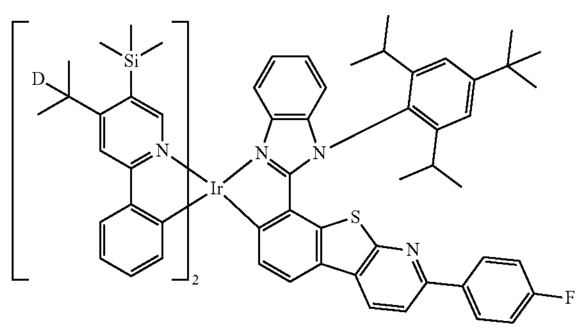

-continued
3811
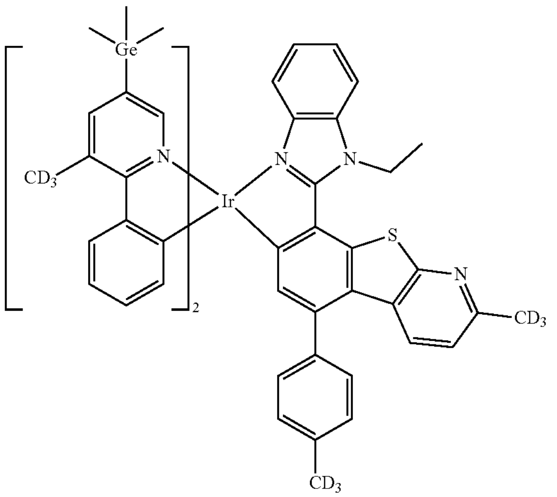
3812
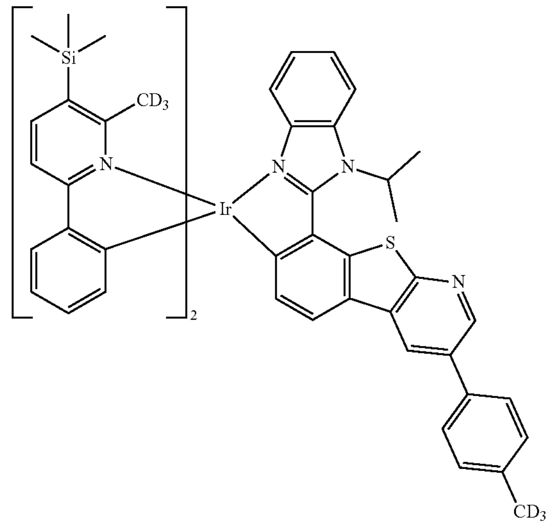
3813
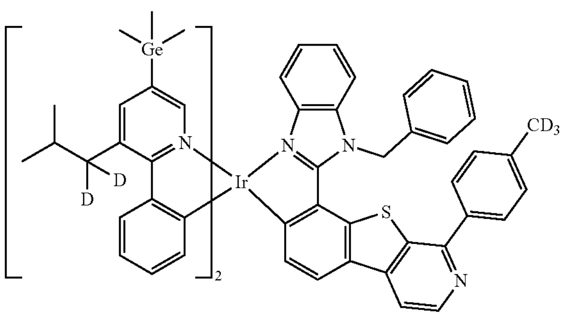
3814
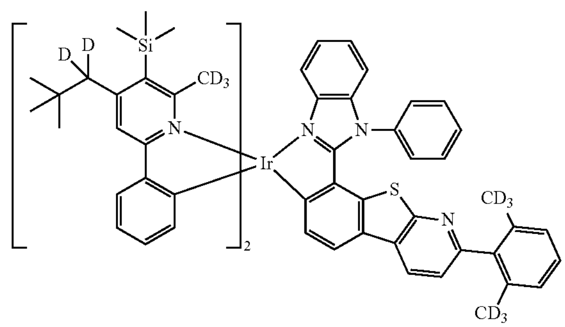
3815
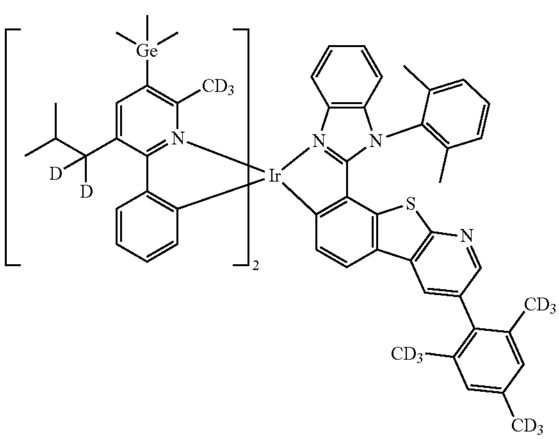
3816
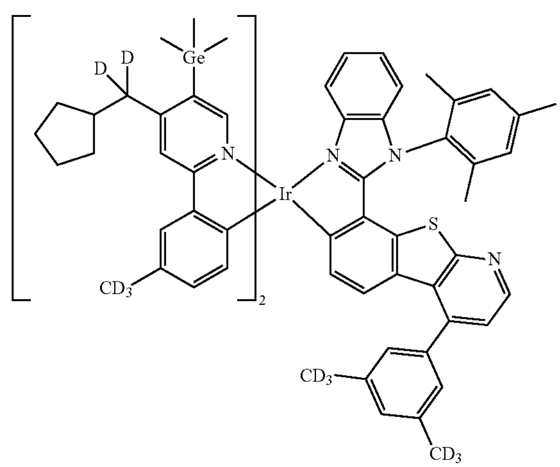

-continued
3817
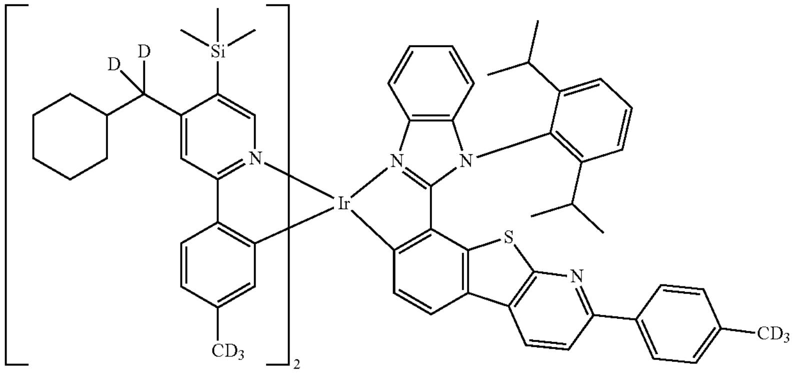
3818
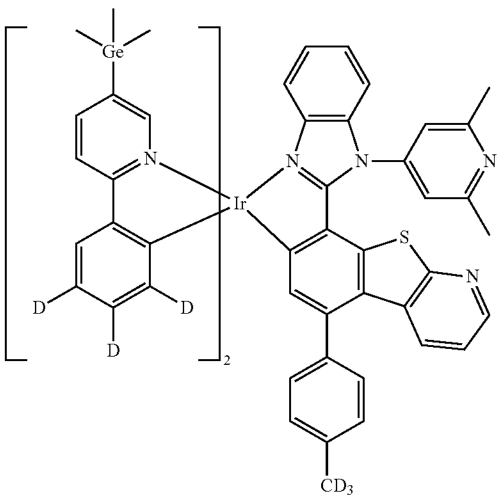
3819
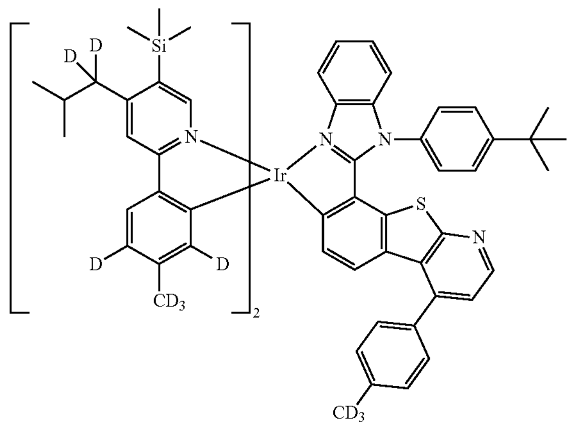
3820
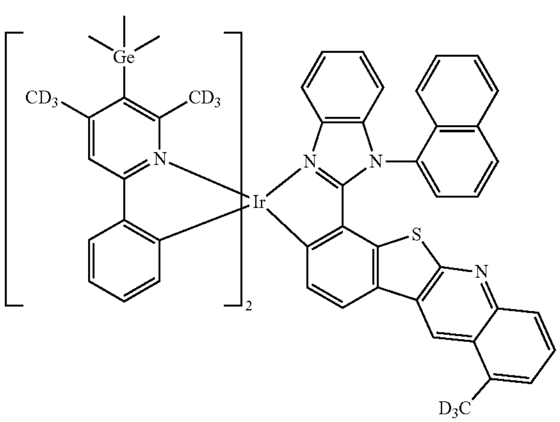
3821
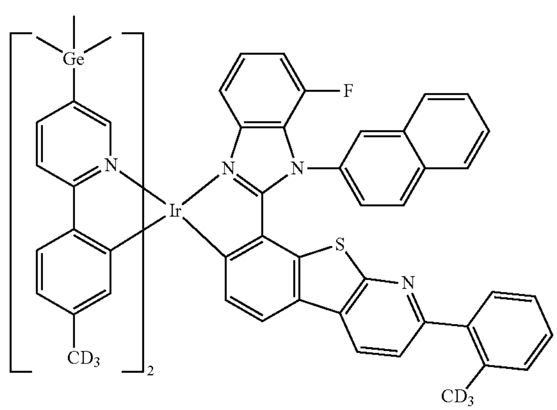

-continued
3822
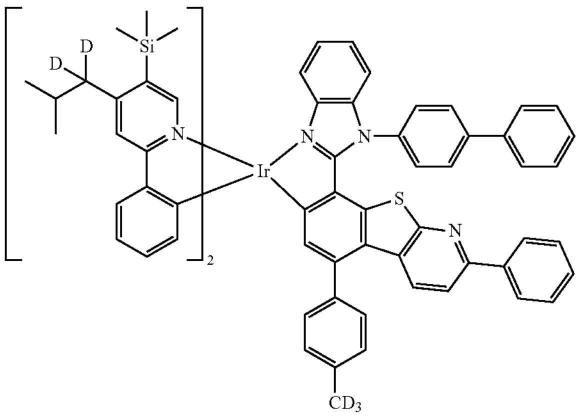
3823
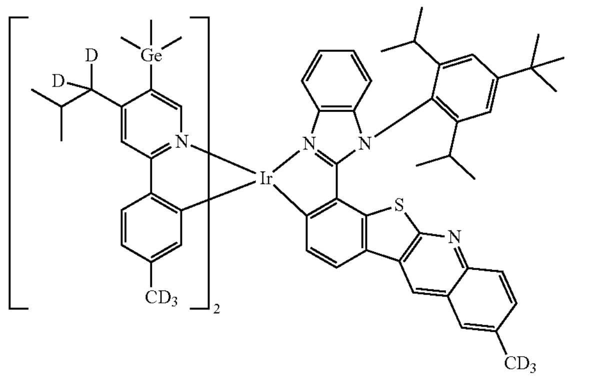
3824
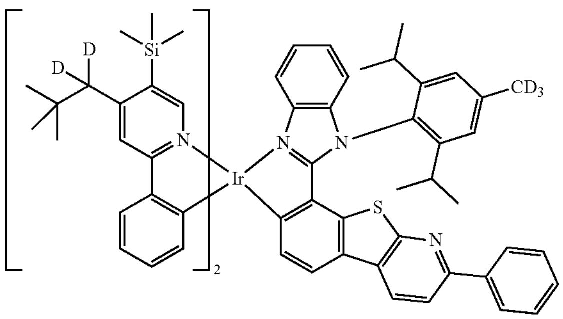
3825
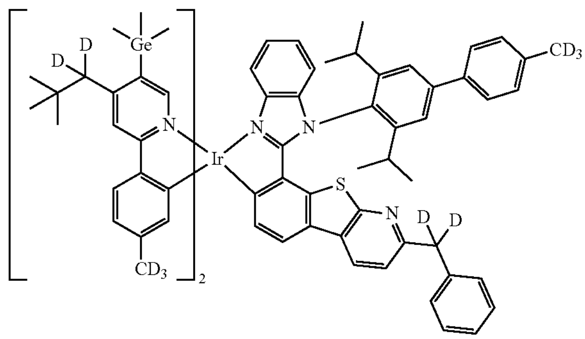
3826
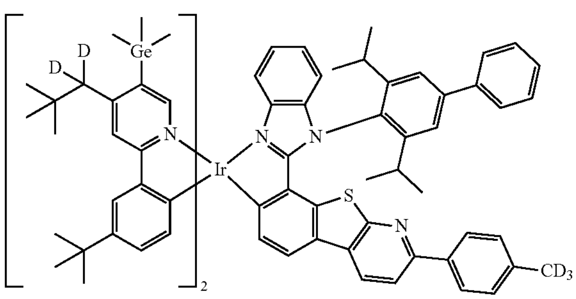
3827
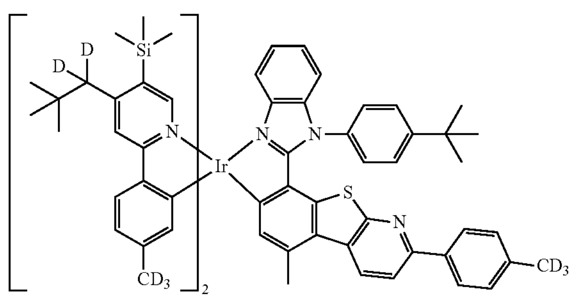
3828
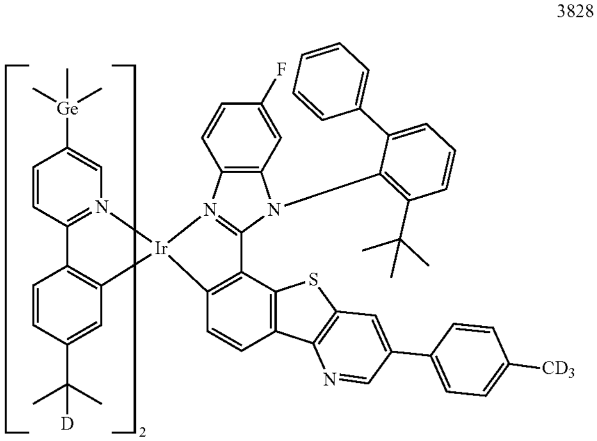
3829
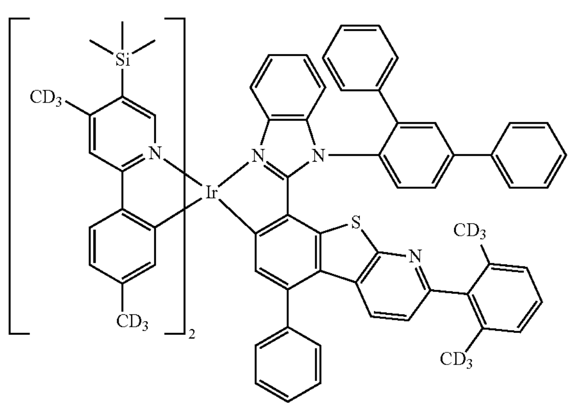

-continued
3830
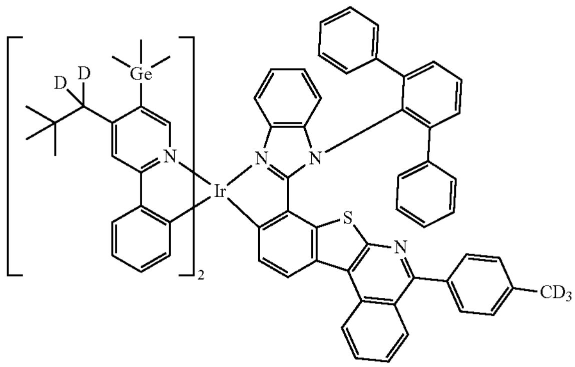
3831
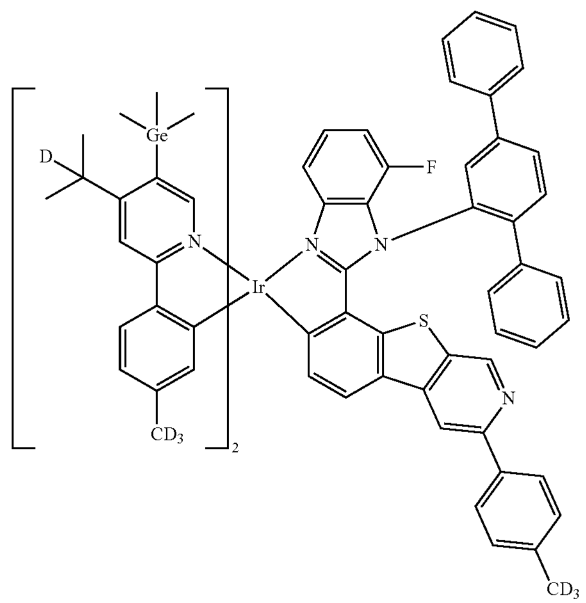
3832
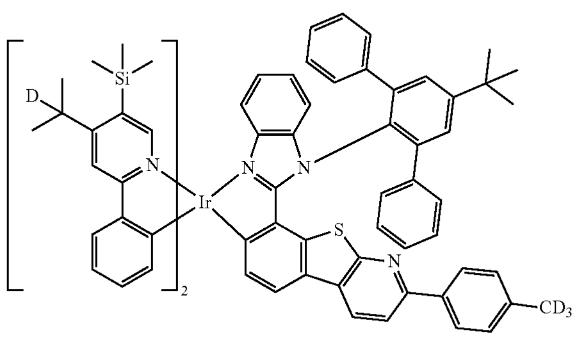
3833
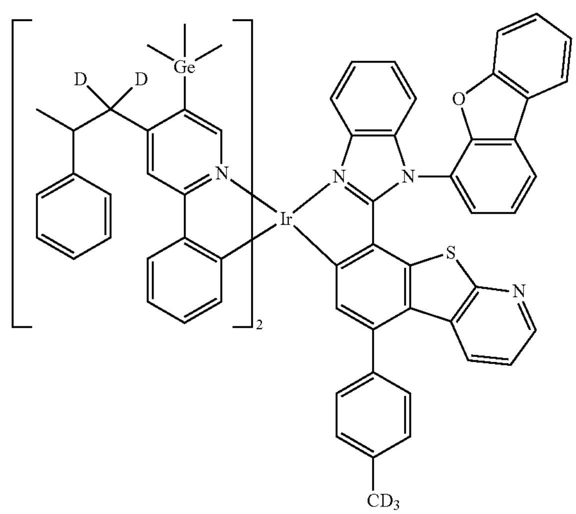
3834
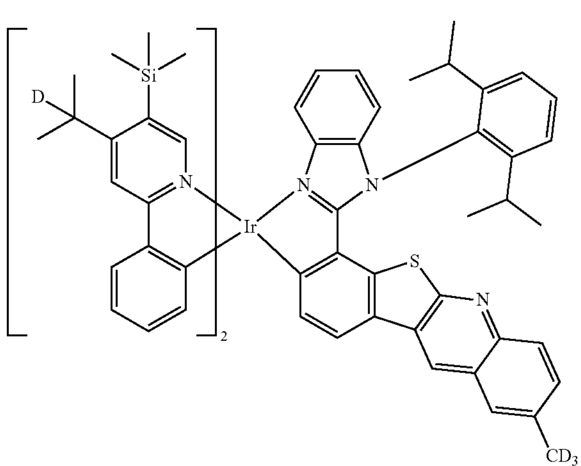
3835
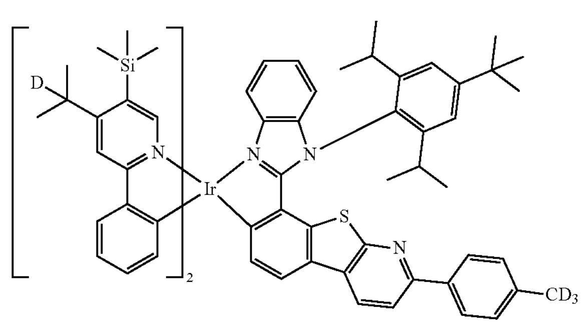

-continued
3836
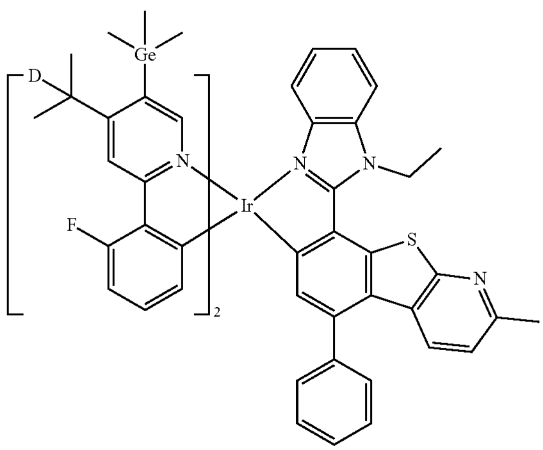
3837
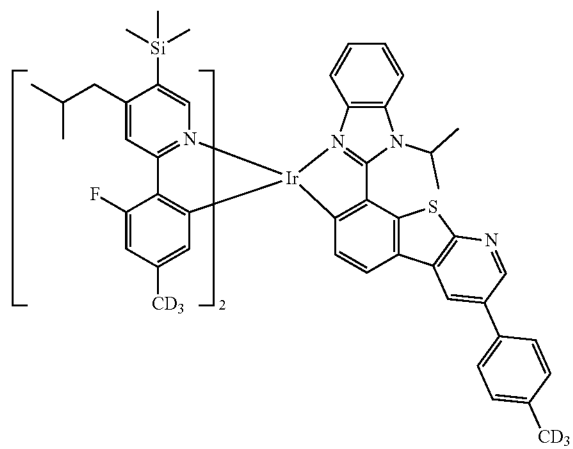
3838
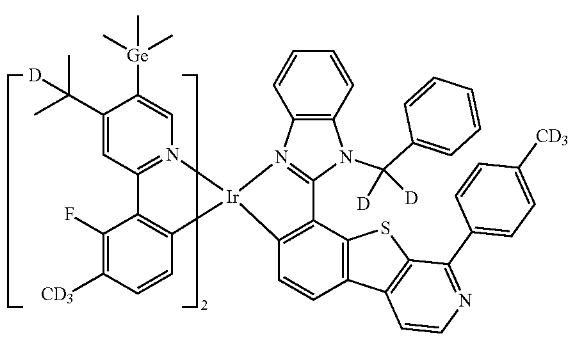
3839
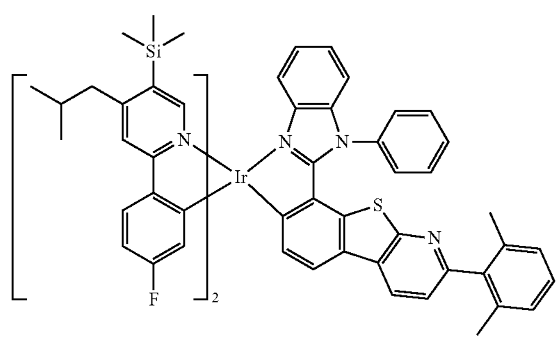
3840
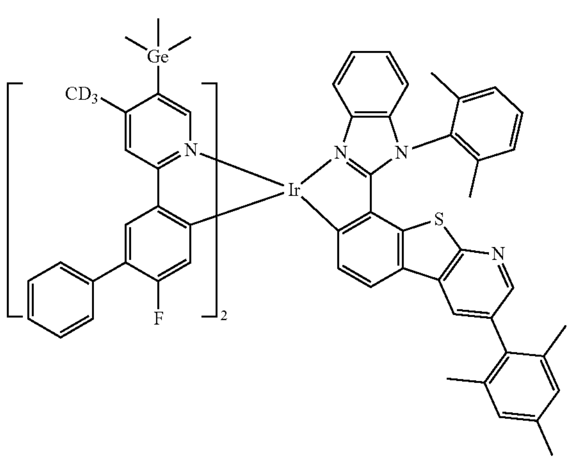
3841
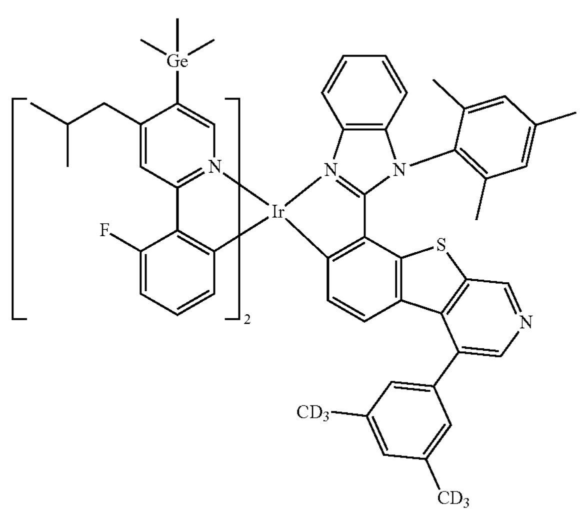

-continued
3842
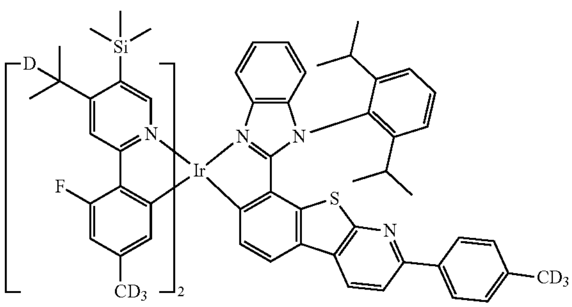
3843
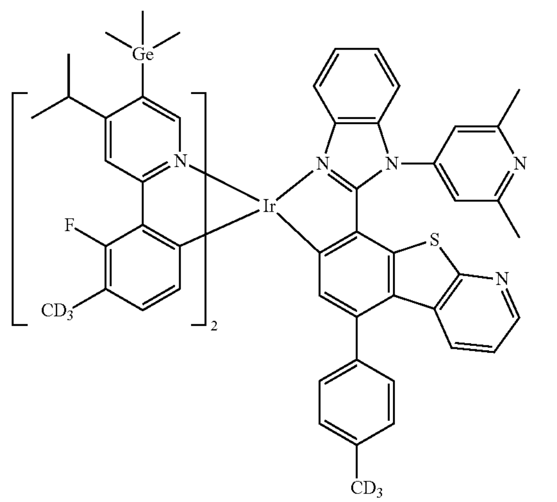
3844
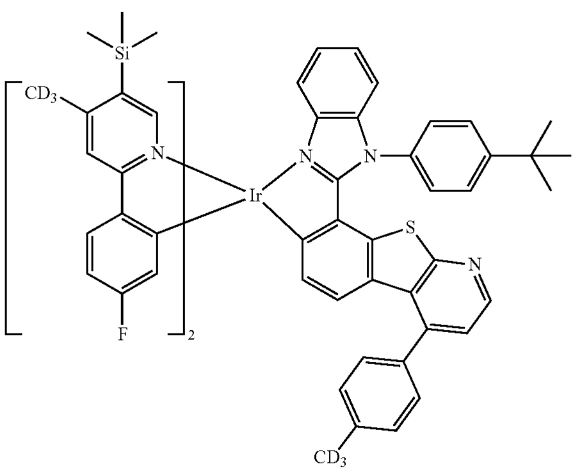
3845
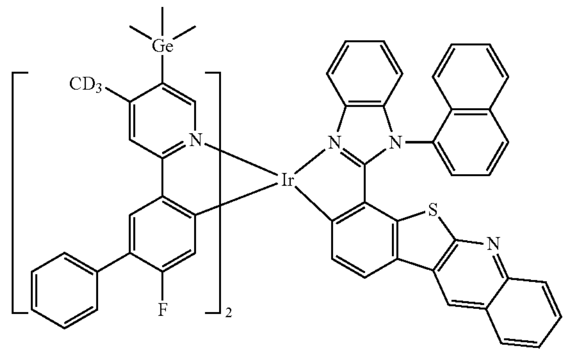
3846
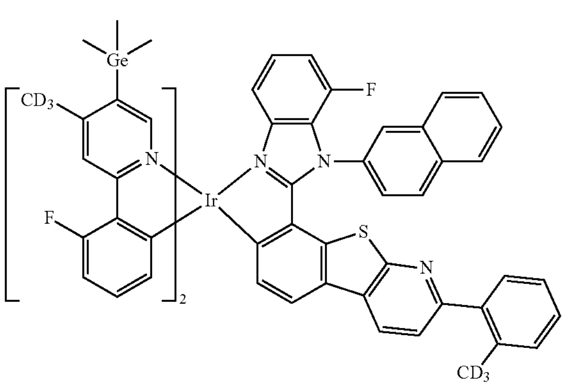
3847
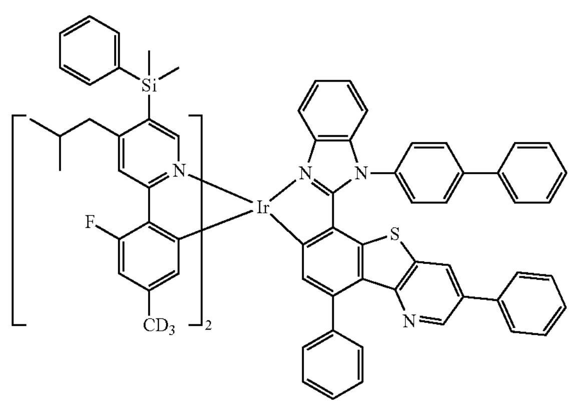

-continued
3848
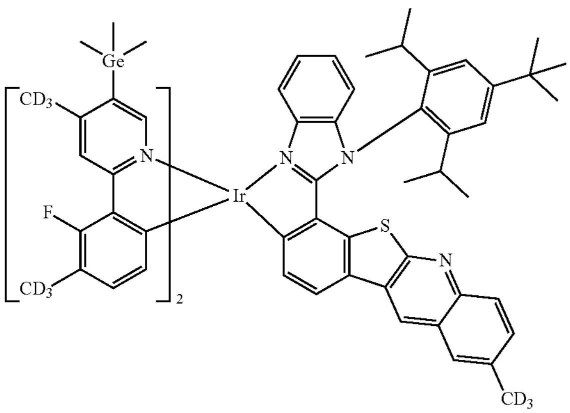
3849
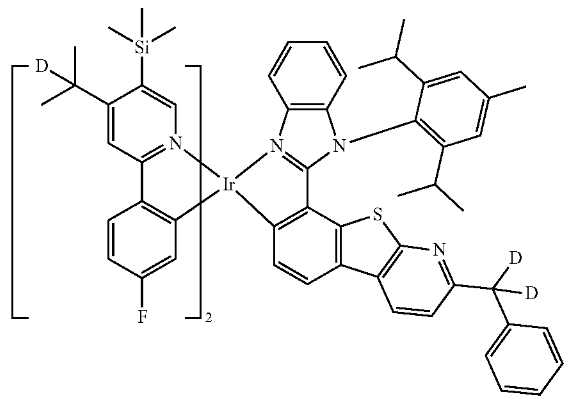
3850
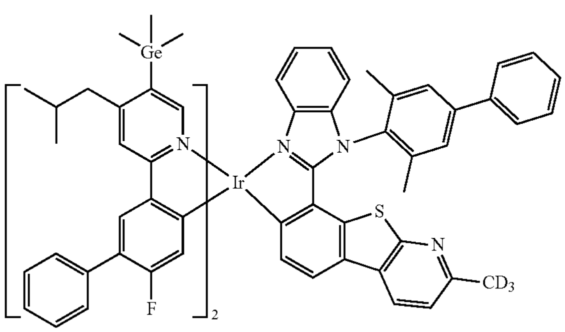
3851
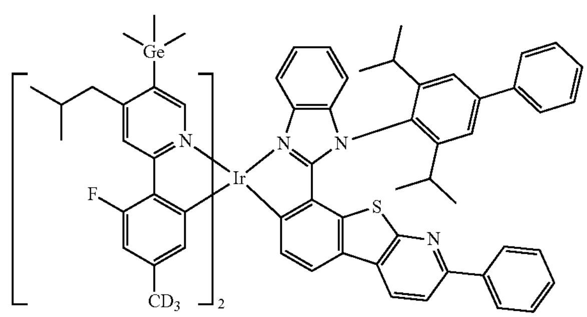
3852
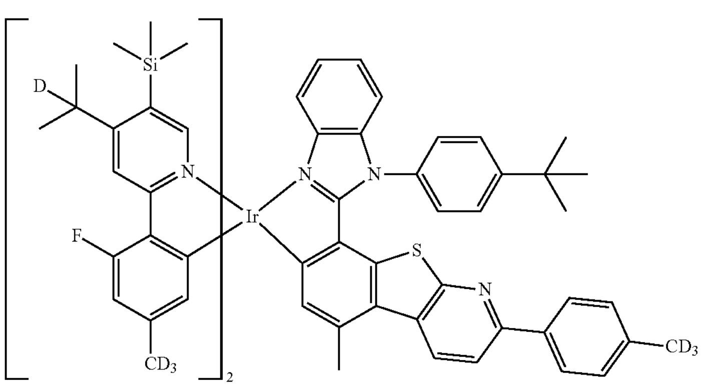

3853
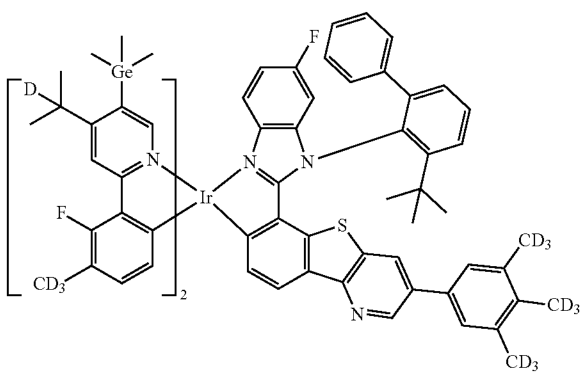
3854
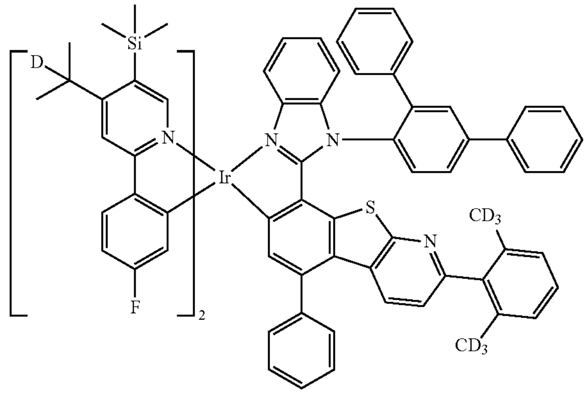
3855
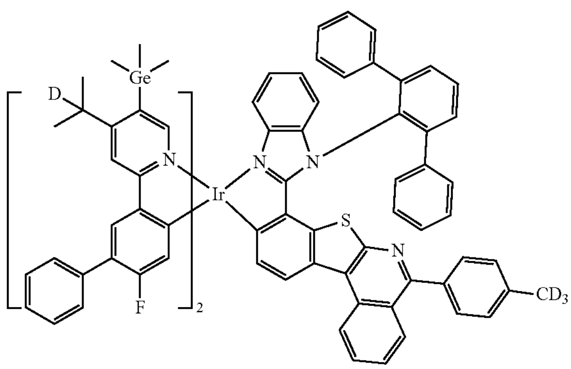
3856
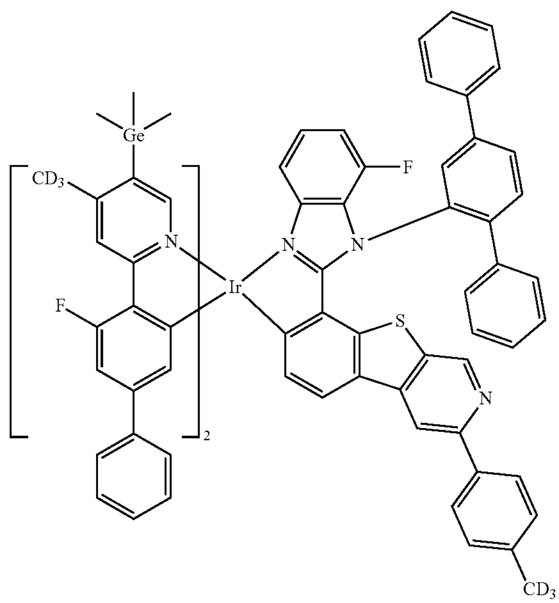
3857
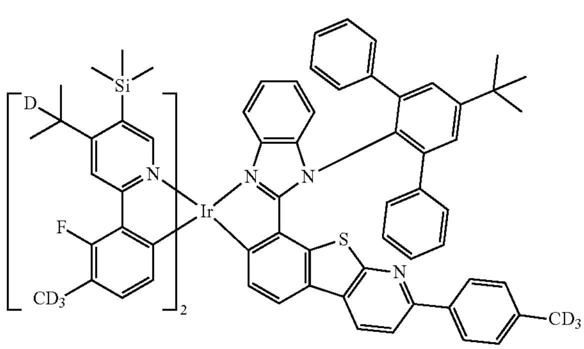
3858
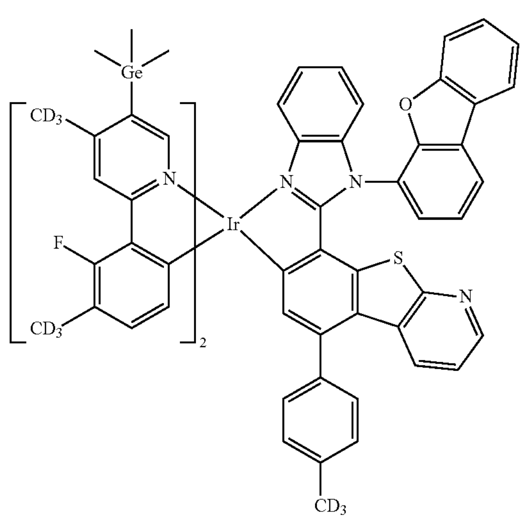

-continued
3859
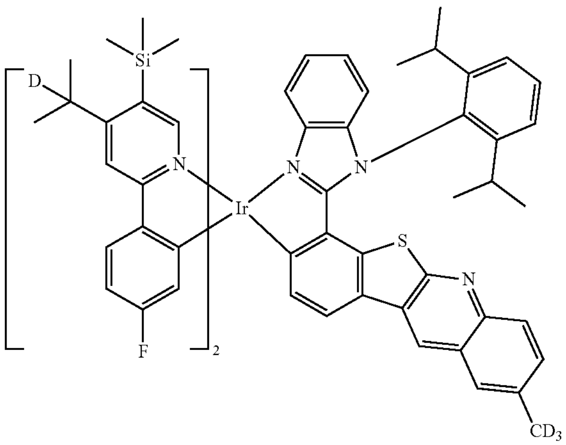
3860
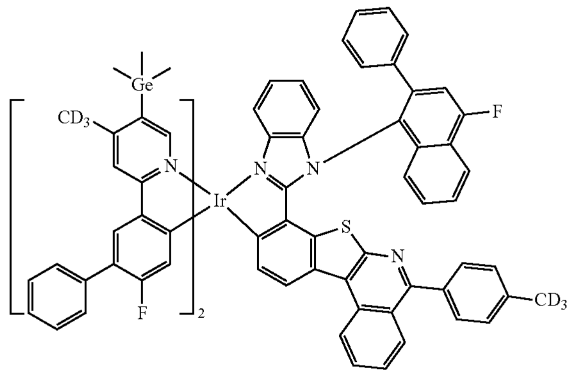
3861
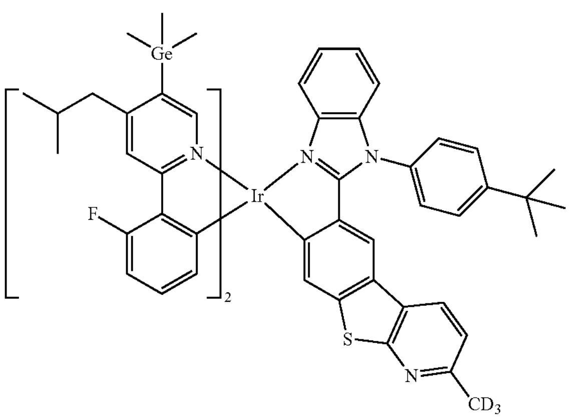
3862
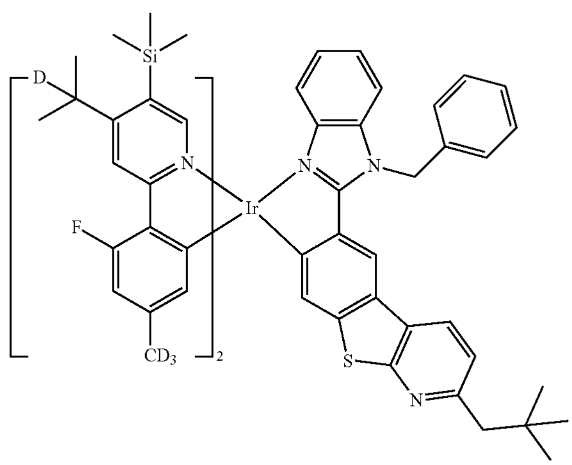
3863
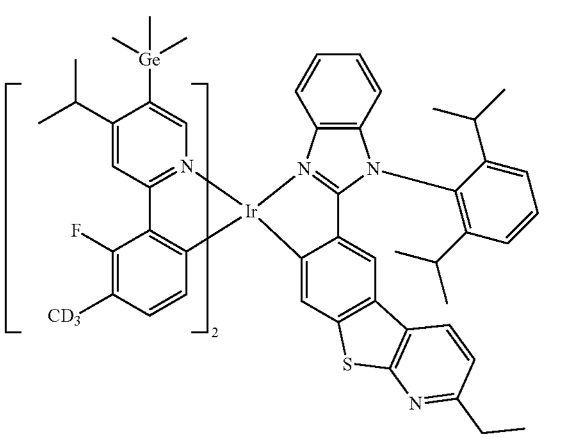
3864
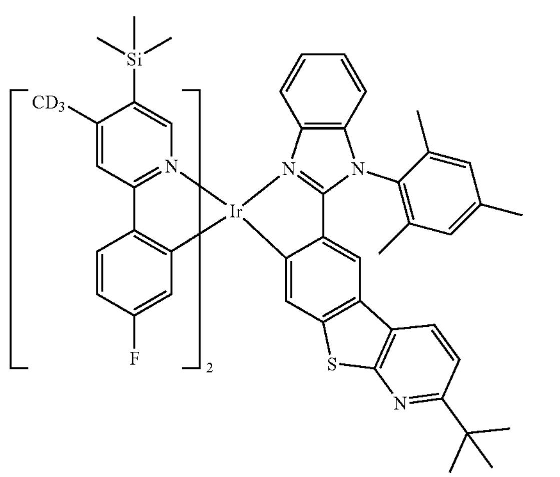

-continued
3865
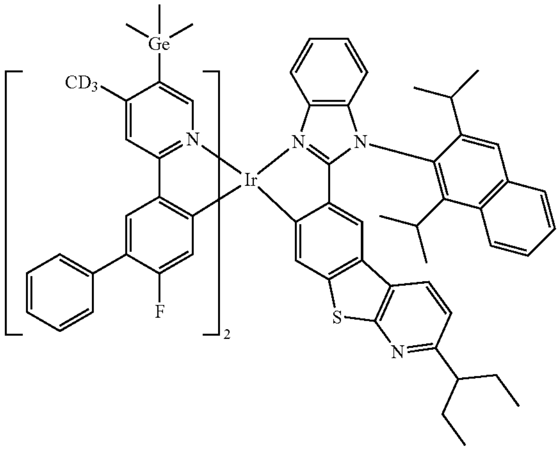
3866
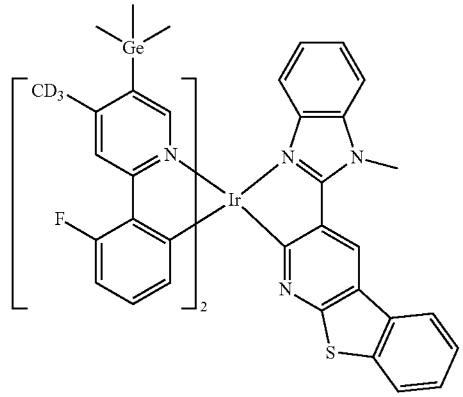
3867
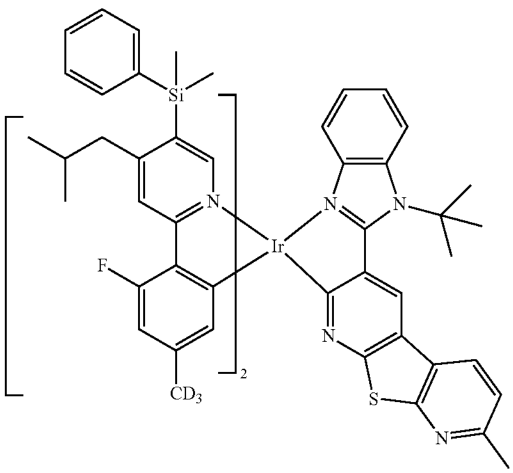
3868
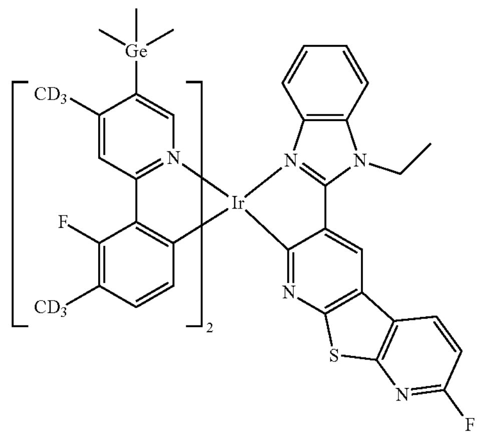
3869
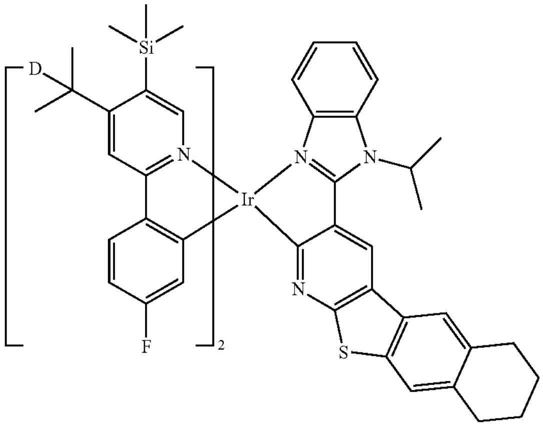
3870
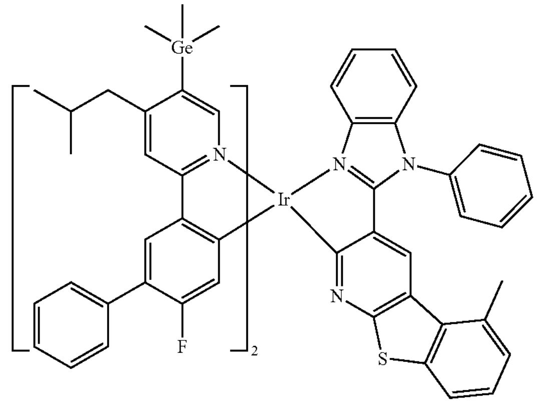

-continued
3871
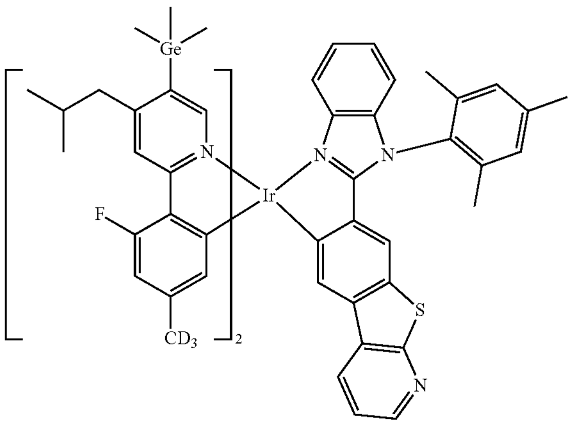
3872
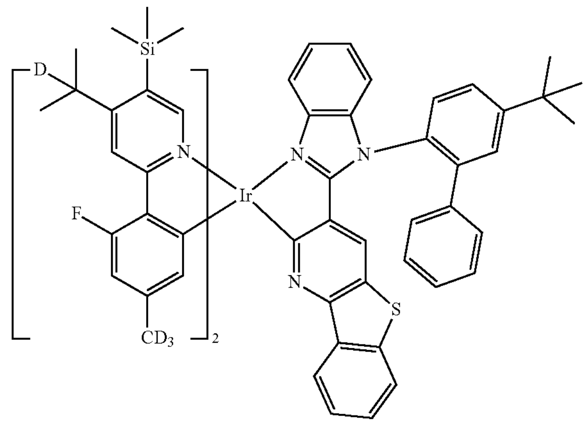
3873
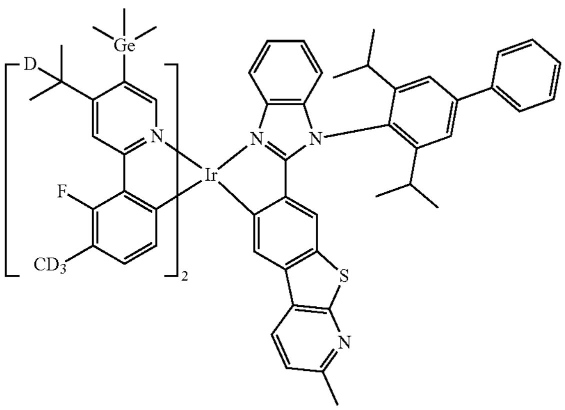
3874
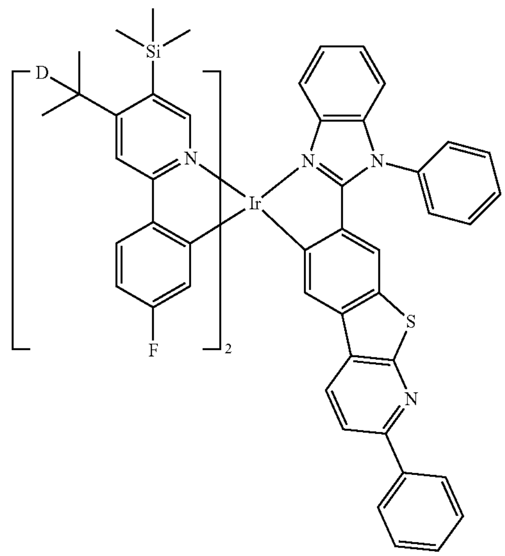
3875
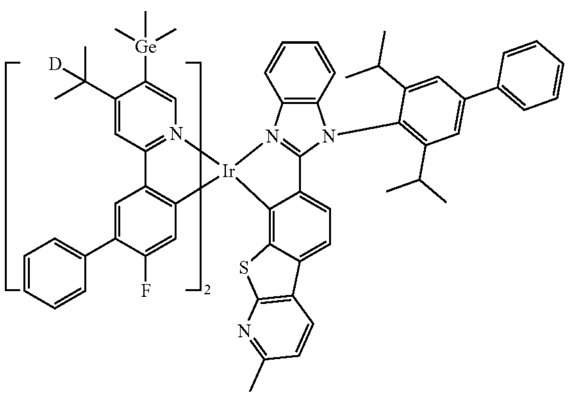
3876
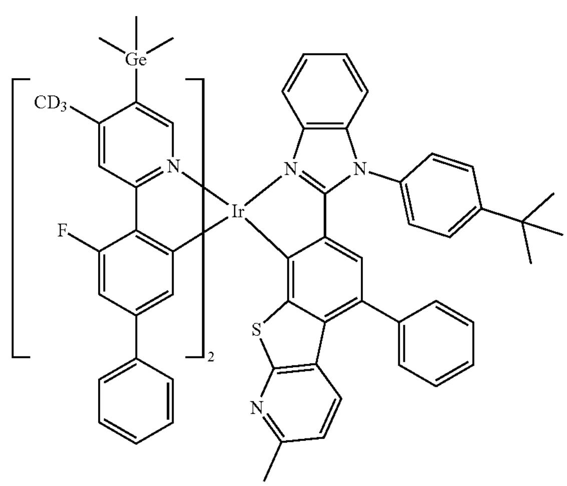

-continued
3877
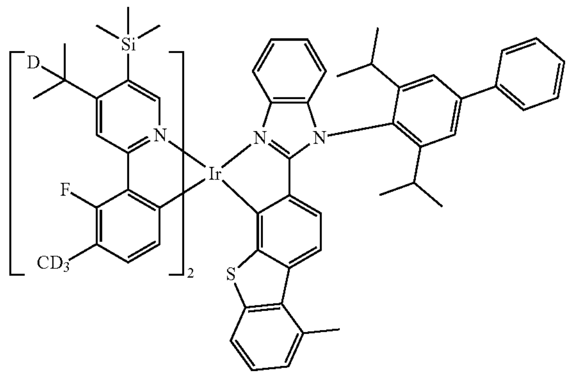
3878
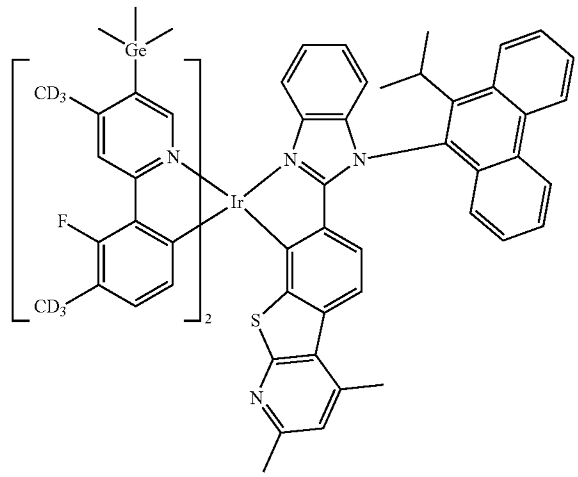
3879
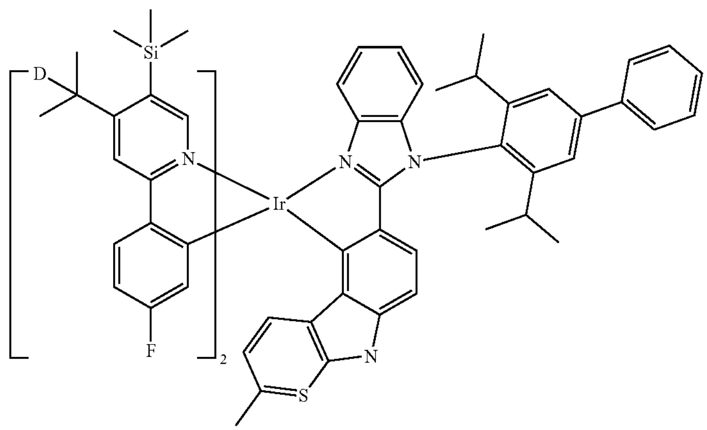
3880
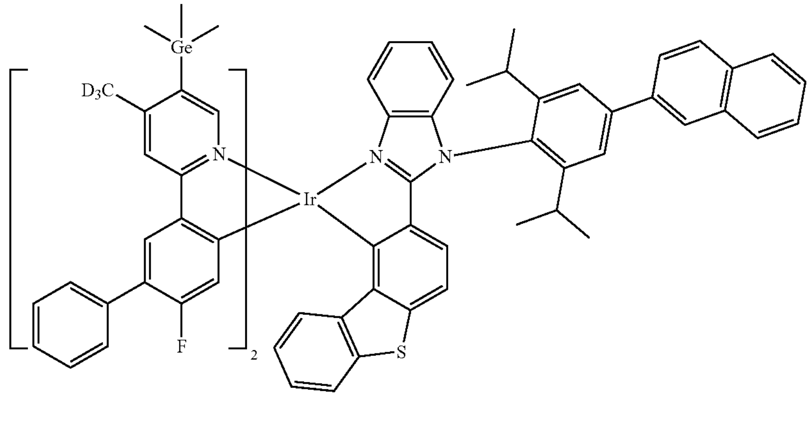

-continued
3881
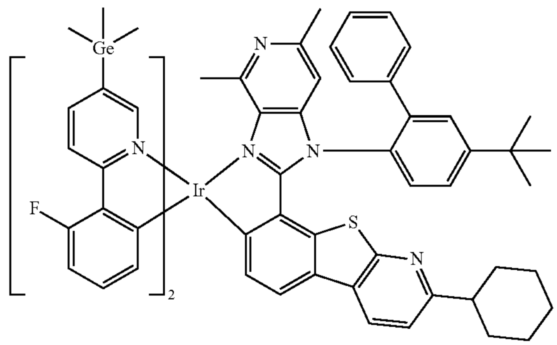
3882
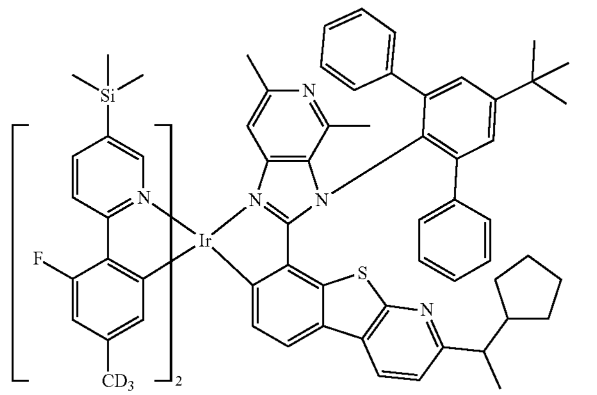
3883
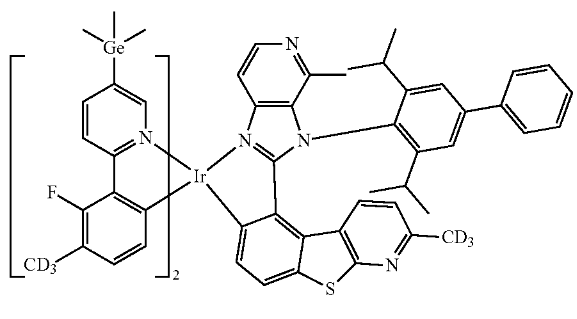
3884
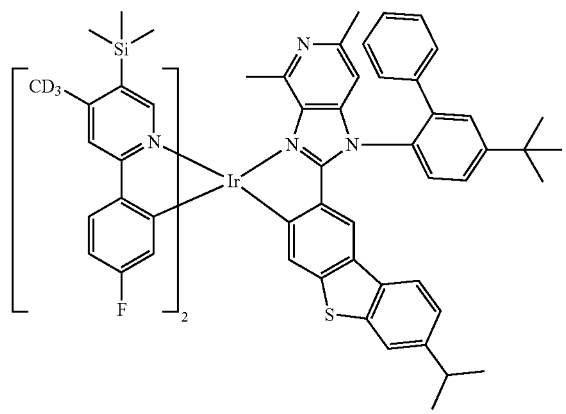
3885
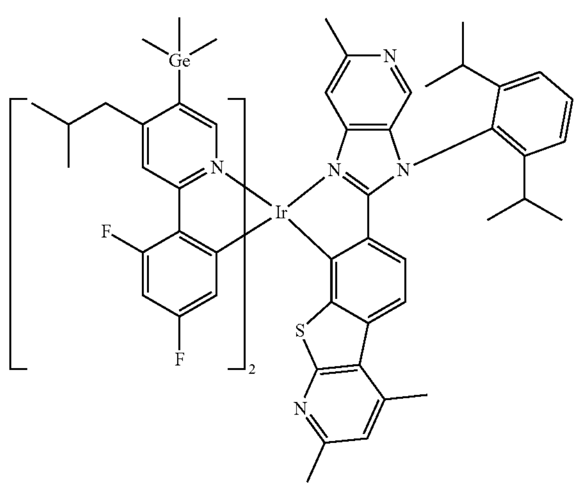
3886
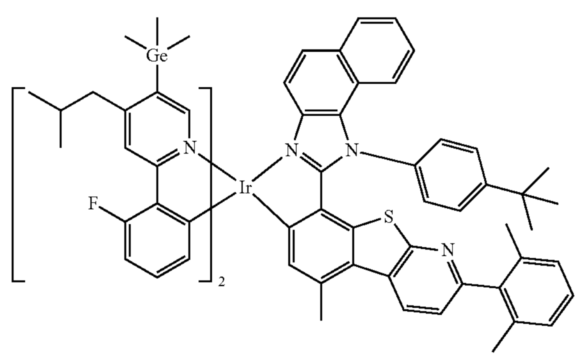

-continued
3887
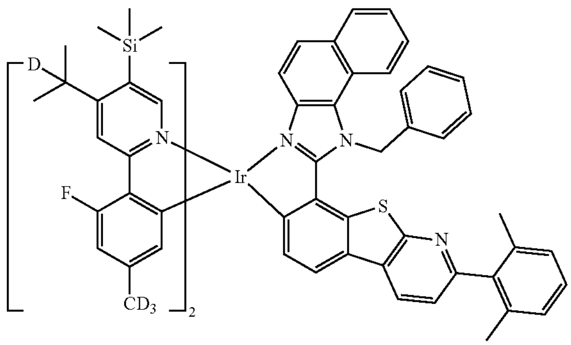
3888
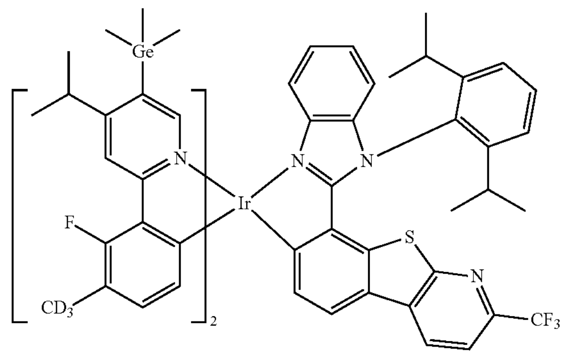
3889
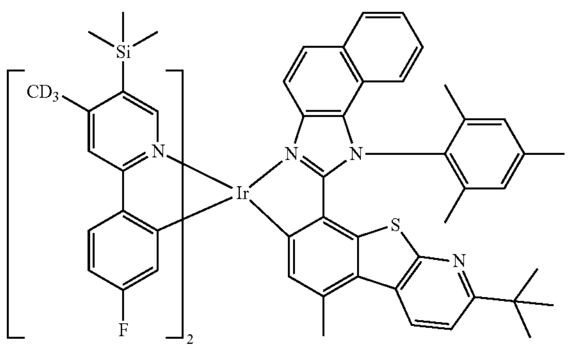
3890
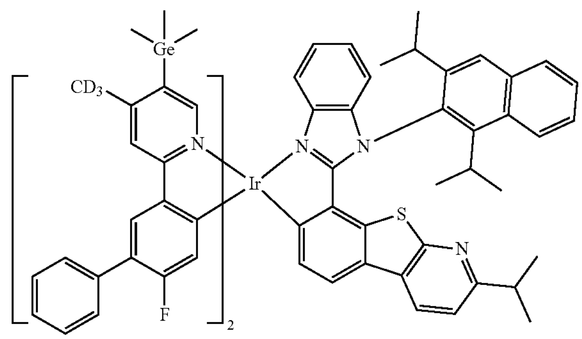
3891
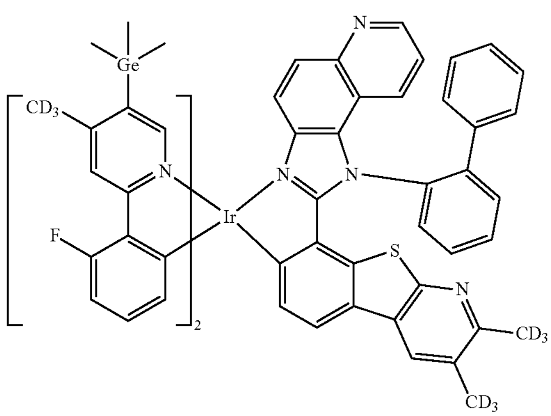
3892
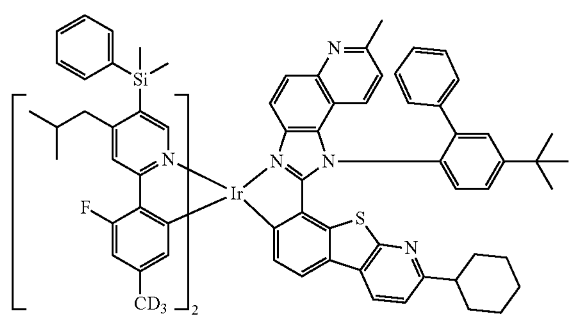
3893
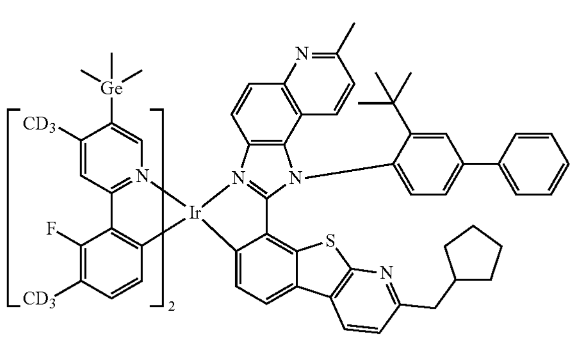
3894
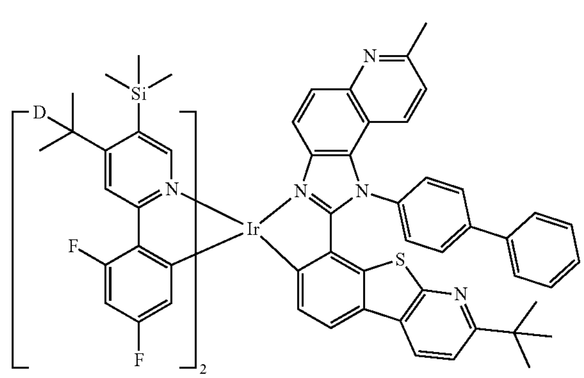

-continued
3895
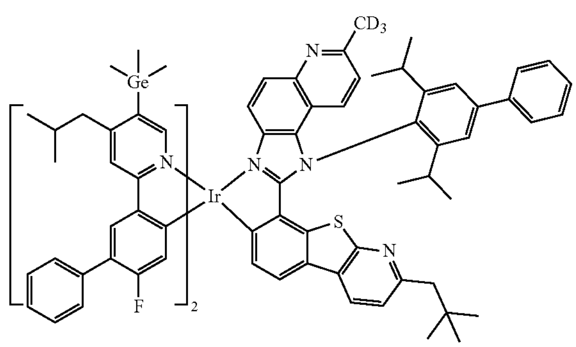
3896
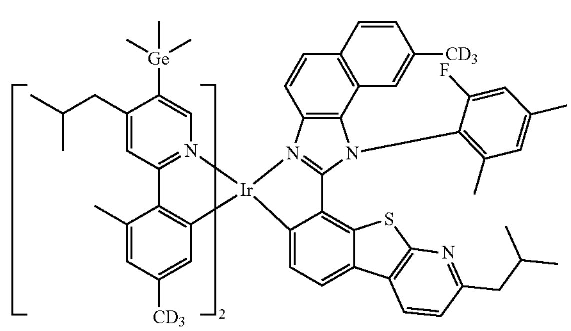
3897
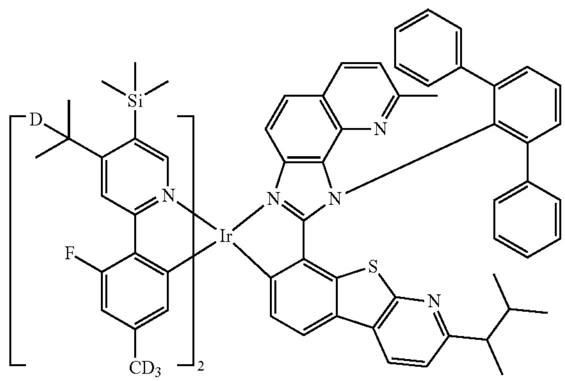
3898
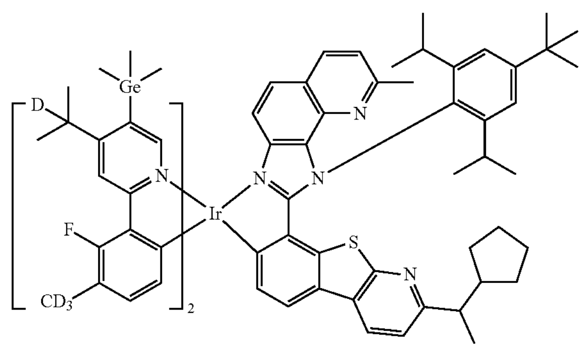
3899
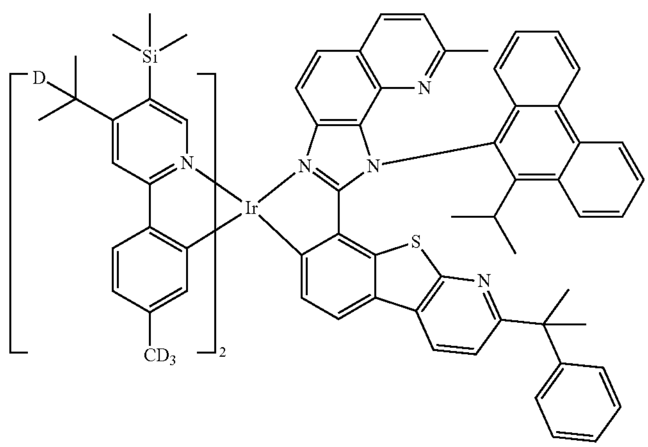
3900
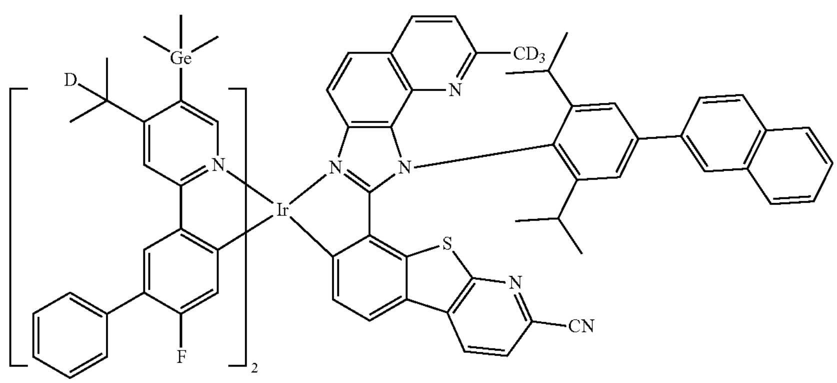

-continued
3901
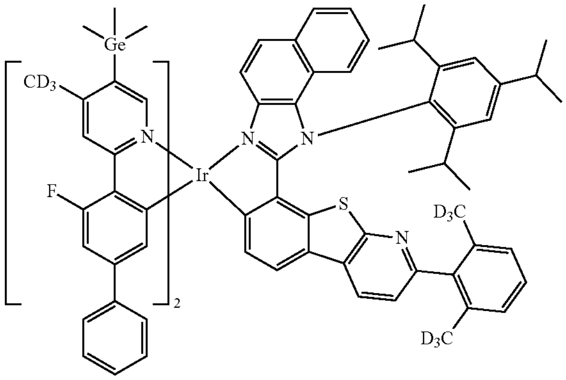
3902
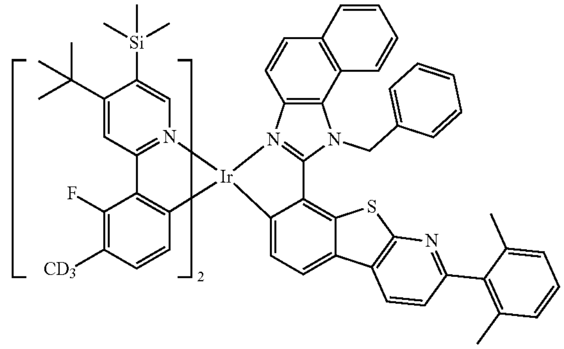
3903
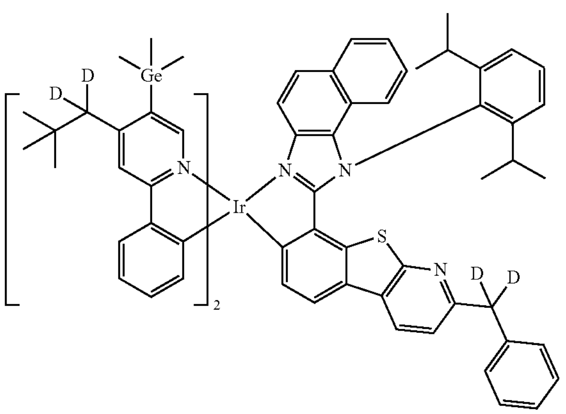
3904
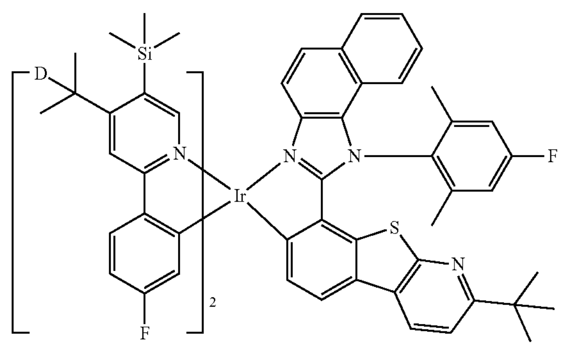
3905
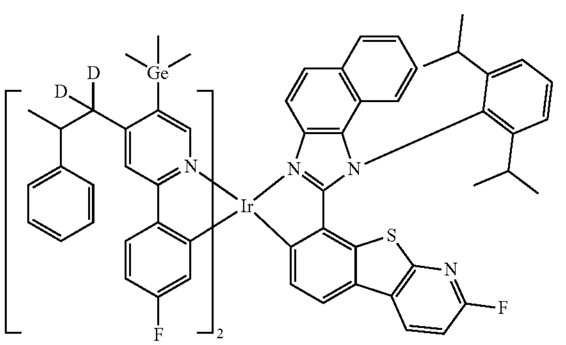
3906
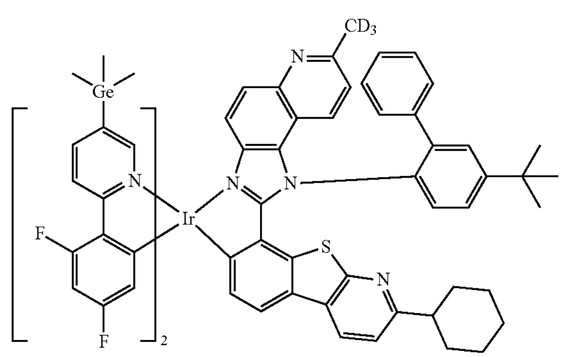
3907
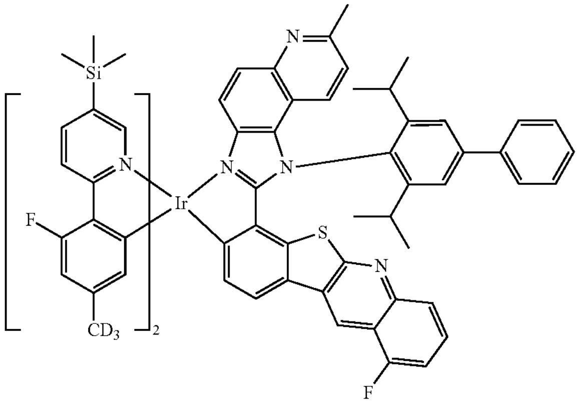
3908
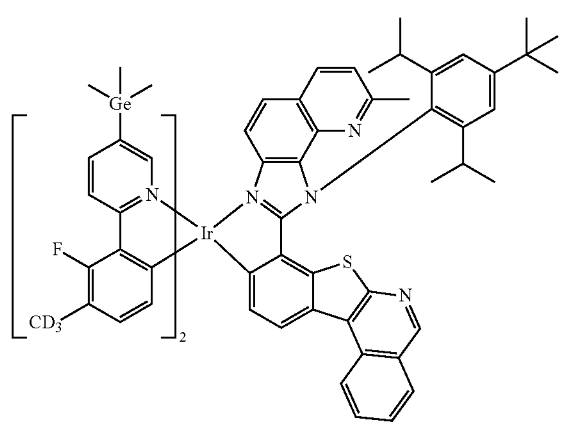

-continued
3909
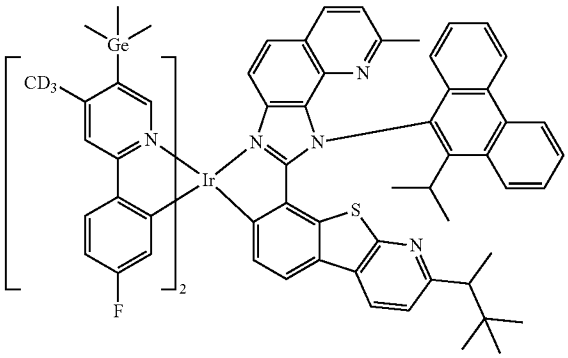
3910
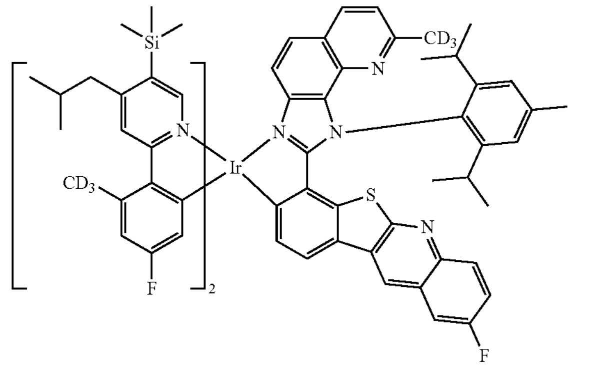
3911
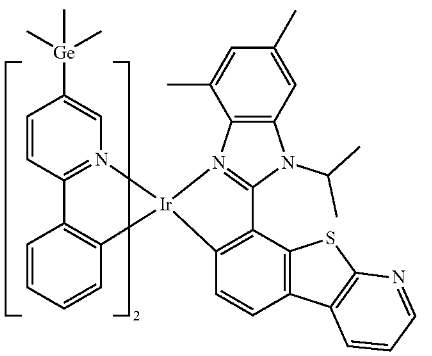
3912
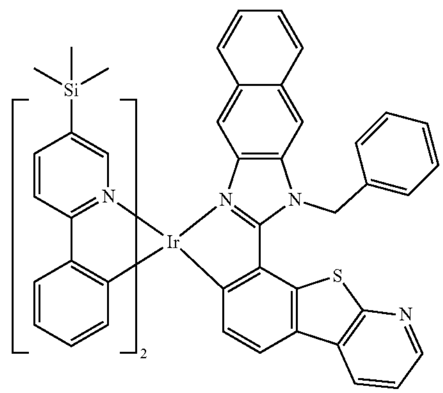
3913
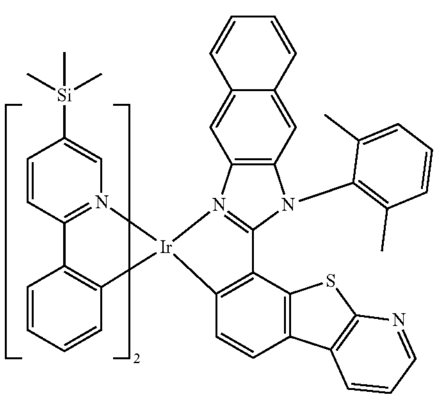
3914
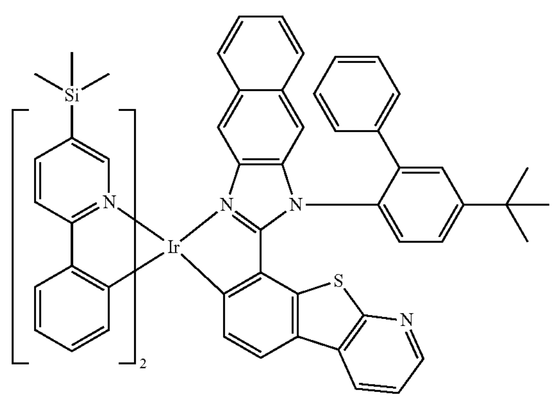
3915
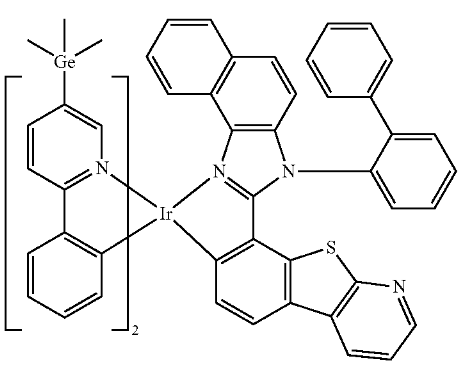
3916
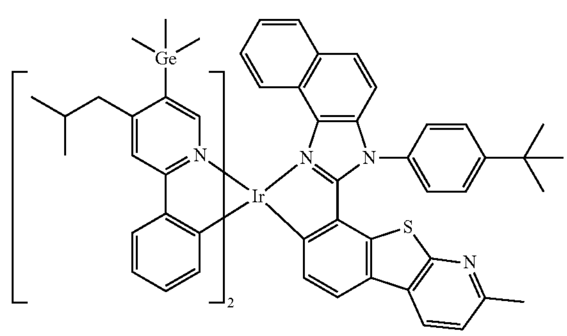

-continued
3917
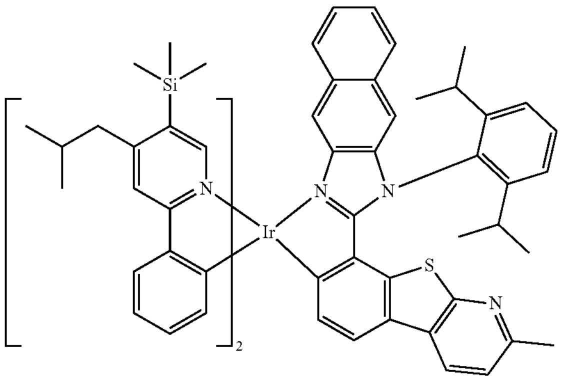
3918
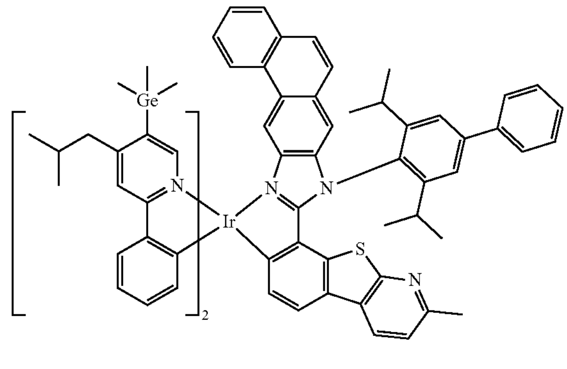
3919
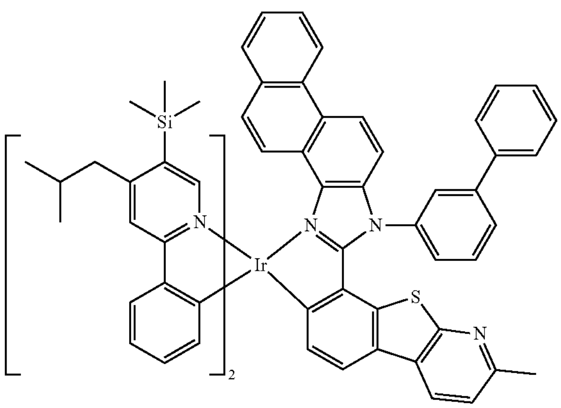
3920
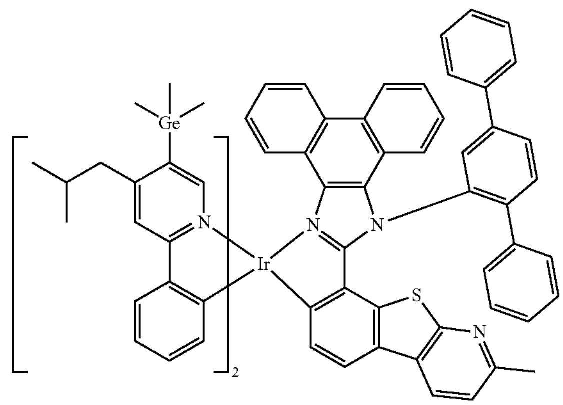
3921
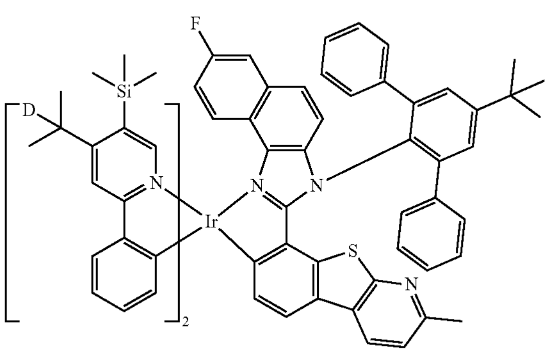
3922
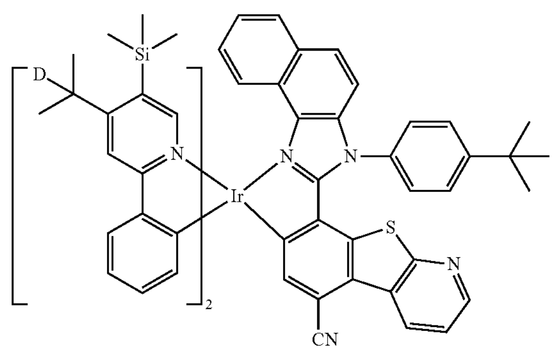
3923
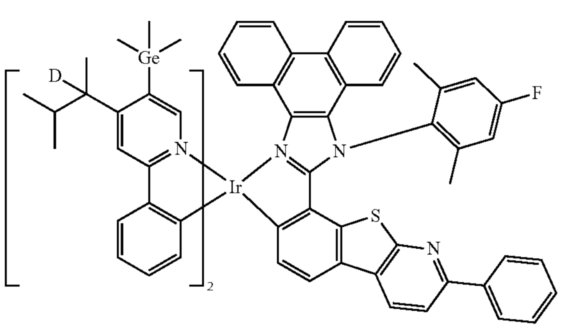
3924
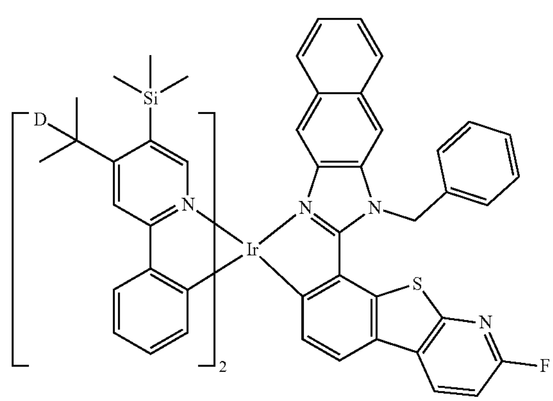

-continued
3925
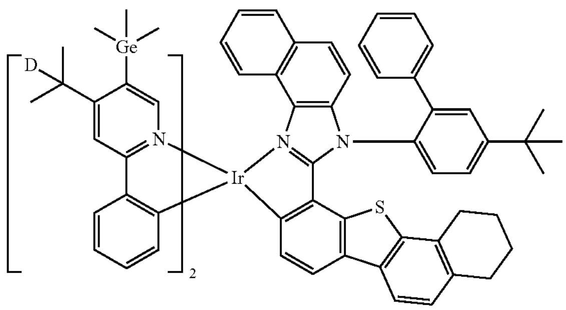
3926
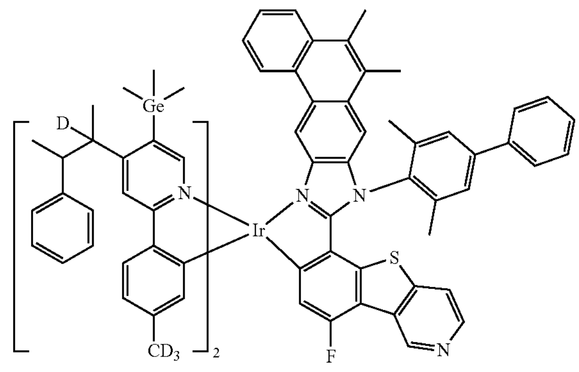
3927
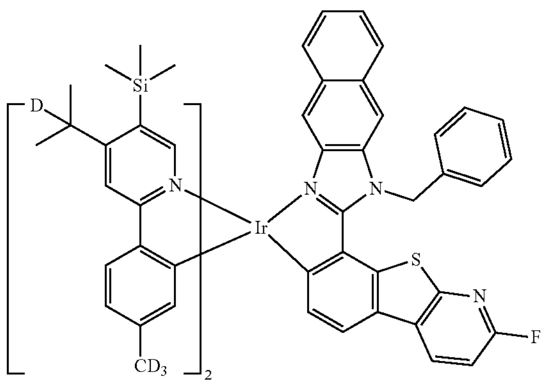
3928
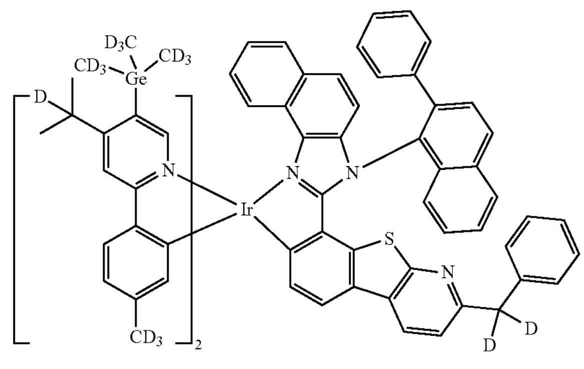
3929
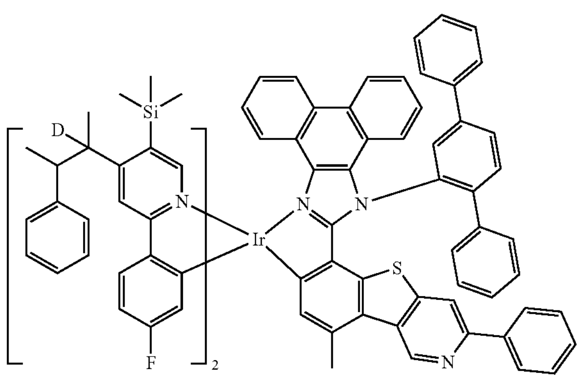
3930
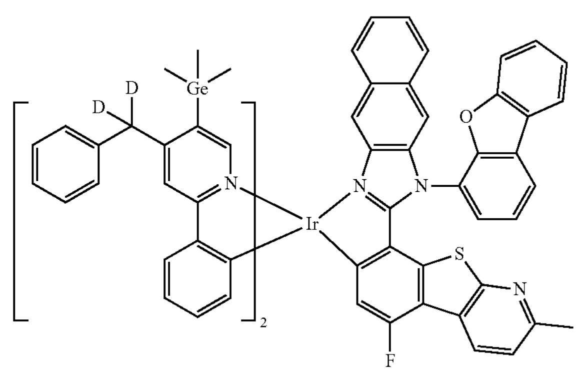
3931
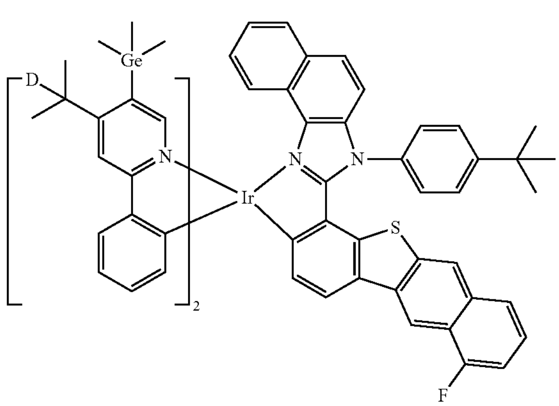
3932
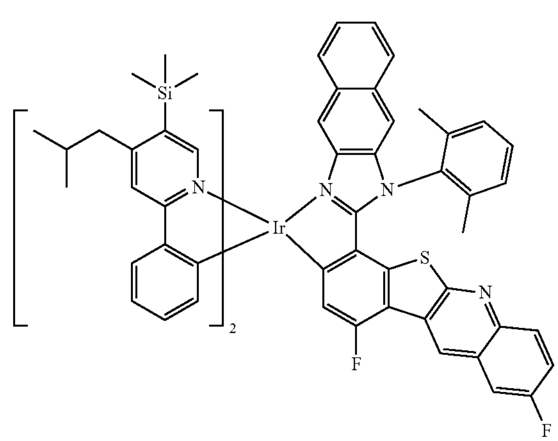

-continued
3933
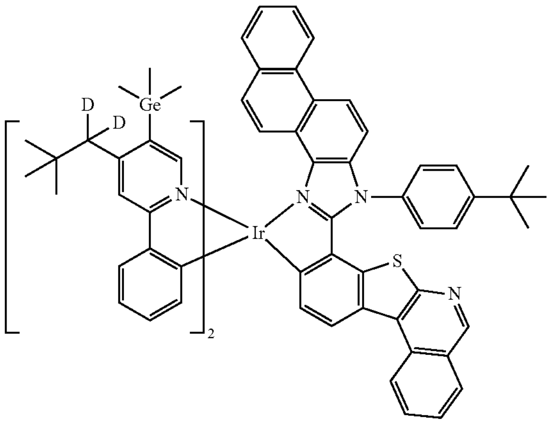
3934
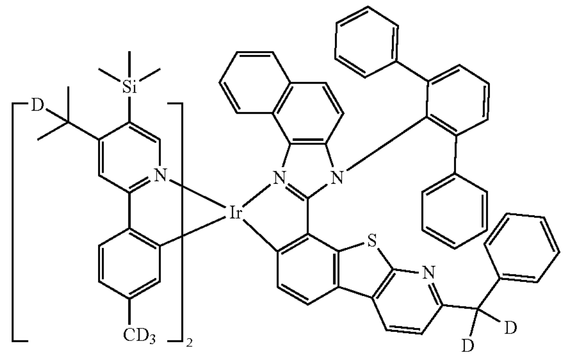
3935
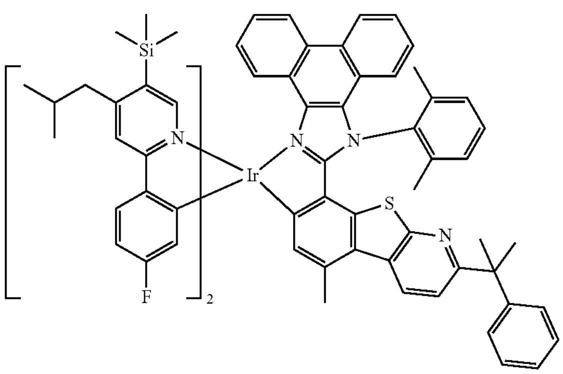
3936
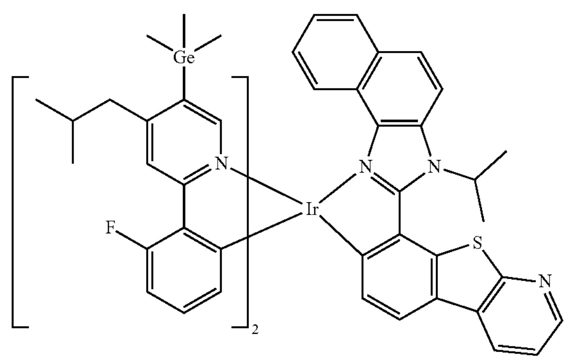
3937
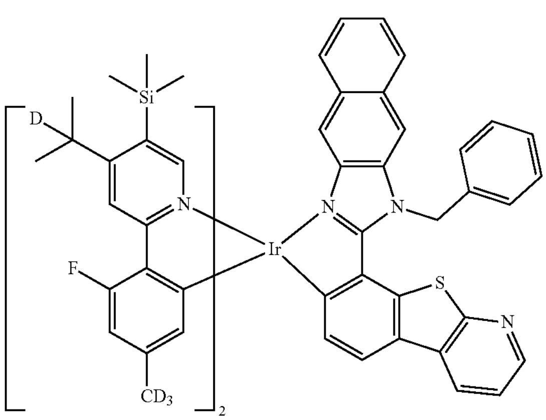
3938
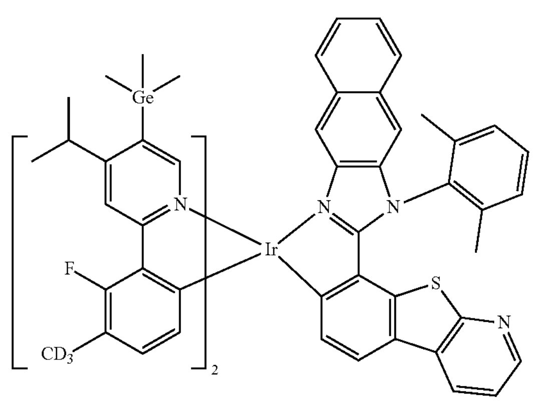

-continued
3939
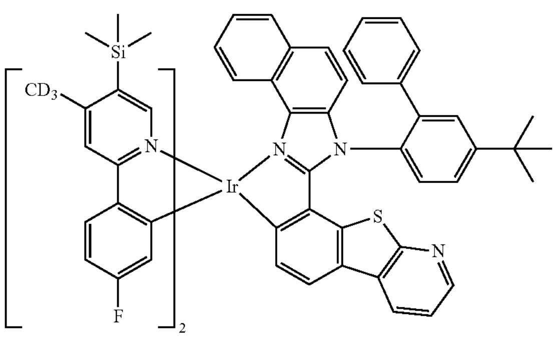
3940
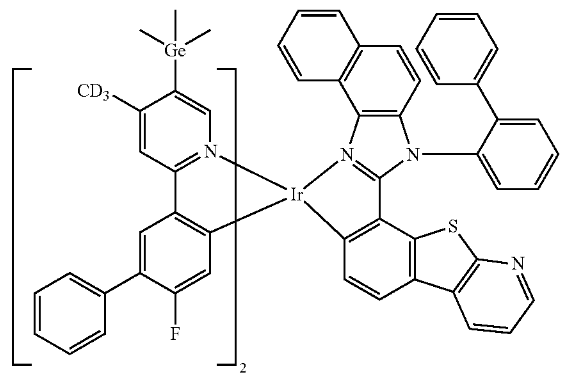
3941
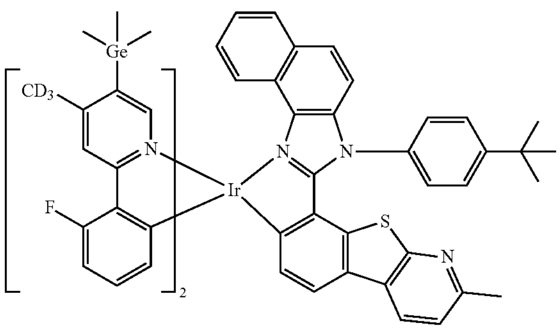
3942
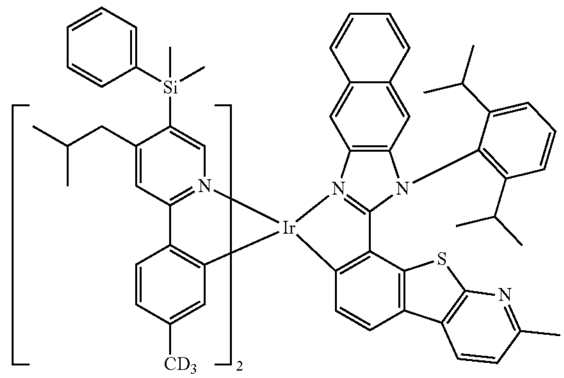
3943
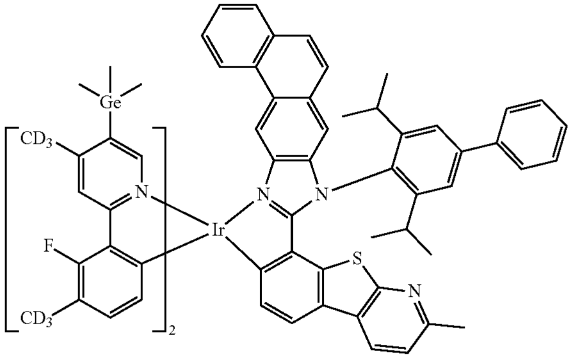
3944
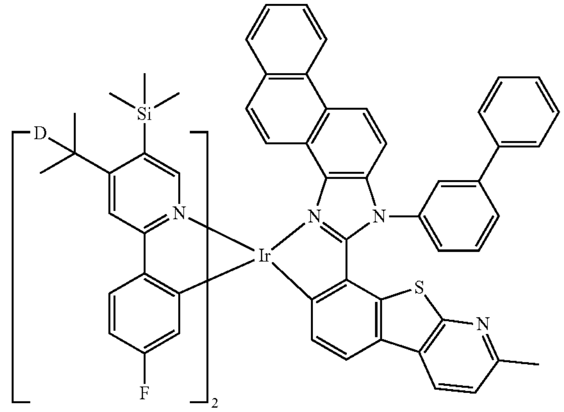

-continued
3945
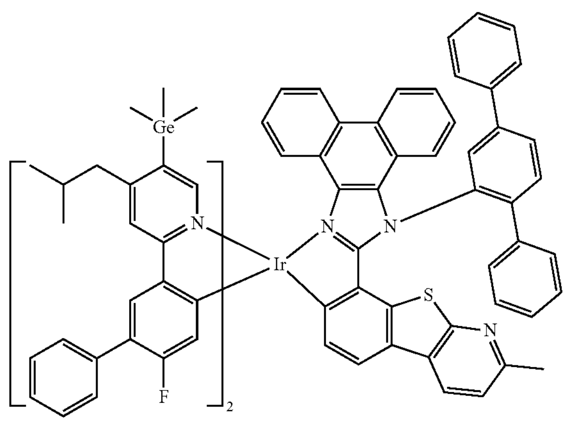
3946
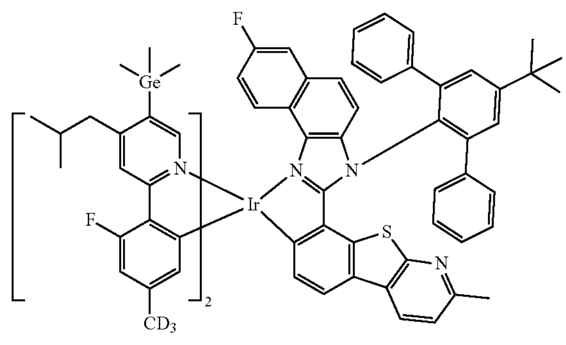
3947
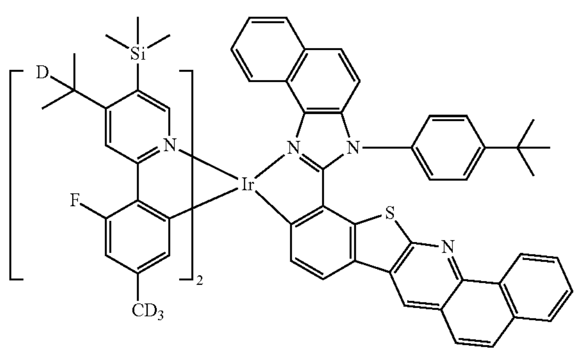
3948
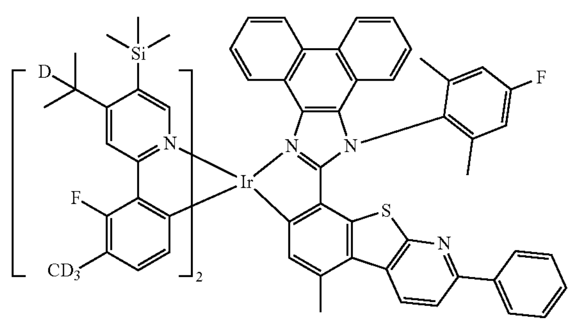
3949
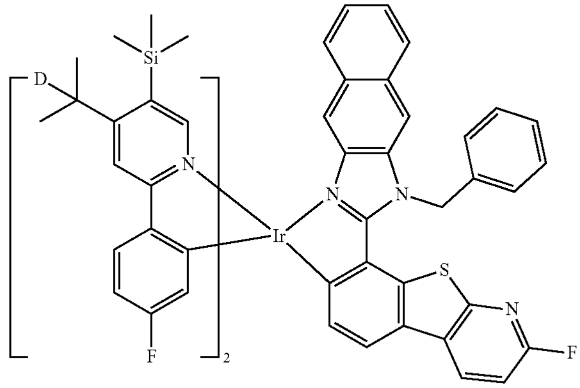
3950
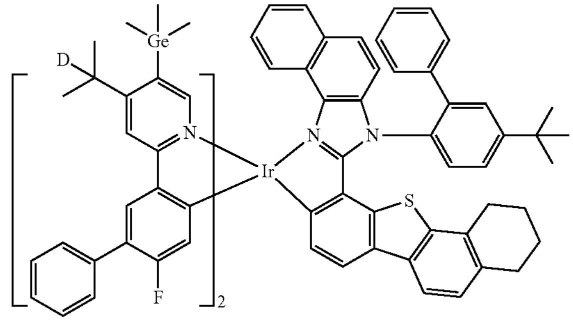

-continued
3951
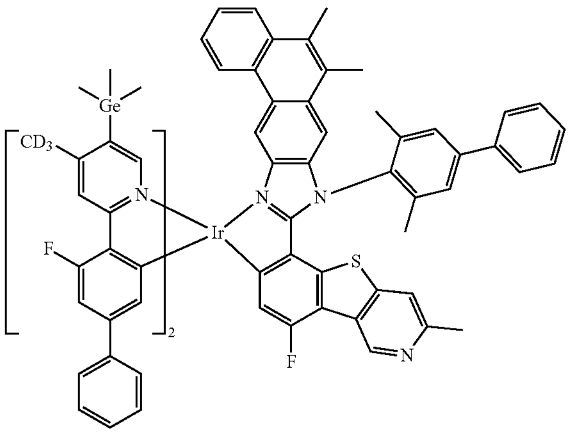
3952
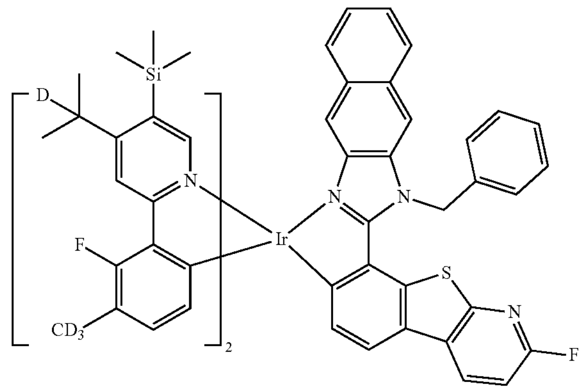
3953
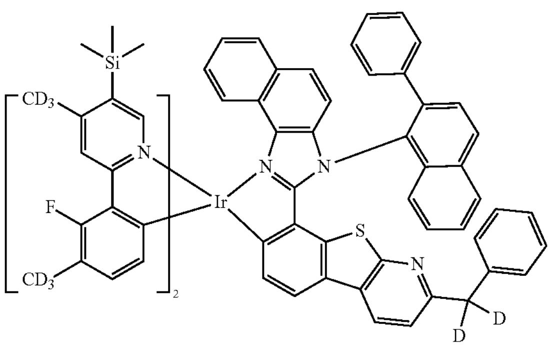
3954
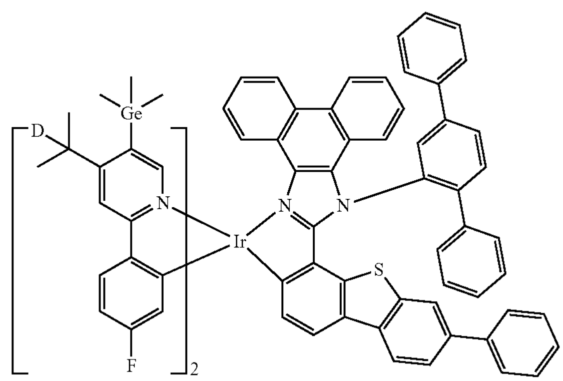
3955
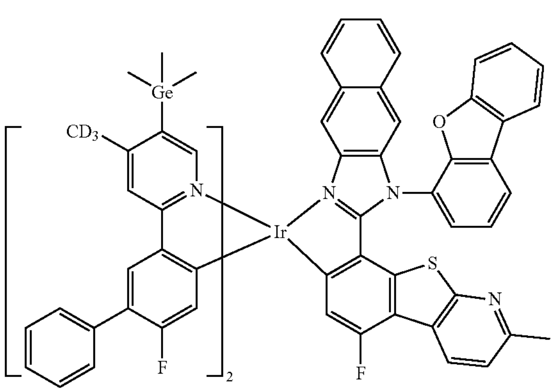
3956
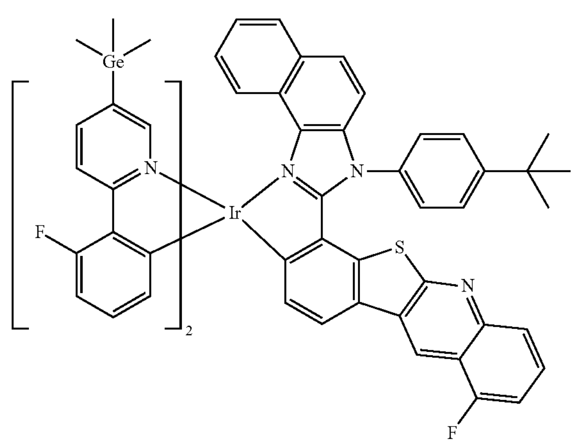

-continued
3957
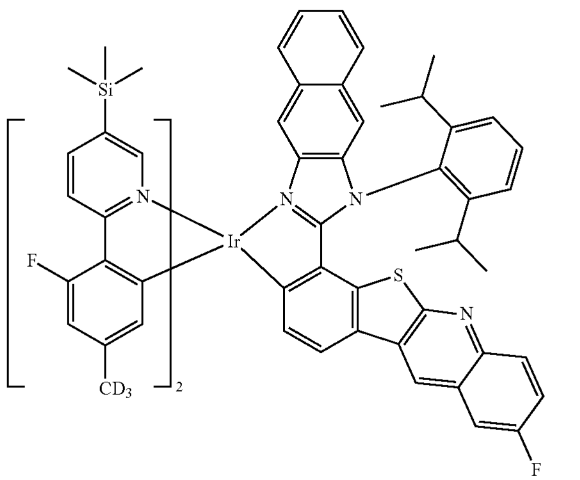
3958
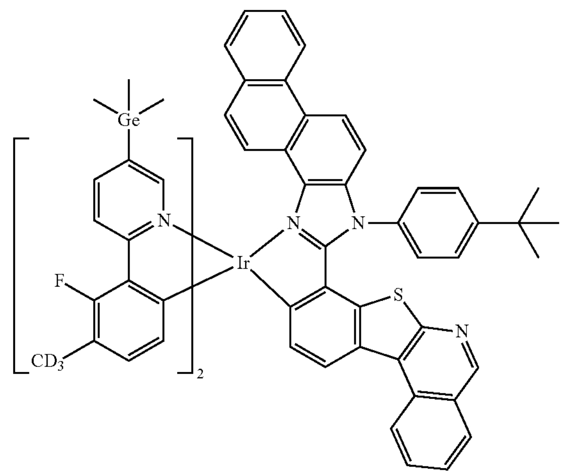
3959
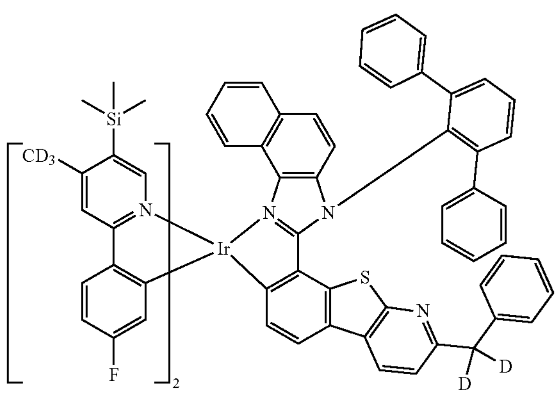
3960
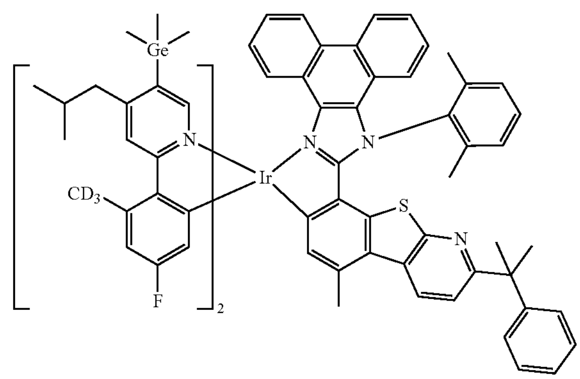
3961
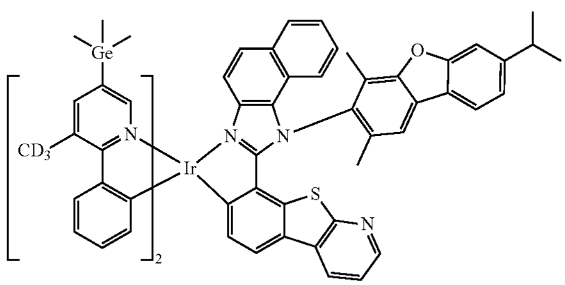
3962
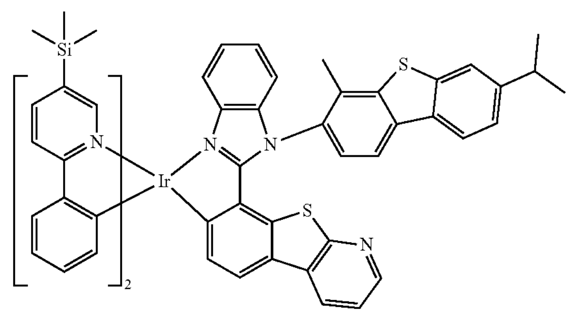
3963
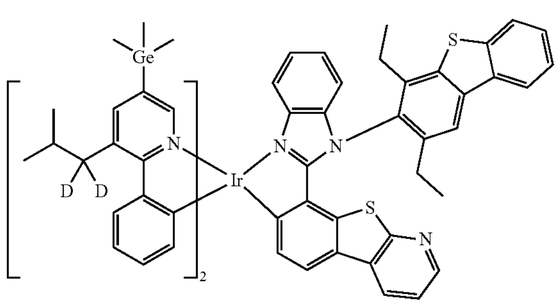
3964
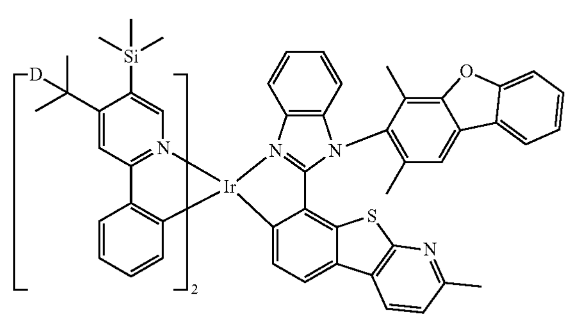

-continued
3965
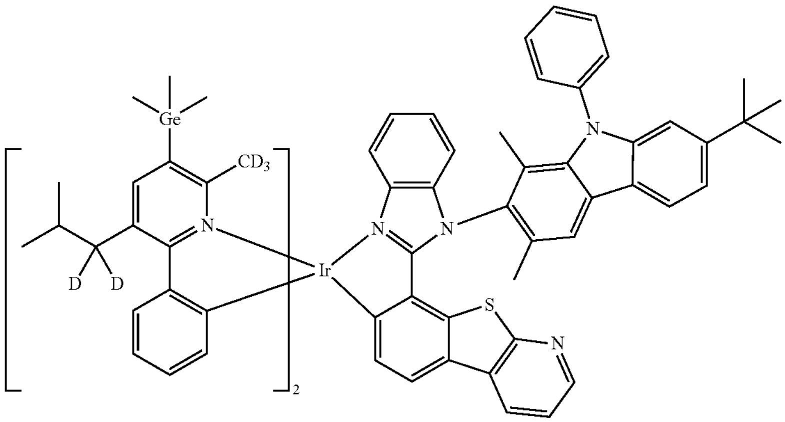
3966
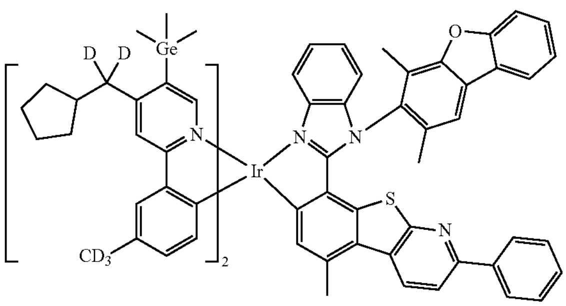
3967
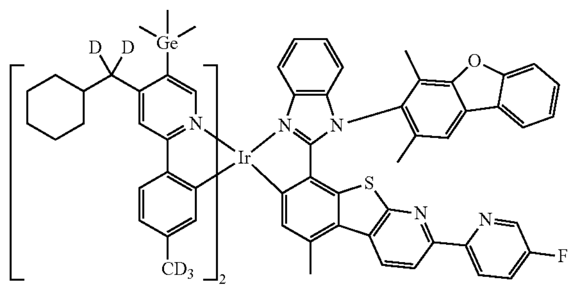
3968
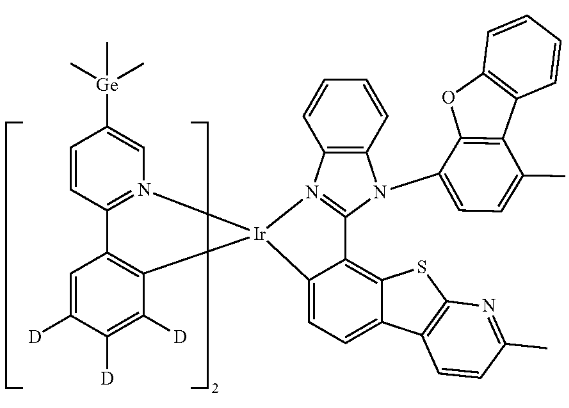
3969
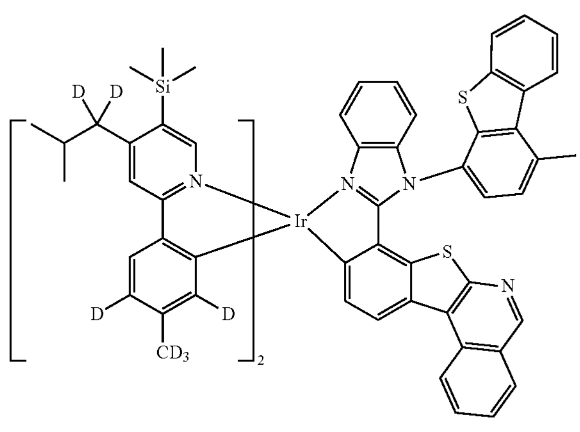
3970
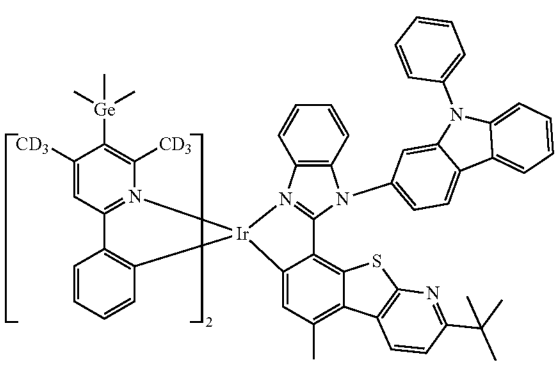
3971
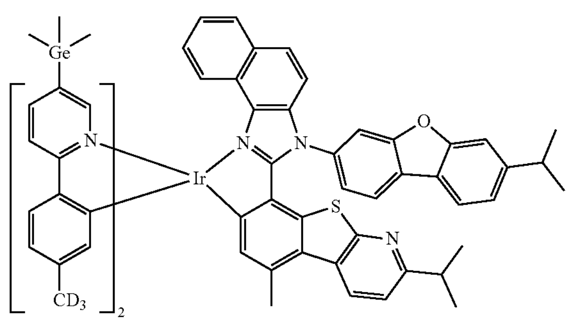

-continued
3972
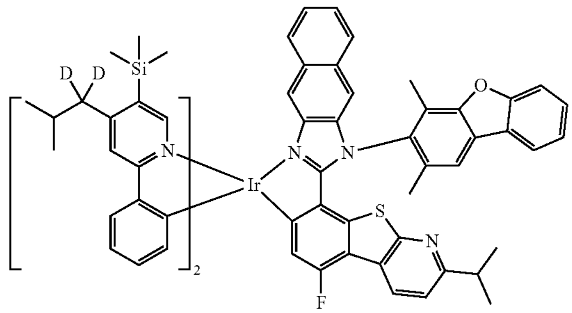
3973
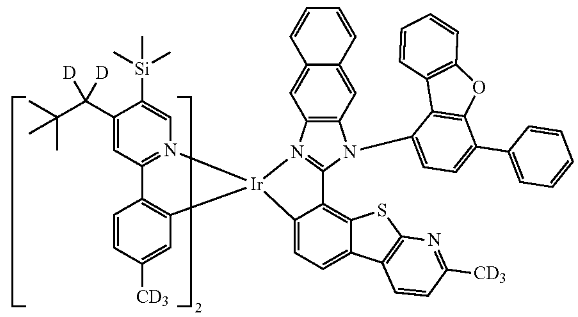
3974
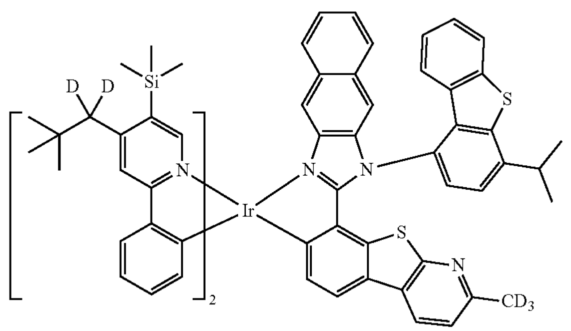
3975
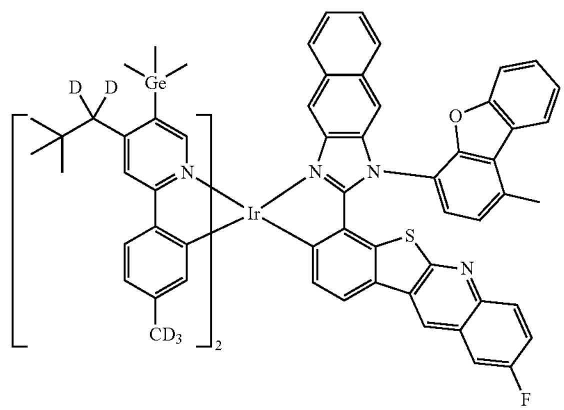
3976
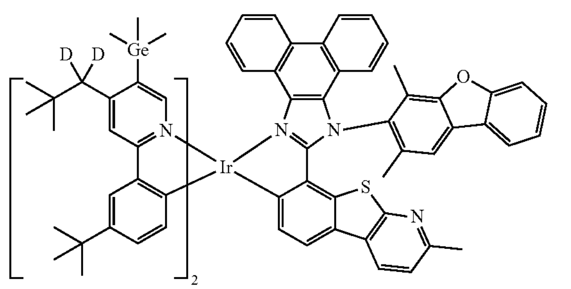
3977
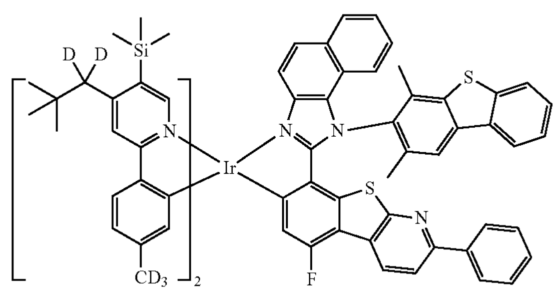
3978
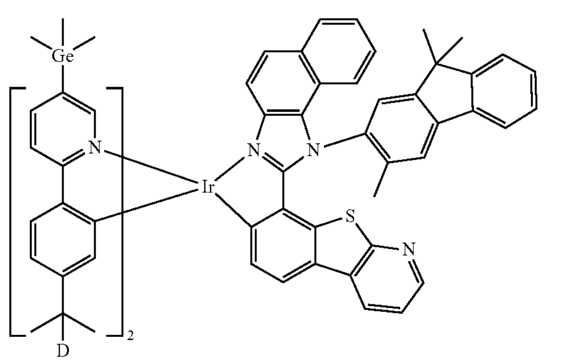
3979
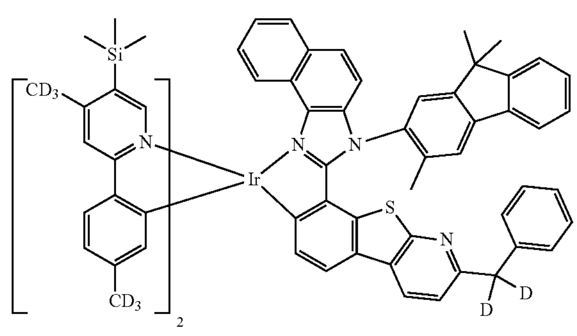

-continued
3980
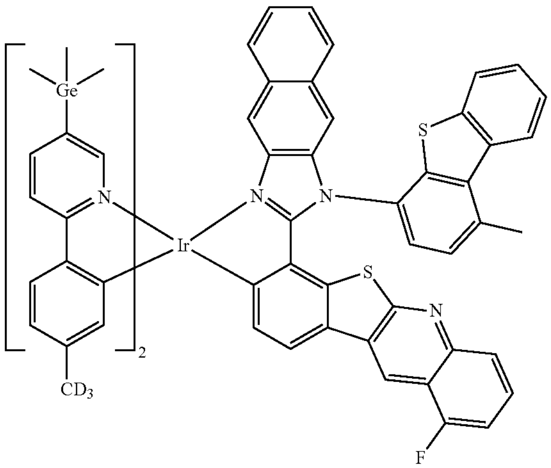
3981
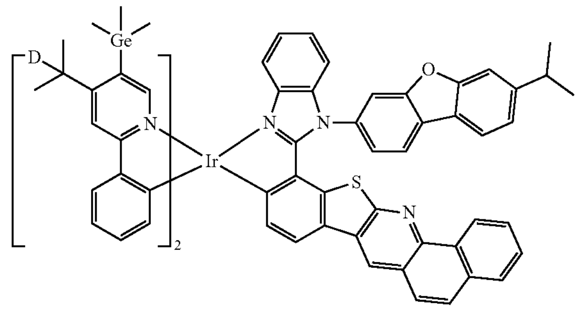
3982
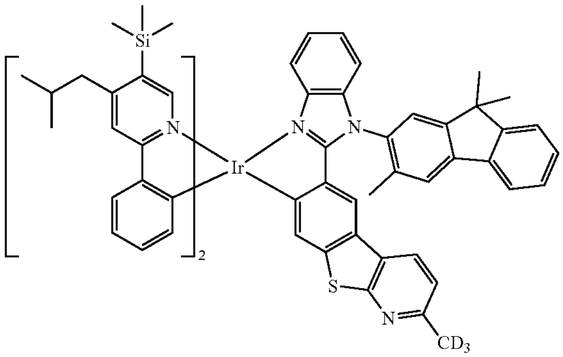
3983
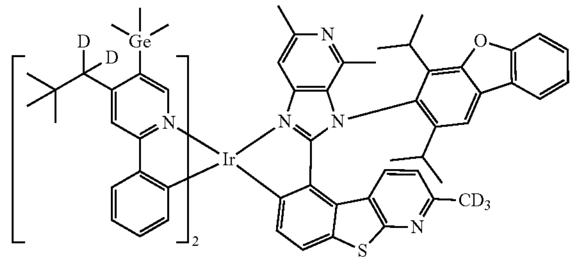
3984
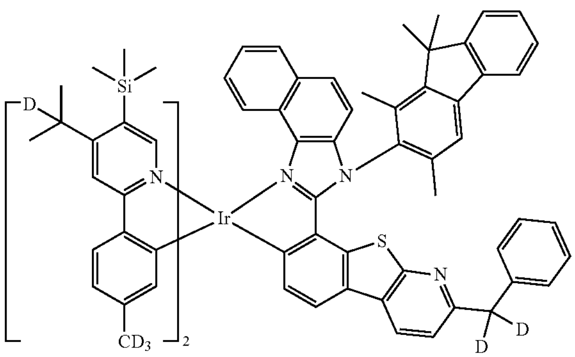
3985
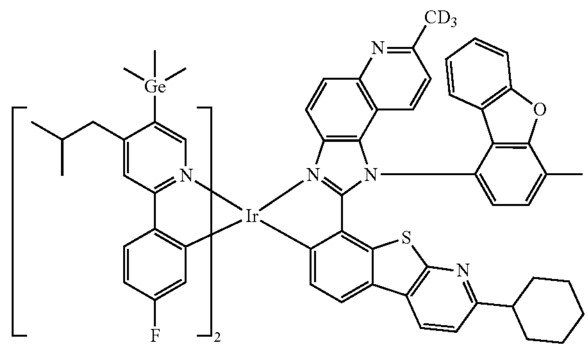
3986
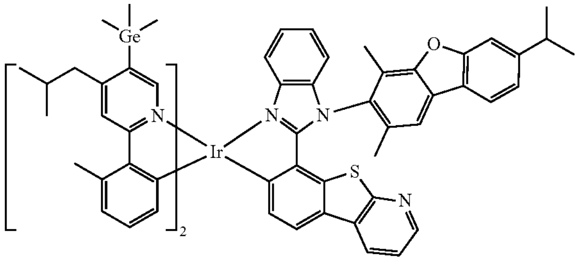
3987
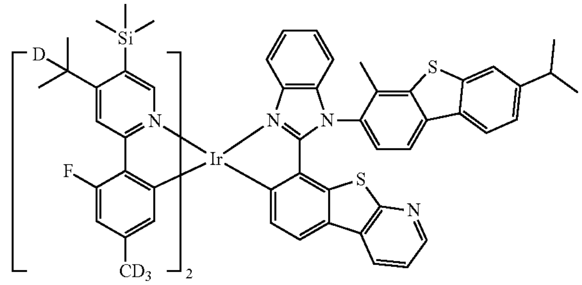

-continued
3988
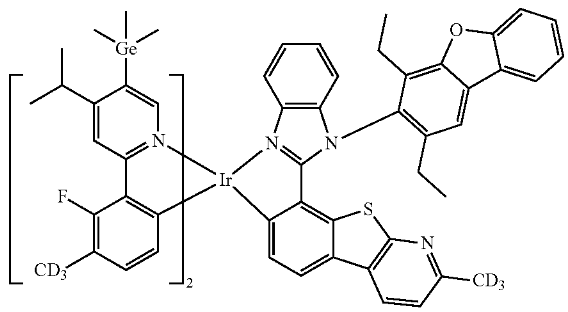
3989
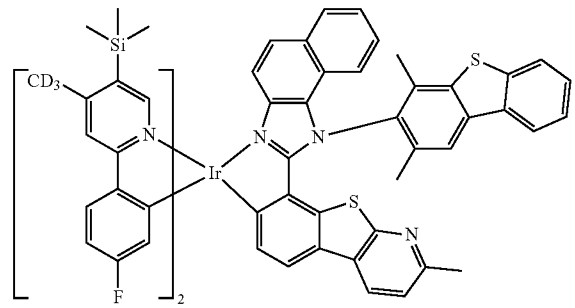
3990
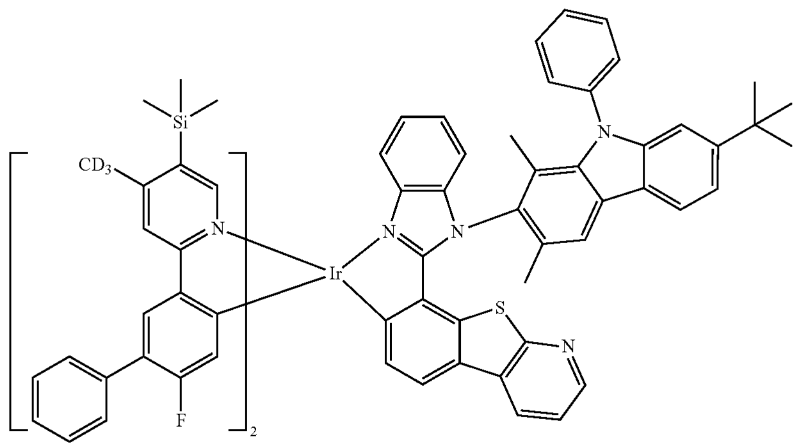
3991
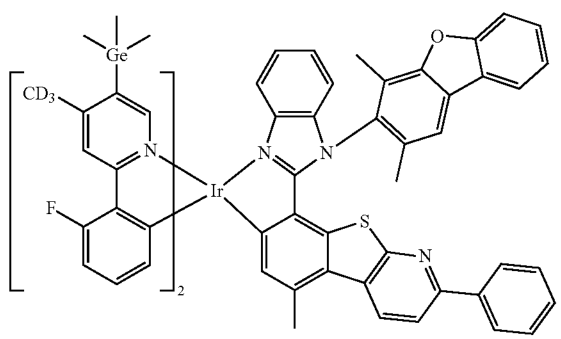
3992
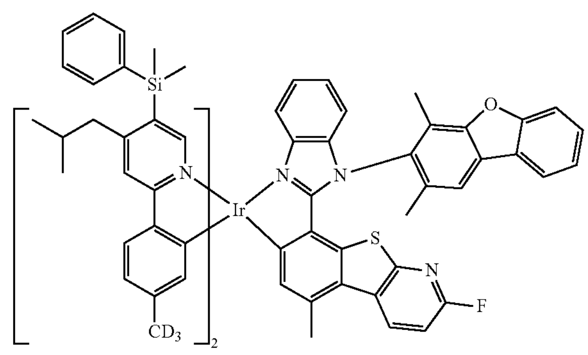
3993
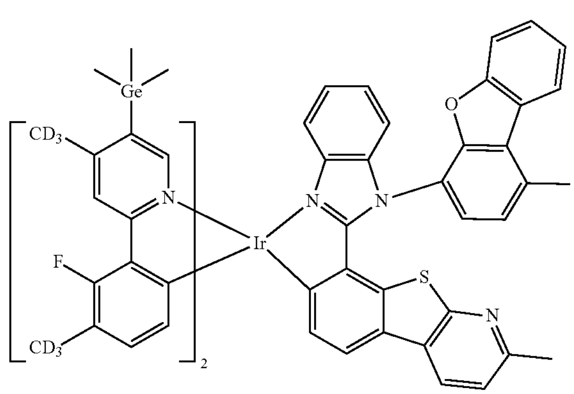
3994
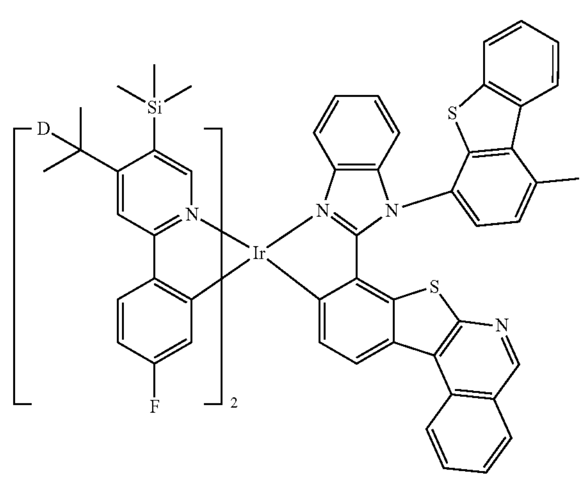

-continued
3995
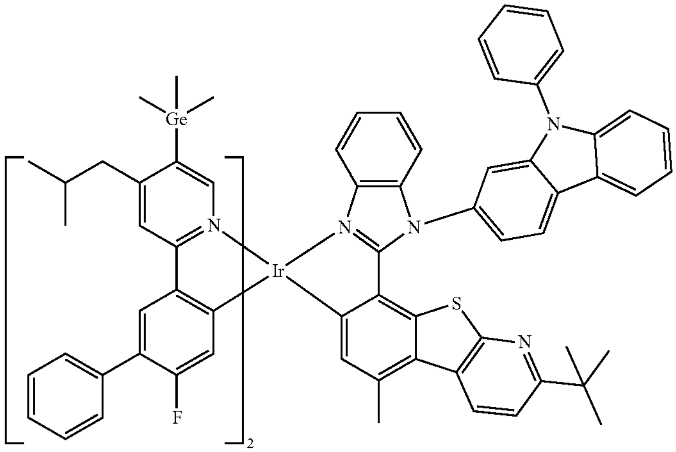
3996
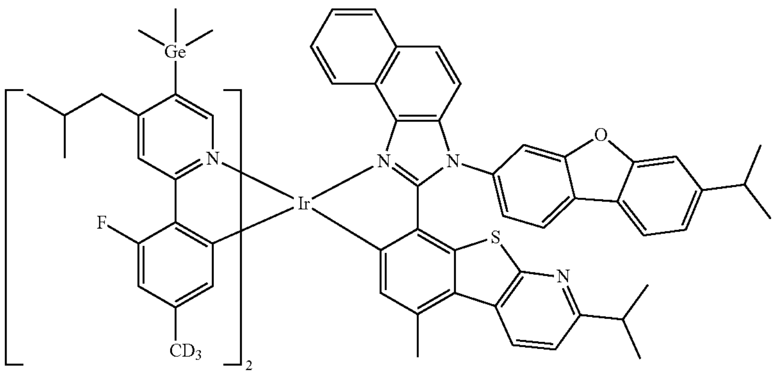
3997
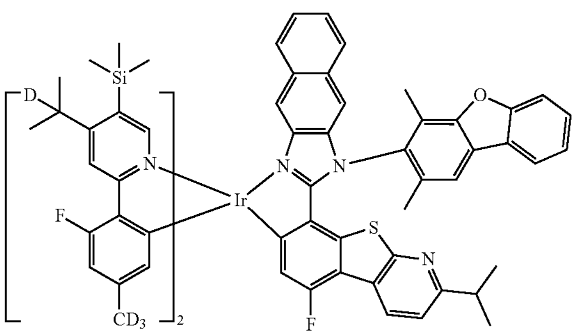
3998
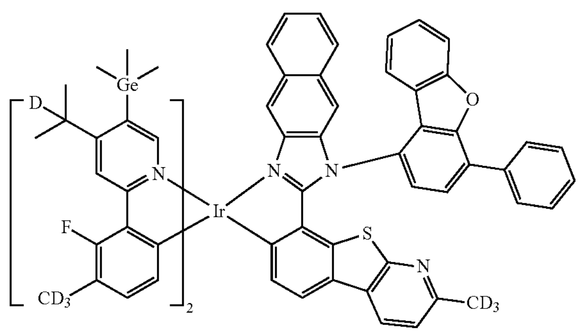
3999
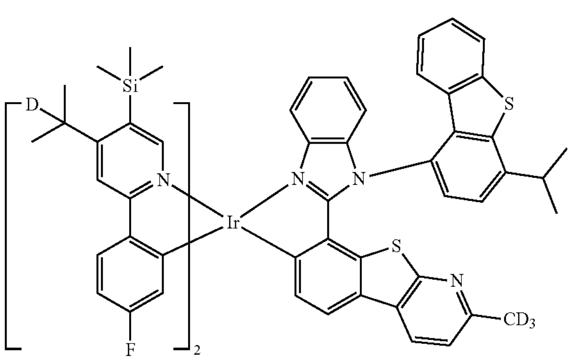
4000
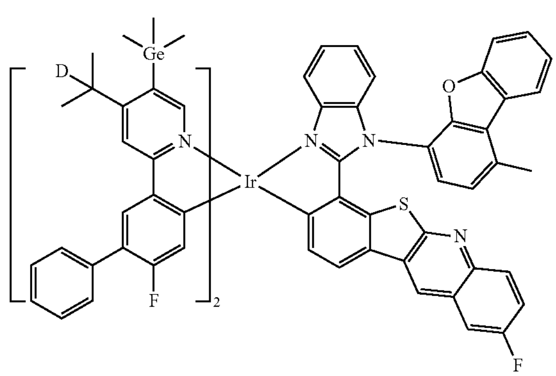

-continued
4001
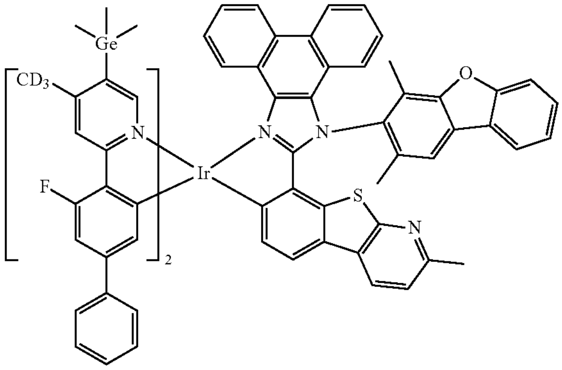
4002
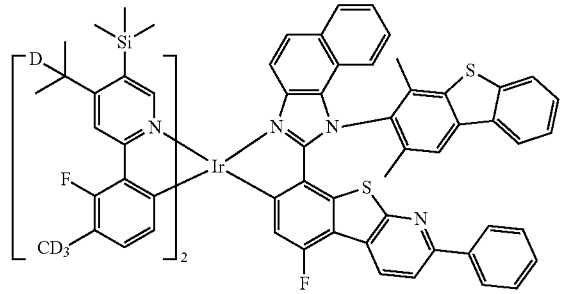
4003
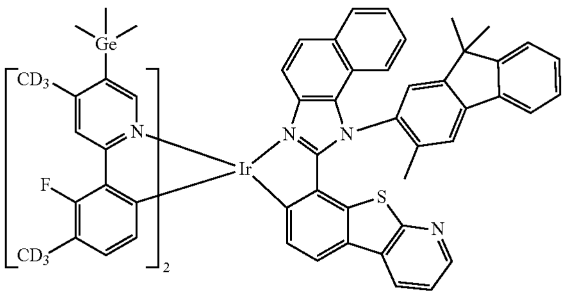
4004
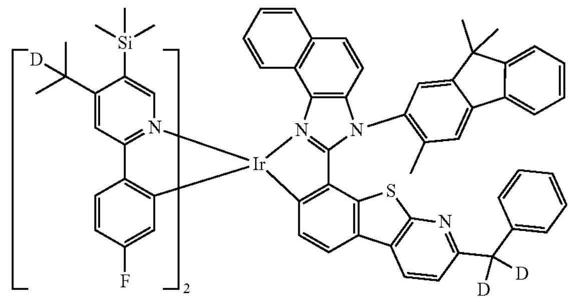
4005
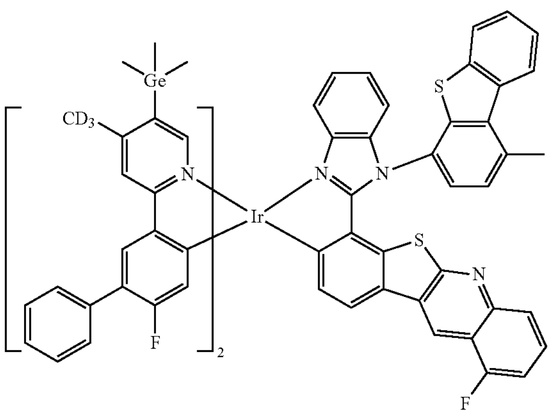
4006
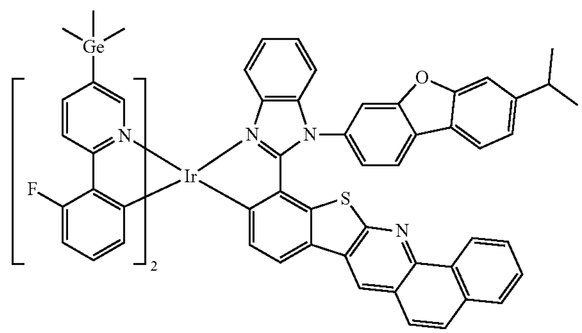
4007
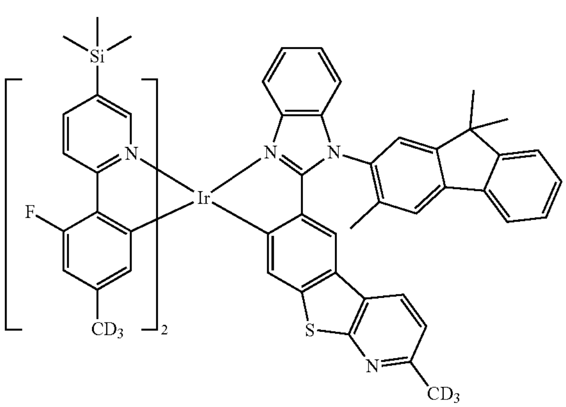
4008
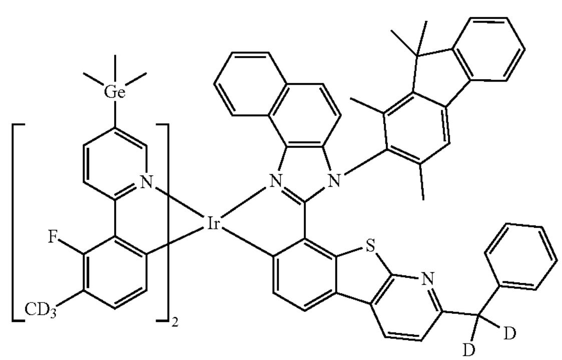

-continued

4009

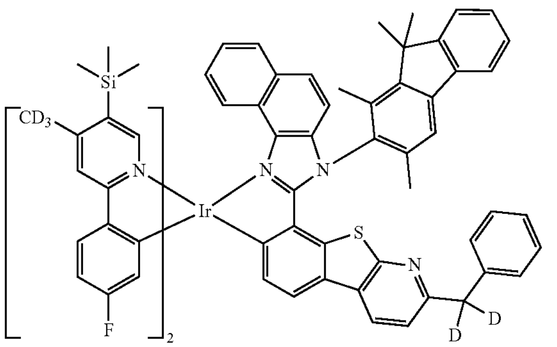

4010

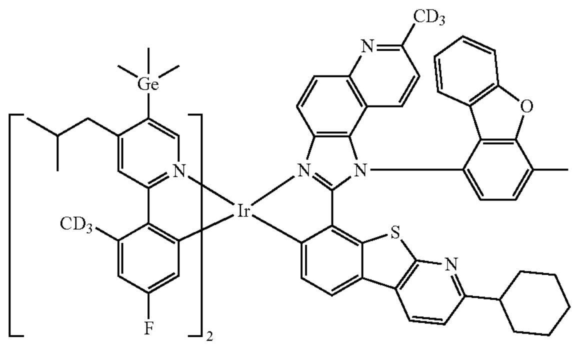

$L_1$ and $L_2$ of the organometallic compound represented by Formula 1 may be ligands represented by Formulae 2 and 3, respectively, and n1 and n2, indicating the numbers of $L_1$ and $L_2$, respectively, may each independently be 1 or 2. In other words, the organometallic compound includes $L_1$ (Formula 2) including a group represented by $*—X_{11}(R_{14})(R_{15})(R_{16})$ and $L_2$ (Formula 3). Accordingly, molecular orientation and charge mobility of the organometallic compound represented by Formula 1 may be significantly improved, and thus external quantum efficiency and lifespan of an electronic device, for example, an organic light-emitting device, including the same may be improved.

Results of evaluating a highest occupied molecular orbital (HOMO) energy level, a lowest unoccupied molecular orbital (LUMO) energy level, a $S_1$ energy level, and a $T_1$ energy level of a part of the organometallic compound represented by Formula 1 by using a Gaussian 09 program involving molecular structure optimization by density functional theory (DFT) based on B3LYP are shown in Table 1 below.

TABLE 1

| Compound No. | HOMO(eV) | LUMO(eV) | $S_1$(eV) | $T_1$(eV) |
|---|---|---|---|---|
| 1 | −4.723 | −1.151 | 2.872 | 2.528 |
| 5 | −4.719 | −1.145 | 2.874 | 2.523 |
| 6 | −4.702 | −1.133 | 2.868 | 2.523 |
| 11 | −4.719 | −1.173 | 2.857 | 2.517 |
| 12 | −4.673 | −1.131 | 2.843 | 2.513 |
| 14 | −4.707 | −1.181 | 2.844 | 2.511 |
| 15 | −4.744 | −1.171 | 2.873 | 2.532 |
| 37 | −4.704 | −1.152 | 2.856 | 2.558 |
| 184 | −4.721 | −1.139 | 2.871 | 2.552 |
| 212 | −4.794 | −1.255 | 2.831 | 2.536 |
| 295 | −4.710 | −1.154 | 2.856 | 2.545 |
| 982 | −4.706 | 1.149 | 2.862 | 2.554 |
| 1042 | −4.761 | −1.197 | 2.856 | 2.513 |
| 1229 | −4.842 | −1.281 | 2.864 | 2.539 |
| 1525 | −4.728 | −1.129 | 2.900 | 2.530 |
| 1550 | −4.705 | −1.108 | 2.892 | 2.557 |
| 1725 | −4.783 | −1.237 | 2.838 | 2.546 |
| 2610 | −4.769 | −1.273 | 32.849 | 2.558 |
| 2755 | −4.779 | −1.200 | 2.883 | 2.531 |
| 3214 | −4.707 | −1.148 | 2.865 | 2.533 |
| 3275 | −4.755 | −1.238 | 2.850 | 2.402 |
| 3492 | −4.840 | −1.268 | 2.892 | 2.509 |
| 3553 | −4.727 | −1.231 | 2.839 | 2.405 |

From Table 1, it is confirmed that the organometallic compound represented by Formula 1 has such electric characteristics that are suitable for use as a dopant for an electronic device, for example, an organic light-emitting device.

A synthesis method for the organometallic compound represented by Formula 1 would be understood to those of ordinary skill in the art by referring to the following exemplary embodiments.

Therefore, the organometallic compound represented by Formula 1 may be suitable for an organic layer of an organic light-emitting device. For example, the organometallic compound represented by Formula 1 may be suitable as a dopant in an emission layer in the organic layer. Accordingly, another aspect of the present disclosure provides an organic light-emitting device including: a first electrode; a second electrode; and an organic layer disposed between the first electrode and the second electrode and including an emission layer, wherein the organic layer includes at least one organometallic compound represented by Formula 1.

The organic light-emitting device including the organic layer including the organometallic compound represented by Formula 1 may have improved external quantum efficiency and improved lifespan characteristics.

The organometallic compound represented by Formula 1 may be used between a pair of electrodes of the organic light-emitting device. For example, the organometallic compound represented by Formula 1 may be included in the emission layer. Here, the organometallic compound may serve as a dopant, and the emission layer may further include a host (i.e., an amount of the organometallic compound represented by Formula 1 may be smaller than that of the host). The emission layer may emit red light or green light, for example, red light or green light, each having a maximum emission wavelength of 500 nm or more, for example, 500 nm or more and 850 nm or less. For example, the organometallic compound may emit green light.

The expression "(an organic layer) includes at least one organometallic compound" as used herein may include a case in which "(an organic layer) includes identical organometallic compounds represented by Formula 1" and a case in which "(an organic layer) includes two or more different organometallic compounds represented by Formula 1".

For example, the organic layer may include, as the organometallic compound, only Compound 1. Here, Compound 1 may exist only in the emission layer of the organic light-emitting device. In one or more embodiments, the organic layer may include, as the organometallic compound, Compound 1 and Compound 2. Here, Compound 1 and Compound 2 may exist in a same layer (for example, Compound 1 and Compound 2 may all exist in the emission layer).

The first electrode may be an anode which is a hole injection electrode, and the second electrode may be a cathode which is an electron injection electrode; or the first electrode may be a cathode which is an electron injection electrode, and the second electrode may be an anode which is a hole injection electrode.

For example, in the organic light-emitting device, the first electrode may be an anode, the second electrode may be a cathode, and the organic layer may further include a hole transport region between the first electrode and the emission layer and an electron transport region disposed between the emission layer and the second electrode, wherein the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" as used herein refers to a single layer and/or a plurality of layers disposed between the first electrode and the second electrode of the organic light-emitting device. The "organic layer" may include not only an organic compound, but also an organometallic complex including metal.

FIGURE is a schematic cross-sectional view of an organic light-emitting device 10 according to an embodiment. Hereinafter, the structure of the organic light-emitting device 10 according to an embodiment and a method of manufacturing the organic light-emitting device 10 will be described in connection with the FIGURE. The organic light-emitting device 10 has a structure in which a first electrode 11, an organic layer 15, and a second electrode 19 are stacked in the stated order.

A substrate may be additionally disposed under the first electrode 11 or above the second electrode 10. For use as the substrate, a substrate used in a typical organic light-emitting device in the related art may be used, and in this regard, the substrate may be a glass substrate or a plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. A material for forming the first electrode 11 may include a material with a high work function to facilitate hole injection. The first electrode 11 may be a reflective electrode, a semi-transmissive electrode, or a transmissive electrode. The material for forming the first electrode 11 may include indium tin oxide (ITO), indium zinc oxide (IZO), tin oxide ($SnO_2$), zinc oxide (ZnO), or the like. In one or more embodiments, the material for forming the first electrode 11 may include metal or metal alloy, such as magnesium (Mg), aluminum (Al), aluminum-lithium (Al—Li), calcium (Ca), magnesium-indium (Mg—In), and magnesium-silver (Mg—Ag).

The first electrode 11 may have a single-layered structure, or a multi-layered structure including two or more layers. For example, the first electrode 11 may have a three-layered structure of ITO/Ag/ITO.

The organic layer 15 may be disposed on the first electrode 11.

The organic layer 15 may include: a hole transport region; an emission layer; and an electron transport region.

The hole transport region may be disposed between the first electrode 11 and the emission layer.

The hole transport region may include a hole injection layer, a hole transport layer, an electron blocking layer, a buffer layer, or a combination thereof.

The hole transport region may include a hole injection layer only, or a hole transport layer only. In one or more embodiments, the hole transport region may have a hole injection layer/hole transport layer structure or a hole injection layer/hole transport layer/electron blocking layer structure, wherein for each structure, constituting layers are sequentially stacked from the first electrode 11 in this stated order.

When the hole transport region includes a hole injection layer, the hole injection layer may be formed on the first electrode 11 by using various methods, such as vacuum deposition, spin coating, casting, Langmuir-Blodgett (LB) deposition, and the like.

When the hole injection layer is formed by vacuum deposition, the deposition may be performed at a deposition temperature of about 100° C. to about 500° C., a vacuum degree of about $10^{-8}$ torr to about $10^{-3}$ torr, and a deposition speed of about 0.01 angstrom per second (Å/sec) to about 100 Å/sec by taking into account a compound for forming a hole injection layer and a structure and thermal characteristics of an emission layer to be formed.

When the hole injection layer is formed by spin coating, the coating may be performed at a coating speed of about 2,000 revolutions per minute (rpm) to about 5,000 rpm and at a heat treatment temperature of about 80° C. to 200° C. for the removal of a solvent after coating by taking into account a compound for forming a hole injection layer and a structure and thermal characteristics of a hole injection layer to be formed.

Conditions for forming the hole transport layer and the electron blocking layer may be referred to those for forming the hole injection layer.

The hole transport region may include, for example, m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine)(TCTA), polyaniline/dodecylbenzenesulfonic acid (PANI/DBSA), poly(3,4-ethylenedioxythiophene)/poly(4-styrenesulfonate)(PEDOT/PSS), polyaniline/camphor sulfonic acid (PANI/CSA), polyaniline/poly(4-styrenesulfonate) (PANI/PSS), a compound represented by Formula 201, a compound represented by Formula 202, or a combination thereof:

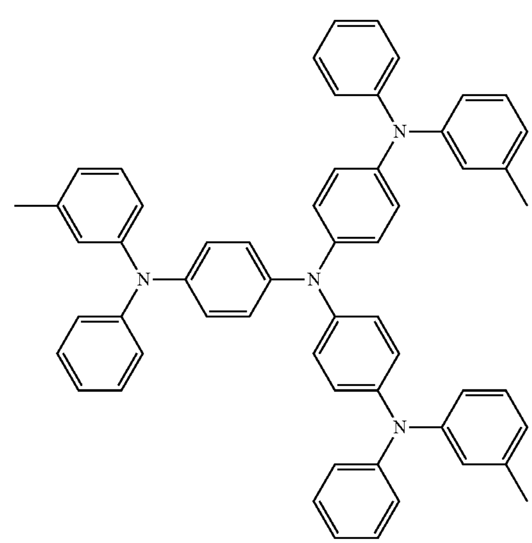

m-MTDATA

-continued
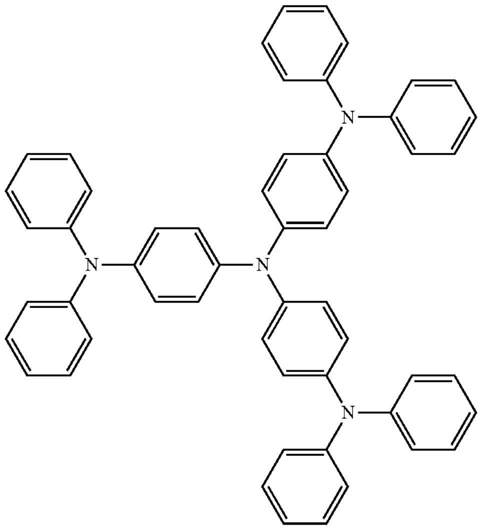
TDATA
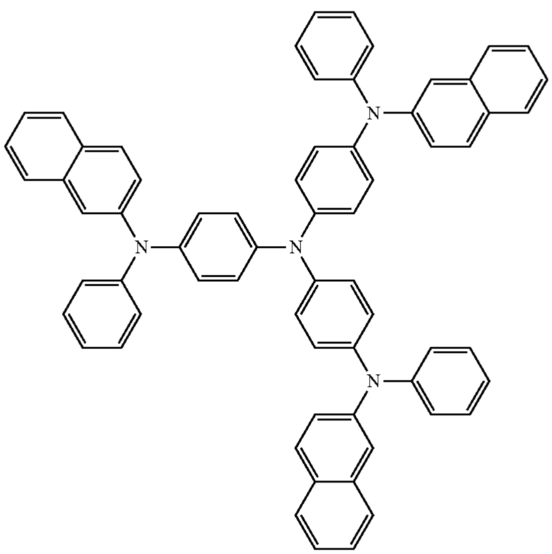
2-TNATA
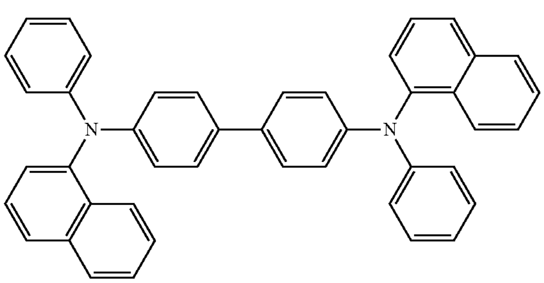
NPB
-continued
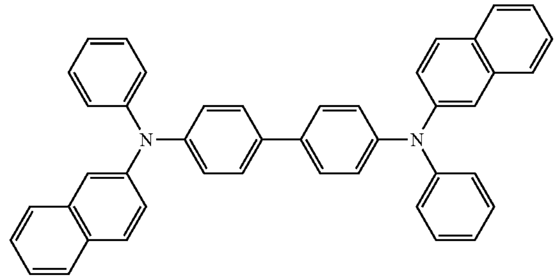
β-NPB
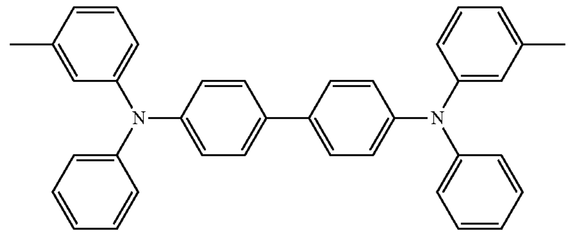
TPD
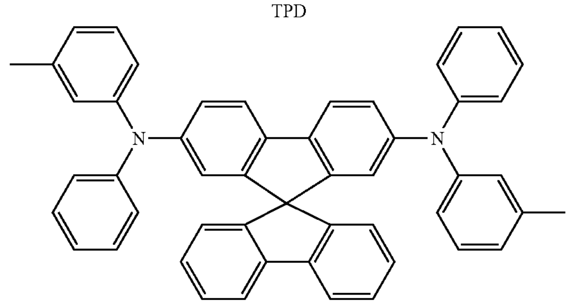
Spirto-TPD
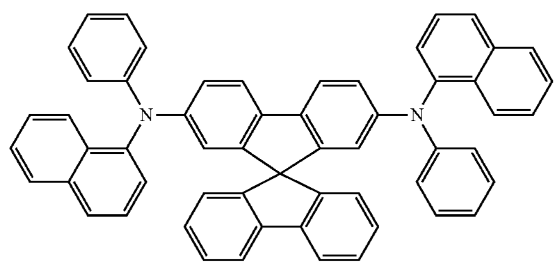
Spirto-NPB
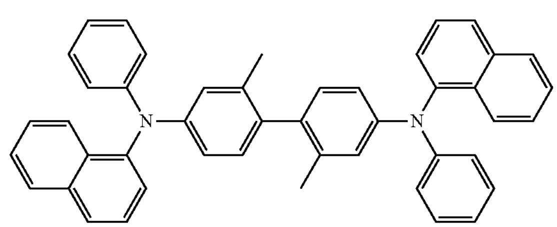
methylated NPB -continued

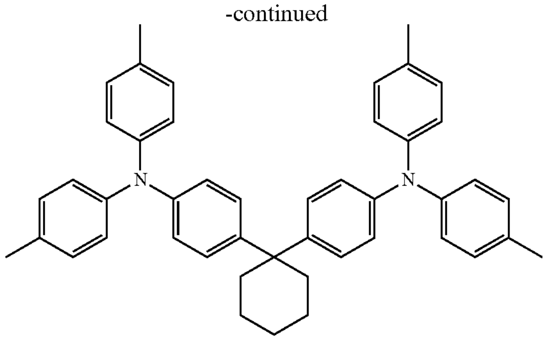

TAPC

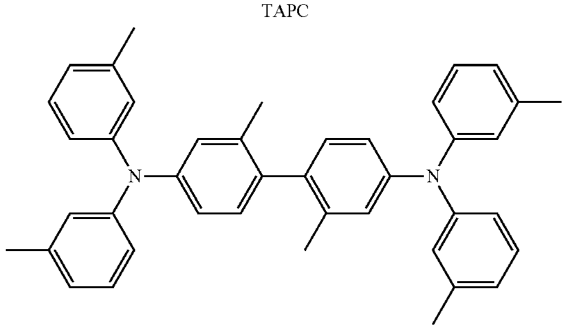

HMTPD

Formula 201

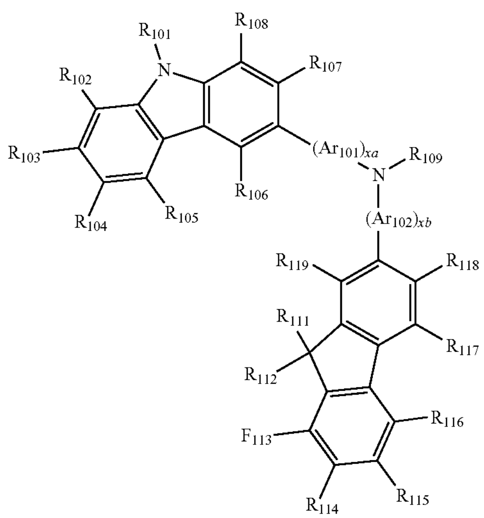

Formula 202

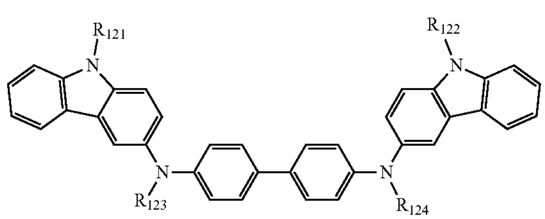

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, or a combination thereof.

In Formula 201, xa and xb may each independently be an integer from 0 to 5, or may be 0, 1, or 2. For example, xa may be 1, and xb may be 0.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, or the like), or a $C_1$-$C_{10}$ alkoxy group (for example, a methoxy group, an ethoxy group, a propoxy group, a butoxy group, a pentoxy group, or the like);

a $C_1$-$C_{10}$ alkyl group or a $C_1$-$C_{10}$ alkoxy group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or a combination thereof.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or a combination thereof.

In one or more embodiments, the compound represented by Formula 201 may be represented by Formula 201A:

Formula 201A
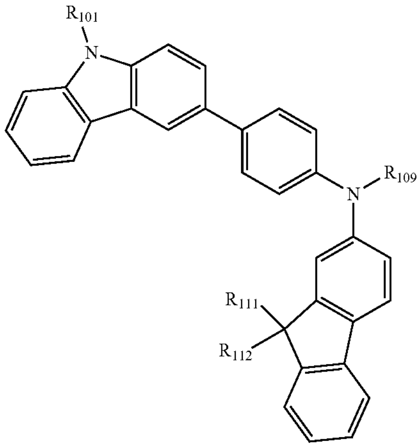
In Formula 201A, $R_{101}$, $R_{111}$, $R_{112}$, and $R_{109}$ may each be understood by referring to the corresponding descriptions thereof provided herein.
For example, the compound represented by Formula 201 and the compound represented by Formula 202 may include Compounds HT1 to HT20:
HT1
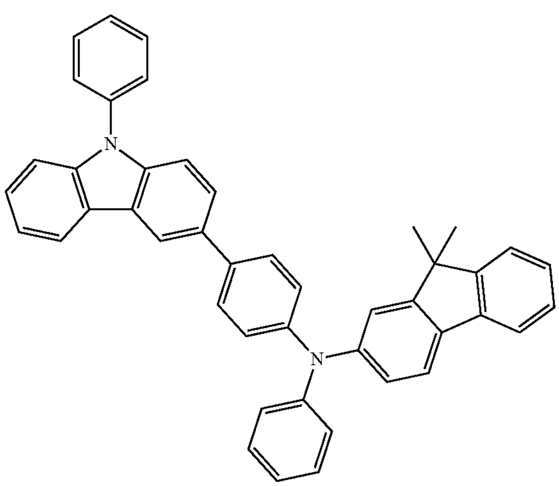
-continued
HT2
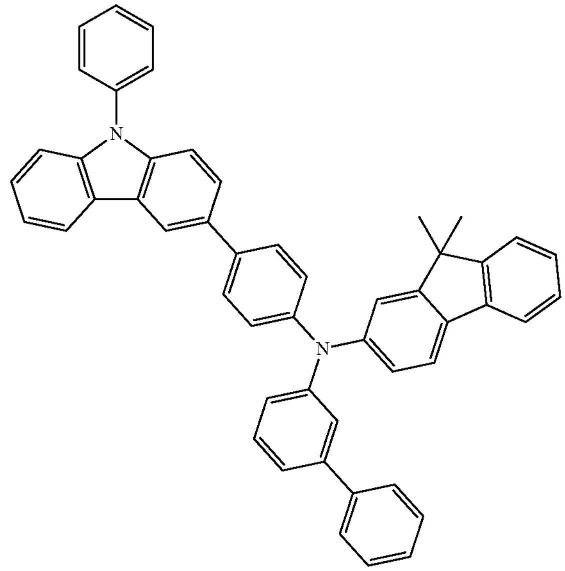
HT3
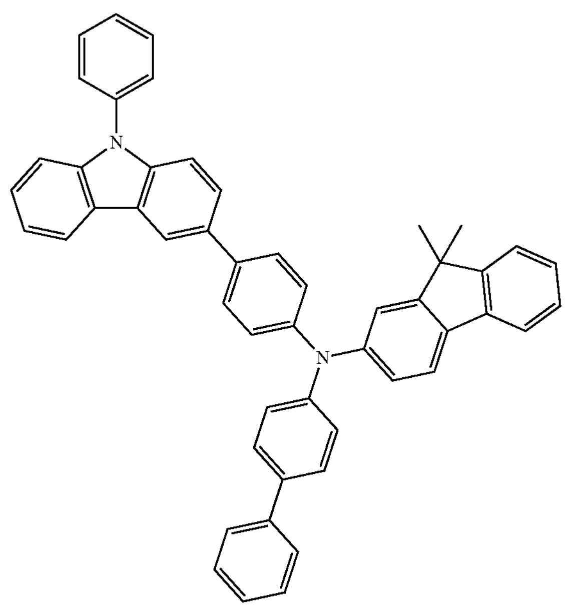

HT4
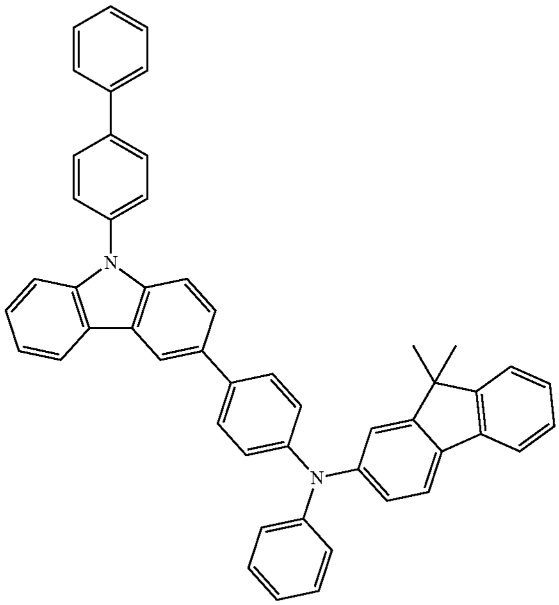
HT5
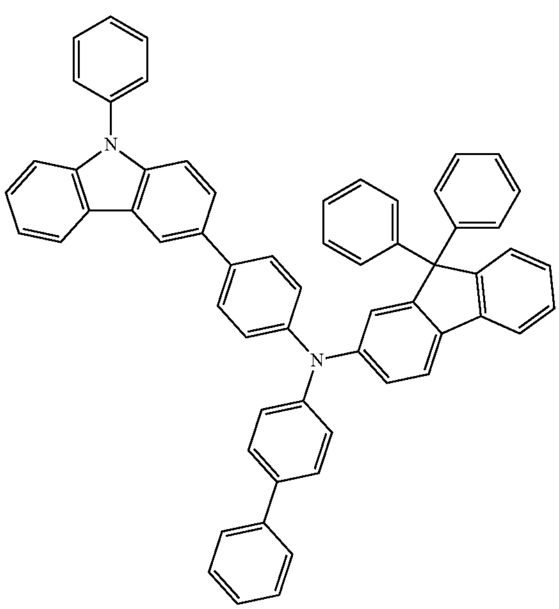
HT6
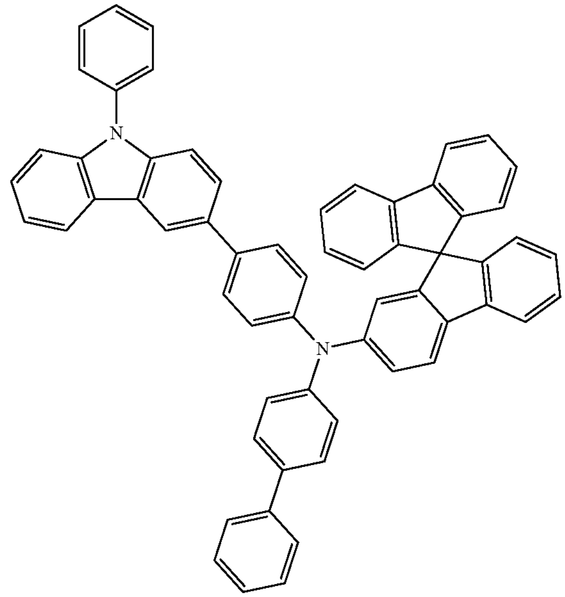
HT7
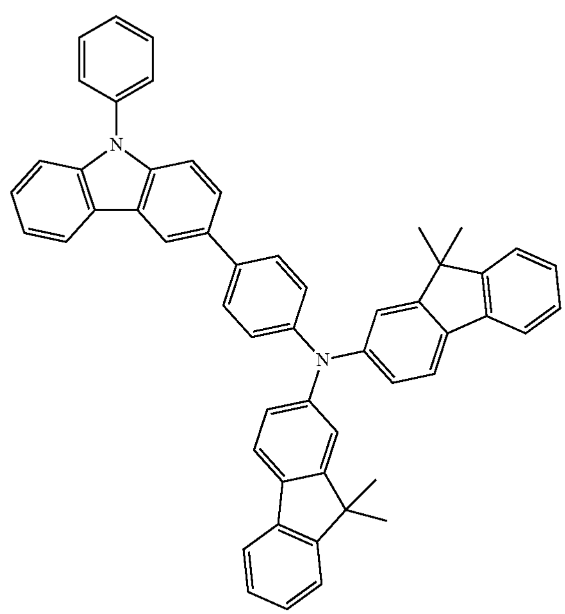

HT8
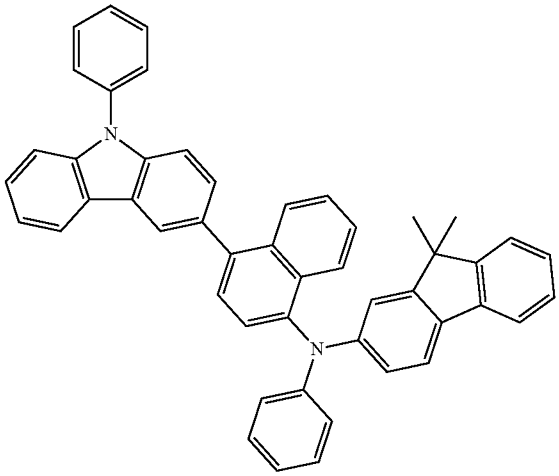
HT9
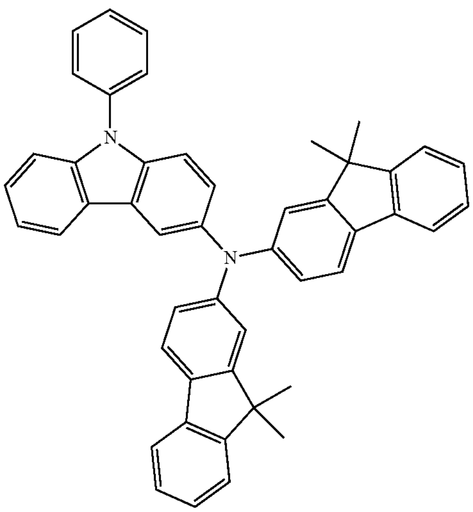
HT10
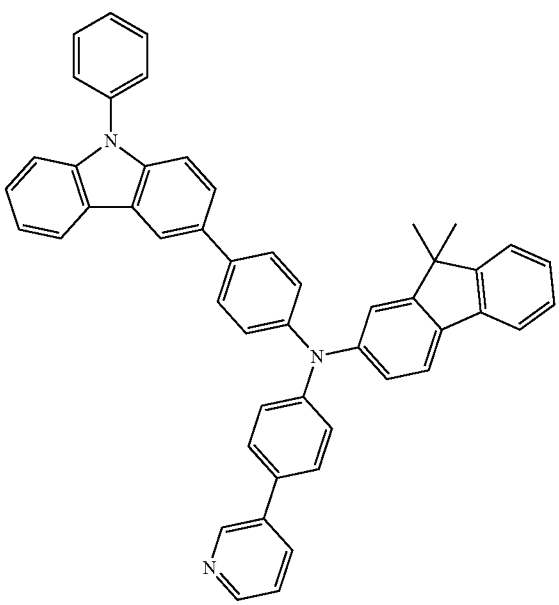
HT11
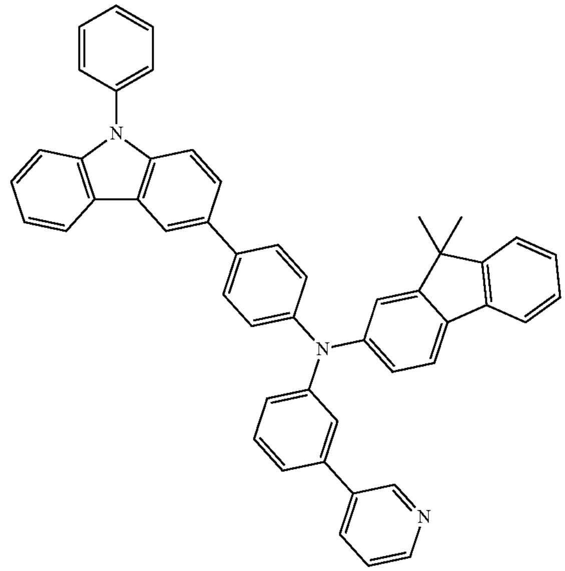
HT12
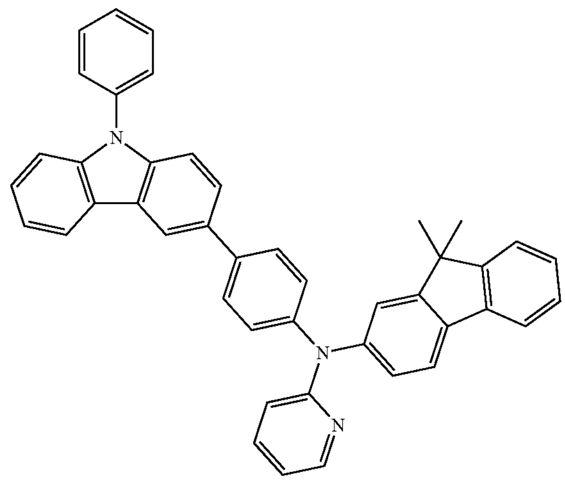
HT13
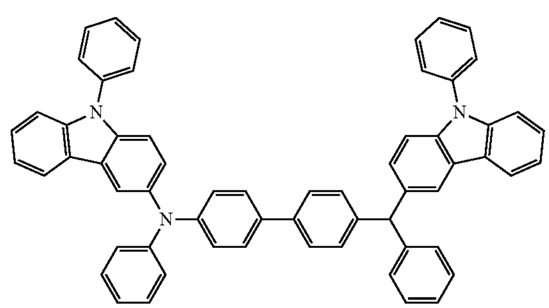

-continued

HT14

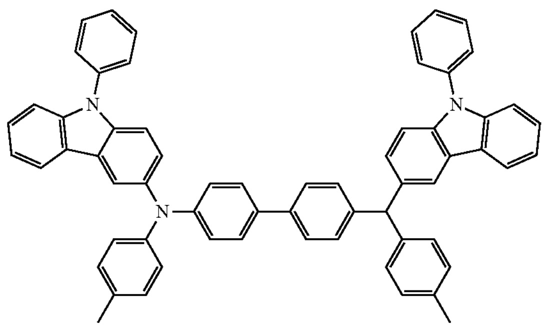

HT15

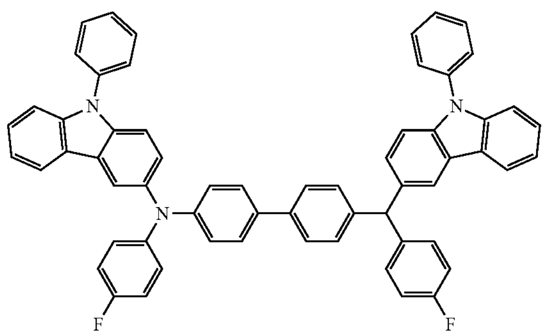

HT16

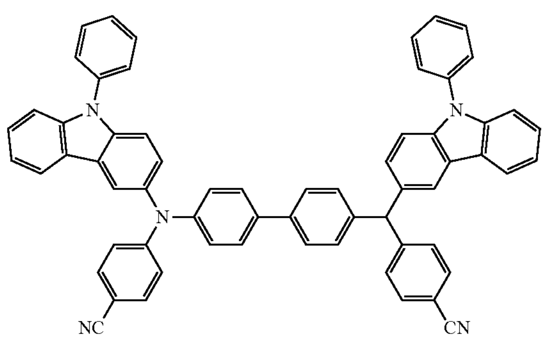

HT17

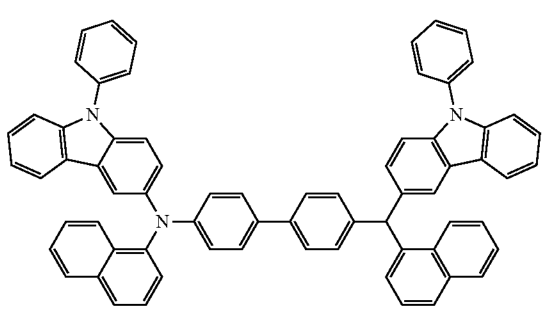

-continued

HT18

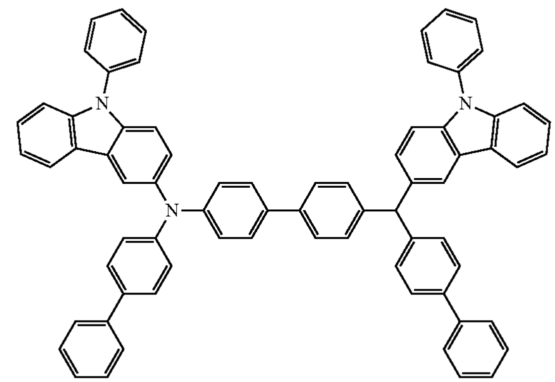

HT19

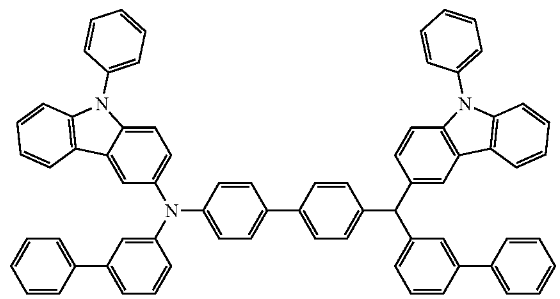

HT20

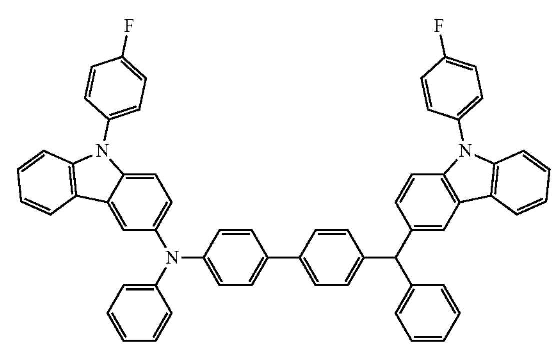

A thickness of the hole transport region may be in a range of about 100 Å to about 10,000 Å, for example, about 100 Å to about 1,000 Å. When the hole transport region includes at least one layer that is a hole injection layer or a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously (e.g., heterogeneously) dispersed in the hole transport region.

The charge-generation material may be, for example, a p-dopant. The p-dopant may be one of a quinone derivative, a metal oxide, and a cyano group-containing compound. For example, non-limiting examples of the p-dopant include: a quinone derivative, such as tetracyanoquinodimethane (TCNQ), 2,3,5,6-tetrafluoro-7,7,8,8-tetracyanoquinodimethane (F4-TCNQ), or F6-TCNNQ; a metal oxide, such as a tungsten oxide or a molybdenum oxide; and a cyano group-containing compound such as Compound HT-D1:

HT-D1

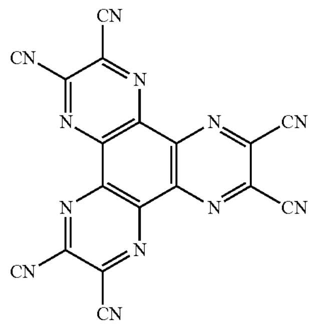

F4-TCNQ

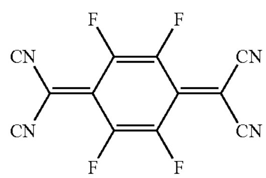

F6-TCNNQ

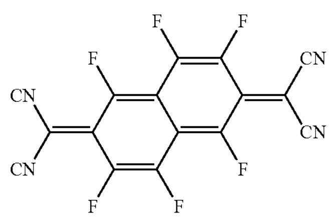

The hole transport region may further include a buffer layer.

The buffer layer may increase efficiency by compensating for an optical resonance distance according to the wavelength of light emitted by the emission layer.

In one or more embodiments, when the hole transport region includes an electron blocking layer, a material for forming the electron blocking layer may include the above-mentioned material for forming the hole transport region, a host material described below, or a combination thereof. For example, when the hole transport region includes an electron blocking layer, a material for forming the electron blocking layer may be mCP described below.

An emission layer may be formed on the hole transport region by using methods, such as vacuum deposition, spin coating, casting, LB, or the like. When the emission layer is formed by vacuum deposition and spin coating, the deposition conditions and the coating conditions may vary depending on a compound used, but may be generally selected within a range of conditions almost identical to the formation of the hole injection layer.

The emission layer may include a host and a dopant, and the dopant may include the organometallic compound represented by Formula 1.

The host may include TPBi, TBADN, AND (also referred to as "DNA"), CBP, CDBP, TCP, mCP, Compound H50, Compound H51, Compound H52, or a combination thereof:

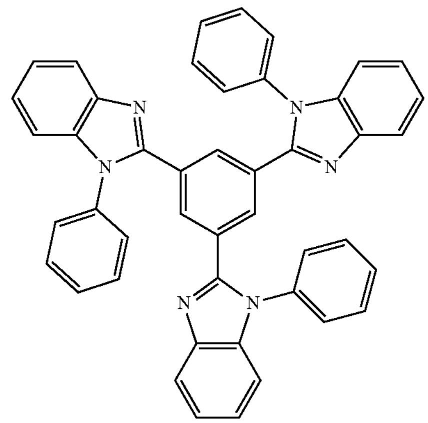

TPBi

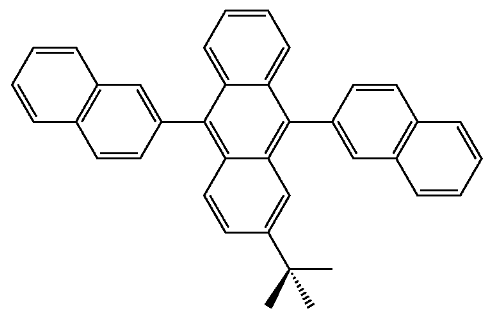

TBADN

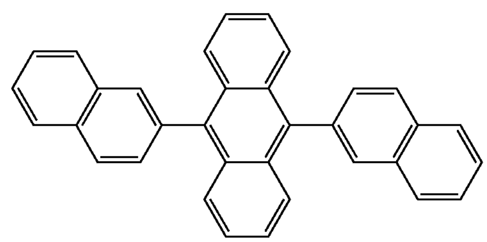

ADN

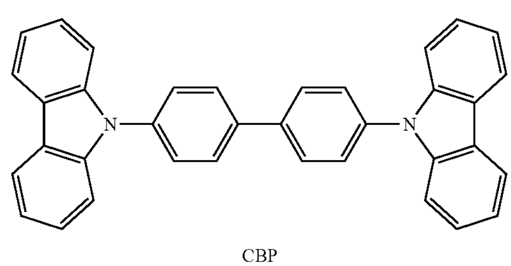

CBP

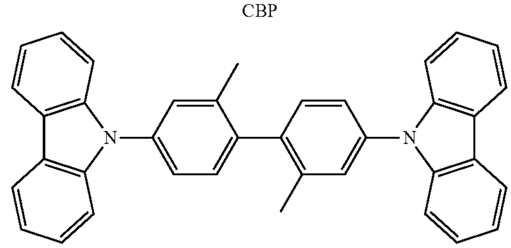

CDBP

-continued

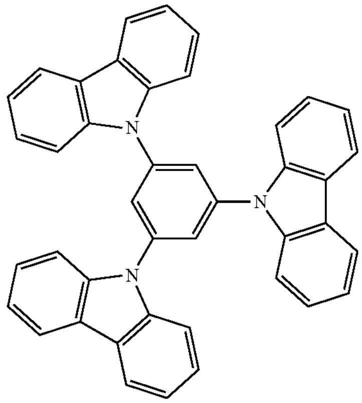

TCP

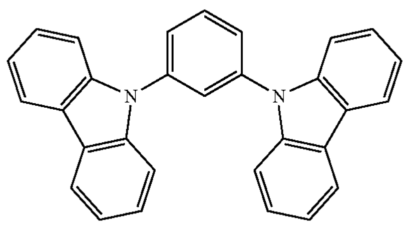

mCP

H50

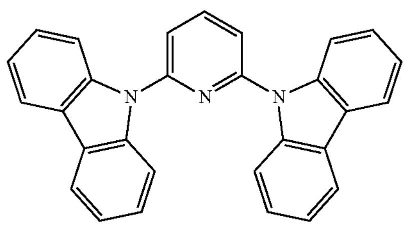

H51

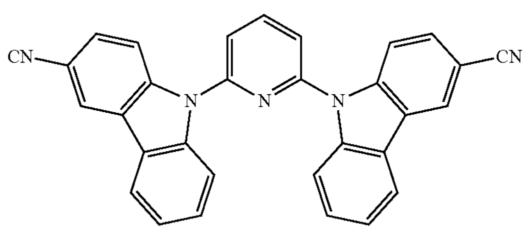

H52

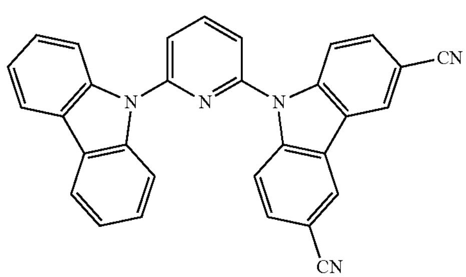

When the organic light-emitting device 10 is a full-color organic light-emitting device, the emission layer may be patterned into a red emission layer, a green emission layer, or a blue emission layer, according to a sub-pixel. In one or more embodiments, the emission layer may have a stacked structure of a red emission layer, a green emission layer, and/or a blue emission layer to emit white light.

When the emission layer includes a host and a dopant, an amount of the dopant may be in a range of about 0.01 parts by weight to about 15 parts by weight based on 100 parts by weight of the host.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Next, an electron transport region may be disposed on the emission layer.

The electron transport region may include a hole blocking layer, an electron transport layer, an electron injection layer, or a combination thereof.

For example, electron transport region may have a hole blocking layer/electron transport layer/electron injection layer structure or an electron transport layer/electron injection layer structure. The electron transport layer may have a single-layered structure or a multi-layered structure having two or more different materials.

Conditions for forming a hole blocking layer, an electron transport layer, and an electron injection layer in the electron transport region may be referred to those for forming the hole injection layer.

When the electron transport region includes a hole blocking layer, the hole blocking layer may include, for example, BCP, Bphen, BAlq, or a combination thereof.

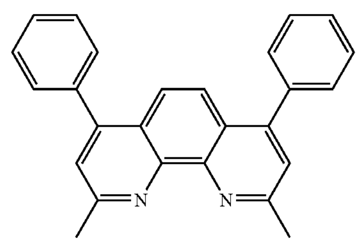

BCP

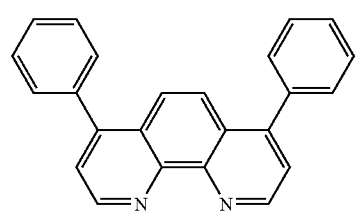

Bphen

A thickness of the hole blocking layer may be in a range of about 20 Å to about 1,000 Å, for example, about 30 Å to about 300 Å. When the thickness of the hole blocking layer is within the range described above, excellent hole blocking characteristics may be obtained without a substantial increase in driving voltage.

The electron transport layer may include BCP, Bphen, $Alq_3$, BAlq, TAZ, NTAZ, or a combination thereof:
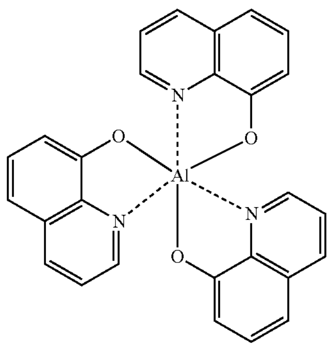
Alq3
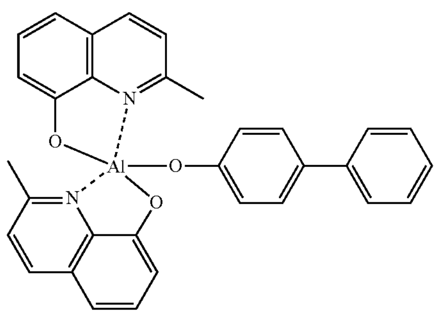
BAlq
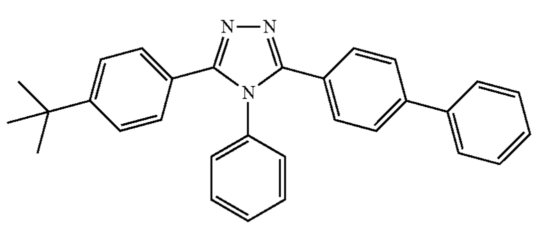
TAZ
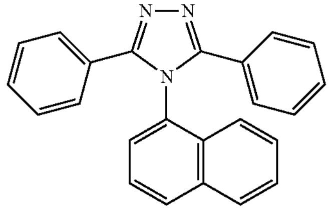
NTAZ
In one or more embodiments, the electron transport layer may include one of Compounds ET1 to ET25, or a combination thereof.
ET1
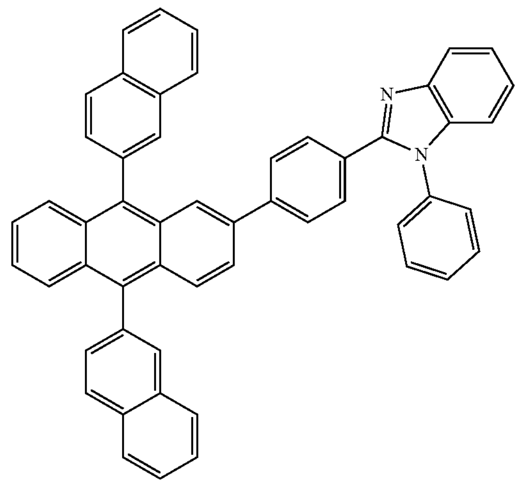
ET2
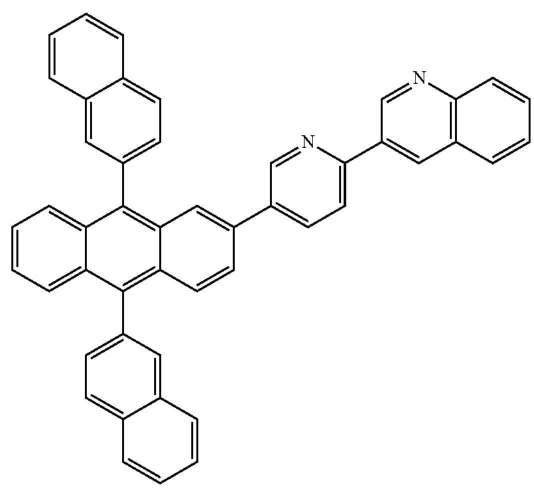
ET3
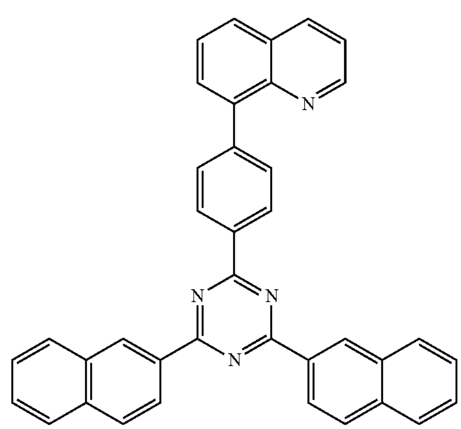

-continued
ET4
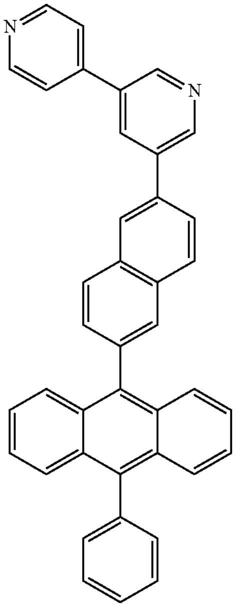
ET5
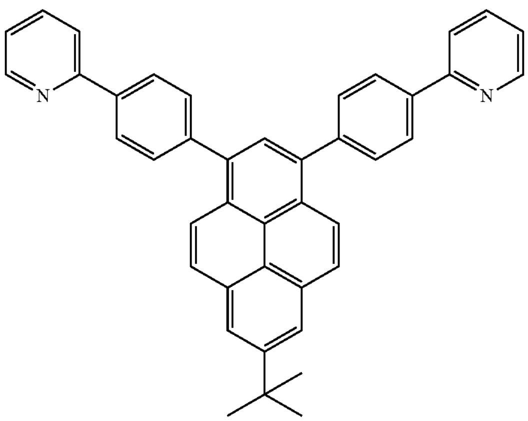
ET6
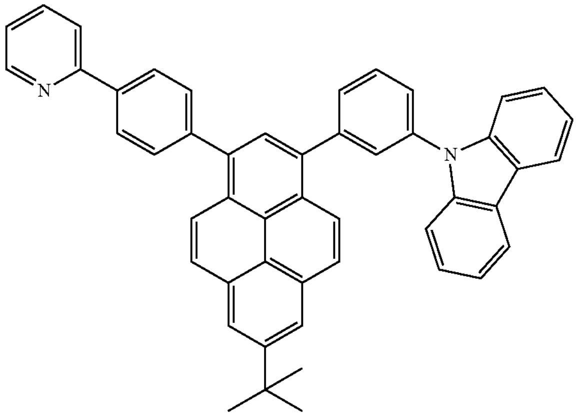
-continued
ET7
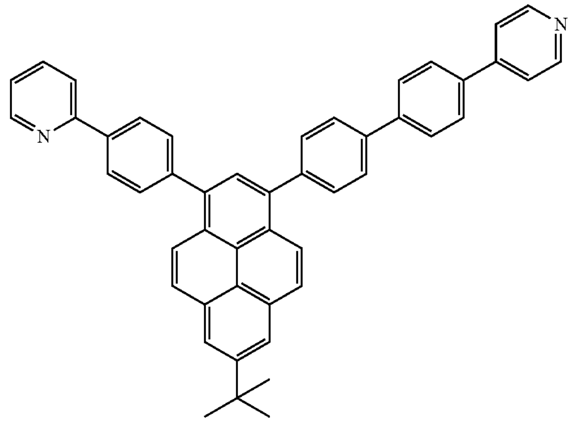
ET8
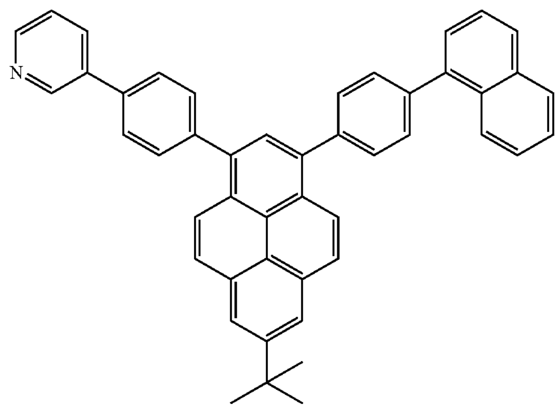
ET9
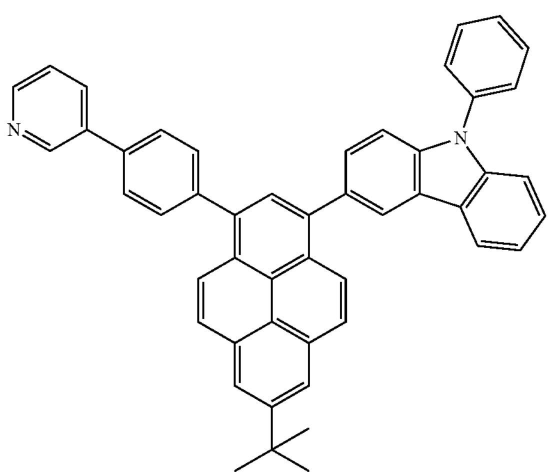

-continued
ET10
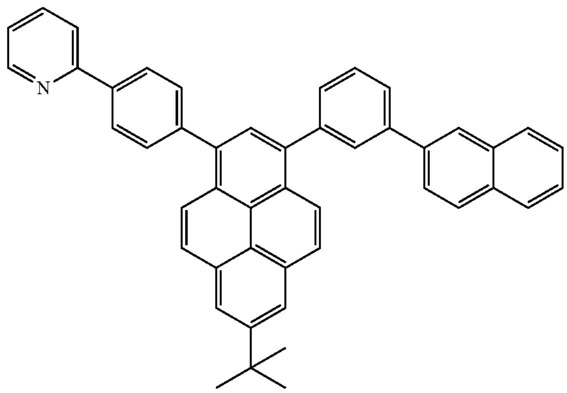
ET11
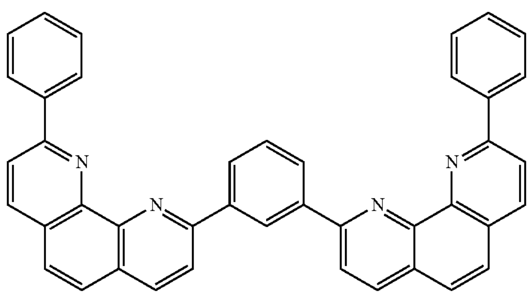
ET12
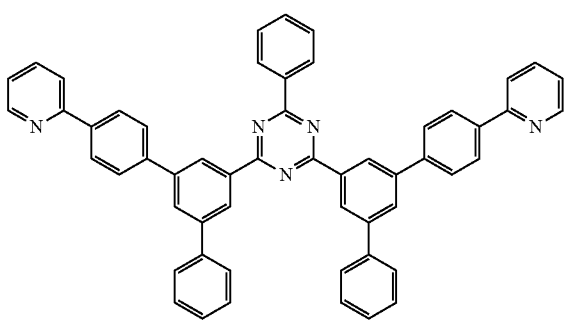
ET13
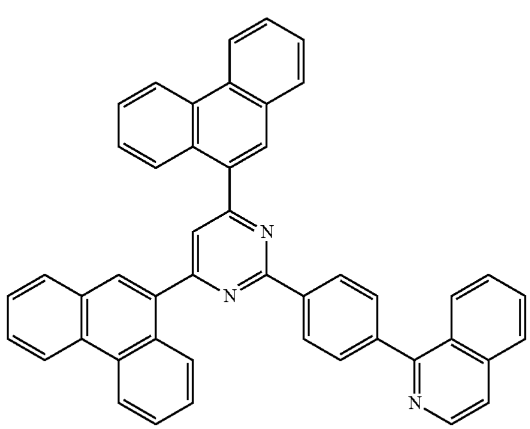
-continued
HT14
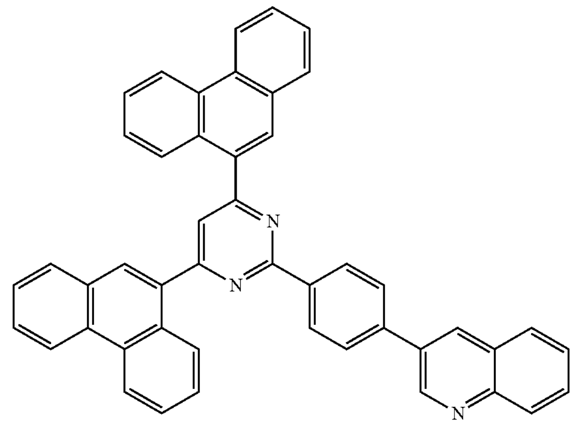
HT15
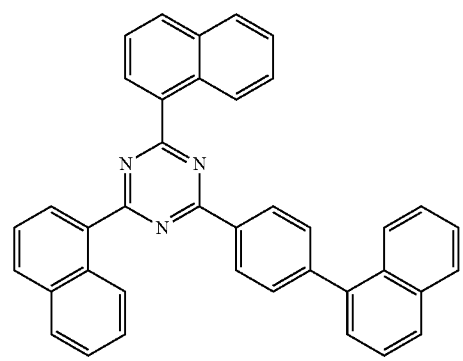
HT16
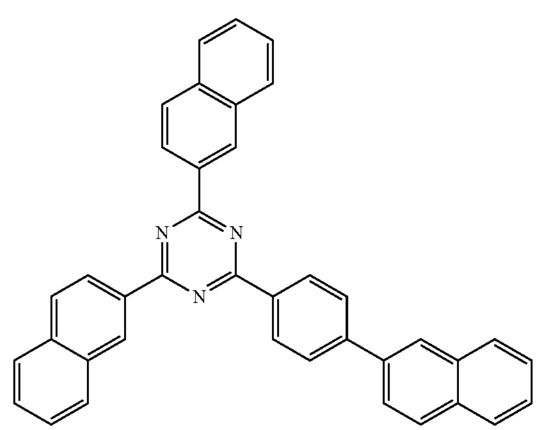

-continued
HT17
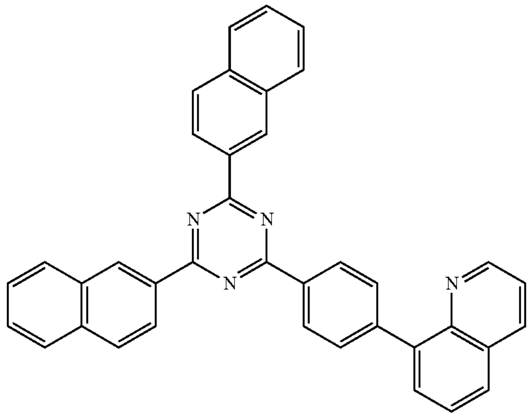
HT18
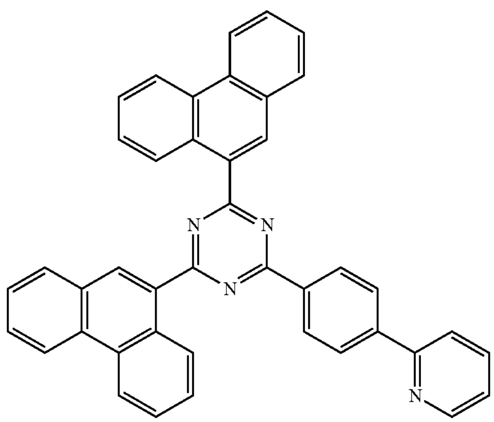
HT19
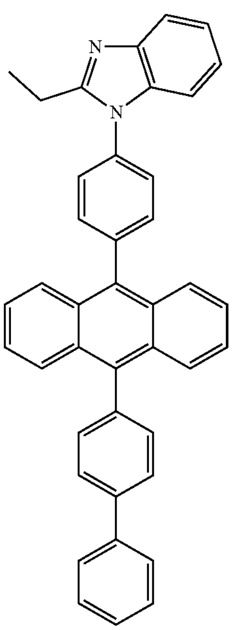
-continued
ET20
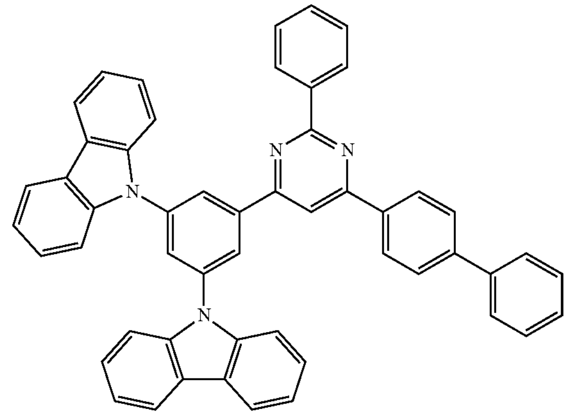
ET21
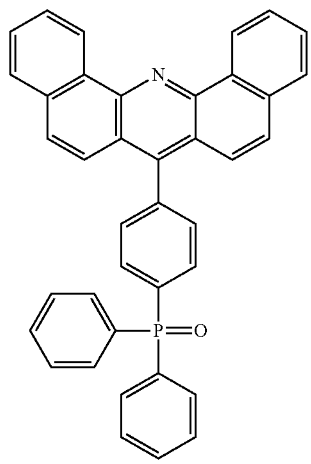
ET22
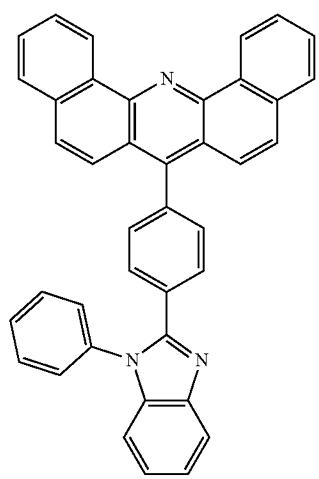

-continued

ET23

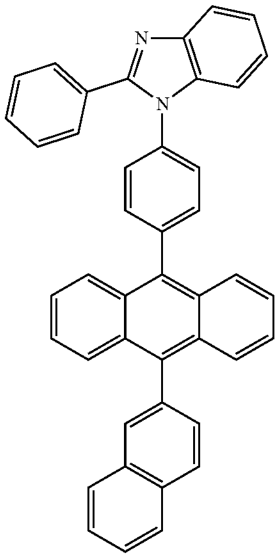

ET24

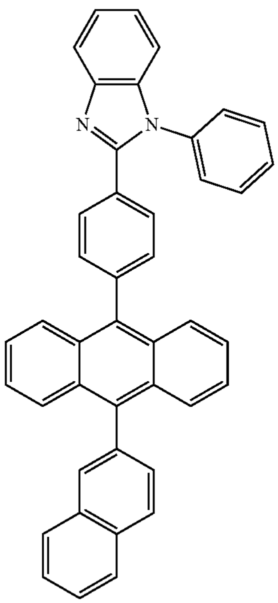

ET25

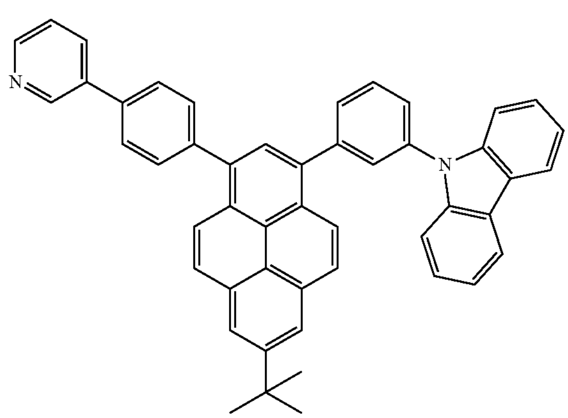

A thickness of the electron transport layer may be in a range of about 100 Å to about 1,000 Å, for example, about 150 Å to about 500 Å. When the thickness of the electron transport layer is within the range described above, satisfactory electron transport characteristics may be obtained without a substantial increase in driving voltage.

The electron transport layer may further include, in addition to the materials described above, a metal-containing material.

The metal-containing material may include a Li complex. The Li complex may include, for example, Compound ET-D1(LiQ) or ET-D2:

ET-D1

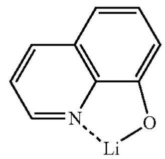

ET-D2

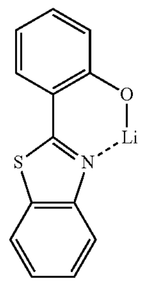

In addition, the electron transport region may include an electron injection layer to facilitate electron injection from the second electrode 19.

The electron injection layer may include LiF, NaCl, CsF, $Li_2O$, BaO, or a combination thereof.

A thickness of the electron injection layer may be in a range of about 1 Å to about 100 Å, for example, about 3 Å to about 90 Å. When the thickness of the electron injection layer is within the range described above, satisfactory electron injection characteristics may be obtained without a substantial increase in driving voltage.

The second electrode 19 may be disposed on the organic layer 15. The second electrode 19 may be a cathode. A material for forming the second electrode 19 may be a metal, an alloy, an electrically conductive compound, or a combination thereof, which has a relatively low work function. For example, the second electrode may comprise lithium (Li), magnesium (Mg), aluminum (Al), aluminum-lithium (Al—Li), calcium (Ca), magnesium-indium (Mg—In), magnesium-silver (Mg—Ag), or the like may be used as the material for forming the second electrode 19. In one or more embodiments, to obtain a top-emission light-emitting device, ITO or IZO may be used to form a transmissive second electrode 19, but embodiments are not limited thereto.

Hereinbefore, the organic light-emitting device according to one or more embodiments has been described in connection with the FIGURE, but embodiments of the present disclosure are not limited thereto.

According to an aspect of another embodiment, an electronic apparatus including the organic light-emitting device may be provided. The electronic apparatus may be used for various purposes such as a display, lighting, and a mobile phone.

Another aspect of the present disclosure provides a diagnostic composition including at least one organometallic compound represented by Formula 1.

The organometallic compound represented by Formula 1 may provide high luminance efficiency, and in this regard, the diagnostic composition including the organometallic compound may have high diagnostic efficiency.

The diagnostic composition may be variously applied to various kits, diagnostic reagents, biosensors, biomarkers, and the like.

The term "$C_1$-$C_{60}$ alkyl group" as used herein refers to a linear or branched saturated aliphatic hydrocarbon monovalent group having 1 to 60 carbon atoms. The term "$C_1$-$C_{60}$ alkylene group" as used herein refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group as used herein may include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group or a tert-decyl group, each unsubstituted or substituted with a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or a combination thereof. In some embodiments, such as in Formula 9-33, the alkyl group may be a branched $C_6$ alkyl group. Formula 9-33 may be a tert-butyl group substituted with two methyl groups.

The term "$C_1$-$C_{60}$ alkoxy group" as used herein refers to a monovalent group represented by —$OA_{101}$ (wherein $A_{101}$ is a $C_1$-$C_{60}$ alkyl group). Examples of the $C_1$-$C_{60}$ alkoxy group, the $C_1$-$C_{20}$ alkoxy group, or the $C_1$-$C_{10}$ alkoxy group as used herein may include a methoxy group, an ethoxy group, a propoxy group, a butoxy group, or a pentoxy group.

The term "$C_2$-$C_{60}$ alkenyl group" as used herein refers to a group formed by placing at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a group formed by placing at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent cyclic saturated hydrocarbon group including 3 to 10 carbon atoms. The term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group as used herein may include a cyclopropyl group, a cyclobutyl group, a cyclopentyl group, a cyclohexyl group, a cycloheptyl group, a cyclooctyl group, an adamantanyl group, a norbornanyl group (a bicyclo[2.2.1]heptyl group), a bicyclo[1.1.1]pentyl group, a bicyclo[2.1.1]hexyl group, or a bicyclo[2.2.2]octyl group.

The term "$C_1$-$C_{10}$ heterocycloalkyl group" as used herein refers to a monovalent monocyclic group including at least one heteroatom selected from N, O, P, Si, Se, Ge, B, and S as a ring-forming atom and 1 to 10 carbon atoms. The term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group as used herein may include a silolanyl group, a silinanyl group, a tetrahydrofuranyl group, a tetrahydro-2H-pyranyl group, or a tetrahydrothiophenyl group.

The term "$C_3$-$C_{10}$ cycloalkenyl group" as used herein refers to a monovalent monocyclic group that has 3 to 10 carbon atoms and at least one carbon-carbon double bond in its ring, wherein the molecular structure as a whole is non-aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group including at least one heteroatom selected from N, O, P, Si, Se, Ge, B, and S as a ring-forming atom, 1 to 10 carbon atoms, and at least one double bond in its ring wherein the molecular structure as a whole is non-aromatic. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include a plurality of rings, the plurality of rings may be fused to each other.

The term "$C_7$-$C_{60}$ alkylaryl group" as used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having a heterocyclic aromatic system having at least one heteroatom selected from N, O, P, Si, Se, Ge, B, and S as a ring-forming atom and 1 to 60 carbon atoms. The term "$C_1$-$C_{60}$ heteroarylene group" as used herein refers to a divalent group having a heterocyclic aromatic system having at least one heteroatom selected from N, O, P, Si, Se, Ge, B, and S as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include a plurality of rings, the plurality of rings may be fused to each other.

The term "$C_2$-$C_{60}$ alkylheteroaryl group" as used herein refers to a $C_1$-$C_{60}$ heteroaryl group substituted with at least one $C_1$-$C_{60}$ alkyl group.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group). The term "$C_1$-$C_{60}$ alkylthio group" as used herein is represented by —$SA_{104}$ (wherein $A_{104}$ is the $C_1$-$C_{60}$ alkyl group).

The term "$C_1$-$C_{60}$ heteroaryloxy group" as used herein refers to —$OA_{106}$ (wherein $A_{106}$ is the $C_2$-$C_{60}$ heteroaryl group), the term "$C_1$-$C_{60}$ heteroarylthio group" as used herein indicates —$SA_{107}$ (wherein $A_{107}$ is the $C_1$-$C_{60}$ heteroaryl group), and the term "$C_2$-$C_{60}$ heteroarylalkyl group" as used herein refers to -$A_{108}A_{109}$ ($A_{109}$ is a $C_1$-$C_{59}$ heteroaryl group, and $A_{108}$ is a $C_1$-$C_{59}$ alkylene group).

The term "monovalent non-aromatic condensed polycyclic group" as used herein refers to a monovalent group that has two or more condensed rings and only carbon atoms (e.g., the number of carbon atoms may be in a range of 8 to 60) as ring-forming atoms, wherein the molecular structure as a whole is non-aromatic. Examples of the monovalent non-aromatic condensed polycyclic group include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and a heteroatom selected from N, O, P, Si, Se, Ge, B, and S and carbon atoms (e.g., the number of carbon atoms may be in a range of 1 to 60) as ring-forming atoms, wherein the molecular structure as a whole is non-aromatic. Examples of the monovalent non-aromatic condensed heteropolycyclic group include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms as ring-forming atoms. The $C_5$-$C_{30}$ carbocyclic group may be a monocyclic group or a polycyclic group. Examples of the "$C_5$-$C_{30}$ carbocyclic group (unsubstituted or substituted with at least one $R_{10a}$)" may include an adamantane group, a norbornene group, a norbornane group (a bicyclo[2.2.1]heptane group), a bicyclo[1.1.1]pentane group, a bicyclo[2.1.1]hexane group, a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, or a fluorene group, each unsubstituted or substituted with at least one $R_{10a}$ as defined herein.

The term "$C_1$-$C_{30}$ heterocyclic group" as used herein refers to saturated or unsaturated cyclic group including 1 to 30 carbon atoms and at least one heteroatom selected from N, O, P, Si, Se, Ge, B, and S as ring-forming atoms. The $C_1$-$C_{30}$ heterocyclic group may be a monocyclic group or a polycyclic group. Examples of the "$C_1$-$C_{30}$ heterocyclic group (unsubstituted or substituted with at least one $R_{10a}$)" may include a thiophene group, a furan group, a pyrrole group, a silole group, a borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophenegroup, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, each unsubstituted or substituted with at least one $R_{10a}$ as defined herein.

Examples of the terms "$C_5$-$C_{30}$ carbocyclic group" and "$C_1$-$C_{30}$ heterocyclic group" as used herein may include i) a first ring, ii) a second ring, iii) a condensed cyclic group in which two or more first rings are condensed with each other, iv) a condensed cyclic group in which two or more second rings are condensed with each other, or v) a condensed cyclic group in which at least one first ring is condensed with at least one second ring,

- the first ring may be a cyclopentane group, a cyclopentadiene group, a furan group, a thiophene group, a pyrrole group, a silole group, a germole group, a borole group, a selenophene group, a phosphole group, an oxazole group, an oxadiazole group, an oxatriazole group, a thiazole group, a thiadiazole group, a thiatriazole group, a pyrazole group, an imidazole group, a triazole group, a tetrazole group, an azasilole group, an azagermole group, an azaborole group, an azaselenophene group, or an azaphosphole group, and
- the second ring may be an adamantane group, a norbornane group (a bicyclo[2.2.1]heptane group), a norbornene group, a bicyclo[1.1.1]pentane group, a bicyclo[2.1.1]hexane group, a bicyclo[2.2.2]octane group, a cyclohexane group, a cyclohexene group, a benzene group, a pyridine group, a pyrimidine group, a pyrazine group, a pyridazine group, or a triazine group.

The "fluorinated $C_1$-$C_{60}$ alkyl group (or fluorinated $C_1$-$C_{20}$ alkyl group or the like)", "fluorinated $C_3$-$C_{10}$ cycloalkyl group", "fluorinated $C_1$-$C_{10}$ heterocycloalkyl group", and "fluorinated phenyl group" as used herein may respectively be a $C_1$-$C_{60}$ alkyl group (or $C_1$-$C_{20}$ alkyl group or the like), $C_3$-$C_{10}$ cycloalkyl group, a $C_1$-$C_{10}$ heterocycloalkyl group, and a phenyl group, each substituted with at least one fluoro group (—F). Examples of the "fluorinated $C_1$ alkyl group (i.e., a fluorinated methyl group)" include —$CF_3$, —$CF_2H$, and —$CFH_2$. The "fluorinated $C_1$-$C_{60}$ alkyl group (or fluorinated $C_1$-$C_{20}$ alkyl group or the like)", "fluorinated $C_3$-$C_{10}$ cycloalkyl group", or "fluorinated $C_1$-$C_{10}$ heterocycloalkyl group" may respectively be: i) a fully fluorinated $C_1$-$C_{60}$ alkyl group (or fully fluorinated $C_1$-$C_{20}$ alkyl group or the like), fully fluorinated $C_3$-$C_{10}$ cycloalkyl group, or fully fluorinated $C_1$-$C_{10}$ heterocycloalkyl group, in which all hydrogen atoms are substituted with fluoro groups; or ii) a partially fluorinated $C_1$-$C_{60}$ alkyl group (or partially fluorinated $C_1$-$C_{20}$ alkyl group or the like), partially fluorinated $C_3$-$C_{10}$ cycloalkyl group, or partially fluorinated $C_1$-$C_{10}$ heterocycloalkyl group, in which one or more hydrogen atoms are substituted with fluoro groups.

The "deuterated $C_1$-$C_{60}$ alkyl group (or deuterated $C_1$-$C_{20}$ alkyl group or the like)", "deuterated $C_3$-$C_{10}$ cycloalkyl group", "deuterated $C_1$-$C_{10}$ heterocycloalkyl group", and "deuterated phenyl group" as used herein may respectively be a $C_1$-$C_{60}$ alkyl group (or $C_1$-$C_{20}$ alkyl group or the like), $C_3$-$C_{10}$ cycloalkyl group, a $C_1$-$C_{10}$ heterocycloalkyl group, and a phenyl group, each substituted with at least one deuterium. Examples of the "deuterated $C_1$ alkyl group (i.e., a deuterated methyl group)" may include —$CD_3$, —$CD_2H$, and —$CDH_2$ and examples of the "deuterated $C_3$-$C_{10}$ cycloalkyl group" may refer to Formula 10-501 described in this disclosure. The "deuterated $C_1$-$C_{60}$ alkyl group (or deuterated $C_1$-$C_{20}$ alkyl group or the like)", "deuterated $C_3$-$C_{10}$ cycloalkyl group", or "deuterated $C_1$-$C_{10}$ heterocycloalkyl group" may respectively be: i) a fully deuterated $C_1$-$C_{60}$ alkyl group (or fully deuterated $C_1$-$C_{20}$ alkyl group or the like), fully deuterated $C_3$-$C_{10}$ cycloalkyl group, or fully deuterated $C_1$-$C_{10}$ heterocycloalkyl group, in which all hydrogen atoms are substituted with deuterium; or ii) a partially deuterated $C_1$-$C_{60}$ alkyl group (or partially deuterated $C_1$-$C_{20}$ alkyl group or the like), partially deuterated $C_3$-$C_{10}$ cycloalkyl group, or partially deuterated $C_1$-$C_{10}$ heterocycloalkyl group, in which one or more hydrogen atoms are substituted with deuterium(s).

The "($C_1$-$C_{20}$ alkyl)'X' group" refers to a 'X' group substituted with at least one $C_1$-$C_{20}$ alkyl group. For example, the "($C_1$-$C_{20}$ alkyl) $C_3$-$C_{10}$ cycloalkyl group" as used herein refers to a $C_3$-$C_{10}$ cycloalkyl group substituted with at least one $C_1$-$C_{20}$ alkyl group, and the "($C_1$-$C_{20}$ alkyl)phenyl group" as used herein refers to a phenyl group substituted with at least one $C_1$-$C_{20}$ alkyl group. Examples of the ($C_1$ alkyl)phenyl group may include a toluyl group.

In the present specification, "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" each refer to a heterocyclic ring in which at least one ring-forming carbon atom is substituted with a nitrogen atom and respectively having an identical backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group".

Substituents of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alklythio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, $C_1$-$C_{60}$ alkoxy group, or $C_1$-$C_{60}$ alkylthio group each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-Coo arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), Ge($Q_{13}$)($Q_{14}$)($Q_{15}$), —B($Q_{16}$)($Q_{17}$), —P(═O)($Q_{18}$)($Q_{19}$), —P($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or a combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, $P(=O)(Q_{38})(Q_{39})$, or —$P(Q_{38})(Q_{39})$; or a combination thereof.

In the present specification, $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, —F, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, —F, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a $C_2$-$C_{60}$ alkylheteroaryl group; a monovalent non-aromatic condensed polycyclic group; or a monovalent non-aromatic condensed heteropolycyclic group.

For example, $Q_1$ to Qg, $Q_{11}$ to $Q_{19}$, $Q_{21}$ to $Q_{29}$, and $Q_{31}$ to $Q_{39}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, a sec-isopentyl group, a phenyl group, a biphenyl group, or a naphthyl group, each unsubstituted or substituted with deuterium, a $C_1$-$C_{20}$ alkyl group, a phenyl group, or a combination thereof.

Hereinafter, a compound according to one or more exemplary embodiments and an organic light-emitting device according to one or more exemplary embodiments will be described in further detail with reference to Synthesis Examples and Examples, but the present disclosure is not limited to Synthesis Examples and Examples below. The expression "B was used instead of A" used in describing Synthesis Examples means that an identical number of molar equivalents of A was used in place of molar equivalents of B.

EXAMPLES

Synthesis Example 1 (Compound 15)

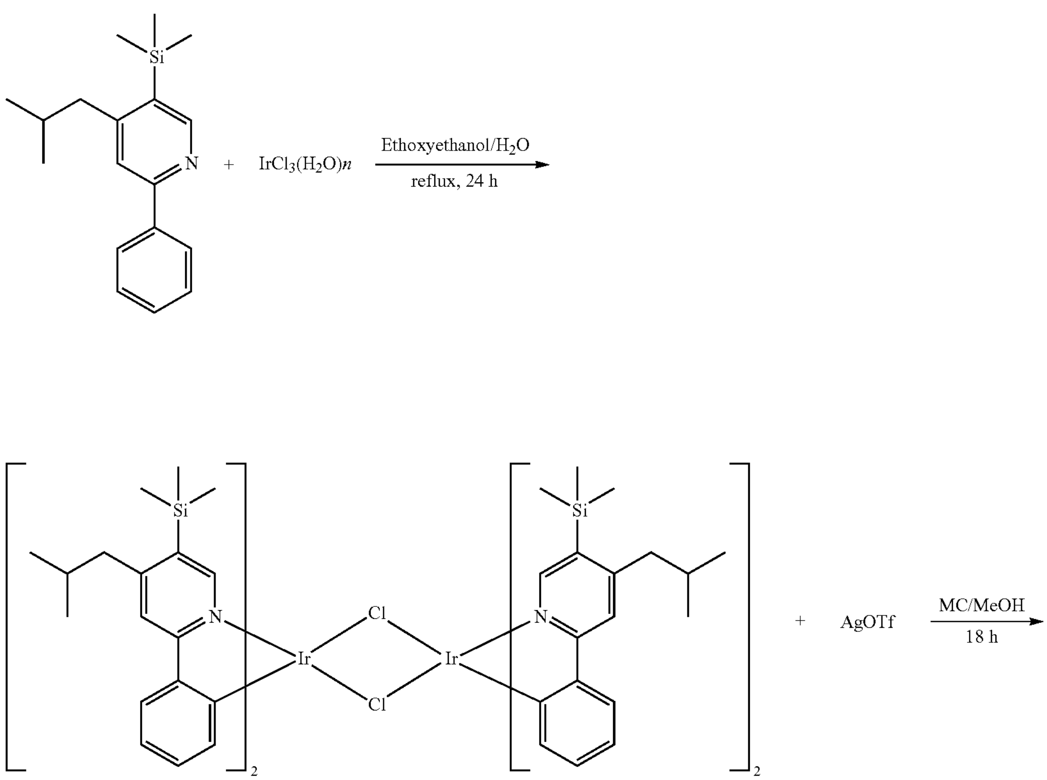

15A

-continued

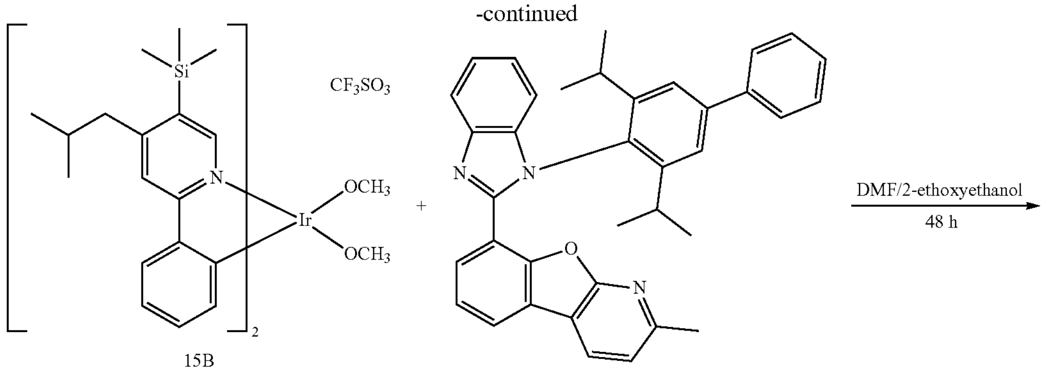

15B

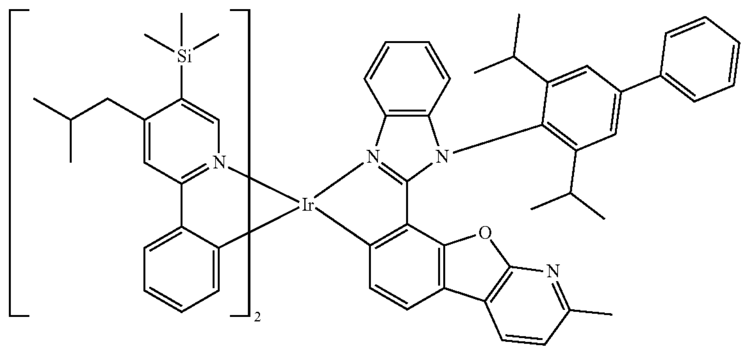

15

Synthesis of Compound 15A 4-isobutyl-2-phenyl-5-(trimethylsilyl)pyridine (7.5 grams (g), 26.7 millimoles (mmol)) and iridium chloride (4.1 g, 11.9 mmol) were mixed with 120 milliliters (mL) of ethoxyethanol and 40 mL of deionized water, and then the mixture was stirred at reflux for 24 hours, and subsequently cooled to room temperature. A solid material formed therefrom was separated by filtration and washed thoroughly with water, methanol, and hexane in the stated order to obtain a solid which was then dried in a vacuum oven to obtain 7.43 g (yield of 79%) of Compound 15A.

Synthesis of Compound 15B

After Compound 15A (3.0 g, 1.91 mmol) and 60 mL of methylene chloride were mixed, AgOTf (silver triflate, 0.98 g, 3.81 mmol) and 20 mL of methanol were mixed and added thereto. Subsequently, the mixture was stirred for 18 hours at room temperature while blocking light with aluminum foil, and then a resultant (Compound 15B) obtained by removing a solid generated by Celite filtration and decompressing a filtrate was used in the next reaction without additional purification.

Synthesis of Compound 15

Compound 15B(3.68 g, 3.79 mmol) and 8-(1-(3,5-diisopropyl-[1,1'-biphenyl]-4-yl)-1H-benzo[d]imidazol-2-yl)-2-methylbenzofuro[2,3-b]pyridine)(2.24 g, 4.17 mmol) were mixed with 50 mL of 2-ethoxyethanol and 50 mL of dimethylformamide, and the mixture was stirred while refluxing for 48 hours at 130° C., and then the temperature was reduced to the room temperature. A compound obtained therefrom was decompressed to obtain a solid which was then subject to column chromatography using methylene chloride (MC):hexane to obtain 2.0 g (yield of 41%) of Compound 15. The material was identified by Mass spectrum and HPLC analysis.

High resolution mass spectrometry (HRMS) Matrix Assisted Laser Desorption Ionization (MALDI) calcd for $C_{73}H_{80}IrN_5OSi_2$: m/z 1291.5531 Found: 1291.5529.

Synthesis Example 2 (Compound 295)

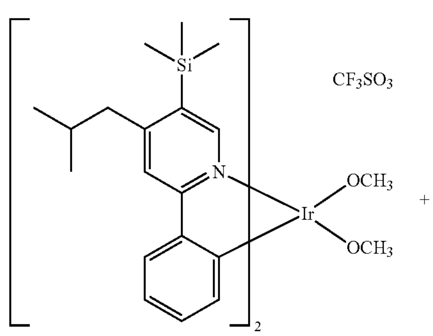

15B

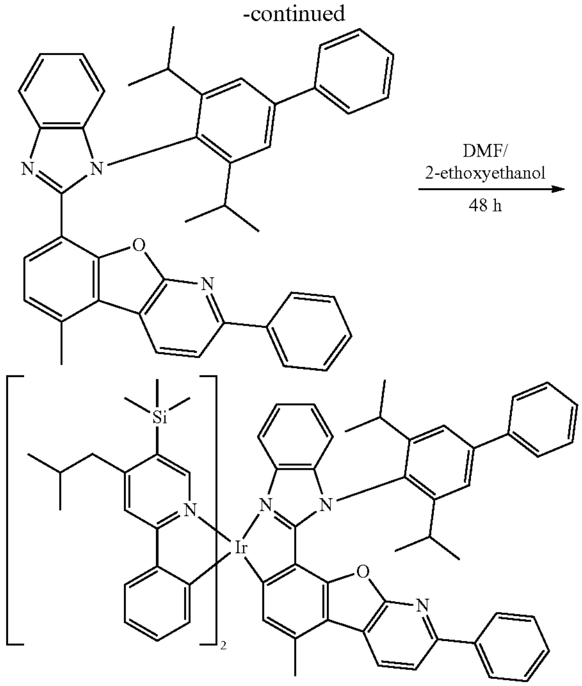

295

0.78 g (yield of 39%) of Compound 295 was obtained by using the same method as the synthesis method of Compound 15 of Synthesis Example 1, except that 8-(1-(3,5-diisopropyl-[1,1'-biphenyl]-4-yl)-1H-benzo[d]imidazol-2-yl)-5-methyl-2-phenylbenzofuro[2,3-b]pyridine was used instead of 8-(1-(3,5-diisopropyl-[1,1'-biphenyl]-4-yl)-1H-benzo[d]imidazol-2-yl)-2-methylbenzofuro[2,3-b]pyridine. The substance was identified by HRMS and HPLC analysis.

HRMS (MALDI) calcd for $C_{81}H_{88}IrN_5OSi_2$: m/z 1395.9863 Found: 1395.96.

Synthesis Example 13 (Compound 184)

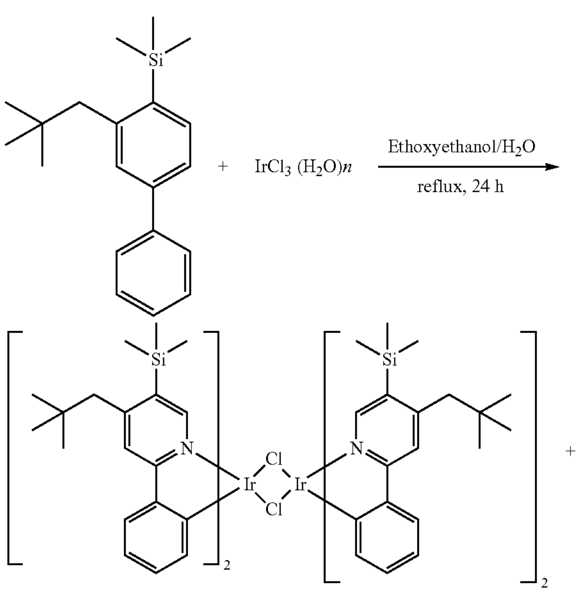

184A

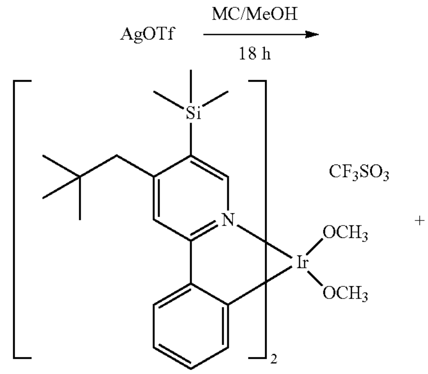

184B

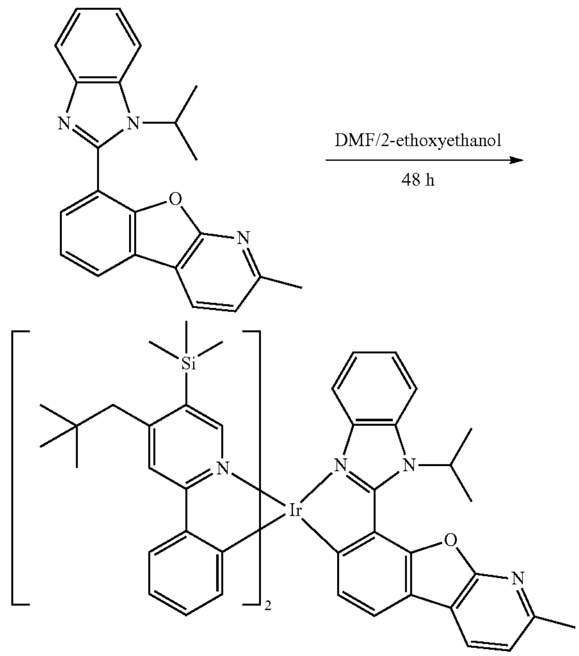

184

Synthesis of Compound 184A 7.1 g (yield of 71%) of Compound 184A was obtained by using the same method as the synthesis method of Compound 15A of Synthesis Example 1, except that 4-neopentyl-2-phenyl-5-(trimethylsilyl)pyridine was used instead of 4-isopropyl-2-phenyl-5-(trimethylsilyl)pyridine.

Synthesis of Compound 184B

Compound 184B was obtained by using the same method as the synthesis method of Compound 15B of Synthesis Example 1, except that Compound 184A was used instead of Compound 15A. The obtained Compound 184B was used in the next reaction without further purification.

Synthesis of Compound 184

0.53 g (yield of 28%) of Compound 184 was obtained by using the same method as the synthesis method of Compound 15 of Synthesis Example 1, except that Compound 184B was used instead of Compound 15B, and 8-(1-isopropyl-1H-benzo[d]imidazol-2-yl)-2-methylbenzofuro[2,3-b]pyridine was used instead of 8-(1-(3,5-diisopropyl-[1,1'-biphenyl]-4-yl)-1H-benzo[d]imidazol-2-yl)-2-methylbenzofuro[2,3-b]pyridine. The substance was identified by HRMS and HPLC analysis.

HRMS (MALDI) calcd for $C_{60}H_{70}IrN_5Si_2$: m/z 1125.4748 Found: 1125.4744.

Synthesis Example 4 (Compound 212)

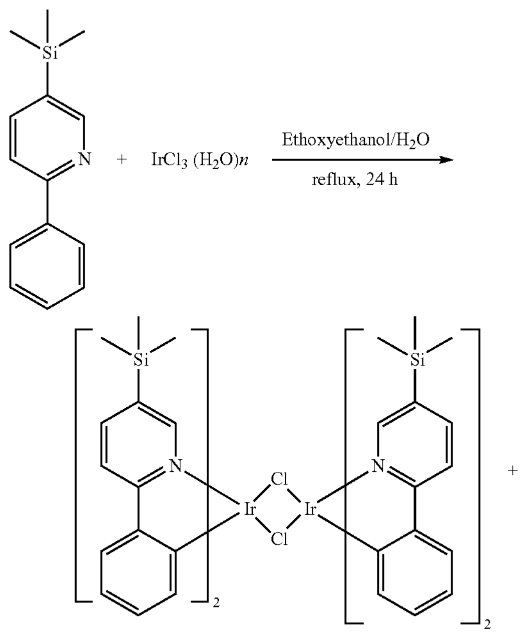

212A

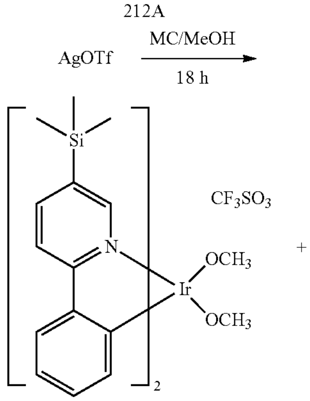

212B

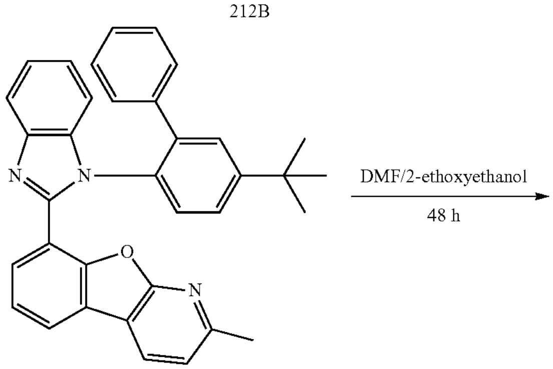

-continued

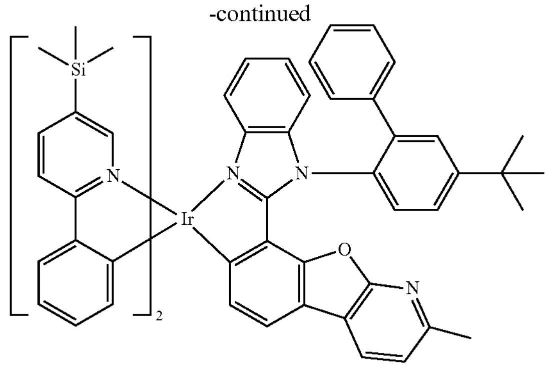

212

Synthesis of Compound 212A 2-phenyl-5-(trimethylsilyl)pyridine (7.5 g, 33.1 mmol) and iridium chloride (5.2 g, 14.7 mmol) were mixed with 120 mL of ethoxyethanol and 40 mL of deionized water, and then the mixture was stirred while refluxing for 24 hours and cooled to room temperature. A solid material generated therefrom was separated by filtration and washed thoroughly with in the order of water/methanol/hexane to obtain a solid which was dried in a vacuum oven to obtain 8.2 g (yield of 82%) of Compound 212A.

Synthesis of Compound 212B

After Compound 212A (1.6 g, 1.2 mmol) and 45 mL of methylene chloride were mixed, AgOTf (0.6 g, 2.3 mmol) and 15 mL of methanol were mixed and added thereto. Subsequently, the mixture was stirred for 18 hours at room temperature while blocking light with aluminum foil, and then a solid (Compound 212B) obtained by removing a solid generated by Celite filtration and decompressing a filtrate was used in the next reaction without additional purification.

Synthesis of Compound 212

Compound 212B(1.49 g, 1.74 mmol) and 8(-(1-(5-(tert-butyl)-[1,1'-biphenyl]-2-yl)-1H-benzo[d]imidazol-2-yl)-2-methylbenzofuro[2,3-b]pyridine)(0.97 g, 1.91 mmol) were mixed with 20 mL of 2-ethoxyethanol and 20 mL of dimethylformamide, and the mixture was stirred while refluxing for 48 hours at 130° C., and then the temperature was lowered. A compound obtained therefrom was decompressed to obtain a solid which was then subjected to column chromatography using MC: hexane to obtain 0.73 g (yield of 37%) of Compound 212. The substance was identified by HRMS and HPLC analysis.

HRMS (MALDI) calcd for $C_{63}H_{60}IrN_5OSi_2$: m/z 1151.3699 Found: 1151.3698.

Synthesis Example 5 (Compound 487)

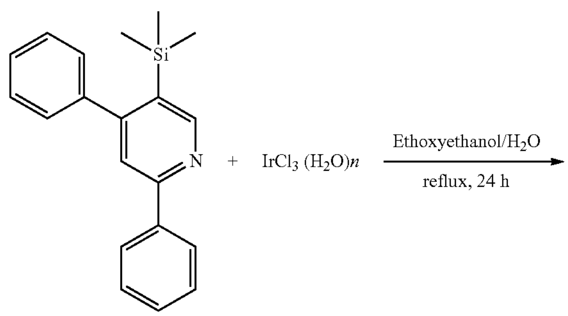

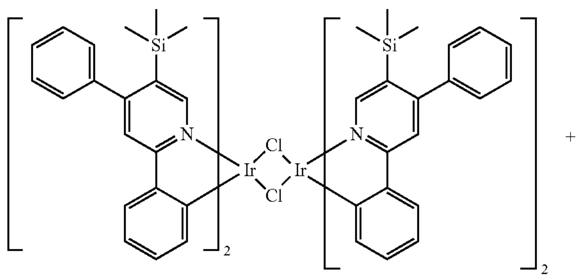

487A

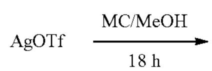

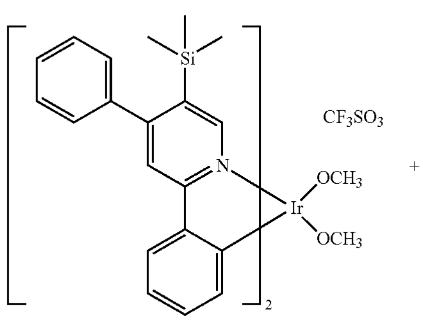

487B

-continued

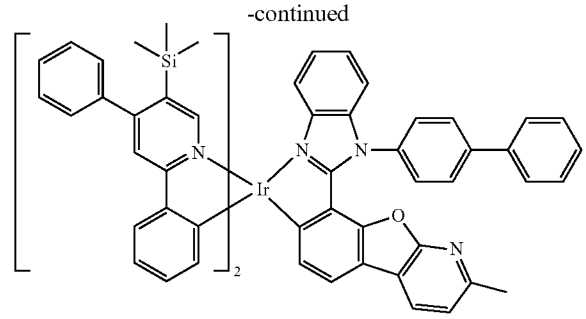

487

Synthesis of Compound 487A 3.4 g (yield of 74%) of Compound 487A was obtained by using the same method as the synthesis method of Compound 212A of Synthesis Example 4, except that 2,4-diphenyl-5-(trimethylsilyl)pyridine was used instead of 2-phenyl-5-(trimethylsilyl)pyridine.

Synthesis of Compound 487B

Compound 487B was obtained by using the same method as the synthesis method of Compound 212B of Synthesis Example 4, except that Compound 487A was used instead of Compound 212A. The obtained Compound 487B was used in the next reaction without further purification.

Synthesis of Compound 487

0.84 g (yield of 42%) of Compound 487 was obtained by using the same method as the synthesis method of Compound 212 of Synthesis Example 4, except that Compound 487B was used instead of Compound 212B and 8-(1-([1,1'-biphenyl]-4-yl)-1H-benzo[d]imidazol-2-yl)-2-methylbenzofuro[2,3-b]pyridine was used instead of 8(-(1-(5-(tert-butyl)-[1,1'-biphenyl]-2-yl)-1H-benzo[d]imidazol-2-yl)-2-methylbenzofuro[2,3-b]pyridine. The substance was identified by HRMS and HPLC analysis.

HRMS (MALDI) calcd for $C_{71}H_{60}IrN_5OSi_2$: m/z 1247.6570 Found: 1247.6571.

Synthesis Example 6 (Compound 982)

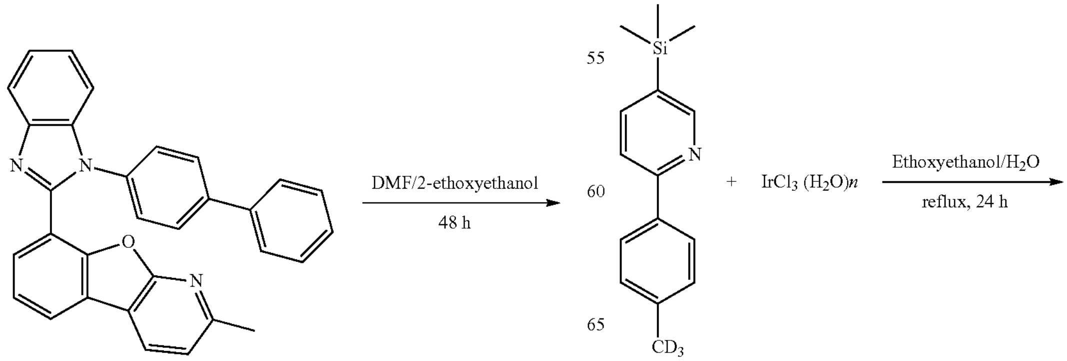

-continued

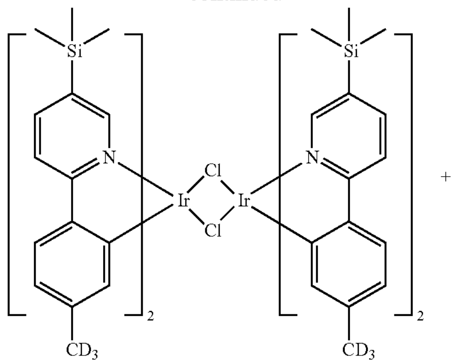

982A

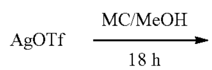

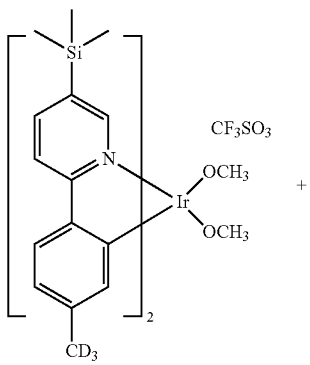

982B

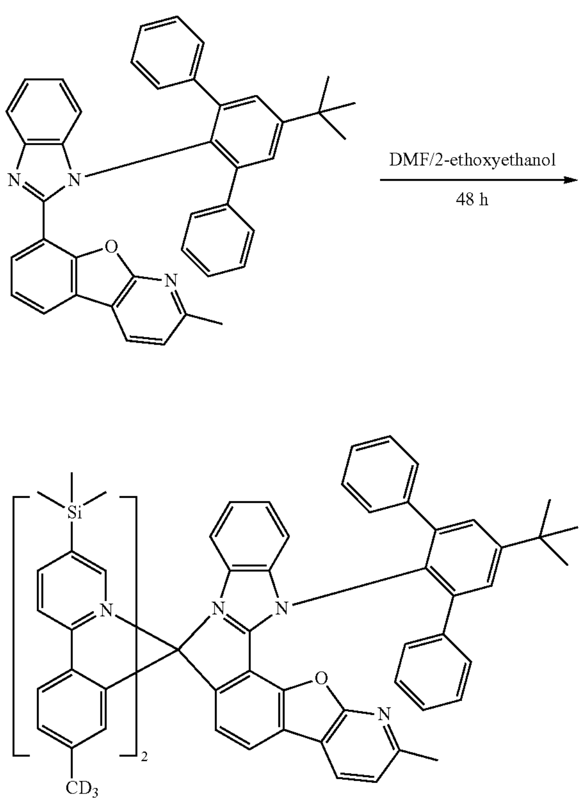

982

Synthesis of Compound 982A 5.3 g (yield of 79%) of Compound 982A was obtained by using the same method as the synthesis method of Compound 212A of Synthesis Example 4, except that (2-(p-tolyl-D3)-5-(trimethylsilyl)pyridine) was used instead of 2-phenyl-5-(trimethylsilyl)pyridine.

Synthesis of Compound 982B

Compound 982B was obtained by using the same method as the synthesis method of Compound 212B of Synthesis Example 4, except that Compound 982A was used instead of Compound 212A. The obtained Compound 982B was used in the next reaction without further purification.

Synthesis of Compound 982

0.78 g (yield of 39%) of Compound 982 was obtained by using the same method as the synthesis method of Compound 212 of Synthesis Example 4, except that Compound 982B was used instead of Compound 212B and 8-(1-(5'-(tert-butyl)-[1,1':3',1"-terphenyl]-2'-yl)-1H-benzo[d]imidazol-2-yl)-2-methylbenzofuro[2,3-b]pyridine was used instead of 8(-(1-(5-(tert-butyl)-[1,1'-biphenyl]-2-yl)-1H-benzo[d]imidazol-2-yl)-2-methylbenzofuro[2,3-b]pyridine. The substance was identified by HRMS and HPLC analysis.

HRMS (MALDI) calcd for $C_{71}H_{62}D_6IrN_5OSi_2$: m/z 1261.4968 Found: 1261.4956.

Synthesis Example 7 (Compound 1042)

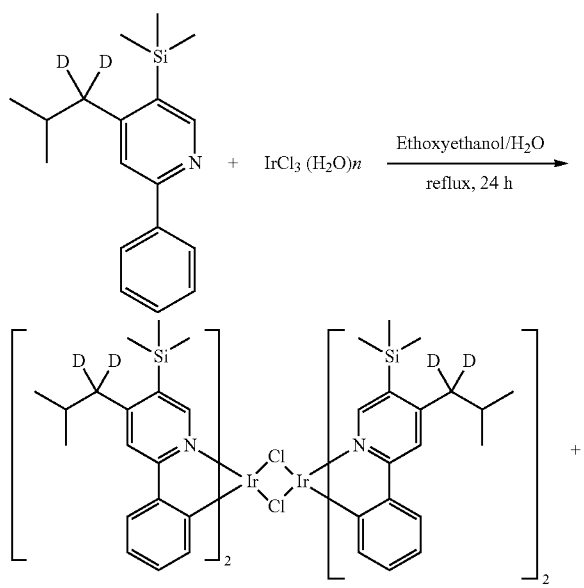

1042A

AgOTf $\xrightarrow[\text{18 h}]{\text{MC/MeOH}}$

-continued

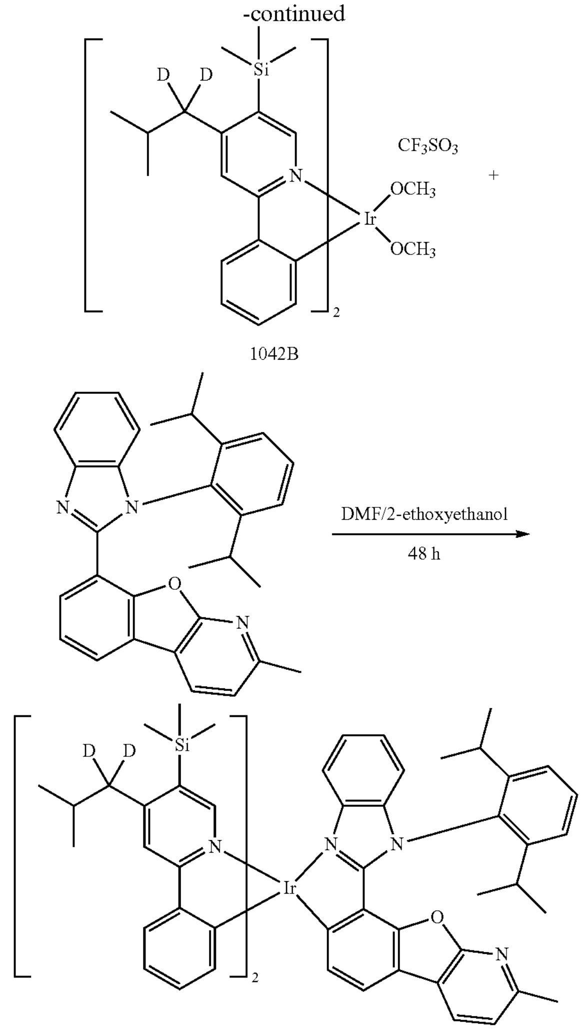

1042B

1042

Synthesis of Compound 1042A 2.5 g (yield of 68%) of Compound 1042A was obtained by using the same method as the synthesis method of Compound 212A of Synthesis Example 4, except that 4-isobutyl(D2)-2-phenyl-5-(trimethylsilyl)pyridine was used instead of 2-phenyl-5-(trimethylsilyl)pyridine.

Synthesis of Compound 1042B

Compound 1042B was obtained by using the same method as the synthesis method of Compound 212B of Synthesis Example 4, except that Compound 1042A was used instead of Compound 212A. The obtained Compound 1042B was used in the next reaction without further purification.

Synthesis of Compound 1042

0.49 g (yield of 33%) of Compound 1042 was obtained by using the same method as the synthesis method of Compound 212 of Synthesis Example 4, except that Compound 1042B was used instead of Compound 212B and 8-(1-(2,6-diisopropylphenyl)-1H-benzo[d]imidazol-2-yl)-2-methylbenzofuro[2,3-b]pyridine was used instead of 8(-(1-(5-(tert-butyl)-[1,1'-biphenyl]-2-yl)-1H-benzo[d]imidazol-2-yl)-2-methylbenzofuro[2,3-b]pyridine. The substance was identified by HRMS and HPLC analysis.

HRMS (MALDI) calcd for $C_{67}H_{71}D_4IrN_4OSi_2$: m/z 1204.5360 Found: 1204.5364.

Synthesis Example 8 (Compound 1229)

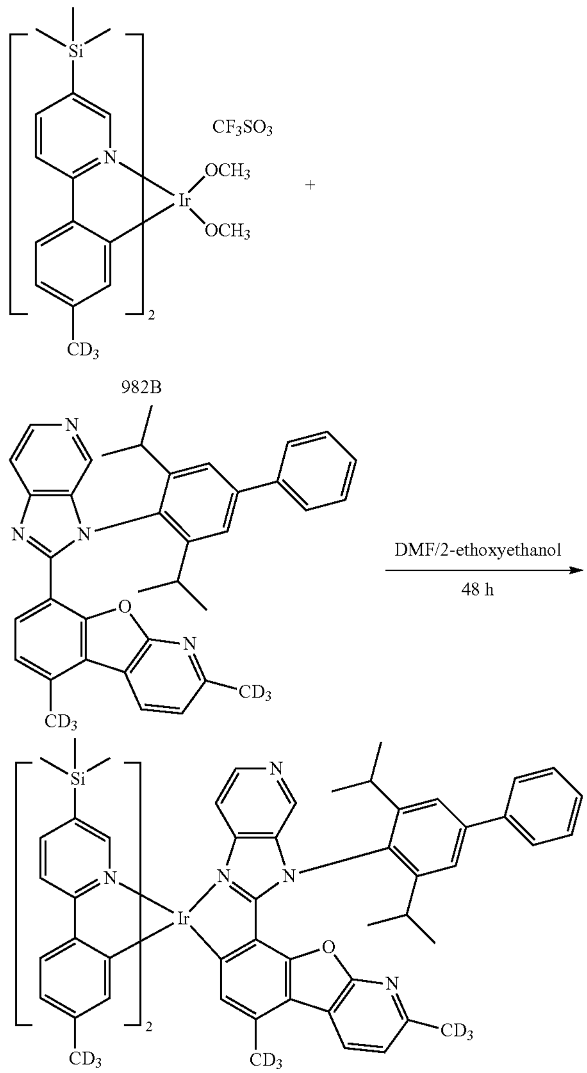

982B

1229

Synthesis of Compound 1229

0.35 g of (yield of 23%) of Compound 1229 was obtained by using the same method as the synthesis method of Compound 212 of Synthesis Example 4, except that Compound 982B was used instead of Compound 212B and 8-(3-(3,5-diisopropyl-[1,1'-biphenyl]-4-yl)-3H-imidazo[4,5-c]pyridin-2-yl)-2,5-dimethyl($D_6$)benzofuro[2,3-b]pyridine was used instead of 8(-(1-(5-(tert-butyl)-[1,1'-biphenyl]-2-yl)-1H-benzo[d]imidazol-2-yl)-2-methylbenzofuro[2,3-b]pyridine. The substance was identified by HRMS and HPLC analysis.

HRMS (MALDI) calcd for $C_{68}H_{58}D_{12}IrN_6OSi_2$: m/z 1234.5454 Found: 1234.5450.

Synthesis Example 9 (Compound 1550)

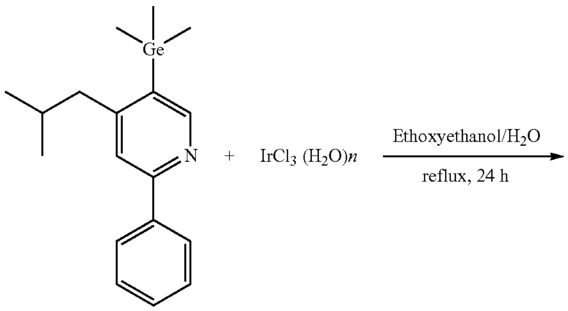

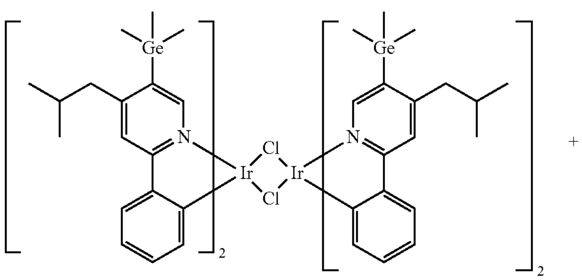

1550A

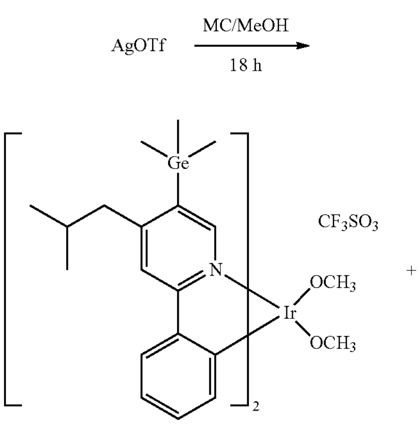

1550B

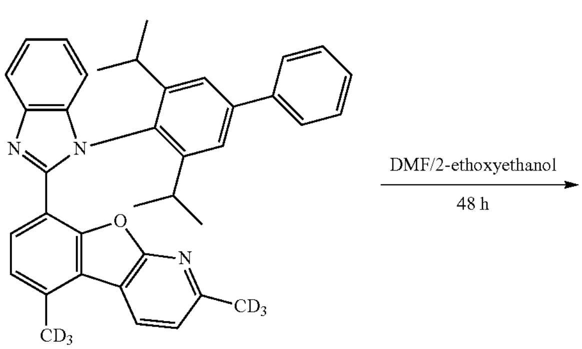

-continued

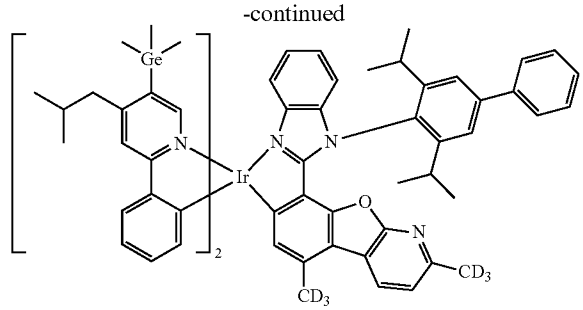

1550

Synthesis of Compound 1550A 3.3 g (yield of 65%) of Compound 1550A was obtained by using the same method as the synthesis method of Compound 15A of Synthesis Example 1, except that 4-isobutyl-2-phenyl-5-(trimethylgermyl)pyridine was used instead of 4-isobutyl-2-phenyl-5-(trimethylsilyl)pyridine.

Synthesis of Compound 1550B

Compound 1550B was obtained by using the same method as the synthesis method of Compound 15B of Synthesis Example 1, except that Compound 1550A was used instead of Compound 15A. The obtained Compound 1550B was used in the next reaction without further purification.

Synthesis of Compound 1550

0.56 g (yield of 28%) of Compound 1550 was obtained by using the same method as the synthesis method of Compound 15 of Synthesis Example 1, except that Compound 1550B was used instead of Compound 15B and (8-(1-(3,5-diisopropyl-[1,1'-biphenyl]-4-yl)-1H-benzo[d]imidazol-2-yl)-2,5-dimethyl($D_6$)benzofuro[2,3-b]pyridine) was used instead of 8-(1-(3,5-diisopropyl-[1,1'-biphenyl]-4-yl)-1H-benzo[d]imidazol-2-yl)-2-methylbenzofuro[2,3-b]pyridine. The substance was identified by HRMS and HPLC analysis.

HRMS (MALDI) calcd for $C_{74}H_{76}D_6Ge_2IrN_5O$: m/z 1403.4949 Found: 1403.4946.

Synthesis Example 10 (Compound 1725)

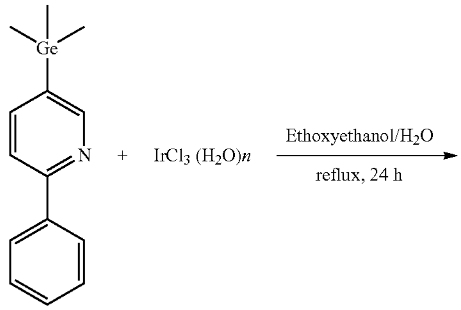

-continued

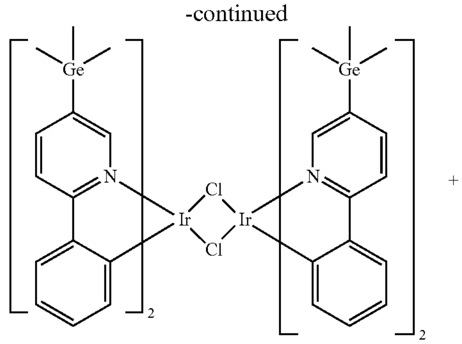

1725A

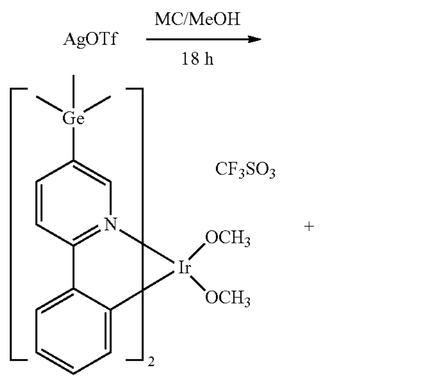

1725B

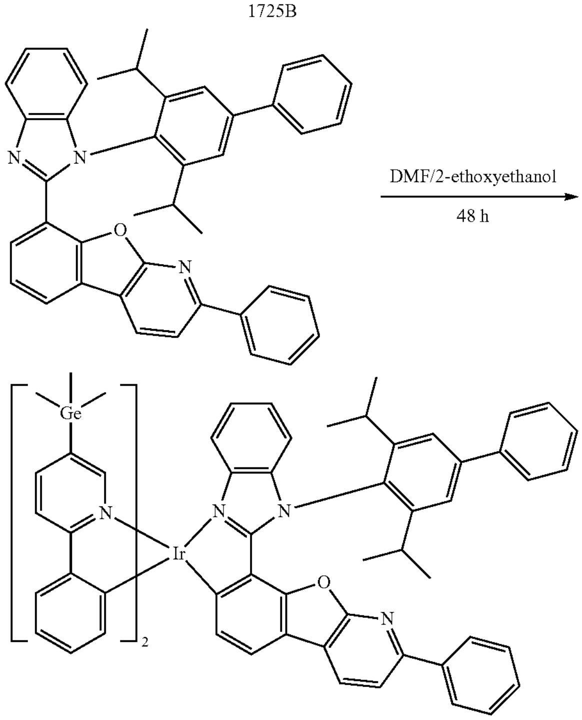

1725

Synthesis of Compound 1725A 2.1 g (yield of 61%) of Compound 1725A was obtained by using the same method as the synthesis method of Compound 212A of Synthesis Example 4, except that 2-phenyl-5-(trimethylgermyl)pyridine was used instead of 2-phenyl-5-(trimethylsilyl)pyridine.

Synthesis of Compound 1725B

Compound 1725B was obtained by using the same method as the synthesis method of Compound 212B of Synthesis Example 4, except that Compound 1725A was used instead of Compound 212A. The obtained Compound 1725B was used in the next reaction without further purification.

Synthesis of Compound 1725

0.76 g (yield of 38%) of Compound 1725 was obtained by using the same method as the synthesis method of Compound 212 of Synthesis Example 4, except that Compound 1725B was used instead of Compound 212B and 8-(1-(3,5-diisopropyl-[1,1'-biphenyl]-4-yl)-1H-benzo[d]imidazol-2-yl)-2-phenylbenzofuro[2,3-b]pyridine was used instead of 8(-(1-(5-(tert-butyl)-[1,1'-biphenyl]-2-yl)-1H-benzo[d]imidazol-2-yl)-2-methylbenzofuro[2,3-b]pyridine. The substance was identified by HRMS and HPLC analysis.

HRMS (MALDI) calcd for $C_{70}H_{66}Ge_2IrN_5O$: m/z 1333.3320 Found: 1333.3318.

Synthesis Example 11 (Compound 2610)

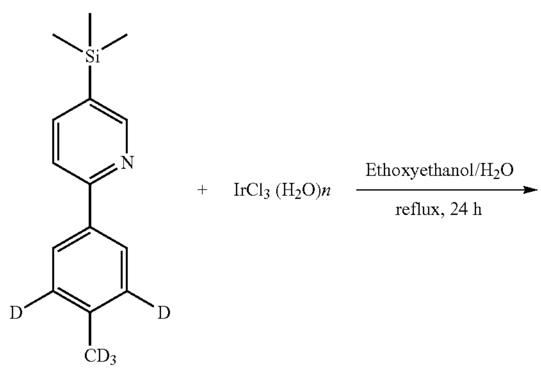

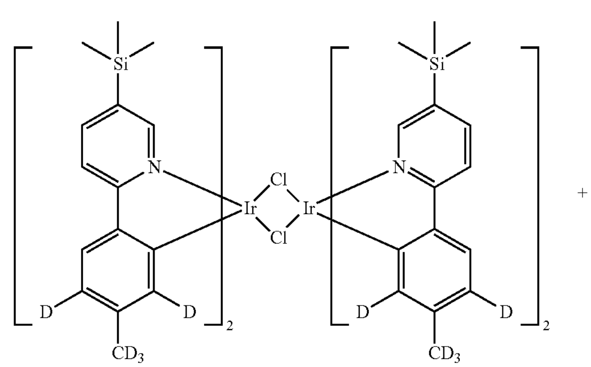

2610A

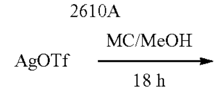

-continued

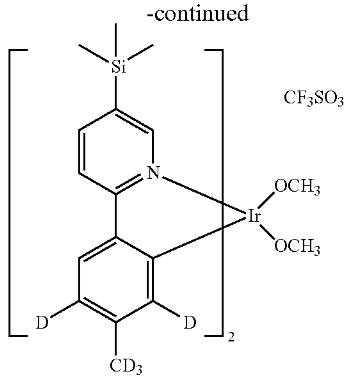

2610B

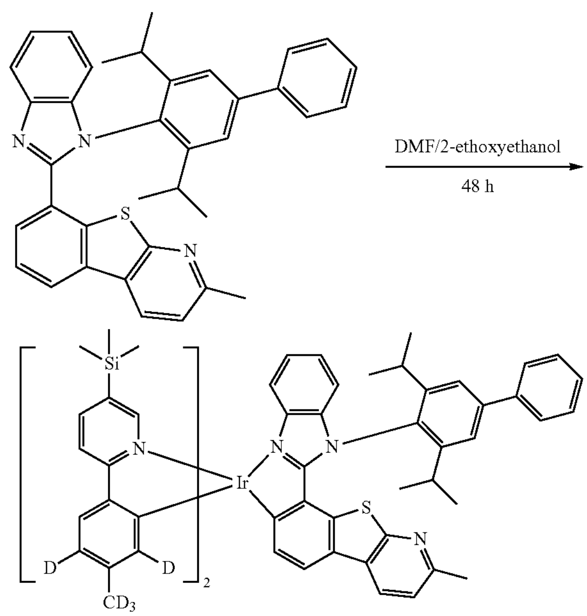

2610

Synthesis of Compound 2610A 2.4 g (yield of 64%) of Compound 2610A was obtained by using the same method as the synthesis method of Compound 212A of Synthesis Example 4, except that 2-(p-tolyl-D5)-5-(trimethylsilyl)pyridine was used instead of 2-phenyl-5-(trimethylsilyl)pyridine.

Synthesis of Compound 2610B

Compound 2610B was obtained by using the same method as the synthesis method of Compound 212B of Synthesis Example 4, except that Compound 2610A was used instead of Compound 212A. The obtained Compound 2610B was used in the next reaction without further purification.

Synthesis of Compound 2610

0.73 g (yield of 37%) of Compound 2610 was obtained by using the same method of the synthesis method of Compound 212 of Synthesis Example 4, except that Compound 2610B was used instead of Compound 212B and 8-(1-(3,5-diisopropyl-[1,1'-biphenyl]-4-yl)-1H-benzo[d]imidazol-2-yl)-2-methylbenzo[4,5]thieno[2,3-b]pyridine was used instead of 8(-(1-(5-(tert-butyl)-[1,1'-biphenyl]-2-yl)-1H-benzo[d]imidazol-2-yl)-2-methylbenzofuro[2,3-b]pyridine. The substance was identified by HRMS and HPLC analysis.

HRMS (MALDI) calcd for $C_{67}H_{58}D_{10}IrN_5SSi_2$: m/z 1233.4991 Found: 1233.4988.

Synthesis Example 12 (Compound 2755)

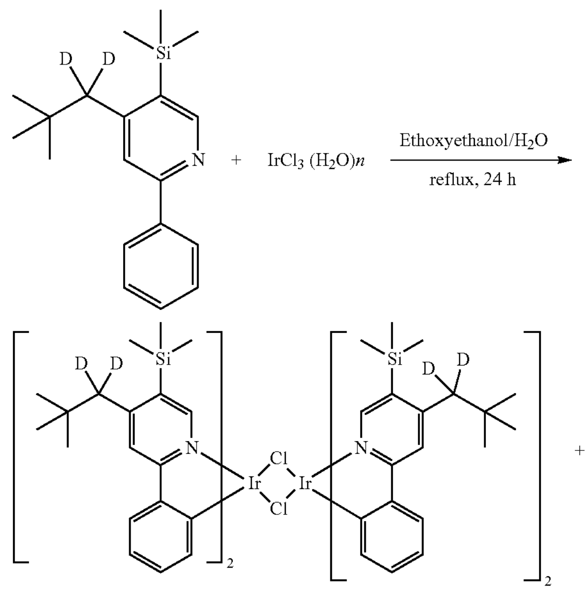

2755A

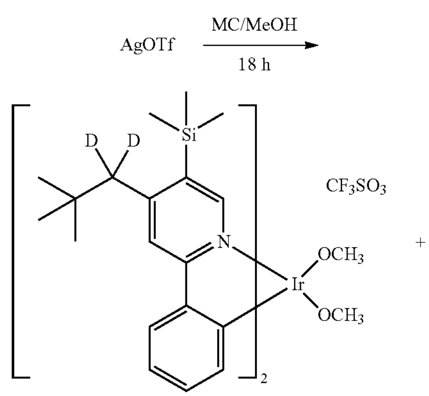

2755B

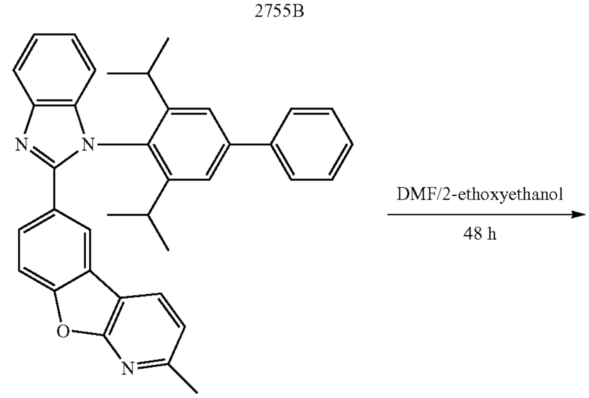

-continued

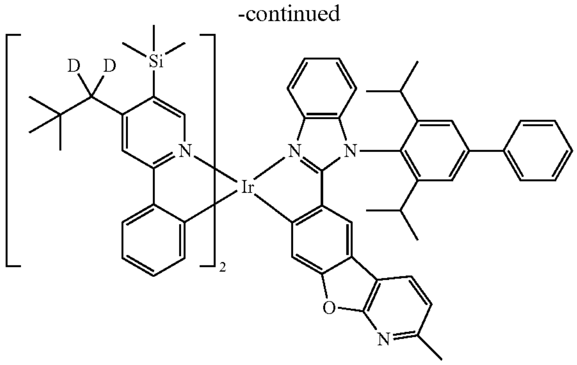

2755

Synthesis of Compound 2755A 4.2 g (yield of 81%) of Compound 2755A was obtained by using the same method as the synthesis method of Compound 212A of Synthesis Example 4, except that 4-neopentyl(D2)-2-phenyl-5-(trimethylsilyl)pyridine was used instead of 2-phenyl-5-(trimethylsilyl)pyridine.

Synthesis of Compound 2755B

Compound 2755B was obtained by using the same method as the synthesis method of Compound 212B of Synthesis Example 4, except that Compound 2755A was used instead of Compound 212A. The obtained Compound 2755B was used in the next reaction without further purification.

Synthesis of Compound 2755

0.65 g (yield of 33%) of Compound 2755 was obtained by using the same method as the synthesis method of Compound 212 of Synthesis Example 4, except that Compound 2755B was used instead of Compound 212B and 6-(1-(3,5-diisopropyl-[1,1'-biphenyl]-4-yl)-1H-benzo[d]imidazol-2-yl)-2-methylbenzofuro[2,3-b]pyridine was used instead of 8(-(1-(5-(tert-butyl)-[1,1'-biphenyl]-2-yl)-1H-benzo[d]imidazol-2-yl)-2-methylbenzofuro[2,3-b]pyridine. The substance was identified by HRMS and HPLC analysis.

HRMS (MALDI) calcd for $C_{75}H_{80}IrN_5OSi_2$: m/z 1323.6095 Found: 1323.6090.

Synthesis Example 13 (Compound 3214)

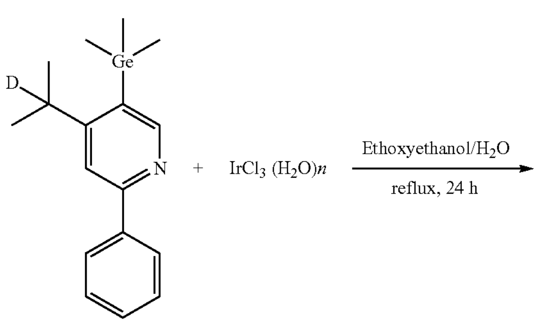

-continued

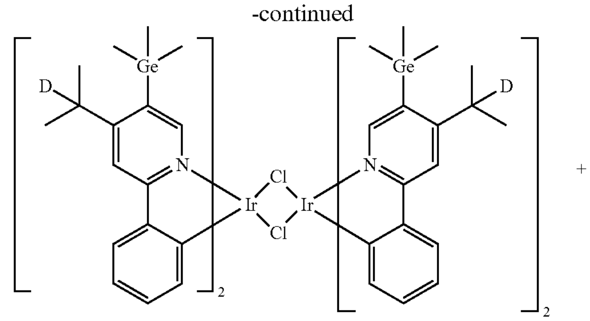

3214A

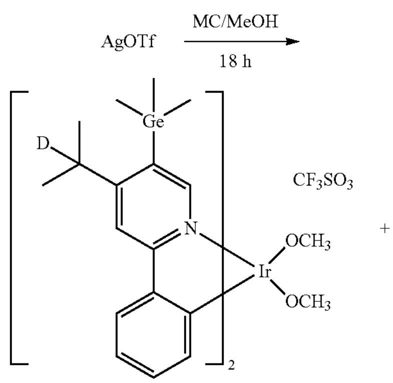

3214B

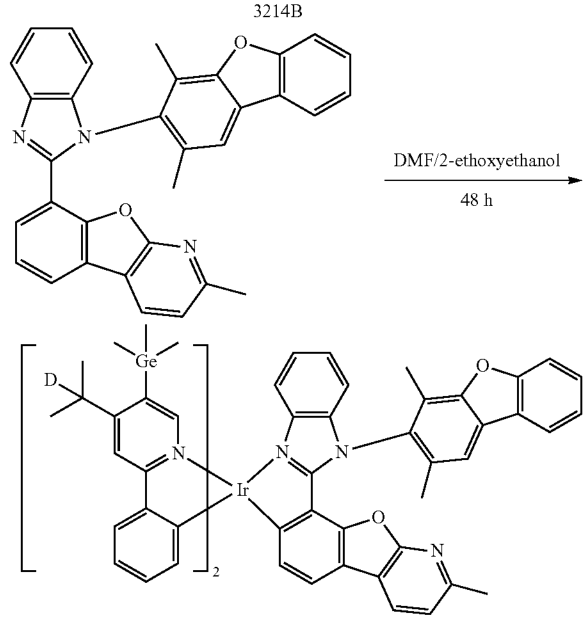

3214

Synthesis of Compound 3214A 8.0 g (yield of 80%) of Compound 3214A was obtained by using the same method as the synthesis method of Compound 212A of Synthesis Example 4, except that 2-phenyl-4-(propan-2-yl-2-D)-5-(trimethylgermyl)pyridine was used instead of 2-phenyl-5-(trimethylsilyl)pyridine.

Synthesis of Compound 3214B

Compound 3214B was obtained by using the same method as the synthesis method of Compound 212B of Synthesis Example 4, except that Compound 3214A was used instead of Compound 212A. The obtained Compound 3214B was used in the next reaction without further purification.

Synthesis of Compound 3214

0.76 g (yield of 38%) of Compound 3214 was obtained by using the same method as the synthesis method of Compound 212 of Synthesis Example 4, except that Compound 3214B was used instead of Compound 212B and 8-(1-(2,4-dimethyldibenzo[b,d]furan-3-yl)-1H-benzo[d]imidazol-2-yl)-2-methylbenzofuro[2,3-b]pyridine was used instead of 8(-(1-(5-(tert-butyl)-[1,1'-biphenyl]-2-yl)-1H-benzo[d]imidazol-2-yl)-2-methylbenzofuro[2,3-b]pyridine. The substance was identified by HRMS and HPLC analysis.

HRMS (MALDI) calcd for $C_{67}H_{64}D_2Ge_2N_5O_2$: m/z 1315.3395 Found: 1315.3394.

Synthesis Example 14 (Compound 3275)

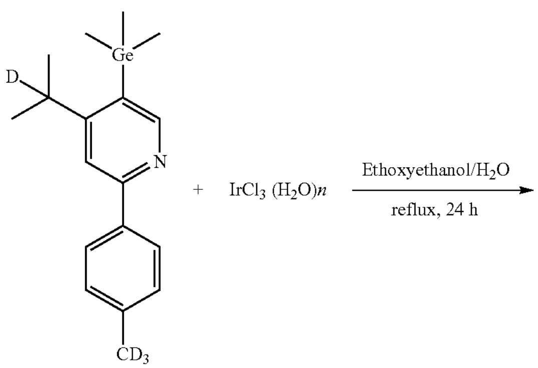

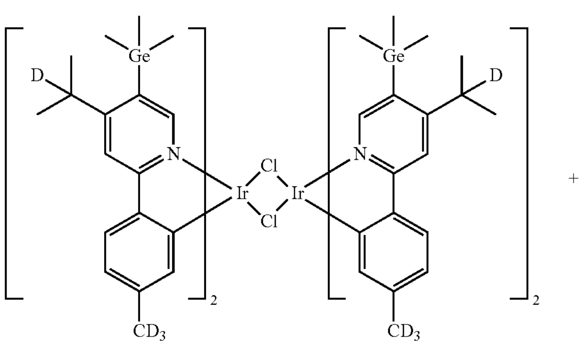

3275A

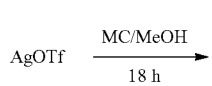

-continued

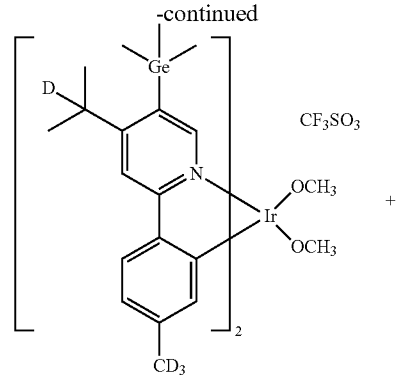

3275B

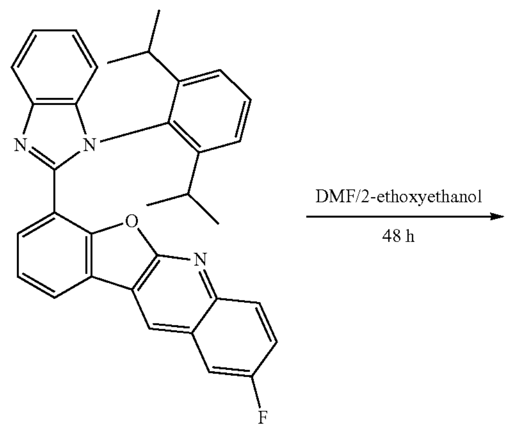

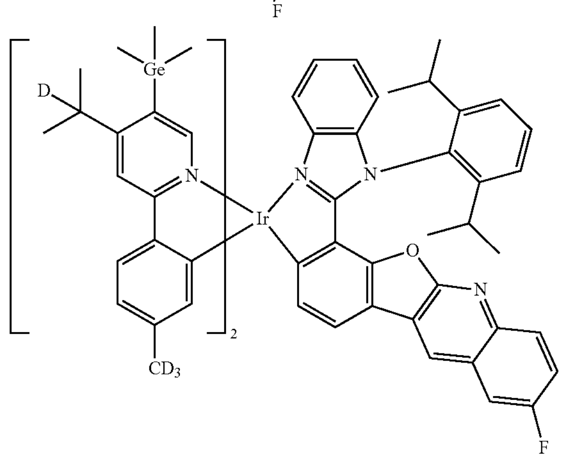

3275

Synthesis of Compound 3275A 8.5 g (yield of 71%) of Compound 3275A was obtained by using the same method as the synthesis method of Compound 212A of Synthesis Example 4, except that 2-(4-(methyl-d3)phenyl)-4-(propan-2-yl-2-d)-5-(trimethylgermyl)pyridine was used instead of 2-phenyl-5-(trimethylsilyl)pyridine.

Synthesis of Compound 3275B

Compound 3275B was obtained by using the same method as the synthesis method of Compound 212B of Synthesis Example 4, except that Compound 3275A was used instead of Compound 212A. The obtained Compound 3275B was used in the next reaction without further purification.

Synthesis of Compound 3275

0.61 g (yield of 34%) of Compound 3275 was obtained by using the same method as the synthesis method of Compound 212 of Synthesis Example 4, except that Compound 3275B was used instead of Compound 212B and 4-(1-(2,6-diisopropylphenyl)-1H-benzo[d]imidazol-2-yl)-9-fluorobenzofuro[2,3-b]quinolone was used instead of 8(-(1-(5-(tert-butyl)-[1,1'-biphenyl]-2-yl)-1H-benzo[d]imidazol-2-yl)-2-methylbenzofuro[2,3-b]pyridine. The substance was identified by HRMS and HPLC analysis.

HRMS (MALDI) calcd for $C_{70}H_{67}D_8FGe_2IrN_5O$: m/z 1369.4511 Found: 1369.4509.

Synthesis Example 15 (Compound 3492)

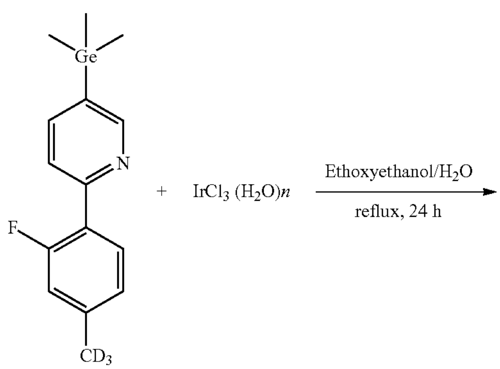

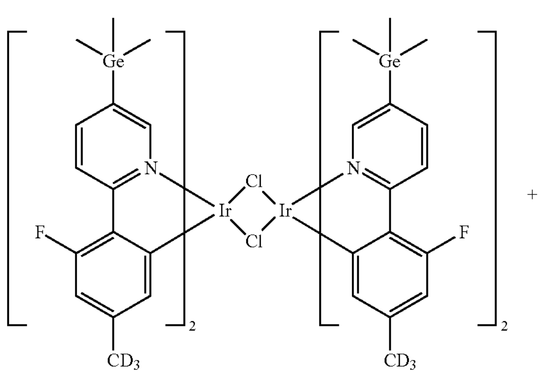

3492A

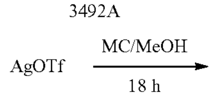

-continued

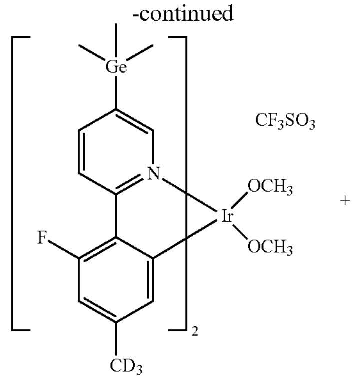

3492B

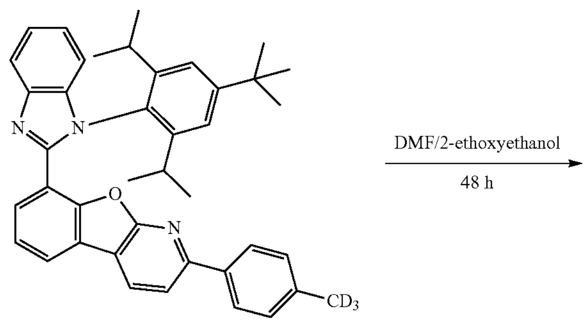

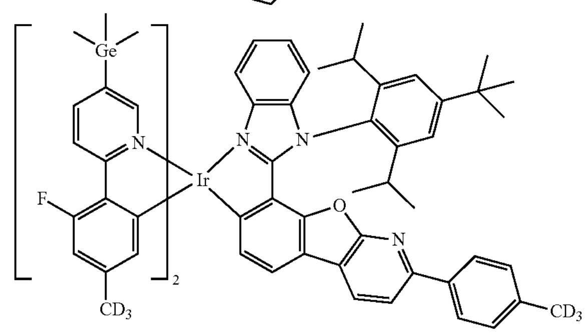

3492

Synthesis of Compound 3492A 9.0 g (yield of 75%) of Compound 3492A was obtained by using the same method as the synthesis method of Compound 212A of Synthesis Example 4, except that 2-(2-fluoro-4-(methyl-$d_3$)phenyl)-5-(trimethylgermyl)pyridine was used instead of 2-phenyl-5-(trimethylsilyl)pyridine.

Synthesis of Compound 3492B

Compound 3492B was obtained by using the same method as the synthesis method of Compound 212B of Synthesis Example 4, except that Compound 3492A was used instead of Compound 212A. The obtained Compound 3492B was used in the next reaction without further purification.

Synthesis of Compound 3492

0.59 g (yield of 35%) of Compound 3492 was obtained by using the same method as the synthesis method of Compound 212 of Synthesis Example 4, except that Compound 3492B was used instead of Compound 212B and 8-(1-(4-

(tert-butyl)-2,6-diisopropylphenyl)-1H-benzo[d]imidazol-2-yl)-2-(4-(methyl-da)phenyl)benzofuro[2,3-b]pyridine was used instead of 8(-(1-(5-(tert-butyl)-[1,1'-biphenyl]-2-yl)-1H-benzo[d]imidazol-2-yl)-2-methylbenzofuro[2,3-b]pyridine. The substance was identified by HRMS and HPLC analysis.

HRMS (MALDI) calcd for $C_{71}H_{65}D_9F_2Ge_2IrN_5O$: m/z 1400.4479 Found: 1400.4477.

Synthesis Example 16 (Compound 3553)

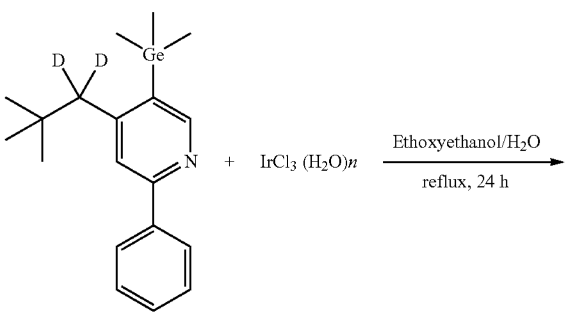

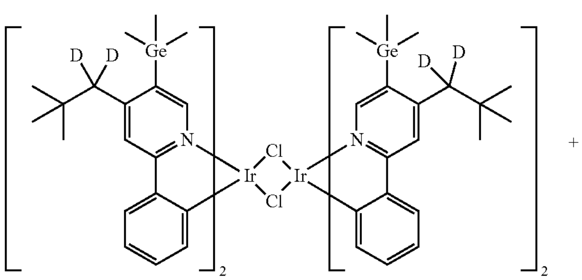

3553A

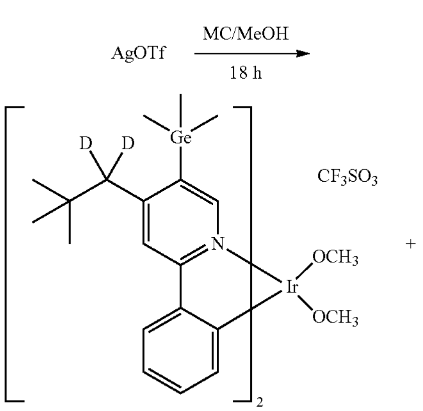

3553B

-continued

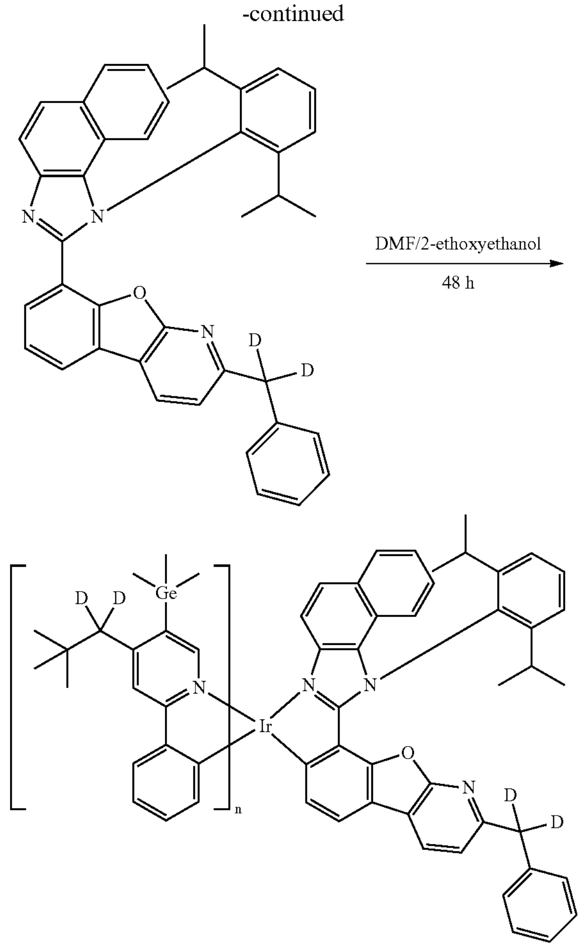

3553

Synthesis of Compound 3553A 8.5 g (yield of 77%) of Compound 3553A was obtained by using the same method as the synthesis method of Compound 212A of Synthesis Example 4, except that 4-(2,2-dimethylpropyl-1,1-d2)-2-phenyl-5-(trimethylgermyl) pyridine was used instead of 2-phenyl-5-(trimethylsilyl) pyridine.

Synthesis of Compound 3553B

Compound 3553B was obtained by using the same method as the synthesis method of Compound 212B of Synthesis Example 4, except that Compound 3553A was used instead of Compound 212A. The obtained Compound 3553B was used in the next reaction without further purification.

Synthesis of Compound 3553

0.55 g (yield of 32%) of Compound 3553 was obtained by using the same method as the synthesis method of Compound 212 of Synthesis Example 4, except that Compound 3553B was used instead of Compound 212B and 8-(1-(2,6-diisopropylphenyl)-1H-naphtho[1,2-d]imidazol-2-yl)-2-(phenylmethyl-$d_2$)benzofuro[2,3-b]pyridine was used instead of 8(-(1-(5-(tert-butyl)-[1,1'-biphenyl]-2-yl)-1H- benzo[d]imidazol-2-yl)-2-methylbenzofuro[2,3-b]pyridine. The substance was identified by HRMS and HPLC analysis.

HRMS (MALDI) calcd for $C_{79}H_{80}D_6Ge_2IrN_5O$: m/z 1467.5262 Found: 1467.5260.

Example 1

As an anode, a glass substrate with ITO patterned thereon was cut to a size of 50 mm×50 mm×0.5 mm, sonicated by using isopropyl alcohol and deionized water for 5 minutes each, and then irradiated with ultraviolet (UV) light for 30 minutes and exposed to ozone for cleaning. Then, the resultant glass substrate was loaded onto a vacuum deposition apparatus.

Compound HT3 and F6-TCNNQ were vacuum deposited at a weight ratio of 98:2 on the anode to form a hole injection layer having a thickness of 100 Å, and Compound HT3 was vacuum deposited on the hole injection layer to form a hole transport layer having a thickness of 1650 Å.

Subsequently, Compound CBP (host) and Compound 15 (dopant) were co-deposited at a weight ratio of 95:5 on the hole transport layer to form an emission layer having a thickness of 400 Å.

Thereafter, Compound ET3 and ET-D1 were co-deposited at a volume ratio of 50:50 on the emission layer to form an electron transport layer having a thickness of 350 Å, ET-D1 was vacuum deposited on the electron transport layer to form an electron injection layer having a thickness of 10 Å, and Al was vacuum deposited on the electron injection layer to form a cathode having a thickness of 1000 Å, and thereby an organic light-emitting device was manufactured.

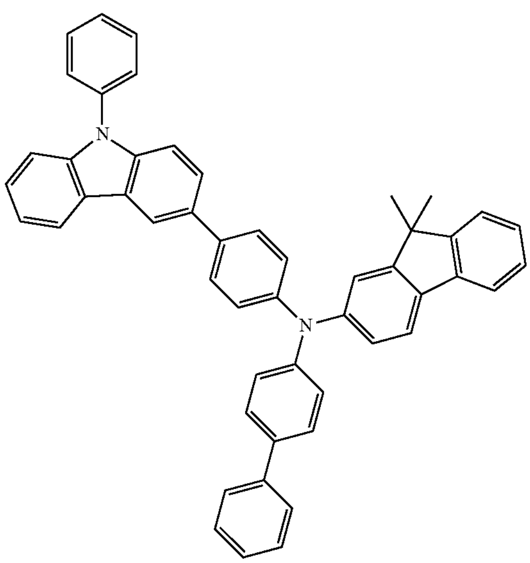

HT3

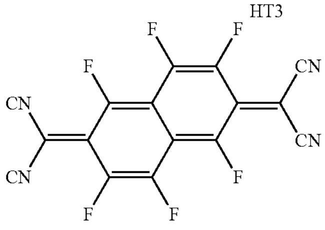

F6-TCNNQ

-continued

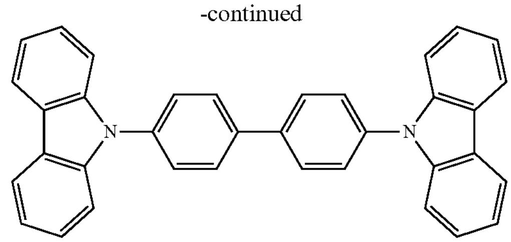

CBP

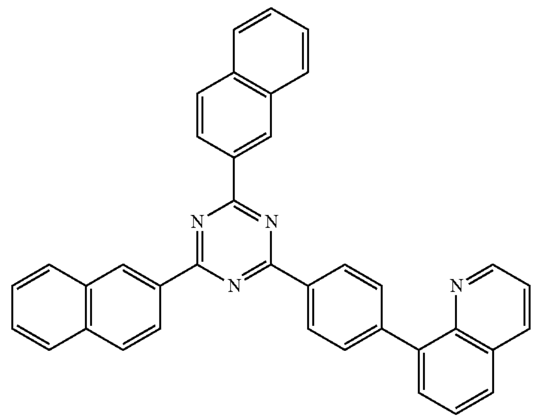

ET3

ET-D1

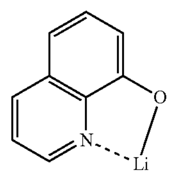

Examples 2 to 15 and Comparative Examples A to C

Organic light-emitting devices were manufactured in the same manner as in Example 1, except that in forming an emission layer, for use as a dopant, corresponding compounds shown in Table 2 were used instead of Compound 15.

Evaluation Example 1

For each organic light-emitting device manufactured in Examples 1 to 15 and Comparative Examples A to C, the maximum value of external quantum efficiency (Max EQE), roll-off ratio, and lifespan ($LT_{97}$) were evaluated. The results are shown in Table 2. This evaluation was performed using a current-voltage meter (Keithley 2400) and a luminescence meter (Minolta Cs-1,000A), and the lifespan ($LT_{97}$)(at 9000 candela per square meter, Cd/m$^2$) was expressed as a relative value (%) by evaluating the time (hours, hr) for the luminance of 97% with respect to the initial luminance of 100%. The roll-off ratio was calculated by the following equation 20.

$$\text{Roll-off ratio}=\{1-(\text{efficiency}(\text{at}9000\text{Cd/m}^2)/\text{maximum luminescent efficiency})\}\times 100\% \quad \text{Equation 20}$$

TABLE 2
| | Dopant in emission layer (Compound No.) | Max EQE (%) | Roll-off ratio (%) | $LT_{97}$ (a relative value, %) (at 9000 cd/m$^2$) |
|---|---|---|---|---|
| Example 1 | 15 | 27.6 | 10 | 134 |
| Example 2 | 184 | 25.6 | 16 | 100 |
| Example 3 | 212 | 27.1 | 11 | 156 |
| Example 4 | 295 | 26.5 | 12 | 114 |
| Example 5 | 982 | 25.6 | 14 | 106 |
| Example 6 | 1042 | 27.2 | 15 | 98 |
| Example 7 | 1229 | 24.7 | 14 | 99 |
| Example 8 | 1550 | 25.1 | 15 | 100 |
| Example 9 | 1725 | 27.5 | 12 | 145 |
| Example 10 | 2610 | 28.0 | 11 | 172 |
| Example 11 | 2755 | 24.5 | 10 | 138 |
| Example 12 | 3214 | 27.4 | 12 | 130 |
| Example 13 | 3275 | 27.1 | 13 | 210 |
| Example 14 | 3492 | 27.8 | 10 | 102 |
| Example 15 | 3553 | 27.1 | 14 | 125 |
| Comparative Example A | A | 23.2 | 20 | 50 |
| Comparative Example B | B | 20.9 | 28 | 42 |
| Comparative Example C | C | 19.6 | 25 | 30 |
15
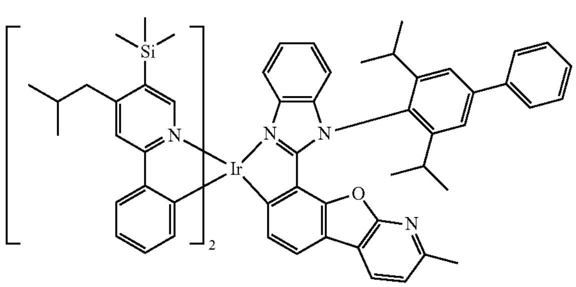
184
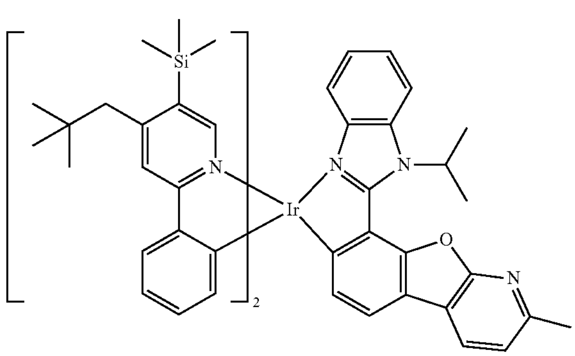
-continued
212
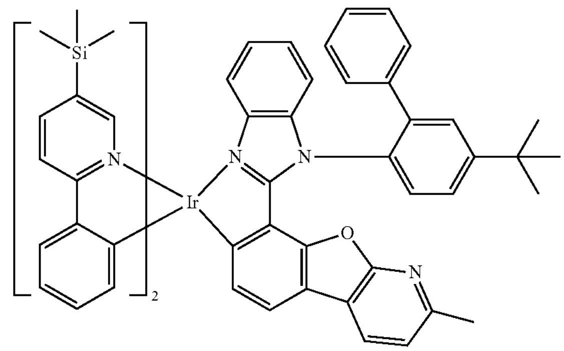
295
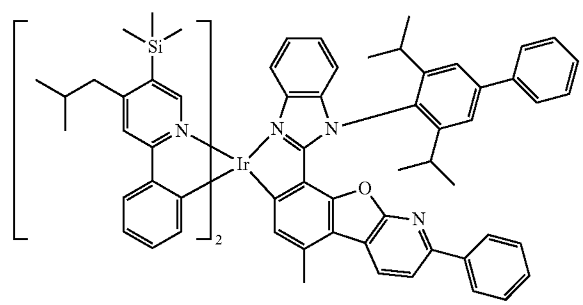
982
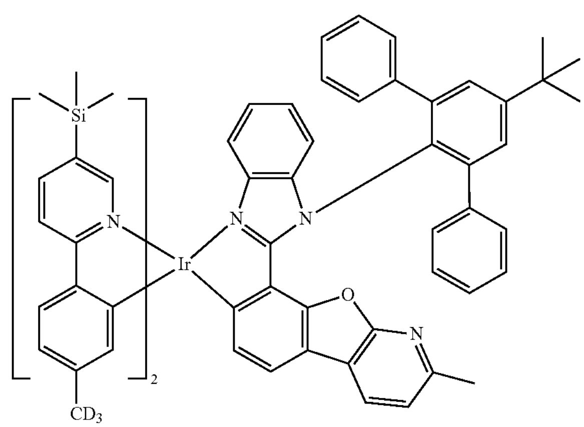
1042
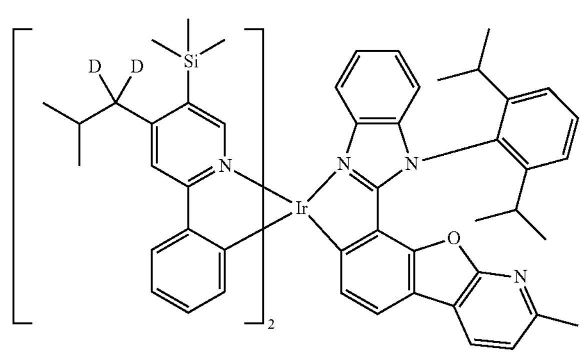

-continued
1229
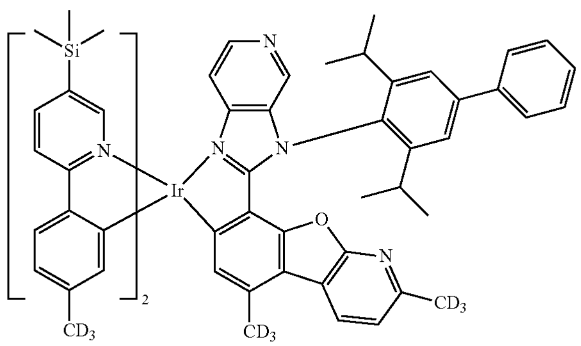
1550
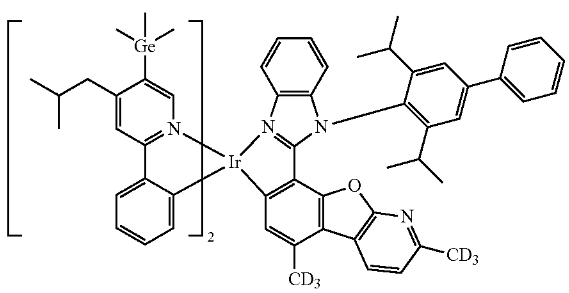
1725
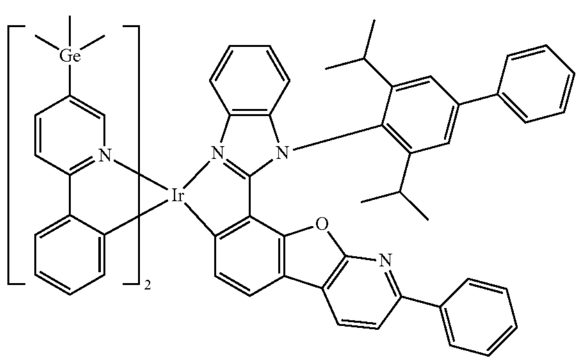
2610
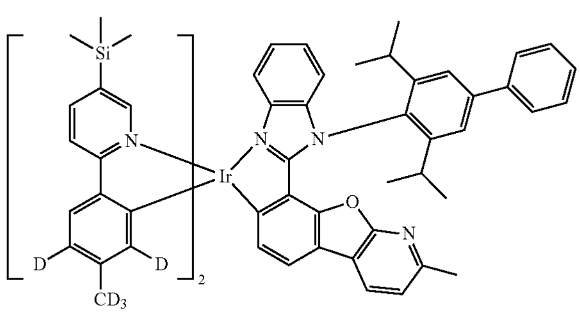
-continued
2755
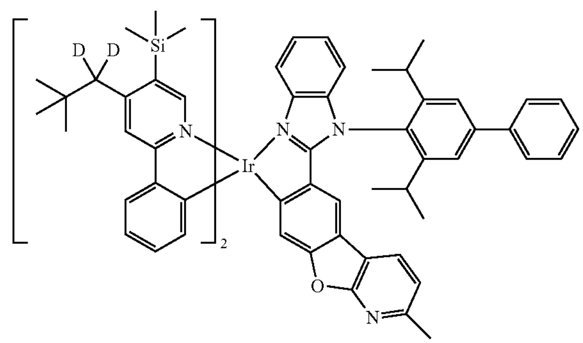
3214
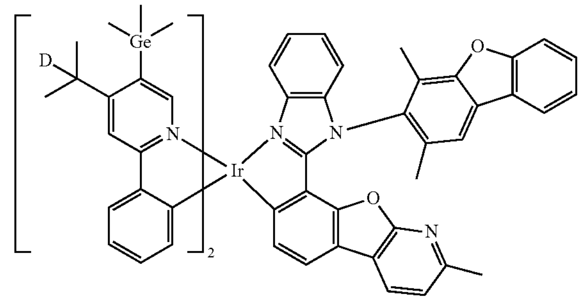
3275
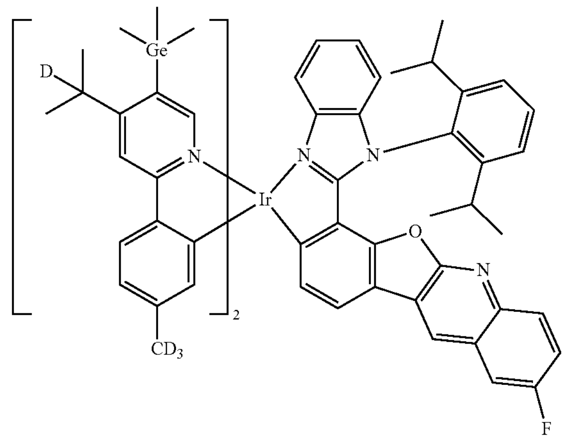
3492
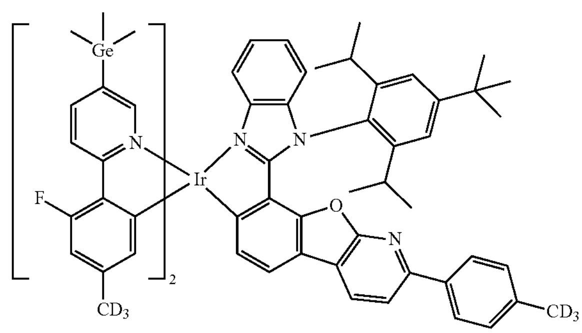

-continued

3553

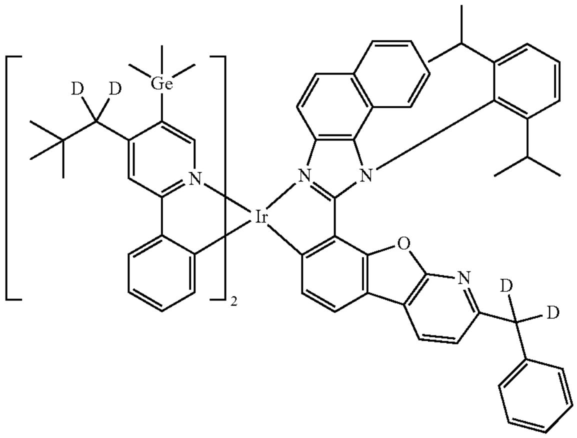

A

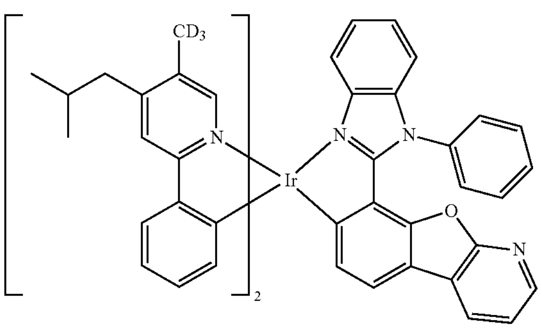

B

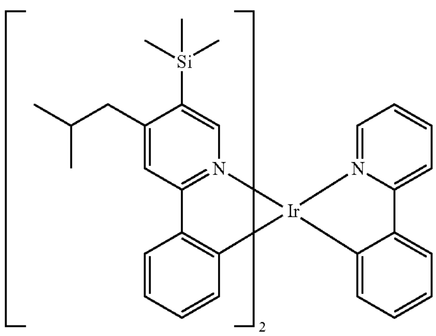

C

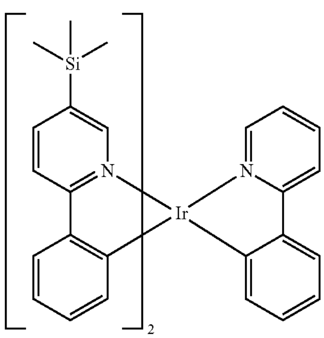

From Table 2, it was confirmed that the organic light-emitting devices of Example 1 to 15 may have improved external quantum efficiency, improved roll-off ratio, and improved lifespan characteristics compared to the organic light-emitting devices of Comparative Examples A to C.

The organometallic compound has excellent electrical characteristics, and thus an electronic device including the organometallic compound, for example, an organic light-emitting device, may have improved external quantum efficiency and improved lifespan characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims.

What is claimed is:

1. An organometallic compound represented by Formula 1:

$$M(L_1)_{n1}(L_2)_{n2} \qquad \text{Formula 1}$$

wherein, in Formula 1,

M is a transition metal, $L_1$ is a ligand represented by Formula 2, $L_2$ is a ligand represented by Formula 3, and n1 and n2 are each independently 1 or 2, when n1 is 2, two $L_1$ groups are identical to or different from each other, and when n2 is 2, two $L_2$ groups are identical to or different from each other:

Formula 2

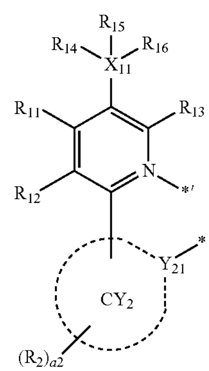

Formula 3

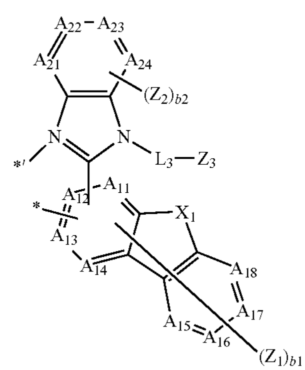

wherein, in Formulae 2 and 3, $Y_{21}$ is C or N, ring $CY_2$ is a $C_5$-$C_{30}$ carbocyclic group or $C_1$-$C_{30}$ heterocyclic group, $X_{11}$ is Si or Ge, $X_1$ is O, S, Se, $N(Z_{19})$, or $Si(Z_{19})(Z_{20})$, $A_{11}$ to $A_{14}$ are each independently C or N, wherein one of $A_{11}$ to $A_{14}$ is C bonded to a group represented by

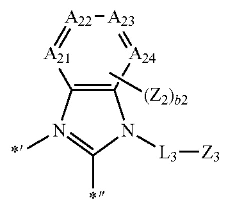

in Formula 3, and one of remaining $A_{11}$ to $A_{14}$ is C bonded to M in Formula 1, $A_{15}$ to $A_{18}$ and $A_{21}$ to $A_{24}$ are each independently C or N, at least one of $A_{11}$ to $A_{18}$ is N, $L_3$ is a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $R_2$, $R_{11}$ to $R_{16}$, $Z_1$ to $Z_3$, $Z_{19}$, and $Z_{20}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, a2 is an integer from 0 to 20, and when a2 is 2 or more, two or more $R_2$ groups are identical to or different from each other, b1 is an integer from 0 to 5, and when b1 is 2 or more, two or more $Z_1$ groups are identical to or different from each other, b2 is an integer from 0 to 4, and when b2 is 2 or more, two or more $Z_2$ groups are identical to or different from each other, $R_{11}$ and $R_{12}$ are optionally linked to each other to form a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, two or more of a plurality of $R_2$ groups are optionally linked to each other to form a $C_5$-$C_{30}$ carbocyclic group that is unsubstituted or substituted with at least one $R_{10a}$, or two or more of the plurality of $R_2$ groups are optionally linked to each other to form a $C_1$-$C_{30}$ heterocyclic group that is unsubstituted or substituted with at least one $R_{10a}$, two or more of a plurality of $Z_1$ groups are optionally linked to each other to form a $C_5$-$C_{30}$ carbocyclic group that is unsubstituted or substituted with at least one $R_{10a}$, or two or more of the plurality of $Z_1$ groups are optionally linked to each other to form a $C_1$-$C_{30}$ heterocyclic group that is unsubstituted or substituted with at least one $R_{10a}$, two or more of a plurality of $Z_2$ groups are optionally linked to each other to form a $C_5$-$C_{30}$ carbocyclic group that is unsubstituted or substituted with at least one $R_{10a}$, or two or more of a plurality of $Z_2$ groups are optionally linked to each other to form a $C_1$-$C_{30}$ heterocyclic group that is unsubstituted or substituted with at least one $R_{10a}$, $R_{10a}$ is deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, and

*, *', and *" each indicate a binding site to M in Formula 1, wherein at least one of (a) or (b) is true:

(a) at least one of $A_{21}$ to $A_{24}$ in Formula 3 is N, or (b) $A_{17}$ is $C(Z_{17})$, wherein $Z_{17}$ is a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and two or more of a plurality of $Z_1$ groups in Formula 3 are not linked to each other, wherein a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, carboxylic acid group or a salt thereof, sulfonic acid group or a salt thereof, phosphoric acid group or a salt thereof, a $C_1$-$C_{60}$ alkyl group, a $C_2$-$C_{60}$ alkenyl group, a $C_2$-$C_{60}$ alkynyl group, $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, carboxylic acid group or a salt thereof, sulfonic acid group or a salt thereof, phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, carboxylic acid group or a salt thereof, sulfonic acid group or a salt thereof, phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or a combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or a combination thereof;

wherein, $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, —F, a $C_1$-$C_{60}$ alkyl group, a $C_6$-$C_{60}$ aryl group, or a combination thereof; a $C_2$-$C_{60}$ alkenyl group; a $C_2$-$C_{60}$ alkynyl group; a $C_1$-$C_{60}$ alkoxy group; a $C_1$-$C_{60}$ alkylthio group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, —F, a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a $C_2$-$C_{60}$ alkylheteroaryl group; a monovalent non-aromatic condensed polycyclic group; or a monovalent non-aromatic condensed heteropolycyclic group.

2. The organometallic compound of claim 1, wherein the ring $CY_2$ is a benzene group, a naphthalene group, an anthracene group, a phenanthrene group, a 1,2,3,4-tetrahydronaphthalene group, a carbazole group, a fluorene group, a dibenzosilole group, a dibenzothiophene group, or a dibenzofuran group.

3. The organometallic compound of claim 1, wherein $L_3$ in Formula 3 is:

a single bond; or a benzene group, a naphthalene group, a dibenzofuran group, or a dibenzothiophene group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a phenyl group, a deuterated phenyl group, a fluorinated phenyl group, a ($C_1$-$C_{20}$ alkyl) phenyl group, a naphthyl group, a pyridinyl group, a furanyl group, a thiophenyl group, a benzofuranyl group, a benzothiophenyl group, a dibenzofuranyl group, a dibenzothiophenyl group, or a combination thereof.

4. The organometallic compound of claim 1, wherein $R_2$, $R_{11}$ to $R_{13}$, $Z_1$ to $Z_3$, $Z_{19}$ and $Z_{20}$ in Formulae 2 and 3 are each independently:

hydrogen, deuterium, —F, or a cyano group; or a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a phenyl group, a deuterated phenyl group, a fluorinated phenyl group, a ($C_1$-$C_{20}$ alkyl)

phenyl group, a naphthyl group, a pyridinyl group, a furanyl group, a thiophenyl group, a benzofuranyl group, a benzothiophenyl group, a dibenzofuranyl group, a dibenzothiophenyl group, —Si($Q_{33}$)($Q_{34}$)($Q_{35}$), —Ge($Q_{33}$)($Q_{34}$)($Q_{35}$), or a combination thereof; and $R_{14}$ to $R_{16}$ in Formula 2 are each independently a $C_1$-$C_{20}$ alkyl group, a $C_3$-$C_{10}$ cycloalkyl group, a phenyl group, a naphthyl group, a pyridinyl group, a furanyl group, a thiophenyl group, a benzofuranyl group, a benzothiophenyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or a combination thereof.

5. The organometallic compound of claim 1, wherein Ru is not hydrogen.

6. The organometallic compound of claim 1, satisfying at least one of Condition A or Condition B:

Condition A $L_3$ is a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, Condition B $Z_3$ is a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

7. The organometallic compound of claim 1, wherein $Z_1$ is not hydrogen, and b1 is an integer from 1 to 5.

8. The organometallic compound of claim 1, wherein a group represented by:

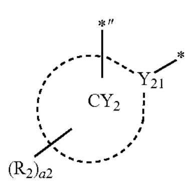

in Formula 2 is a group represented by one of Formulae CY2-1 to CY2-33:

CY2-1

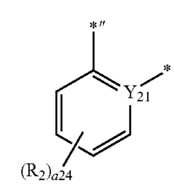

-continued

CY2-2

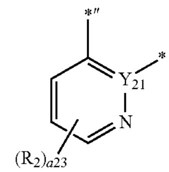

CY2-3

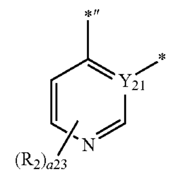

CY2-4

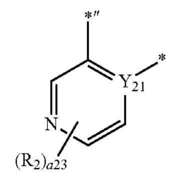

CY2-5

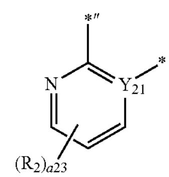

CY2-6

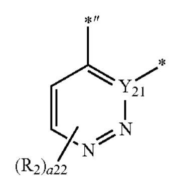

CY2-7

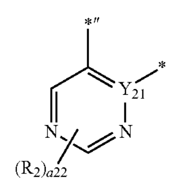

CY2-8

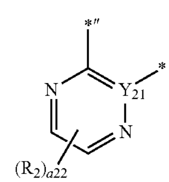

CY2-9

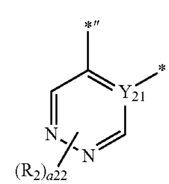

CY2-10

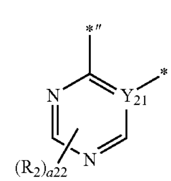

-continued
CY2-11
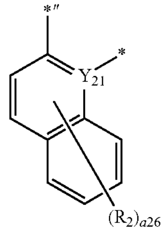
CY2-12
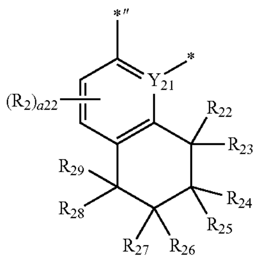
CY2-13
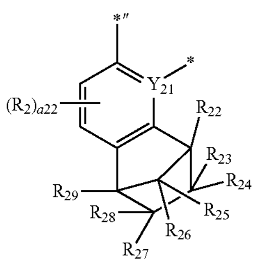
CY2-14
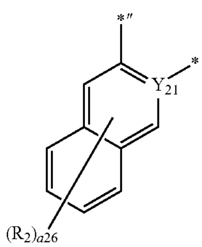
CY2-15
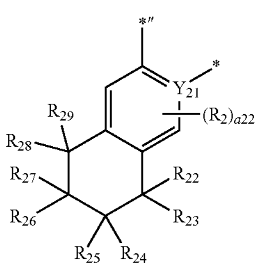
CY2-16
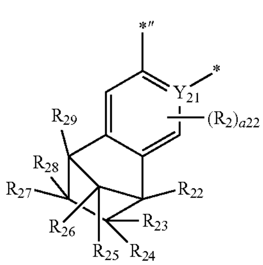
-continued
CY2-17
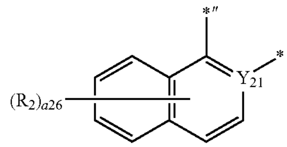
CY2-18
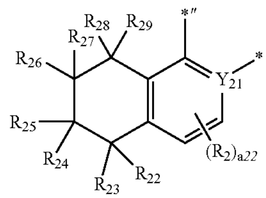
CY2-19
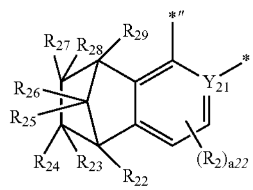
CY2-20
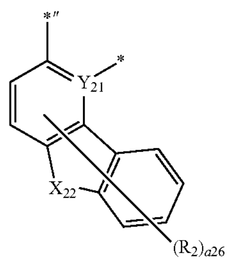
CY2-21
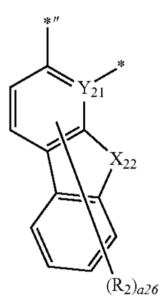
CY2-22
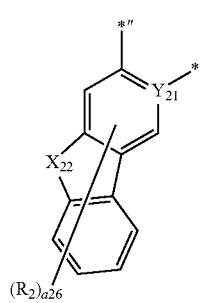

-continued

CY2-23

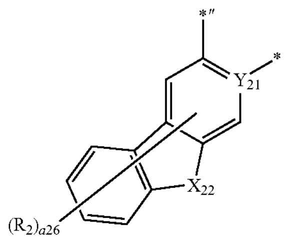

CY2-24

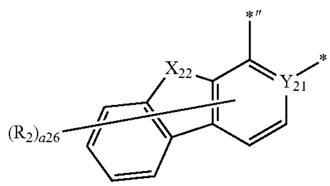

CY2-25

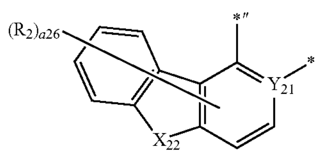

CY2-26

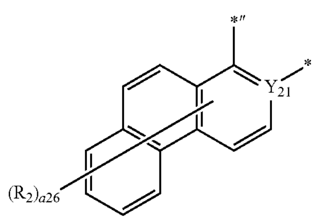

CY2-27

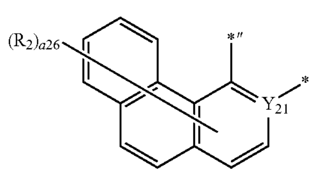

CY2-28

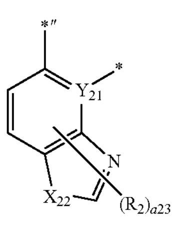

CY2-29

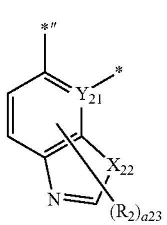

-continued

CY2-30

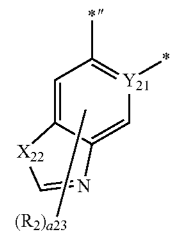

CY2-31

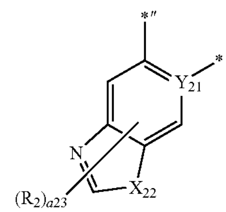

CY2-32

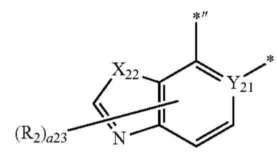

CY2-33

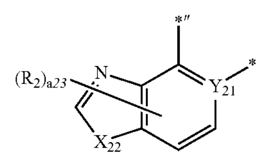

wherein, in Formulae CY2-1 to CY2-33, $X_{22}$ is $C(R_{22})(R_{23})$, $N(R_{22})$, O, S, or $Si(R_{22})(R_{23})$, $R_{22}$ to $R_{29}$ are each the same as described in connection with $R_2$, a28 is an integer from 0 to 8, a26 is an integer from 0 to 6, a24 is an integer from 0 to 4, a23 is an integer from 0 to 3, a22 is an integer from 0 to 2,

*" indicates a binding site to a neighboring atom in Formula 2, and

* indicates a binding site to M in Formula 1.

9. The organometallic compound of claim 1, wherein the group represented by:

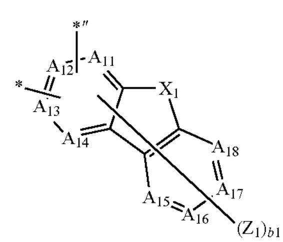

in Formula 3 is a group represented by one of Formulae CY3-1 to CY3-6:

CY3-1

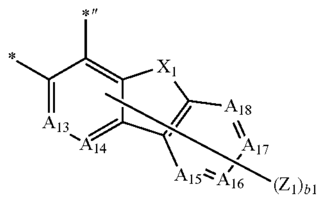

CY3-2

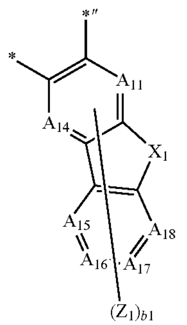

CY3-3

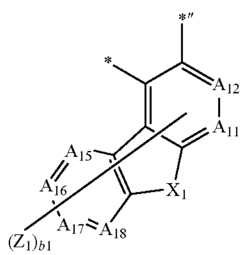

CY3-4

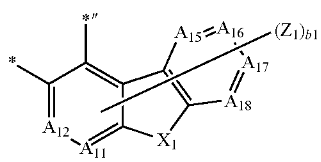

CY3-5

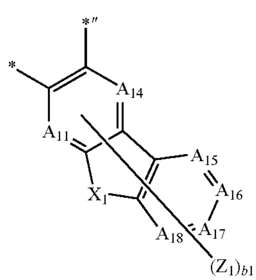

CY3-6

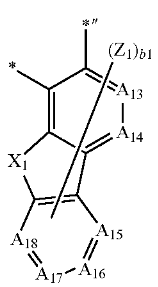

wherein, in Formulae CY3-1 to CY3-6, $A_{11}$ to $A_{18}$ are each independently C or N, wherein at least one of $A_{13}$ to $A_{18}$ in Formulae CY3-1 and CY3-6 is N, at least one of $A_{11}$, $A_{14}$, $A_{15}$, $A_{16}$, $A_{17}$ and $A_{18}$ in Formulae CY3-2 and CY3-5 is N, and at least one of $A_{11}$, $A_{12}$, $A_{15}$, $A_{16}$, $A_{17}$ and $A_{18}$ in Formulae CY3-3 and CY3-4 is N,

* indicates a binding site to M in Formula 1, and

*" indicates a binding site to a neighboring atom in Formula 3.

10. The organometallic compound of claim 1, wherein a group represented by:

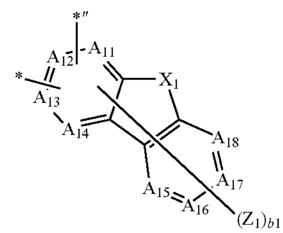

in Formula 3 is a group represented by one of Formulae CY3-1-1 to CY3-1-6, CY3-2-1 to CY3-2-6, CY3-3-1 to CY3-3-6, CY3-4-1 to CY3-4-6, CY3-5-1 to CY3-5-6, and CY3-6-1 to CY3-6-6:

CY3-1-1

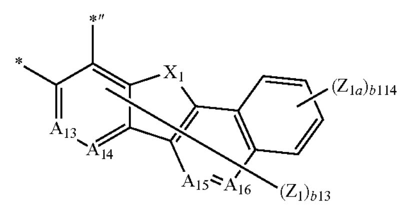

CY3-1-2

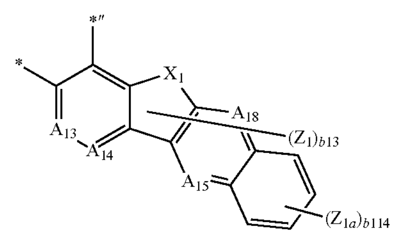

CY3-1-3

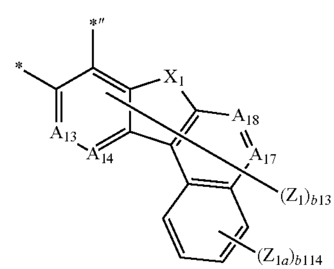

CY3-1-4

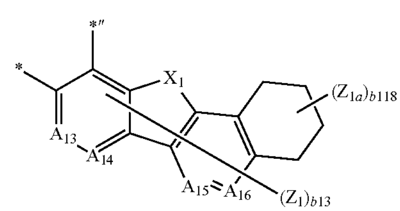

-continued
CY3-1-5
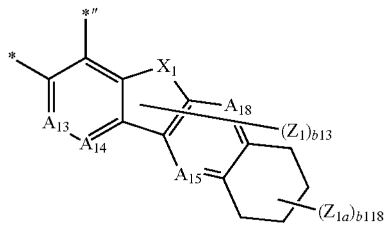
CY3-1-6
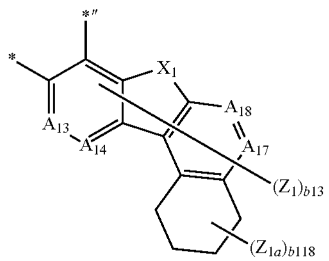
CY3-2-1
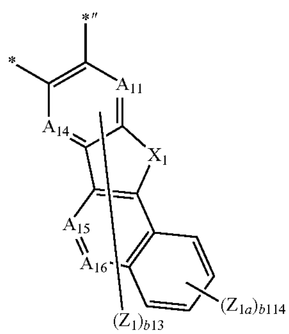
CY3-2-2
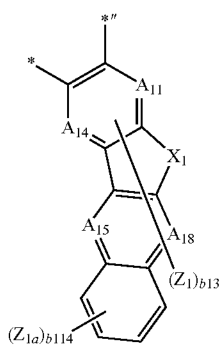
CY3-2-3
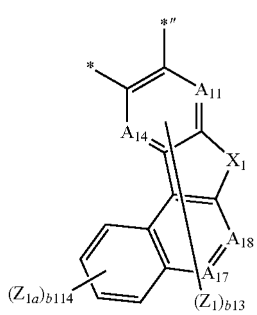
-continued
CY3-2-4
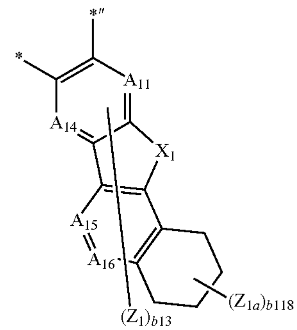
CY3-2-5
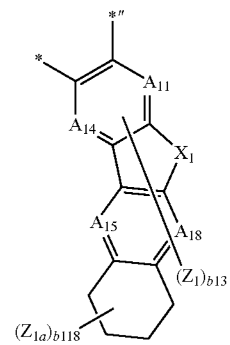
CY3-2-6
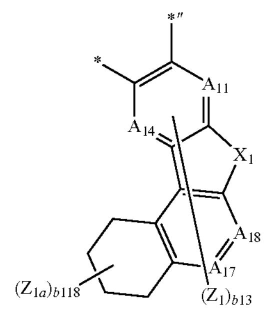
CY3-3-1
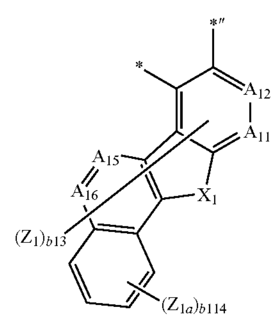
CY3-3-2
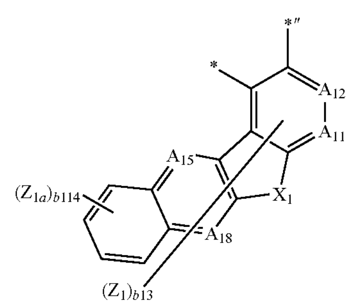

-continued
CY3-3-3
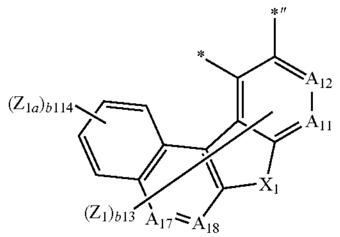
CY3-3-4
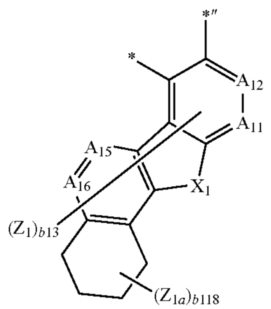
CY3-3-5
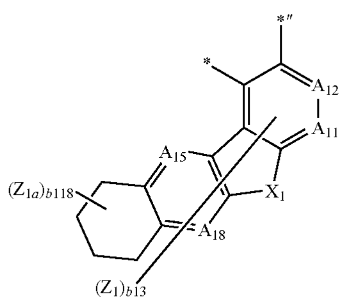
CY3-3-6
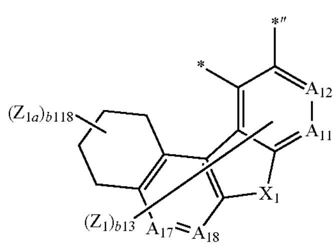
CY3-4-1
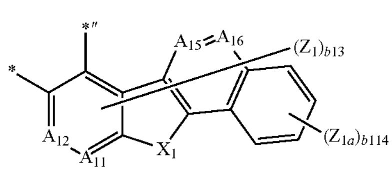
CY3-4-2
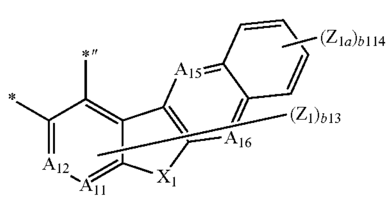
-continued
CY3-4-3
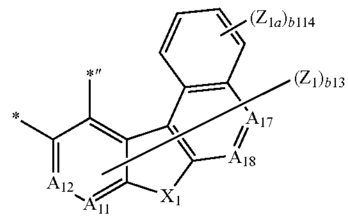
CY3-4-4
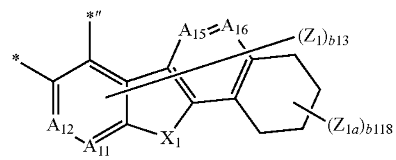
CY3-4-5
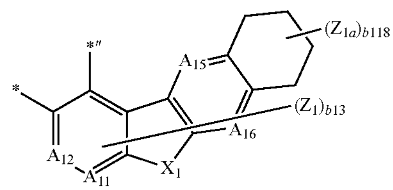
CY3-4-6
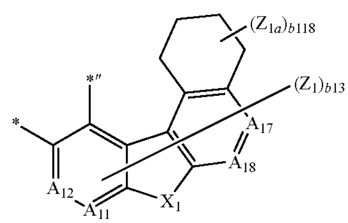
CY3-5-1
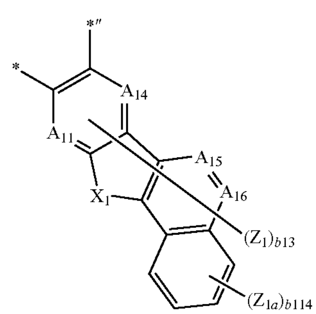
CY3-5-2
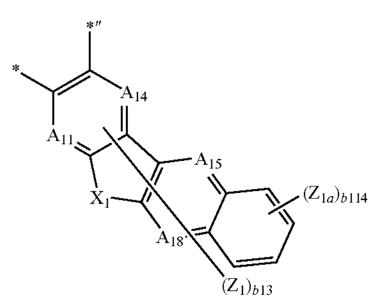

-continued
CY3-5-3
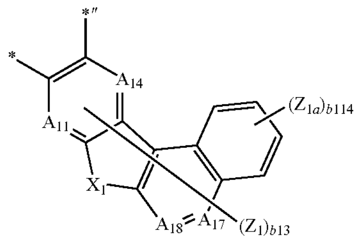
CY3-5-4
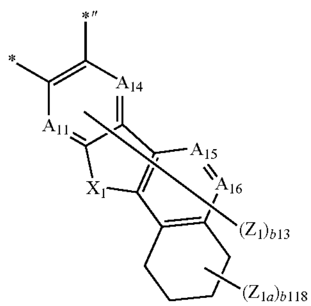
CY3-5-5
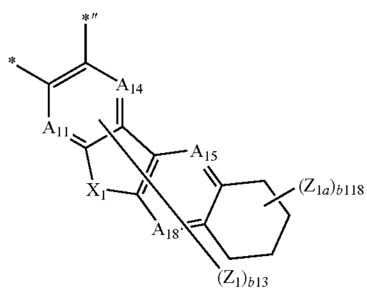
CY3-5-6
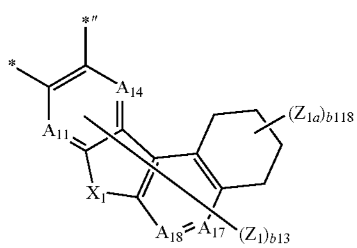
CY3-6-1
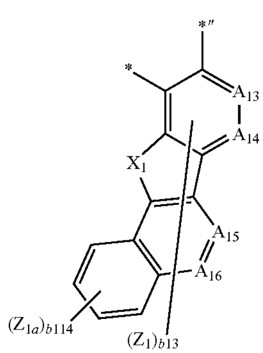
-continued
CY3-6-2
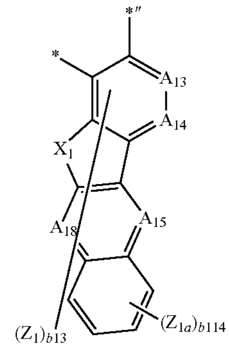
CY3-6-3
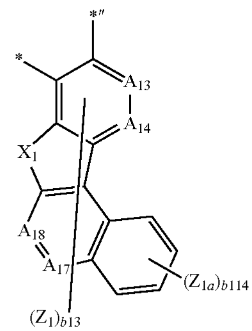
CY3-6-4
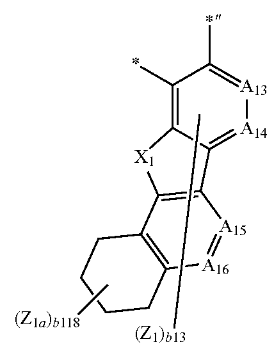
CY3-6-5
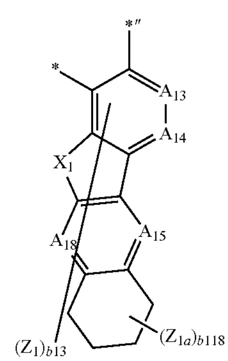

-continued

CY3-6-6

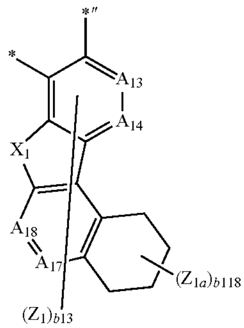

wherein, in Formulae CY3-1-1 to CY3-1-6, CY3-2-1 to CY3-2-6, CY3-3-1 to CY3-3-6, CY3-4-1 to CY3-4-6, CY3-5-1 to CY3-5-6, and CY3-6-1 to CY3-6-6, $Z_{1a}$ is the same as defined in connection with Ria, $A_{11}$ to $A_{18}$ are each independently C or N, wherein a) at least one of $A_{13}$, $A_{14}$, $A_{15}$, and $A_{16}$ in Formulae CY3-1-1, CY3-1-4, CY3-6-1, and CY3-6-4 is N, b) at least one of $A_{13}$, $A_{14}$, $A_{15}$, and $A_{18}$ in Formulae CY3-1-2, CY3-1-5, CY3-6-2, and CY3-6-5 is N, c) at least one of $A_{13}$, $A_{14}$, $A_{17}$, and $A_{18}$ in Formulae CY3-1-3, CY3-1-6, CY3-6-3, and CY3-6-6 is N, d) at least one of $A_{11}$, $A_{14}$, $A_{15}$, and $A_{16}$ in Formulae CY3-2-1, CY3-2-4, CY3-5-1, and CY3-5-4 is N, e) at least one of $A_{11}$, $A_{14}$, $A_{15}$, and $A_{18}$ in Formulae CY3-2-2, CY3-2-5, CY3-5-2, and CY3-5-5 is N, f) at least one of $A_{11}$, $A_{14}$, $A_{17}$, and $A_{18}$ in Formulae CY3-2-3, CY3-2-6, CY3-5-3, and CY3-5-6 is N, g) at least one of $A_{11}$, $A_{12}$, $A_{15}$, and $A_{16}$ in Formulae CY3-3-1, CY3-3-4, CY3-4-1, and CY3-4-4 is N, h) at least one of $A_{11}$, $A_{12}$, $A_{15}$, and $A_{18}$ in Formulae CY3-3-2, CY3-3-5, CY3-4-2, and CY3-4-5 is N, i) at least one of $A_{11}$, $A_{12}$, $A_{17}$, and $A_{18}$ in Formulae CY3-3-3, CY3-3-6, CY3-4-3, and CY3-4-6 is N, b13 is an integer from 0 to 3, b114 is an integer from 0 to 4, b118 is an integer from 0 to 8,

* indicates a binding site to M in Formula 1, and

*" indicates a binding site to a neighboring atom in Formula 3.

11. The organometallic compound of claim 1, wherein a group represented by:

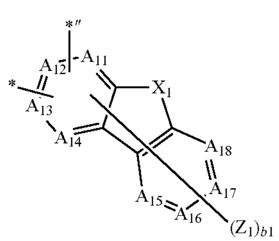

in Formula 3 is a group represented by one of Formulae NCY3(1) to NCY3(84):

NCY3(1)

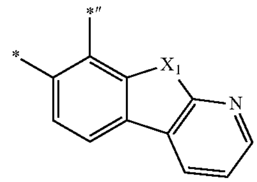

NCY3(2)

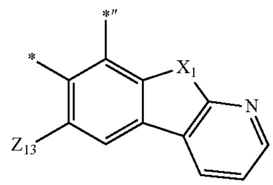

NCY3(3)

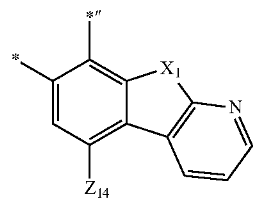

NCY3(4)

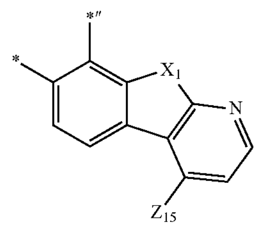

NCY3(5)

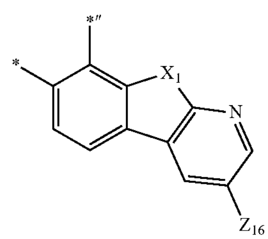

NCY3(6)

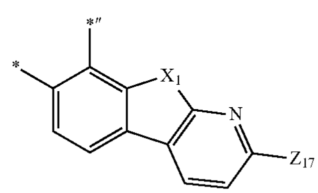

NCY3(7)

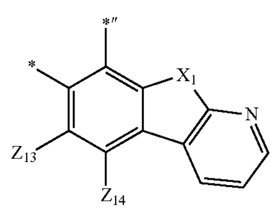

-continued
NCY3(8)
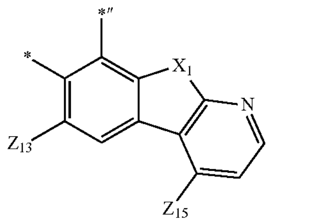
NCY3(9)
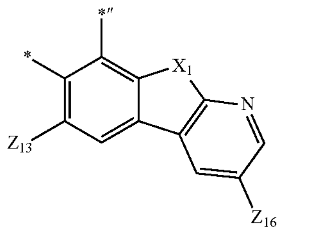
NCY3(10)
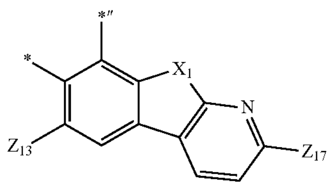
NCY3(11)
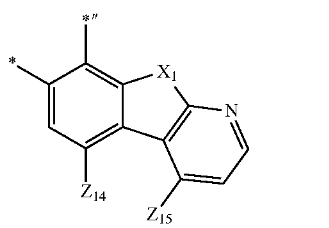
NCY3(12)
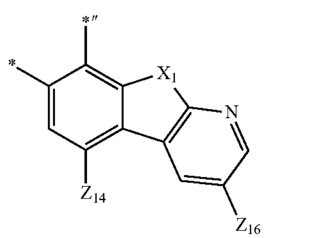
NCY3(13)
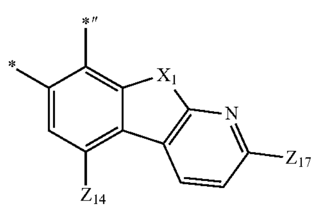
NCY3(14)
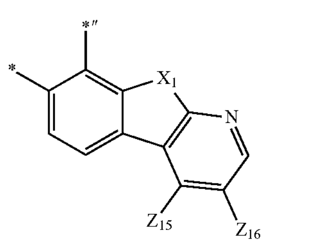
-continued
NCY3(15)
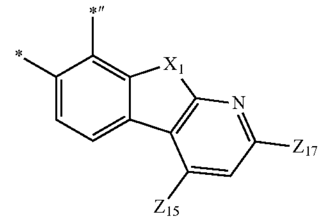
NCY3(16)
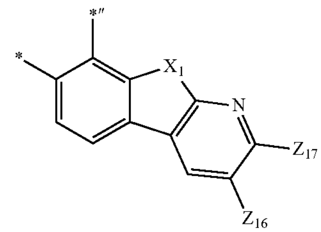
NCY3(17)
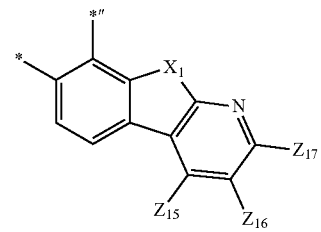
NCY3(18)
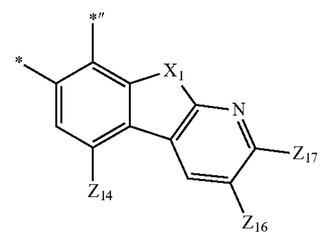
NCY3(19)
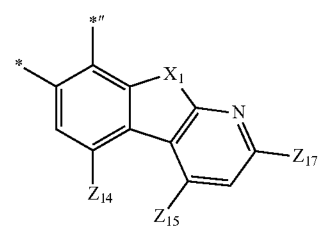
NCY3(20)
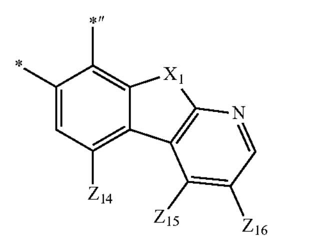
NCY3(21)
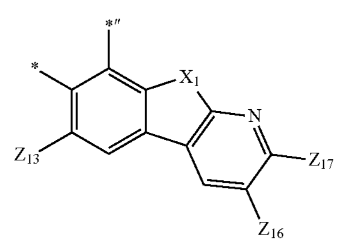

NCY3(22)
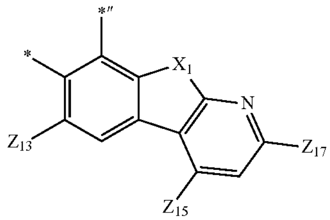
NCY3(23)
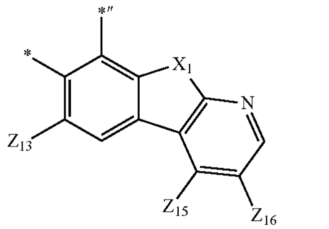
NCY3(24)
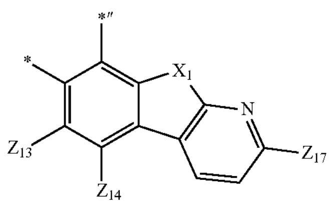
NCY3(25)
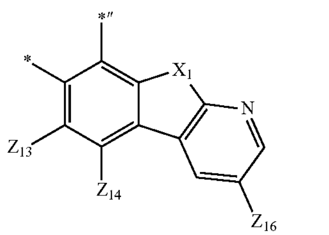
NCY3(26)
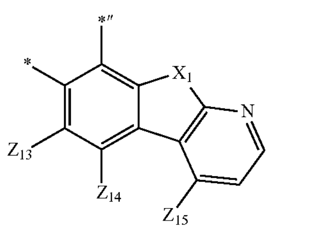
NCY3(27)
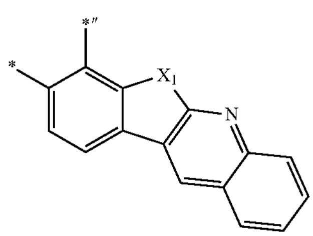
NCY3(28)
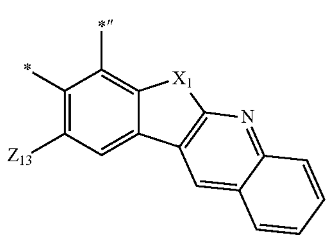
NCY3(29)
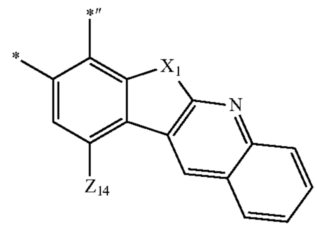
NCY3(30)
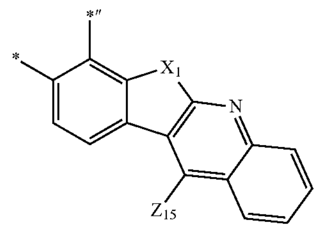
NCY3(31)
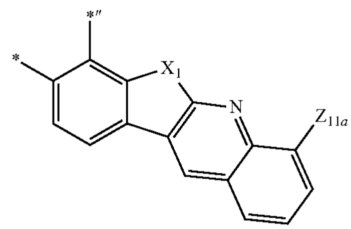
NCY3(32)
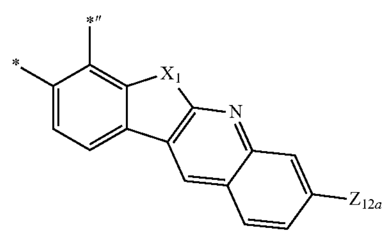
NCY3(33)
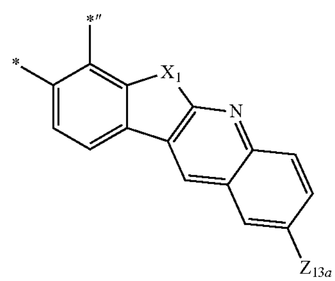
NCY3(34)
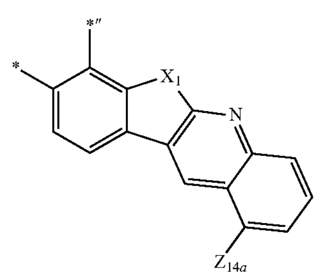

-continued
NCY3(35)
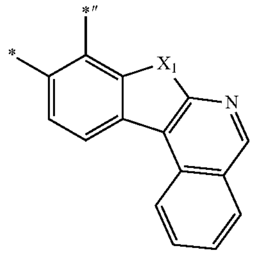
NCY3(36)
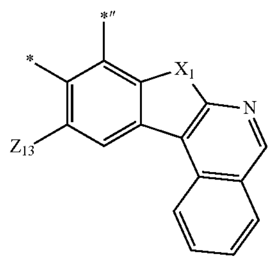
NCY3(37)
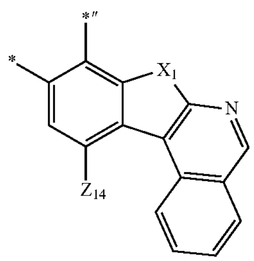
NCY3(38)
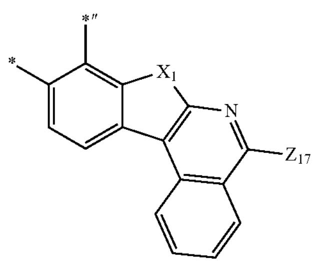
NCY3(39)
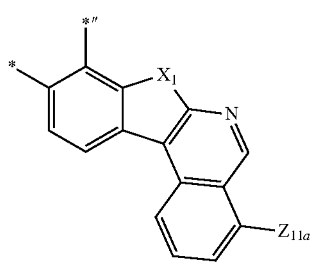
NCY3(40)
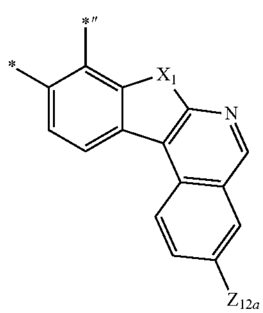
-continued
NCY3(41)
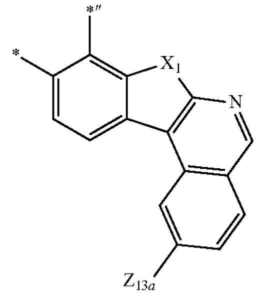
NCY3(42)
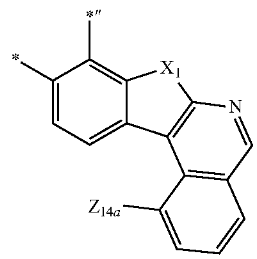
NCY3(43)
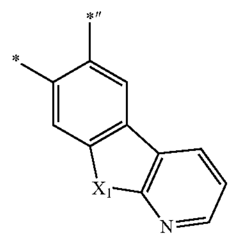
NCY3(44)
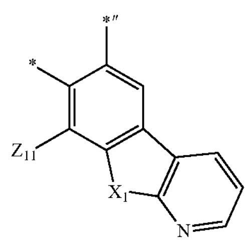
NCY3(45)
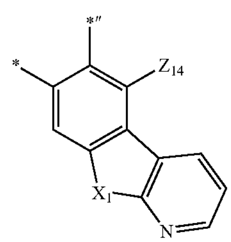
NCY3(46)
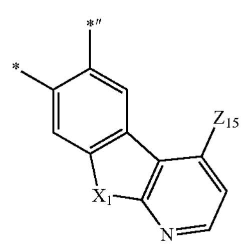

-continued
NCY3(47)
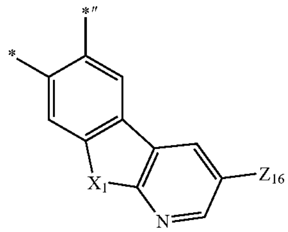
NCY3(48)
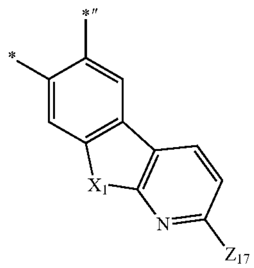
NCY3(49)
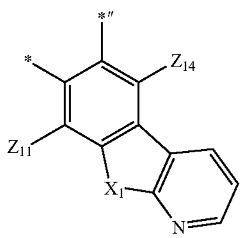
NCY3(50)
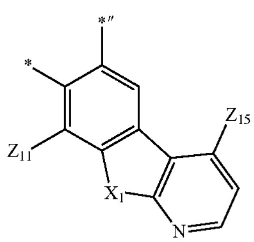
NCY3(51)
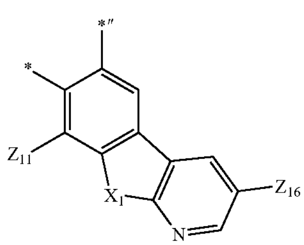
NCY3(52)
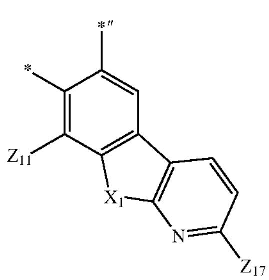
-continued
NCY3(53)
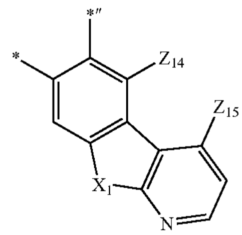
NCY3(54)
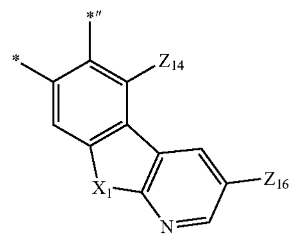
NCY3(55)
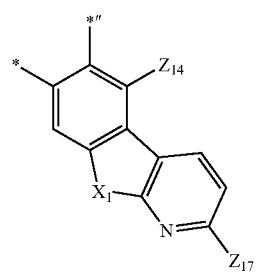
NCY3(56)
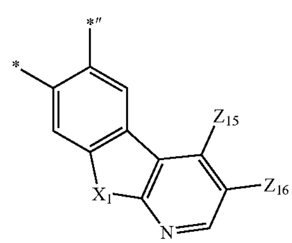
NCY3(57)
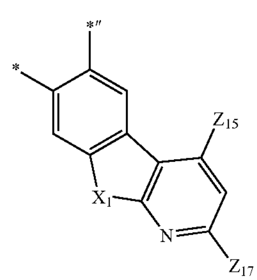
NCY3(58)
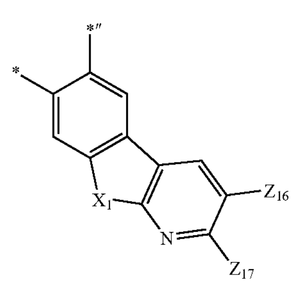

-continued
NCY3(59)
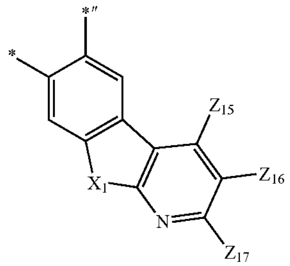
NCY3(60)
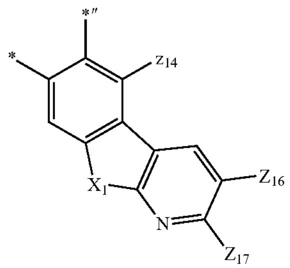
NCY3(61)
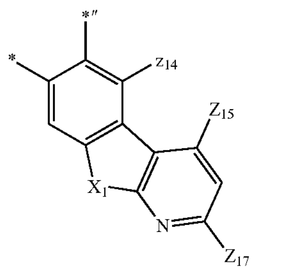
NCY3(62)
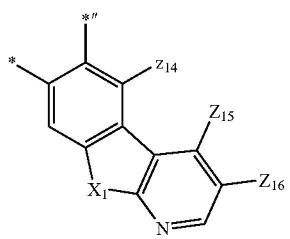
NCY3(63)
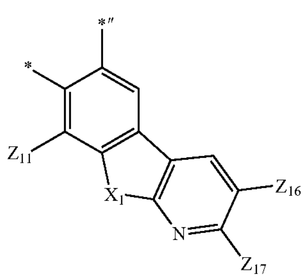
NCY3(64)
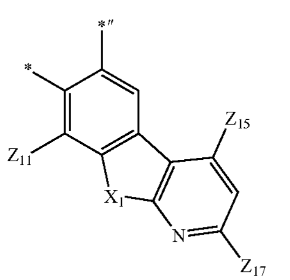
-continued
NCY3(65)
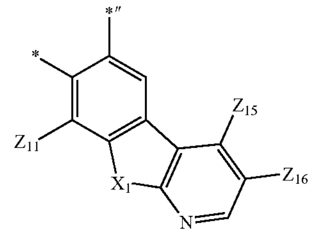
NCY3(66)
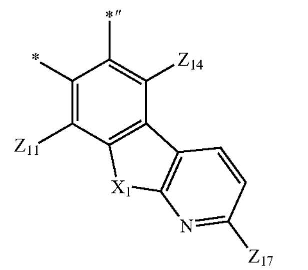
NCY3(67)
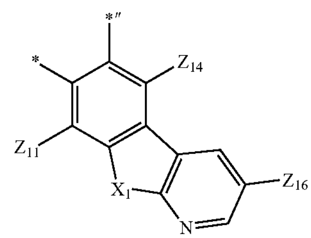
NCY3(68)
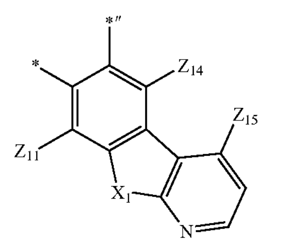
NCY3(69)
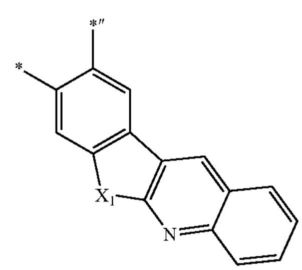
NCY3(70)
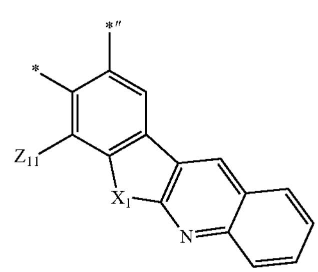

-continued
NCY3(71)
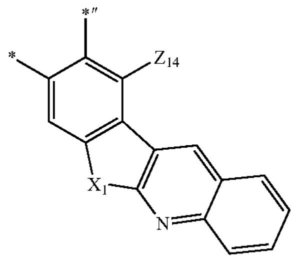
NCY3(72)
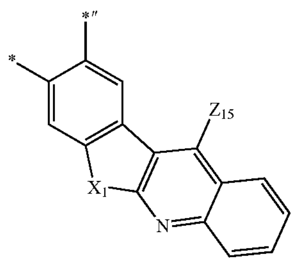
NCY3(73)
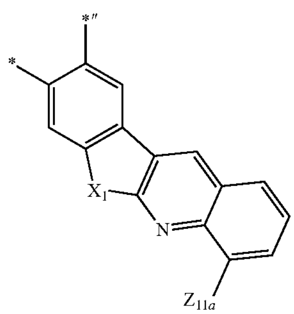
NCY3(74)
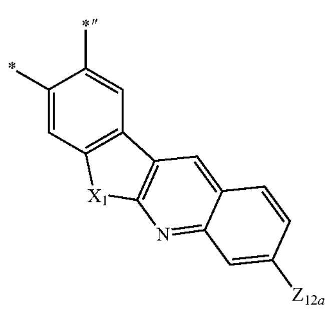
NCY3(75)
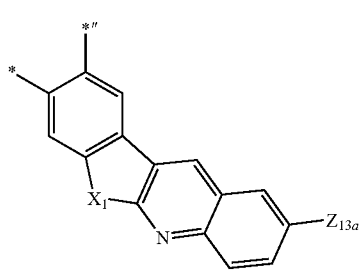
-continued
NCY3(76)
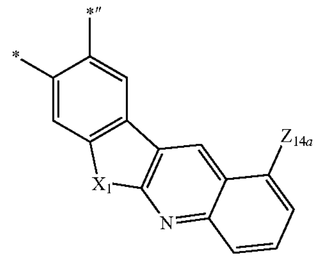
NCY3(77)
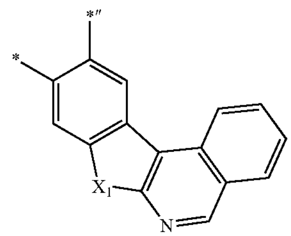
NCY3(78)
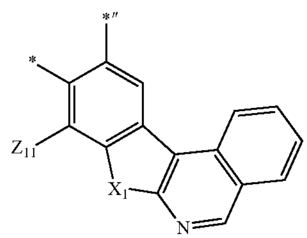
NCY3(79)
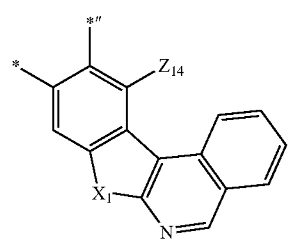
NCY3(80)
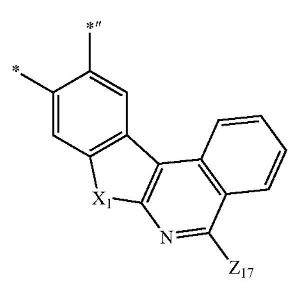
NCY3(81)
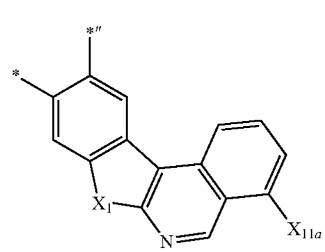

-continued

NCY3(82)

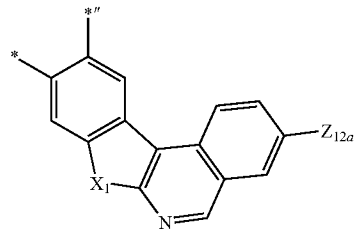

NCY3(83)

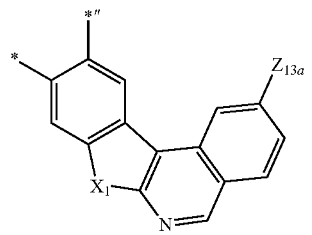

NCY3(84)

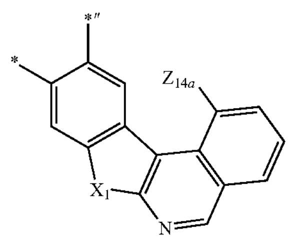

wherein, in Formulae NCY3(1) to NCY3(84), $Z_{11}$ to $Z_{18}$ and $Z_{11a}$ to $Z_{14a}$ $Z_{1a}$ are each independently the same as defined in connection with $Z_1$, and each of $Z_{11}$ to $Z_{18}$ and $Z_{11a}$ to $Z_{14a}$ $Z_{1a}$ is not hydrogen,

* indicates a binding site to M in Formula 1, and

*" indicates a binding site to a neighboring atom in Formula 3.

12. The organometallic compound of claim 1, wherein a group represented by:

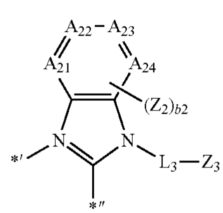

in Formula 3 is a group represented by one of Formulae CY4-1 to CY4-60:

CY4-1

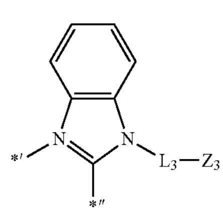

-continued

CY4-2

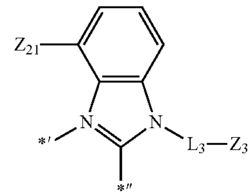

CY4-3

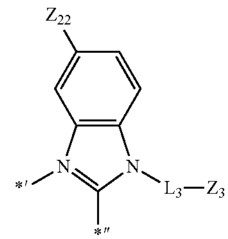

CY4-4

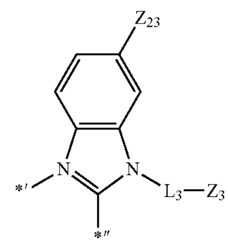

CY4-5

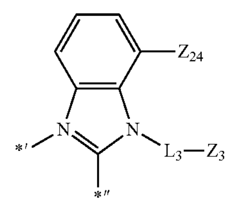

CY4-6

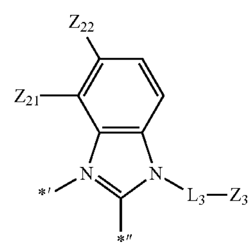

CY4-7

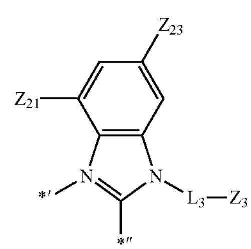

CY4-8

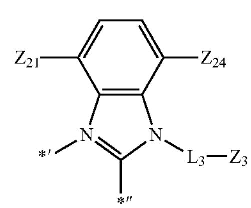

-continued
CY4-9
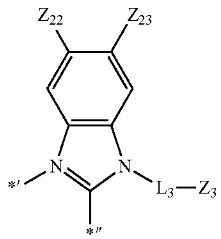
CY4-10
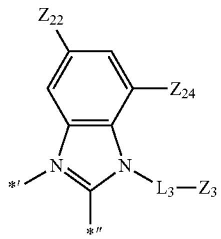
CY4-11
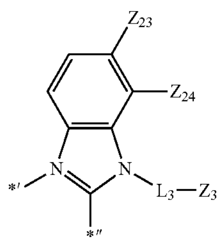
CY4-12
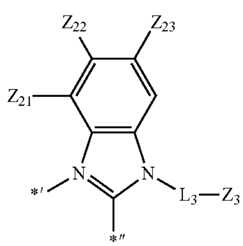
CY4-13
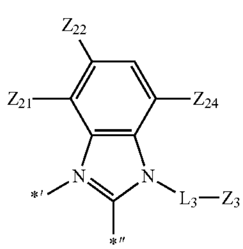
CY4-14
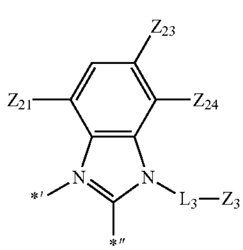
-continued
CY4-15
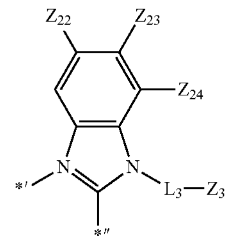
CY4-16
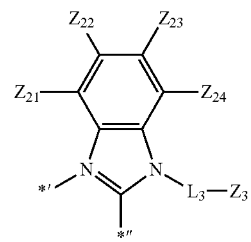
CY4-17
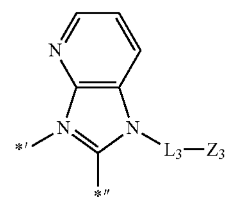
CY4-18
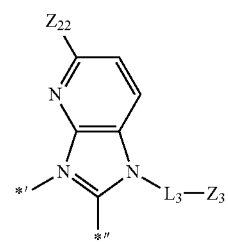
CY4-19
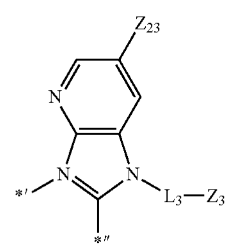
CY4-20
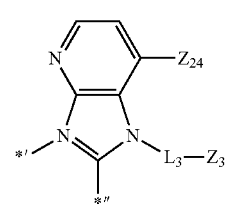
CY4-21
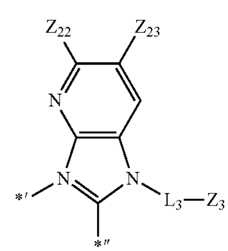

-continued
CY4-22
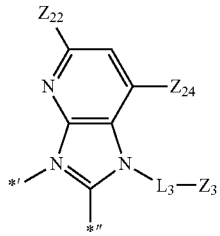
CY4-23
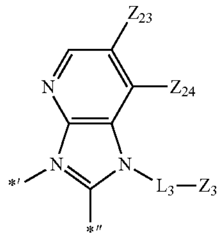
CY4-24
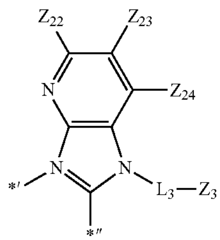
CY4-25
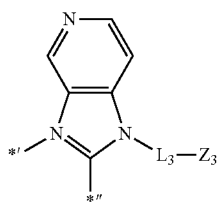
CY4-26
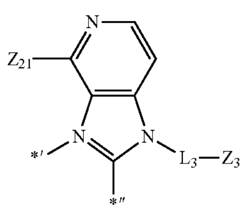
CY4-27
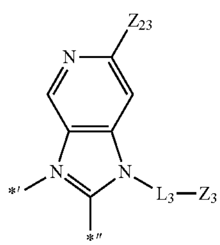
CY4-28
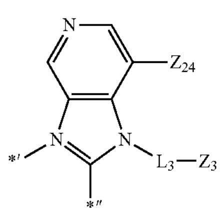
-continued
CY4-29
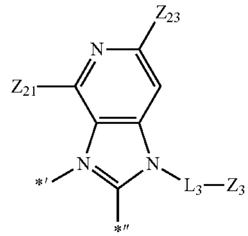
CY4-30
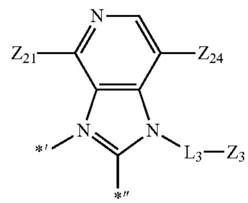
CY4-31
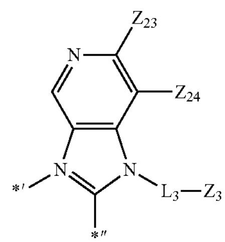
CY4-32
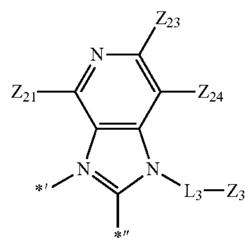
CY4-33
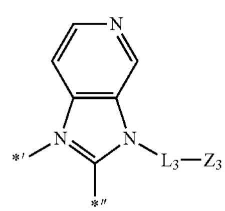
CY4-34
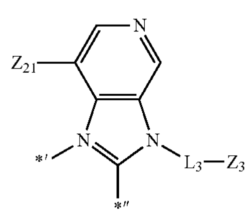
CY4-35
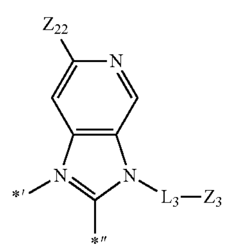

-continued
CY4-36
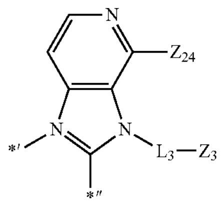
CY4-37
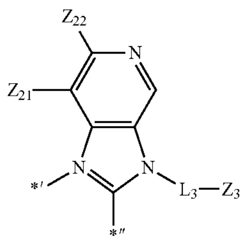
CY4-38
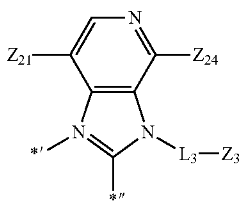
CY4-39
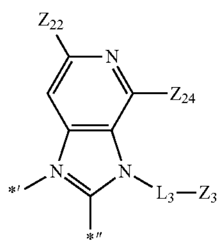
CY4-40
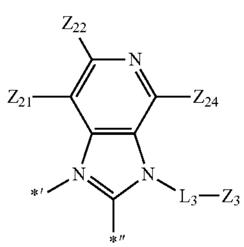
CY4-41
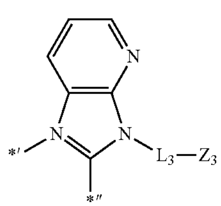
CY4-42
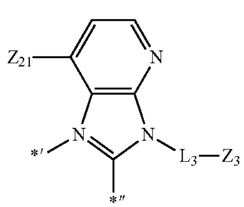
-continued
CY4-43
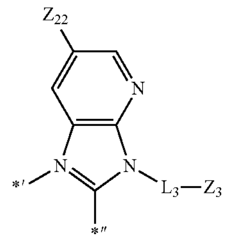
CY4-44
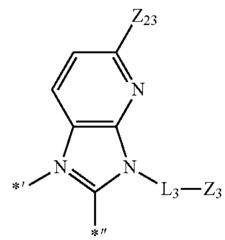
CY4-45
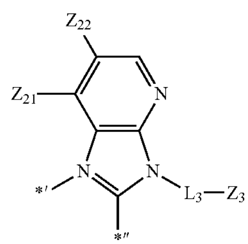
CY4-46
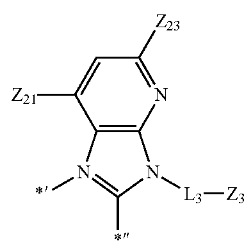
CY4-47
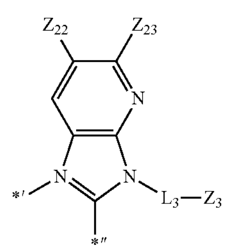
CY4-48
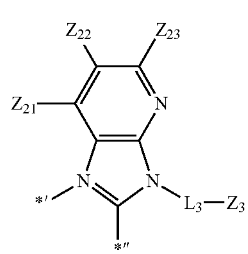

-continued
CY4-49
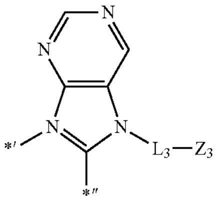
CY4-50
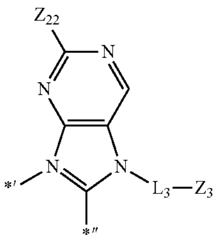
CY4-51
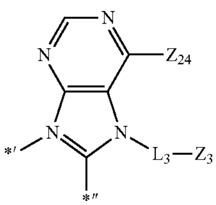
CY4-52
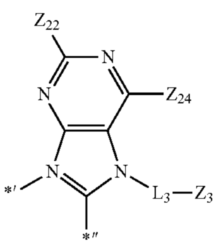
CY4-53
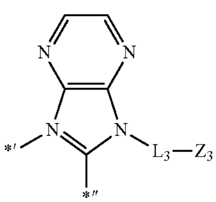
CY4-54
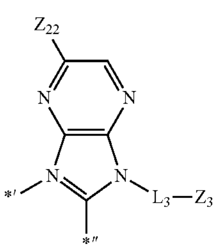
CY4-55
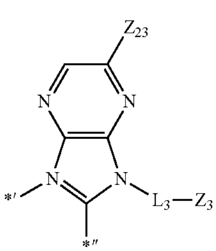
-continued
CY4-56
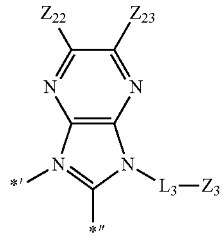
CY4-57
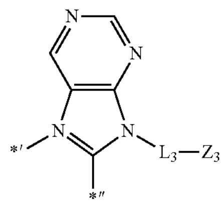
CY4-58
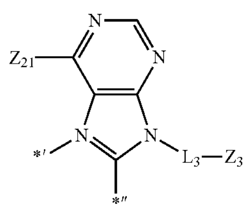
CY4-59
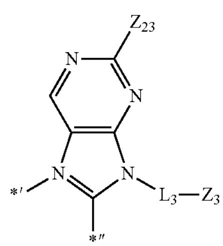
CY4-60
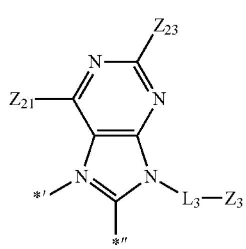
wherein, in Formulae CY4-1 to CY4-60,
$Z_{21}$ to $Z_{24}$ are each independently the same as defined in connection with $Z_2$, wherein $Z_{21}$ to $Z_{24}$ are not hydrogen,
*' indicates a binding site to M in Formula 1, and
*" indicates a binding site to a neighboring atom in Formula 3.

13. The organometallic compound of claim 1, wherein a group represented by:

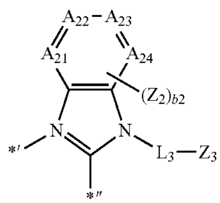

in Formula 3 is a group represented by one of Formulae CY4(1) to CY4(4):

CY4(1)

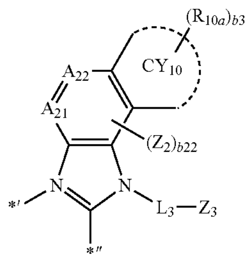

CY4(2)

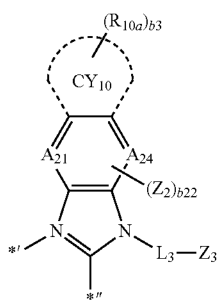

CY4(3)

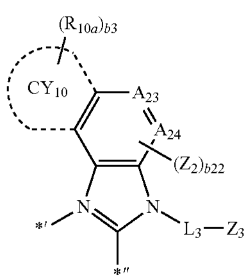

CY4(4)

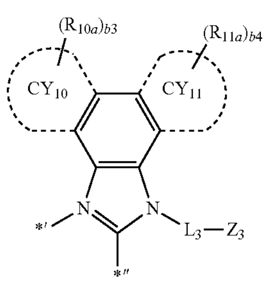

wherein, in Formulae CY4(1) to CY4(4), b22 is an integer from 0 to 2, ring $CY_{10}$ and ring $CY_{11}$ are each independently a $C_5$-$C_{30}$ carbocyclic group or a $C_1$-$C_{30}$ heterocyclic group, $R_{11a}$ is the same as defined in connection with $R_{10a}$, b3 and b4 are each independently an integer from 0 to 20, when b3 is 2 or more, two or more $R_{10a}$ groups are identical to or different from each other, and when b4 is 2 or more, two or more $R_{11a}$ groups are identical to or different from each other,

*' indicates a binding site to M in Formula 1, and

*" indicates a binding site to a neighboring atom in Formula 3.

14. The organometallic compound of claim 1, wherein a group represented by:

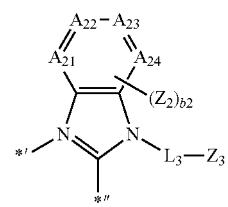

in Formula 3 is a group represented by one of Formulae CY4(1)-1 to CY4(1)-4, CY4(2)-1 to CY4(2)-4, CY4(3)-1 to CY4(3)-4 and CY4(4)-1:

CY4(1)-1

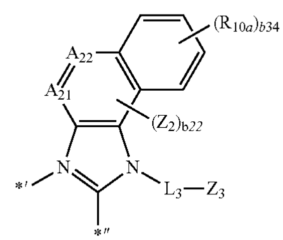

CY4(1)-2

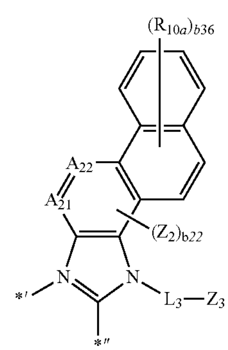

CY4(1)-3

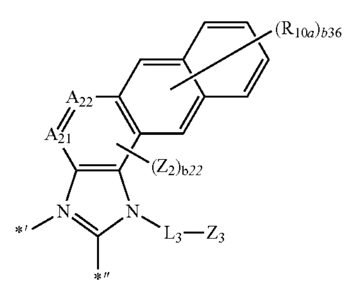

-continued

CY4(1)-4

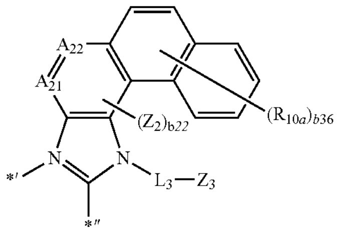

CY4(2)-1

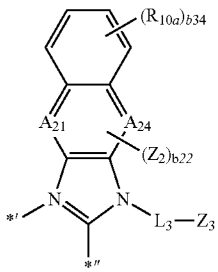

CY4(2)-2

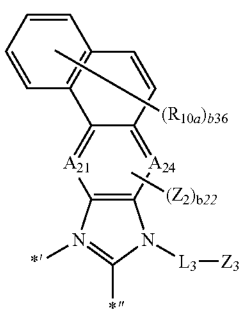

CY4(2)-3

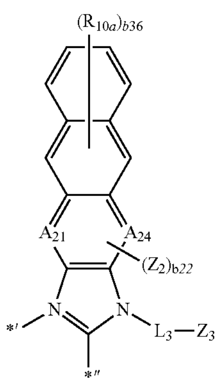

CY4(2)-4

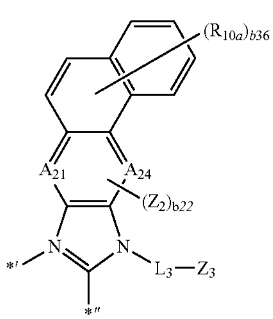

-continued

CY4(3)-1

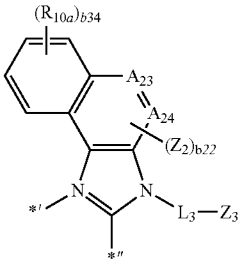

CY4(3)-2

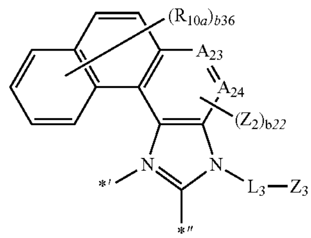

CY4(3)-3

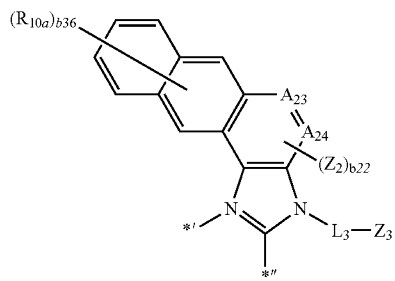

CY4(3)-4

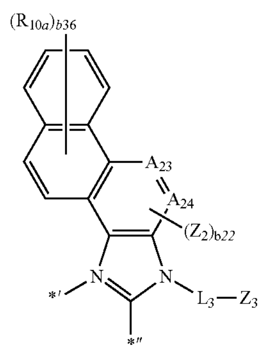

CY4(4)-1

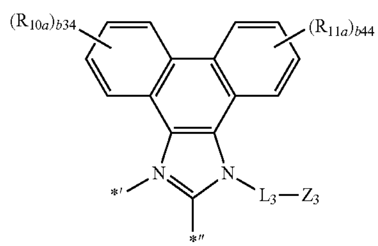

wherein, in Formulae CY4(1)-1 to CY4(1)-4, CY4(2)-1 to CY4(2)-4, CY4(3)-1 to CY4(3)-4 and CY4(4)-1, b22 is an integer from 0 to 2, $R_{11a}$ is the same as defined in connection with $R_{10a}$, b34 and b44 may each independently be an integer from 0 to 4, when b34 is 2 or more, two or more $R_{10a}$(s) may be identical to or different from each other, and when b44 is 2 or more, two or more $R_{11a}$(s) may be identical to or different from each other, b36 may be an integer from 0 to 6, when b36 is 2 or more, two or more $R_{10a}$(s) may be identical to or different from each other,

*' indicates a binding site to M in Formula 1, and

*" indicates a binding site to a neighboring atom in Formula 3.

15. An organic light-emitting device comprising:

a first electrode;

a second electrode; and an organic layer disposed between the first electrode and the second electrode and comprising an emission layer, wherein the organic layer comprises at least one organometallic compound of claim 1.

16. The organic light-emitting device of claim 15, wherein the first electrode is an anode, the second electrode is a cathode, the organic layer further comprises a hole transport region between the first electrode and the emission layer and an electron transport region disposed between the emission layer and the second electrode, the hole transport region comprises a hole injection layer, a hole transport layer, an electron blocking layer, a buffer layer, or a combination thereof, and the electron transport region comprises a hole blocking layer, an electron transport layer, an electron injection layer, or a combination thereof.

17. The organic light-emitting device of claim 15, wherein the emission layer comprises the at least one organometallic compound.

18. The organic light-emitting device of claim 17, wherein the emission layer emits green light.

19. The organic light-emitting device of claim 17, wherein the emission layer further comprises a host, and an amount of the host is greater than an amount of the organometallic compound in the emission layer based on total weight of the emission layer.

20. An electronic apparatus comprising the organic light-emitting device of claim 15.

* * * * *